US012439821B2

(12) United States Patent
Lee et al.

(10) Patent No.: US 12,439,821 B2
(45) **Date of Patent: *Oct. 7, 2025**

(54) LIGHT EMITTING DEVICE AND FUSED POLYCYCLIC COMPOUND FOR LIGHT EMITTING DEVICE

(71) Applicant: SAMSUNG DISPLAY CO., LTD., Yongin-si (KR)

(72) Inventors: Hyoyoung Lee, Suwon-si (KR); Soo-Byung Ko, Yongin-si (KR); Junha Park, Gwacheon-si (KR); Han Kyu Pak, Suwon-si (KR); Jang Yeol Baek, Yongin-si (KR); Mun-Ki Sim, Seoul (KR); Chanseok Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

This patent is subject to a terminal disclaimer.

(21) Appl. No.: 17/937,762

(22) Filed: Oct. 3, 2022

(65) Prior Publication Data

US 2023/0130170 A1 Apr. 27, 2023

Related U.S. Application Data

(63) Continuation-in-part of application No. 16/882,900, filed on May 26, 2020, now Pat. No. 11,489,124.

(30) Foreign Application Priority Data

Jul. 8, 2019 (KR) ........................ 10-2019-0082058

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/027* (2013.01); *H10K 50/11* (2023.02); *H10K 85/631* (2023.02);
(Continued)

(58) Field of Classification Search
CPC ............................ H01L 51/0072; C09K 11/06
See application file for complete search history.

(56) References Cited

U.S. PATENT DOCUMENTS 10,680,186 B2 6/2020 Hatakeyama
10,862,047 B2 12/2020 Nakanotani et al.
(Continued)

FOREIGN PATENT DOCUMENTS

JP 2007-153776 A 6/2007
JP 2018-174279 A 11/2018
(Continued)

OTHER PUBLICATIONS

US Office Action dated Dec. 21, 2022, issued in U.S. Appl. No. 16/856,971 (16 pages).
(Continued)

*Primary Examiner* — Douglas M Menz
(74) *Attorney, Agent, or Firm* — Womble Bond Dickinson (US) LLP

(57) ABSTRACT

An light emitting device of the present embodiments includes oppositely disposed first electrode and second electrode, and a plurality of organic layers disposed between the first electrode and the second electrode, wherein at least one among the plurality of organic layers includes a fused polycyclic compound represented by Formula 1 below, thereby showing improved emission efficiency:
(Continued)

Formula 1

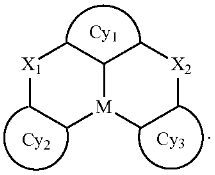

20 Claims, 8 Drawing Sheets

(51) Int. Cl.
*H10K 50/11* (2023.01)
*H10K 85/60* (2023.01)
*H10K 101/00* (2023.01)
*H10K 101/10* (2023.01)

(52) U.S. Cl.
CPC ....... *H10K 85/636* (2023.02); *H10K 85/6572* (2023.02); *C07B 2200/05* (2013.01); *H10K 2101/10* (2023.02); *H10K 2101/27* (2023.02)

(56) References Cited

U.S. PATENT DOCUMENTS

| | | | | |
|---|---|---|---|---|
| 11,489,124 | B2 * | 11/2022 | Lee | C07F 5/00 |
| 12,114,561 | B2 | 10/2024 | Kim et al. | |
| 2015/0236274 | A1 | 8/2015 | Hatakeyama et al. | |
| 2016/0130225 | A1 | 5/2016 | Tasaki et al. | |
| 2017/0324037 | A1 | 11/2017 | Itoi | |
| 2018/0301629 | A1 | 10/2018 | Hatakeyama et al. | |
| 2020/0035921 | A1 | 1/2020 | Nakanotani et al. | |
| 2020/0227639 | A1 | 7/2020 | Yamatani | |
| 2020/0283426 | A1 | 9/2020 | Uno | |
| 2020/0287138 | A1 | 9/2020 | Suzaki | |
| 2020/0328352 | A1 | 10/2020 | Ahn | |
| 2020/0381634 | A1 | 12/2020 | Baek | |
| 2020/0403160 | A1 | 12/2020 | Sakamoto | |
| 2020/0411764 | A1 | 12/2020 | Furue | |
| 2021/0013430 | A1 | 1/2021 | Lee | |

FOREIGN PATENT DOCUMENTS

| | | | |
|---|---|---|---|
| KR | 10-2016-0044522 | A | 4/2016 |
| KR | 10-2016-0119683 | A | 10/2016 |
| KR | 10-2017-0130434 | A | 11/2017 |
| KR | 10-1990818 | B1 | 6/2019 |
| KR | 10-2020-0047400 | A | 5/2020 |

OTHER PUBLICATIONS

US Final Office Action dated Jun. 22, 2023, issued in U.S. Appl. No. 16/856,971 (18 pages).
JP 2007-153776 A, machine translation (Year: 2007).
US Office Action dated Oct. 26, 2023, issued in U.S. Appl. No. 16/856,971 (26 pages).
US Final Office Action dated Mar. 27, 2024, issued in U.S. Appl. No. 16/856,971 (20 pages).

* cited by examiner

LIGHT EMITTING DEVICE AND FUSED POLYCYCLIC COMPOUND FOR LIGHT EMITTING DEVICE

CROSS-REFERENCE TO RELATED APPLICATION

The present application is a continuation-in-part of U.S. patent application Ser. No. 16/882,900, filed on May 26, 2020, which claims priority to and the benefit of Korean Patent Application No. 10-2019-0082058, filed on Jul. 8, 2019, the entire content of which is hereby incorporated by reference.

BACKGROUND

One or more embodiments of the present disclosure herein relate to an organic electroluminescence device and a fused polycyclic compound used (utilized) therein, and more particularly, to a fused polycyclic compound used (utilized) as a light-emitting material and an organic electroluminescence device including the same.

Recently, the development of an organic electroluminescence display device as an image display device is being actively conducted. Different from a liquid crystal display device, the organic electroluminescence display device is a self-luminescent display device in which holes and electrons injected from a first electrode and a second electrode recombine in an emission layer, and a light-emitting material including an organic compound in the emission layer emits light to attain display of images.

In the application of an organic electroluminescence device to a display device, the decrease of the driving voltage, and the increase of the emission efficiency and the life of the organic electroluminescence device are required (or desired), and developments of materials for an organic electroluminescence device capable of stably attaining these characteristics are being continuously required (or desired).

Recently, in order to accomplish an organic electroluminescence device with high efficiency, techniques on phosphorescence emission (which uses energy in a triplet state) or delayed fluorescence emission (which uses the generating phenomenon of singlet excitons by the collision of triplet excitons (triplet-triplet annihilation, TTA)) are being developed, and development of a material for thermally activated delayed fluorescence (TADF) using delayed fluorescence phenomenon is being conducted.

SUMMARY

One or more aspects of embodiments of the present disclosure are directed toward a light emitting device having improved emission efficiency.

One or more aspects of embodiments of the present disclosure are also directed toward a fused polycyclic compound capable of improving the emission efficiency of a light emitting device.

An embodiment of the inventive concept provides a light emitting device including a first electrode, a second electrode facing the first electrode, and a plurality of organic layers between the first electrode and the second electrode. At least one organic layer among the plurality of organic layers includes a fused polycyclic compound represented by the following Formula 1:

Formula 1

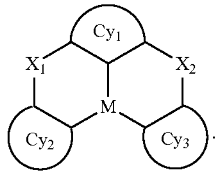

In Formula 1, M is B, Al, Ga, or In; $X_1$ and $X_2$ may each independently be $NR_1$, O, S, $P(=O)R_2$, or $P(=S)R_3$; $R_1$ to $R_3$ may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_3$ may (optionally) be combined with an adjacent group to form a ring; $Cy_1$ to $Cy_3$ may each independently be a substituted or unsubstituted aromatic hydrocarbon ring, or a substituted or unsubstituted aromatic heterocycle, and any of $Cy_1$ to $Cy_3$ may (optionally) be combined with an adjacent group to form a ring, and at least one among $Cy_1$ to $Cy_3$ is substituted with a substituent represented by the following Formula 2:

Formula 2

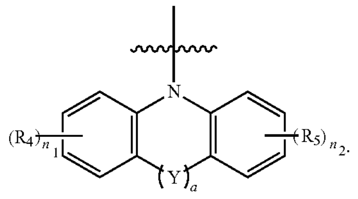

In Formula 2, $R_4$ and $R_5$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_4$ and $R_5$ may (optionally) be combined with an adjacent group to form a ring; $n_1$ and $n_2$ are each independently an integer of 0 to 4; at least one among $R_4$ and $R_5$ is a substituted or unsubstituted amine group, or a substituted or unsubstituted carbazole group, provided that when $R_4$ is the substituted or unsubstituted amine group, or the substituted or unsubstituted carbazole group, $n_1$ is an integer of 1 to 4, and when $R_5$ is the substituted or unsubstituted amine group, or the substituted or unsubstituted carbazole group, $n_2$ is an integer of 1 to 4; Y is a direct linkage; and "a" is 0 or 1.

In an embodiment, the plurality of organic layers may include a hole transport region on the first electrode, an emission layer on the hole transport region, and an electron transport region on the emission layer. The emission layer may include the fused polycyclic compound represented by Formula 1.

In an embodiment, the emission layer may emit delayed fluorescence.

In an embodiment, the emission layer may be a delayed fluorescence emission layer including a first compound and a second compound. The second compound may include the fused polycyclic compound represented by Formula 1.

In an embodiment, the emission layer may include a first compound having a first lowest triplet excitation energy level, a second compound having a second lowest triplet excitation energy level which is lower than the first lowest triplet excitation energy level, and a third compound having a third lowest triplet excitation energy level which is lower than the second lowest triplet excitation energy level. The second compound may include the fused polycyclic compound represented by Formula 1.

In an embodiment, the second compound may be a delayed fluorescence material. The third compound may be a phosphorescence material or a fluorescence material.

In an embodiment, the fused polycyclic compound represented by Formula 1 may be represented by the following Formula 3:

Formula 3

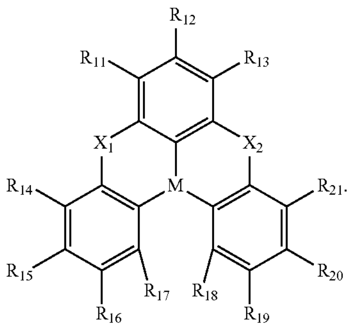

In Formula 3, $R_{11}$ to $R_{21}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ may (optionally) be combined with an adjacent group to form a ring, and at least one among $R_{11}$ to $R_{21}$ may be represented by Formula 2 above.

In Formula 3, M, $X_1$, and $X_2$ may be the same as defined in Formula 1.

In an embodiment, the fused polycyclic compound represented by Formula 3 may be represented by the following Formula 4:

Formula 4

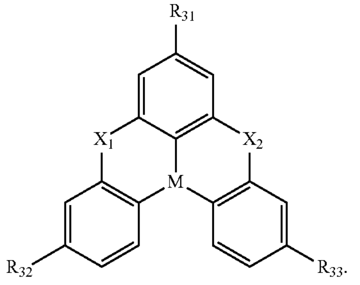

In Formula 4, $R_{31}$ to $R_{33}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{31}$ to $R_{33}$ may (optionally) be combined with an adjacent group to form a ring, and at least one among $R_{31}$ to $R_{33}$ may be represented by Formula 2 above.

In Formula 4, M, $X_1$, and $X_2$ are the same as defined in Formula 1.

In an embodiment, the substituent represented by Formula 2 may be represented by the following Formula 5-1 or Formula 5-2:

Formula 5-1

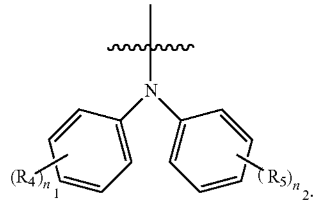

Formula 5-2

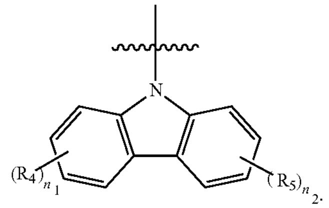

In Formulae 5-1 and 5-2, $R_4$, $R_5$, $n_1$ and $n_2$ are the same as defined in Formula 2.

In an embodiment, the substituent represented by Formula 2 may be represented by any one among the following Formula 6-1 to Formula 6-4:

Formula 6-1

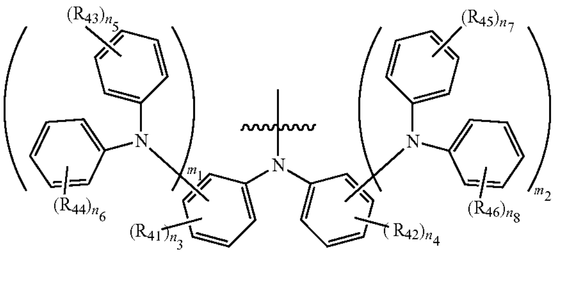

Formula 6-2

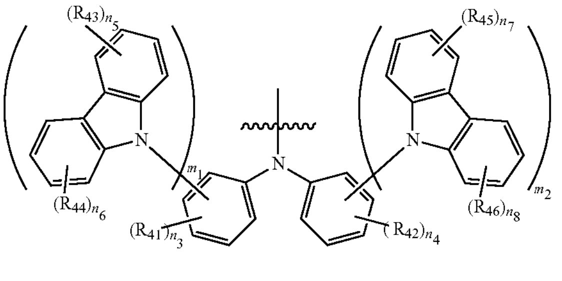

-continued

Formula 6-3

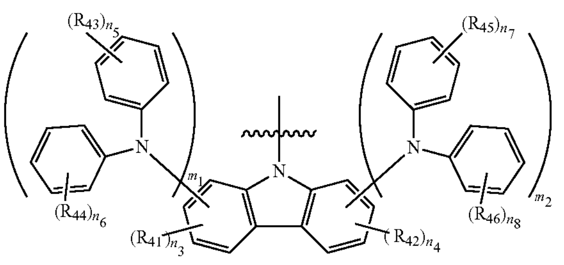

Formula 6-4

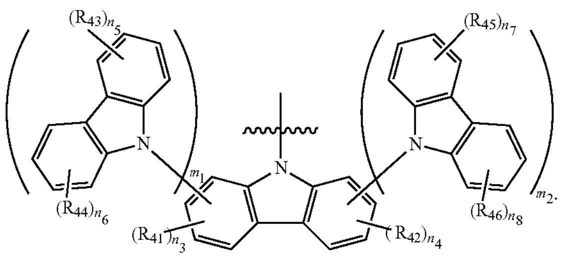

In Formulae 6-1 to 6-4, $R_{41}$ to $R_{46}$ may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{41}$ to $R_{46}$ may (optionally) be combined with an adjacent group to form a ring, $n_3$ and $n_4$ are each independently an integer of 0 to 3, $n_5$ to $n_8$ are each independently an integer of 0 to 4, $m_1$ and $m_2$ are each independently 0 or 1, and at least one of $m_1$ and $m_2$ is 1 ($m_1+m_2\neq 0$).

In an embodiment, the substituent represented by Formula 2 may be represented by the following Formula 7-1 or Formula 7-2:

Formula 7-1

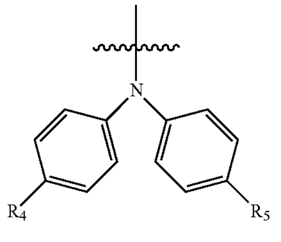

Formula 7-2

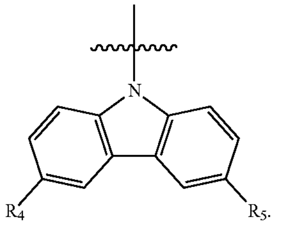

In Formulae 7-1 and 7-2, $R_4$, and $R_5$ are the same as defined in Formula 2.

In an embodiment, $X_1$ and $X_2$ may be each independently $NR_1$, or O, and $R_1$ may be a substituted or unsubstituted phenyl group.

In an embodiment, the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides of one or more selected from them.

In an embodiment of the inventive concept, a fused polycyclic compound according to an embodiment may be represented by Formula 1 above.

BRIEF DESCRIPTION OF THE FIGURES

The accompanying drawings are included to provide a further understanding of the inventive concept, and are incorporated in and constitute a part of this specification. The drawings illustrate exemplary (example) embodiments of the inventive concept and, together with the description, serve to explain principles of the inventive concept. In the drawings.

Figure 7:
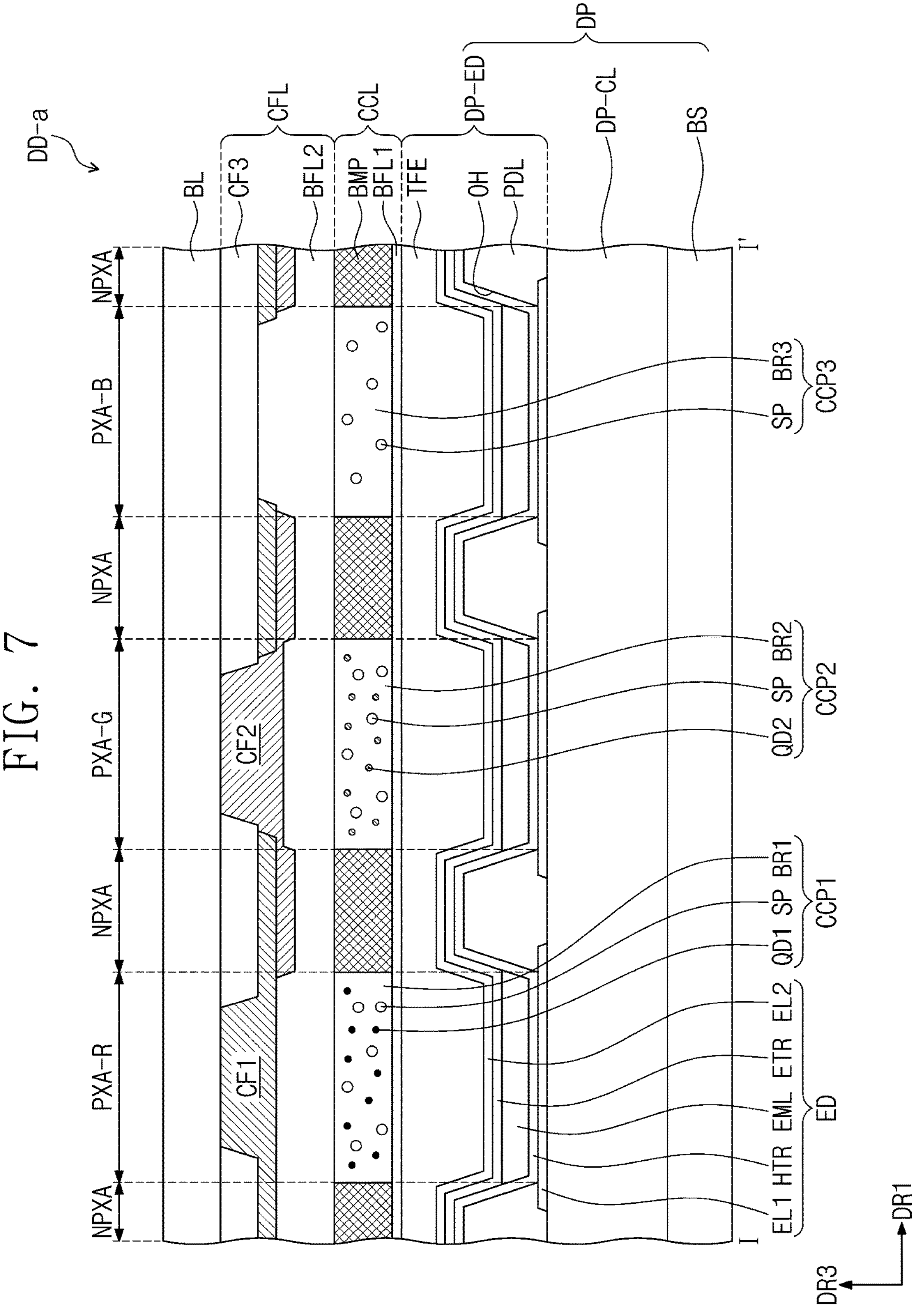
Figure 8:
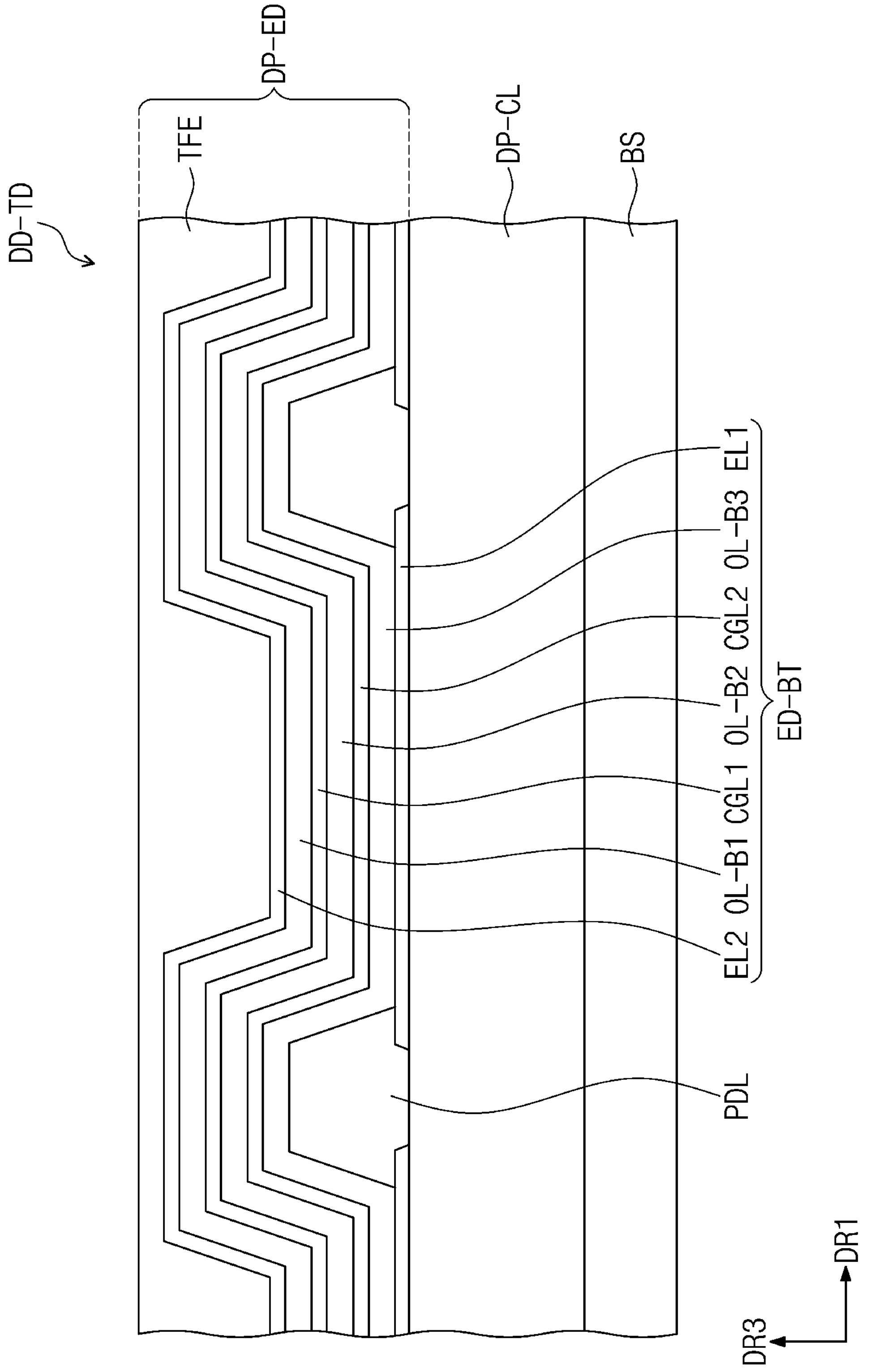
Figure 9:
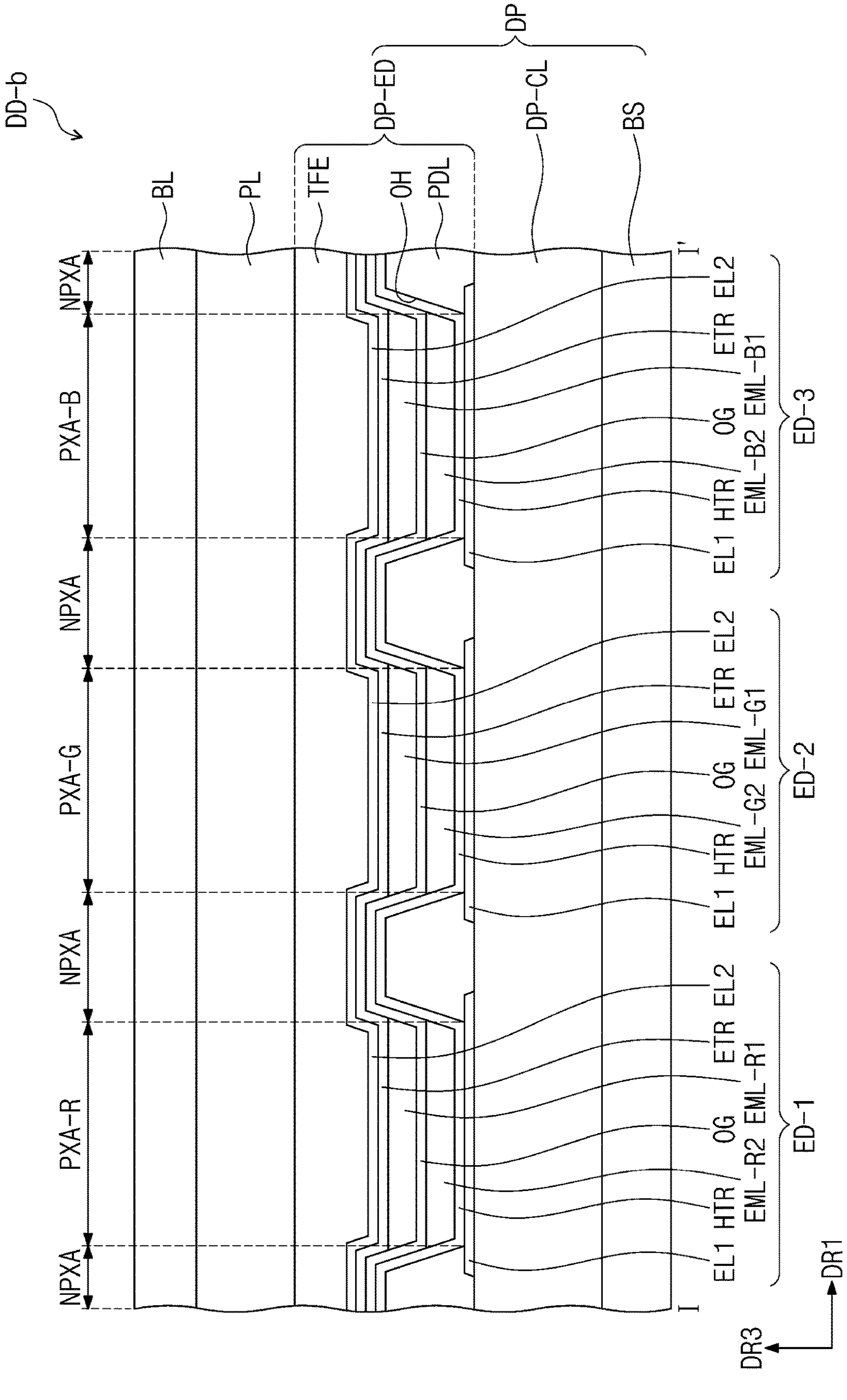
Figure 10:
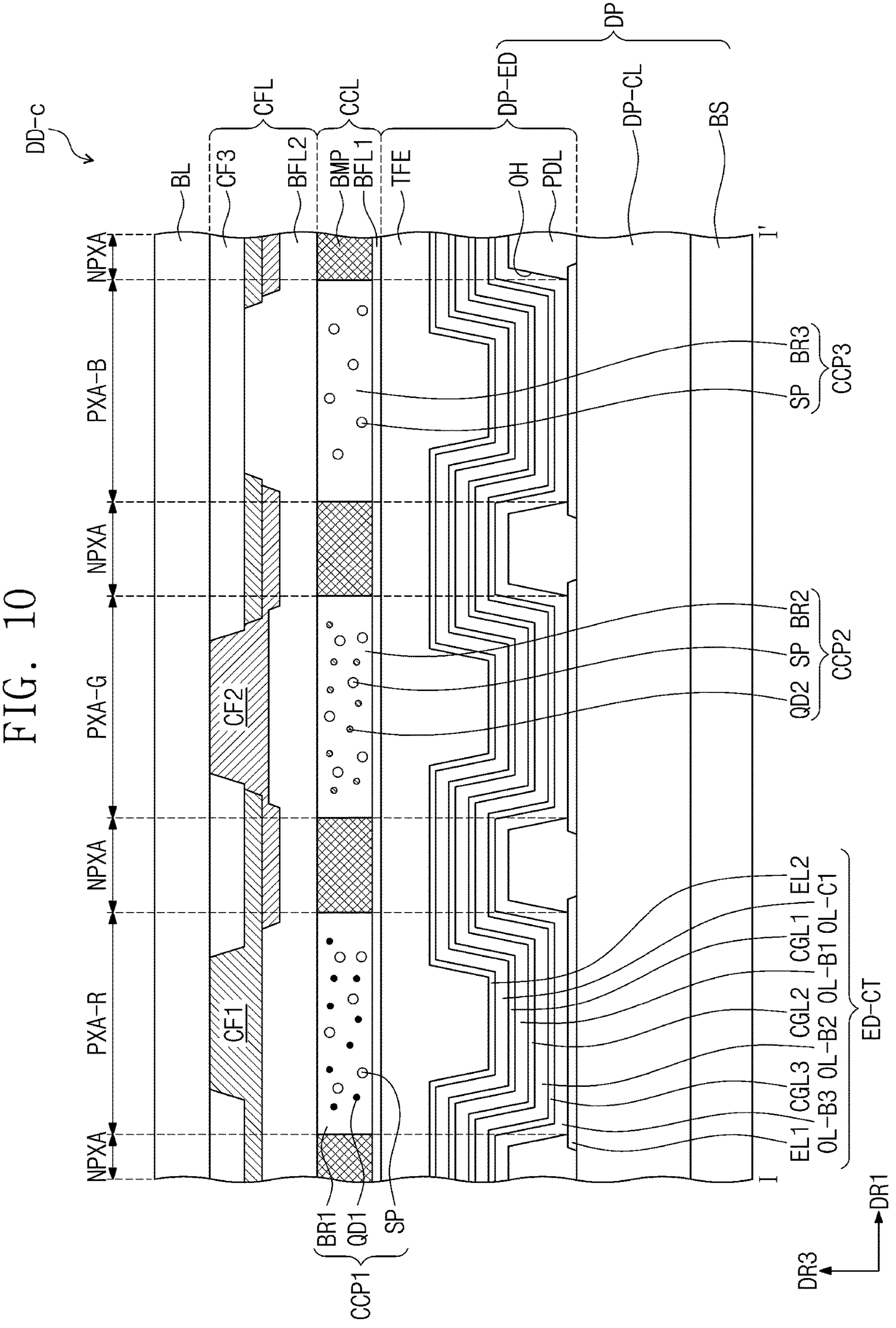

Each of FIGS. 7 and 8 is a cross-sectional view of a display apparatus according to one or more embodiments of the present disclosure;

FIG. 9 is a cross-sectional view illustrating a display apparatus according to one or more embodiments of the present disclosure; and FIG. 10 is a cross-sectional view illustrating a display apparatus according to one or more embodiments of the present disclosure.

DETAILED DESCRIPTION

The above objects, other objects, features and advantages of the inventive concept will be easily understood from preferred exemplary (example) embodiments with reference to the accompanying drawings. The inventive concept may, however, be embodied in different forms and should not be construed as limited to the embodiments set forth herein. Rather, exemplary (example) embodiments are provided so that the contents disclosed herein become thorough and complete, and the spirit of the inventive concept is sufficiently accepted (evident) for a person skilled in the art.

Like reference numerals refer to like elements for explaining each drawing. In the drawings, the sizes of elements may be enlarged for clarity of the inventive concept. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers (or parts) may also be present. Similarly, when a layer, a film, a region, a plate, etc. is referred to as being "under" another part, it can be "directly under" the other part, or intervening layers (or parts) may also be present. In contrast, when a layer, a film, a region, a plate, etc. is referred to as being "directly on" or "directly under" another part, no intervening layers (or parts) may be present.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

As used herein, the term "and/or" includes any and all combinations of one or more of the associated listed items.

Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein In the specification, the term "substituted or unsubstituted" may refer to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the substituents exemplified may be substituted or unsubstituted. For example, a biphenyl group may be interpreted as an aryl group and/or a phenyl group substituted with a phenyl group.

In the specification, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may each independently be monocyclic or polycyclic. In some embodiments, the rings formed by being bonded to each other may be connected to another ring to form a spiro structure.

In the specification, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, two methyl groups in 1,2-dimethylbenzene may be interpreted as "adjacent groups" to each other and two ethyl groups in 1,1-diethylcyclopentane may be interpreted as "adjacent groups" to each other. In some embodiments, two methyl groups in 4,5-dimethylphenanthrene may be interpreted as "adjacent groups" to each other.

In the specification, examples of the halogen atom may include a fluorine atom, a chlorine atom, a bromine atom, and an iodine atom.

In the specification, the alkyl group may be a linear, branched or cyclic alkyl group. The number of carbons in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the embodiment of the present disclosure is not limited thereto.

In the specification, a cycloalkyl group may refer to a cyclic alkyl group. The number of carbons in the cycloalkyl group may be 3 to 50, 3 to 30, 3 to 20, or 3 to 12. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptanyl group, a bicyclooctanyl group, a bicyclononanyl group, etc., but the embodiment of the present disclosure is not limited thereto.

In the specification, an aryl group refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the embodiment of the present disclosure is not limited thereto.

In the specification, the fluorenyl group may be substituted, and two substituents may be bonded to each other to form a spiro structure. Examples of cases where the fluorenyl group is substituted are as follows. However, the embodiment of the present disclosure is not limited thereto:

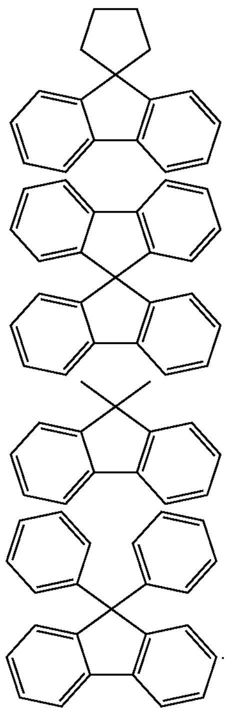

In the specification, the heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a pyridine group, a bipyridine group, a pyrimidine group, a triazine group, a triazole group, an acridine group, a pyridazine group, a pyrazine group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the embodiment of the present disclosure is not limited thereto.

In the specification, the above description of the aryl group may be applied to an arylene group except that the arylene group is a divalent group. The above description of the heteroaryl group may be applied to a heteroarylene group except that the heteroarylene group is a divalent group.

In the description, the silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, one or more embodiments of the present disclosure are not limited thereto.

In the specification, a thio group may include an alkylthio group and an arylthio group. The thio group may mean that a sulfur atom is bonded to the alkyl group or the aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but the embodiment of the present disclosure is not limited thereto.

In the specification, an oxy group may mean that an oxygen atom is bonded to the alkyl group or the aryl group as defined above. The oxy group may include an alkoxy group and an aryl oxy group. The alkoxy group may be a linear chain, a branched chain or a ring chain. The number of carbon atoms in the alkoxy group is not specifically limited, but may be, for example, 1 to 20 or 1 to 10. Examples of the oxy group include methoxy, ethoxy, n-propoxy, isopropoxy, butoxy, pentyloxy, hexyloxy, octyloxy, nonyloxy, decyloxy, benzyloxy, etc., but the embodiment of the present disclosure is not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but the embodiment of the present disclosure is not limited thereto.

In the specification, a direct linkage may refer to a single bond.

In some embodiments, in the description,

"*—"

refers to a position to be connected (e.g., a binding site).

Hereinafter, embodiments of the present disclosure will be described with reference to the accompanying drawings.

Figure 1:
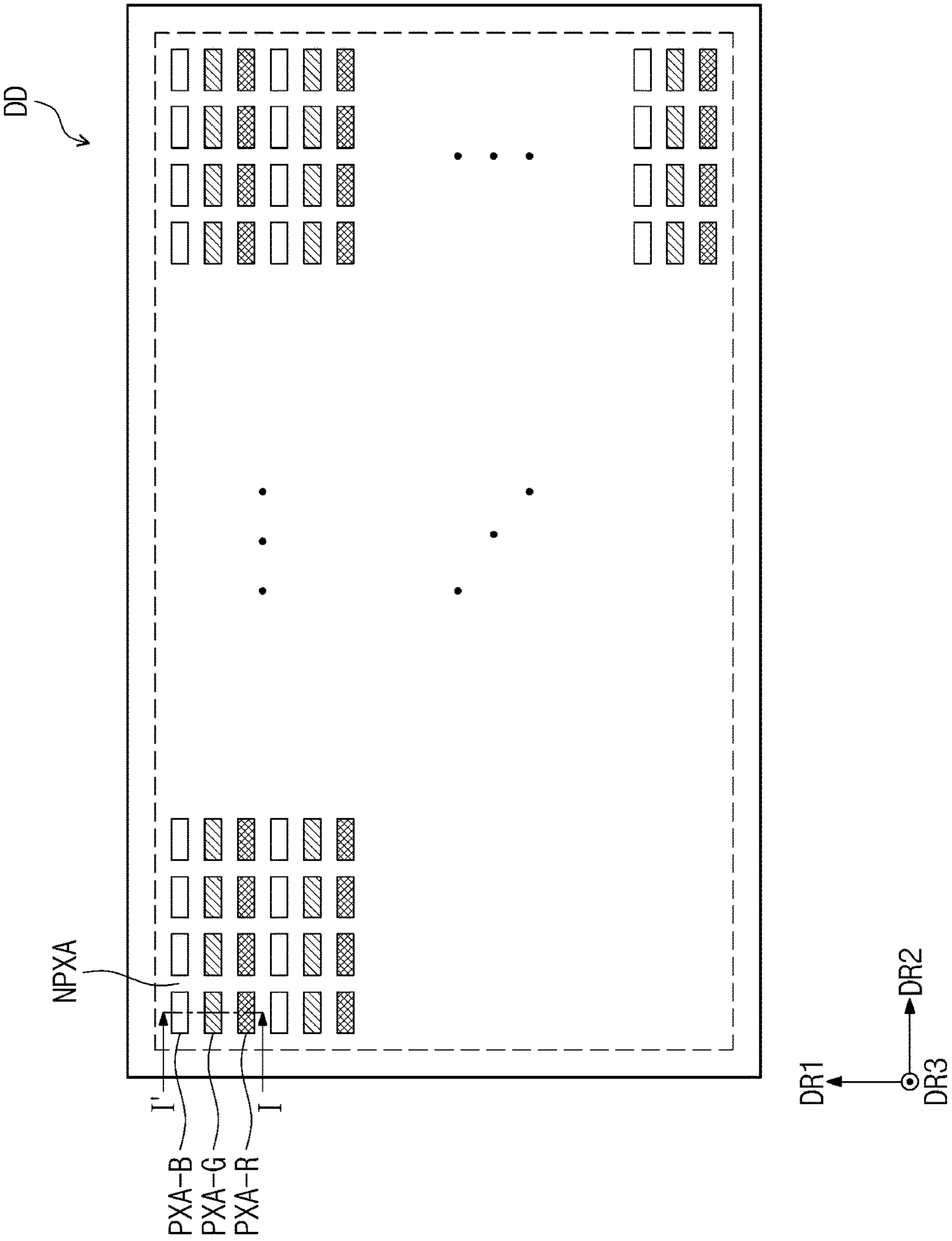
FIG. 1 is a plan view of a display apparatus according to one or more embodiments of the present disclosure.
Figure 2:
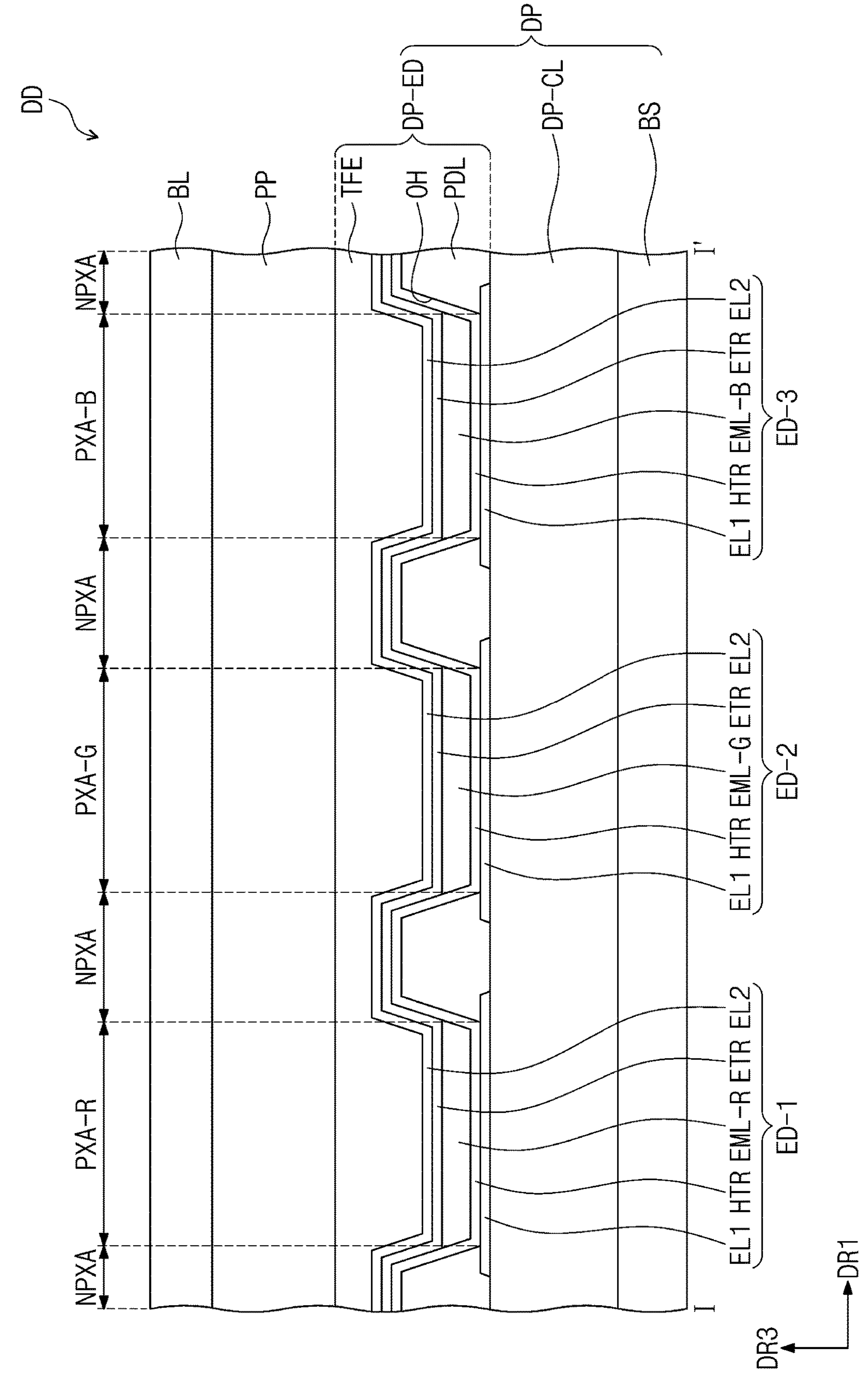
FIG. 2 is a cross-sectional view of a display apparatus according to one or more embodiments of the present disclosure.

FIG. 1 is a plan view illustrating one or more embodiments of a display apparatus DD. FIG. 2 is a cross-sectional view of the display apparatus DD of one or more embodiments. FIG. 2 is a cross-sectional view illustrating a part taken along line I-I' of FIG. 1.

The display apparatus DD may include a display panel DP and an optical layer PP disposed on the display panel DP. The display panel DP includes light emitting devices ED-1, ED-2, and ED-3. The display apparatus DD may include a plurality of light emitting devices ED-1, ED-2, and ED-3. The optical layer PP may be disposed on the display panel DP and control reflected light in the display panel DP due to external light. The optical layer PP may include, for example, a polarization layer and/or a color filter layer. In some embodiments, the optical layer PP may not be provided in the display apparatus DD.

A base substrate BL may be disposed on the optical layer PP. The base substrate BL may be a member which provides a base surface on which the optical layer PP is disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer (e.g., including an organic material and an inorganic material). In some embodiments, the base substrate BL may not be provided.

The display apparatus DD according to one or more embodiments may further include a filling layer. The filling layer may be disposed between a display device layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and the display device layer DP-ED. The display device layer DP-ED may include a pixel defining film PDL, the light emitting devices ED-1, ED-2, and ED-3 disposed between portions of the pixel defining film PDL, and an encapsulation layer TFE disposed on the light emitting devices ED-1, ED-2, and ED-3.

The base layer BS may be a member which provides a base surface on which the display device layer DP-ED is disposed. The base layer BS may be a glass substrate, a metal substrate, a plastic substrate, etc. However, the embodiment is not limited thereto, and the base layer BS may be an inorganic layer, an organic layer, or a composite material layer.

In one or more embodiments, the circuit layer DP-CL is disposed on the base layer BS, and the circuit layer DP-CL may include a plurality of transistors. Each of the transistors may include a control electrode, an input electrode, and an output electrode. For example, the circuit layer DP-CL may include a switching transistor and a driving transistor for driving the light emitting devices ED-1, ED-2, and ED-3 of the display device layer DP-ED.

Each of the light emitting devices ED-1, ED-2, and ED-3 may have a structure of a light emitting device ED of one or more embodiments according to FIGS. 3 to 6, which will be described in more detail herein below. Each of the light emitting devices ED-1, ED-2 and ED-3 may include a first electrode EL1, a hole transport region HTR, emission layers EML-R, EML-G and EML-B (respectively), an electron transport region ETR, and a second electrode EL2.

FIG. 2 illustrates one or more embodiments in which the emission layers EML-R, EML-G, and EML-B of the light emitting devices ED-1, ED-2, and ED-3 are disposed in openings OH defined in the pixel defining film PDL, and the hole transport region HTR, the electron transport region ETR, and the second electrode EL2 are provided as a common layer in the entire light emitting devices ED-1, ED-2, and ED-3. However, the embodiment of the present disclosure is not limited thereto, and in some embodiments, the hole transport region HTR and the electron transport region ETR in one or more embodiments may be provided by being patterned inside the openings OH defined in the pixel defining film PDL. For example, the hole transport region HTR, the emission layers EML-R, EML-G, and EML-B, and the electron transport region ETR of the light emitting devices ED-1, ED-2, and ED-3 in one or more embodiments may be provided by being patterned in an inkjet printing method.

The encapsulation layer TFE may cover the light emitting devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to one or more embodiments may include at least one inorganic film (hereinafter, an encapsulation-inorganic film). The encapsulation layer TFE according to one or more embodiments may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances such as dust particles. The encapsulation-inorganic film may include silicon nitride, silicon oxynitride, silicon oxide, titanium oxide, aluminum oxide, and/or the like, but the embodiment of the present disclosure is not particularly limited thereto. The encapsulation-organic film may include an acrylic-based compound, an epoxy-based compound, and/or the like. The encapsulation-organic film may include a photopolymerizable organic material, but the embodiment of the present disclosure is not particularly limited thereto.

The encapsulation layer TFE may be disposed on the second electrode EL2 and may be disposed filling the opening OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B may be regions in which light generated by the respective light emitting devices ED-1, ED-2 and ED-3 is emitted. The light emitting regions PXA-R, PXA-G, and PXA-B may be spaced apart from each other on a plane.

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. In some embodiments, in the specification, the light emitting regions PXA-R, PXA-G, and PXA-B may respectively correspond to pixels. The pixel defining film PDL may divide the light emitting devices ED-1, ED-2, and ED-3. The emission layers EML-R, EML-G and EML-B of the light emitting devices ED-1, ED-2 and ED-3 may be disposed in openings OH defined in the pixel defining film PDL and separated from each other.

The light emitting regions PXA-R, PXA-G and PXA-B may be divided into a plurality of groups according to the color of light generated from the light emitting devices ED-1, ED-2 and ED-3. In the display apparatus DD of one or more embodiments shown in FIGS. 1 and 2, three light emitting regions PXA-R, PXA-G, and PXA-B which emit red light, green light, and blue light, respectively, are illustrated. For example, the display apparatus DD of one or more embodiments may include the red light emitting region PXA-R, the green light emitting region PXA-G, and the blue light emitting region PXA-B that are separated from each other.

In the display apparatus DD according to one or more embodiments, the plurality of light emitting devices ED-1, ED-2 and ED-3 may be to emit light beams having wavelengths different from each other. For example, in one or more embodiments, the display apparatus DD may include a first light emitting device ED-1 that emits (e.g., is to emit) red light, a second light emitting device ED-2 that emits (e.g., is to emit) green light, and a third light emitting device ED-3 that emits (e.g., is to emit) blue light. For example, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, the embodiment of the present disclosure is not limited thereto, and the first to third light emitting devices ED-1, ED-2, and ED-3 may be to emit light beams in substantially the same wavelength range or at least one light emitting device may be to emit a light beam in a wavelength range different from the others. For example, the first to third light emitting devices ED-1, ED-2, and ED-3 may all emit blue light.

The light emitting regions PXA-R, PXA-G, and PXA-B in the display apparatus DD according to one or more embodiments may be arranged in a stripe form. Referring to FIG. 1, the plurality of red light emitting regions PXA-R, the plurality of green light emitting regions PXA-G, and the plurality of blue light emitting regions PXA-B each may be arranged along a second directional axis DR2. In some embodiments, the red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but the embodiment of the present disclosure is not limited thereto. Thus, the light emitting regions PXA-R, PXA-G, and PXA-B may have different areas from each other according to the wavelength range of the emitted light. In this case, the areas of the light emitting regions PXA-R, PXA-G, and PXA-B may refer to areas when viewed on a plane defined by the first directional axis DR1 and the second directional axis DR2.

In some embodiments, an arrangement form of the light emitting regions PXA-R, PXA-G, and PXA-B is not limited to the configuration illustrated in FIG. 1, and the order in which the red light emitting region PXA-R, the green light emitting region PXA-G, and the blue light emitting region PXA-B are arranged may be provided in one or more suitable combinations according to the characteristics of display quality required in the display apparatus DD. For example, the arrangement form of the light emitting regions PXA-R, PXA-G, and PXA-B may be a PENTILE® arrangement form (PENTILE® is a registered trademark owned by Samsung Display Co., Ltd.) or a DIAMOND OLED™ arrangement form (DIAMOND OLED™ is a trademark of Samsung Display Co., Ltd.).

In some embodiments, the areas of the light emitting regions PXA-R, PXA-G, and PXA-B may be different from each other. For example, in one or more embodiments, the area of the green light emitting region PXA-G may be smaller than that of the blue light emitting region PXA-B, but the embodiment of the present disclosure is not limited thereto.

Hereinafter, FIGS. 3 to 7 are cross-sectional views schematically illustrating light emitting devices according to embodiments. The light emitting devices ED according to embodiments each may include a first electrode EL1, a second electrode EL2 facing the first electrode EL1, and at least one functional layer disposed between the first electrode EL1 and the second electrode EL2. The at least one functional layer may include a hole transport region HTR, an emission layer EML, and an electron transport region ETR that are sequentially stacked. For example, each of the light emitting devices ED of embodiments may include the first electrode EL1, the hole transport region HTR, the emission layer EML, the electron transport region ETR, and the second electrode EL2 that are sequentially stacked.

Figure 3:
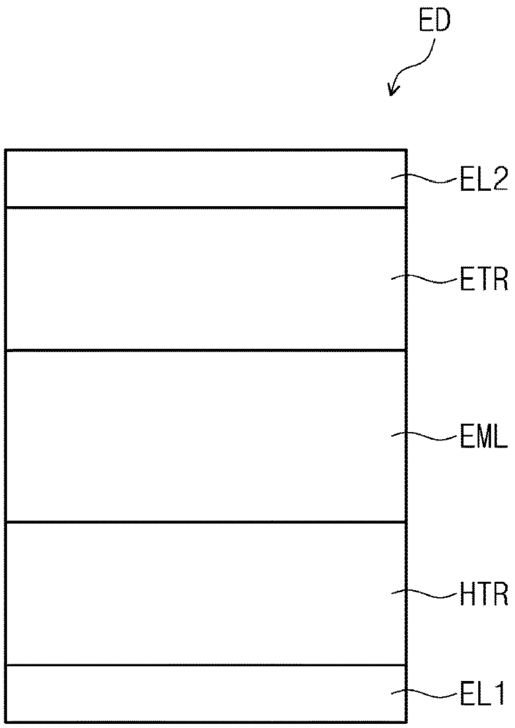
FIG. 3 is a cross-sectional view schematically illustrating a light emitting device according to one or more embodiments of the present disclosure.
Figure 4:
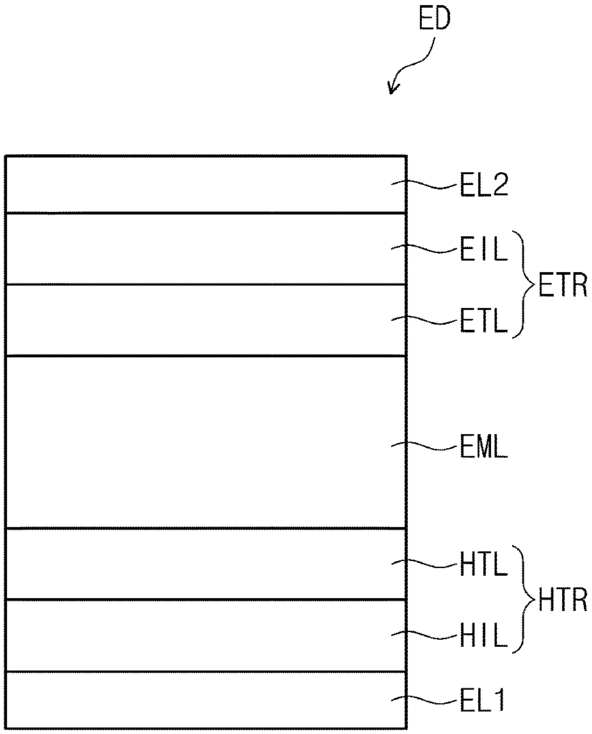
FIG. 4 is a cross-sectional view schematically illustrating a light emitting device according to one or more embodiments of the present disclosure.
Figure 5:
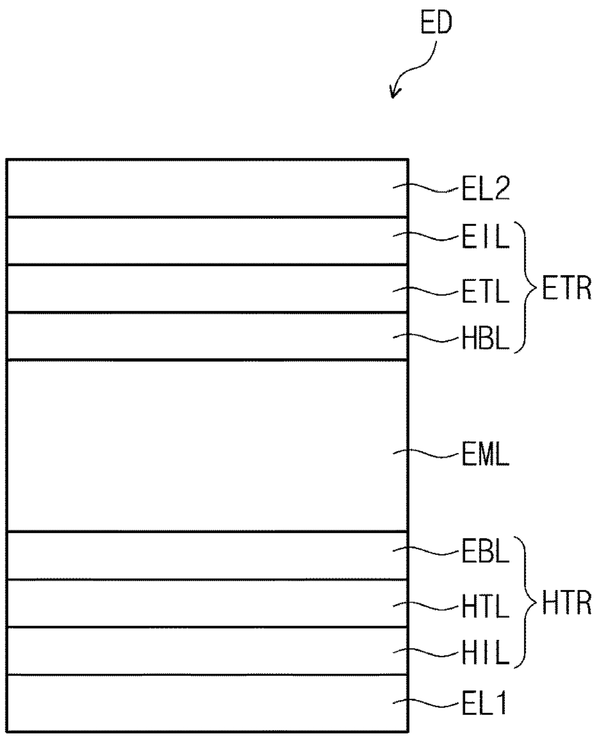
FIG. 5 is a cross-sectional view schematically illustrating a light emitting device according to one or more embodiments of the present disclosure.
Figure 6:
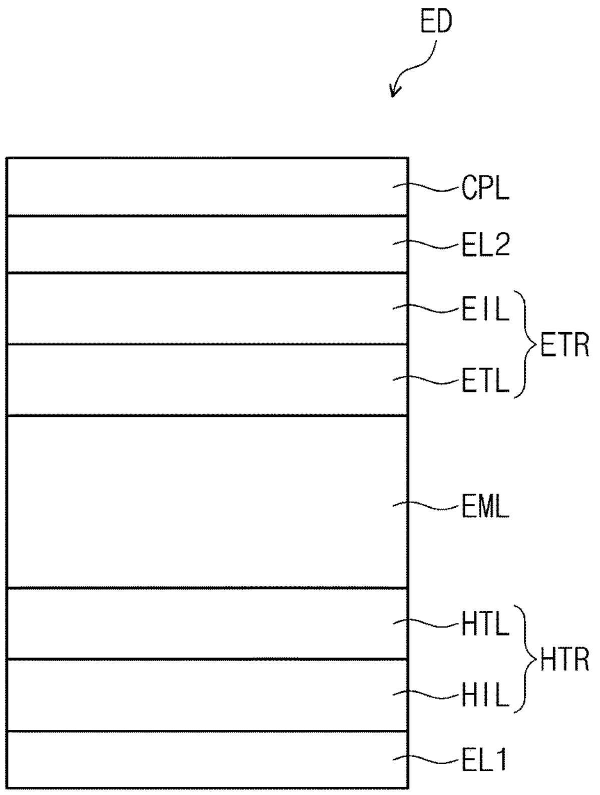
FIG. 6 is a cross-sectional view schematically illustrating a light emitting device according to one or more embodiments of the present disclosure.

Compared with FIG. 3, FIG. 4 illustrates a cross-sectional view of a light emitting device ED of one or more embodiments, in which a hole transport region HTR includes a hole injection layer HIL and a hole transport layer HTL, and an electron transport region ETR includes an electron injection layer EIL and an electron transport layer ETL. In some embodiments, compared with FIG. 3, FIG. 5 illustrates a cross-sectional view of a light emitting device ED of one or more embodiments, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 4, FIG. 6 illustrates a cross-sectional view of a light emitting device ED of one or more embodiments including a capping layer CPL disposed on a second electrode EL2. Compared with FIG. 4, FIG. 7 illustrates a cross-sectional view of a light emitting device ED of one or more embodiments, in which a hole transport region HTR includes a plurality of hole transport layers HTL1, HTL2, and HTL3.

The light emitting device ED of one or more embodiments may include the amine compound of one or more embodiments, which will be described in more detail herein below, in at least one functional layer of the hole transport region HTR, the emission layer EML, the electron transport region ETR, and/or the like.

The first electrode EL1 has conductivity (e.g., is a conductor). The first electrode EL1 may be formed of a metal material, a metal alloy, or a conductive compound. The first electrode EL1 may be an anode or a cathode. However, the embodiment of the present disclosure is not limited thereto. In some embodiments, the first electrode EL1 may be a pixel electrode. The first electrode EL1 may be a transmissive electrode, a transflective electrode, or a reflective electrode.

The first electrode EL1 may include at least one selected from among Ag, Mg, Cu, Al, Pt, Pd, Au, Ni, Nd, Ir, Cr, Li, Ca, LiF, Mo, Ti, W, In, Sn, and Zn, a compound of two or more selected therefrom, a mixture of two or more selected therefrom, and/or an oxide thereof.

When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, and/or a compound or mixture thereof (e.g., a mixture of Ag and Mg). In some embodiments, the first electrode EL1 may have a multilayer structure including a reflective film or a transflective film formed of any of the above-described materials, and a transparent conductive film formed of ITO, IZO, ZnO, ITZO, etc. For example, the first electrode EL1 may have a three-layer structure of ITO/Ag/ITO, but the embodiment of the present disclosure is not limited thereto. In some embodiments, the embodiment of the present disclosure is not limited thereto, and the first electrode EL1 may include one or more of the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission-auxiliary layer, or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but the embodiment of the present disclosure is not limited thereto.

The hole transport region HTR may be formed utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1:

Formula H-1

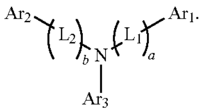

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer from 0 to 10. In some embodiments, when a or b is an integer of 2 or greater, a plurality of $L_1$s and $L_2$s may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In some embodiments, in Formula H-1, $Ar_3$ may be a substituted or unsubstituted aryl group having 6 to 30 ring-forming carbon atoms.

The compound represented by Formula H-1 may be a monoamine compound. In some embodiments, the compound represented by Formula H-1 may be a diamine compound in which at least one selected from among $Ar_1$ to $Ar_3$ includes the amine group as a substituent. In some embodiments, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one selected from among the compounds of Compound Group H. However, the compounds listed in Compound Group H are merely examples, and the compounds represented by Formula H-1 are not limited to those represented by Compound Group H:

Compound Group H

Compound Group H

H-1-1

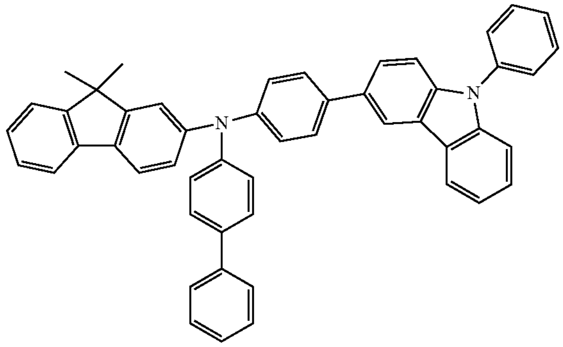

-continued
H-1-2
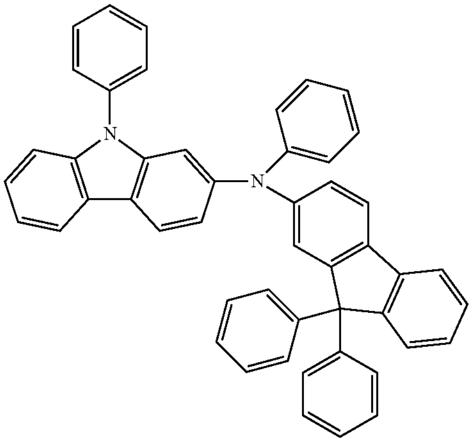
H-1-3
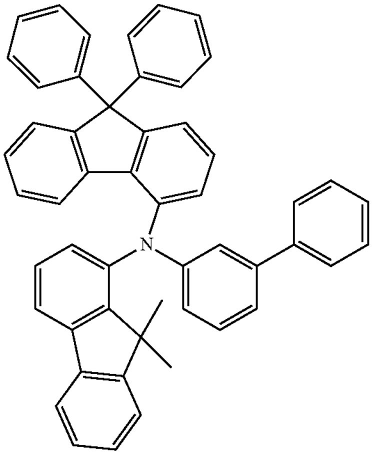
H-1-4
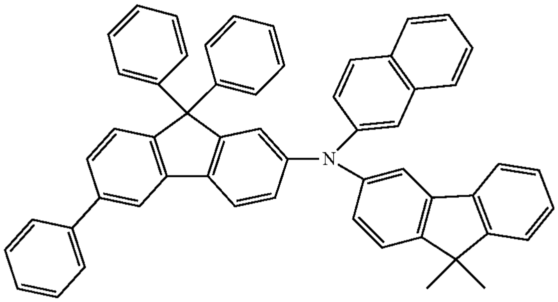
H-1-5
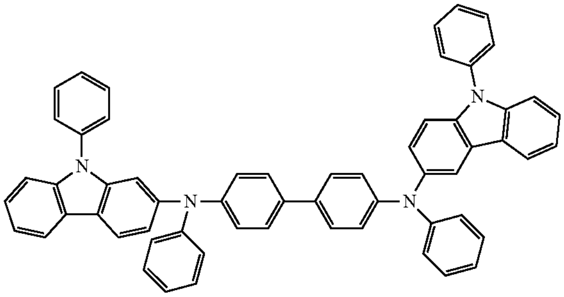
-continued
H-1-6
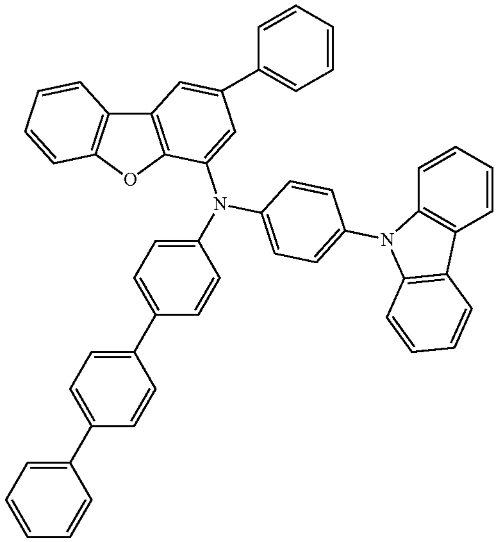
H-1-7
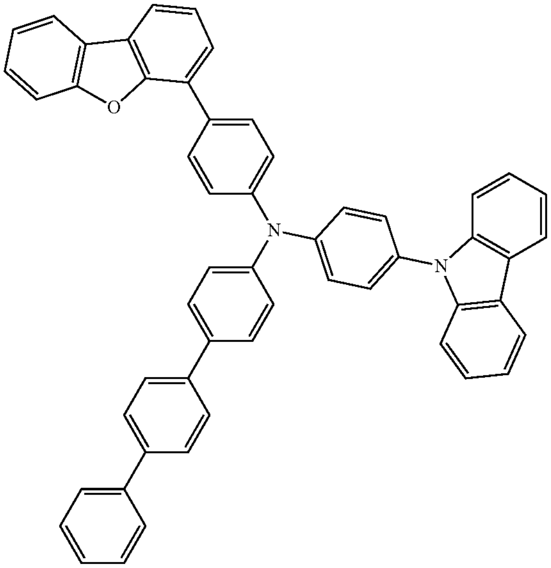
H-1-8
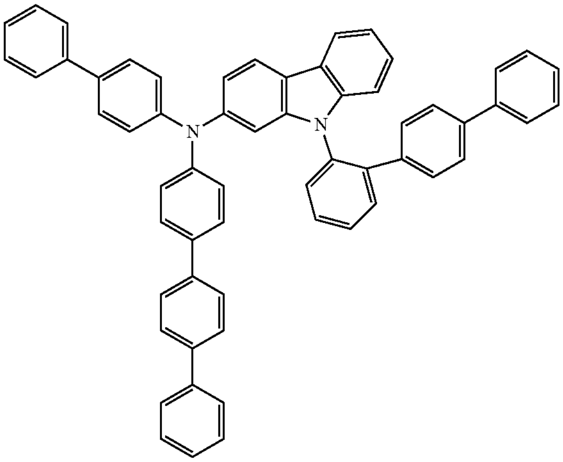

-continued
H-1-9
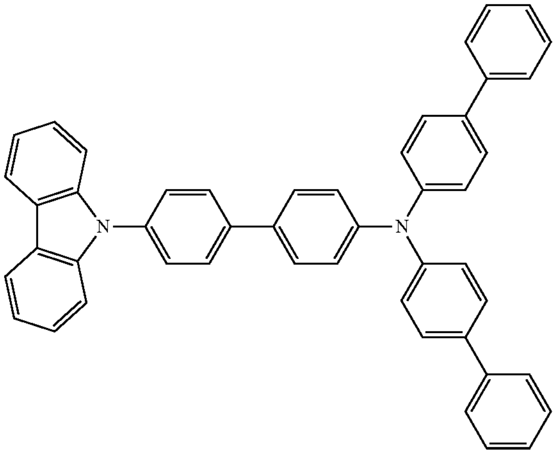
H-1-10
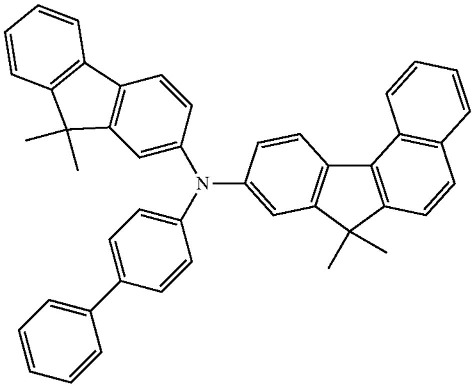
H-1-11
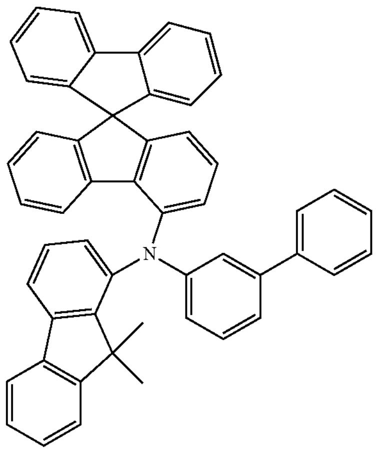
-continued
H-1-12
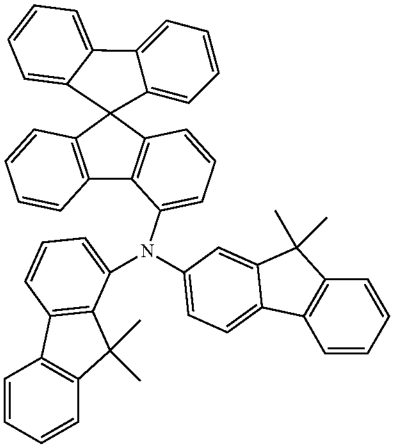
H-1-13
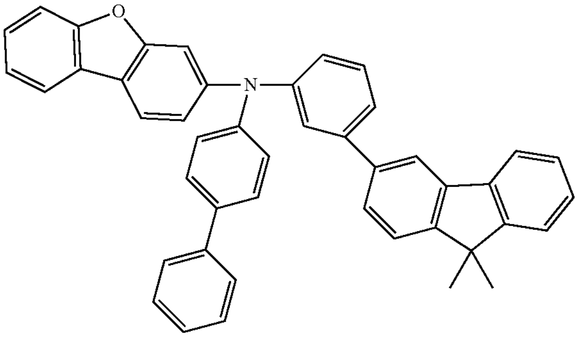
H-1-14
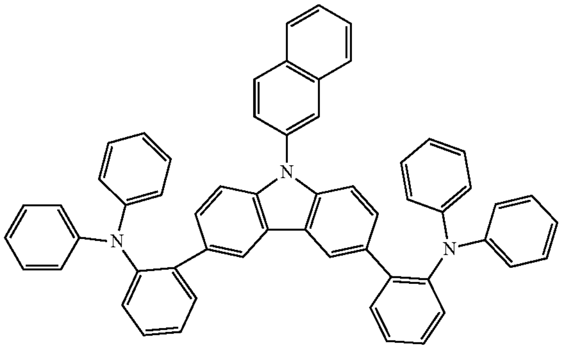
H-1-15
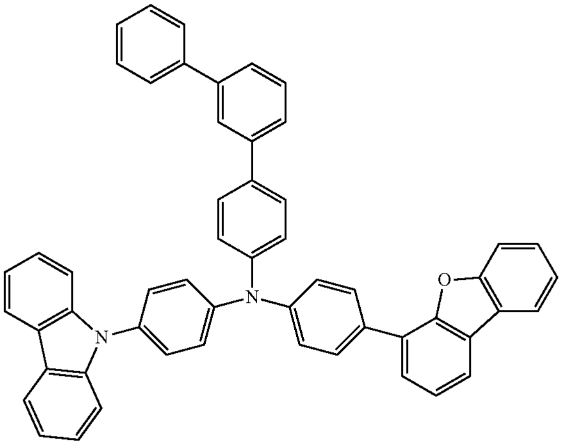

-continued

H-1-16

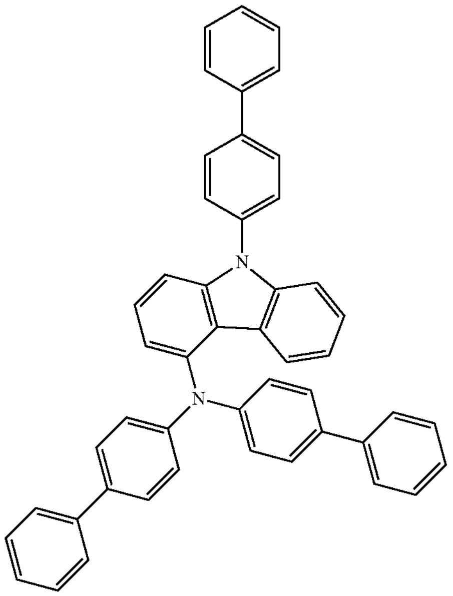

H-1-17

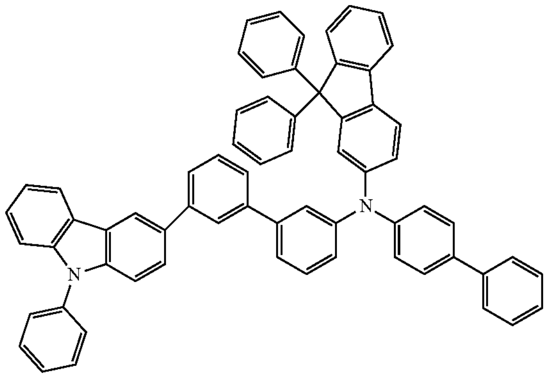

H-1-18

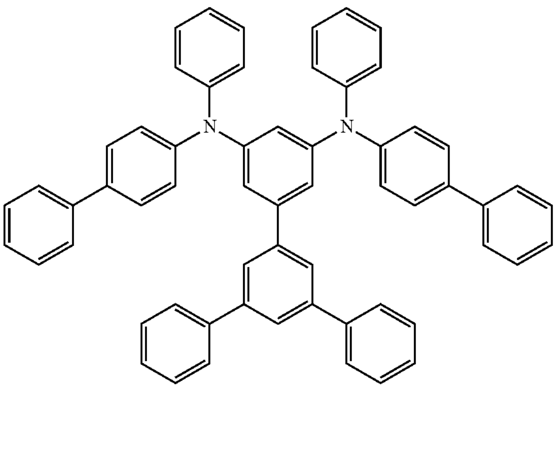

-continued

H-1-19

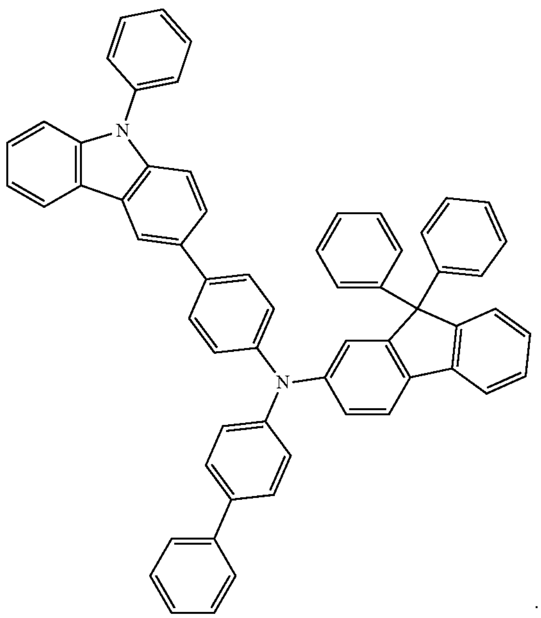

The hole transport region may include a compound represented by Formula H-a. The compound represented by Formula H-a may be a monoamine compound.

Formula H-a

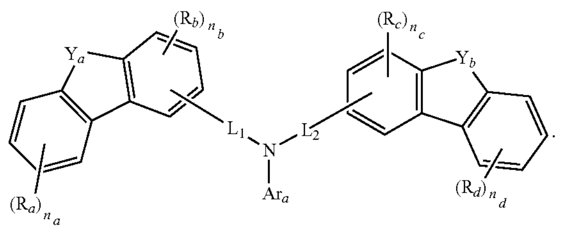

In Formula H-a, $Y_a$ and $Y_b$ may each independently be $CR_eR_f$, $NR_g$, O, or S. $Y_a$ and $Y_b$ may be the same as or different from each other. In an embodiment, both (e.g., simultaneously) $Y_a$ and $Y_b$ may be $CR_eR_f$. In some embodiments, any one selected from among $Y_a$ and $Y_b$ may be $CR_eR_f$, and the other (the substituent that is not $CR_eR_f$) may be $NR_g$.

In Formula H-a, Ara may be a substituted or unsubstituted aryl group having 6 to 30 ring-forming carbon atoms, or a substituted or unsubstituted heteroaryl group having 2 to 30 ring-forming carbon atoms. For example, Ara may be a substituted or unsubstituted phenyl group, a substituted or unsubstituted biphenyl group, a substituted or unsubstituted naphthyl group, a substituted or unsubstituted fluorenyl group, or a substituted or unsubstituted terphenyl group.

In Formula H-a, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. For example, $L_1$ and $L_2$ may be a direct linkage, a substituted or unsubstituted phenylene group, or a substituted or unsubstituted divalent biphenyl group.

In Formula H-a, $R_a$ to $R_g$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. For example, $R_a$ to $R_g$ may each independently be a hydrogen atom, a substituted or unsubstituted methyl group, or a substituted or unsubstituted phenyl group.

In Formula H-a, $n_a$ and $n_d$ may each independently be an integer from 0 to 4, and $n_b$ and $n_c$ may each independently be an integer from 0 to 3.

The hole transport region HTR may include a phthalocyanine compound such as copper phthalocyanine; $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCfN), etc.

The hole transport region HTR may include a carbazole-based derivative such as N-phenyl carbazole or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) or 4,4',4"-tris (N-carbazolyl)triphenylamine (TCTA), N,N'-di (naphthalene-I-yl)-N,N'-diphenyl-benzidine (NPB), 4,4'-cyclohexylidene bis[N,N-bis(4-methylphenyl] benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of a hole injection layer HIL, a hole transport layer HTL, or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 250 Å to about 1,000 Å. For example, when the hole transport region HTR includes the electron blocking layer EBL, the electron blocking layer EBL may have a thickness of about 10 Å to about 1,000 Å. When the thicknesses of the hole transport region HTR, the hole injection layer HIL, the hole transport layer HTL and the electron blocking layer EBL satisfy the above-described ranges, satisfactory (suitable) hole transport properties may be achieved without a substantial increase in driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but the embodiment of the present disclosure is not limited thereto. For example, the p-dopant may include a metal halide compound such as CuI or RbI, a quinone derivative such as tetracyanoquinodimethane (TCNQ) or 2,3,5,6-tetrafluoro-7,7'8,8-tetracyanoquinodimethane (F4-TCNQ), a metal oxide such as tungsten oxide or molybdenum oxide, a cyano group-containing compound such as dipyrazino[2,3-f: 2',3'-h] quinoxaline-2,3,6,7,10,11-hexacarbonitrile (HATCN) or 4-[[2,3-bis [cyano-(4-cyano-2,3,5,6-tetrafluorophenyl)methylidene]cyclopropylidene]-cyanomethyl]-2,3,5,6-tetrafluorobenzonitrile (NDP9), etc., but the embodiment of the present disclosure is not limited thereto.

As described above, the hole transport region HTR may further include at least one of the buffer layer or the electron blocking layer EBL in addition to the hole injection layer HIL and the hole transport layer HTL. The buffer layer may compensate for a resonance distance according to the wavelength of light emitted from the emission layer EML and may thus increase light emission efficiency. A material that may be contained in the hole transport region HTR may be utilized as a material to be contained in the buffer layer. The electron blocking layer EBL is a layer that serves to prevent or reduce the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

In the light emitting device ED of an embodiment, the emission layer EML may include a plurality of luminescent materials. In the light emitting device ED of an embodiment, the emission layer EML may include a first compound, and at least one of a second compound, a third compound, or a fourth compound. In the light emitting device ED of an embodiment, the emission layer EML may include at least one host and at least one dopant. For example, the emission layer EML of an embodiment may include a first dopant, and include, as a host, a first host and a second host that are different. The emission layer EML of an embodiment may include the first host and the second host as described above, and a first dopant and a second dopant that are different.

In the emission layer EML of the light emitting device ED of an embodiment, the first compound may include a fused polycyclic compound having a structure in which a plurality of aromatic rings are fused via one boron atom and two heteroatoms.

device EDdevice EDdevice EDdevice EDdevice EDdevice EDdevice EDdevice EDdevice EDdevice EDThe fused polycyclic compound of the present embodiments is represented by the following Formula 1:

Formula 1

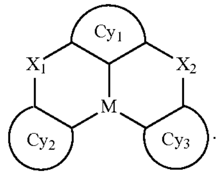

In Formula 1, M is B, Al, Ga, or In. M may be any one among the elements in Group 13. For example, M may be boron (B).

In Formula 1, $X_1$ and $X_2$ may each independently be $NR_1$, O, S, $P(=O)R_2$, or $P(=S)R_3$. $R_1$ to $R_3$ may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_1$ to $R_3$ may be each independently combined with an adjacent group to form a ring. In an embodiment, $X_1$ and $X_2$ may each independently be $NR_1$, or O. For example, in the fused polycyclic compound represented by Formula 1, both $X_1$ and $X_2$ may be $NR_1$. In some embodiments, both $X_1$ and $X_2$ may be O. In some embodiments, any one among $X_1$ and $X_2$ may be $NR_1$ and the other one may be O. In case where at least one among $X_1$ and $X_2$ is $NR_1$, $R_1$ may be a substituted or unsubstituted phenyl group. For example, $R_1$ may be an unsubstituted phenyl group. In some embodiments, $R_1$ may be a 1,3,5-trimethylphenyl group.

In Formula 1, $Cy_1$ to $Cy_3$ may each independently be a substituted or unsubstituted aromatic hydrocarbon ring, or a substituted or unsubstituted aromatic heterocycle. $Cy_1$ to $Cy_3$ may each independently be a five- or six-member substituted or unsubstituted aromatic hydrocarbon ring, or a substituted or unsubstituted aromatic heterocycle. Optionally, $Cy_1$ to $Cy_3$ may each independently be combined with an adjacent group to form an additional ring. $Cy_1$ to $Cy_3$ may each independently be a substituted or unsubstituted six-member aromatic hydrocarbon ring.

In Formula 1, at least one among $Cy_1$ to $Cy_3$ is substituted with a substituent represented by the following Formula 2:

Formula 2

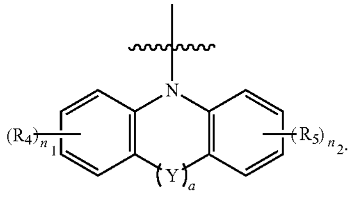

In Formula 2, $R_4$ and $R_5$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. In some embodiments, $R_4$ and $R_5$ may each independently be combined with an adjacent group to form an additional ring.

At least one among $R_4$ and $R_5$ may be a substituted or unsubstituted amine group, or a substituted or unsubstituted carbazole group. For example, any one among $R_4$ and $R_5$ may be a substituted or unsubstituted N,N-diphenylamine group, or a substituted or unsubstituted carbazole group. In some embodiments, both $R_4$ and $R_5$ may be substituted or unsubstituted N,N-diphenylamine groups, or substituted or unsubstituted carbazole groups.

In Formula 2, Y is a direct linkage, and "a" is 0 or 1. If "a" is 0, the substituent represented by Formula 2 may be a substituted or unsubstituted N,N-diphenylamine group. If "a" is 1, the substituent represented by Formula 2 may be a substituted or unsubstituted carbazole group.

In Formula 2, $n_1$ and $n_2$ may each independently be an integer of 0 to 5. Meanwhile, the sum of "$n_1$" and "a" is an integer of 5 or less, and the sum of "$n_2$" and "a" is an integer of 5 or less. That is, when "a" is 0, "$n_1$" is an integer of 0 or more and 5 or less, and when "a" is 1, "$n_1$" is an integer of 0 or more and 4 or less. When "a" is 0, "$n_2$" is an integer of 0 or more and 5 or less, and when "a" is 1, "$n_2$" is an integer of 0 or more and 4 or less. If $n_1$ is 0, the fused polycyclic compound according to embodiments may not be substituted with $R_4$. A case where $n_1$ is 4 and "a" is 1, and all $R_4$ groups are hydrogen atoms, may be the same as a case where $n_1$ is 0. A case where $n_1$ is 5 and a is 0, and all $R_4$ groups are hydrogen atoms, may be the same as a case where $n_1$ is 0. If $n_1$ is an integer of 2 or more, a plurality of $R_4$ groups may be the same, or at least one among the plurality of $R_4$ groups may be different. If $n_2$ is 0, the fused polycyclic compound may not be substituted with $R_5$. A case where $n_2$ is 4 and "a" is 1, and all $R_5$ groups are hydrogen atoms, may be the same as a case where $n_2$ is 0. A case where $n_2$ is 5 and "a" is 0, and all $R_5$ groups are hydrogen atoms, may be the same as a case where $n_2$ is 0. If $n_2$ is an integer of 2 or more, a plurality of $R_5$ groups may be the same or at least one among the plurality of $R_5$ groups may be different.

In Formula 2, at least one among $n_1$ and $n_2$ is an integer of 1 or more. If $R_4$ is a substituted or unsubstituted amine group, or a substituted or unsubstituted carbazole group, $n_1$ is an integer of 1 to 5. If $R_5$ is a substituted or unsubstituted amine group, or a substituted or unsubstituted carbazole group, $n_2$ is an integer of 1 to 5. That is, the fused polycyclic compound of the present embodiments may have a structure in which a first hetero substituent including nitrogen is substituted at the fused polycyclic ring structure and in addition, a second hetero substituent including nitrogen is additionally substituted at the first hetero substituent.

The fused polycyclic compound of the present embodiments includes a nitrogen-containing hetero substituent, which reinforces the donor properties of electrons when compared with the related art polycyclic compound including two nitrogen atoms and one boron atom in a core. Particularly, the fused polycyclic compound of the present embodiments has a structure in which a first hetero substituent including nitrogen is substituted at the fused polycyclic ring and in addition, a second hetero substituent including nitrogen is additionally substituted at the first hetero substituent. In addition, the fused polycyclic compound of the present embodiments shows multiple resonance by a plurality of aromatic rings forming fused rings, to easily separate HOMO and LUMO states in one molecule, and may be used as a material emitting delayed fluorescence. The fused polycyclic compound according to the embodiments includes a double nitrogen-containing hetero substituent which reinforces the donor properties of electrons when compared with the related art polycyclic compound including two nitrogen atoms and one boron atom, and may have a decreased difference ($\Delta E_{ST}$) between the lowest triplet excitation energy level (T1 level) and the lowest singlet excitation energy level (S1 level). Accordingly, if the fused polycyclic compound of the present embodiments is used as a material for emitting delayed florescence, the emission efficiency of a light emitting device may be even further improved.

The fused polycyclic compound represented by Formula 1 may be represented by the following Formula 3:

Formula 3

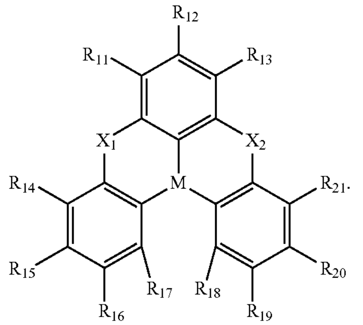

In Formula 3, $R_{11}$ to $R_{21}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_{11}$ to $R_{21}$ may each independently be combined with an adjacent group to form an additional ring.

At least one among $R_{11}$ to $R_{21}$ may be represented by Formula 2. For example, at least one among $R_{12}$, $R_{15}$, and $R_{20}$ may be represented by Formula 2. At least one among $R_{12}$, $R_{15}$, and $R_{20}$ may be a substituted or unsubstituted amine group, or a substituted or unsubstituted carbazole group. At least one among $R_{12}$, $R_{15}$, and $R_{20}$ may be a substituted or unsubstituted N,N-diphenylamine group, or a substituted or unsubstituted carbazole group. At least one among $R_{12}$, $R_{15}$, and $R_{20}$ may be an unsubstituted N,N-diphenylamine group, a N,N-diphenylamine group which is substituted with a substituted or unsubstituted carbazole group, or a substituted or unsubstituted carbazole group.

Meanwhile, in Formula 3, the same explanation on M, $X_1$, and $X_2$ provided in reference to Formula 1 may be applied.

The fused polycyclic compound represented by Formula 3 may be represented by the following Formula 4:

Formula 4

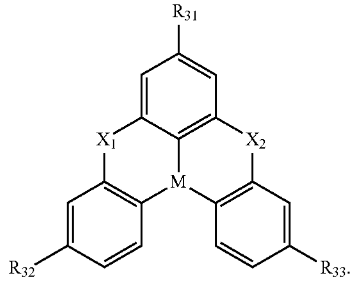

In Formula 4, $R_{31}$ to $R_{33}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_{31}$ to $R_{33}$ may each independently be combined with an adjacent group to form an additional ring.

At least one among $R_{31}$ to $R_{33}$ may be represented by Formula 2. At least one among $R_{31}$ to $R_{33}$ may be a substituted or unsubstituted amine group, or a substituted or unsubstituted carbazole group. At least one among $R_{31}$ to $R_{33}$ may be a substituted or unsubstituted N,N-diphenylamine group, or a substituted or unsubstituted carbazole group. At least one among $R_{31}$ to $R_{33}$ may be an unsubstituted N,N-diphenylamine group, a N,N-diphenylamine group which is substituted with a substituted or unsubstituted carbazole group, or a substituted or unsubstituted carbazole group.

Meanwhile, in Formula 4, the same explanation on M, $X_1$, and $X_2$ provided in reference to Formula 1 may be applied.

In Formula 1, the substituent represented by Formula 2 may be represented by the following Formula 5-1 or Formula 5-2:

Formula 5-1

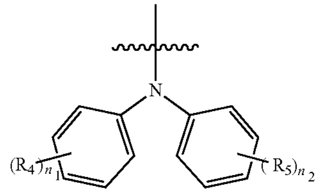

Formula 5-2

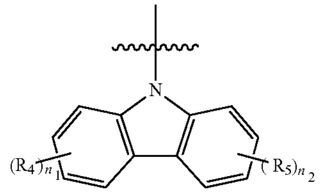

Formula 5-1 may correspond to Formula 2 where "a" is 0. Formula 5-2 may correspond to Formula 2 where "a" is 1.

Meanwhile, in Formula 5-1 and Formula 5-2, the same explanation for $R_4$, $R_5$, $n_1$, and $n_2$ provided in reference to Formula 2 may be applied.

The substituent represented by Formula 2 may be represented by any one among the following Formula 6-1 to Formula 6-4:

Formula 6-1

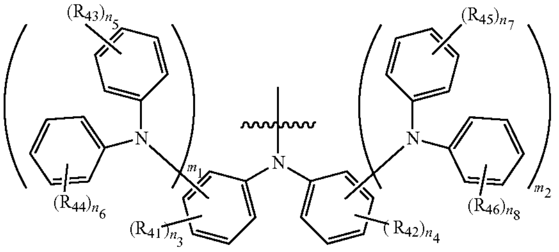

-continued

Formula 6-2

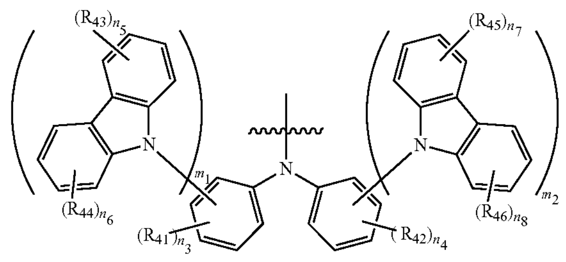

Formula 6-3

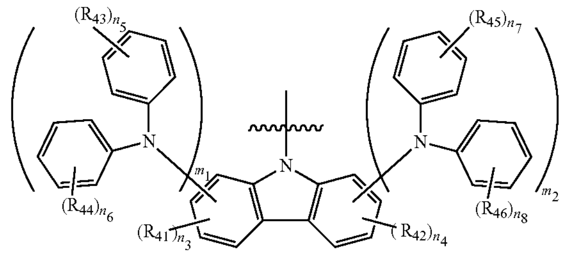

Formula 6-4

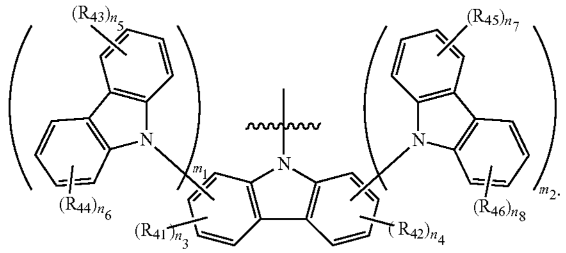

In Formulae 6-1 to 6-4, $R_{41}$ to $R_{46}$ (may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_{41}$ to $R_{46}$ may each independently be combined with an adjacent group to form an additional ring. For example, all of $R_{41}$ to $R_{46}$ may be hydrogen atoms.

In Formulae 6-1 to 6-4, $n_3$ and $n_4$ may each independently be an integer of 0 to 3. If $n_3$ is 0, the fused polycyclic compound according to the embodiments may not be substituted with $R_{41}$. If $n_3$ is an integer of 2 or more, a plurality of $R_{41}$ groups may be the same or at least one among the plurality of $R_{41}$ groups may be different. If $n_4$ is 0, the fused polycyclic compound may not be substituted with $R_{42}$. If $n_4$ is an integer of 2 or more, a plurality of $R_{42}$ groups may be the same or at least one among the plurality of $R_{42}$ groups may be different.

In Formulae 6-1 to 6-4, $n_5$ to $n_8$ may each independently be an integer of 0 to 4. If $n_5$ is 0, the fused polycyclic compound according to the embodiments may not be substituted with $R_{43}$. If $n_5$ is an integer of 2 or more, a plurality of $R_{43}$ groups may be the same or at least one among the plurality of $R_{43}$ groups may be different. If $n_6$ is 0, the fused polycyclic may not be substituted with $R_{44}$. If $n_6$ is an integer of 2 or more, a plurality of $R_{44}$ groups may be the same or at least one among the plurality of $R_{44}$ groups may be different. If $n_7$ is 0, the fused polycyclic compound may not be substituted with $R_{45}$. If $n_7$ is an integer of 2 or more, a plurality of $R_{45}$ groups may be the same or at least one among the plurality of $R_{45}$ groups may be different. If $n_8$ is 0, the fused polycyclic compound may not be substituted with $R_4s$. If $n_8$ is an integer of 2 or more, a plurality of $R_{46}$ groups may be the same or at least one among the plurality of $R_{46}$ groups may be different.

In Formulae 6-1 to 6-4, $m_1$ and $m_2$ may each independently be 0 or 1. In this case, $m_1+m_2\neq 0$, that is, at least one among $m_1$ and $m_2$ may be 1. A case where both $m_1$ and $m_2$ are 0, is excluded. In one or more embodiments, one among $m_1$ and $m_2$ may be 1, and the other one may be 0. In some embodiments, both $m_1$ and $m_2$ may be 1.

The substituent represented by Formula 2 may be represented by the following Formula 7-1 to Formula 7-4:

Formula 7-1

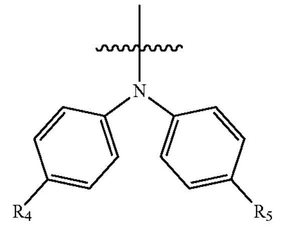

Formula 7-2

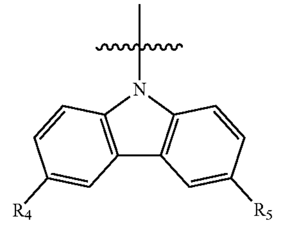

Formula 7-3

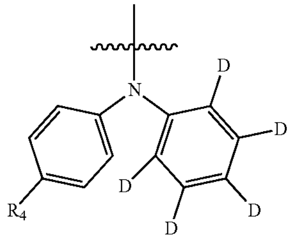

Formula 7-4

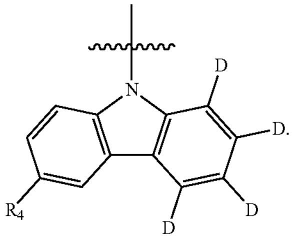

In Formulae 7-1 to 7-4, the same explanation on $R_4$, and $R_5$ provided in reference to Formula 2 may be applied.

The fused polycyclic compound of the present embodiments may be any one among the compounds represented in Compound Group 1 below. The light emitting device ED of the present embodiments may include at least one fused polycyclic compound among the compounds represented in Compound Group 1 in an emission layer EML.

Compound Group 1
1
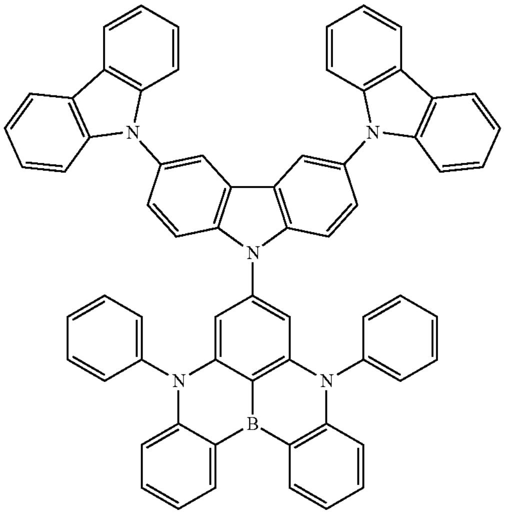
2
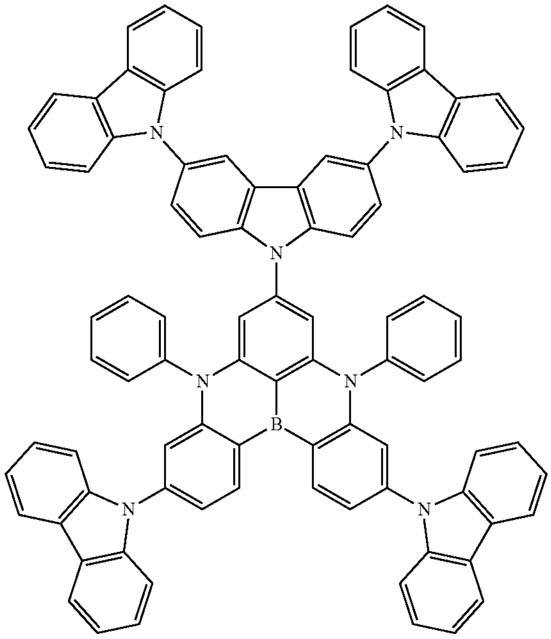
3
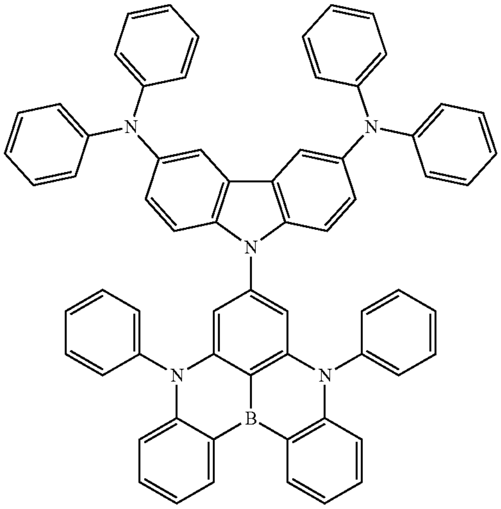
4
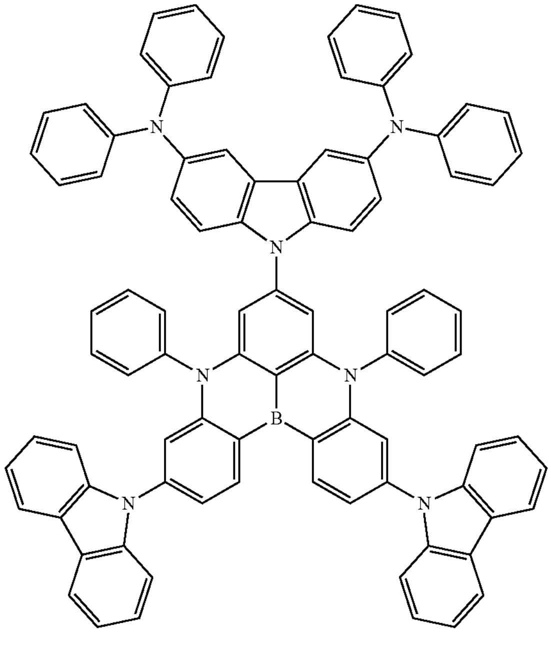

-continued
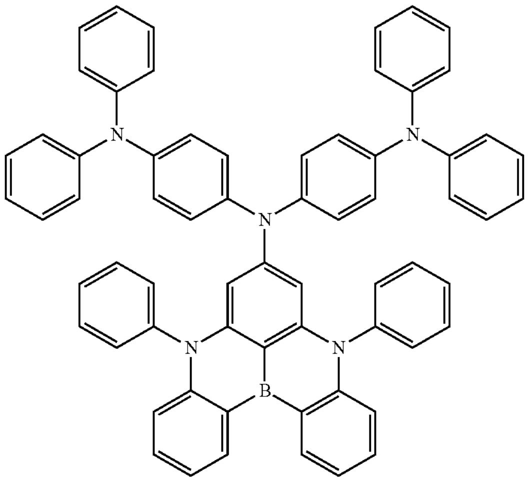
5
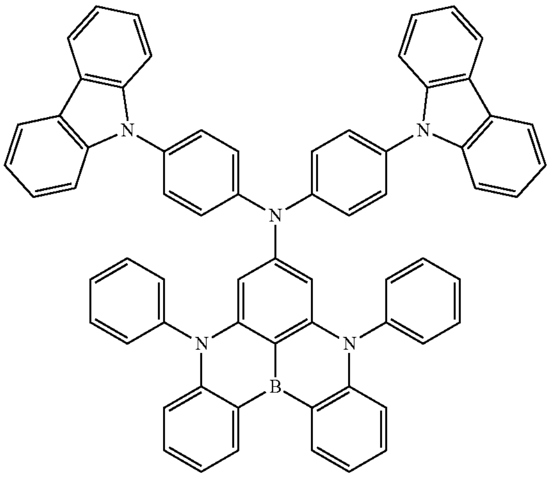
6
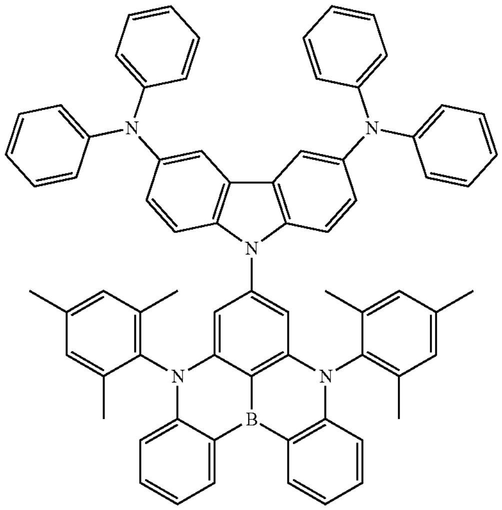
7
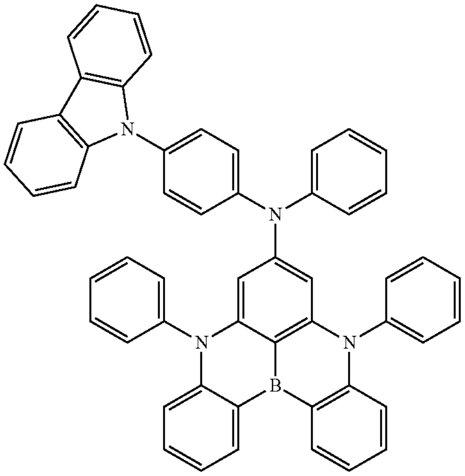
8
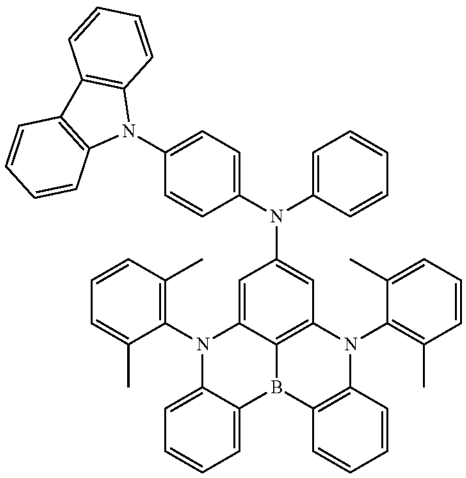
9
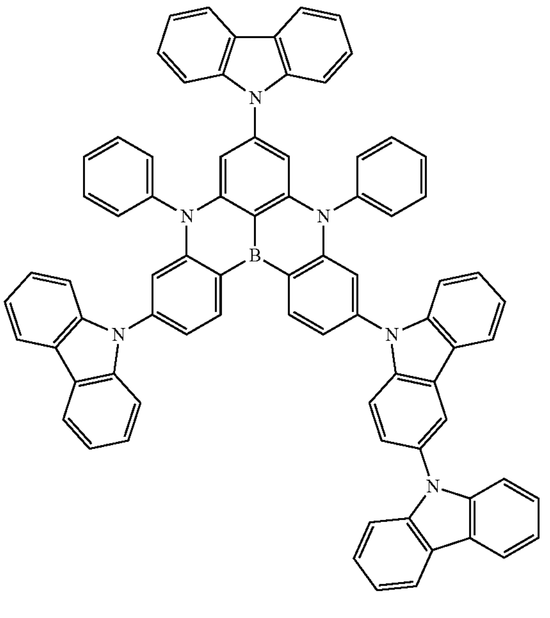
10

-continued
11
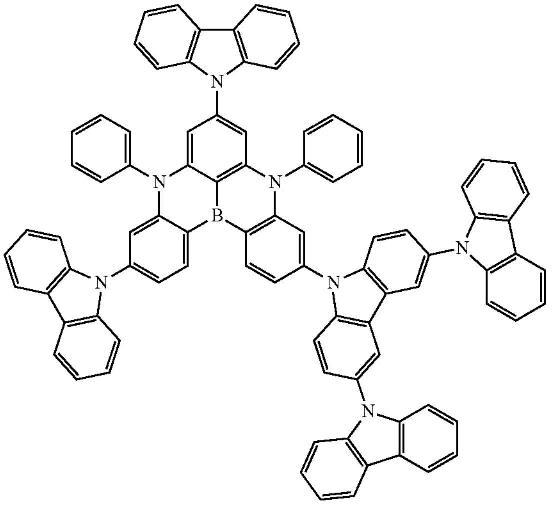
12
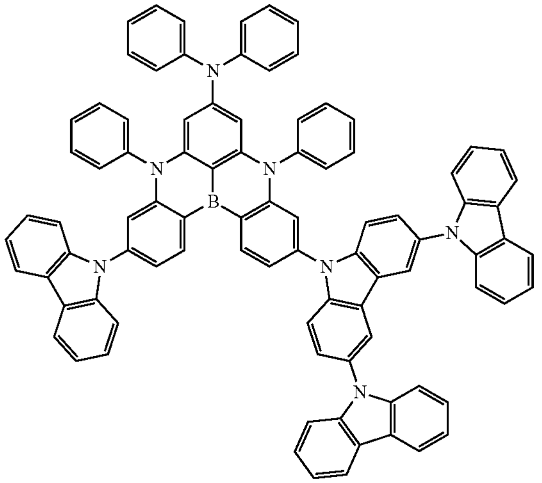
13
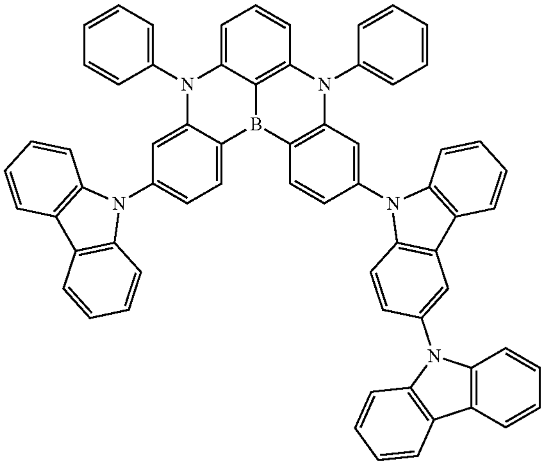
14
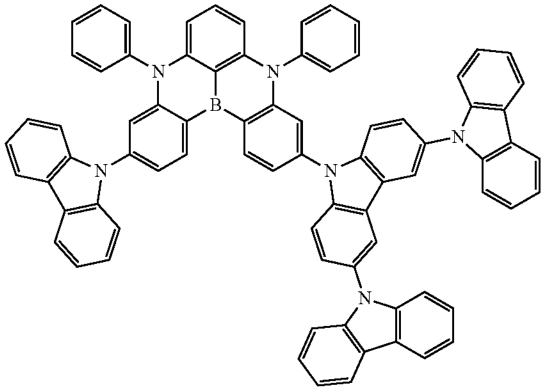
15
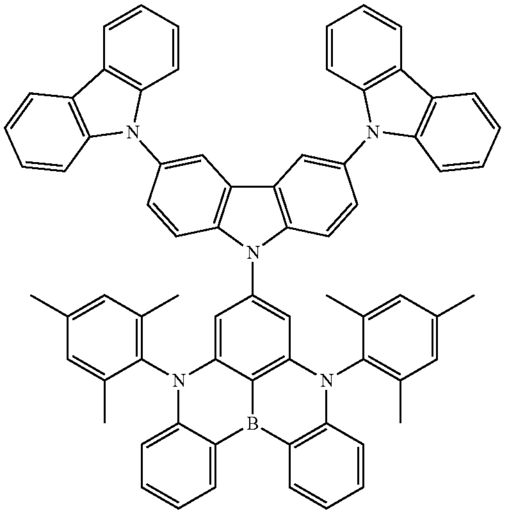
16
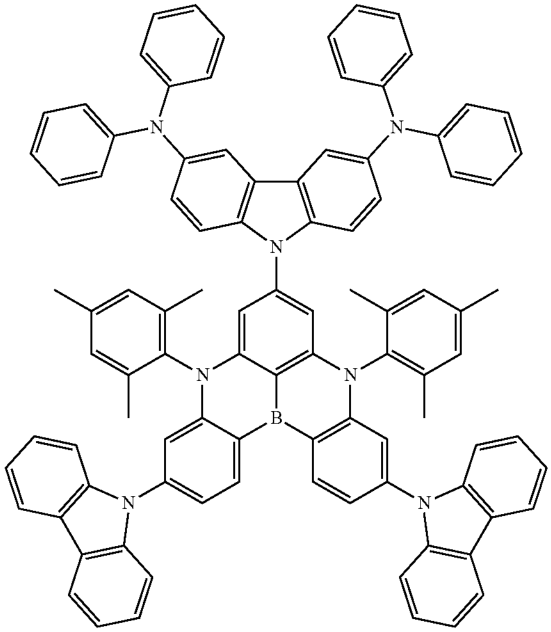

-continued
17
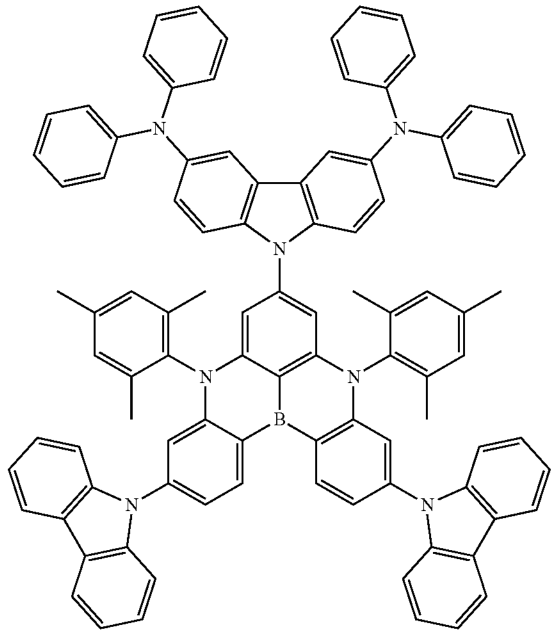
18
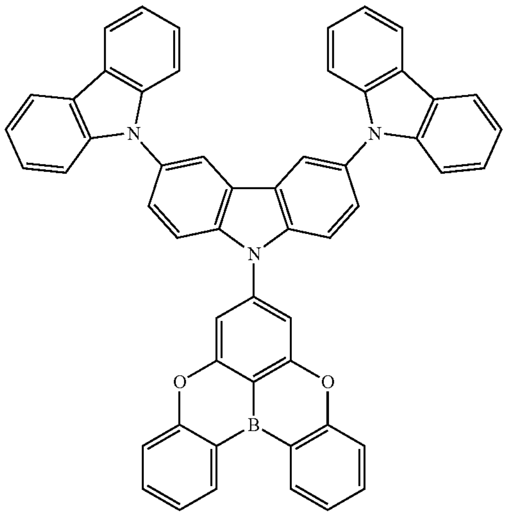
19
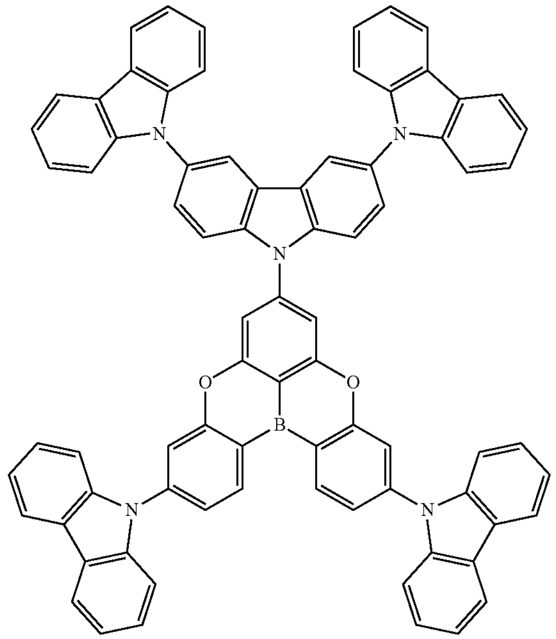
20
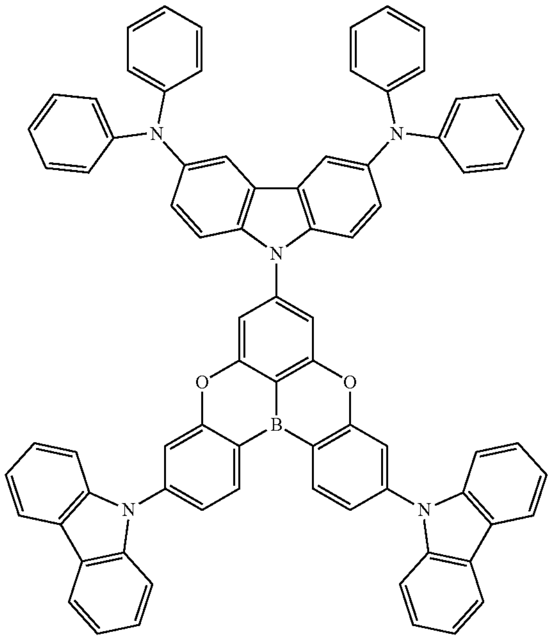

-continued
21
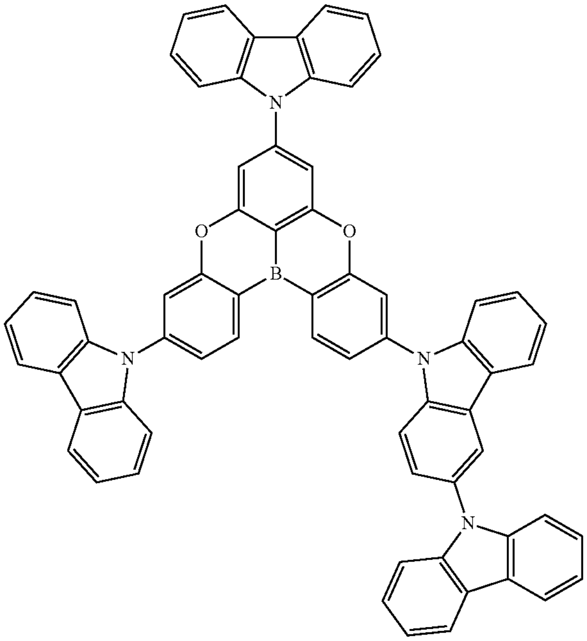
22
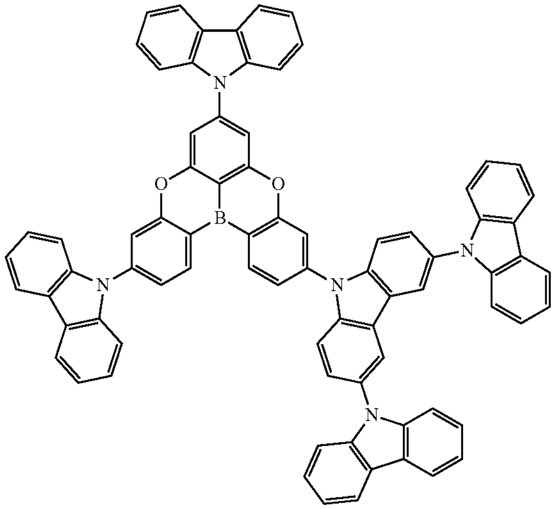
23
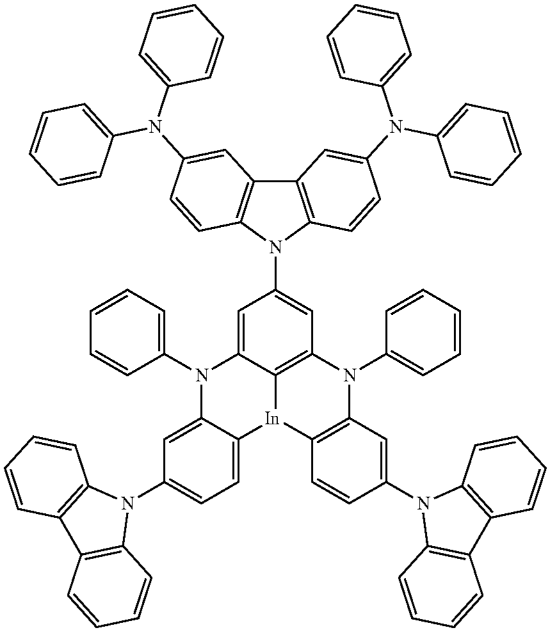
24
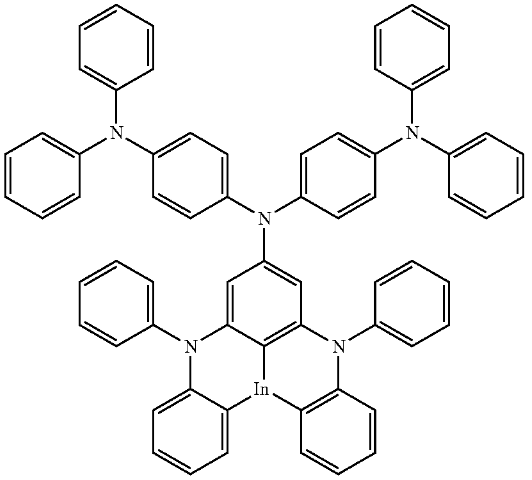

-continued
25
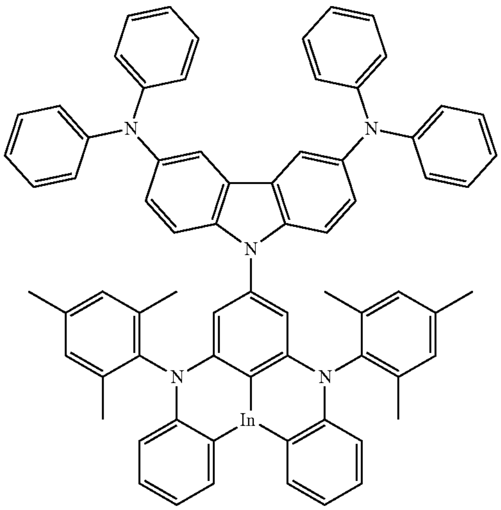
26
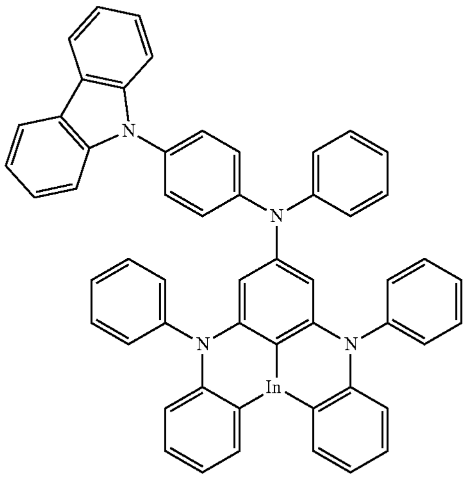
27
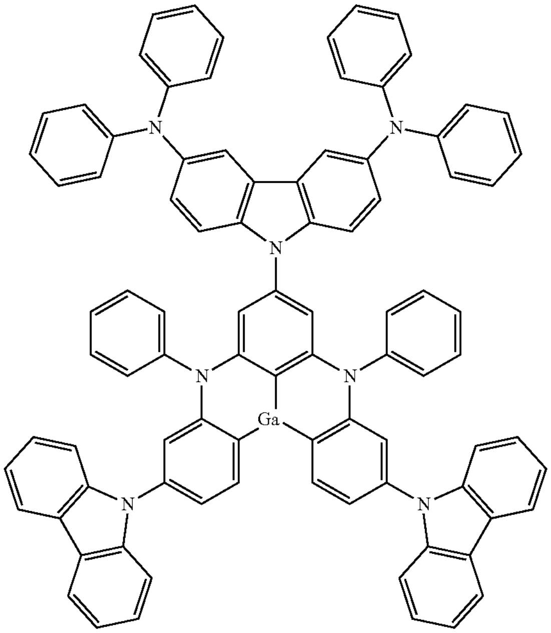
28
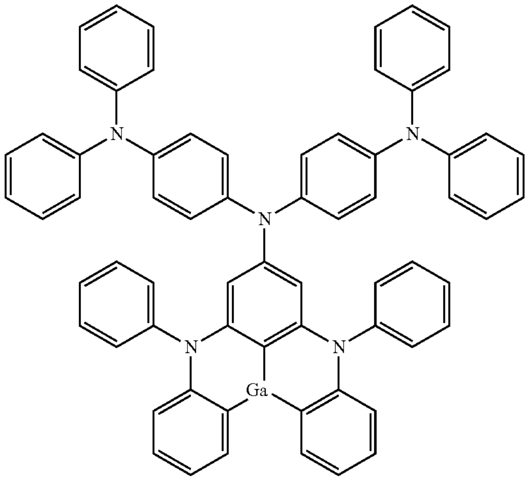
29
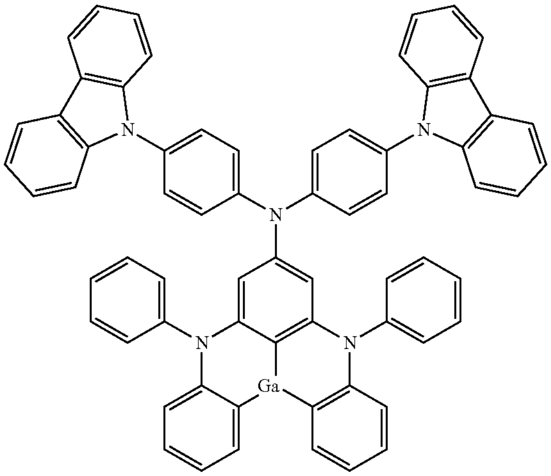

-continued
30
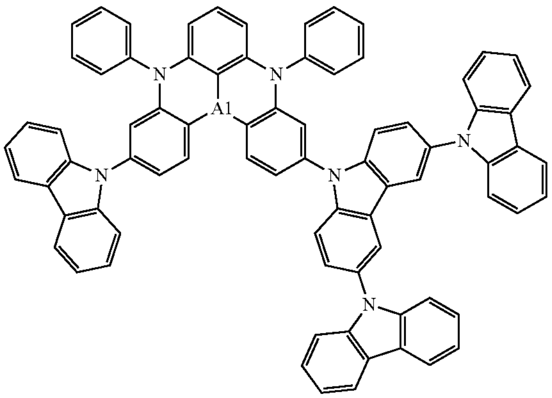
31
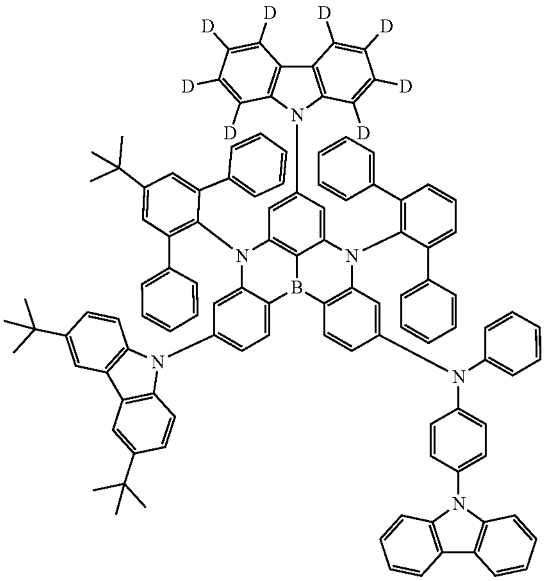
32
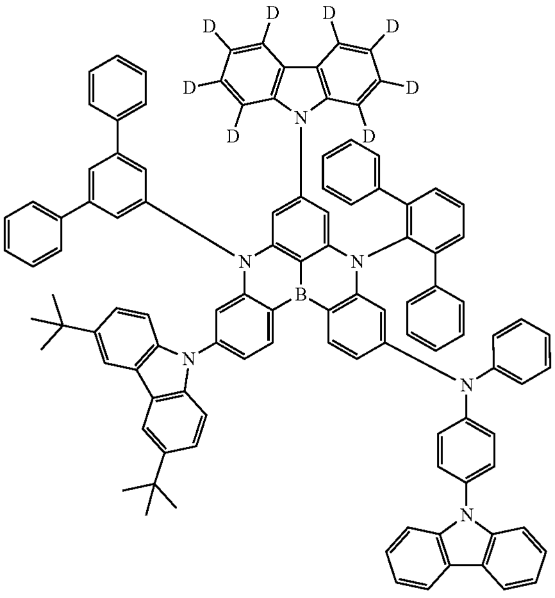
33
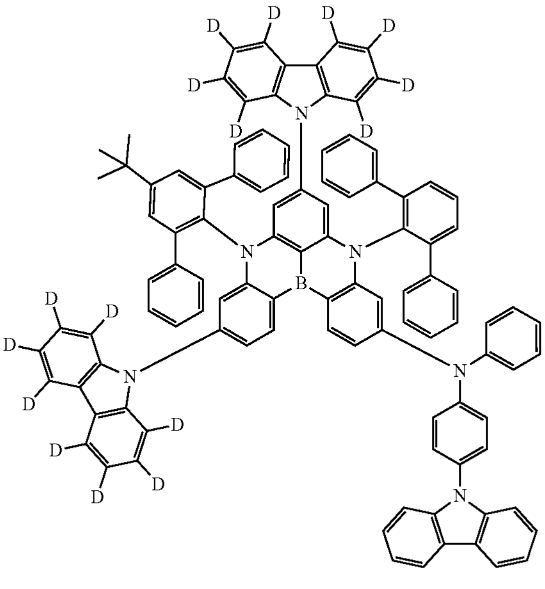

-continued
34
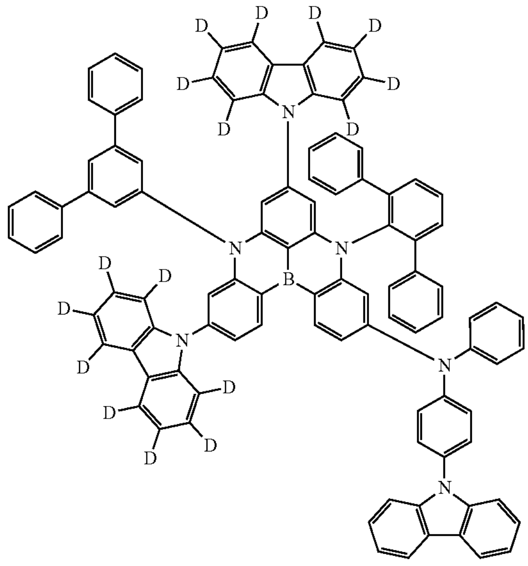
35
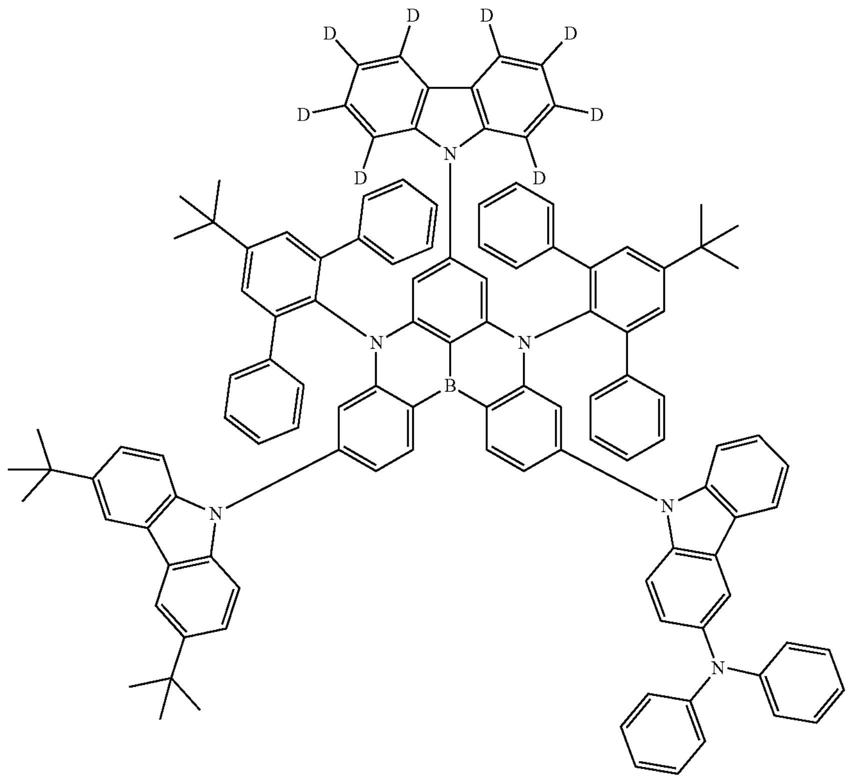

-continued
36
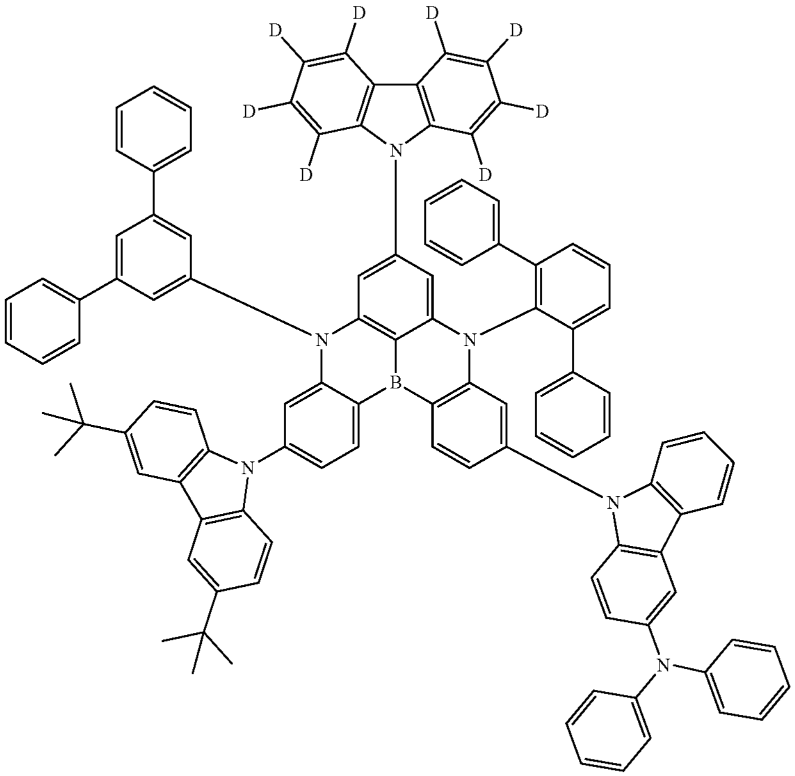
37
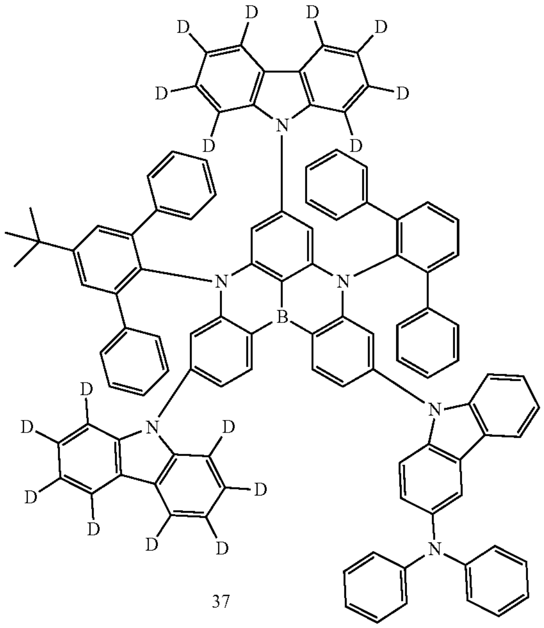
37

-continued
38
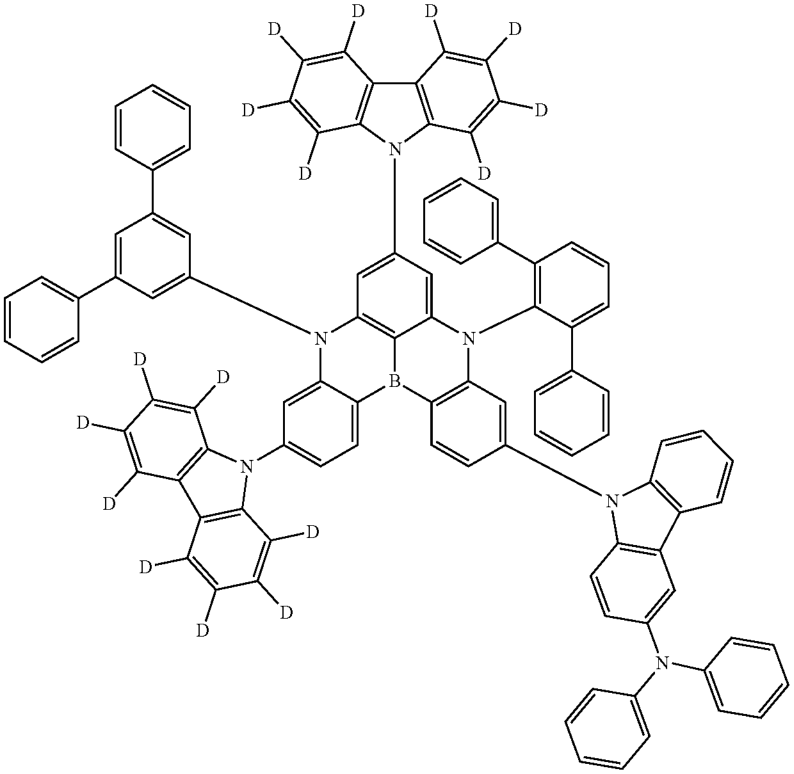
39
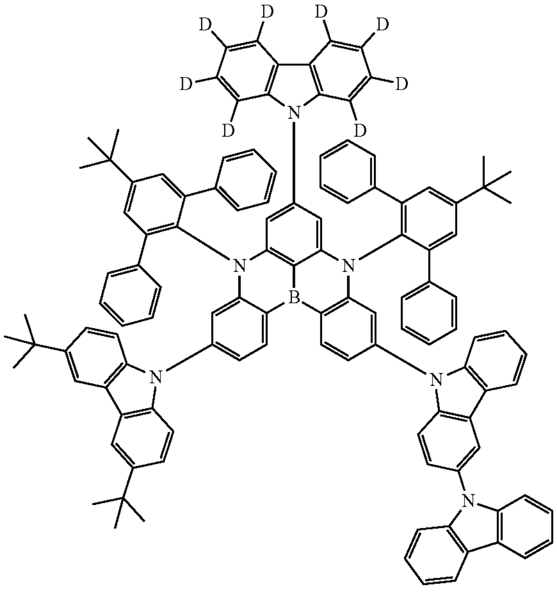
40
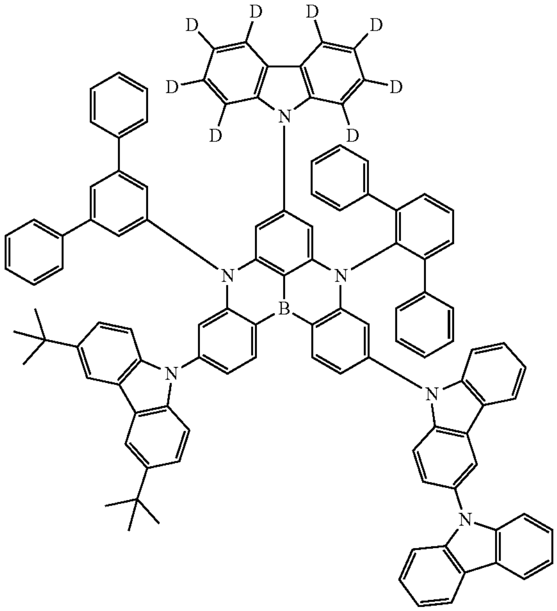

-continued
41
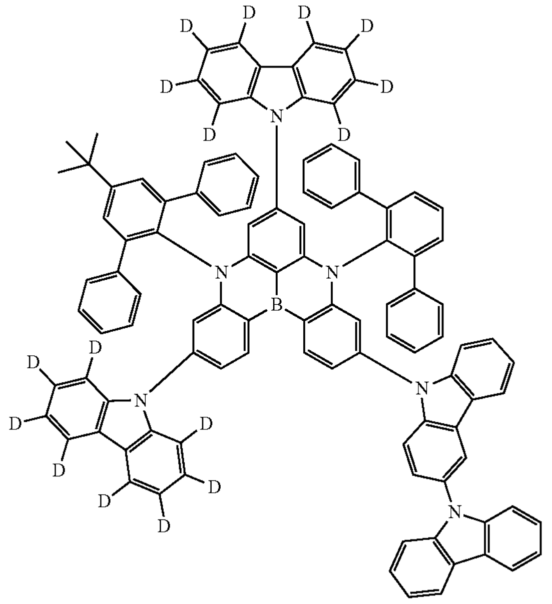
42
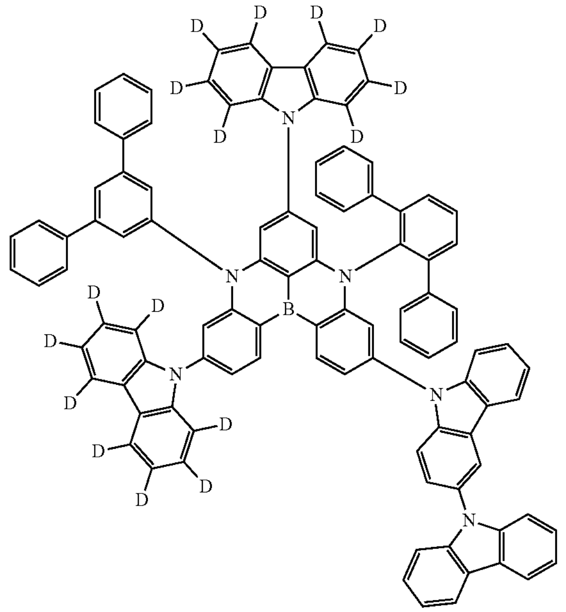
43
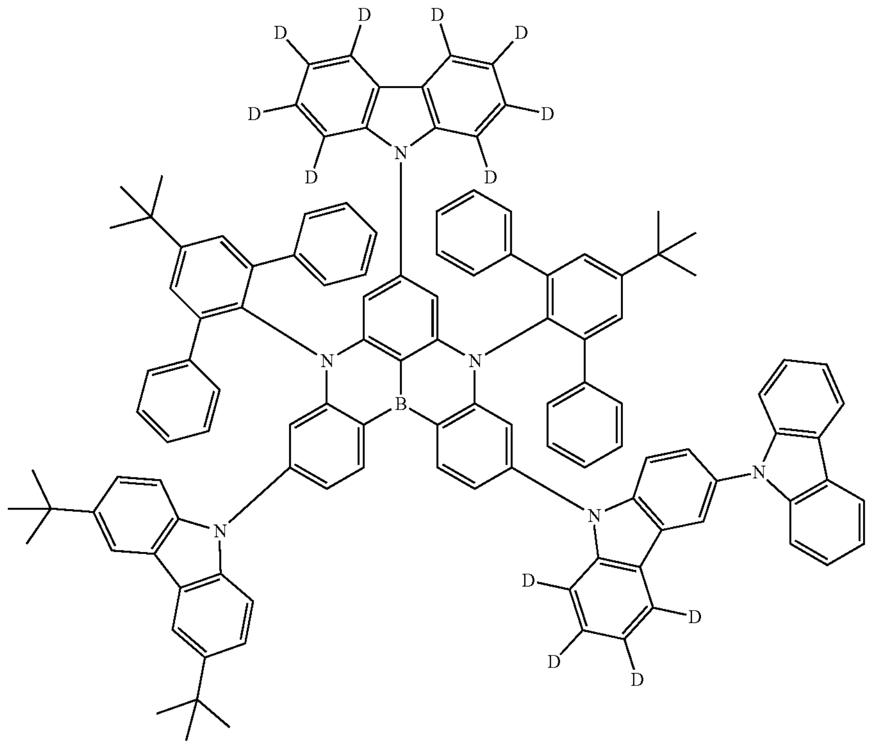

-continued
44
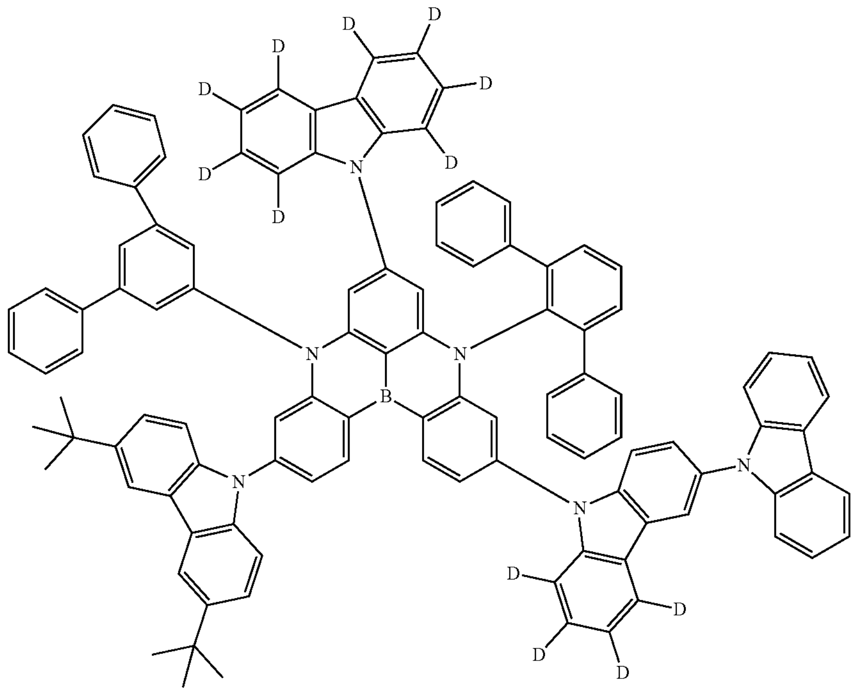
45
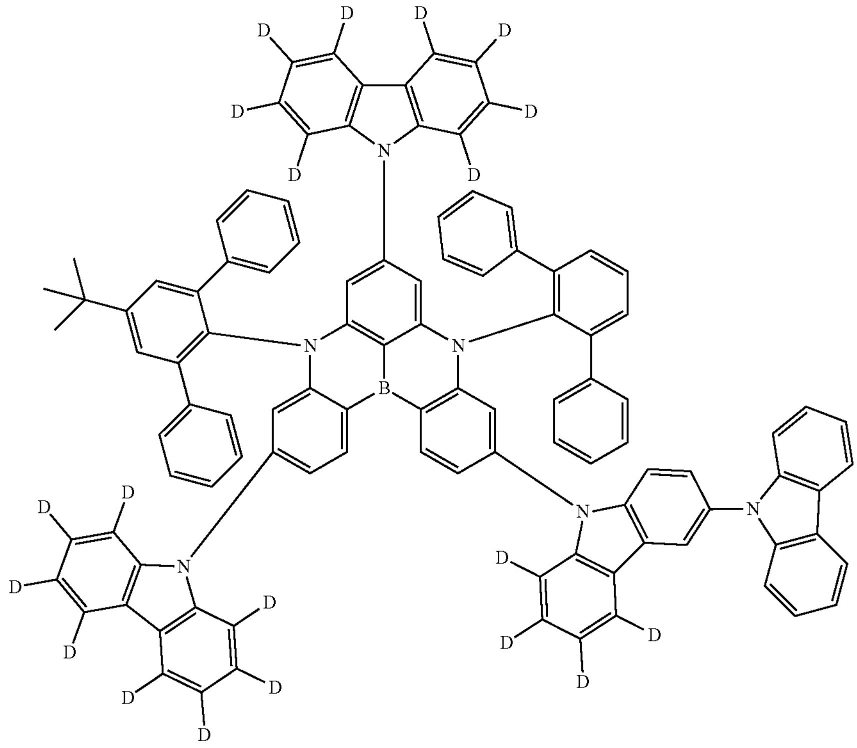

-continued
46
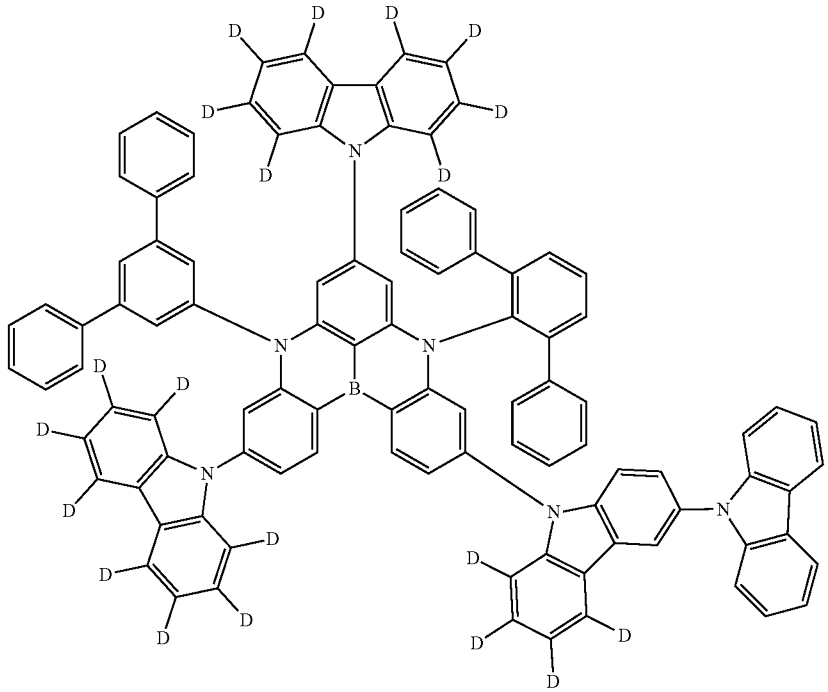
47
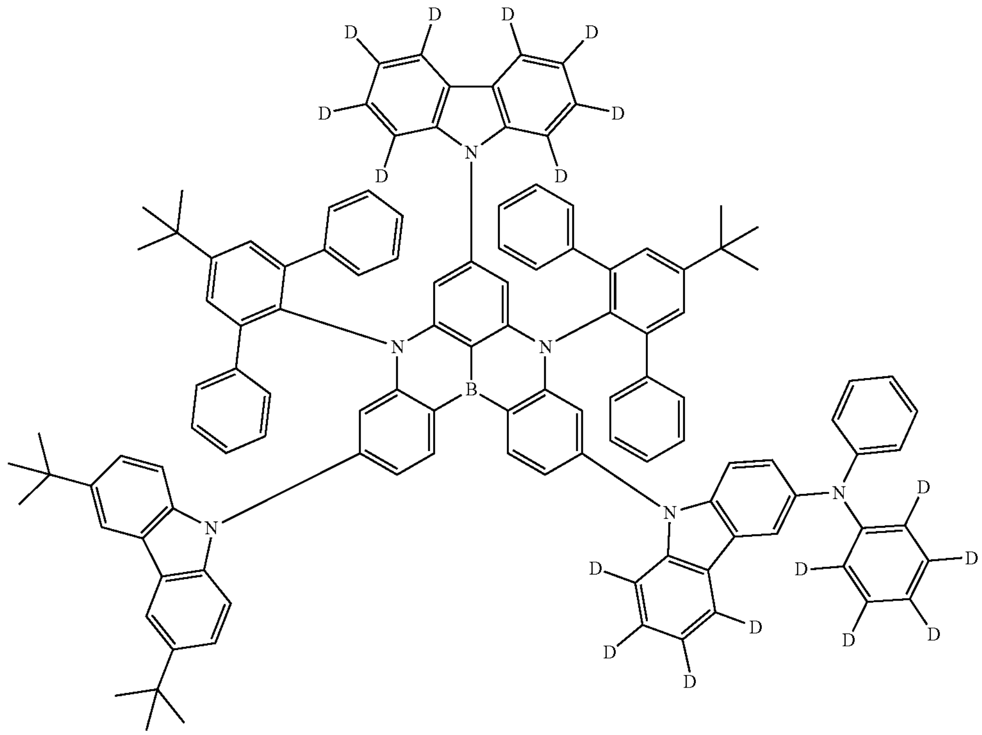

-continued
48
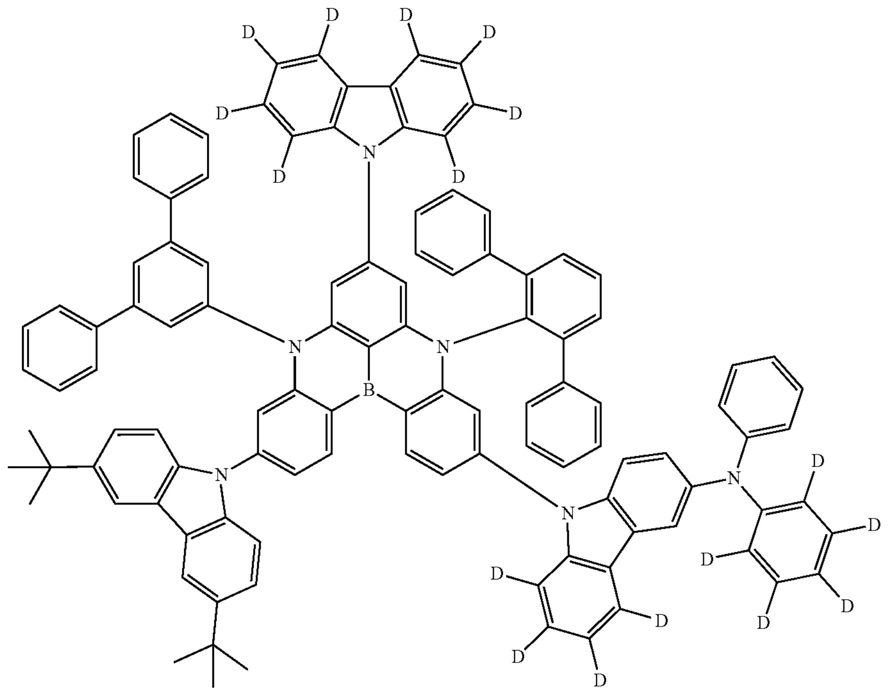
49
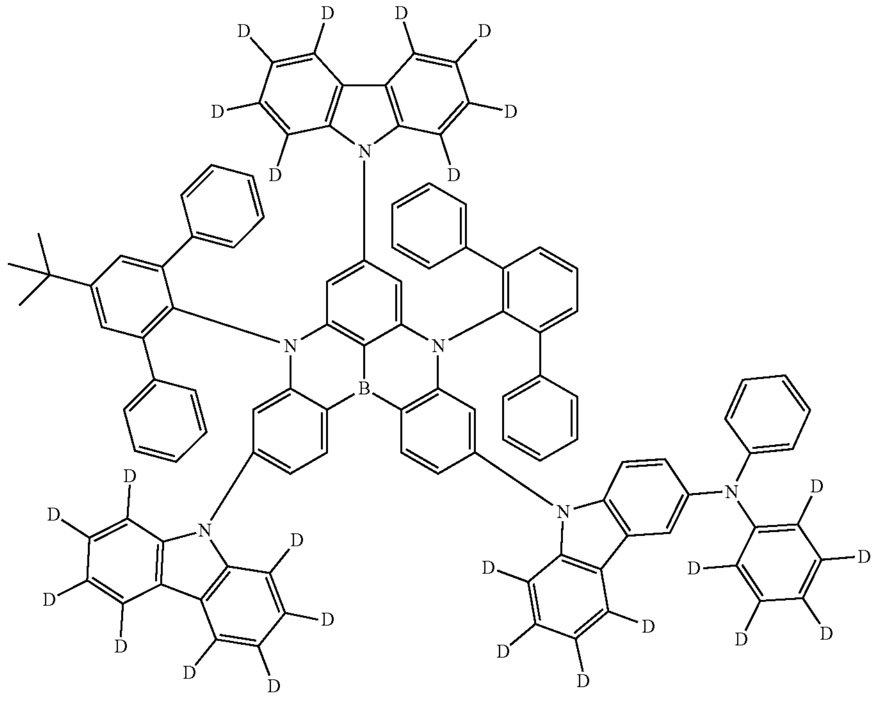

-continued
50
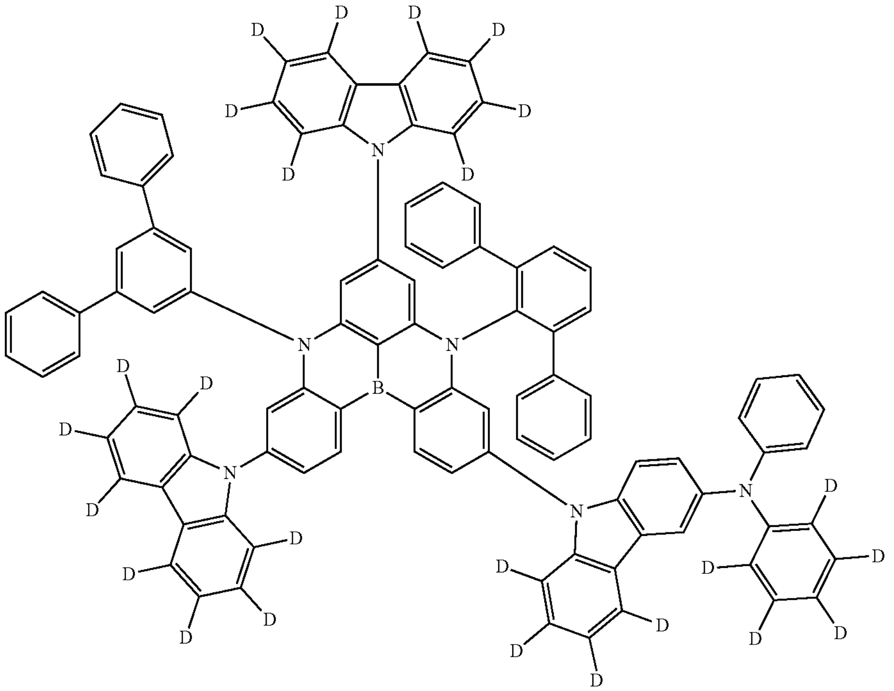
51
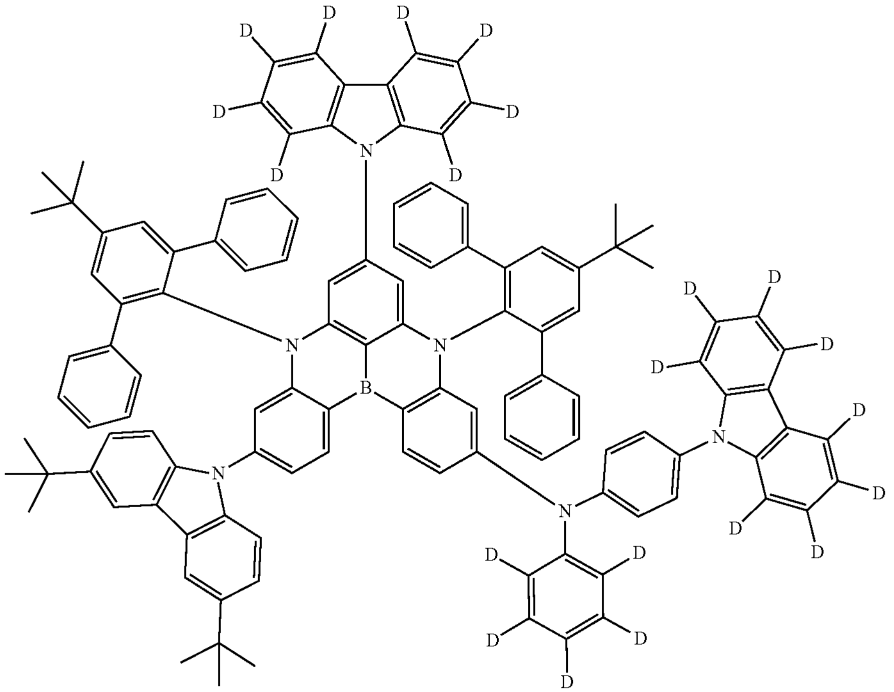

-continued
52
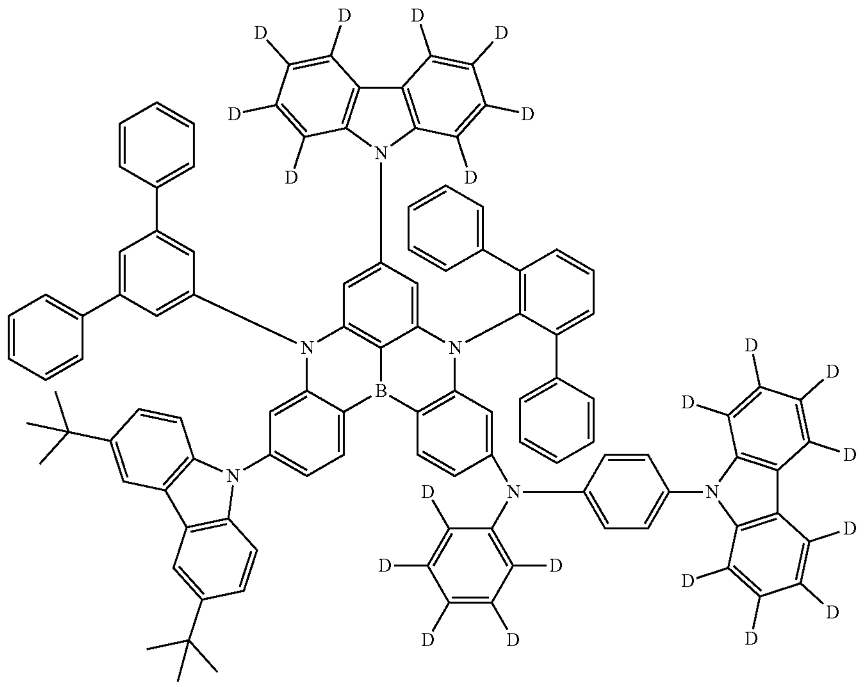
53
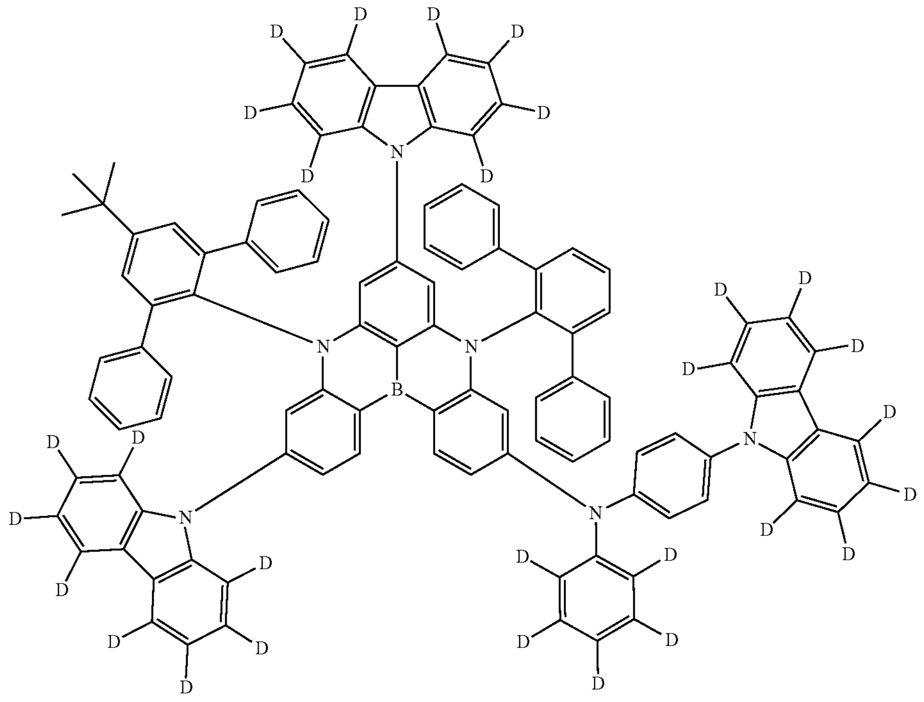

-continued
54
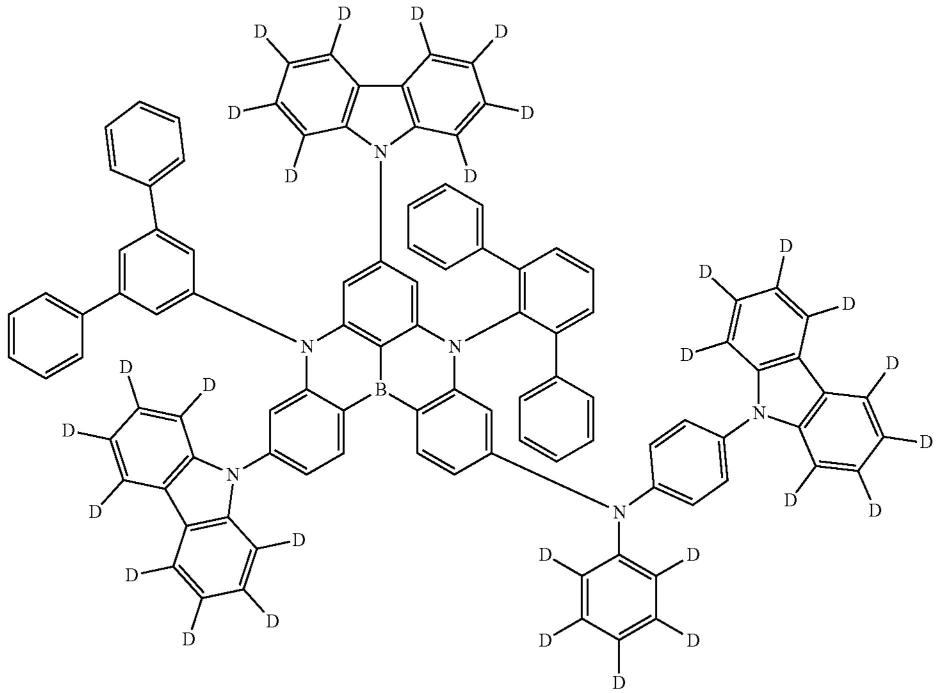
55
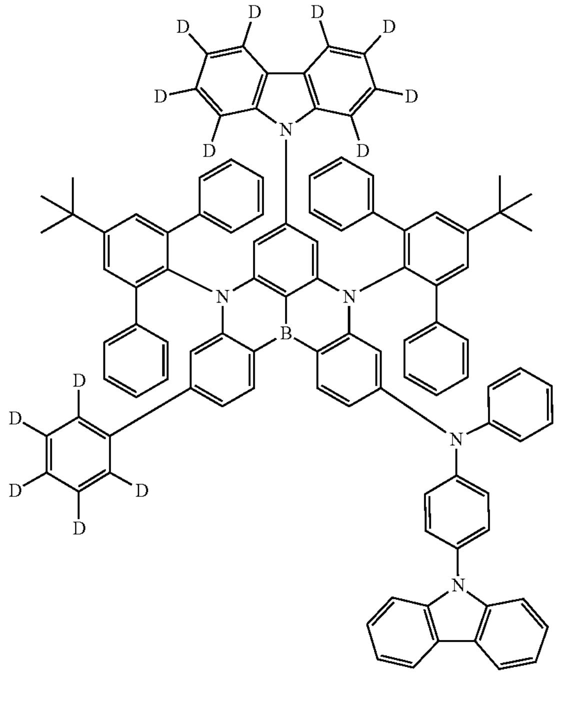
56
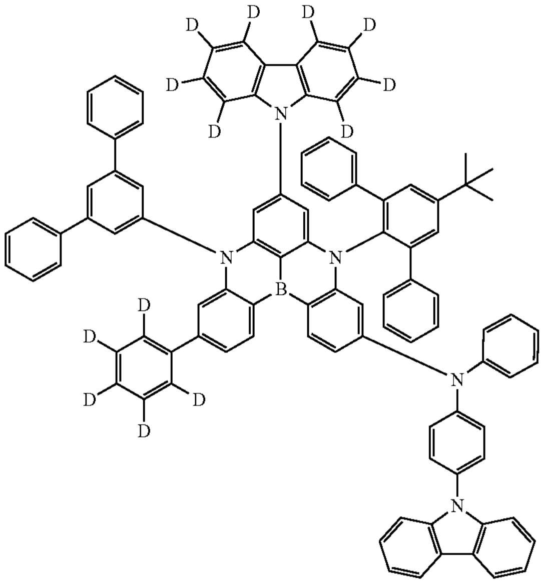

-continued
57
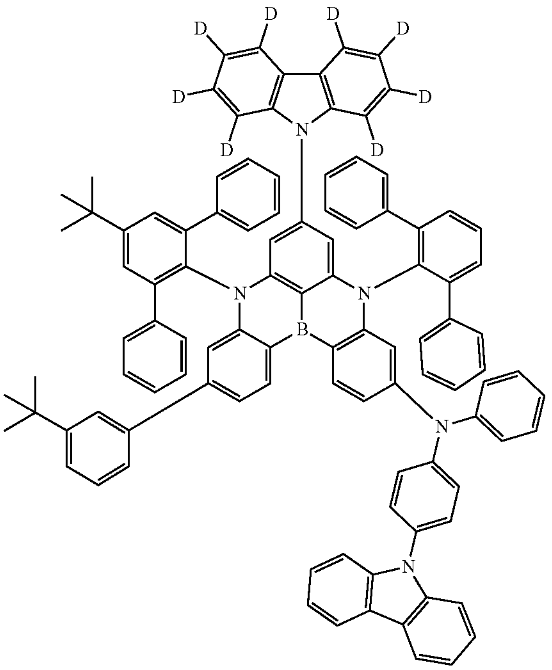
58
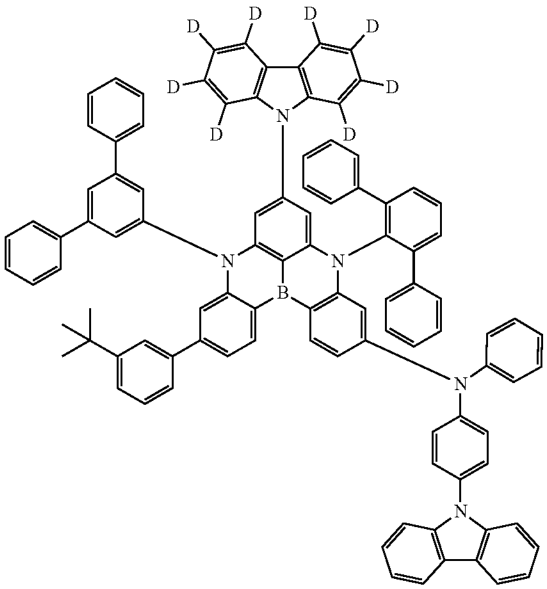
59
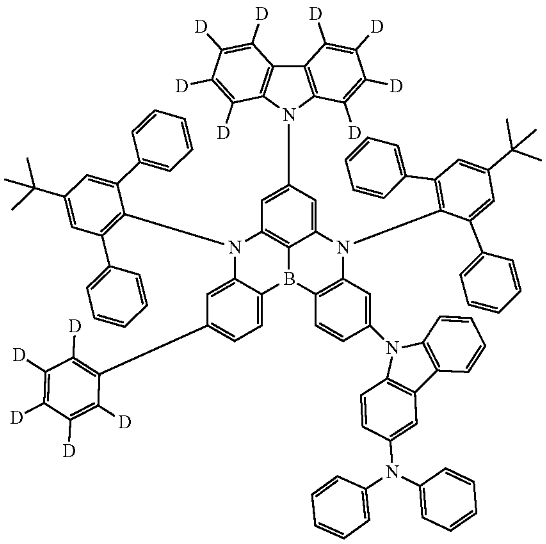
60
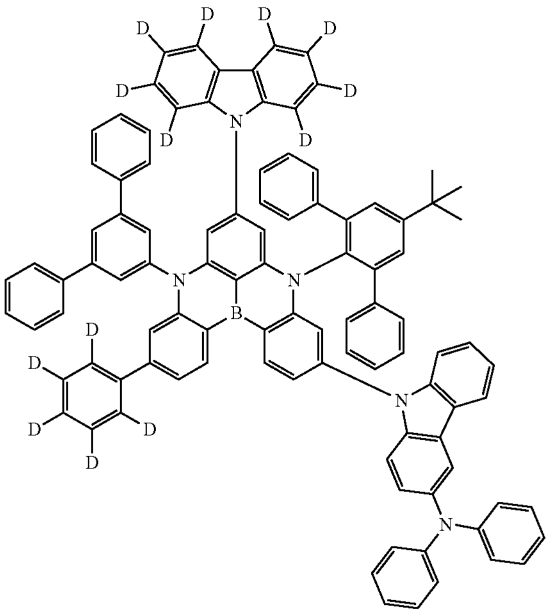

-continued
61
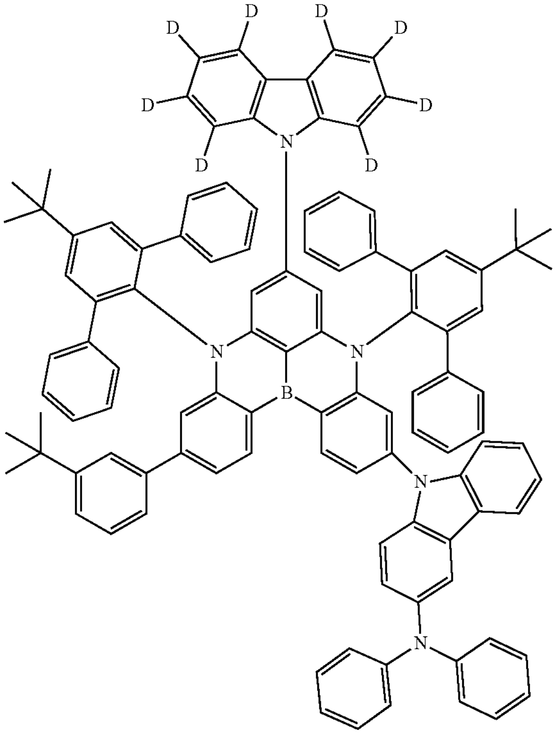
62
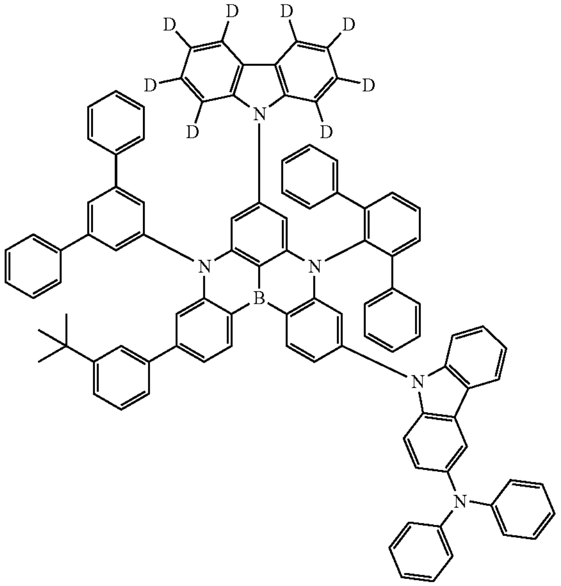
63
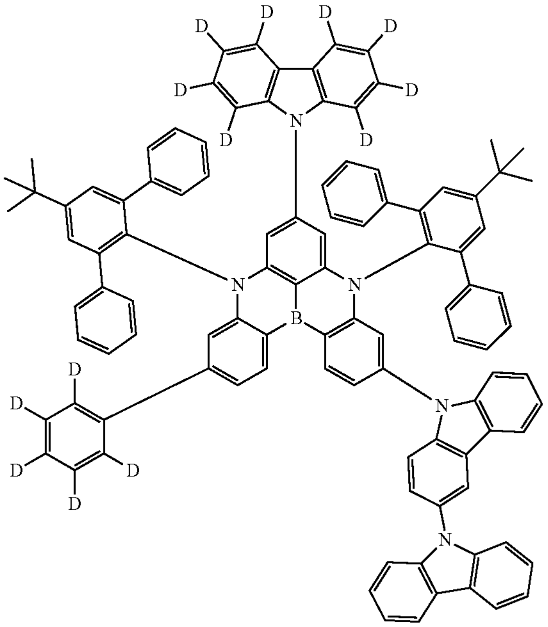
64
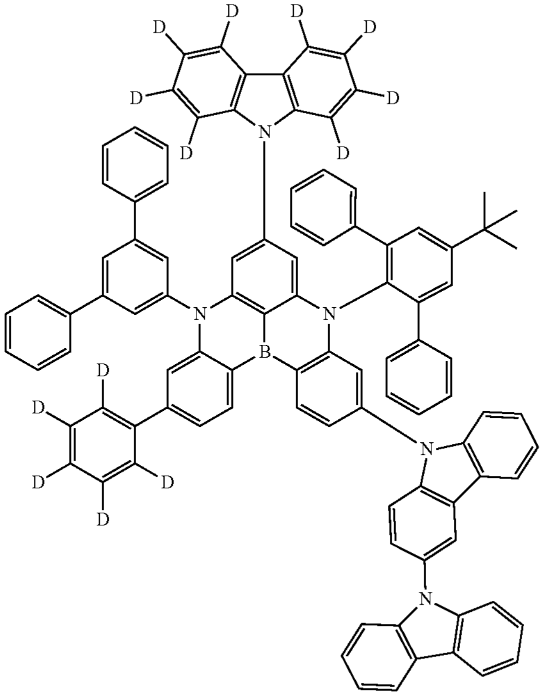

-continued
65
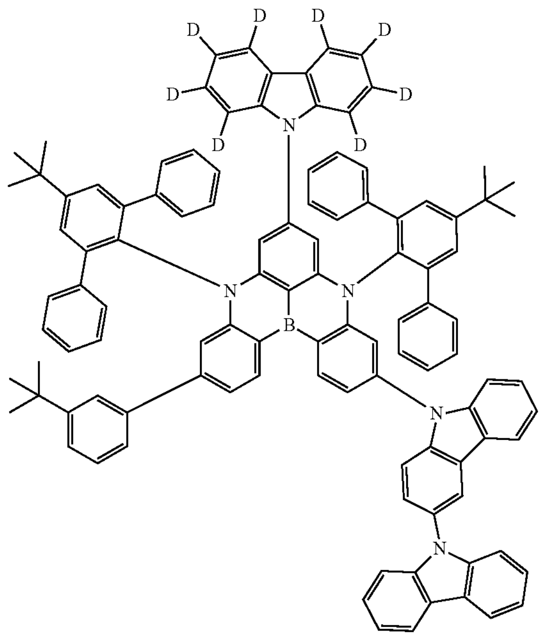
66
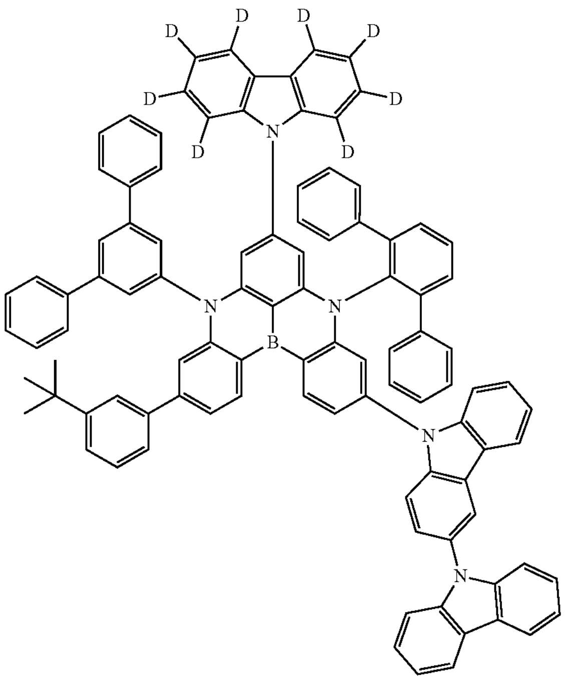
67
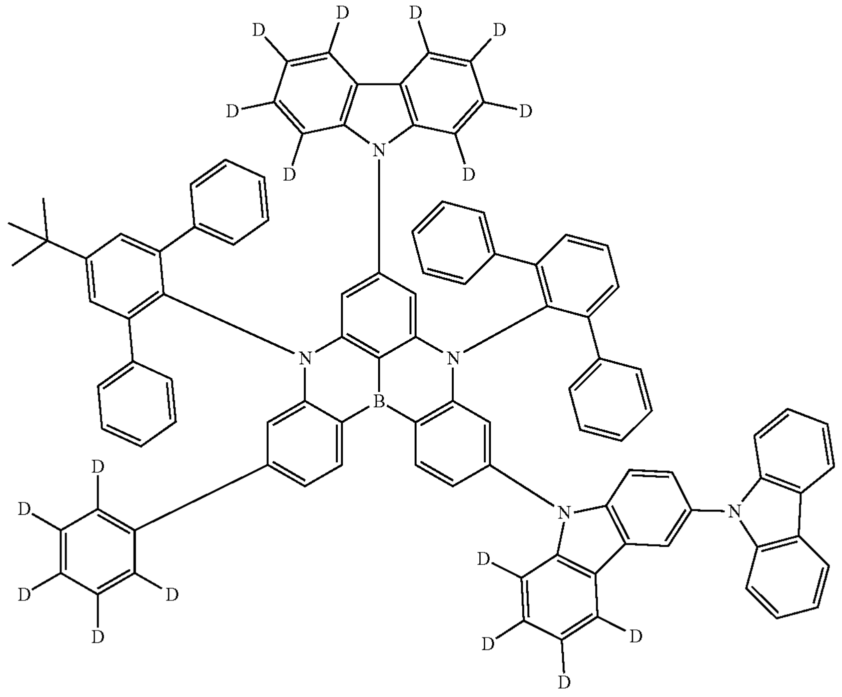

-continued
68
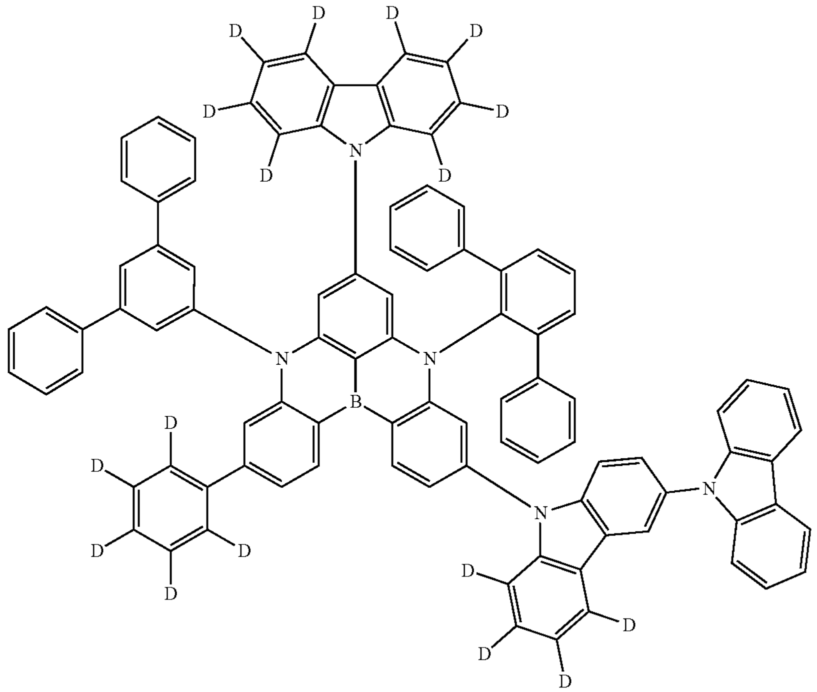
69
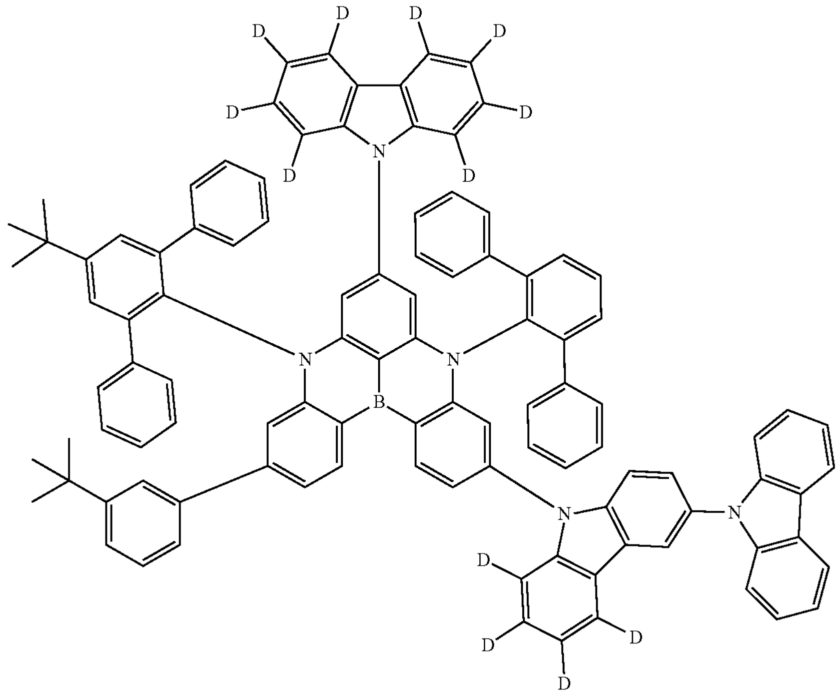

-continued
70
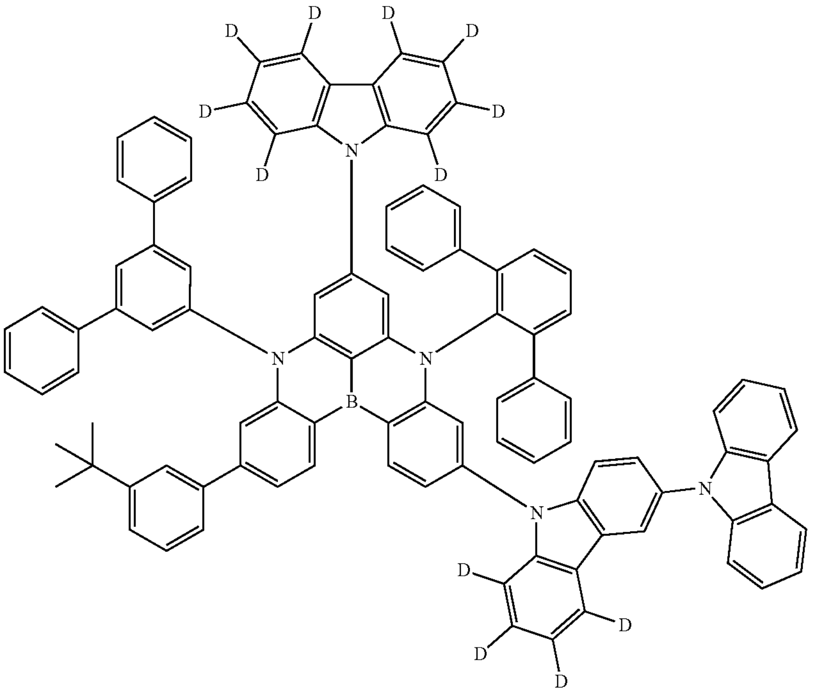
71
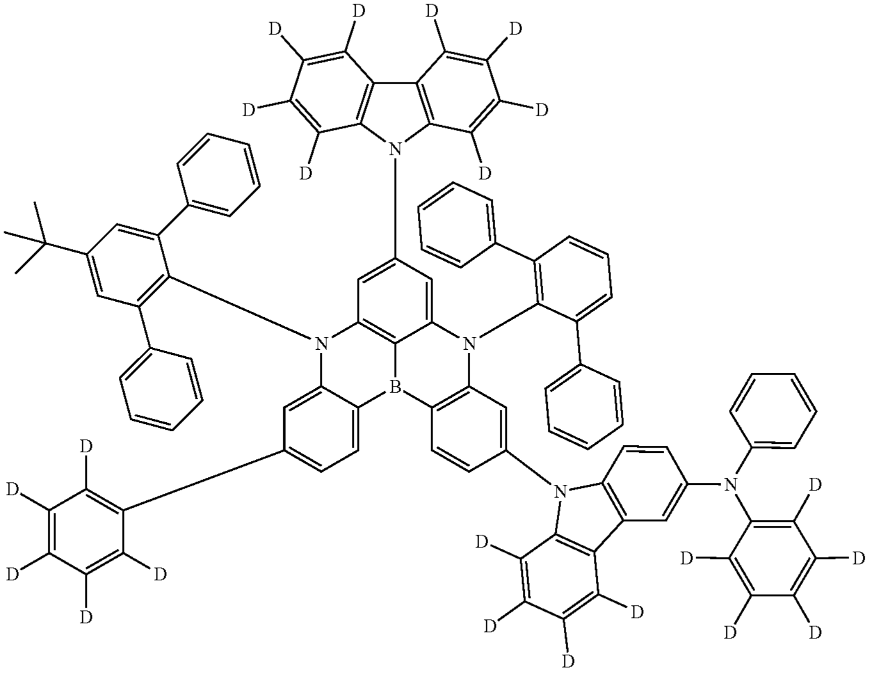

-continued
72
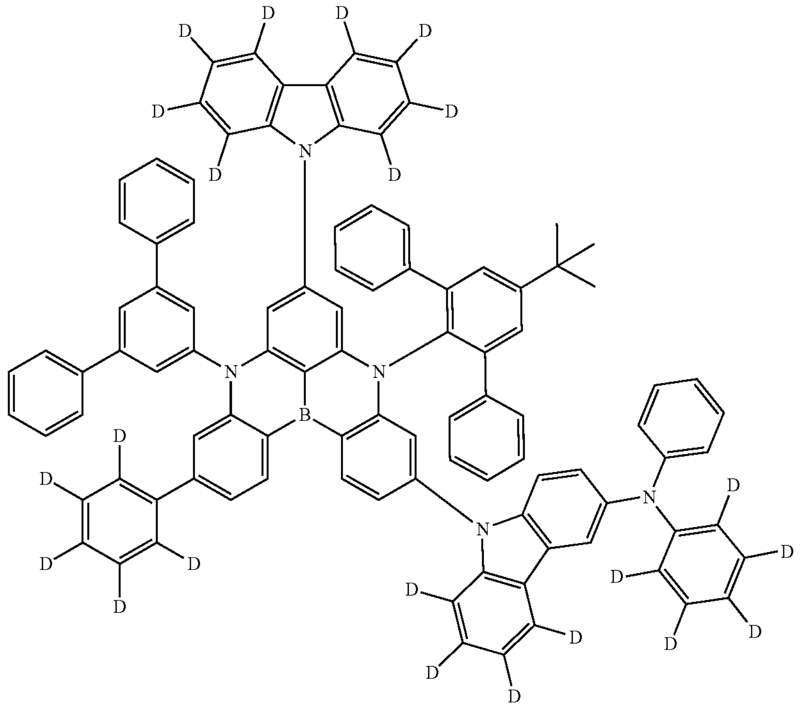
73
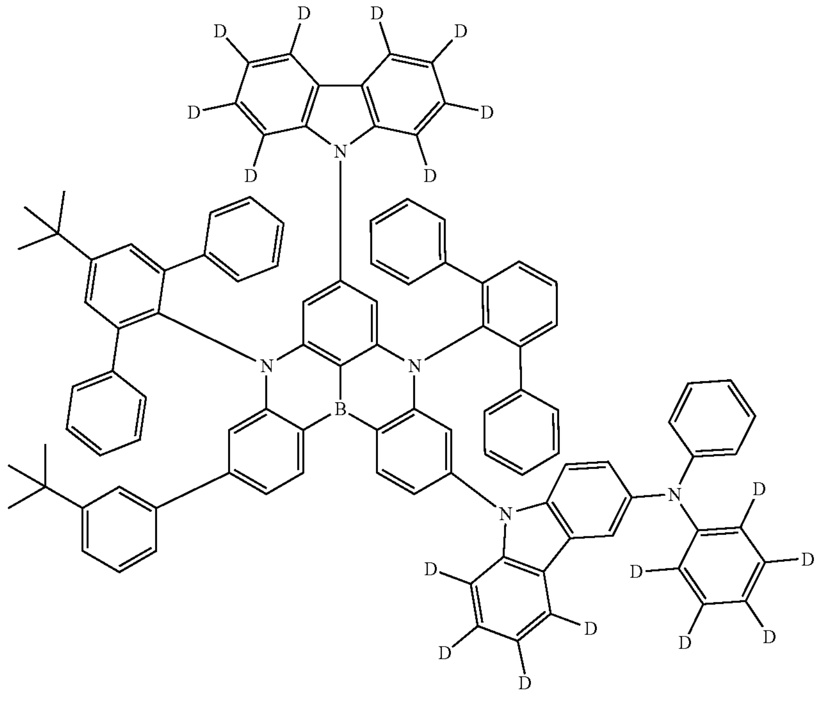

-continued
74
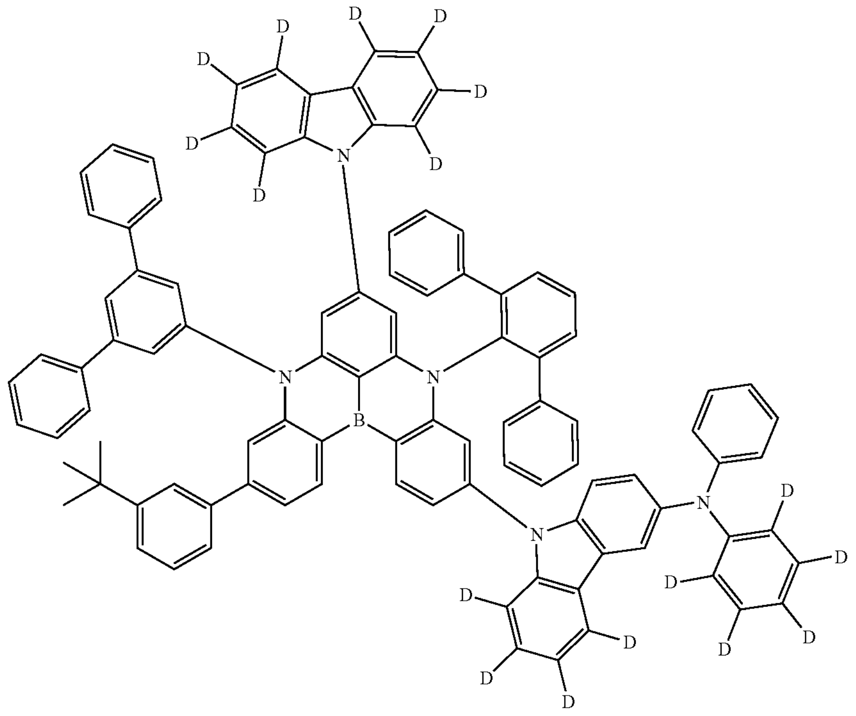
75
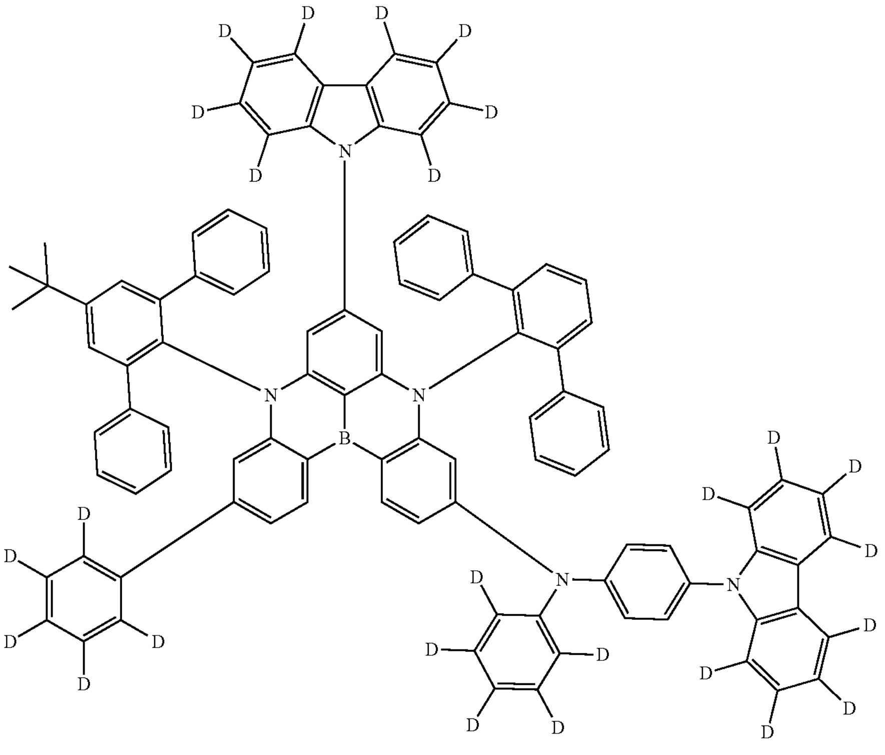

-continued
76
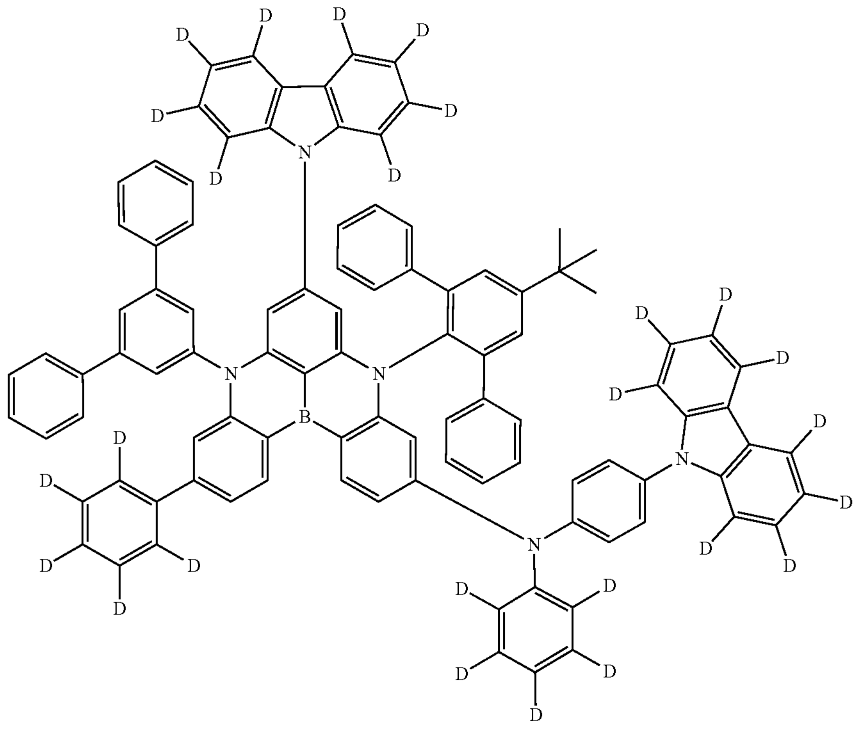
77
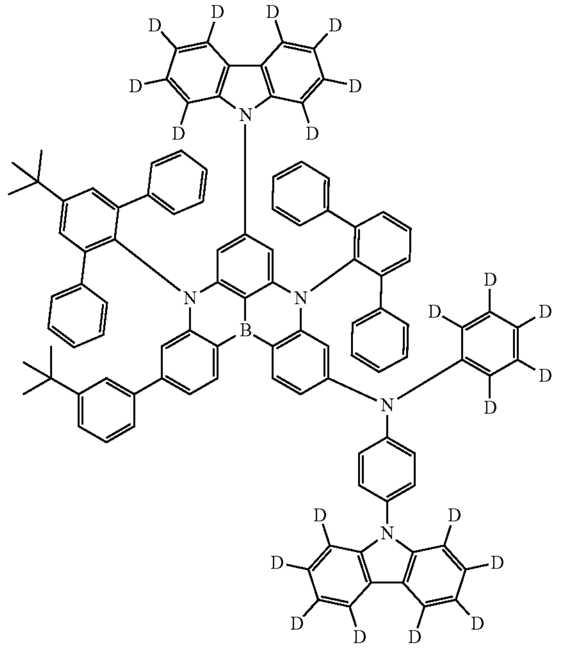

-continued
78
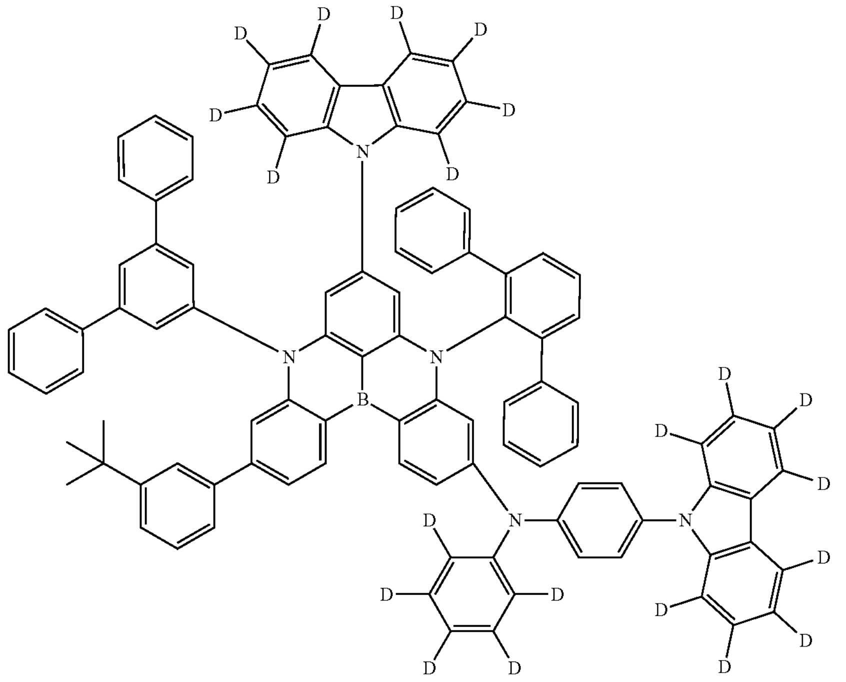
79
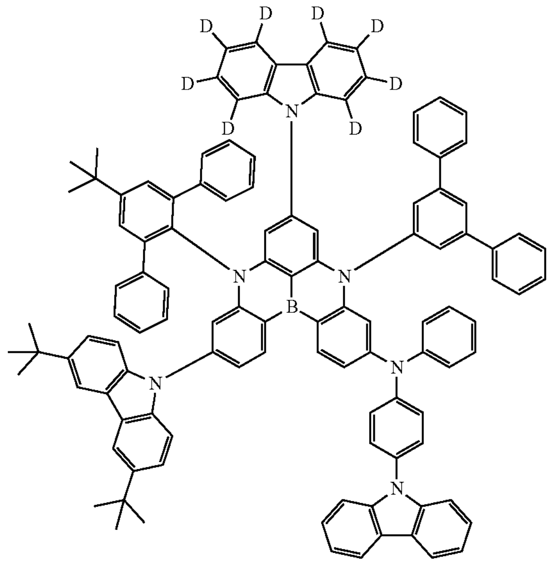
80
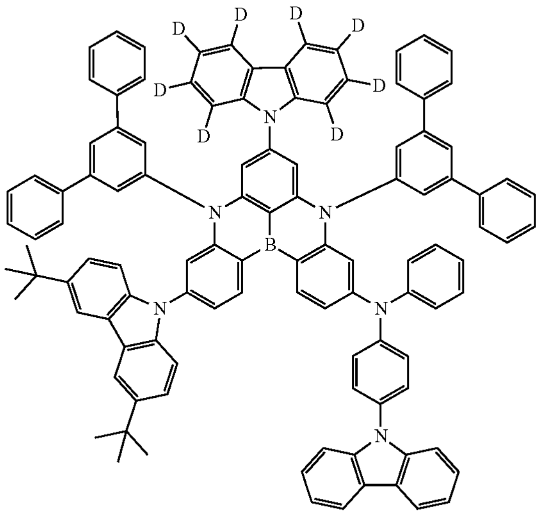

-continued
81
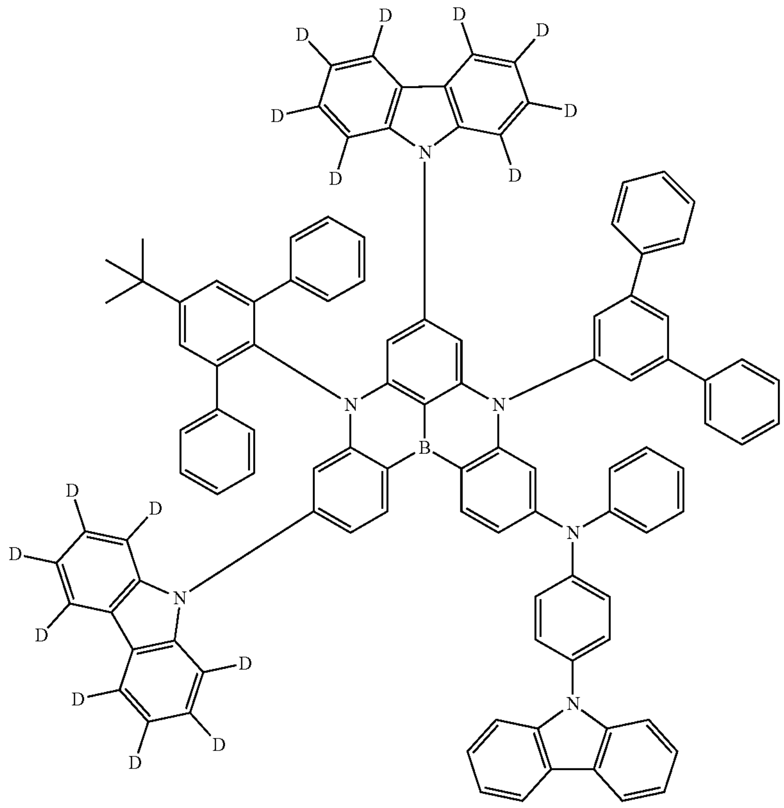
82
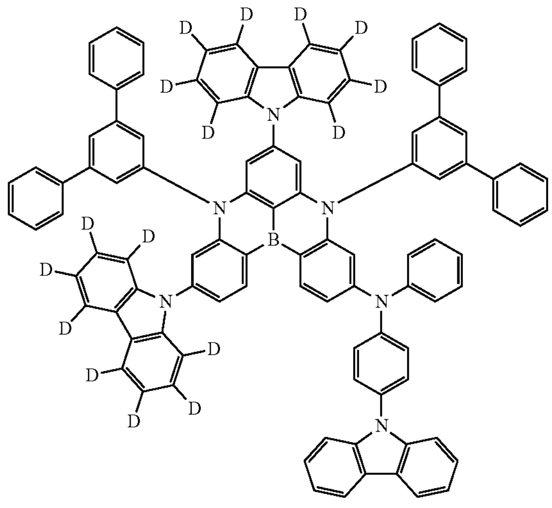

-continued
83
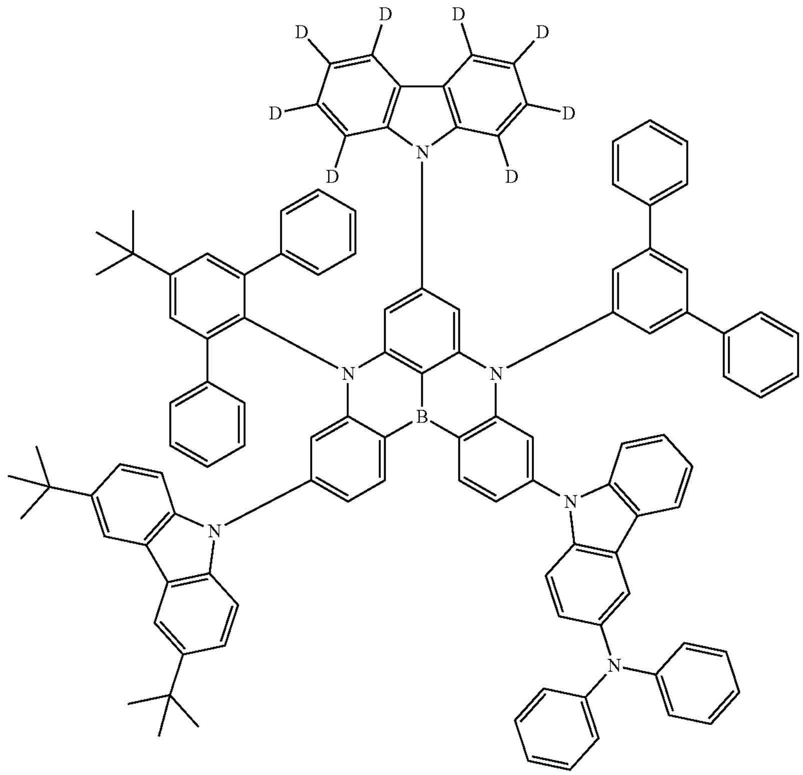
84
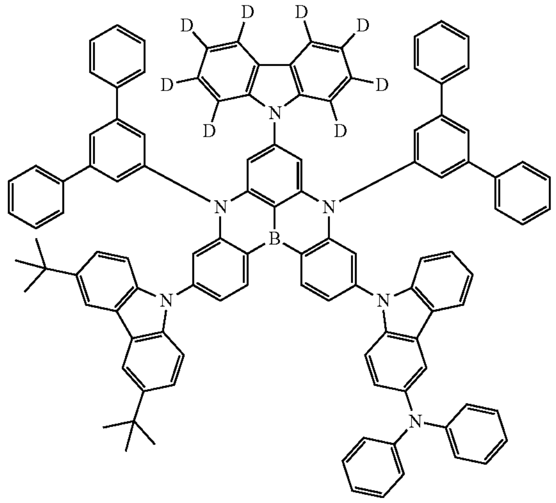

-continued
85
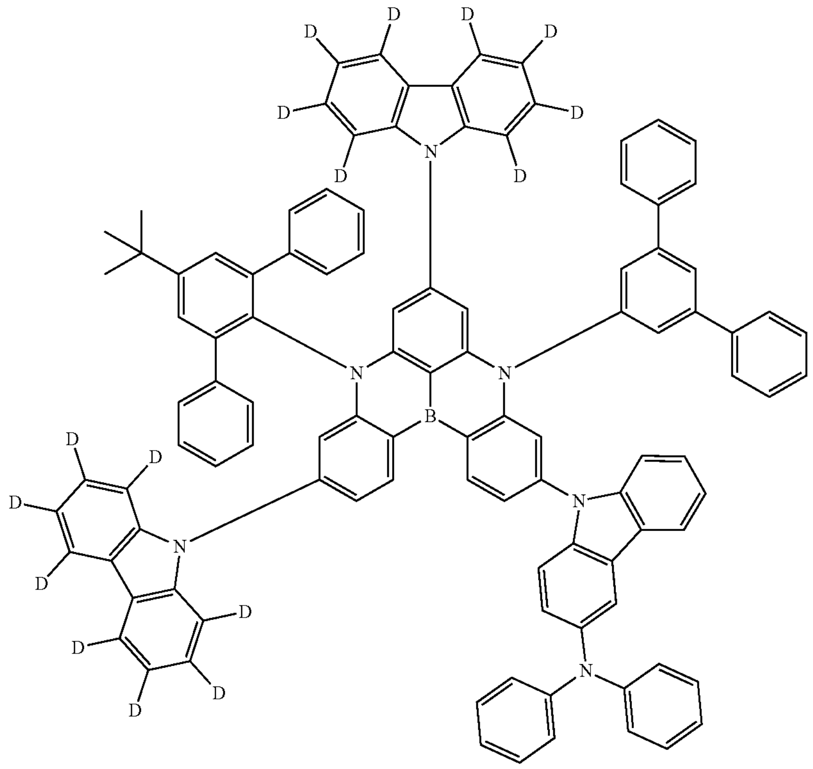
86
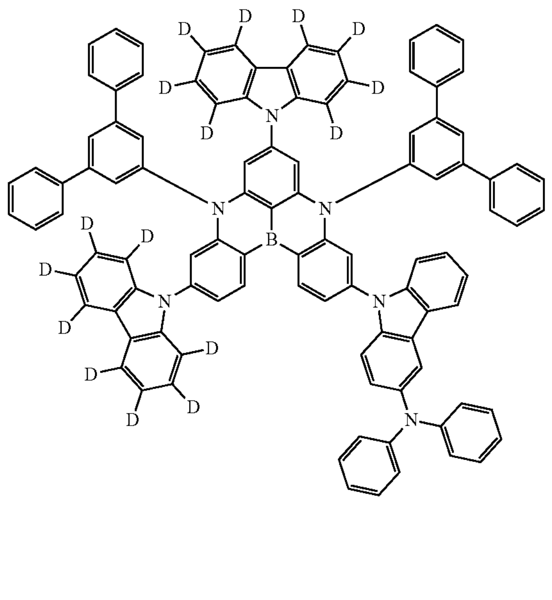

-continued
87
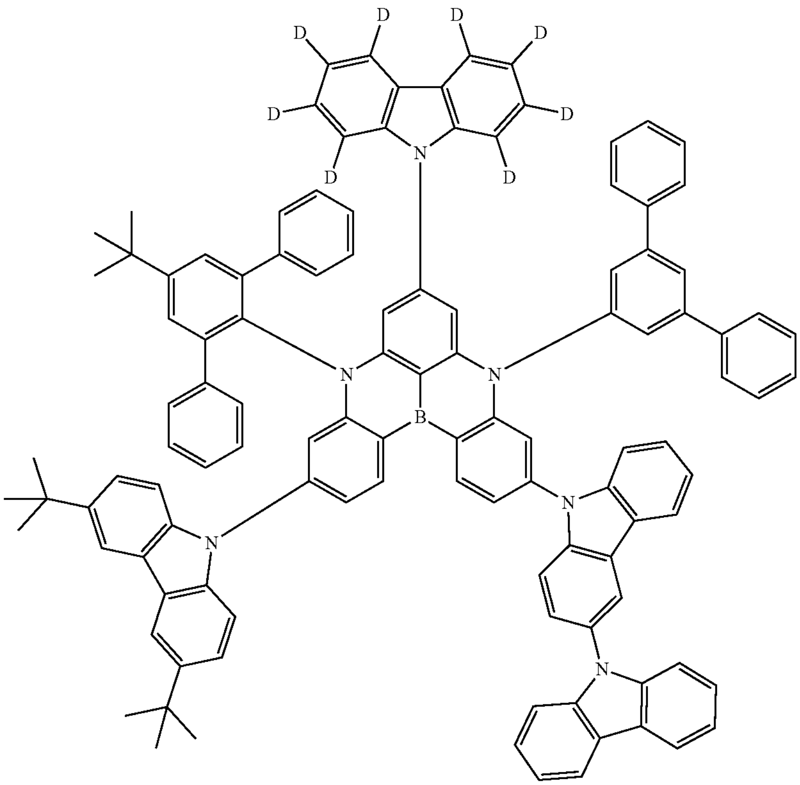
88
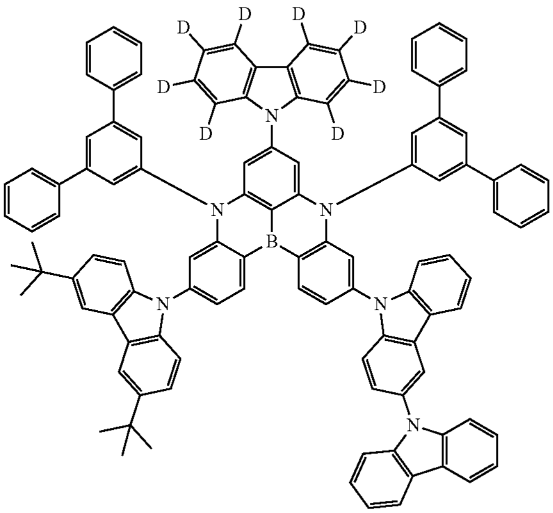

-continued
89
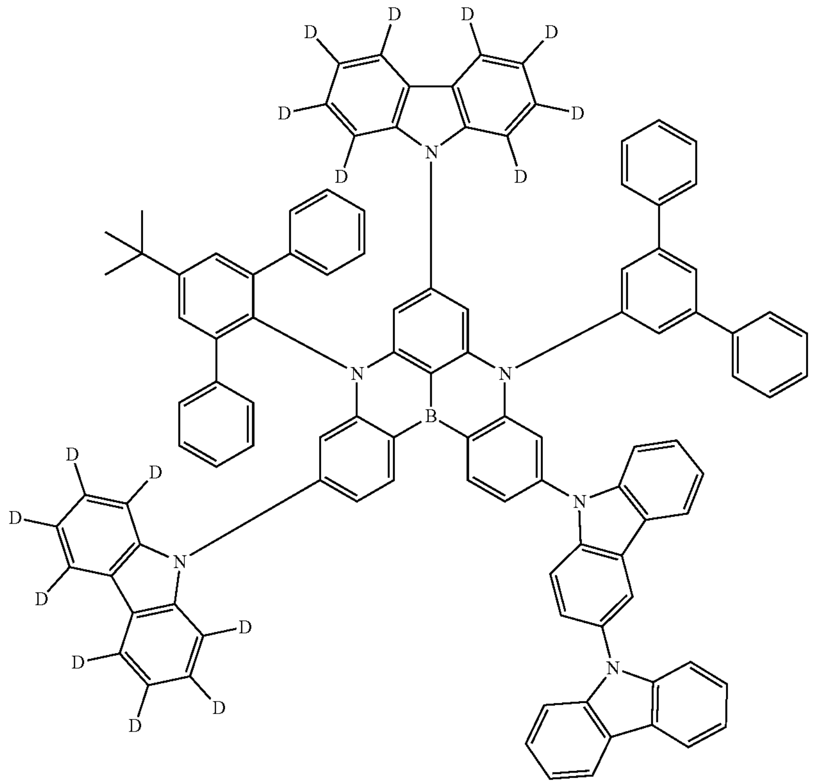
90
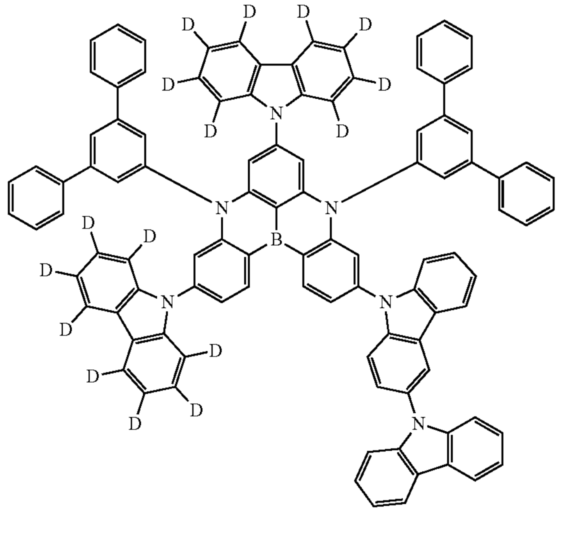

-continued
91
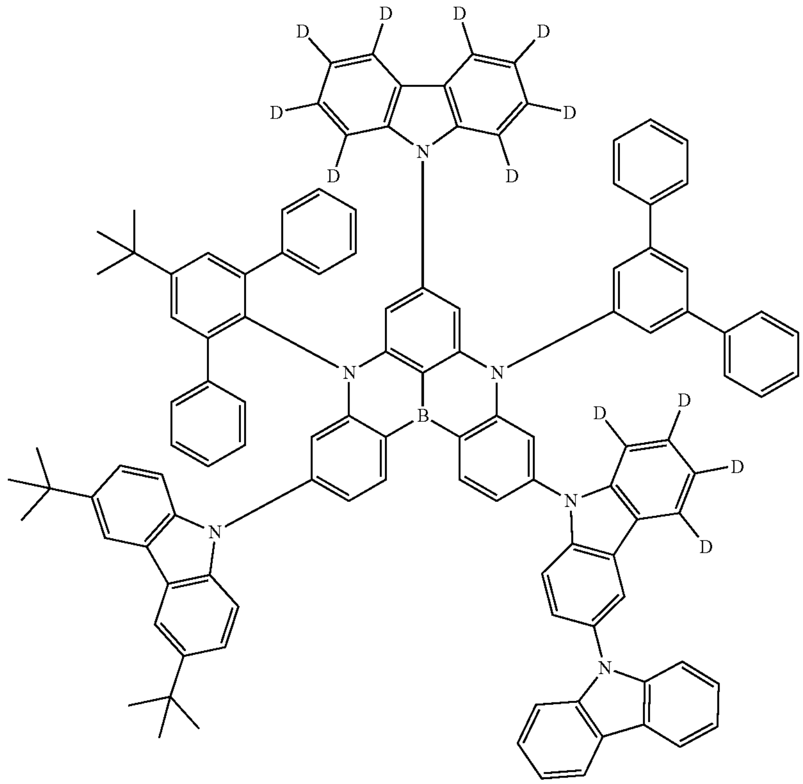
92
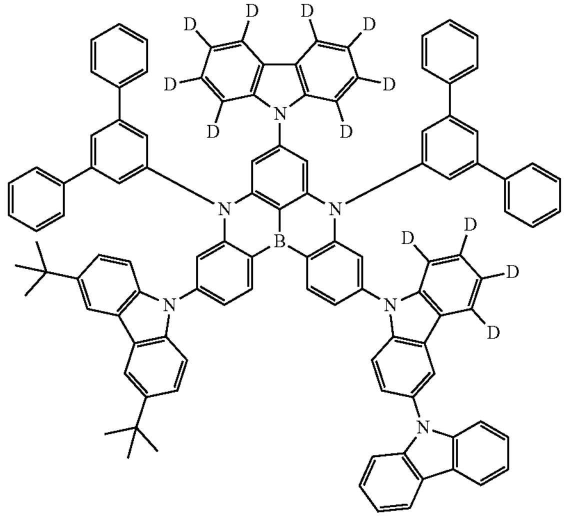

-continued
93
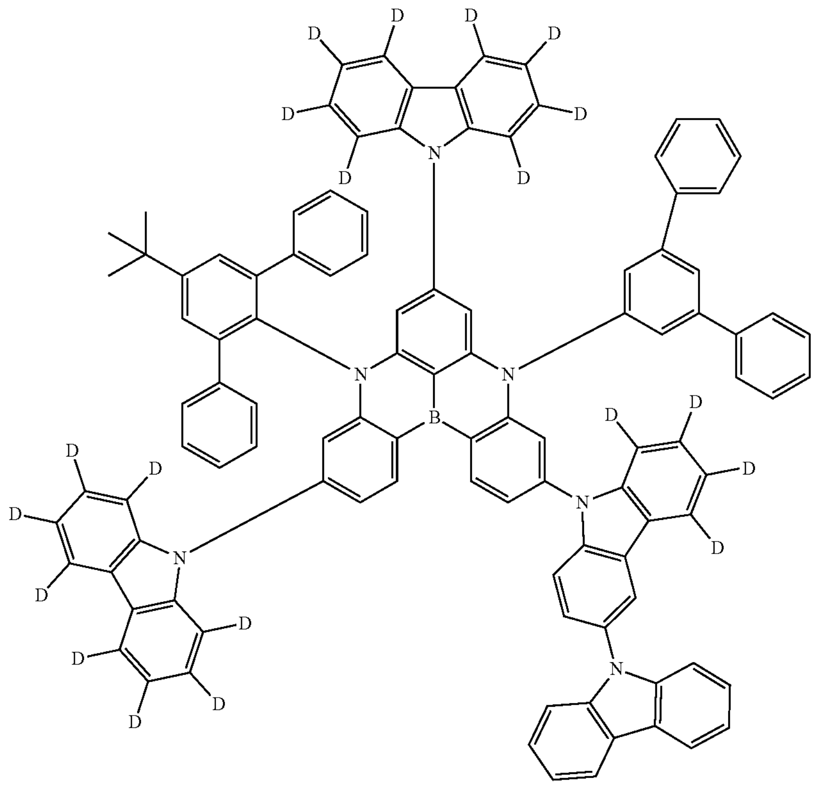
94
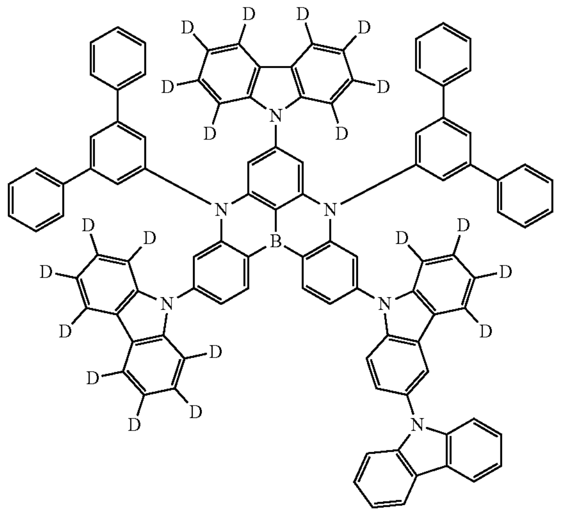

-continued
95
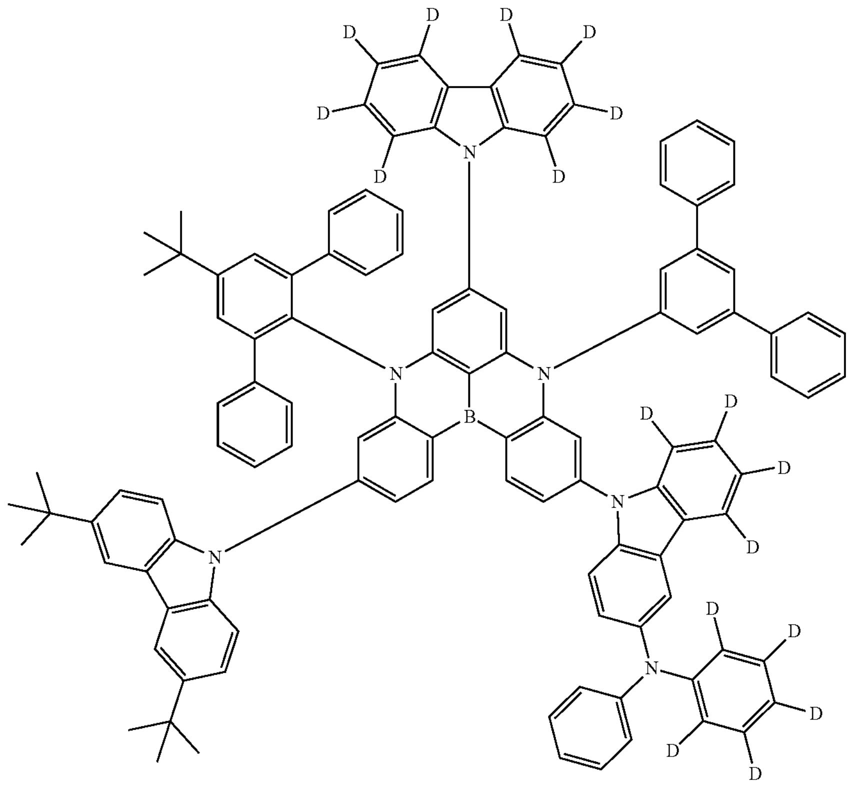
96
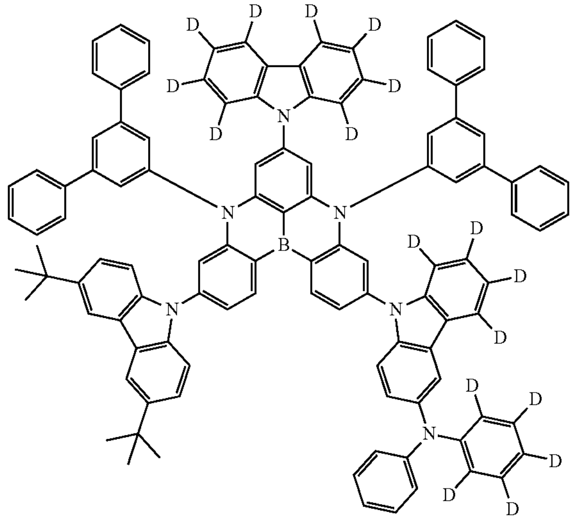

-continued
97
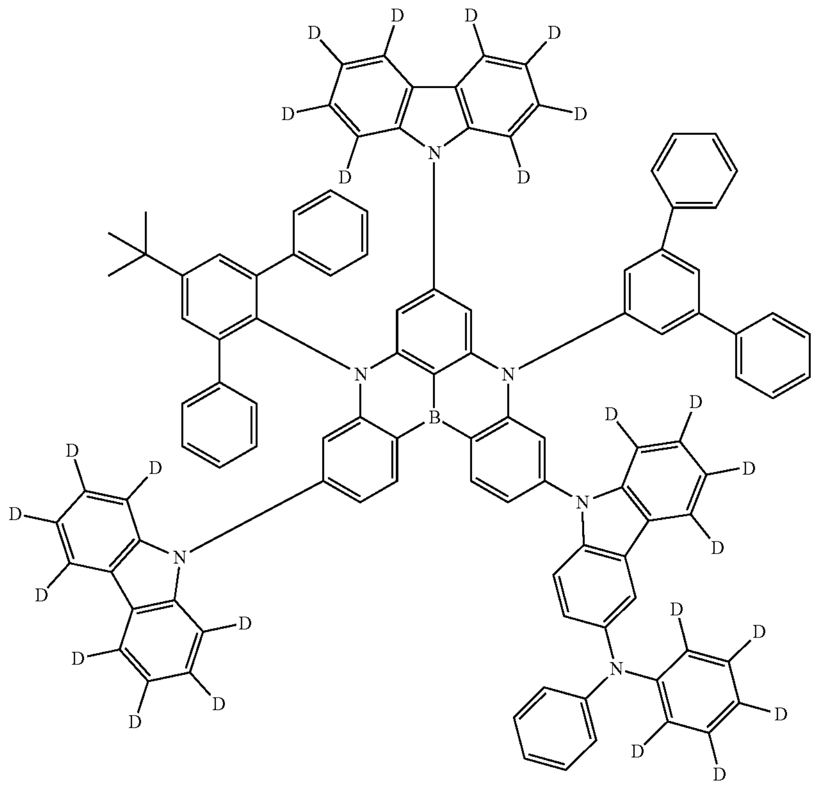
98
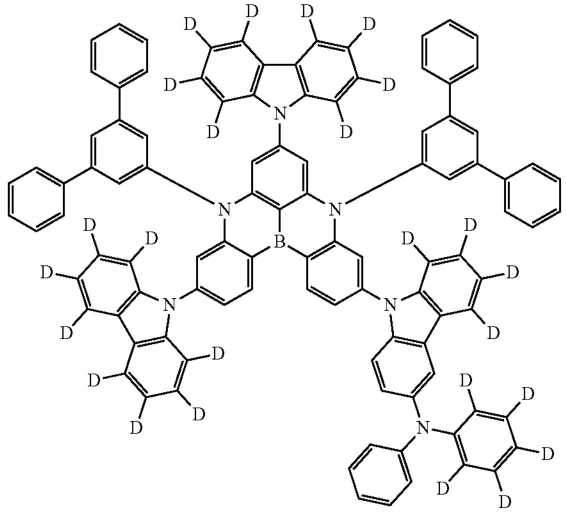

-continued
99
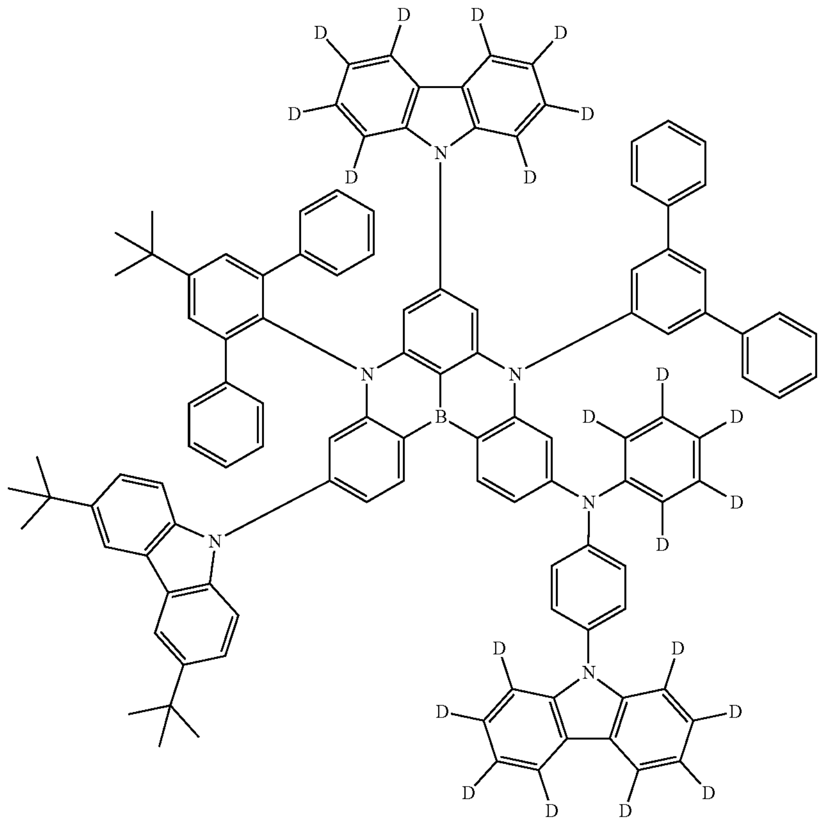
100
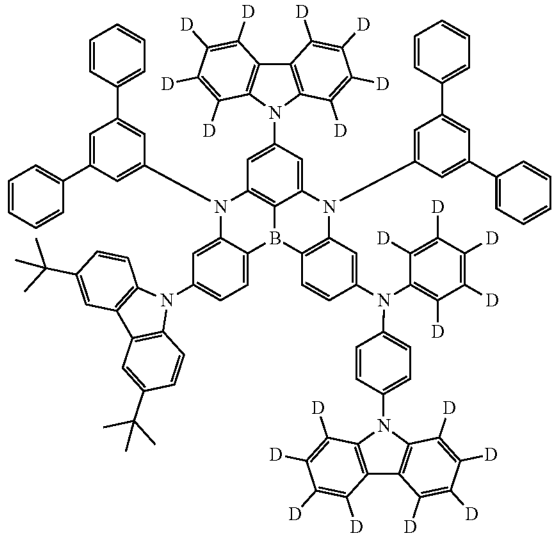

-continued
101
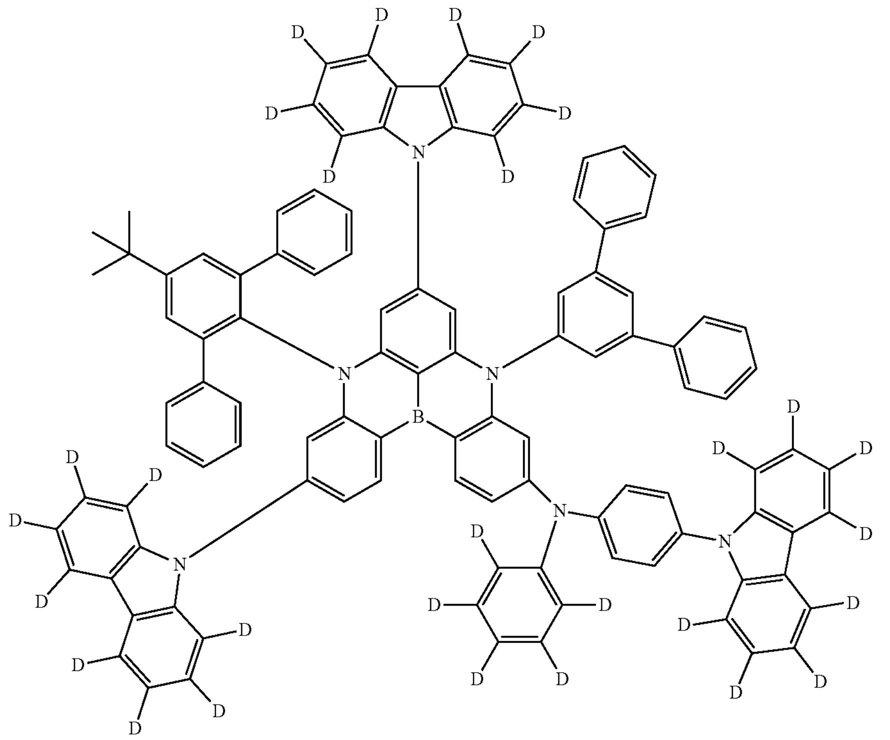
102
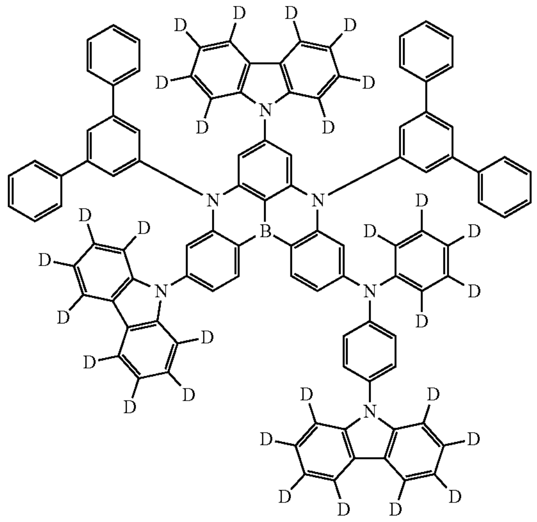
103
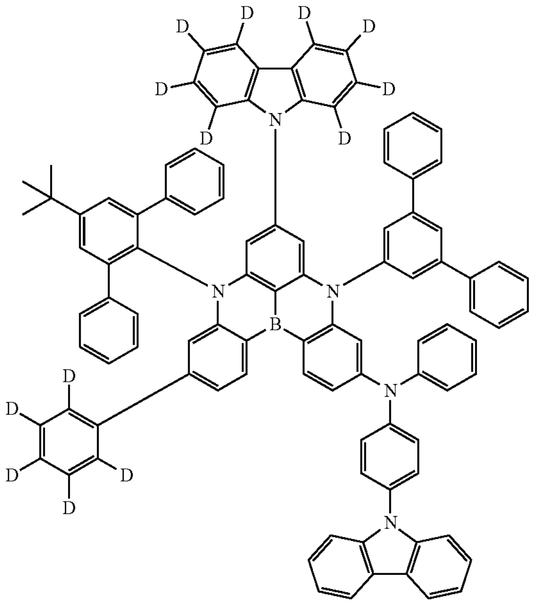

-continued
104
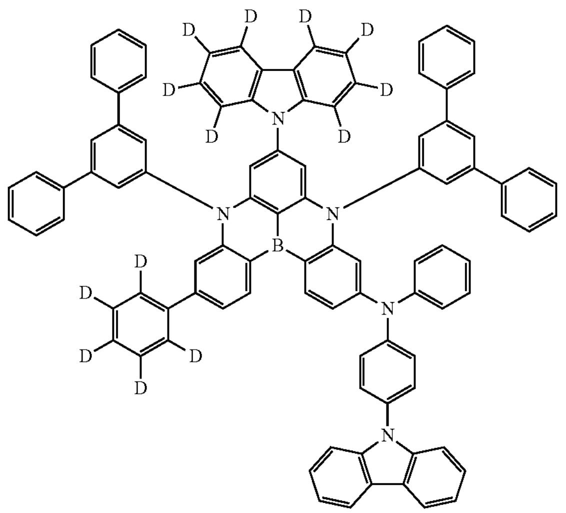
105
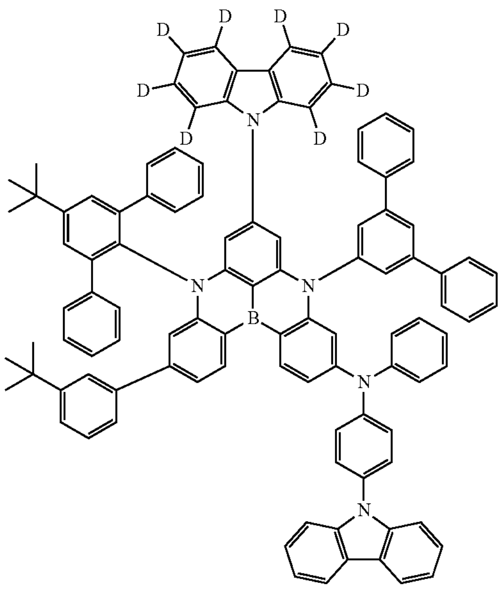
106
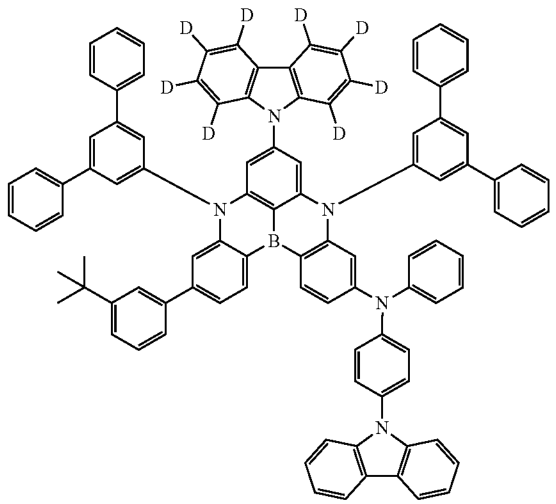
107
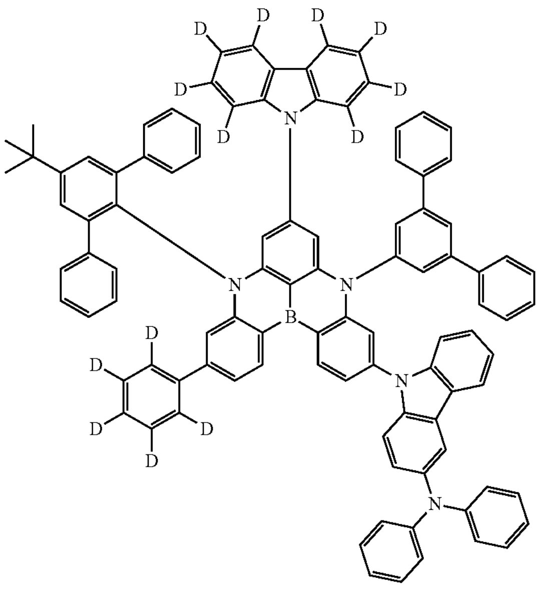

-continued
108
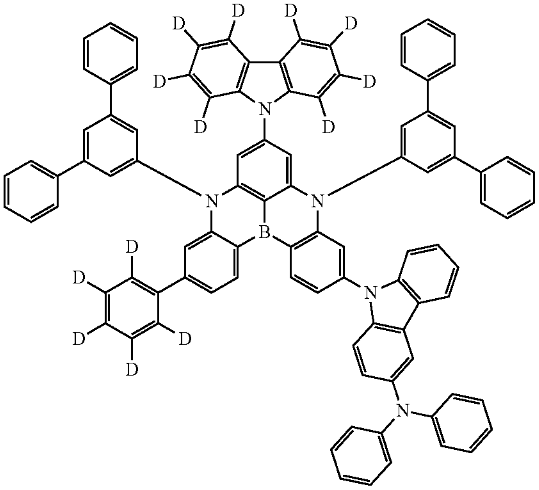
109
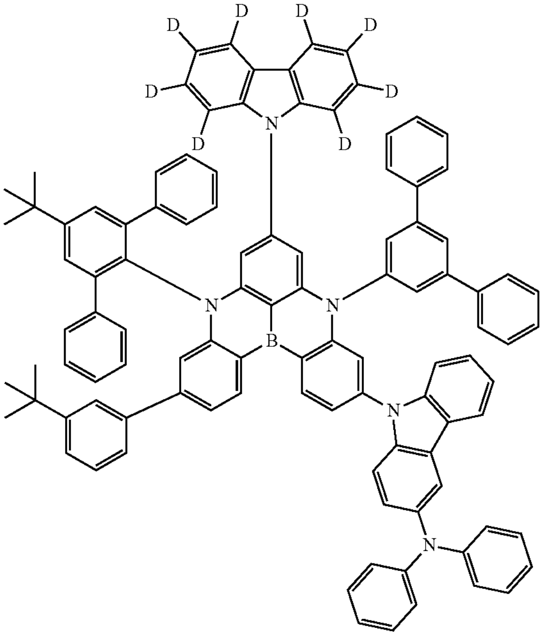
110
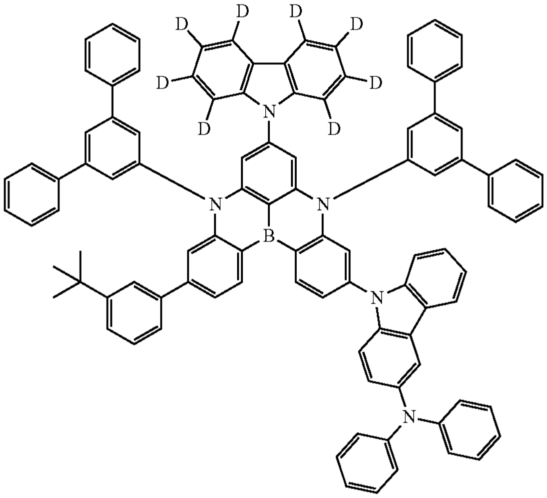
111
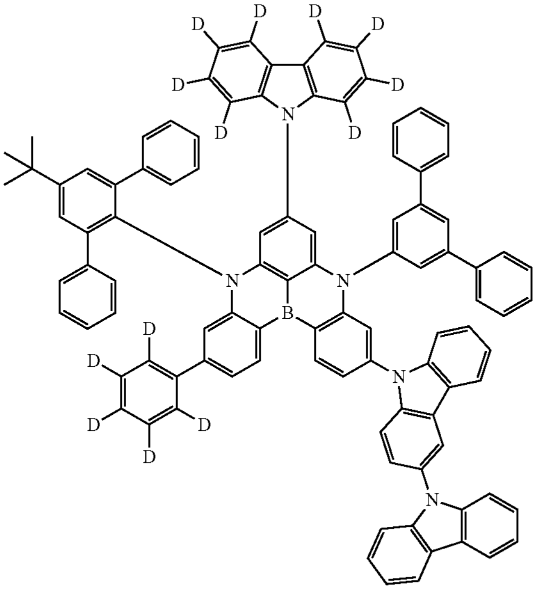

-continued
112
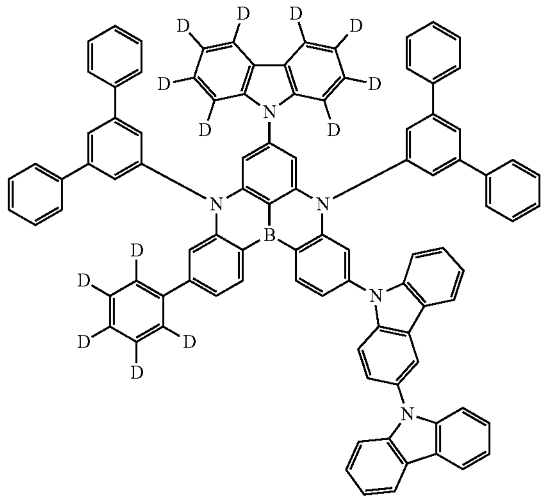
113
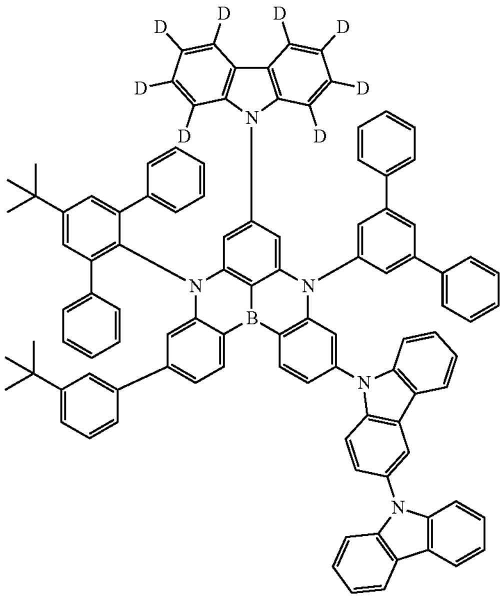
114
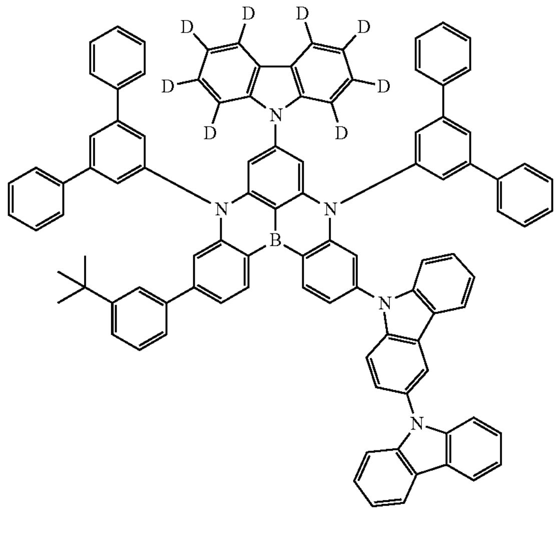

-continued
115
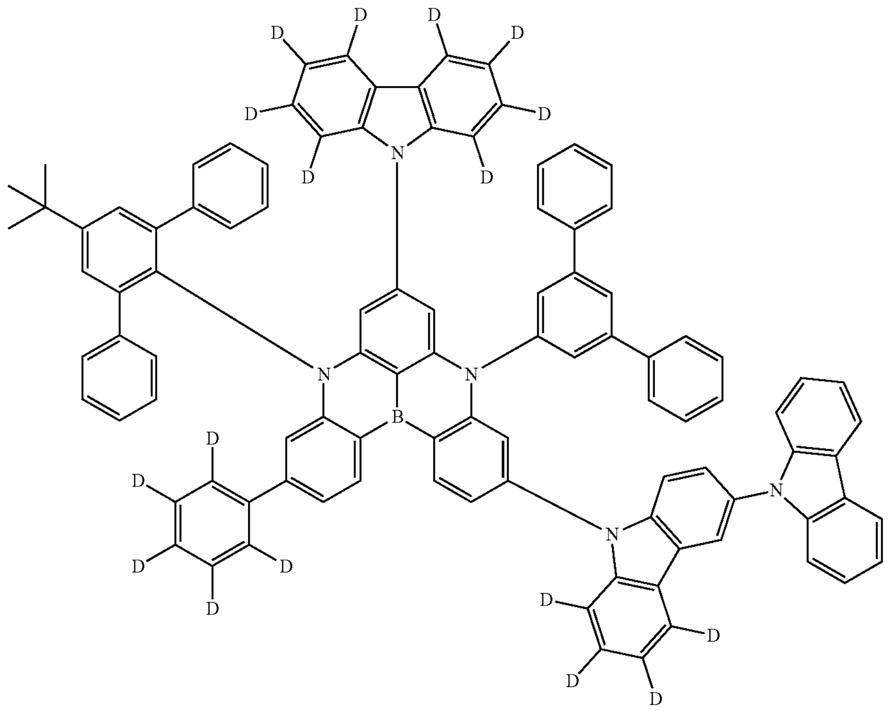
116
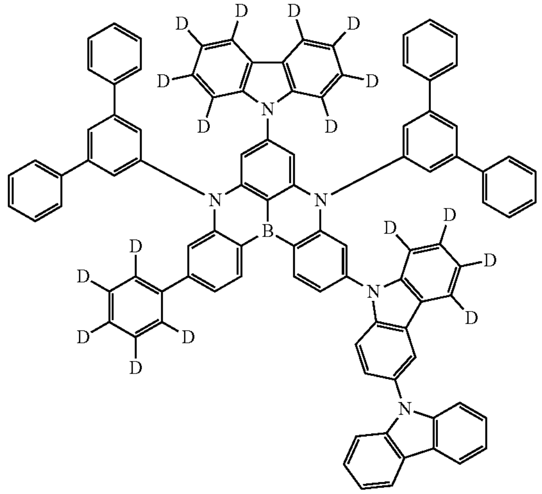
117
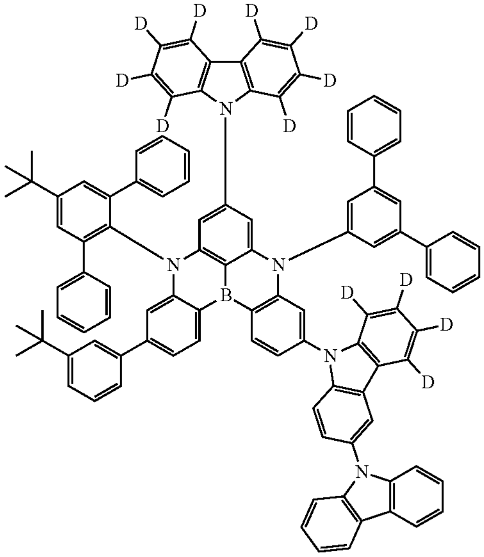

-continued
118
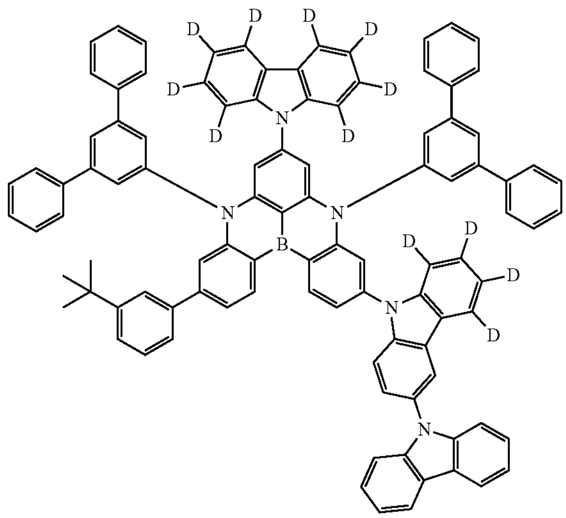
119
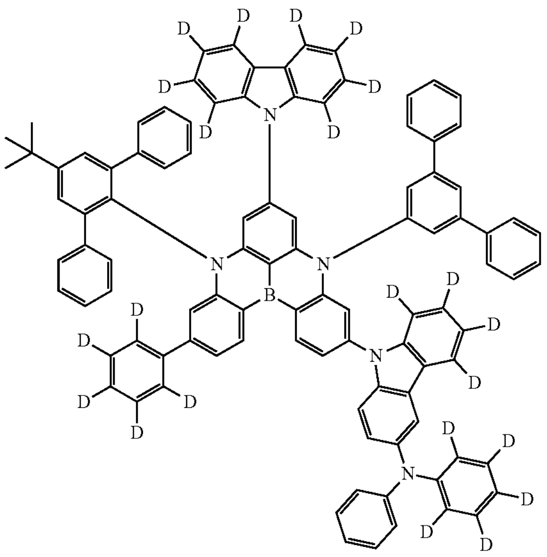
120
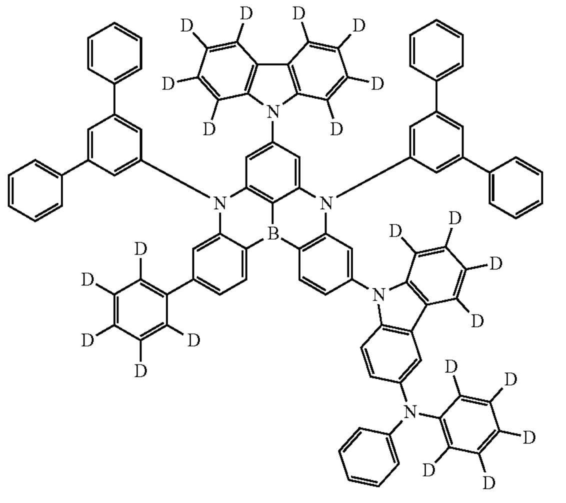
121
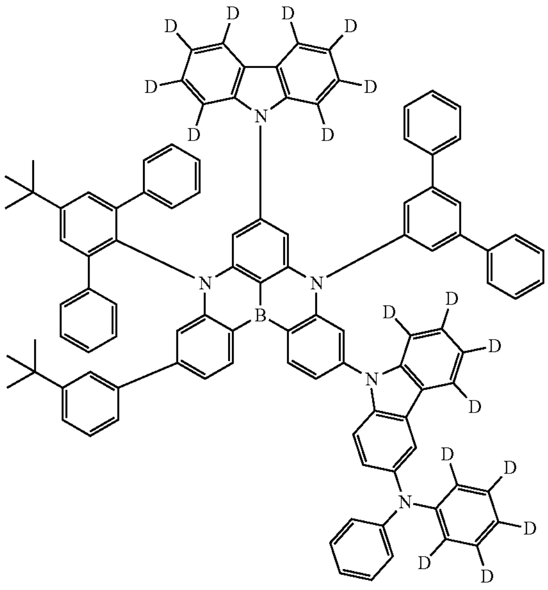

-continued
122
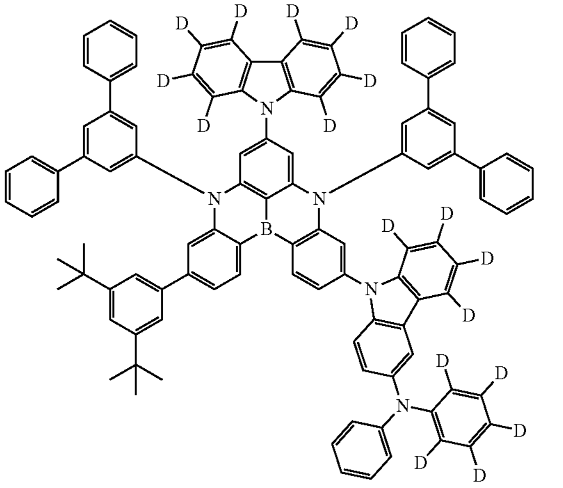
123
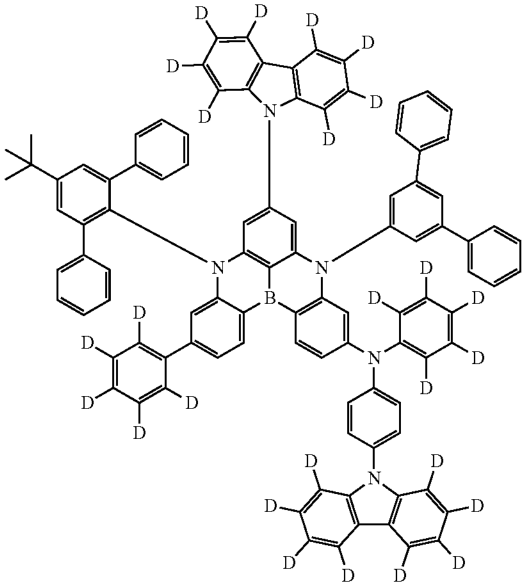
124
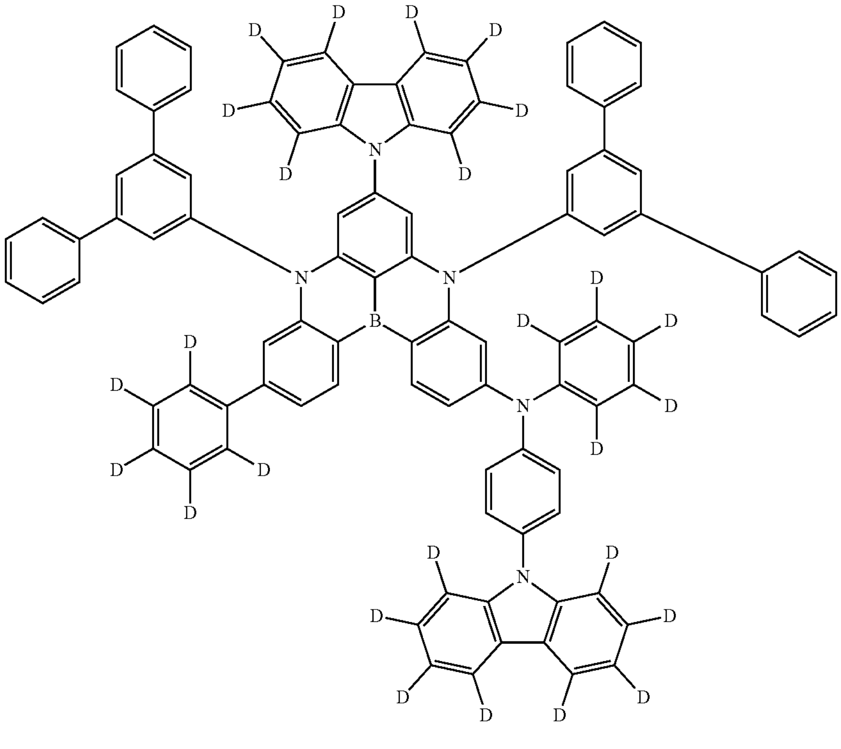

-continued
125
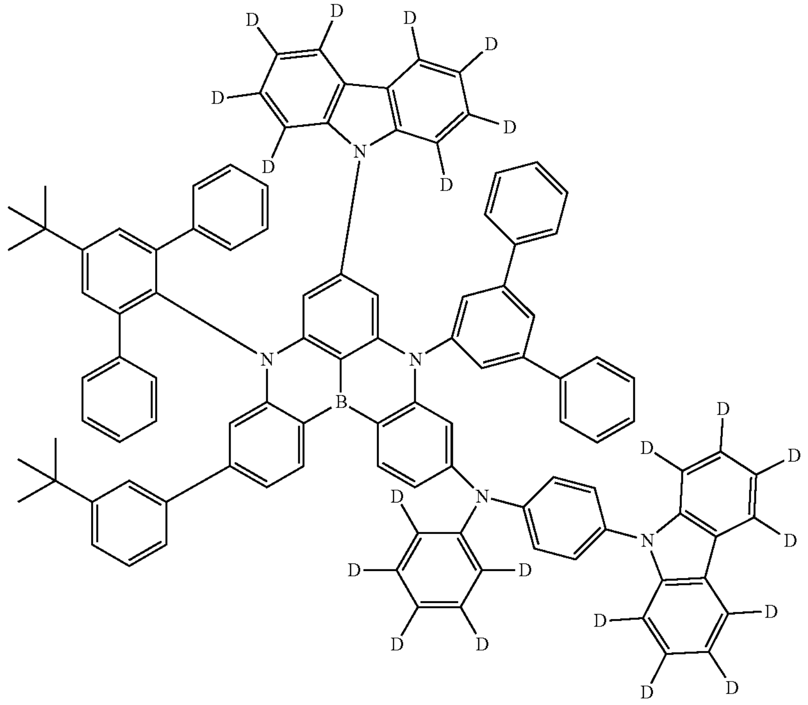
126
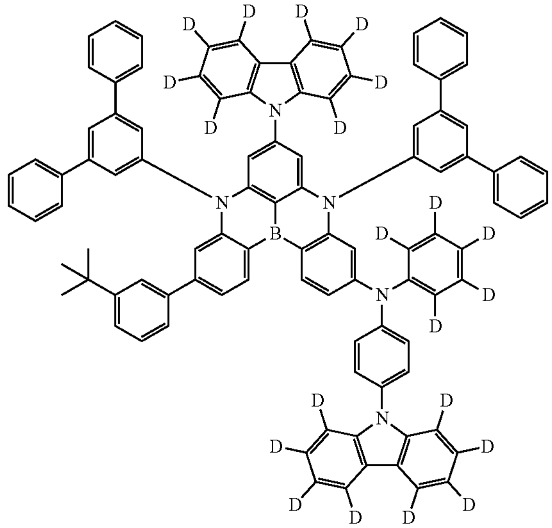
127
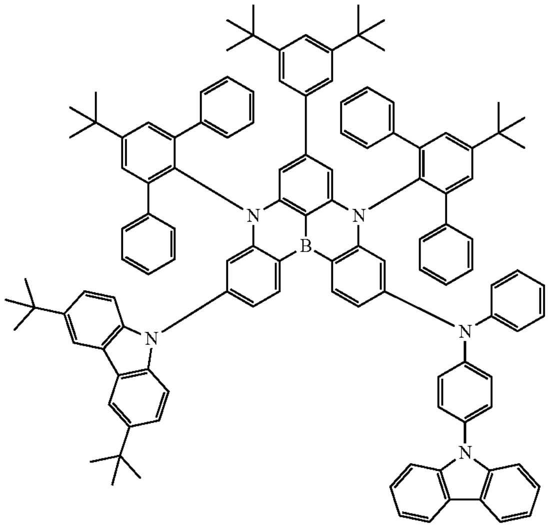

-continued
128
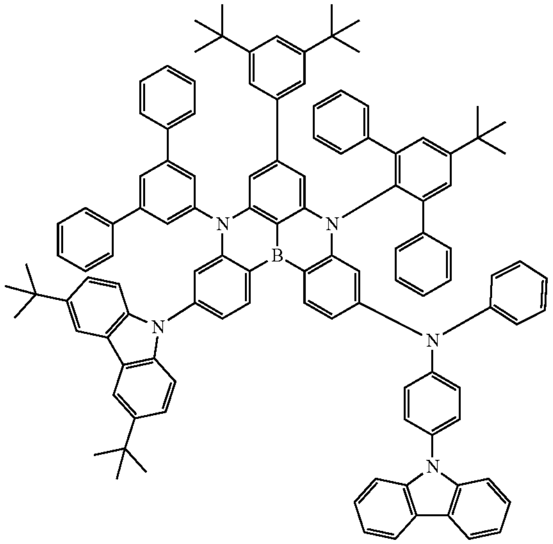
129
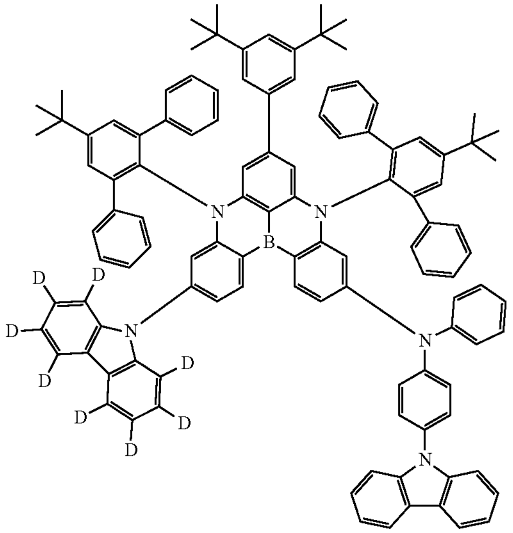
130
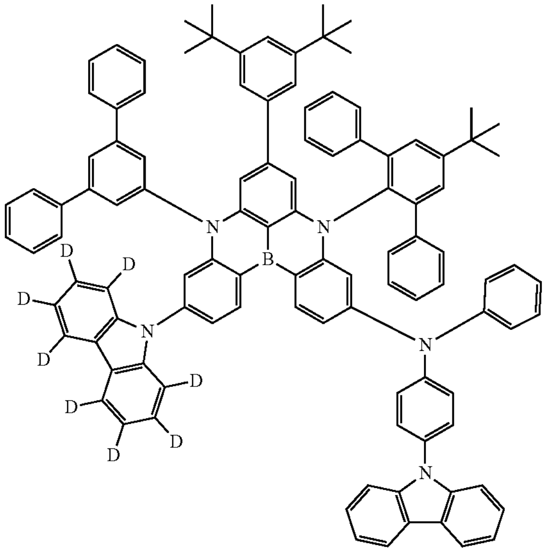

-continued
131
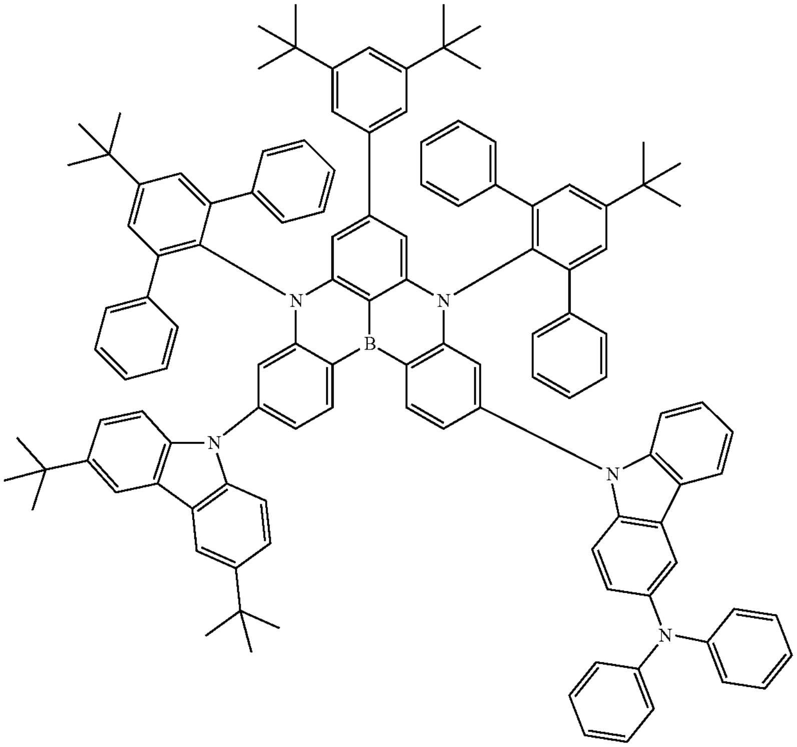
132
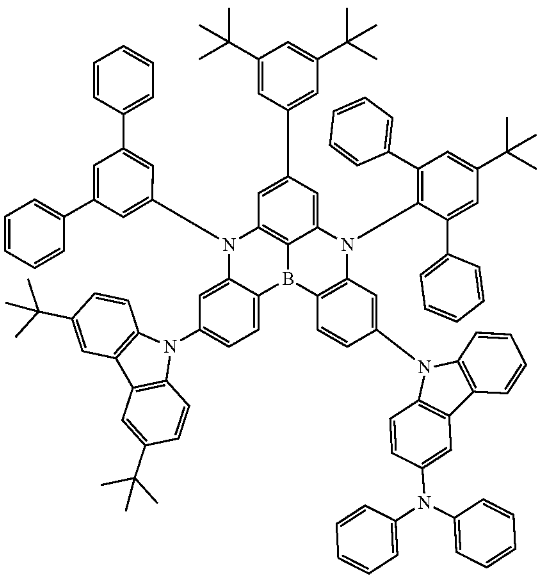
133
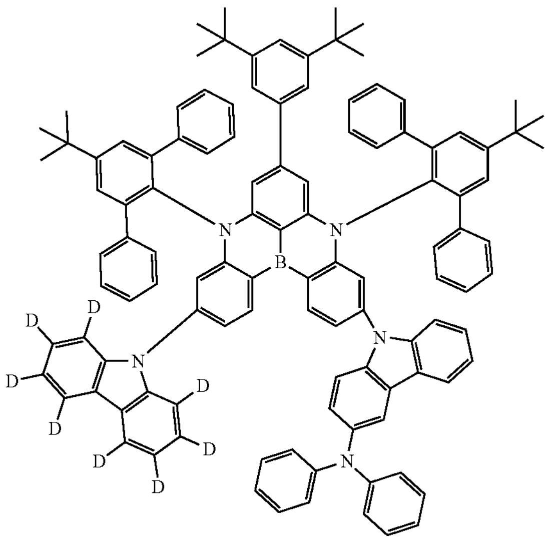

-continued
134
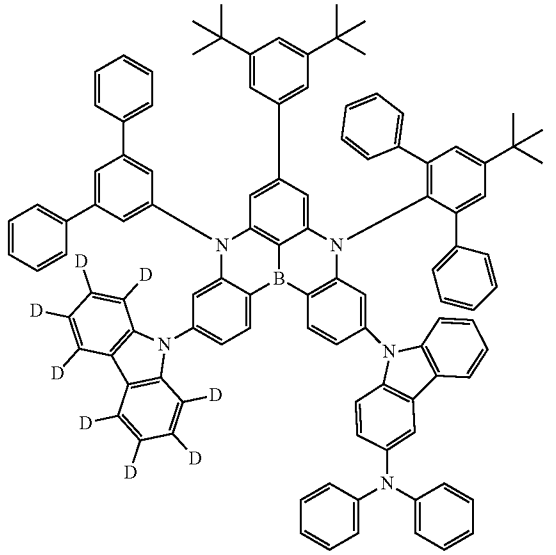
135
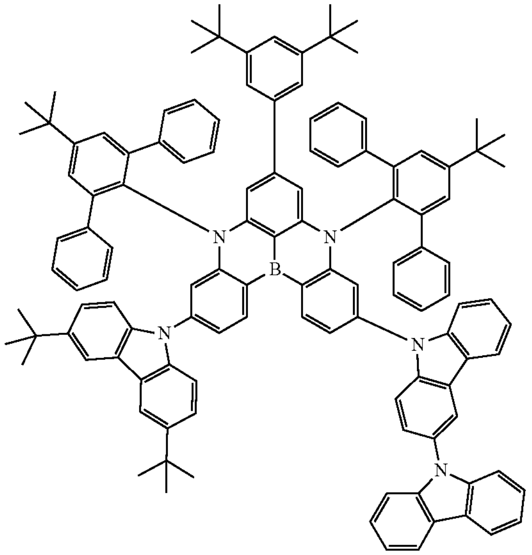
136
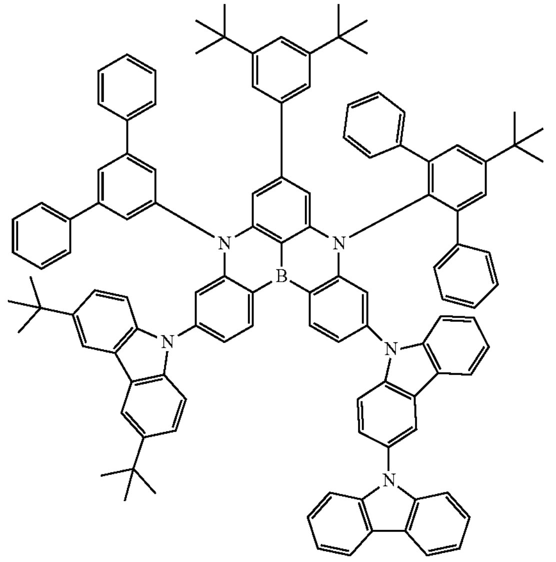
137
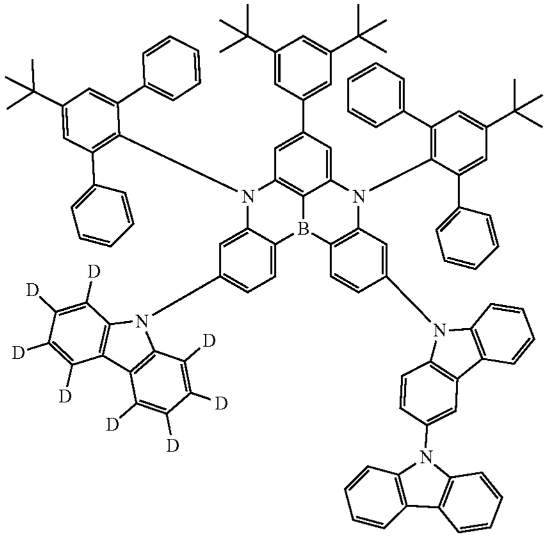
138
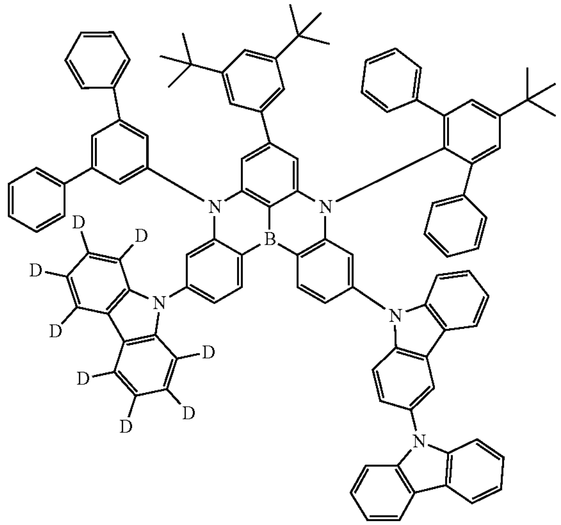

-continued
139
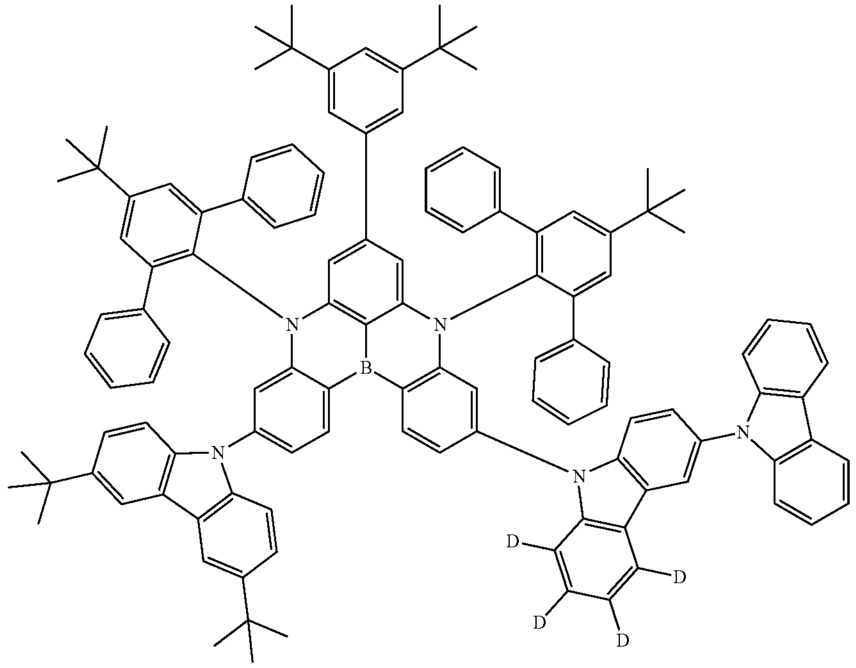
140
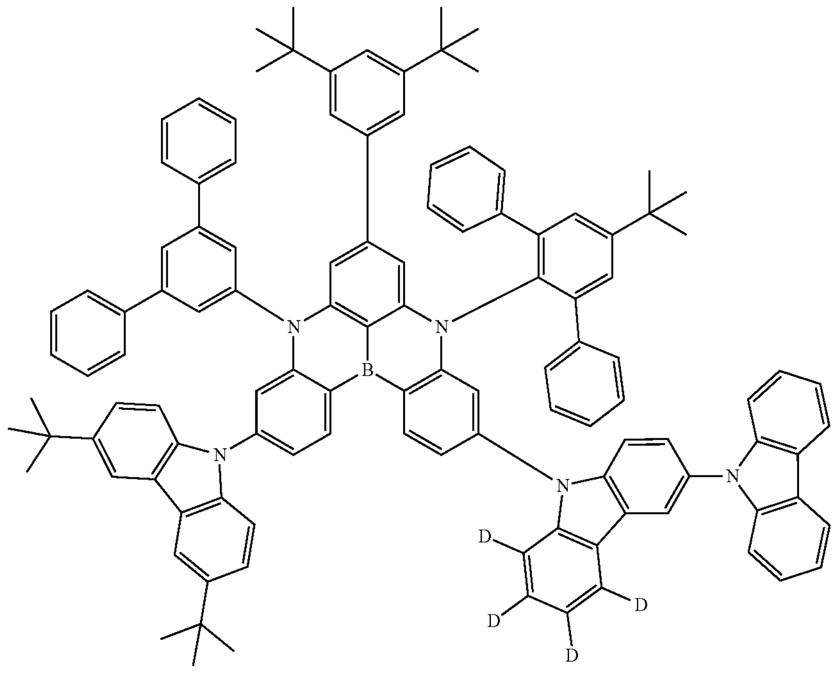

-continued
141
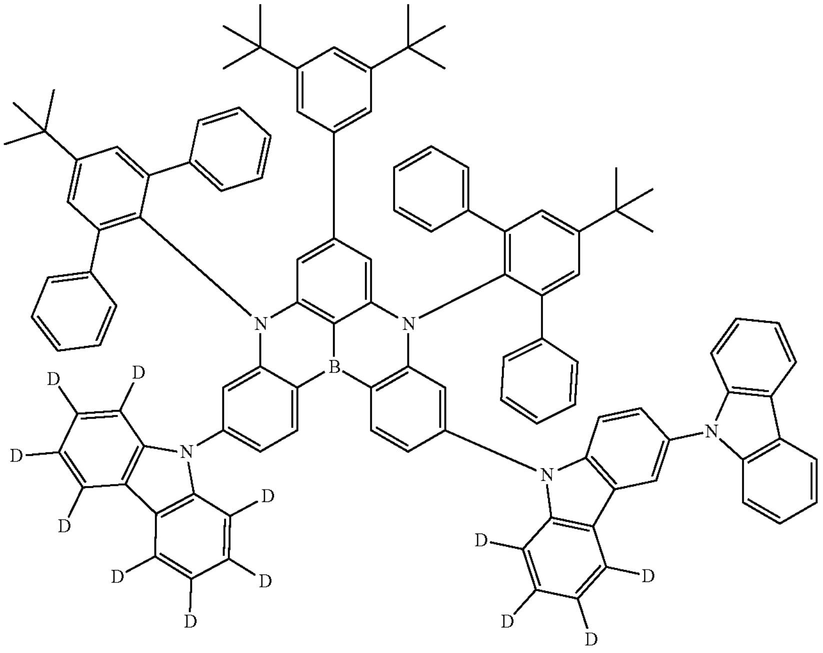
142
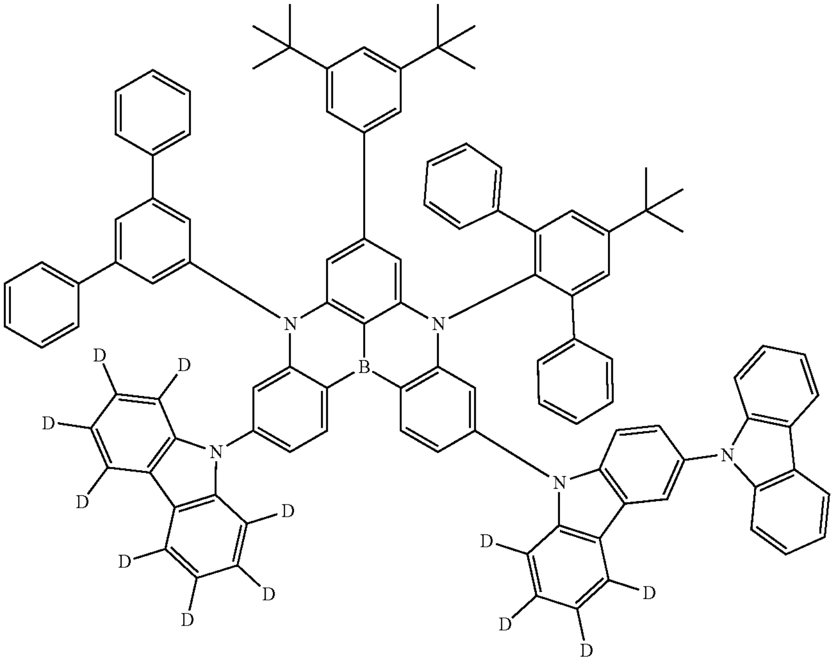

-continued
143
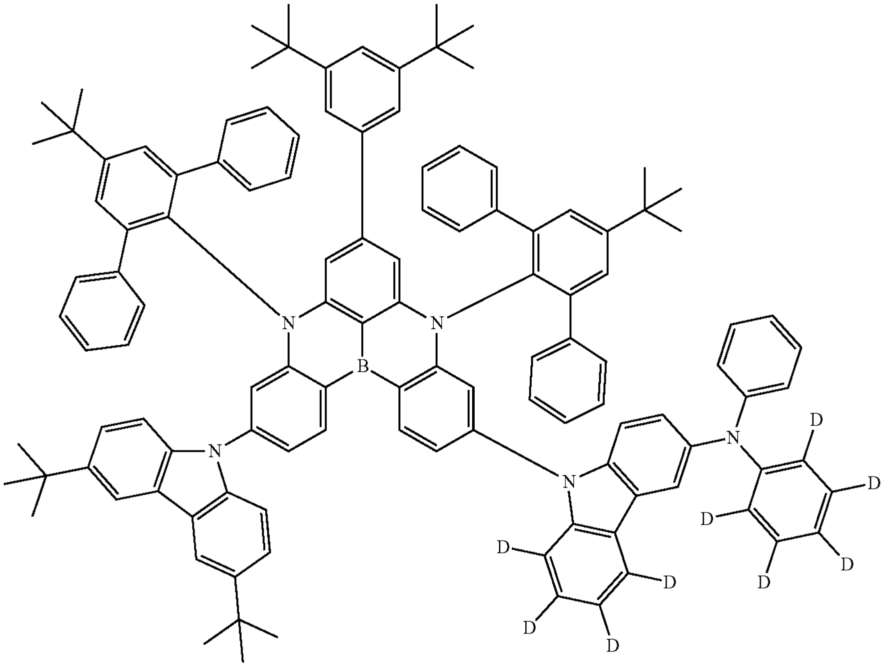
144
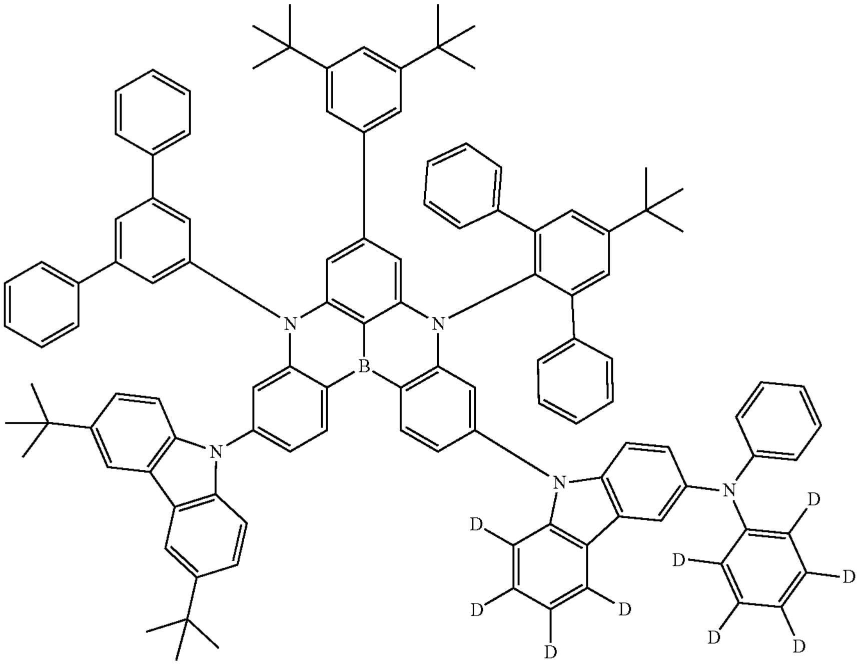

-continued
145
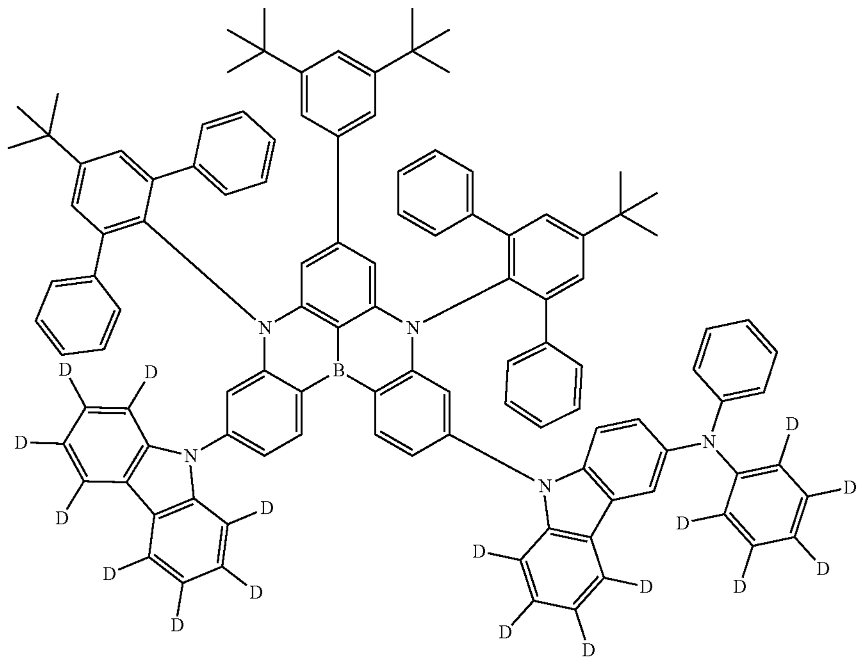
146
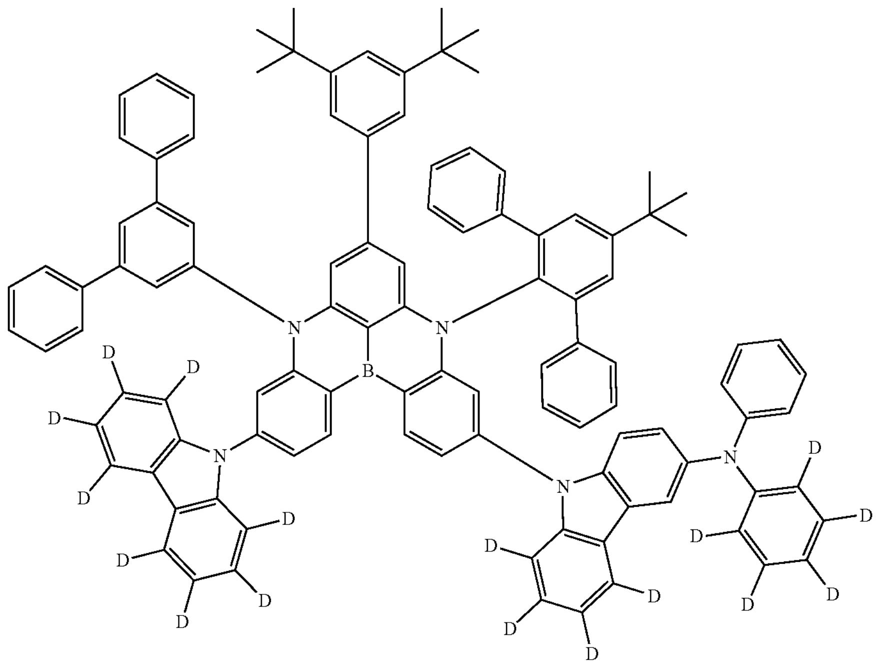

-continued
147
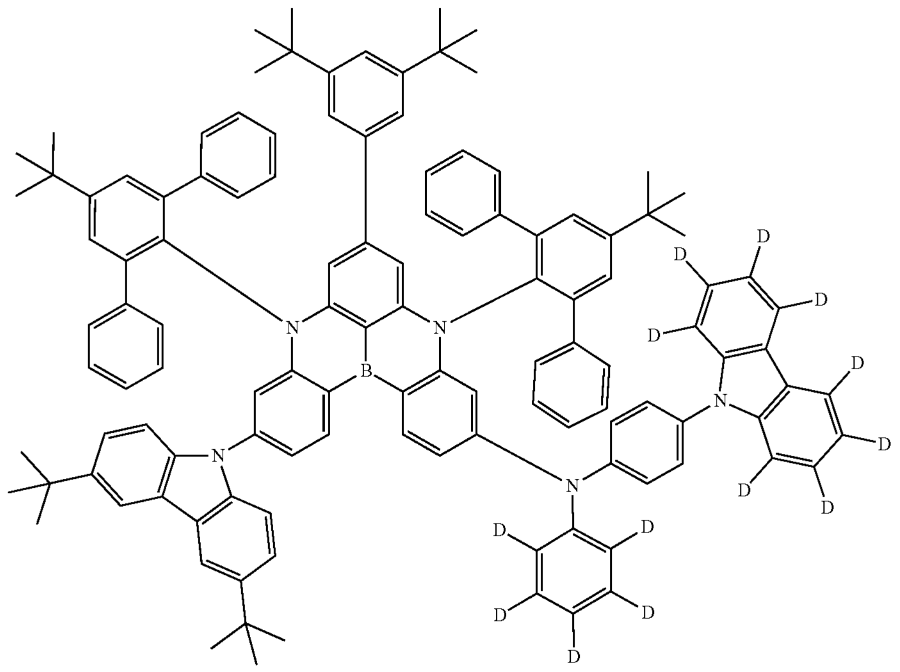
148
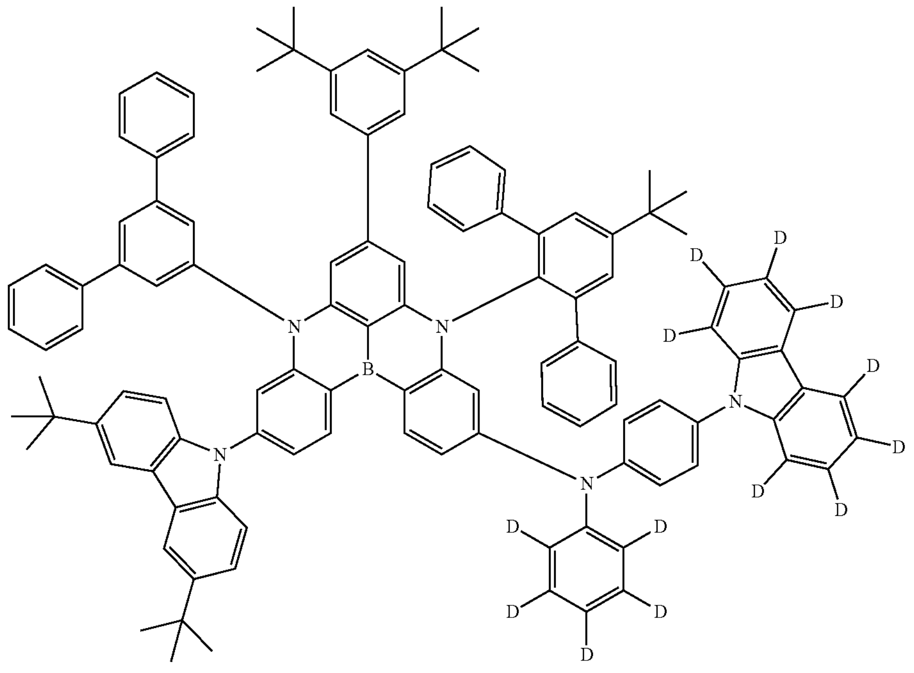

-continued
149
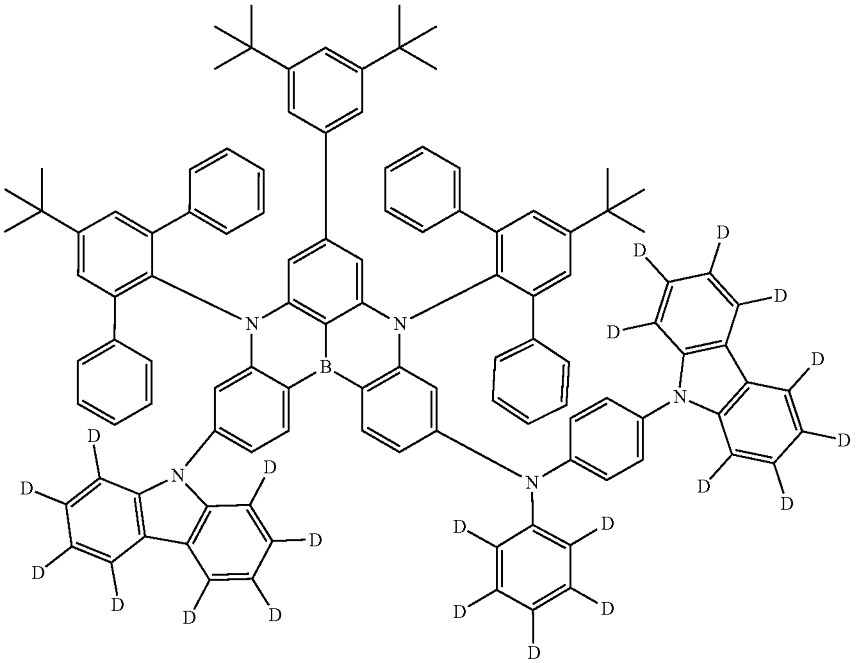
150
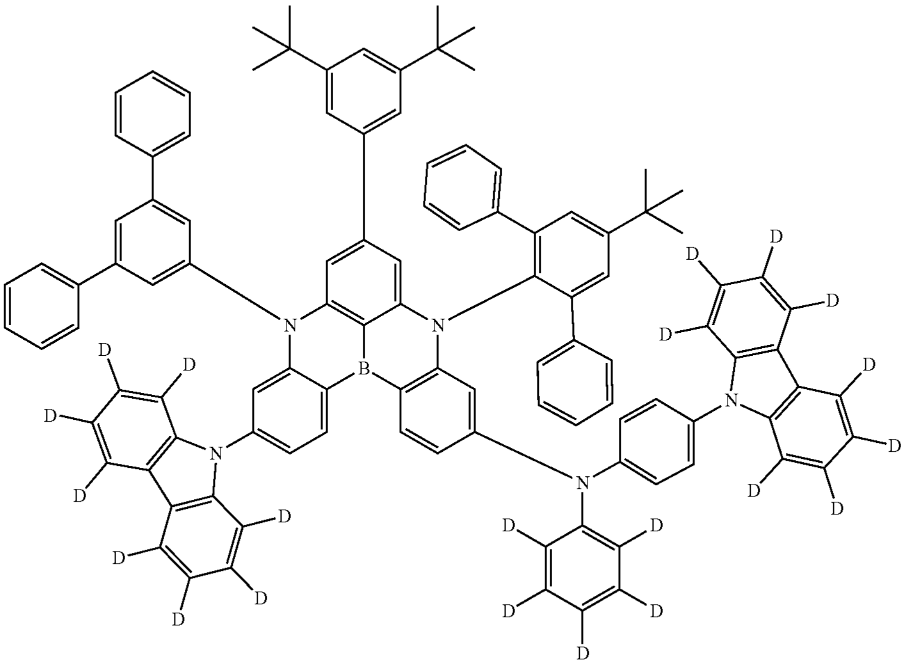

-continued
151
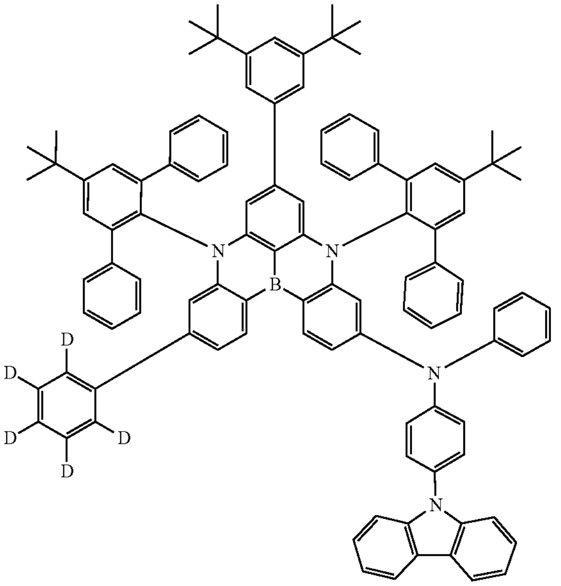
152
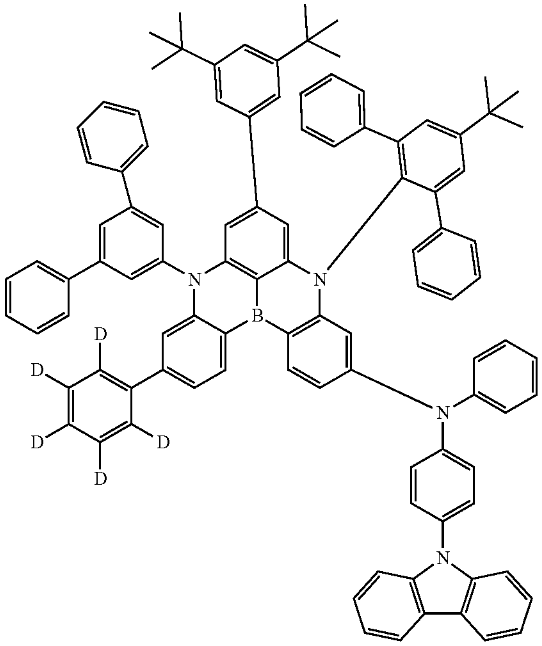
153
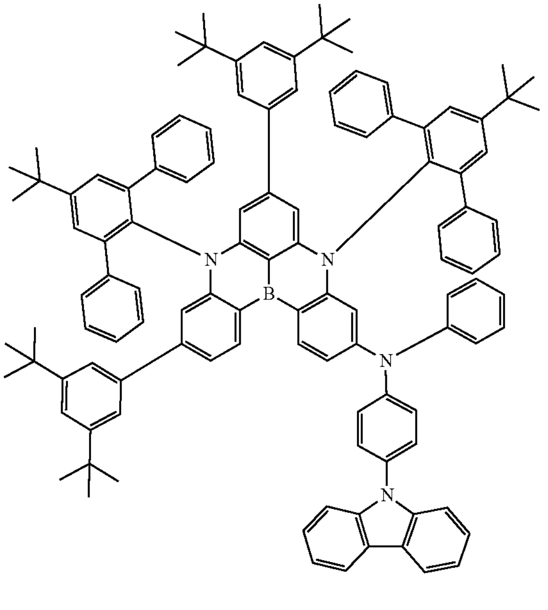
154
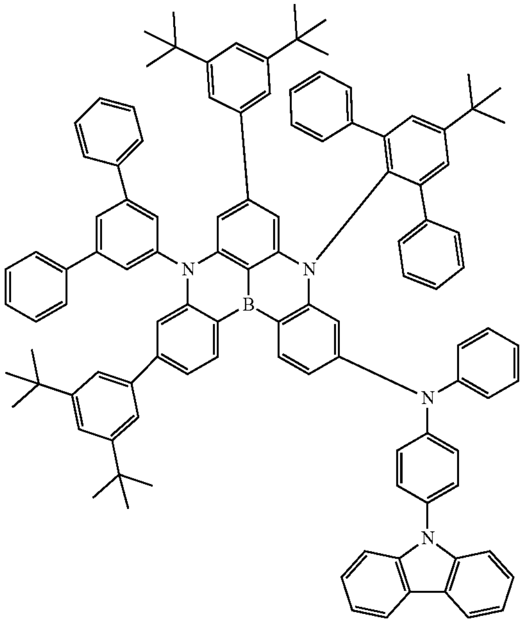

-continued
155
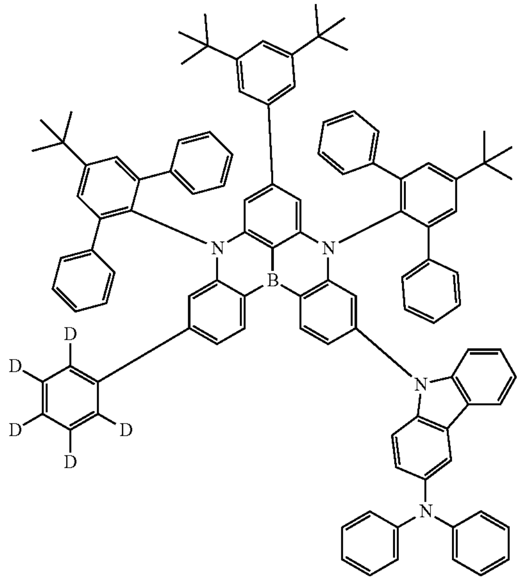
156
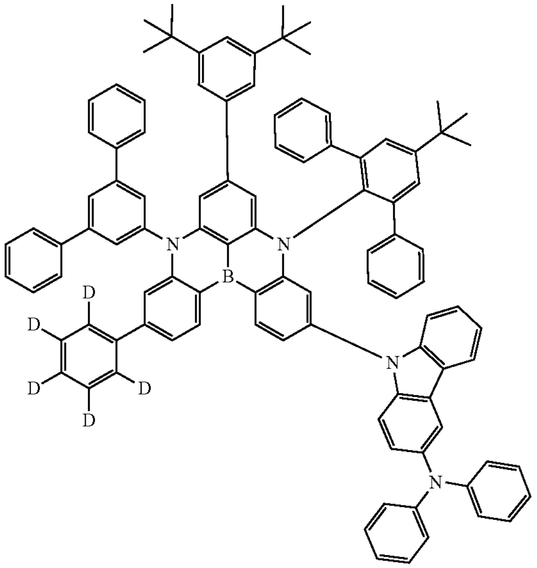
157
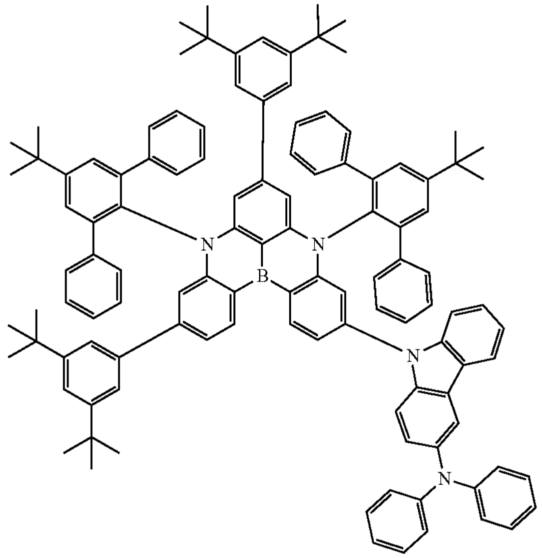
158
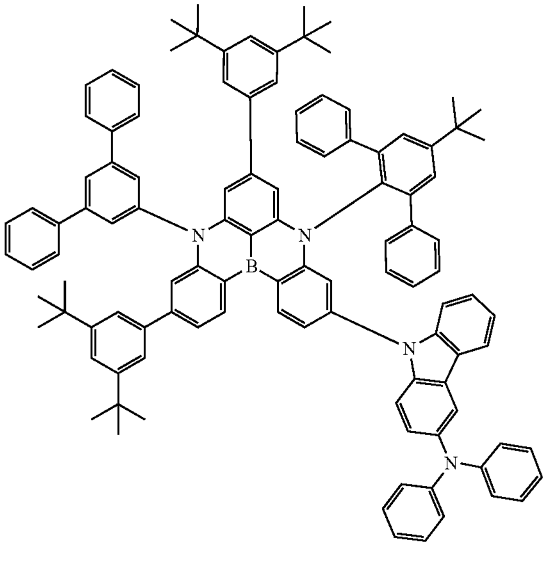

-continued
159
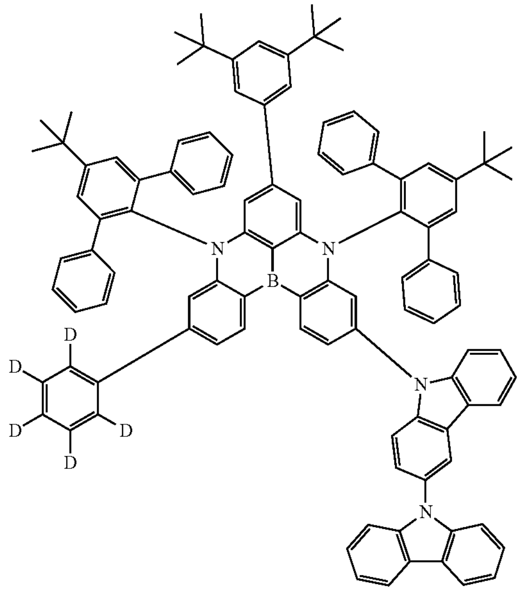
160
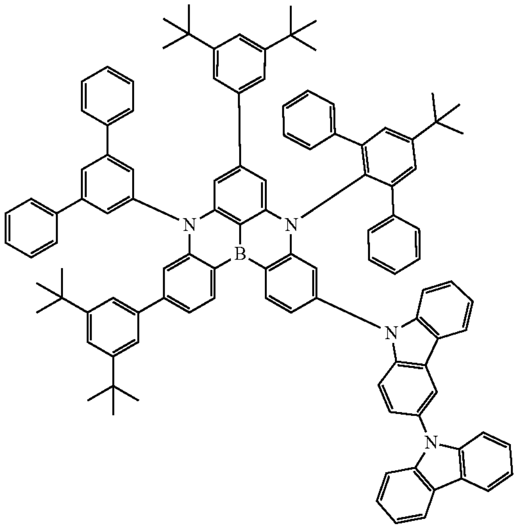
161
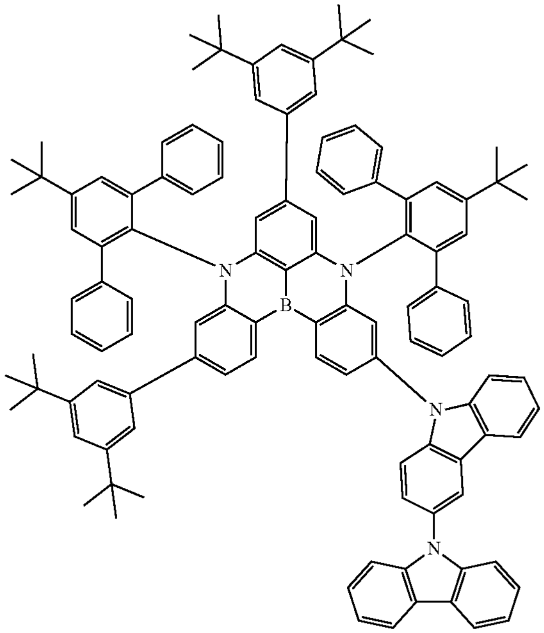
162
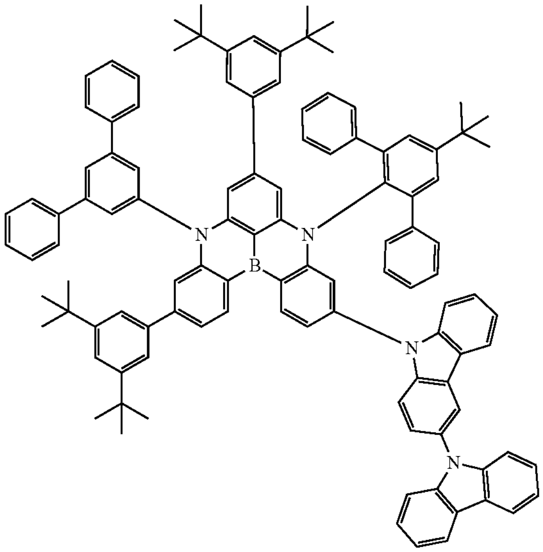

-continued
163
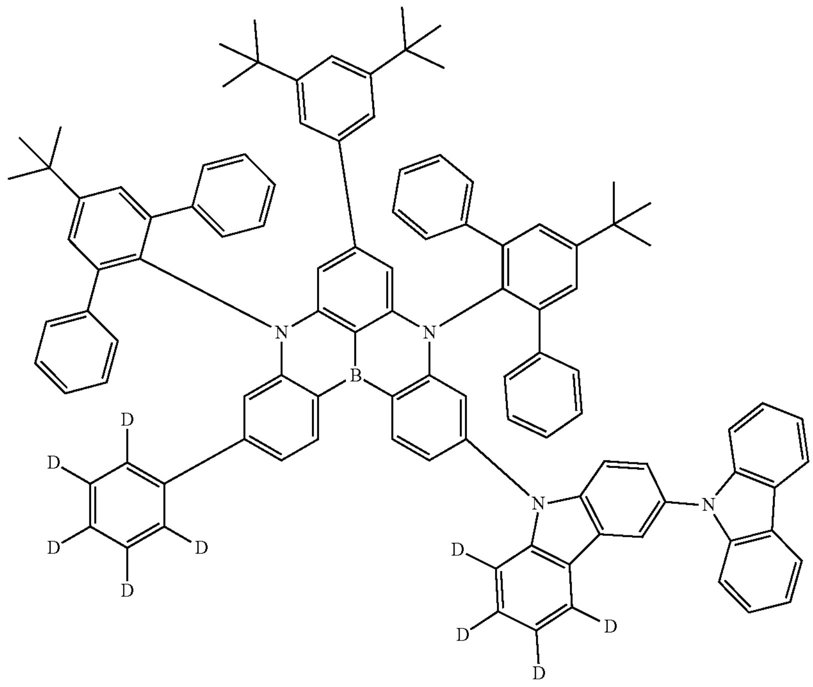
164
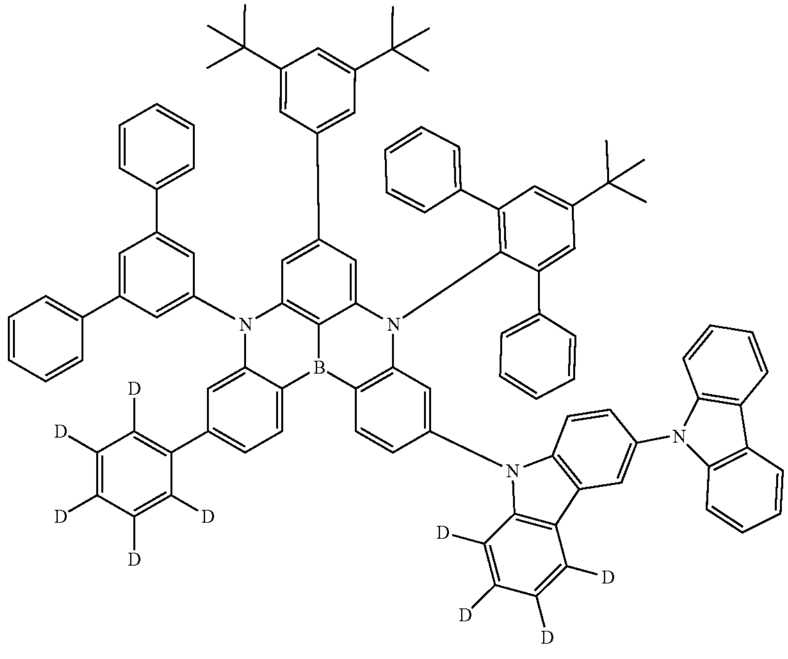

-continued
165
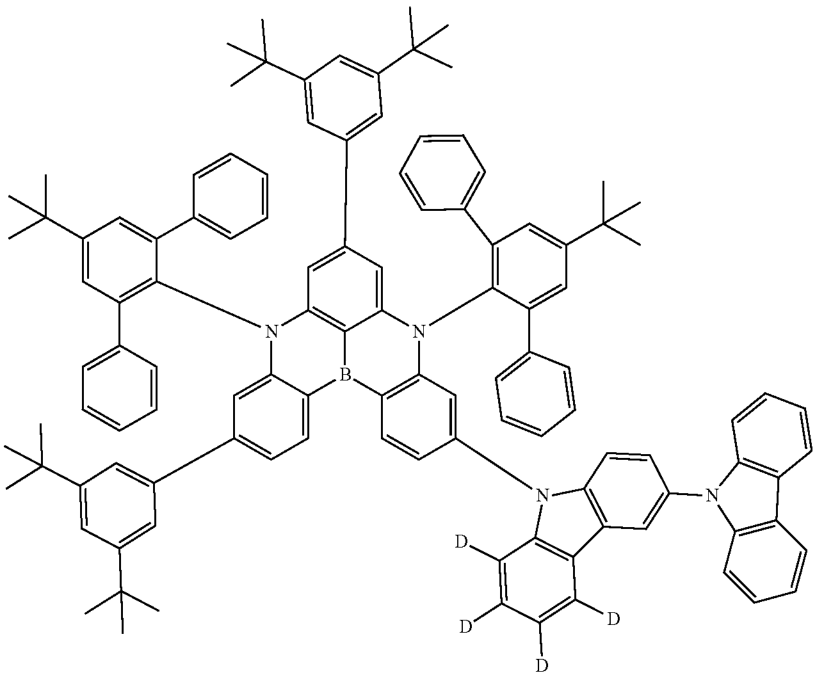
166
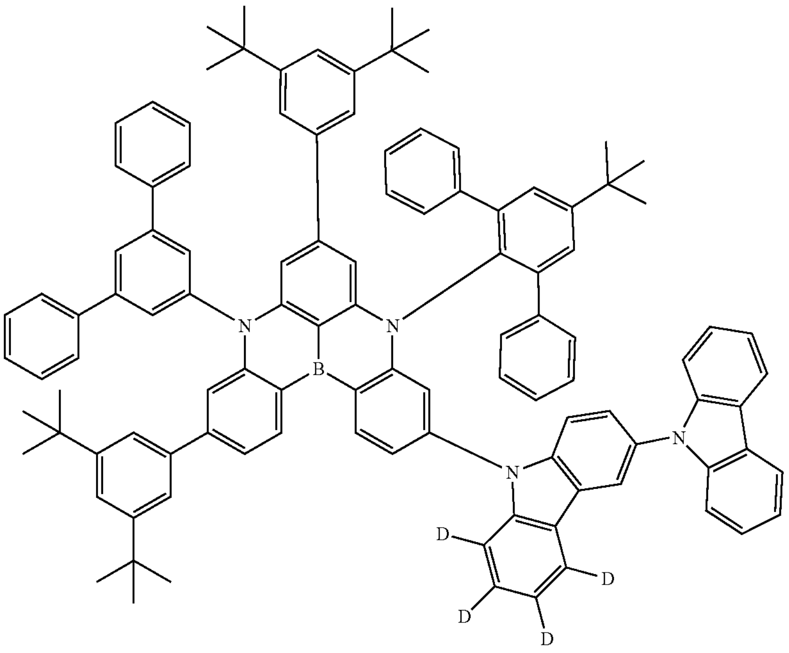

-continued
167
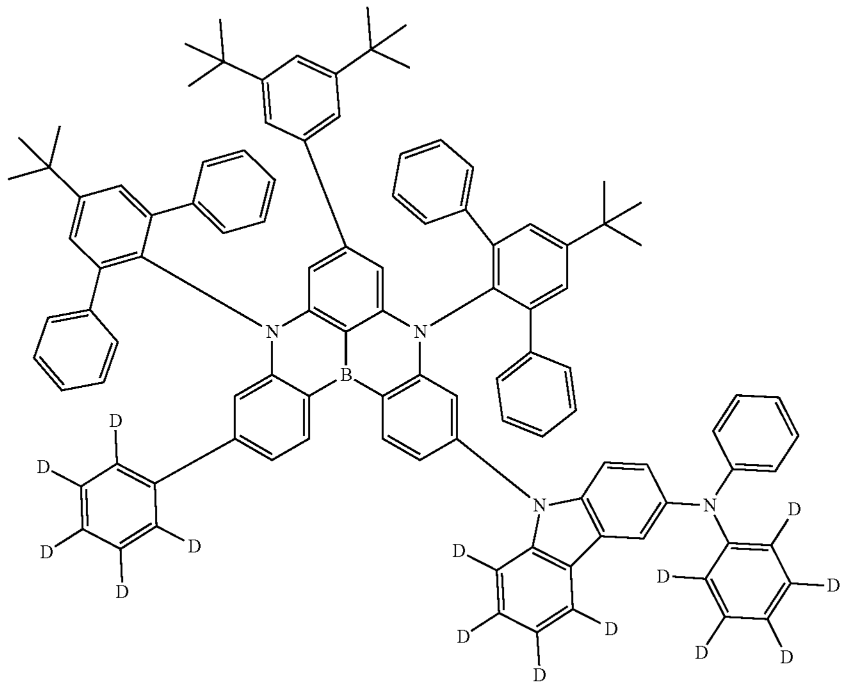
168
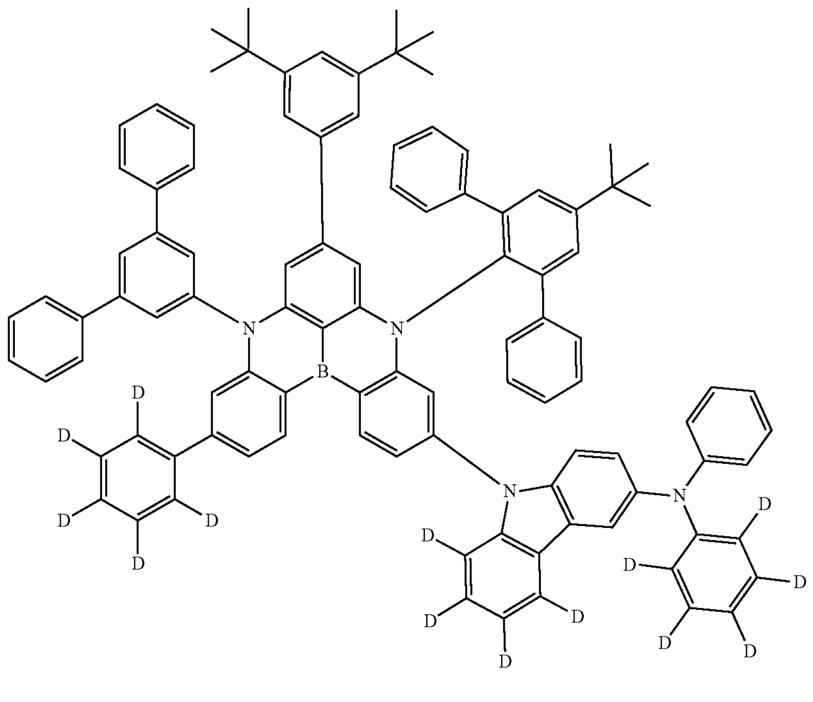

-continued
169
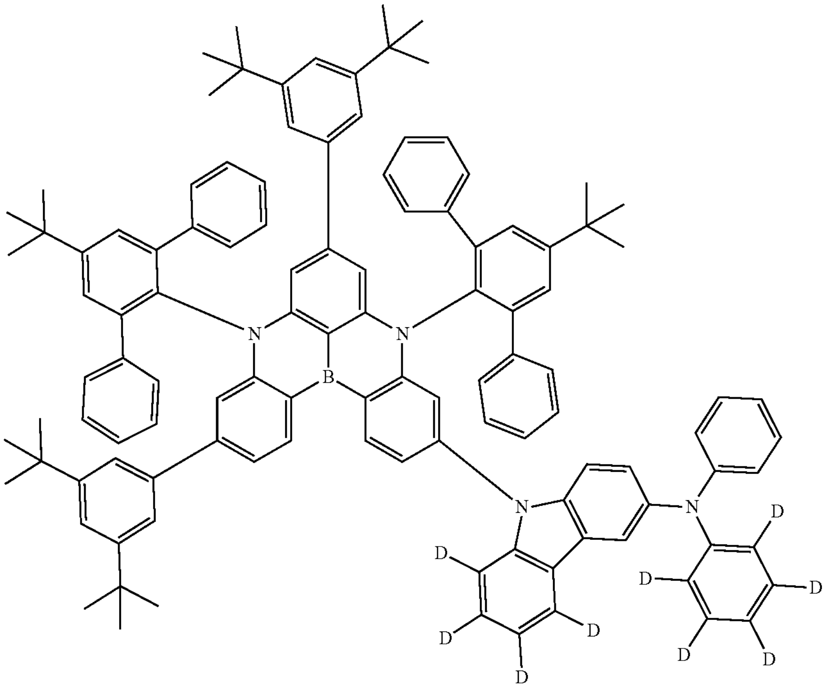
170
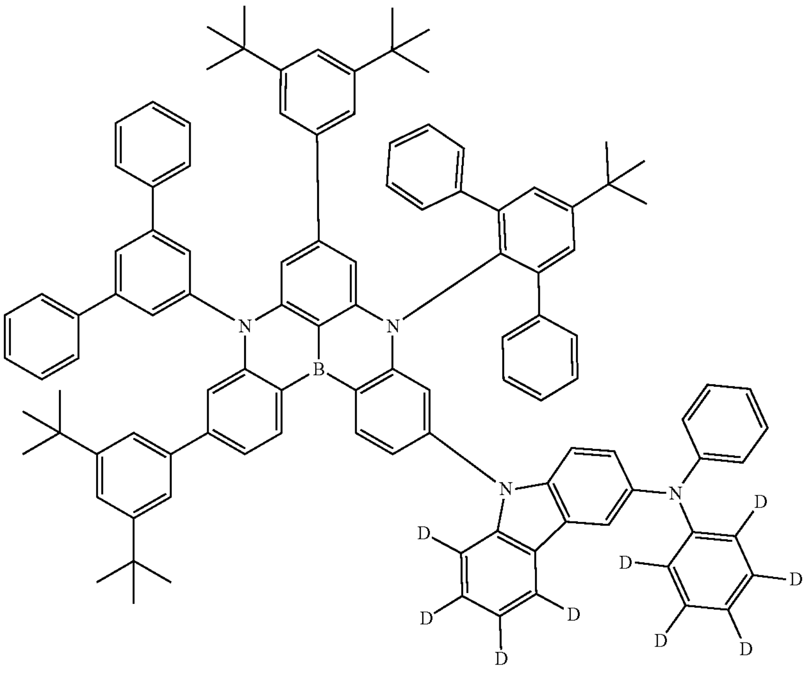

-continued
171
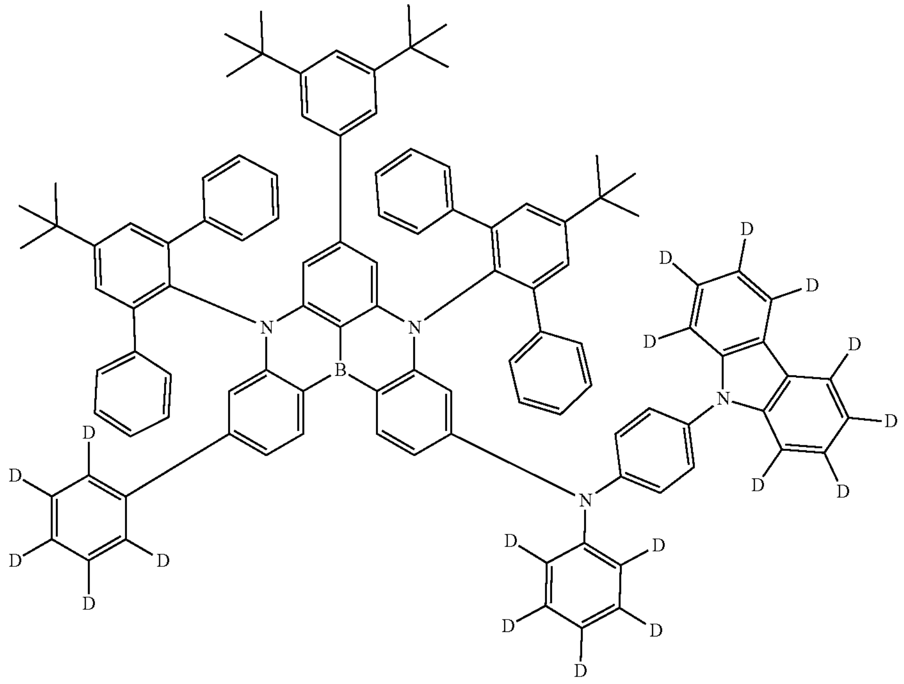
172
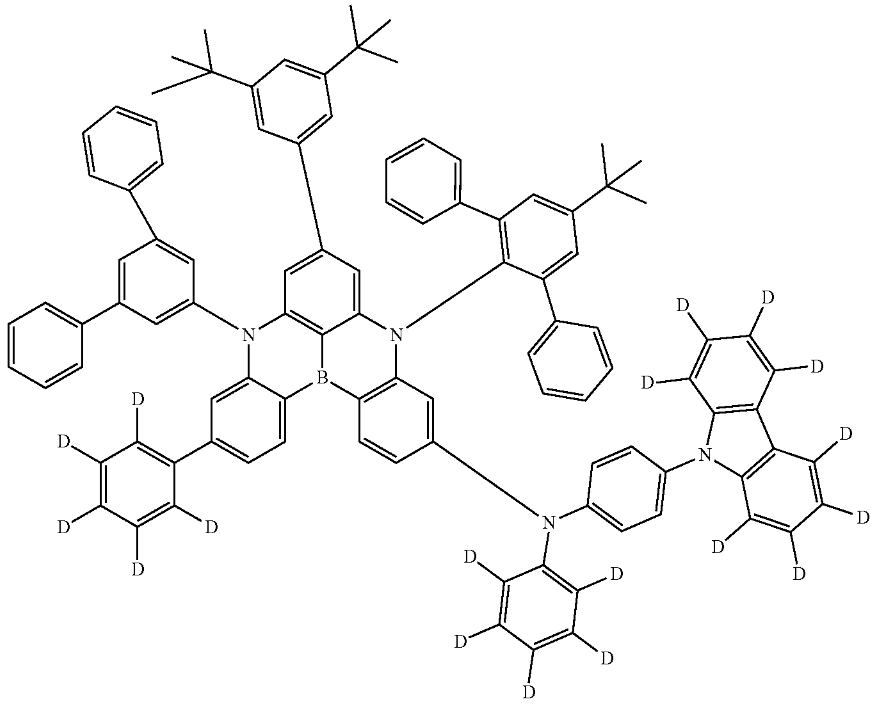

-continued
173
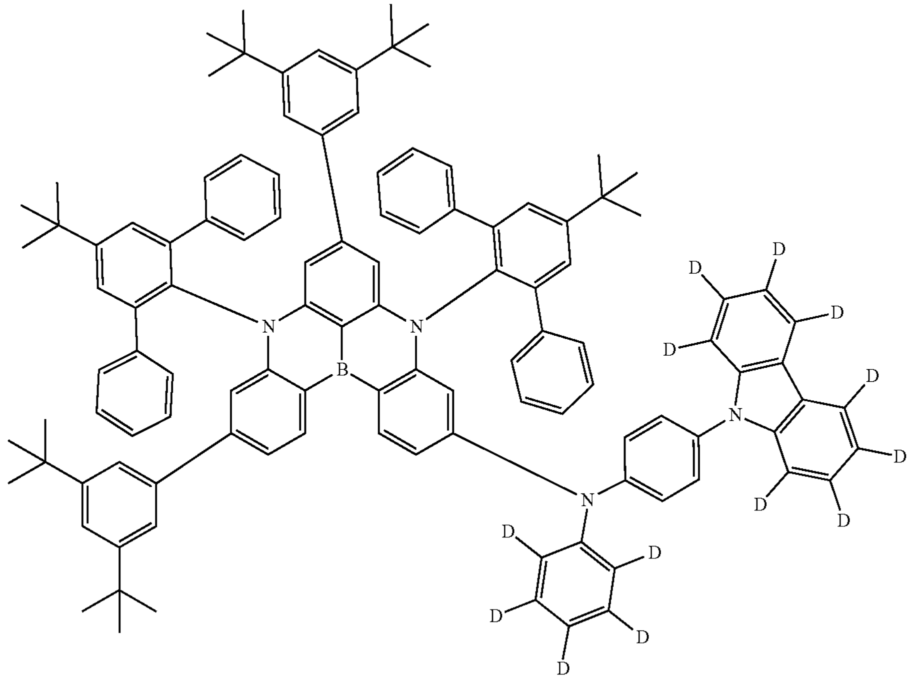
174
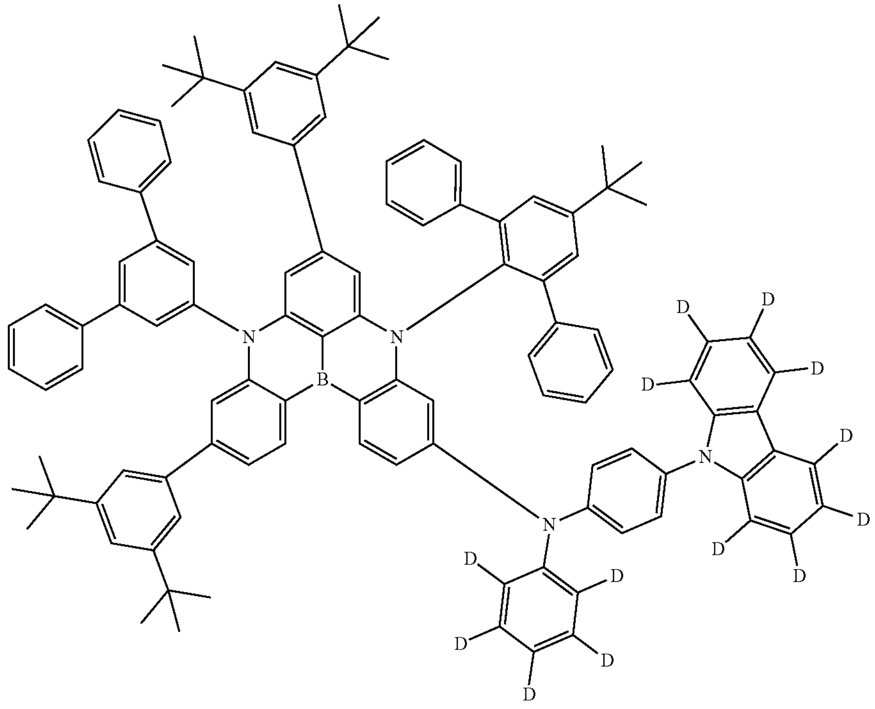

-continued
175
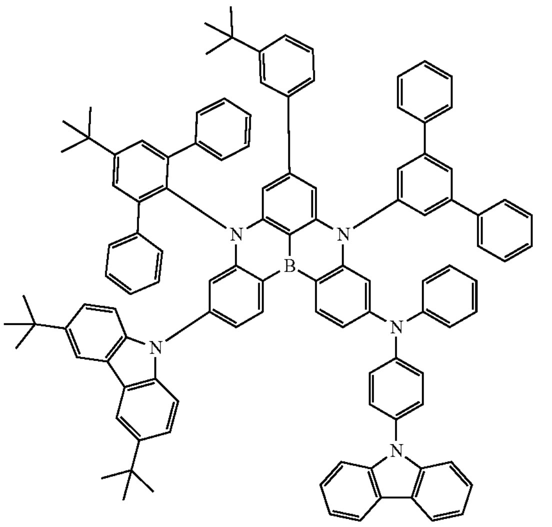
176
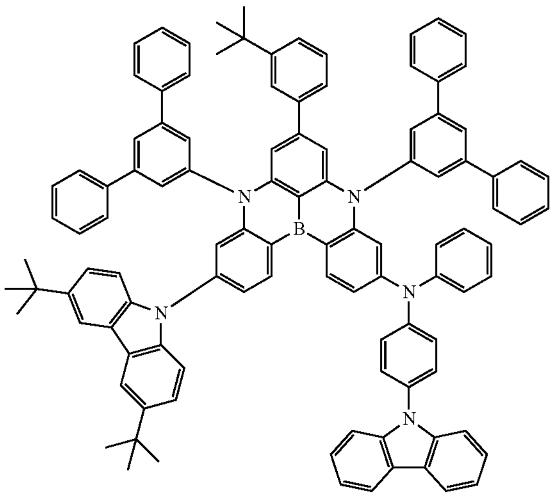
177
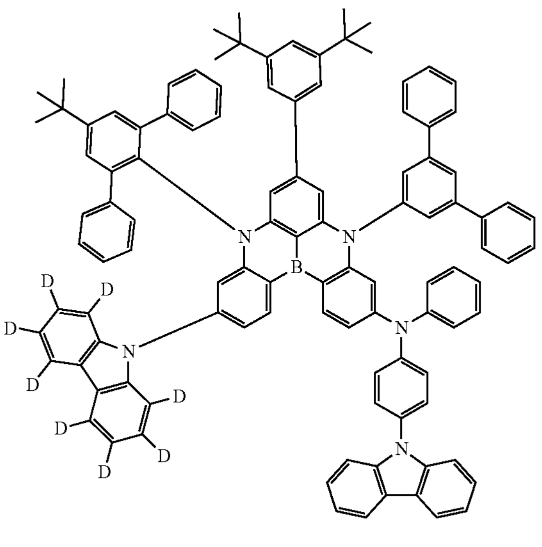
178
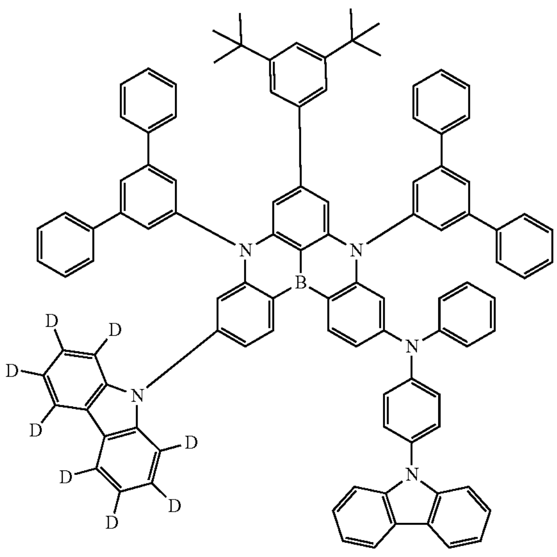
179
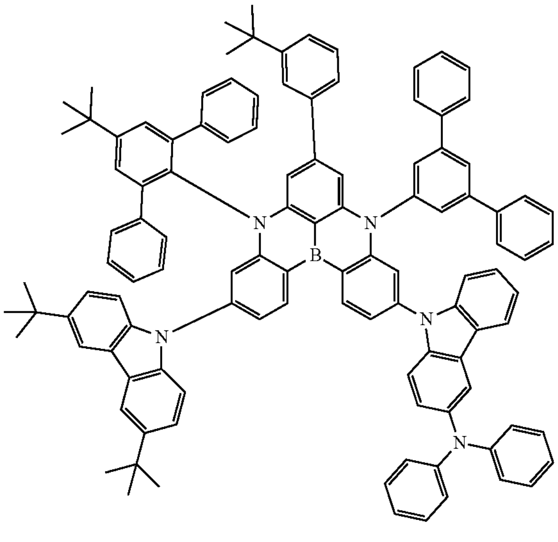
180
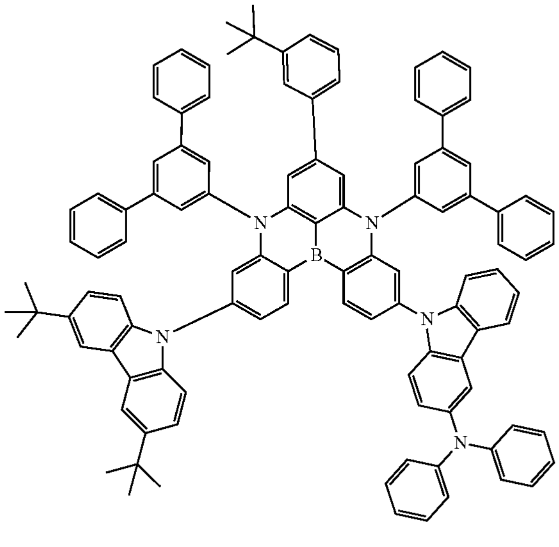

-continued
181
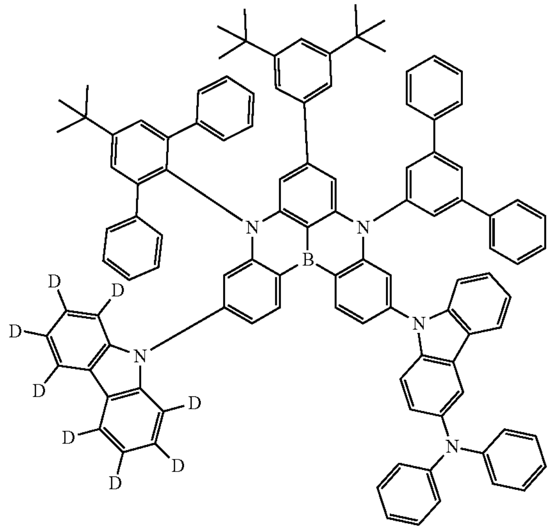
182
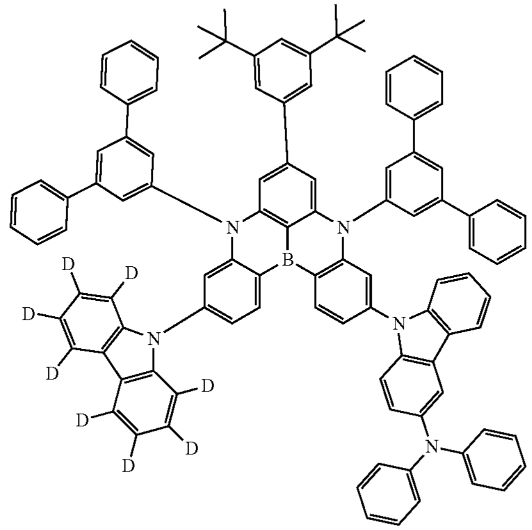
183
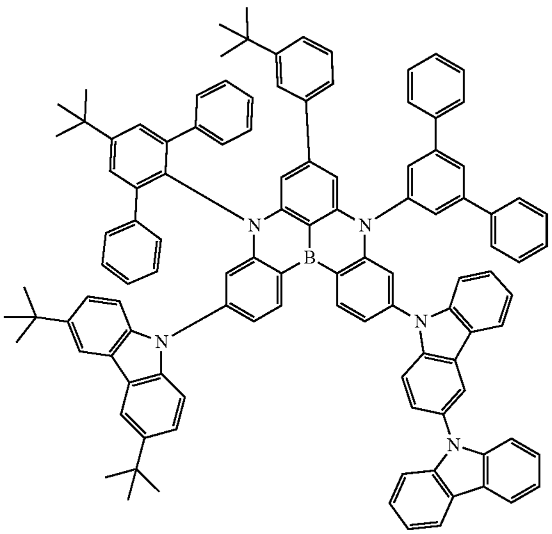
184
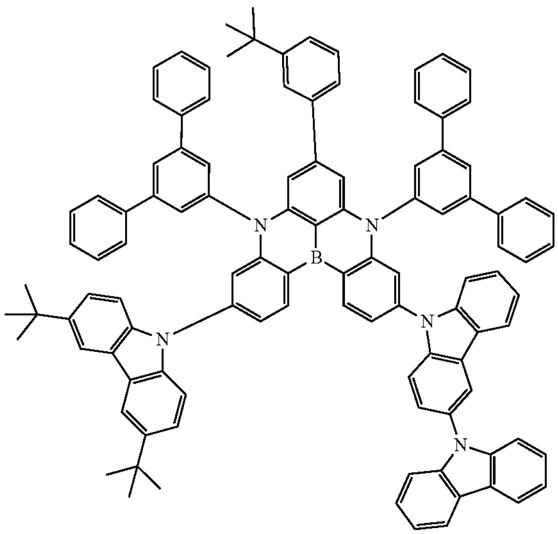
185
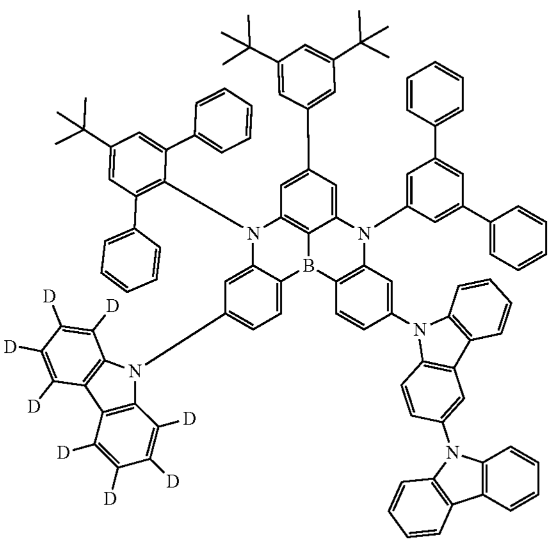
186
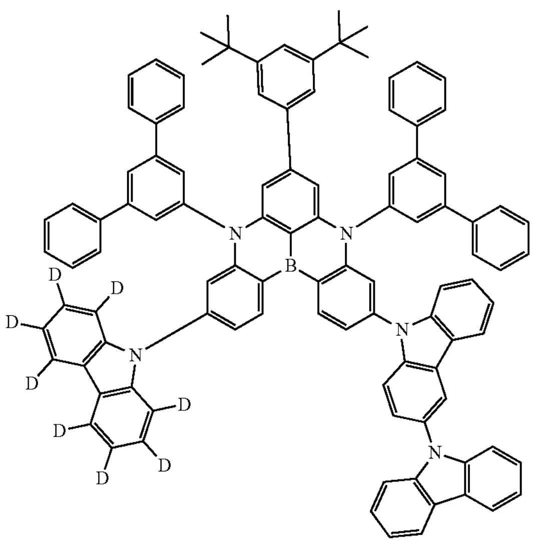

-continued
187
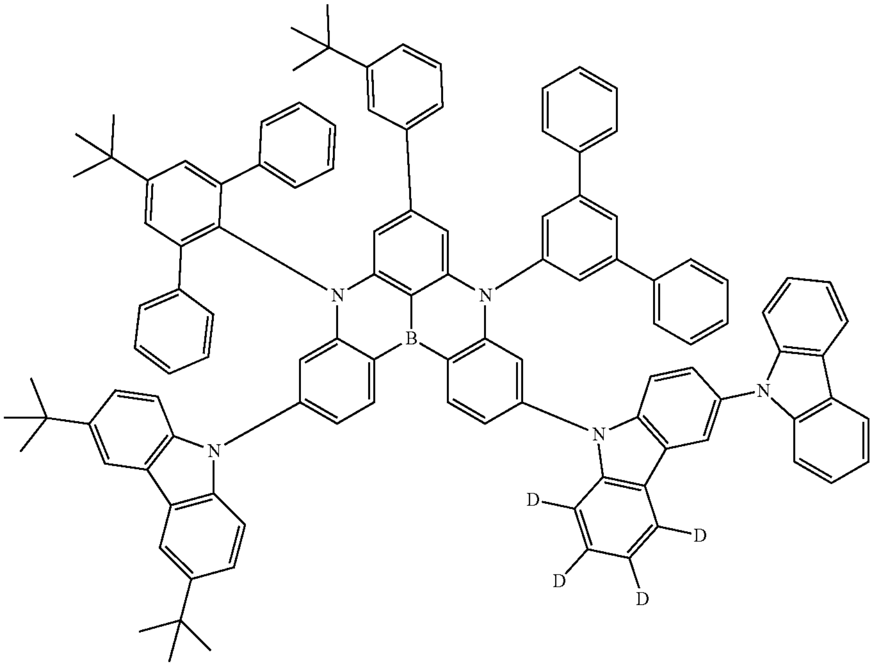
188
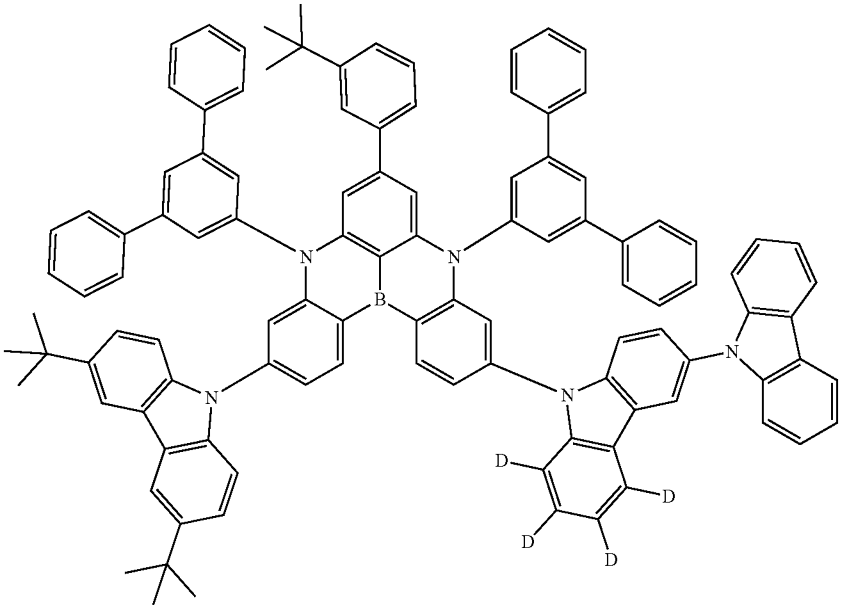

-continued
189
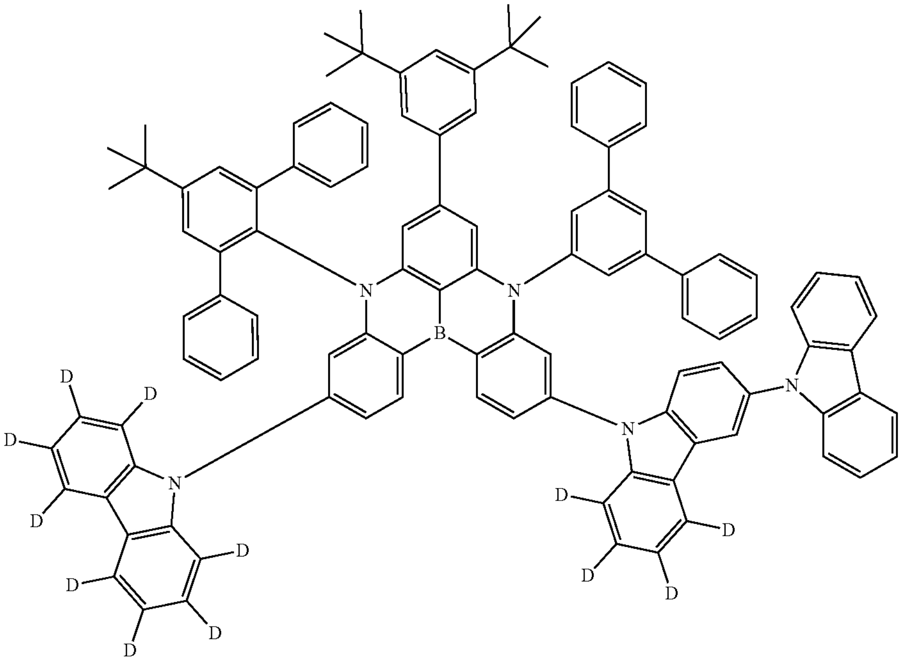
190
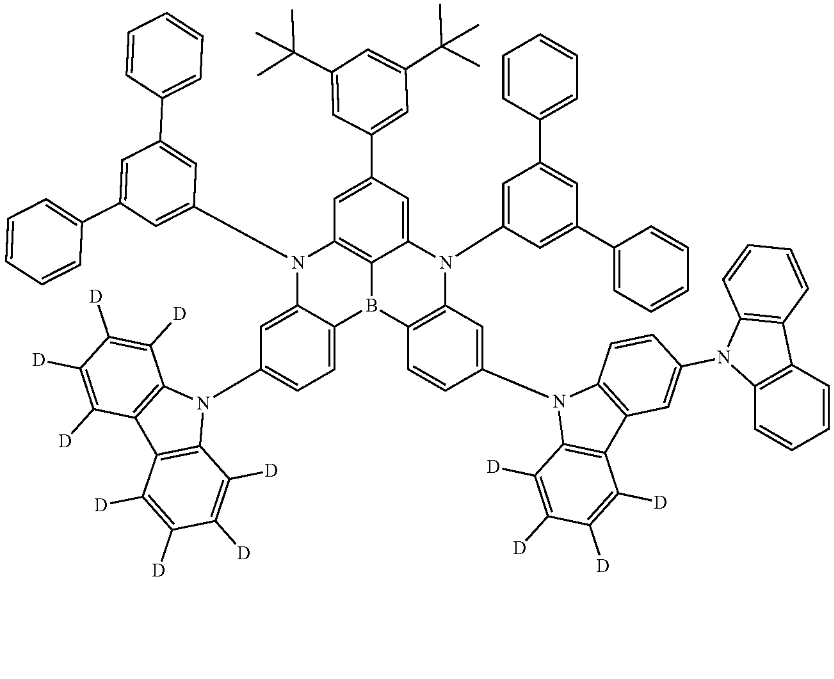

-continued
191
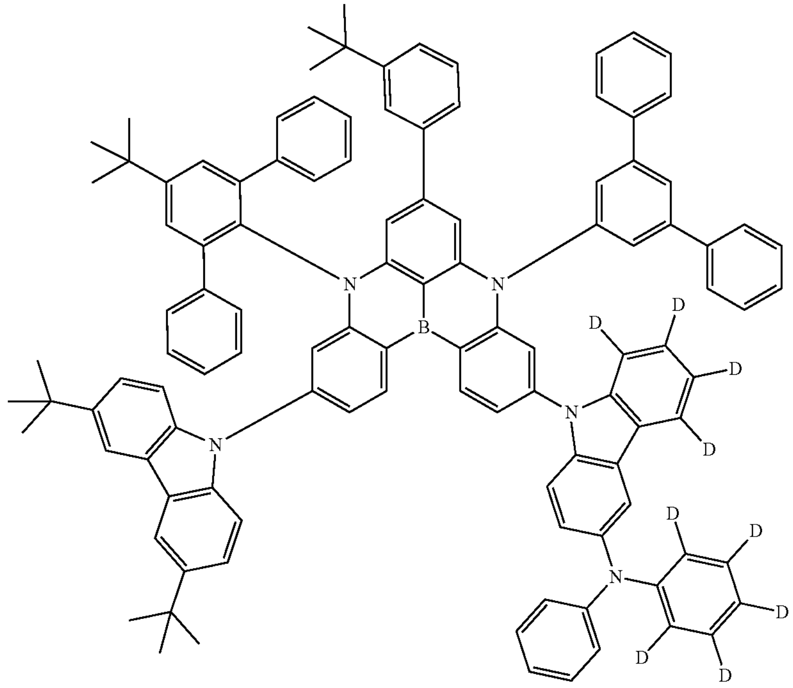
192
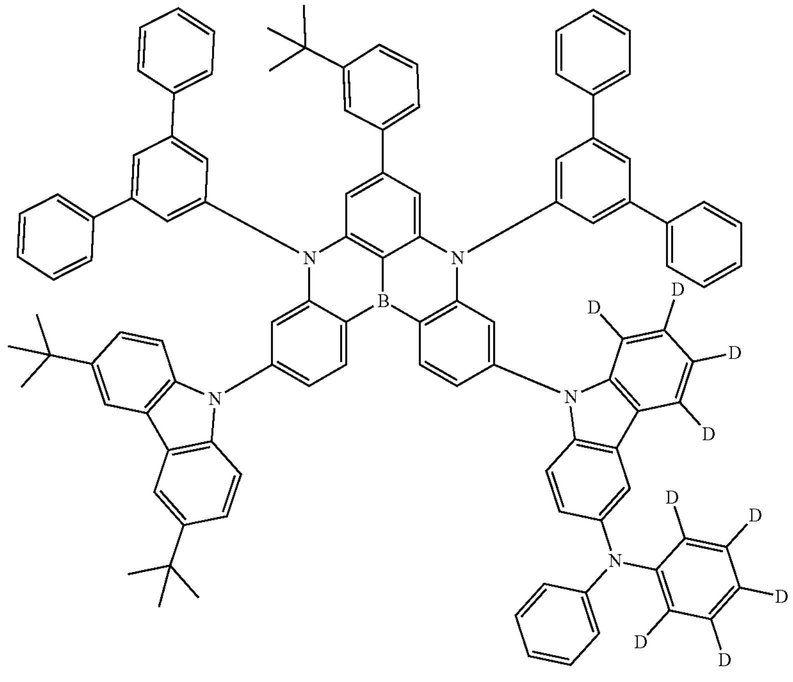

-continued
193
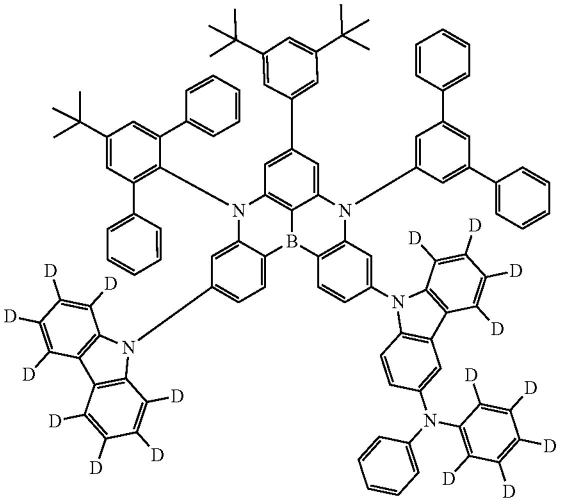
194
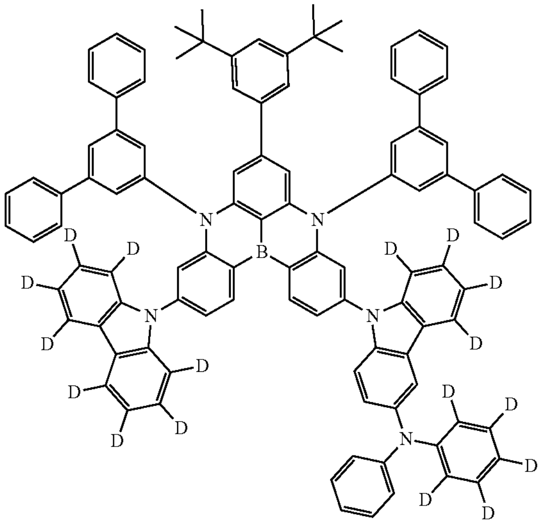
195
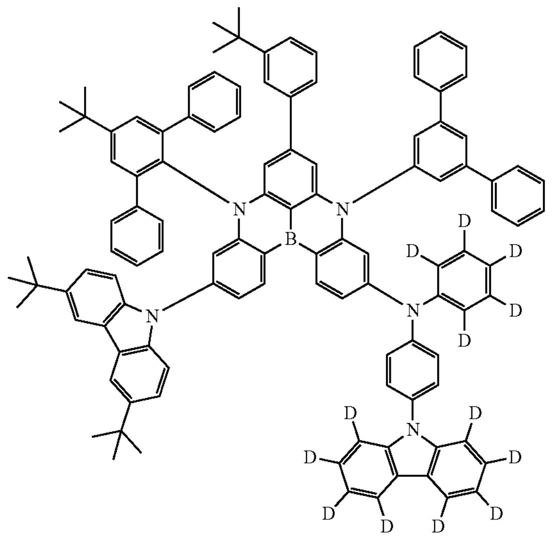
196
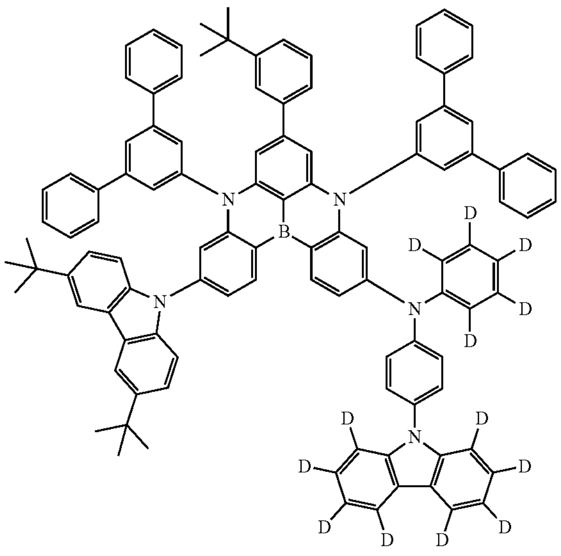

-continued
197
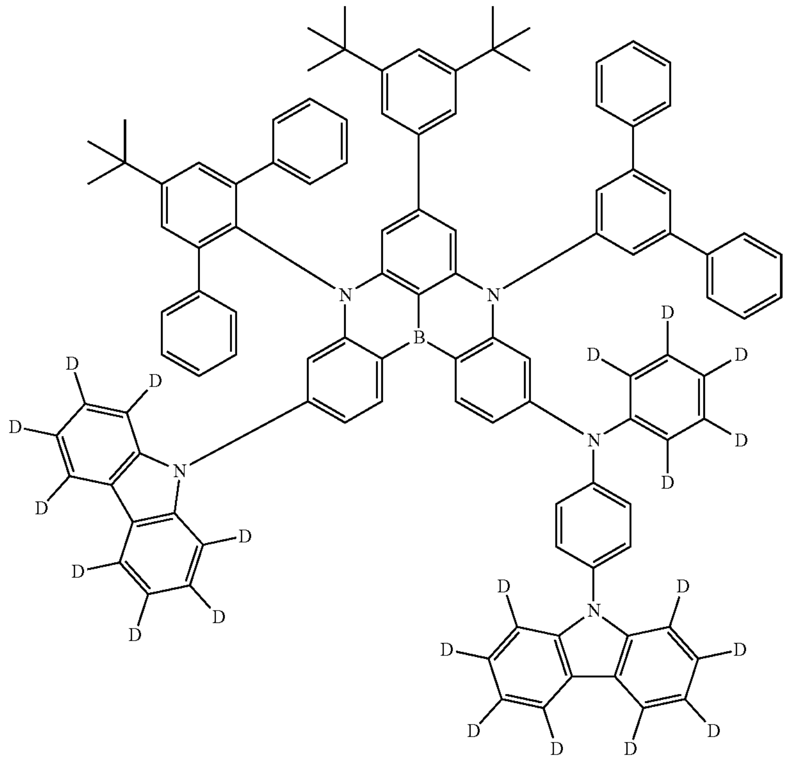
198
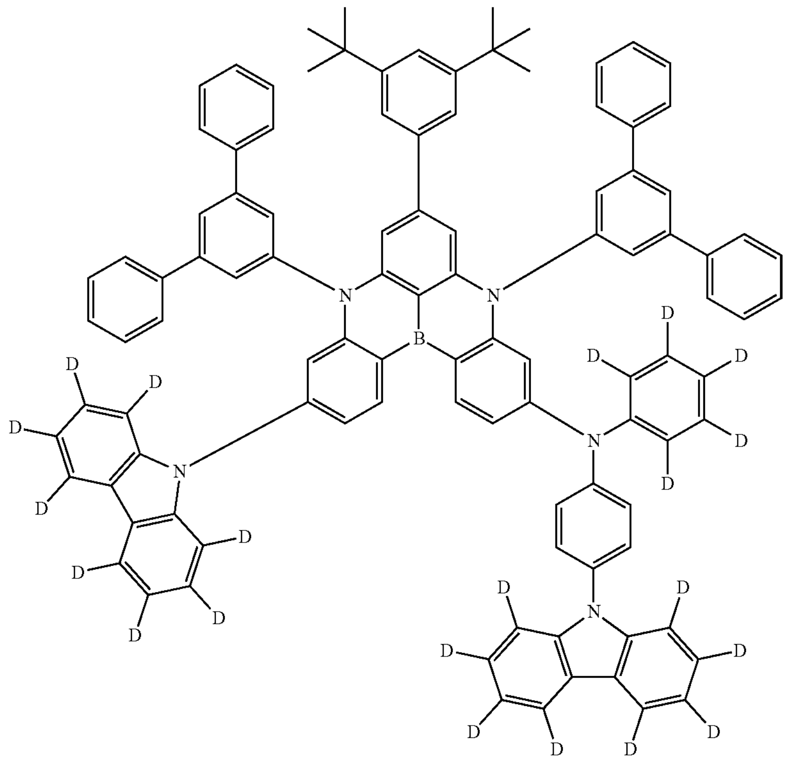

-continued
199
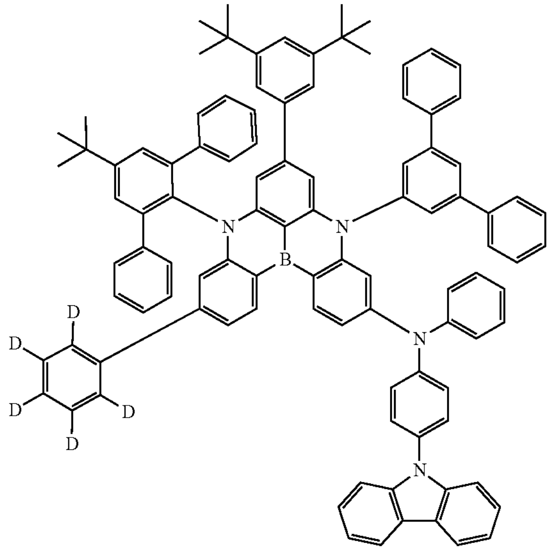
200
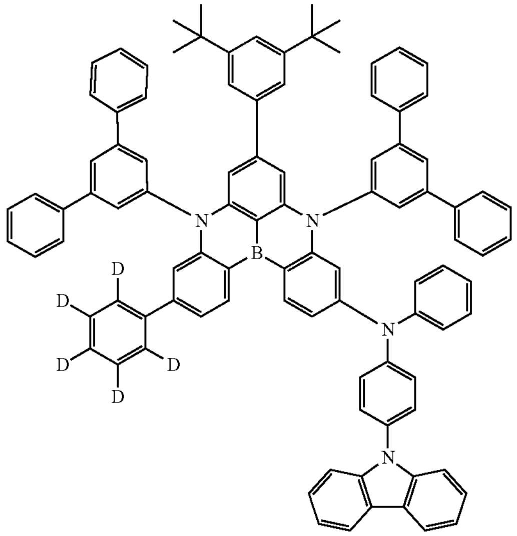
201
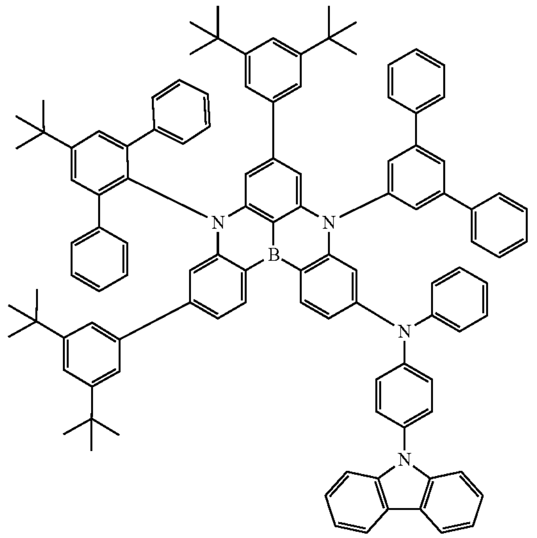
202
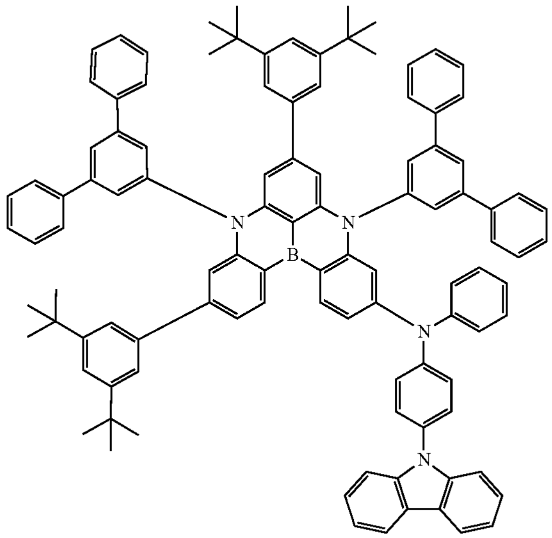
203
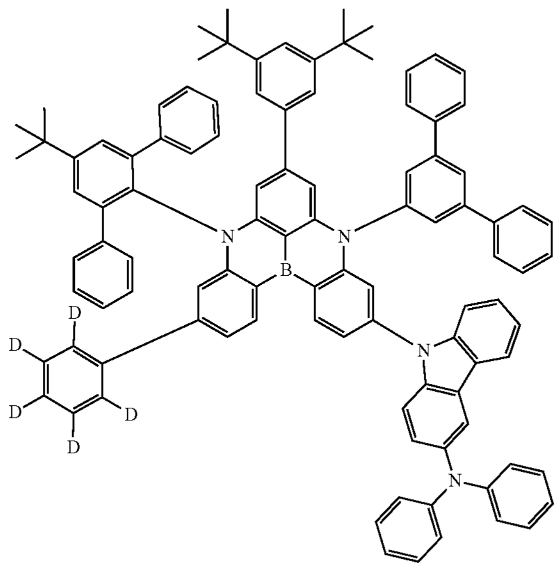
204
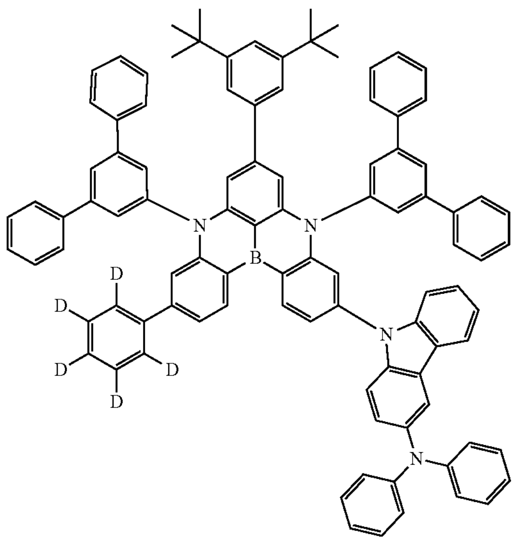

-continued
205
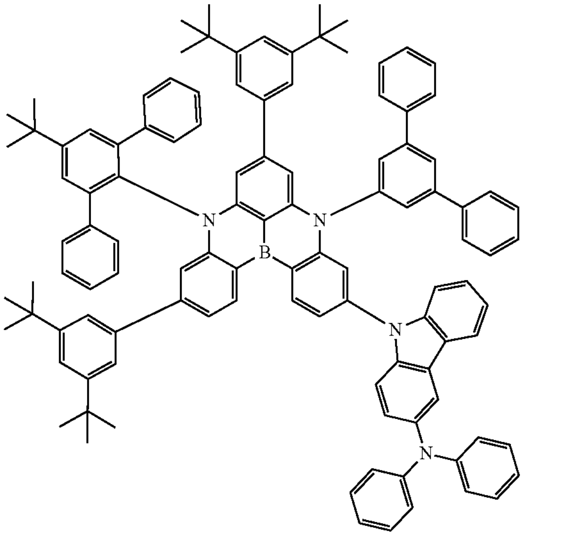
206
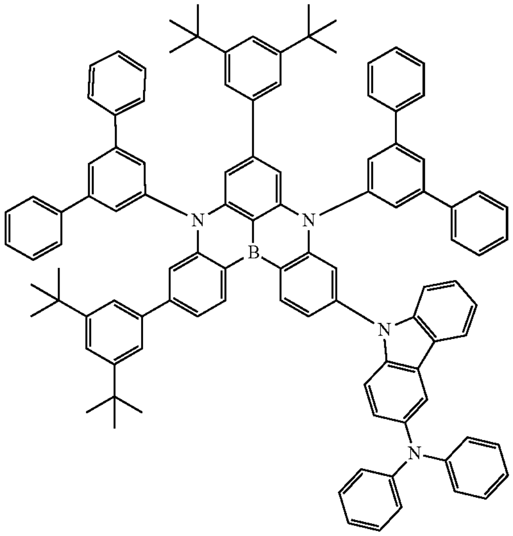
207
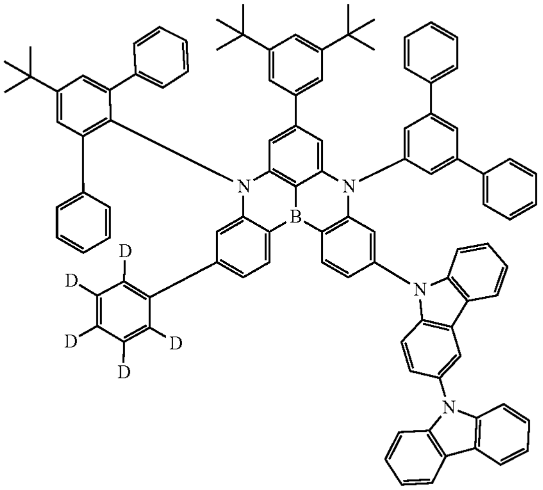
208
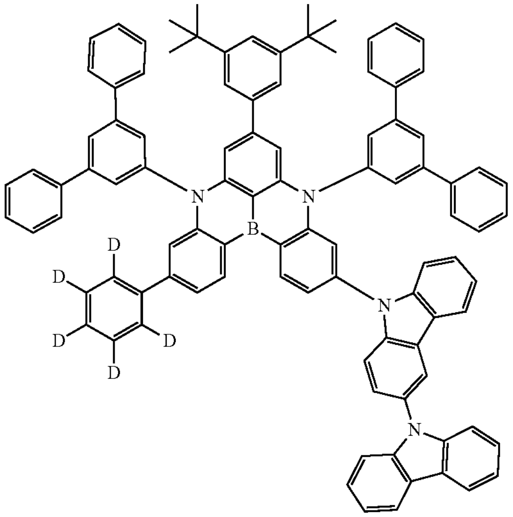
209
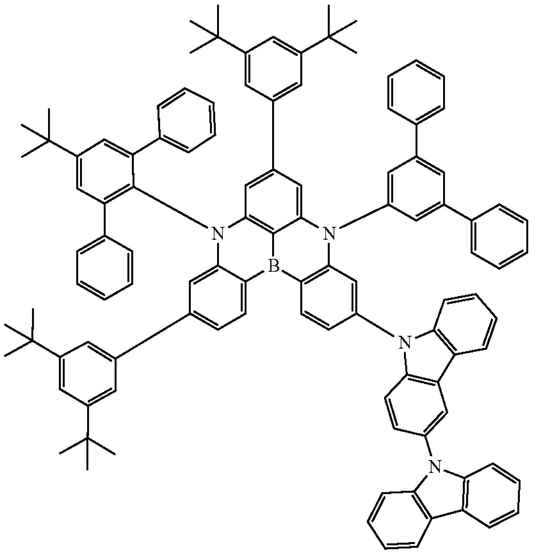
210
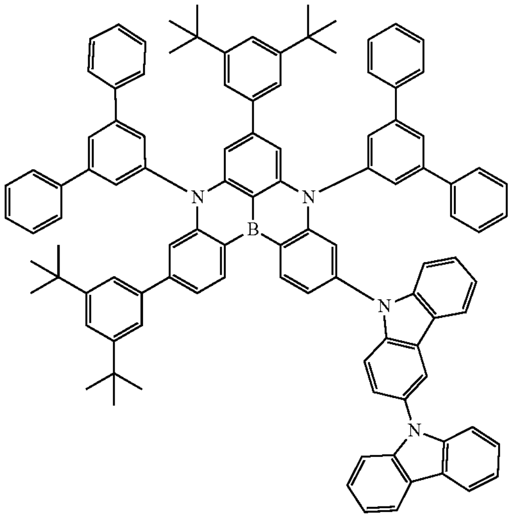

-continued
211
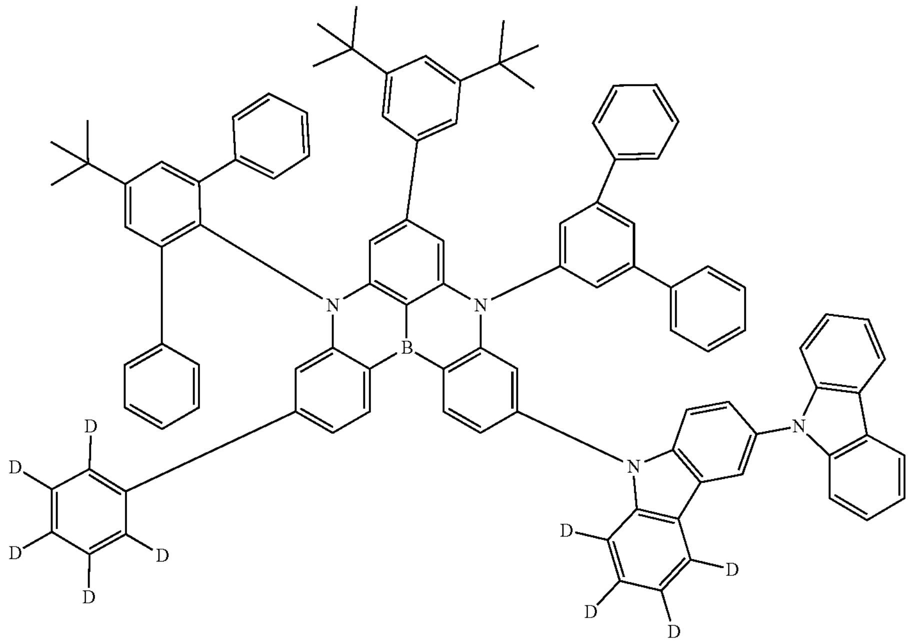
212
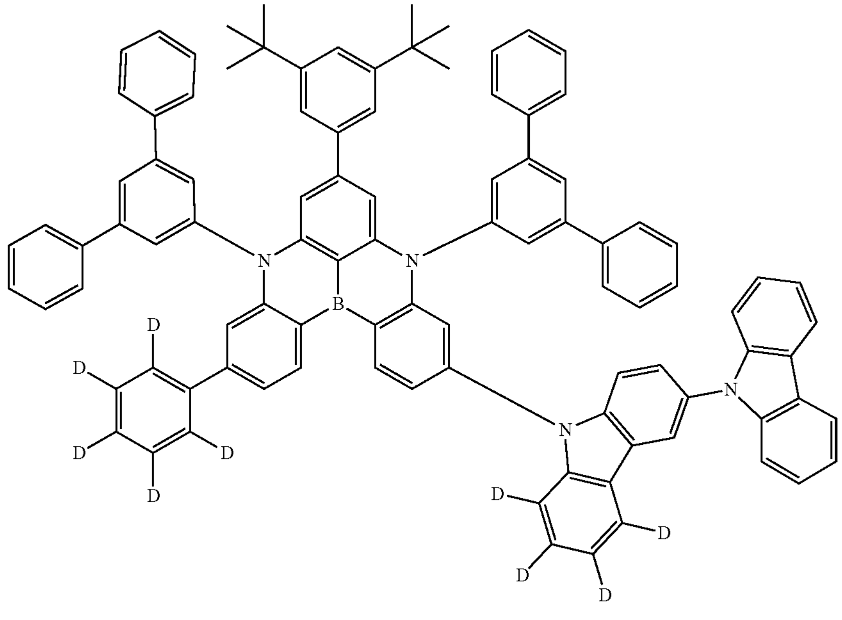

-continued
213
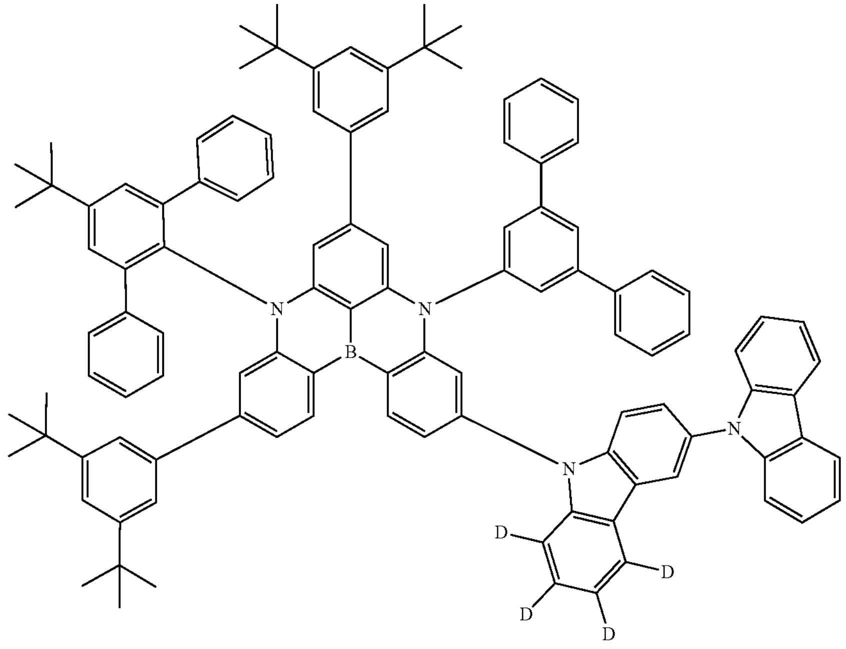
214
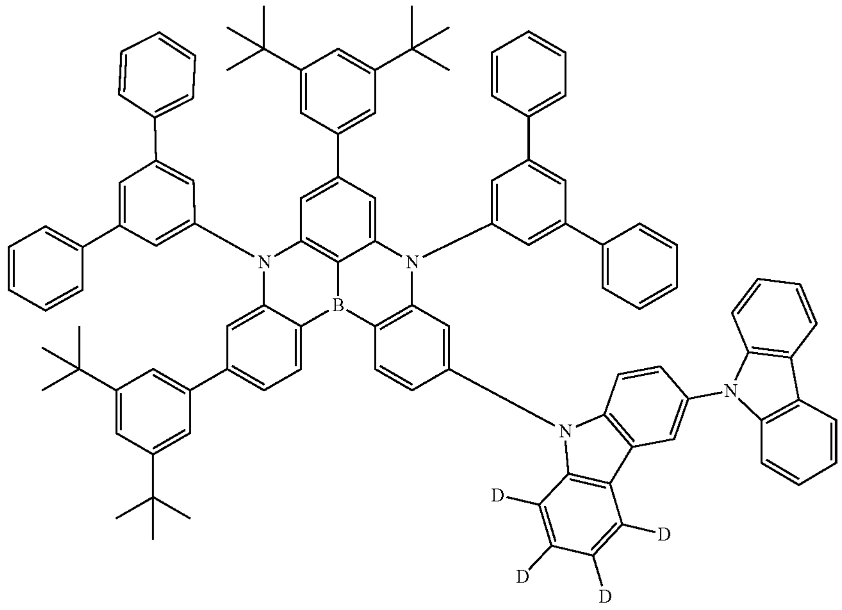

-continued
215
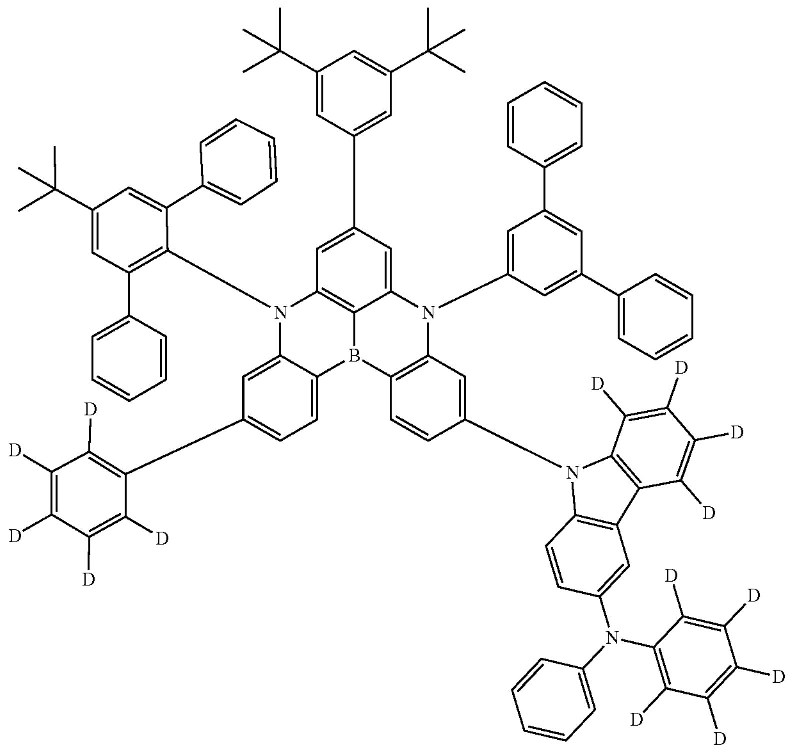
216
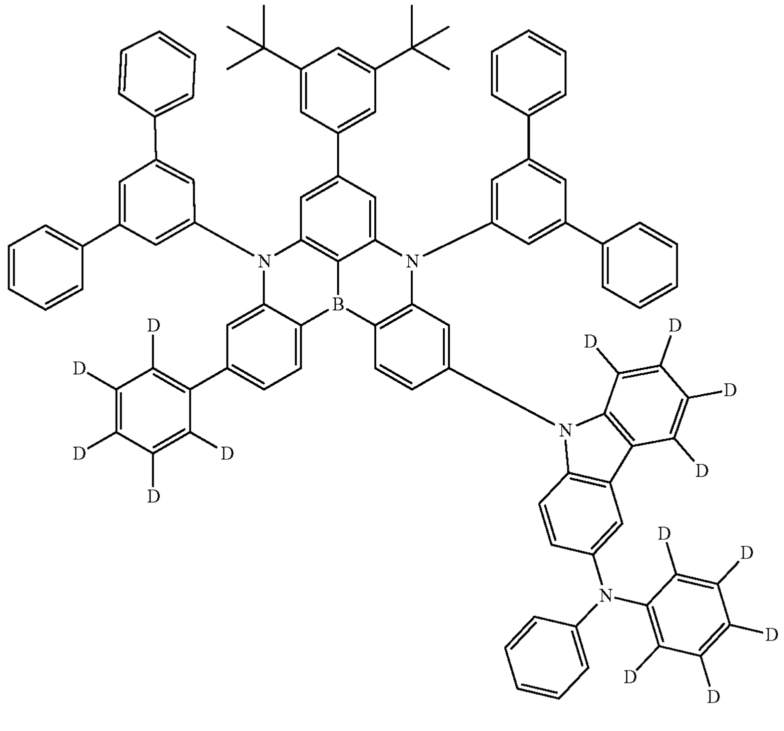

-continued
217
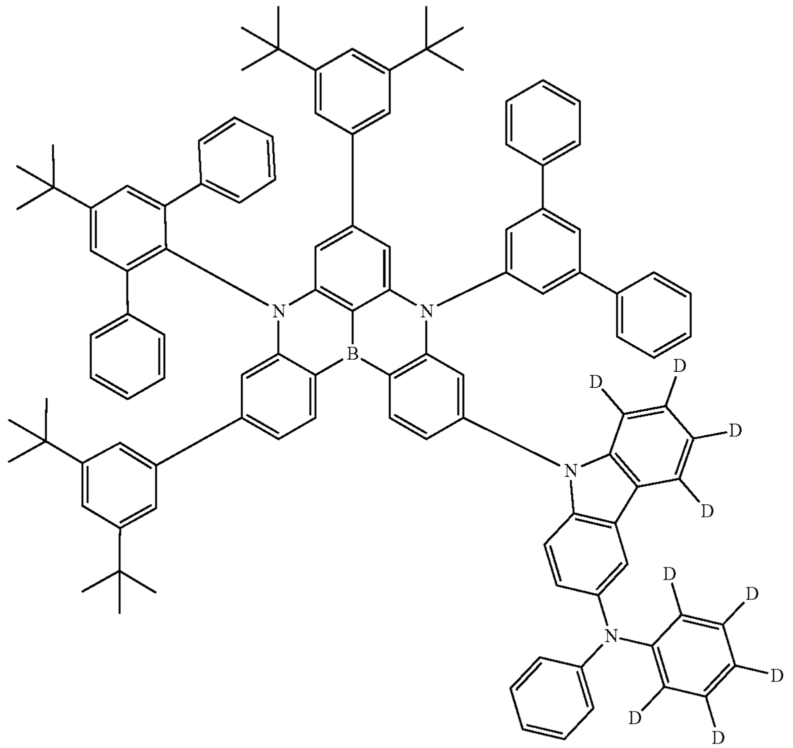
218
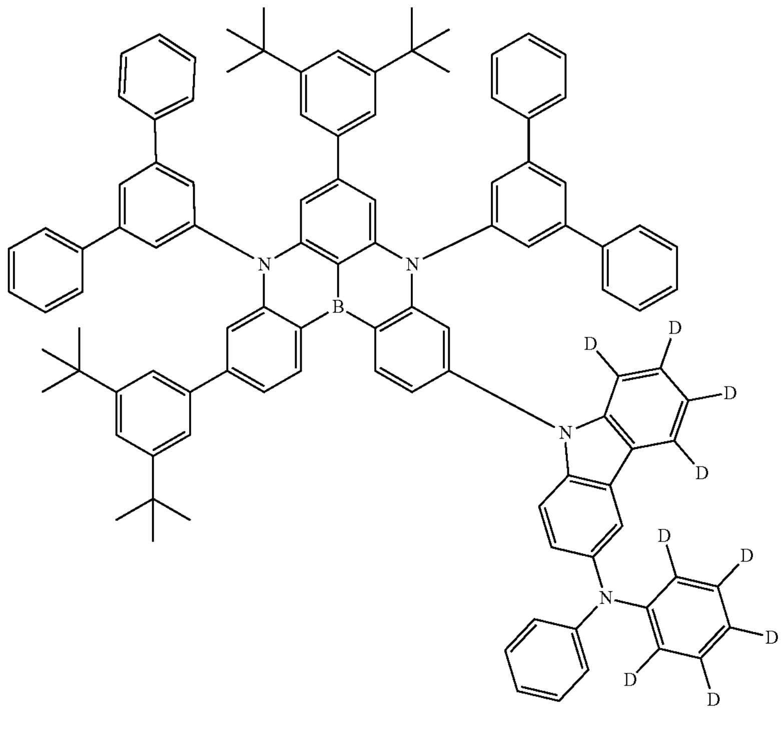

-continued
219
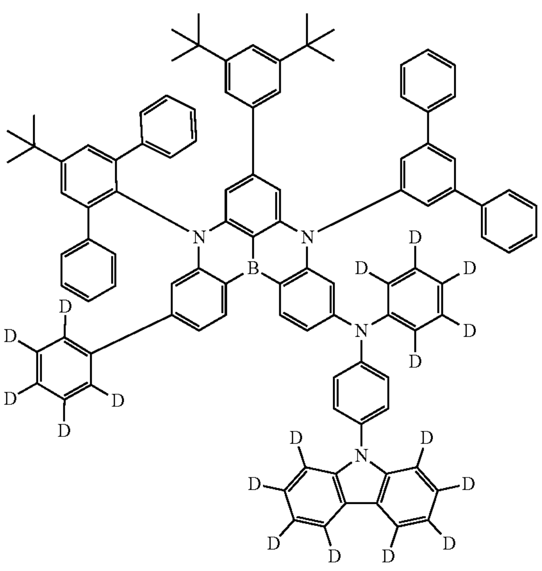
220
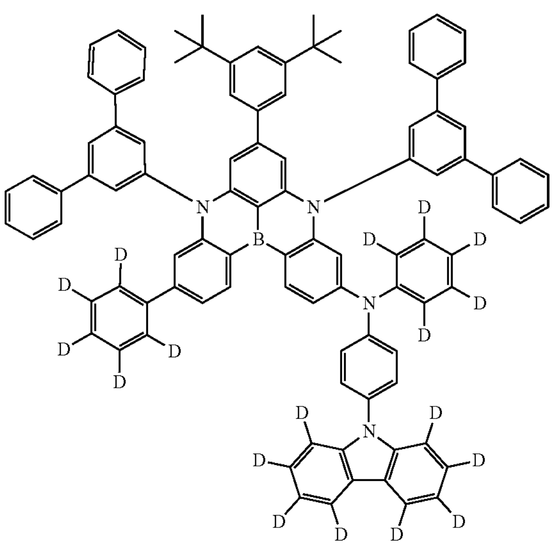
221
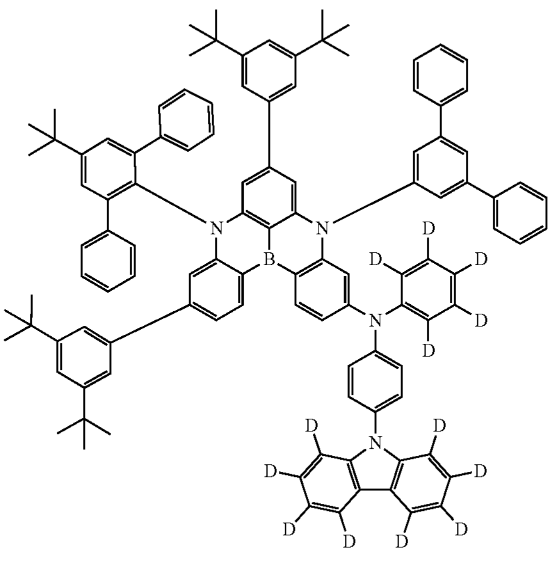
222
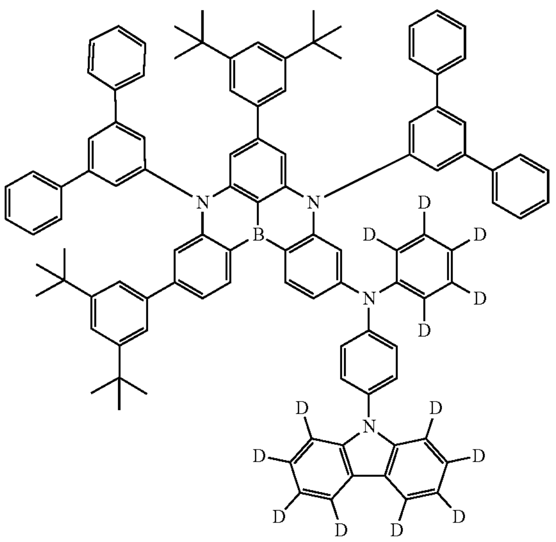

-continued
223
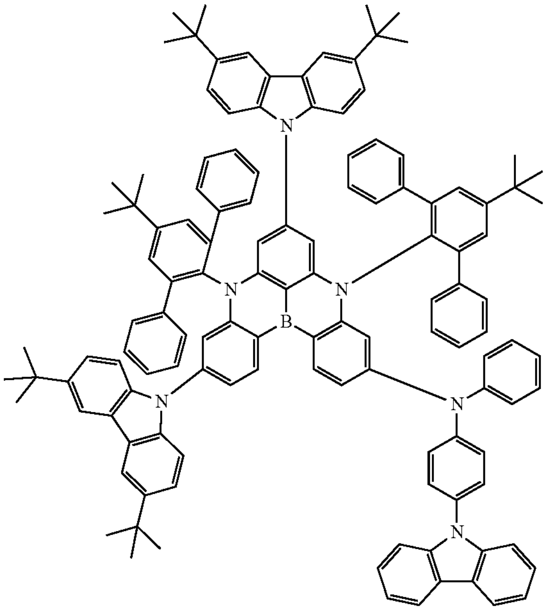
224
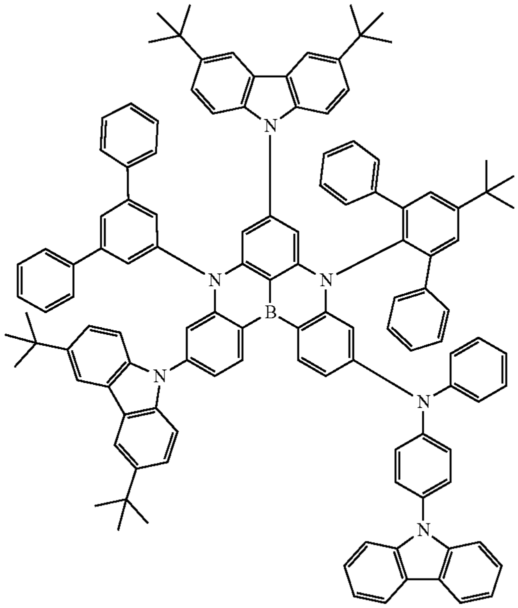
225
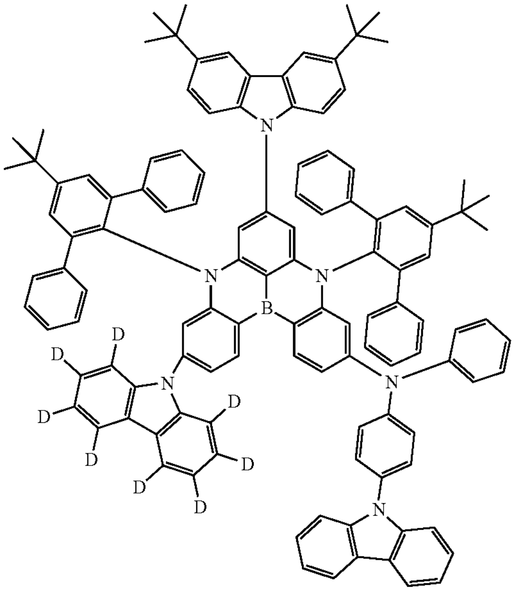
226
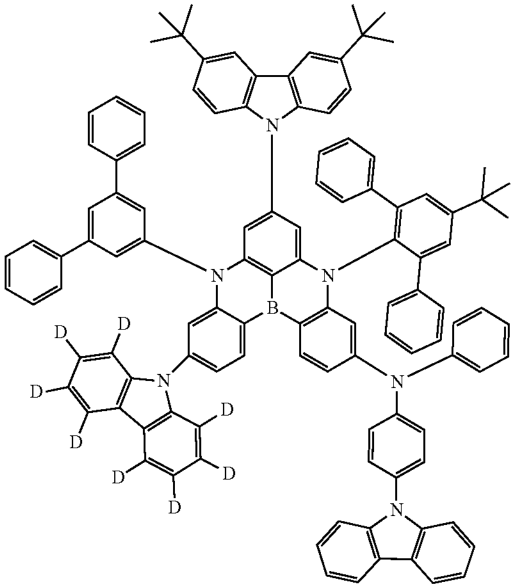

-continued
227
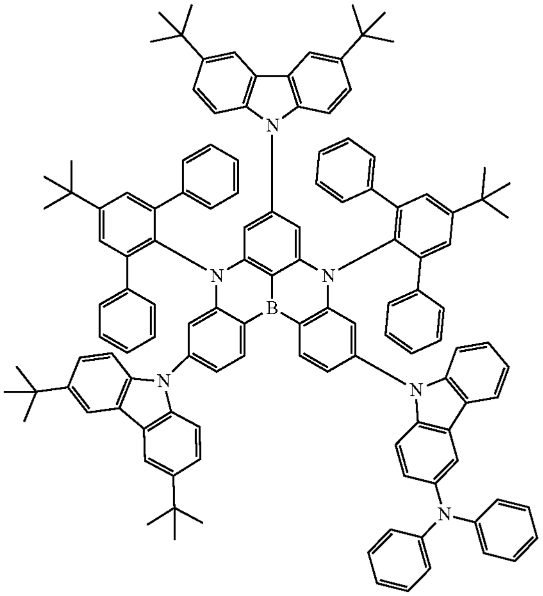
228
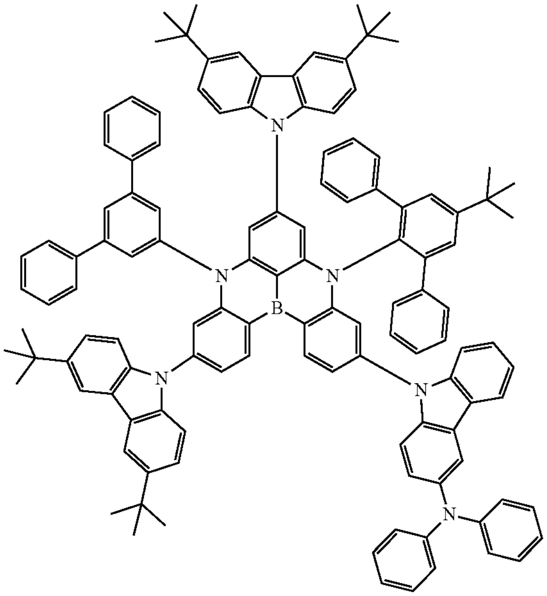
229
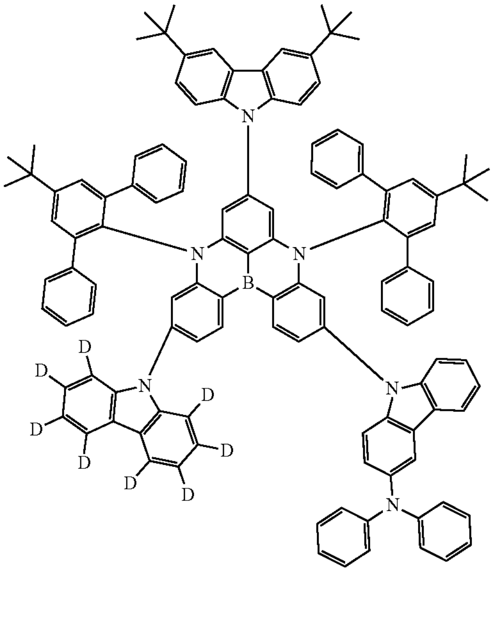
230
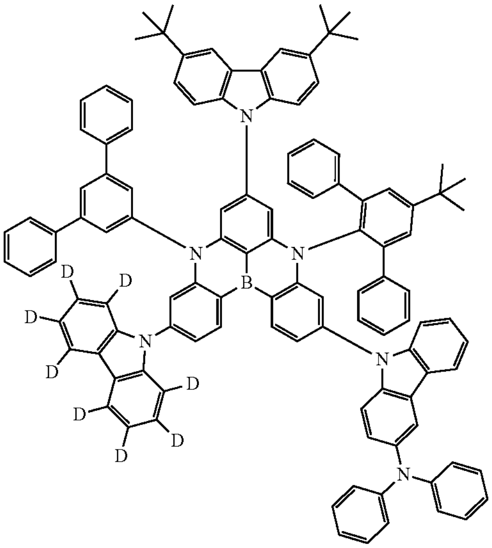

-continued
231
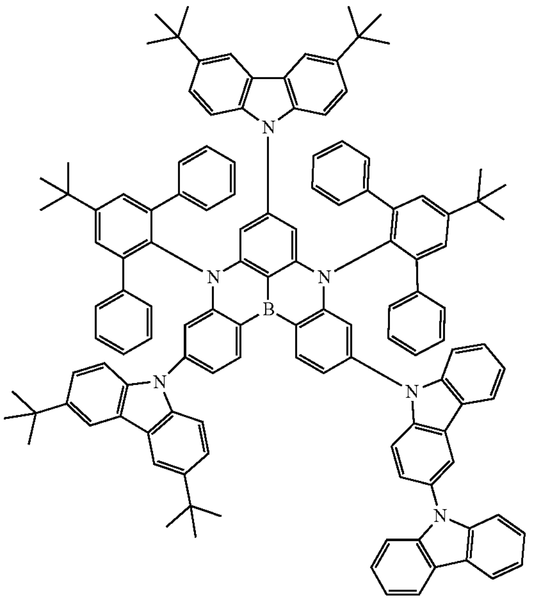
232
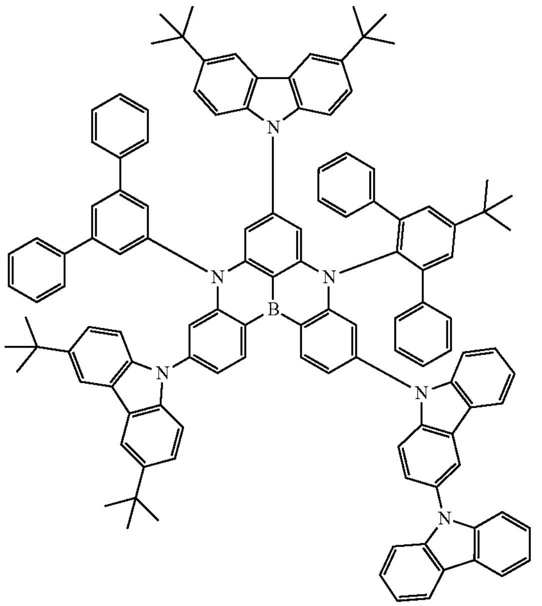
233
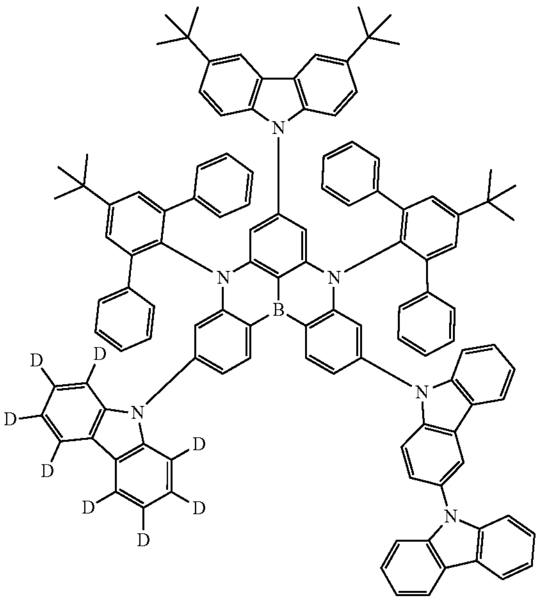
234
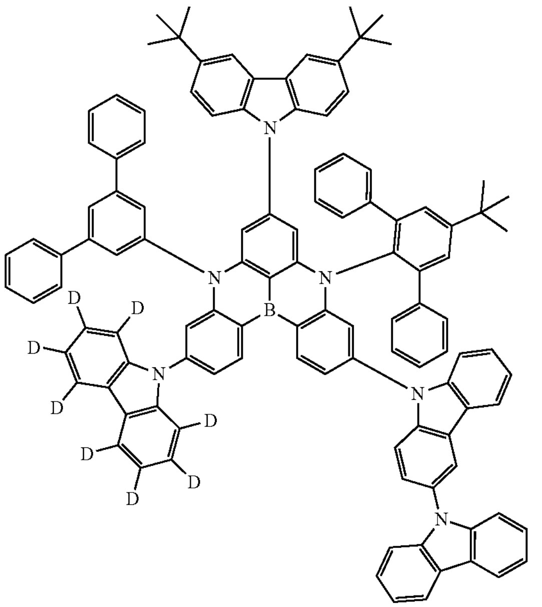

-continued
235
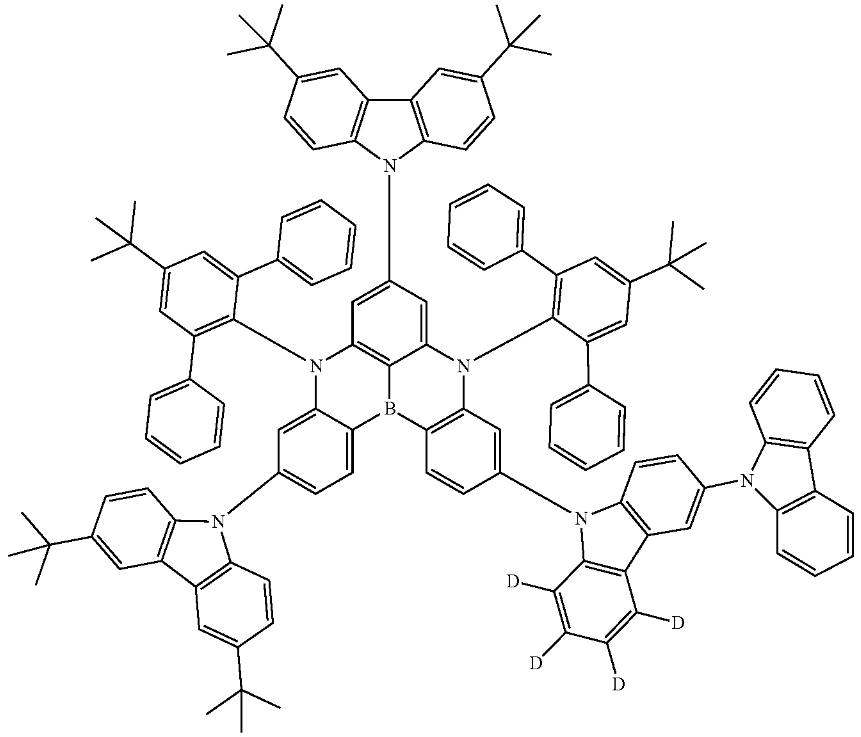
236
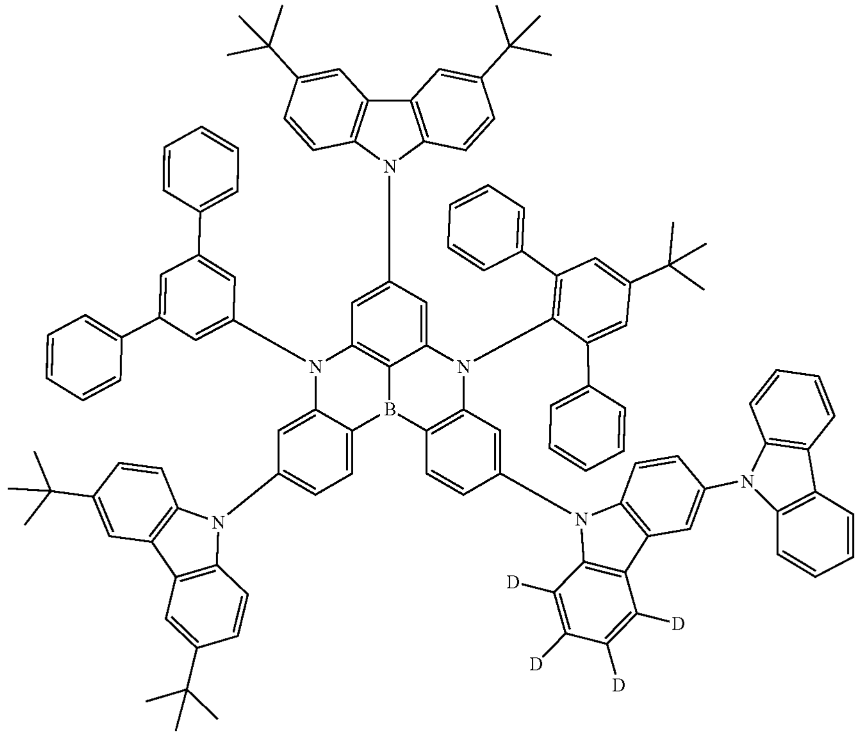

-continued
237
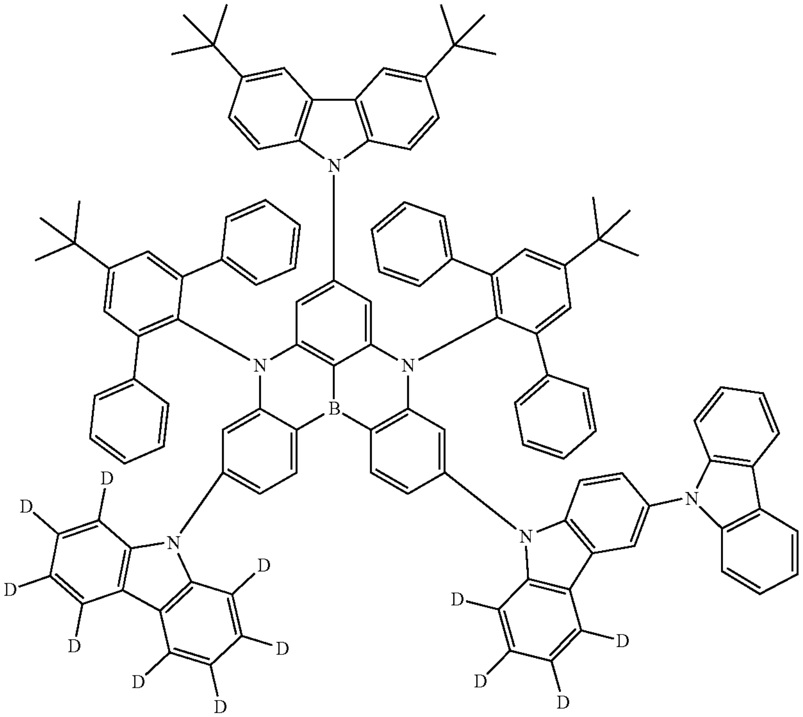
238
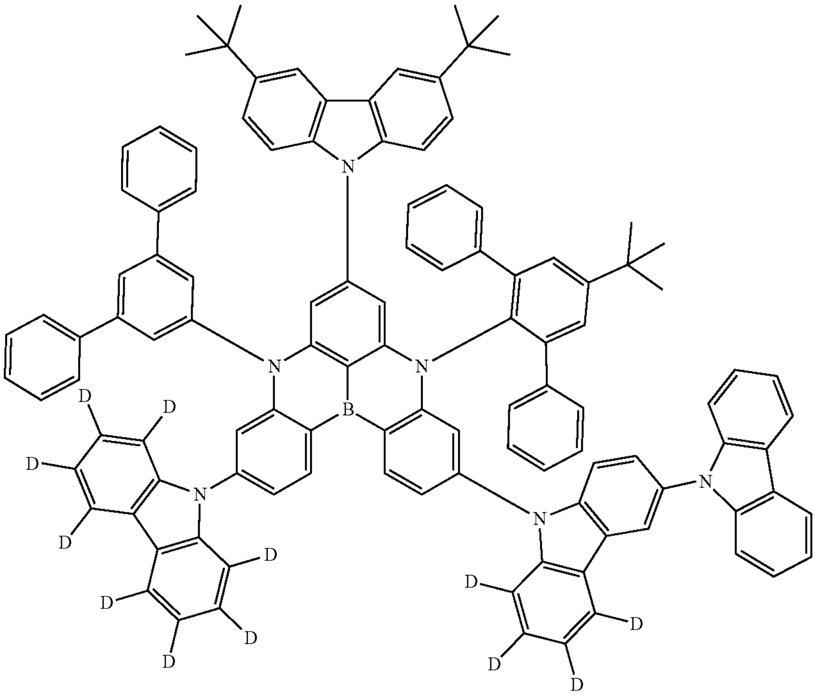

-continued
239
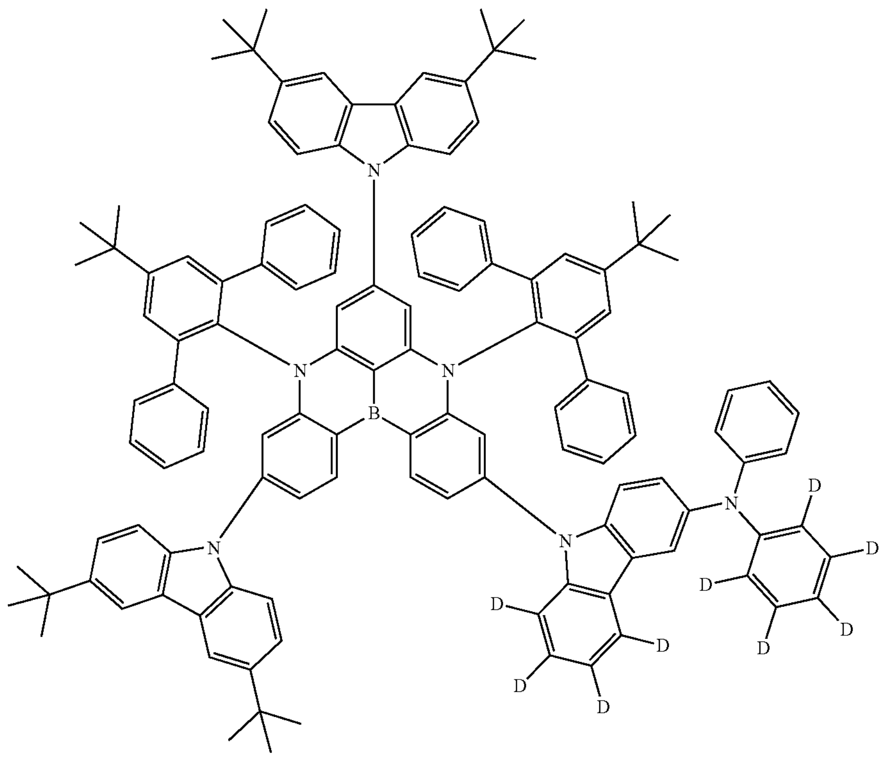
240
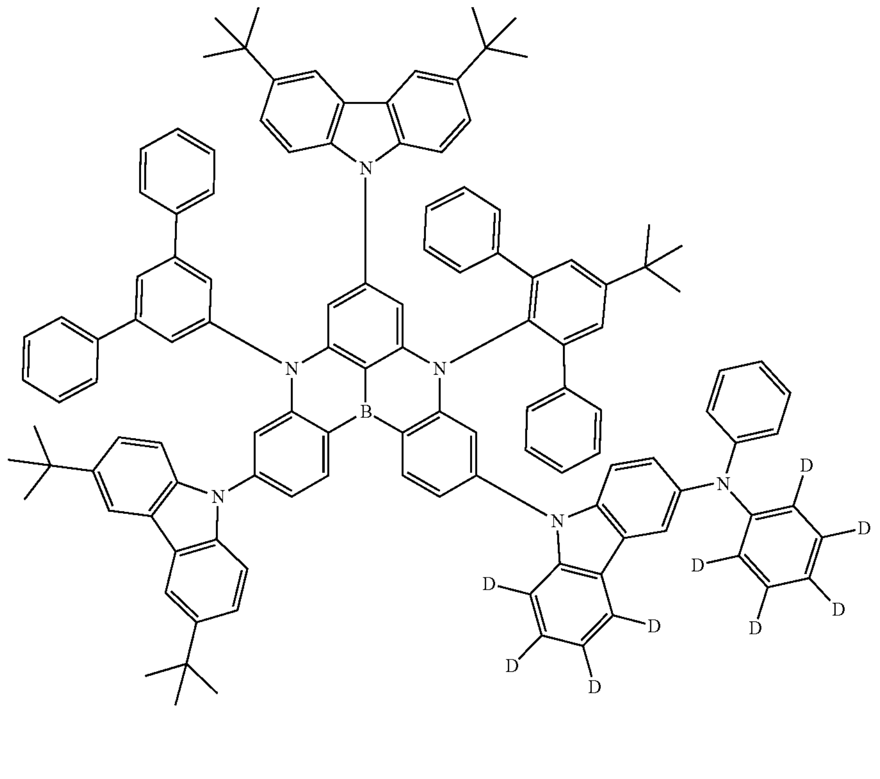

-continued
241
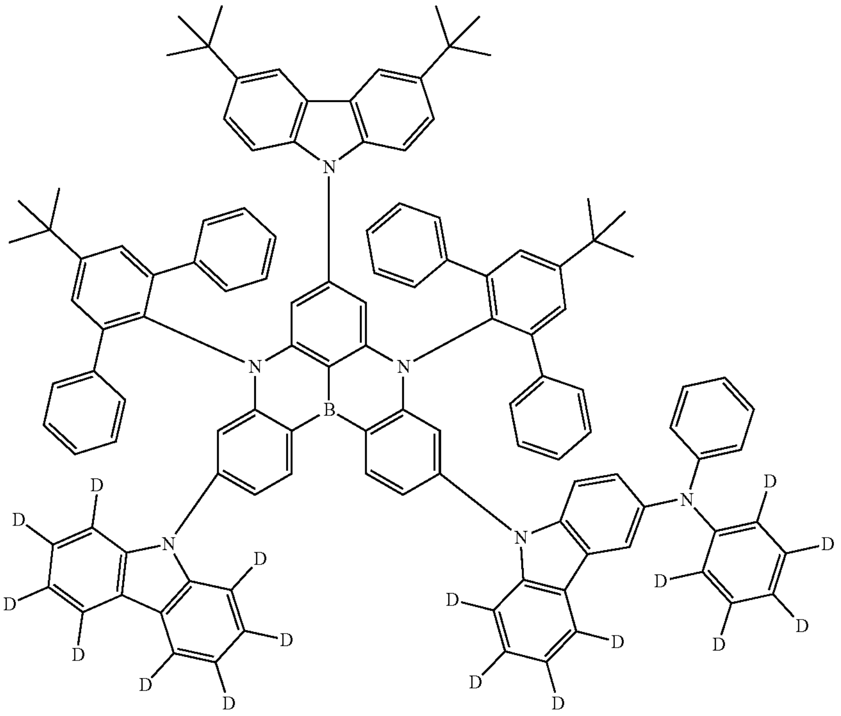
242
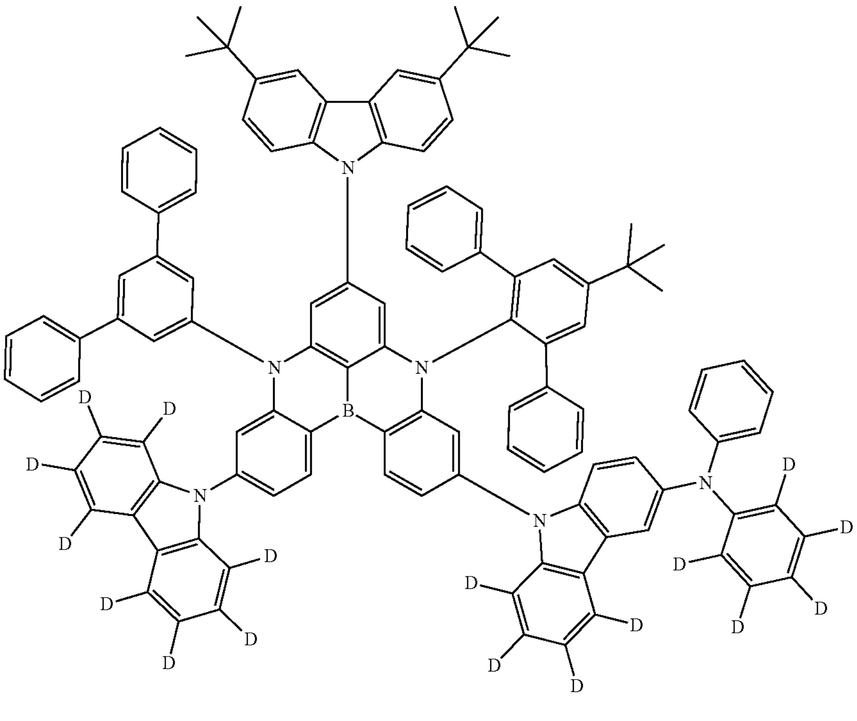

-continued
243
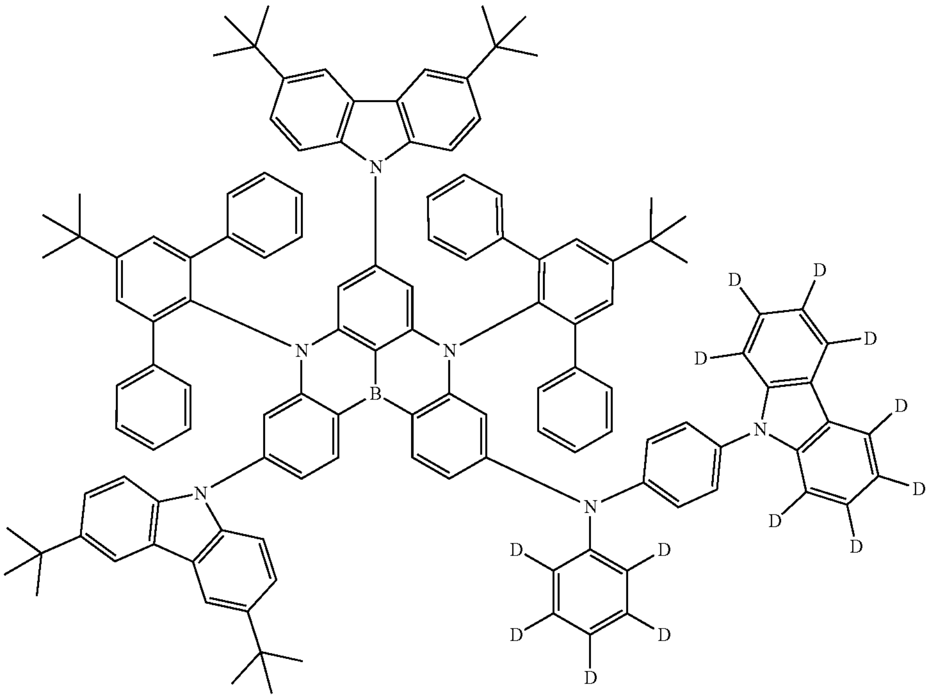
244
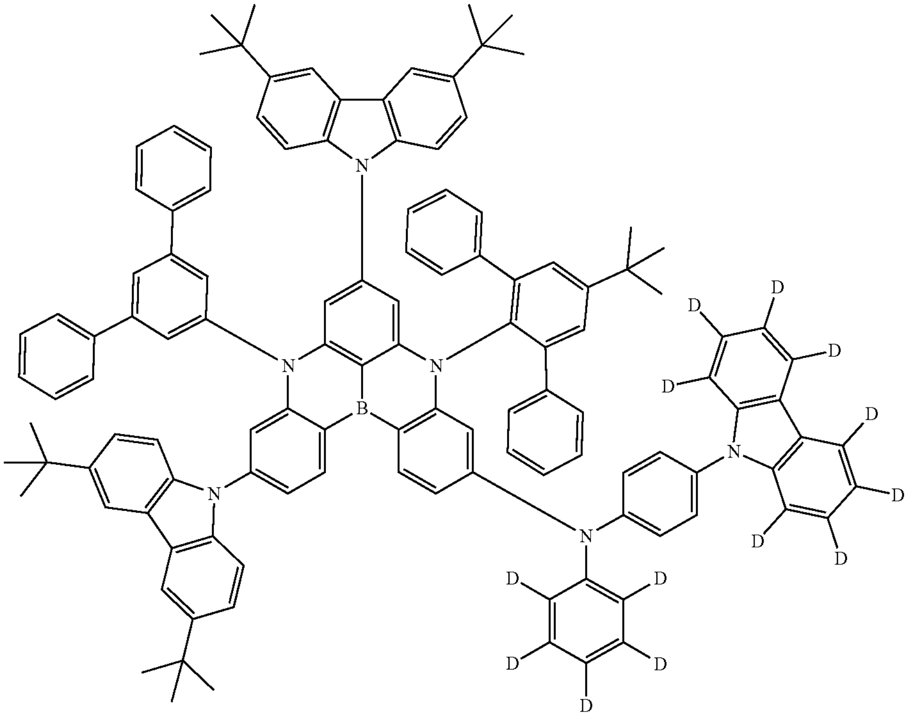

-continued
245
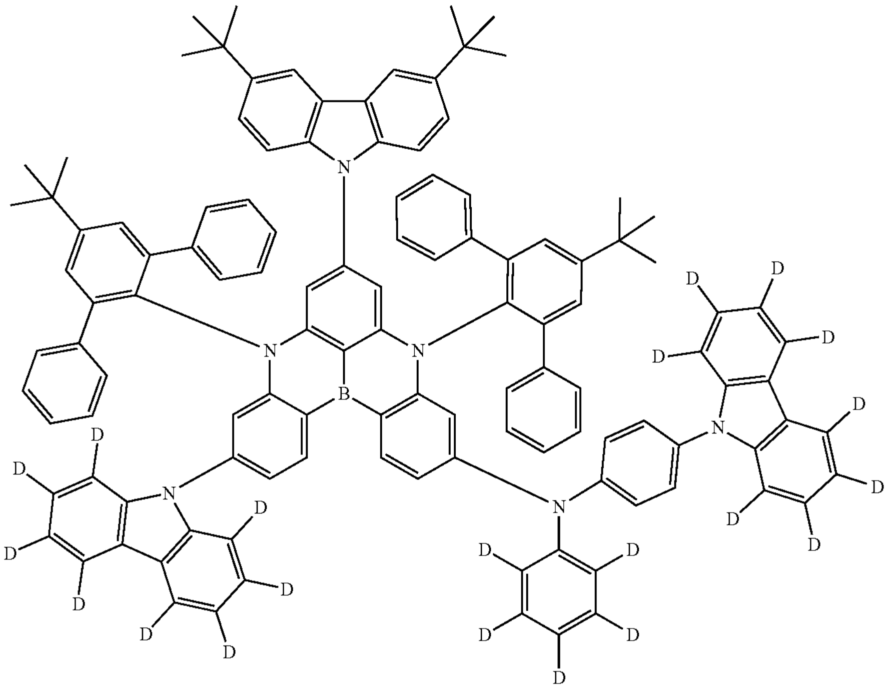
246
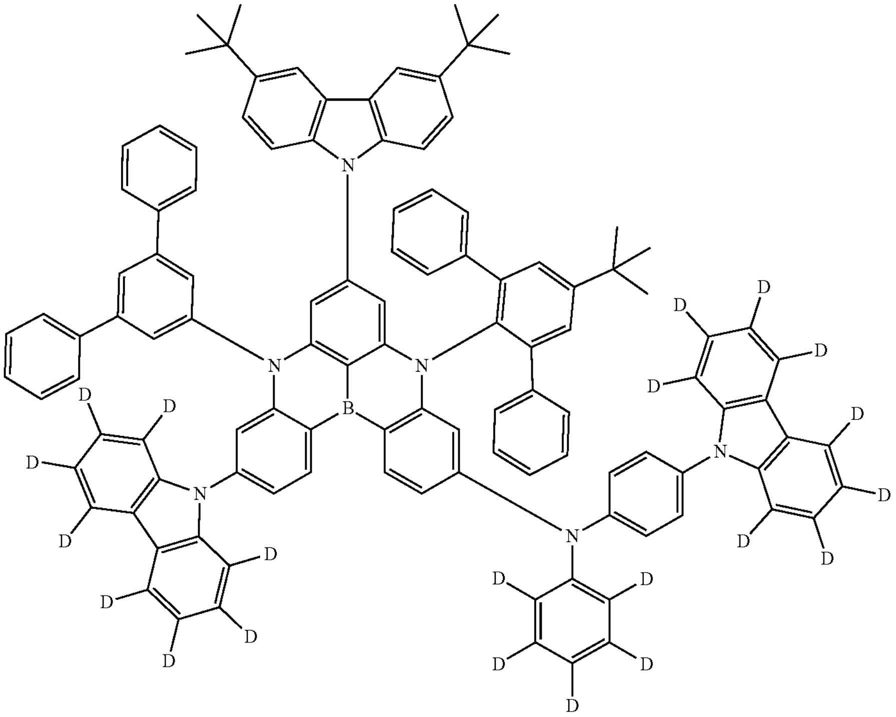

-continued
247
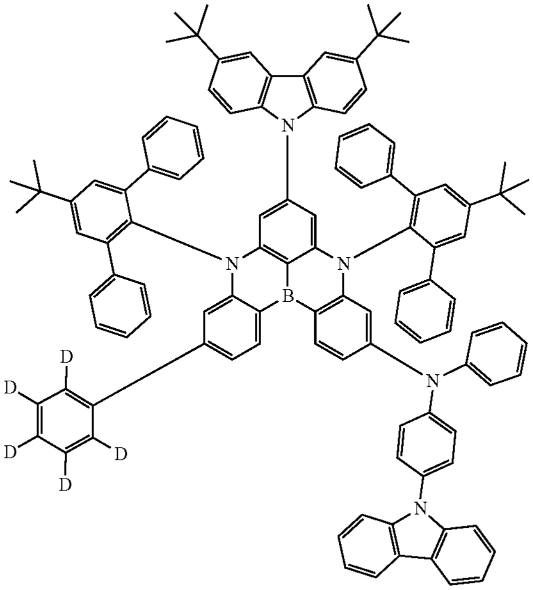
248
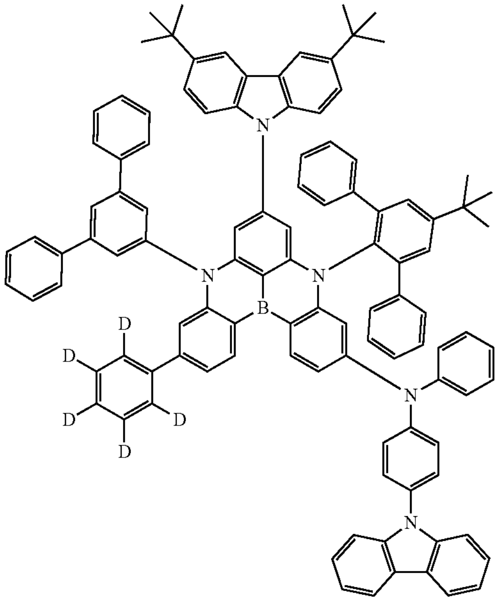
249
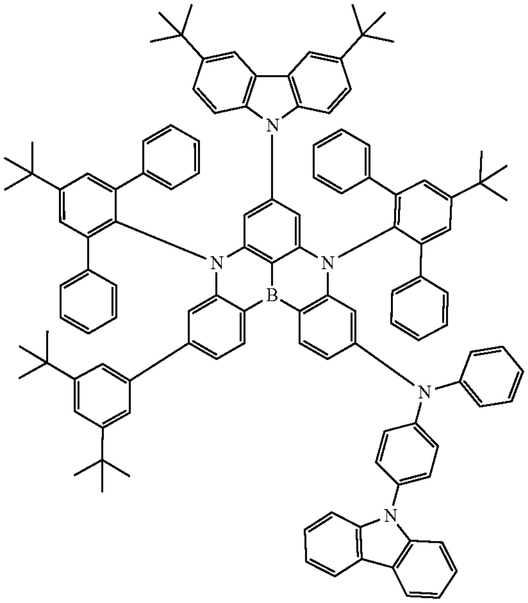
250
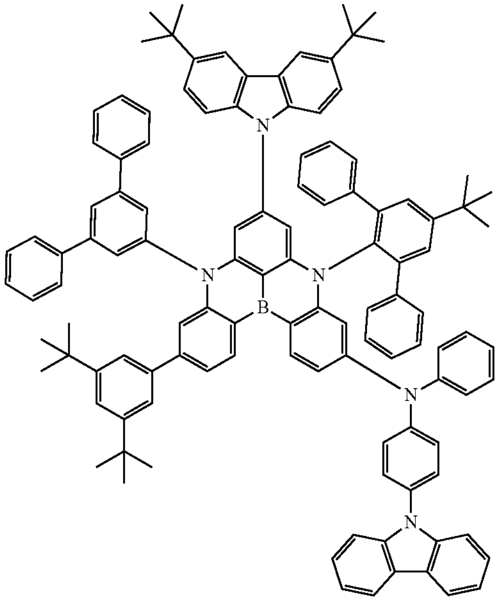

-continued
251
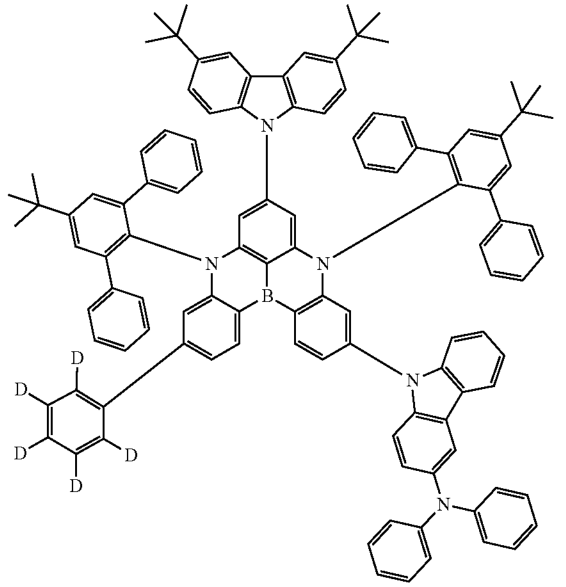
252
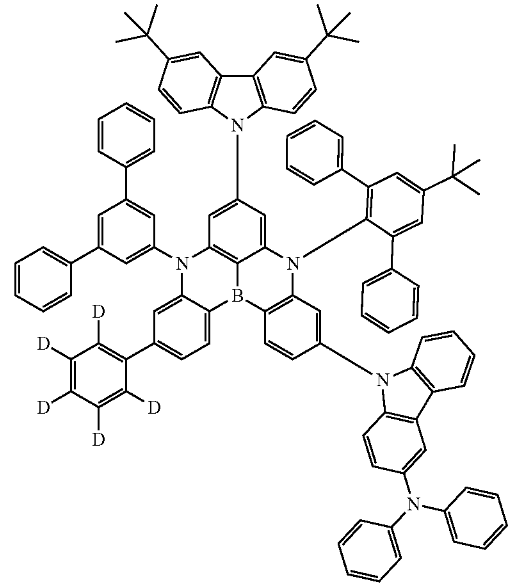
253
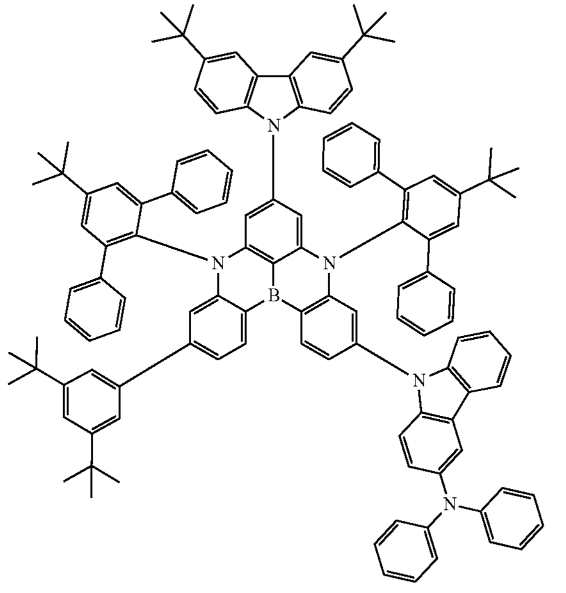
254
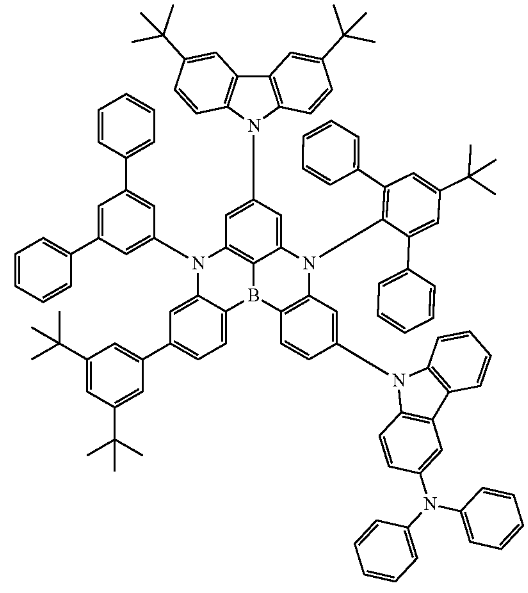

-continued
255
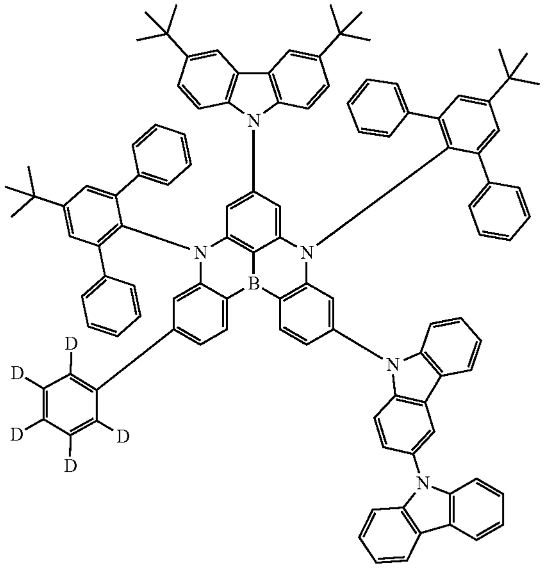
256
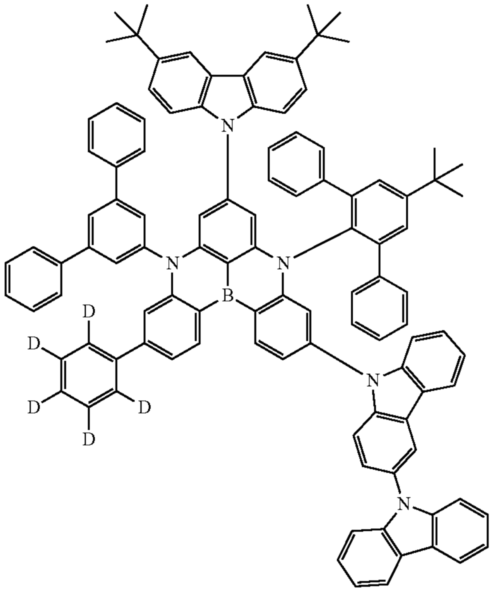
257
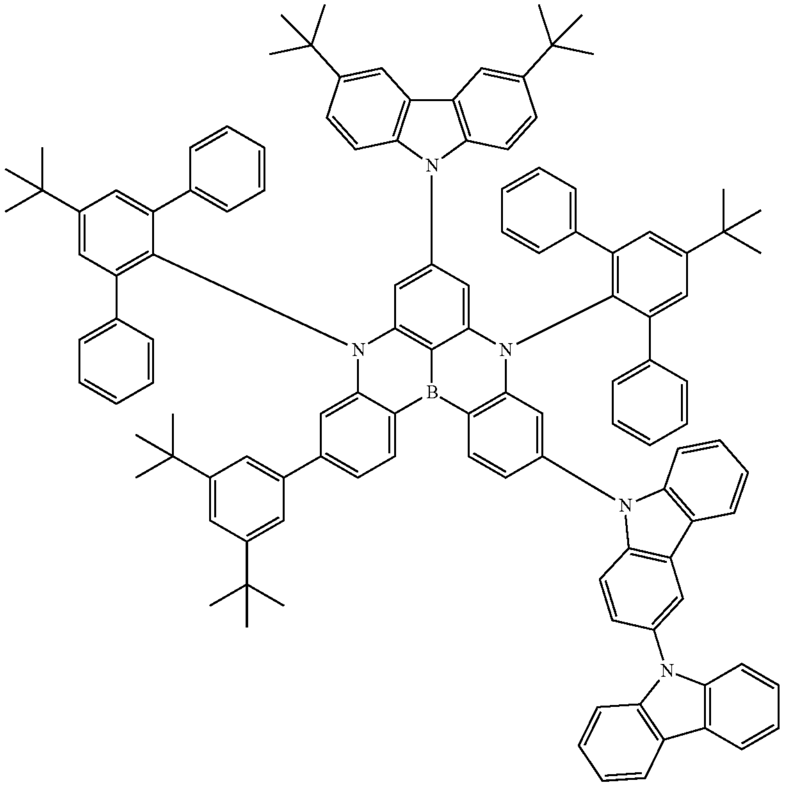

-continued
258
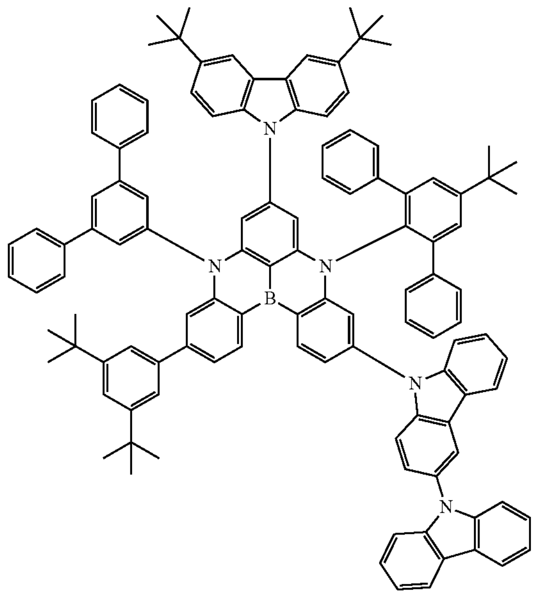
259
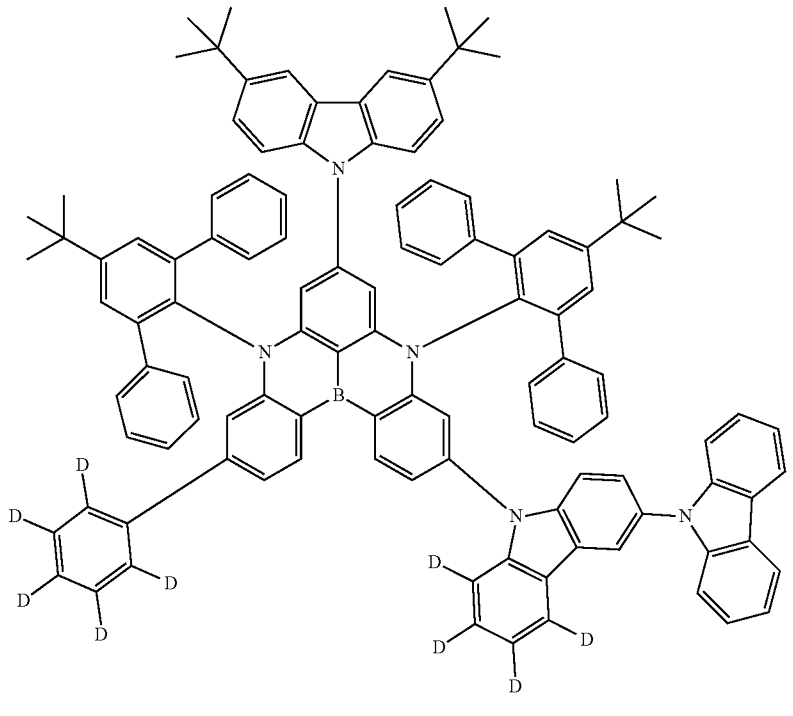

-continued
260
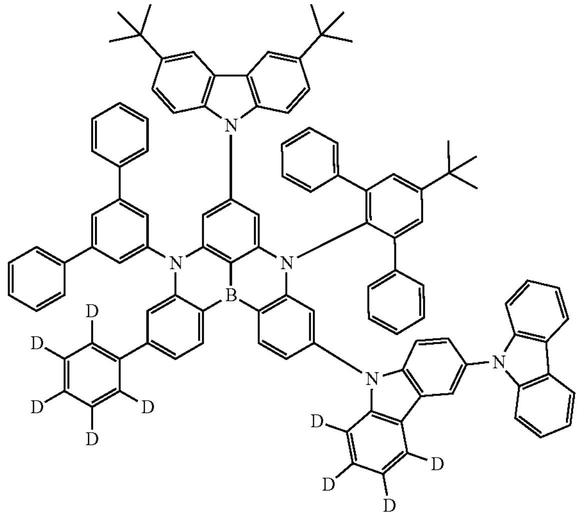
261
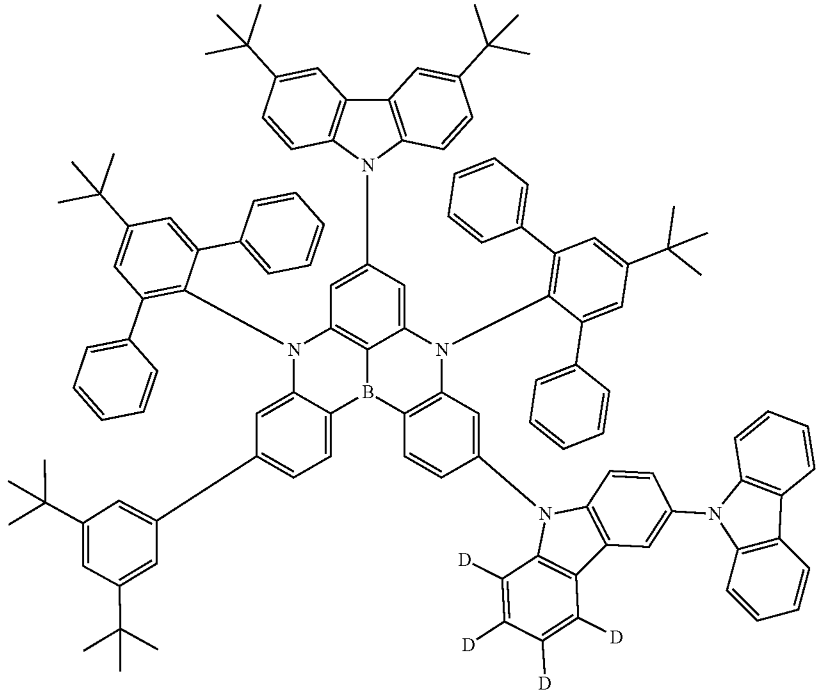

-continued
262
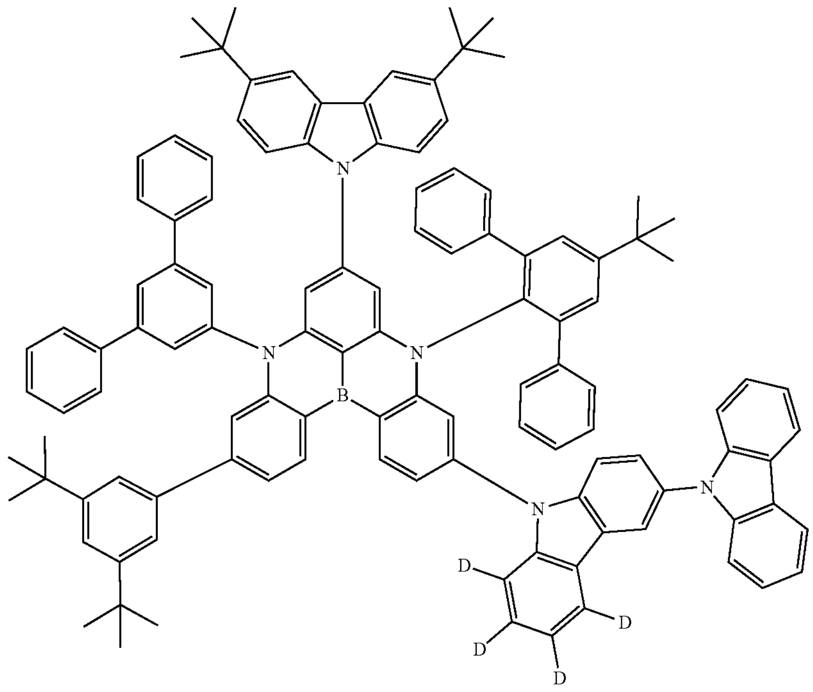
263
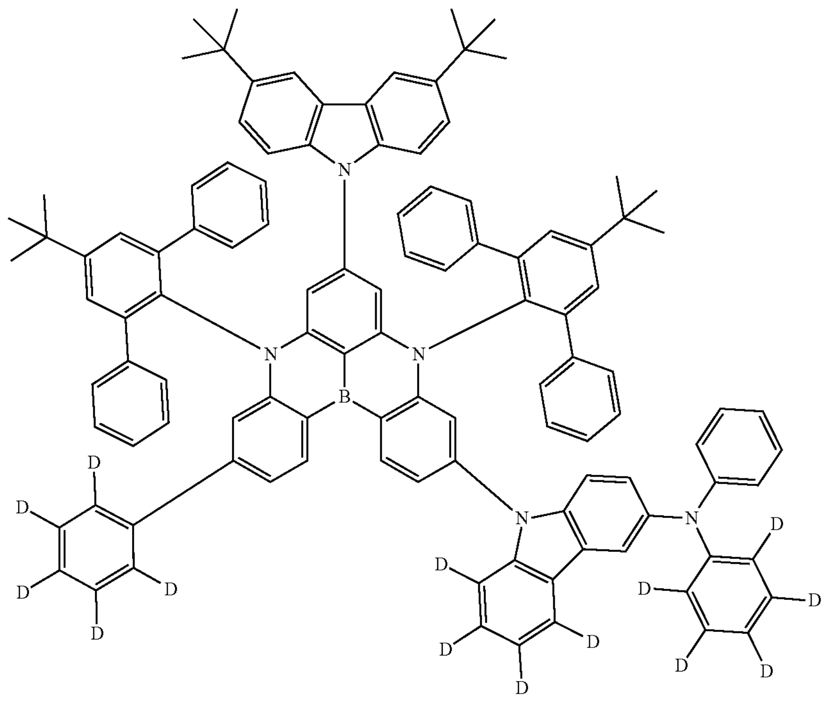

-continued
264
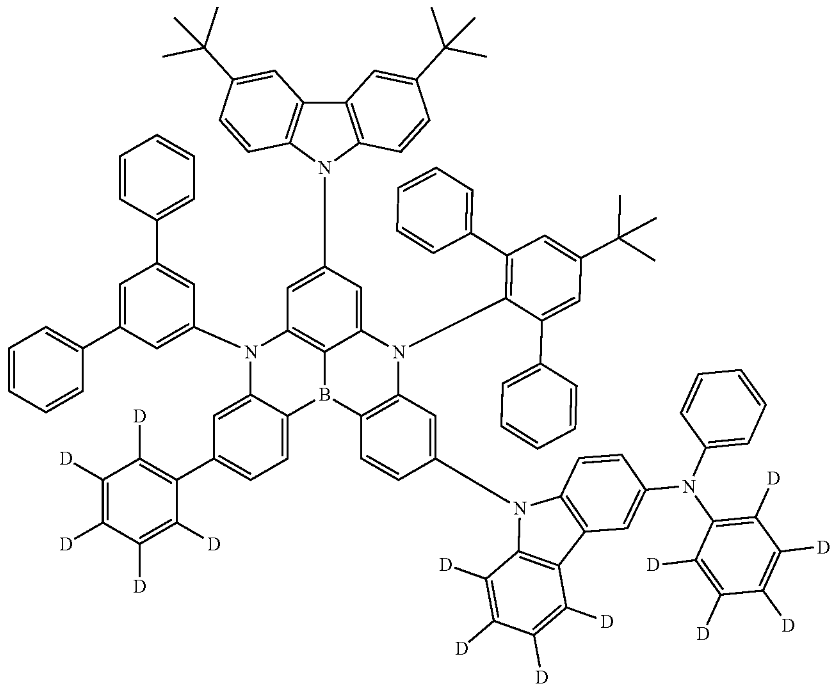
265
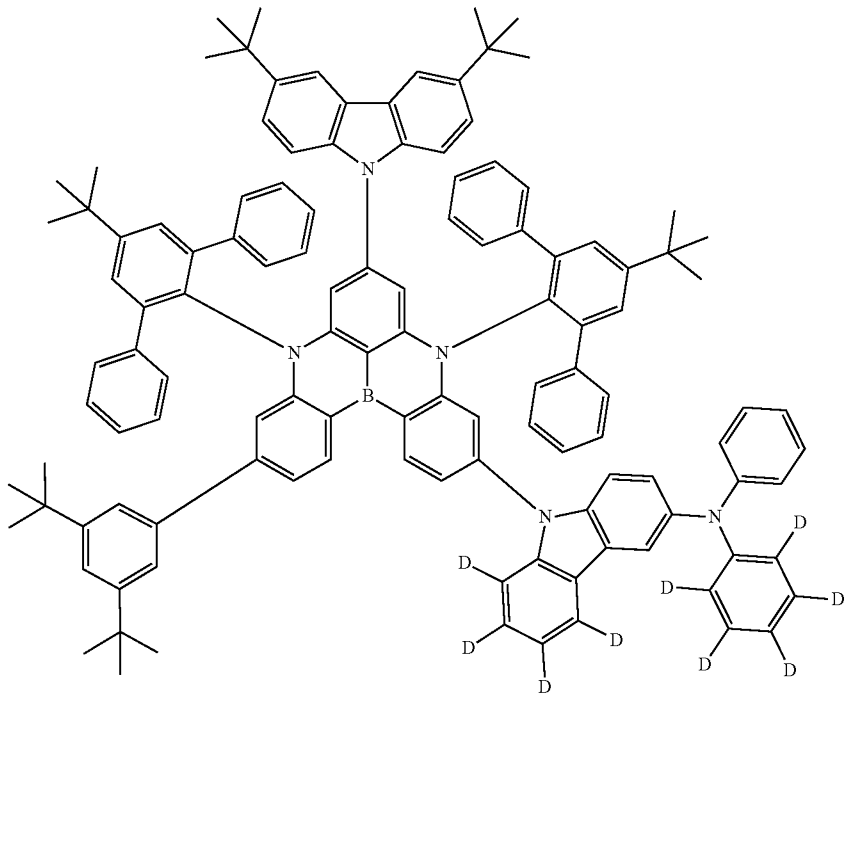

-continued
266
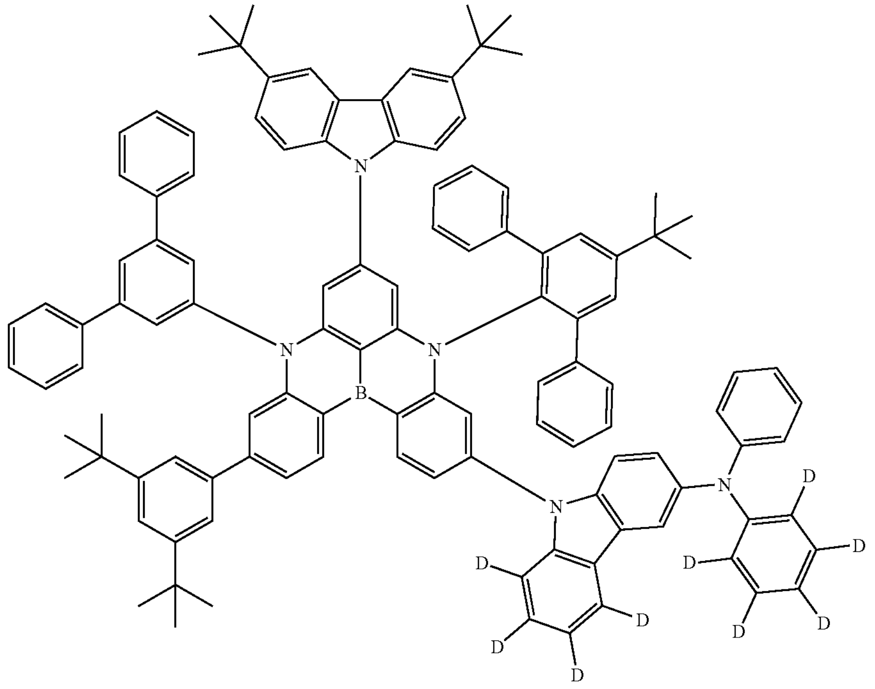
267
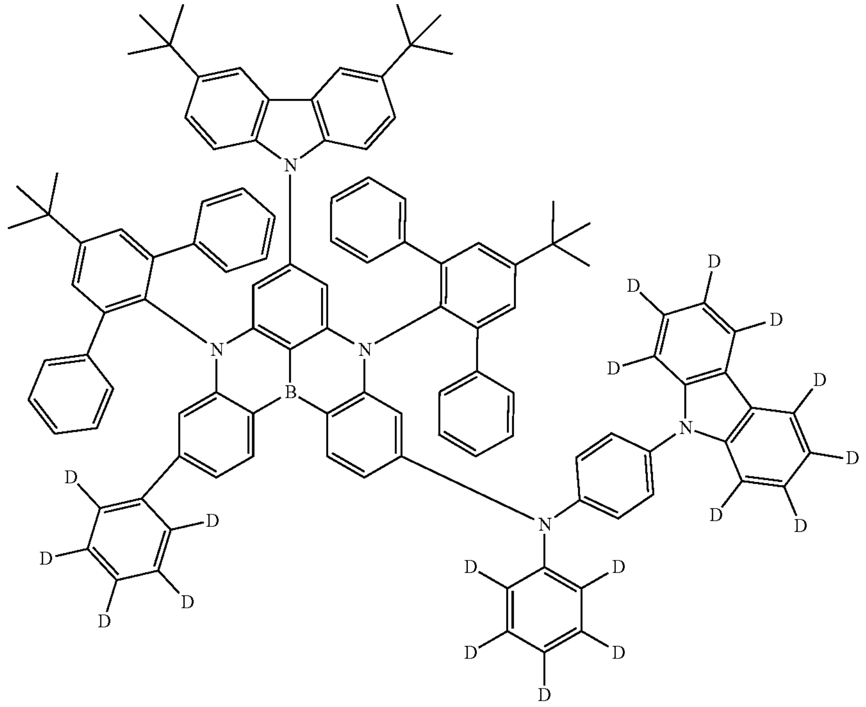

-continued
268
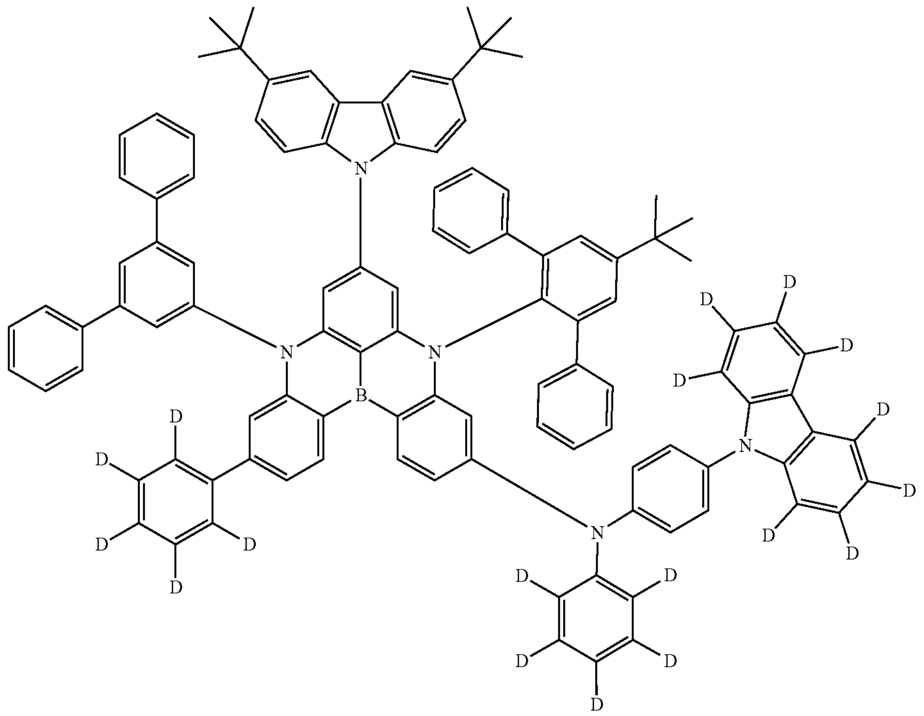
269
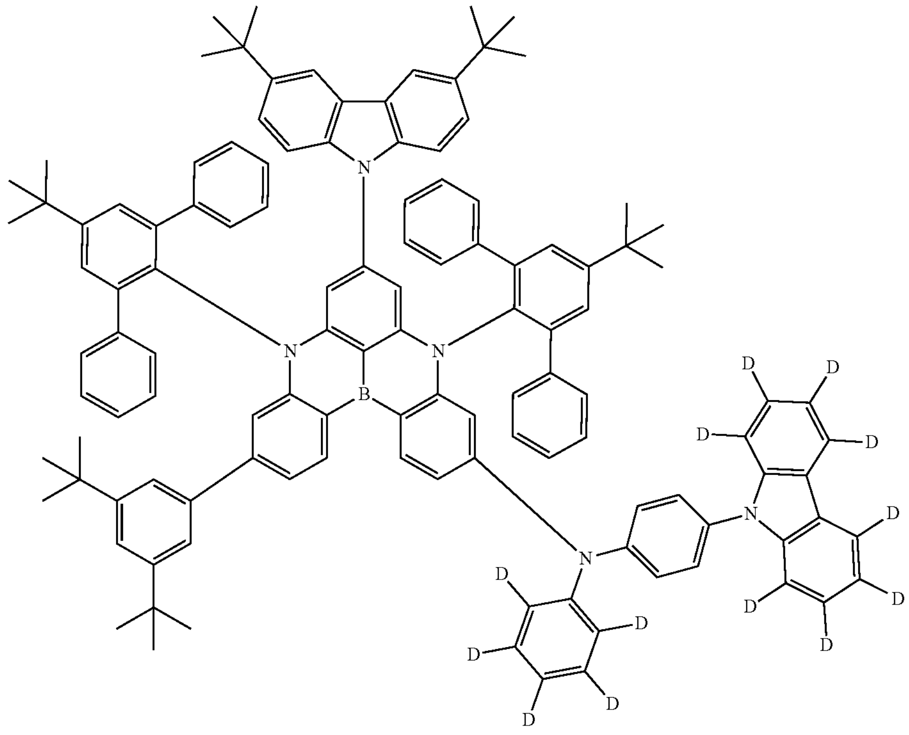

-continued
270
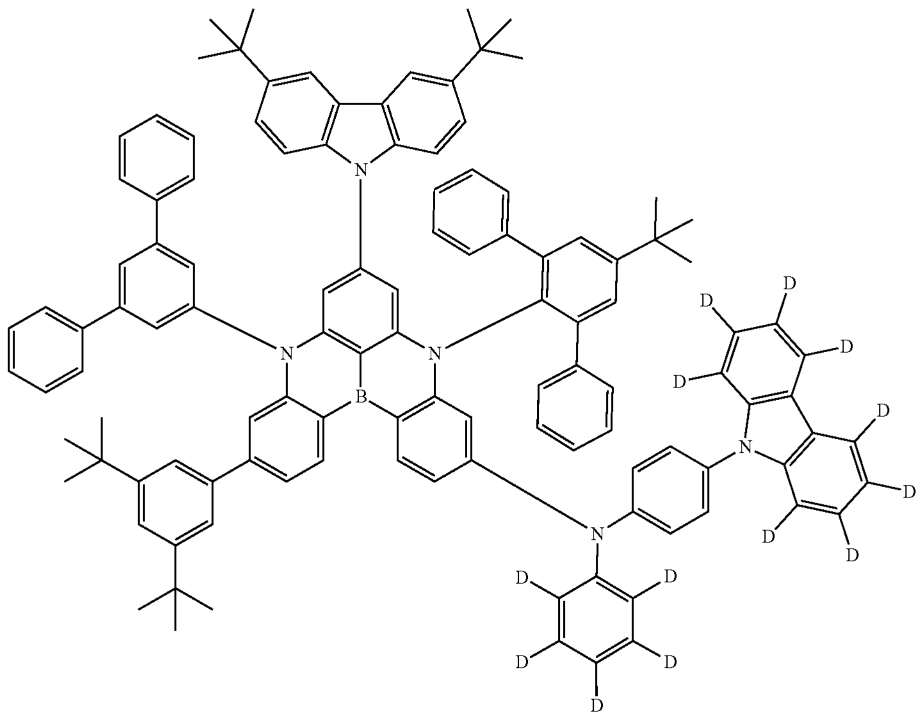
271
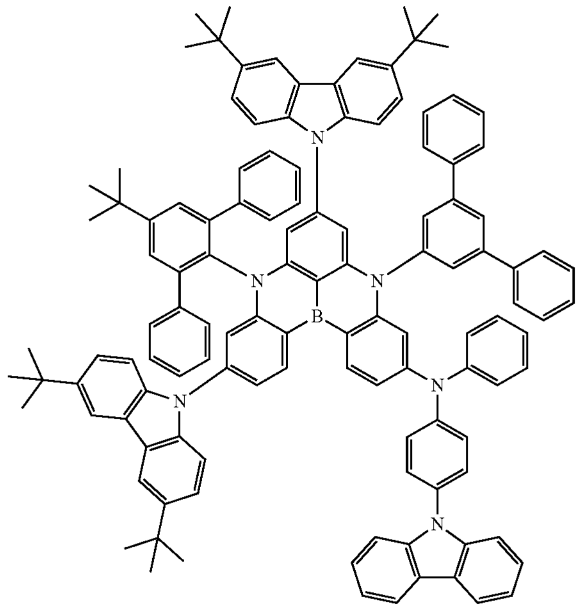
272
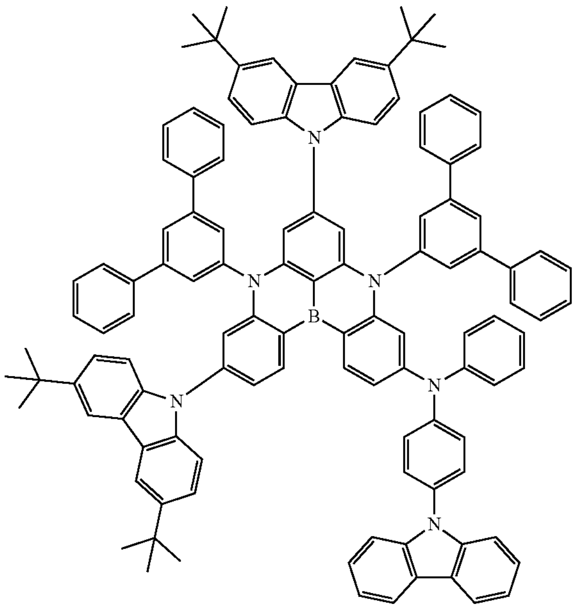

-continued
273
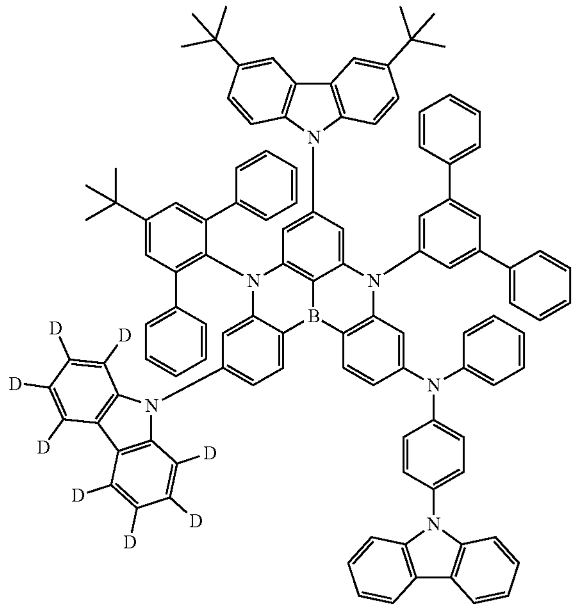
274
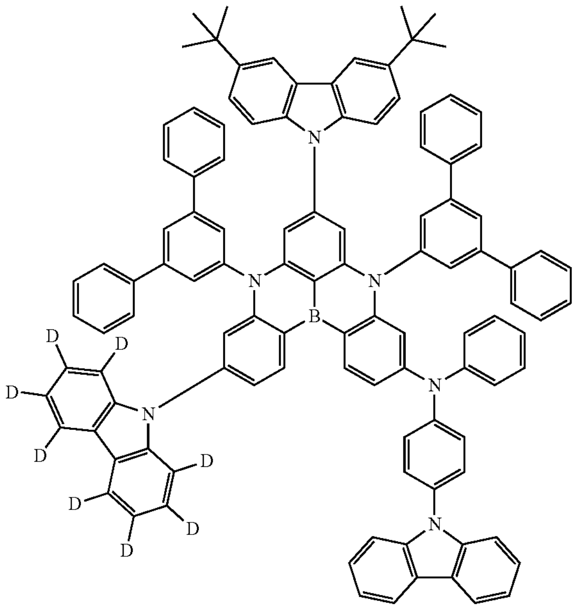
275
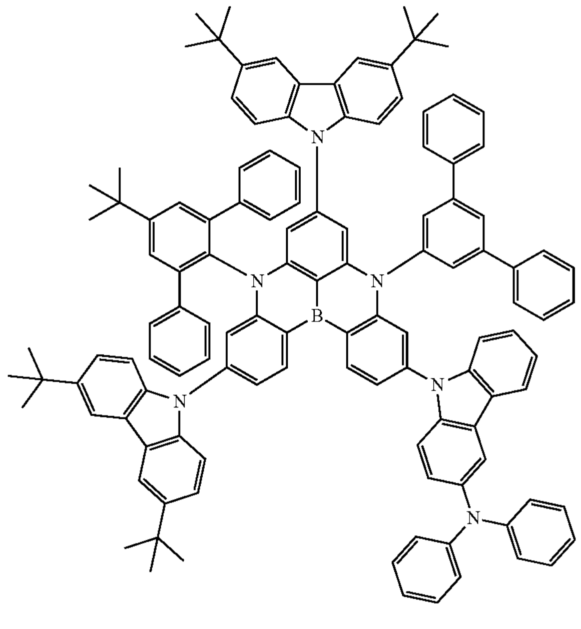
276
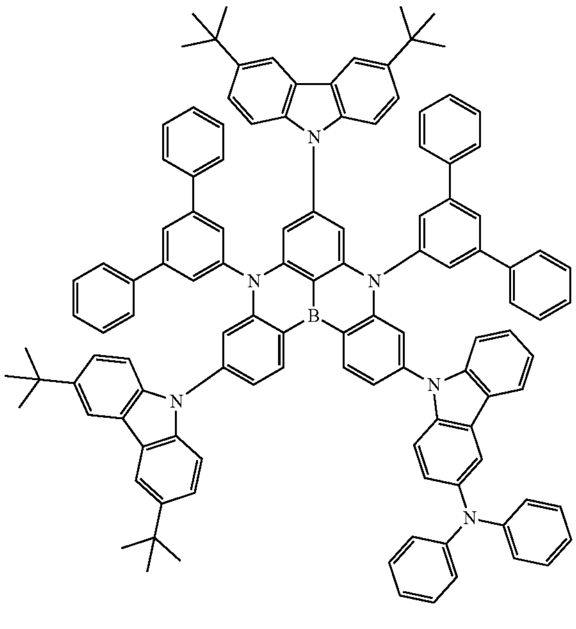

-continued
277
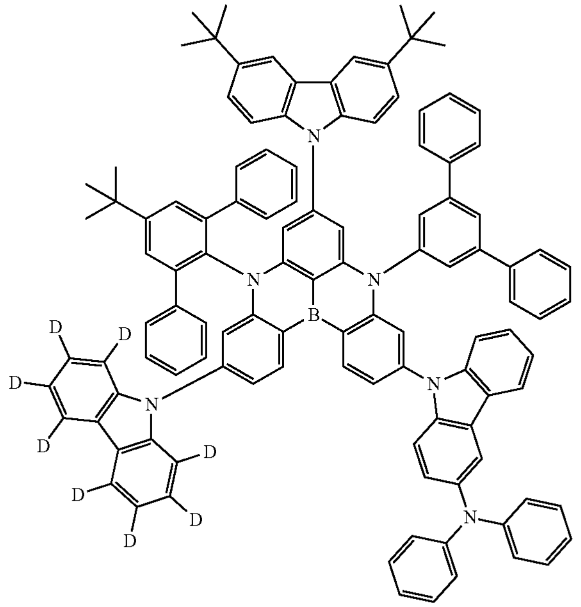
278
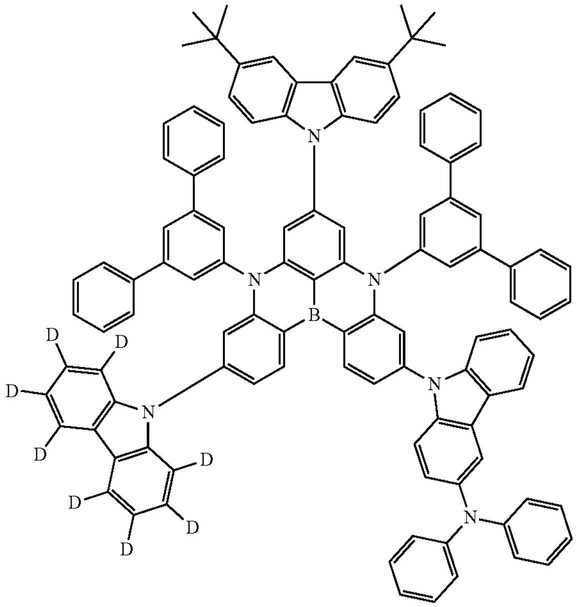
279
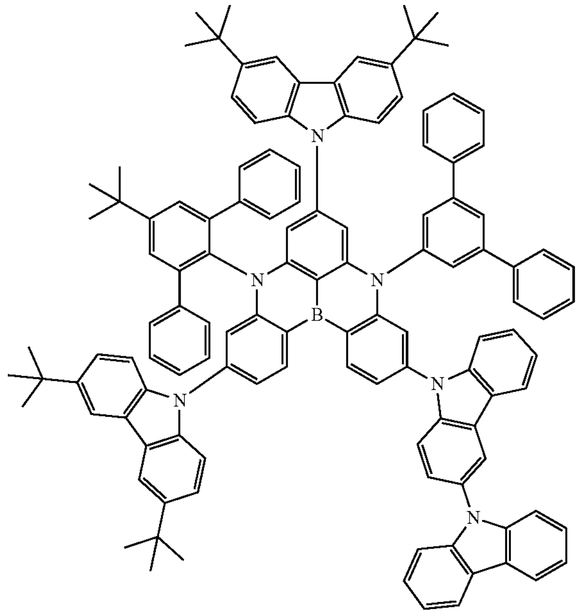
280
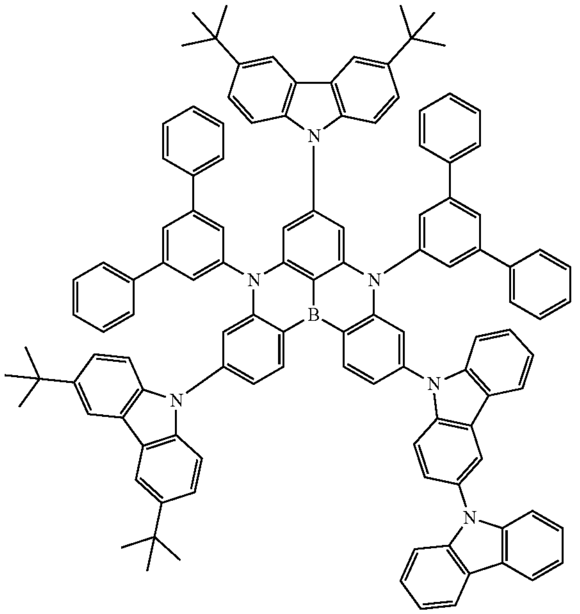

-continued
281
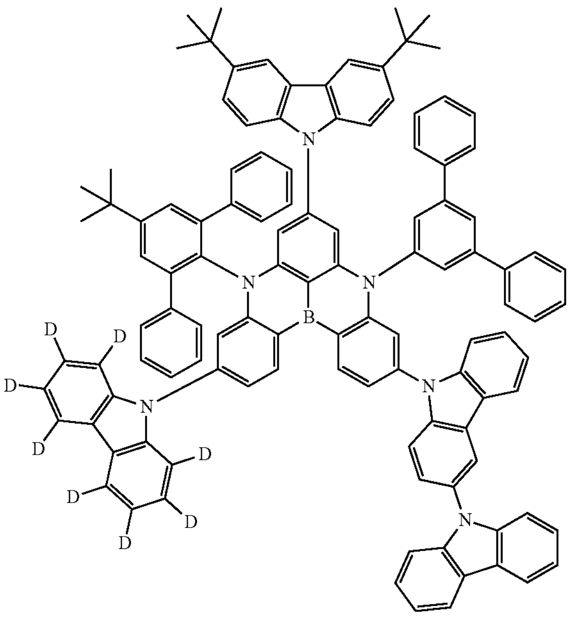
282
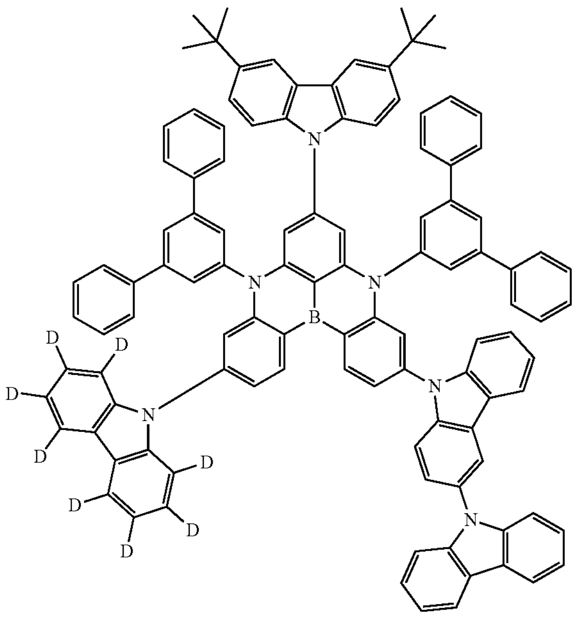
283
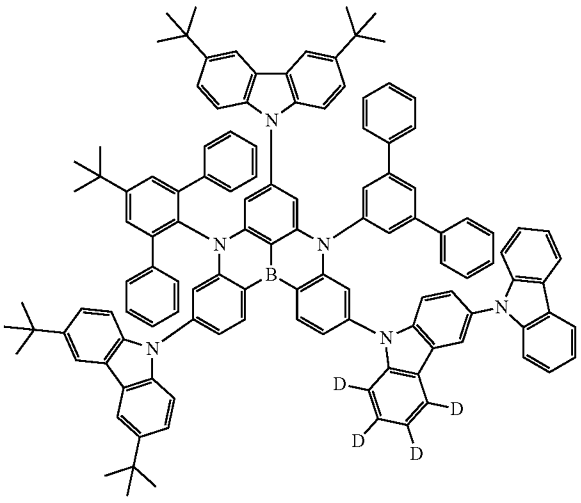
284
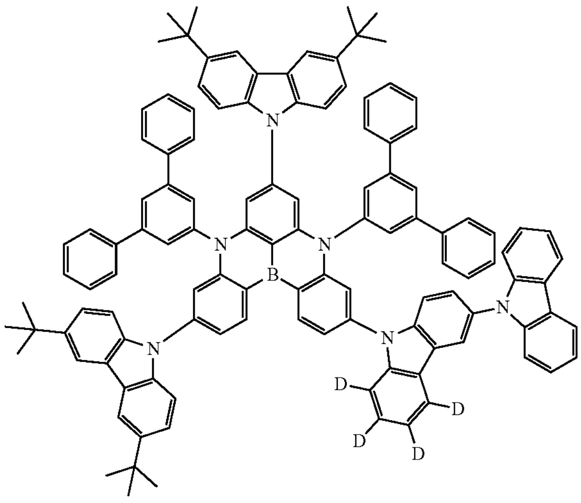
285
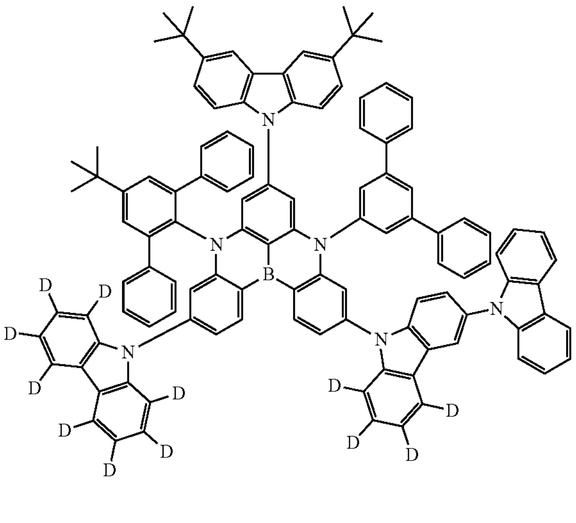
286
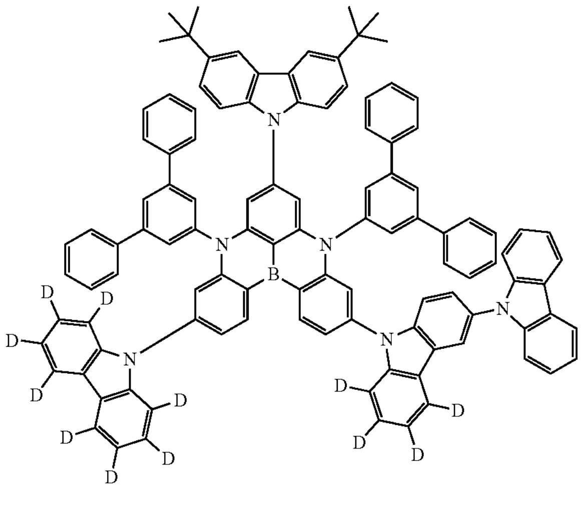

-continued
287
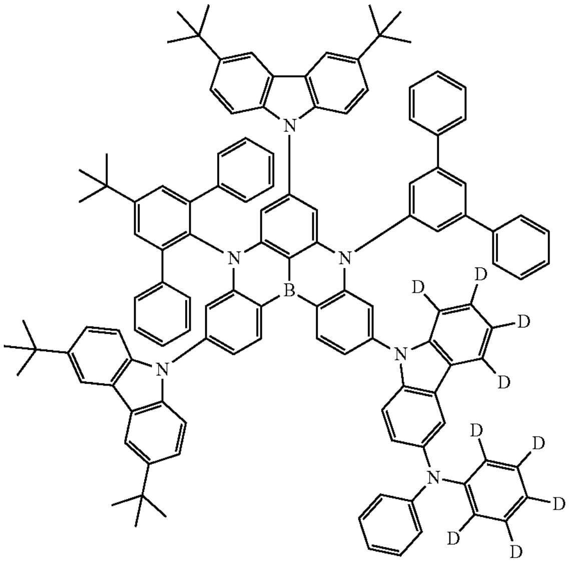
288
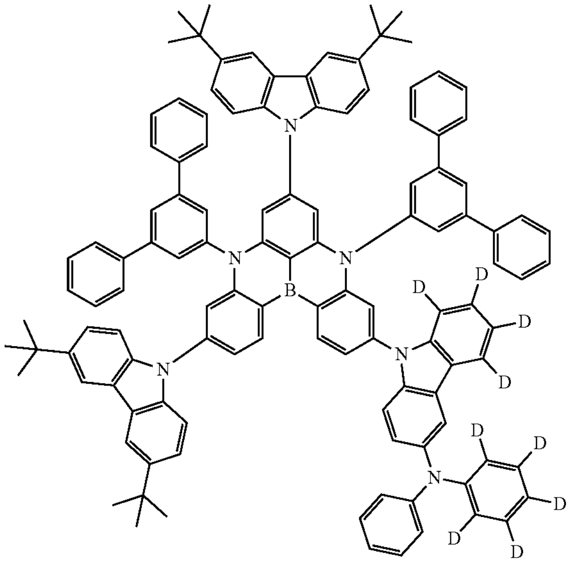
289
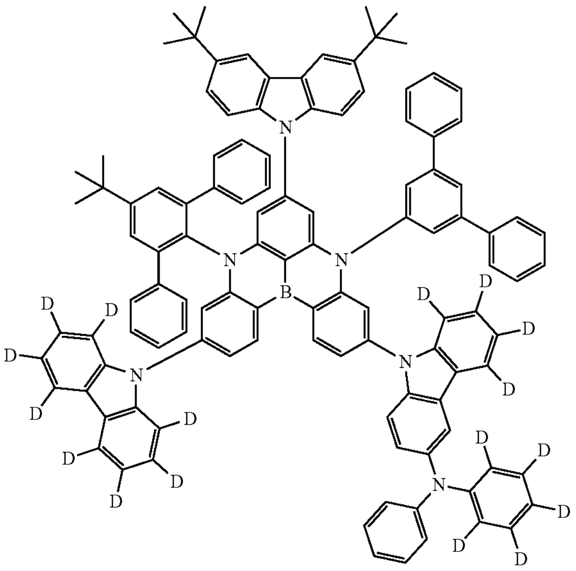
290
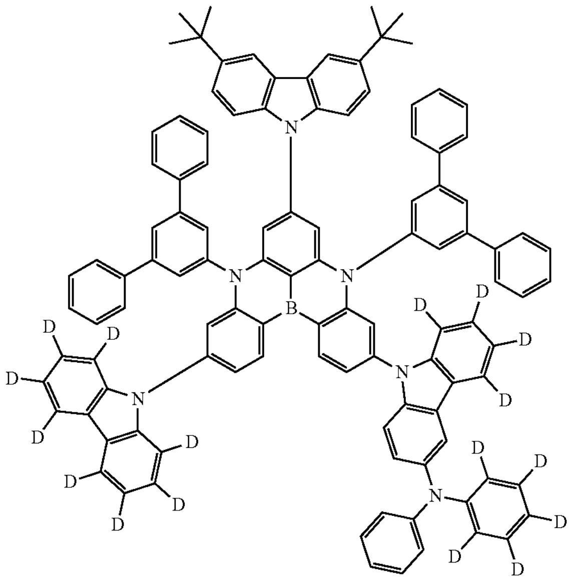

-continued
291
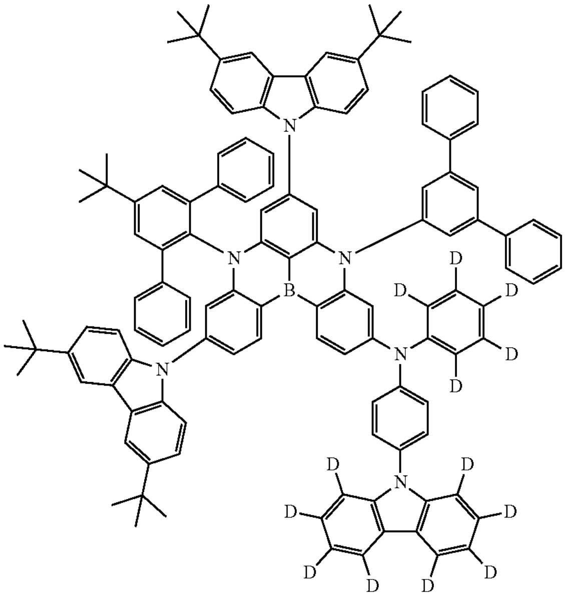
292
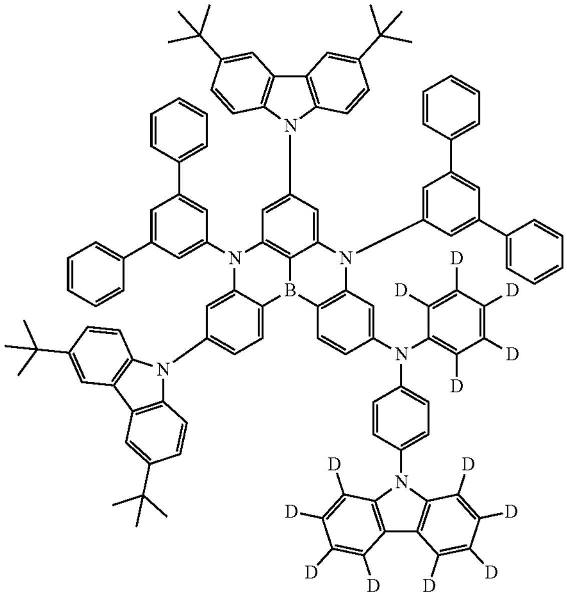
293
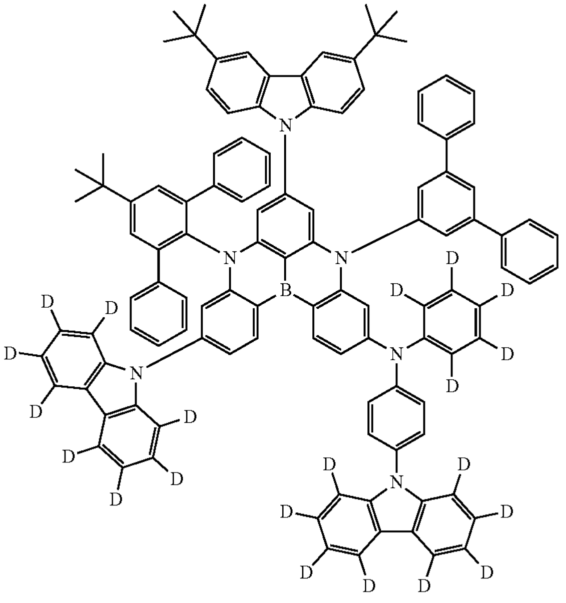
294
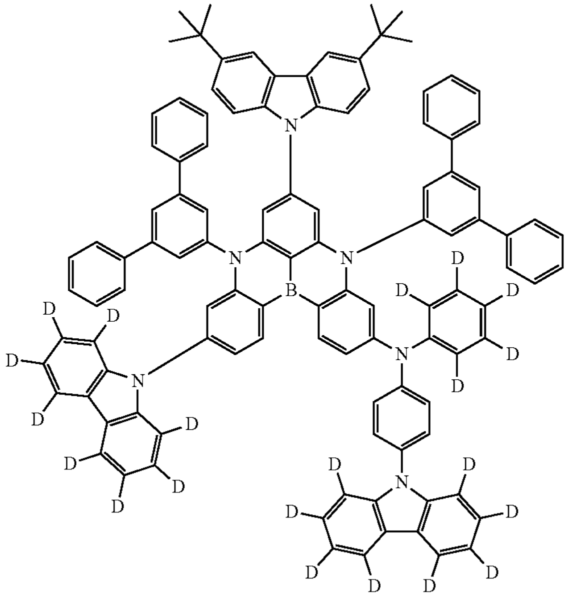

-continued
295
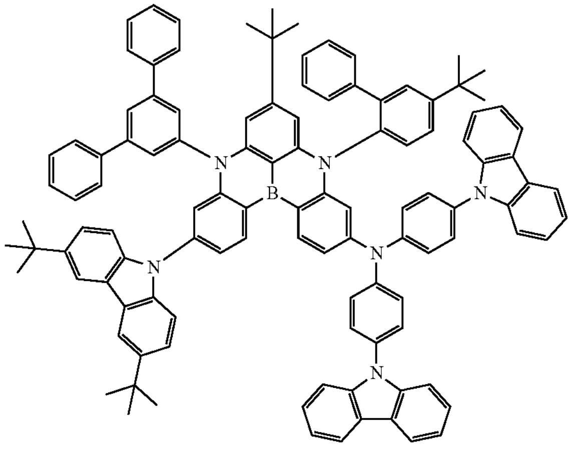
296
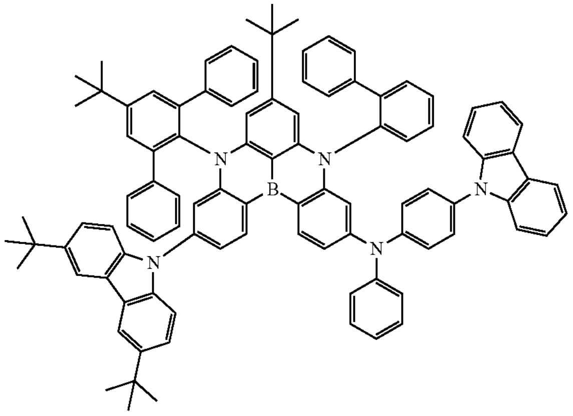
297
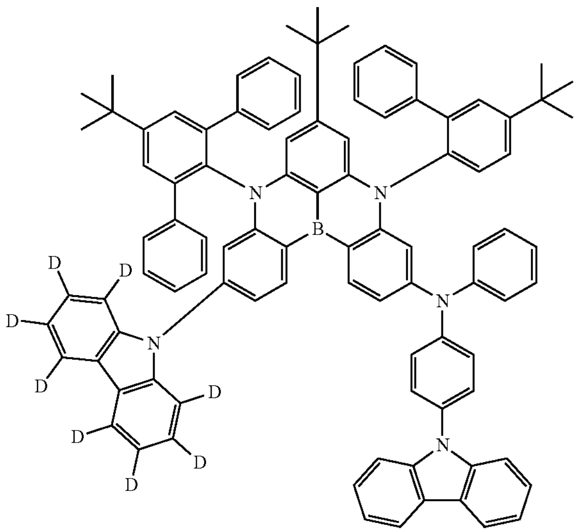
298
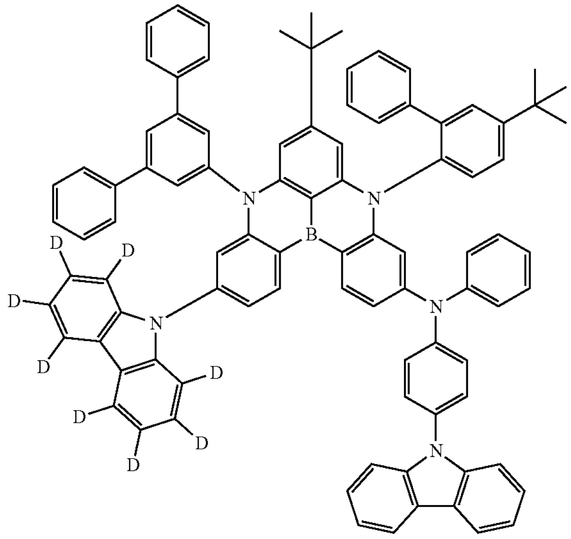
299
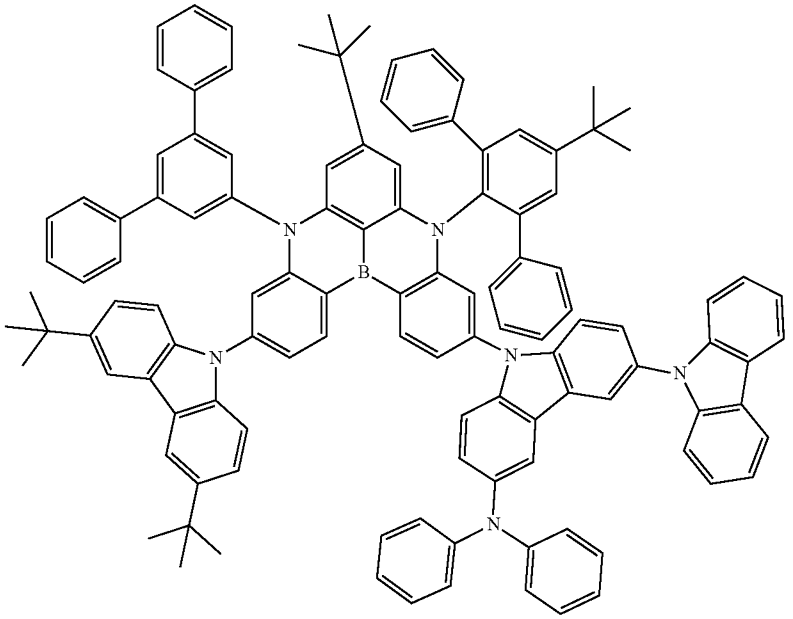

-continued
300
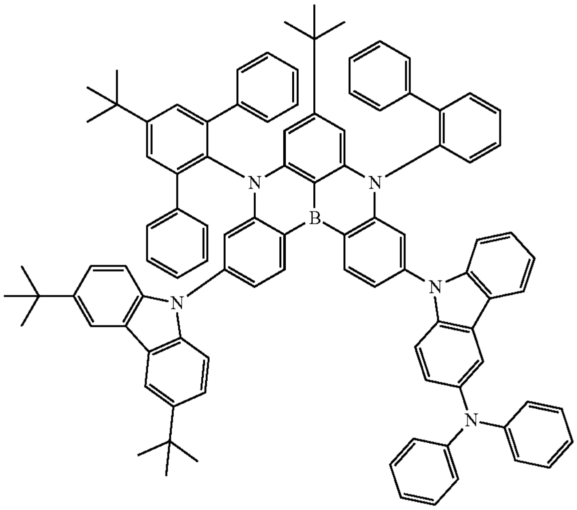
301
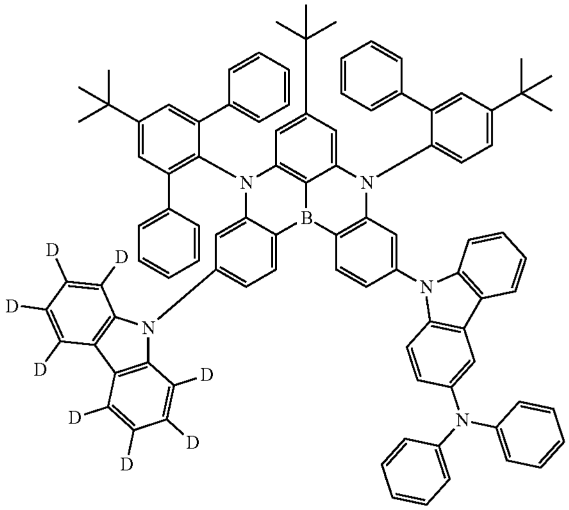
302
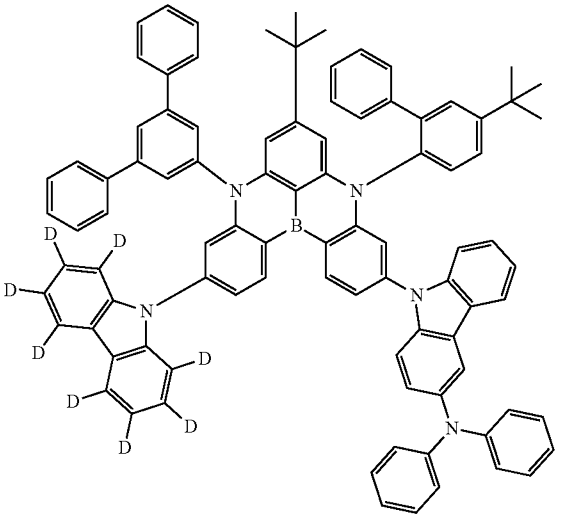
303
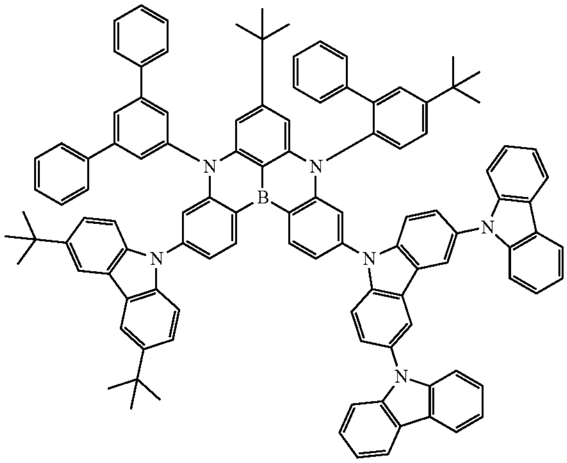
304
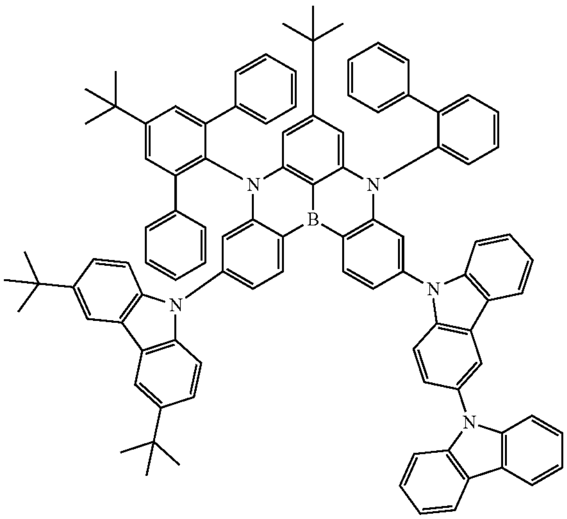
305
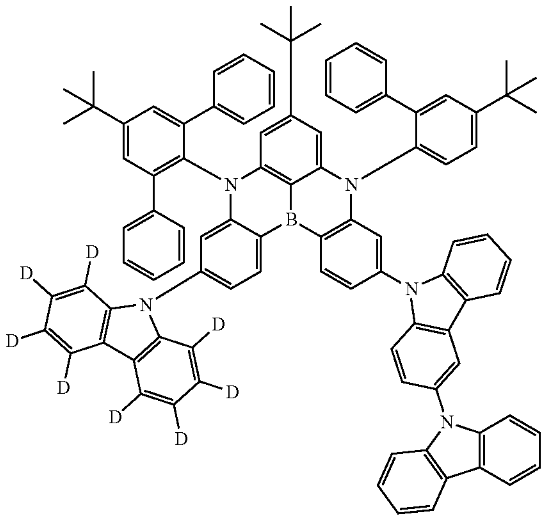

-continued
306
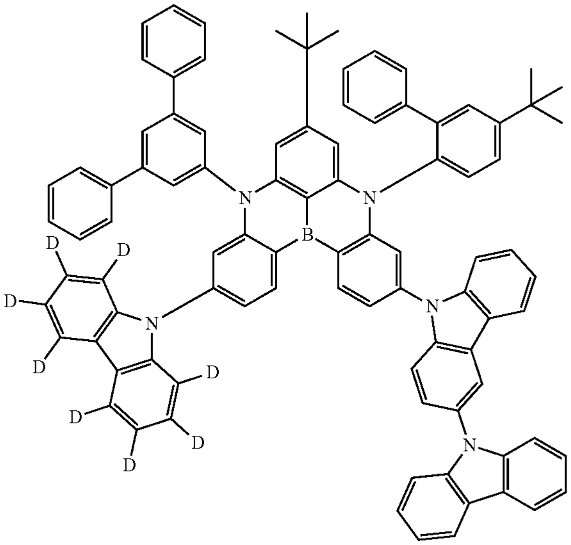
307
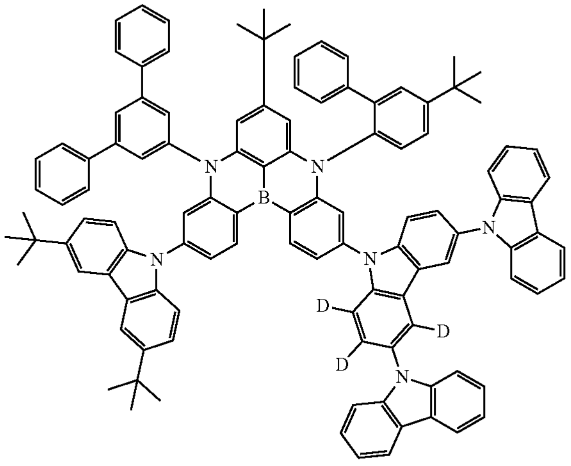
308
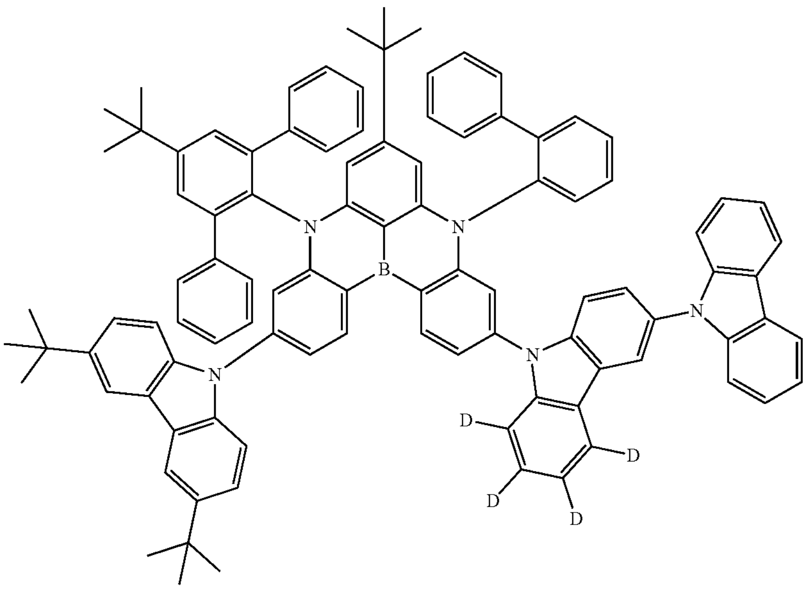

-continued
309
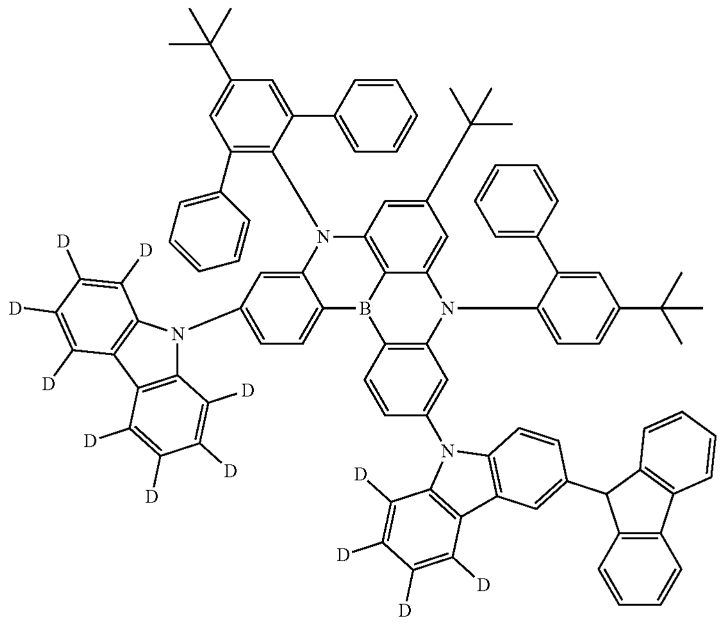
310
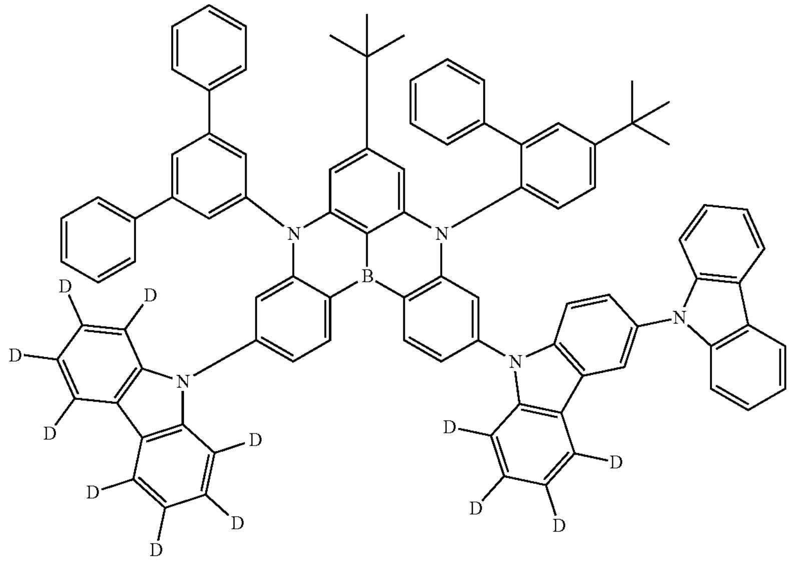

-continued
311
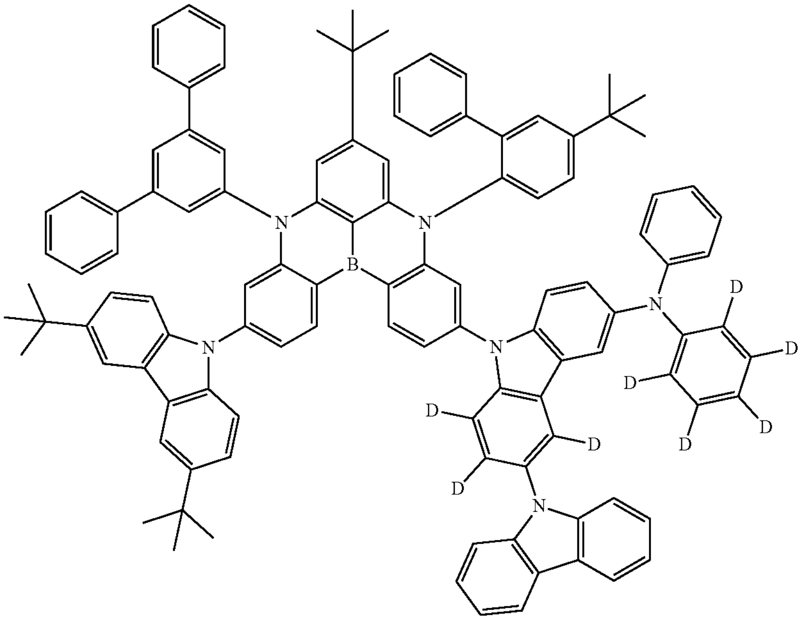
312
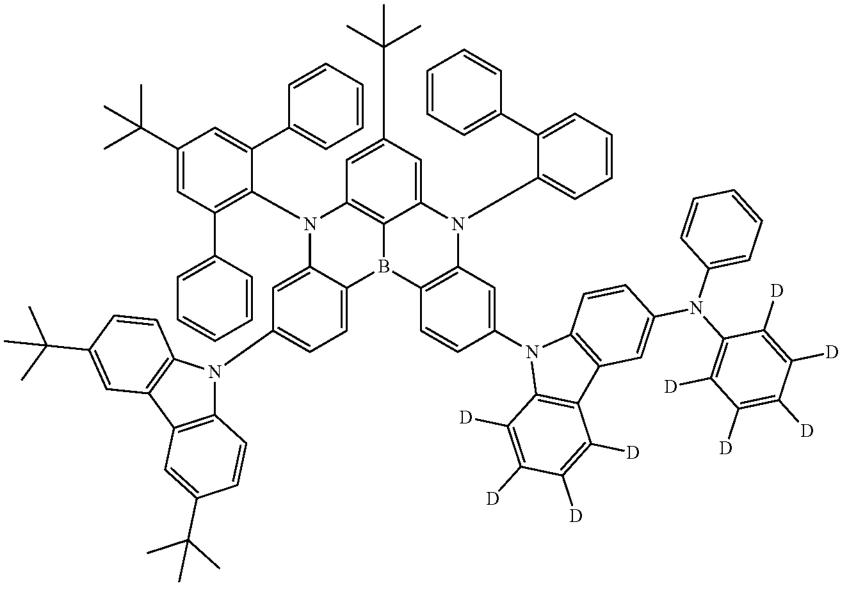

-continued
313
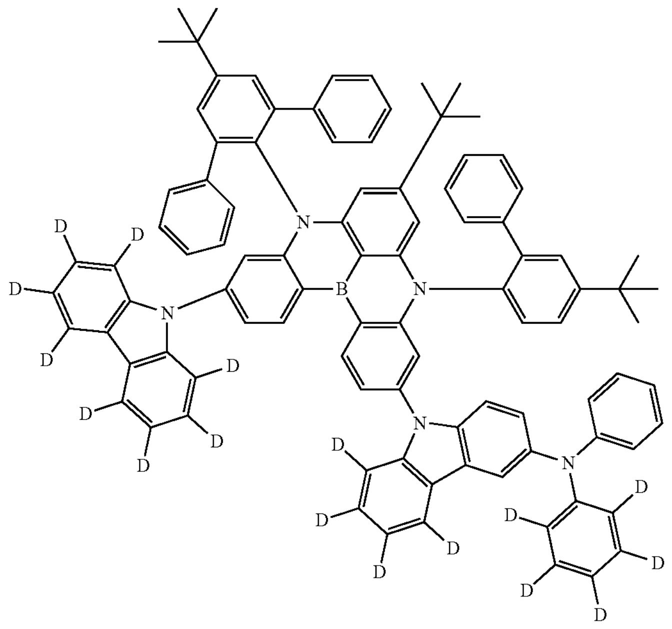
314
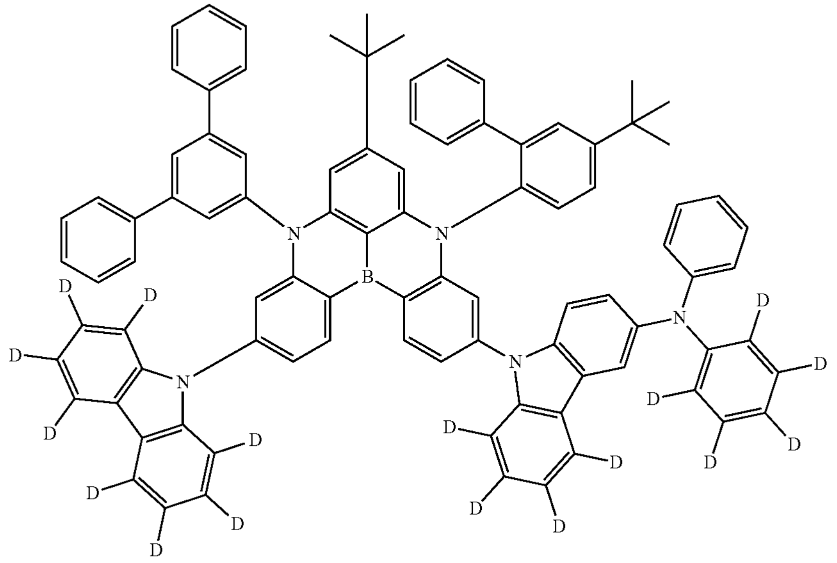

-continued
315
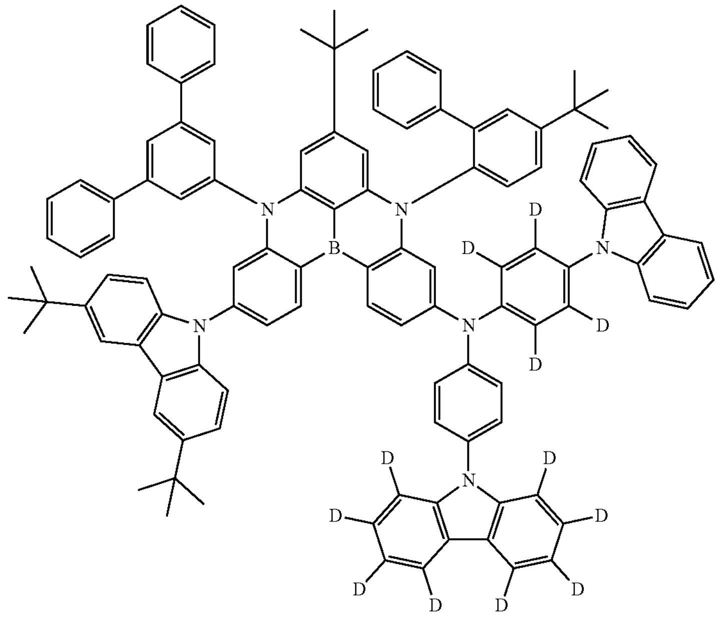
316
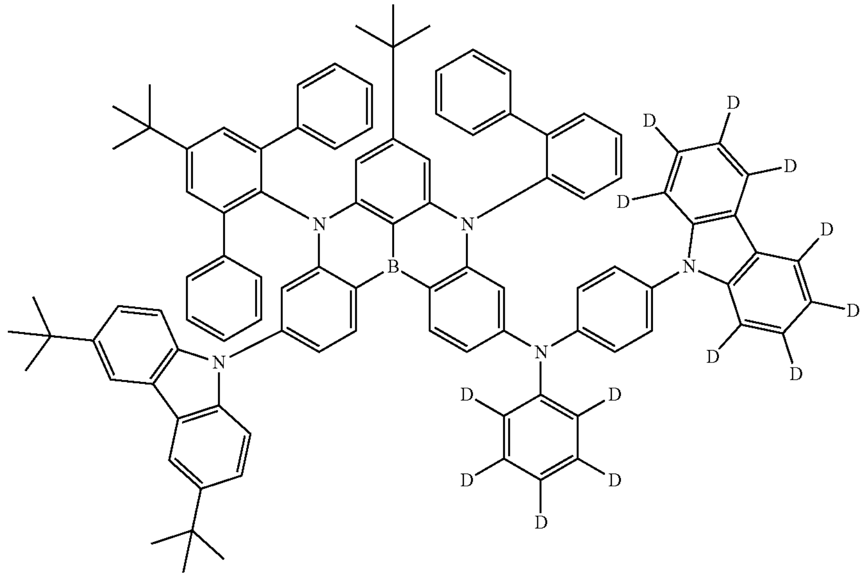

-continued
317
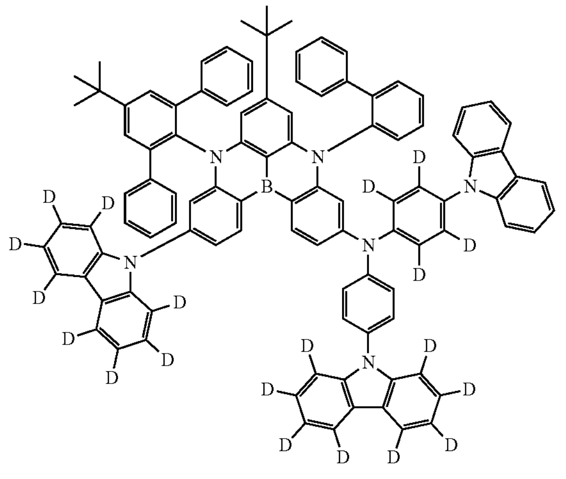
318
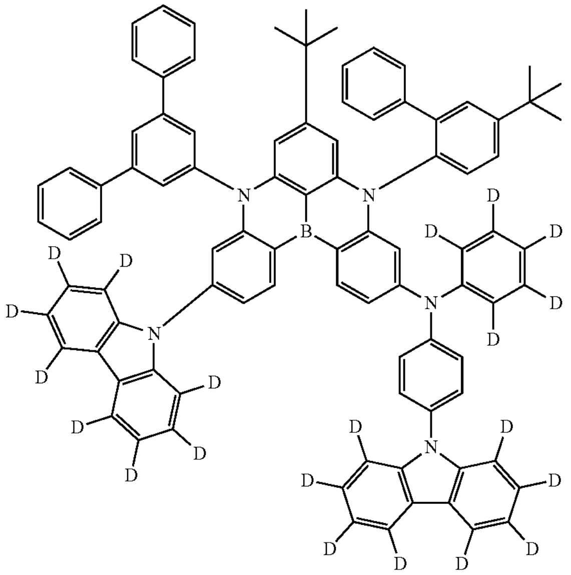
319
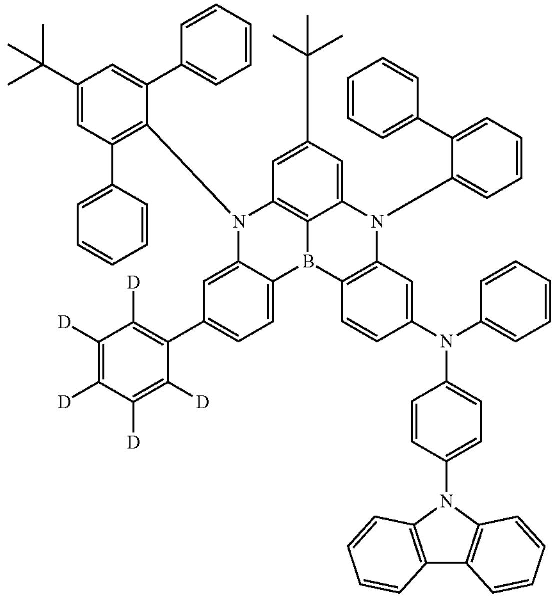
320
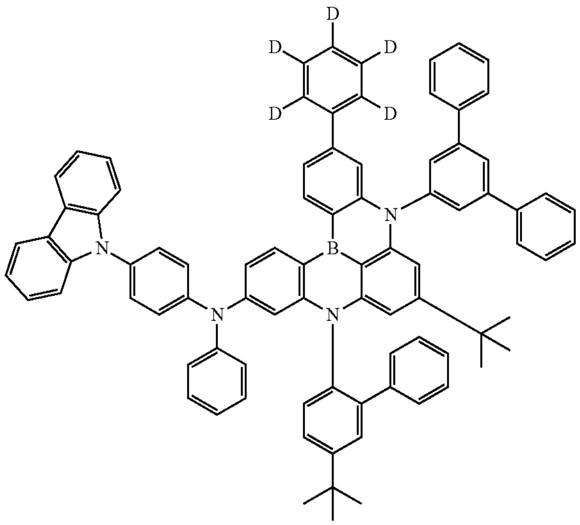

-continued
321
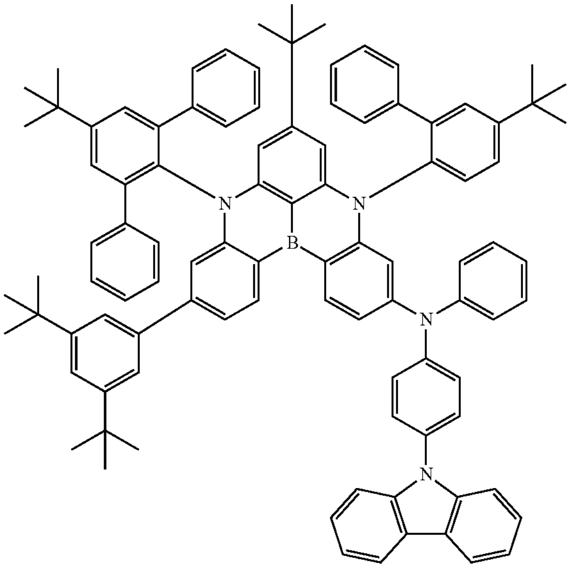
322
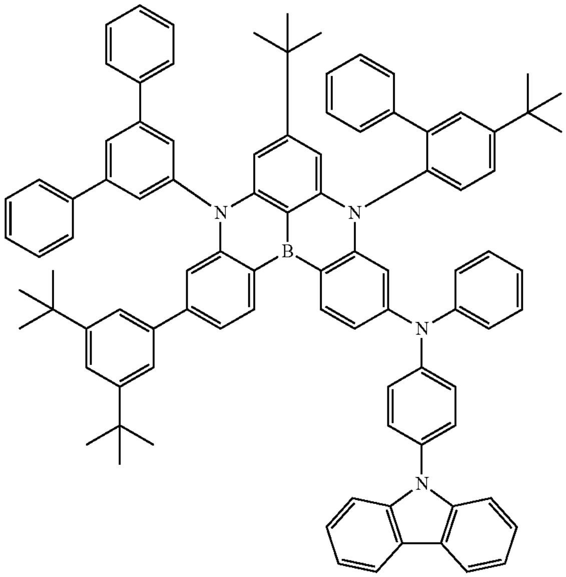
323
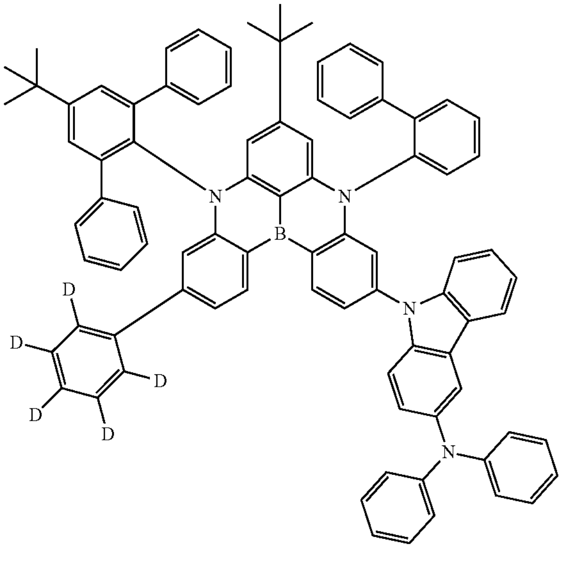
324
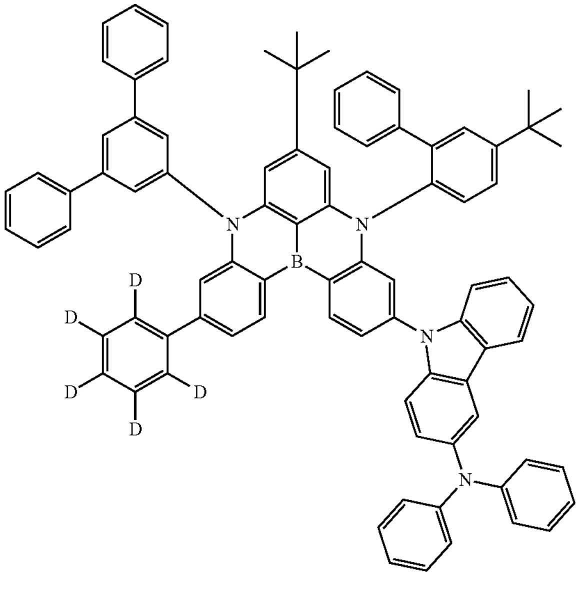

-continued
325
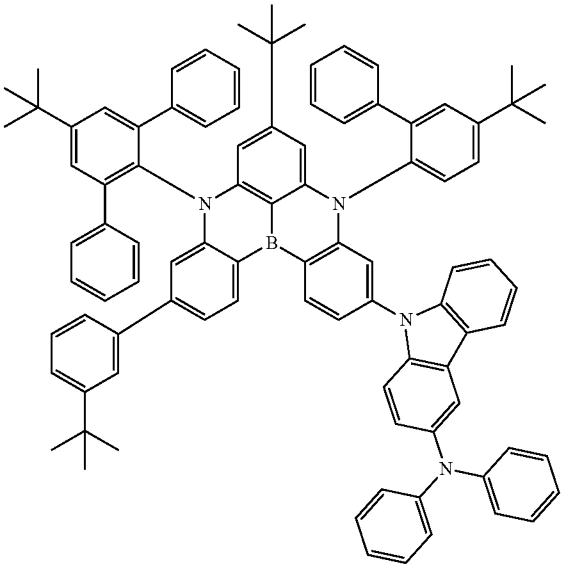
326
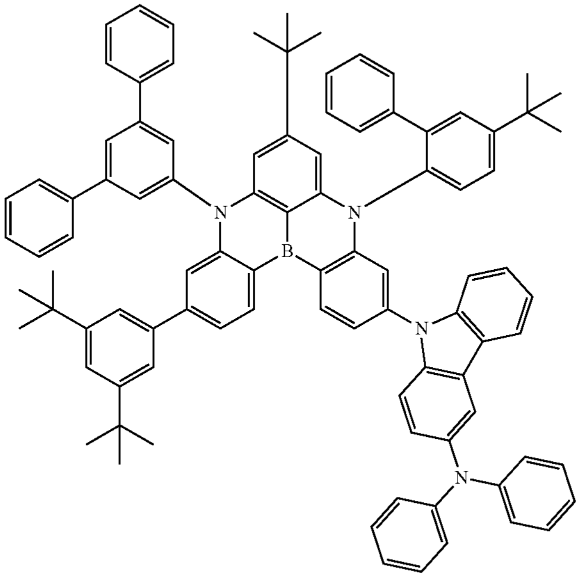
327
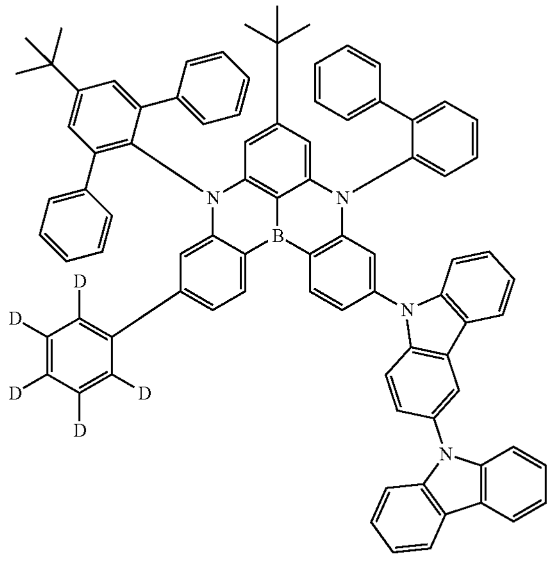
328
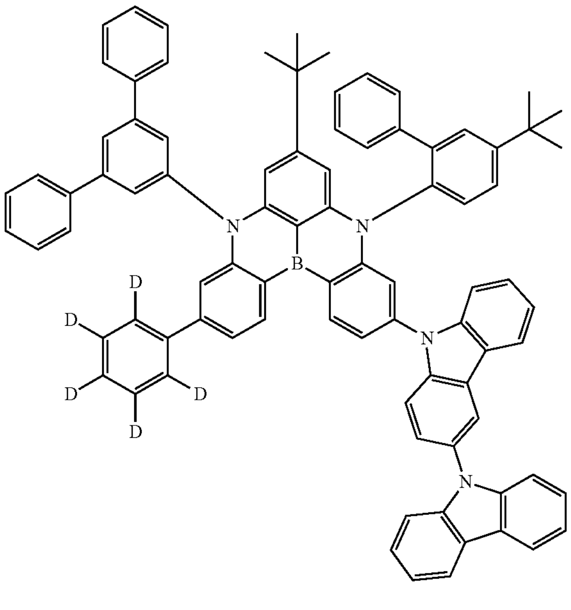

-continued
329
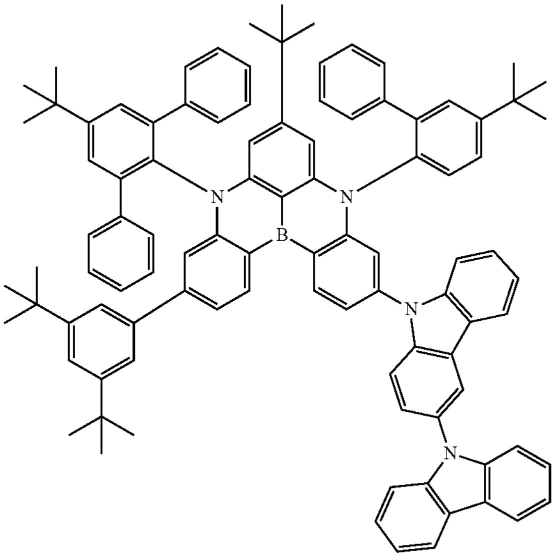
330
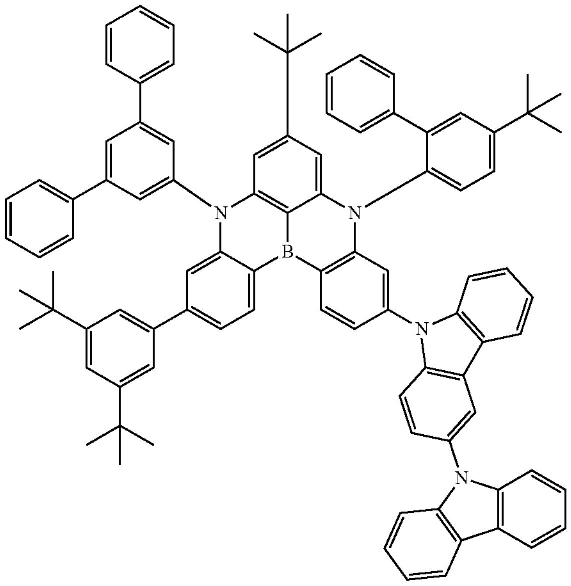
331
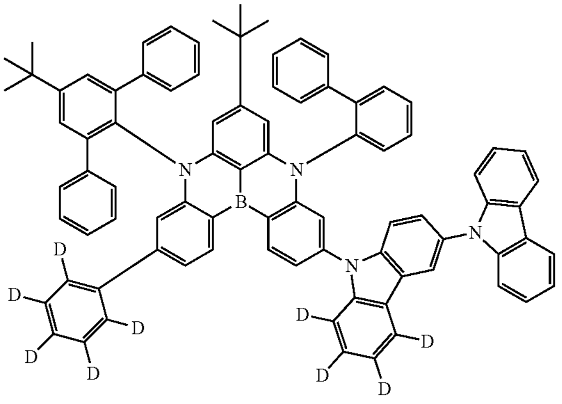
332
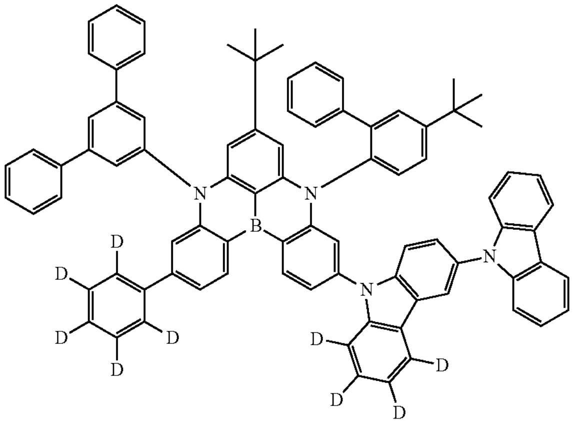
333
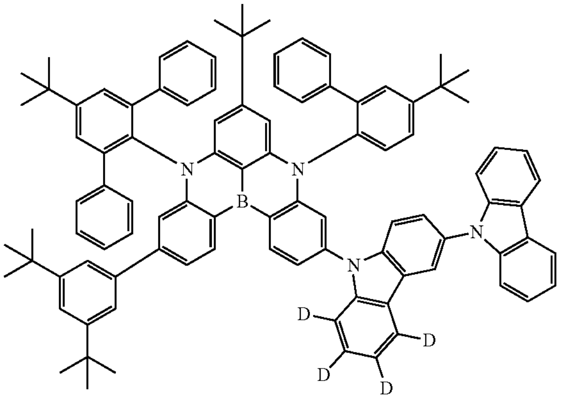
334
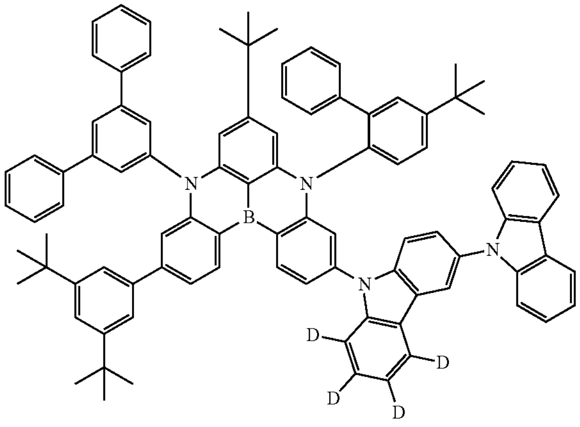

-continued
335
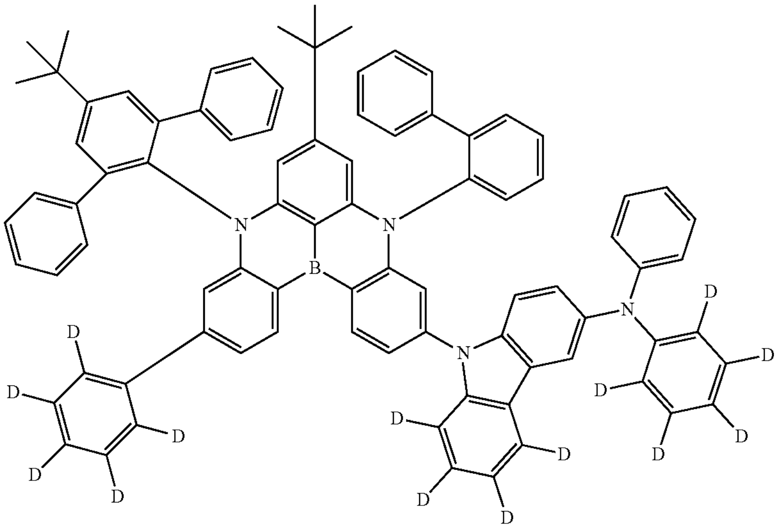
336
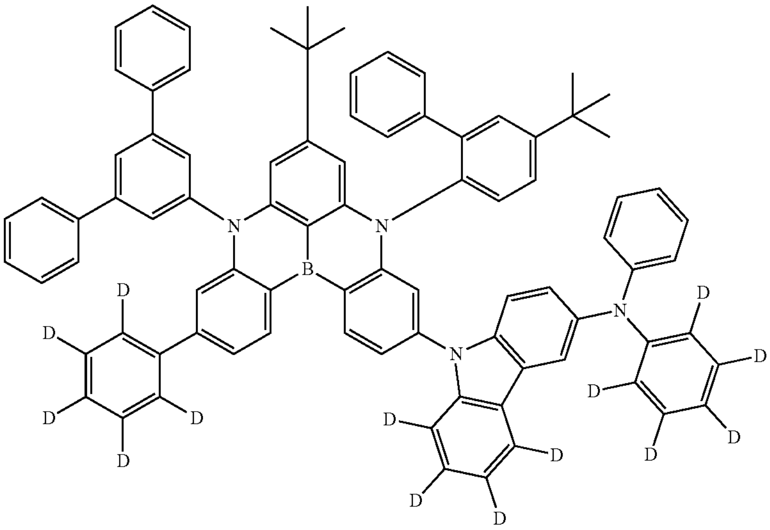
337
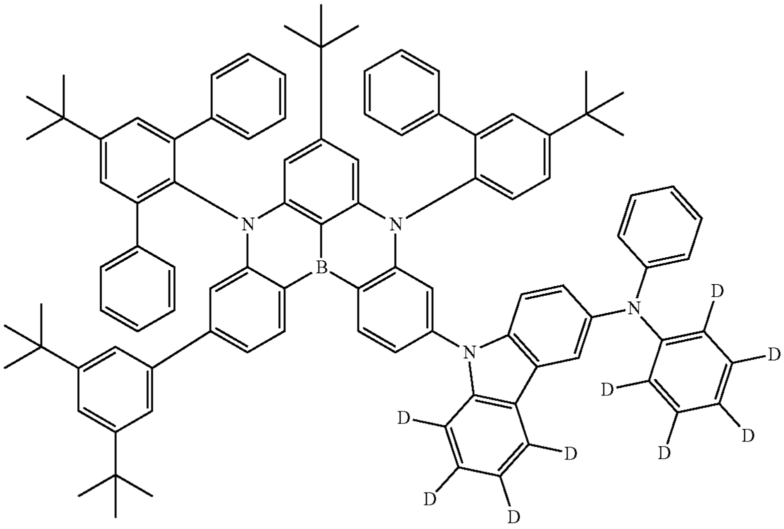

-continued
338
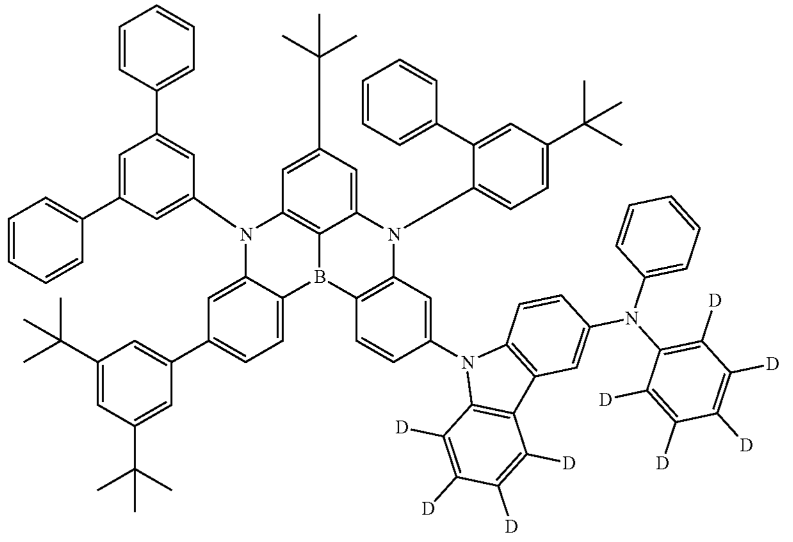
339
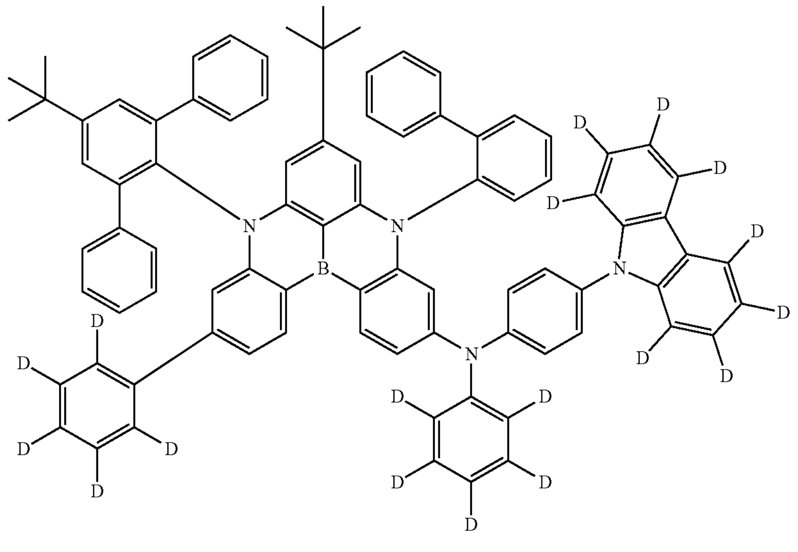

-continued
340
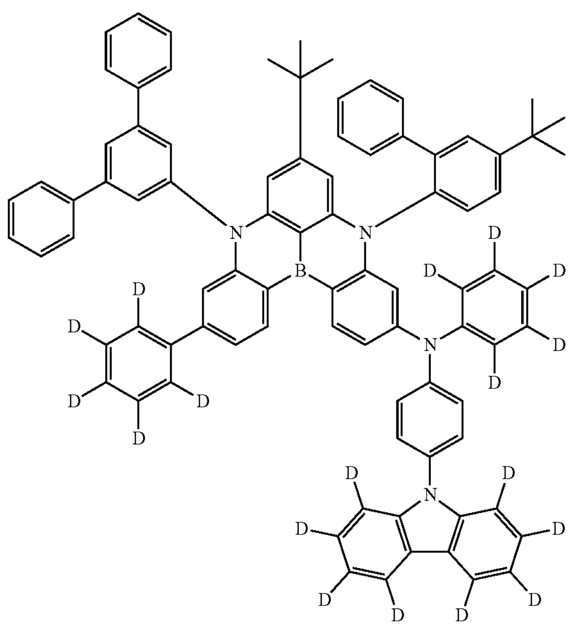
341
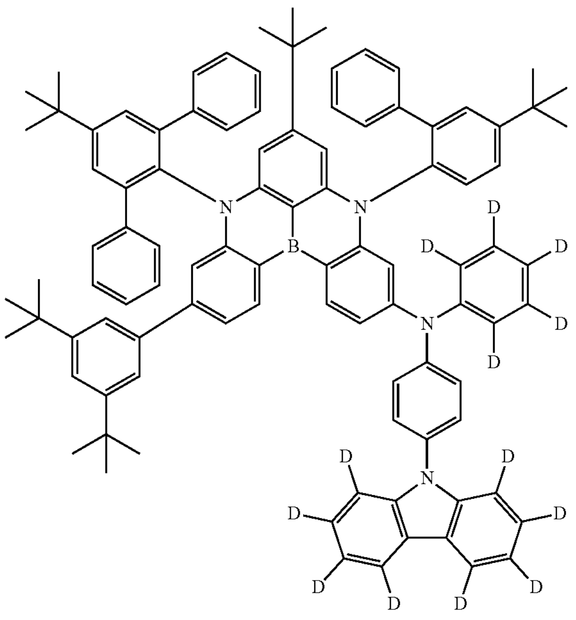
342
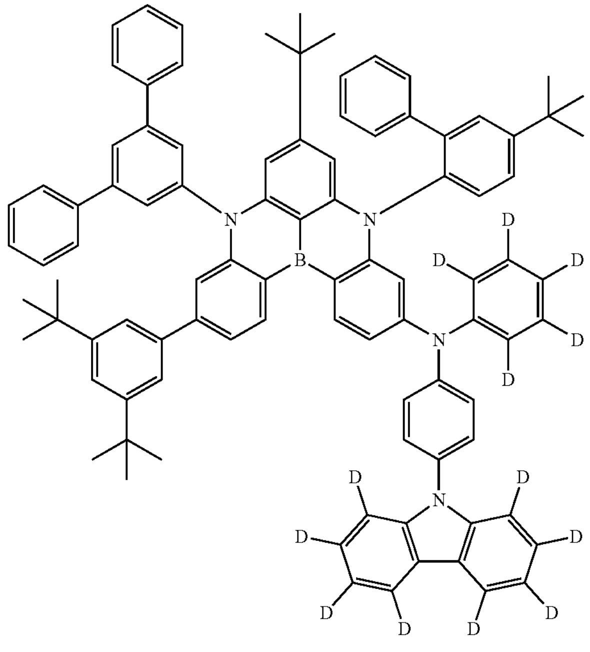

-continued
343
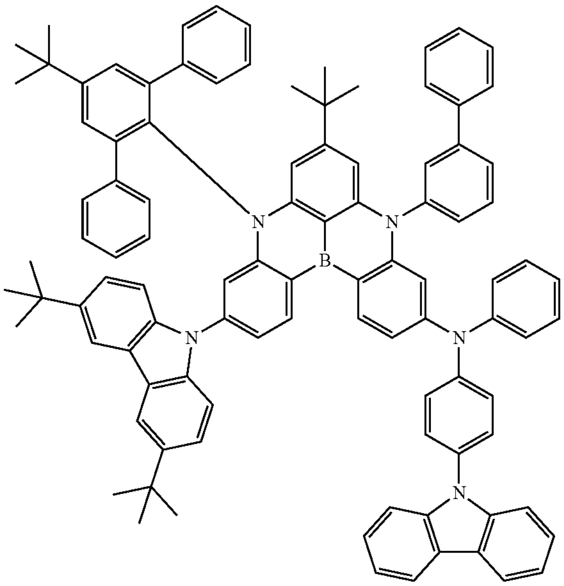
344
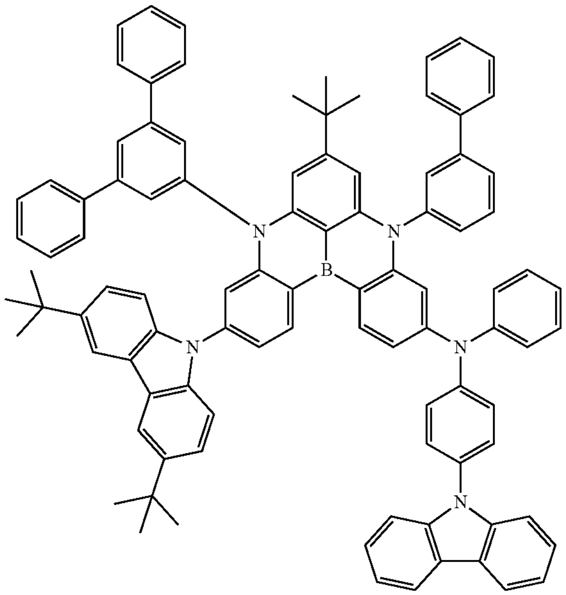
345
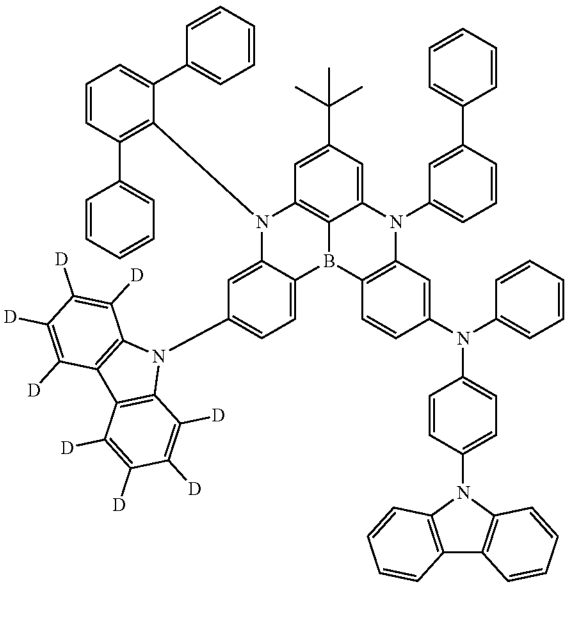
346
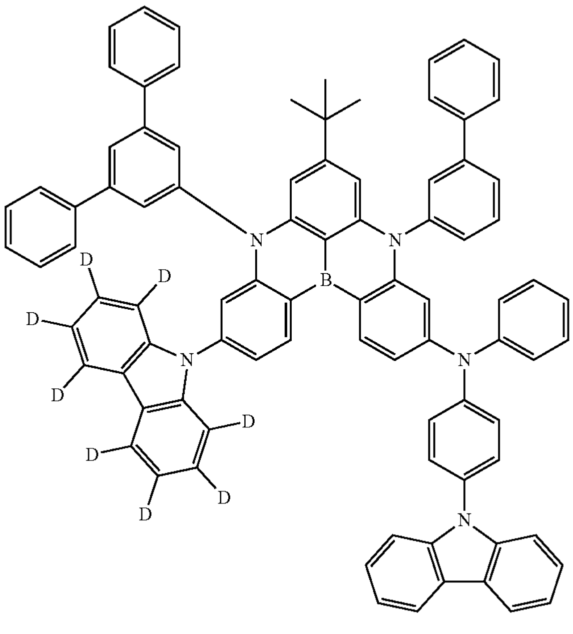

-continued
347
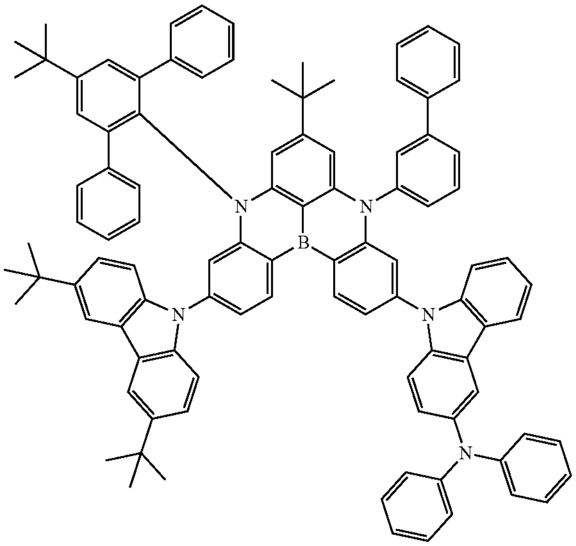
348
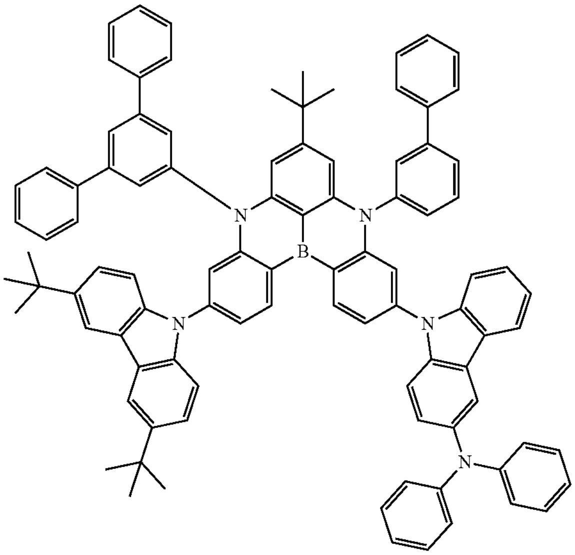
349
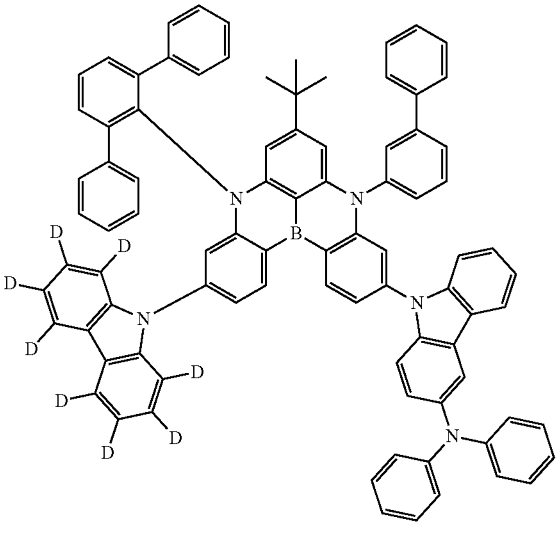
350
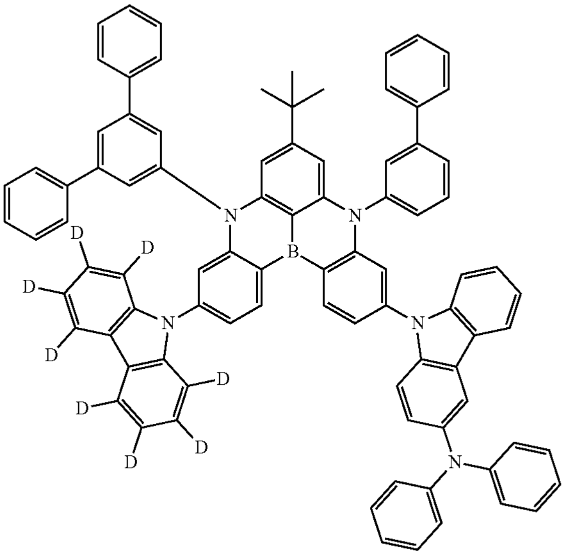

-continued
351
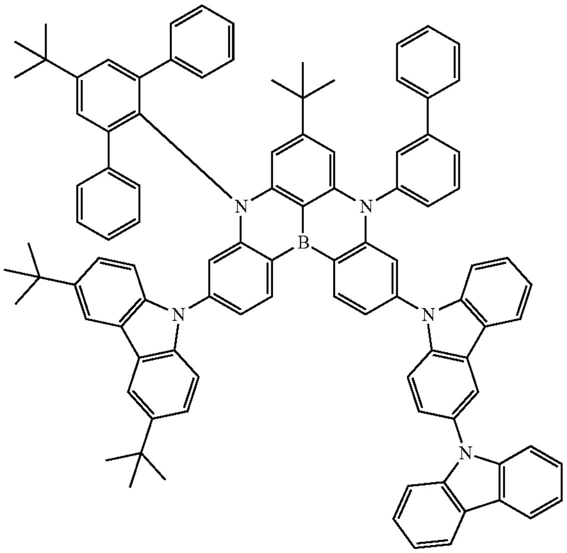
352
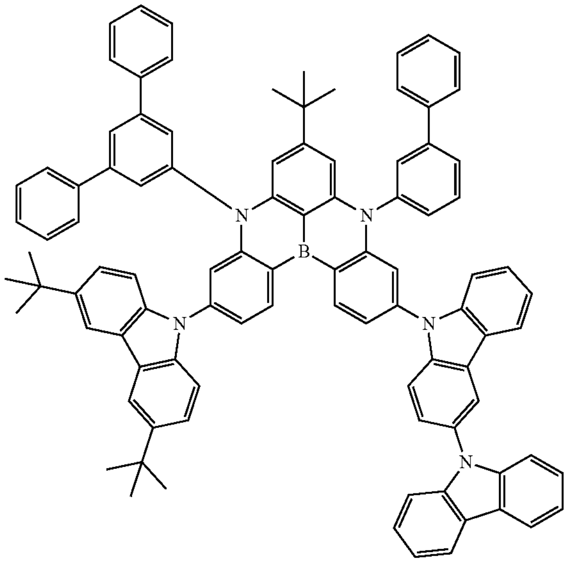
353
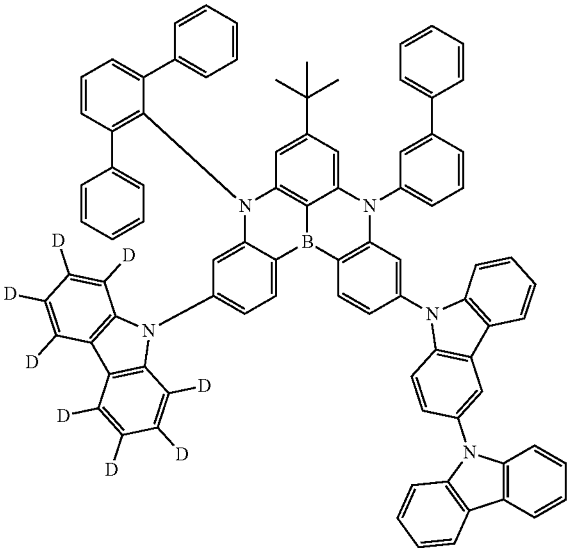
354
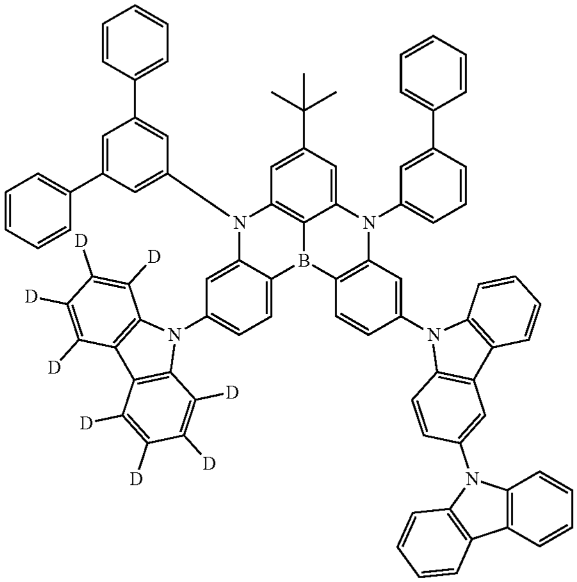

-continued
355
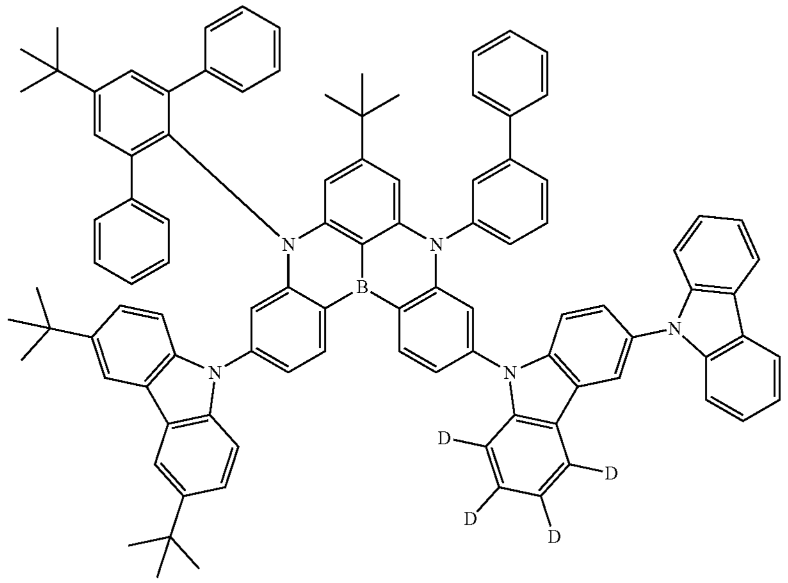
356
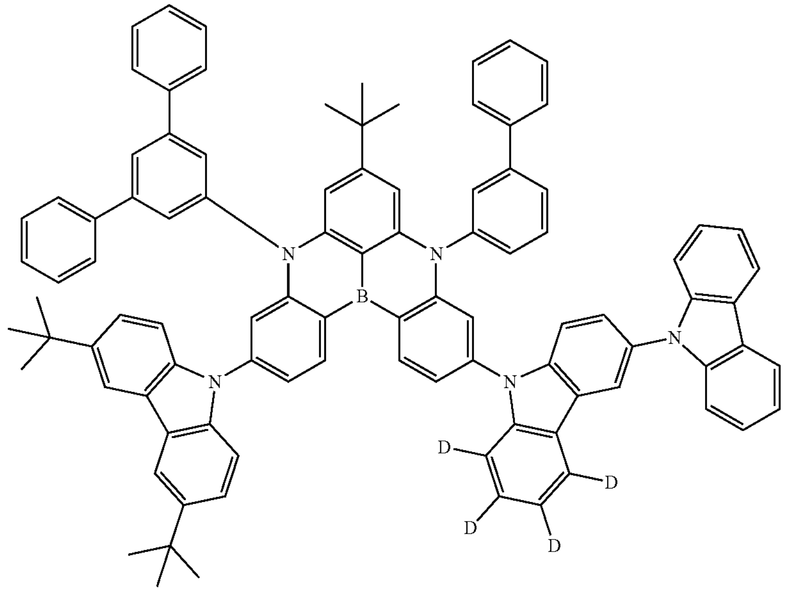

-continued
357
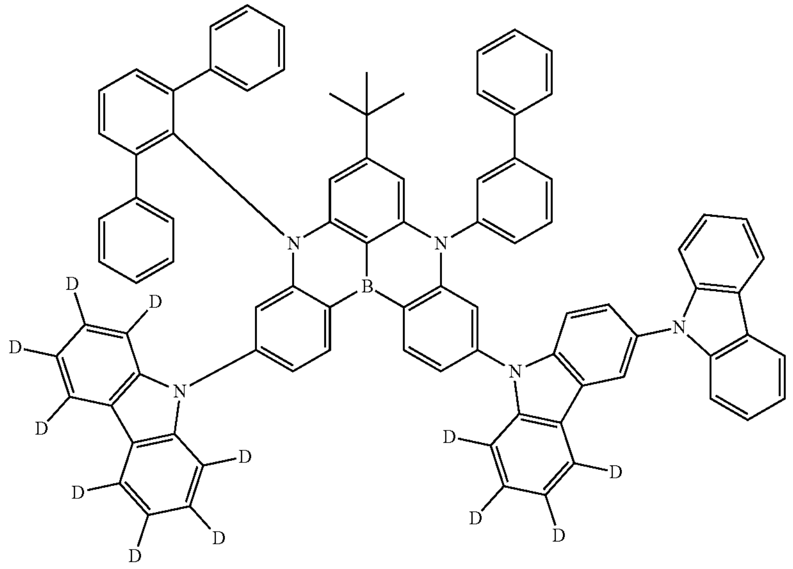
358
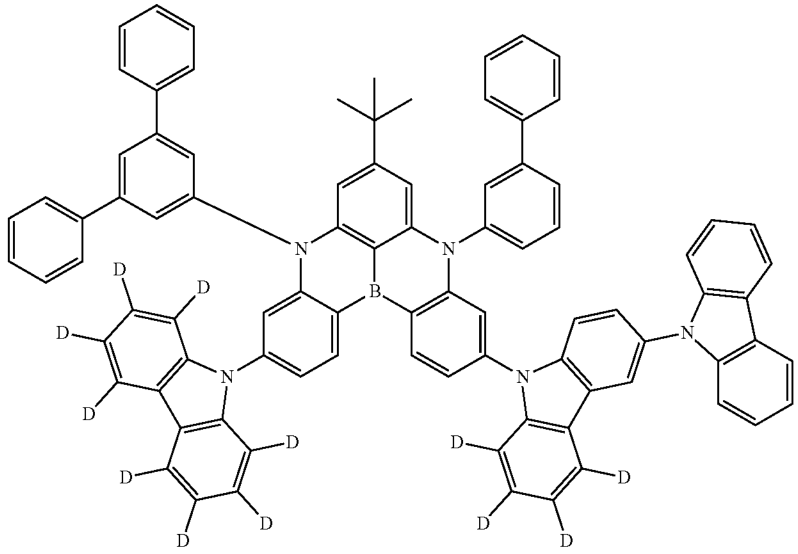
359
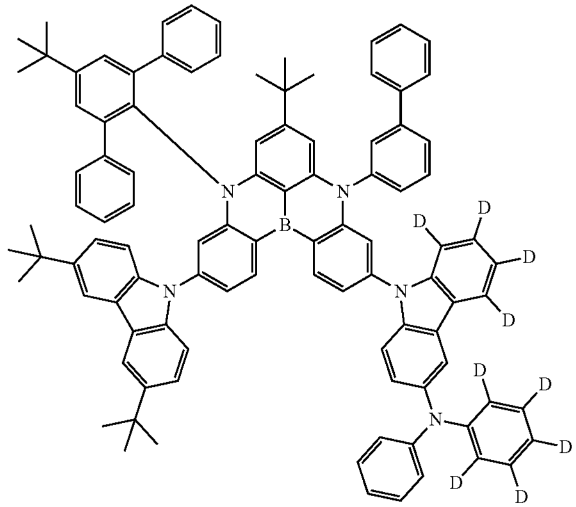
360
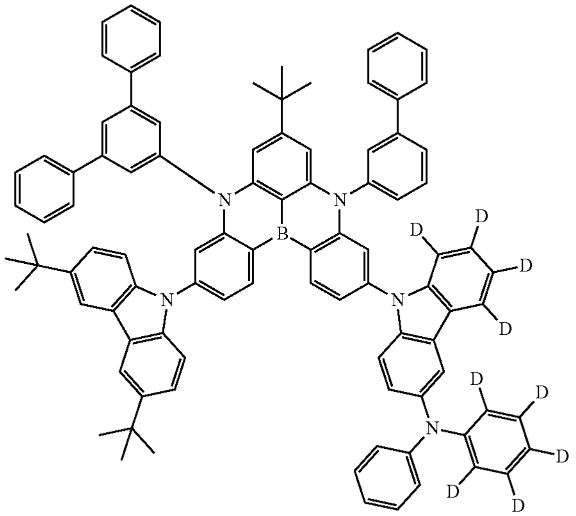

-continued
361
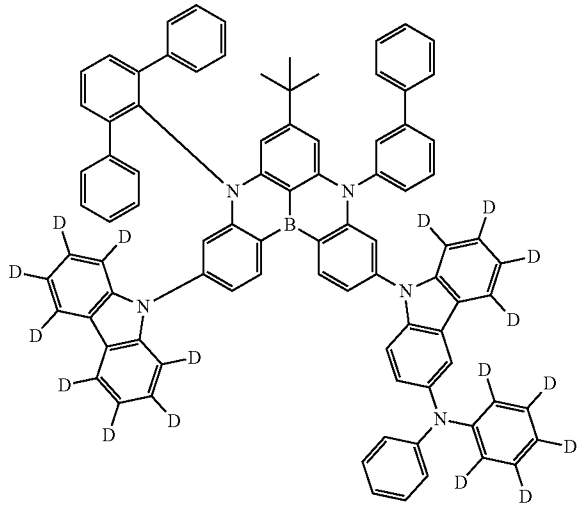
362
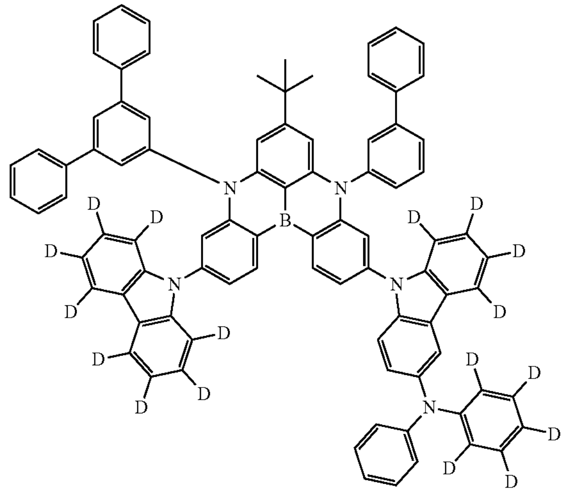
363
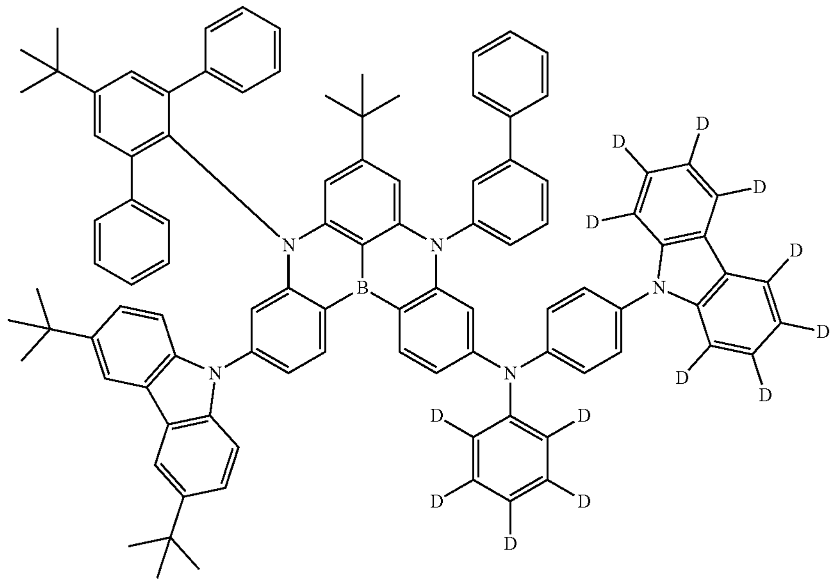

-continued
364
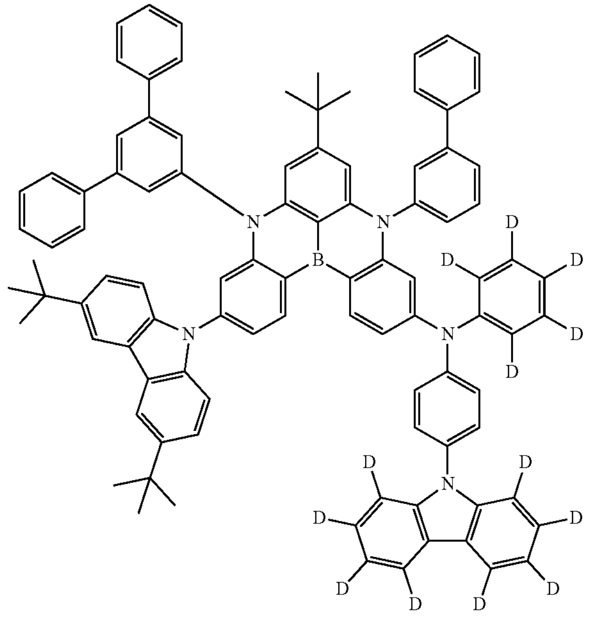
365
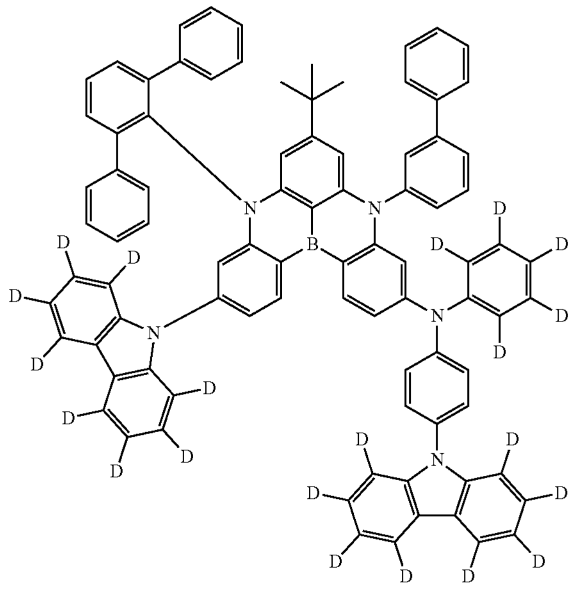
366
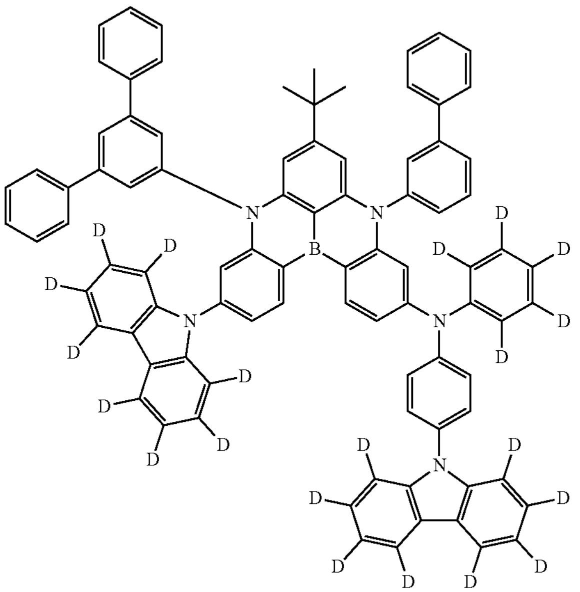

-continued
367
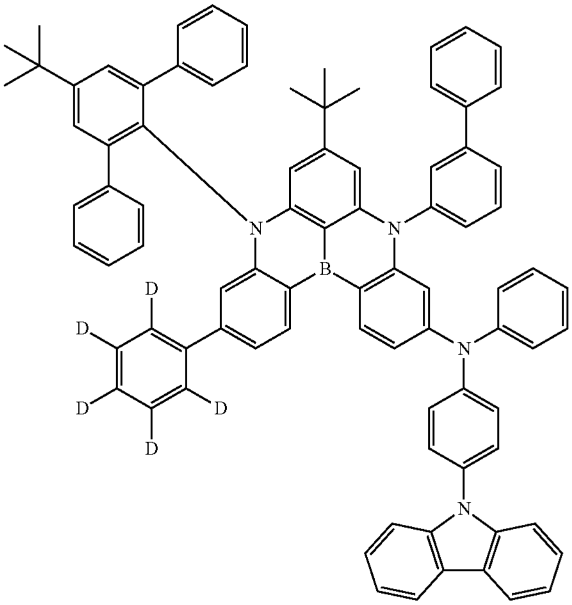
368
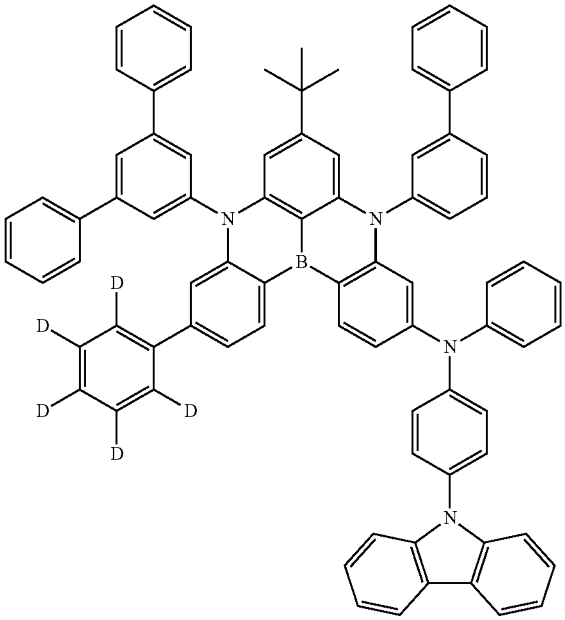
369
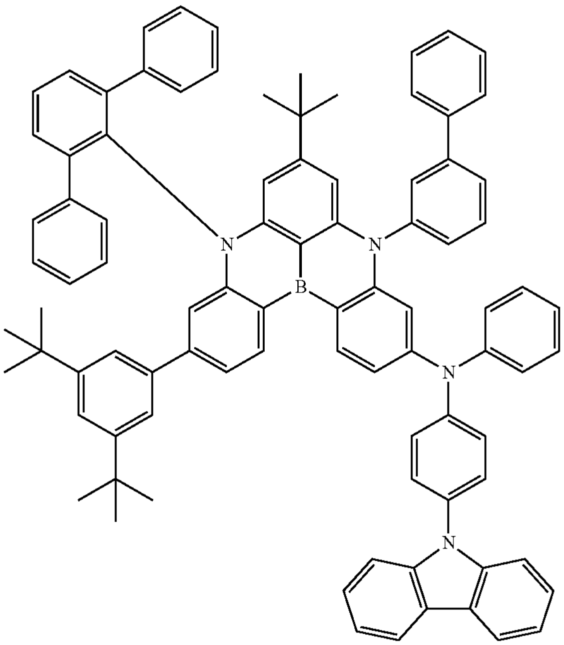
370
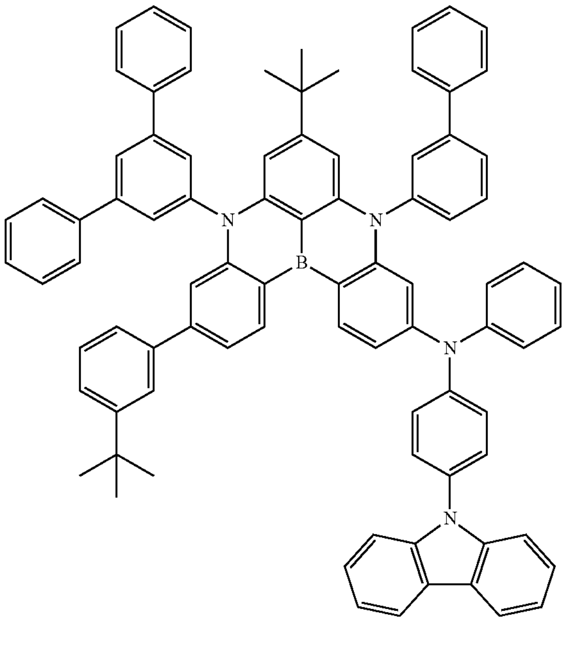

-continued
371
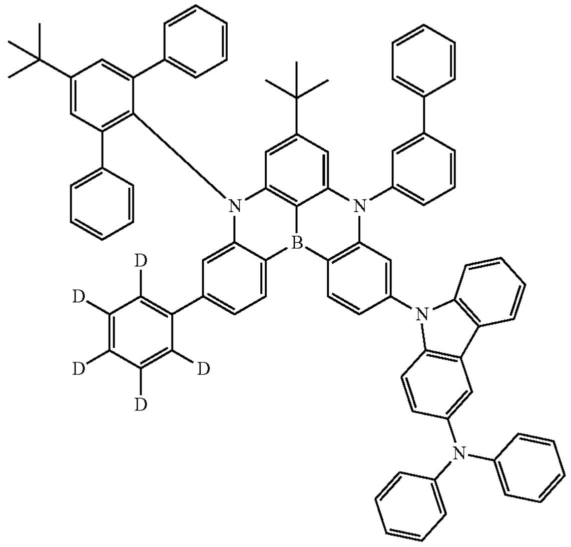
372
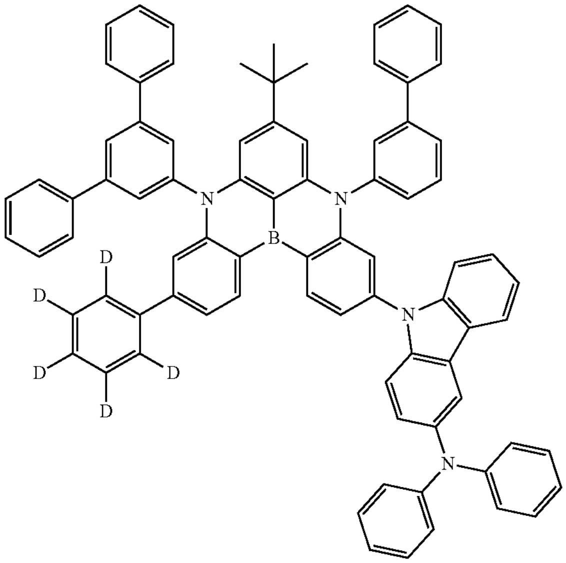
373
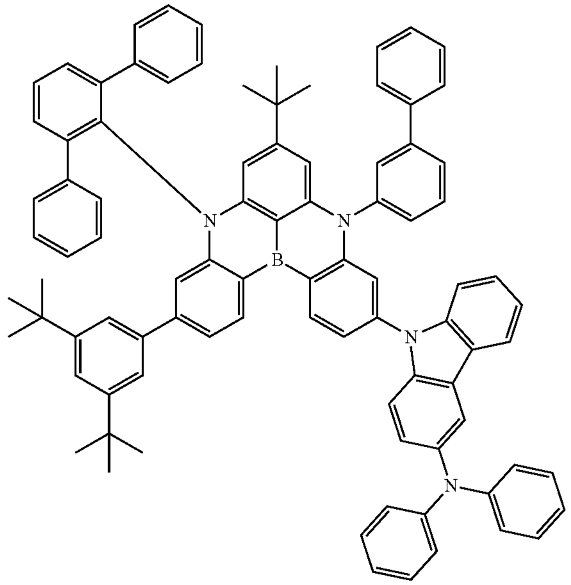
374
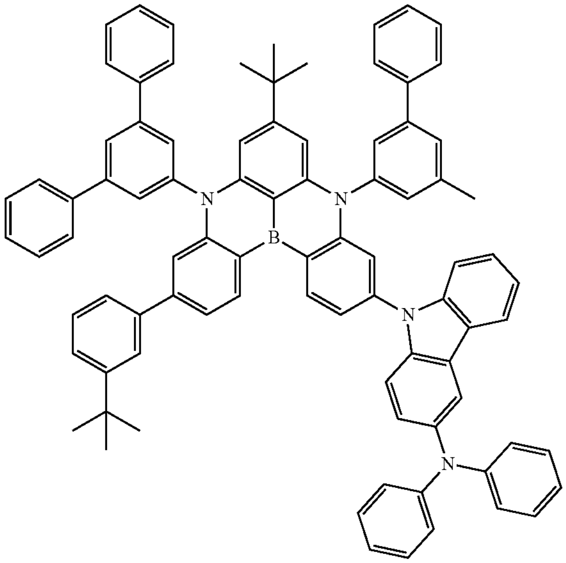

-continued
375
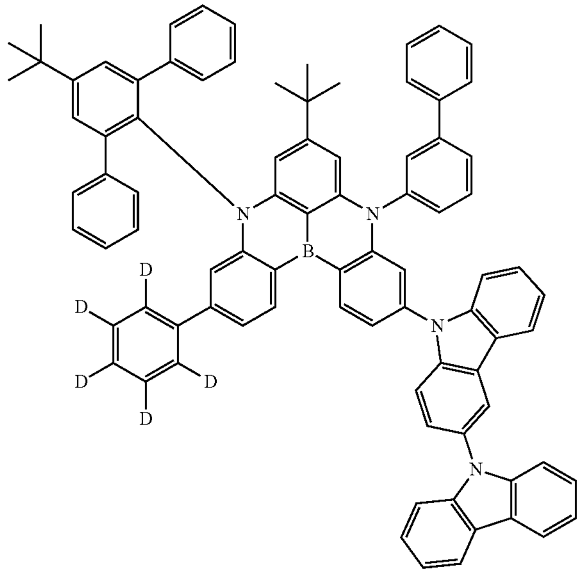
376
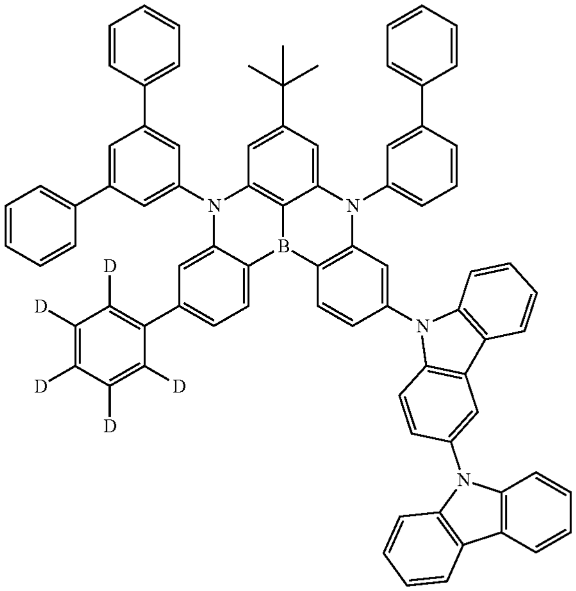
377
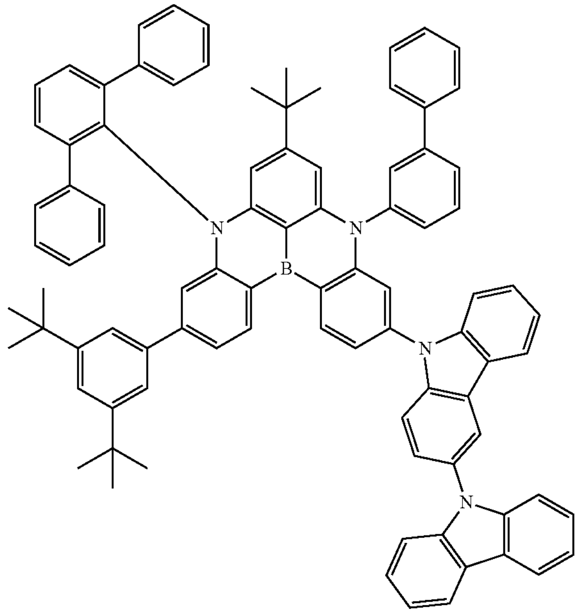
378
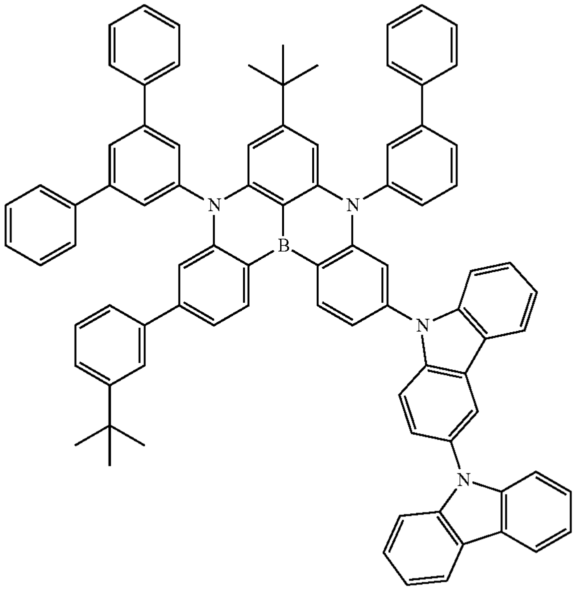

-continued
379
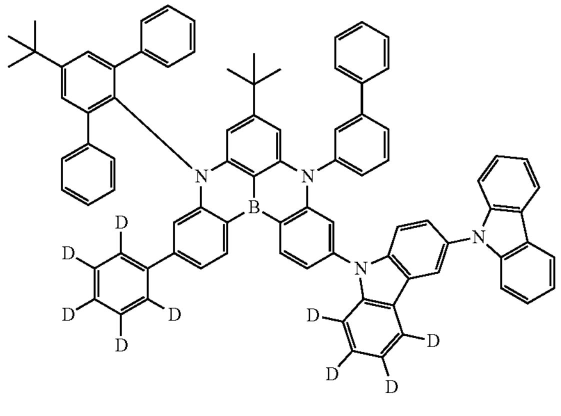
380
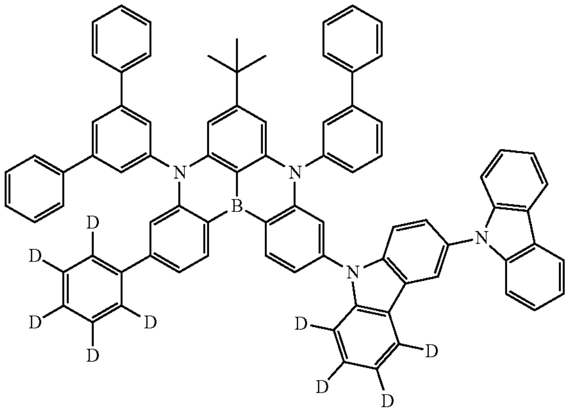
381
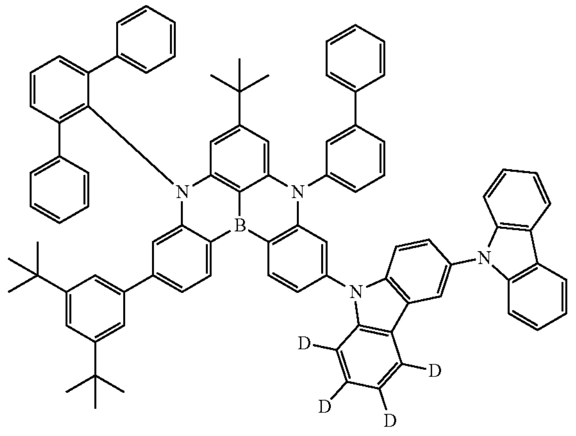
382
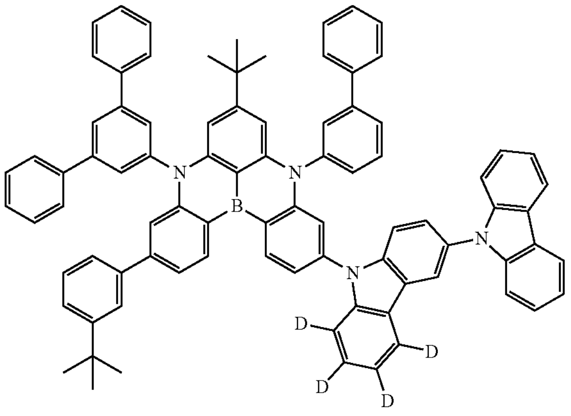
383
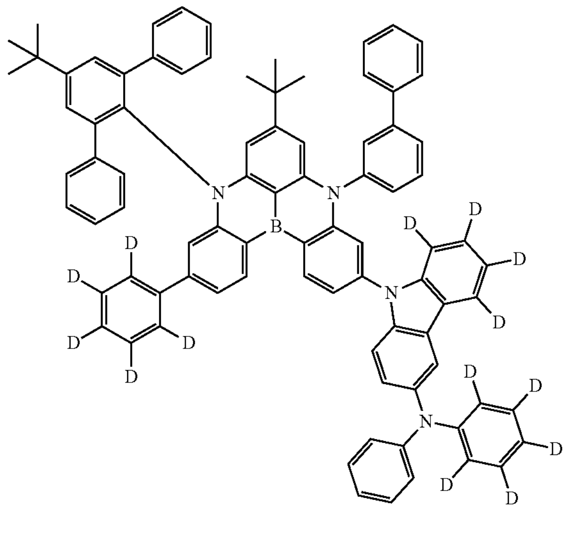
384
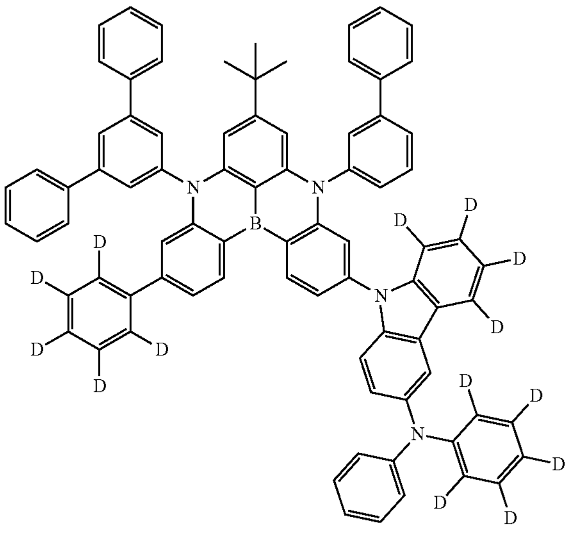

-continued
385
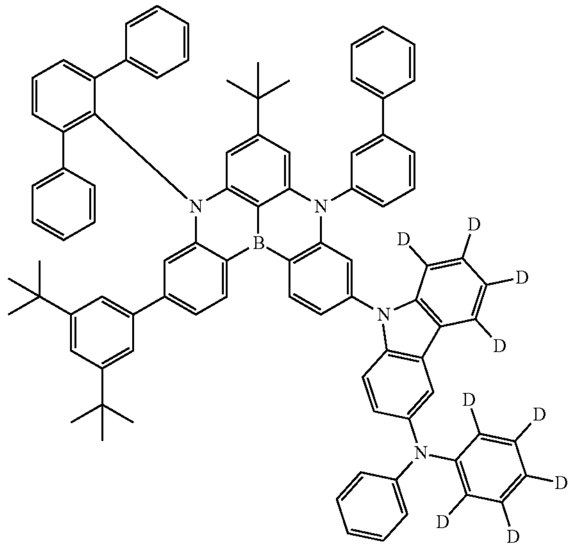
386
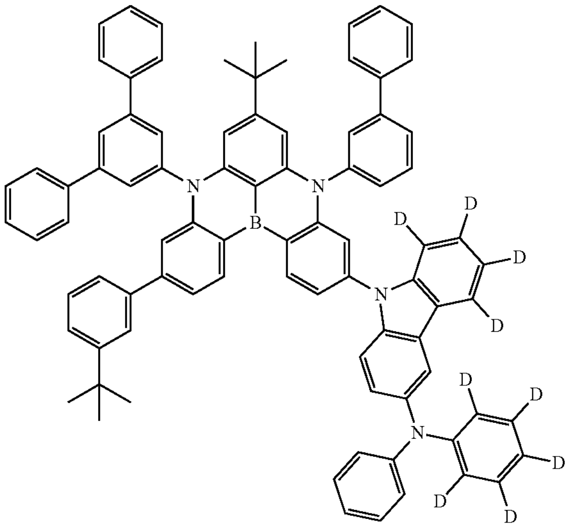
387
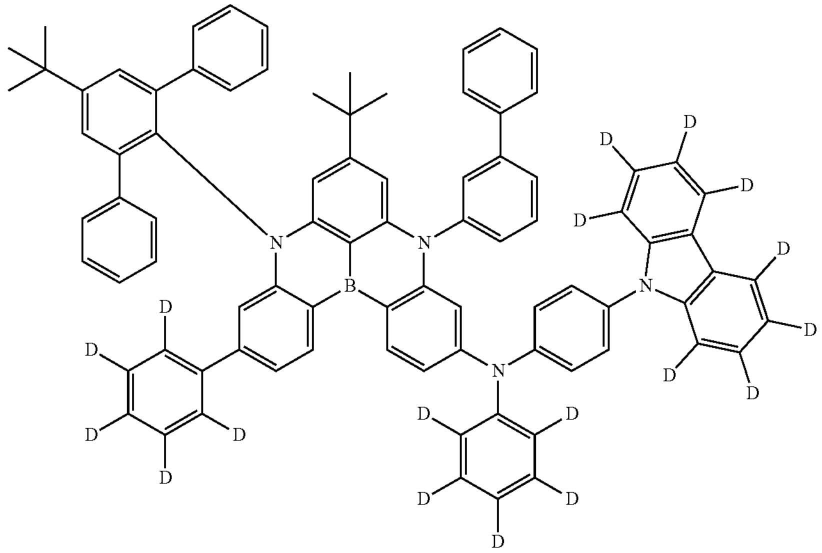

-continued
388
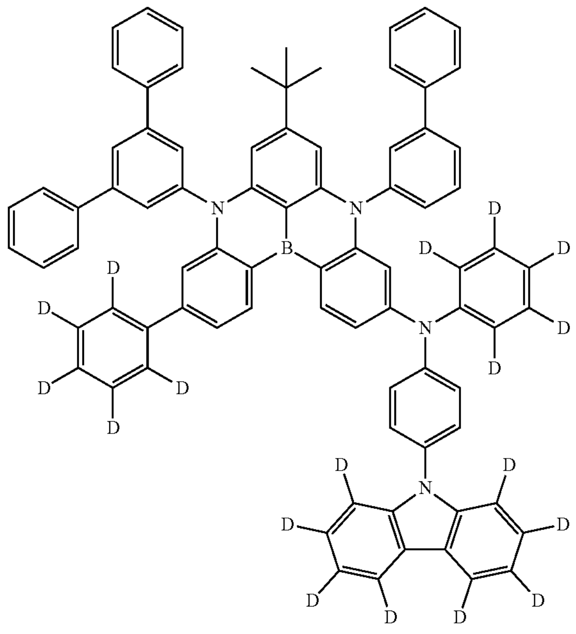
389
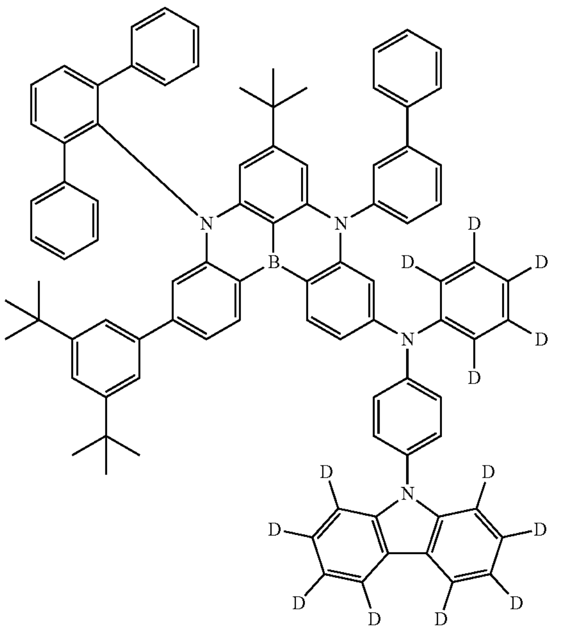
390
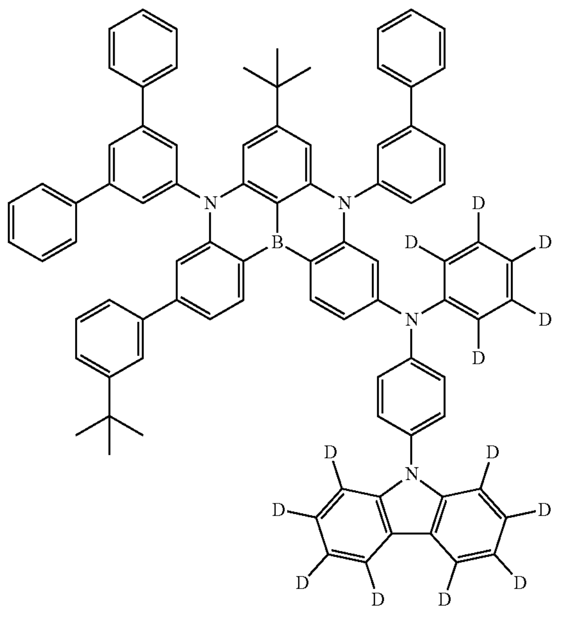
391
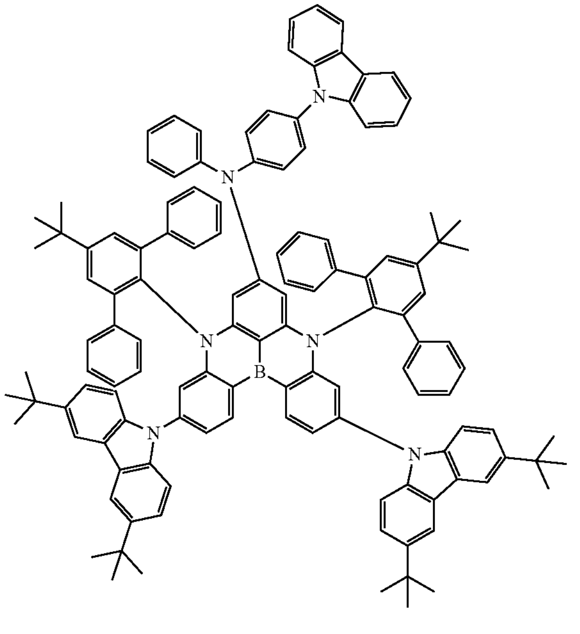

-continued
392
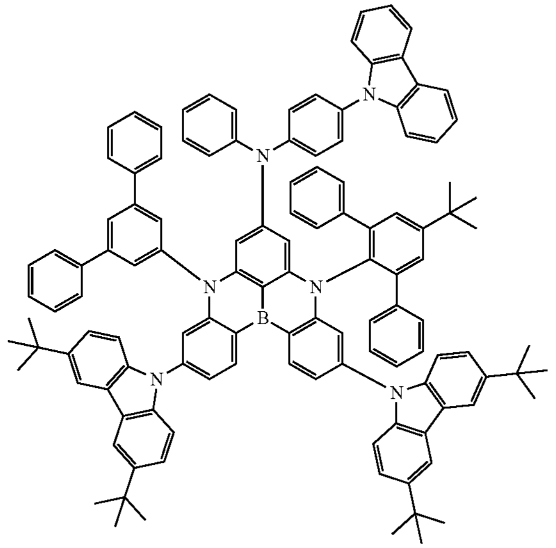
393
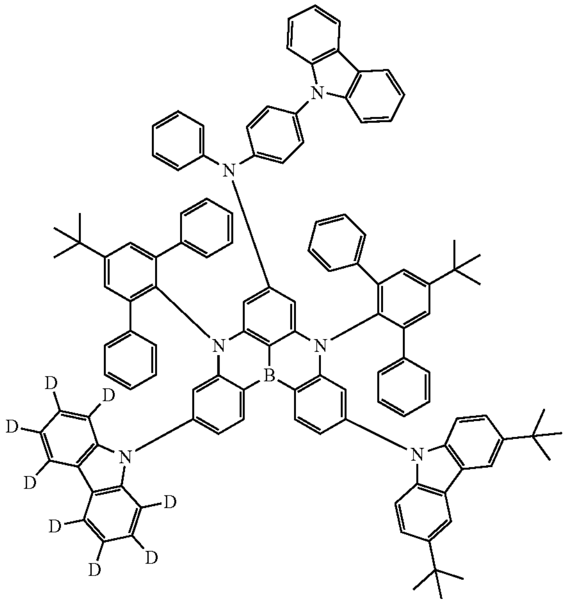
394
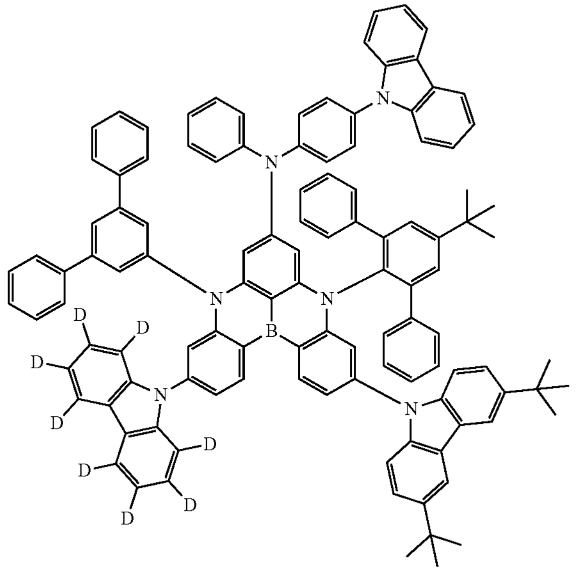
395
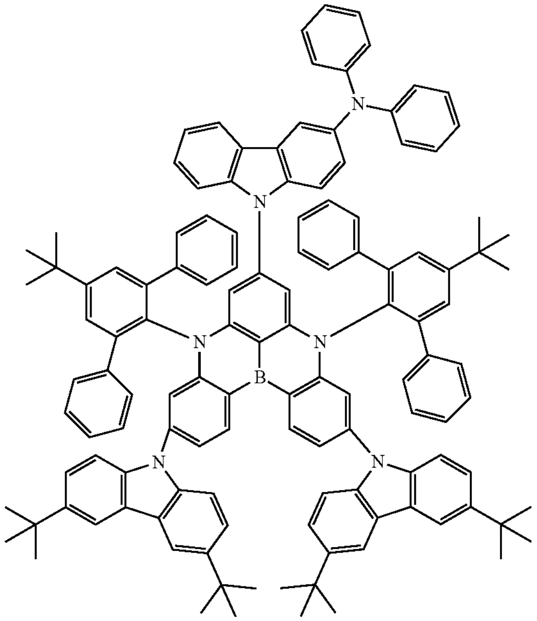

-continued
396
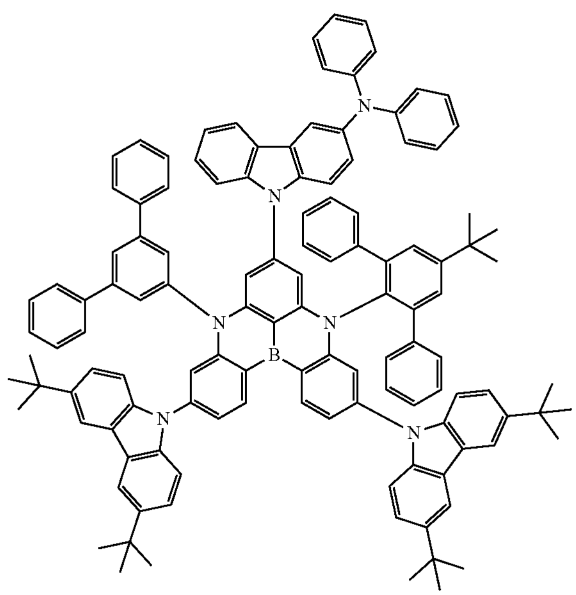
397
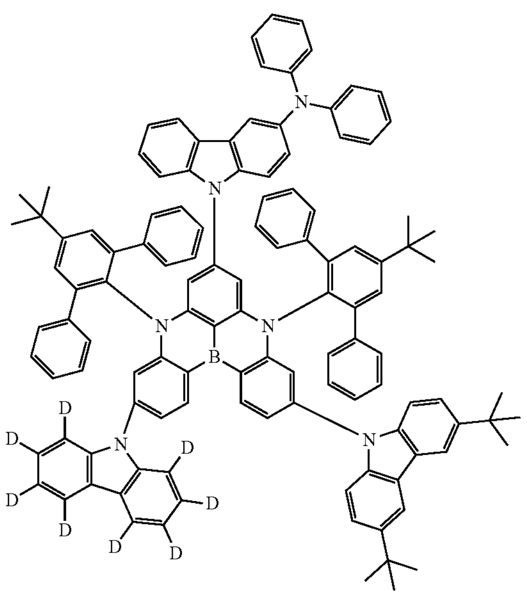
398
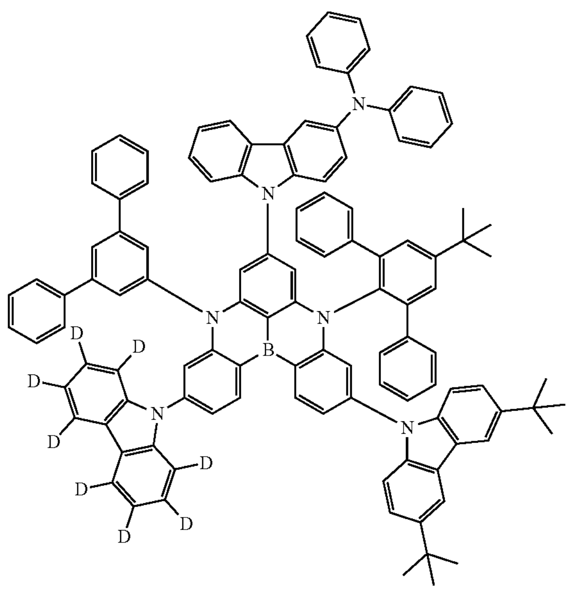
399
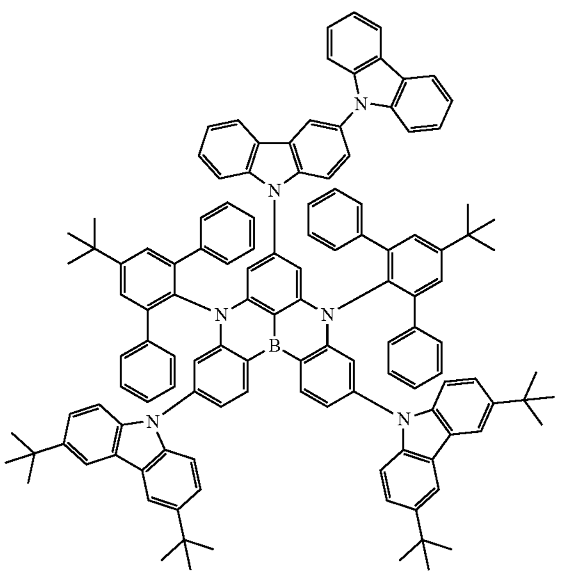

-continued
400
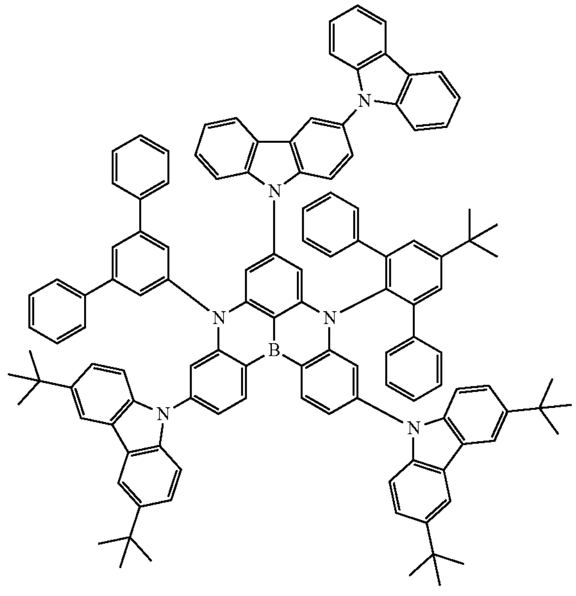
401
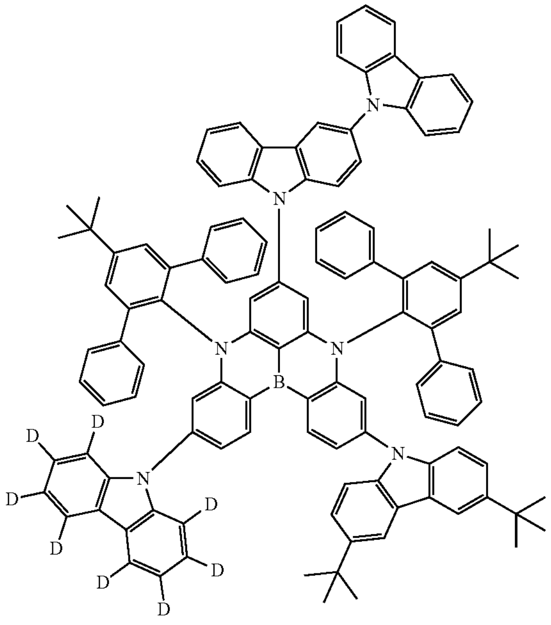
402
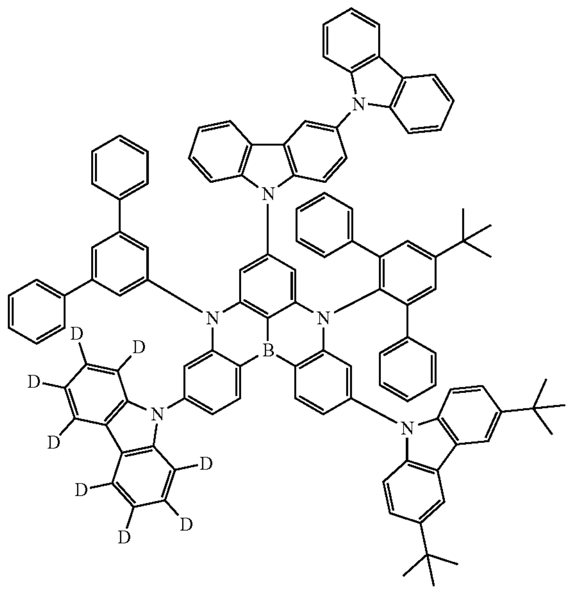
403
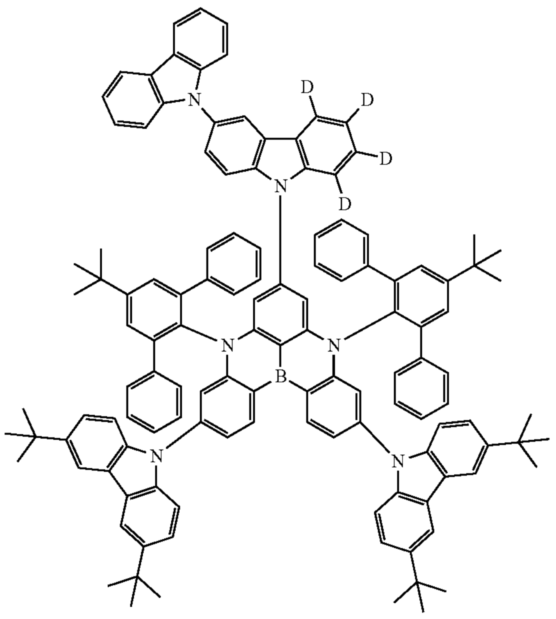

-continued
404
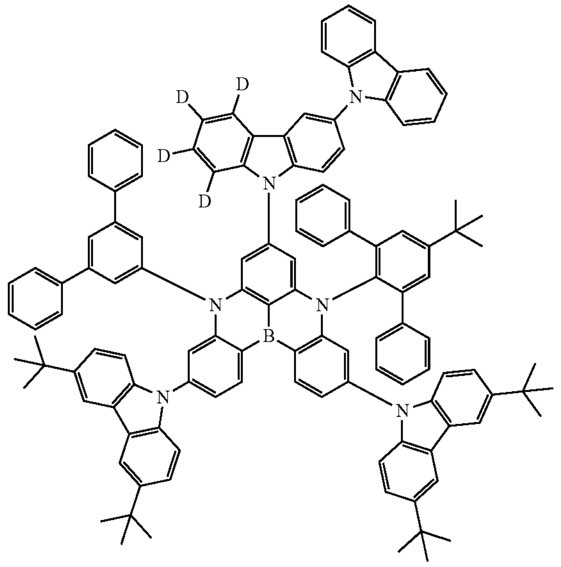
405
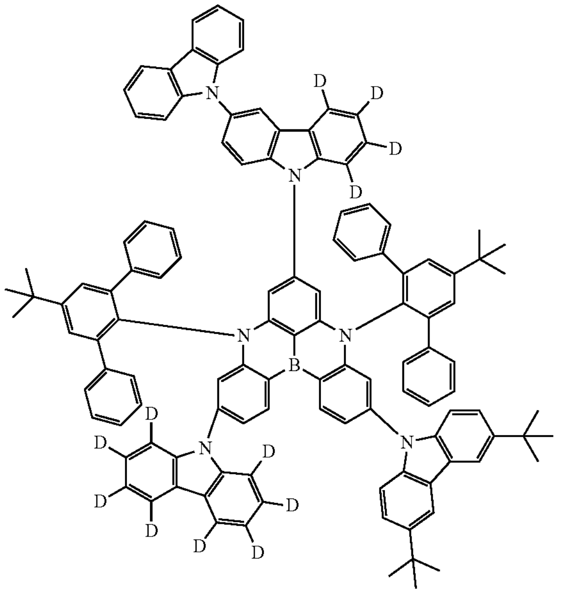
407
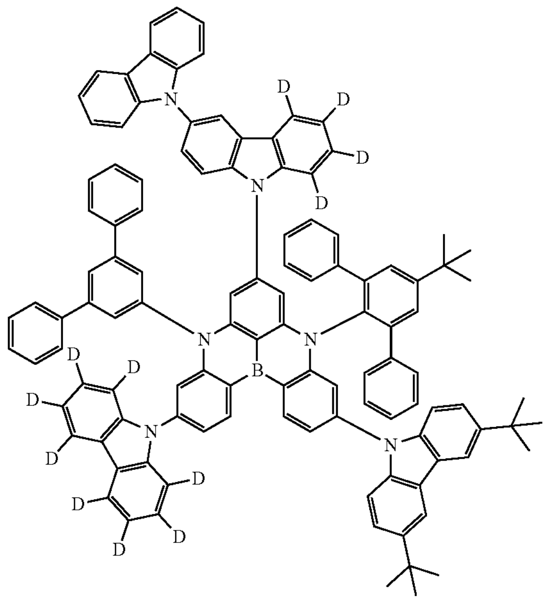
408
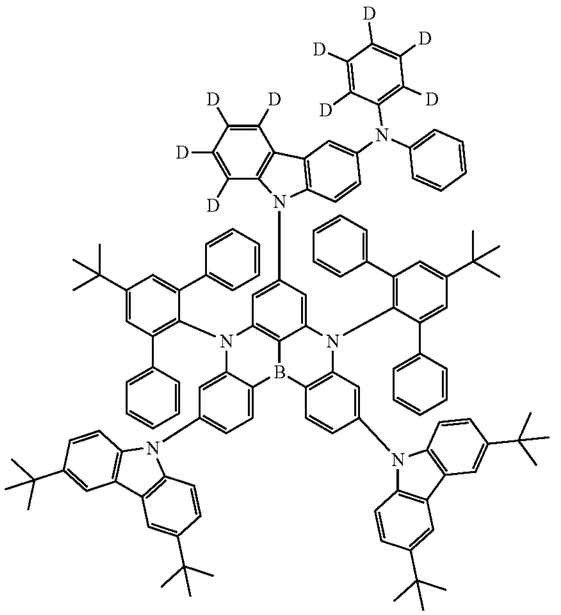

-continued
408
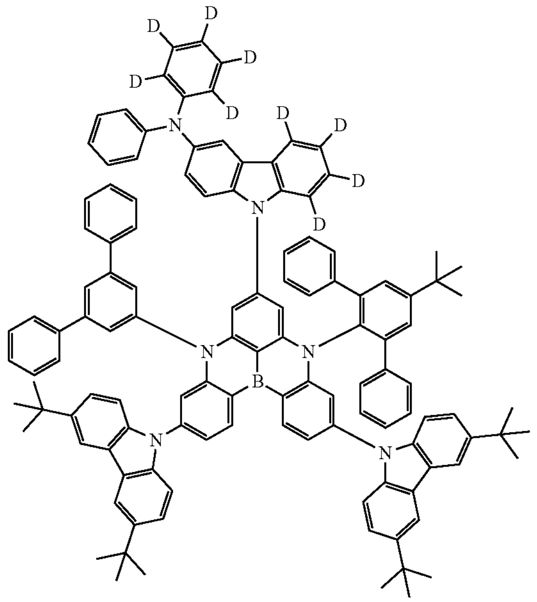
409
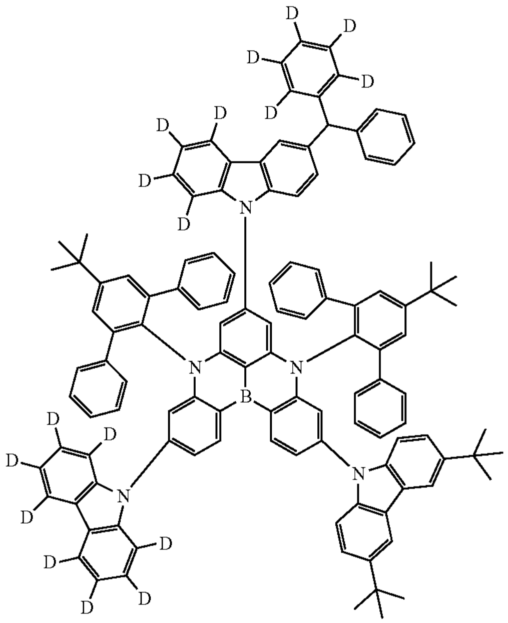
410
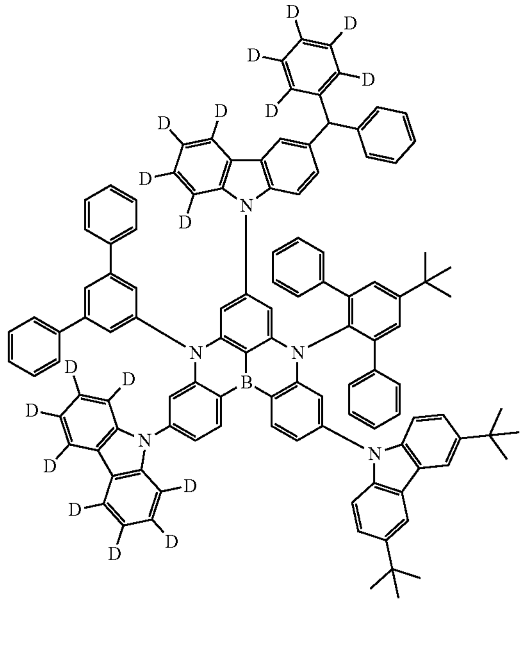
411
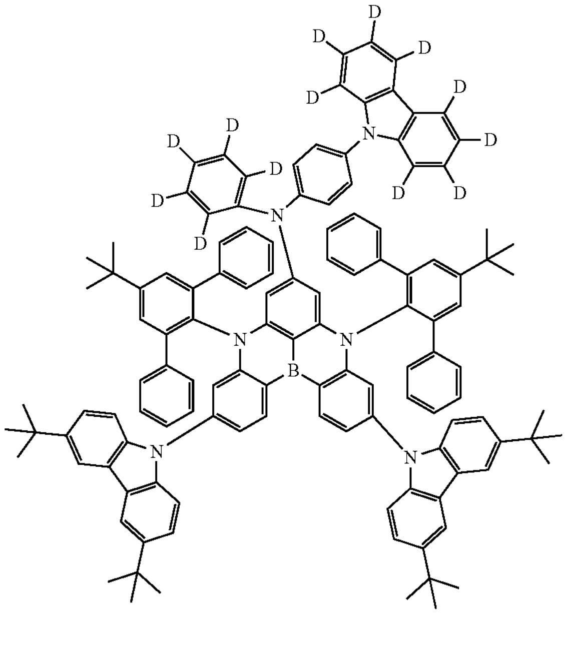

-continued
412
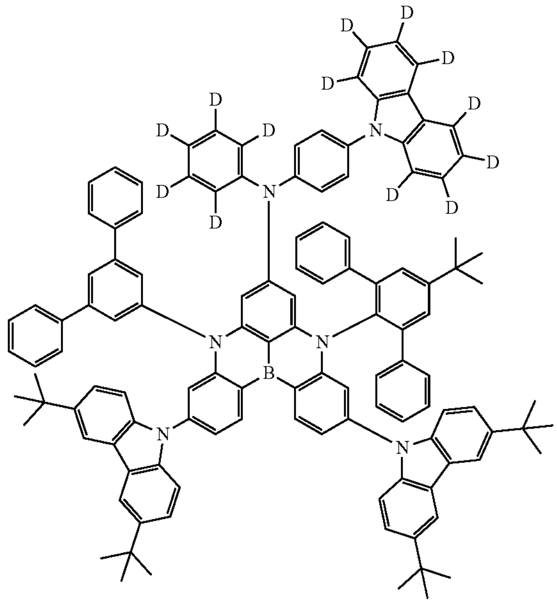
413
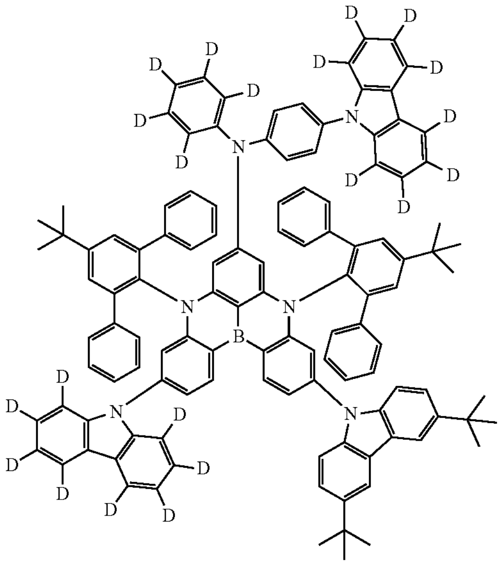
414
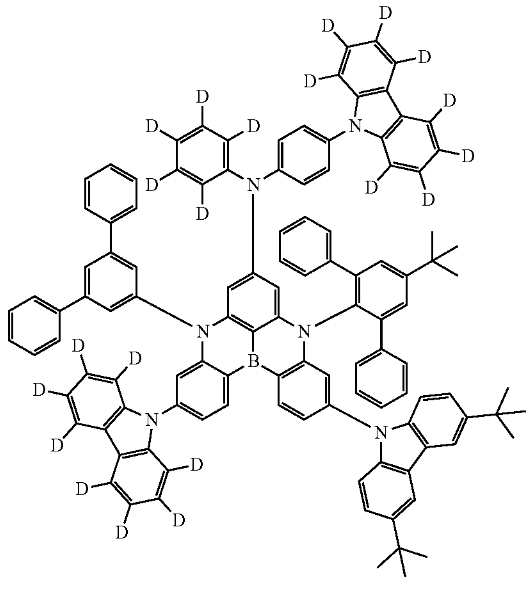
415
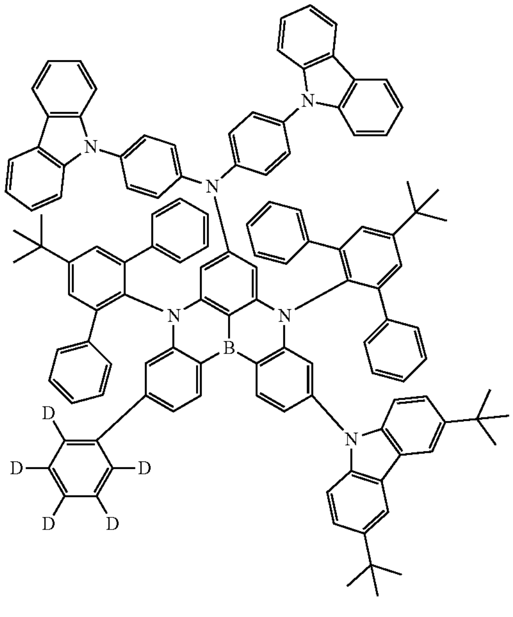

-continued
416
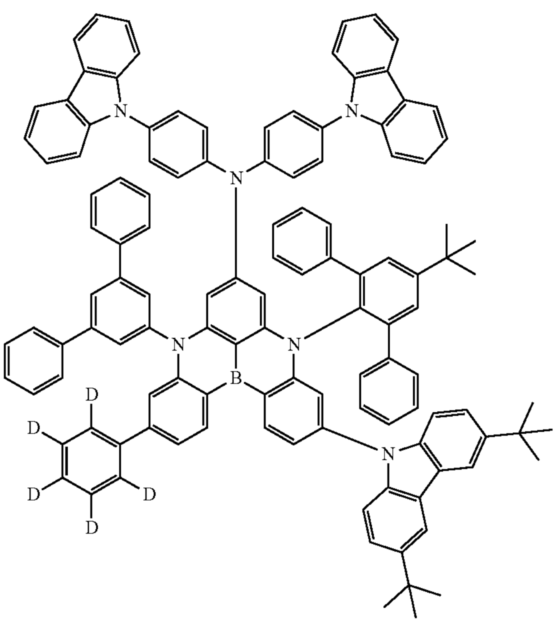
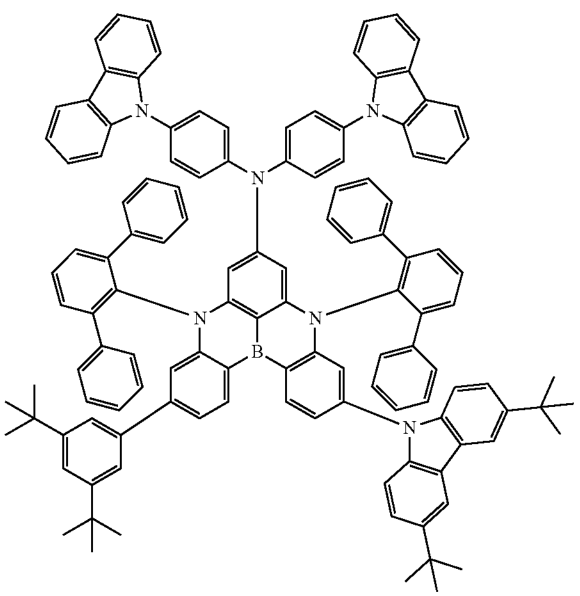
418
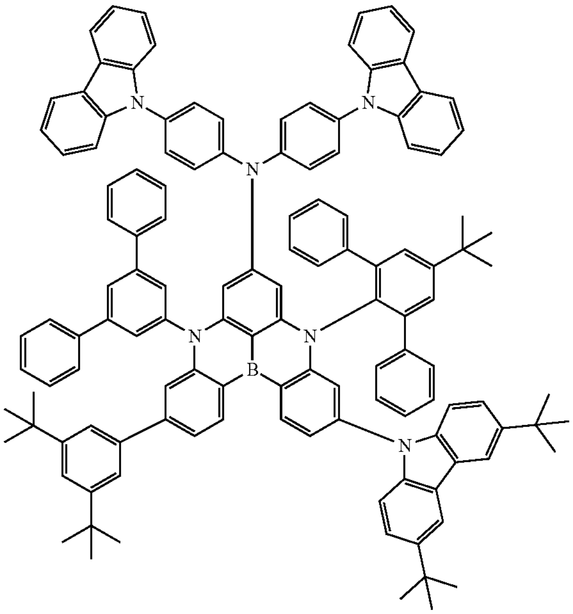
419
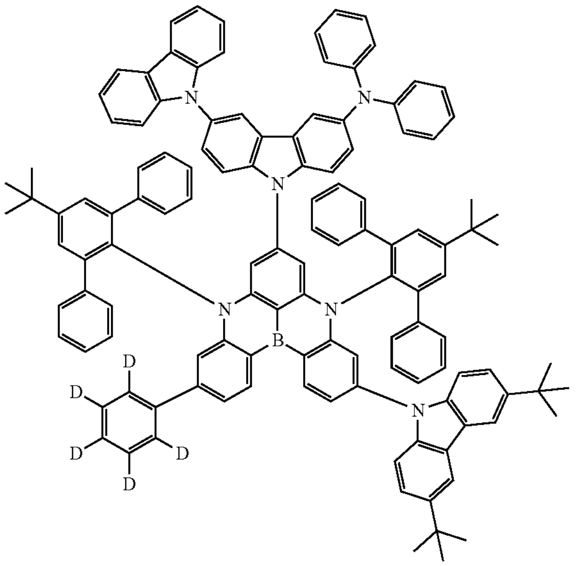

-continued
420
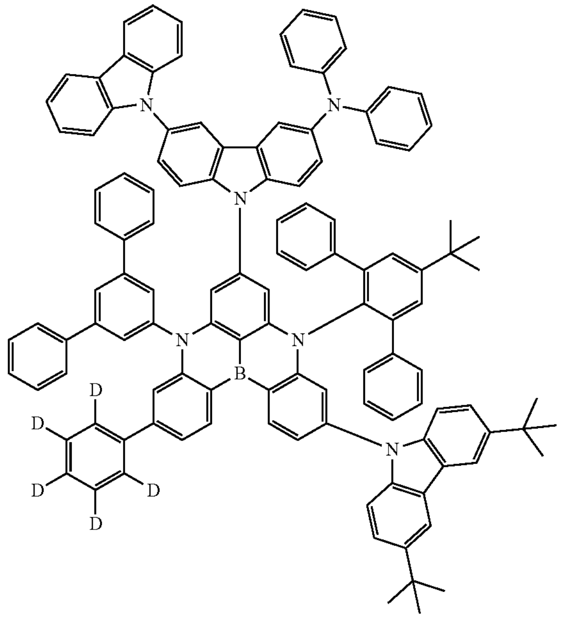
421
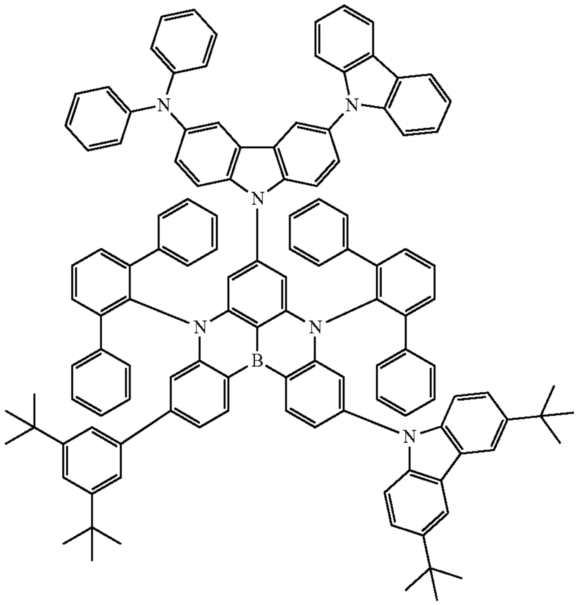
422
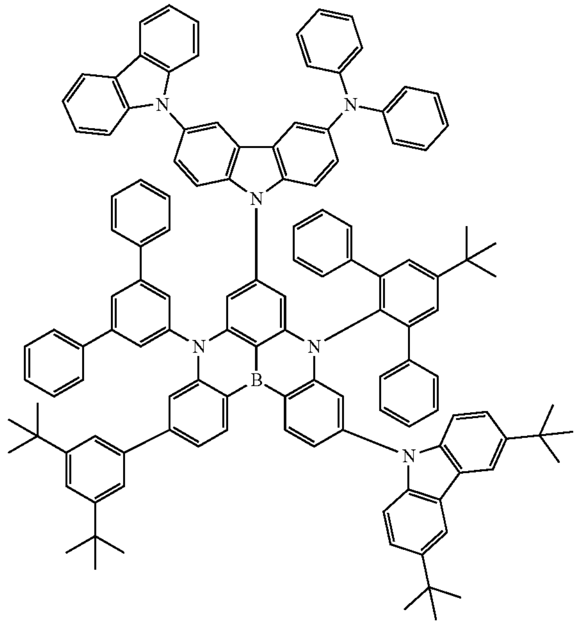
423
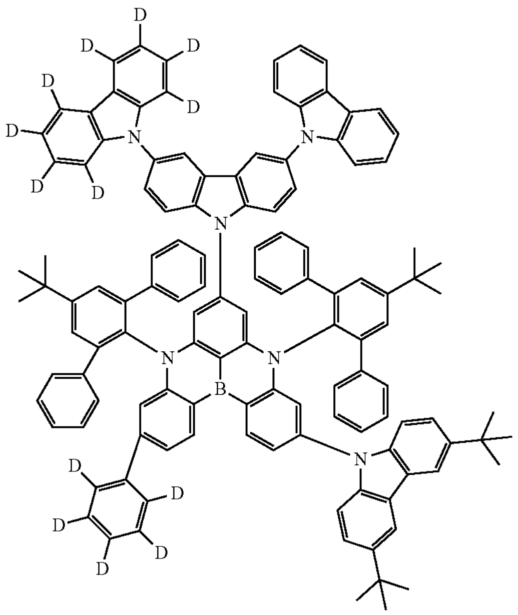

-continued
424
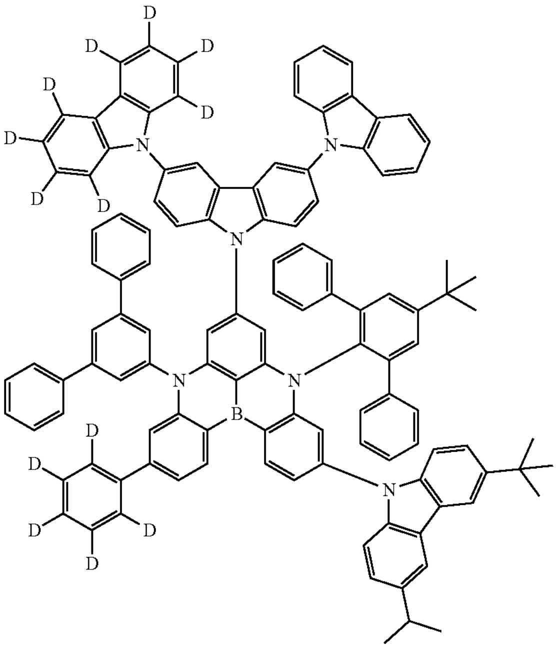
425
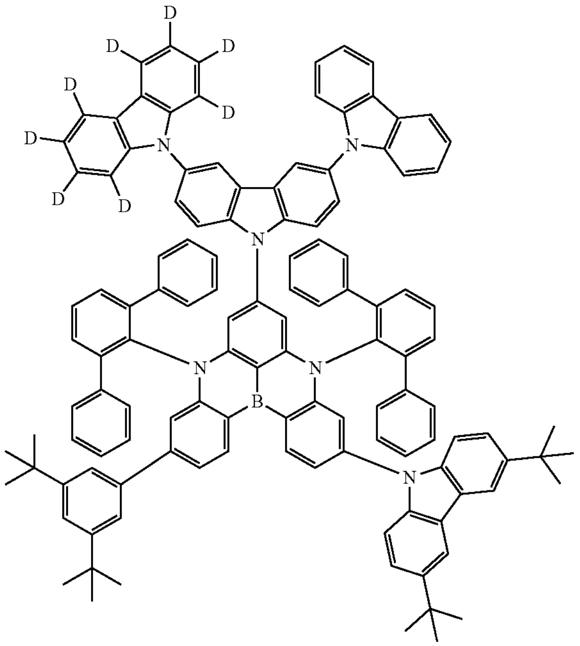
426
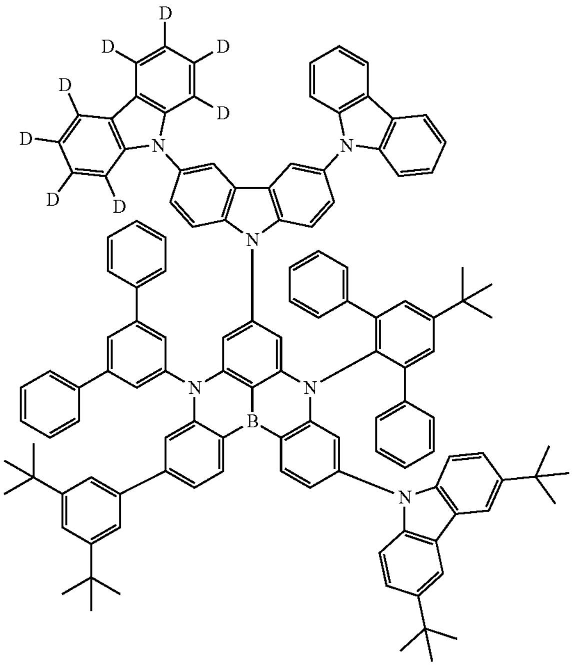
427
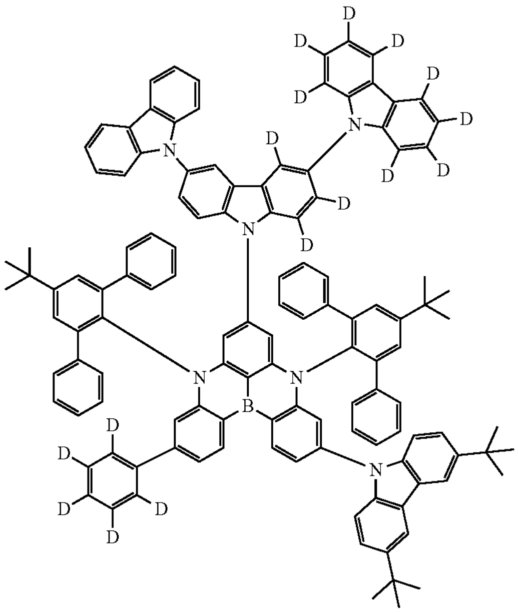

-continued
428
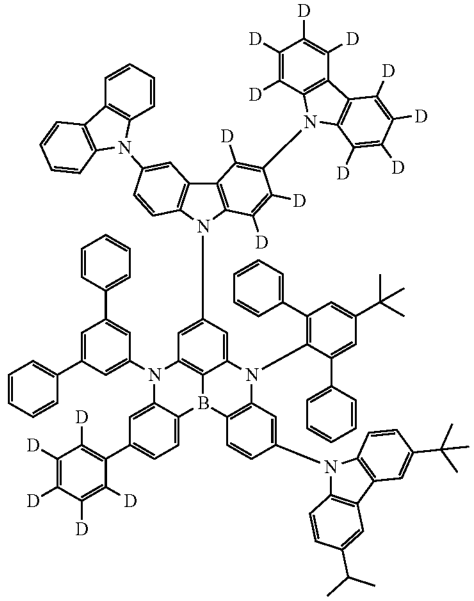
429
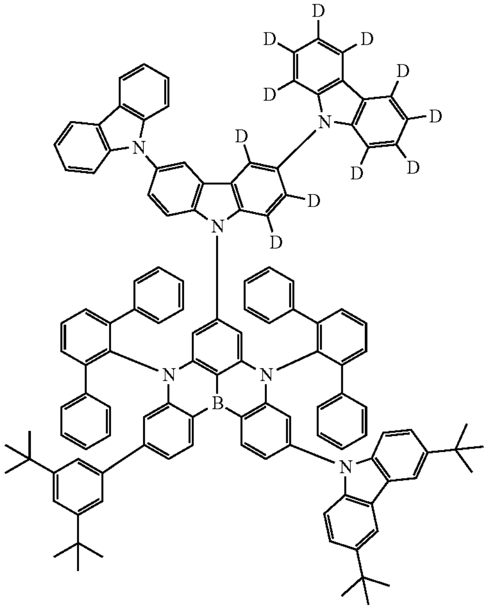
430
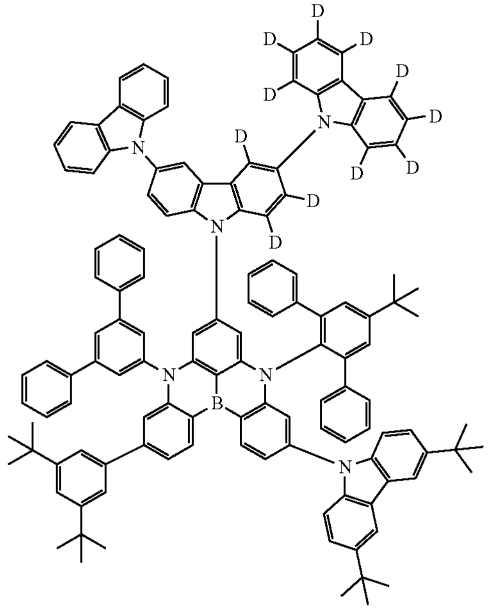
431
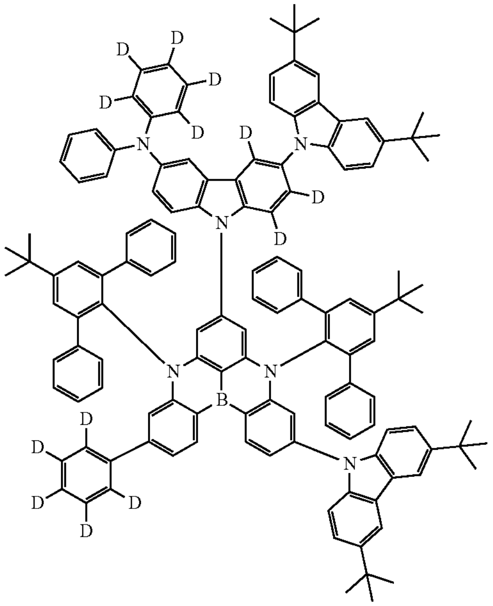

-continued
432
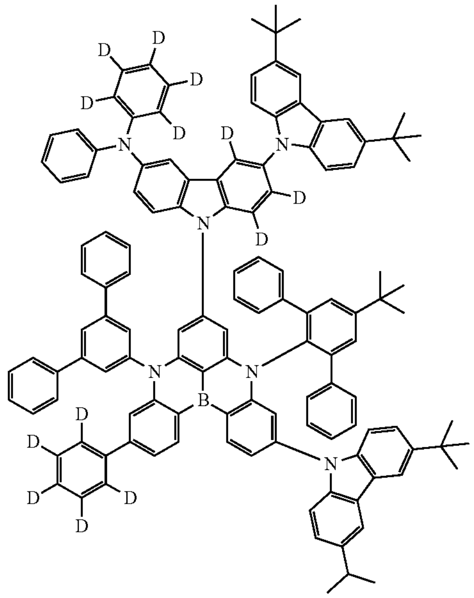
433
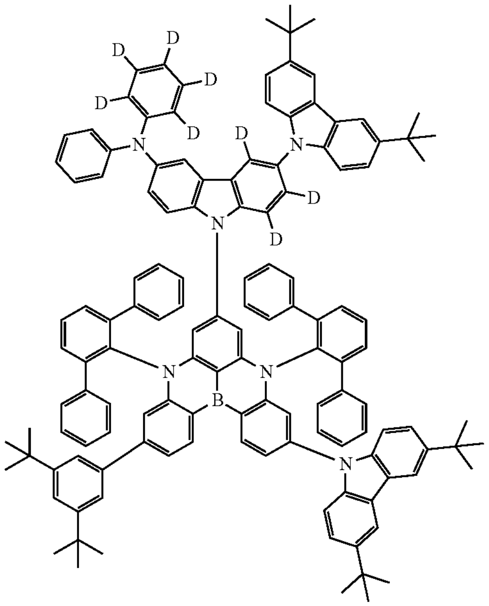
434
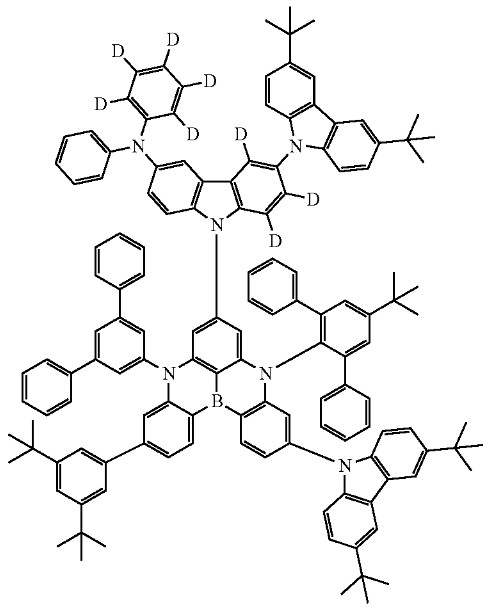
435
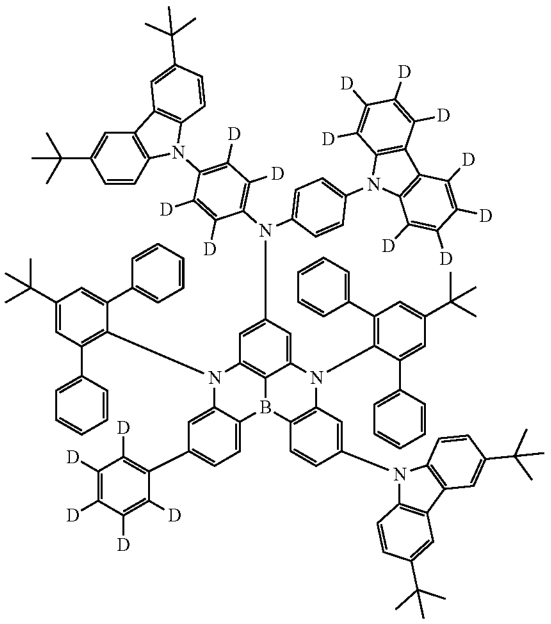

-continued
436
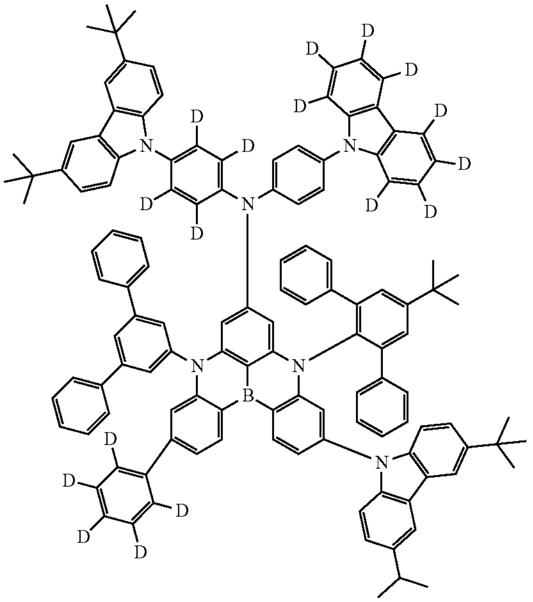
437
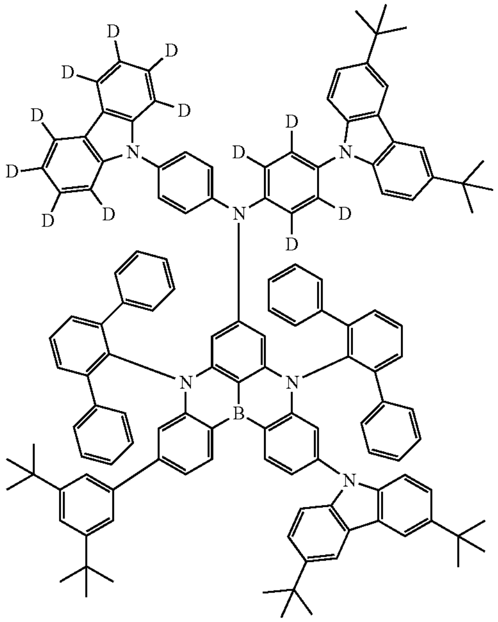
438
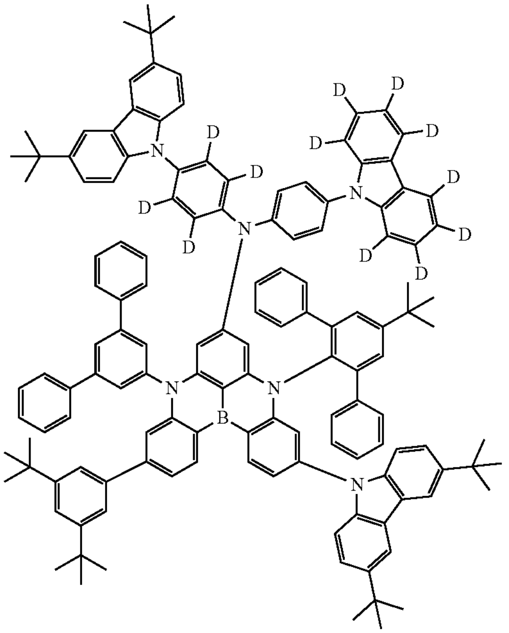
439
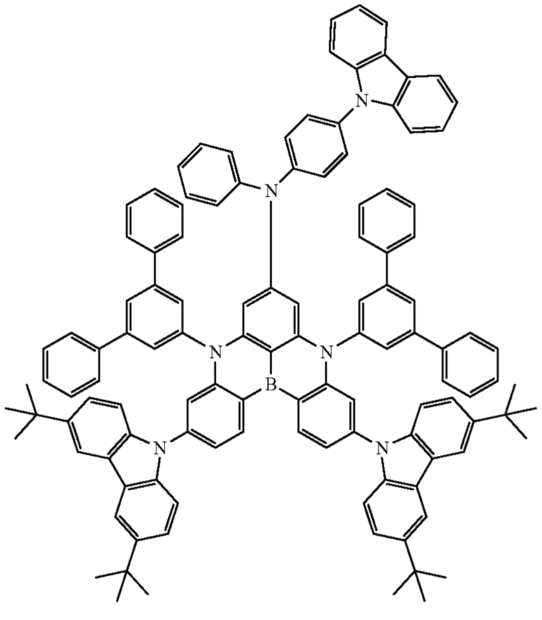

-continued
440
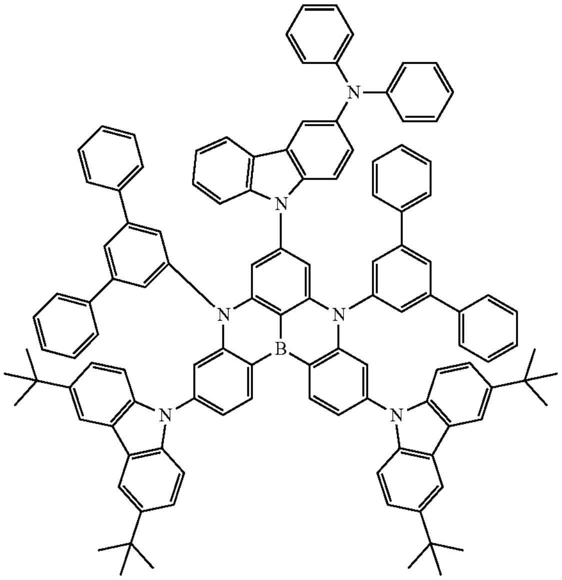
441
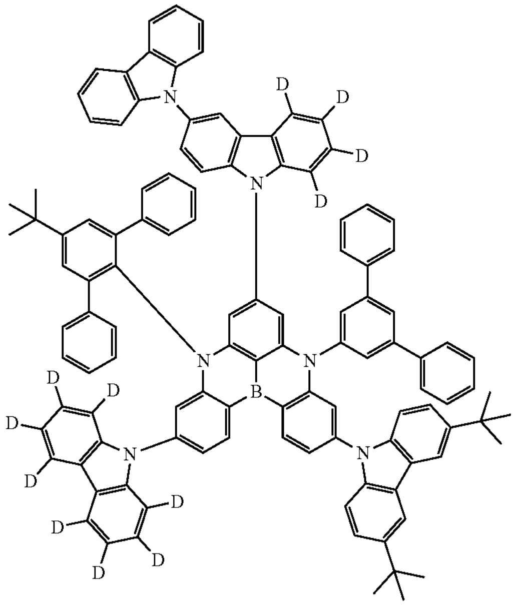
442
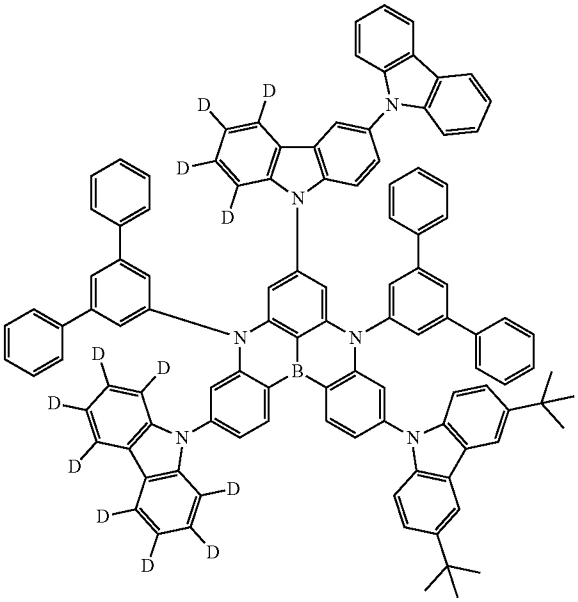
443
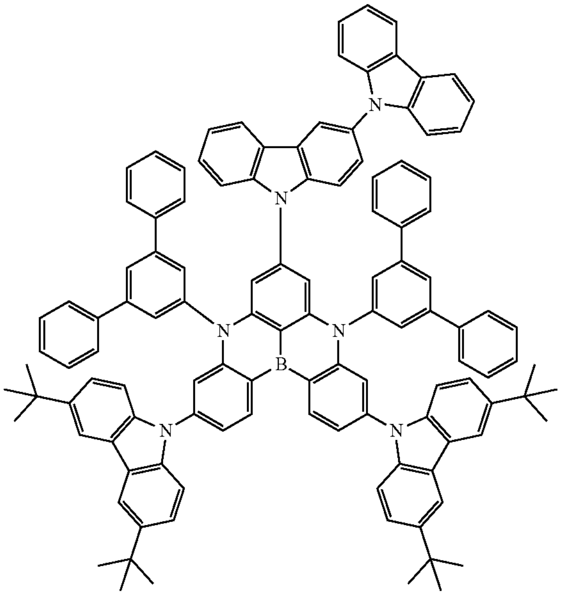

-continued
444
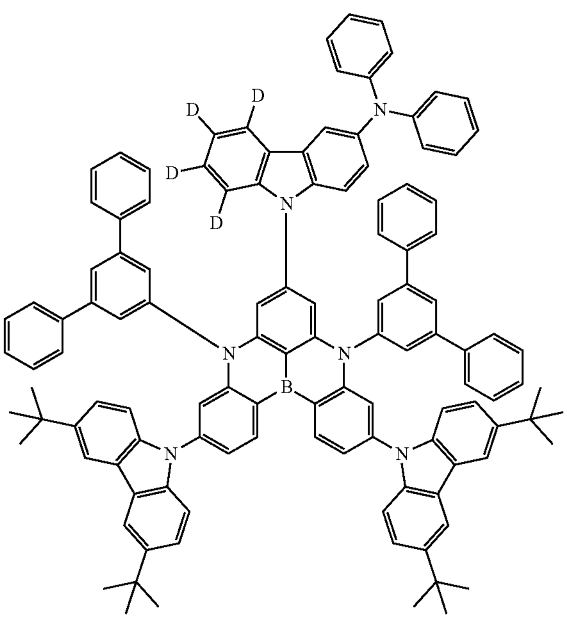
445
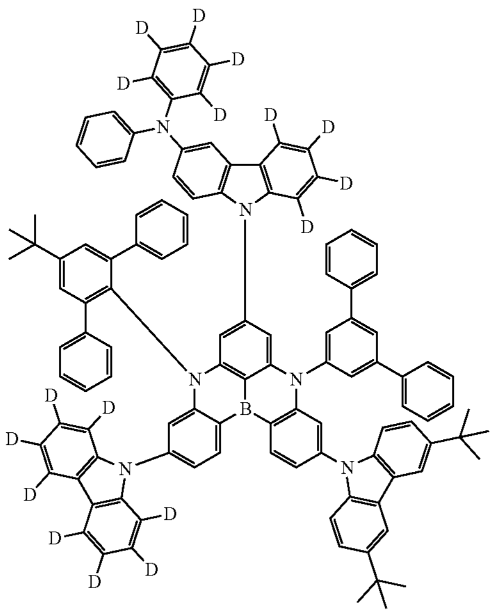
446
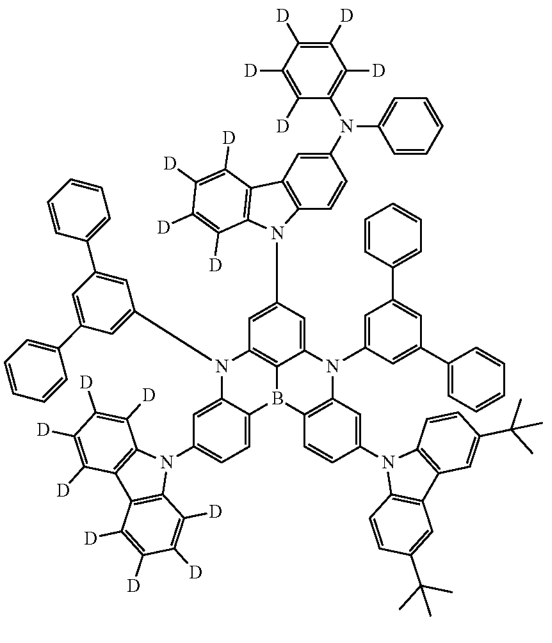
447
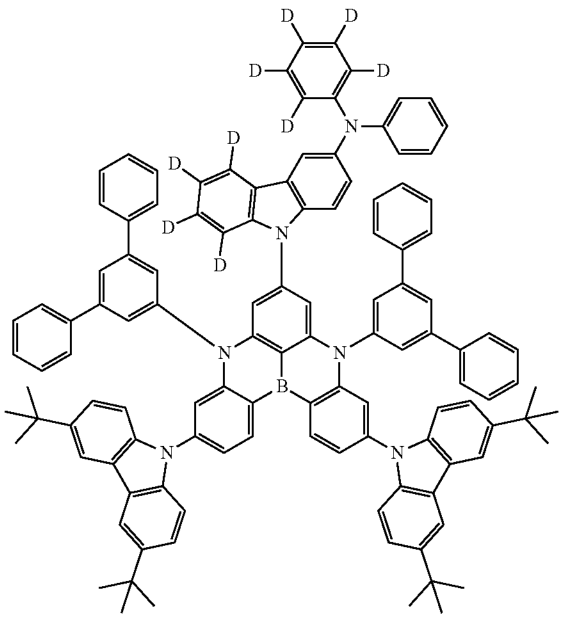

-continued
448
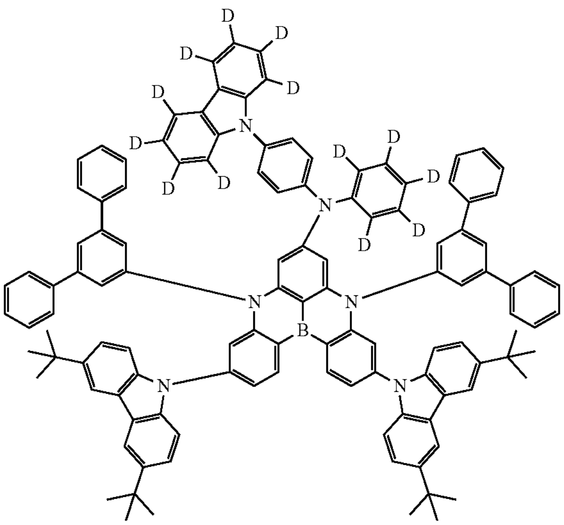
449
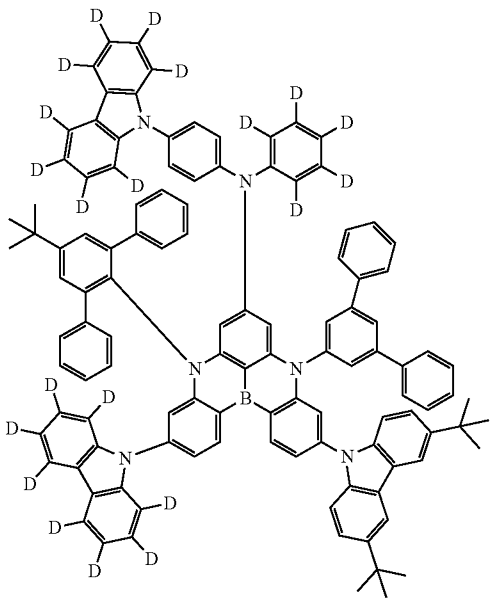
450
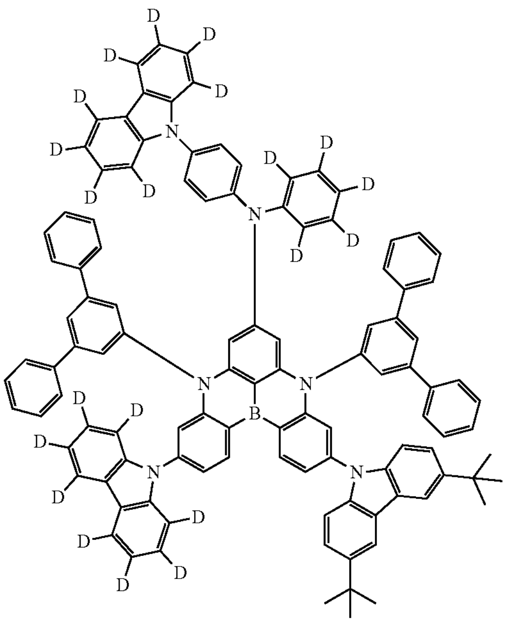
451
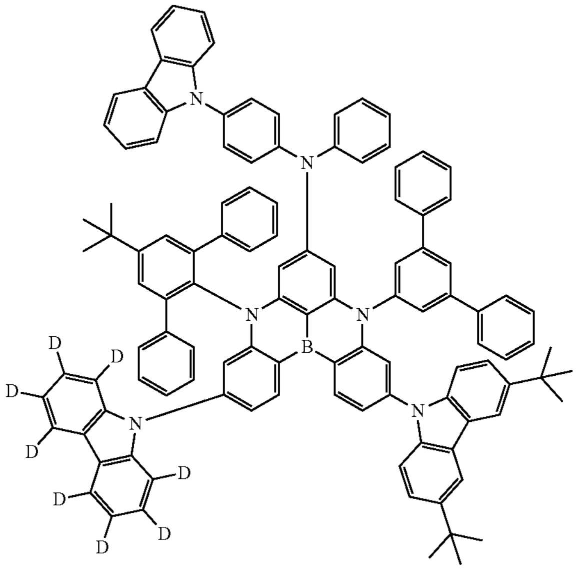

-continued
452
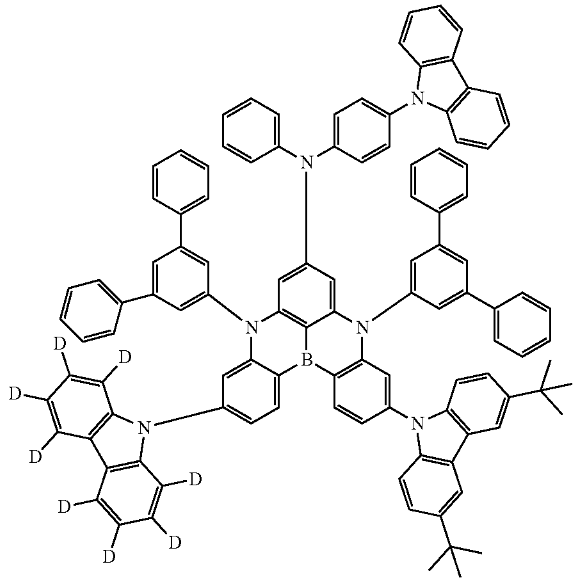
453
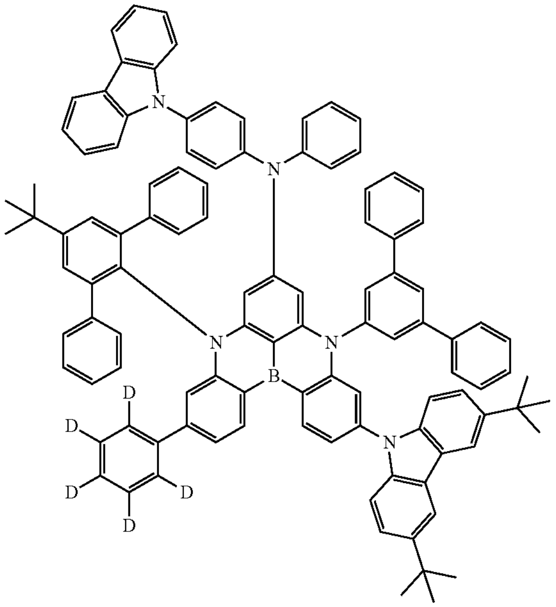
454
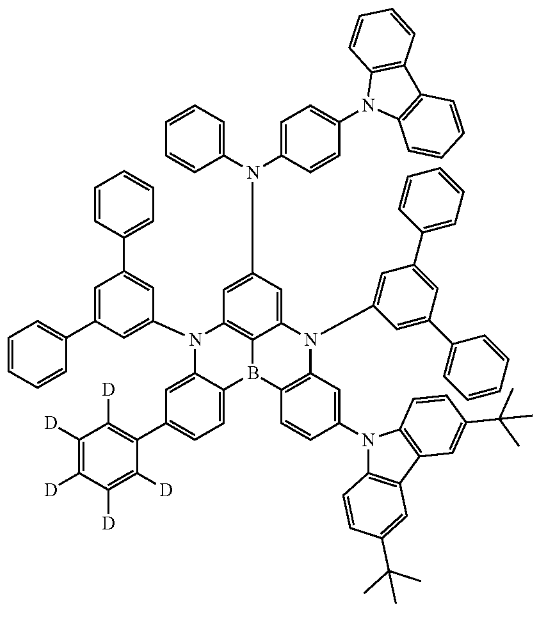
455
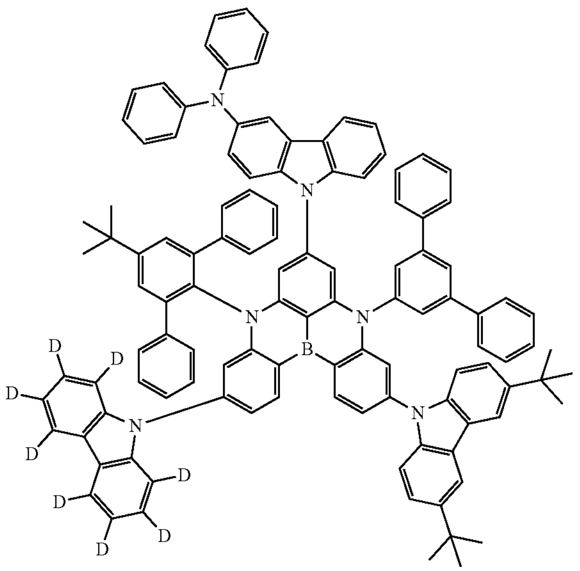

-continued
456
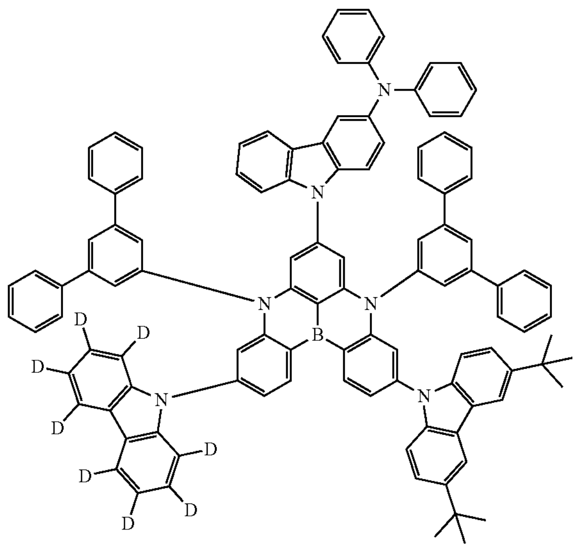
457
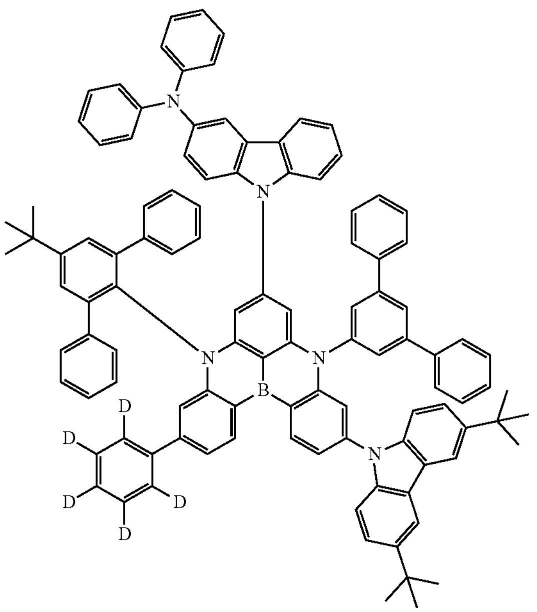
458
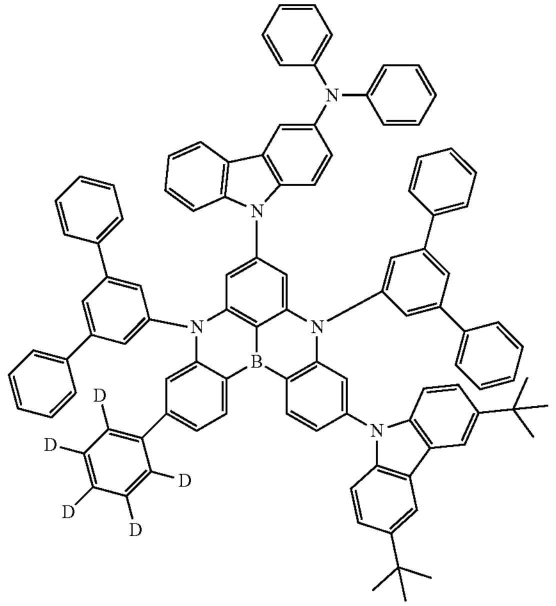
459
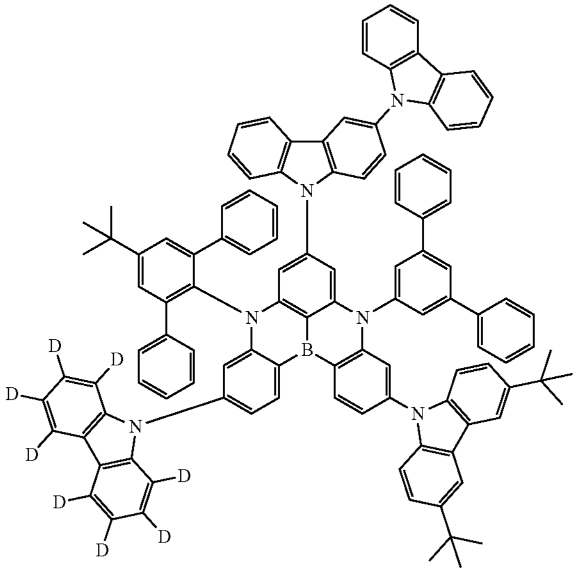
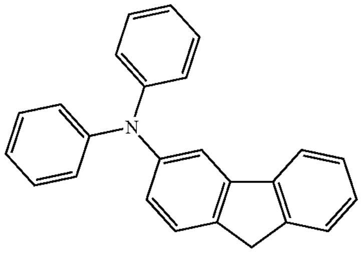

-continued
460
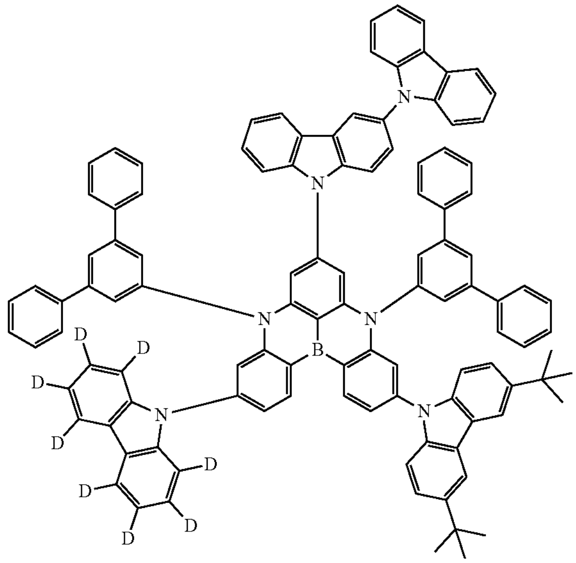
461
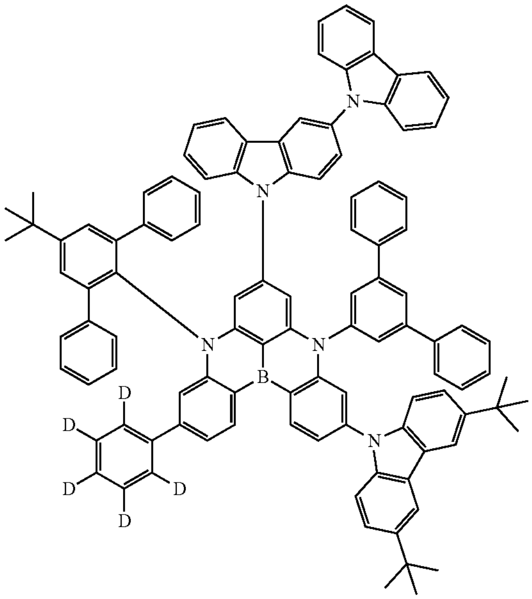
462
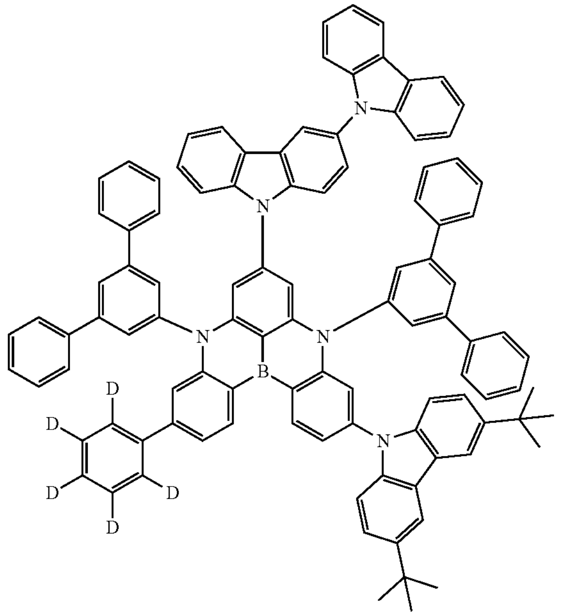
463
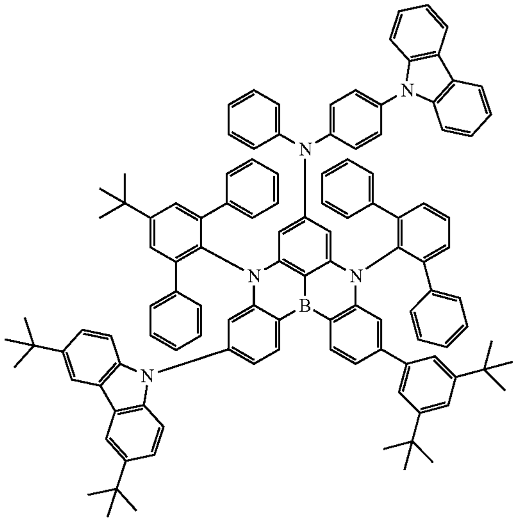

-continued
464
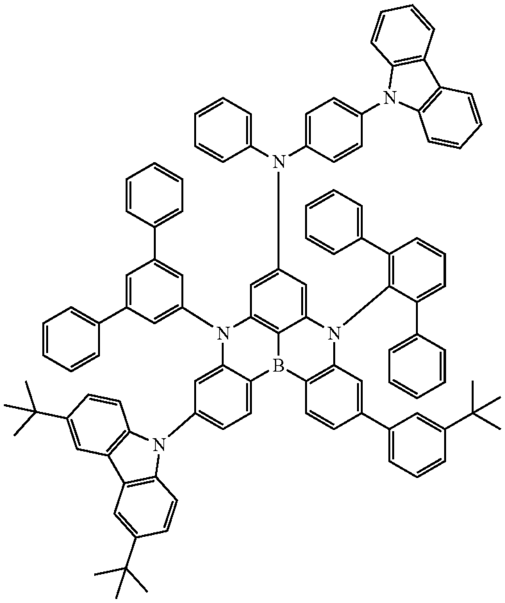
465
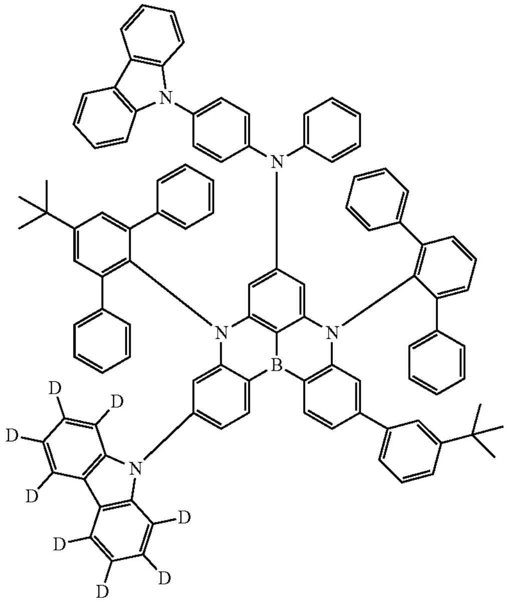
466
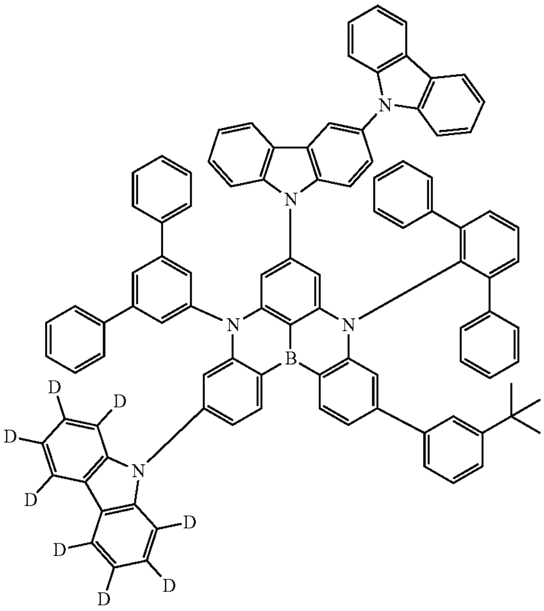
467
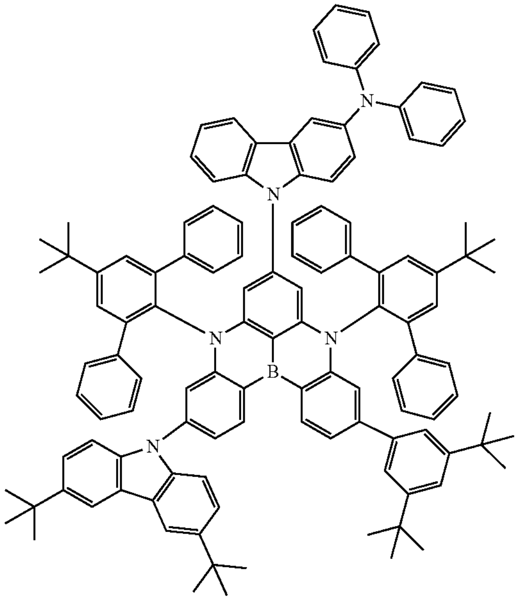

-continued
468
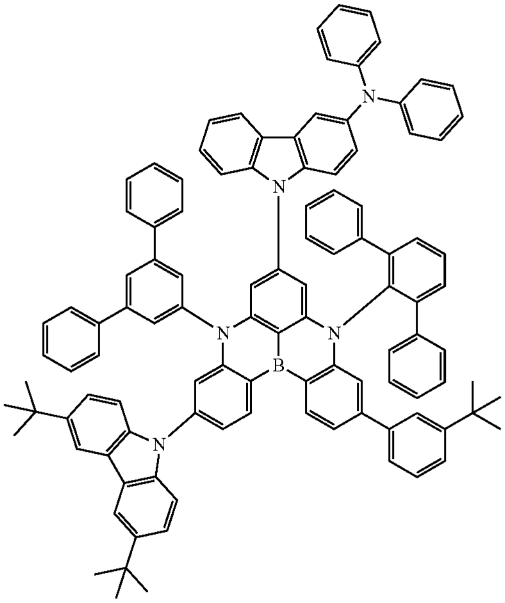
469
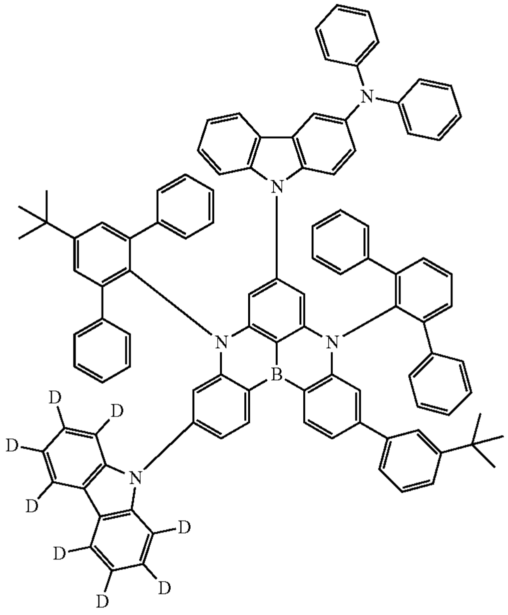
470
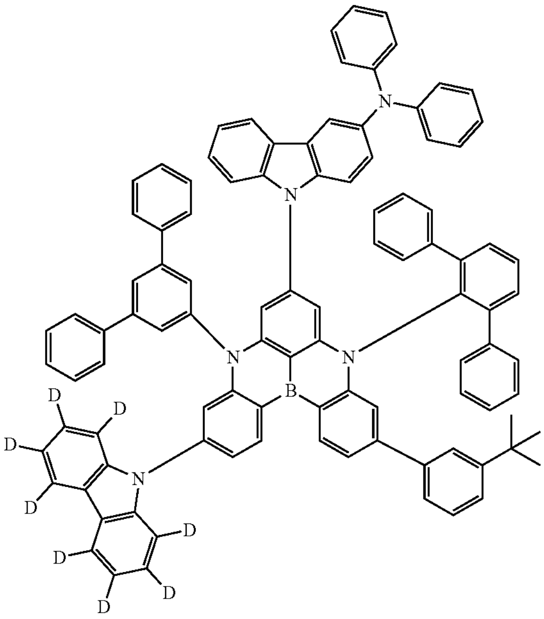
471
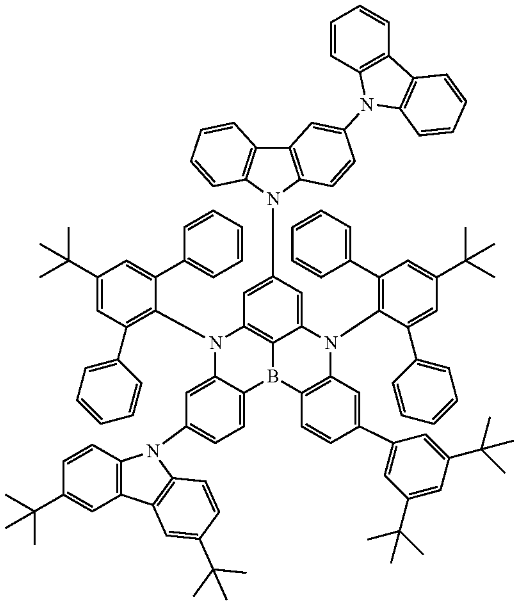

-continued
472
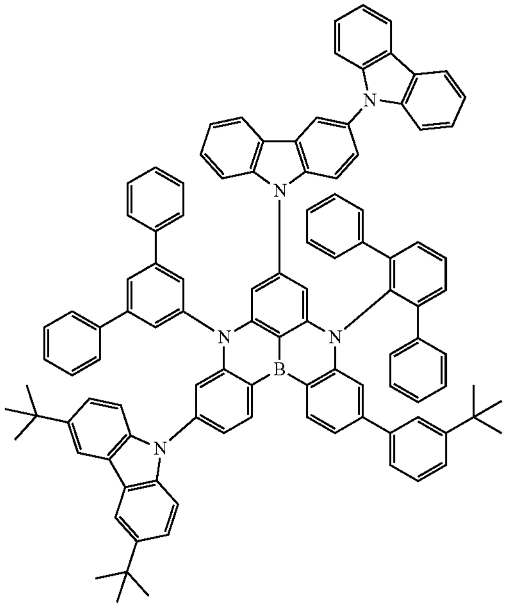
473
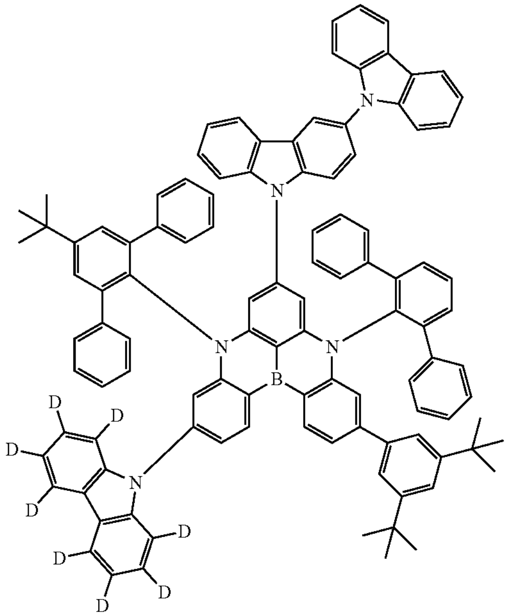
474
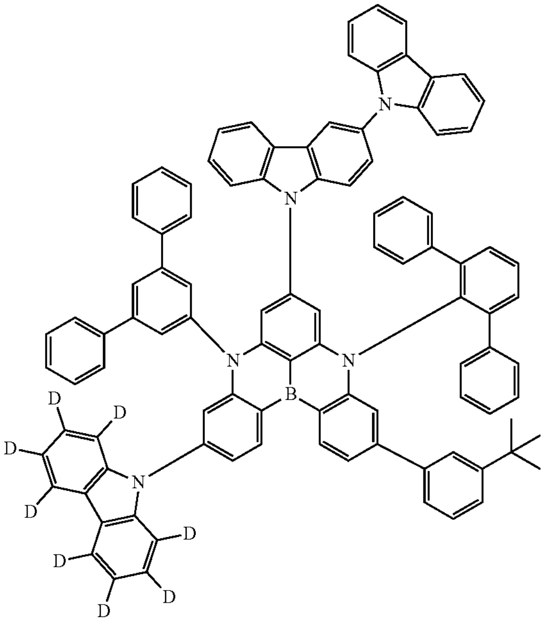
475
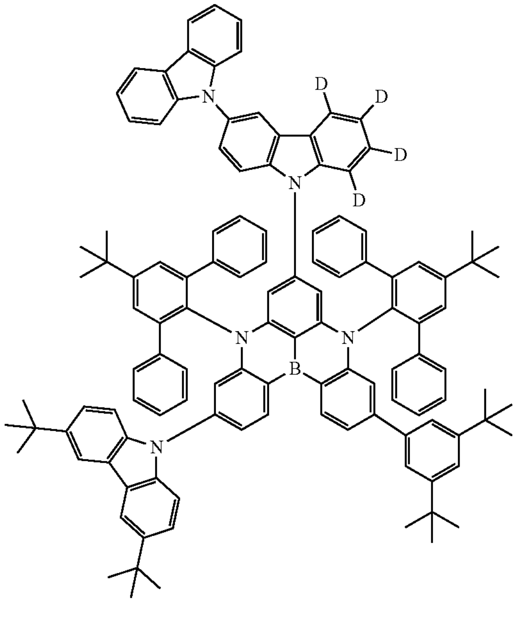

-continued
476
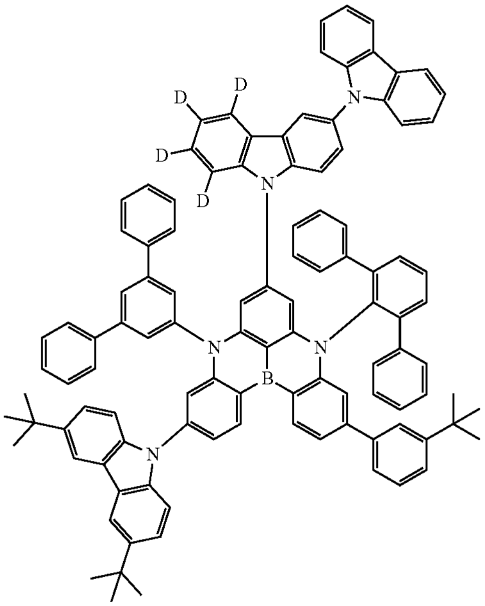
477
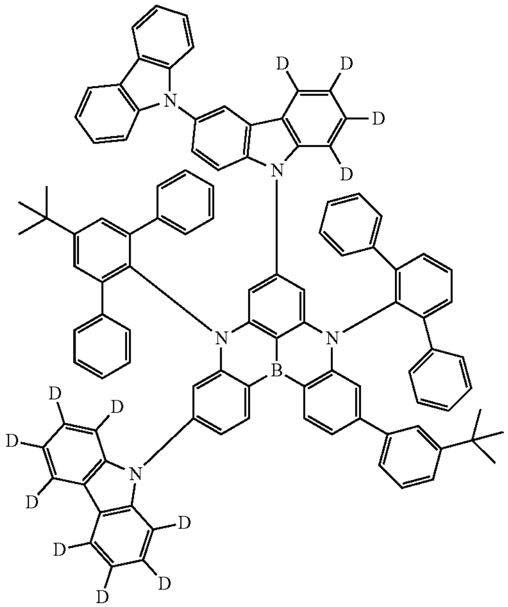
478
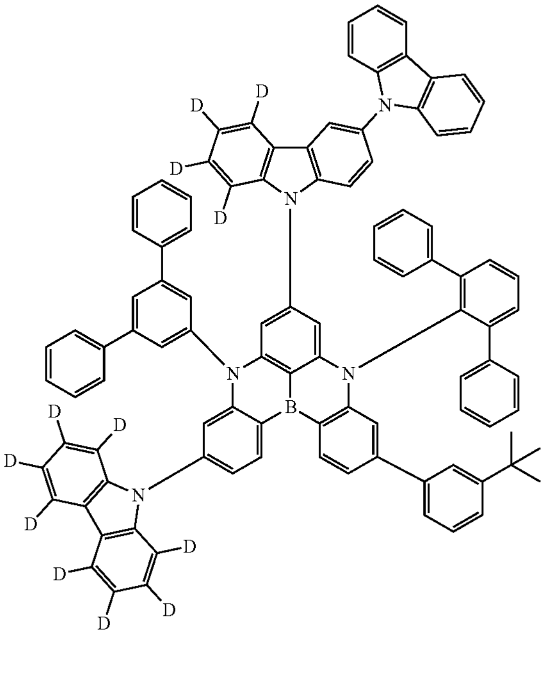
479
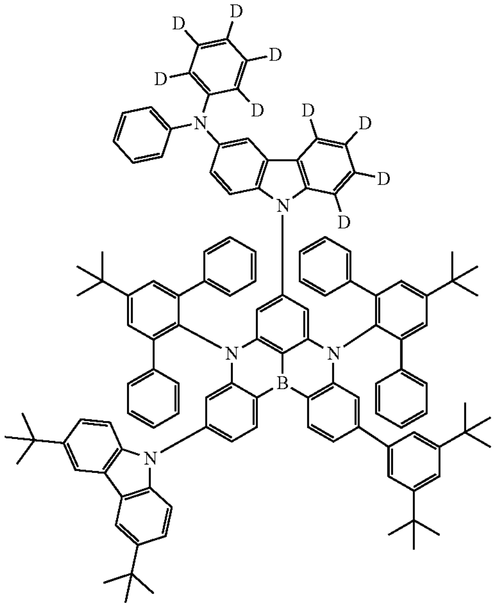

-continued
480
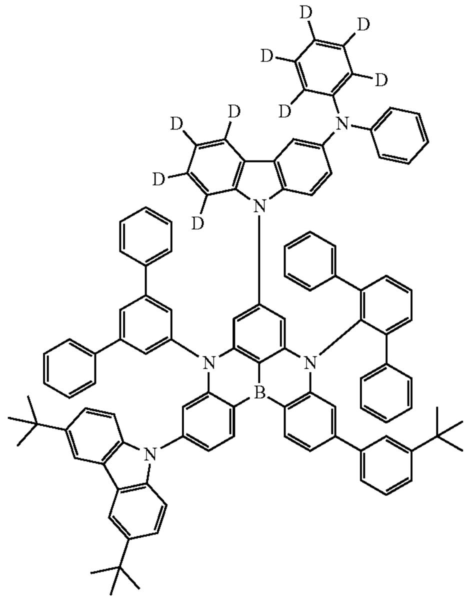
481
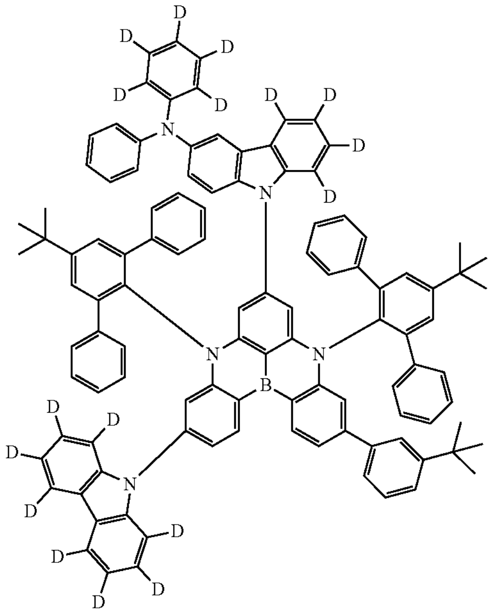
482
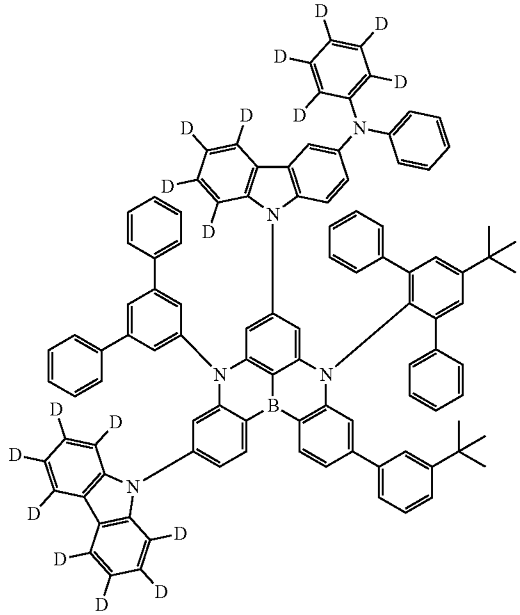
483
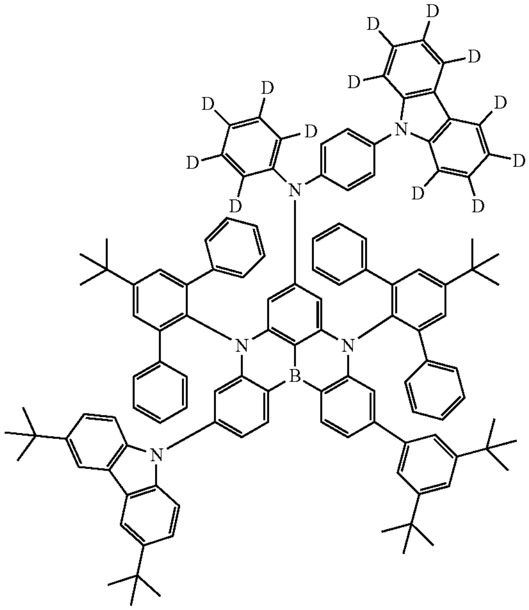

-continued
484
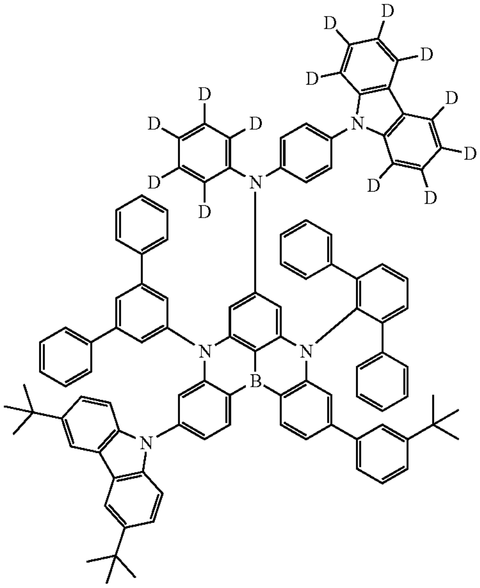
485
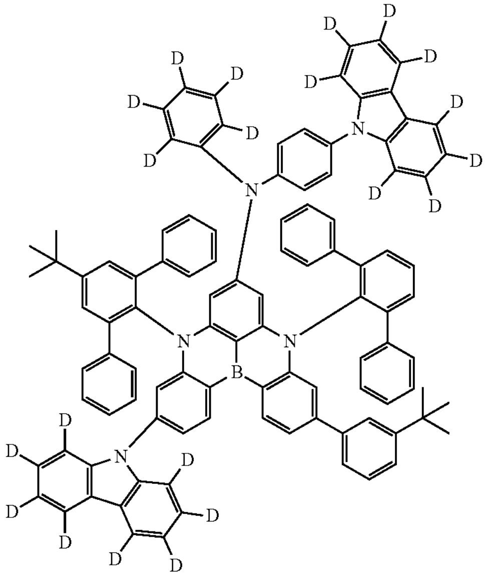
486
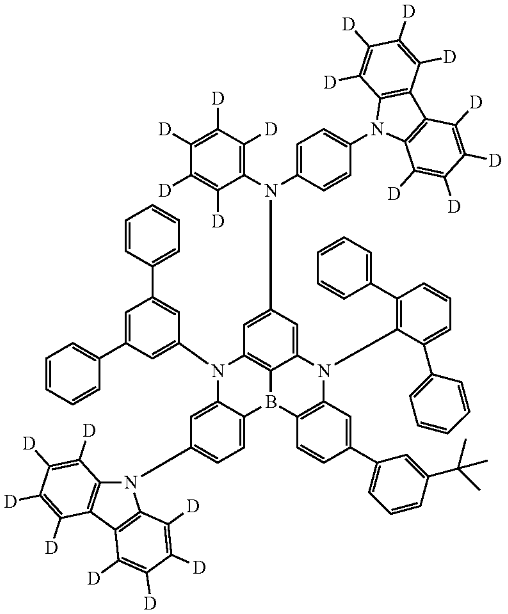
487
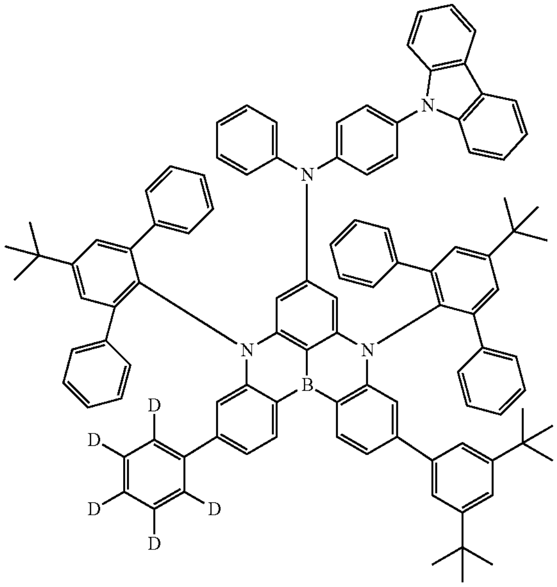

-continued
488
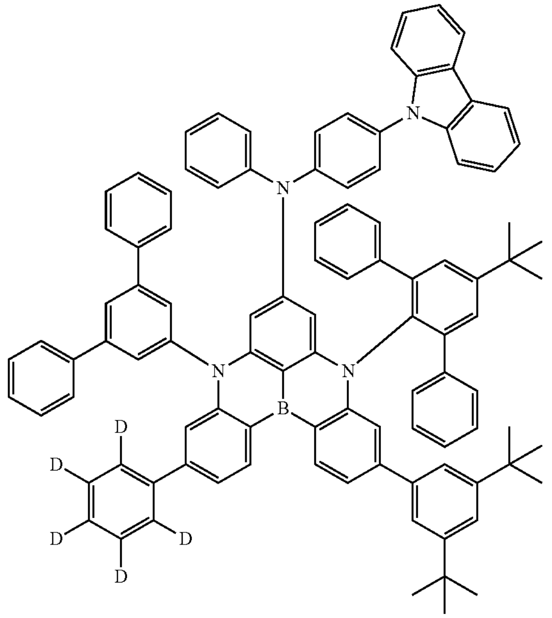
489
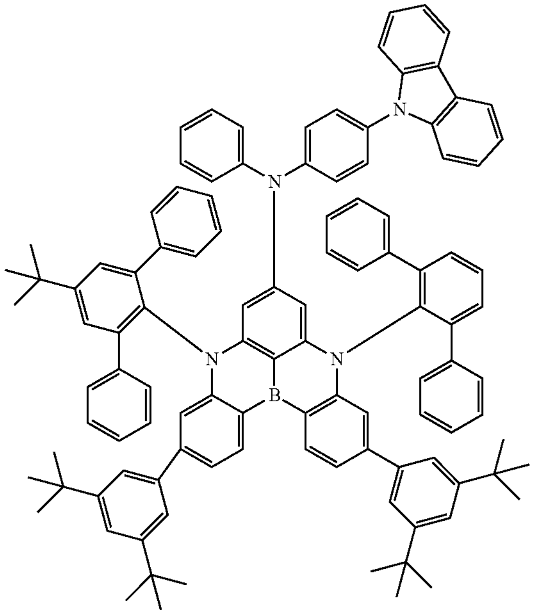
490
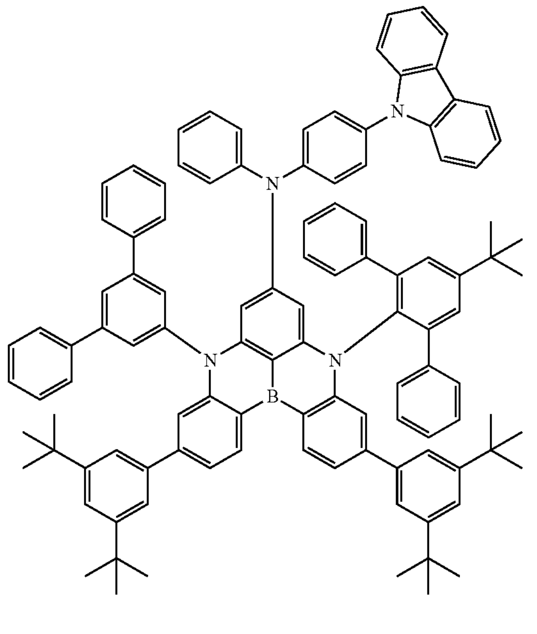
491
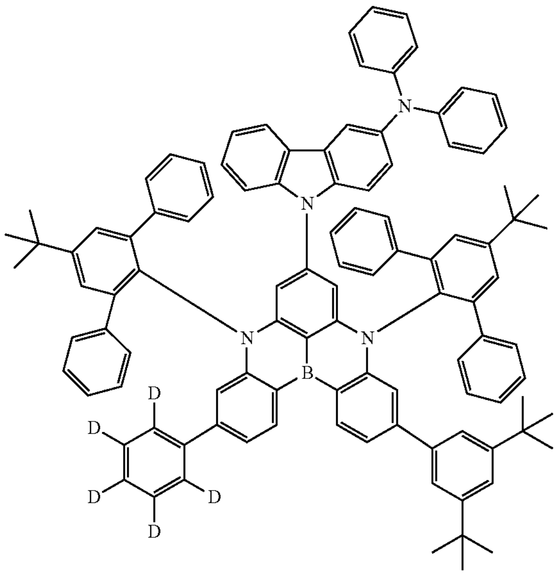

-continued
492
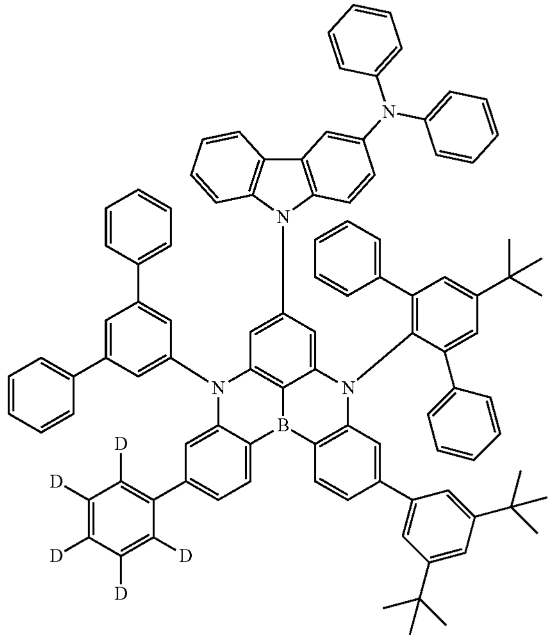
493
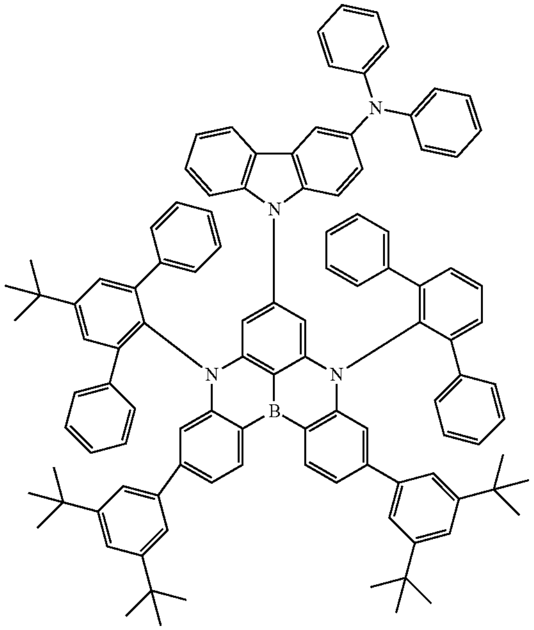
494
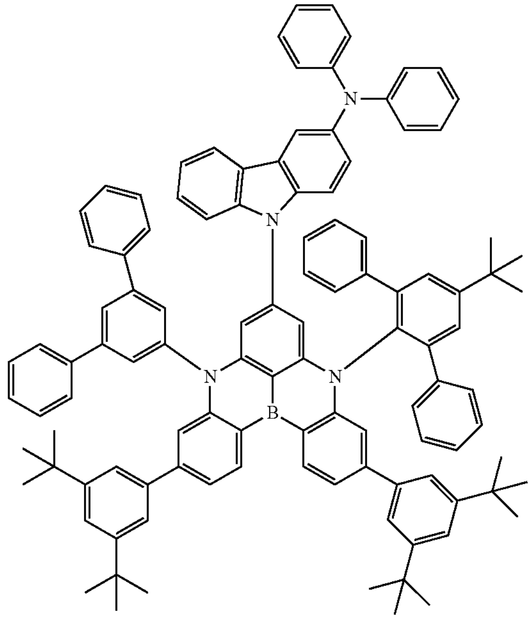
495
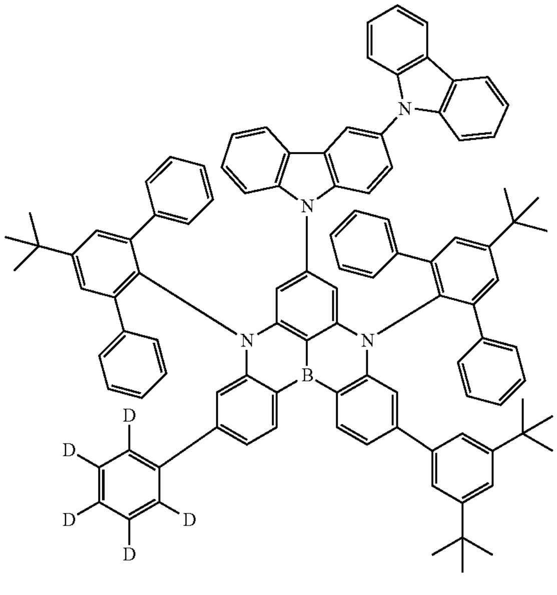

-continued
496
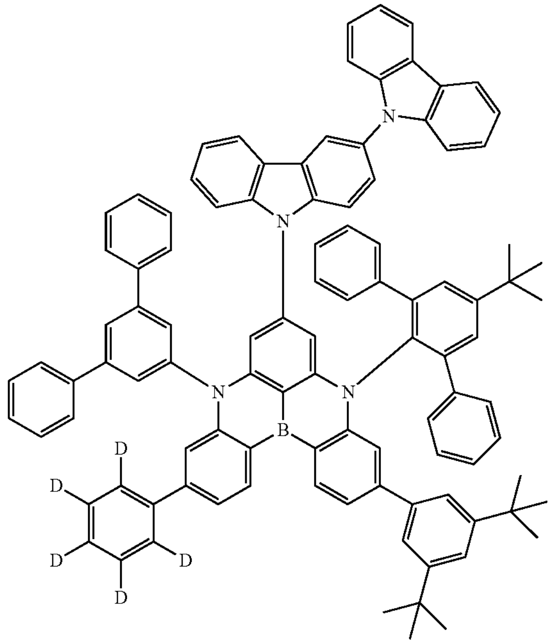
497
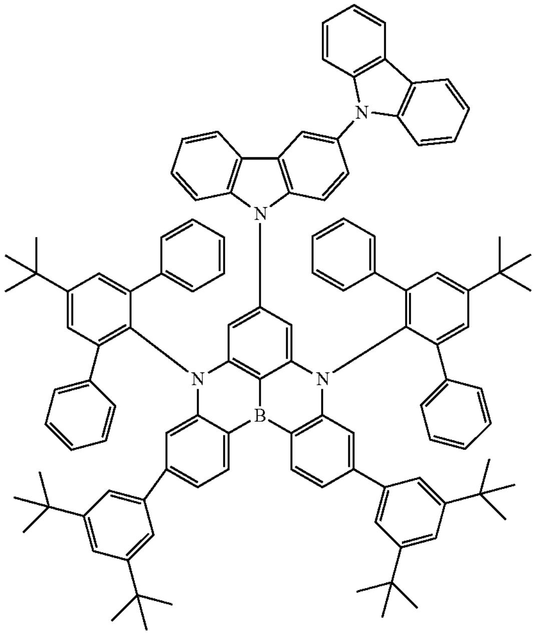
498
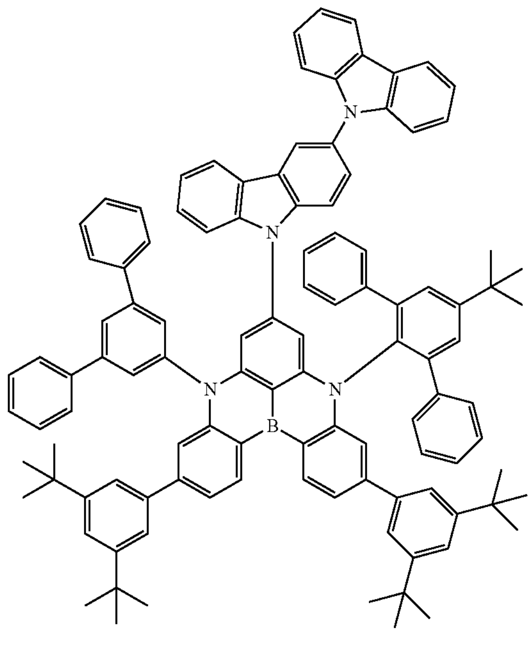
499
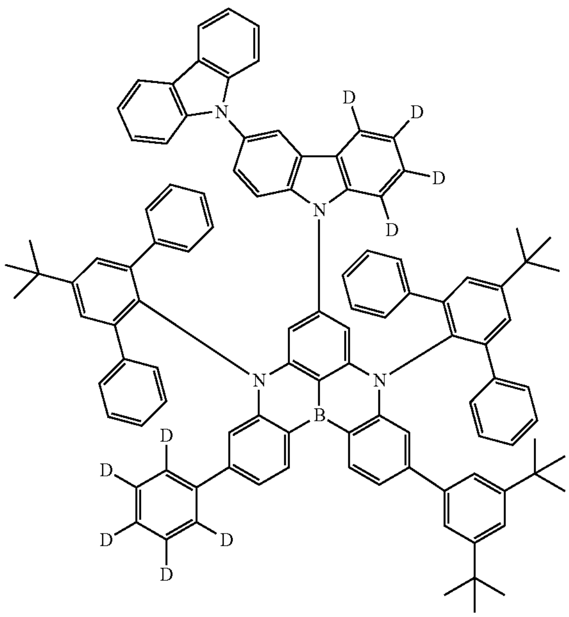

-continued
500
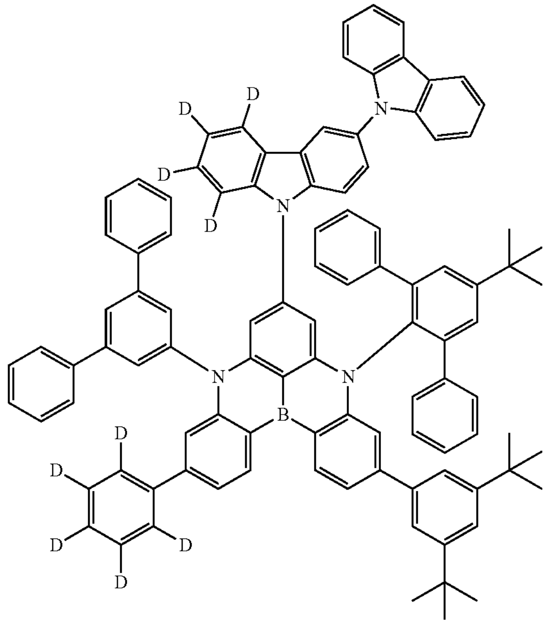
501
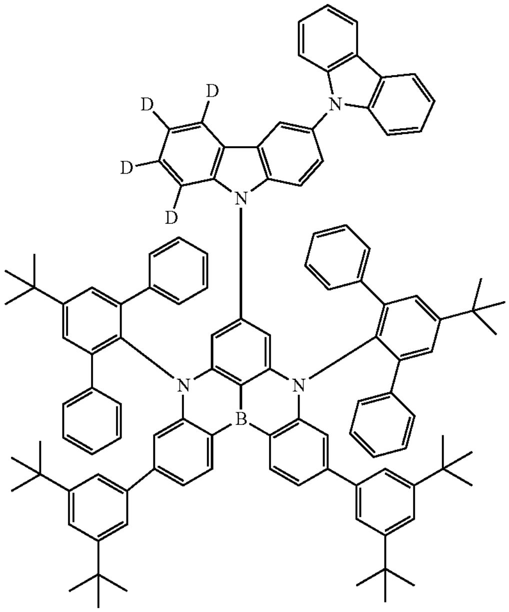
502
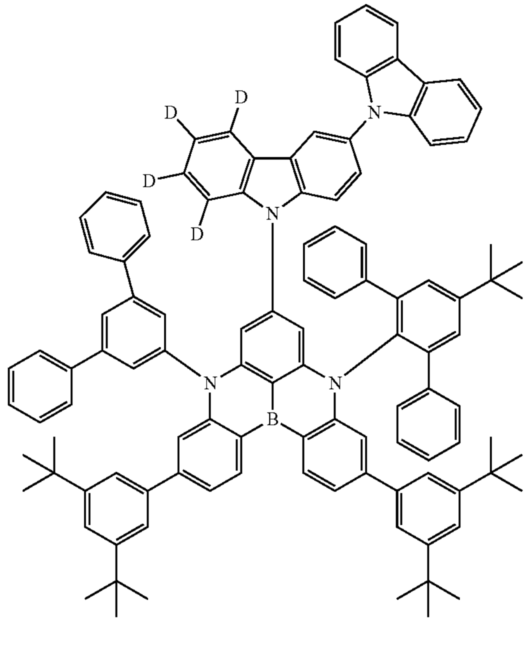
503
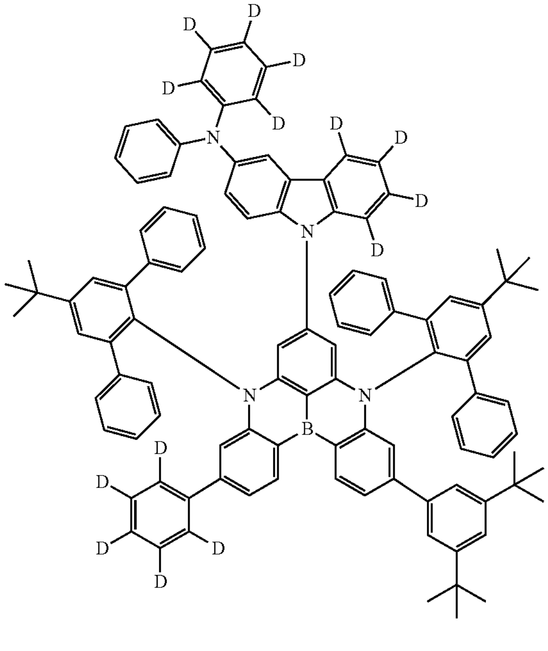

-continued
504
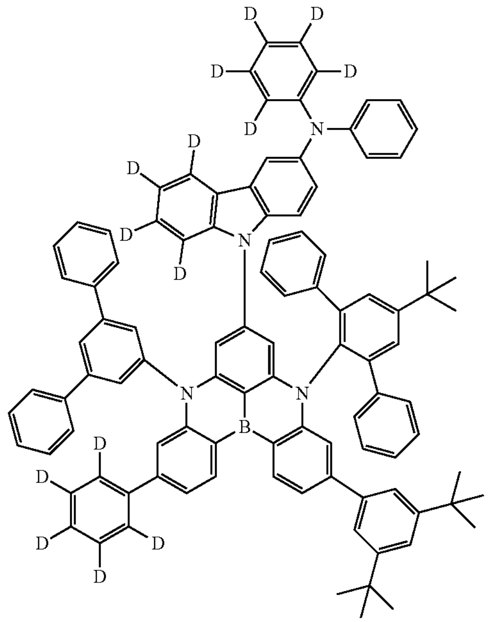
505
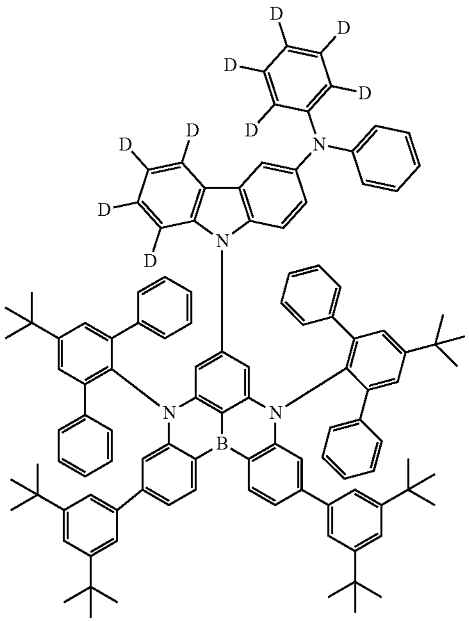
506
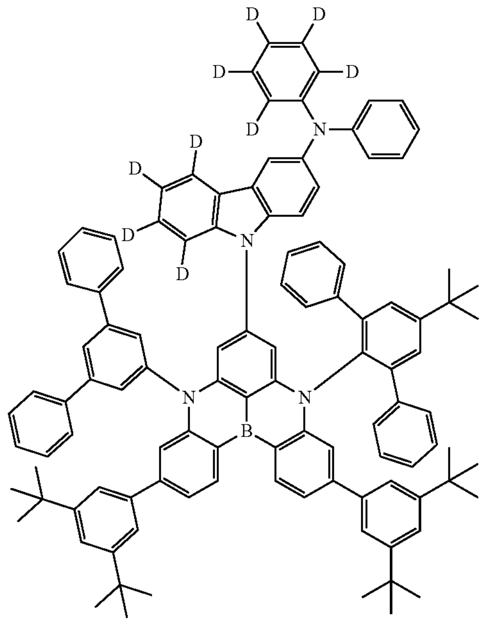
507
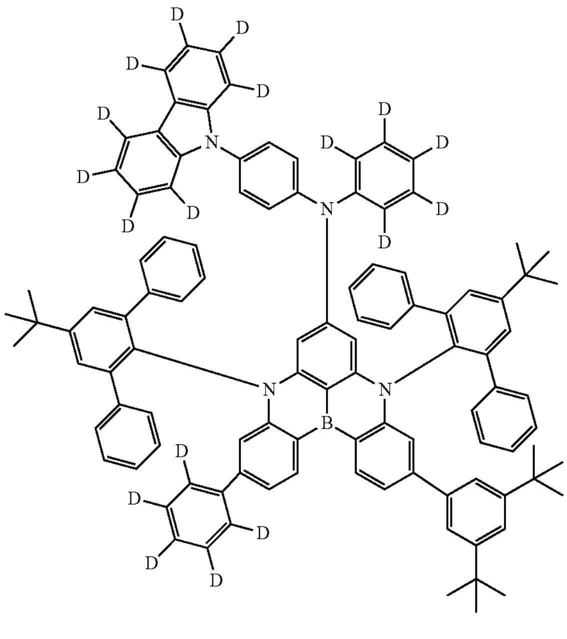

-continued
508
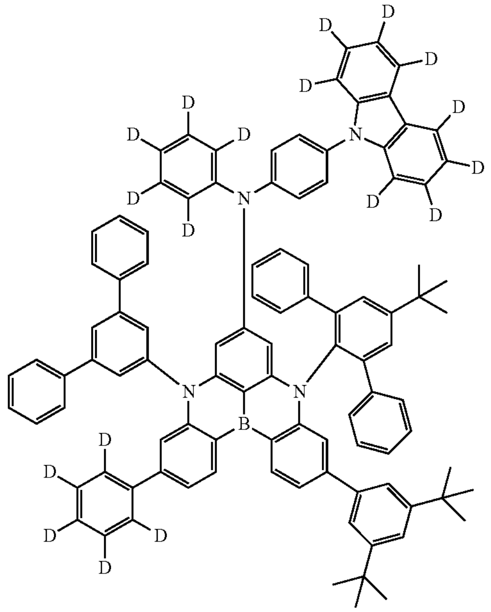
509
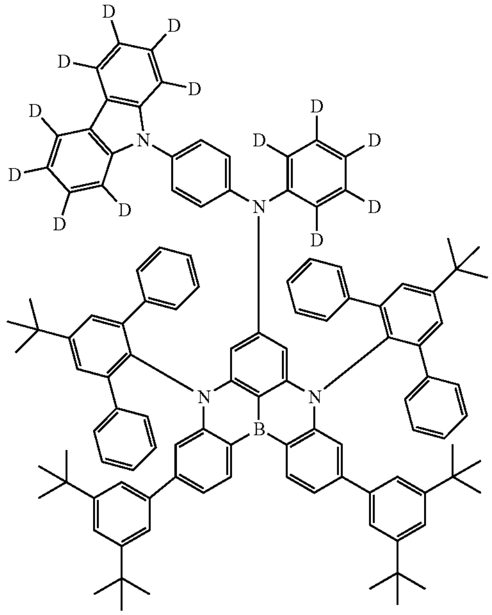
510
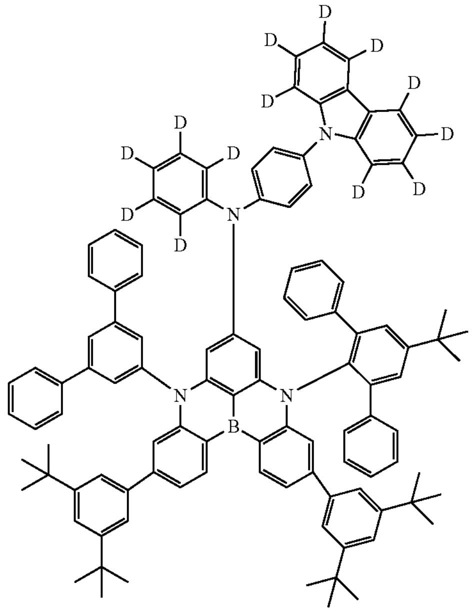
511
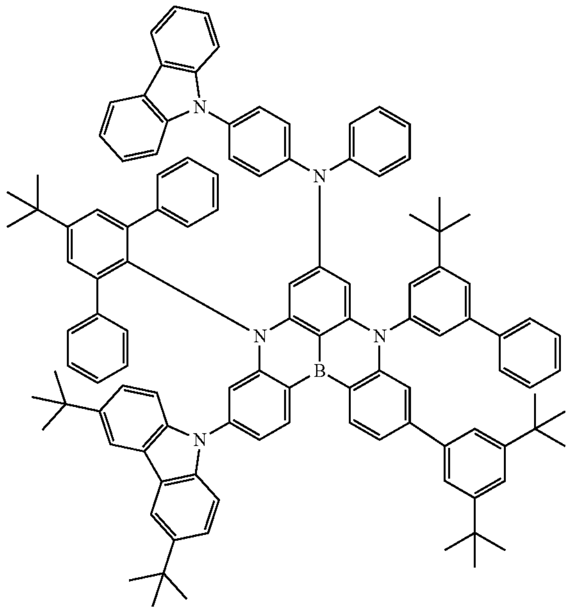

-continued
512
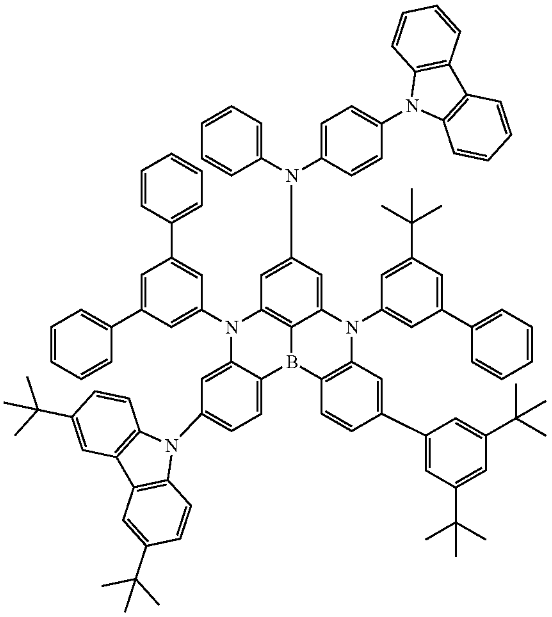
513
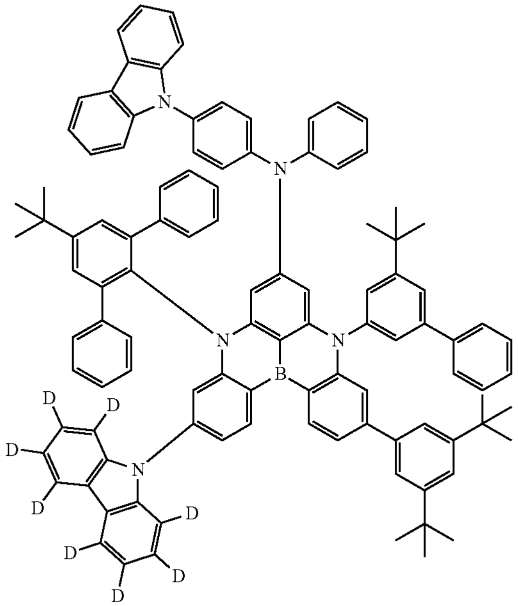
514
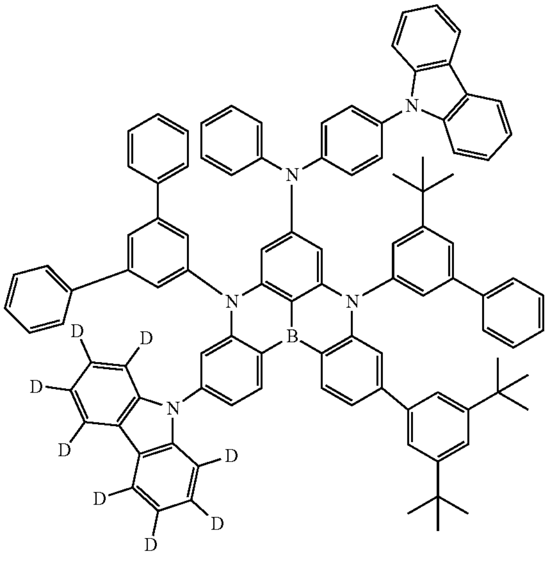
515
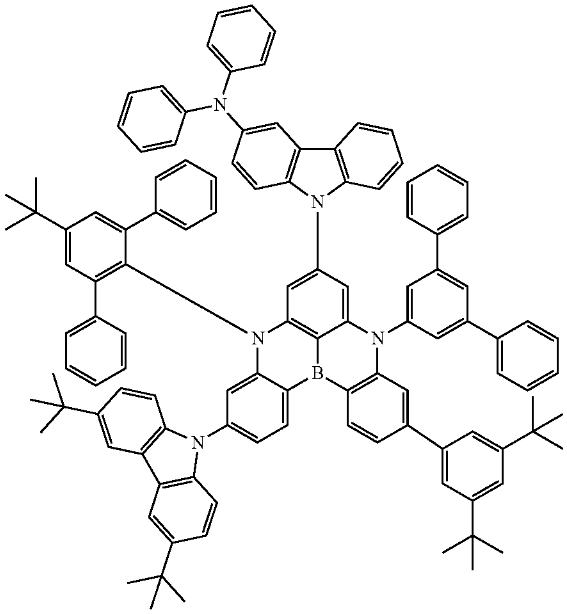

-continued
516
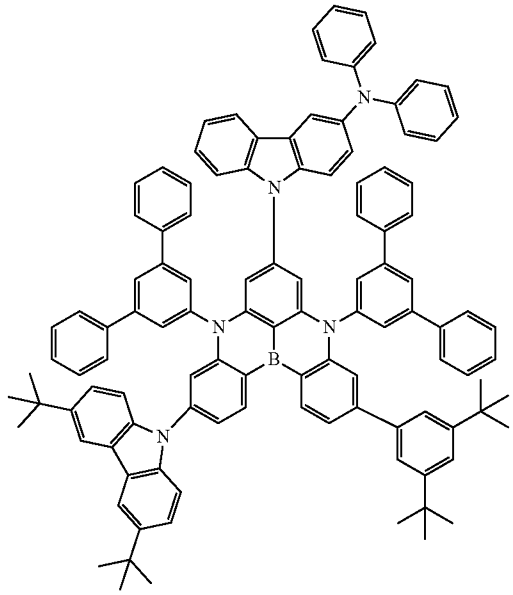
517
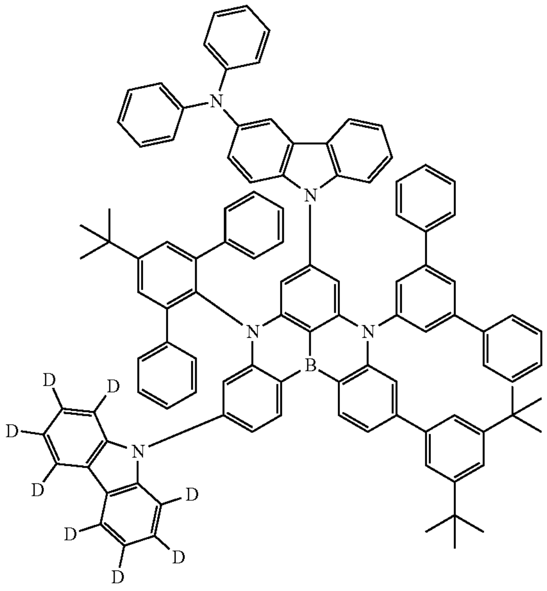
518
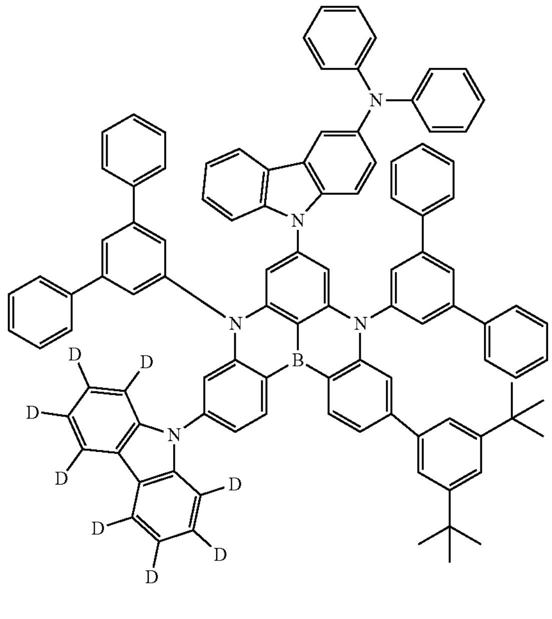
519
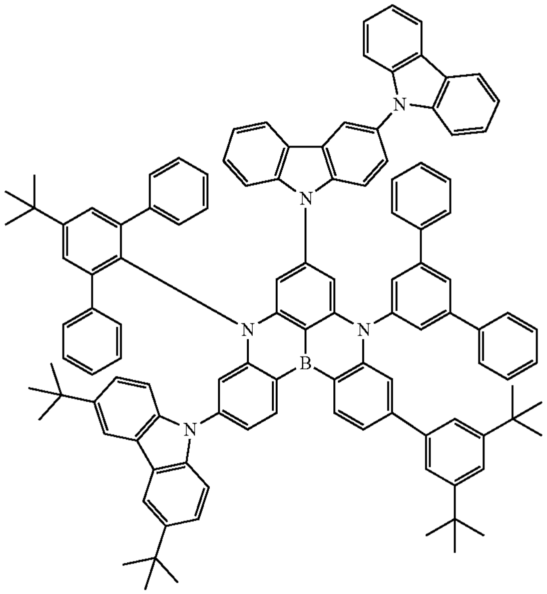

-continued
520
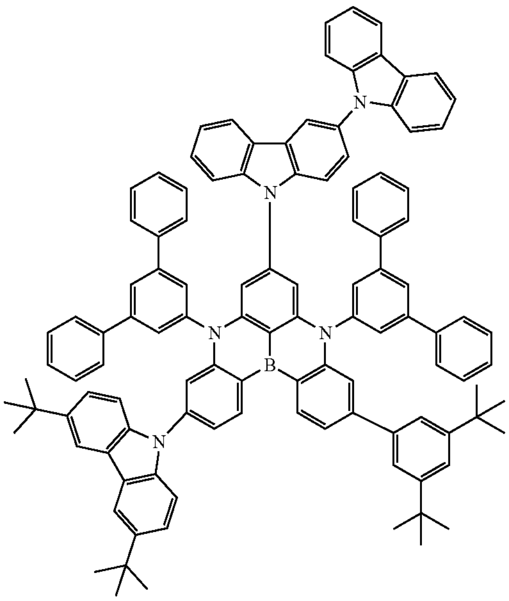
521
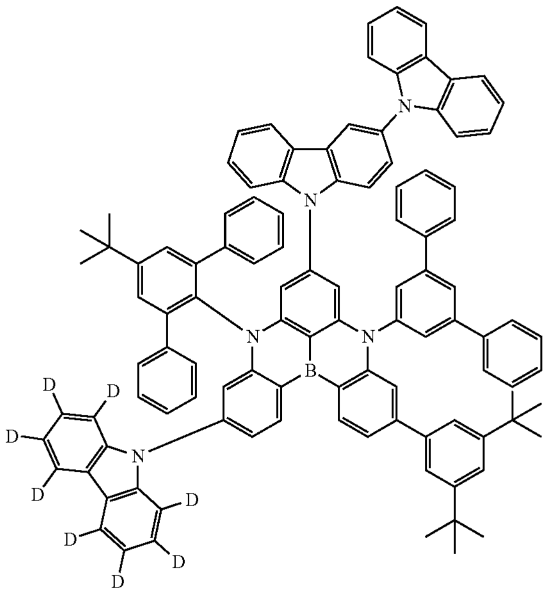
522
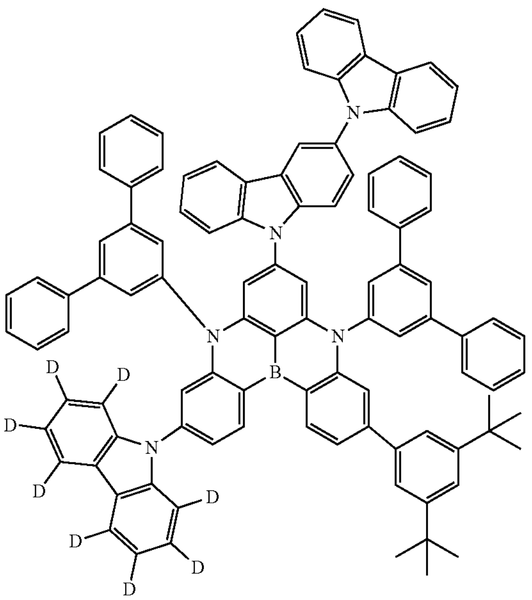
523
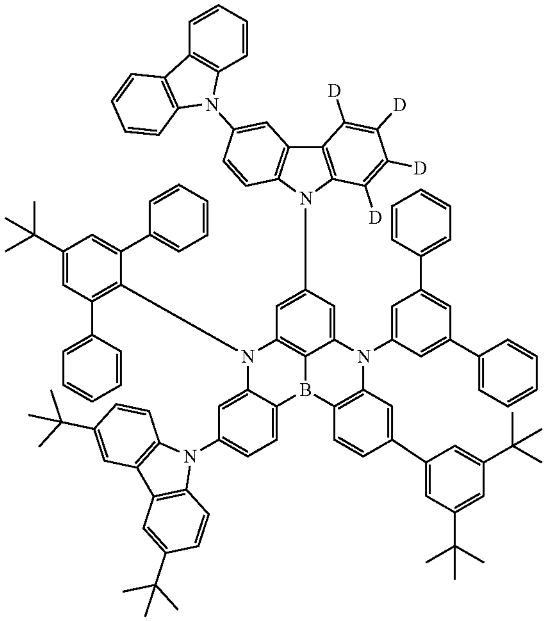

-continued
524
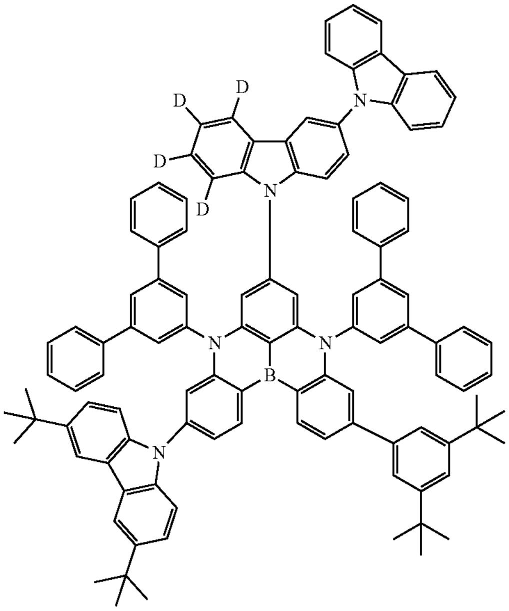
525
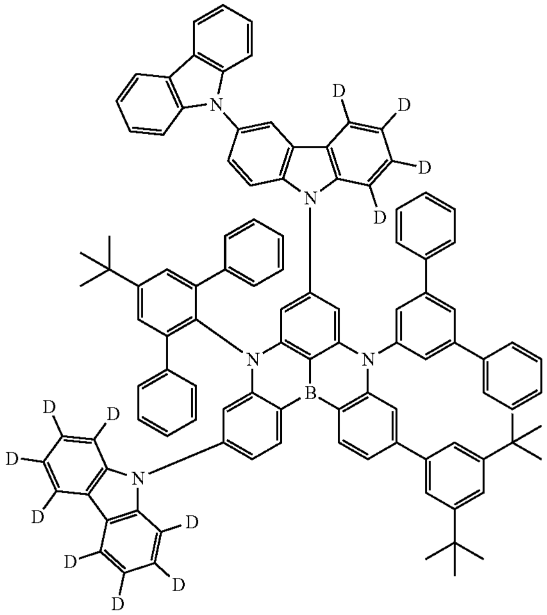
526
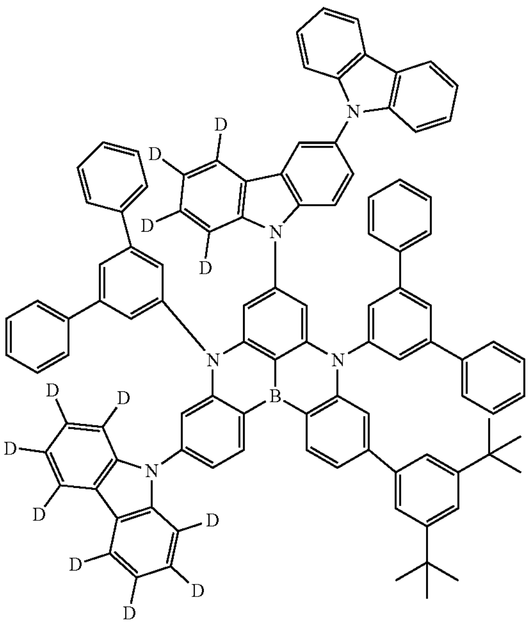
527
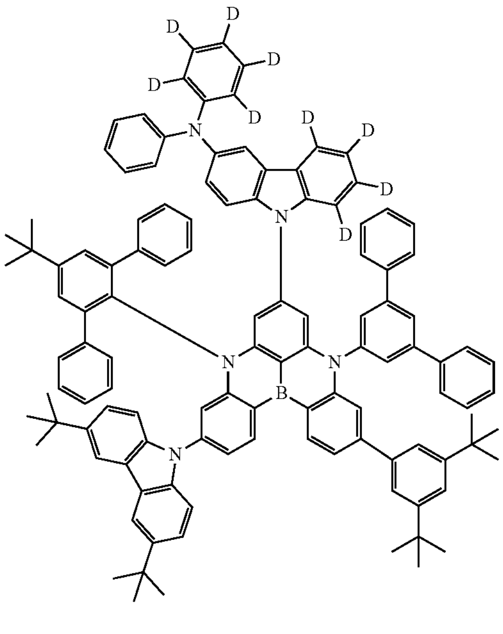

-continued
528
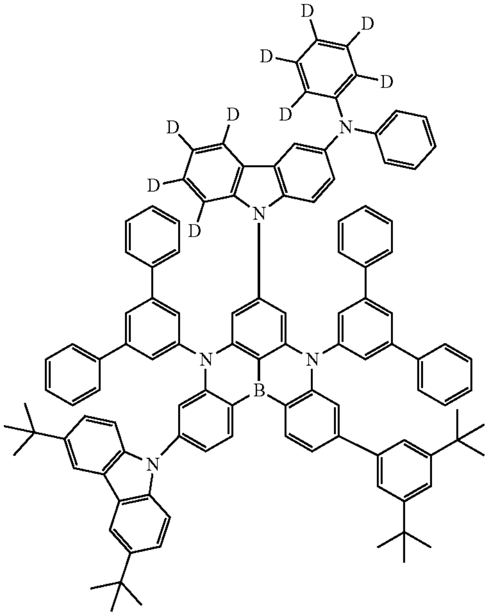
529
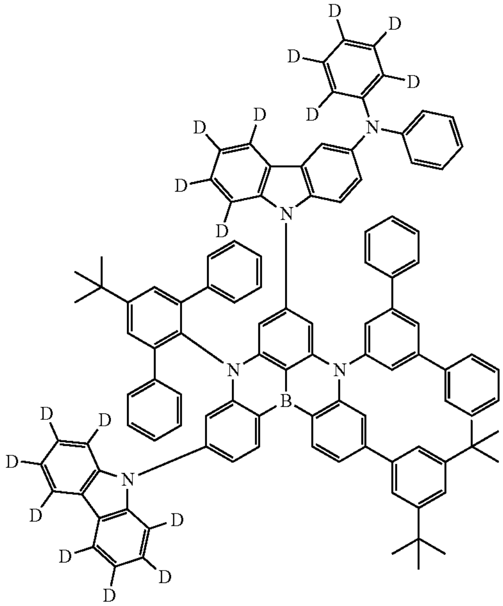
530
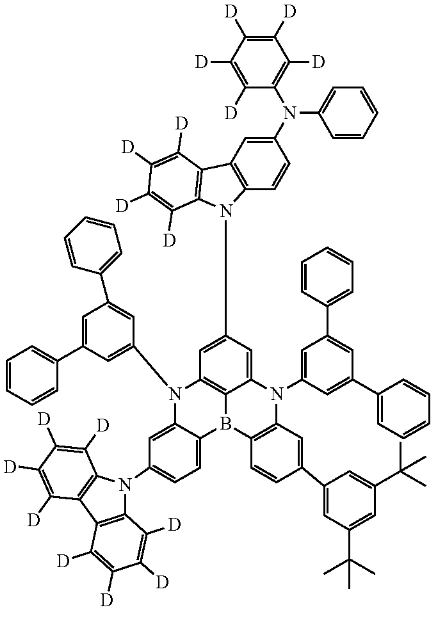
531
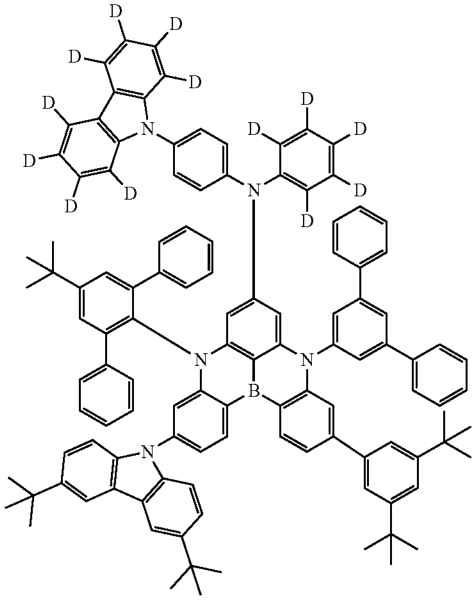

-continued

532

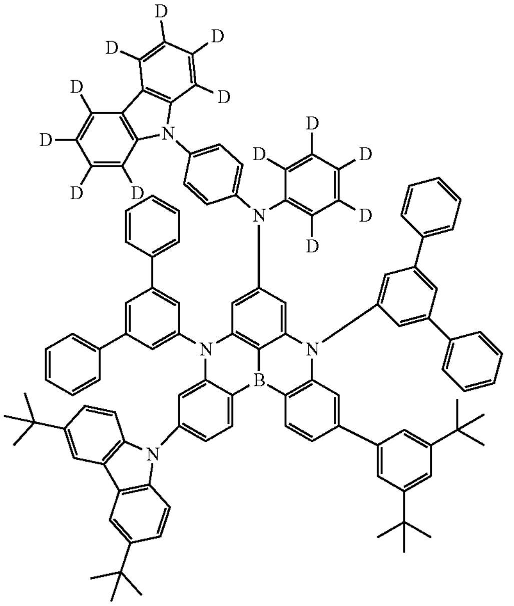

533

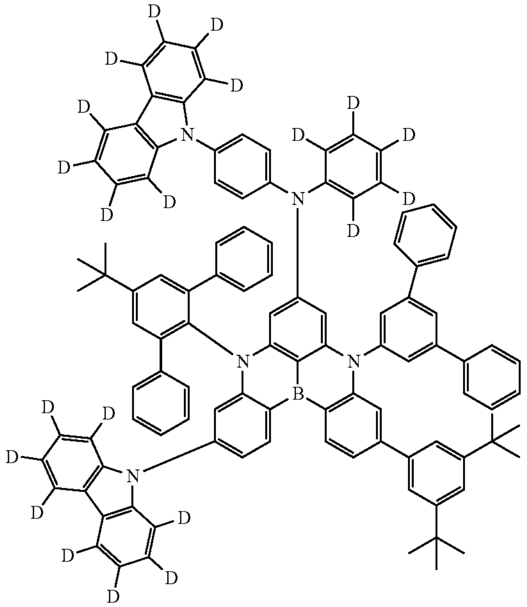

534

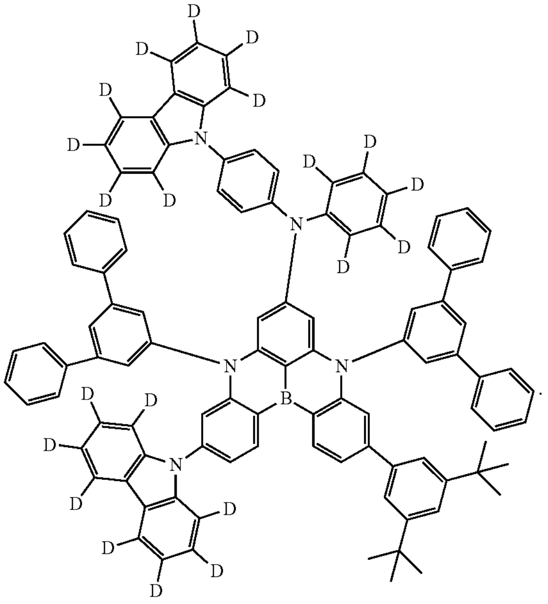

"D" in the structures of the compounds in Compound Group 1 refers to a deuterium atom.

The fused polycyclic compound of the present embodiments, represented by Formula 1 may be a thermally activated delayed fluorescence emission material. In addition, the fused polycyclic compound of the present embodiments represented by Formula 1 may be a thermally activated delayed fluorescence dopant having a difference ($\Delta E_{ST}$) between the lowest triplet excitation energy level (T1 level) and the lowest singlet excitation energy level (S1 level) of about 0.4 eV or less.

The fused polycyclic compound of the present embodiments represented by Formula 1 may be a light-emitting material having a light-emitting central wavelength in a wavelength region of about 430 nm to about 490 nm. For example, the fused polycyclic compound of the present embodiments represented by Formula 1 may be a blue thermally activated delayed fluorescence (TADF) dopant. However, an embodiment of the inventive concept is not limited thereto, and in case of using the fused polycyclic compound of the present embodiments as the light-emitting material, the fused polycyclic compound may be used as a dopant material emitting light in various suitable wavelength regions, such as a red emitting dopant and/or a green emitting dopant.

In the light emitting device ED of the present embodiments, the emission layer EML may emit delayed fluorescence. For example, the emission layer EML may emit thermally activated delayed fluorescence (TADF).

In addition, the light emitting device ED may emit blue light. For example, the emission layer EML of the light emitting device ED of the present embodiments may emit blue light in a region of about 490 nm or more. However, an embodiment of the inventive concept is not limited thereto, and the emission layer EML may emit green light or red light.

The light emitting device ED of the present embodiments may include a plurality of emission layers. The plurality of emission layers may be laminated one by one (sequentially). For example, the light emitting device ED (including a plurality of emission layers) may emit white light. The light emitting device (including the plurality of emission layers) may be an light emitting device having a tandem structure. If the light emitting device ED includes a plurality of emission layers, at least one emission layer EML may include the fused polycyclic compound of the present embodiments.

The light emitting device ED according to an embodiment of the inventive concept includes the fused polycyclic compound of the present embodiments in the emission layer EML disposed between the first electrode EL1 and the second electrode EL2, thereby showing high emission efficiency properties. In addition, the fused polycyclic compound according to the present embodiments may be a thermally activated delayed fluorescence dopant, and the emission layer EML may include the fused polycyclic compound of the present embodiments to emit thermally activated delayed fluorescence. Accordingly, high emission efficiency properties may be achieved.

The fused polycyclic compound of the present embodiments may be included in an organic layer other than the emission layer EML as a material for the light emitting device ED. For example, the light emitting device ED according to an embodiment of the inventive concept may include the fused polycyclic compound in at least one organic layer disposed between the first electrode EL1 and the second electrode EL2, or in the capping layer CPL disposed on the second electrode EL2.

The fused polycyclic compound of the present embodiments includes a double nitrogen-containing hetero substituent, which is obtained by additionally substituting a nitrogen-containing second hetero substituent at a nitrogen-containing first hetero substituent, when compared with the related art polycyclic compound including two nitrogen atoms and one boron atom, and may relatively decrease a difference ($\Delta E_{ST}$) between the lowest triplet excitation energy level (T1 level) and the lowest singlet excitation energy level (S1 level). Accordingly, if used as a material for an light emitting device, the efficiency of the light emitting device may be further improved.

The emission layer EML in the light emitting device ED of an embodiment may include a host. The host may serve to deliver energy to the dopant without emitting light in the light emitting device ED. The emission layer EML may include at least one kind of host. For example, the emission layer EML may include two kinds of different hosts. When the emission layer EML includes two kinds of hosts, the two kinds of hosts may include a hole transporting host and an electron transporting host. However, the embodiment of the present disclosure is not limited thereto, and the emission layer EML may include one kind of host, or a mixture of two kinds of different hosts.

In an embodiment, the emission layer EML may include two different hosts. The host may include the second compound, and the third compound different from the second compound. The host may include the second compound having a hole transporting moiety and the third compound having an electron transporting moiety. In the light emitting device ED of an embodiment, for the host, the second compound and the third compound may form an exciplex.

In the light emitting device ED of an embodiment, an exciplex may be formed by the hole transporting host and the electron transporting host in the emission layer. In this embodiment, a triplet energy of the exciplex formed by the hole transporting host and the electron transporting host may correspond to the difference between a lowest unoccupied molecular orbital (LUMO) energy level of the electron transporting host and a highest occupied molecular orbital (HOMO) energy level of the hole transporting host.

For example, the absolute value of the triplet energy (T1) of the exciplex formed by the hole transporting host and the electron transporting host may be about 2.4 eV to about 3.0 eV. In some embodiments, the triplet energy of the exciplex may be a value smaller than an energy gap of each host material. The exciplex may have a triplet energy of about 3.0 eV or less that is an energy gap between the hole transporting host and the electron transporting host.

In an embodiment, the host may include the second compound represented by Formula H-1 and the third compound represented by Formula H-2. The second compound may be a hole transporting host, and the third compound may be an electron transporting host.

The emission layer EML according to an embodiment may include the second compound including a carbazole group derivative moiety. The second compound may be represented by Formula H-1:

Formula H-1

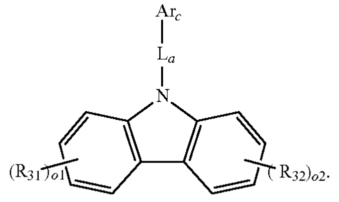

In Formula H-1, La may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, $Ar_c$ may be a substituted or unsubstituted aryl group having 6 to 30 ring-forming carbon atoms, or a substituted or unsubstituted heteroaryl group having 2 to 30 ring-forming carbon atoms.

In Formula H-1, $R_{31}$ and $R_{32}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{31}$ and $R_{32}$ may each independently be a hydrogen atom or a deuterium atom.

In Formula H-1, o1 and o2 may each independently be an integer from 0 to 4. When each of o1 and o2 is 0, the second compound of an embodiment may not be substituted with each of $R_{31}$ and $R_{32}$. In Formula H-1, the embodiment in which each of o1 and o2 is 4 and $R_{31}$s and $R_{32}$s are each hydrogen atoms may be the same as the embodiment in which each of o1 and o2 in Formula H-1 is 0. When each of o1 and o2 is an integer of 2 or more, a plurality of $R_{31}$s and $R_{32}$s may each be the same or at least one among the plurality of $R_{31}$s and $R_{32}$s may be different from the others. For example, in Formula H-1, both (e.g., simultaneously) o1 and o2 may be 0. In this embodiment, the carbazole group in Formula H-1 corresponds to an unsubstituted one (i.e., unsubstituted carbazole group).

In Formula H-1, La may be a direct linkage, a phenylene group, a divalent biphenyl group, a divalent carbazole group, etc., but the embodiment of the present disclosure is not limited thereto. For example, $Ar_c$ may be a substituted or unsubstituted carbazole group, a substituted or unsubstituted dibenzofuran group, a substituted or unsubstituted dibenzothiophene group, a substituted or unsubstituted biphenyl group, etc., but the embodiment of the present disclosure is not limited thereto.

The emission layer EML in the light emitting device ED of an embodiment may include a compound represented by Formula H-2 as the third compound:

Formula H-2

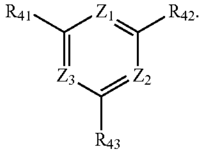

In Formula H-2, any one selected from among $Z_1$ to $Z_3$ may be N. The rest (that are not N) among $Z_1$ to $Z_3$ may be $CR_{44}$. For example, the third compound represented by Formula H-2 may include a pyridine moiety, a pyrimidine moiety, or a triazine moiety.

In Formula H-2, $R_{41}$ to $R_{44}$ may each independently be a hydrogen atom, a deuterium atom, a cyano group, a substituted or unsubstituted silyl group, a substituted or unsubstituted aryl group having 6 to 30 ring-forming carbon atoms, or a substituted or unsubstituted heteroaryl group having 2 to 30 ring-forming carbon atoms. In an embodiment, $R_{41}$ to $R_{44}$ may each independently be a substituted or unsubstituted phenyl group, a substituted or unsubstituted carbazole group, etc., but the embodiment of the present disclosure is not limited thereto.

When the emission layer EML of the light emitting device ED of an embodiment includes the second compound represented by Formula H-1 and the third compound represented by Formula H-2 in the emission layer EML at the same time (concurrently), the light emitting device ED may exhibit excellent or suitable luminous efficiency and long service life characteristics. For example, in the emission layer EML of the light emitting device ED of an embodiment, for the host, the second compound represented by Formula H-1 and the third compound represented by Formula H-2 may form an exciplex.

The second compound among the two host materials concurrently (e.g., simultaneously) included in the emission layer EML may be a hole transporting host, and the third compound may be an electron transporting host. The light emitting device ED of an embodiment may include, in the emission layer EML, both (e.g., simultaneously) the second compound which has excellent or suitable hole transport characteristics and the third compound which has excellent or suitable electron transport characteristics, thereby efficiently delivering energy to the first compound which will be described.

The emission layer EML in the light emitting device ED of an embodiment may further include the fourth compound in addition to the first compound represented by Formula 1 as described above. The emission layer EML may include, as the fourth compound, an organometallic complex containing platinum (Pt) as a central metal atom and ligands linked to the central metal atom. The emission layer EML in the light emitting device ED of an embodiment may include a compound represented by Formula D-2 as the fourth compound:

Formula D-2

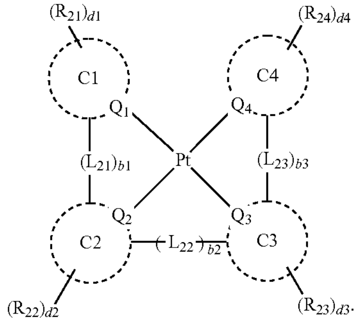

In Formula D-2, $Q_1$ to $Q_4$ may each independently be C or N.

In Formula D-2, C1 to C4 may each independently be a substituted or unsubstituted hydrocarbon ring having 5 to 30 ring-forming carbon atoms, or a substituted or unsubstituted heterocycle having 2 to 30 ring-forming carbon atoms.

In Formula D-2, $L_{21}$ to $L_{23}$ may each independently be a direct linkage,

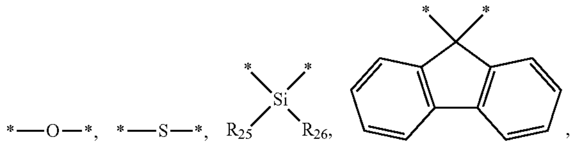

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms. In $L_{21}$ to $L_{23}$,

—* refers to a part linked to C1 to C4.

In Formula D-2, b1 to b3 may each independently be 0 or 1. When b1 is 0, C1 and C2 may not be linked to each other. When b2 is 0, C2 and C3 may not be linked to each other. When b3 is 0, C3 and C4 may not be linked to each other.

In Formula D-2, $R_{21}$ to $R_{26}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 1 to 30 ring-forming carbon atoms, and/or be bonded to an adjacent group to form a ring, For example, $R_{21}$ to $R_{26}$ may each independently be a methyl group or a t-butyl group.

In Formula D-2, d1 to d4 may each independently be an integer from 0 to 4. In some embodiments, when each of d1 to d4 is an integer of 2 or more, a plurality of $R_{21}$s to $R_{24}$s may each be the same or at least one may be different.

In Formula D-2, C1 to C4 may each independently be a substituted or unsubstituted hydrocarbon ring or a substituted or unsubstituted heterocycle represented by any one selected from among C-1 to C-3:

C-1

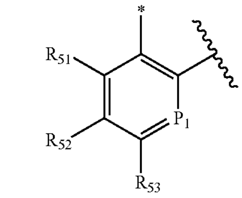

C-2

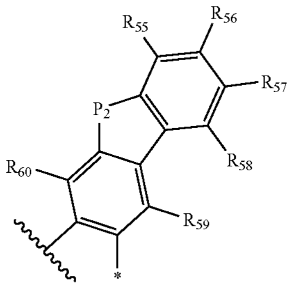

C-3

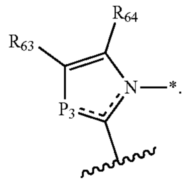

In C-1 to C-3, $P_1$ may be

C—* or $CR_{54}$, $P_2$ may be

N—* or $NR_{61}$, and $P_3$ may be

N—* or $NR_{62}$. $R_{51}$ to $R_{64}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 6 to 30 ring-forming carbon atoms, and/or be bonded to an adjacent group to form a ring.

In some embodiments, in C-1 to C-3,

“  ”

corresponds to a part linked to Pt that is a central metal atom, and "-*" corresponds to a part linked to a neighboring cyclic group (C1 to C4) or a linker ($L_{21}$ to $L_{24}$).

The fourth compound represented by Formula D-2 as described above may be a phosphorescent dopant.

In an embodiment, the first compound may be a luminescent dopant which emits blue light, and the emission layer EML may be to emit a fluorescence. In some embodiments, for example, the emission layer EML may emit blue light through the thermally activated delayed fluorescence.

In an embodiment, the fourth compound included in the emission layer EML may be a sensitizer. The fourth compound included in the emission layer EML in the light emitting device ED of an embodiment may serve as a sensitizer to deliver energy from the host to the first compound that is a light emitting dopant. For example, the fourth compound serving as an auxiliary dopant accelerates energy delivery to the first compound that is a light emitting dopant, thereby increasing the emission ratio of the first compound. Therefore, the emission layer EML of an embodiment may improve luminous efficiency. In some embodiments, when the energy delivery to the first compound is increased, an exciton formed in the emission layer EML is not accumulated inside the emission layer EML and emits light rapidly, and thus deterioration of the element may be reduced. Therefore, the service life of the light emitting device ED of an embodiment may increase.

When the emission layer EML in the light emitting device ED of an embodiment includes all of the first compound, the second compound, the third compound, and the fourth compound, with respect to the total weight of the first compound, the second compound, the third compound, and the fourth compound, the content (e.g., amount) of the first compound may be about 1 wt % to about 5 wt %, and the content (e.g., amount) of the fourth compound may be about 10 wt % to about 15 wt %.

When the contents of the first compound and the fourth compound satisfy the above-described proportion, the first compound may efficiently deliver energy to the fourth compound, and thus the luminous efficiency and device service life may increase.

The contents of the second compound and the third compound in the emission layer EML may be the rest excluding the weights of the first compound and the fourth compound described above. For example, the contents of the second compound and the third compound in the emission layer EML may be about 80 wt % to about 89 wt % with respect to the total weight of the first compound, the second compound, the third compound, and the fourth compound. In the total weight of the second compound and the third compound, the weight ratio of the second compound and the third compound may be about 3:7 to about 7:3. For example, in the total weight of the second compound and the third compound, the weight ratio of the second compound and the third compound may be about 5:5.

When the contents of the second compound and the third compound satisfy the above-described ratio, a charge balance characteristic in the emission layer EML is improved, and thus the luminous efficiency and device service life may increase.

When the contents of the second compound and the third compound deviate from the above-described ratio range, a charge balance in the emission layer EML is broken, and thus the luminous efficiency may be reduced and the device may be easily deteriorated.

When each of the first compound, the second compound, the third compound, and the fourth compound included in the emission layer EML satisfies the above-described ratio range, excellent or suitable luminous efficiency and long service life may be achieved.

The light emitting device ED of an embodiment may include all of the first compound, the second compound, the third compound, and the fourth compound, and the emission layer EML may include the combination of two host materials and two dopant materials. In the light emitting device ED of an embodiment, the emission layer EML may concurrently (e.g., simultaneously) include two different hosts, the first compound that emits a delayed fluorescence, and the fourth compound including an organometallic complex, thereby exhibiting excellent or suitable luminous efficiency characteristics.

In an embodiment, the second compound represented by Formula H-1 may be represented by any one selected from among the compounds represented by Compound Group 2. The emission layer EML may include one or more selected from among the compounds represented by Compound Group 2 as a hole transporting host material.

Compound Group 2

Compound Group 2

HTH1

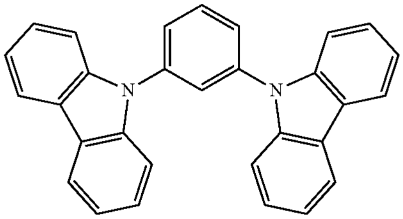

HTH2

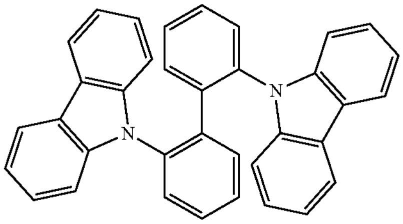

HTH3

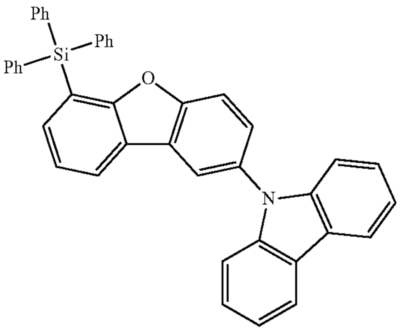

-continued

HTH4

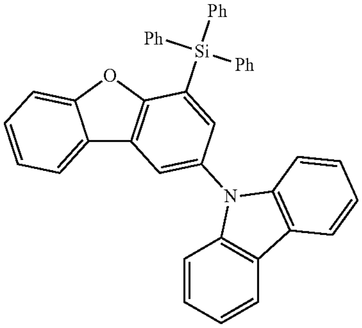

HTH5

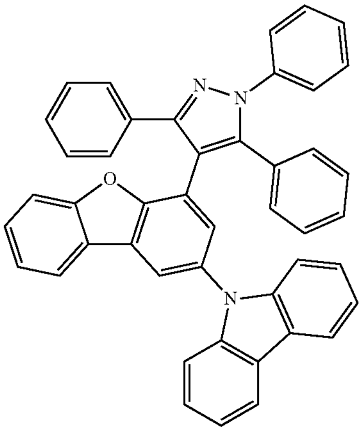

HTH6

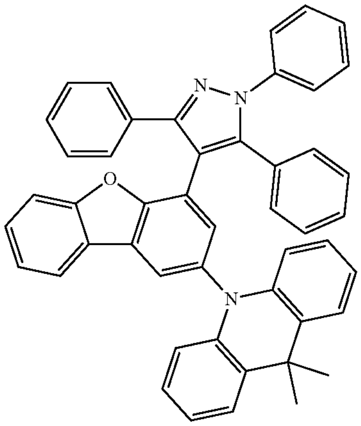

HTH7

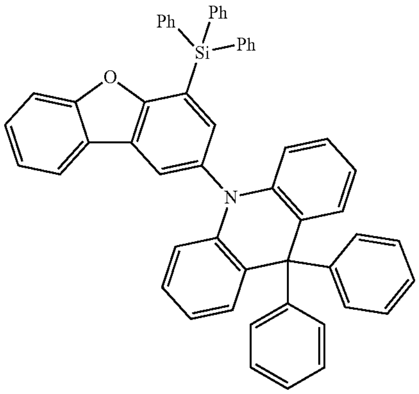

-continued
HTH8
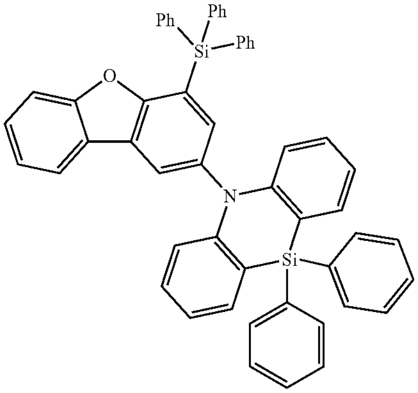
HTH9
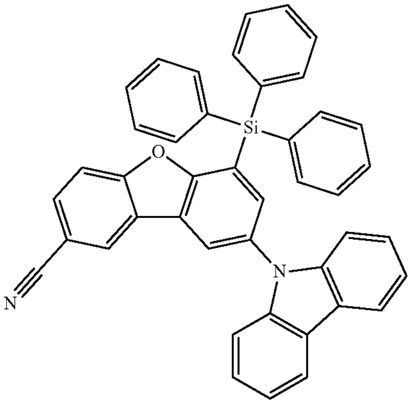
HTH10
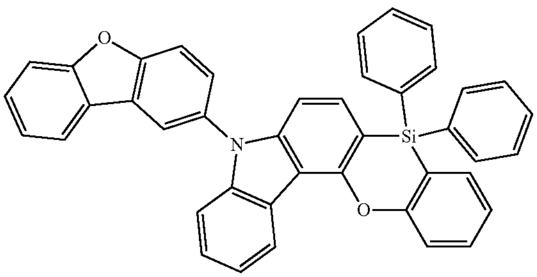
HTH11
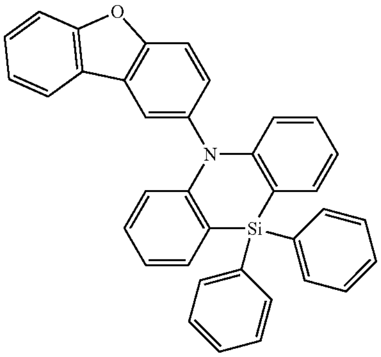
-continued
HTH12
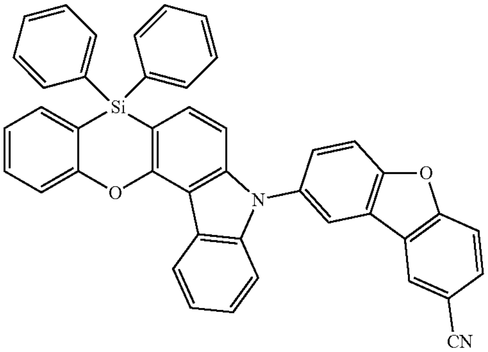
HTH13
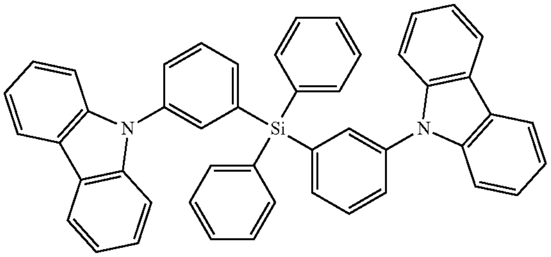
HTH14
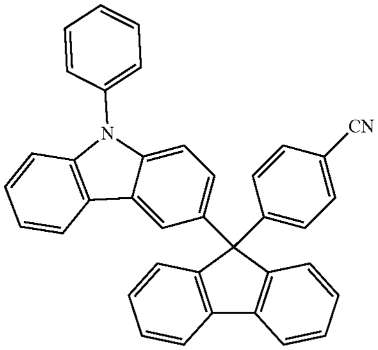
HTH15
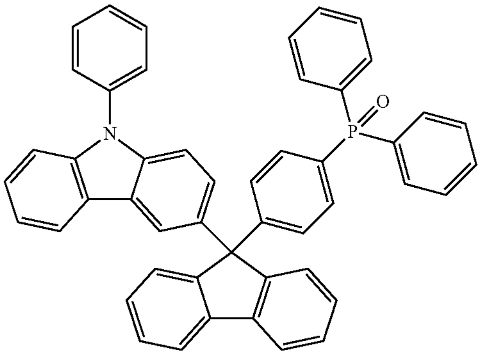

-continued
HTH16
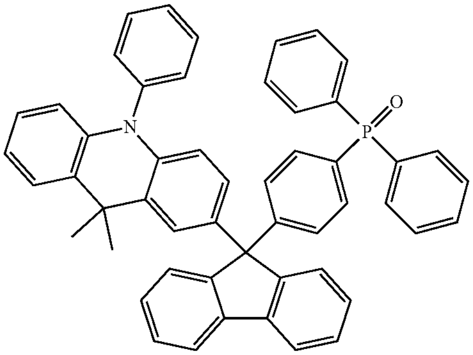
HTH17
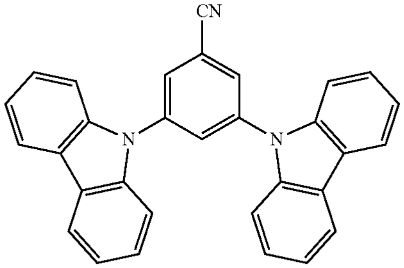
HTH18
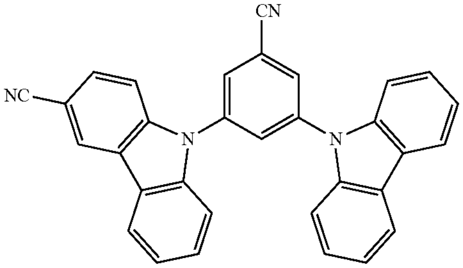
HTH19
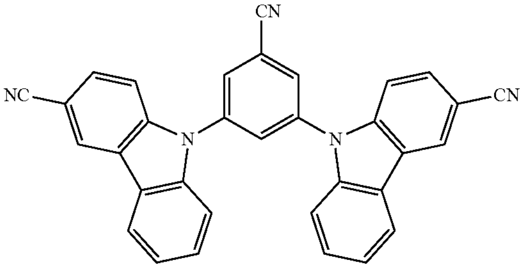
HTH20
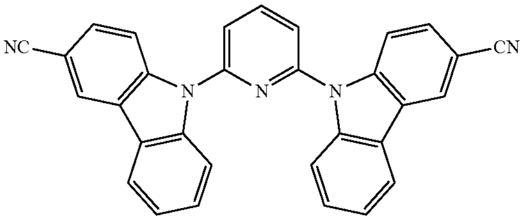
-continued
HTH21
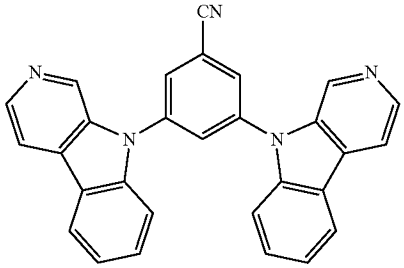
HTH22
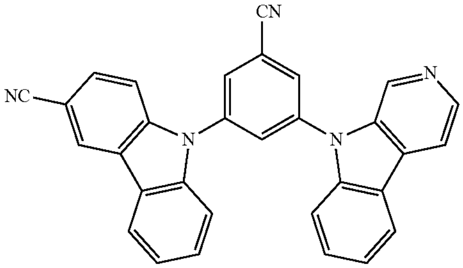
HTH23
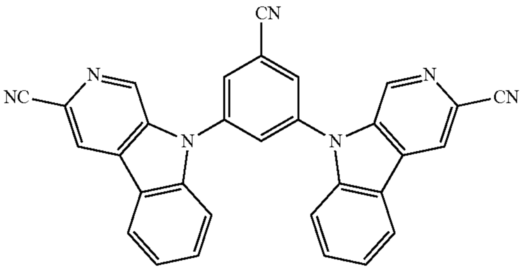
HTH24
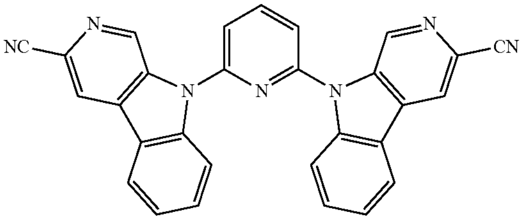
HTH25
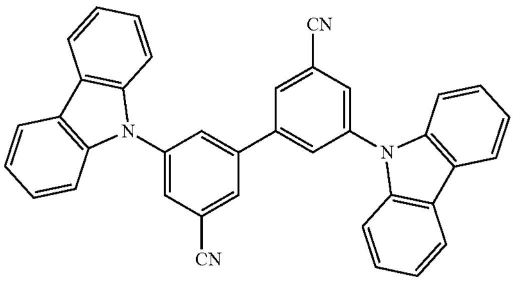

-continued
HTH26
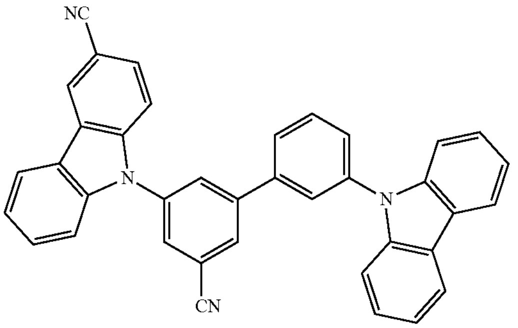
HTH27
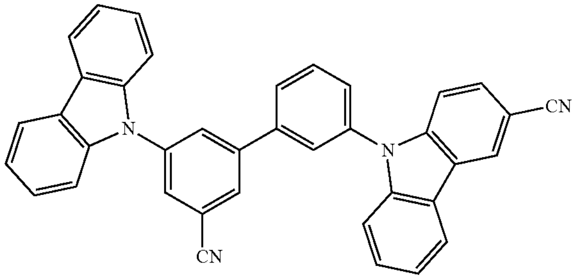
HTH28
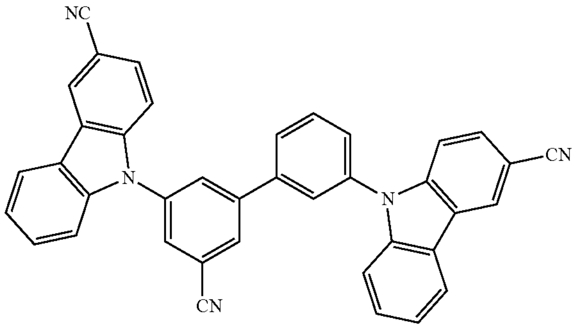
HTH29
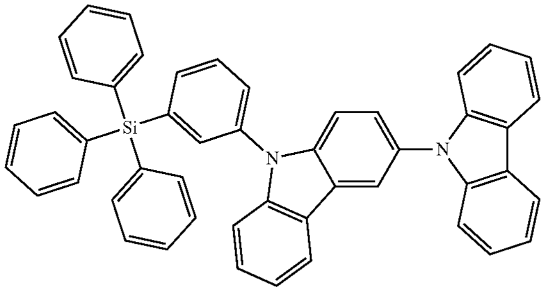
-continued
HTH30
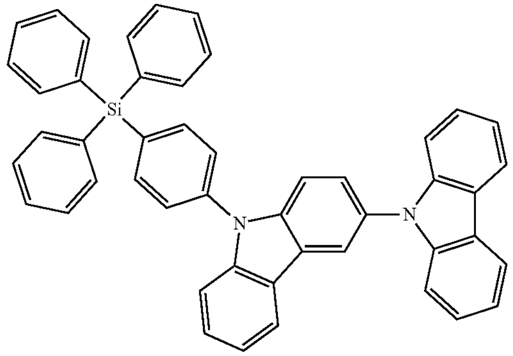
HTH31
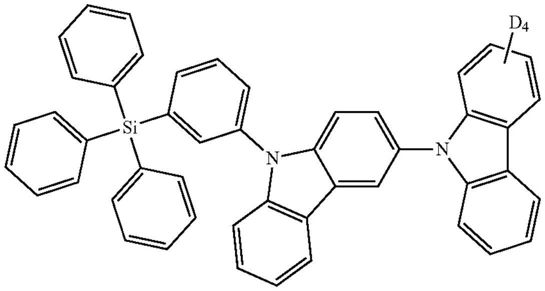
HTH32
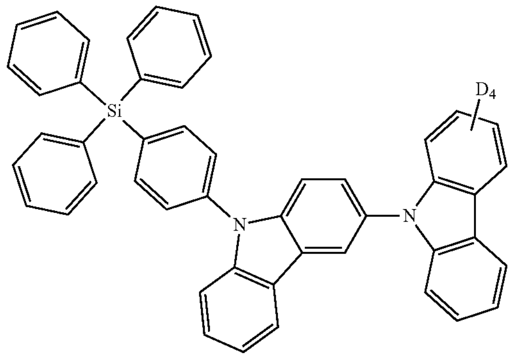
HTH33
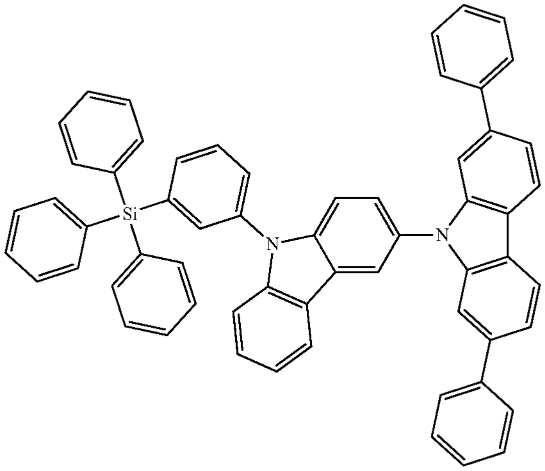

-continued
HTH34
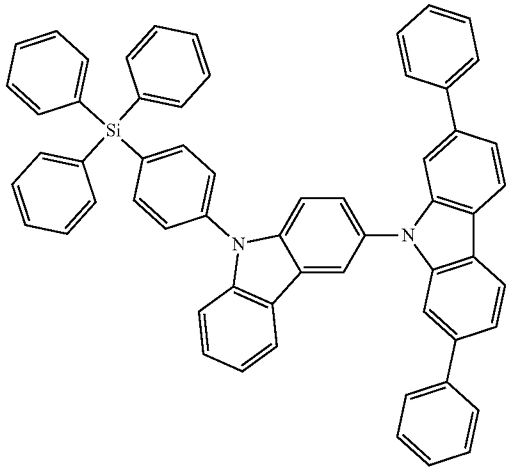
HTH35
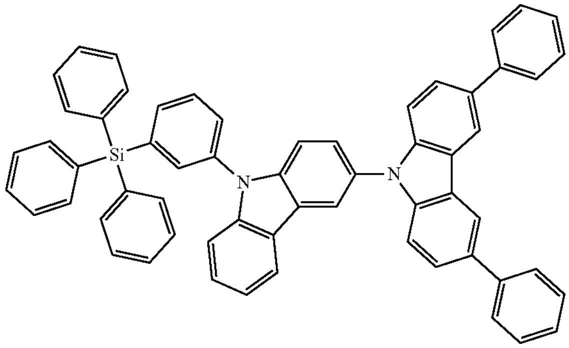
HTH36
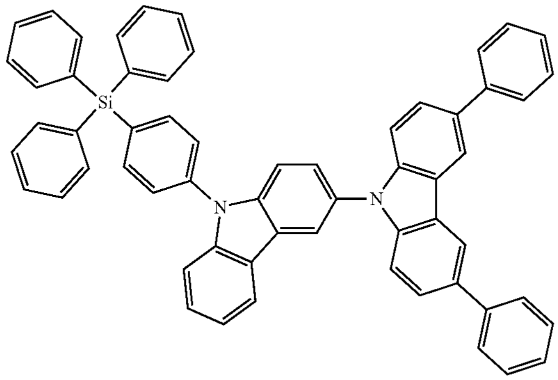
HTH37
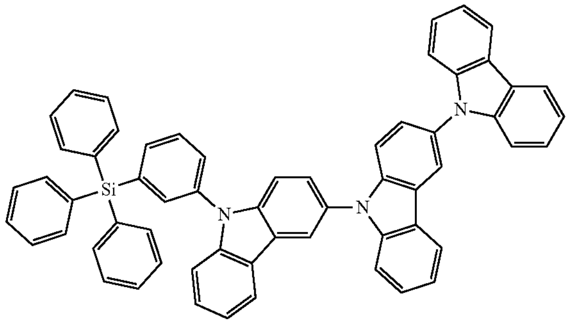
-continued
HTH38
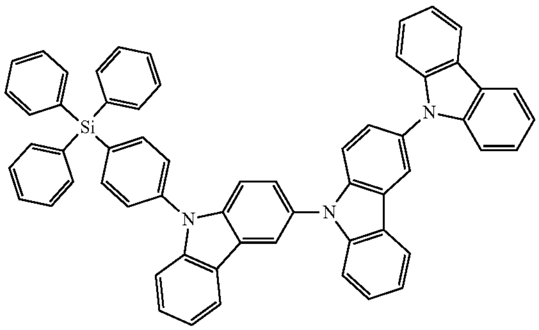
HTH39
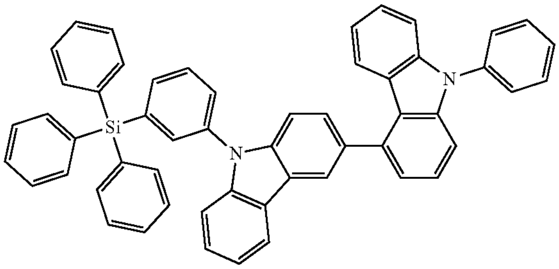
HTH40
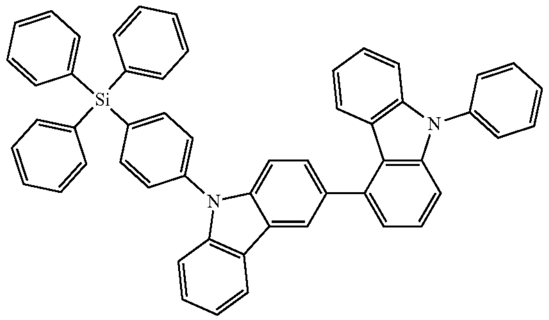
HTH41
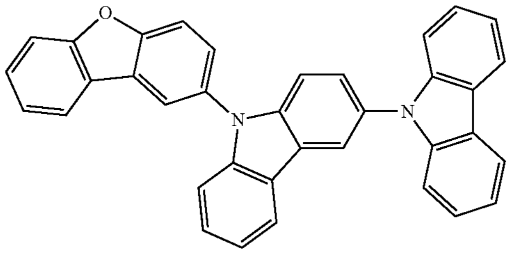
HTH42
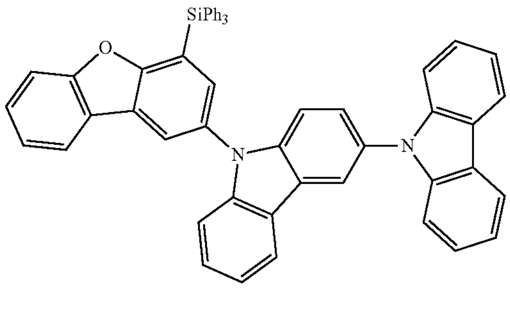

-continued
HTH43
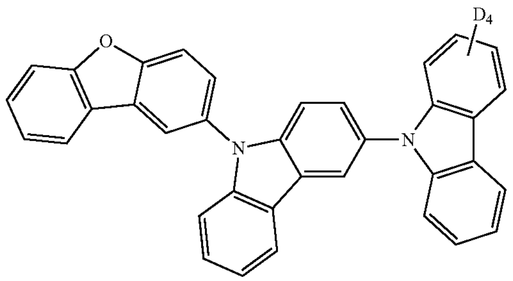
HTH44
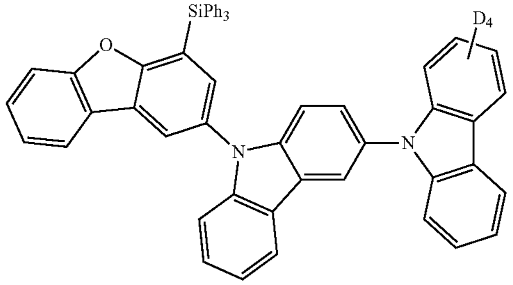
HTH45
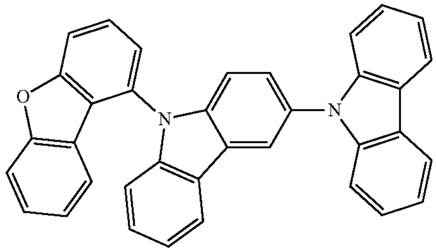
HTH46
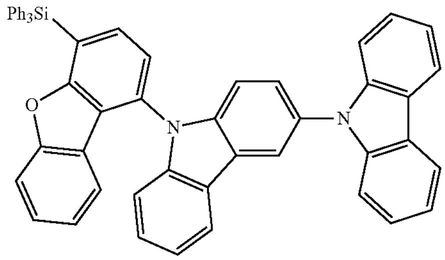
HTH47
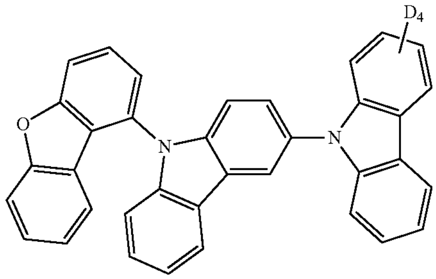
-continued
HTH48
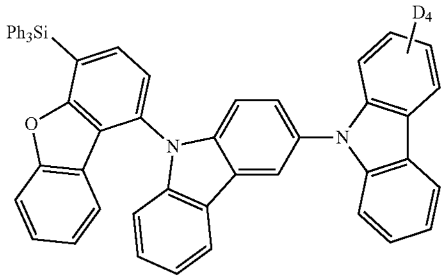
HTH49
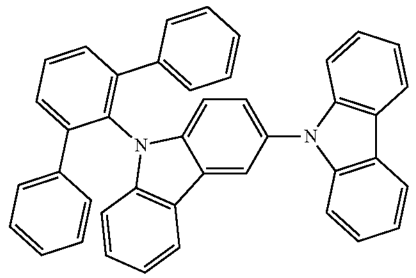
HTH50
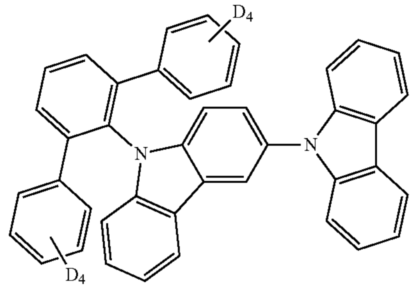
HTH51
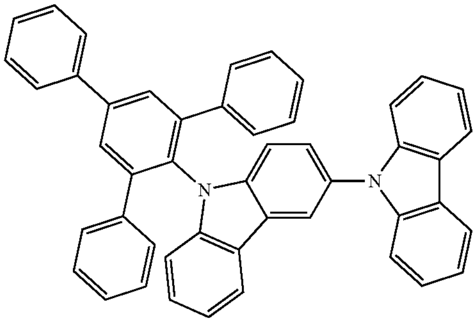
HTH52
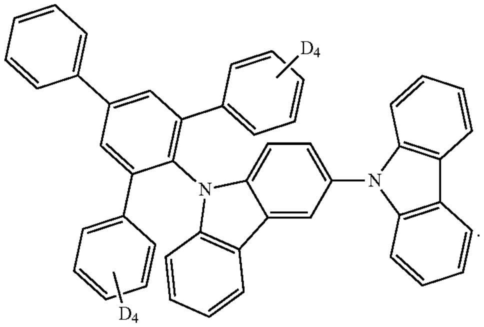

In an embodiment, the third compound represented by Formula H-2 may be represented by any one selected from among the compounds represented by Compound Group 3. The emission layer EML may include one or more selected from among the compounds represented by Compound Group 3 as an electron transporting host material.

Compound Group 3

Compound Group 3

ETH1

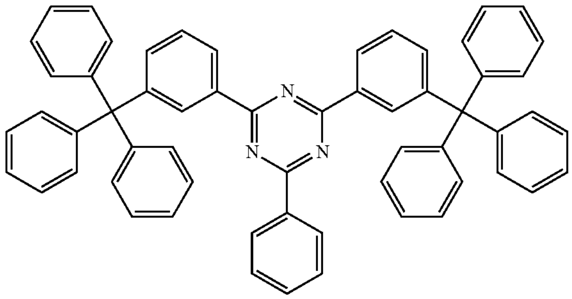

ETH2

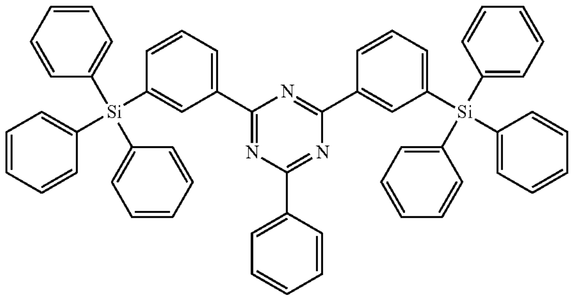

ETH3

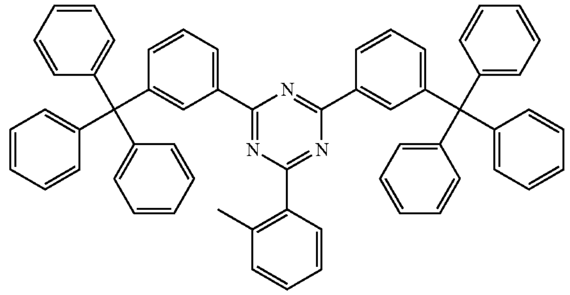

ETH4

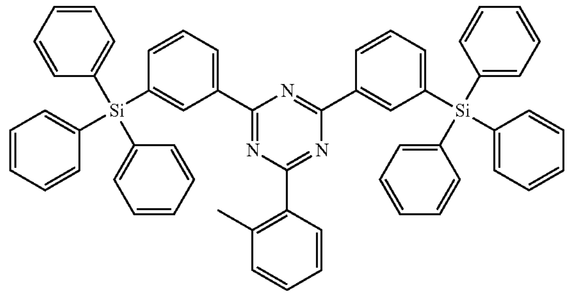

-continued

ETH5

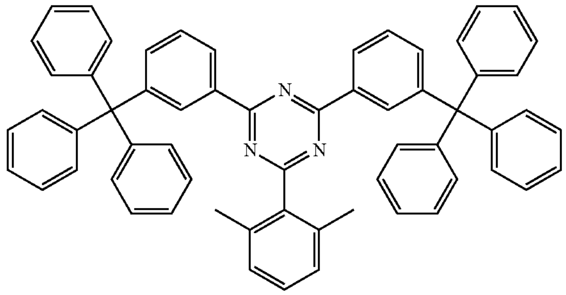

ETH6

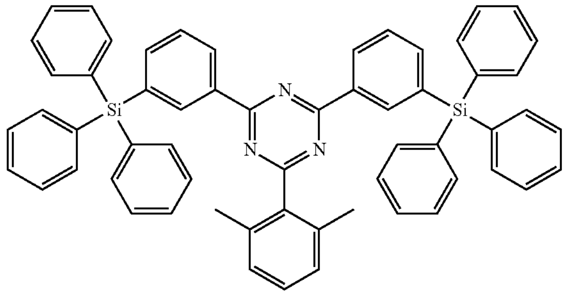

ETH7

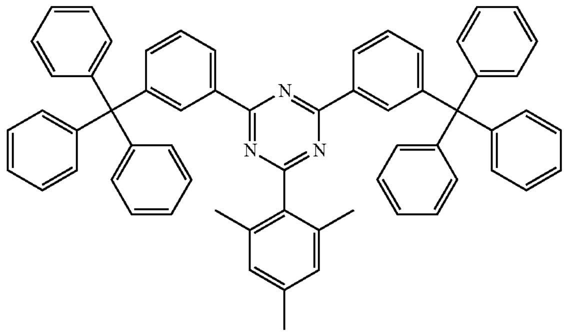

ETH8

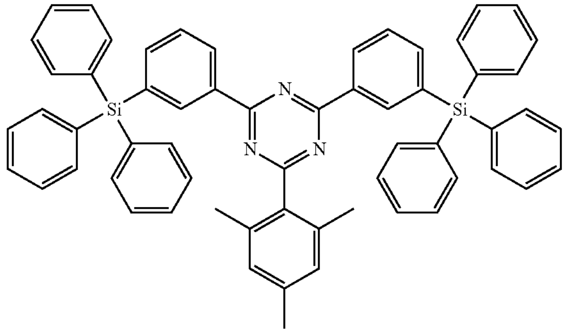

-continued
ETH9
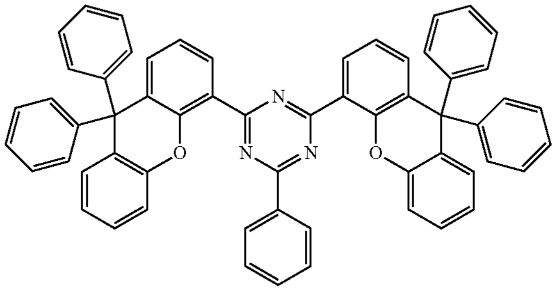
ETH10
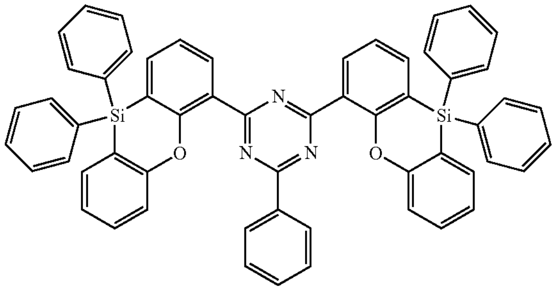
ETH11
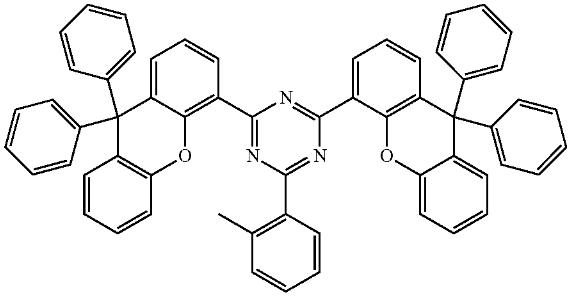
ETH12
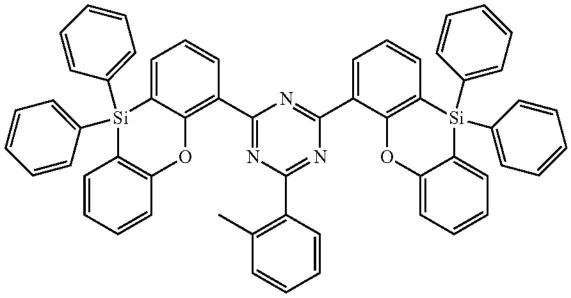
ETH13
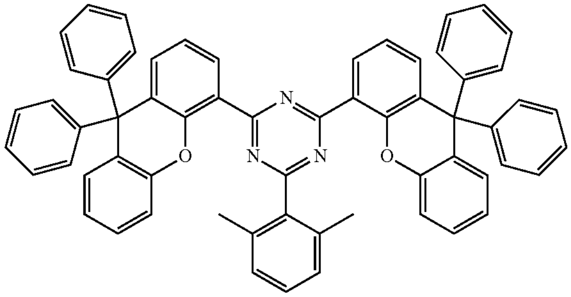
-continued
ETH14
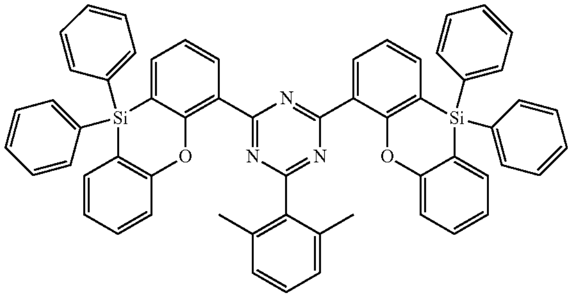
ETH15
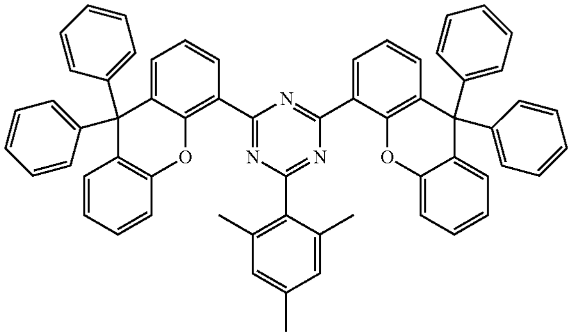
ETH16
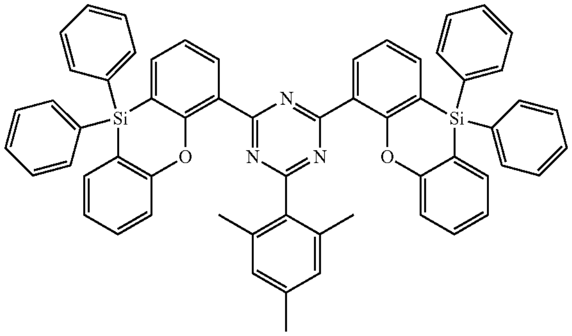
ETH17
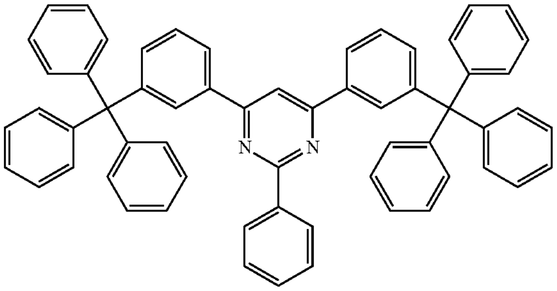

-continued
ETH18
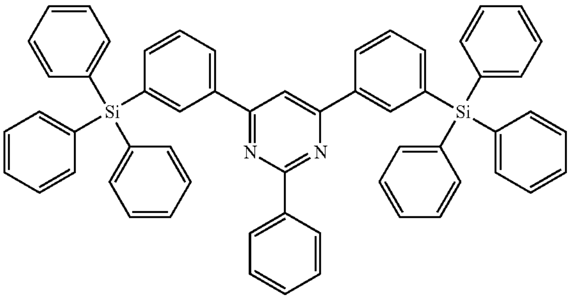
ETH19
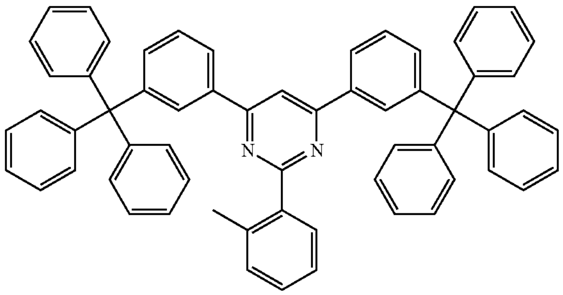
ETH20
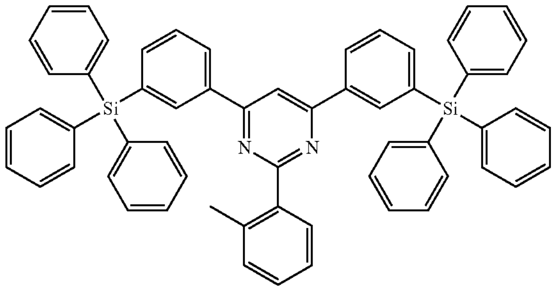
ETH21
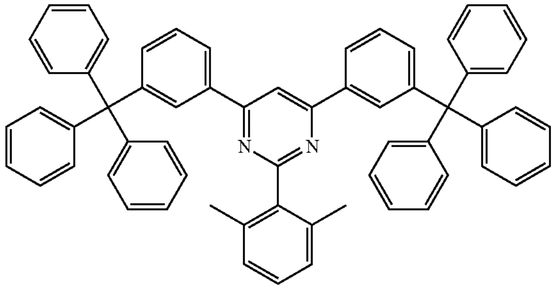
ETH22
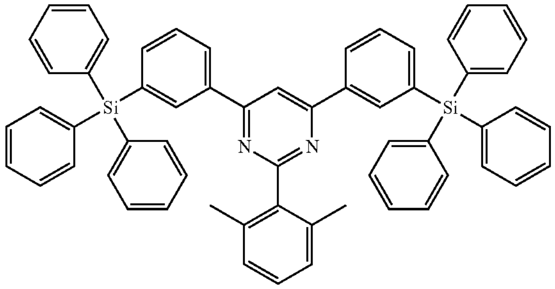
-continued
ETH23
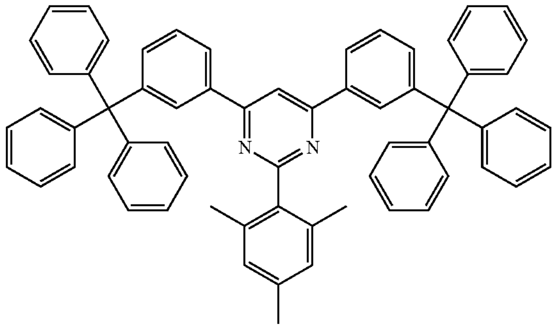
ETH24
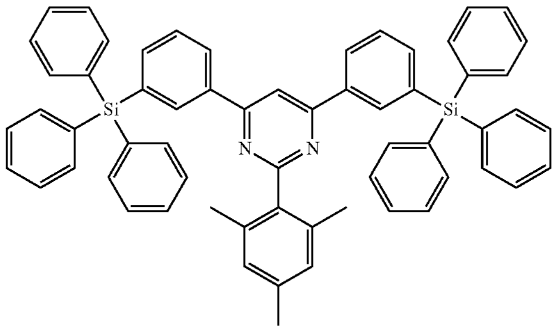
ETH25
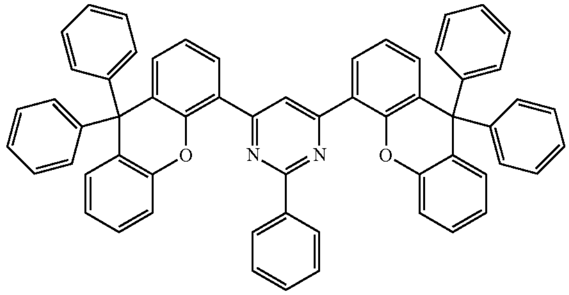
ETH26
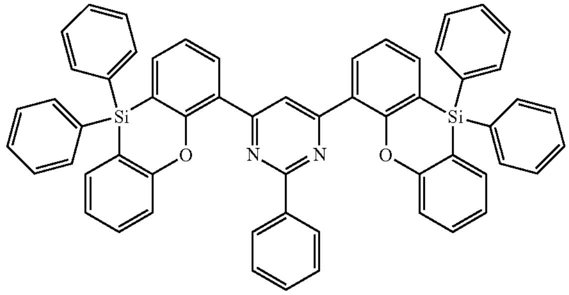

-continued
ETH27
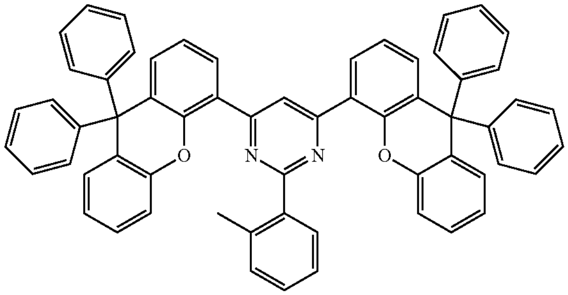
ETH28
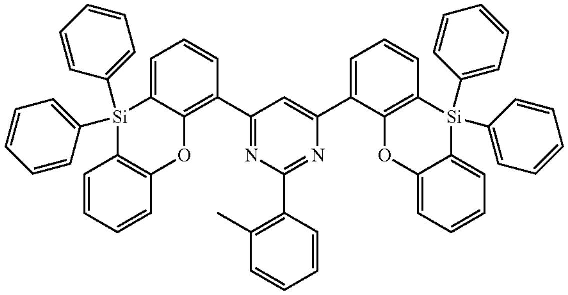
ETH29
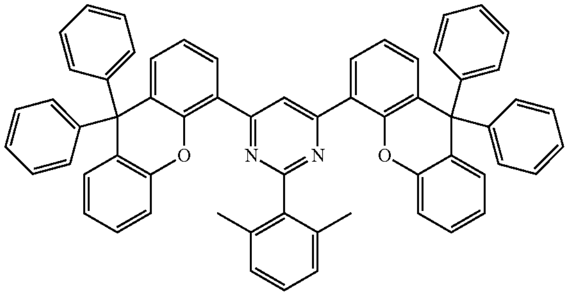
ETH30
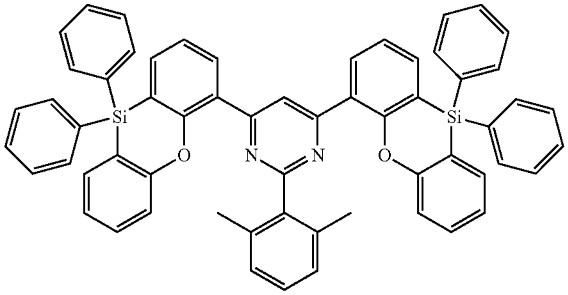
ETH31
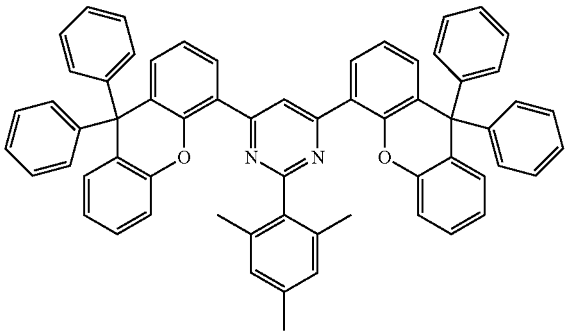
-continued
ETH32
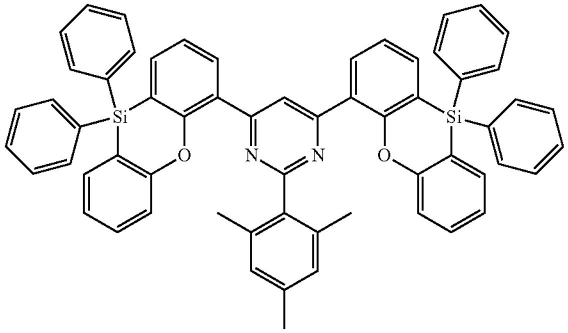
ETH33
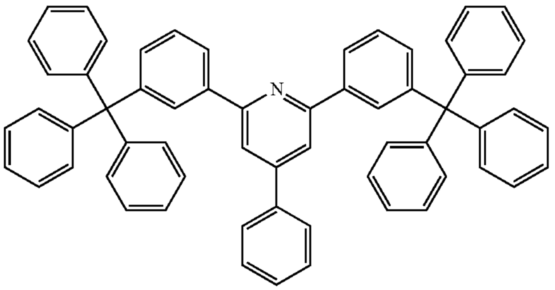
ETH34
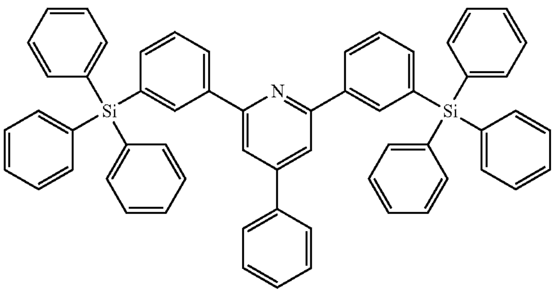
ETH35
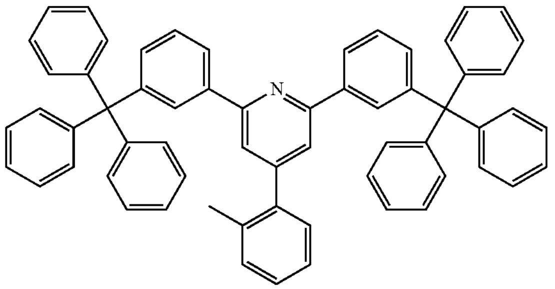
ETH36
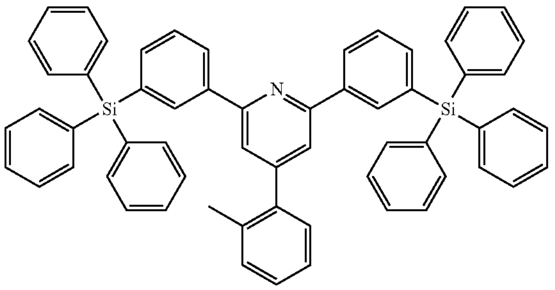

-continued
ETH37
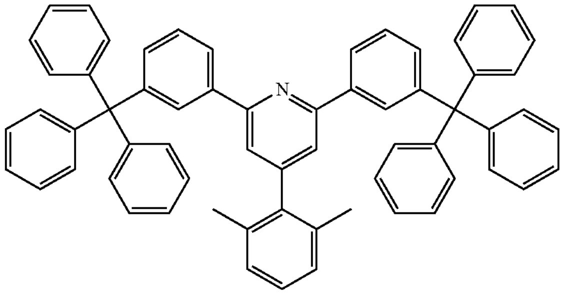
ETH38
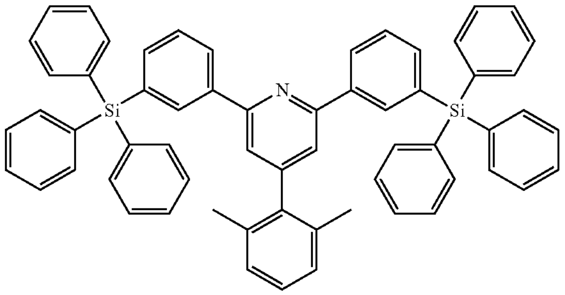
ETH39
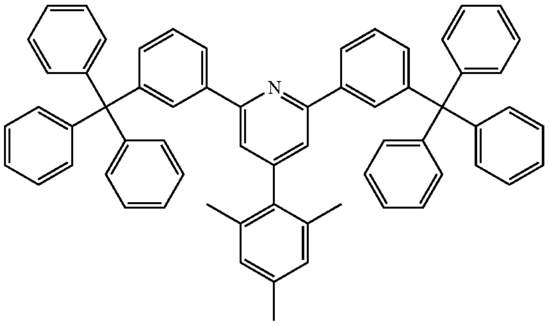
ETH40
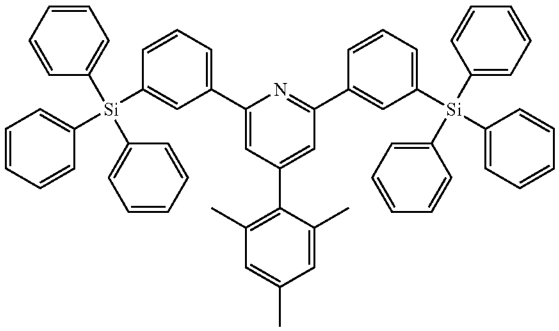
-continued
ETH41
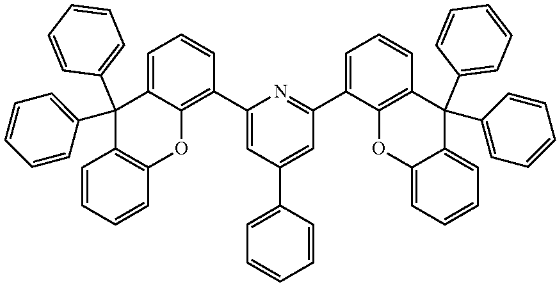
ETH42
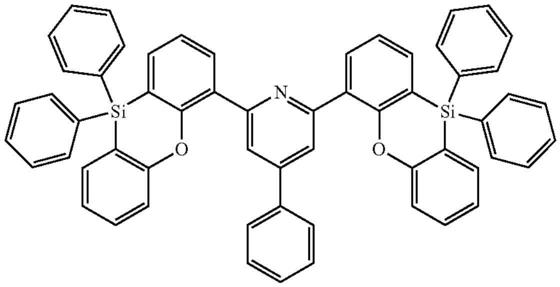
ETH43
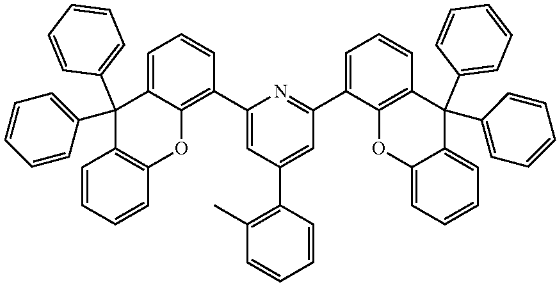
ETH44
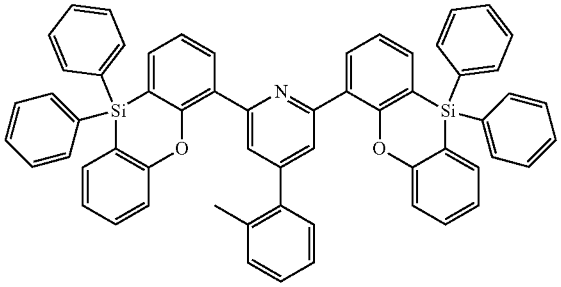
ETH45
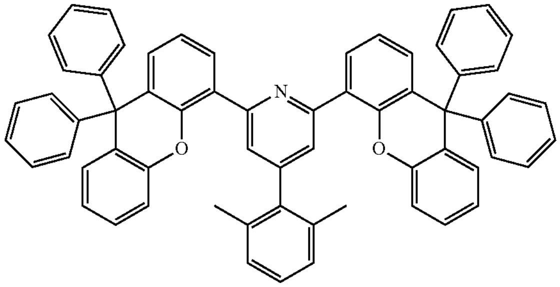

ETH46
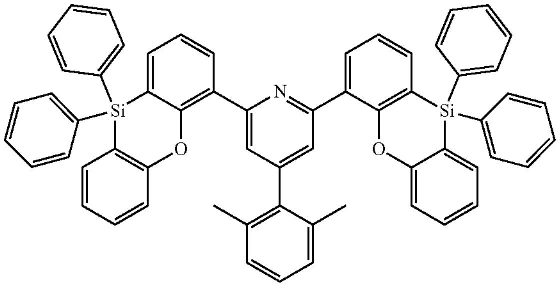
ETH47
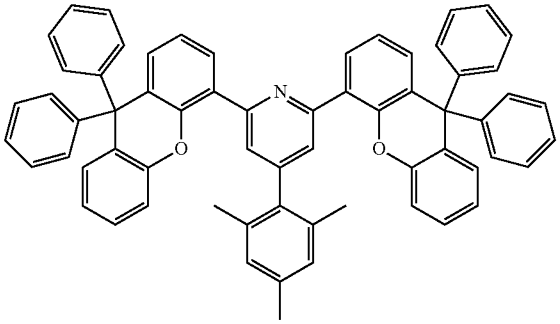
ETH48
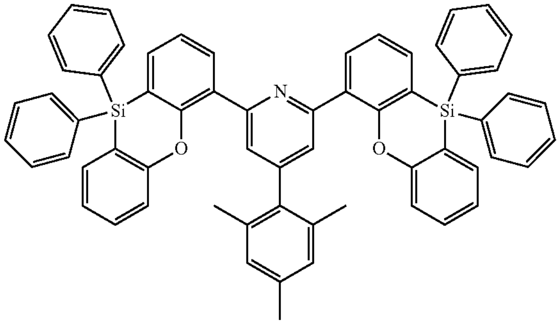
ETH49
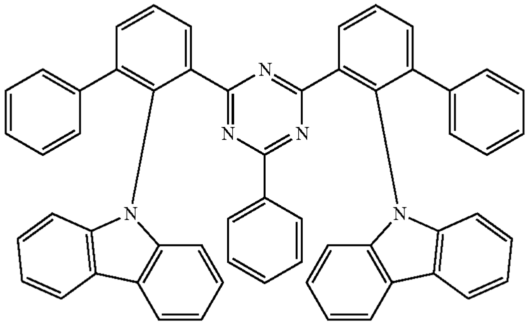
ETH50
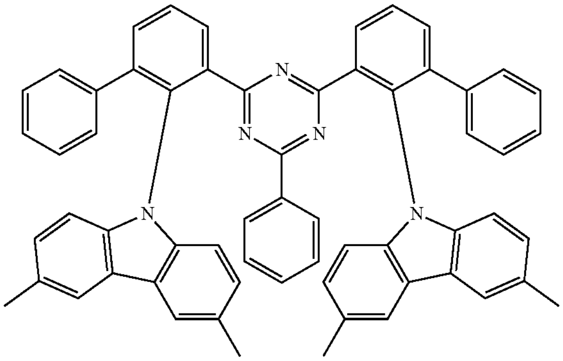
ETH51
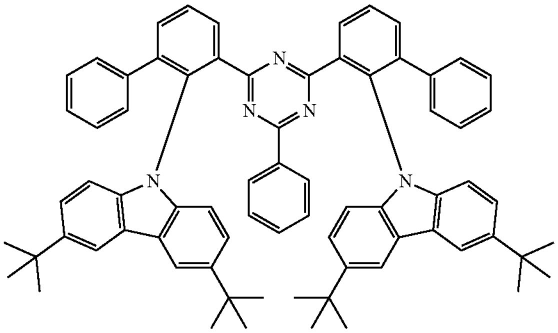
ETH52
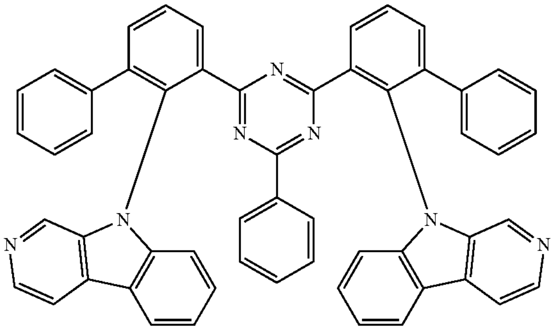
ETH53
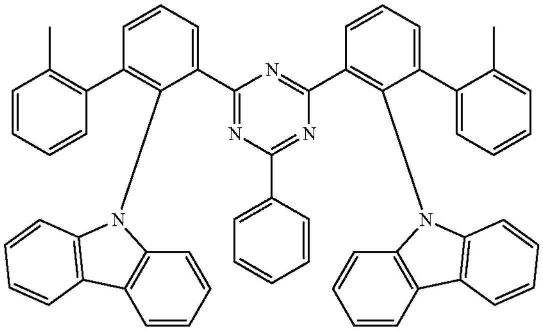

-continued
ETH54
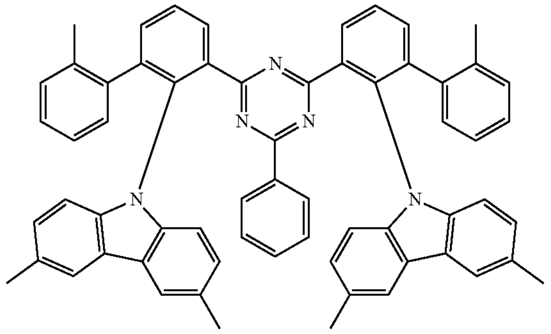
ETH55
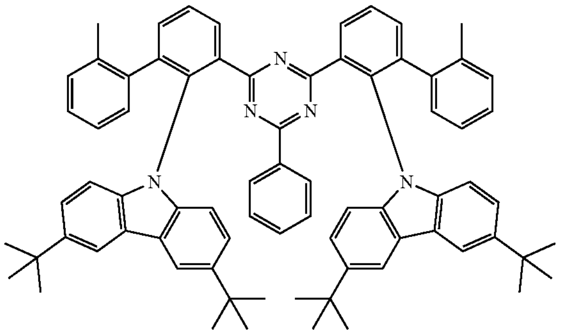
ETH56
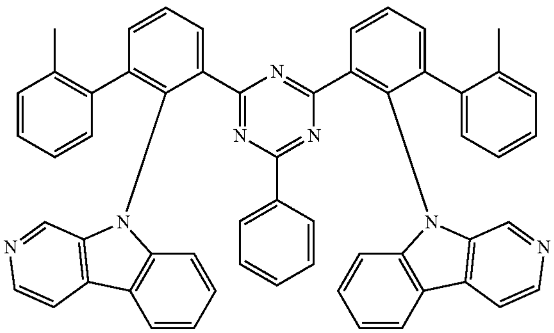
ETH57
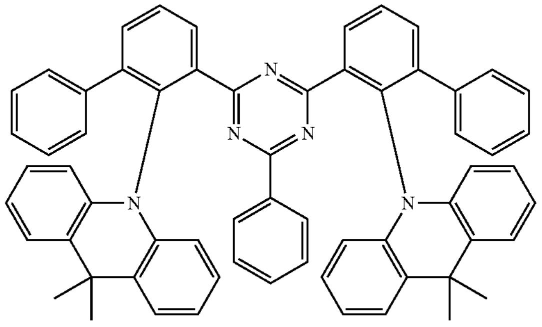
-continued
ETH58
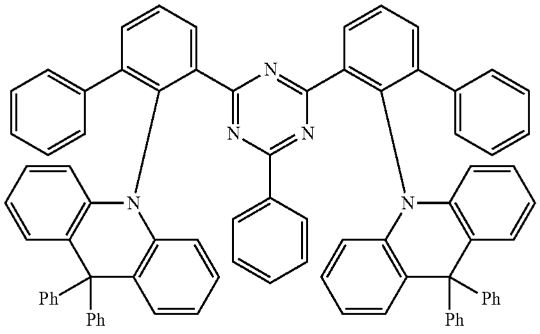
ETH59
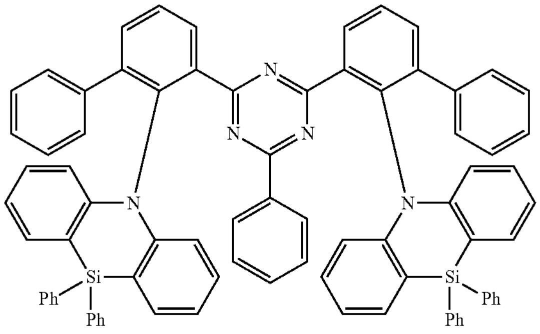
ETH60
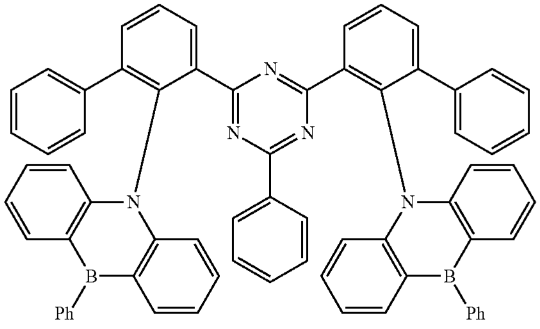
ETH61
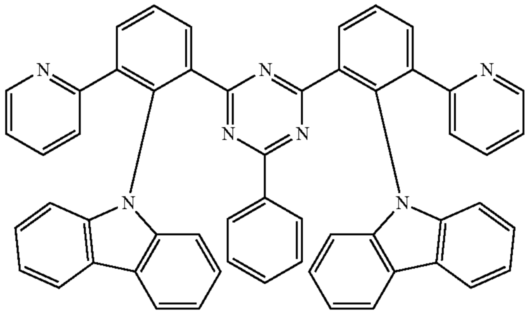

-continued
ETH62
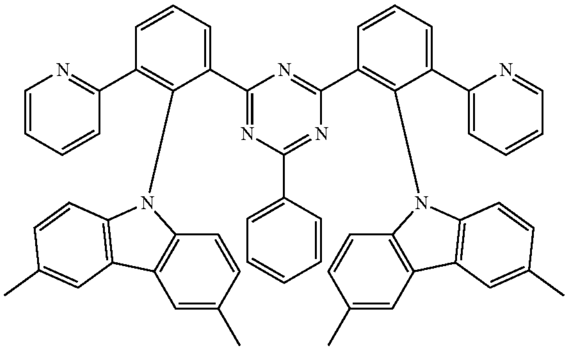
ETH63
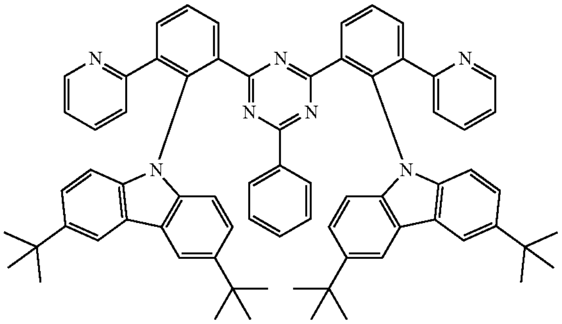
ETH64
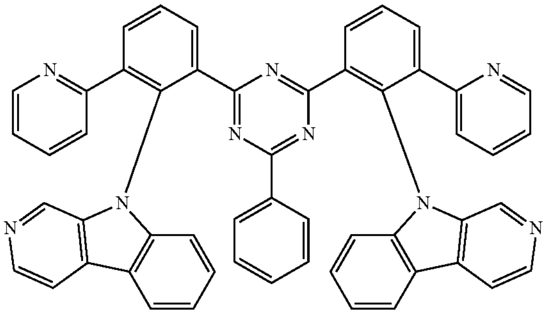
ETH65
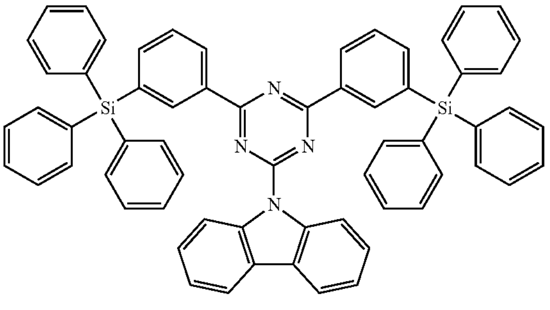
-continued
ETH66
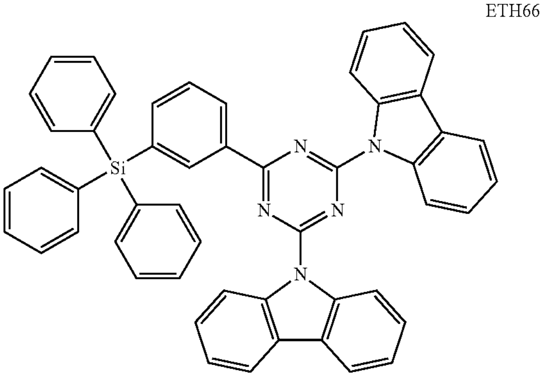
ETH67
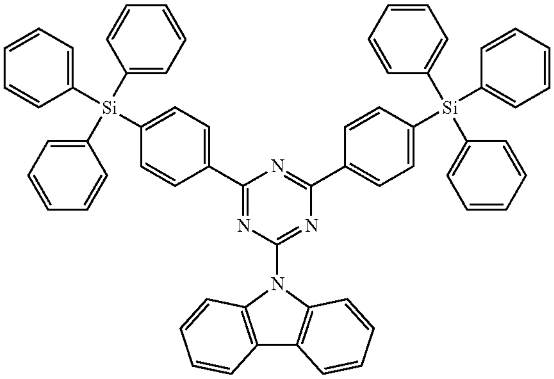
ETH68
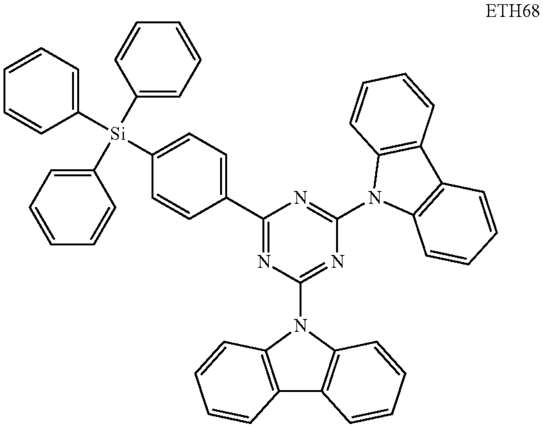
ETH69
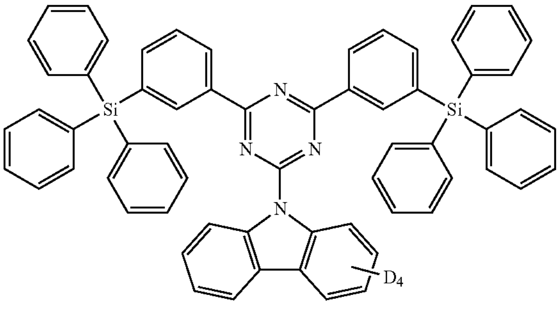

-continued
ETH70
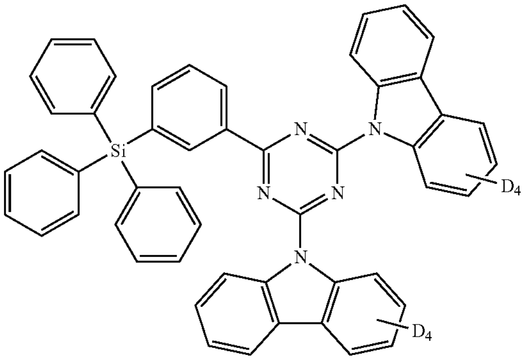
ETH71
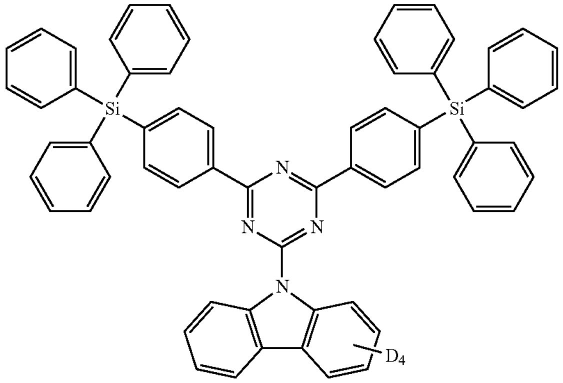
ETH72
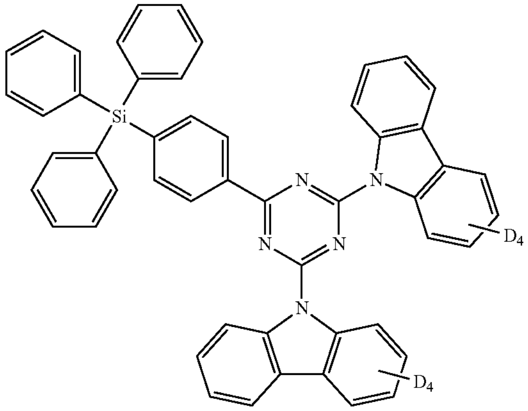
ETH73
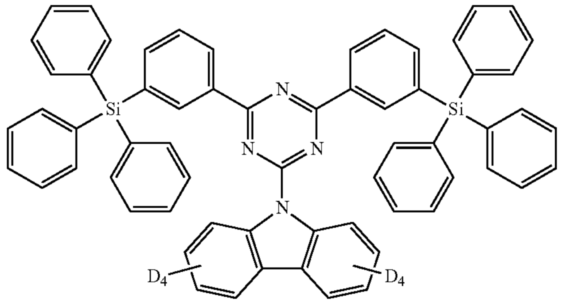
-continued
ETH74
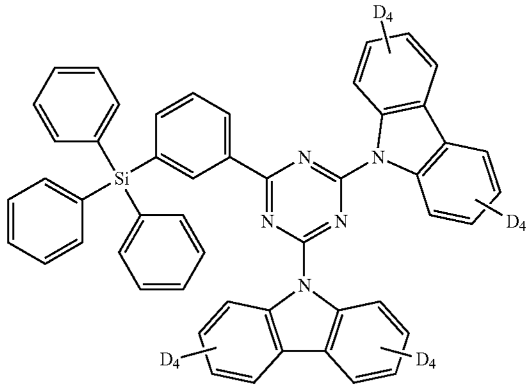
ETH75
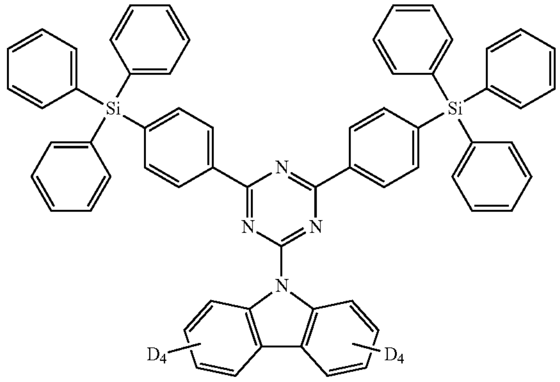
ETH76
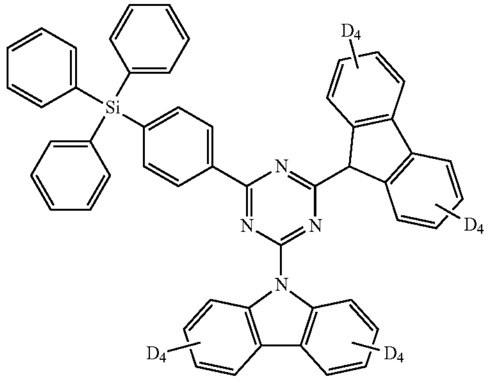

-continued
ETH77
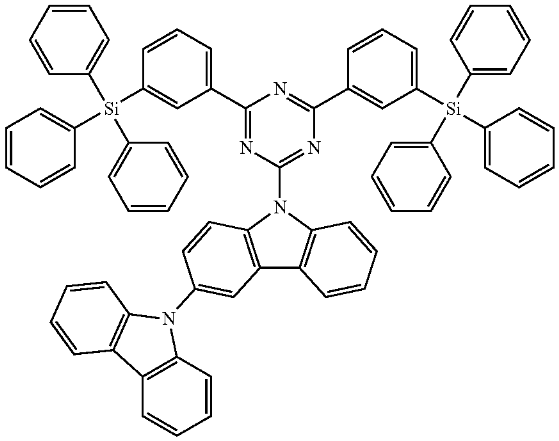
ETH78
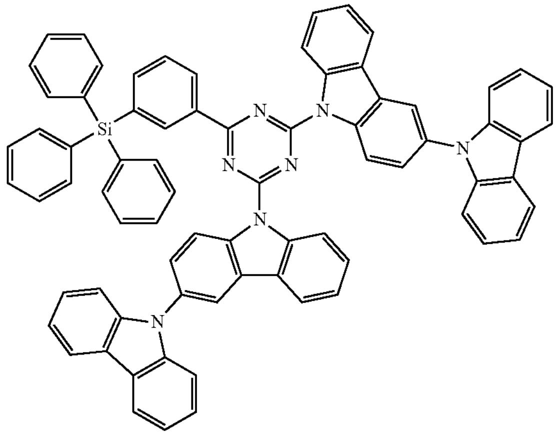
ETH79
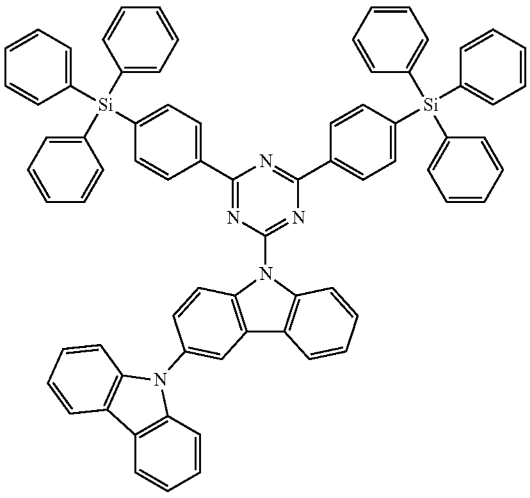
-continued
ETH80
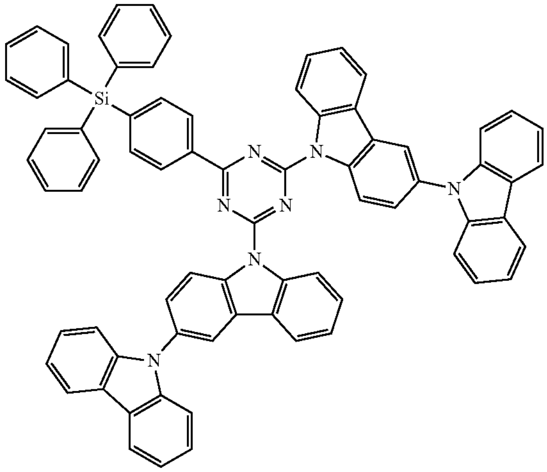
ETH81
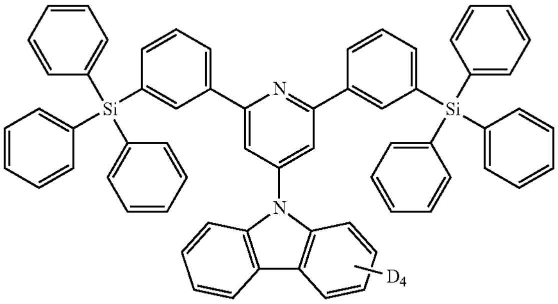
ETH82
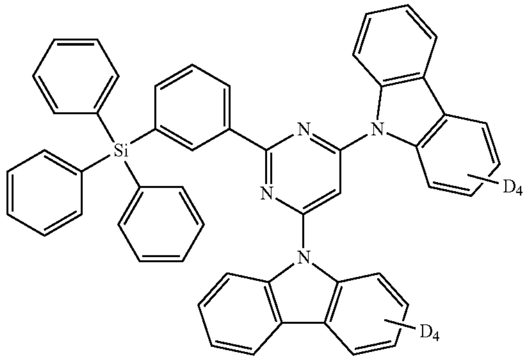
ETH83
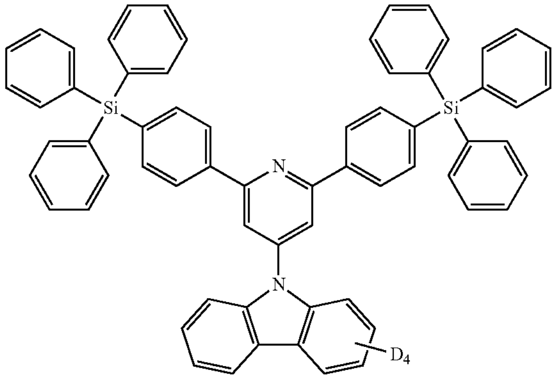

-continued

ETH84

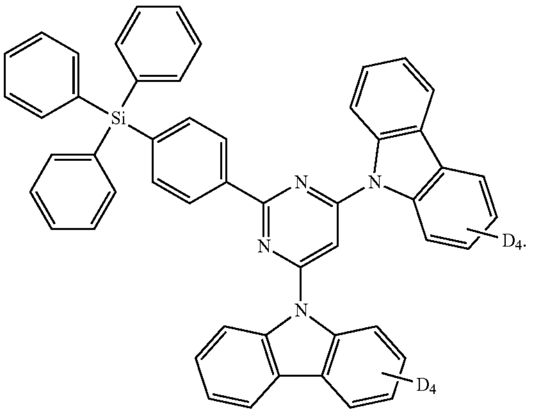

In some embodiments, D in the structures of the compounds in Compound Groups 2 and 3 refers to a deuterium atom.

In an embodiment, the emission layer EML may include one or more selected from among the compounds represented by Compound Group 4 as the fourth compound material. The emission layer EML may include at least one among the compounds represented by Compound Group 4 as a sensitizer material.

Compound Group 4

Compound Group 4

AD-01

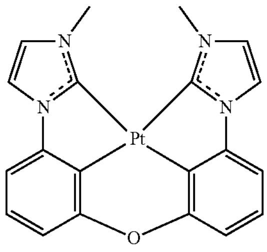

AD-02

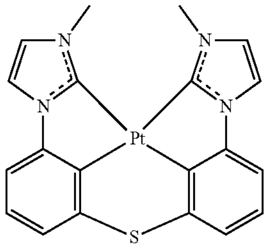

AD-03

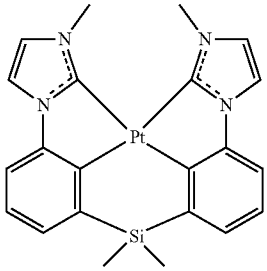

-continued

AD-04

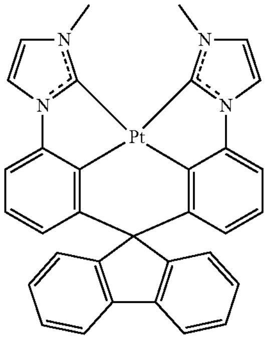

AD-05

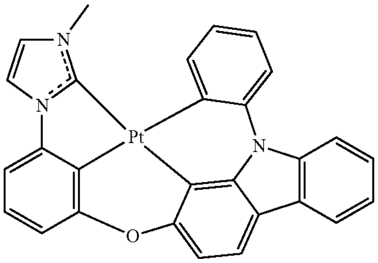

AD-06

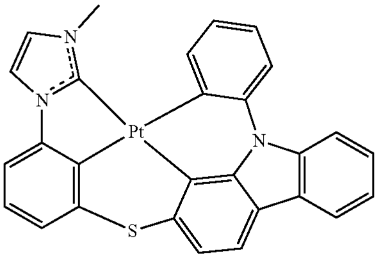

AD-07

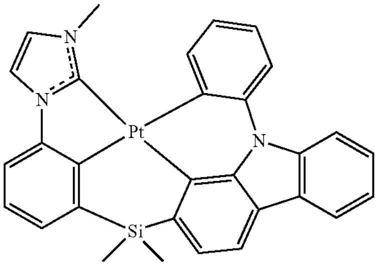

AD-08

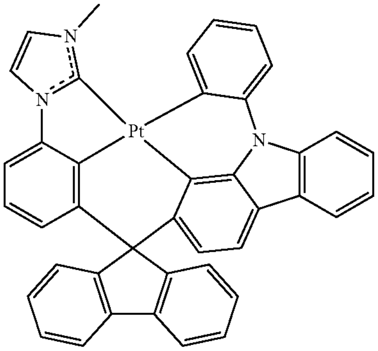

-continued
AD-09
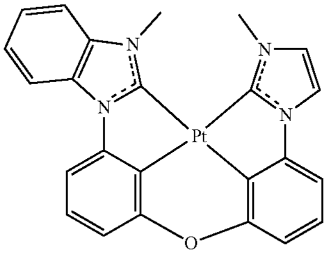
AD-10
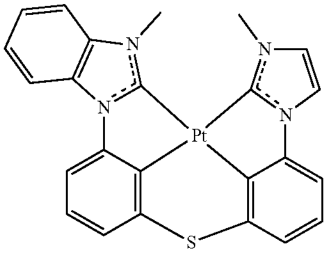
AD-11
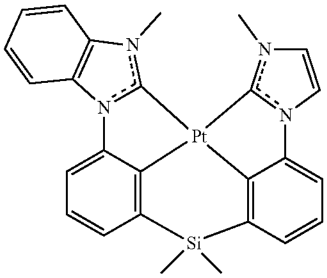
AD-12
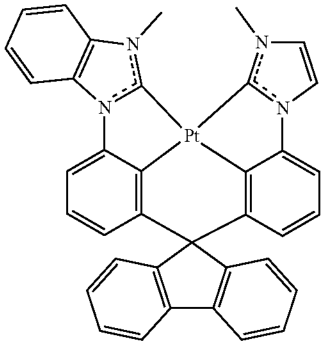
AD-13
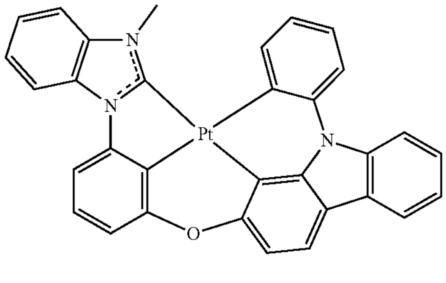
-continued
AD-14
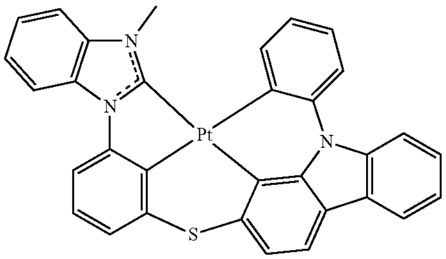
AD-15
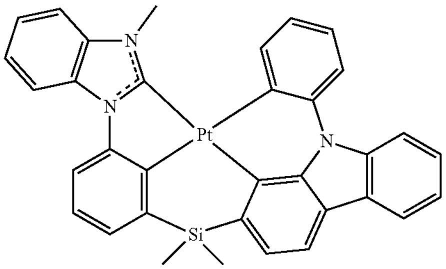
AD-16
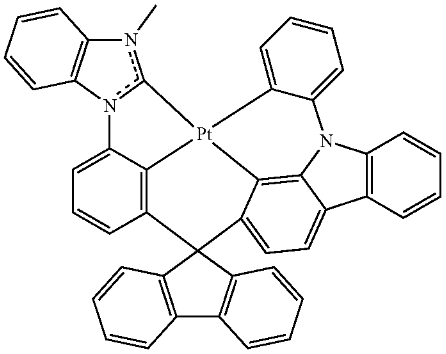
AD-17
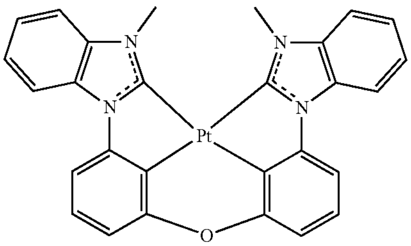
AD-18
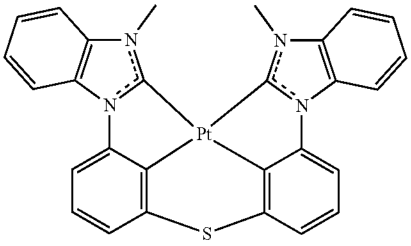

AD-19
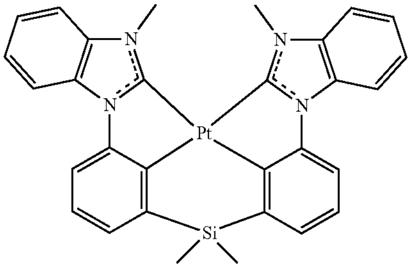
AD-20
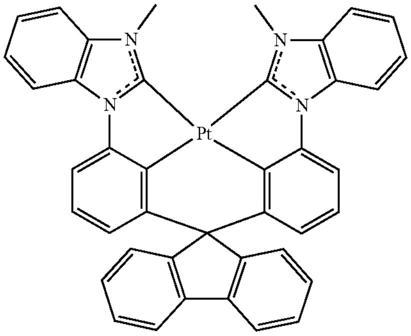
AD-21
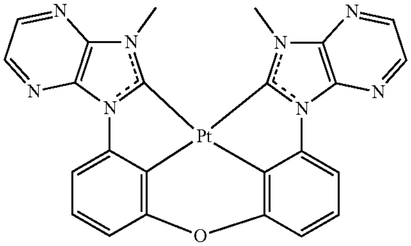
AD-22
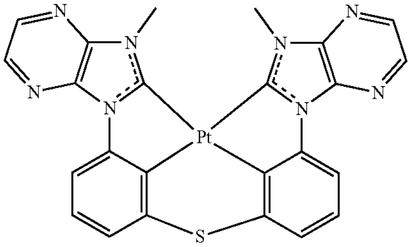
AD-23
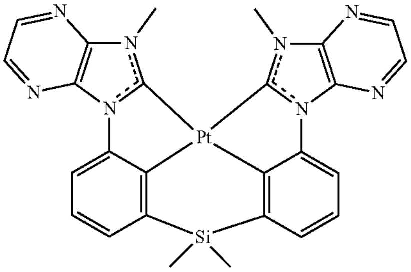
AD-24
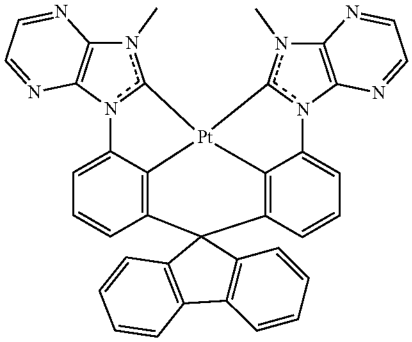
AD-25
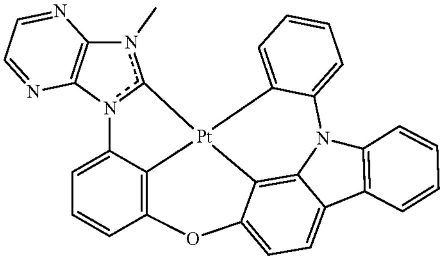
AD-26
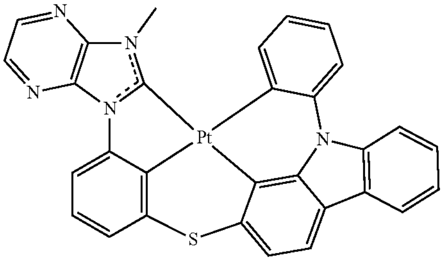
AD-27
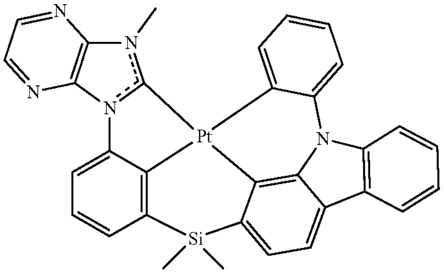
AD-28
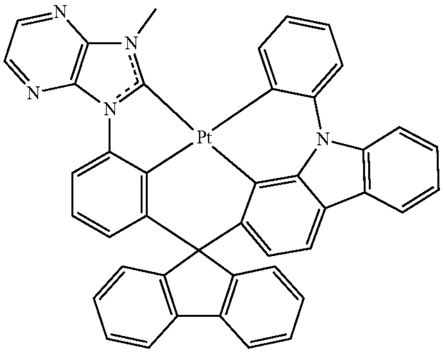

-continued
AD-29
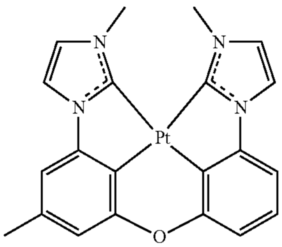
AD-30
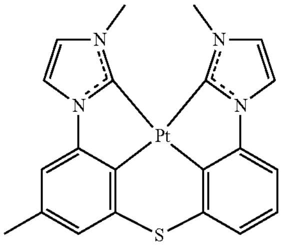
AD-31
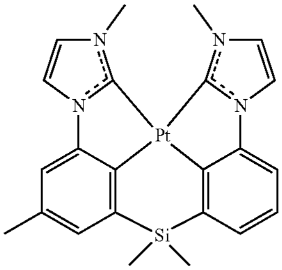
AD-32
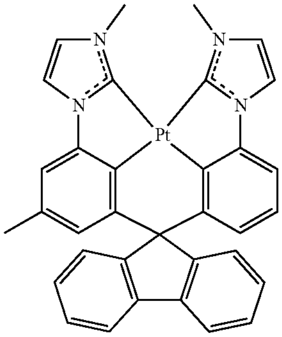
AD-33
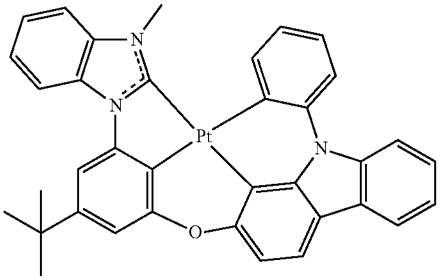
-continued
AD-34
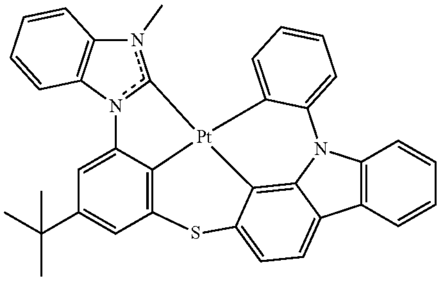
AD-35
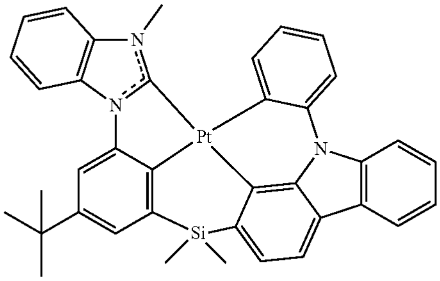
AD-36
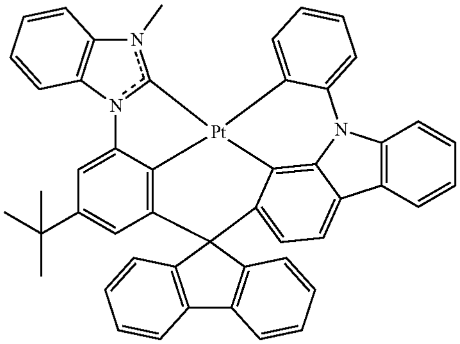
AD-37
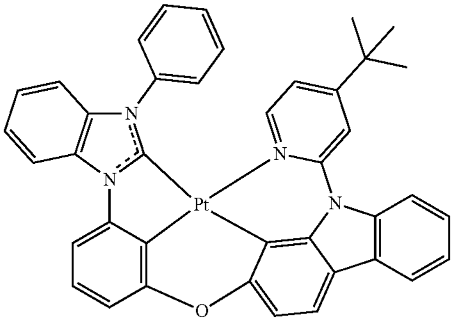

-continued

AD-38

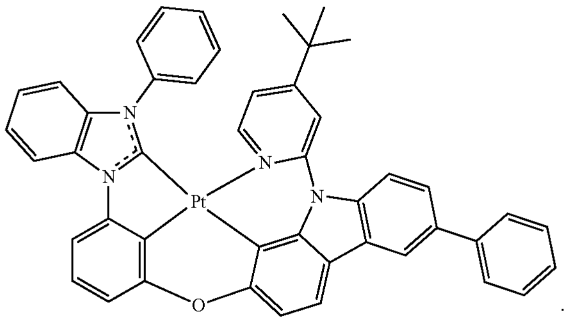

In some embodiments, the light emitting device ED of an embodiment may include a plurality of emission layers. The plurality of emission layers may be sequentially stacked and provided, and for example, the light emitting device ED including the plurality of emission layers may emit white light. The light emitting device including the plurality of emission layers may be a light emitting device having a tandem structure. When the light emitting device ED includes the plurality of emission layers, at least one emission layer EML may include all of the first compound, the second compound, the third compound, and the fourth compound as described above.

In the light emitting device ED of an embodiment, the emission layer EML may further include an anthracene derivative, a pyrene derivative, a fluoranthene derivative, a chrysene derivative, a dehydrobenzanthracene derivative, or a triphenylene derivative. For example, the emission layer EML may include the anthracene derivative or the pyrene derivative.

In each light emitting device ED of embodiments illustrated in FIGS. 3 to 6, the emission layer EML may further include a generally utilized/generally available host and dopant in addition to the above-described host and dopant, and the emission layer EML may include a compound represented by Formula E-1. The compound represented by Formula E-1 may be utilized as a fluorescent host material.

Formula E-1

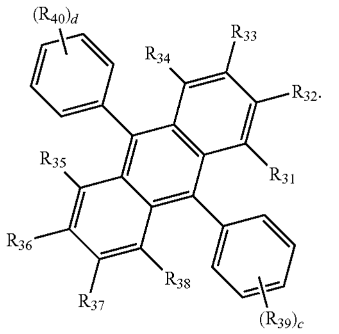

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. In some embodiments, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may each independently be an integer from 0 to 5.

Formula E-1 may be represented by any one selected from among Compound E1 to Compound E19:

E1

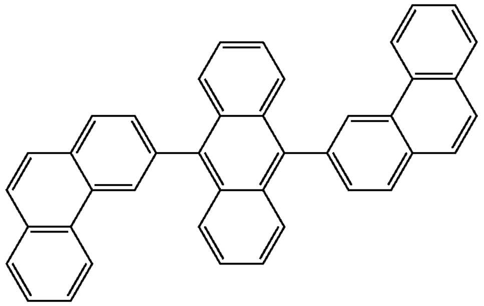

E2

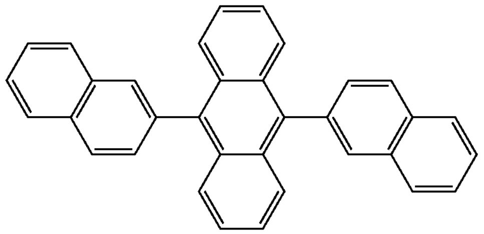

E3

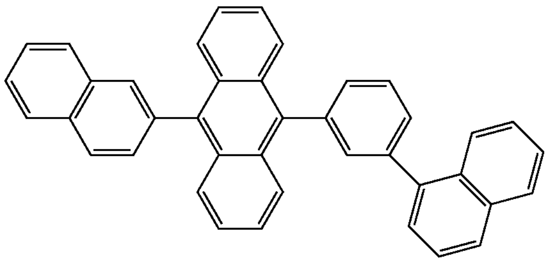

E4

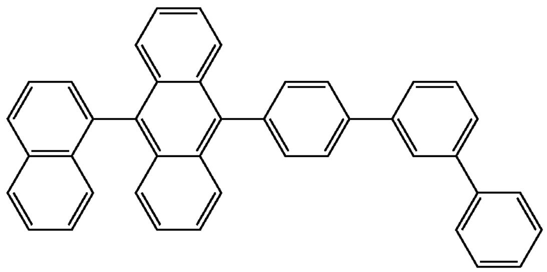

-continued
E5
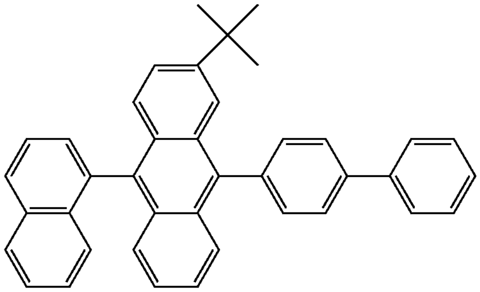
E6
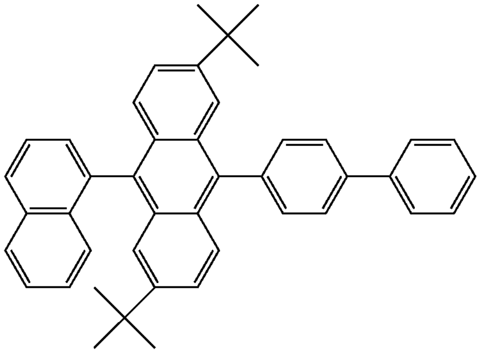
E7
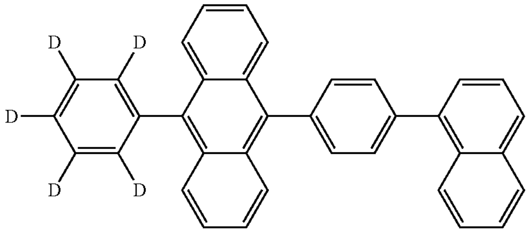
E8
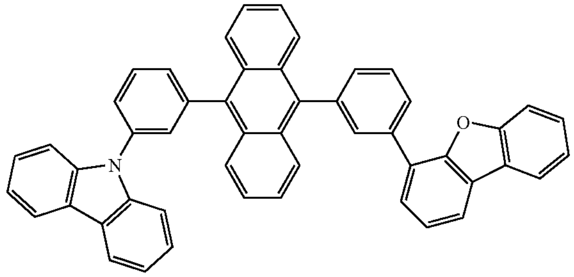
E9
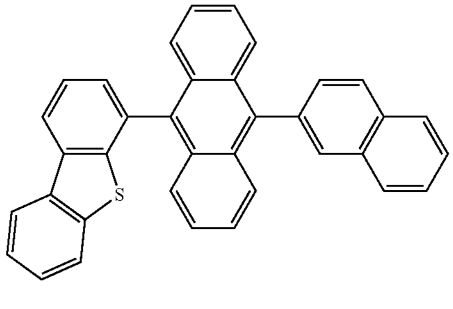
-continued
E10
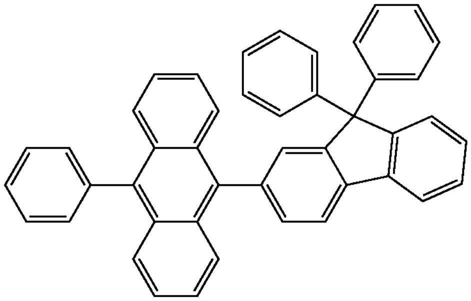
E11
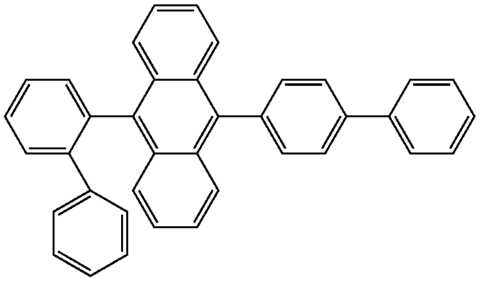
E12
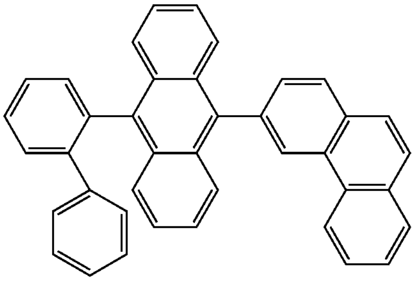
E13
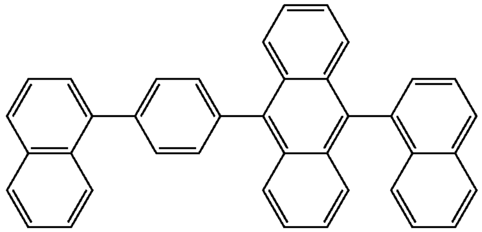
E14
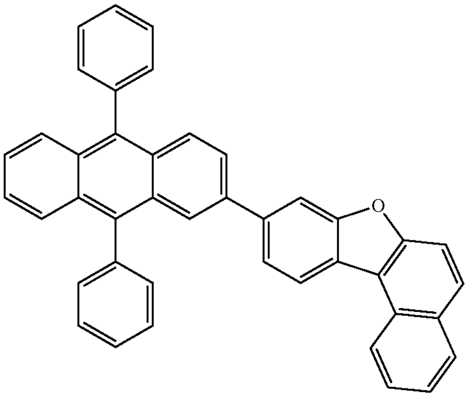

-continued

E15

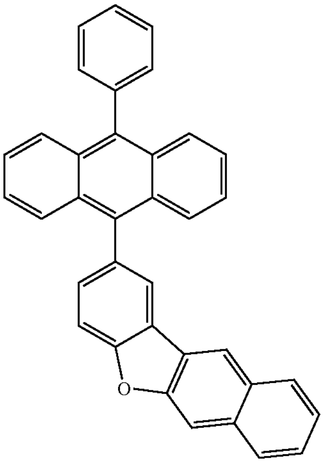

E16

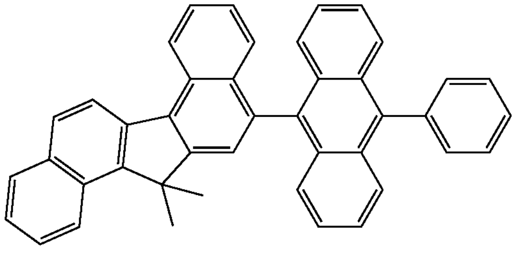

E17

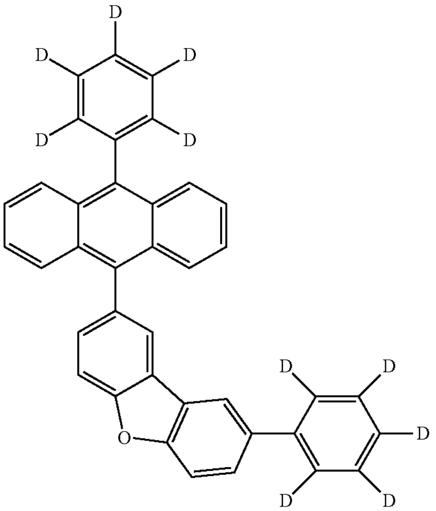

E18

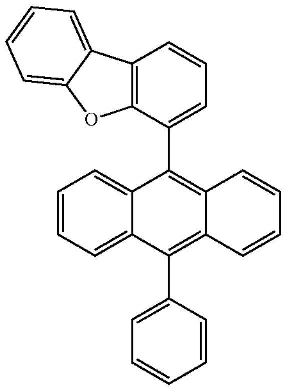

-continued

E19

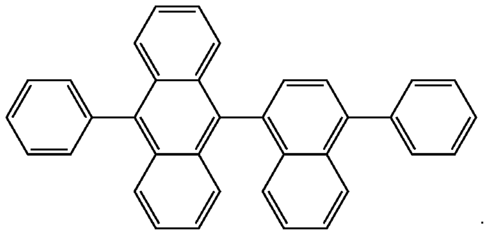

In an embodiment, the emission layer EML may include a compound represented by Formula E-2a or Formula E-2b. The compound represented by Formula E-2a or Formula E-2b may be utilized as a phosphorescent host material.

Formula E-2a

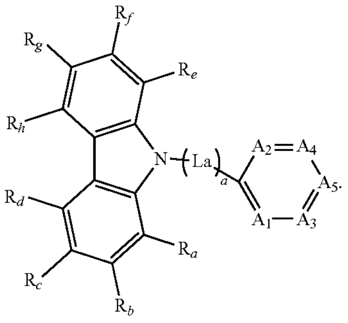

In Formula E-2a, a may be an integer from 0 to 10, La may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a is an integer of 2 or more, a plurality of Las may each independently be a substituted or unsubstituted arylene group having 6 to 30 ring-forming carbon atoms, or a substituted or unsubstituted heteroarylene group having 2 to 30 ring-forming carbon atoms.

In some embodiments, in Formula E-2a, $A_1$ to $A_5$ may each independently be N or $CR_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. $R_a$ to $R_i$ may be bonded to an adjacent group to form a hydrocarbon ring or a heterocycle containing N, O, S, etc. as a ring-forming atom.

In some embodiments, in Formula E-2a, two or three selected from among $A_1$ to $A_5$ may be N, and the rest (i.e., the substituents that are not N) may be $CR_i$.

Formula E-2b $$(Cbz1)-(L_b)_b-(Cbz2).$$

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, b is an integer from 0 to 10, and when b is an integer of 2 or more, a plurality of $L_b$s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2. However, the compounds listed in Compound Group E-2 are merely examples, and the compound represented by Formula E-2a or Formula E-2b is not limited to those represented in Compound Group E-2.

Compound Group E-2

Compound Group E-2

E-2-1

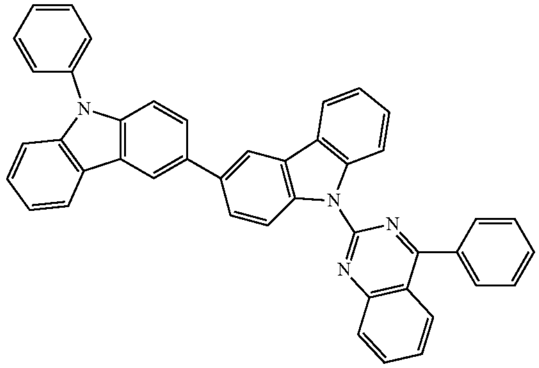

E-2-2

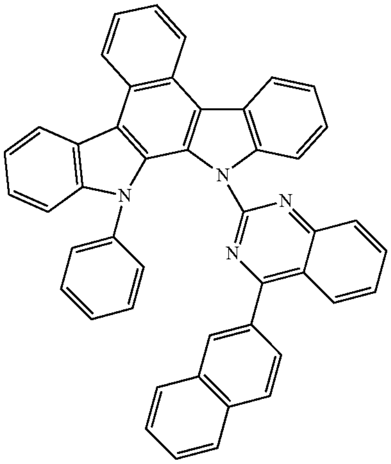

-continued

E-2-3

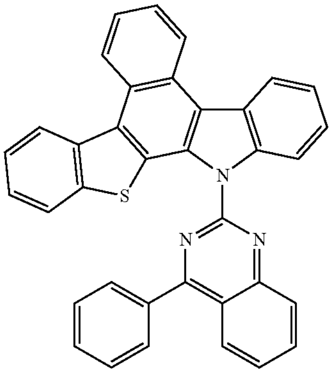

E-2-4

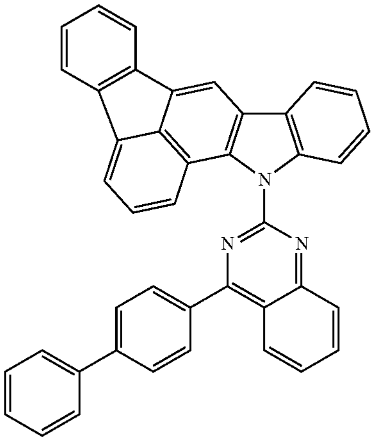

E-2-5

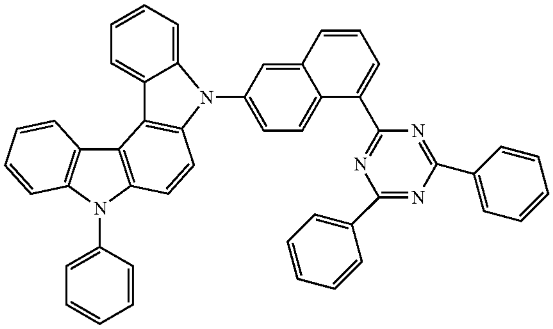

E-2-6

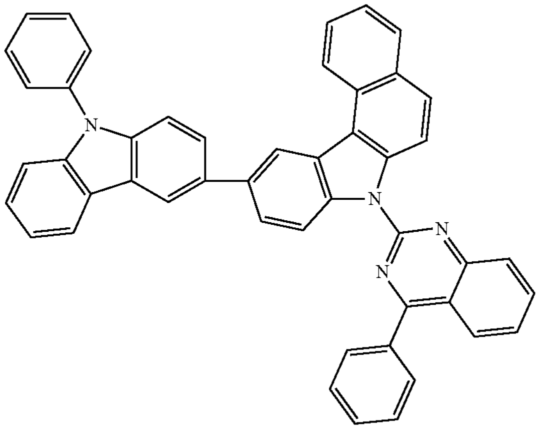

-continued
E-2-7
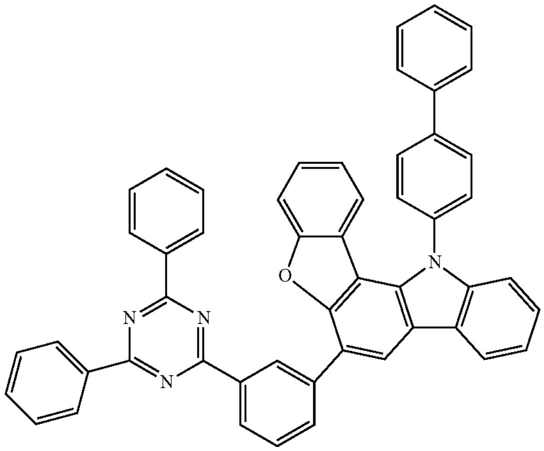
E-2-8
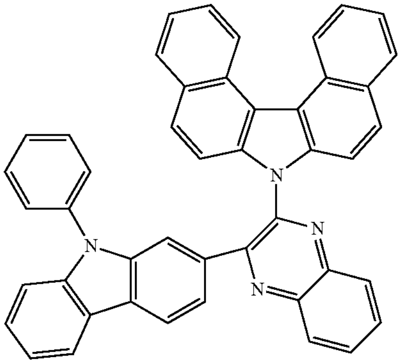
E-2-9
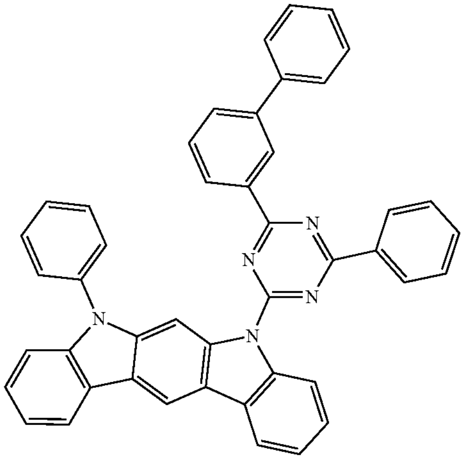
-continued
E-2-10
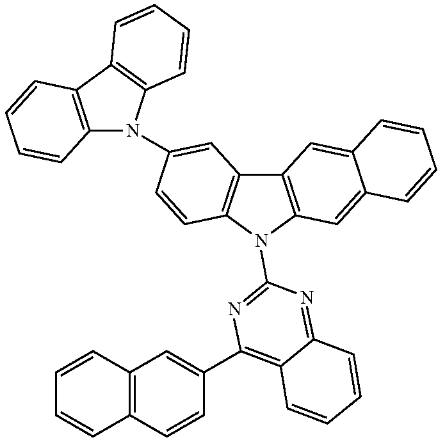
E-2-11
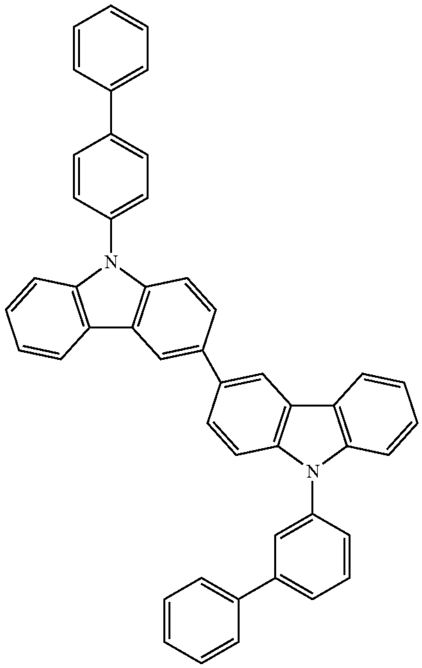
E-2-12
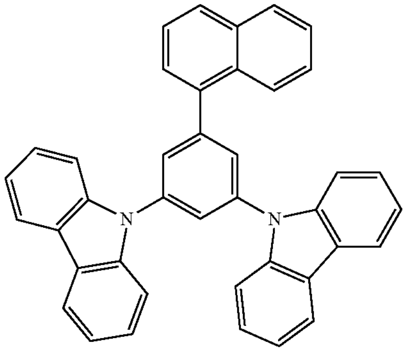

-continued
E-2-13
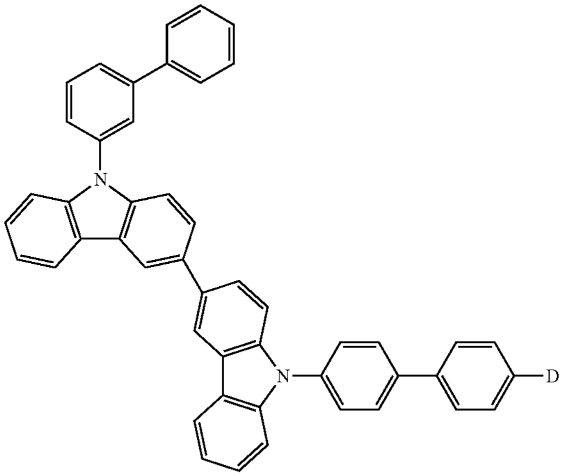
E-2-14
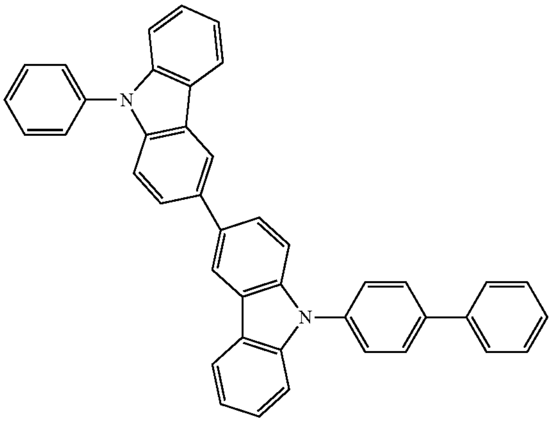
E-2-15
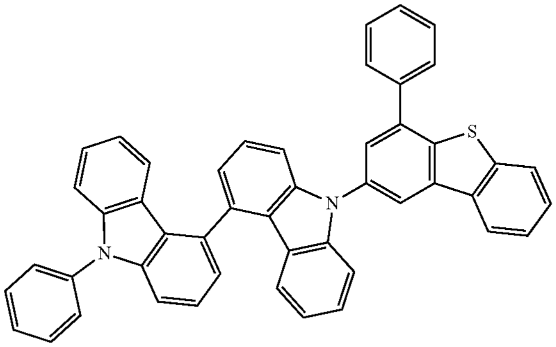
-continued
E-2-16
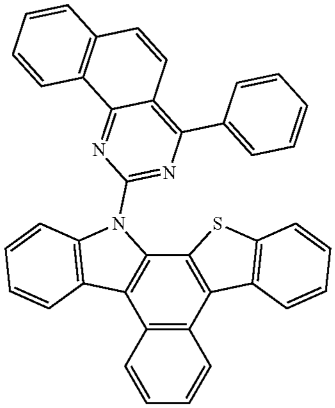
E-2-17
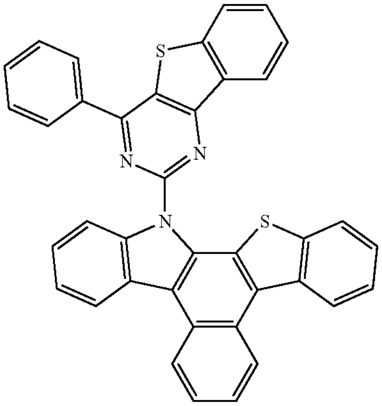
E-2-18
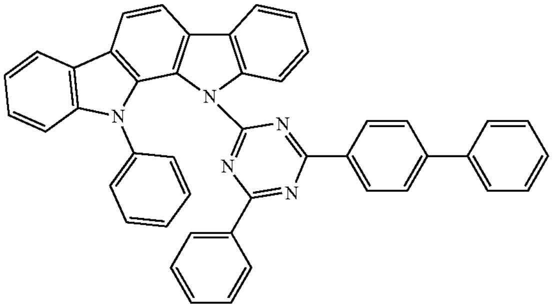
E-2-19
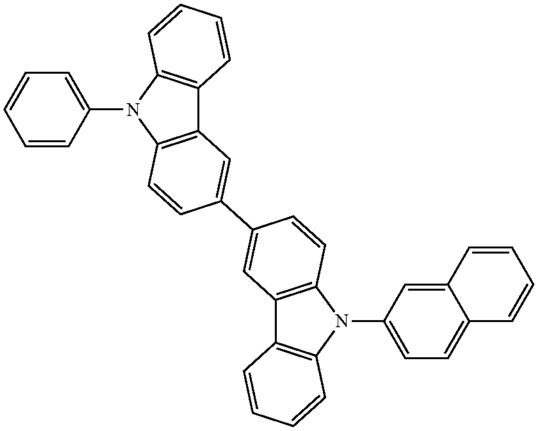

-continued

E-2-20

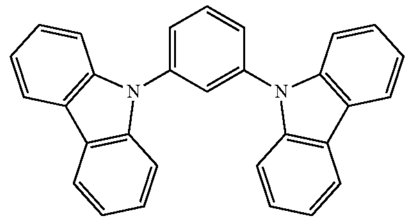

E-2-21

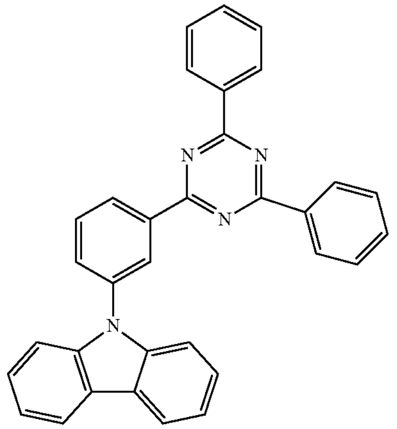

E-2-22

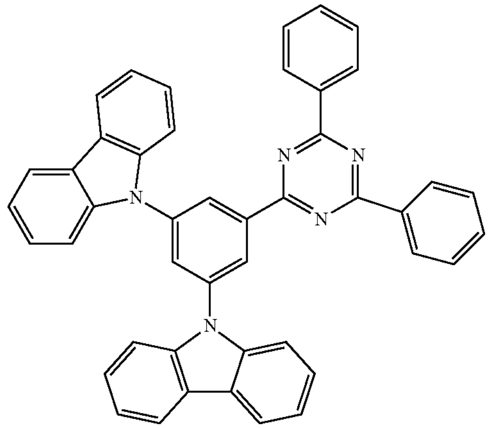

E-2-23

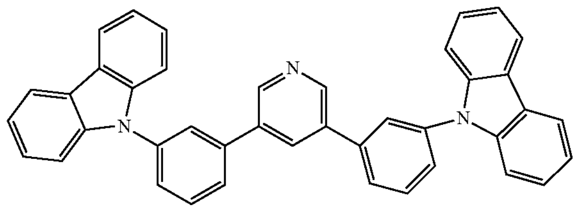

-continued

E-2-24

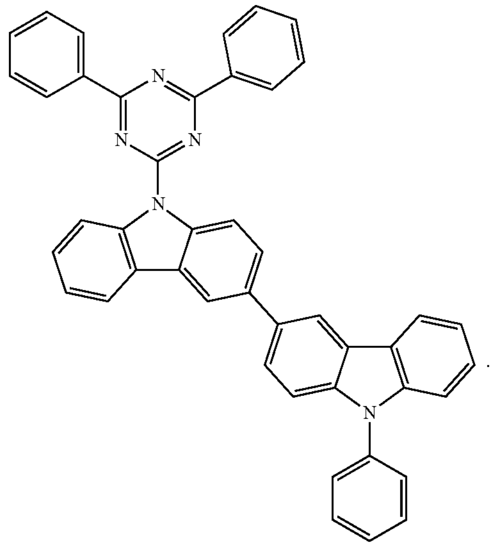

The emission layer EML may further include a general material generally utilized/generally available in the art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl] ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, the embodiment of the present disclosure is not limited thereto, for example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be utilized as a host material.

The emission layer EML may further include a compound represented by Formula M-a. The compound represented by Formula M-a may be utilized as a phosphorescent dopant material.

Formula M-a

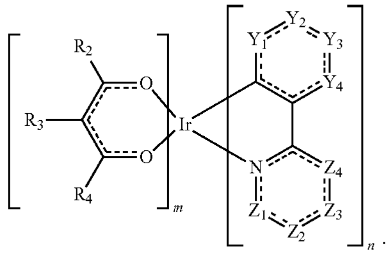

In Formula M-a, $Y_1$ to $Y_4$ and $Z_1$ to $Z_4$ may each independently be $CR_1$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. In Formula M-a, m may be 0 or 1, and n may be 2 or 3. In Formula M-a, when m is 0, n is 3, and when m is 1, n is 2.

The compound represented by Formula M-a may be utilized as a phosphorescent dopant.

The compound represented by Formula M-a may be represented by any one selected from among Compound M-a1 to Compound M-a25. However, Compounds M-a1 to M-a25 are merely examples, and the compound represented by Formula M-a is not limited to those represented by Compounds M-a1 to M-a25.

M-a1

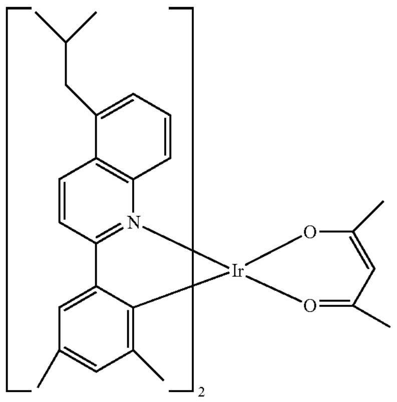

M-a2

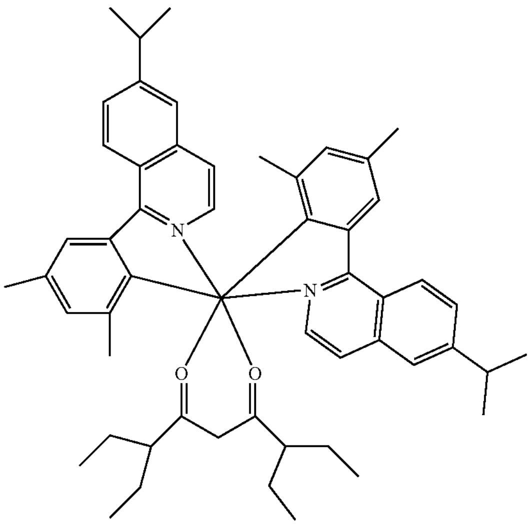

-continued

M-a3

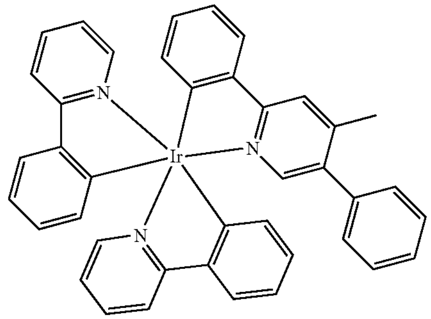

M-a4

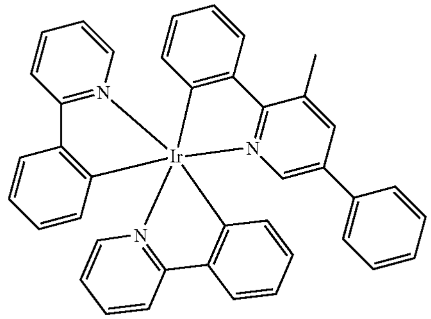

M-a5

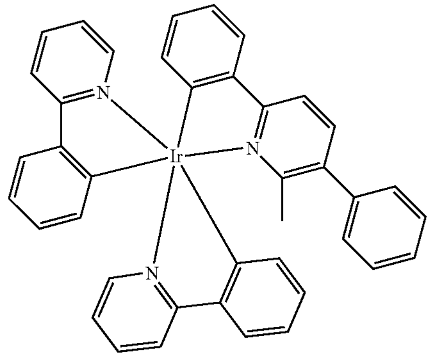

M-a6

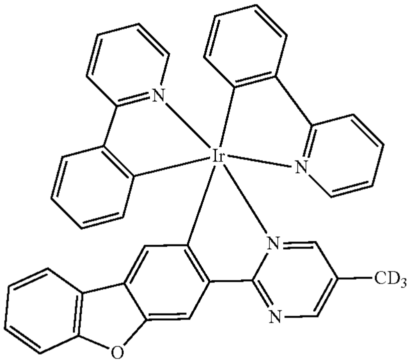

-continued
M-a7
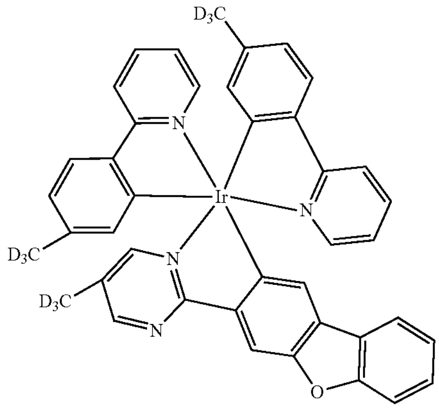
M-a8
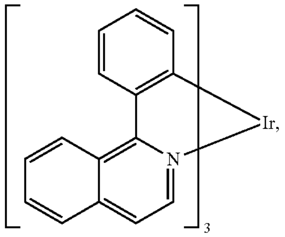
M-a9
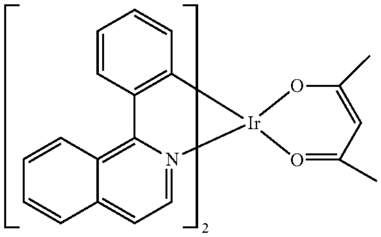
M-a10
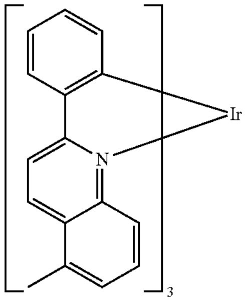
M-a11
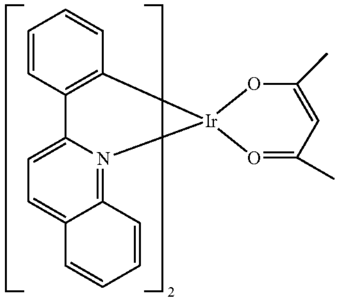
-continued
M-a12
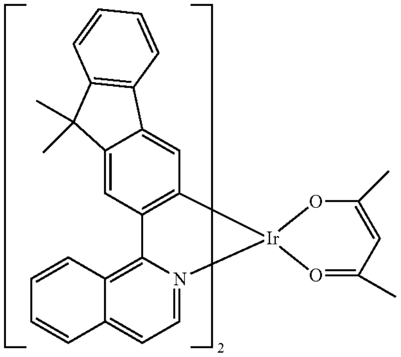
M-a13
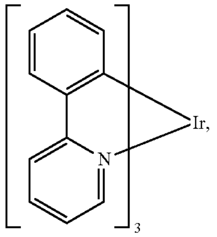
M-a14
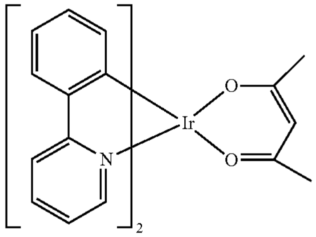
M-a15
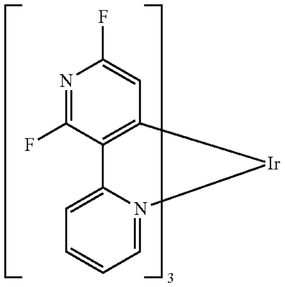
M-a16
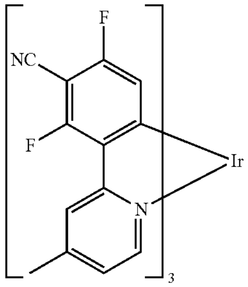

-continued
M-a17
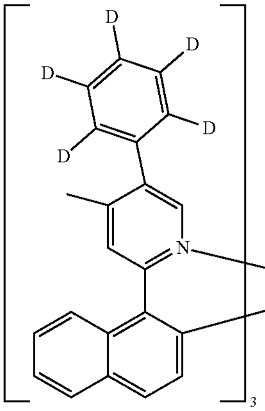
M-a18
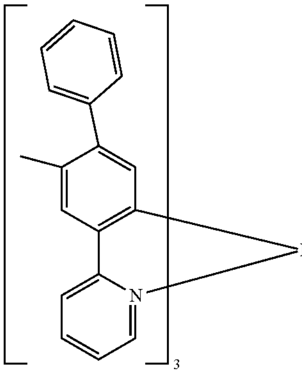
M-a19
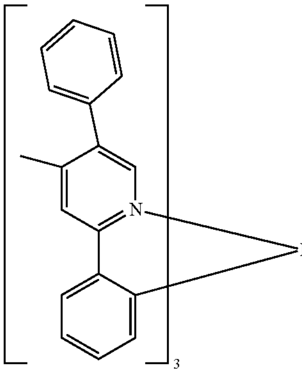
M-a20
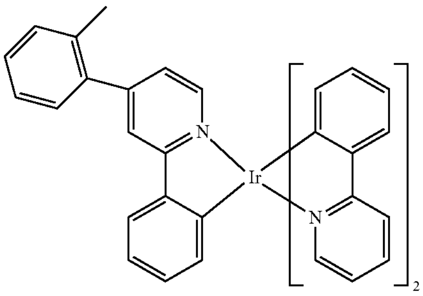
-continued
M-a21
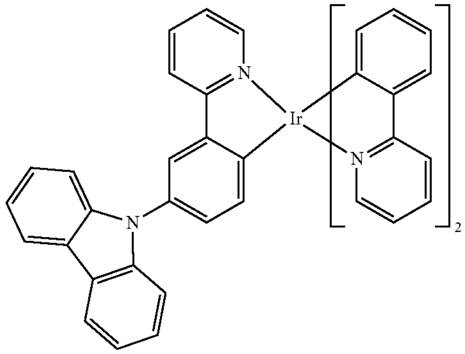
M-a22
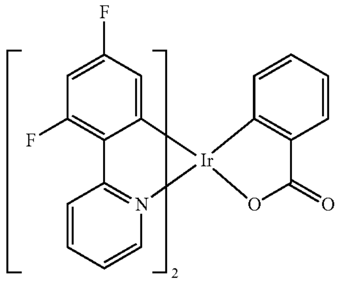
M-a23
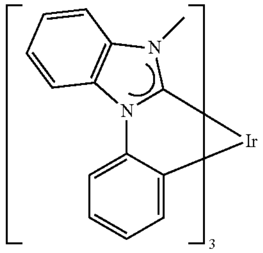
M-a24
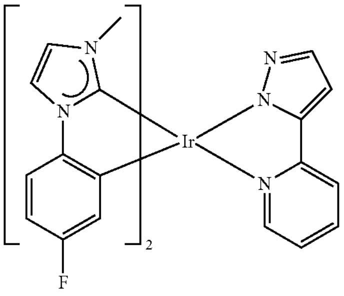
M-a25
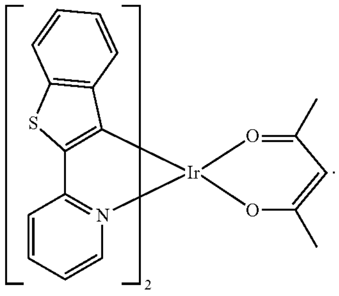
The emission layer EML may further include a compound represented by any one selected from among Formula F-a to Formula F-c. The compound represented by Formula F-a or Formula F-c may be utilized as a fluorescence dopant material.

Formula F-a

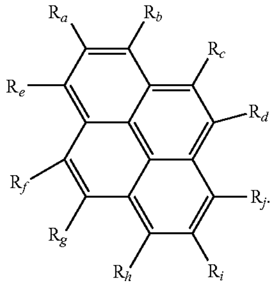

In Formula F-a, two selected from among $R_a$ to $R_j$ may each independently be substituted with $* — NAr_1Ar_2$.

The others, which are not substituted with $* — NAr_1Ar_2$, among $R_a$ to $R_j$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In $* — NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

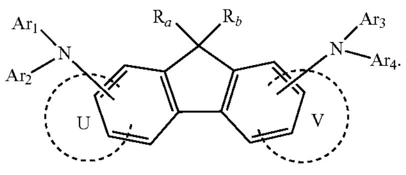

In Formula F-b, $Ar_1$ to $Ar_4$ may be a substituted or unsubstituted aryl group having 6 to 30 ring-forming carbon atoms, or a substituted or unsubstituted heteroaryl group having 2 to 30 ring-forming carbon atoms.

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, it refers to when the number of U or V is 1, one ring constitutes a fused ring at a portion indicated by U or V, and when the number of U or V is 0, a ring indicated by U or V does not exist. For example, when the number of U is 0 and the number of V is 1, or when the number of U is 1 and the number of V is 0, the fused ring having a fluorene core in Formula F-b may be a cyclic compound having four rings. In some embodiments, when each number of U and V is 0, the fused ring in Formula F-b may be a cyclic compound having three rings. In some embodiments, when each number of U and V is 1, the fused ring having a fluorene core in Formula F-b may be a cyclic compound having five rings.

Formula F-c

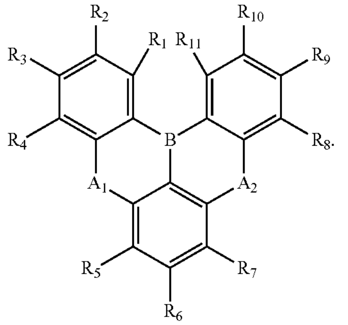

In Formula F-c, $A_1$ and $A_2$ may each independently be O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula F-c, $A_1$ and $A_2$ may each independently be bonded to substituents of an adjacent ring to form a condensed ring. For example, when $A_1$ and $A_2$ may each independently be $NR_m$, $A_1$ may be bonded to $R_4$ or $R_5$ to form a ring. In some embodiments, $A_2$ may be bonded to $R_7$ or $R_8$ to form a ring.

In an embodiment, the emission layer EML may further include, as a generally utilized/generally available dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-

((E)-4-(diphenylamino)styryl)naphthalen-2-yl)vinyl) phenyl)-N-phenylbenzenamine (N-BDAVBi), 4,4'-bis[2-(4-(N,N-diphenylamino)phenyl)vinyl]biphenyl (DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may further include a generally utilized/generally available phosphorescence dopant material. For example, a metal complex containing iridium (Ir), platinum (Pt), osmium (Os), aurum (Au), titanium (Ti), zirconium (Zr), hafnium (Hf), europium (Eu), terbium (Tb), or thulium (Tm) may be utilized as a phosphorescent dopant. For example, iridium(III) bis(4,6-difluorophenylpyridinato-N,C2') (Flrpic), bis(2,4-difluorophenylpyridinato)-tetrakis (1-pyrazolyl)borate iridium(III) (Fir6), or platinum octaethyl porphyrin (PtOEP) may be utilized as a phosphorescent dopant. However, the embodiment of the present disclosure is not limited thereto.

The emission layer EML may include a quantum dot material. The core of the quantum dot may be selected from among a Group II-VI compound, a Group III-VI compound, a Group I-III-IV compound, a Group III-V compound, a Group III-II-V compound, a Group IV-VI compound, a Group IV element, a Group IV compound, and one or more combinations thereof.

The Group II-VI compound may be selected from the group including (e.g., consisting of) a binary compound selected from the group including (e.g., consisting of) CdSe, CdTe, CdS, ZnS, ZnSe, ZnTe, ZnO, HgS, HgSe, HgTe, MgSe, MgS, and one or more compounds or mixtures thereof, a ternary compound selected from the group including (e.g., consisting of) CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and one or more compounds or mixtures thereof, and a quaternary compound selected from the group including (e.g., consisting of) HgZnTeS, CdZnSeS, CdZnSeTe, CdZnSTe, CdHgSeS, CdHgSeTe, CdHgSTe, HgZnSeS, HgZnSeTe, HgZnSTe, and one or more compounds or mixtures thereof.

The Group III-VI compound may include a binary compound such as $In_2S_3$ or $In_2Se_3$, a ternary compound such as $InGaS_3$ or $InGaSe_3$, or one or more combinations thereof.

The Group I-III-VI compound may be selected from a ternary compound selected from the group including (e.g., consisting of) AgInS, $AgInS_2$, CuInS, $CuInS_2$, $AgGaS_2$, $CuGaS_2$ $CuGaO_2$, $AgGaO_2$, $AgAlO_2$, and one or more compounds or mixtures thereof, or a quaternary compound such as $AgInGaS_2$ or $CuInGaS_2$.

The Group III-V compound may be selected from the group including (e.g., consisting of) a binary compound selected from the group including (e.g., consisting of) GaN, GaP, GaAs, GaSb, AlN, AlP, AlAs, AlSb, InN, InP, InAs, InSb, and one or more compounds or mixtures thereof, a ternary compound selected from the group including (e.g., consisting of) GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and one or more compounds or mixtures thereof, and/or a quaternary compound selected from the group including (e.g., consisting of) GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and one or more compounds or mixtures thereof. In some embodiments, the Group III-V compound may further include a Group II metal. For example, InZnP, etc. may be selected as a Group III-II-V compound.

The Group IV-VI compound may be selected from the group including (e.g., consisting of) a binary compound selected from the group including (e.g., consisting of) SnS, SnSe, SnTe, PbS, PbSe, PbTe, and one or more compounds or mixtures thereof, a ternary compound selected from the group including (e.g., consisting of) SnSeS, SnSeTe, SnSTe, PbSeS, PbSeTe, PbSTe, SnPbS, SnPbSe, SnPbTe, and one or more compounds or mixtures thereof, and a quaternary compound selected from the group including (e.g., consisting of) SnPbSSe, SnPbSeTe, SnPbSTe, and one or more compounds or mixtures thereof. The Group IV element may be selected from the group including (e.g., consisting of) Si, Ge, and one or more compounds or mixtures thereof. The Group IV compound may be a binary compound selected from the group including (e.g., consisting of) SiC, SiGe, and one or more compounds or mixtures thereof.

In this case, a binary compound, a ternary compound, or a quaternary compound may be present in a particle form with a substantially uniform concentration distribution, or may be present in substantially the same particle with a partially different concentration distribution. In some embodiments, a core/shell structure in which one quantum dot surrounds another quantum dot may also be possible. The core/shell structure may have a concentration gradient in which the concentration of elements present in the shell decreases toward the core.

In some embodiments, the quantum dot may have the above-described core/shell structure including a core containing nanocrystals and a shell around (e.g., surrounding) the core. The shell of the quantum dot may serve as a protection layer to prevent or reduce the chemical deformation of the core to maintain semiconductor properties, and/or a charging layer to impart electrophoresis properties to the quantum dot. The shell may be a single layer or a multilayer. An example of the shell of the quantum dot may include a metal or non-metal oxide, a semiconductor compound, or one or more combinations thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$, but the embodiment of the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

The quantum dot may have a full width of half maximum (FWHM) of a light emitting wavelength spectrum of about 45 nm or less, about 40 nm or less, or about 30 nm or less, and color purity or color reproducibility may be improved in the above ranges. In some embodiments, light emitted through such a quantum dot is emitted in all directions, and thus a wide viewing angle may be improved (increased).

In some embodiments, although the form of the quantum dot is not limited as long as it is a form commonly utilized in the art, for example, the quantum dot in the form of substantially spherical, pyramidal, multi-arm, or cubic nanoparticles, nanotubes, nanowires, nanofibers, nanoplate particles, etc. may be utilized.

A quantum dot may control the color of emitted light according to the particle size thereof and thus the quantum dot may have one or more suitable light emission colors such as green, red, etc.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, or the electron injection layer EIL, but the embodiment of the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL are stacked in order (in the stated order) from the emission layer EML, but the embodiment of the present disclosure is not limited thereto. The electron transport region ETR may have a thickness, for example, from about 1,000 Å to about 1,500 Å.

The electron transport region ETR may be formed by utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1:

Formula ET-1

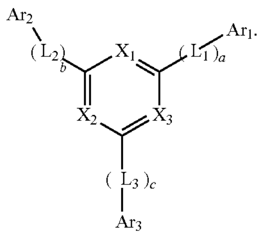

In Formula ET-1, at least one selected from among $X_1$ to $X_3$ is N, and the rest (the substituents that are not N) are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

$Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10.

In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a to c are each an integer of 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl)anthracene (ADN), 1,3-Bis[3,5-di(pyridin-3-yl)phenyl]benzene (BmPyPhB), or one or more compounds or mixtures thereof.

The electron transport region ETR may include at least one selected from among Compound ET1 to Compound ET36:

ET1

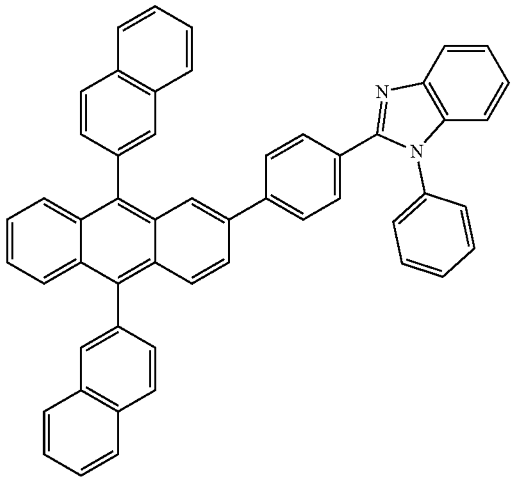

-continued
ET2
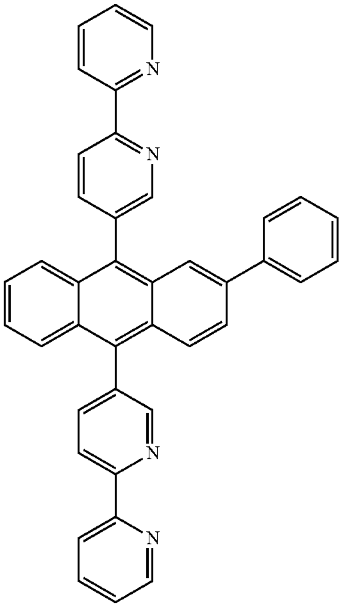
ET3
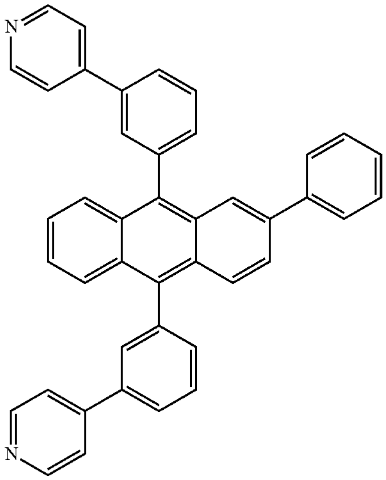
ET4
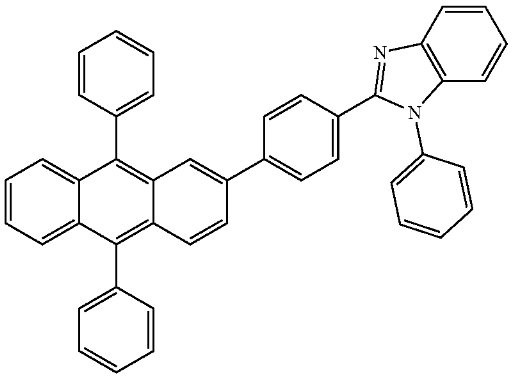
-continued
ET5
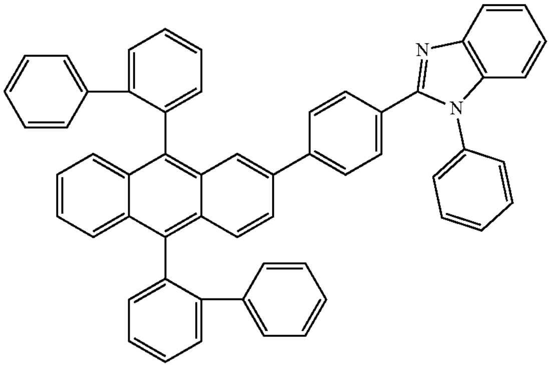
ET6
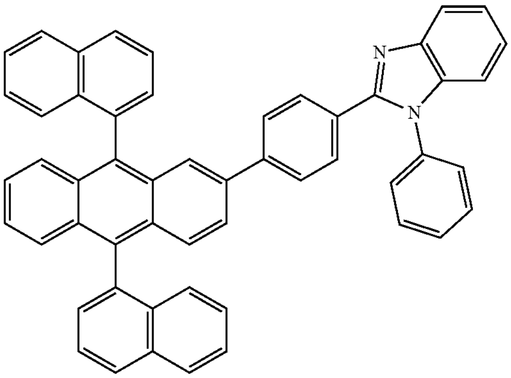
ET7
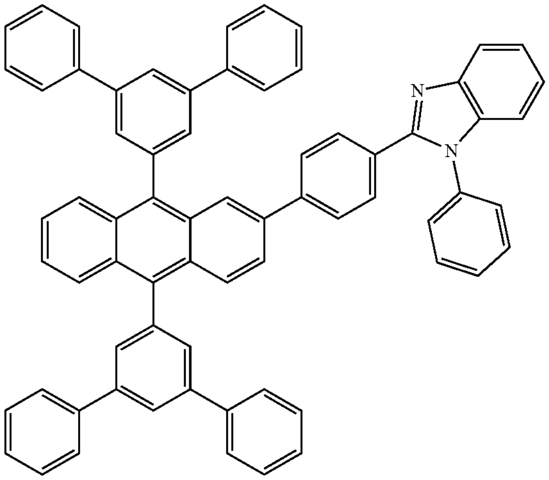

-continued
ET8
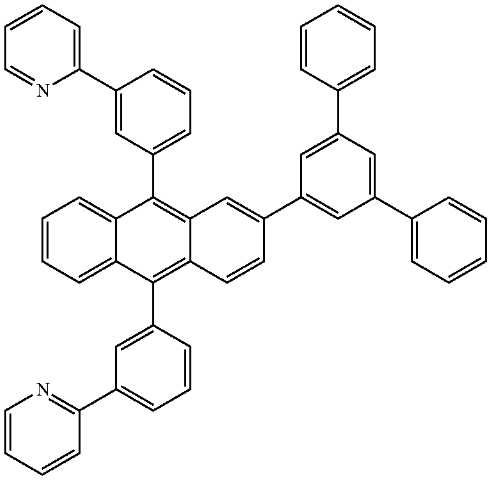
ET9
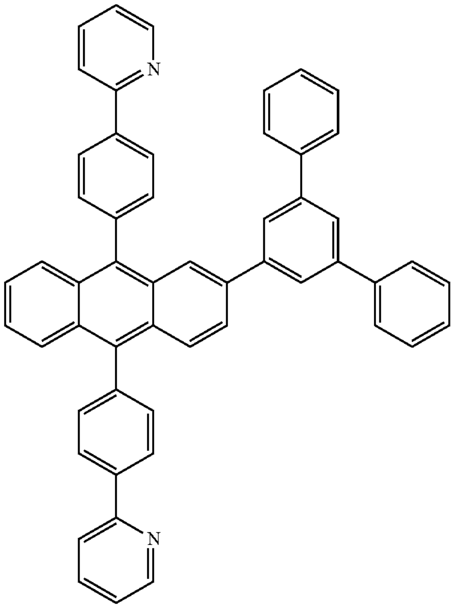
-continued
ET10
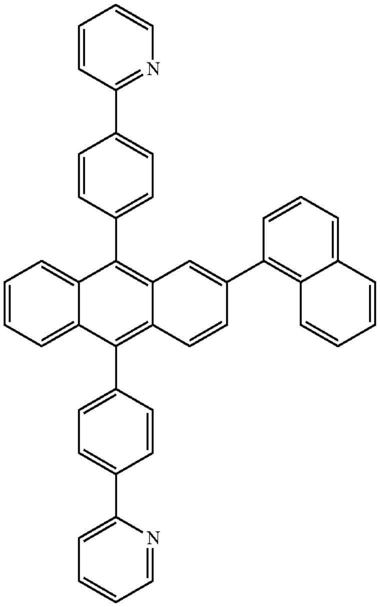
ET11
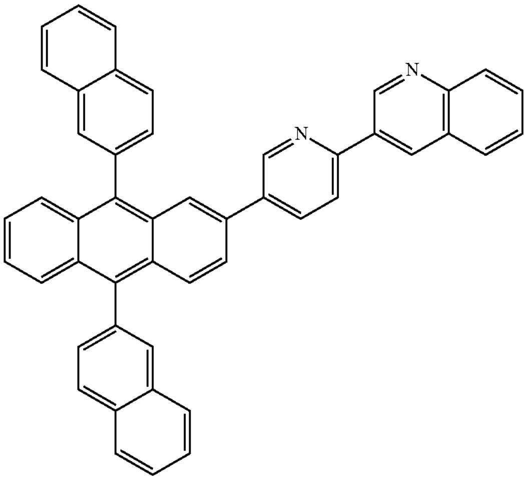
ET12
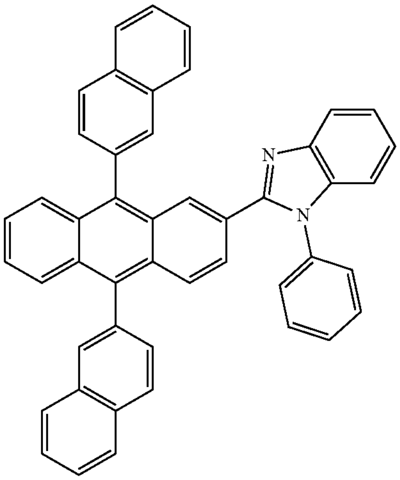

-continued
ET13
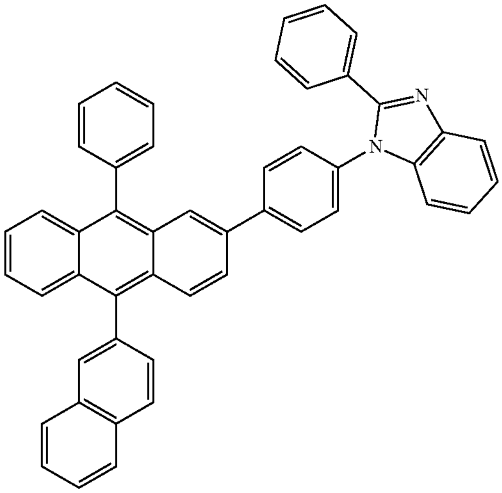
ET14
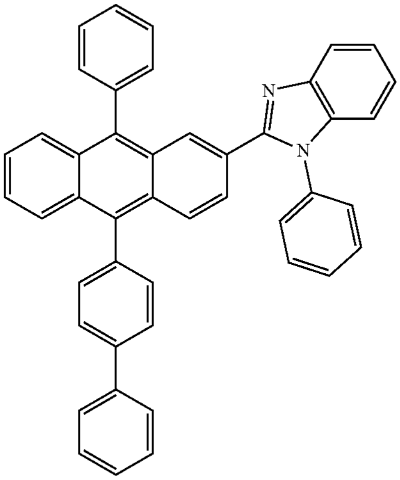
ET15
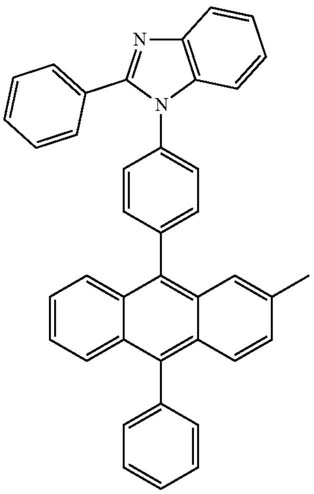
-continued
ET16
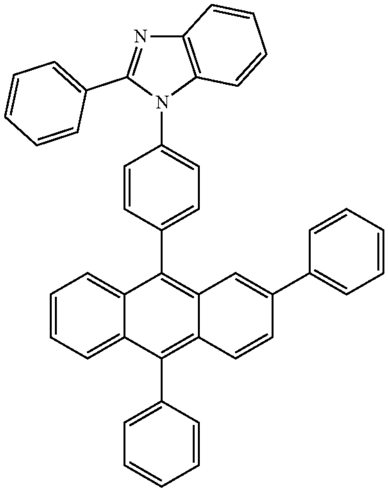
ET17
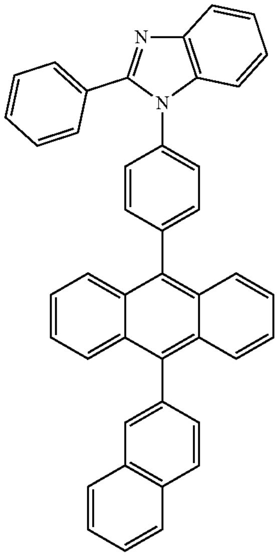
ET18
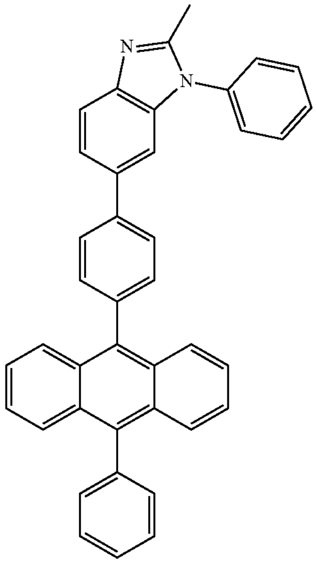

-continued
ET19
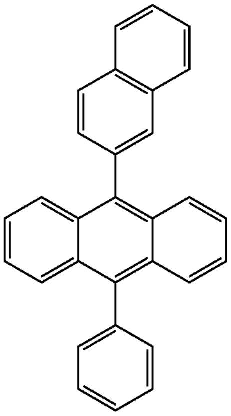
ET20
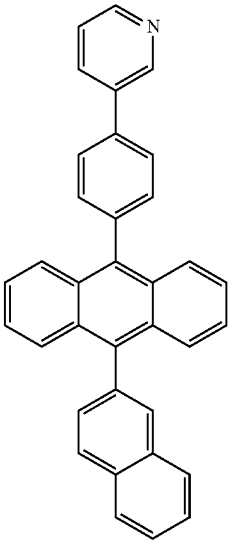
ET21
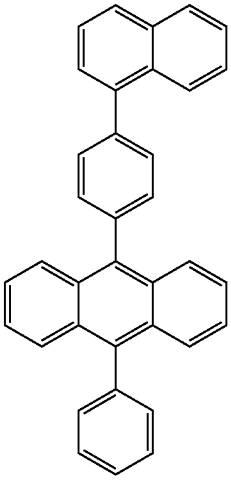
-continued
ET22
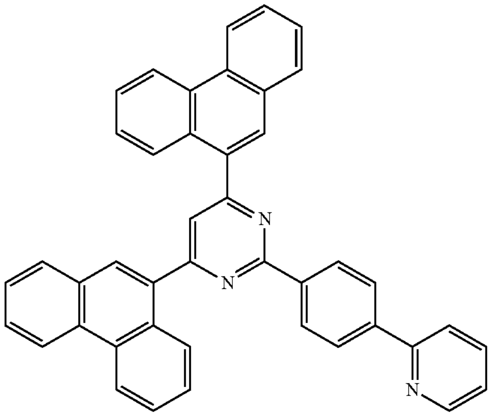
ET23
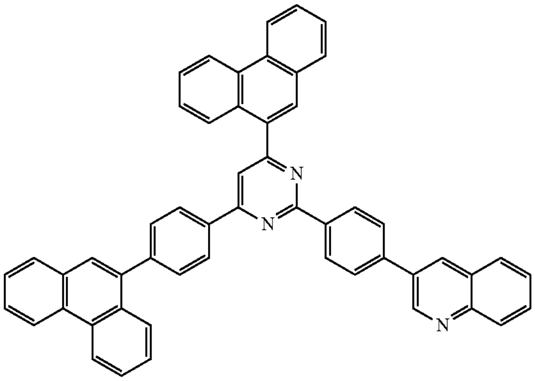
ET24
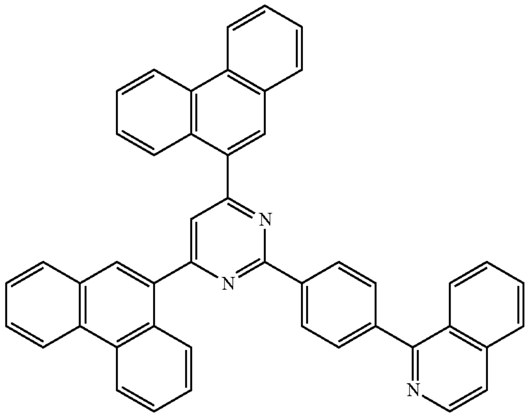

ET25
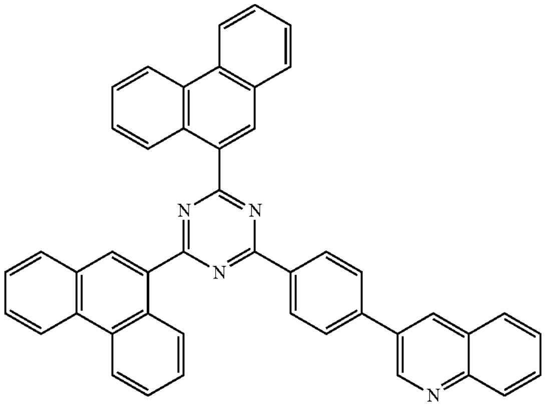
ET26
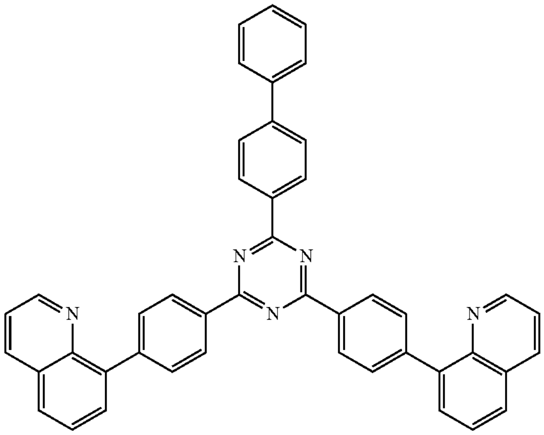
ET27
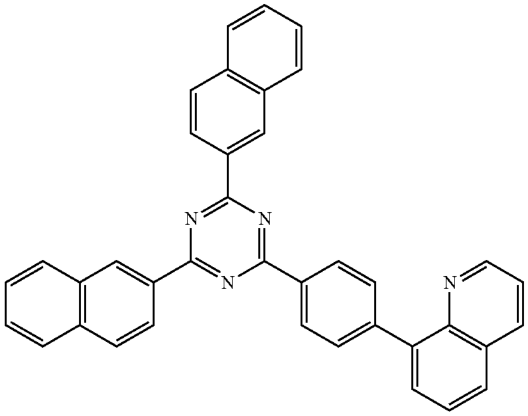
ET28
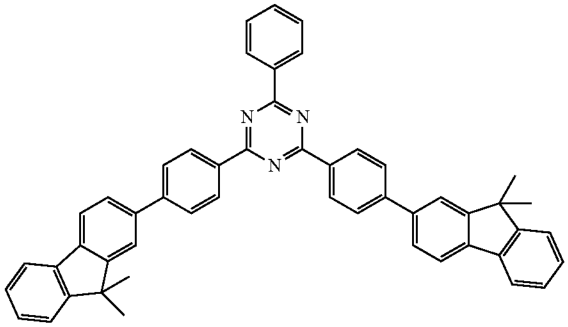
ET29
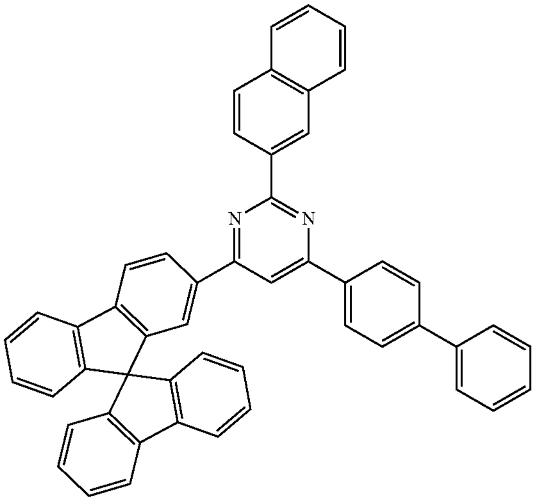
ET30
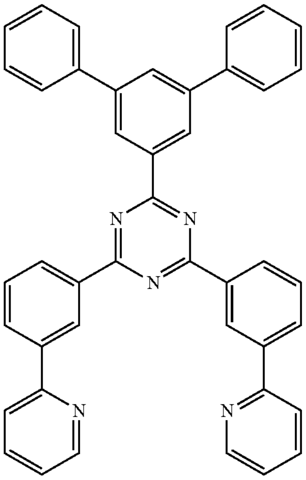

-continued

ET31

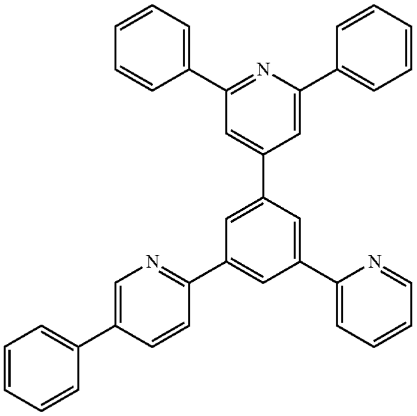

ET32

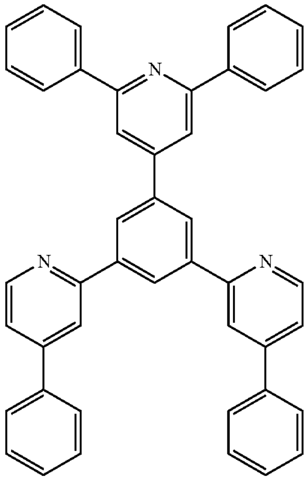

ET33

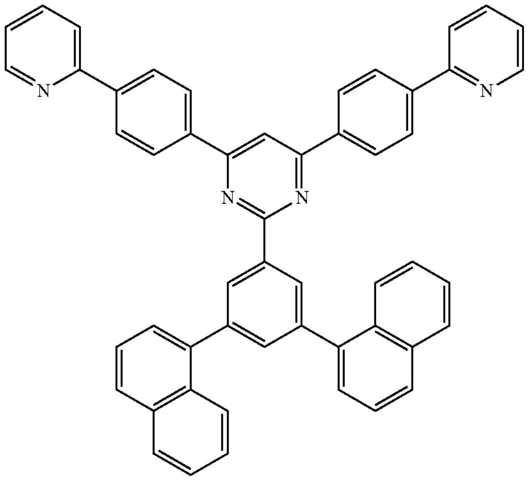

-continued

ET34

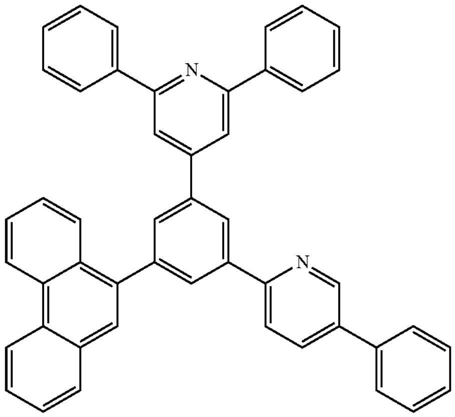

ET35

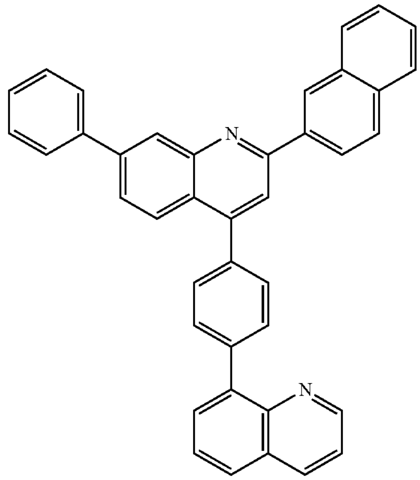

ET36

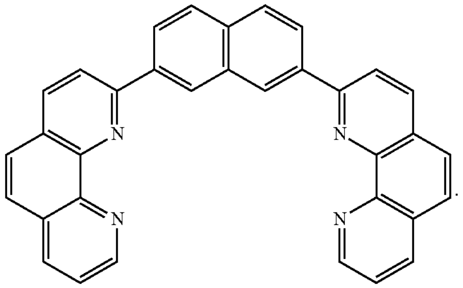

In some embodiments, the electron transport regions ETR may include a metal halide such as LiF, NaCl, CsF, RbCl, RbI, CuI, or KI, a lanthanide metal such as $Y_b$, and/or a co-deposited material of the metal halide and the lanthanide metal. For example, the electron transport region ETR may include KI:$Y_b$, RbI:$Y_b$, LiF:$Y_b$, etc. as a co-deposited material. In some embodiments, the electron transport region ETR may be formed utilizing a metal oxide such as $Li_2O$ or BaO, or 8-hydroxyl-lithium quinolate (Liq), etc., but the embodiment of the present disclosure is not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, a metal acetate, a metal benzoate, a metal acetoacetate, a metal acetylacetonate, or a metal stearate.

The electron transport region ETR may further include at least one of 2,9-dimethyl-4,7-diphenyl-1,10-phenanthroline (BCP), diphenyl(4-(triphenylsilyl)phenyl)phosphine oxide (TSPO1), or 4,7-diphenyl-1,10-phenanthroline (Bphen) in addition to the above-described materials, but the embodiment of the present disclosure is not limited thereto.

The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. When the thickness of the electron transport layer ETL satisfies the aforementioned range, satisfactory (suitable) electron transport characteristics may be obtained without a substantial increase in a driving voltage. When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies the above-described ranges, satisfactory (suitable) electron injection characteristics may be obtained without a substantial increase in driving voltage.

The second electrode EL2 is provided on the electron transport region ETR. The second electrode EL2 may be a common electrode. The second electrode EL2 may be a cathode or an anode, but the embodiment of the present disclosure is not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, $Y_b$, W, or one or more compounds or mixtures thereof (e.g., AgMg, AgYb, or MgAg). In some embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

The second electrode EL2 may be connected with an auxiliary electrode. When the second electrode EL2 is connected with the auxiliary electrode, the resistance of the second electrode EL2 may decrease.

In some embodiments, a capping layer CPL may further be disposed on the second electrode EL2 of the light emitting device ED of an embodiment. The capping layer CPL may include a multilayer or a single layer.

In an embodiment, the capping layer CPL may be an organic layer or an inorganic layer. For example, when the capping layer CPL contains an inorganic material, the inorganic material may include an alkaline metal compound (for example, LiF), an alkaline earth metal compound (for example, $MgF_2$), SiON, $SiN_x$, SiOy, etc.

For example, when the capping layer CPL contains an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol-9-yl)triphenylamine (TCTA), etc., or may include an epoxy resin, or an acrylate such as a methacrylate. However, the embodiment of the present disclosure is not limited thereto, and the capping layer CPL may include at least one selected from among Compounds P1 to P5:

P1

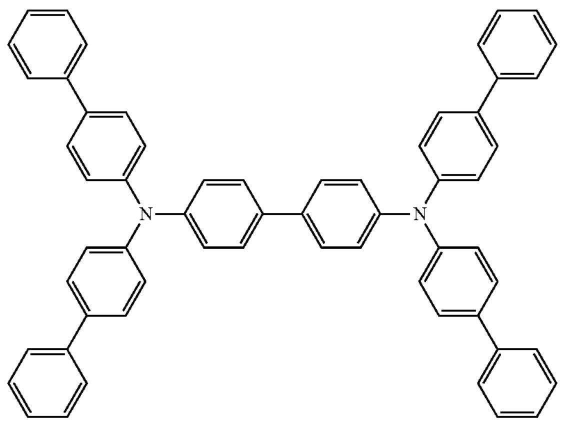

P2

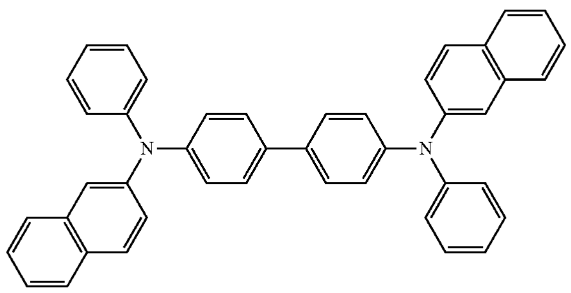

P3

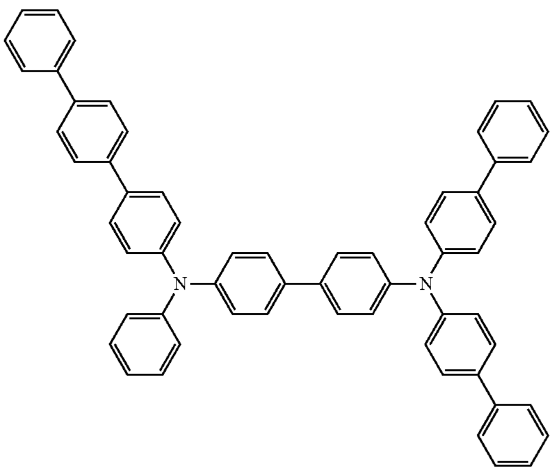

-continued

P4

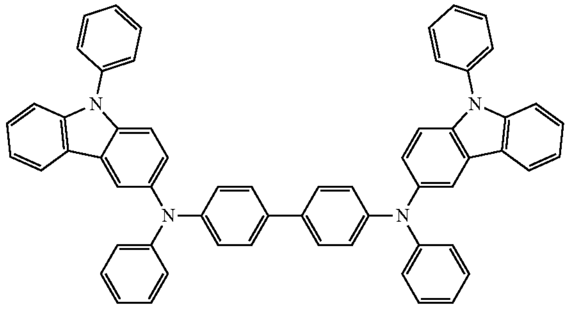

P5

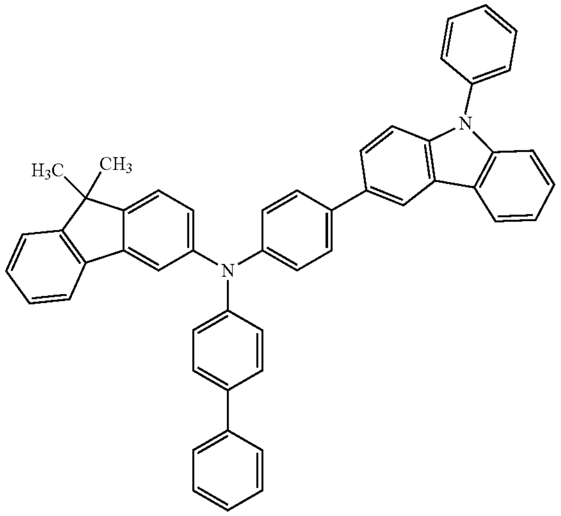

.

In some embodiments, the refractive index of the capping layer CPL may be about 1.6 or more. For example, the refractive index of the capping layer CPL may be about 1.6 or more with respect to light in a wavelength range of about 550 nm to about 660 nm.

FIGS. 7 and 8 each are a cross-sectional view of a display apparatus according to an embodiment. Hereinafter, in describing the display apparatuses of embodiments with reference to FIGS. 7 and 8, the duplicated features which have been described in FIGS. 1 to 6 may not be described again, but their differences will be primarily described.

Referring to FIG. 7, the display apparatus DD according to an embodiment may include a display panel DP including a display device layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In some embodiments, the structures of the light emitting devices of FIGS. 3 to 6 as described above may be equally applied to the structure of the light emitting device ED illustrated in FIG. 7.

The emission layer EML of the light emitting device ED included in the display apparatus DD-a according to an embodiment may include the above-described first compound of an embodiment. The emission layer EML may include all of the first compound, the second compound, the third compound, and the fourth compound.

Referring to FIG. 7, the emission layer EML may be disposed in an opening OH defined in a pixel defining film PDL. For example, the emission layer EML which is divided by the pixel defining film PDL and provided corresponding to each light emitting regions PXA-R, PXA-G, and PXA-B may emit light in substantially the same wavelength range. In the display apparatus DD of an embodiment, the emission layer EML may emit blue light. In some embodiments, the emission layer EML may be provided as a common layer in the entire light emitting regions PXA-R, PXA-G, and PXA-B.

The light control layer CCL may be on the display panel DP. The light control layer CCL may include a light conversion body. The light conversion body may be a quantum dot, a phosphor, and/or the like. The light conversion body may emit provided light by converting the wavelength thereof. For example, the light control layer CCL may a layer containing the quantum dot or a layer containing the phosphor.

The light control layer CCL may include a plurality of light control parts CCP1, CCP2, and CCP3. The light control parts CCP1, CCP2, and CCP3 may be spaced apart from (separated from) each other.

Referring to FIG. 7, divided patterns BMP may be between the light control parts CCP1, CCP2, and CCP3 which are spaced apart from each other, but the embodiment of the present disclosure is not limited thereto. FIG. 7 illustrates that the divided patterns BMP do not overlap the light control parts CCP1, CCP2, and CCP3, but at least a portion of the edges of the light control parts CCP1, CCP2, and CCP3 may overlap the divided patterns BMP.

The light control layer CCL may include a first light control part CCP1 containing a first quantum dot QD1 which converts first color light provided from the light emitting device ED into second color light, a second light control part CCP2 containing a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting device ED. For example, the first quantum dot QD1 may be a red quantum dot, and the second quantum dot QD2 may be a green quantum dot. The same as described above may be applied with respect to the quantum dots QD1 and QD2.

In some embodiments, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include (e.g., may exclude) any quantum dot but may still include the scatterer SP.

The scatterer SP may be inorganic particles. For example, the scatterer SP may include at least one of $TiO_2$, ZnO, $Al_2O_3$, $SiO_2$, or hollow sphere silica. The scatterer SP may include any one selected from among $TiO_2$, ZnO, $Al_2O_3$, $SiO_2$, and hollow sphere silica, or may be a mixture of at least two materials selected from among $TiO_2$, ZnO, $Al_2O_3$, $SiO_2$, and hollow sphere silica.

The first light control part CCP1, the second light control part CCP2, and the third light control part CCP3 may include (e.g., each may include a corresponding one of) base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of one or more suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be disposed on the light control parts CCP1, CCP2, and CCP3 to block or reduce the light control parts CCP1, CCP2, and CCP3 from being exposed to moisture/oxygen. In some embodiments, the barrier layer BFL1 may cover the light control parts CCP1, CCP2, and CCP3. In some embodiments, the barrier layer BFL2 may be provided between the light control parts CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In some embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be on the light control layer CCL. For example, the color filter layer CFL may be directly on the light control layer CCL. In this embodiment, the barrier layer BFL2 may not be provided.

The color filter layer CFL may include a light shielding part BM and color filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment or dye, the second filter CF2 may include a green pigment or dye, and the third filter CF3 may include a blue pigment or dye. In some embodiments, the embodiment of the present disclosure is not limited thereto, and the third filter CF3 may not include (e.g., may exclude) any pigment or dye. The third filter CF3 may include a polymeric photosensitive resin and may not include (e.g., may exclude) any pigment or dye. The third filter CF3 may be transparent. The third filter CF3 may be formed of a transparent photosensitive resin.

In an embodiment, the first filter CF1 and the second filter CF2 may be a yellow filter. The first filter CF1 and the second filter CF2 may not be separated and may be provided as one filter.

The light shielding part BM may be a black matrix. The light shielding part BM may include an organic light shielding material or an inorganic light shielding material containing a black pigment or dye. The light shielding part BM may prevent or reduce light leakage, and may separate boundaries between the adjacent filters CF1, CF2, and CF3. In some embodiments, the light shielding part BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be on the color filter layer CFL. The base substrate BL may be a member which provides a base surface in which the color filter layer CFL, the light control layer CCL, and/or the like are disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer. In some embodiments, the base substrate BL may not be provided.

FIG. 8 is a cross-sectional view illustrating a portion of a display apparatus according to an embodiment of the present disclosure. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 may be sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including a plurality of emission layers.

In an embodiment illustrated in FIG. 8, all light beams respectively emitted from the light emitting structures OL-B1, OL-B2, and OL-B3 may be blue light. However, the embodiment of the present disclosure is not limited thereto, and the light beams respectively emitted from the light emitting structures OL-B1, OL-B2, and OL-B3 may have wavelength ranges different from each other. For example, the light emitting device ED-BT including the plurality of light emitting structures OL-B1, OL-B2, and OL-B3 which emit light beams having wavelength ranges different from each other may emit white light.

Charge generation layers CGL1 and CGL2 may be respectively disposed between two of the neighboring light emitting structures OL-B1, OL-B2, and OL-B3. The charge generation layers CGL1 and CGL2 may include a p-type or kind charge generation layer (e.g., P-charge generation layer) and/or an n-type or kind charge generation layer (e.g., N-charge generation layer).

FIG. 9 is a cross-sectional view illustrating a display apparatus according to an embodiment of the present disclosure. FIG. 10 is a cross-sectional view illustrating a display apparatus according to an embodiment of the present disclosure.

Referring to FIG. 9, the display device DD-b according to an embodiment may include light emitting devices ED-1, ED-2, and ED-3 in which two emission layers are stacked. Compared with the display apparatus DD of an embodiment illustrated in FIG. 2, an embodiment illustrated in FIG. 9 has a difference in that the first to third light emitting devices ED-1, ED-2, and ED-3 each include two emission layers stacked in the thickness direction. In each of the first to third light emitting devices ED-1, ED-2, and ED-3, the two emission layers may emit light in substantially the same wavelength region.

The first light emitting device ED-1 may include a first red emission layer EML-R1 and a second red emission layer EML-R2. The second light emitting device ED-2 may include a first green emission layer EML-G1 and a second green emission layer EML-G2. In some embodiments, the third light emitting device ED-3 may include a first blue emission layer EML-B1 and a second blue emission layer EML-B2. An emission auxiliary part OG may be between the first red emission layer EML-R1 and the second red emission layer EML-R2, between the first green emission layer EML-G1 and the second green emission layer EML-G2, and between the first blue emission layer EML-B1 and the second blue emission layer EML-B2.

The emission auxiliary part OG may include a single layer or a multilayer. The emission auxiliary part OG may include a charge generation layer. For example, the emission auxiliary part OG may include an electron transport region, a charge generation layer, and a hole transport region that are sequentially stacked. The emission auxiliary part OG may be provided as a common layer in the whole of the first to third light emitting devices ED-1, ED-2, and ED-3. However, the embodiment of the present disclosure is not limited thereto, and the emission auxiliary part OG may be provided by being patterned within the openings OH defined in the pixel defining film PDL.

The first red emission layer EML-R1, the first green emission layer EML-G1, and the first blue emission layer EML-B1 may be between the hole transport region HTR and the emission auxiliary part OG. The second red emission layer EML-R2, the second green emission layer EML-G2, and the second blue emission layer EML-B2 may be between the emission auxiliary part OG and the electron transport region ETR.

For example, the first light emitting device ED-1 may include the first electrode EL1, the hole transport region HTR, the second red emission layer EML-R2, the emission auxiliary part OG, the first red emission layer EML-R1, the electron transport region ETR, and the second electrode EL2 that are sequentially stacked. The second light emitting device ED-2 may include the first electrode EL1, the hole transport region HTR, the second green emission layer EML-G2, the emission auxiliary part OG, the first green emission layer EML-G1, the electron transport region ETR, and the second electrode EL2 that are sequentially stacked. The third light emitting device ED-3 may include the first electrode EL1, the hole transport region HTR, the second blue emission layer EML-B2, the emission auxiliary part OG, the first blue emission layer EML-B1, the electron transport region ETR, and the second electrode EL2 that are sequentially stacked.

In some embodiments, an optical auxiliary layer PL may be on the display device layer DP-ED. The optical auxiliary layer PL may include a polarizing layer. The optical auxiliary layer PL may be on the display panel DP and control reflected light in the display panel DP due to external light. The optical auxiliary layer PL in the display apparatus according to an embodiment may not be provided.

At least one emission layer included in the display device DD-b of an embodiment illustrated in FIG. 9 may include the above-described fused polycyclic compound of an embodiment. For example, in an embodiment, at least one of the first blue emission layer EML-B1 or the second blue emission layer may include the fused polycyclic compound, that is, the first compound of an embodiment.

Unlike FIGS. 8 and 9, FIG. 10 illustrates that a display apparatus DD-c includes four light emitting structures OL-B1, OL-B2, OL-B3, and OL-C1. A light emitting device ED-CT may include a first electrode EL1 and a second electrode EL2 which face each other, and first to fourth light emitting structures OL-B1, OL-B2, OL-B3, and OL-C1 that are sequentially stacked in the thickness direction between the first electrode EL1 and the second electrode EL2. Charge generation layers CGL1, CGL2, and CGL3 may be disposed between the first to fourth light emitting structures OL-B1, OL-B2, OL-B3, and OL-C1. Among the four light emitting structures, the first to third light emitting structures OL-B1, OL-B2, and OL-B3 may emit blue light, and the fourth light emitting structure OL-C1 may emit green light. However, the embodiment of the present disclosure is not limited thereto, and the first to fourth light emitting structures OL-B1, OL-B2, OL-B3, and OL-C1 may emit light beams in different wavelength regions.

The charge generation layers CGL1, CGL2, and CGL3 disposed between adjacent light emitting structures OL-B1, OL-B2, OL-B3, and OL-C1 may include a p-type or kind charge generation layer (e.g., P-charge generation layer) and/or an n-type or kind charge generation layer (e.g., N-charge generation layer).

At least one among the light emitting structures OL-B1, OL-B2, OL-B3, and OL-C1 included in the display apparatus DD-c of an embodiment may contain the above-described fused polycyclic compound of an embodiment. For example, in an embodiment, at least one among the first to third light emitting structures OL-B1, OL-B2, and OL-B3 may include the described-above fused polycyclic compound, for example, the first compound of an embodiment.

Hereinafter, the fused polycyclic compound according to embodiments of the inventive concept and the light emitting device of the present embodiments will be particularly explained referring to particular embodiments and comparative embodiments. The following embodiments are only illustrations to assist the understanding of the inventive concept, and the scope of the inventive concept is not limited thereto.

EXAMPLES

1. Synthesis of Fused Polycyclic Compound

First, the synthetic (synthesis) method of the fused polycyclic compound according to an embodiment will be particularly explained referring to the synthetic methods of Compound 1, Compound 7, Compound 20, and Compound 21. However, the synthetic methods of the fused polycyclic compounds explained below are only example embodiments, and the synthetic method of the fused polycyclic compound according to embodiments of the inventive concept is not limited thereto.

(1) Synthesis of Compound 1

Fused Polycyclic Compound 1 according to an embodiment may be synthesized, for example, by Reaction 1 and Reaction 2 below.

Synthesis of Intermediate Compound 1-1

Reaction 1

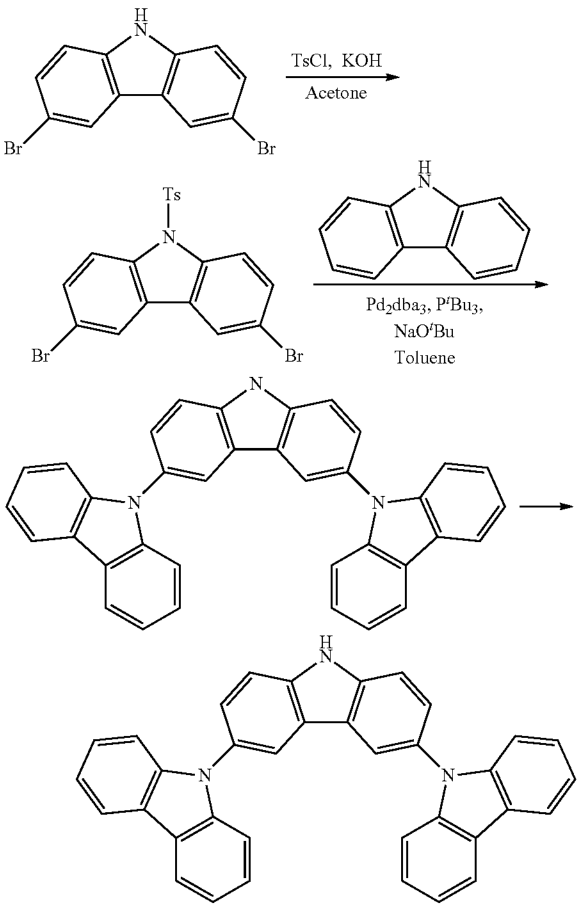

I-1

Synthesis of Compound 1

Reaction 2

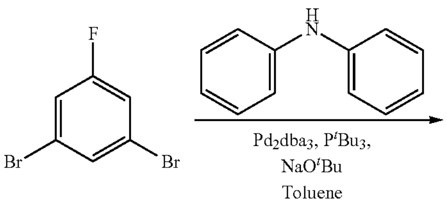

-continued

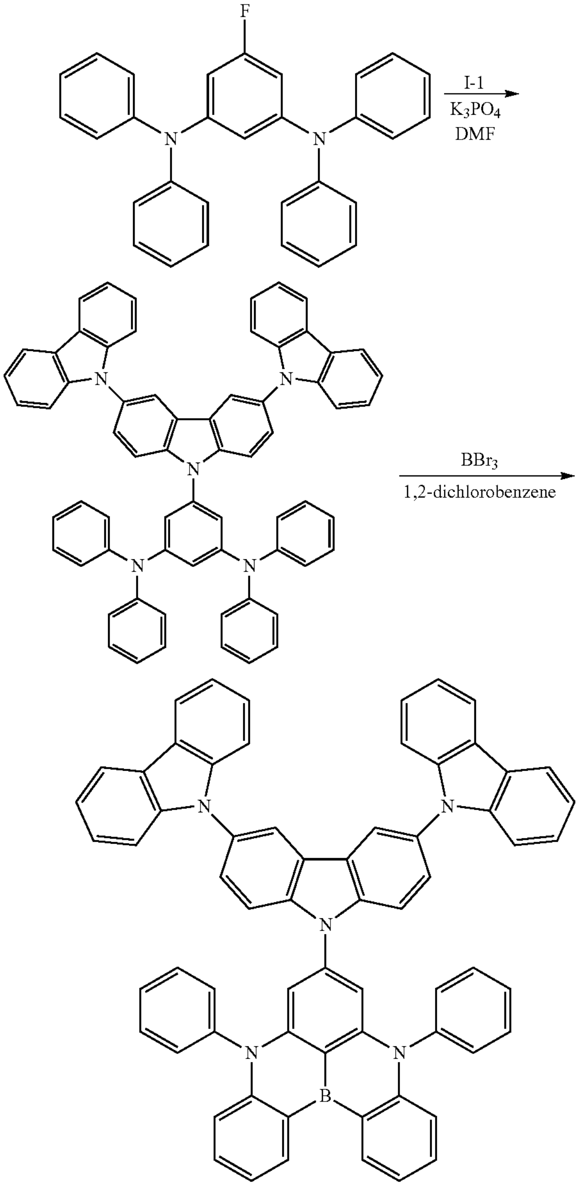

1

9.08 g (10 mmol) of 5-(9'H-[9,3':6',9"-tercarbazol]-9'-yl)-N1,N1,N3,N3-tetraphenylbenzene-1,3-diamine was dissolved in 60 ml of 1,2-dichlorobenzene, and $BBr_3$ (30 mmol) was added at about 0° C. Then, the reactants were stirred at about 150° C. for about 15 hours, and the temperature was decreased to room temperature. Water was added thereto and washing with 30 ml of methylene chloride was carried out three times. The methylene chloride layer thus washed was dried with $MgSO_4$, the solvents were evaporated, and the crude product was separated by silica gel chromatography to obtain 3.66 g (yield 40%) of Compound 1. From confirmation results through Mass Spectrometry-Fast Atom Bombardment (MS/FAB) and $^1H$ NMR, the product thus produced had a molecular formula of $C_{66}H_{42}BN_5$ and a molecular weight of 915.37. From the results, the compound thus obtained was identified as Compound 1.

(2) Synthesis of Compound 7

Fused Polycyclic Compound 7 according to an embodiment may be synthesized, for example, by Reaction 3 and Reaction 4 below.

Synthesis of Intermediate Compound 1-2

Reaction 3

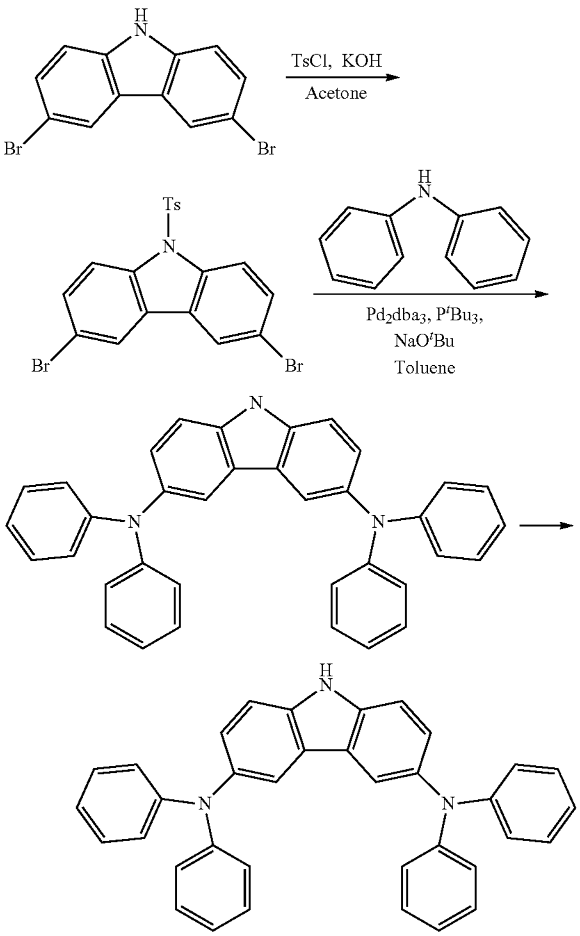

I-2

Synthesis of Compound 7

Reaction 4

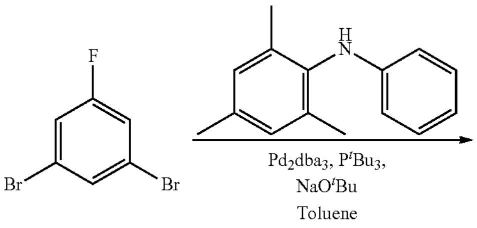

-continued

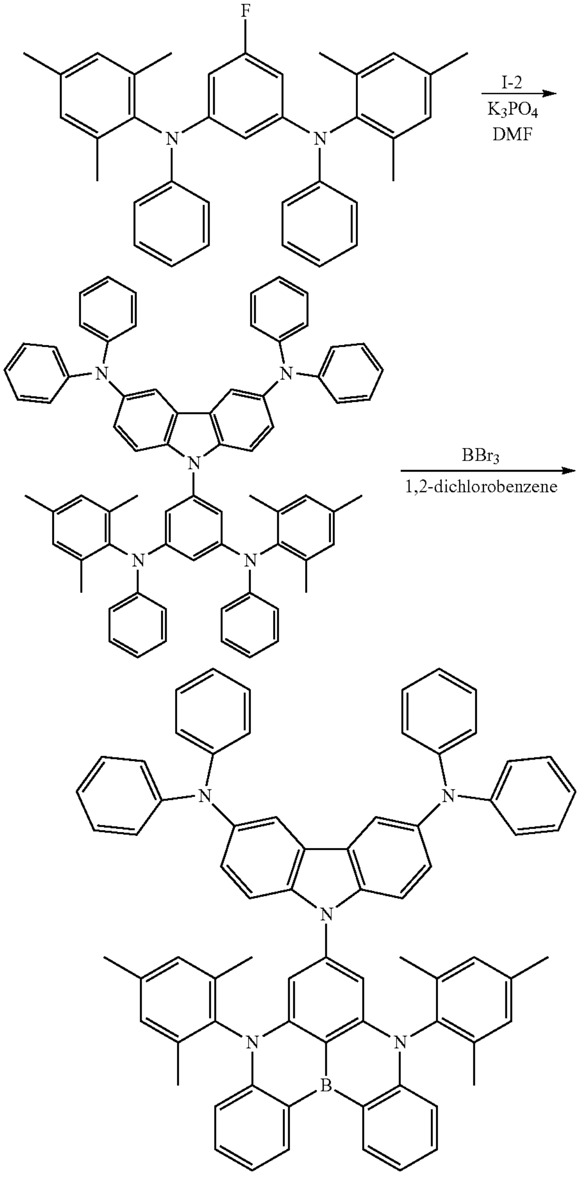

7

3.68 g (yield 36%) of Compound 7 was synthesized by the same (or substantially the same) method as that used for synthesizing Compound 1, except for using diphenylamine instead of carbazole in Reaction 1, using 2,4,6-trimethyl-N-phenylaniline instead of diphenylamine in Reaction 2, and using 9.96 g (10 mmol) of 9-(3,5-bis(mesityl(phenyl)amino)phenyl)-N3,N3,N6,N6-tetraphenyl-9H-carbazole-3,6-diamine and $BBr_3$ (30 mmol). From confirmation results through MS/FAB and $^1H$ NMR, the product thus produced had a molecular formula of $C_{72}H_{58}BN_5$ and a molecular weight of 1003.50. From the results, the compound thus obtained was identified as Compound 7.

(3) Synthesis of Compound 20

Fused Polycyclic Compound 20 according to an embodiment may be synthesized, for example, by Reaction 5 below.

Reaction 5

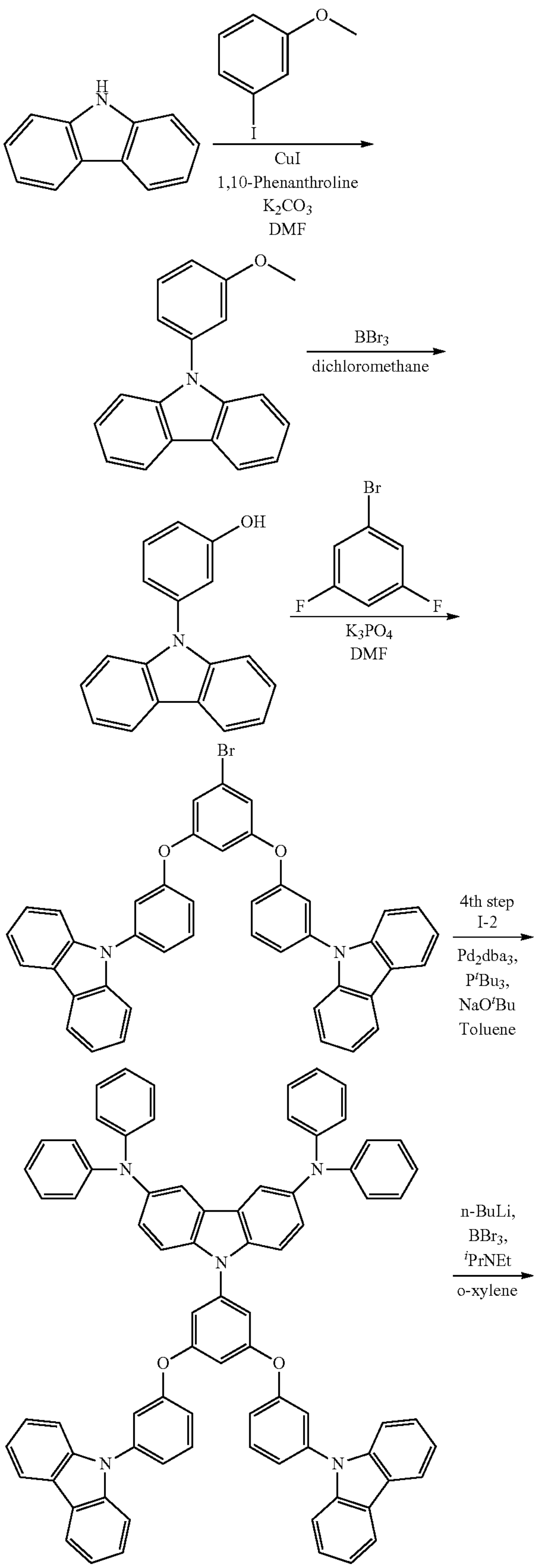

-continued

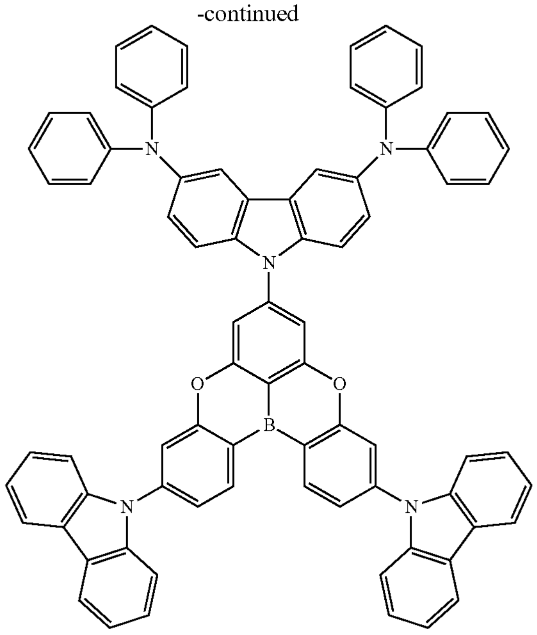

20

Intermediate I-2 prepared in Reaction 3 was used in step 4.

10.92 g (10 mmol) of 9-(3,5-bis(3-(9H-carbazol-9-yl) phenoxy)phenyl)-N3,N3,N6,N6-tetraphenyl-9H-carbazole-3,6-diamine was dissolved in 60 ml of o-xylene, and 10 ml (25 mmol) of 2.5 M n-BuLi was added at about −30° C. Then, the reactants were stirred at about 70° C. for about 1 hour, and $BBr_3$ (30 mmol) was added at about 0° C. dropwisely. The reactants were stirred at about 150° C. for about 15 hours and the temperature was increased to room temperature. Water was added thereto and washing with 30 ml of ethyl acetate was carried out three times. The ethyl acetate layer thus washed was dried with $MgSO_4$, the solvents were evaporated, and the crude product was separated by silica gel chromatography to obtain 201.1 g (yield 10%) of Compound 20. From confirmation results through MS/FAB and $^1H$ NMR, the product thus produced had a molecular formula of $C_{78}H_{50}BN_5O_2$ and a molecular weight of 1099.45. From the results, the compound thus obtained was identified as Compound 20.

(4) Synthesis of Compound 21

Fused Polycyclic Compound 21 according to an embodiment may be synthesized, for example, by Reaction 6 below.

Reaction 6

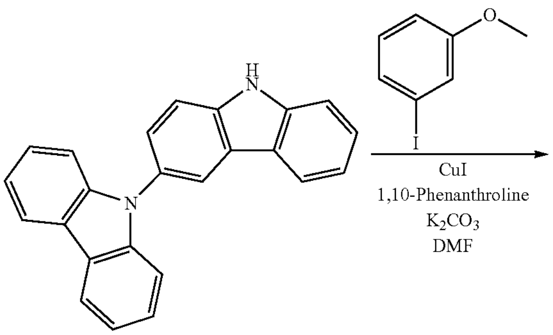

-continued

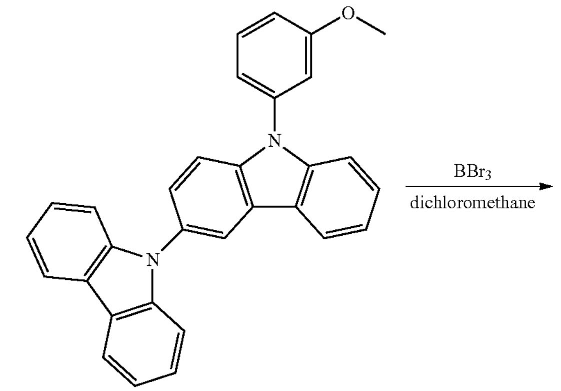

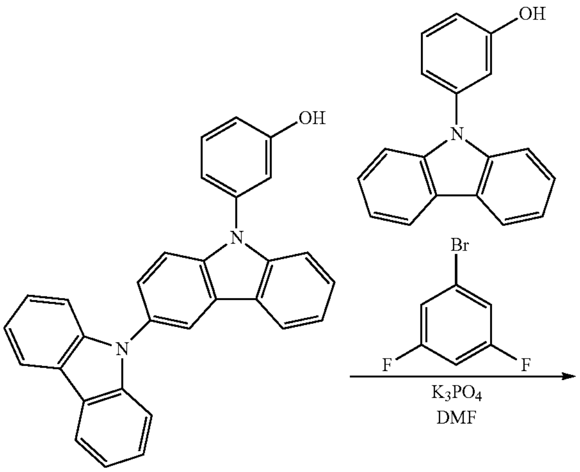

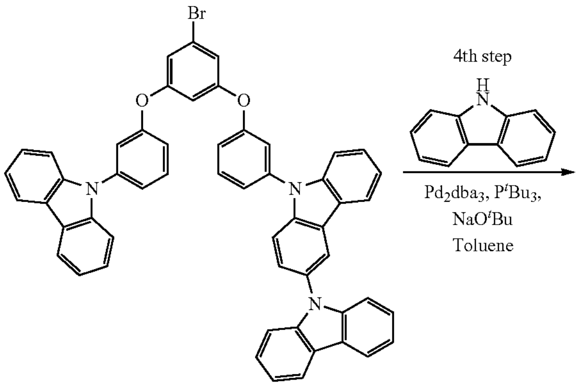

-continued

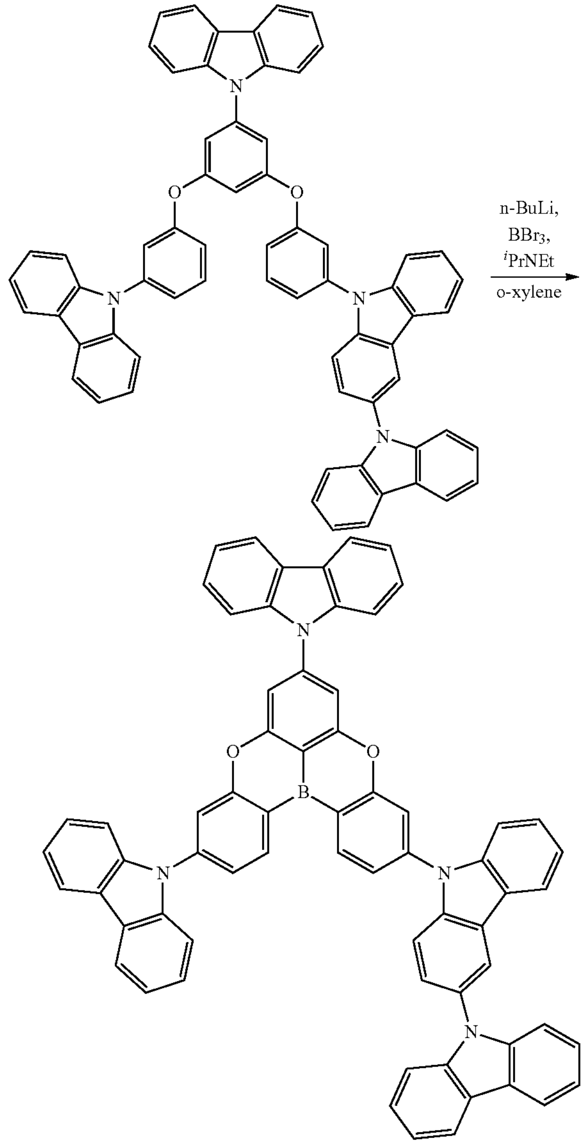

21

Compared to Reaction 5, 9H-3,9'-bicarbazole was used in Reaction 6 instead of carbazole, and carbazole was used instead of Intermediate I-2 in step 4.

0.75 g (yield 8%) of Compound 21 was obtained by the same (or substantially the same) method as that used for synthesizing Compound 20, by using 9.23 g (10 mmol) of 9-(3-(3-(3-(9H-carbazol-9-yl)phenoxy)-5-(9H-carbazol-9-yl)phenoxy)phenyl)-9H-3,9'-bicarbazole, 10 ml (25 mmol) of 2.5 M n-BuLi, and $BBr_3$ (30 mmol). From confirmation results through MS/FAB and $^1H$ NMR, the product thus produced had a molecular formula of $C_{66}H_{39}BN_4O_2$ and a molecular weight of 930.36.

From the results, the compound thus obtained was identified as Compound 21.

(5) Synthesis of Compound 255

Fused Polycyclic Compound 255 according to an embodiment may be synthesized, for example, by Reaction 7 below.

Reaction 7
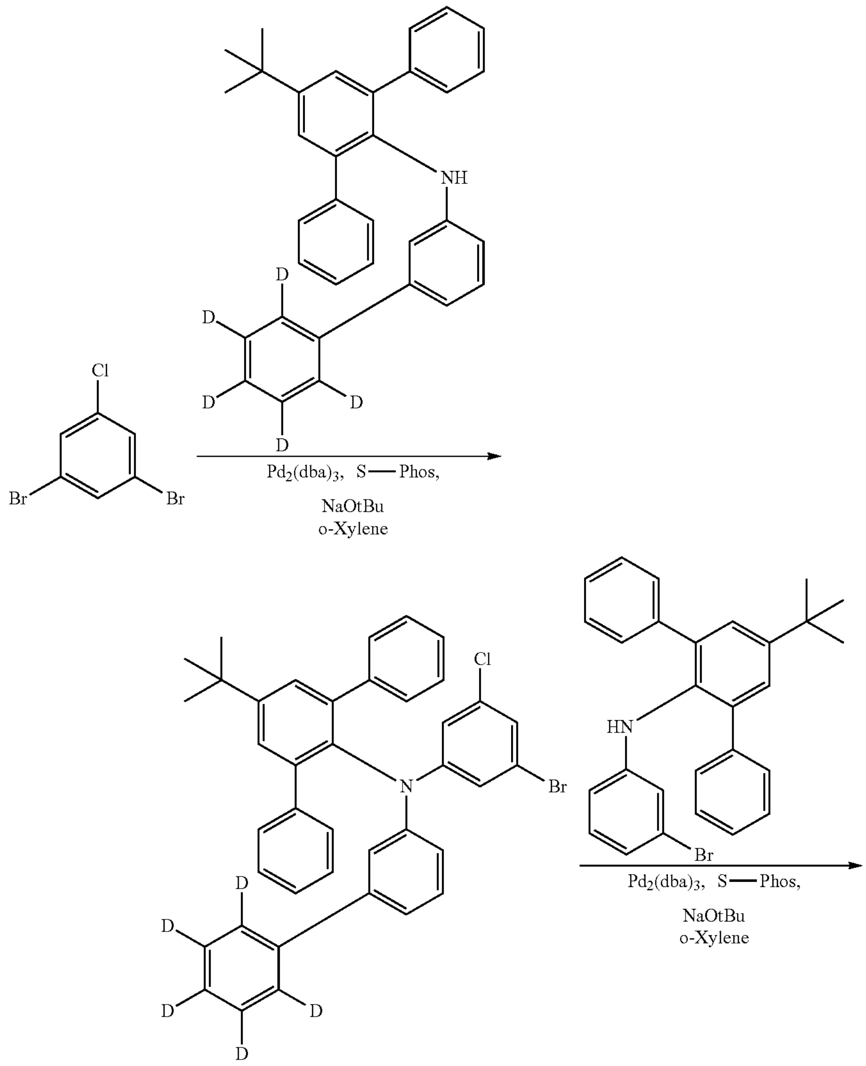
255-1
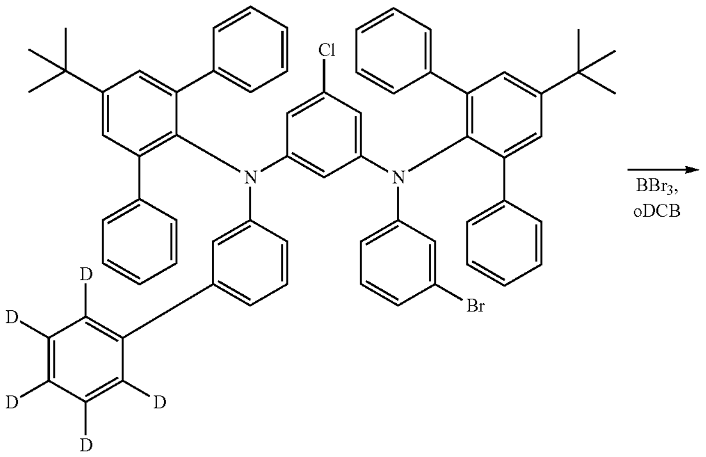
255-2

-continued
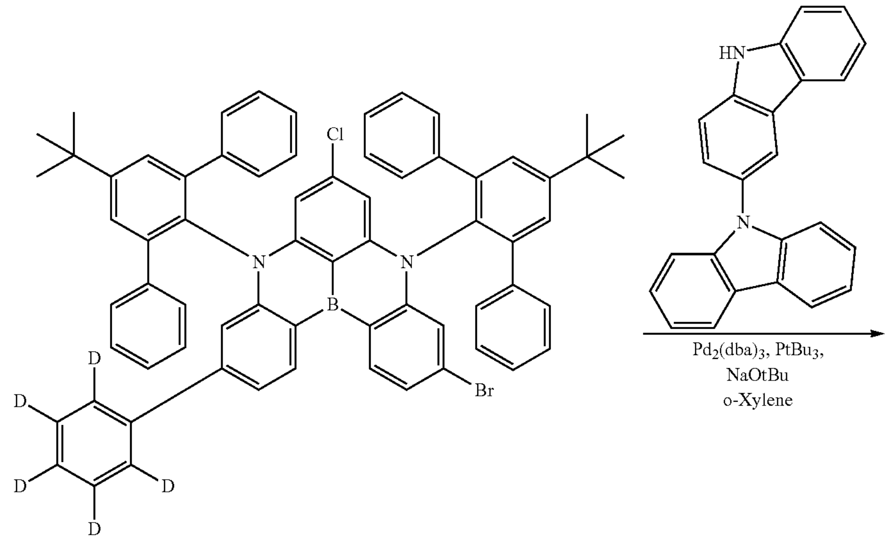
255-3
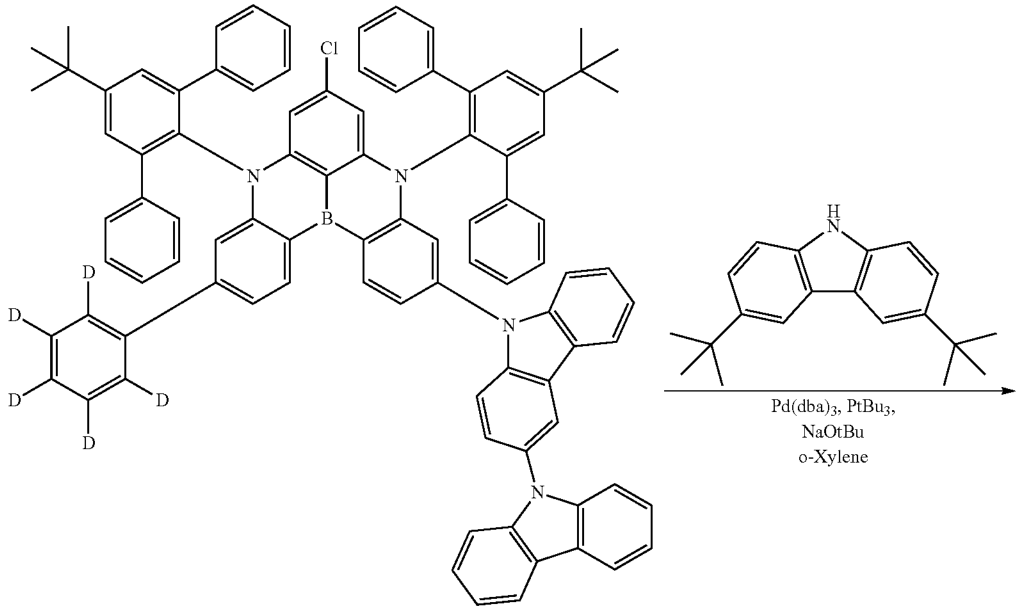
255-4

-continued

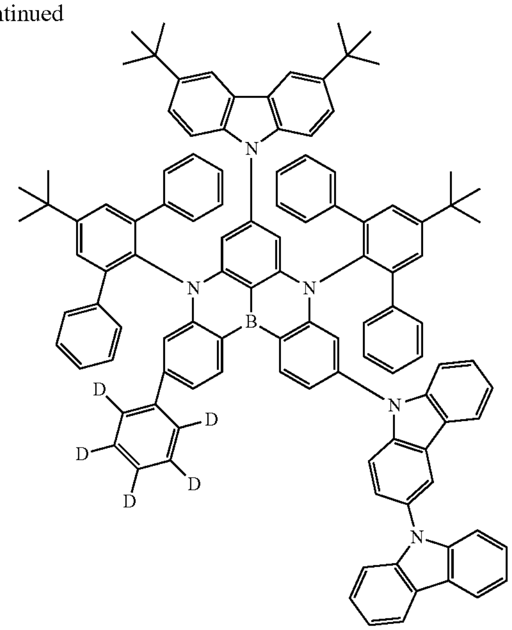

255

Synthesis of Intermediate 255-1

1,3-dibromo-5-chlorobenzene (1 eq), N-([1,1'-biphenyl]-3-yl-2',3',4',5',6'-d5)-5'-(tert-butyl)-[1,1':3',1"-terphenyl]-2'-amine (1 eq), Tris(dibenzylideneacetone)dipalladium(0) (0.05 eq), 2-Dicyclohexylphosphino-2',6'-dimethoxybiphenyl (S-Phos, 0.10 eq) and sodium tert-butoxide (3 eq) were dissolved in o-Xylene and stirred in a high pressure reactor at 150° C. under nitrogen atmosphere for 20 hours. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) to obtain an intermediate 255-1. (Yield: 55%)

Synthesis of Intermediate 255-2

Intermediate 255-1 (1 eq), N-(3-bromophenyl)-5'-(tert-butyl)-[1,1':3,1"-terphenyl]-2'-amine (1 eq), Tris (dibenzylideneacetone)dipalladium(0) (0.05 eq), 2-Dicyclohexylphosphino-2',6'-dimethoxybiphenyl (S-Phos, 0.10 eq), sodium tert-butoxide (3 eq) was dissolved in o-Xylene, and the mixture was stirred in a high pressure reactor at 150° C. for 20 hours. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) to obtain an intermediate 255-2. (Yield: 62%)

Synthesis of Intermediate 255-3

Intermediate 255-2 (1 eq) was dissolved in ortho-dichlorobenzene, the flask was cooled to 0 degrees Celsius under a nitrogen atmosphere, and $BBr_3$ (5 eq) dissolved in ortho-dichlorobenzene was slowly injected. After completion of the dropping, the temperature was raised to 190° C. and stirred for 24 hours. After cooling to 0° C., triethylamine was slowly dropped into the flask until the exotherm stopped, and the reaction was terminated. The obtained solid was purified by silica filtration, and then purified again by MC/Hex recrystallization to obtain Intermediate 255-3. After that, final purification was performed with a column (dichloromethane:n-Hexane). (Yield: 12%)

Synthesis of Compound 255-4

Intermediate 255-3 (1 eq), 9H-3,9'-bicarbazole (1.1 eq), Tris(dibenzylideneacetone)dipalladium(0) (0.05 eq), Tri-tert-butylphosphine ($PtBu_3$, 0.10 eq), Sodium tert-butoxide (3 eq) was dissolved in o-Xylene and stirred for 24 hours at 150° C. under a nitrogen atmosphere. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) to obtain an intermediate 255-4 (yield: 57%).

Synthesis of Compound 255

Intermediate 255-4 (1 eq), 3,6-di-tert-butyl-9H-carbazole (1.1 eq), Tris(dibenzylideneacetone)dipalladium(0) (0.05 eq), Tri-tert-butylphosphine (PtBu3, 0.10 eq), Sodium tert-butoxide (3 eq) was dissolved in o-Xylene and stirred at 150° C. under nitrogen atmosphere for 24 hours. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) gave compound 255 (yield: 62%). After that, the final purity was further purified by sublimation purification, and it was confirmed that the obtained compound was compound 255 through ESI-LCMS. ESI-LCMS: [M]+: C112H89N5, 1526.4

(6) Synthesis of Compound 519
Fused Polycyclic Compound 519 according to an embodiment may be synthesized, for example, by Reaction 8 below.
Reaction 8
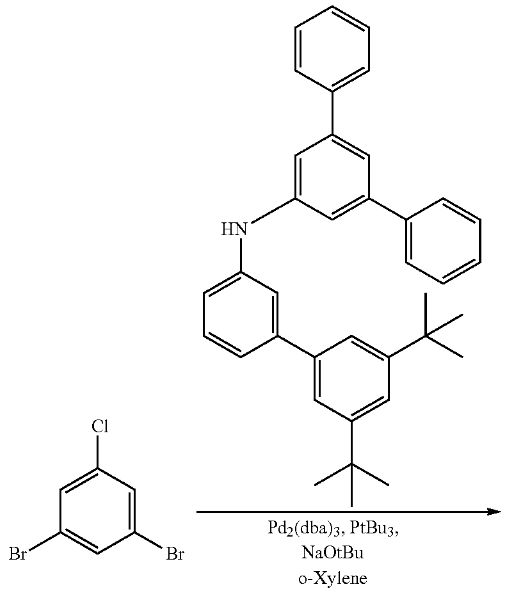
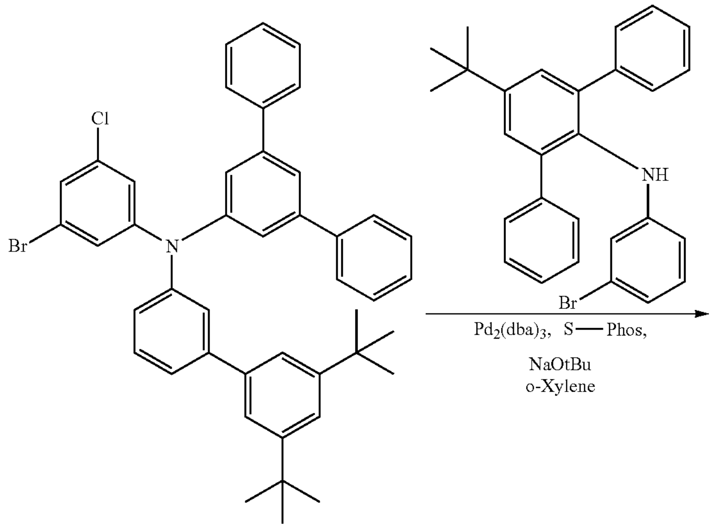
519-1

-continued
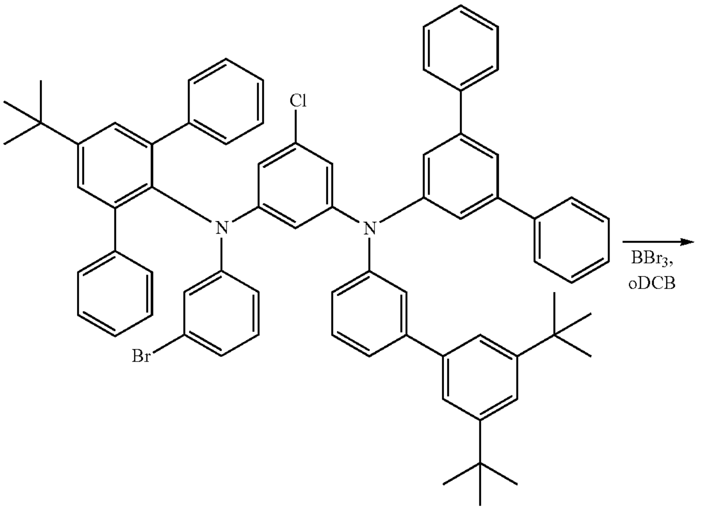
519-2
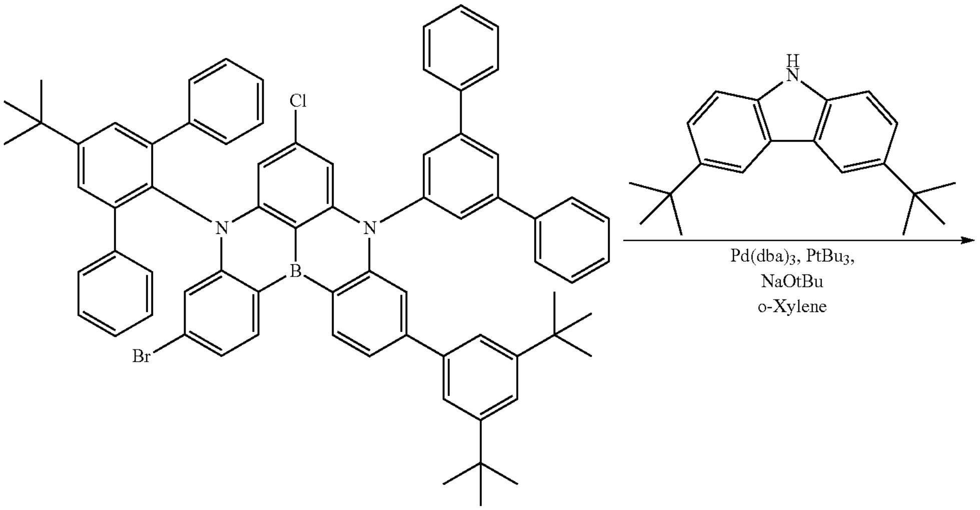
519-3
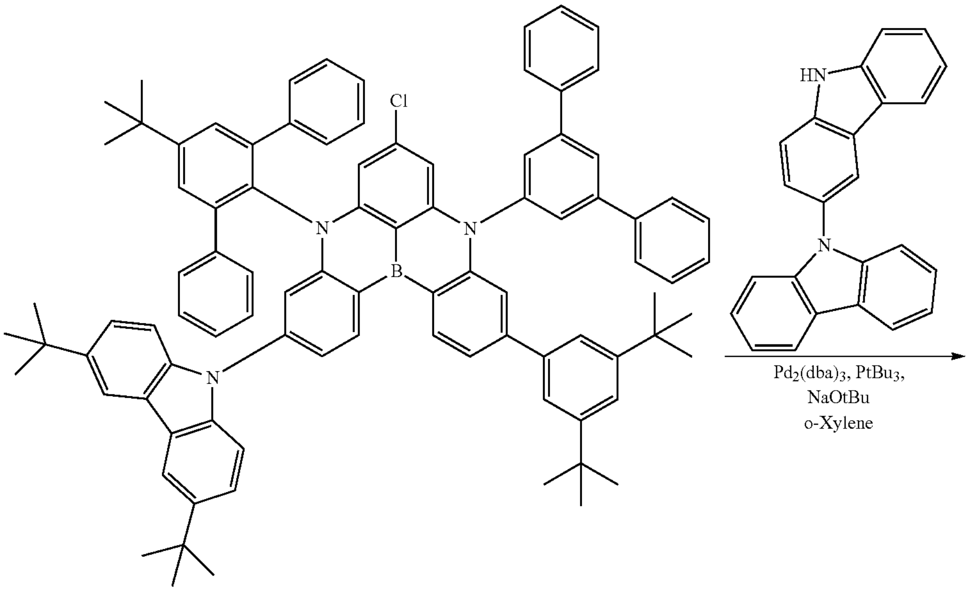
519-4

-continued

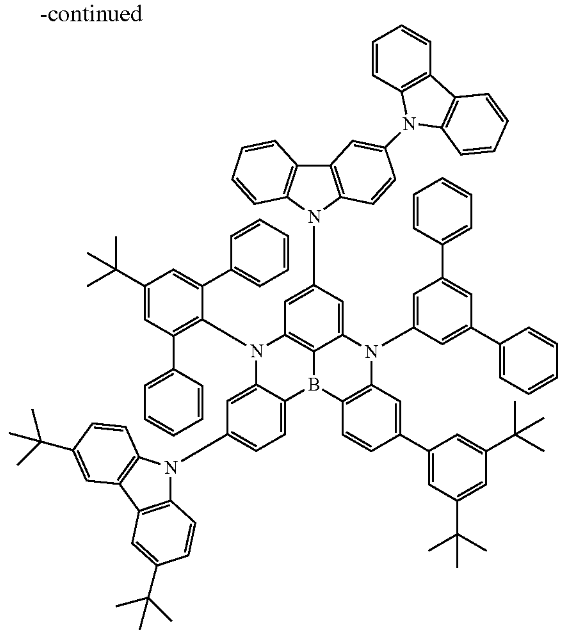

519

Synthesis of Intermediate 519-1

1,3-dibromo-5-chlorobenzene (1 eq), N-(3',5'-di-tert-butyl-[1,1'-biphenyl]-3-yl)-[1,1':3',1"-terphenyl]-5'-amine (1 eq), Tris(dibenzylideneacetone)dipalladium(0) (0.05 eq), Tri-tert-butylphosphine (PtBu3, 0.10 eq), Sodium tert-butoxide (3 eq) After dissolving in -Xylene, the mixture was stirred at 150° C. under nitrogen atmosphere for 24 hours. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) gave an intermediate 519-1 (yield: 62%).

Synthesis of Intermediate 519-2

Intermediate 519-1 (1 eq), N-(3-bromophenyl)-5'-(tert-butyl)-[1,1':3,1"-terphenyl]-2'-amine (1 eq), Tris (dibenzylideneacetone)dipalladium(0) (0.05 eq), 2-Dicyclohexylphosphino-2',6'-dimethoxybiphenyl (S-Phos, 0.10 eq), sodium tert-butoxide (3 eq) was dissolved in o-Xylene and The mixture was stirred in a high pressure reactor at 150° C. for 20 hours. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) to obtain an intermediate 519-2. (Yield: 57%)

Synthesis of Intermediate 519-3

Intermediate 519-2 (1 eq) was dissolved in ortho dichlorobenzene, the flask was cooled to 0 degrees Celsius under a nitrogen atmosphere, and $BBr_3$ (5 eq) dissolved in ortho dichlorobenzene was slowly injected. After completion of the dropping, the temperature was raised to 190° C. and stirred for 24 hours. After cooling to 0° C., triethylamine was slowly dropped into the flask until the exotherm stopped, and the reaction was terminated. The obtained solid was purified by silica filtration, and then purified again by MC/Hex recrystallization to obtain Intermediate 519-3. After that, final purification was performed with a column (dichloromethane:n-Hexane). (Yield: 9%)

Synthesis of Intermediate 519-4

Intermediate 519-3 (1 eq), 3,6-di-tert-butyl-9H-carbazole (1 eq), Tris(dibenzylideneacetone)dipalladium(0) (0.05 eq), Tri-tert-butylphosphine (PtBu3, 0.10 eq), Sodium tert-butoxide (3 eq) was dissolved in o-Xylene and stirred at 150° C. under nitrogen atmosphere for 24 hours. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) gave an intermediate 519-4 (yield: 59%).

Synthesis of Compound 519

Intermediate 519-4 (1 eq), 9H-3,9'-bicarbazole (1.1 eq), Tris(dibenzylideneacetone)dipalladium(0) (0.05 eq), Tri-tert-butylphosphine (PtBu3, 0.10 eq), Sodium tert-butoxide (3 eq) was dissolved in o-Xylene and stirred for 24 hours at 150° C. under a nitrogen atmosphere. After cooling, it was dried under reduced pressure to remove o-Xylene. After washing three times with ethyl acetate and water, the obtained organic layer was dried over $MgSO_4$ and dried under reduced pressure. Purification and recrystallization by column chromatography (dichloromethane:n-Hexane) gave compound 519 (yield: 61%). Thereafter, the final purity was further purified by sublimation purification, and it was confirmed that the obtained compound was compound 519 through ESI-LCMS. ESI-LCMS: [M]+: C116H102N5, 1577.3

2. Evaluation of Energy Level of Fused Polycyclic Compound
The compounds used in Example 1 to Example 4 and Comparative Example 1 to Comparative Example 8 are shown in Table 1.
TABLE 1
| | |
|---|---|
| Compound 1 | 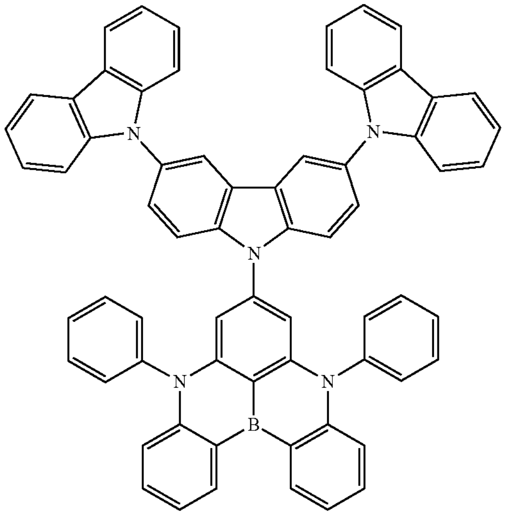 1 |
| Compound 7 | 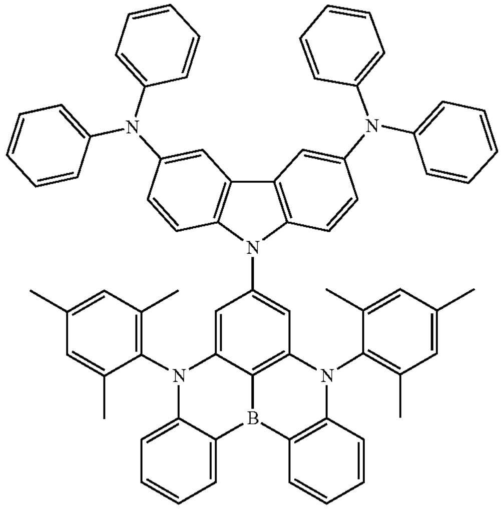 7 |

TABLE 1-continued
Compound 20
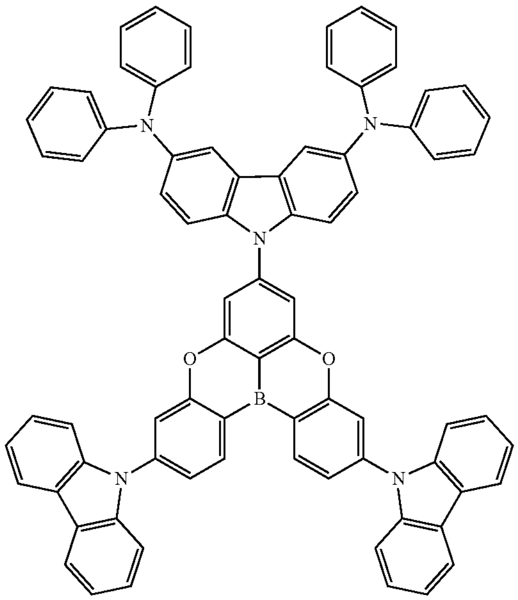
20
Compound 21
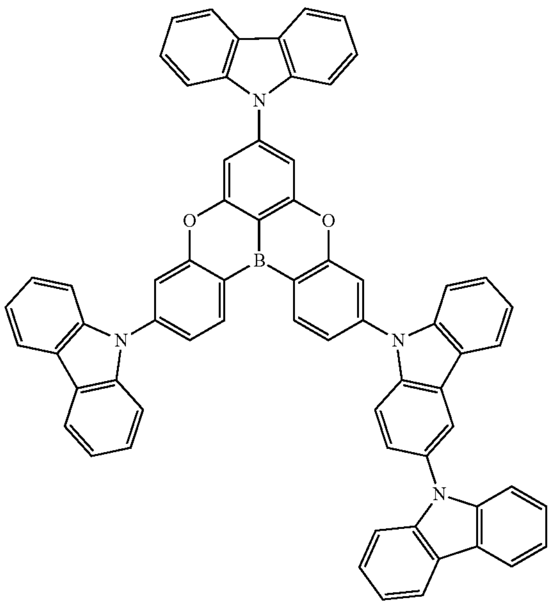
21

TABLE 1-continued
| | |
|---|---|
| Comparative Compound C1 | 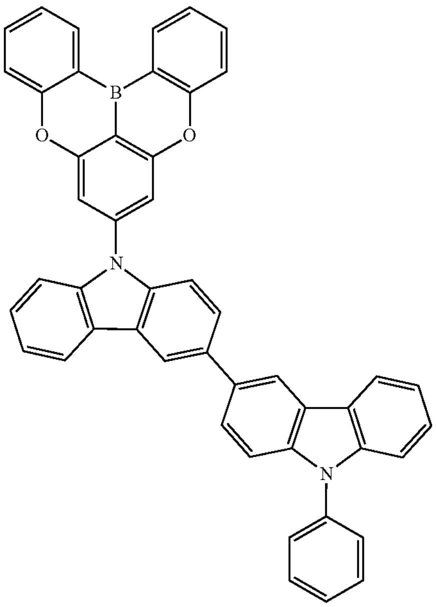<br>C1 |
| Comparative Compound C2 | 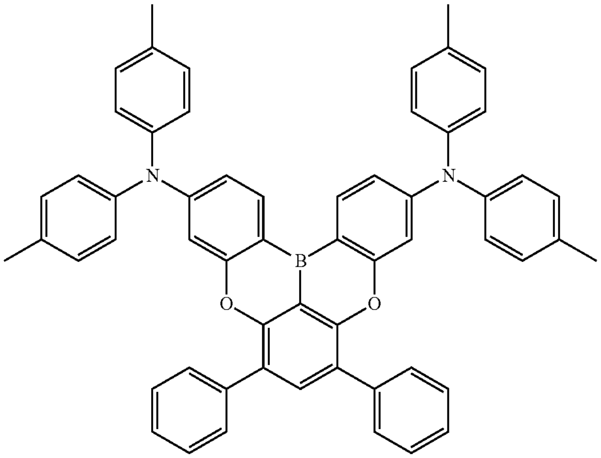<br>C2 |

TABLE 1-continued
Compound 255
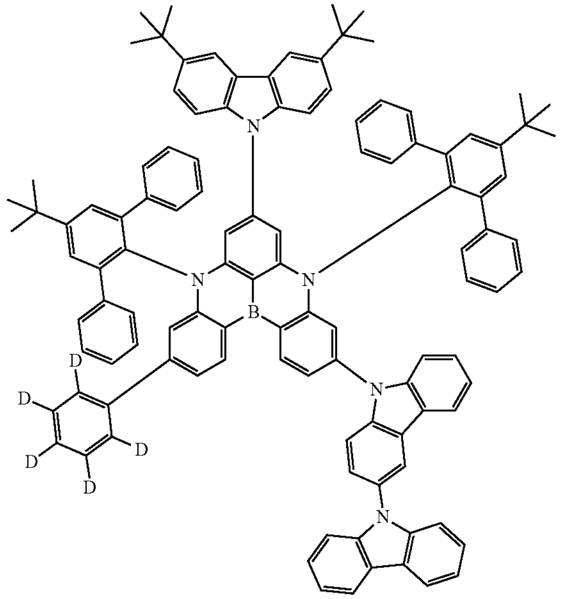
255
Comparative Compound C3
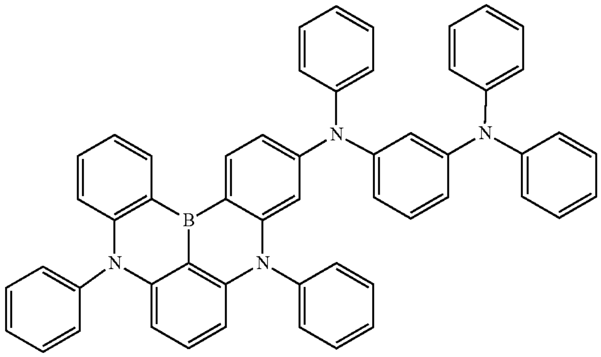
C3
Comparative Compound C4
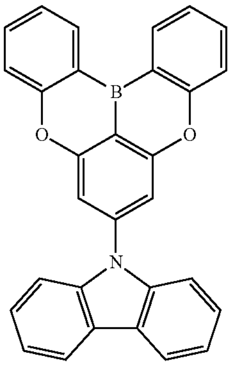
C4

TABLE 1-continued
Comparative Compound C5
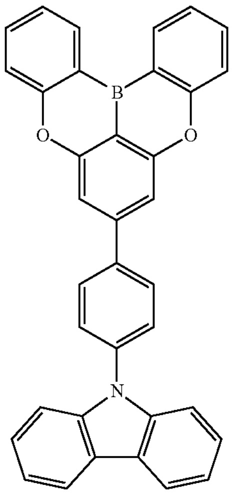
C5
Comparative Compound C6
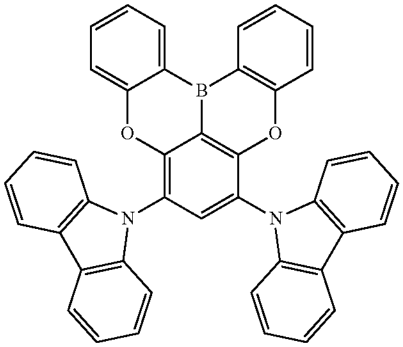
C6
Comparative Compound C7
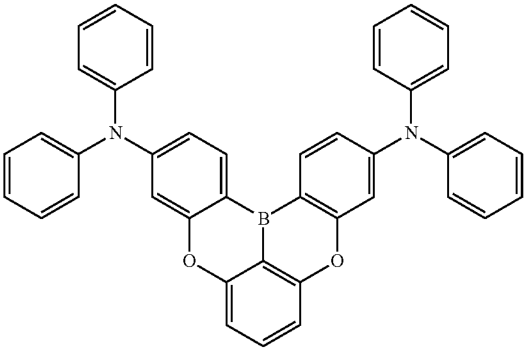
C7

TABLE 1-continued

| | |
|---|---|
| Comparative Compound C8 | 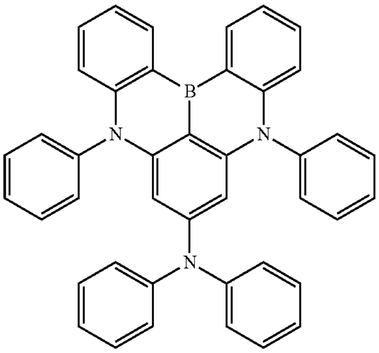 C8 |
| Compound 519 | 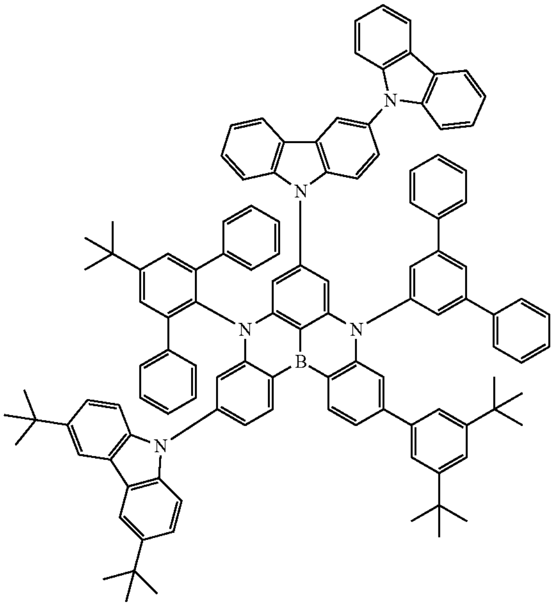 519 |

In Table 2 below, the lowest singlet excitation energy level (S1 level), the lowest triplet excitation energy level (T1 level), and $E_{ST}$ of Compound 1, Compound 7, Compound 20, and Compound 21 (which are the Example Compounds), and Comparative Compound C1 to Comparative Compound C8 are shown. The energy level values in Table 2 were calculated by a nonempirical molecular orbital method. Particularly, the calculation was conducted by B3LYP/6-31G(d) using Gaussian 09 of Gaussian Co. $E_{ST}$ represents a difference between the lowest singlet excitation energy level (S1 level) and the lowest triplet excitation energy level (T1 level).

TABLE 2

| Division | Compound type | S1 level (eV) | T1 level (eV) | $E_{ST}$ (eV) |
|---|---|---|---|---|
| Example 1 | Compound 1 | 2.99 | 2.64 | 0.35 |
| Example 2 | Compound 7 | 2.88 | 2.64 | 0.24 |
| Example 3 | Compound 20 | 2.20 | 2.16 | 0.04 |
| Example 4 | Compound 21 | 2.72 | 2.67 | 0.05 |
| Comparative Example 1 | Comparative Compound C1 | 2.82 | 2.73 | 0.09 |

TABLE 2-continued

| Division | Compound type | S1 level (eV) | T1 level (eV) | $E_{ST}$ (eV) |
|---|---|---|---|---|
| Comparative Example 2 | Comparative Compound C2 | 2.93 | 2.55 | 0.38 |
| Comparative Example 3 | Comparative Compound C3 | 3.06 | 2.61 | 0.45 |
| Comparative Example 4 | Comparative Compound C4 | 3.11 | 2.93 | 0.18 |
| Comparative Example 5 | Comparative Compound C5 | 3.15 | 2.84 | 0.31 |
| Comparative Example 6 | Comparative Compound C6 | 2.79 | 2.65 | 0.14 |
| Comparative Example 7 | Comparative Compound C7 | 3.01 | 2.60 | 0.41 |
| Comparative Example 8 | Comparative Compound C8 | 3.13 | 2.64 | 0.49 |

It could be confirmed that Compound 1, Compound 7, Compound 20, and Compound 21, which are the Example Compounds, showed small $E_{ST}$ values. Since Compound 1, Compound 7, Compound 20, and Compound 21, which are the Example Compounds showed small $E_{ST}$ values of about 0.4 eV or less, these compounds could be used as dopant materials for thermally activated delayed fluorescence, with high light efficiency.

3. Manufacture and Evaluation of Light Emitting Device Including Fused Polycyclic Compound Manufacture of Light Emitting Device An light emitting device of the present embodiments including the fused polycyclic compound of the present embodiments in an emission layer was manufactured by a method described below. Light emitting devices of Example 1 to Example 4 were manufactured using the fused polycyclic compounds of Compound 1, Compound 7, Compound 20, and Compound 21, which were Example Compounds, as dopant materials for an emission layer. The light emitting devices of Comparative Example 1 to Comparative Example 8 were manufactured using Comparative Compound C1 to Comparative Compound C8 as dopant materials in an emission layer.

On a glass substrate, ITO with a thickness of about 1,200 Å was patterned and washed with isopropyl alcohol and ultra-pure water, washed with ultrasonic waves for about 5 minutes, exposed to UV for about 30 minutes and treated with ozone. Then, NPD was vacuum deposited to a thickness of about 300 Å to form a hole injection layer, and TCTA was vacuum deposited to a thickness of about 200 Å, and CzSi was vacuum deposited to a thickness of about 100 Å to form a hole transport layer.

On the hole transport layer, mCP and the fused polycyclic compound of the present embodiments of the inventive concept or Comparative Compound were co-deposited in a ratio of 99:1 to form an emission layer with a thickness of about 200 Å. The emission layer formed by the co-deposition, was formed by mixing Compound 1, Compound 7, Compound 20, and Compound 21, respectively, with mCP to prepare Example 1 to Example 4, respectively, or by mixing Comparative Compound C1 to Comparative Compound C8, respectively, with mCP to prepare Comparative Example 1 to Comparative Compound 8, respectively.

On the emission layer, an electron transport layer was formed using TPSO1 to a thickness of about 200 Å, and then, an electron injection layer was formed by depositing TPBi to a thickness of about 300 Å and $Y_b$ to a thickness of about 10 Å in order. Then, a second electrode was formed using aluminum (Al) to a thickness of about 3,000 Å on the electron injection layer.

Compounds used in the Examples and Comparative Examples are shown below.

NPD

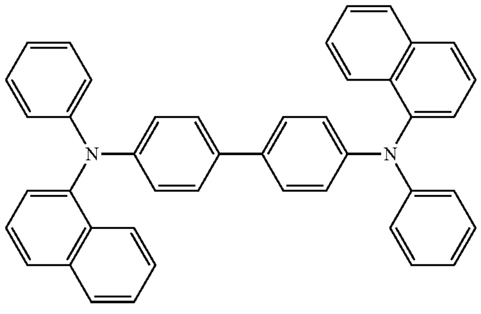

-continued

TCTA

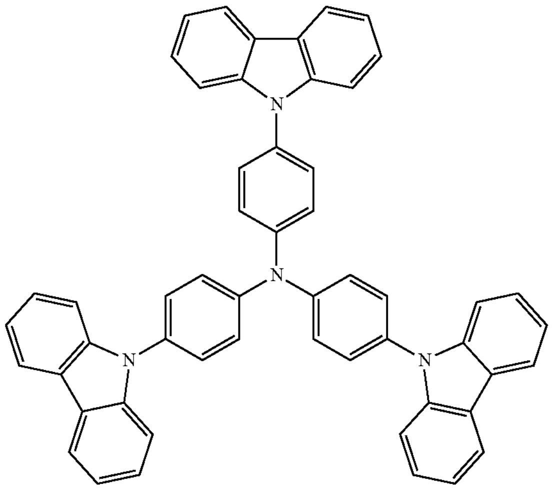

Cz Si

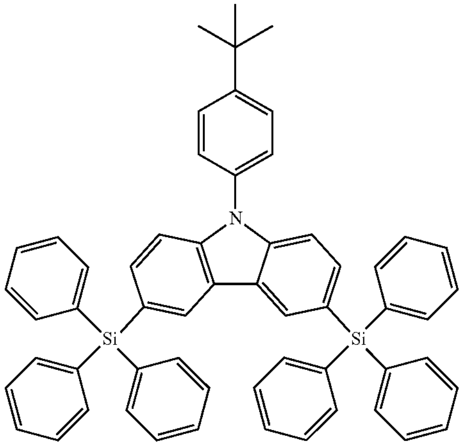

mCP

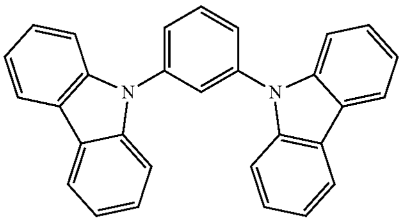

TSPO1

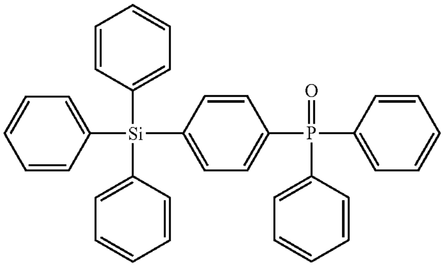

-continued

TPBi

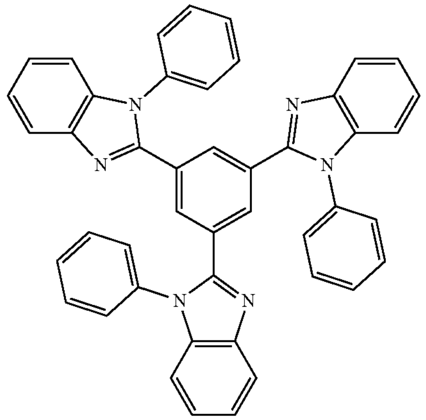

Evaluation of Properties of Light Emitting Device

In Table 3, the evaluation results of the light emitting devices of Example 1 to Example 6, and Comparative Example 1 to Comparative Example 8 are shown. In Table 3, the driving voltage, emission efficiency and external quantum efficiency (EQE) of the light emitting devices thus manufactured are compared and shown.

In the evaluation results of the properties on the Examples and the Comparative Examples, as shown in Table 3, the voltage and current density were measured using a source meter (Keithley Instrument Co., 2400 series), and the external quantum efficiency (EQE) was measured using an external quantum efficiency measurement apparatus 09920-12 of HAMAMATSU Photonics Co. The emission efficiency represents a current efficiency value with respect to current density of 10 mA/cm$^2$.

TABLE 3

| Device manufacturing example | Dopant material of emission layer | Driving voltage (V) | Emission efficiency (cd/A) | EQE (%) | Color of emitted light |
|---|---|---|---|---|---|
| Example 1 | Compound 1 | 4.9 | 18.6 | 17.9 | Blue |
| Example 2 | Compound 7 | 4.7 | 22.2 | 21.4 | Blue |
| Example 3 | Compound 20 | 5.0 | 23.8 | 23.0 | Blue |
| Example 4 | Compound 21 | 5.5 | 21.7 | 20.4 | Blue |
| Example 5 | Compound 255 | 4.4 | 26.8 | 25.7 | Blue |
| Example 6 | Compound 519 | 4.5 | 25.7 | 24.9 | Blue |
| Comparative Example 1 | Comparative Compound C1 | 6.4 | 15.3 | 14.0 | Blue |
| Comparative Example 2 | Comparative Compound C2 | 6.5 | 15.0 | 13.9 | Blue |
| Comparative Example 3 | Comparative Compound C3 | 5.7 | 14.8 | 13.3 | Blue |
| Comparative Example 4 | Comparative Compound C4 | 5.9 | 14.2 | 13.1 | Blue |
| Comparative Example 5 | Comparative Compound C5 | 6.1 | 14.4 | 13.4 | Blue |
| Comparative Example 6 | Comparative Compound C6 | 6.3 | 13.9 | 12.8 | Blue |
| Comparative Example 7 | Comparative Compound C7 | 5.8 | 15.2 | 14.3 | Blue |
| Comparative Example 8 | Comparative Compound C8 | 5.7 | 15.4 | 14.5 | Blue |

Referring to the results in Table 3, the light emitting devices according to the Examples, using the fused polycyclic compound according to embodiments of the inventive concept as a material for an emission layer, were found to show lower driving voltage values and higher emission efficiency and external quantum efficiency, when compared with the Comparative Examples. In case of the Example Compounds, TADF properties are shown by using multiple resonance phenomenon by aromatic rings which form fused rings, and may have small $E_{ST}$ values by including a double nitrogen-containing hetero substituent which is obtained by substituting a nitrogen-containing first hetero substituent in addition to a nitrogen-containing second hetero substituent at a ring which forms the fused ring. Accordingly, the light emitting devices of the Examples may show improved emission efficiency than the light emitting of the Comparative Examples. Particularly, the light emitting device of the present embodiments may accomplish high emission efficiency in a blue light wavelength region by including the fused polycyclic compound of the present embodiments as a material for an emission layer.

The light emitting device of the present embodiments may show improved device characteristics showing high emission efficiency in a blue region.

The fused polycyclic compound of the present embodiments may be included in an emission layer of an light emitting device and may contribute to increasing the efficiency of the light emitting device.

Although the exemplary (example) embodiments of the present invention have been described, it is understood that the present invention should not be limited to these exemplary (example) embodiments but various changes and modifications can be made by one ordinary skilled in the art within the spirit and scope of the present invention as hereinafter defined by the following claims and their equivalents.

What is claimed is:

1. A light emitting device, comprising:

a first electrode;

a second electrode facing the first electrode; and a plurality of organic layers between the first electrode and the second electrode, wherein at least one organic layer among the plurality of organic layers comprises a fused polycyclic compound represented by Formula 1:

Formula 1

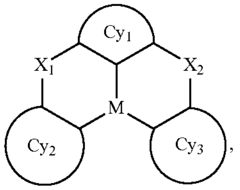

wherein, in Formula 1,

M is B, Al, Ga, or In, $X_1$ and $X_2$ are each independently $NR_1$, O, S, $P(=O)R_2$, or $P(=S)R_3$, $R_1$ to $R_3$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_3$ are optionally combined with an adjacent group to form a ring, $Cy_1$ to $Cy_3$ are each independently a substituted or unsubstituted aromatic hydrocarbon ring, or a substituted or unsubstituted aromatic heterocycle, and any of $Cy_1$ to $Cy_3$ are optionally combined with an adjacent group to form a ring, and at least one among $Cy_1$ to $Cy_3$ is substituted with a substituent represented by Formula 2:

Formula 2

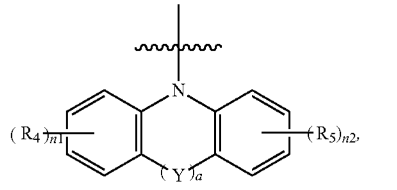

wherein, in Formula 2, $R_4$ and $R_5$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_4$ and $R_5$ are optionally combined with an adjacent group to form a ring, "$n_1$" and "$n_2$" are each independently an integer of 0 to 5, at least one among $R_4$ and $R_5$ is a substituted or unsubstituted amine group, or a substituted or unsubstituted carbazole group, if $R_4$ is the substituted or unsubstituted amine group, or the substituted or unsubstituted carbazole group, $n_1$ is an integer of 1 to 5, if $R_5$ is the substituted or unsubstituted amine group, or the substituted or unsubstituted carbazole group, $n_2$ is an integer of 1 to 5, Y is a direct linkage, a is 0 or 1, a sum of "a" and "n1" is an integer of 5 or less, and a sum of "a" and "$n_2$" is an integer of 5 or less.

2. The light emitting device of claim 1, wherein the plurality of organic layers comprise:

a hole transport region on the first electrode;

an emission layer on the hole transport region; and an electron transport region on the emission layer, and the emission layer comprises the fused polycyclic compound represented by Formula 1.

3. The light emitting device of claim 2, wherein the emission layer is to emit delayed fluorescence.

4. The light emitting device of claim 2, wherein the emission layer is a delayed fluorescence emission layer comprising a first compound and a second compound, and the second compound comprises the fused polycyclic compound represented by Formula 1.

5. The light emitting device of claim 2, wherein the emission layer comprises:

a first compound having a first lowest triplet excitation energy level;

a second compound having a second lowest triplet excitation energy level which is lower than the first lowest triplet excitation energy level; and a third compound having a third lowest triplet excitation energy level which is lower than the second lowest triplet excitation energy level, and the second compound comprises the fused polycyclic compound represented by Formula 1.

6. The light emitting device of claim 5, wherein the second compound is a delayed fluorescence material, and the third compound is a phosphorescence material or a fluorescence material.

7. The light emitting device of claim 1, wherein the fused polycyclic compound represented by Formula 1 is represented by Formula 3:

Formula 3

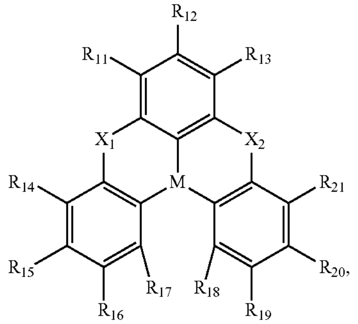

wherein, in Formula 3, $R_{11}$ to $R_{21}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ are optionally combined with an adjacent group to form a ring, at least one among $R_{11}$ to $R_{21}$ is represented by Formula 2, and M, $X_1$, and $X_2$ are the same as defined in Formula 1.

8. The light emitting device of claim 7, wherein the fused polycyclic compound represented by Formula 3 is represented by Formula 4:

Formuula 4

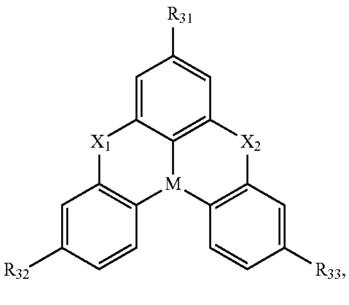

wherein, in Formula 4, $R_{31}$ to $R_{33}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{31}$ to $R_{33}$ are optionally combined with an adjacent group to form a ring, at least one among $R_{31}$ to $R_{33}$ is represented by Formula 2, and M, $X_1$, and $X_2$ are the same as defined in Formula 1.

9. The light emitting device of claim 1, wherein the substituent represented by Formula 2 is represented by Formula 5-1 or Formula 5-2:

Formula 5-1

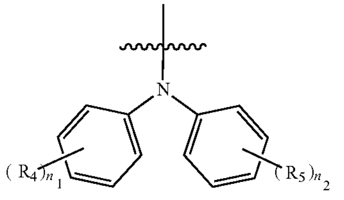

-continued

Formula 5-2

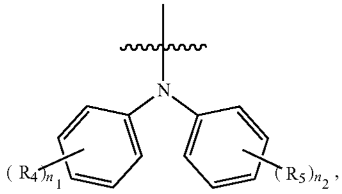

wherein, in Formulae 5-1 and 5-2, $R_4$, $R_5$, $n_1$, and $n_2$ are the same as defined in Formula 2.

10. The light emitting device of claim 9, wherein the substituent represented by Formula 2 is represented by any one among Formula 6-1 to Formula 6-4:

Formula 6-1

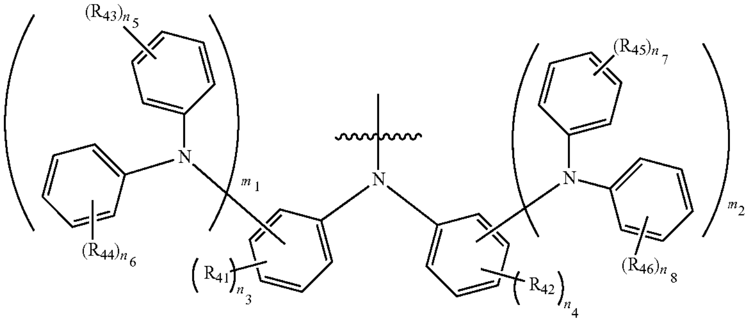

Formula 6-2

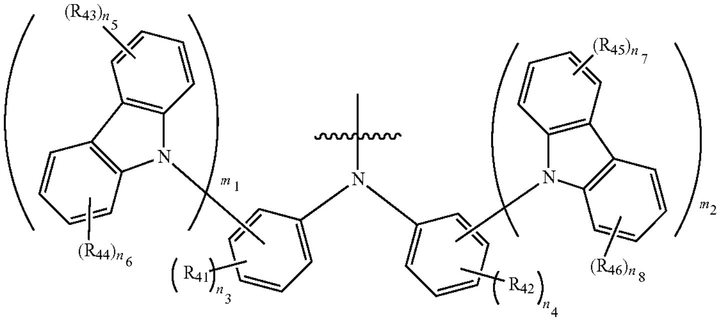

Formula 6-3

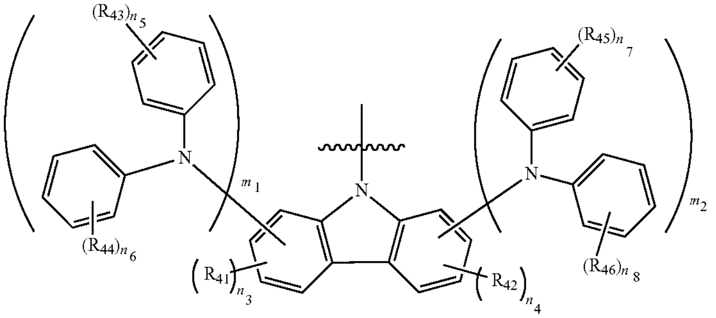

-continued

Formula 6-4

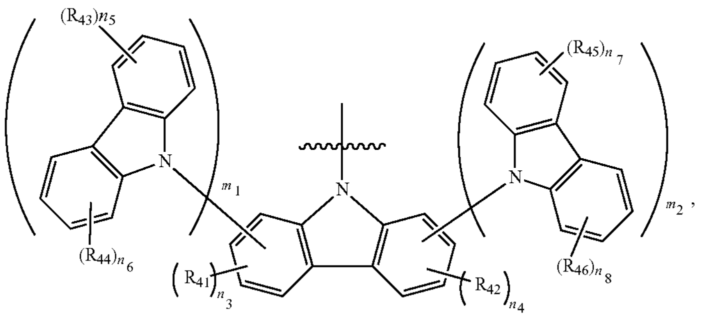

wherein, in Formulae 6-1 to 6-4, $R_{41}$ to $R_{46}$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{41}$ to $R_{46}$ are optionally combined with an adjacent group to form a ring, $n_3$ and $n_4$ are each independently an integer of 0 to 3, $n_5$ to $n_8$ are each independently an integer of 0 to 4, $m_1$ and $m_2$ are each independently 0 or 1, and at least one of $m_1$ and $m_2$ is 1.

11. The light emitting device of claim 1, wherein the substituent represented by Formula 2 is represented by Formula 7-1 to Formula 7-4:

Formula 7-1

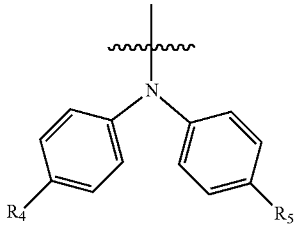

Formula 7-2

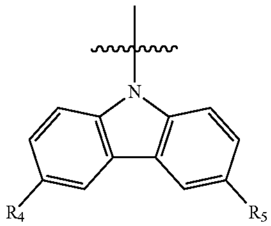

-continued

Formula 7-3

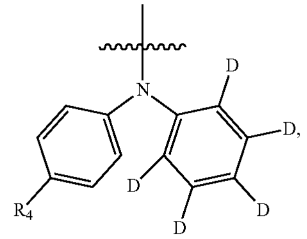

Formula 7-4

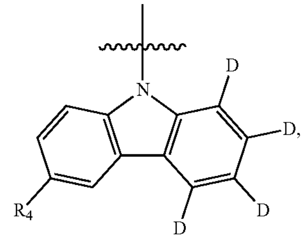

wherein, in Formulae 7-1 to 7-4, $R_4$, and $R_5$ are the same as defined in Formula 2.

12. The light emitting device of claim 1, wherein $X_1$ and $X_2$ are each independently $NR_1$, or O, and $R_1$ is a substituted or unsubstituted aryl group of 6 to 60 carbon atoms to form a ring.

13. The light emitting device of claim 1, further comprising a capping layer on the second electrode, wherein the capping layer has a refractive index of about 1.6 or more.

14. A fused polycyclic compound represented by Formula 1:

Formula 1

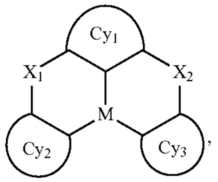

wherein, in Formula 1,

M is B, Al, Ga, or In, $X_1$ and $X_2$ are each independently $NR_1$, O, S, $P(=O)R_2$, or $P(=S)R_3$, $R_1$ to $R_3$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_3$ are optionally combined with an adjacent group to form a ring, $Cy_1$ to $Cy_3$ are each independently a substituted or unsubstituted aromatic hydrocarbon ring, or a substituted or unsubstituted aromatic heterocycle, and any of $Cy_1$ to $Cy_3$ are optionally combined with an adjacent group to form a ring, and at least one among $Cy_1$ to $Cy_3$ is substituted with a substituent represented by Formula 2:

Formula 2

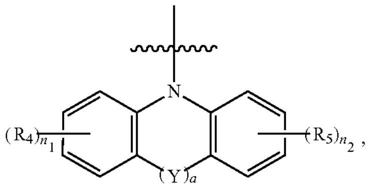

wherein, in Formula 2, $R_4$ and $R_5$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_4$ and $R_5$ are optionally combined with an adjacent group to form a ring, "$n_1$" and "$n_2$" are each independently an integer of 0 to 5, at least one among $R_4$ and $R_5$ is a substituted or unsubstituted amine group, or a substituted or unsubstituted carbazole group, if $R_4$ is the substituted or unsubstituted amine group, or the substituted or unsubstituted carbazole group, $n_1$ is an integer of 1 to 5, if $R_5$ is the substituted or unsubstituted amine group, or the substituted or unsubstituted carbazole group, $n_2$ is an integer of 1 to 5, Y is a direct linkage, "a" is 0 or 1, a sum of "a" and "$n_1$" is an integer of 5 or less, and a sum of "a" and "$n_2$" is an integer of 5 or less.

15. The fused polycyclic compound of claim 14, wherein the fused polycyclic compound represented by Formula 1 has an absolute value of a difference between a lowest singlet excitation energy level (S1) and a lowest triplet excitation energy level (T1) of about 0.4 eV or less.

16. The fused polycyclic compound of claim 14, wherein the fused polycyclic compound represented by Formula 1 is represented by Formula 3:

Formula 3

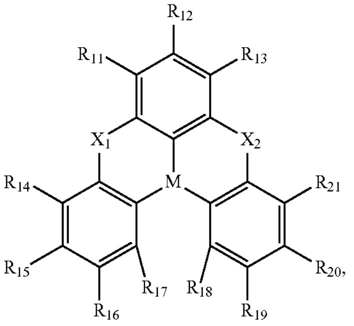

wherein, in Formula 3, $R_{11}$ to $R_{21}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ are optionally combined with an adjacent group to form a ring, at least one among $R_{11}$ to $R_{21}$ is represented by Formula 2, and M, $X_1$, and $X_2$ are the same as defined in Formula 1.

17. The fused polycyclic compound of claim 16, wherein the fused polycyclic compound represented by Formula 3 is represented by Formula 4:

Formula 4

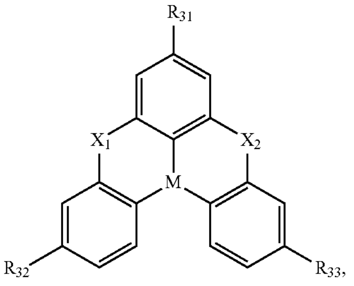

wherein, in Formula 4, $R_{31}$ to $R_{33}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{31}$ to $R_{33}$ are optionally combined with an adjacent group to form a ring, at least one among $R_{31}$ to $R_{33}$ is represented by Formula 2, and M, $X_1$, and $X_2$ are the same as defined in Formula 1.

18. The fused polycyclic compound of claim 14, wherein the substituent represented by Formula 2 is represented by any one among Formula 6-1 to Formula 6-4:

Formula 6-1

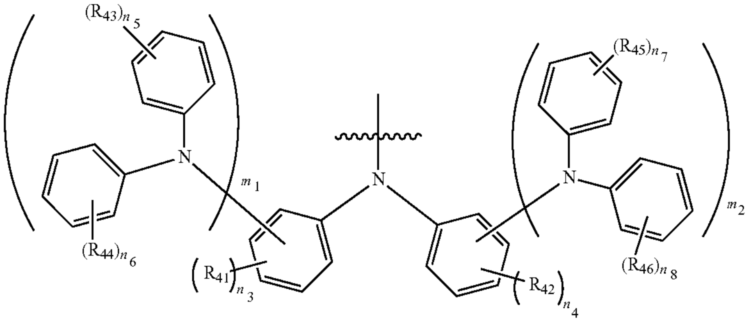

Formula 6-2

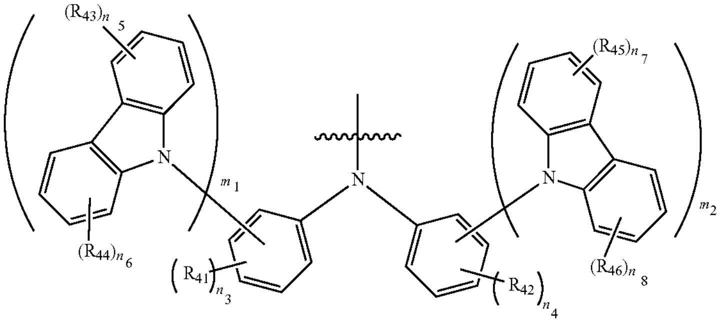

Formula 6-3

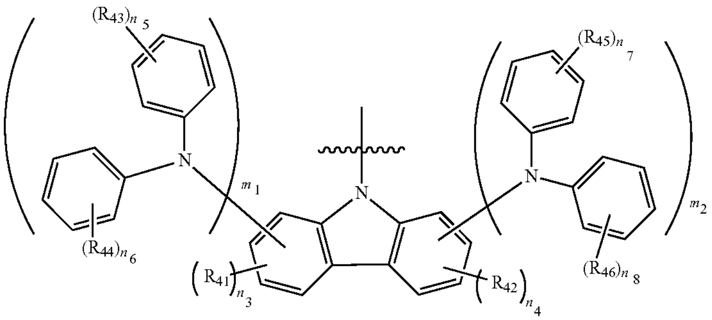

Formula 6-4

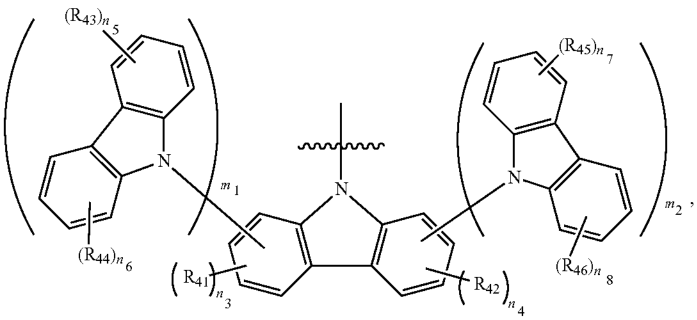

, wherein, in Formulae 6-1 to 6-4, $R_{41}$ to $R_{46}$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{41}$ to $R_{46}$ are optionally combined with an adjacent group to form a ring, $n_3$ and $n_4$ are each independently an integer of 0 to 3, $n_5$ to $n_8$ are each independently an integer of 0 to 4, $m_1$ and $m_2$ are each independently 0 or 1, and at least one of $m_1$ and $m_2$ is 1.

19. The fused polycyclic compound of claim 14, wherein the substituent represented by Formula 2 is represented by Formula 7-1 to Formula 7-4:

Formula 7-1

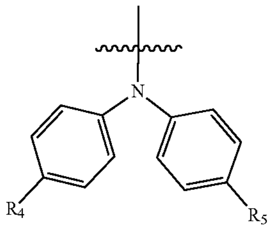

Formula 7-2

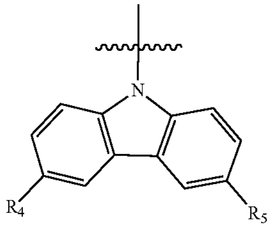

-continued

Formula 7-3

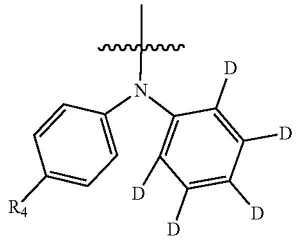

Formula 7-4

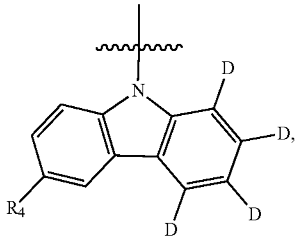

wherein, in Formulae 7-1 to 7-4, $R_4$, and $R_5$ are the same as defined in Formula 2.

20. The fused polycyclic compound of claim 14, wherein the fused polycyclic compound represented by Formula 1 is at least one selected among compounds in Compound Group 1:

Compound Group 1

1

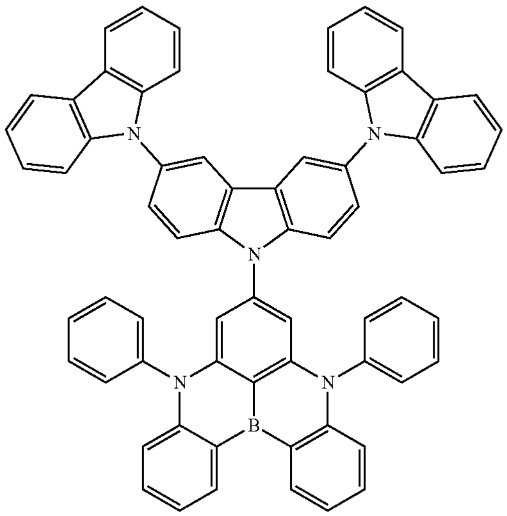

2

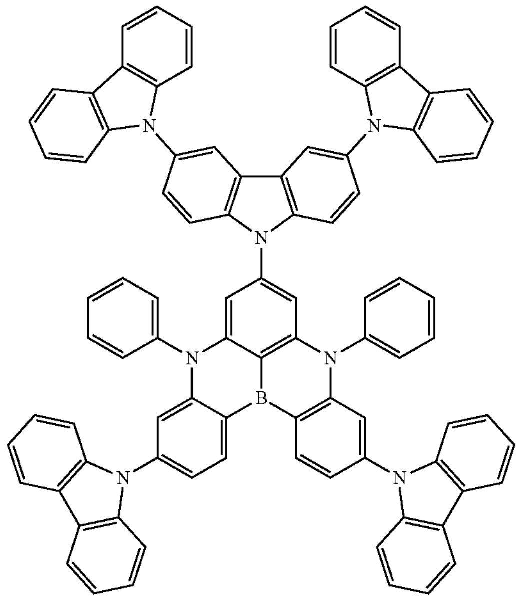

-continued
3
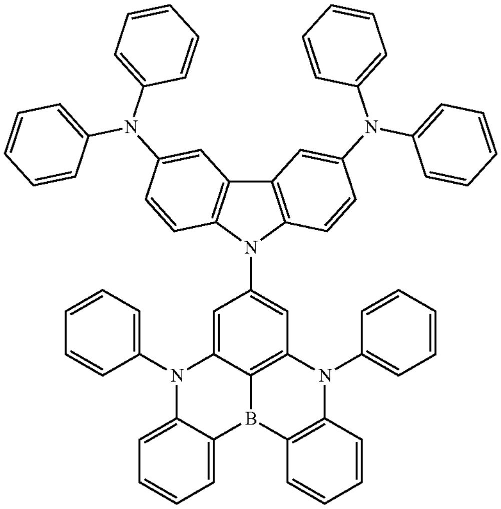
4
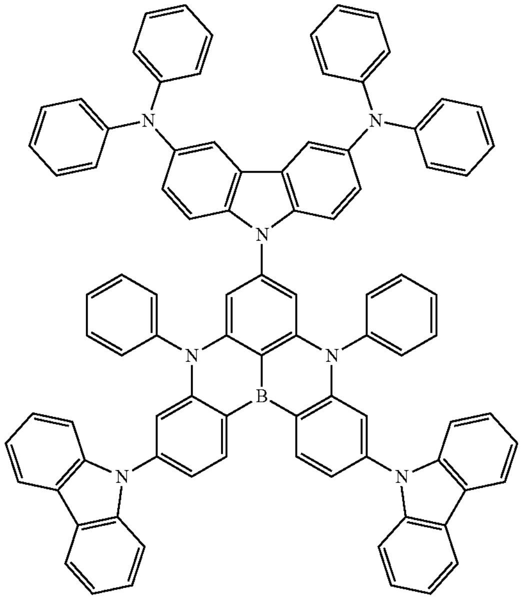
5
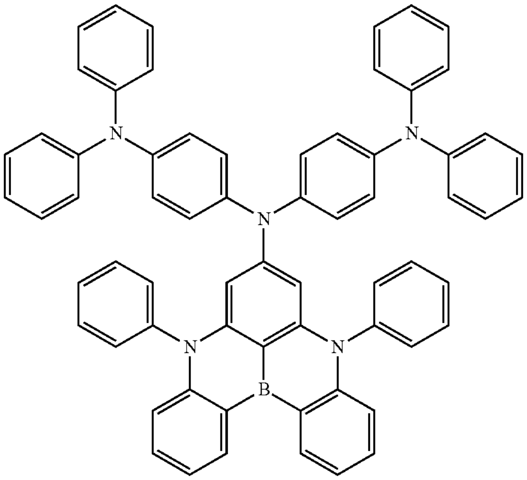
6
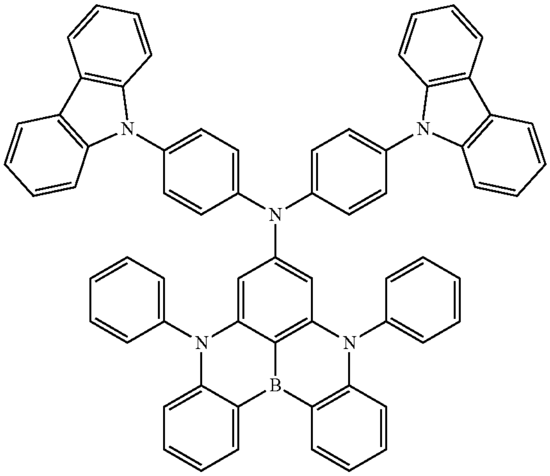
7
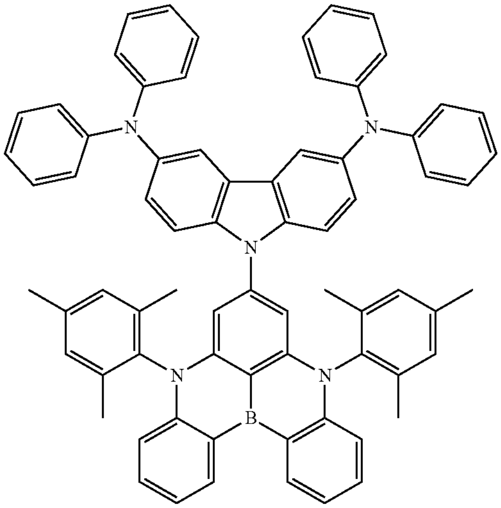
8
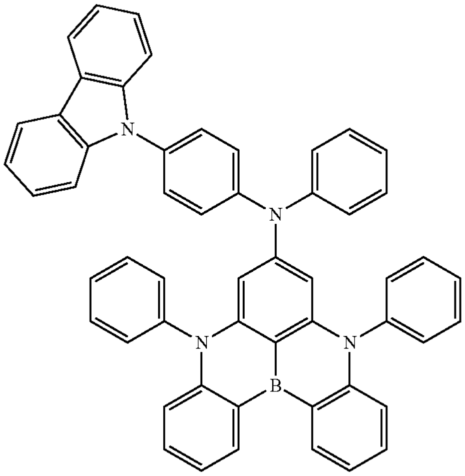

-continued
9
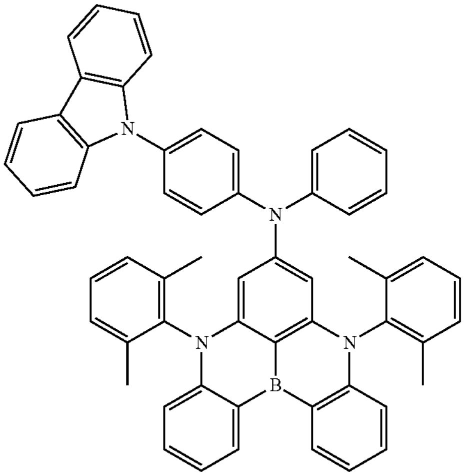
10
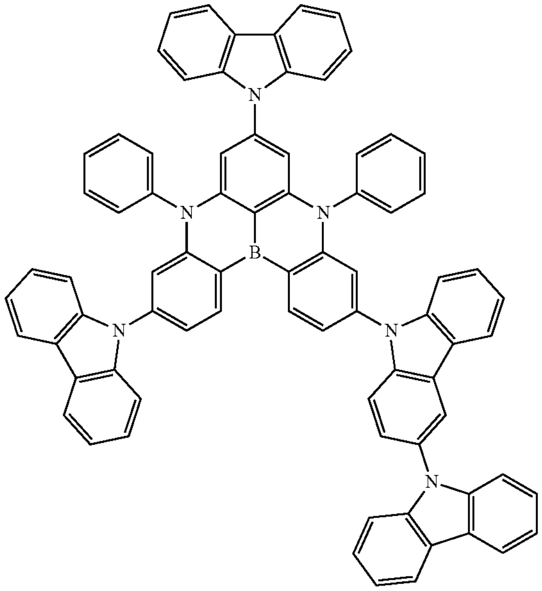
11
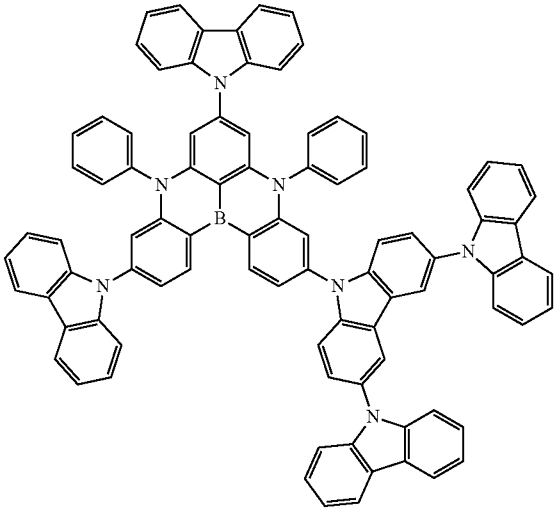
12
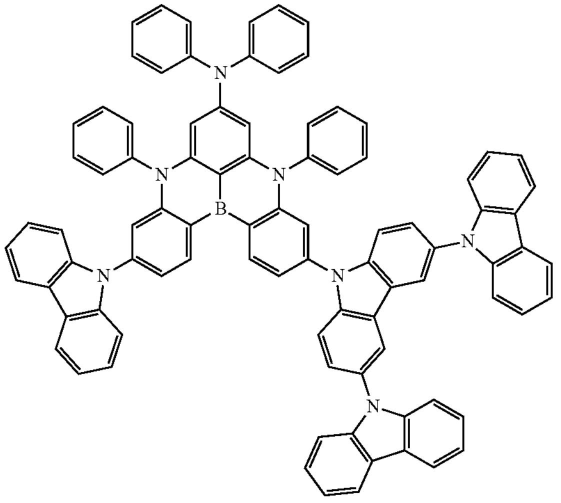
13
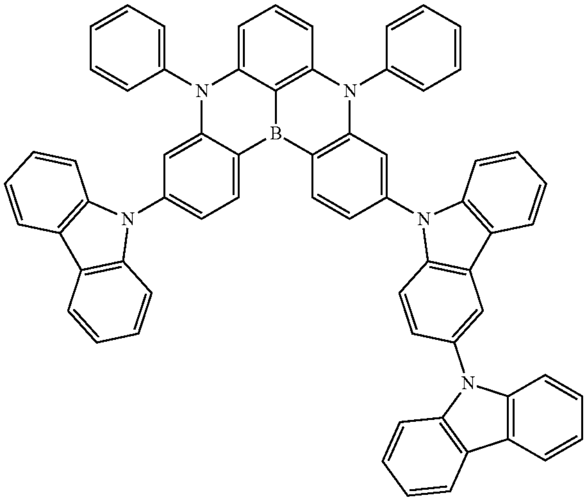
14
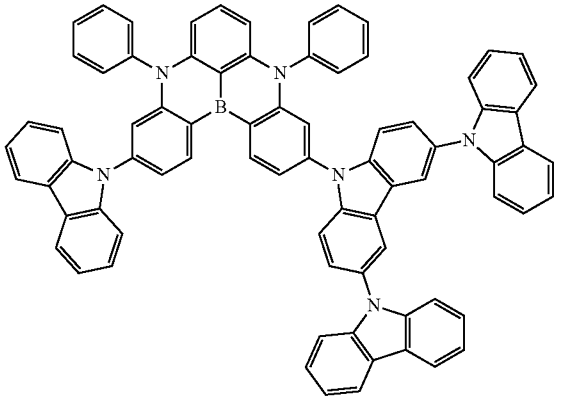

-continued
15
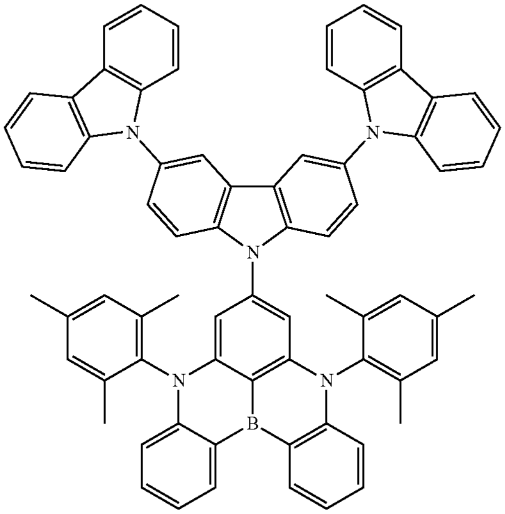
16
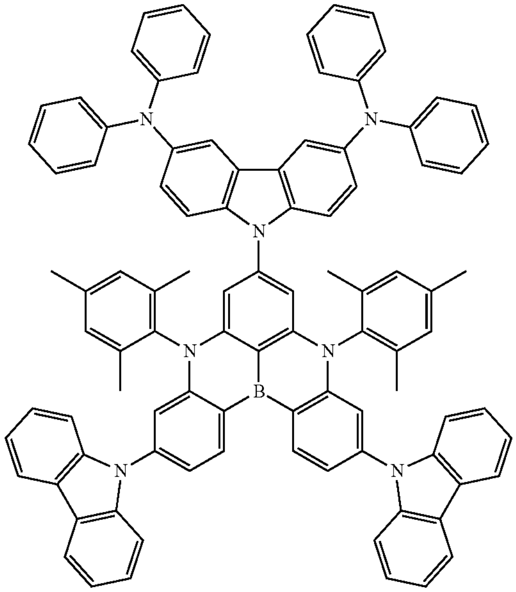
17
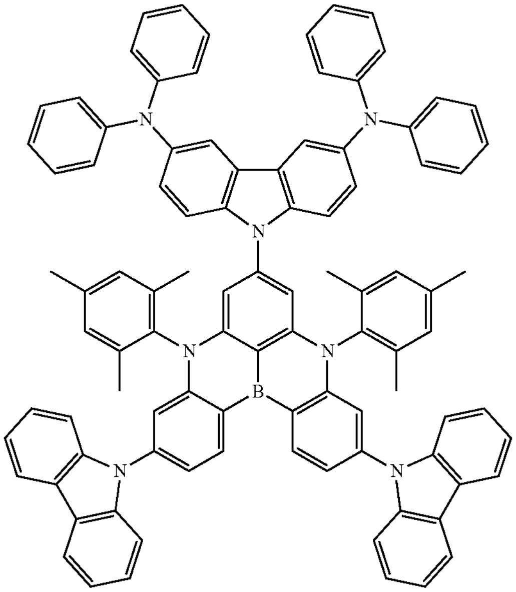
18
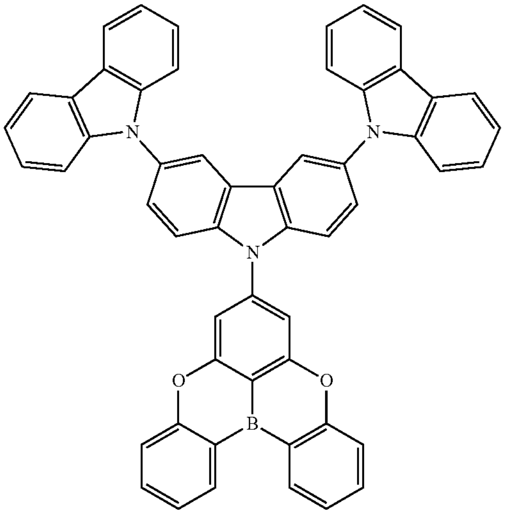

-continued
19
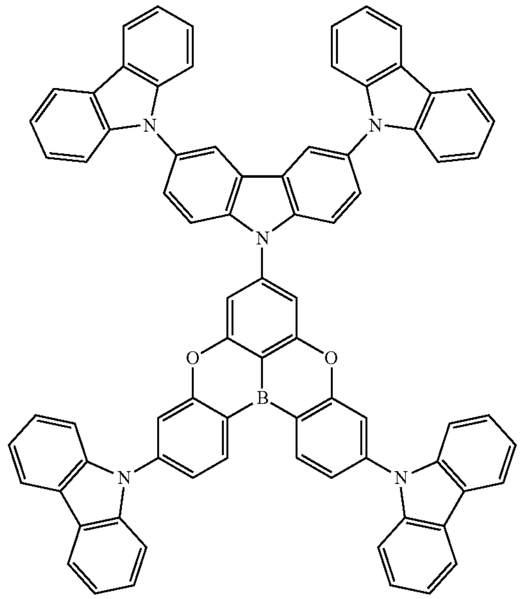
20
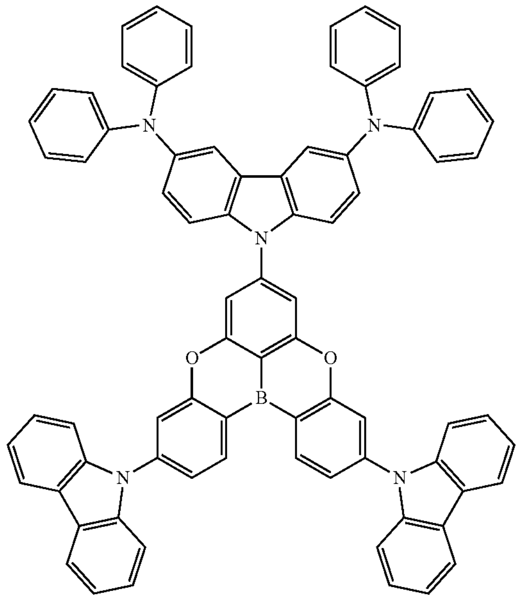
21
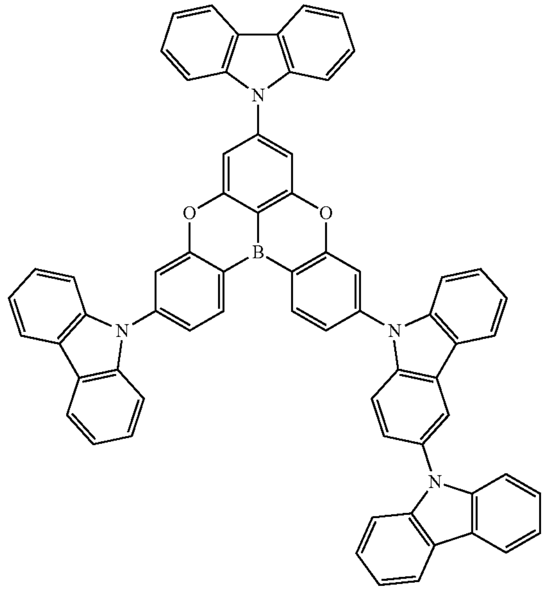
22
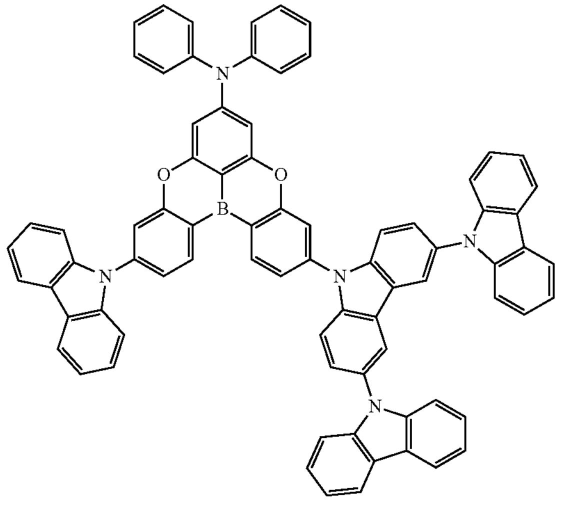

-continued
23
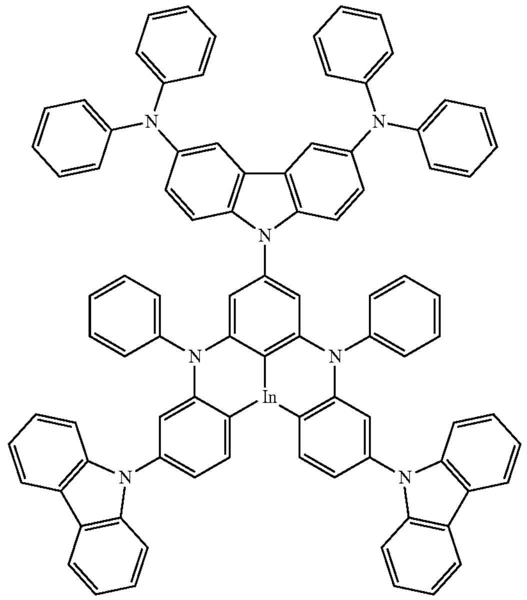
24
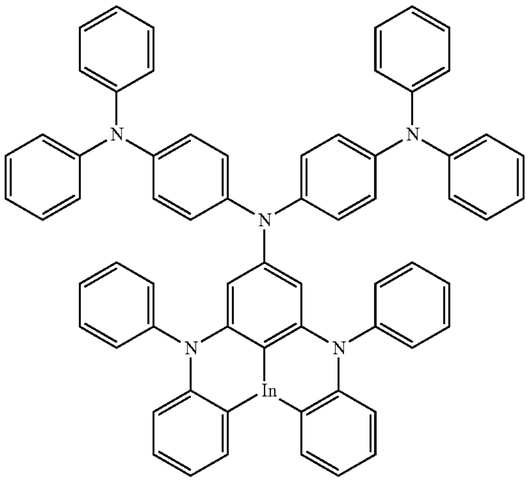
25
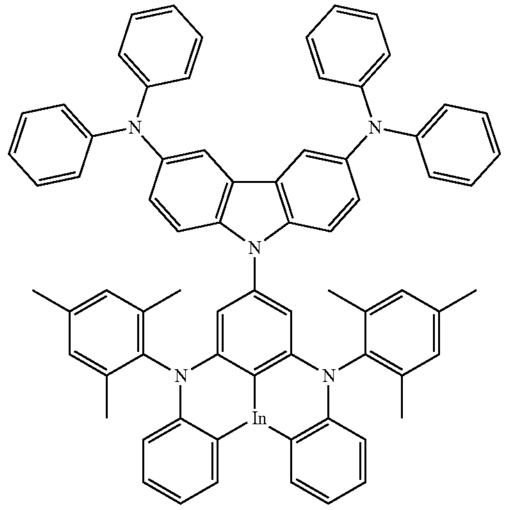
26
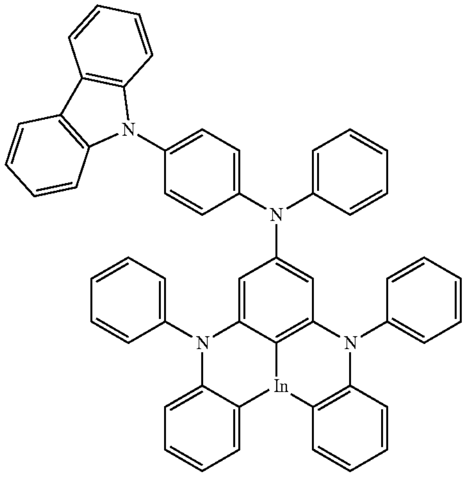

-continued
27
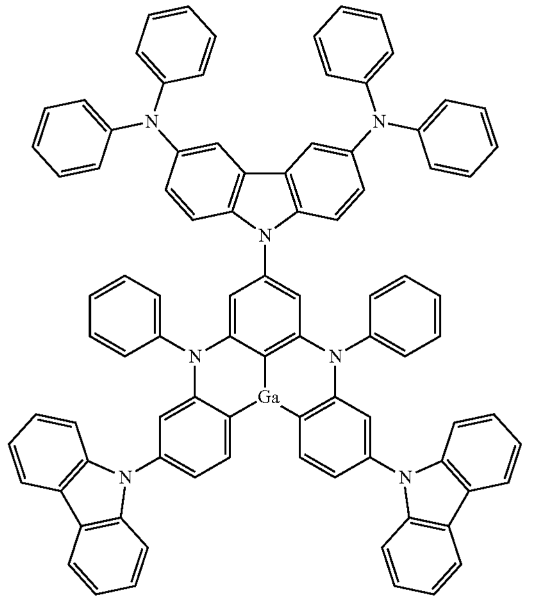
28
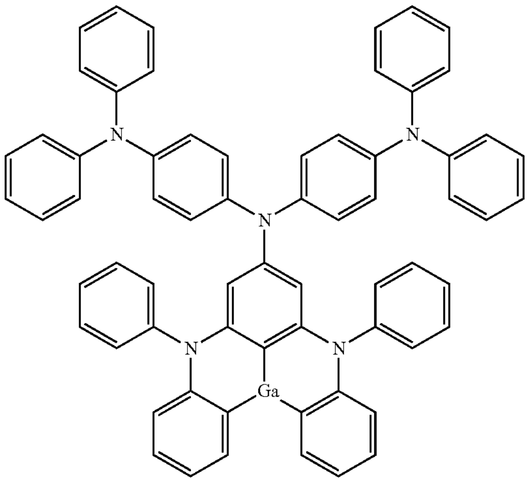
29
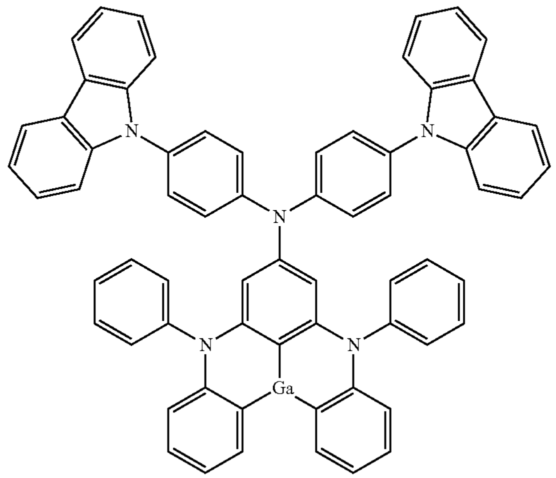
30
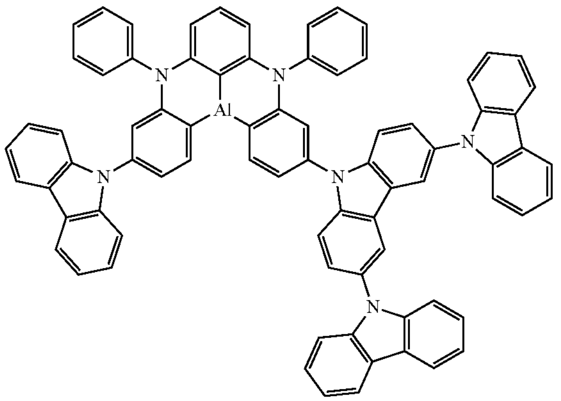

-continued
31
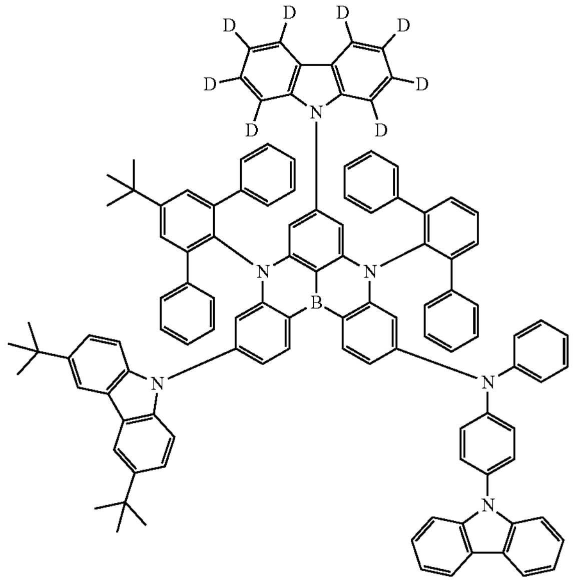
32
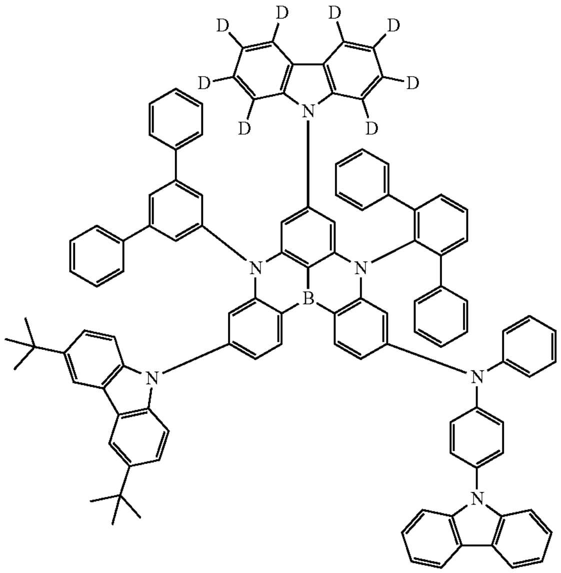
33
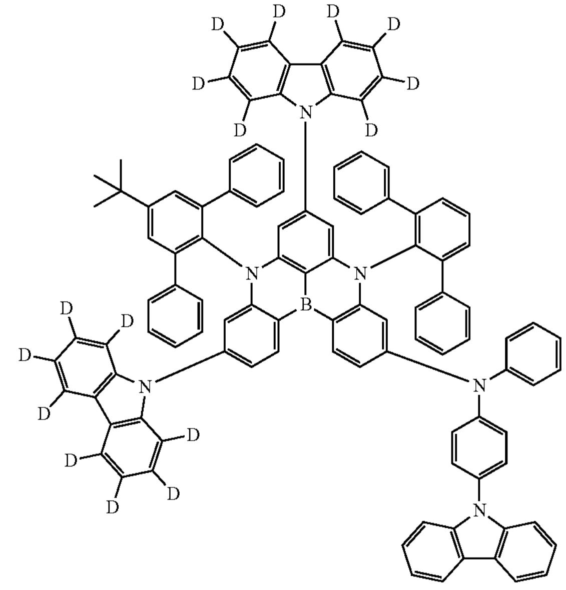
34
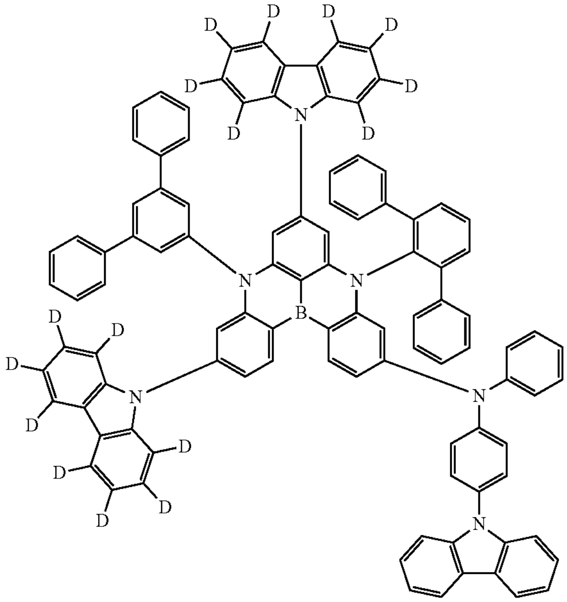

-continued
35
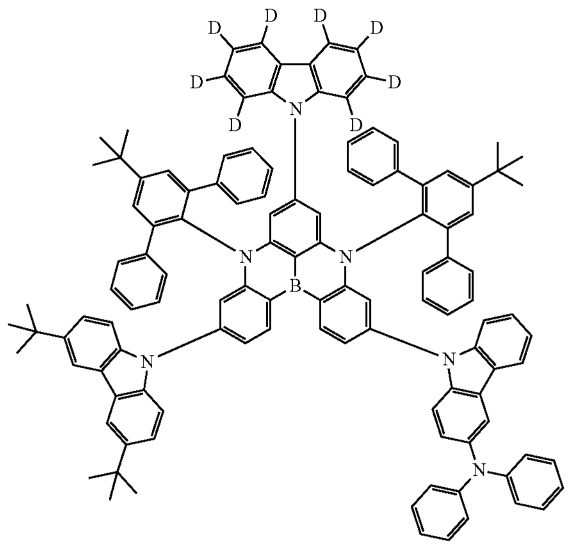
36
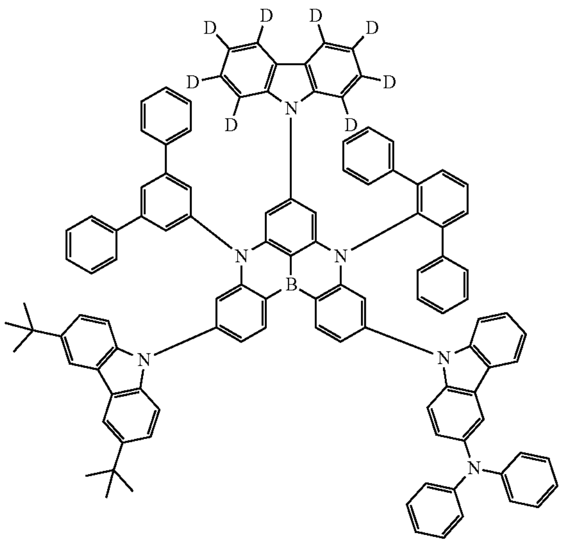
37
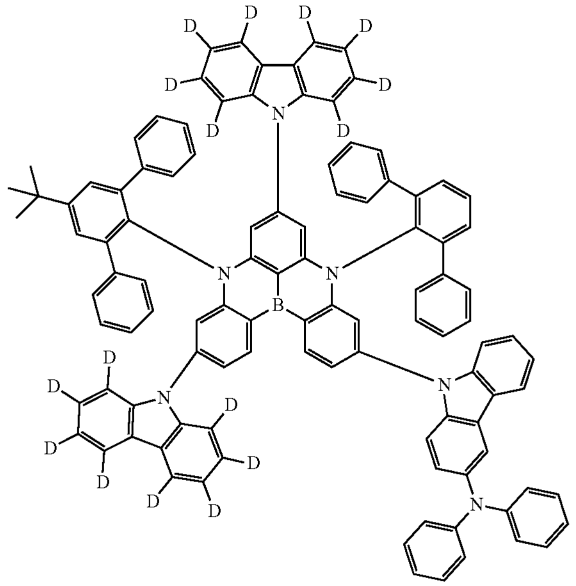
38
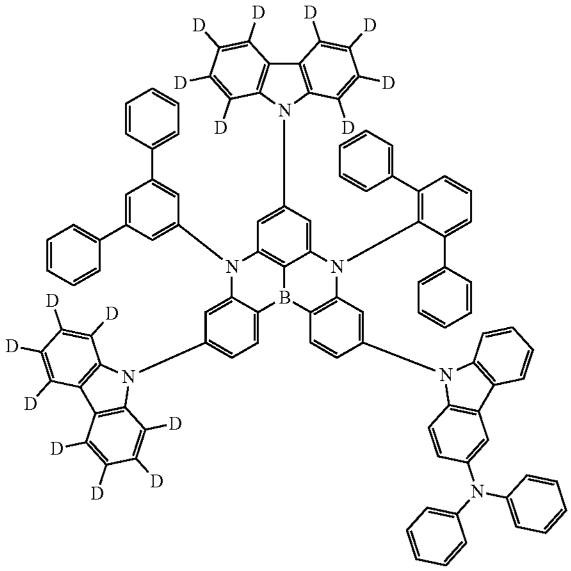

-continued
39
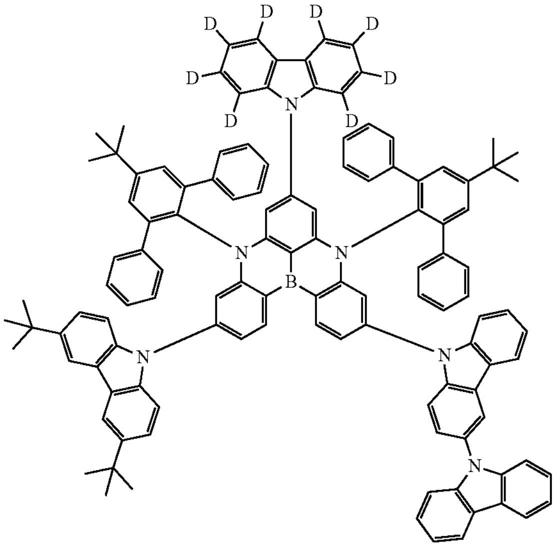
40
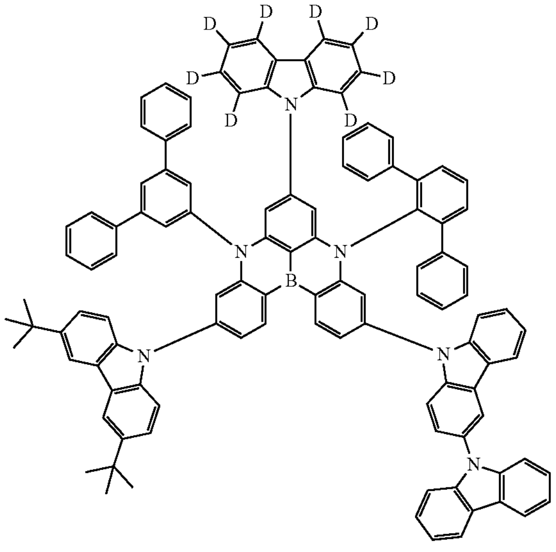
41
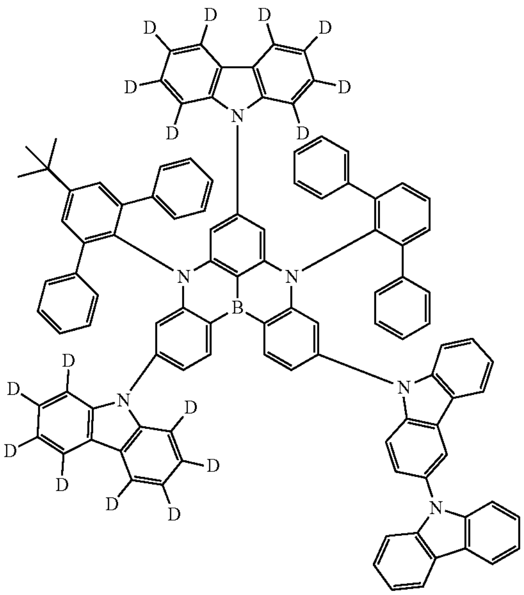
42
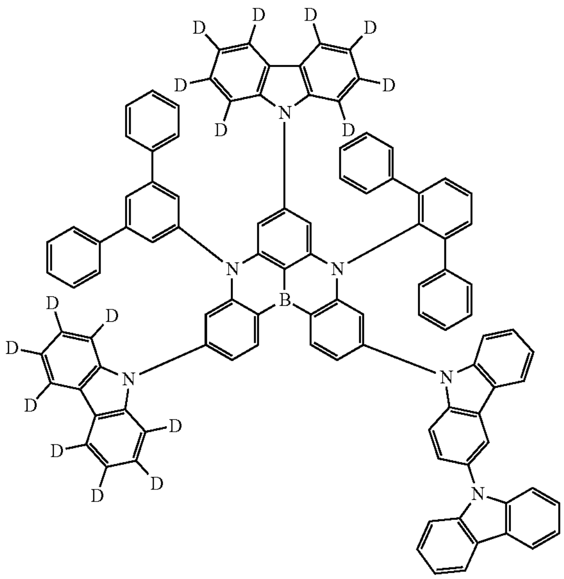

-continued
43
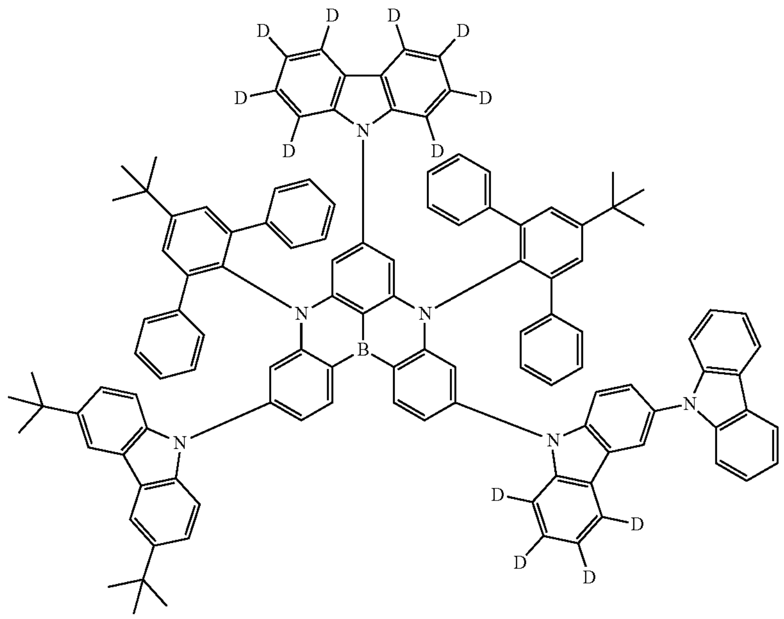
44
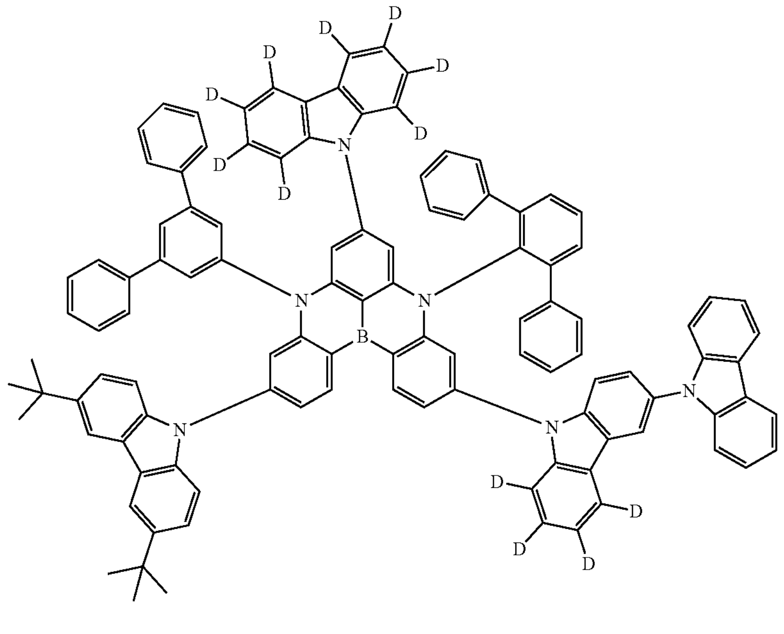

-continued
45
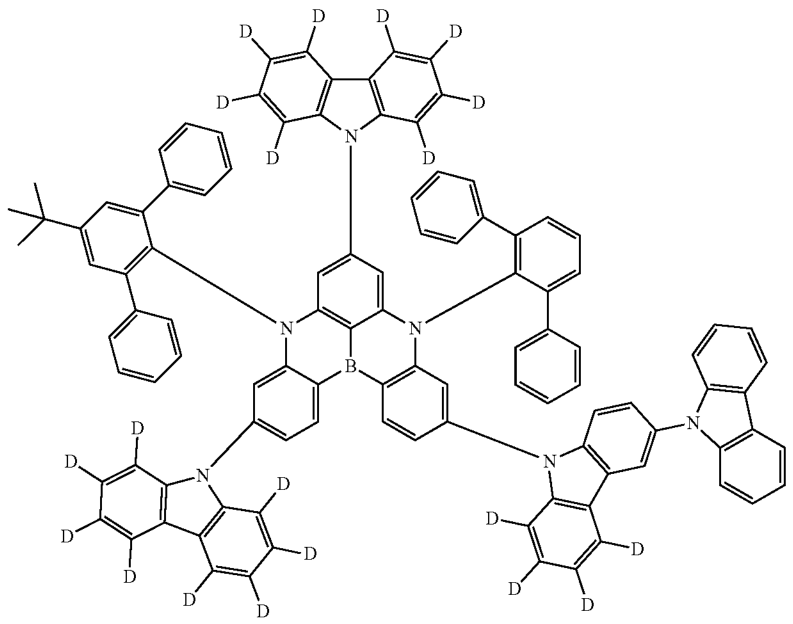
46
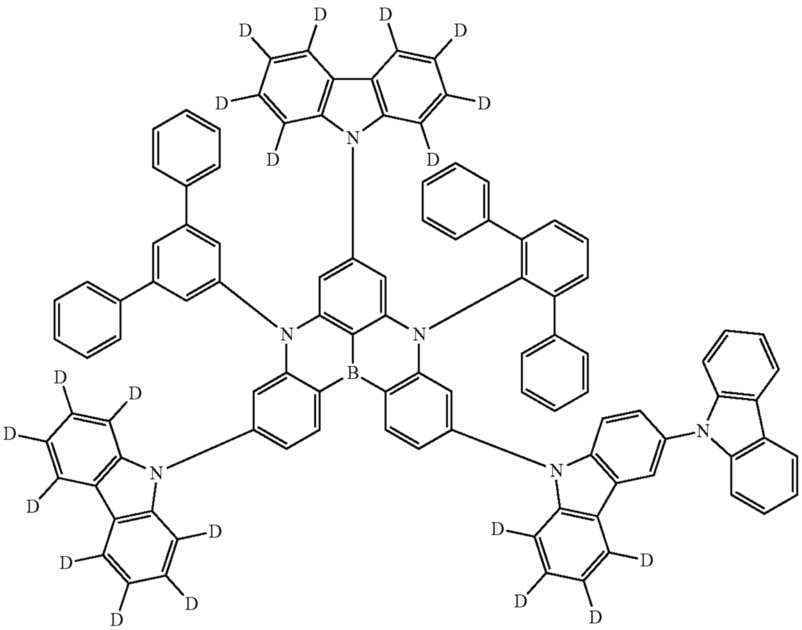

-continued
47
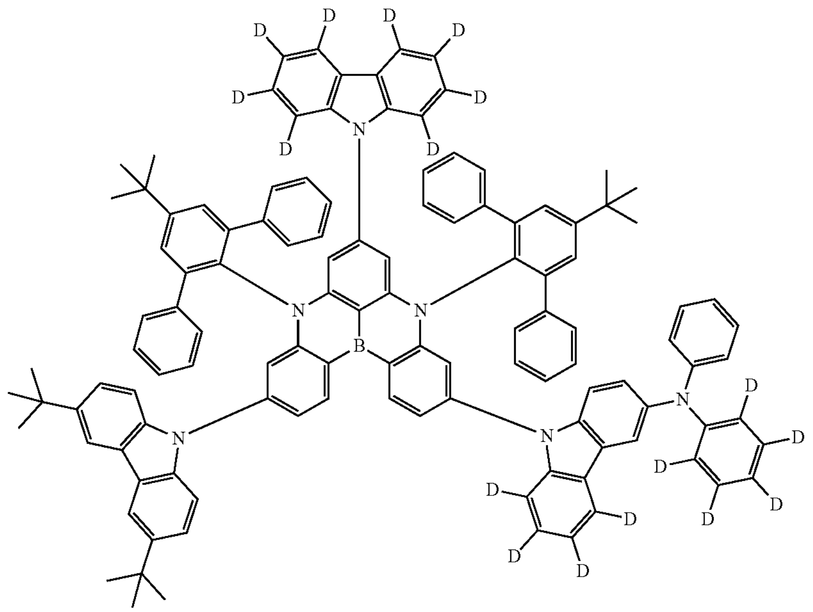
48
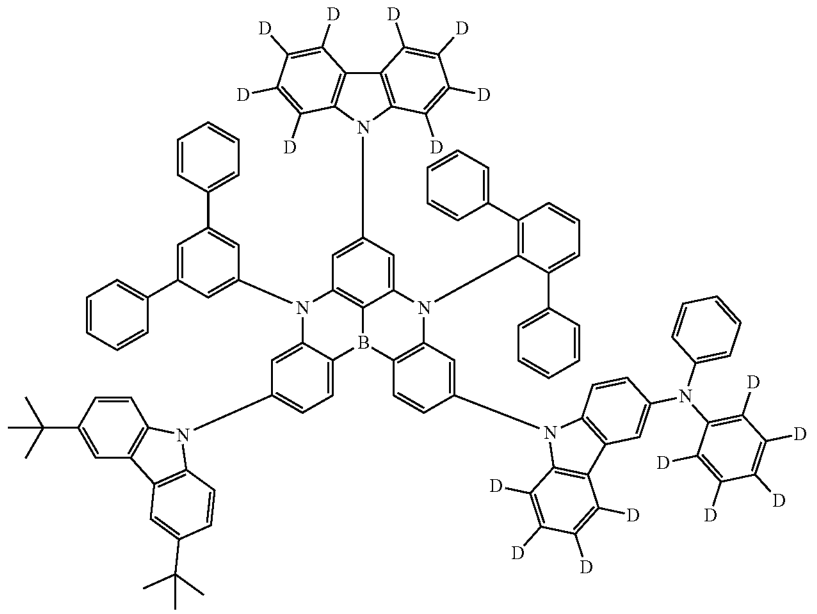

-continued
49
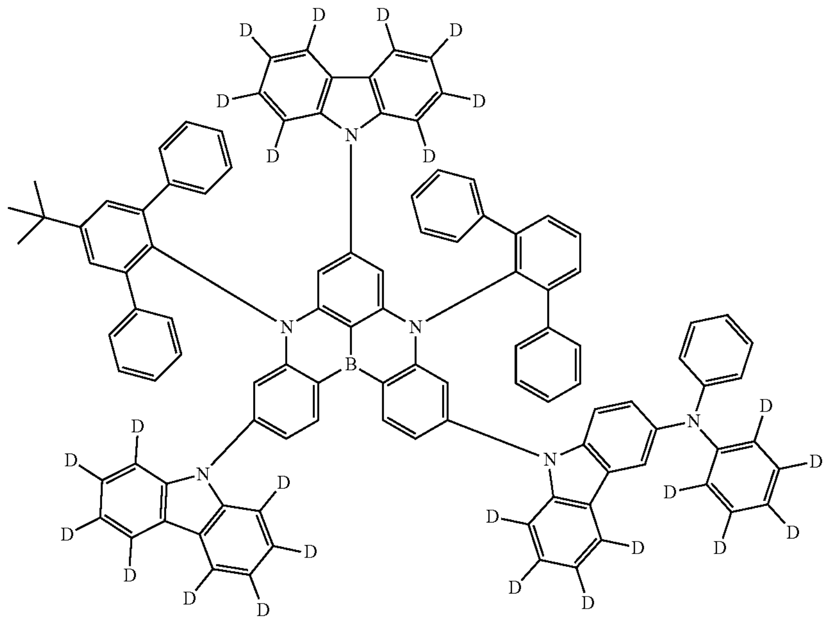
50
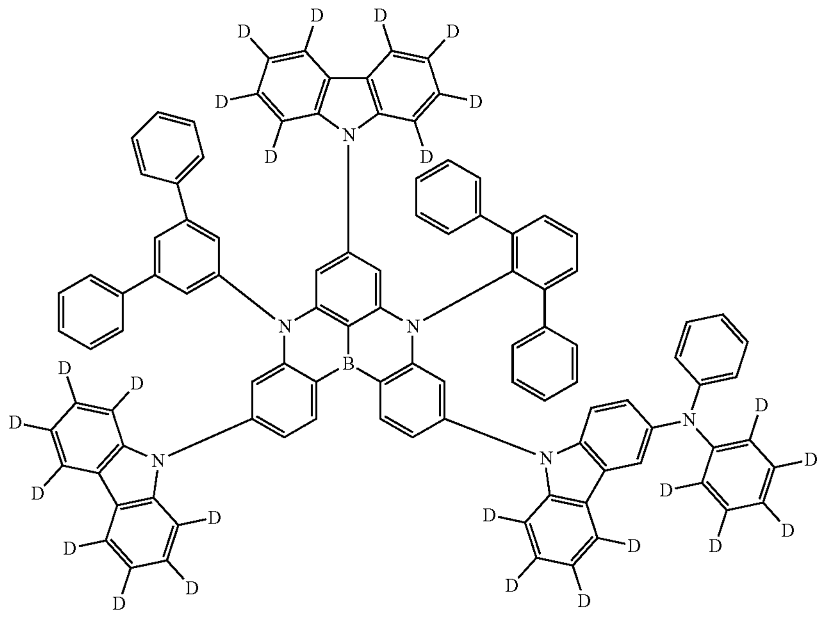

-continued
51
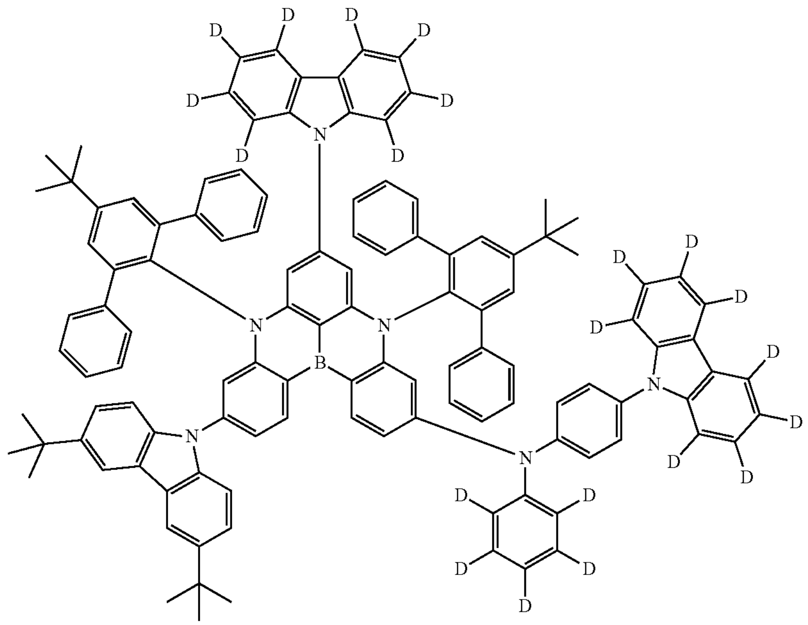
52
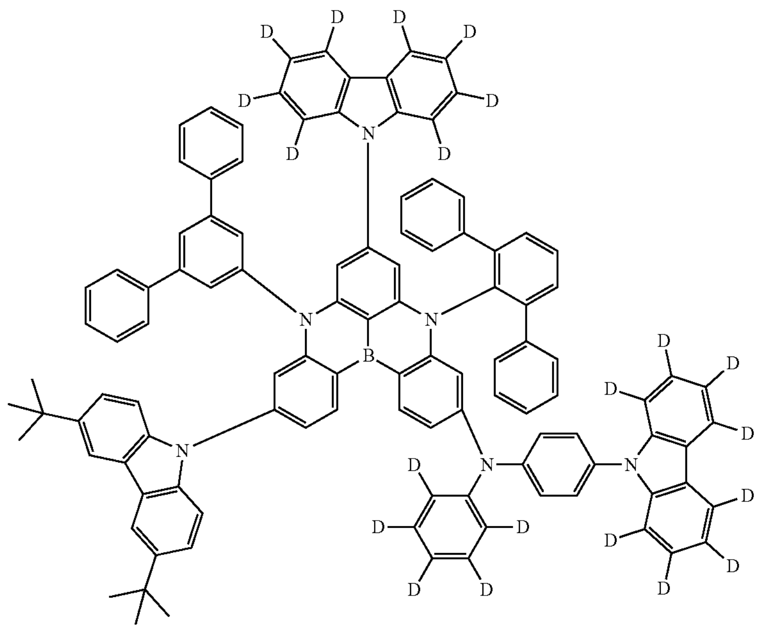

-continued
53
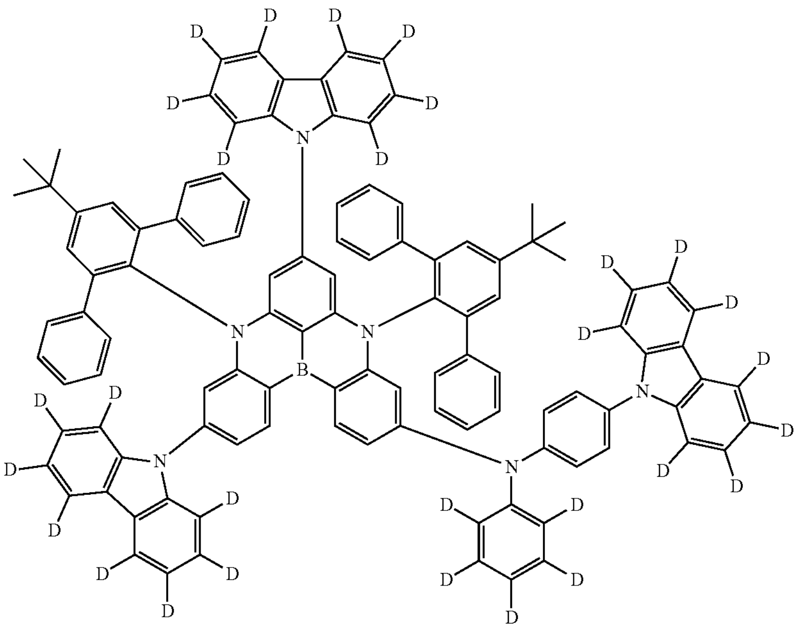
54
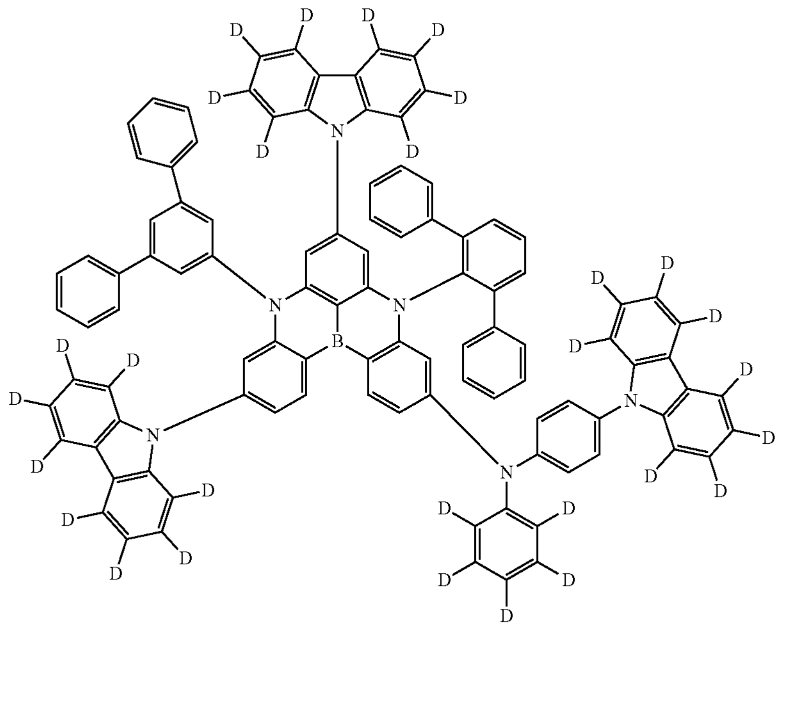

-continued
55
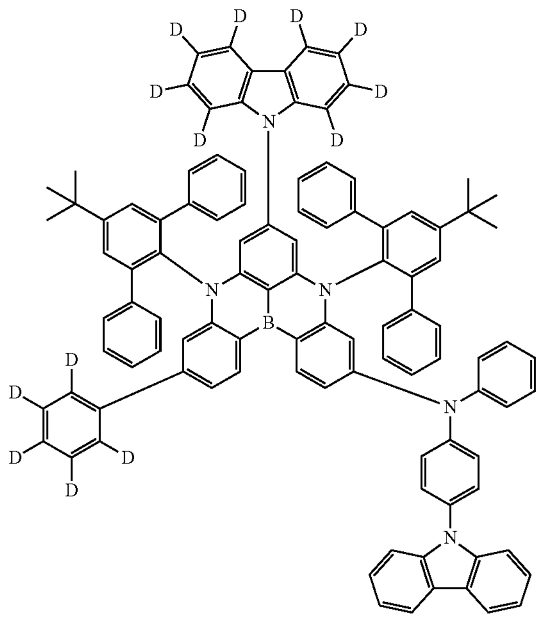
56
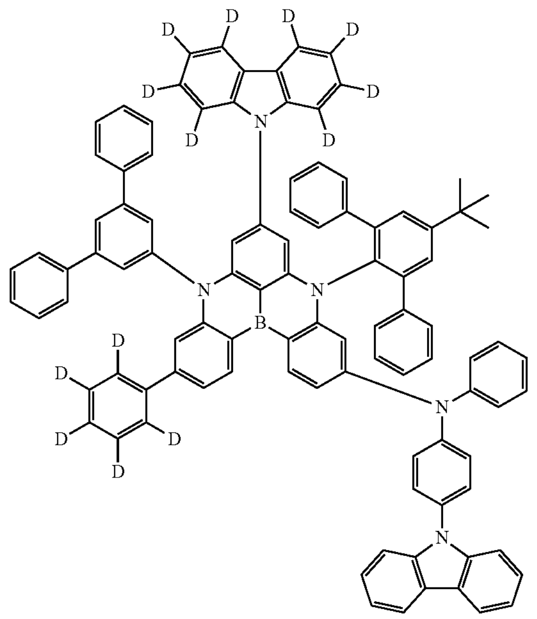
57
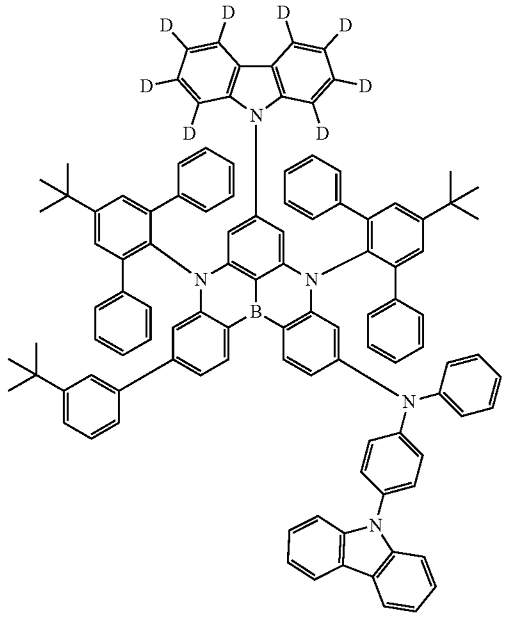
58
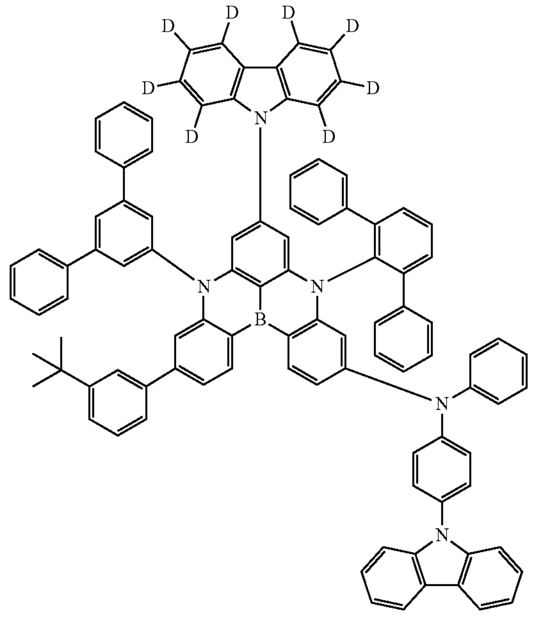

-continued
59
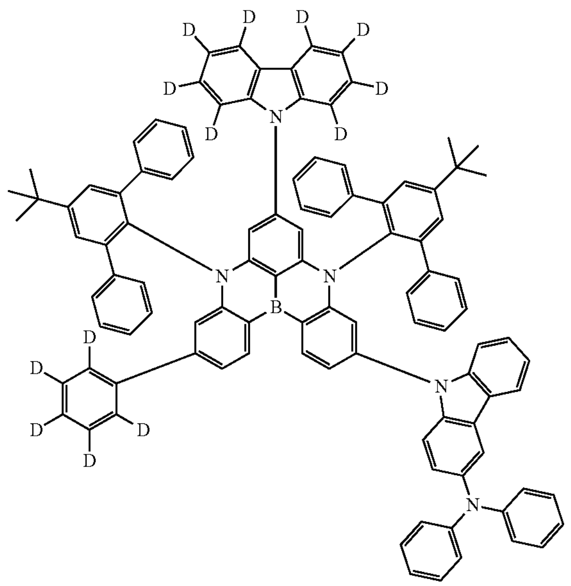
60
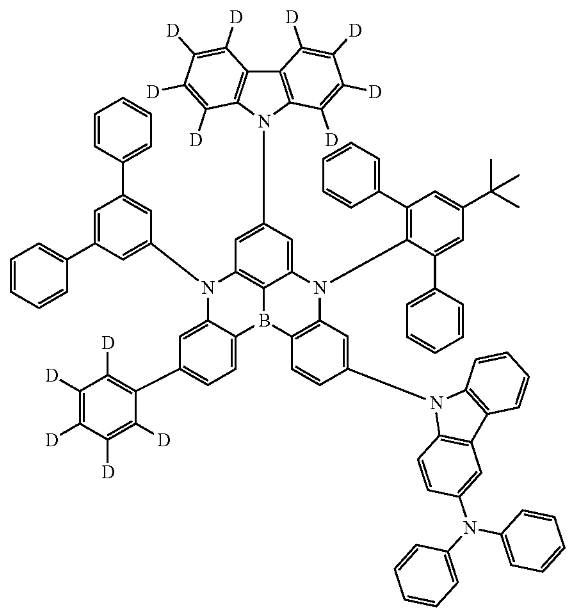
61
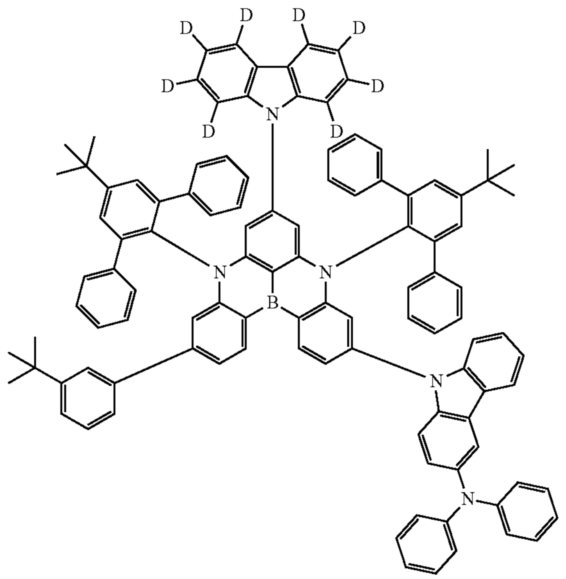
62
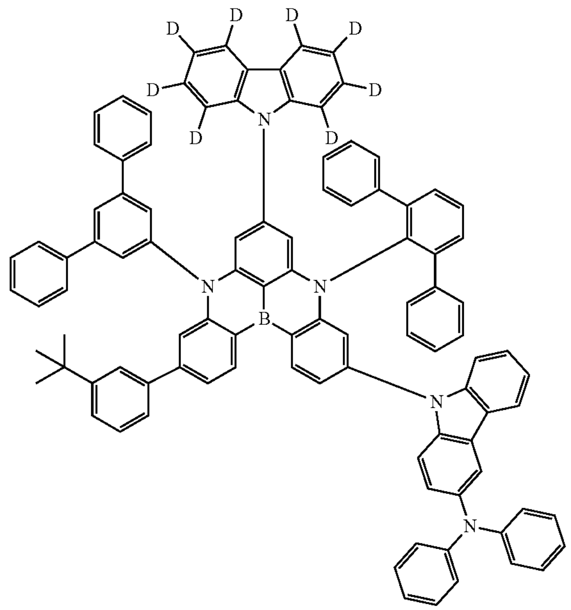

-continued
63
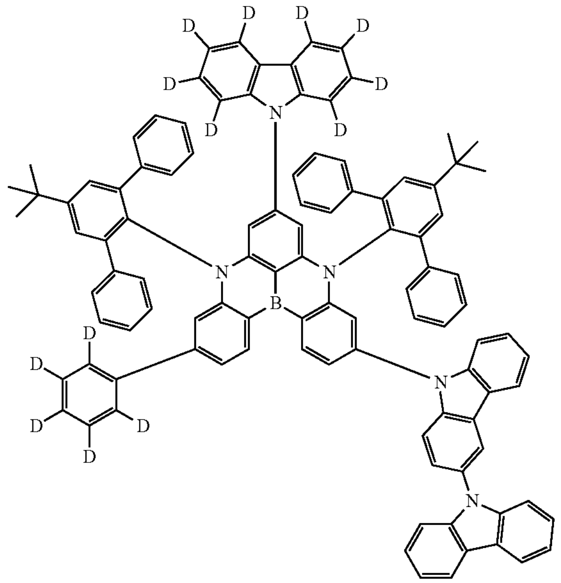
64
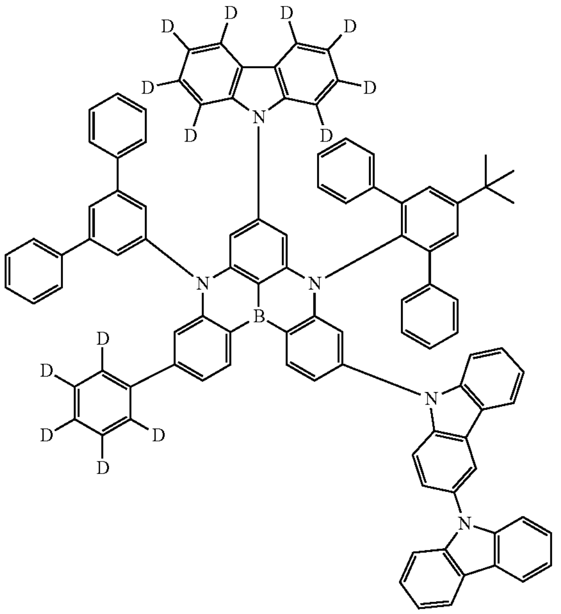
65
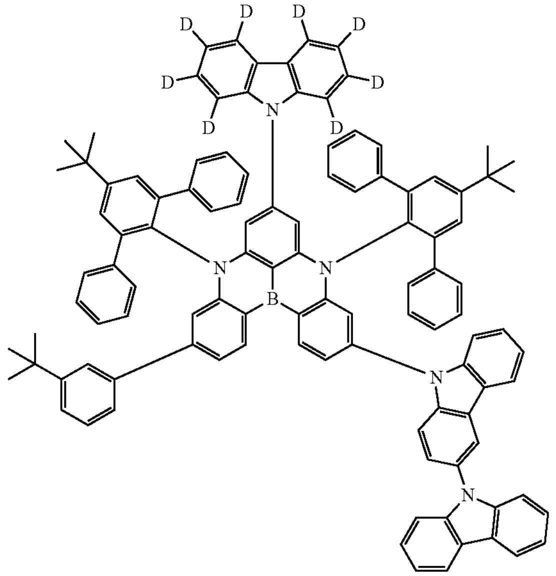
66
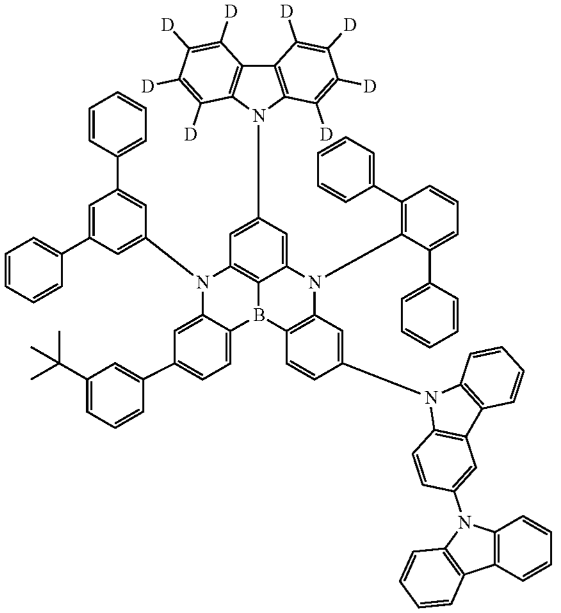

-continued
67
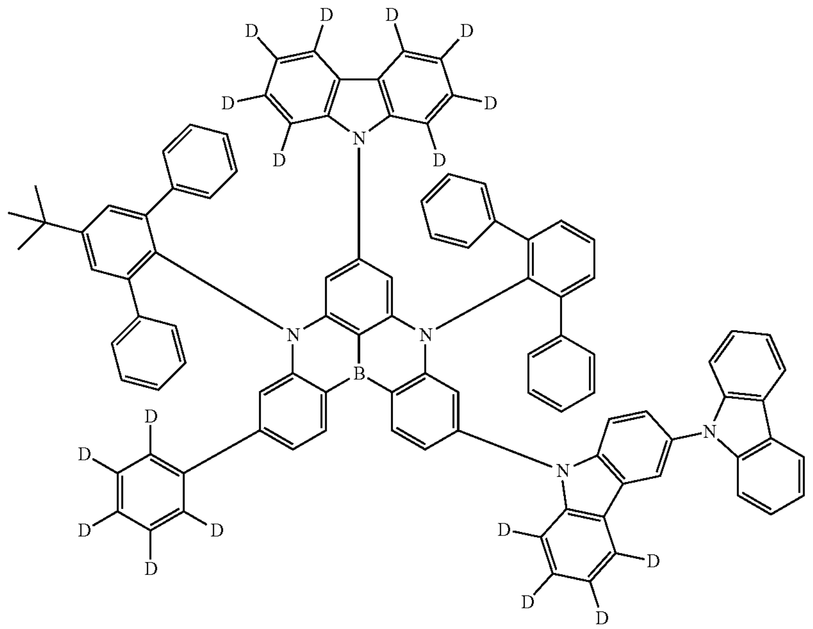
68
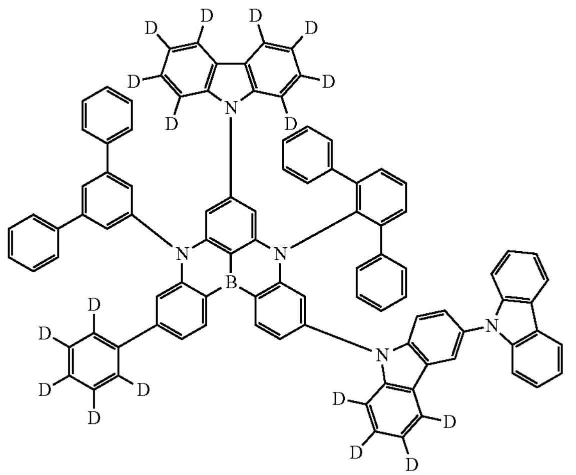
69
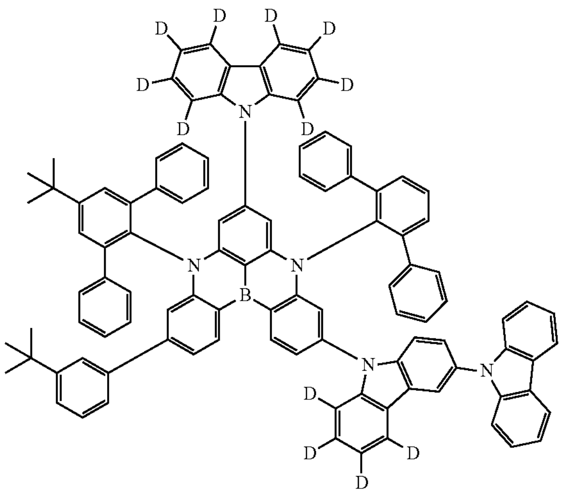

-continued
70
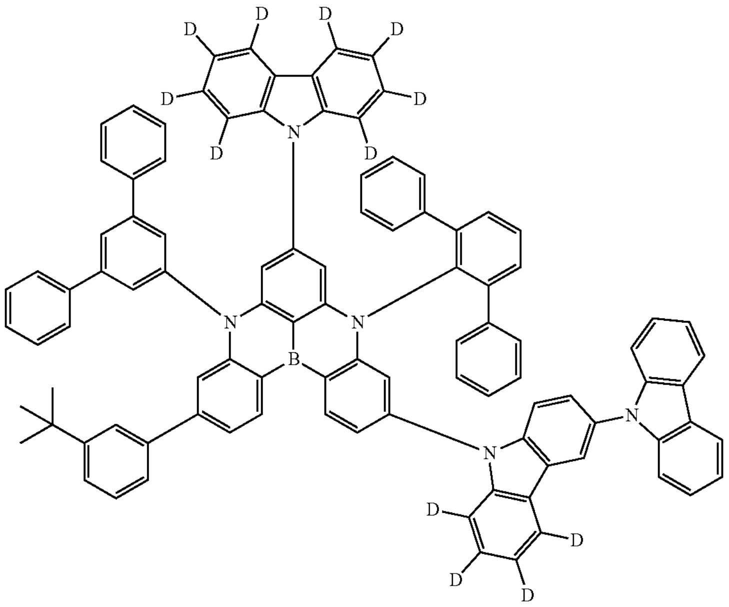
71
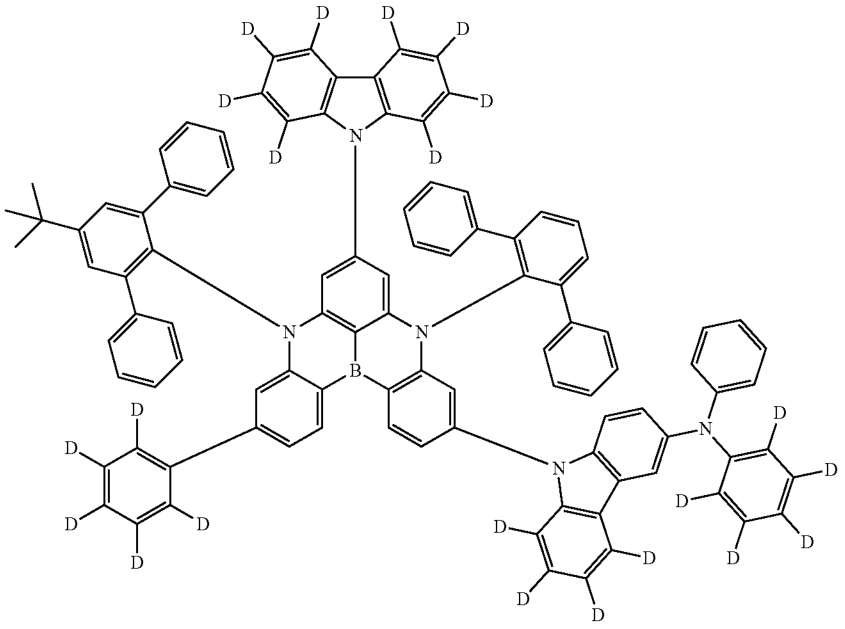

-continued
72
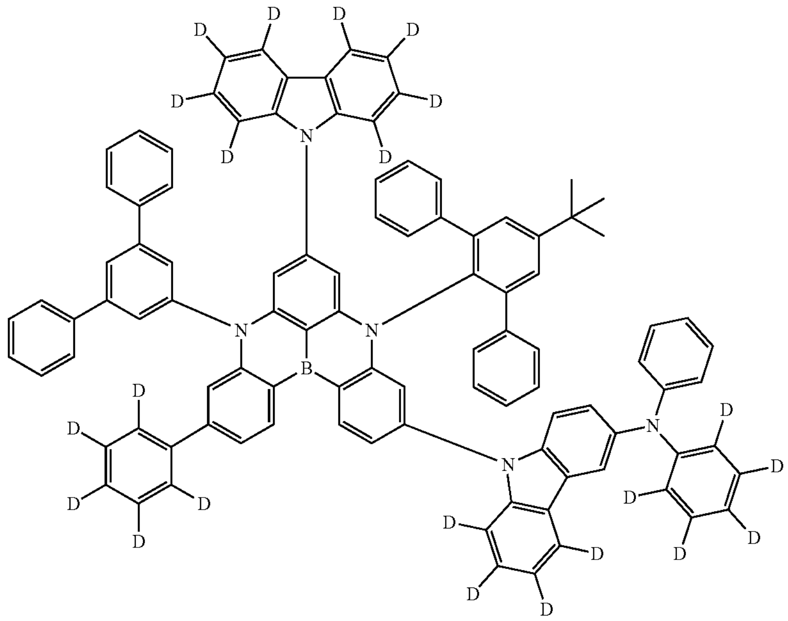
73
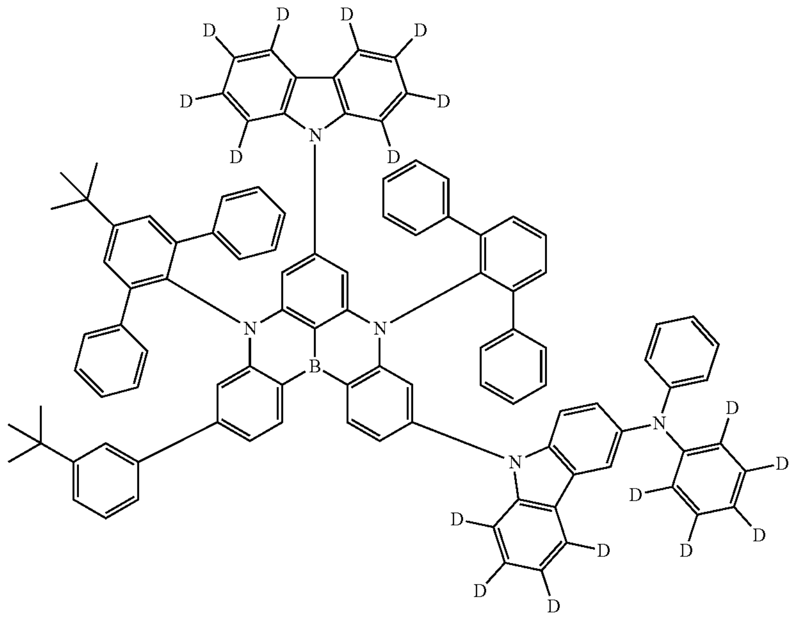

-continued
74
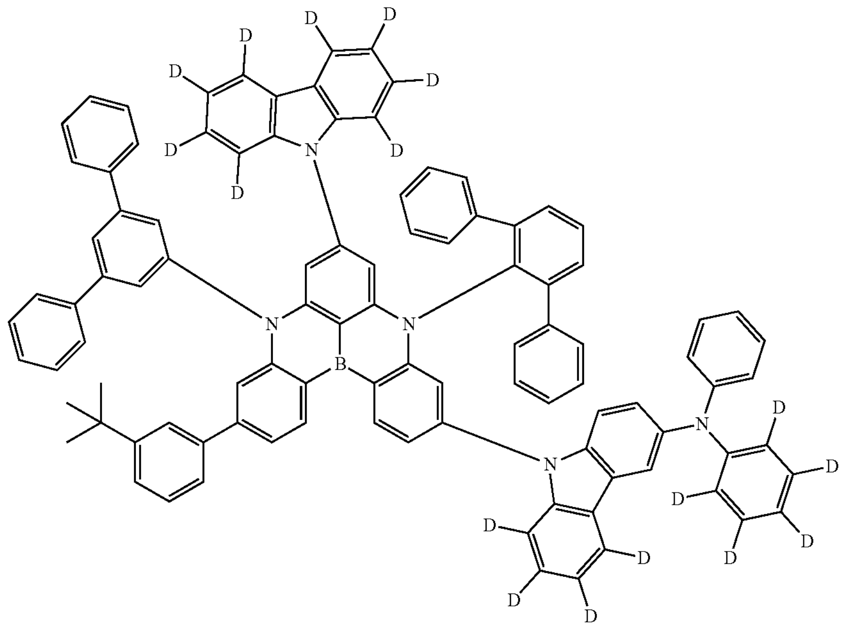
75
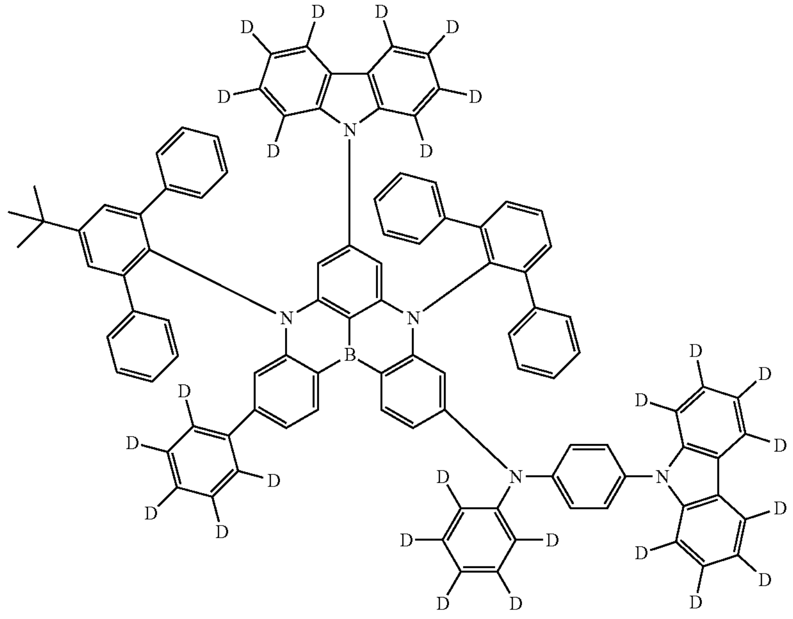

-continued
76
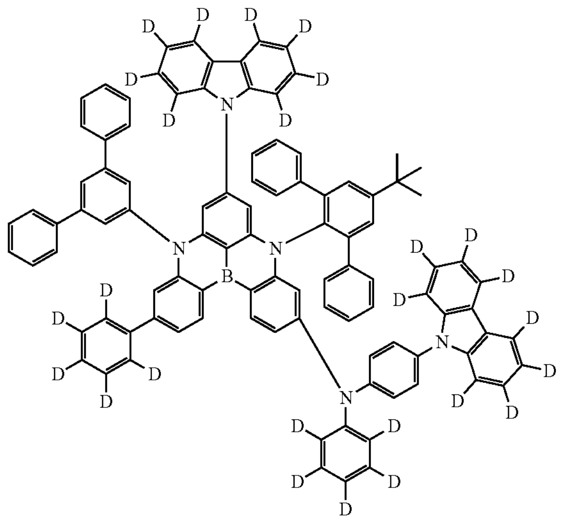
77
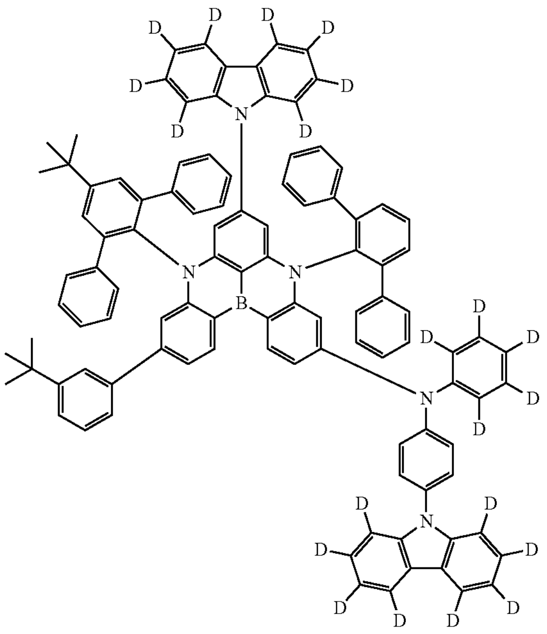
78
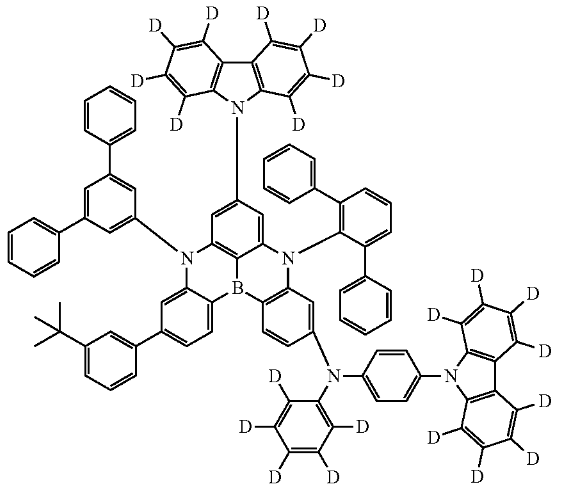
79
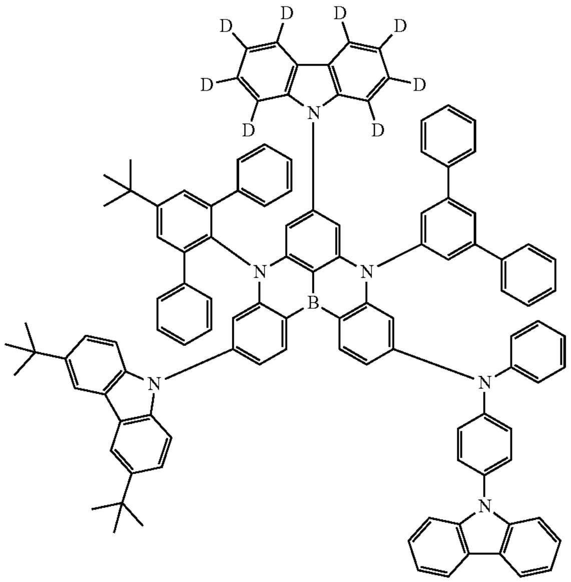

-continued
80
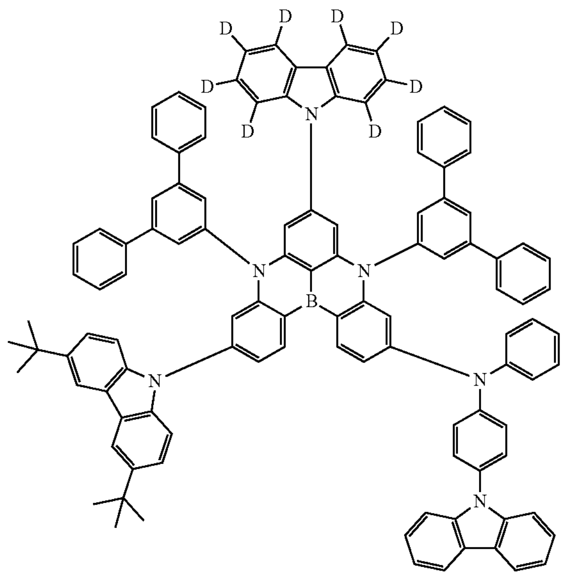
81
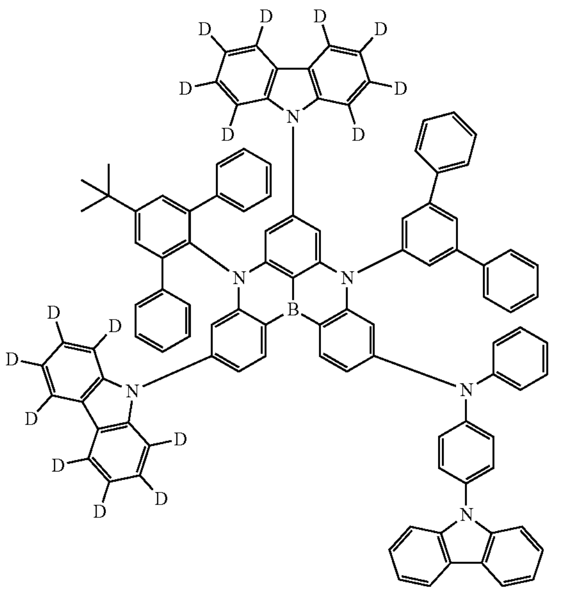
82
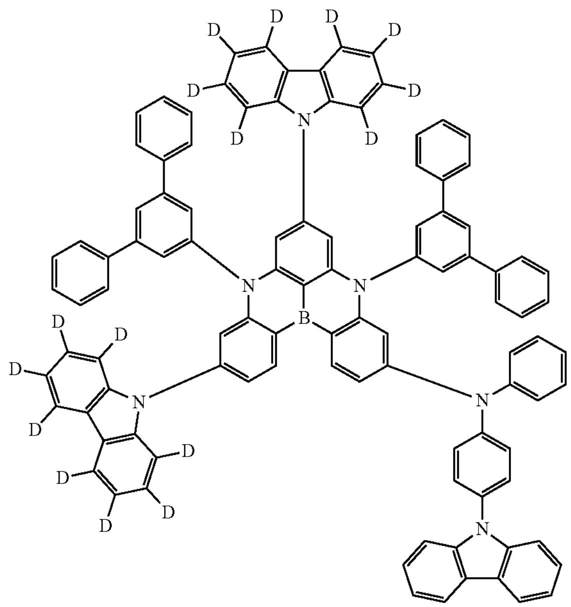
83
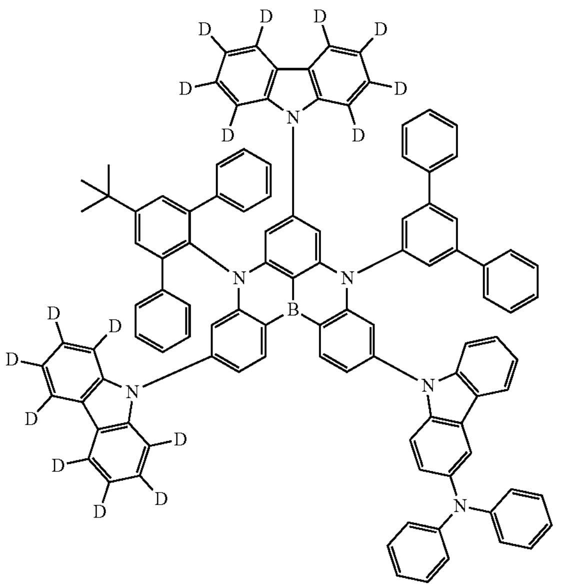

-continued
84
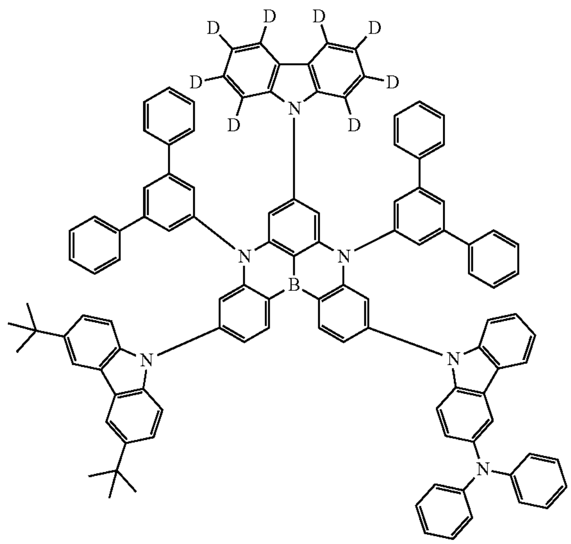
85
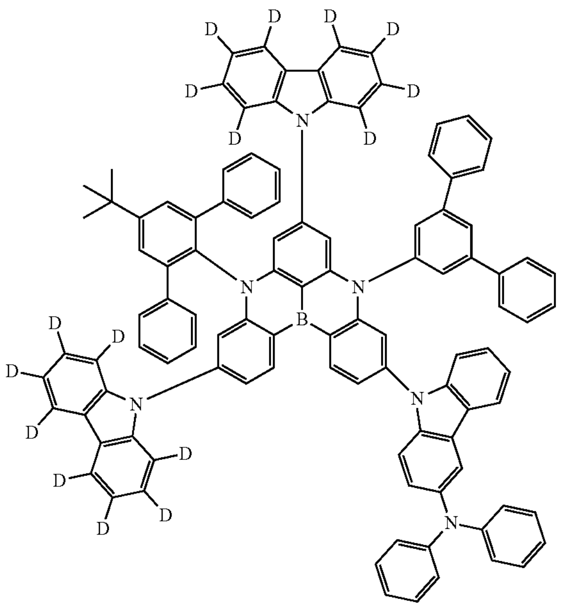
86
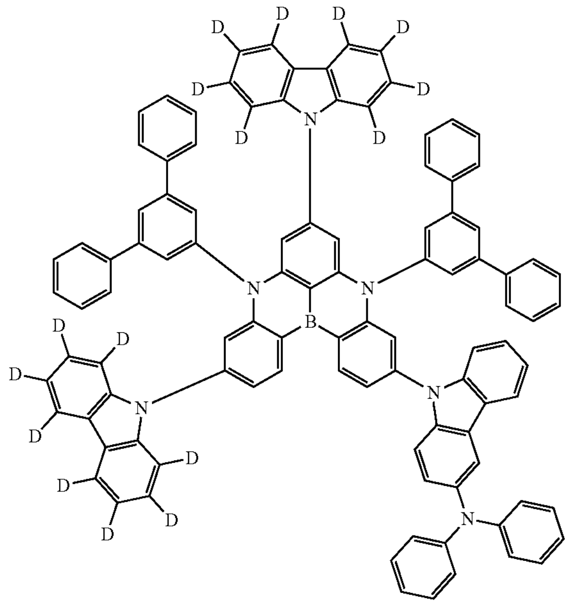
87
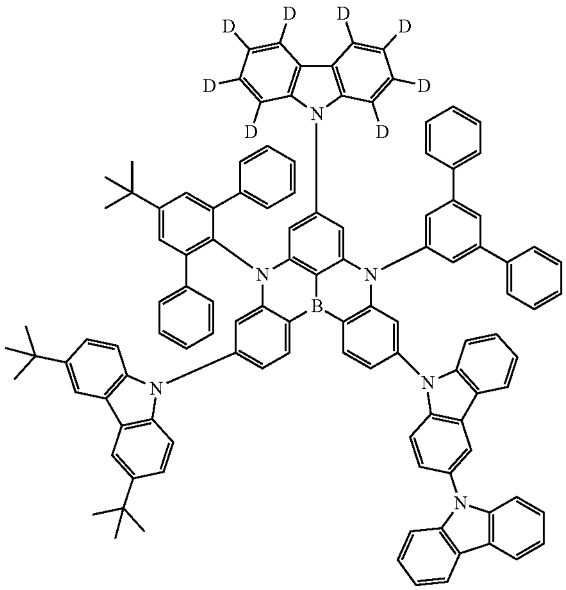

-continued
88
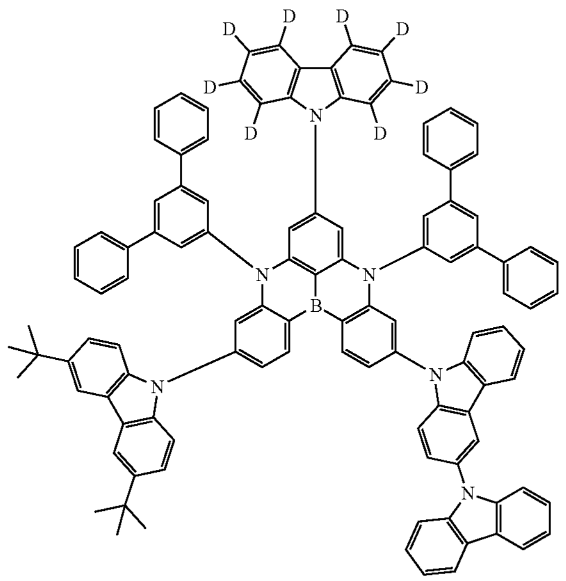
89
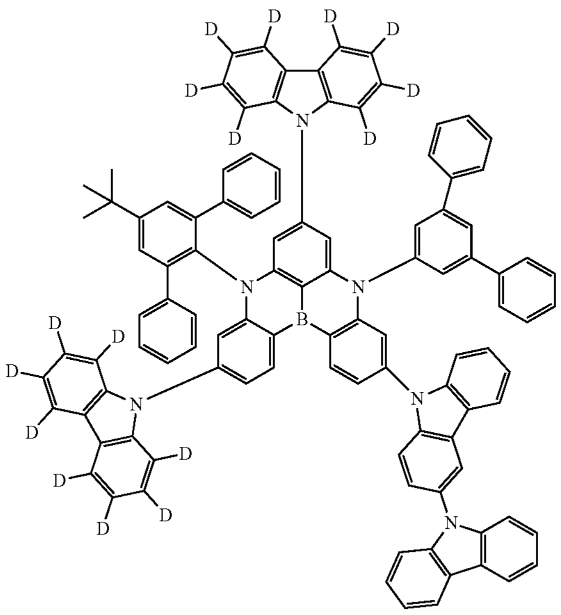
90
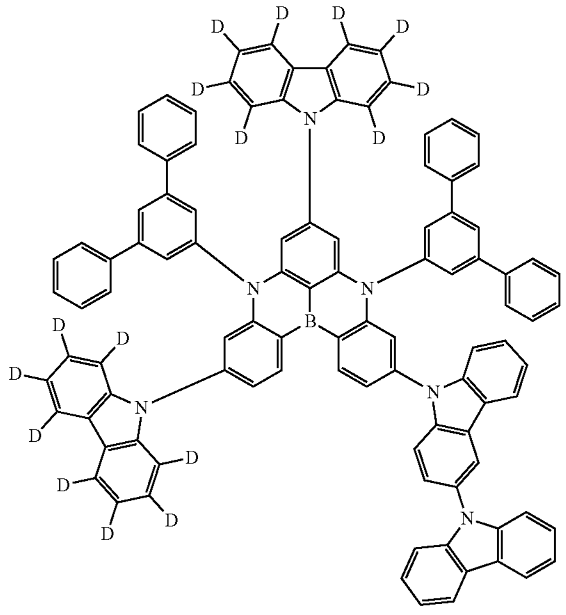
91
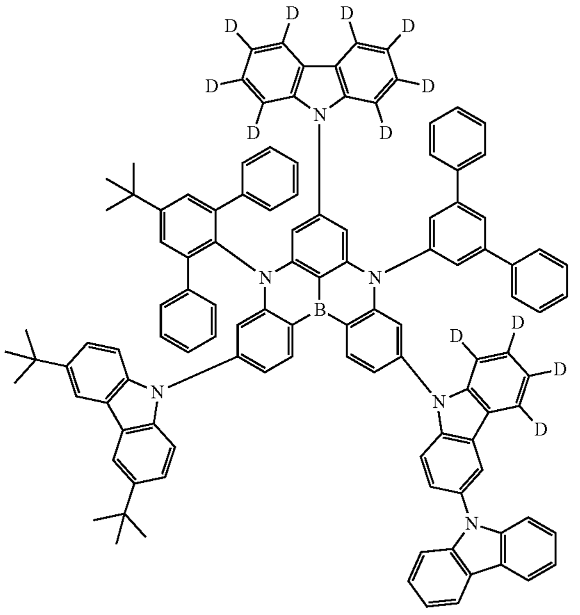

-continued
92
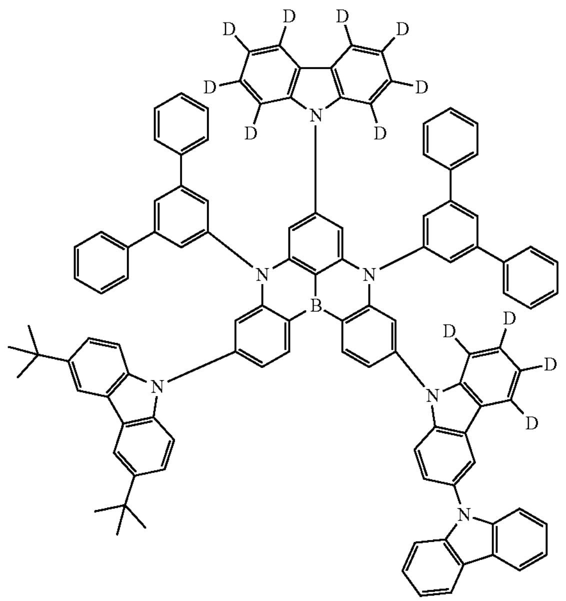
93
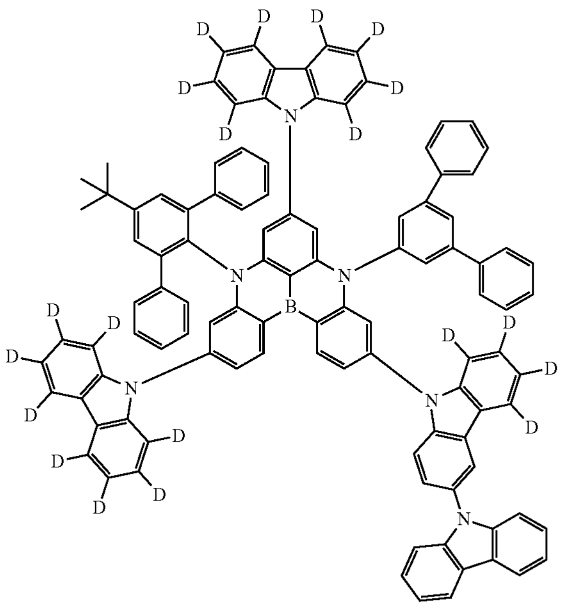
94
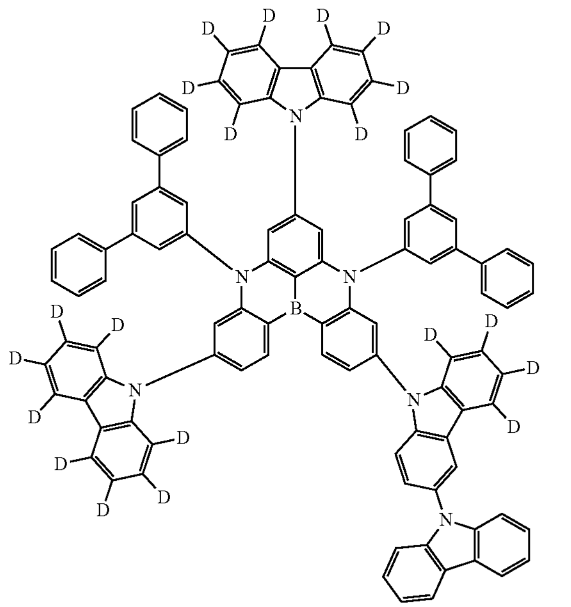
95
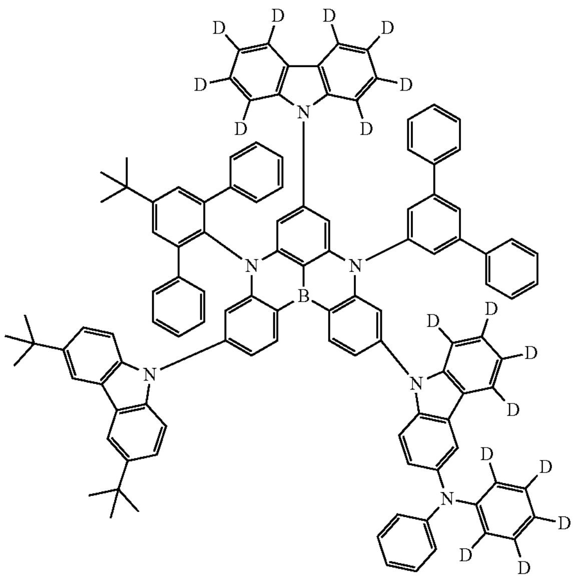

-continued
96
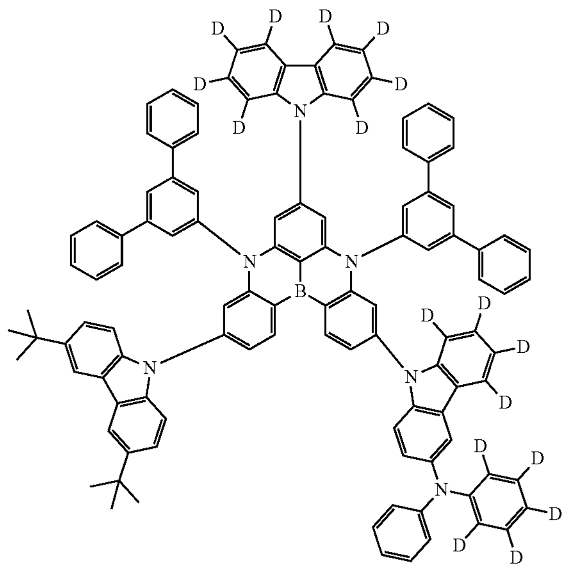
97
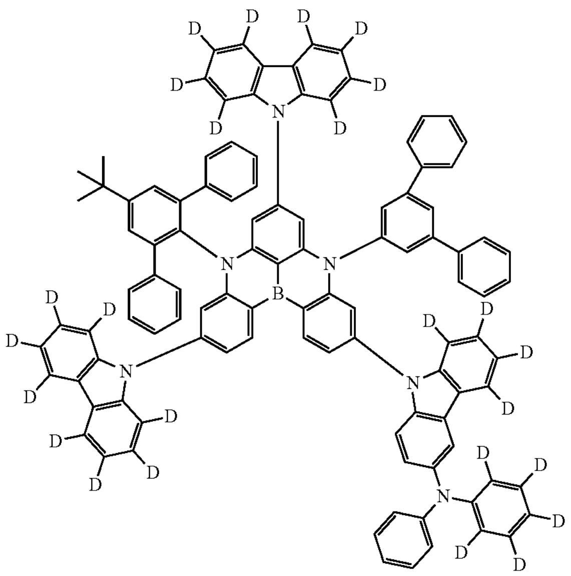
98
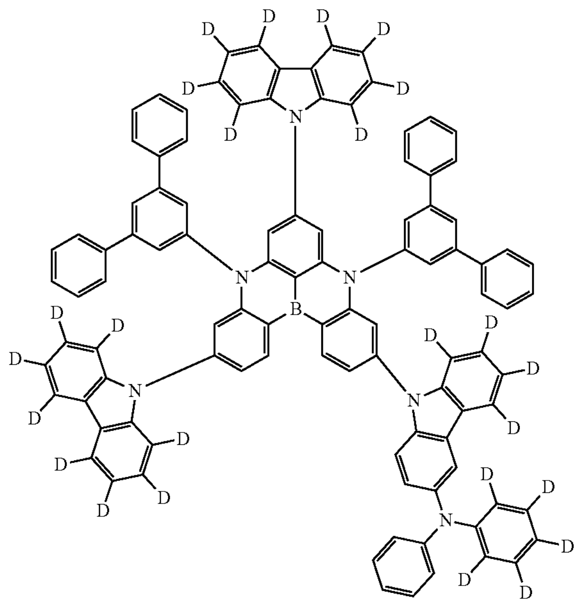
99
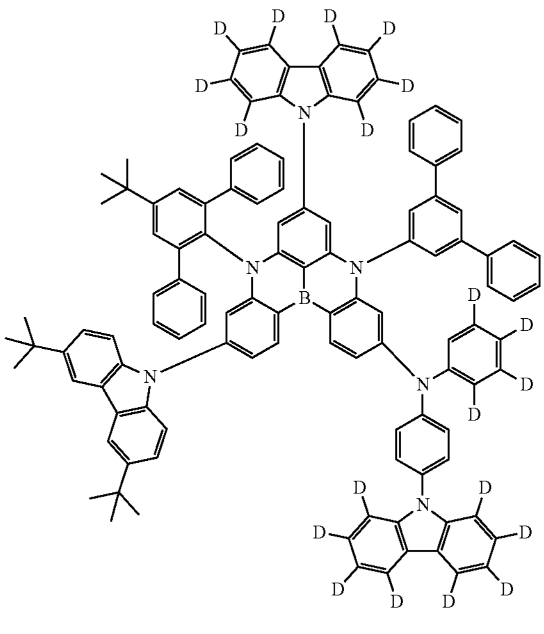

-continued
100
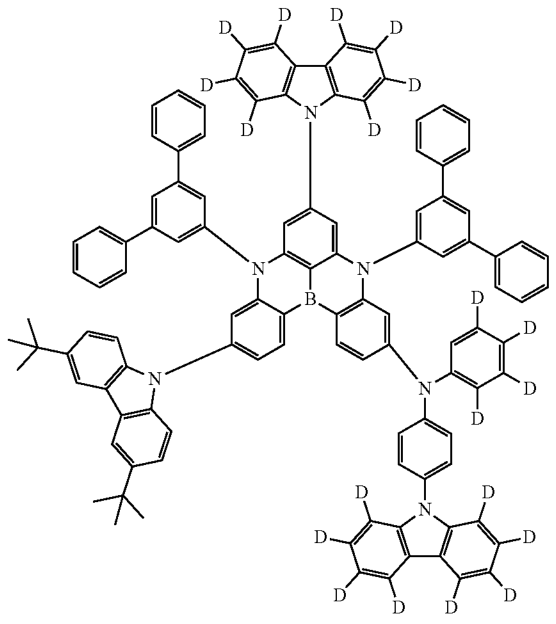
101
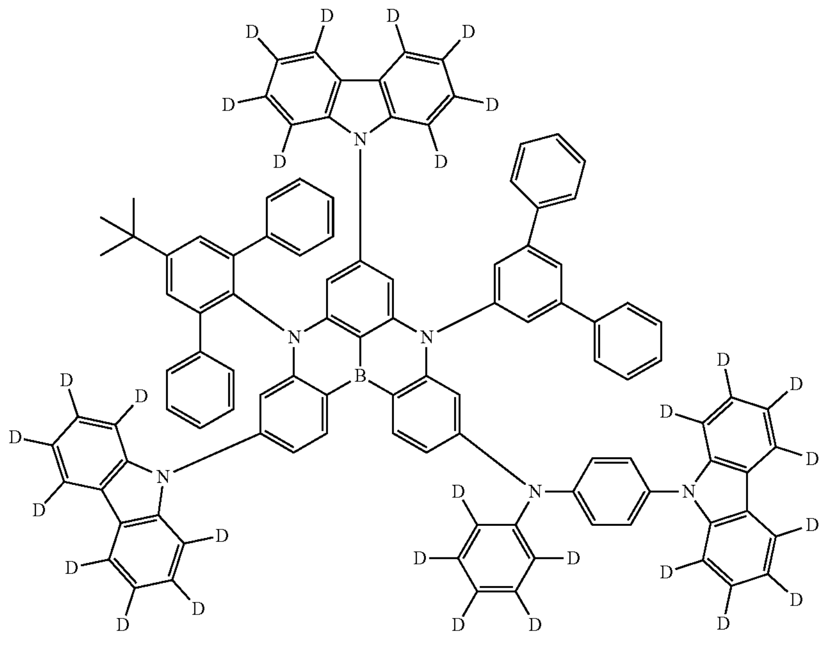

-continued
102
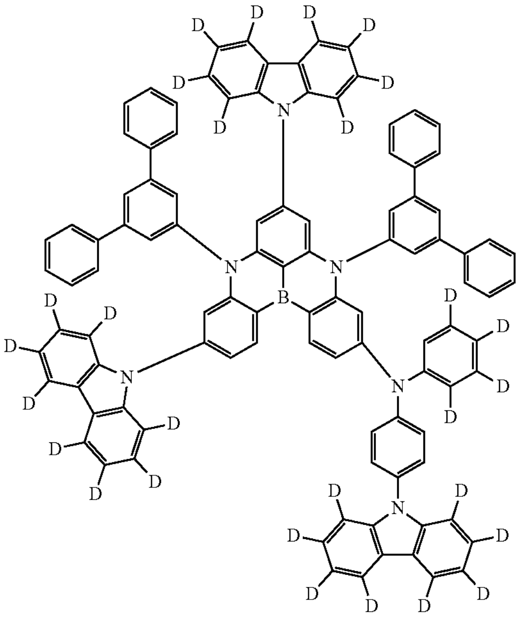
103
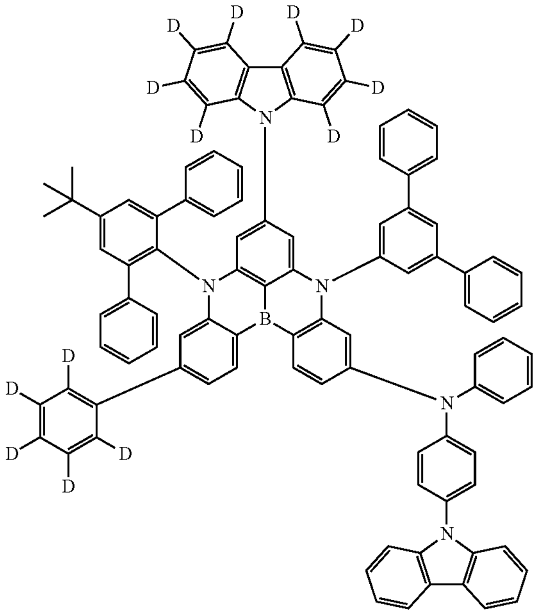
104
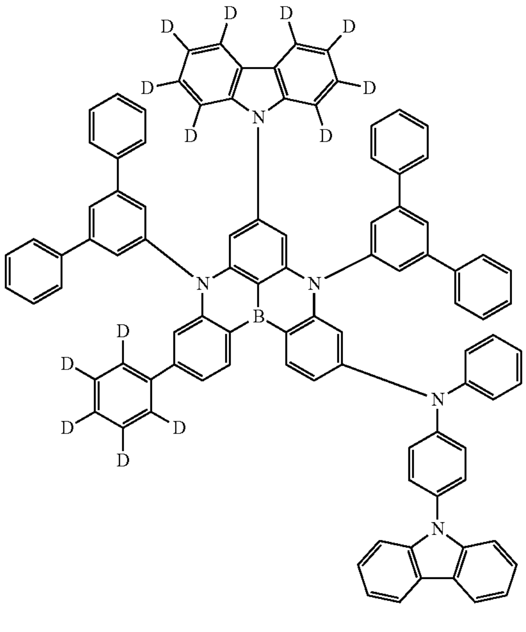
105
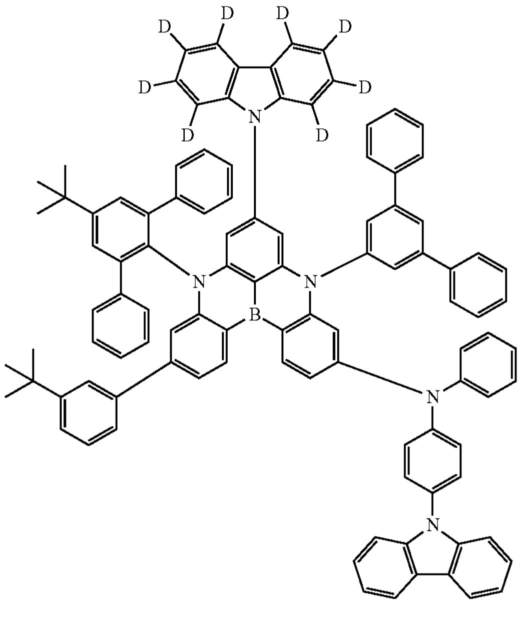

-continued
106
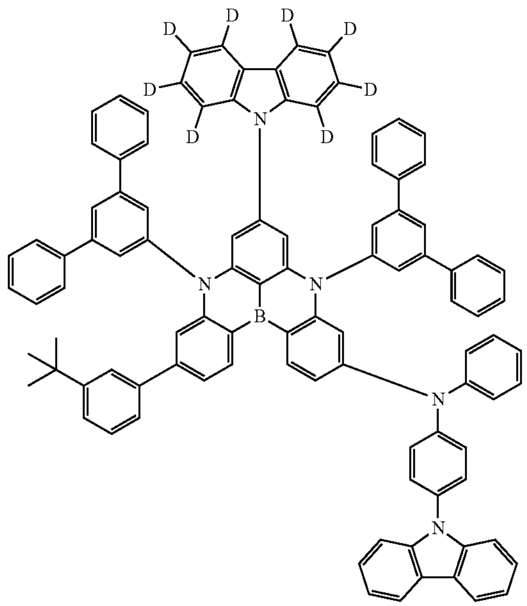
107
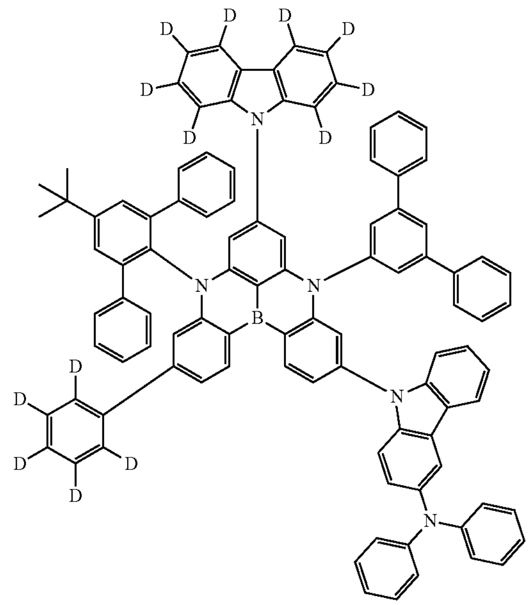
108
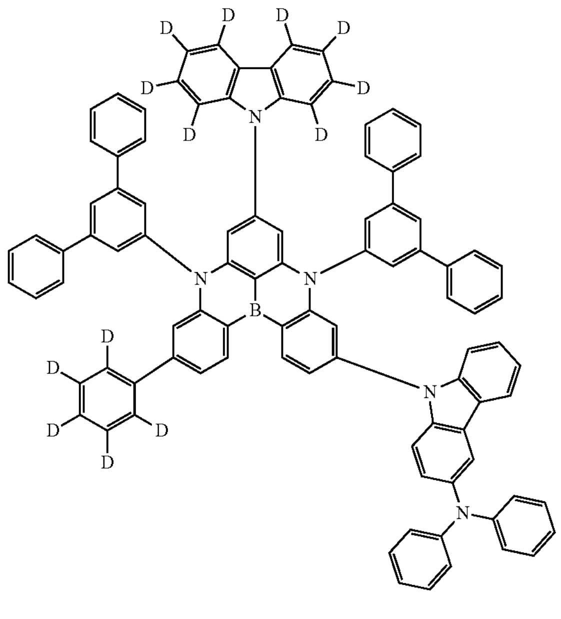
109
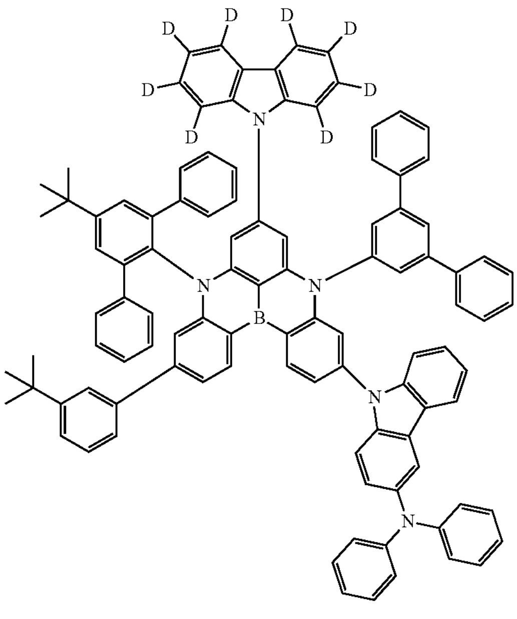

-continued
110
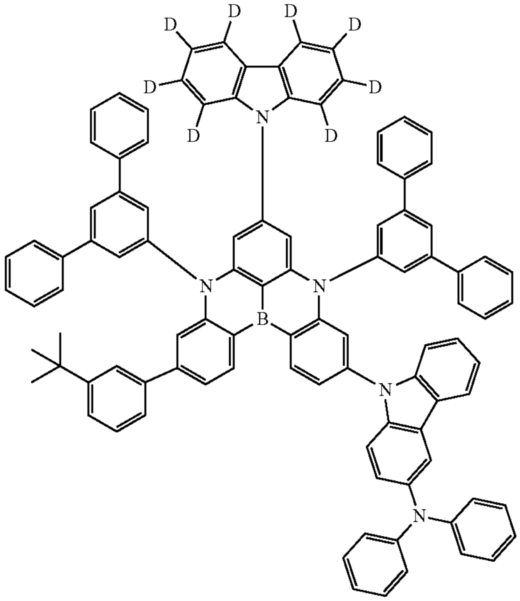
111
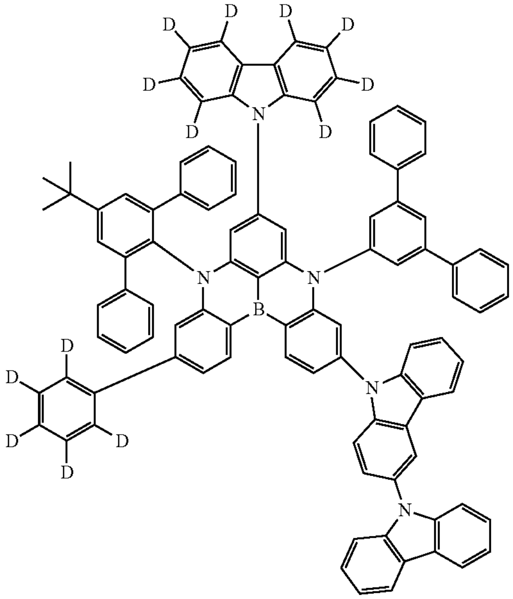
112
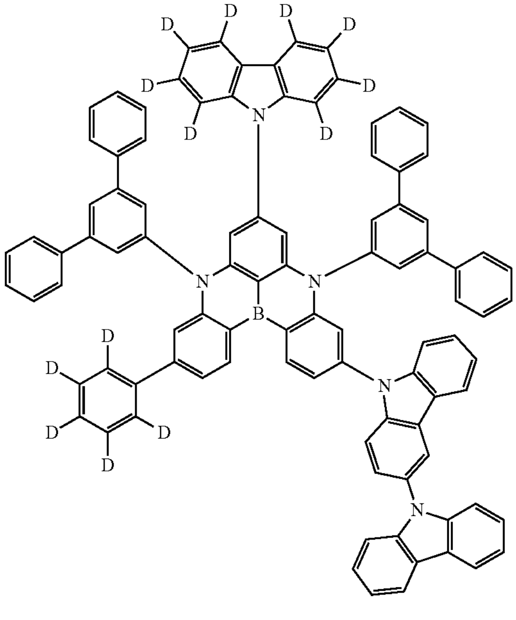
113
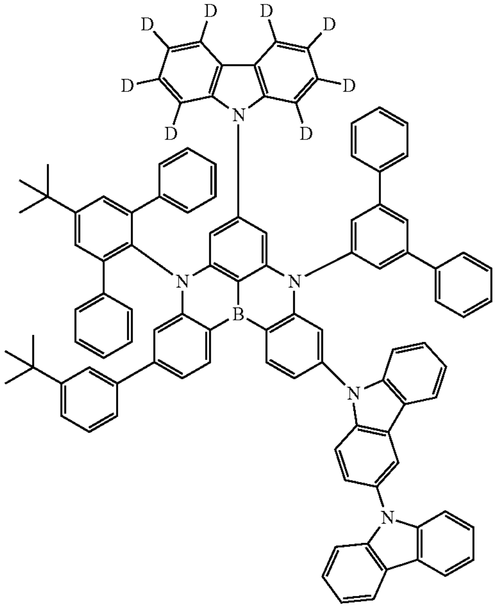

-continued
114
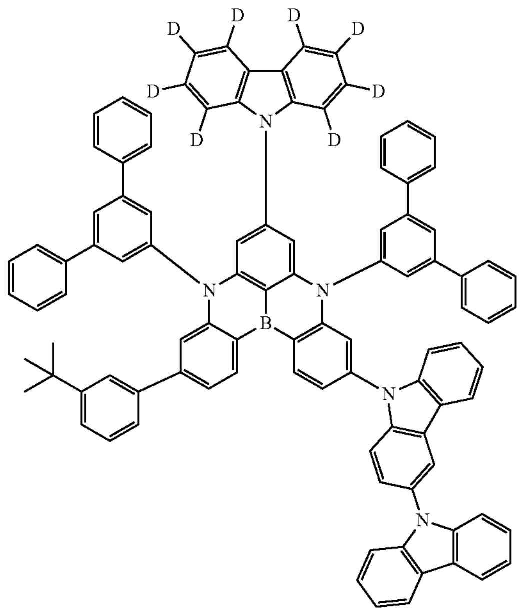
115
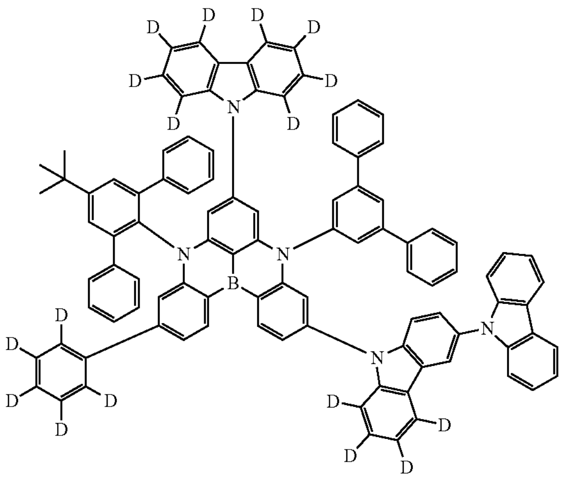
116
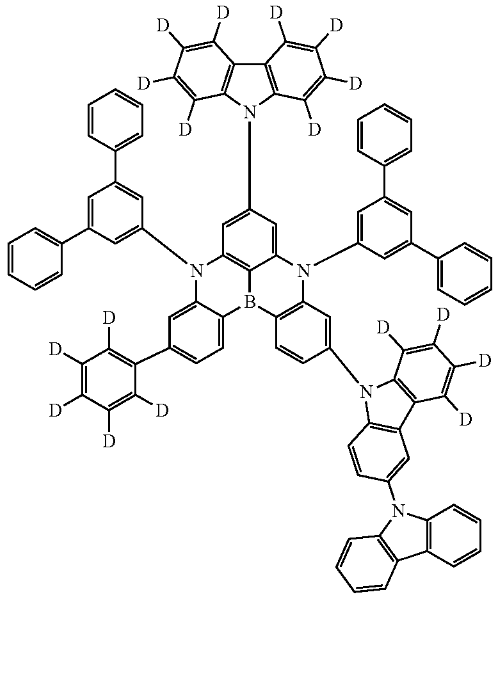
117
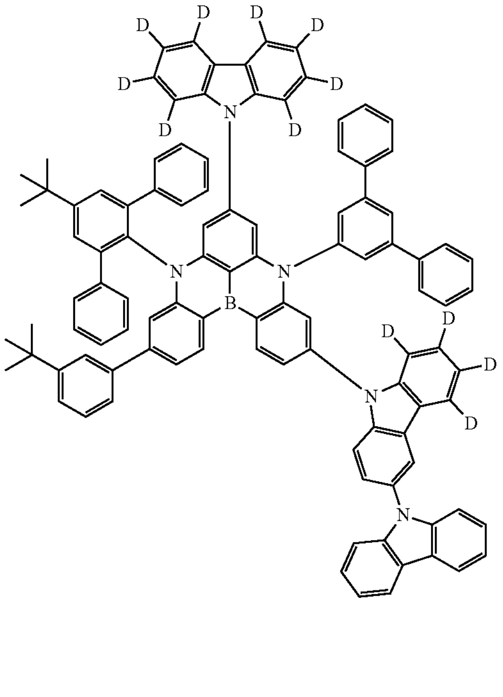

-continued
118
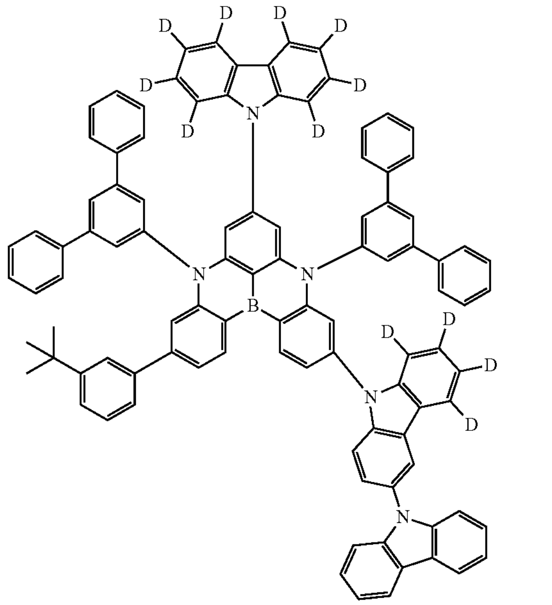
119
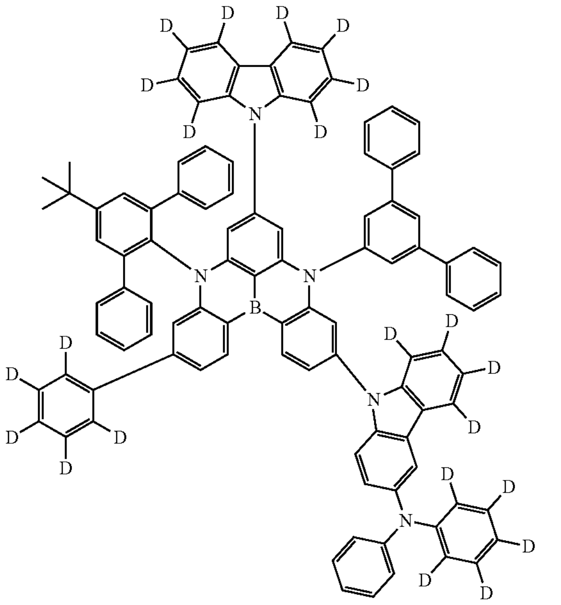
120
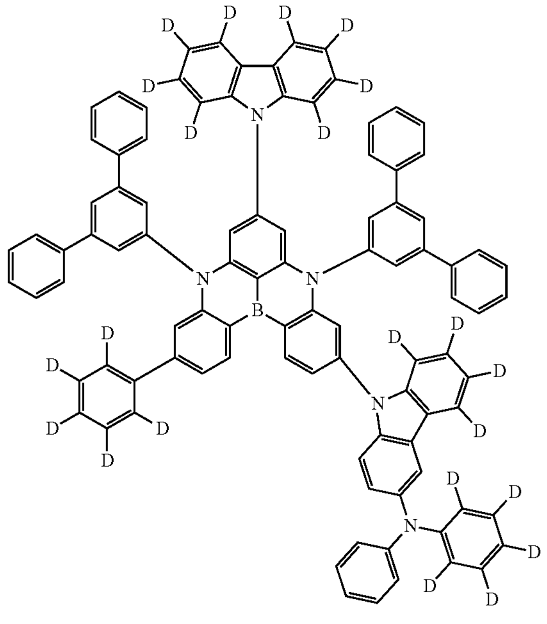
121
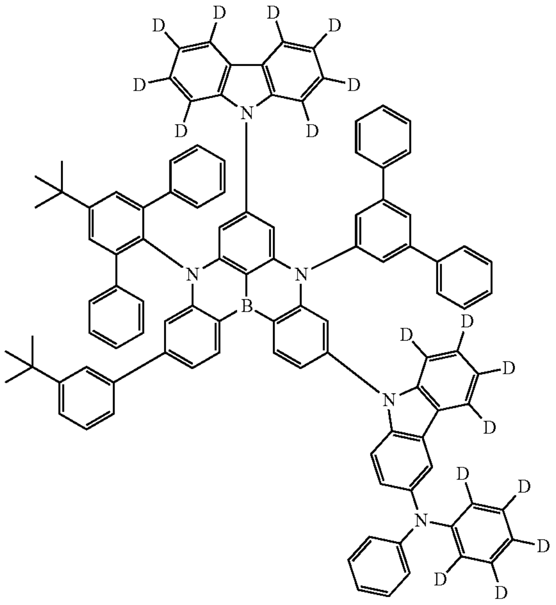

-continued
122
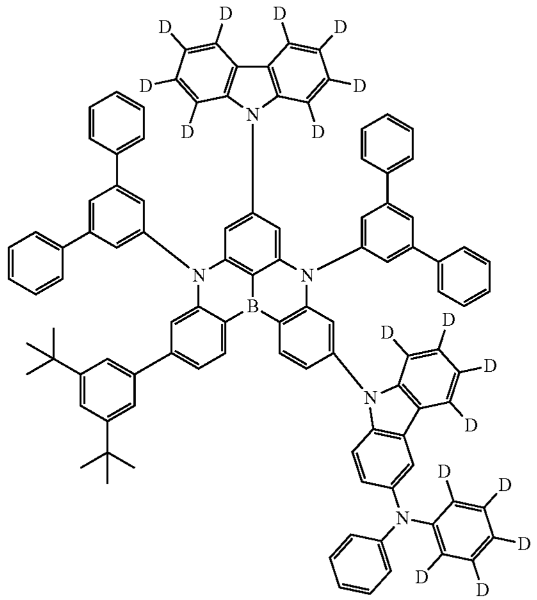
123
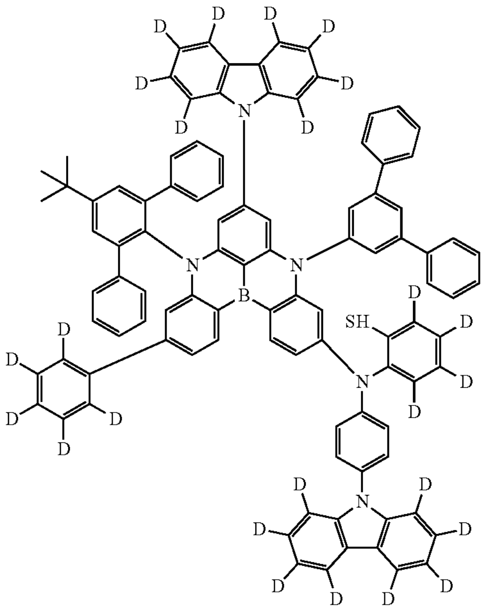
124
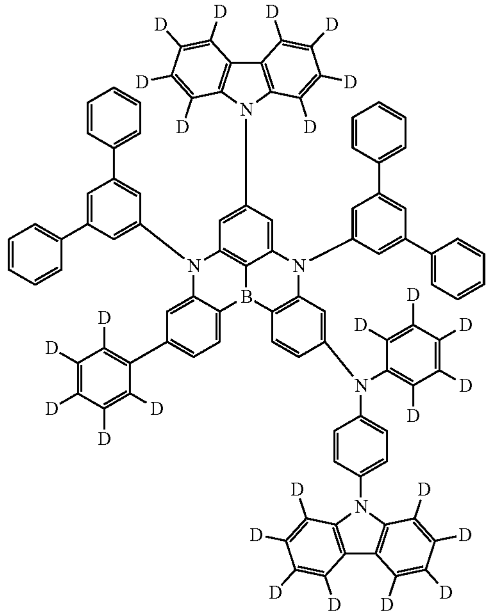

-continued
125
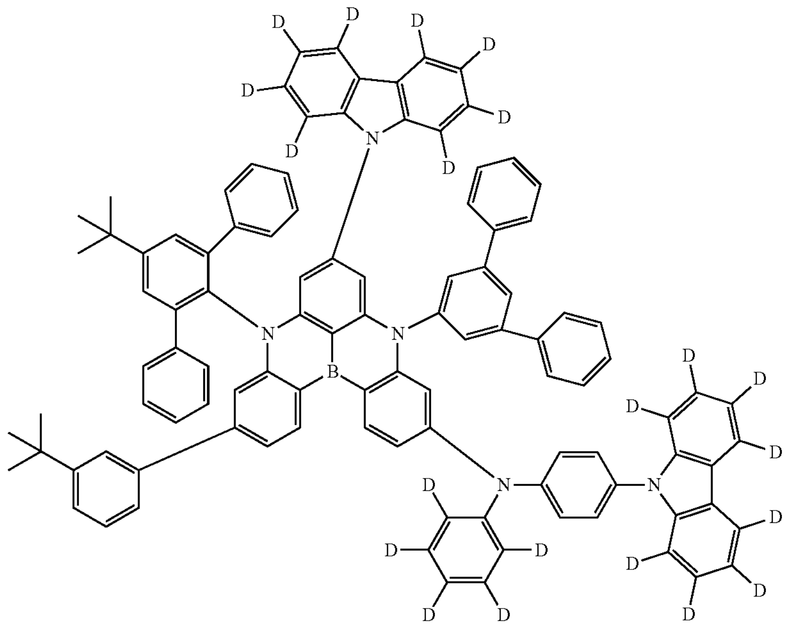
126
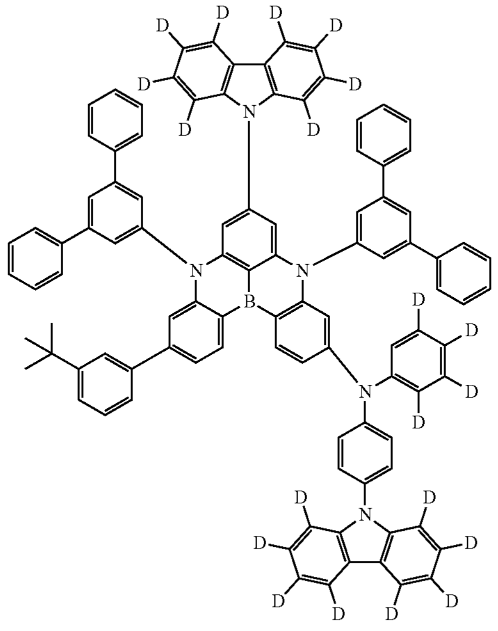
127
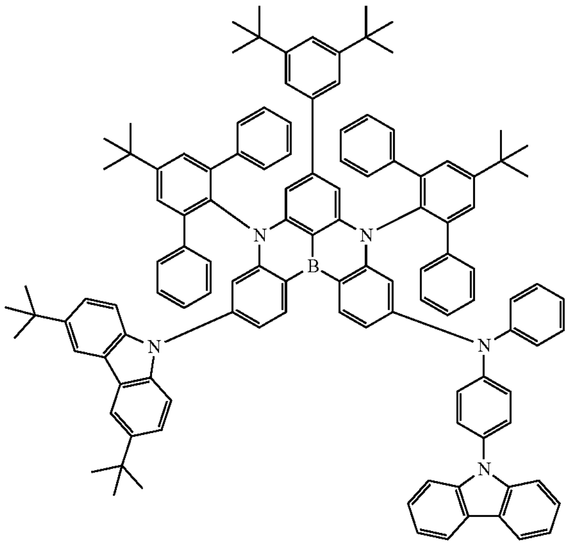

-continued
128
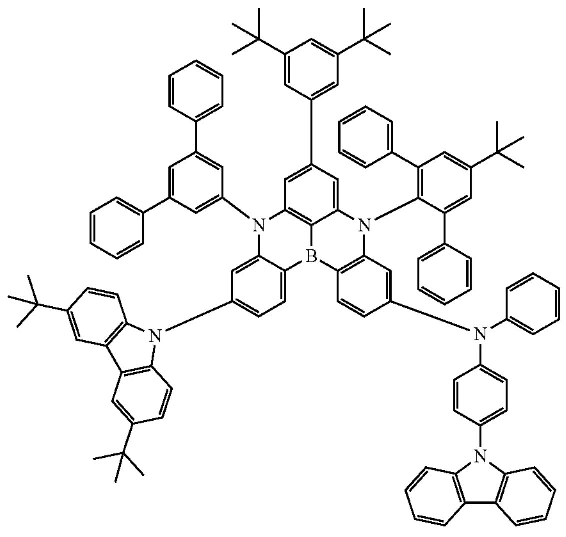
129
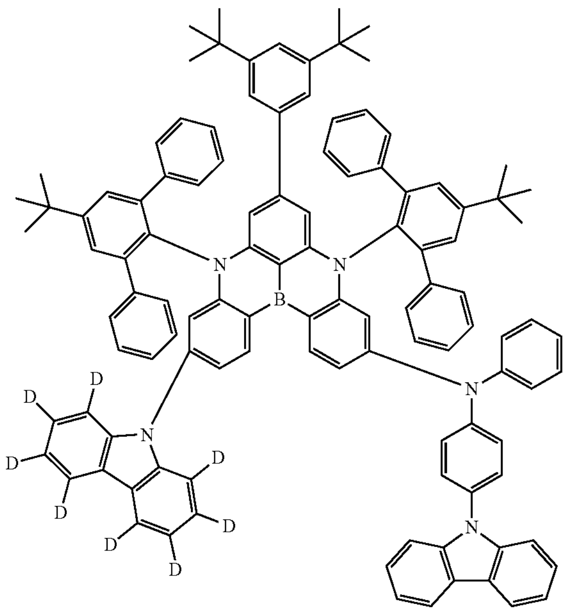
130
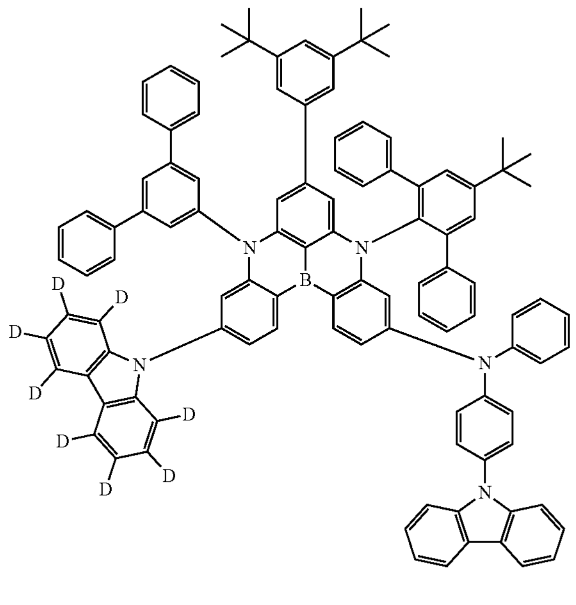
131
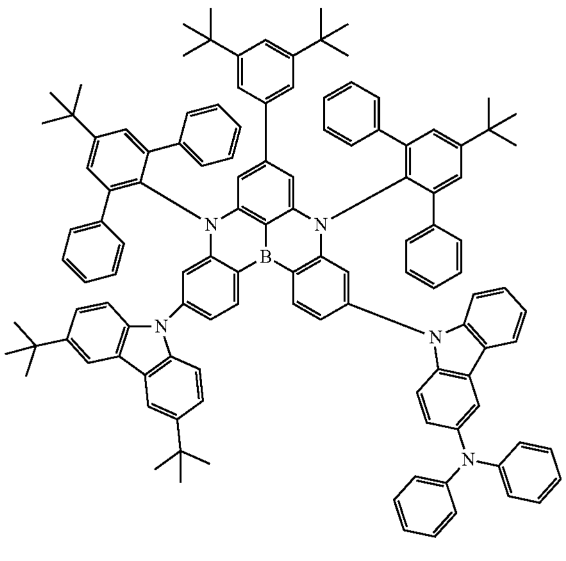

-continued
132
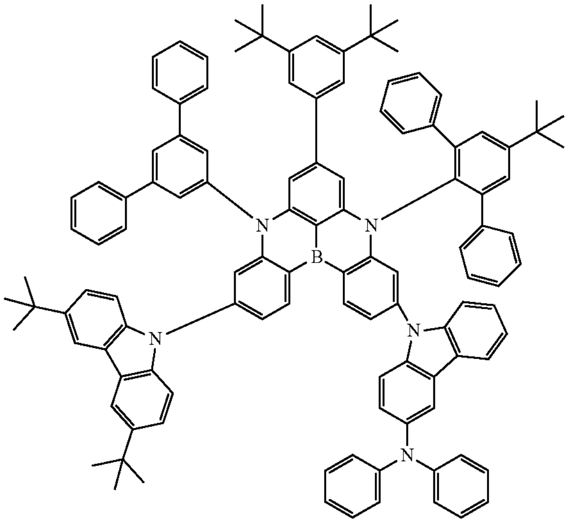
133
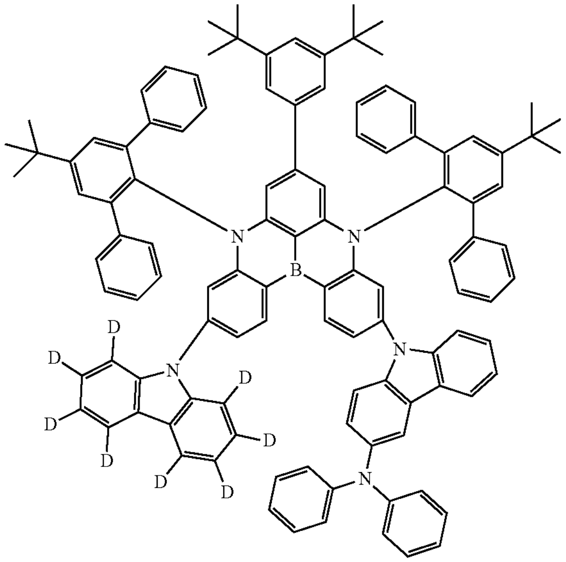
134
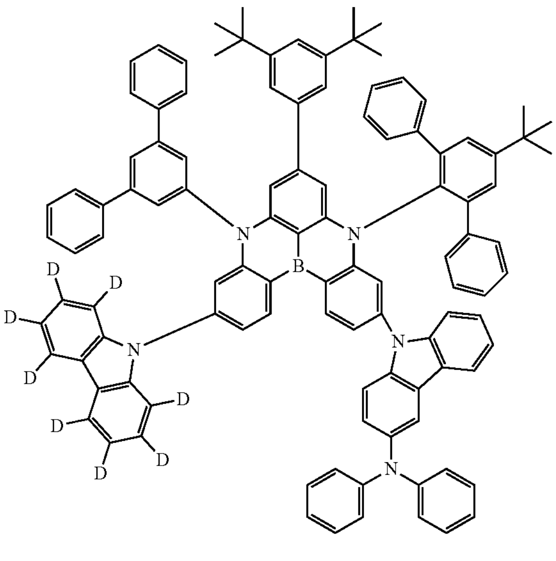
135
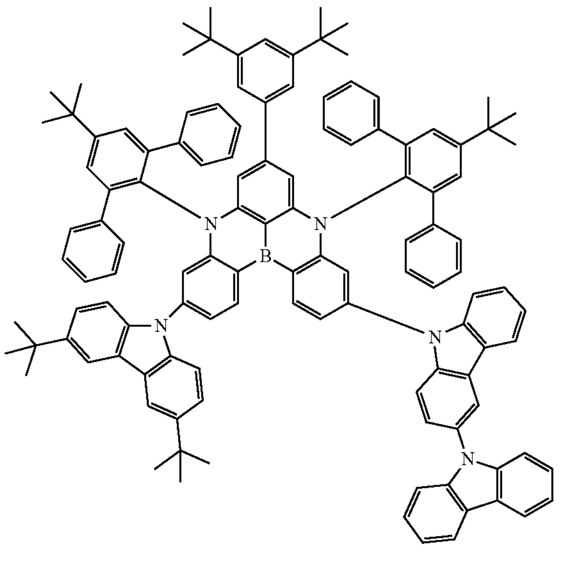

-continued
136
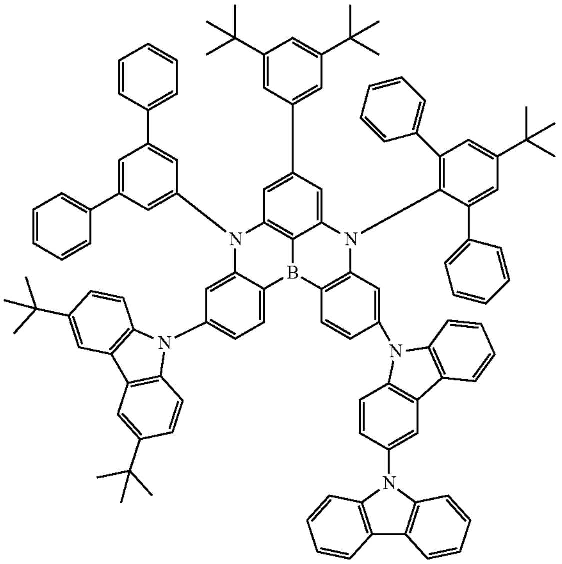
137
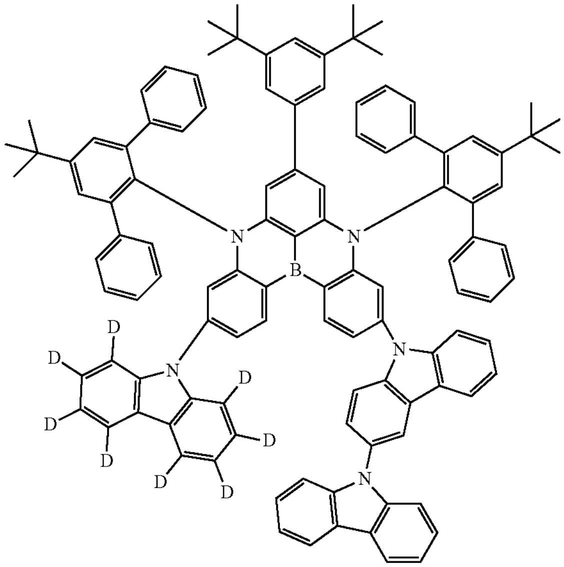
138
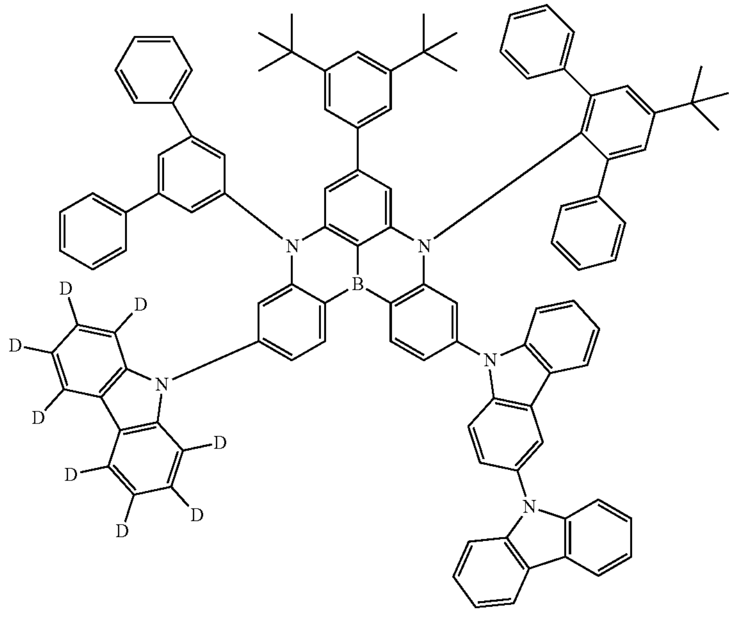

-continued
139
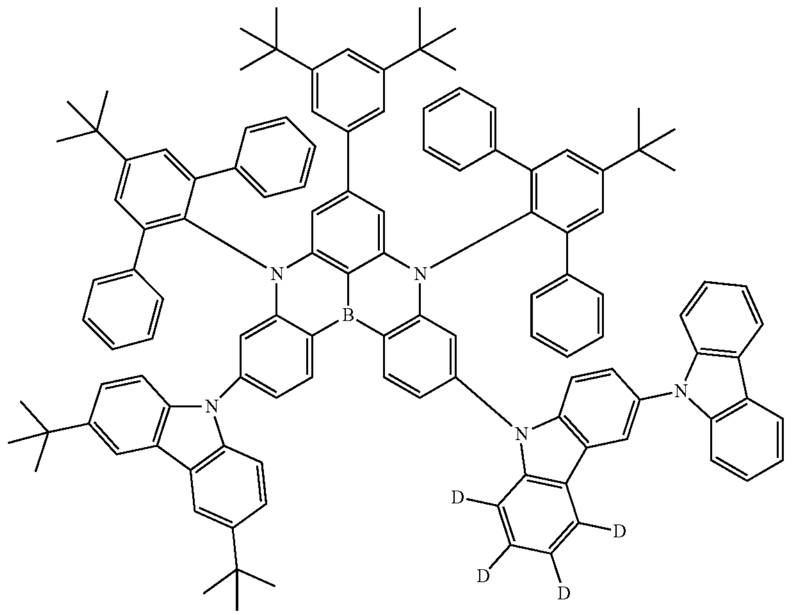
140
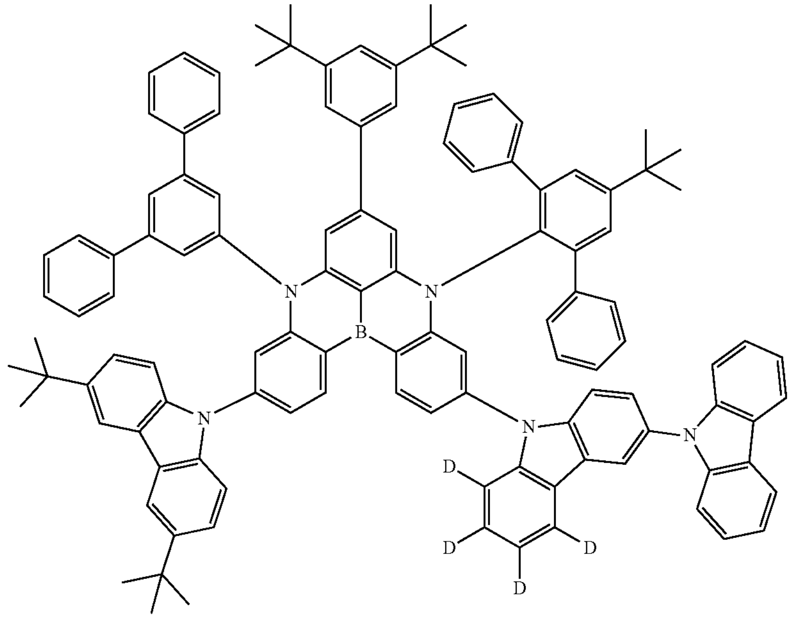

-continued
141
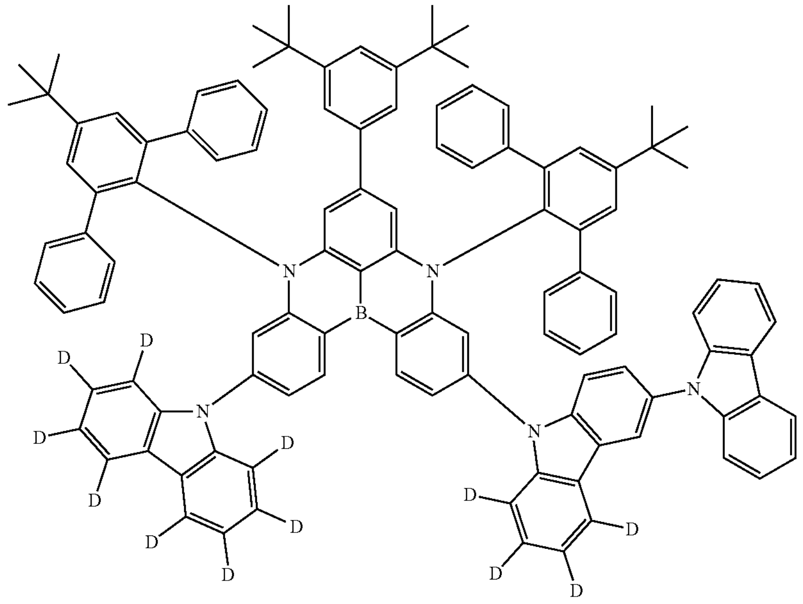
142
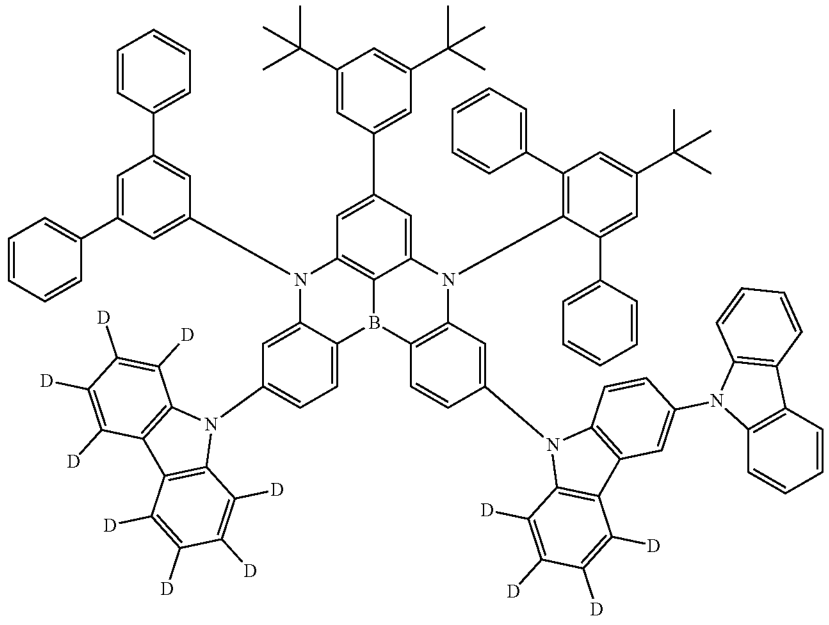

-continued
143
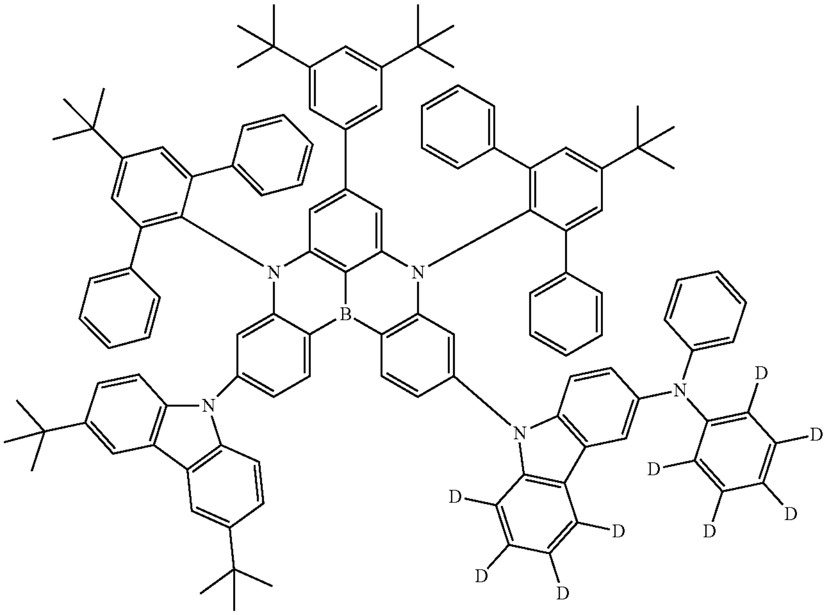
144
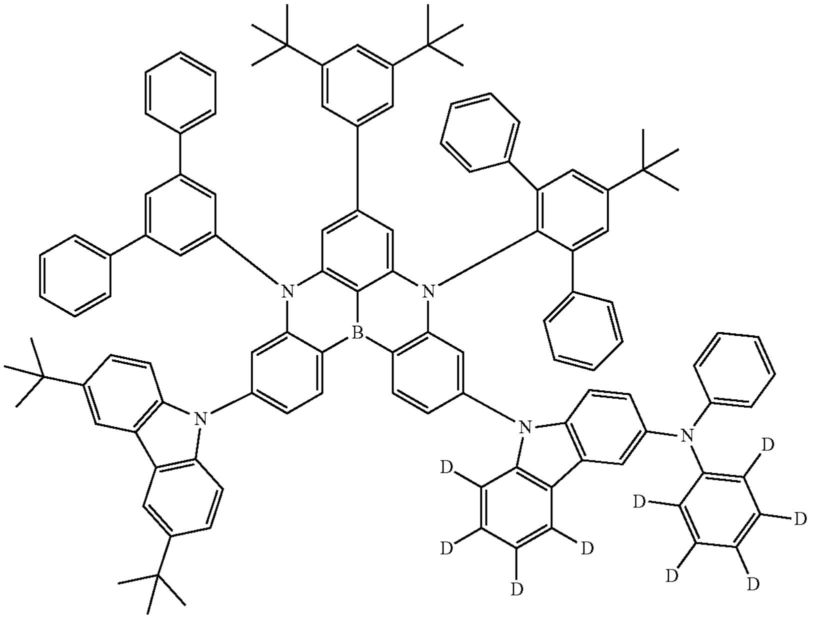

-continued
145
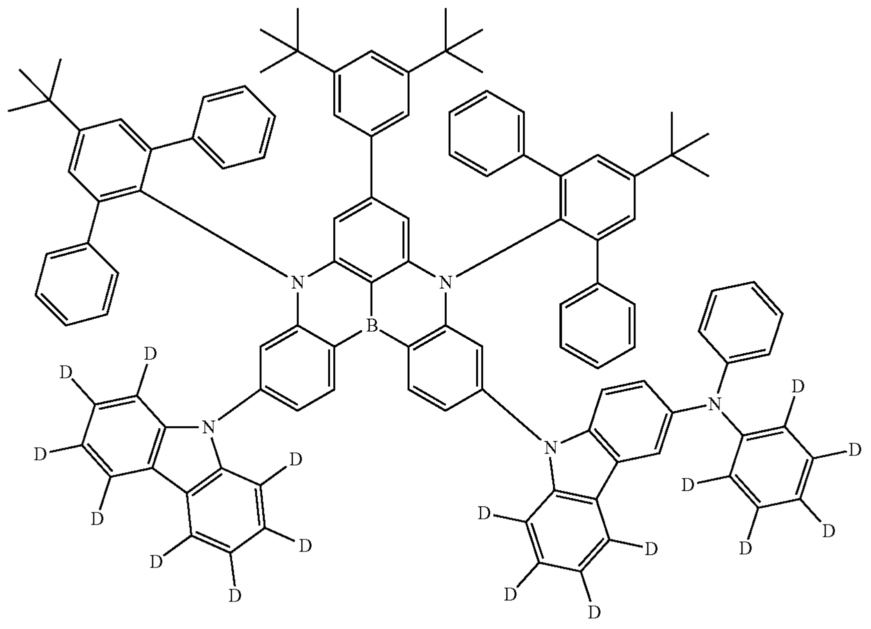
146
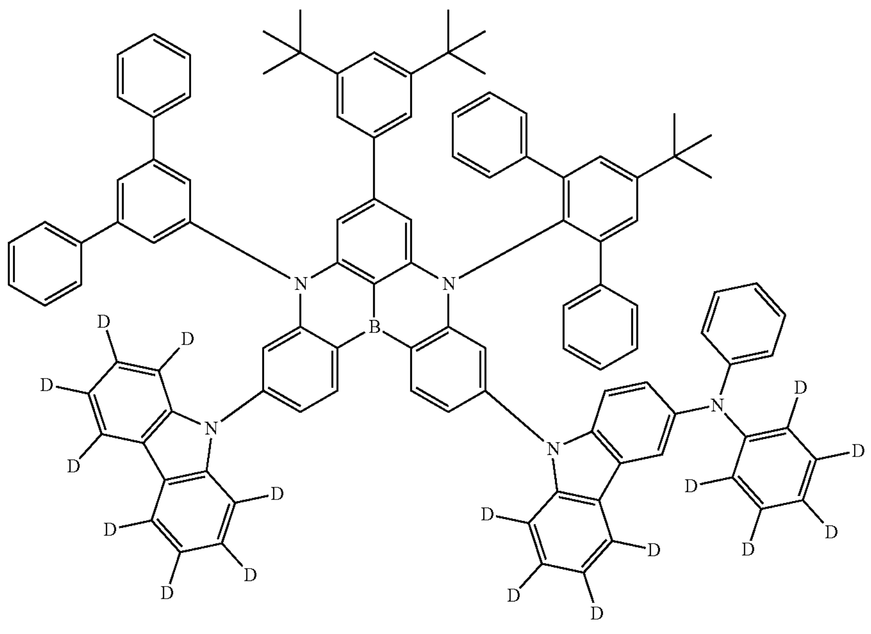

-continued
147
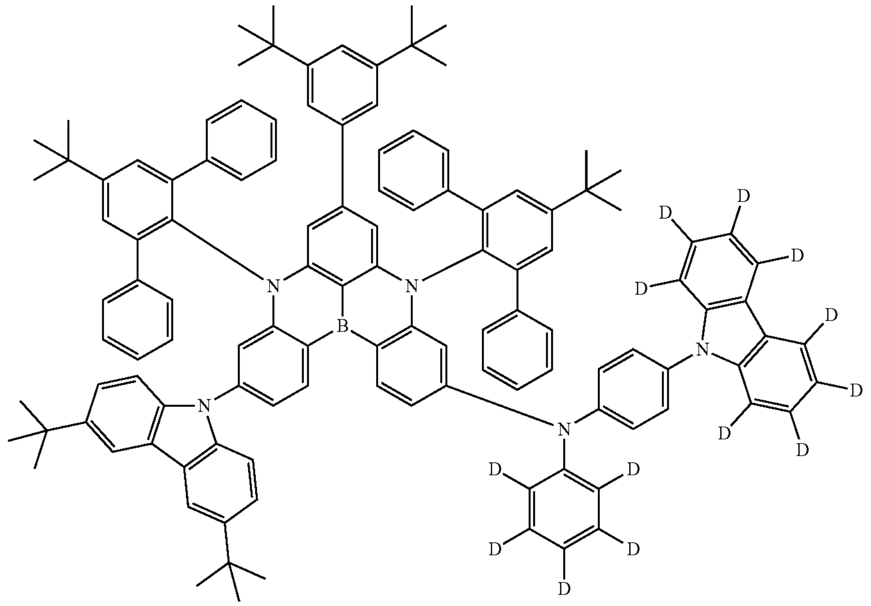
148
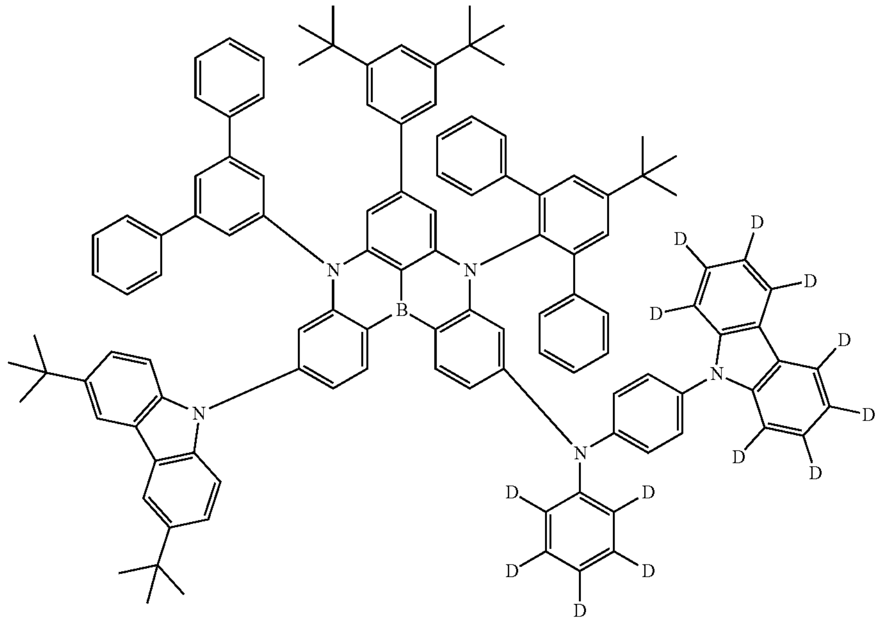

-continued
149
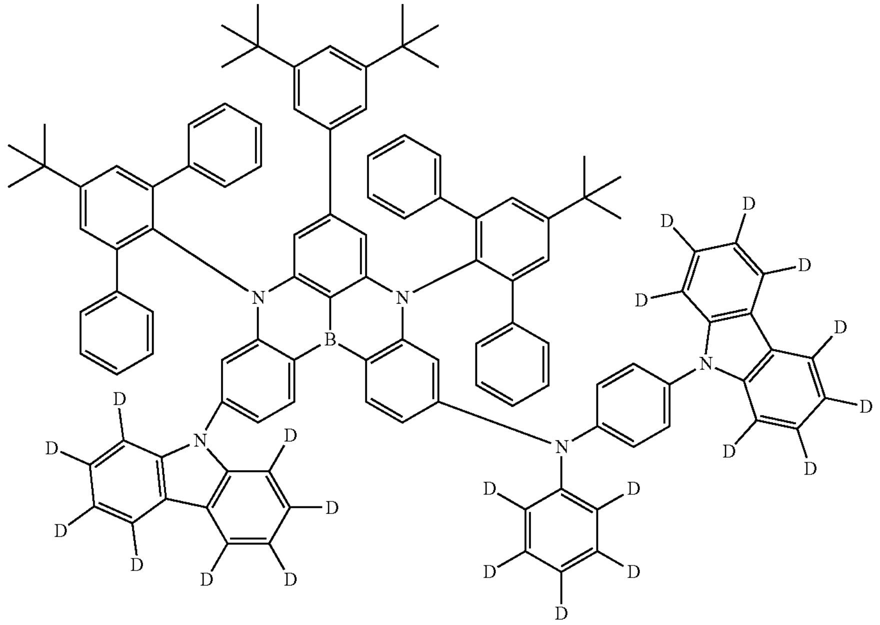
150
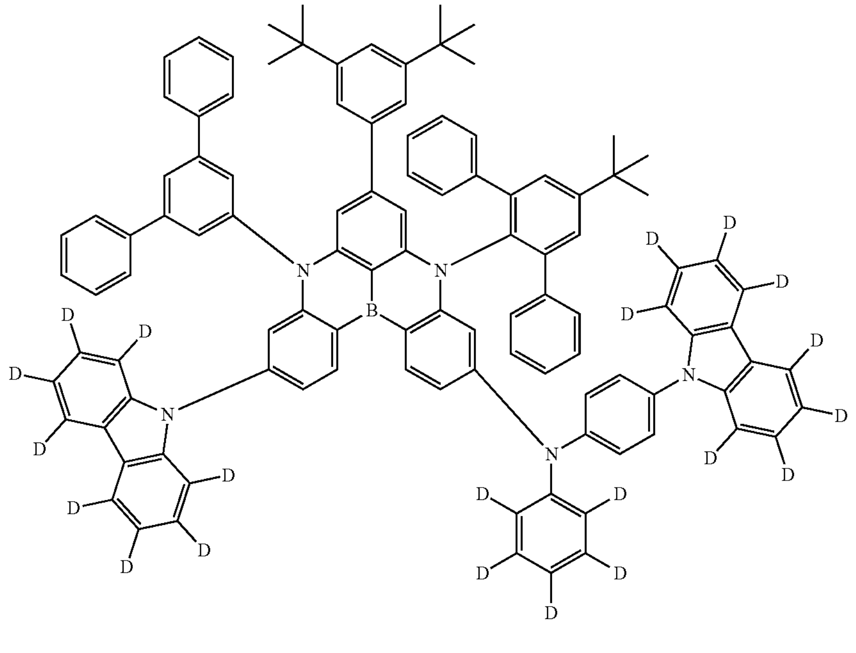

-continued
151
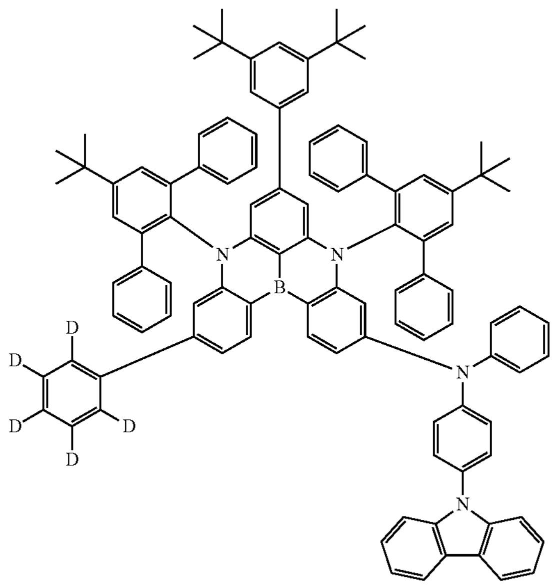
152
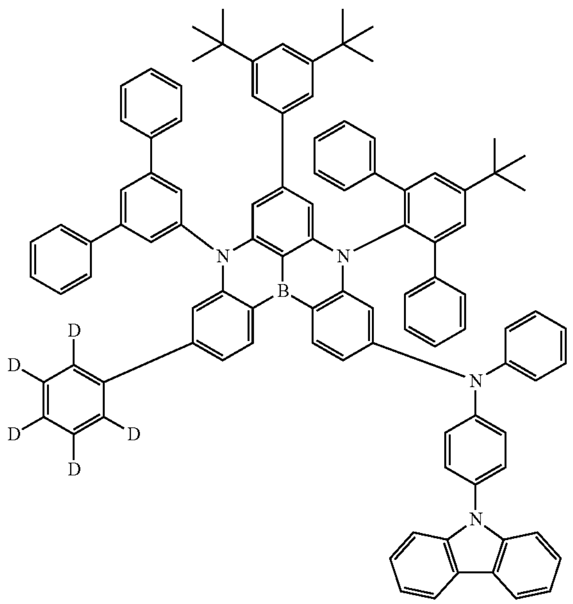
153
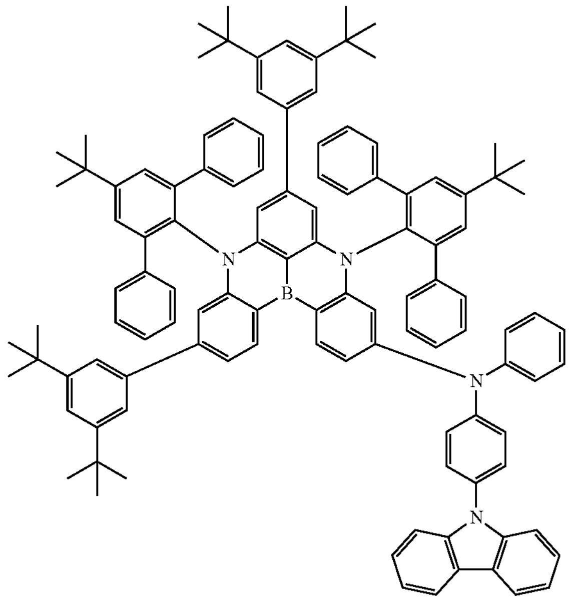
154
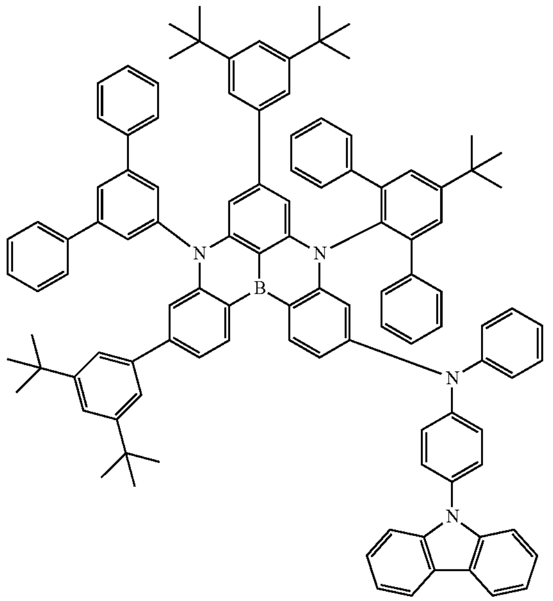

-continued
155
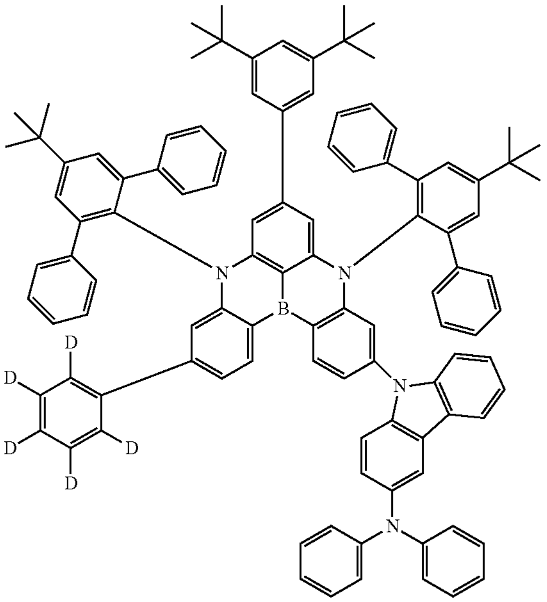
156
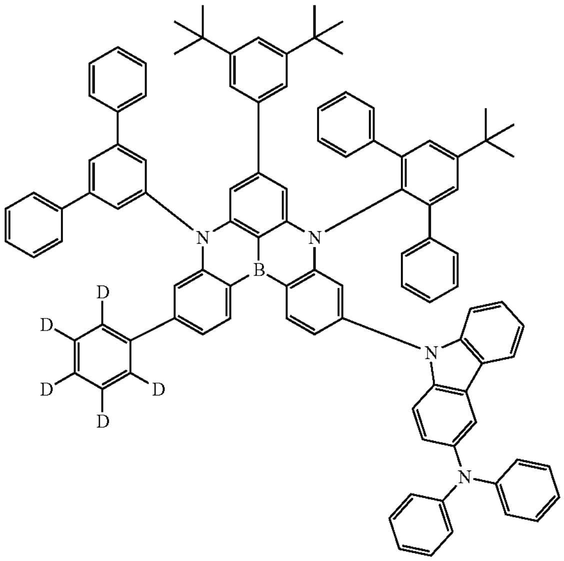
157
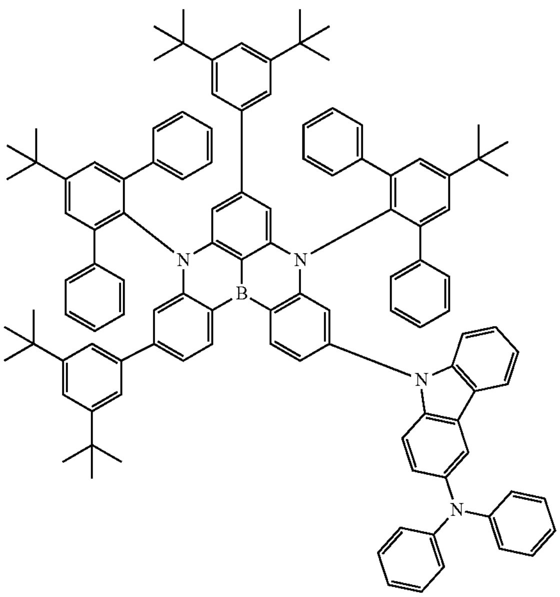
158
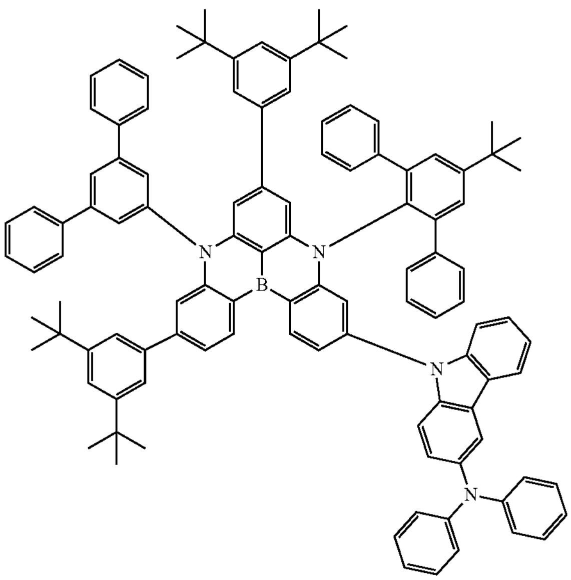

-continued
159
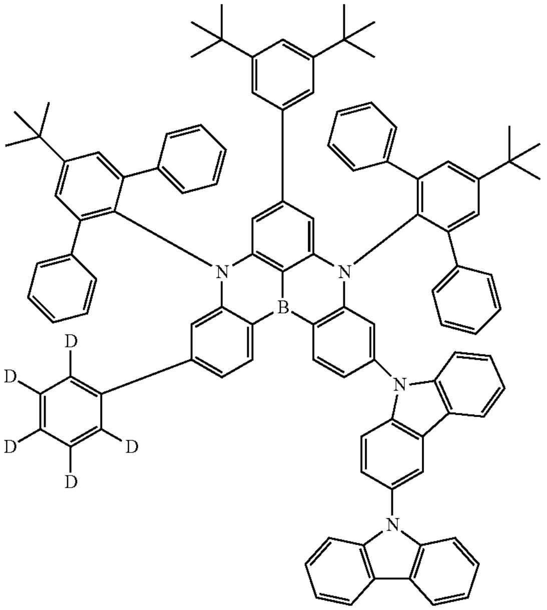
160
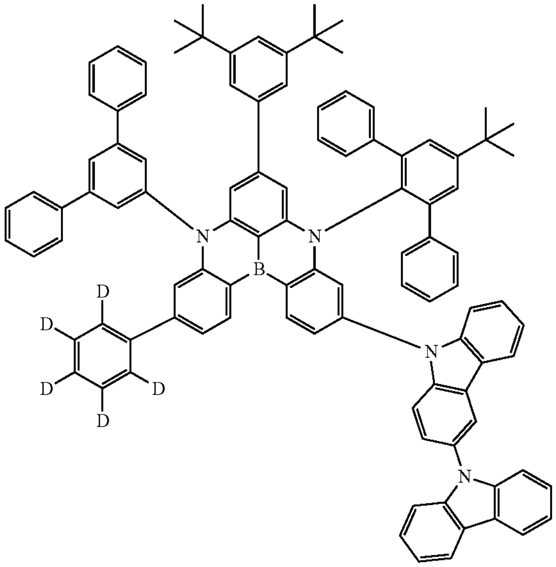
161
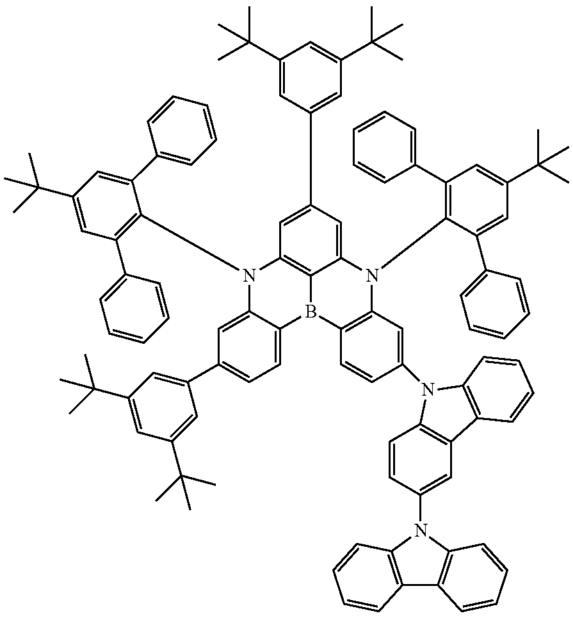
162
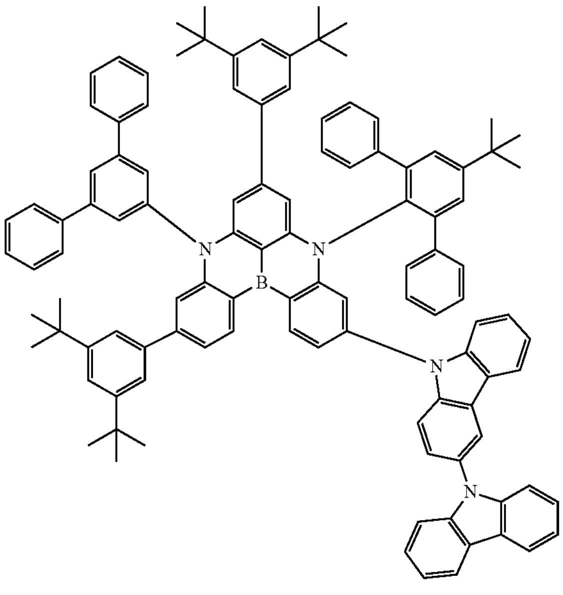

-continued
163
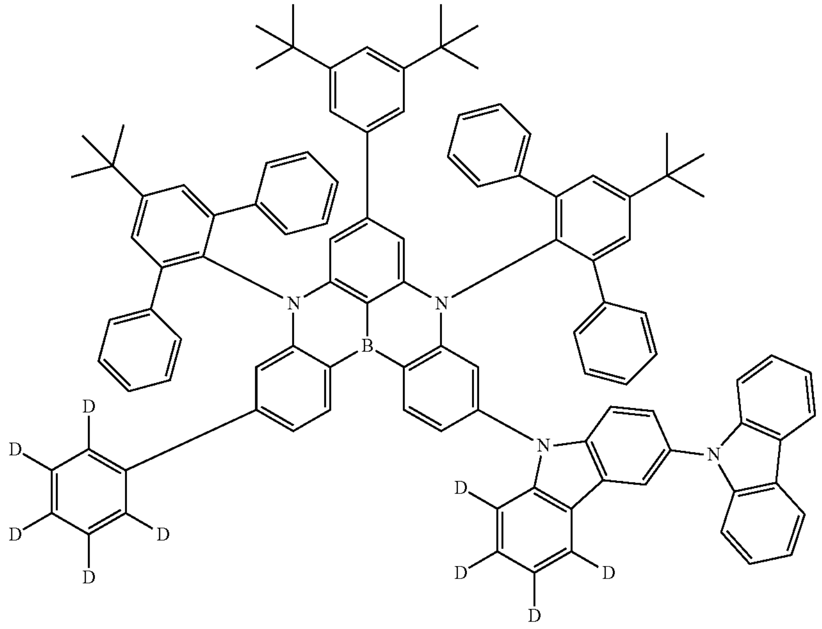
164
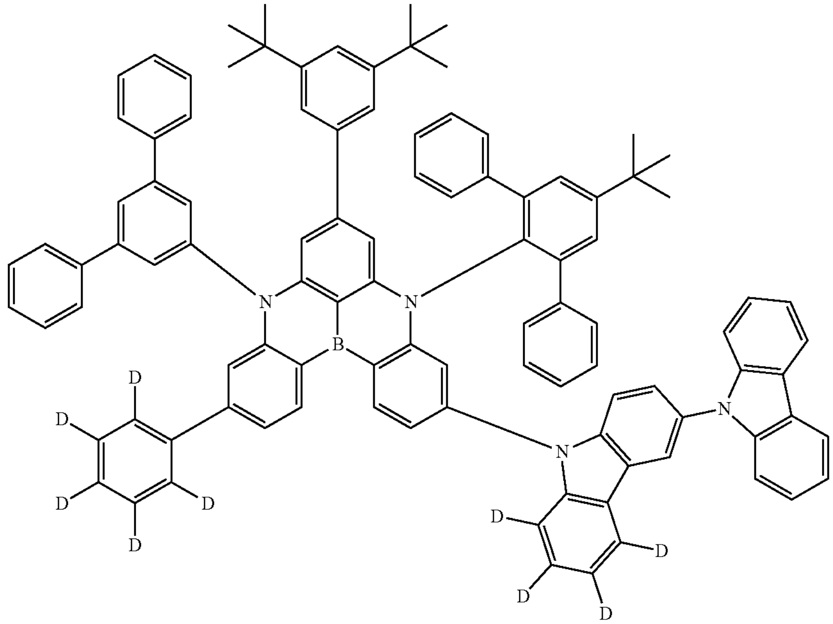

-continued
165
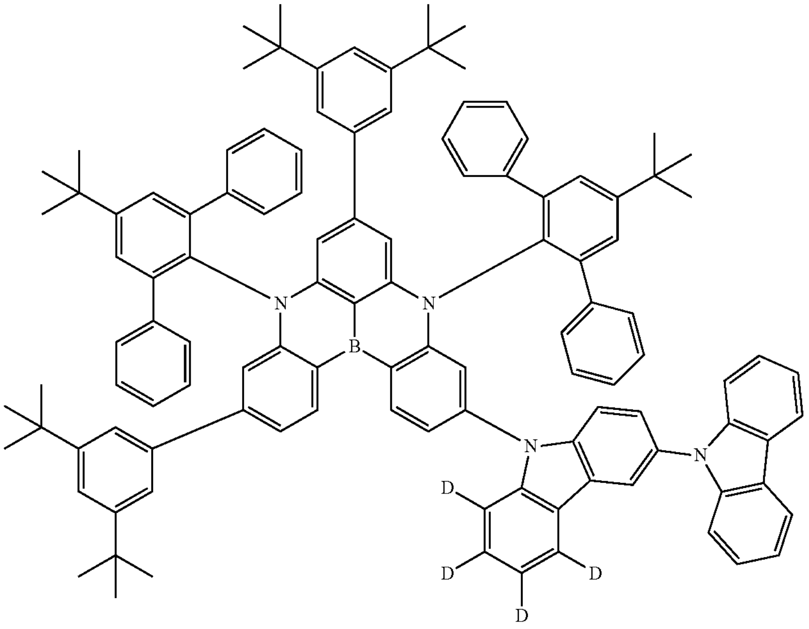
166
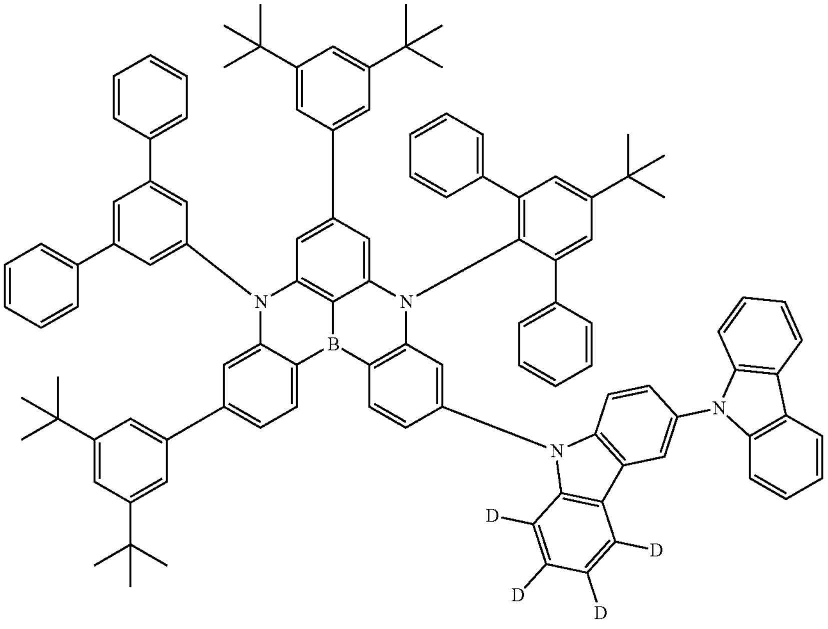

-continued
167
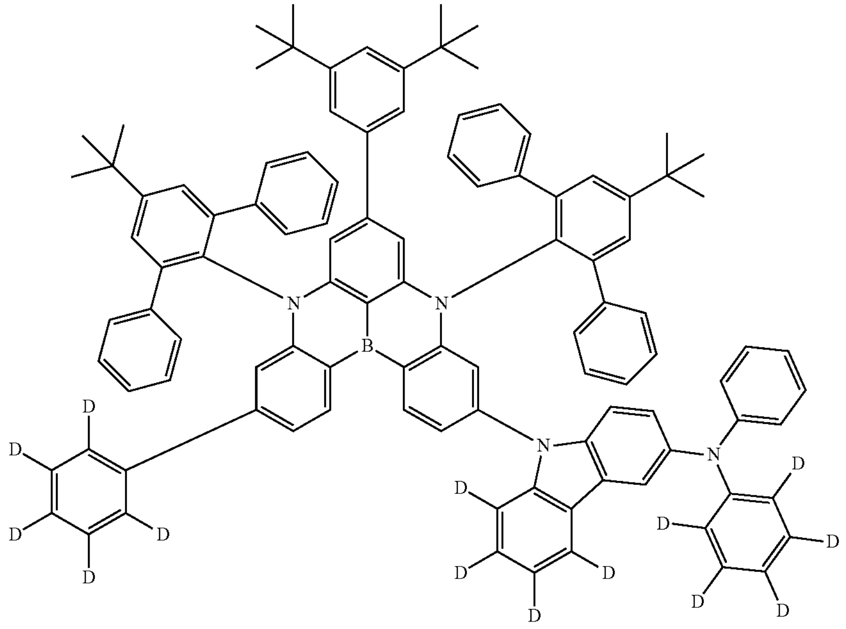
168
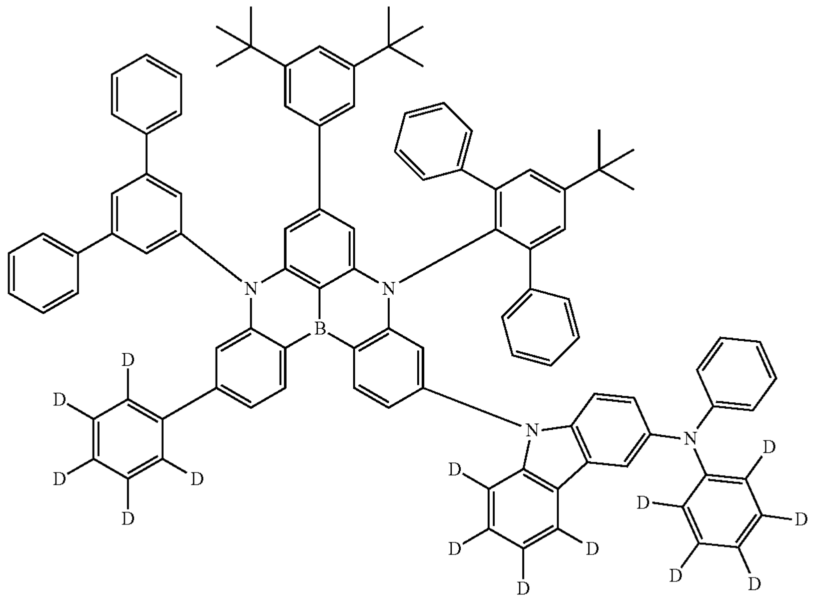

-continued
169
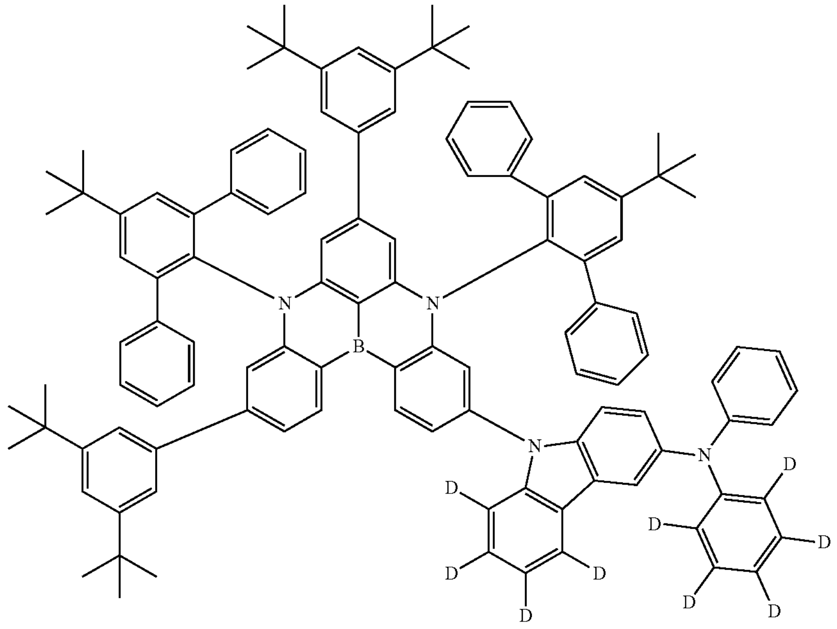
170
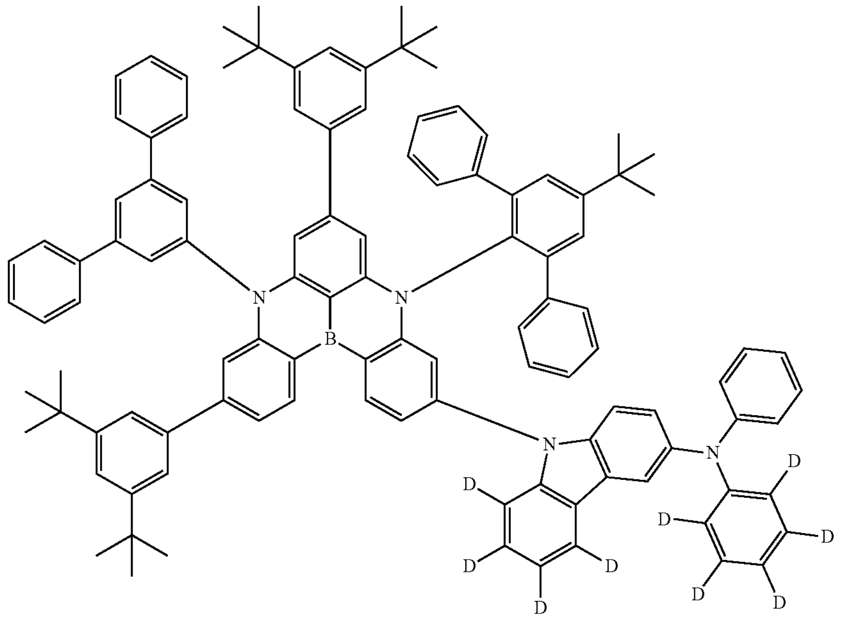

-continued
171
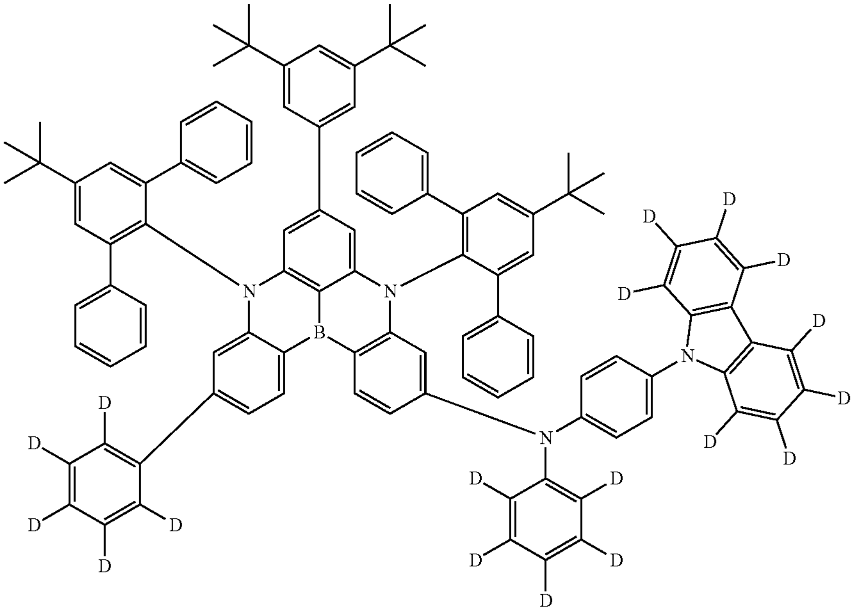
172
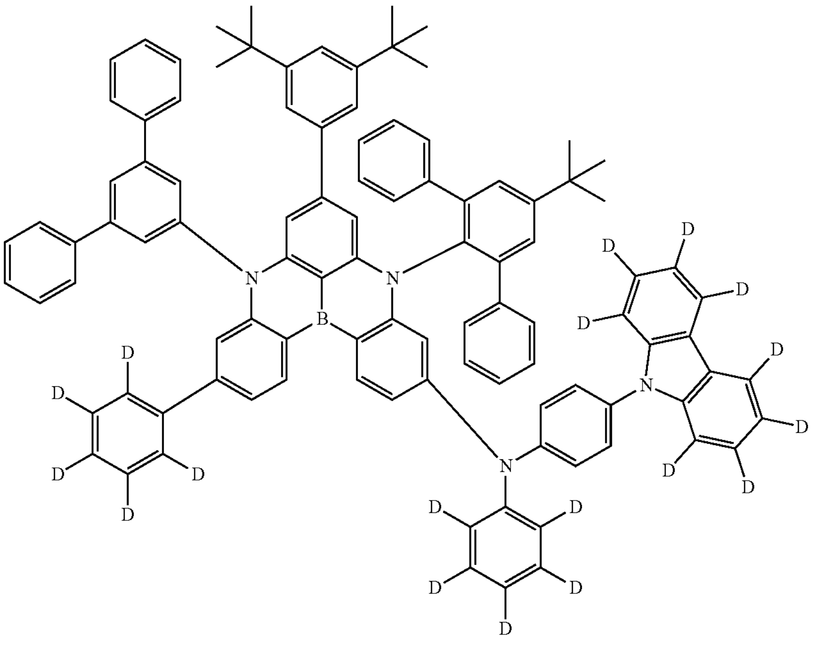

-continued
173
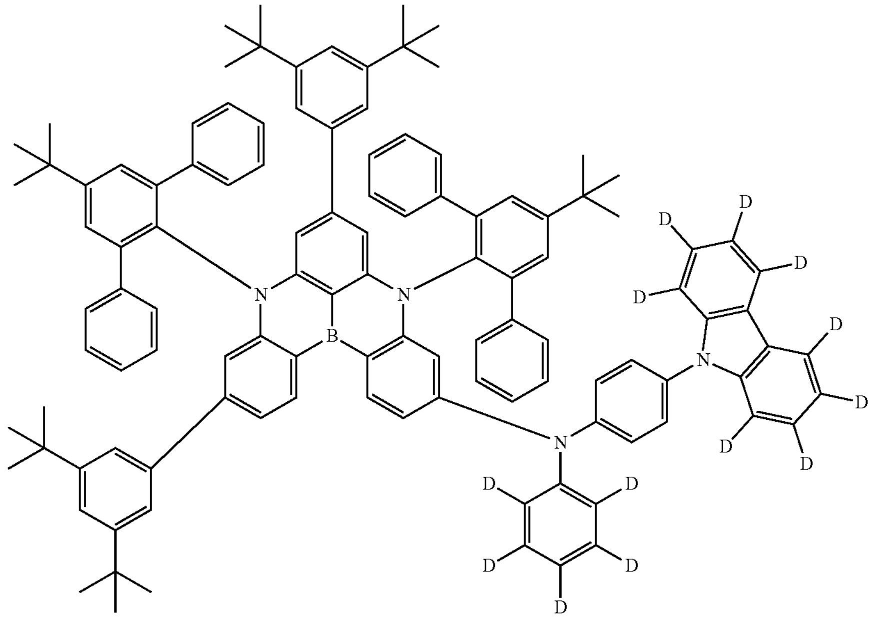
174
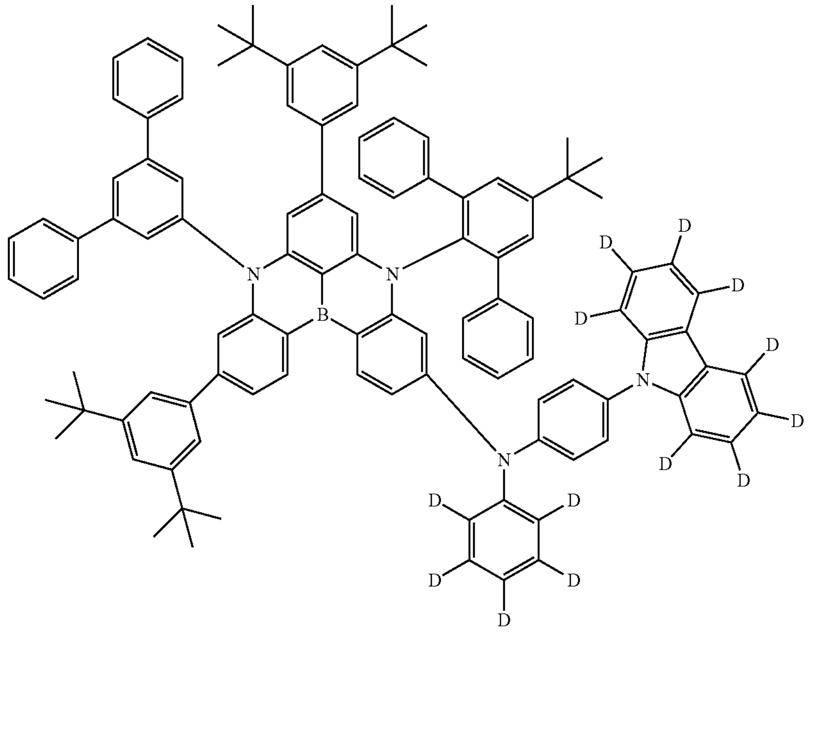

-continued
175
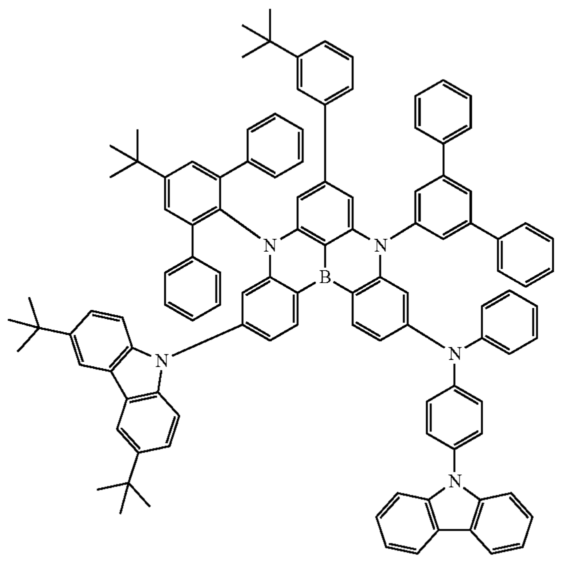
176
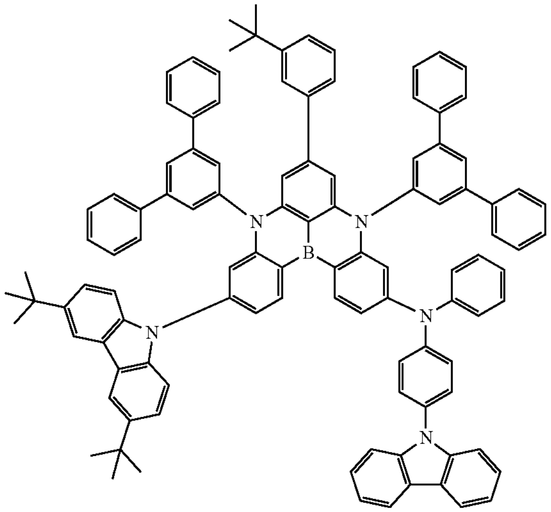
177
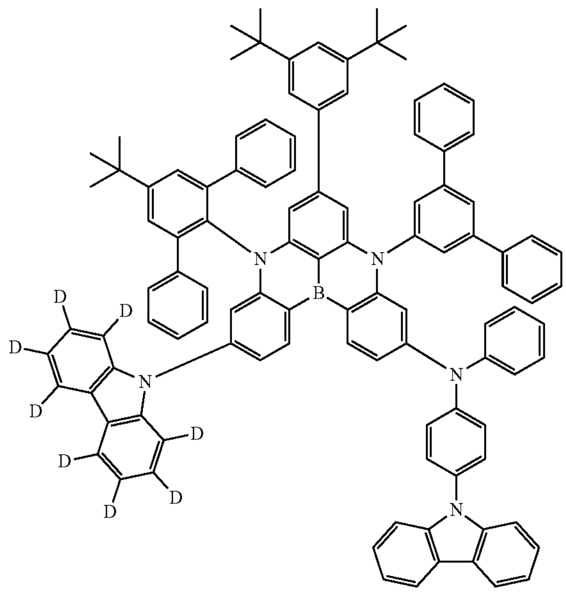
178
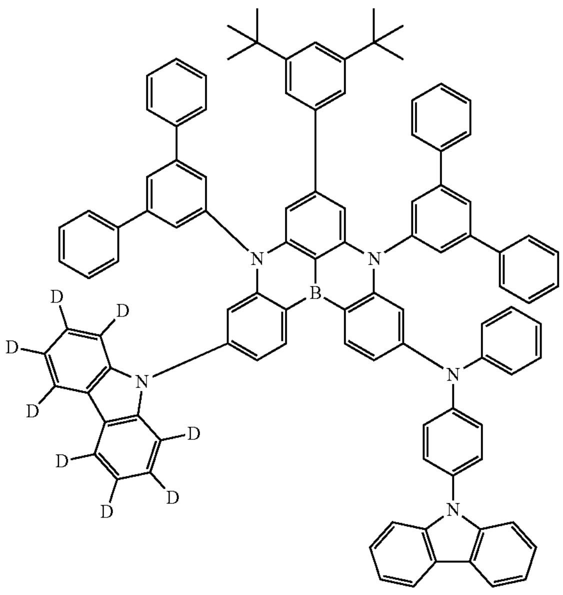

-continued
179
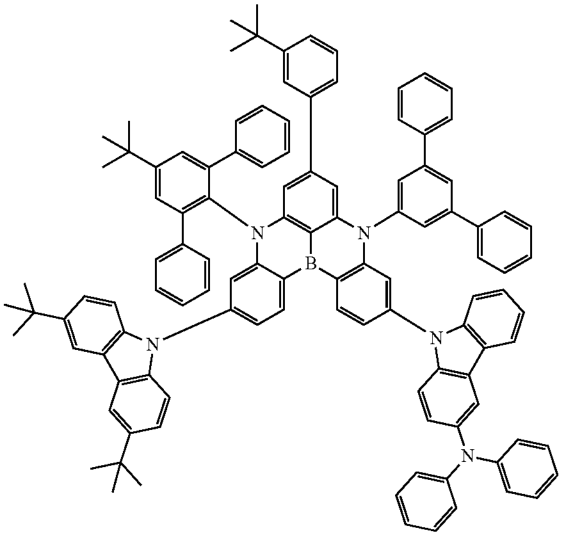
180
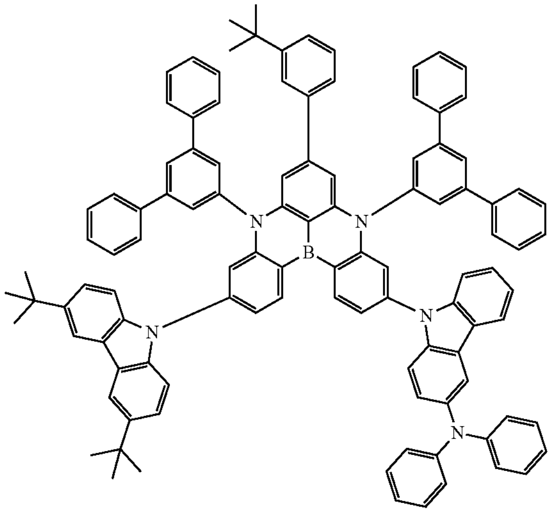
181
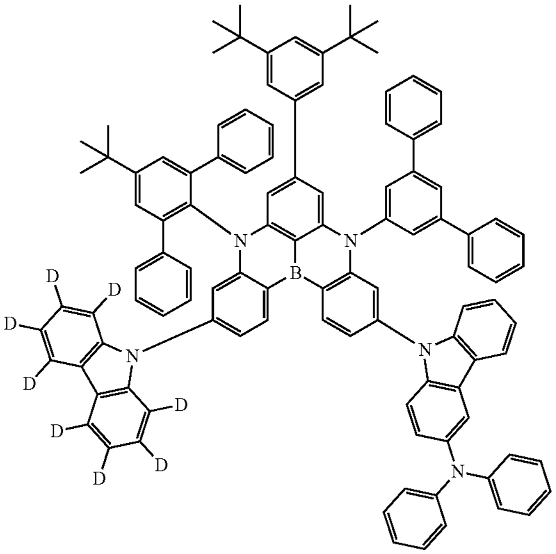
182
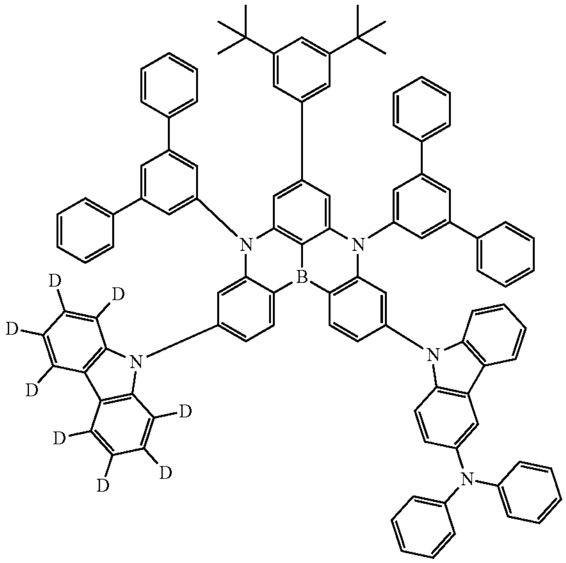

-continued
183
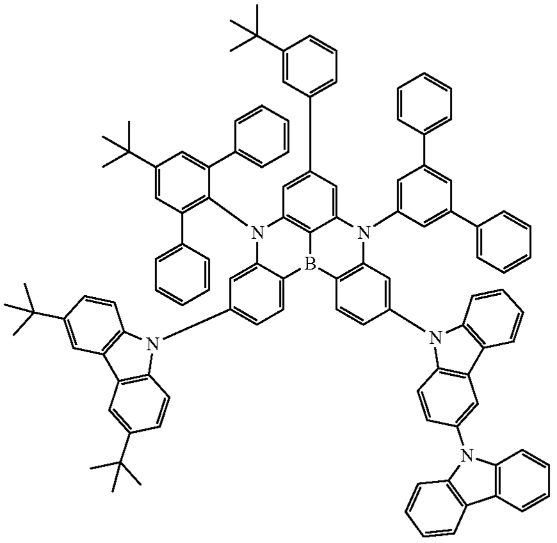
184
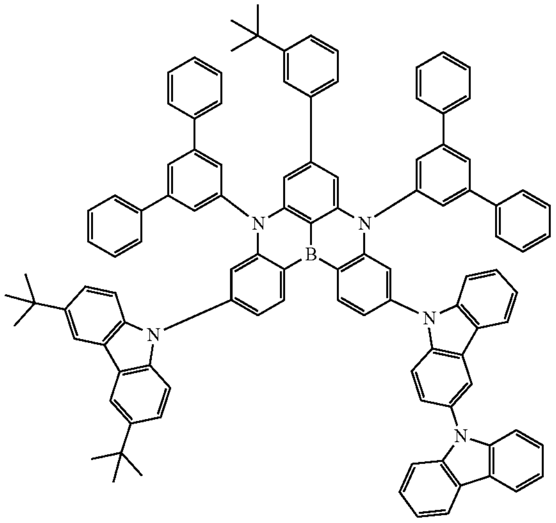
185
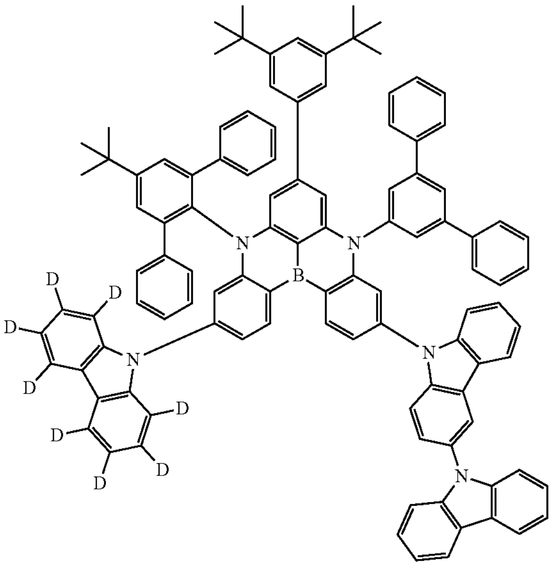
186
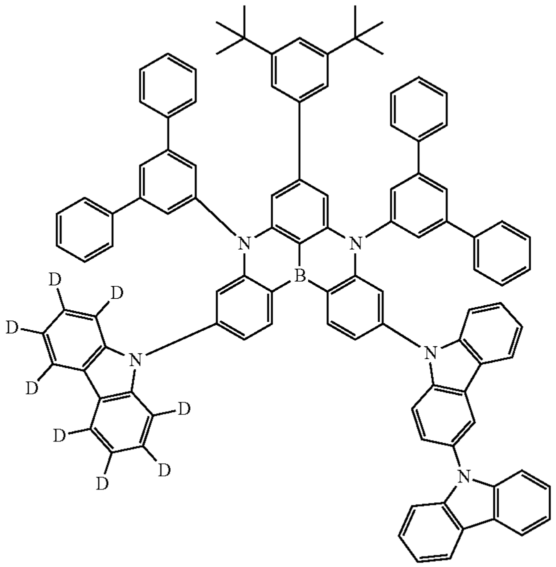

-continued
187
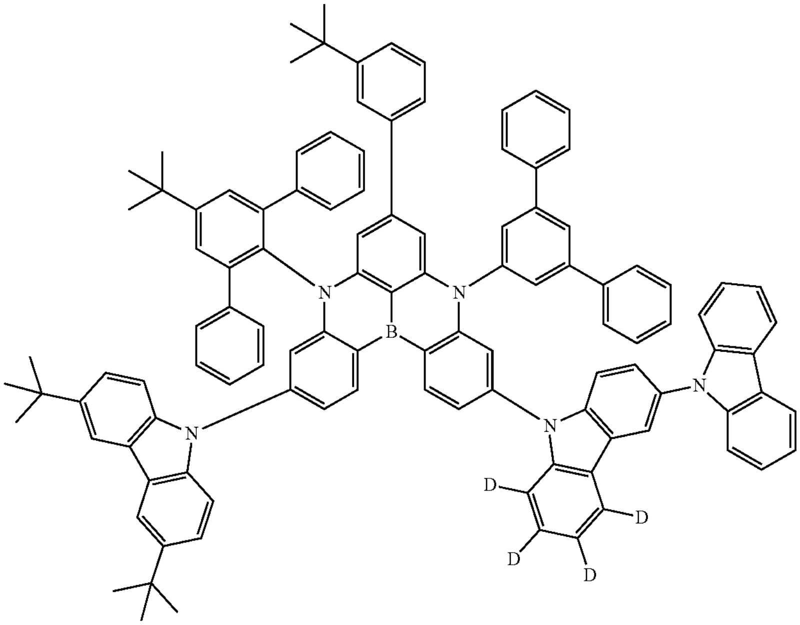
188
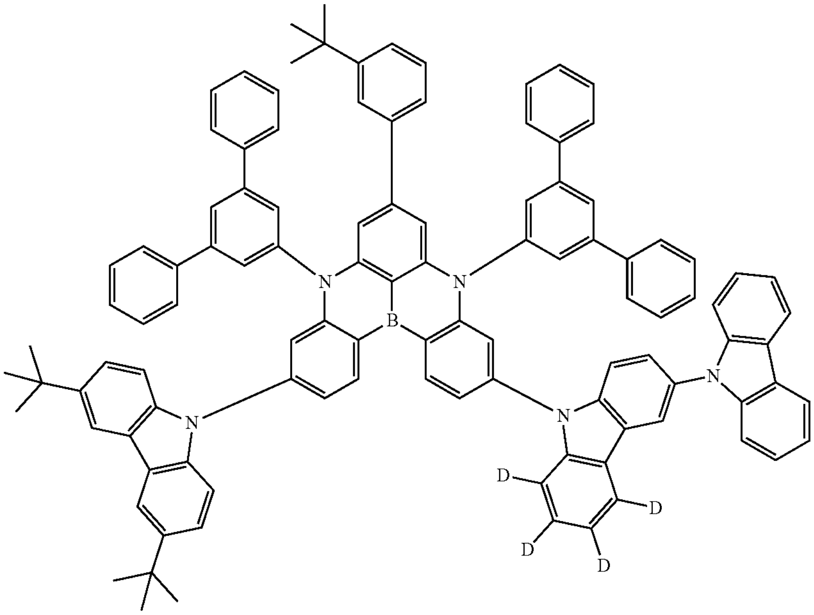

-continued
189
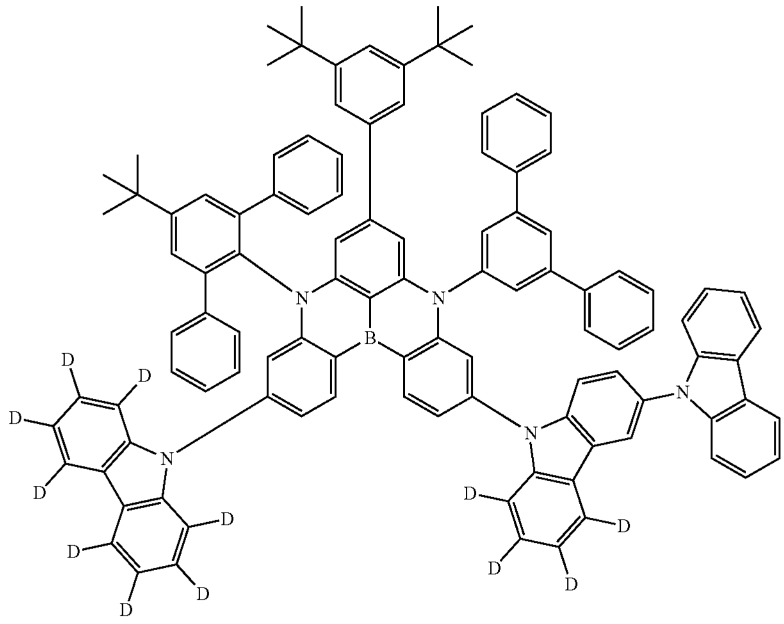
190
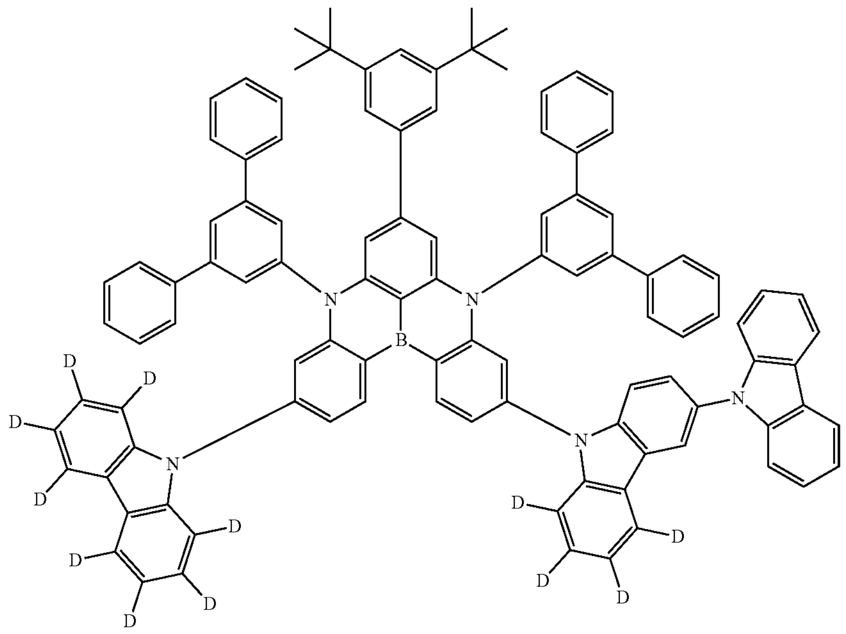

-continued
191
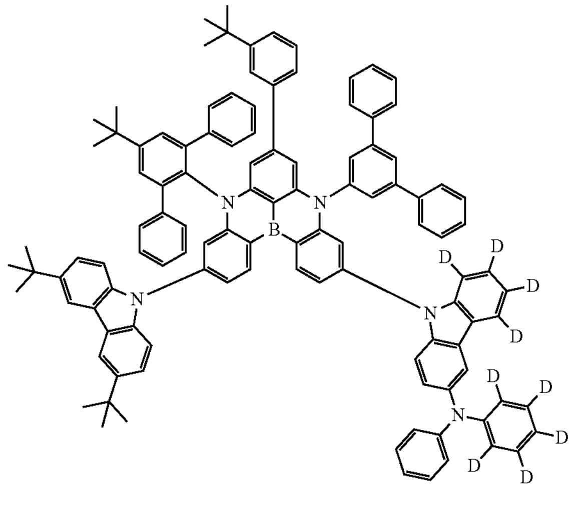
192
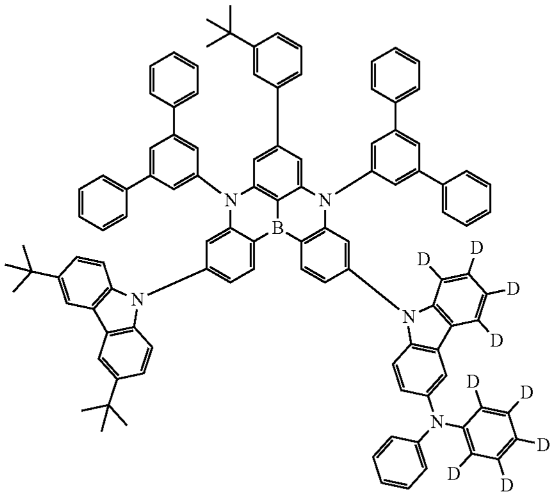
193
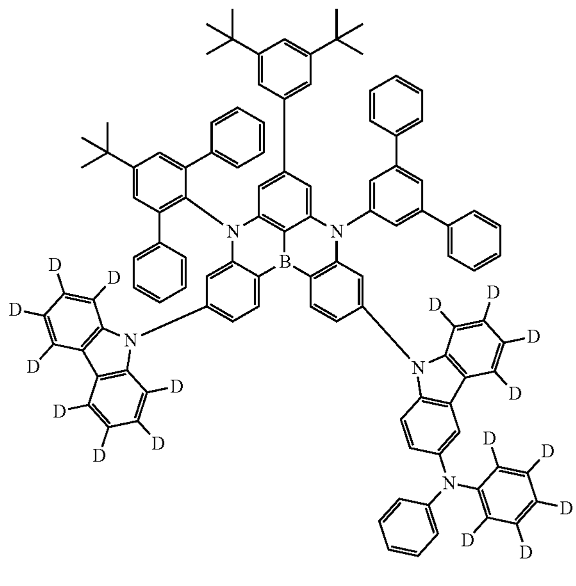
194
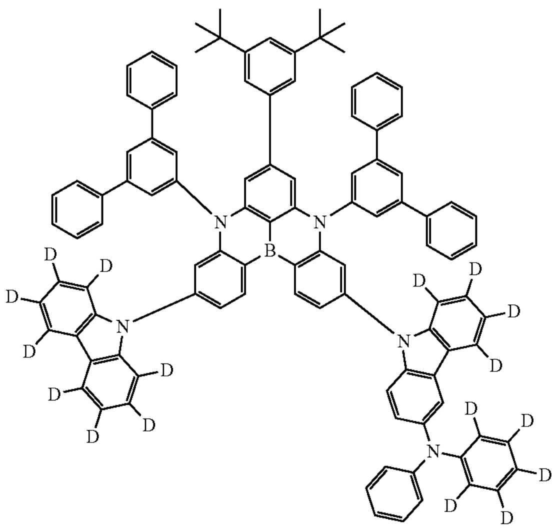

-continued
195
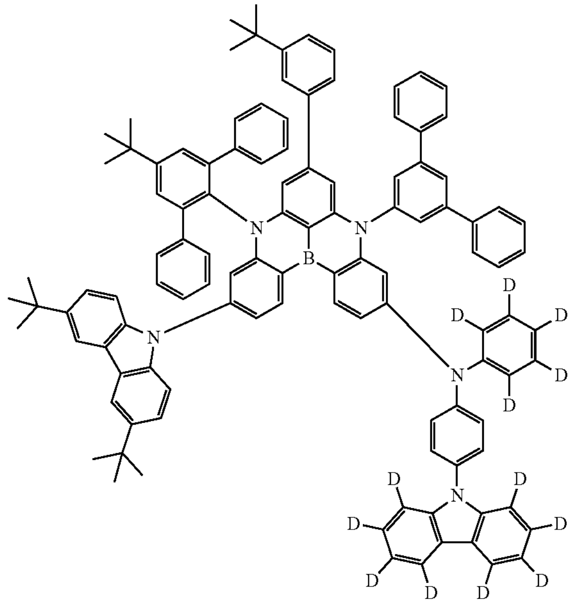
196
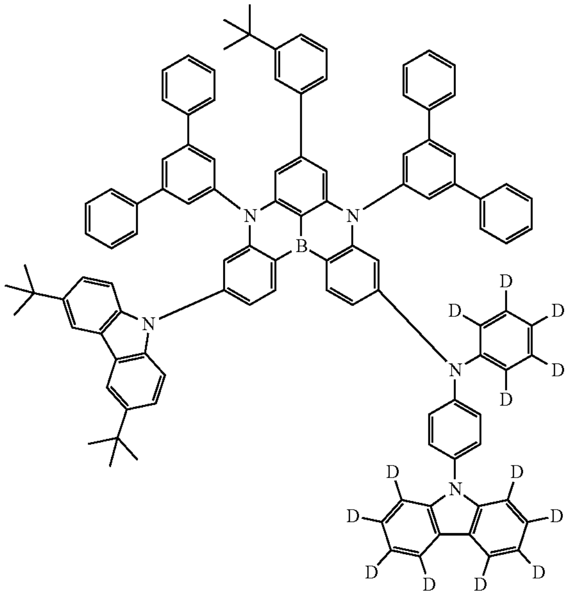
197
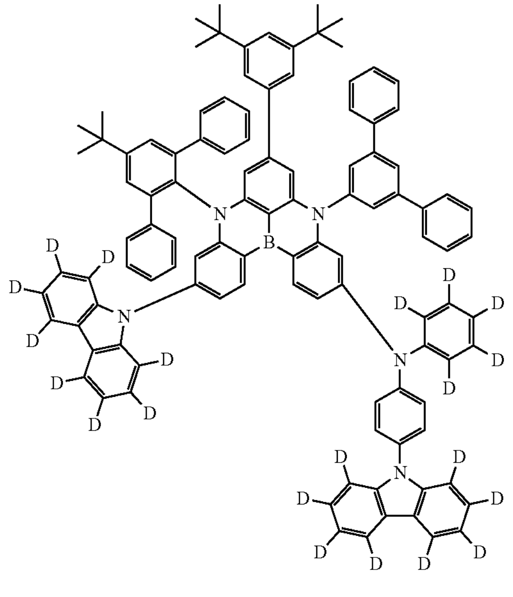
198
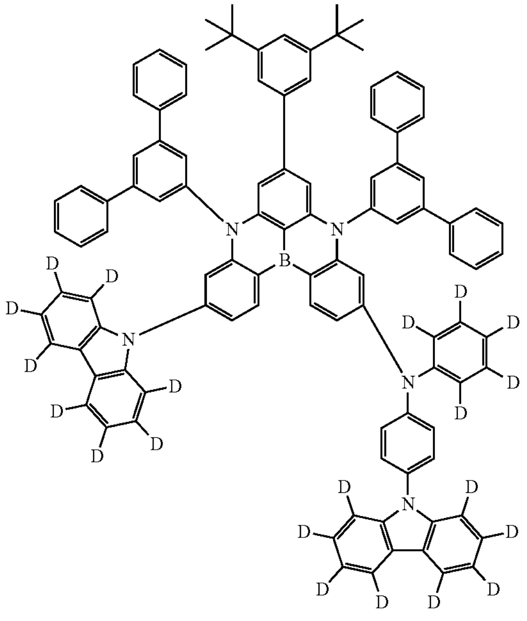

-continued
199
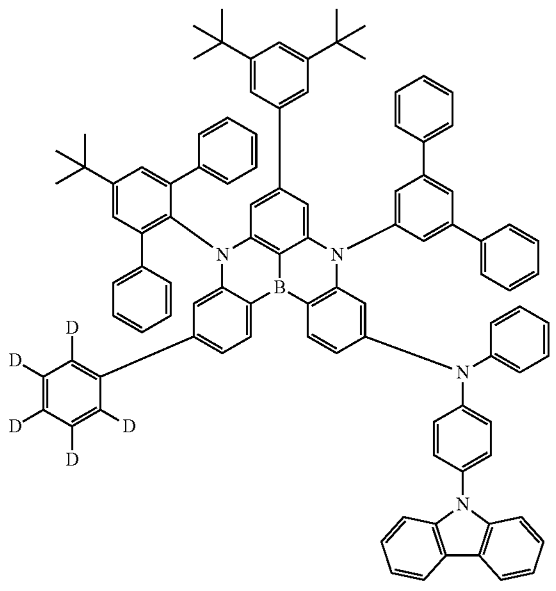
200
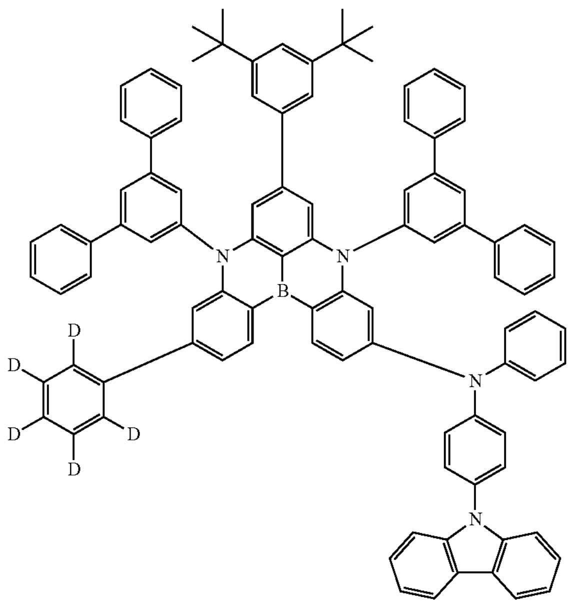
201
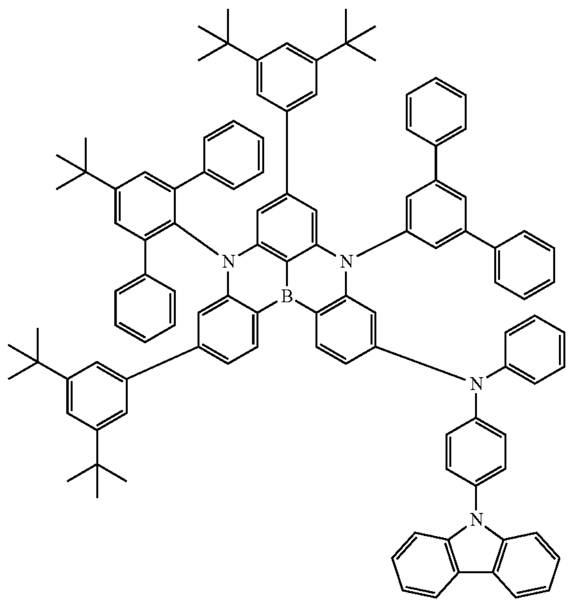
202
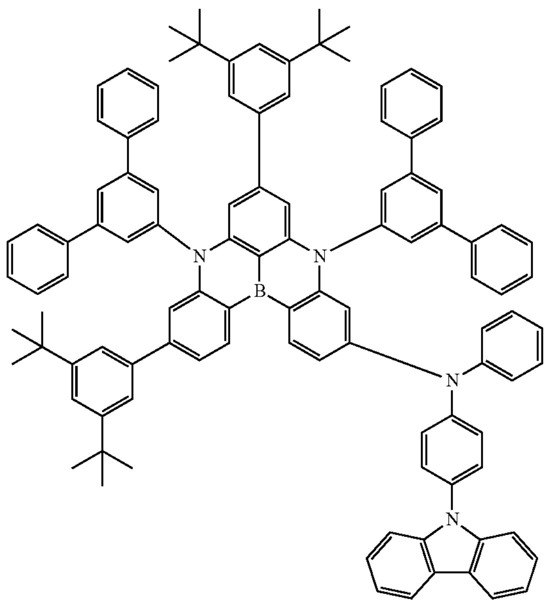

-continued
203
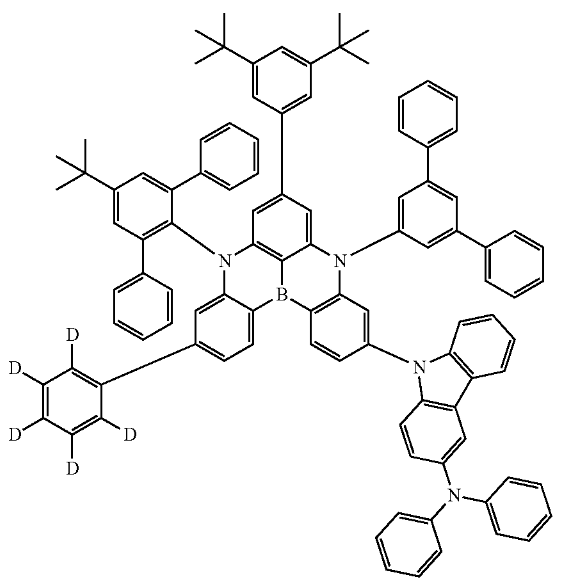
204
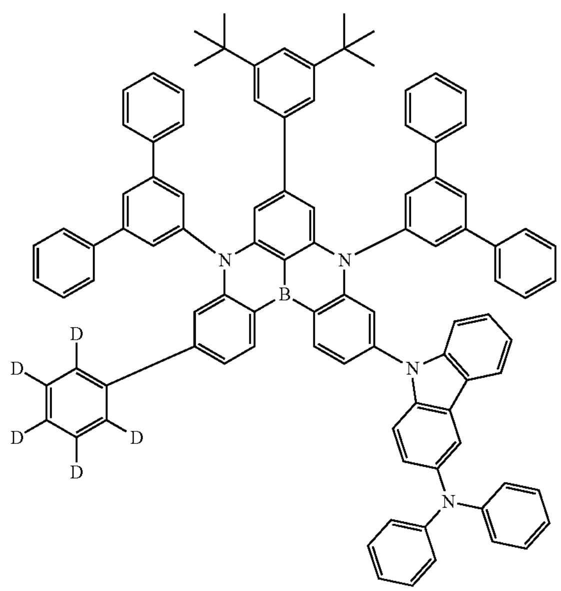
205
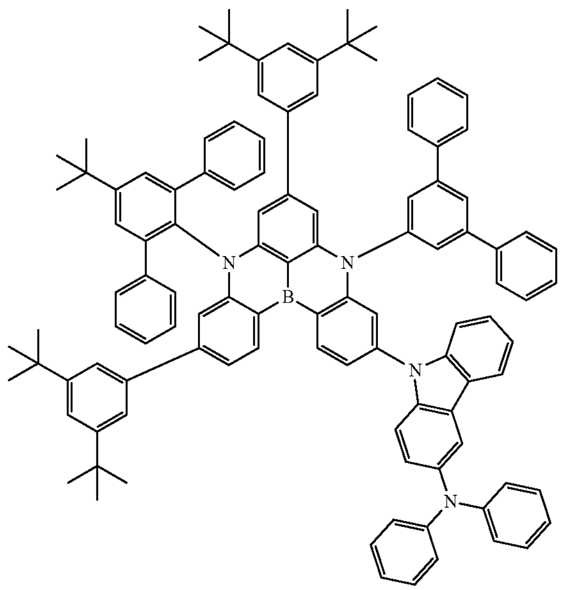
206
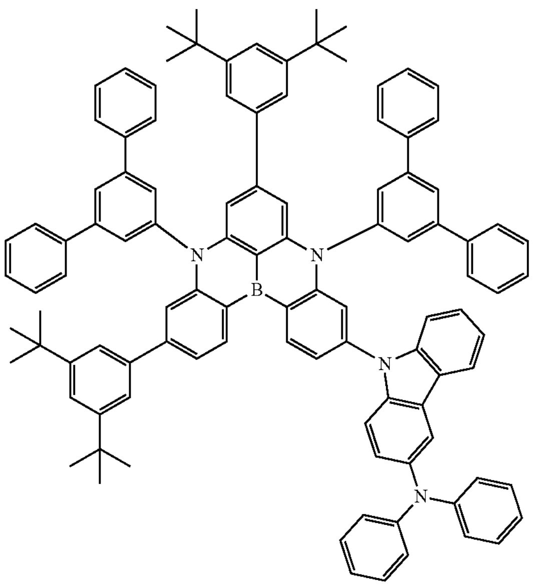

-continued
207
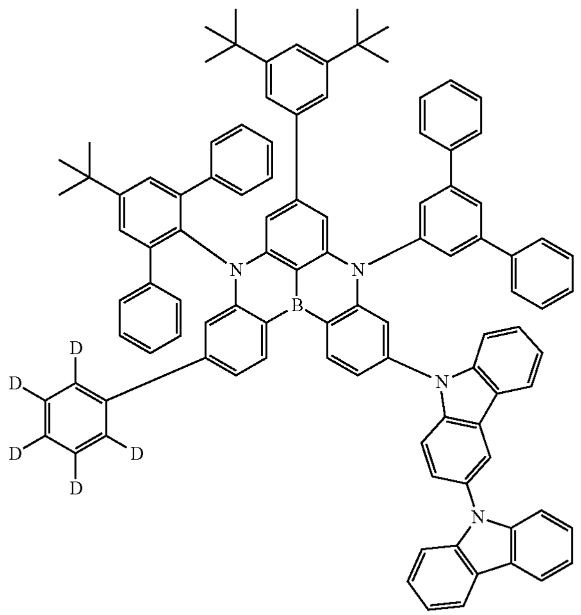
208
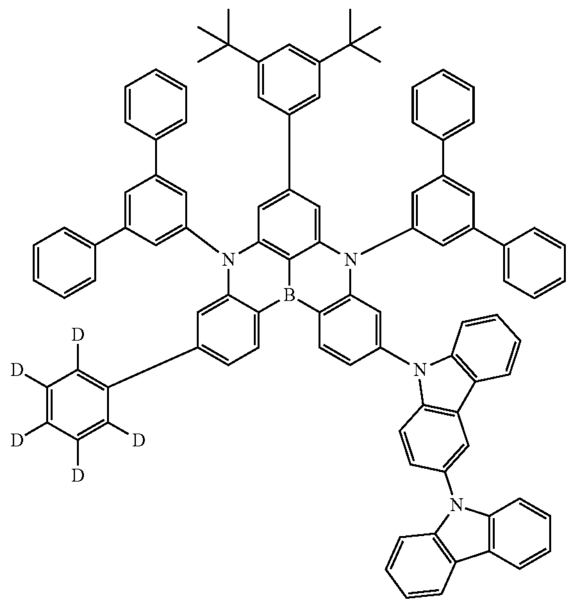
209
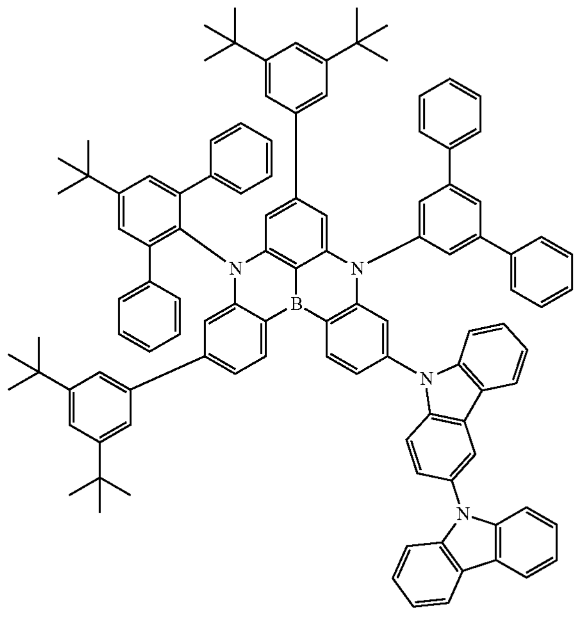
210
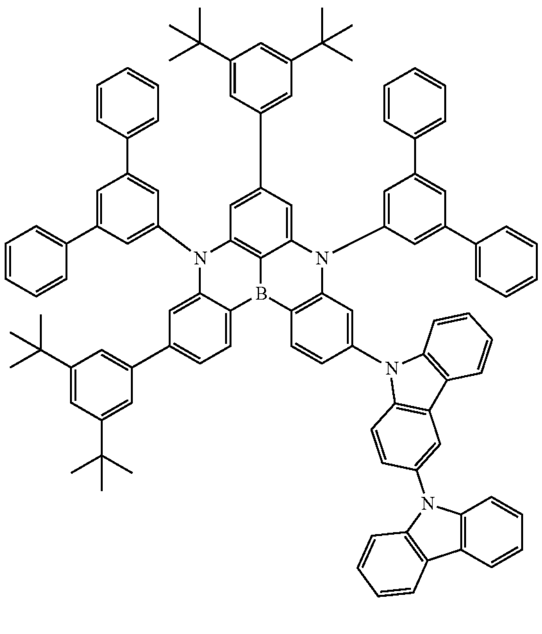

-continued
211
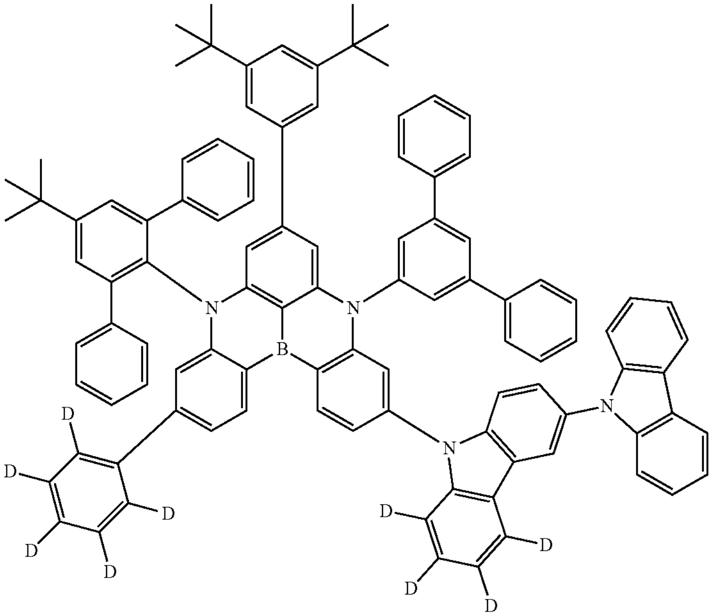
212
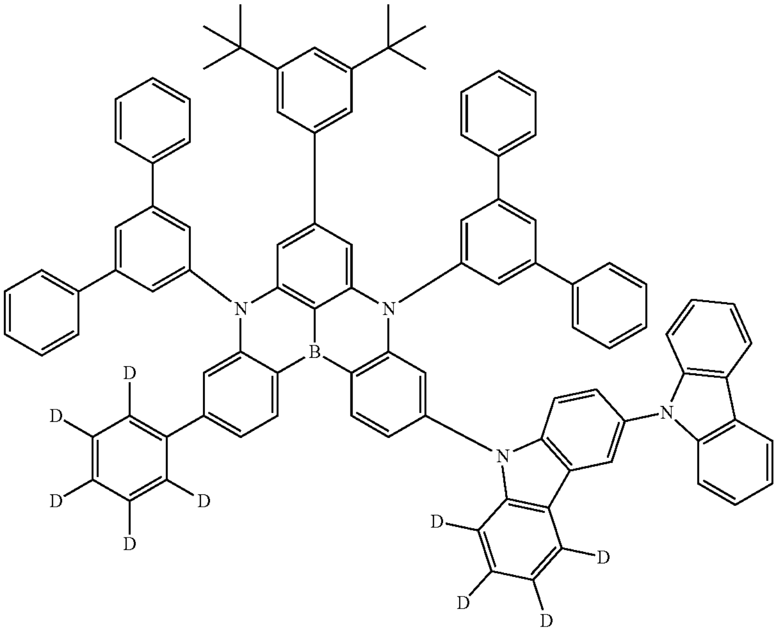

-continued
213
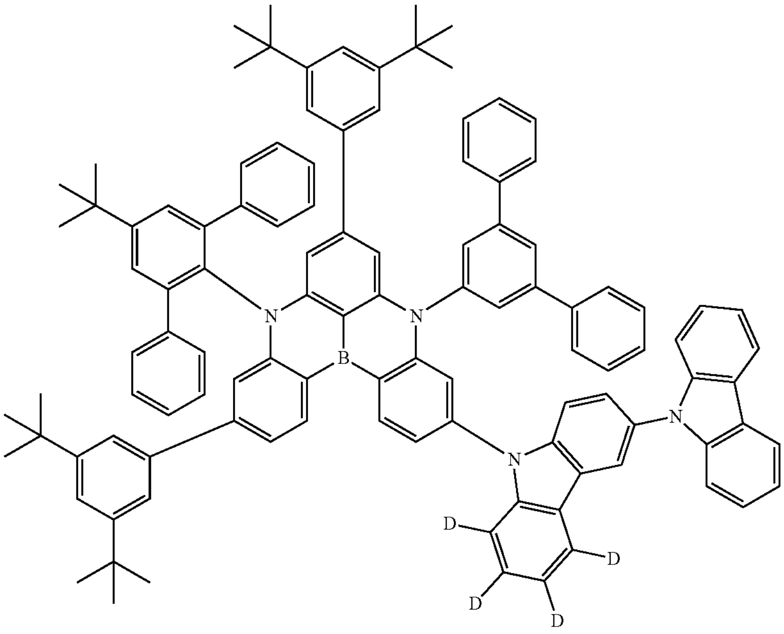
214
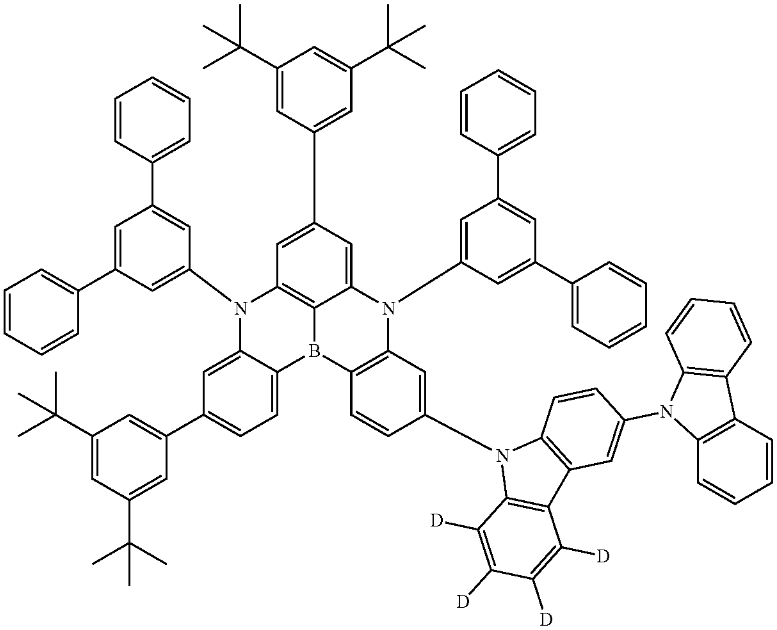

-continued
215
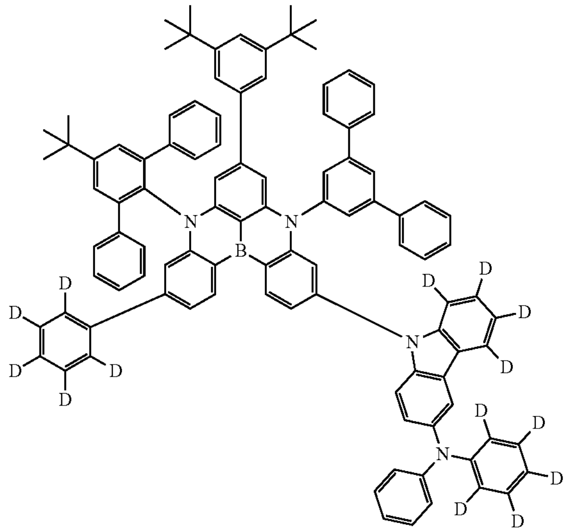
216
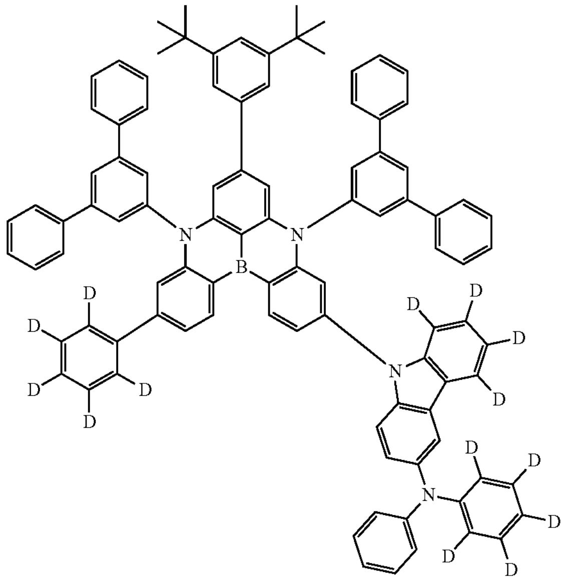
217
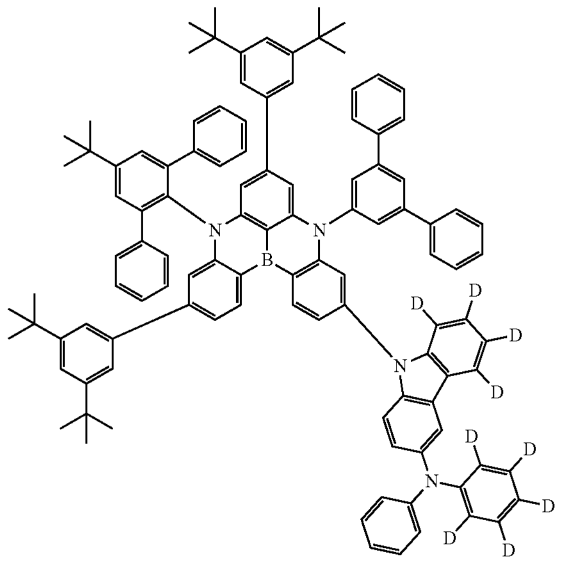
218
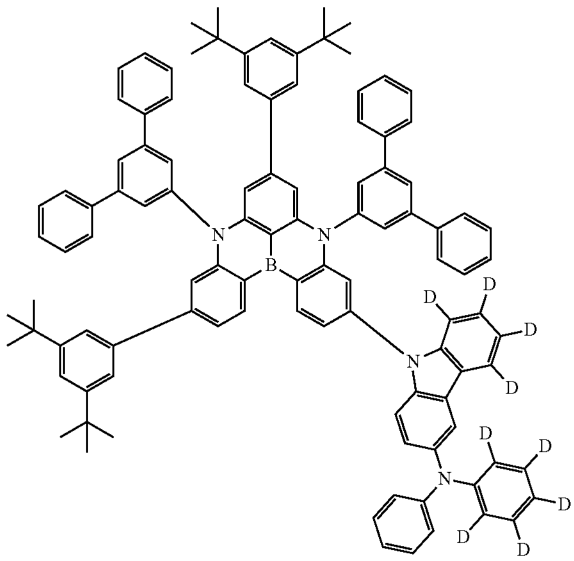

-continued
219
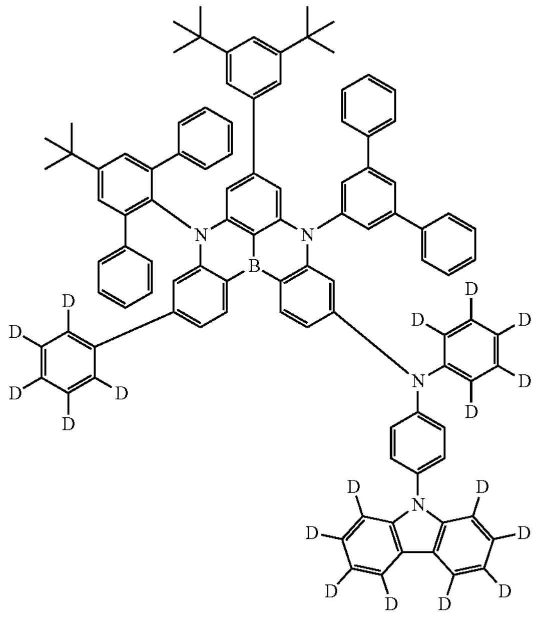
220
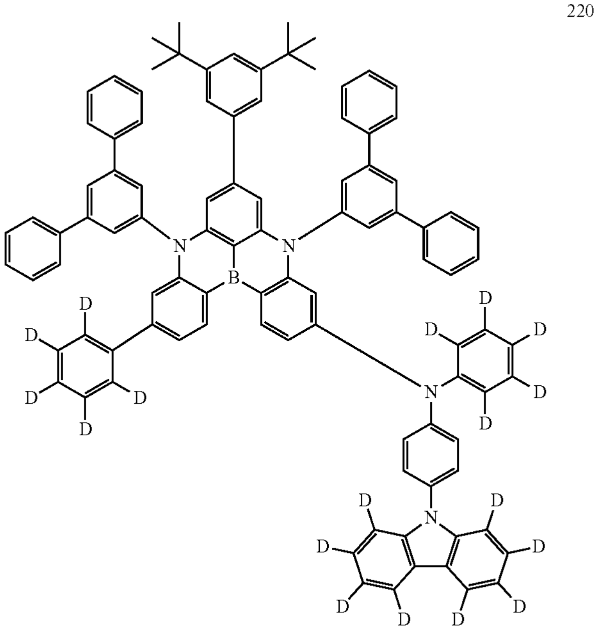
221
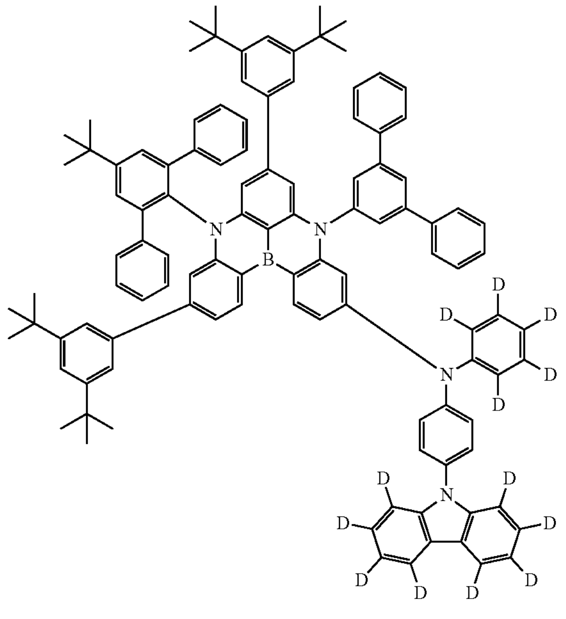
222
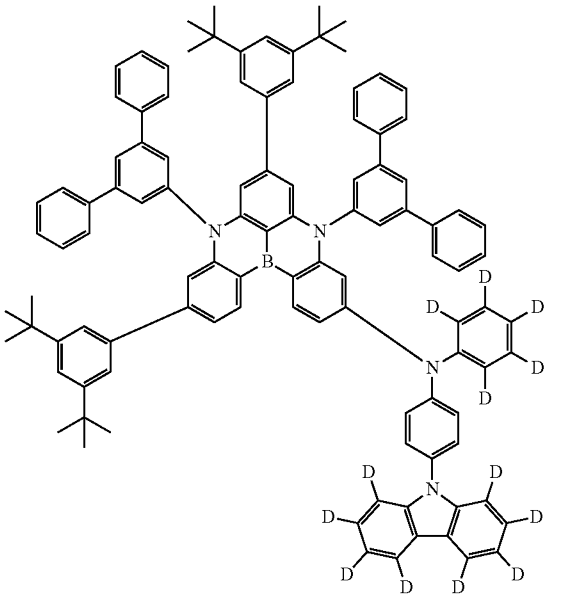

-continued
223
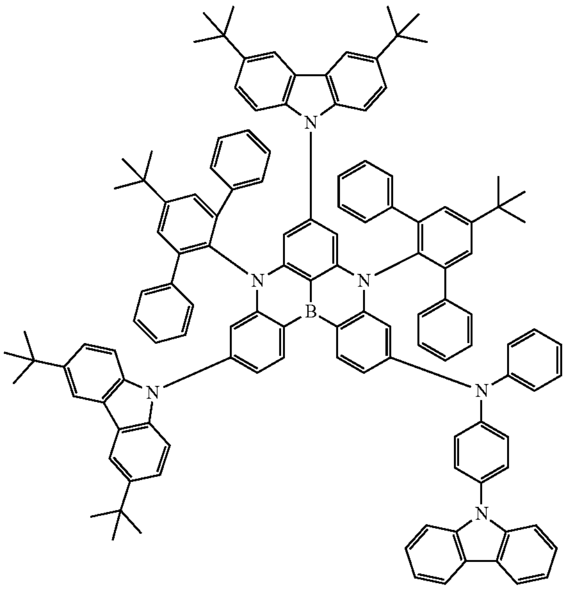
224
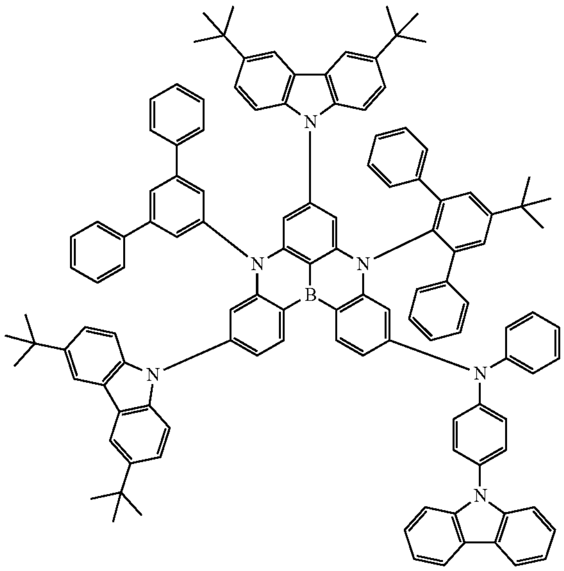
225
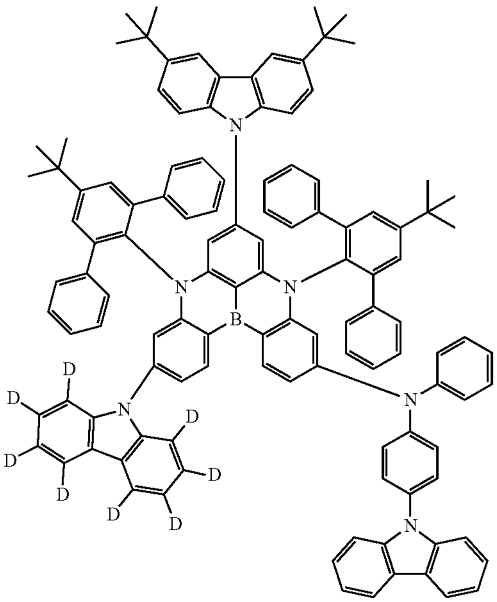
226
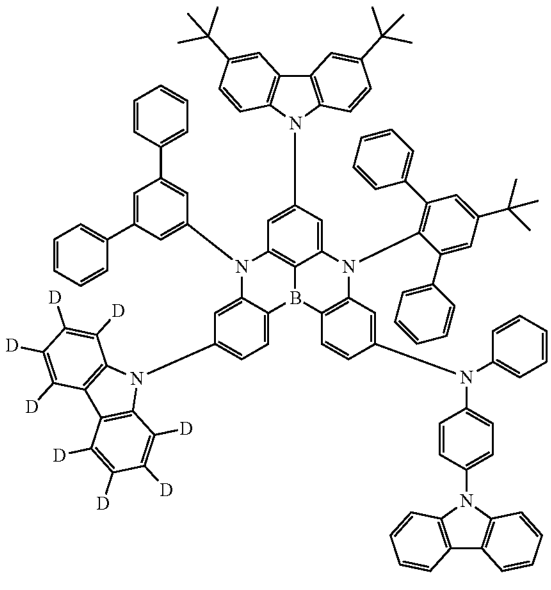

-continued
227
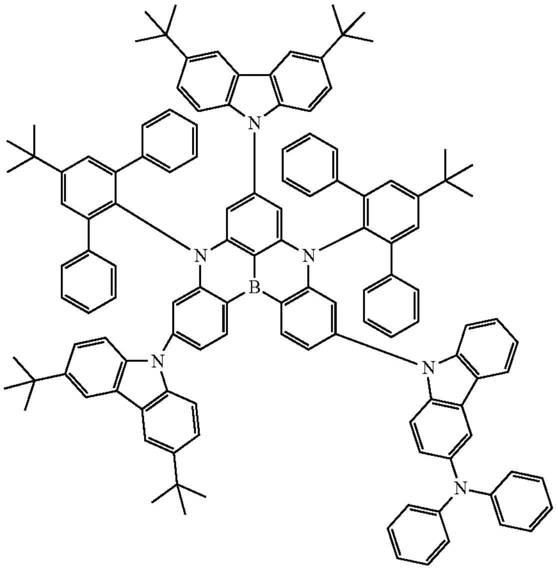
228
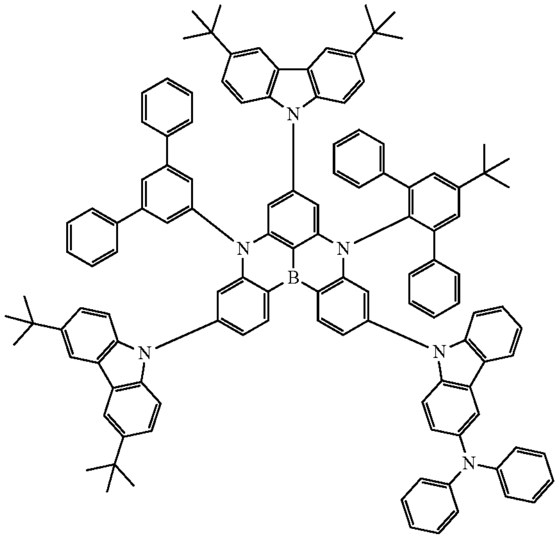
229
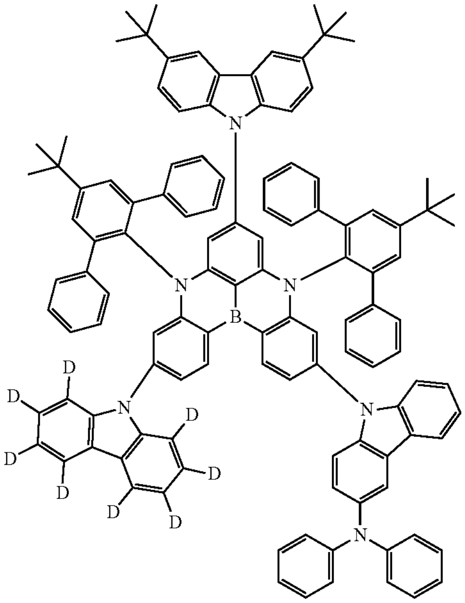
230
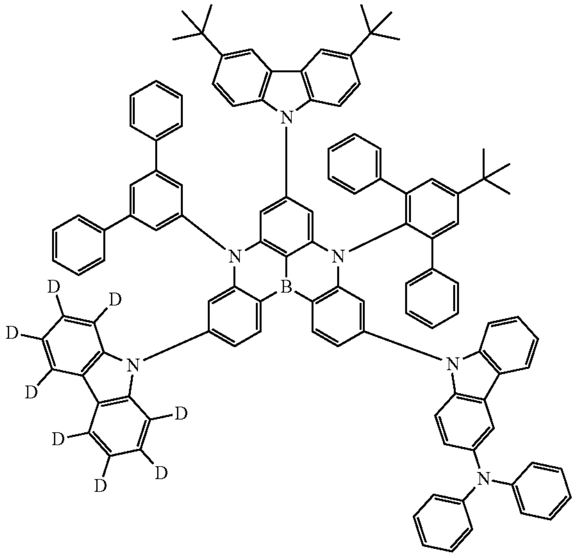

-continued
231
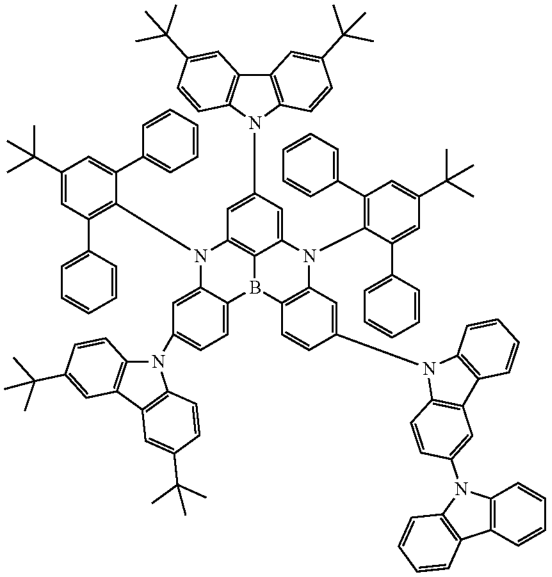
232
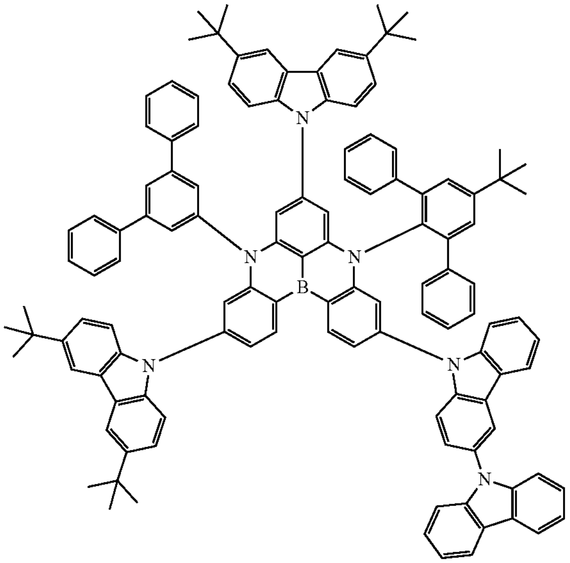
233
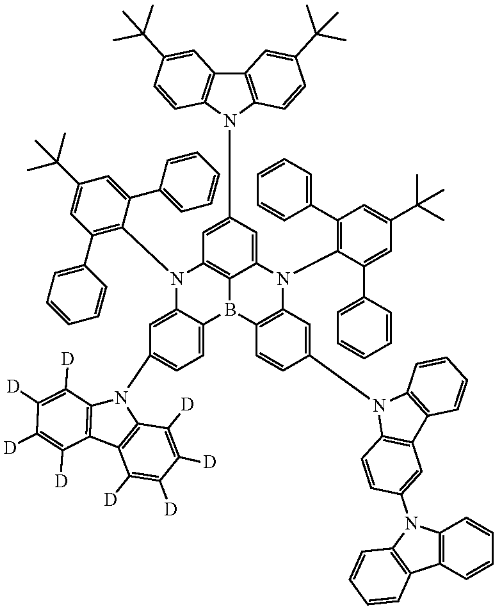
234
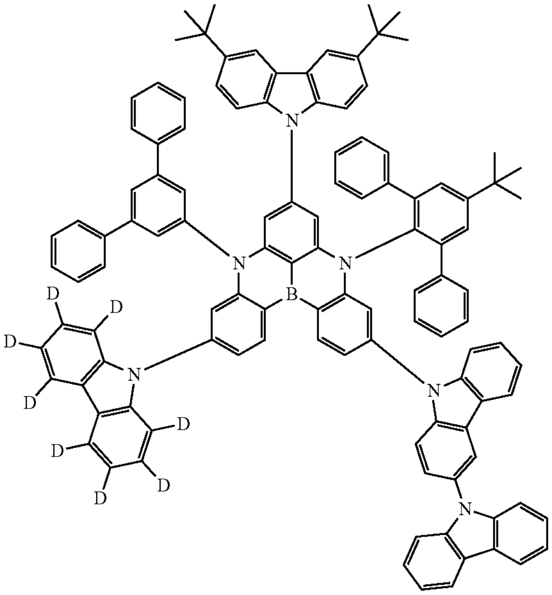

-continued
235
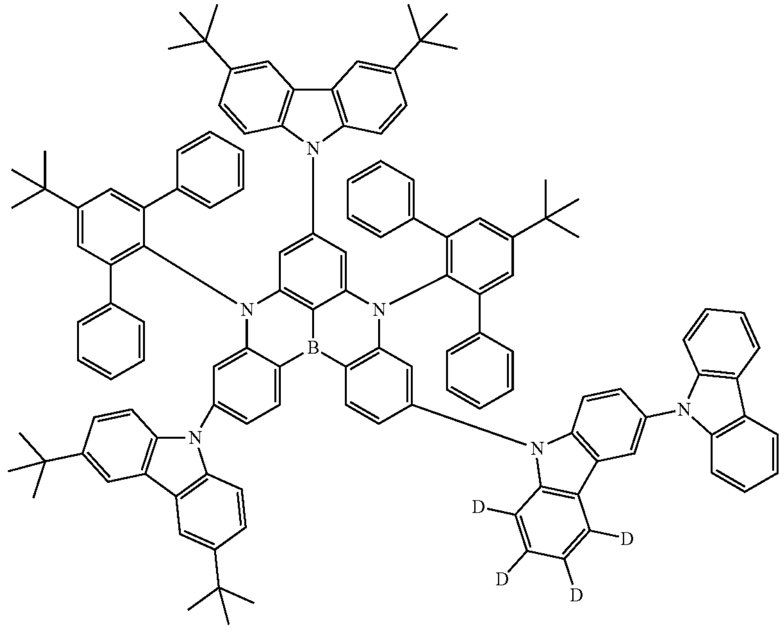
236
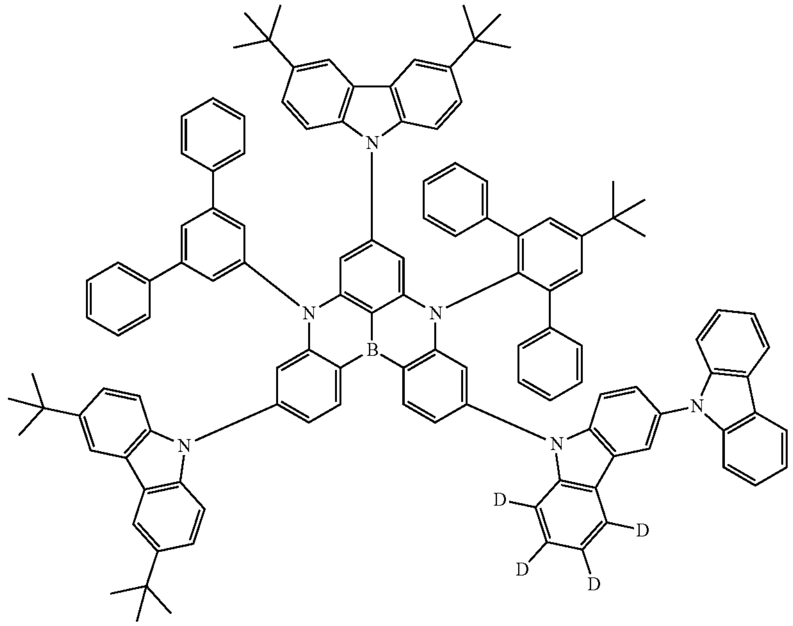

-continued
237
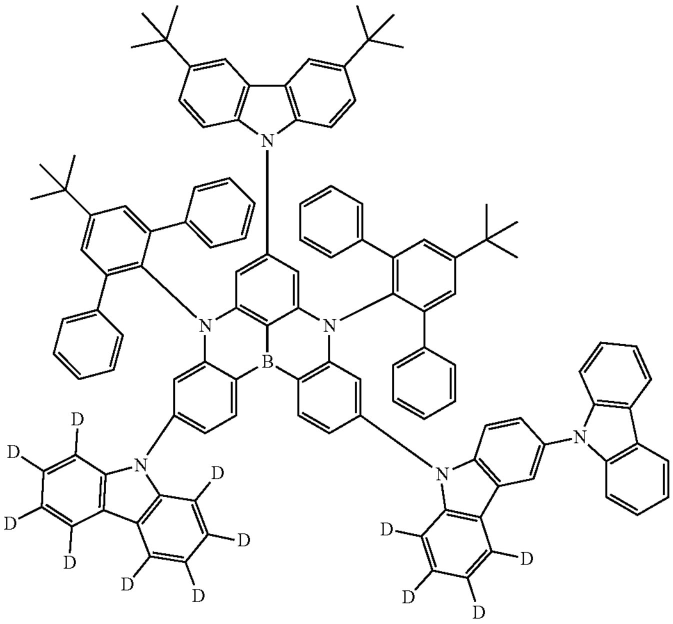
238
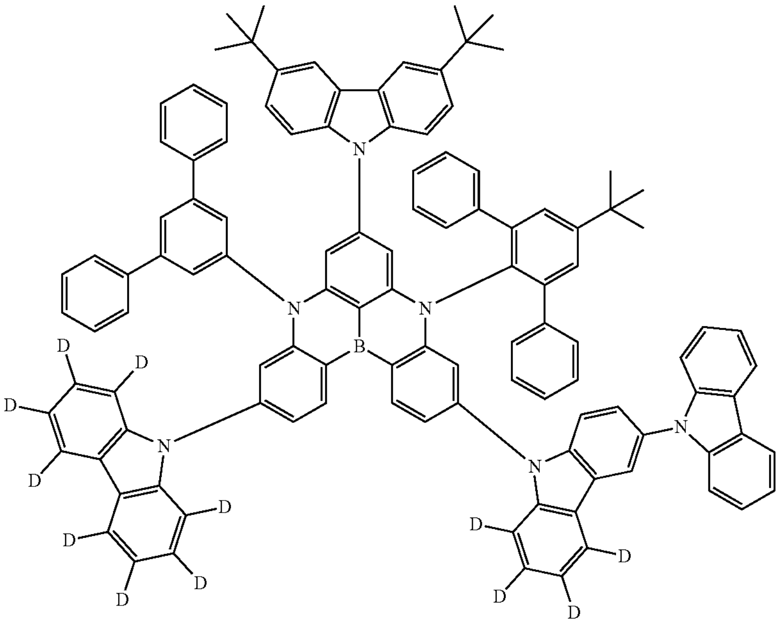

-continued
239
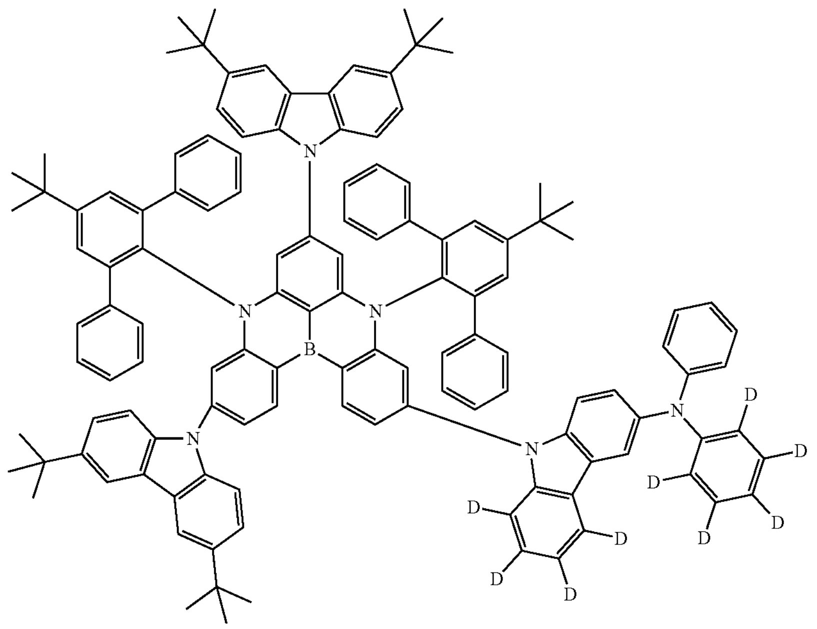
240
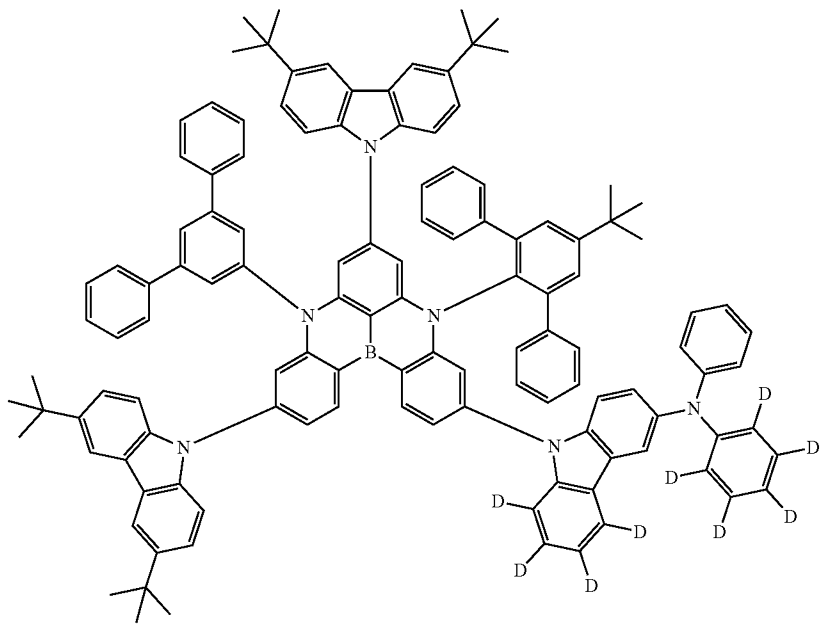

-continued
241
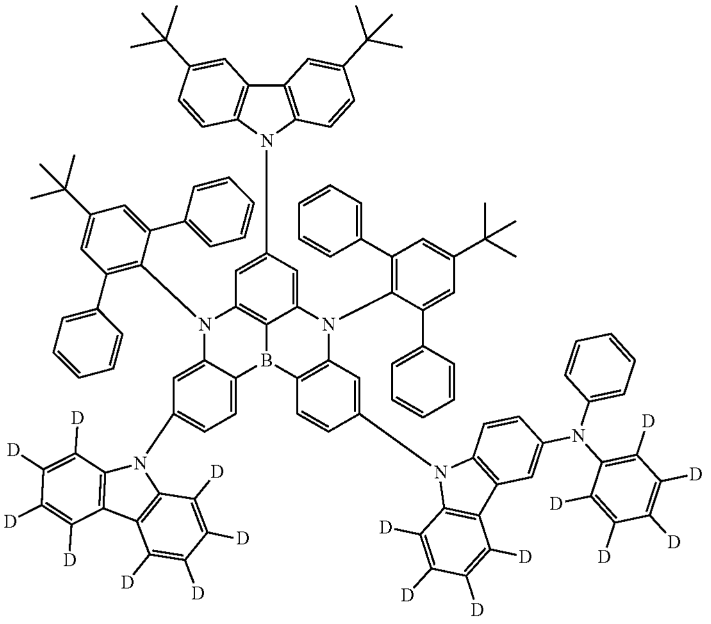
242
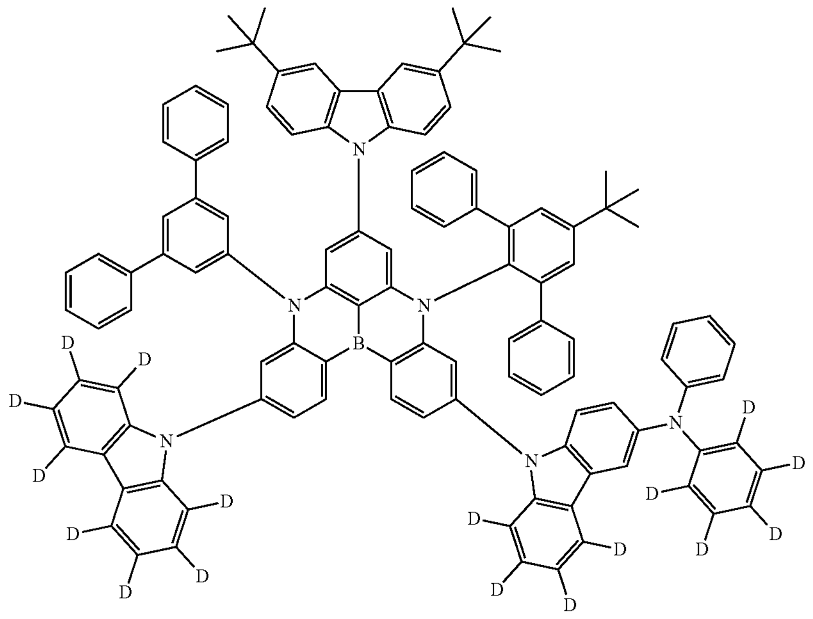

-continued
243
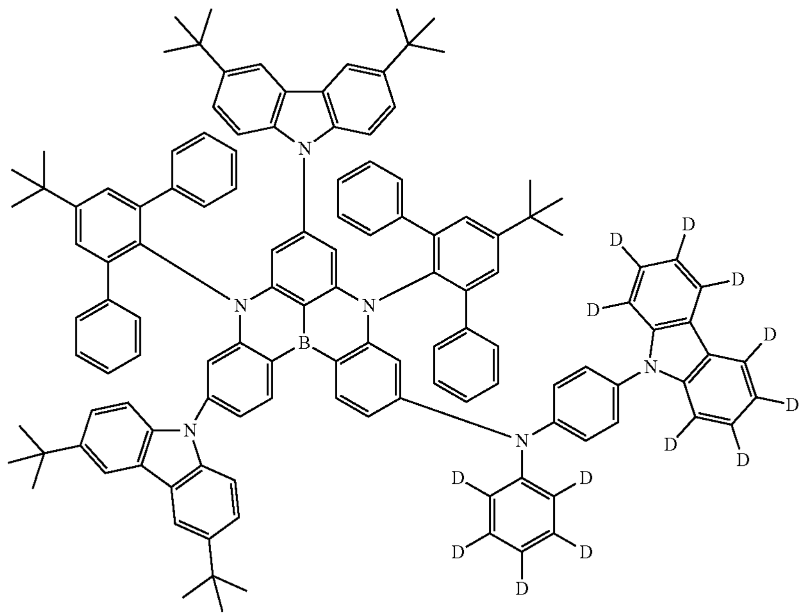
244
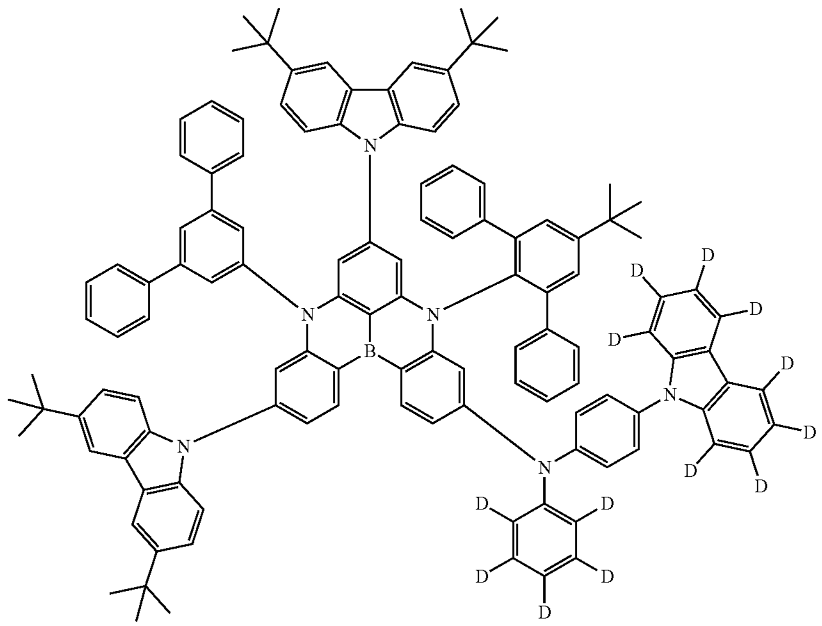

-continued
245
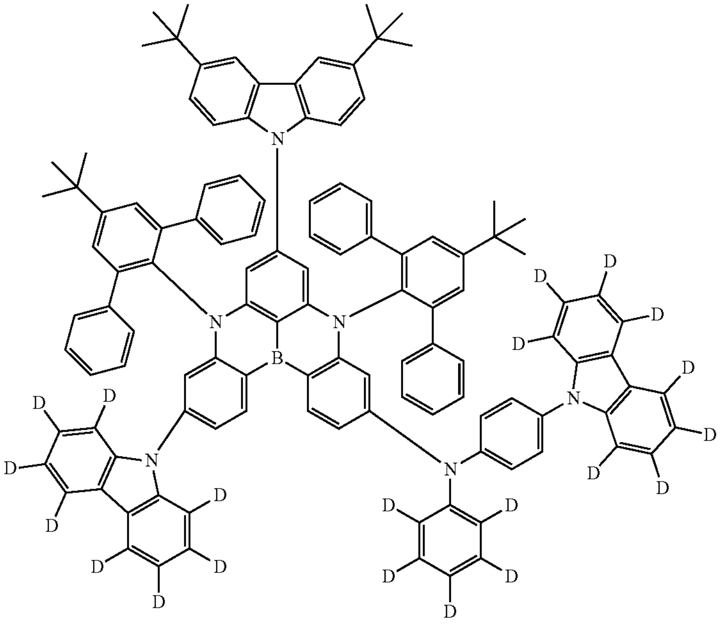
246
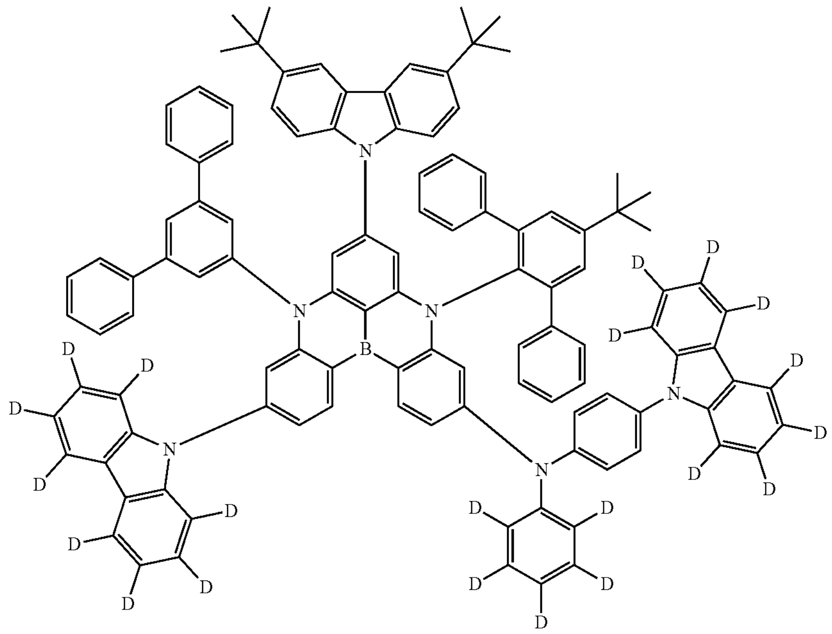

-continued
247
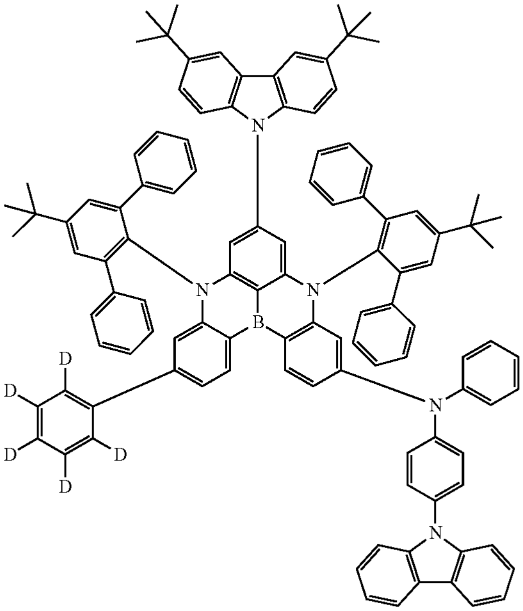
248
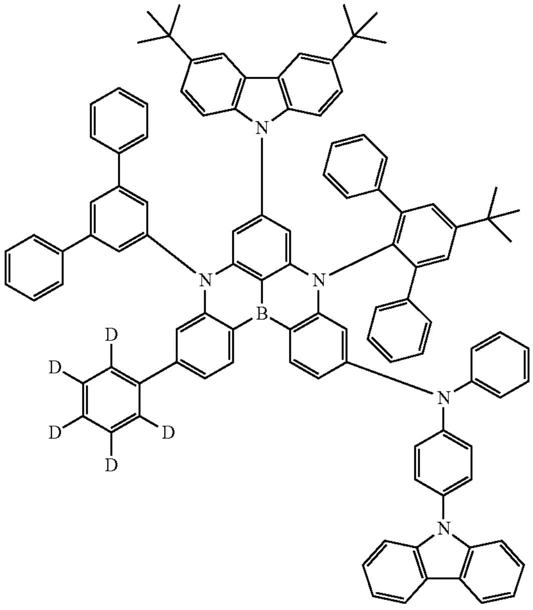
249
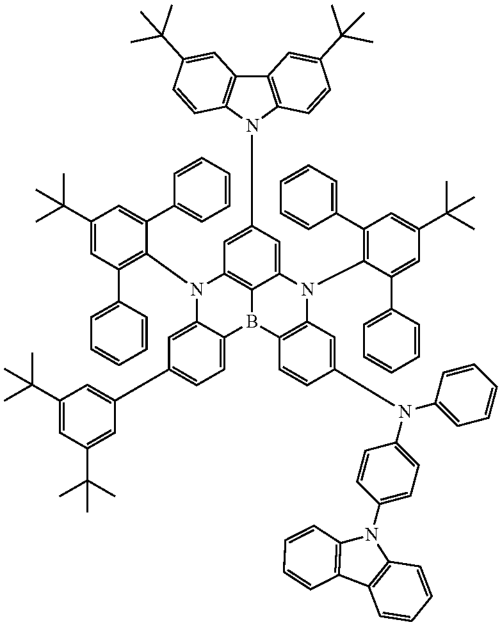
250
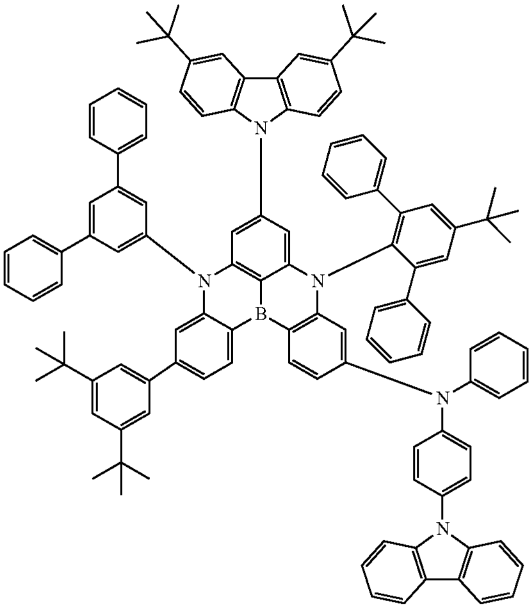

-continued
251
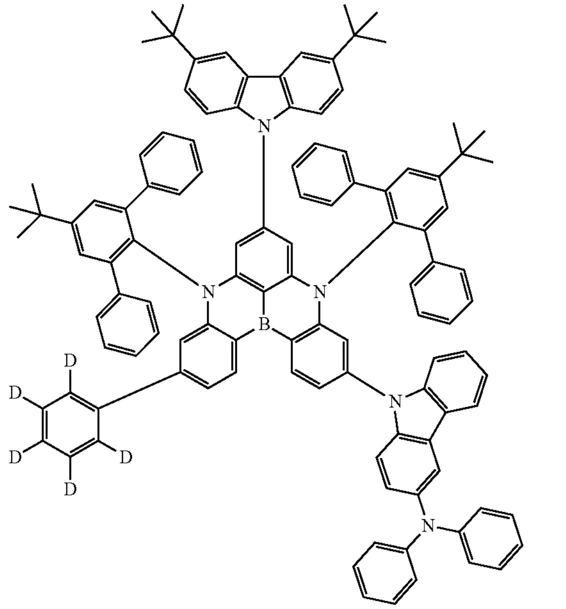
252
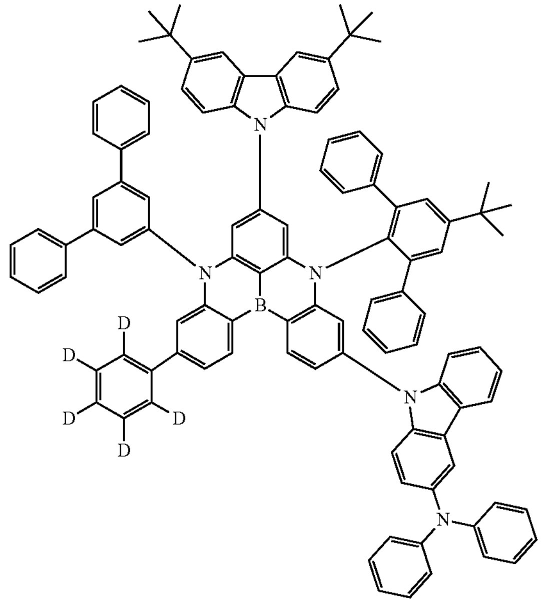
253
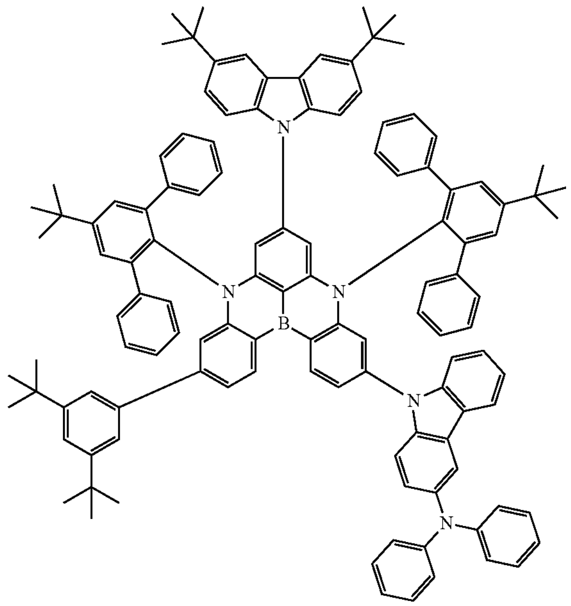
254
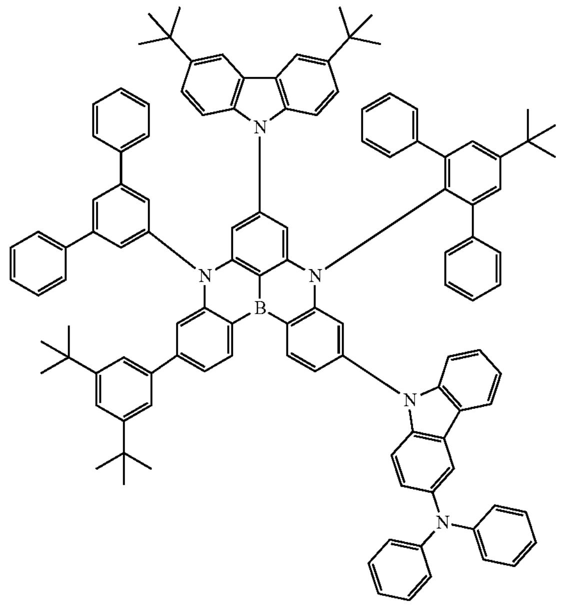

-continued
255
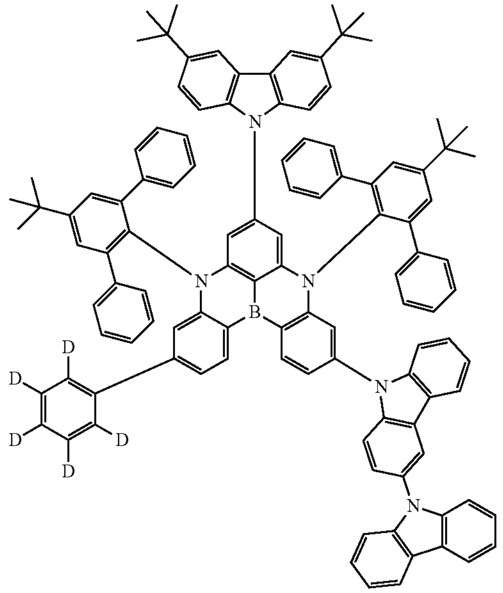
256
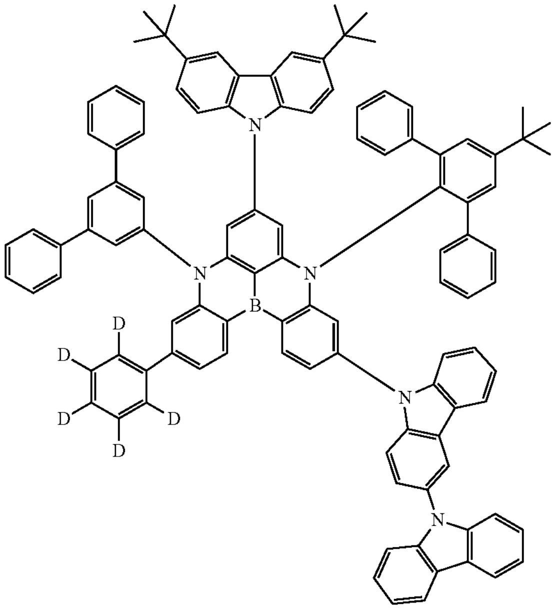
257
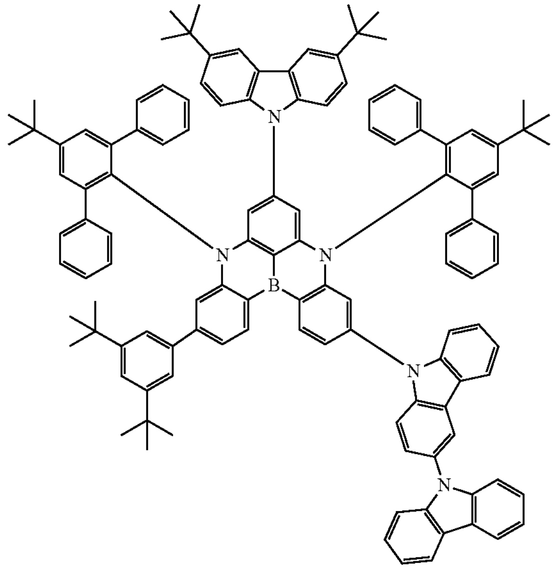
258
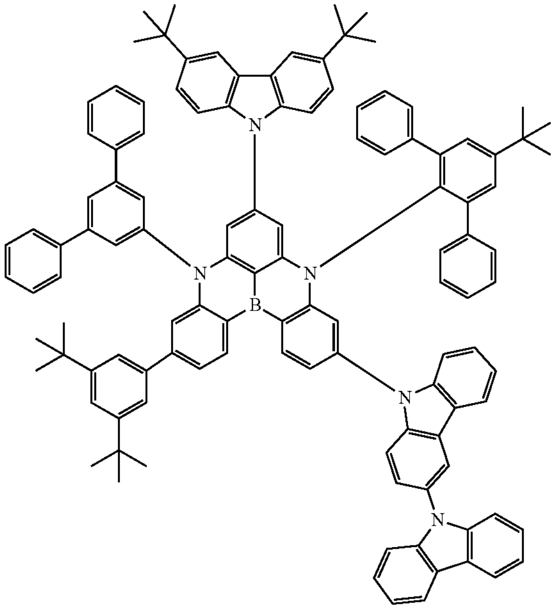

-continued
259
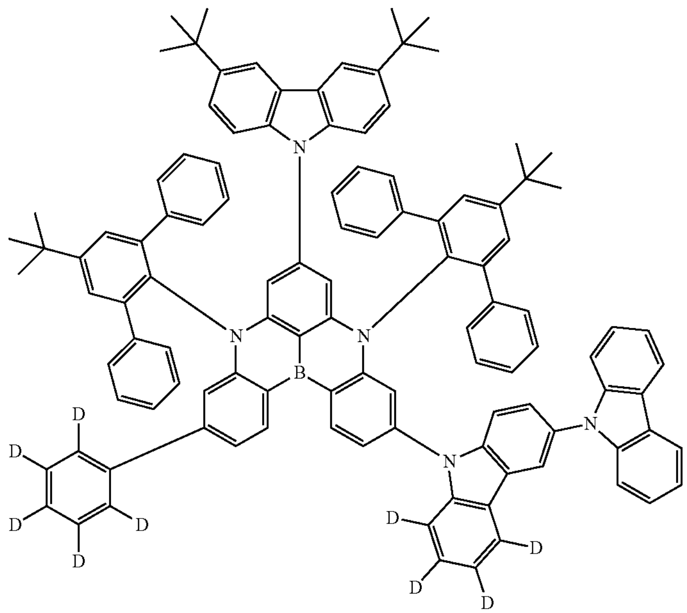
260
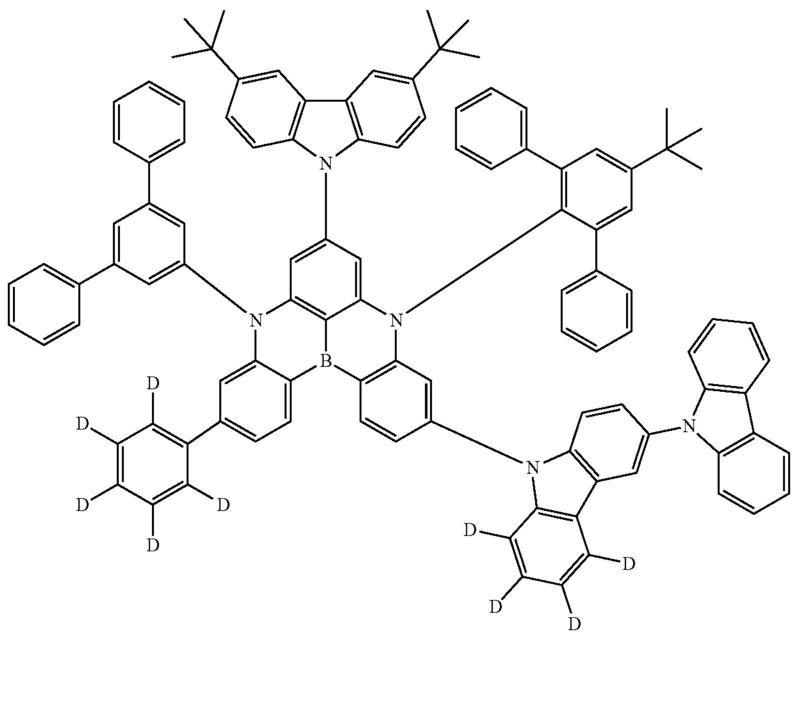

-continued
261
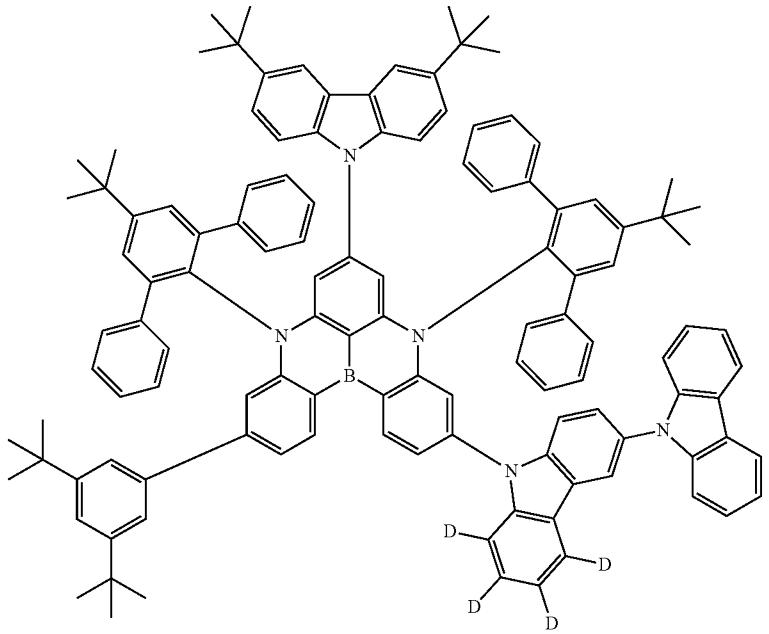
262
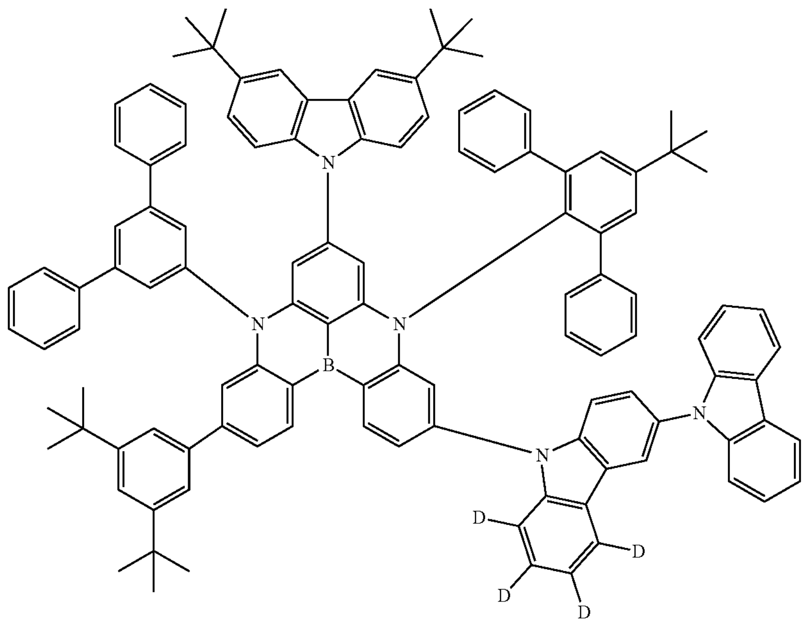

-continued
263
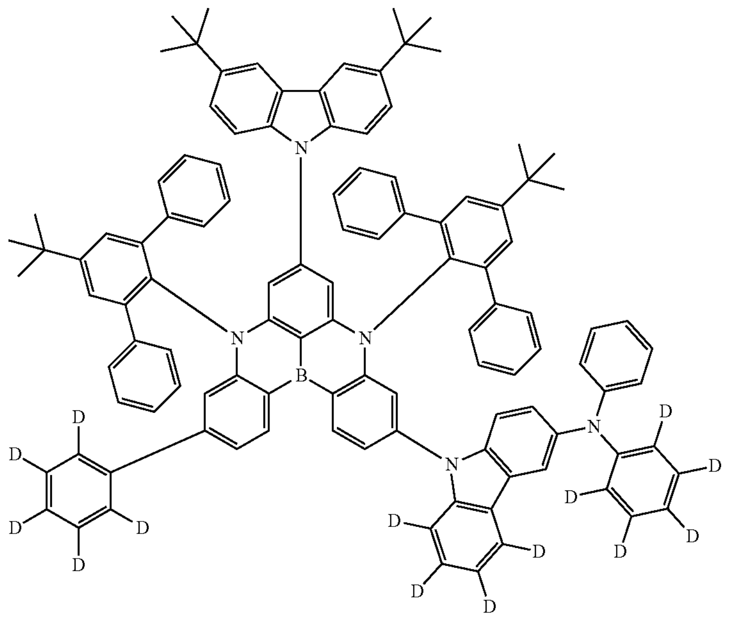
264
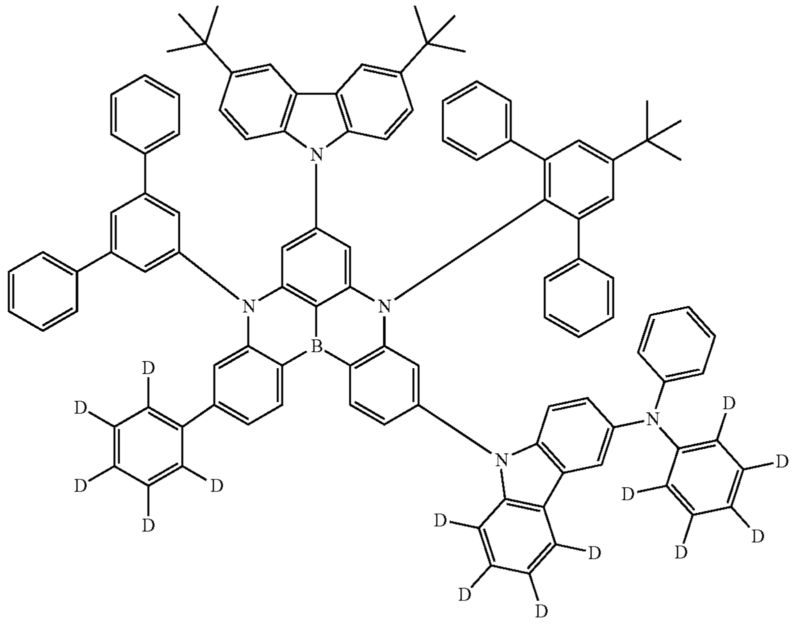

-continued
265
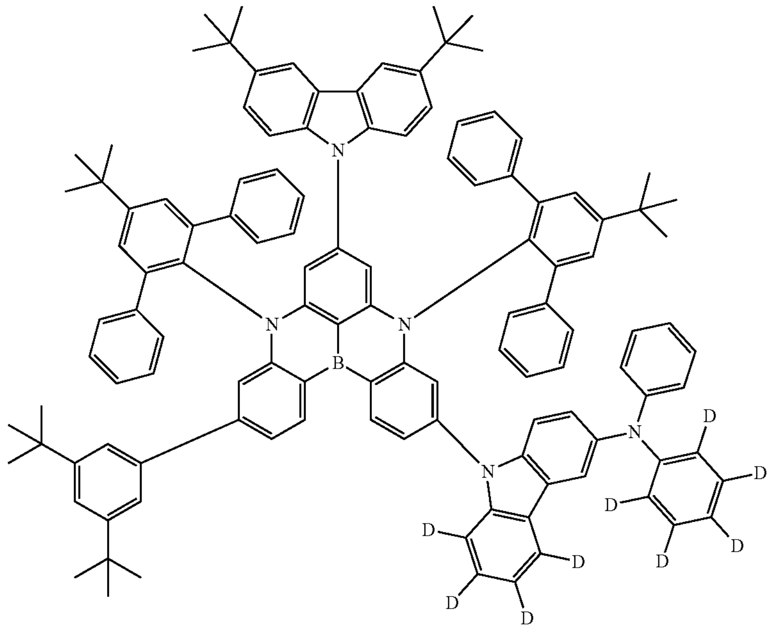
266
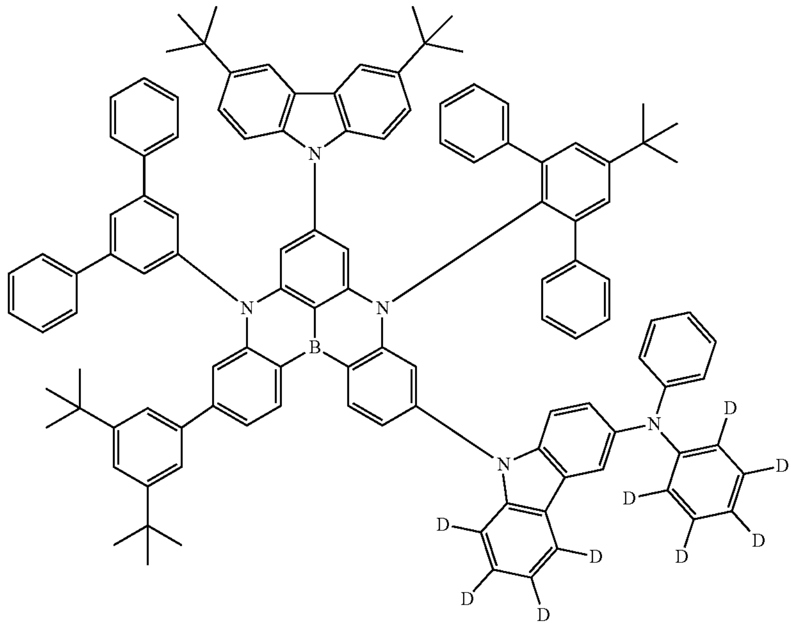

-continued
267
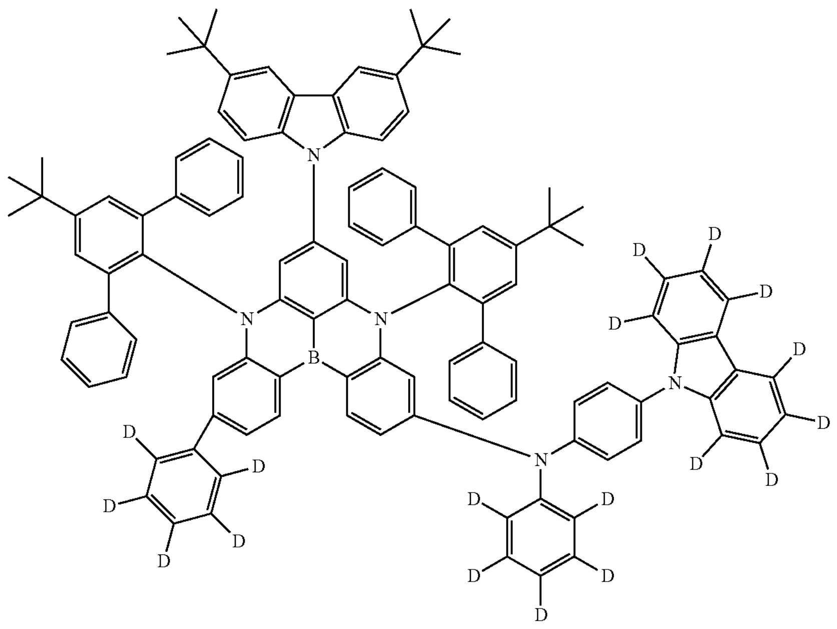
268
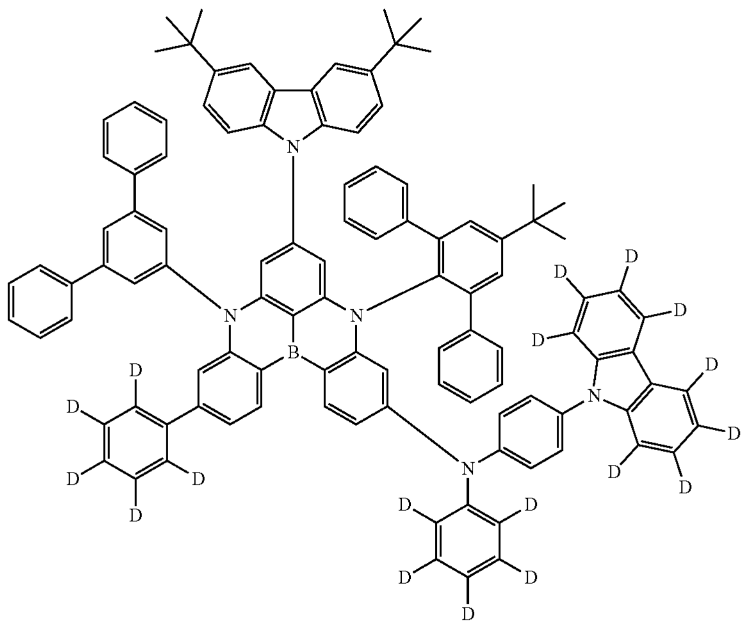

-continued
269
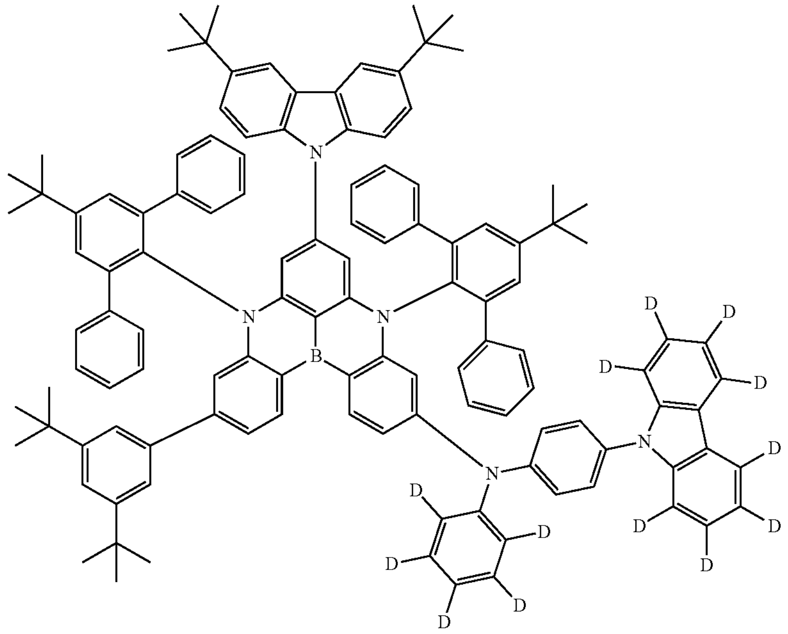
270
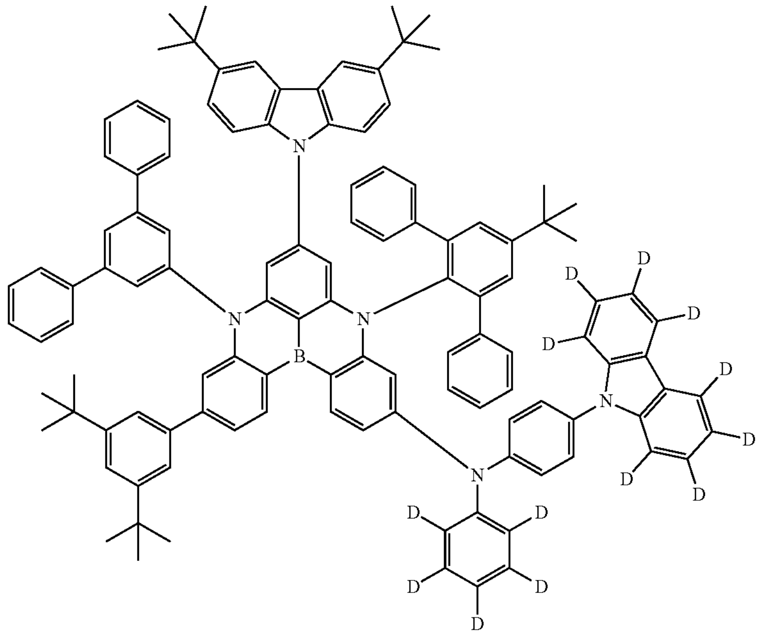

271
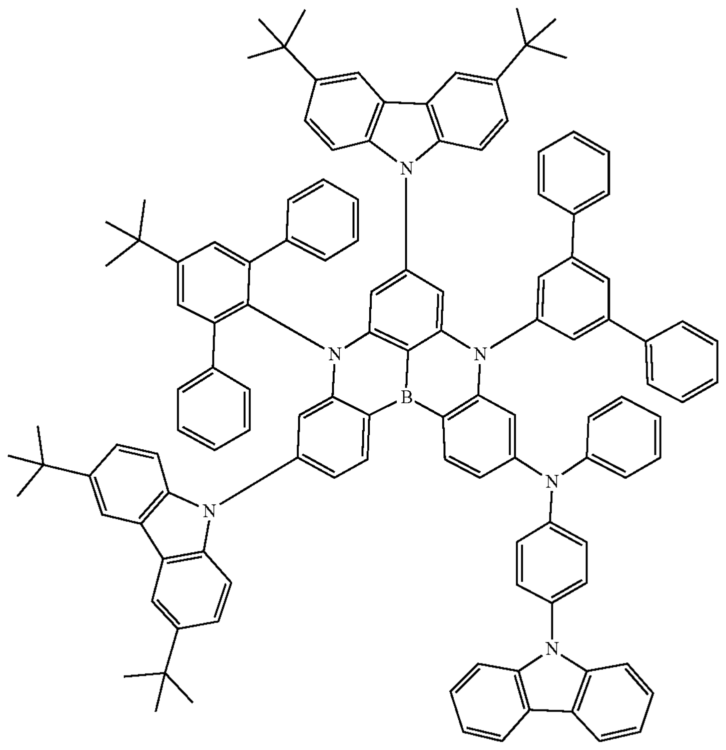
272
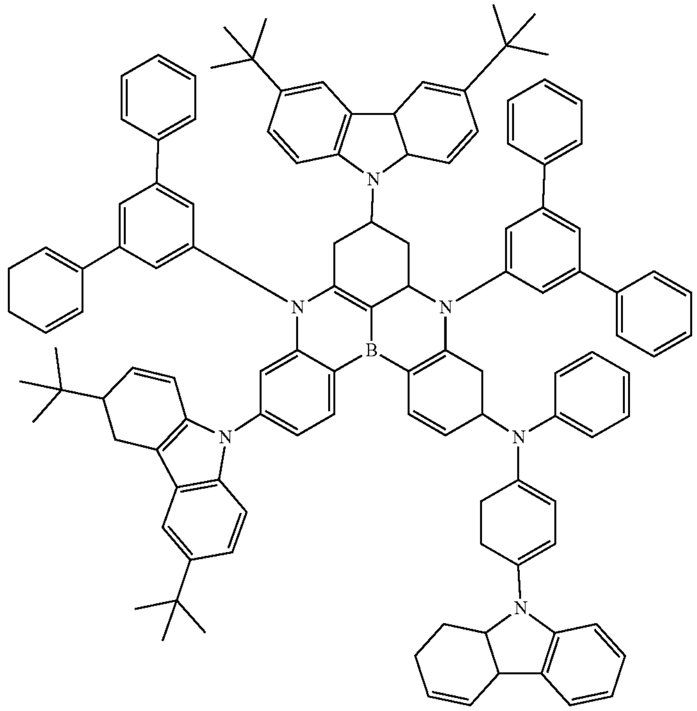

-continued
273
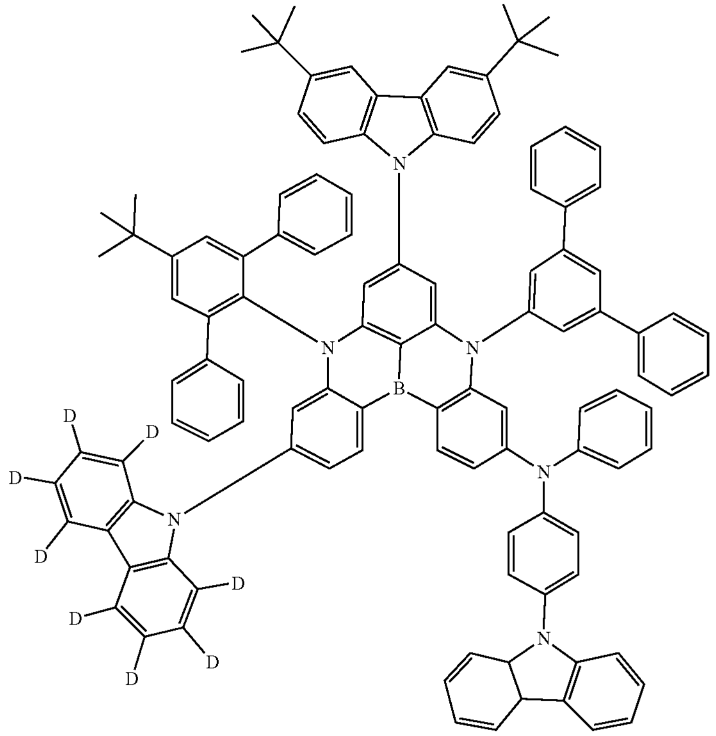
274
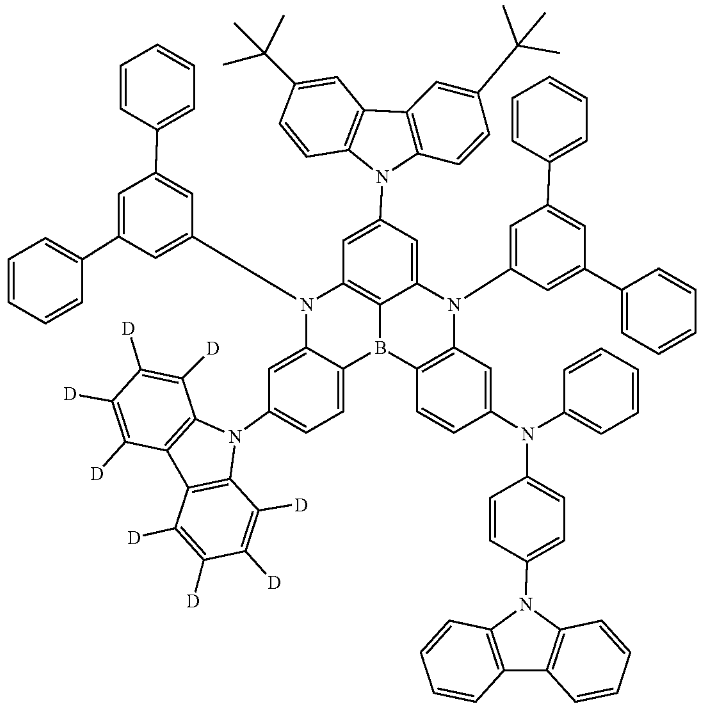

-continued
275
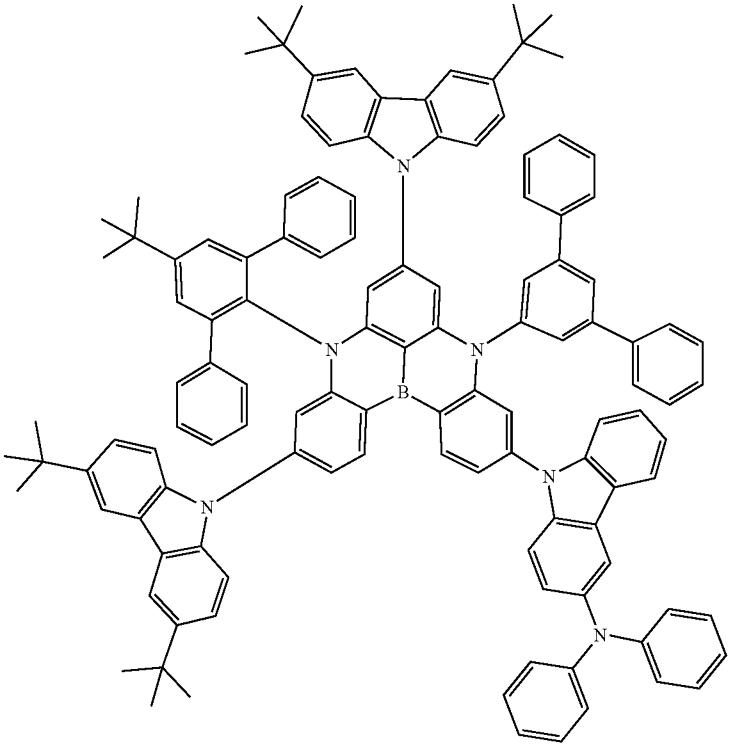
276
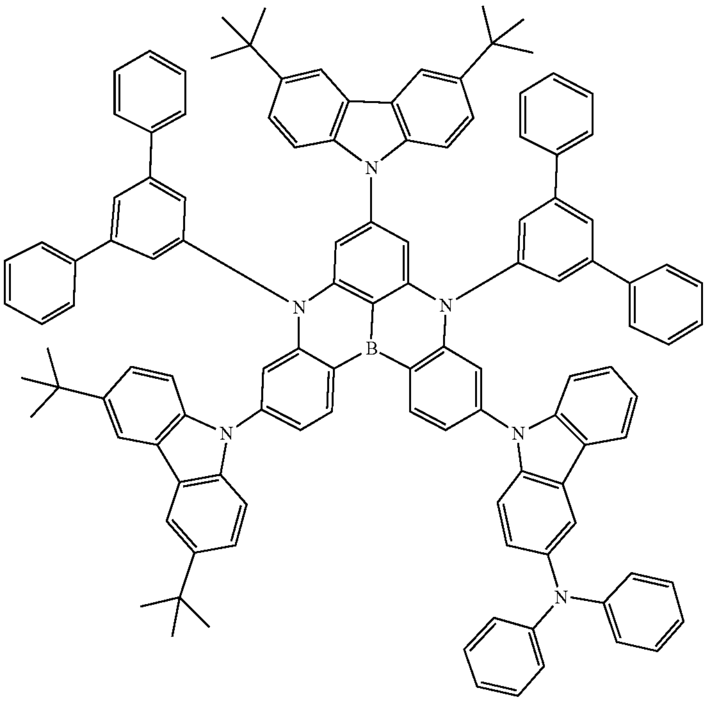

-continued
277
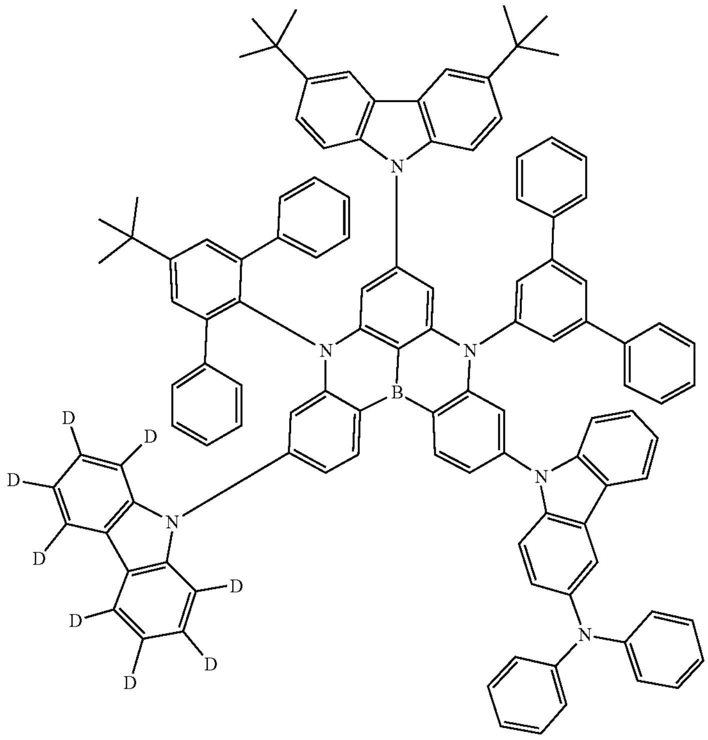
278
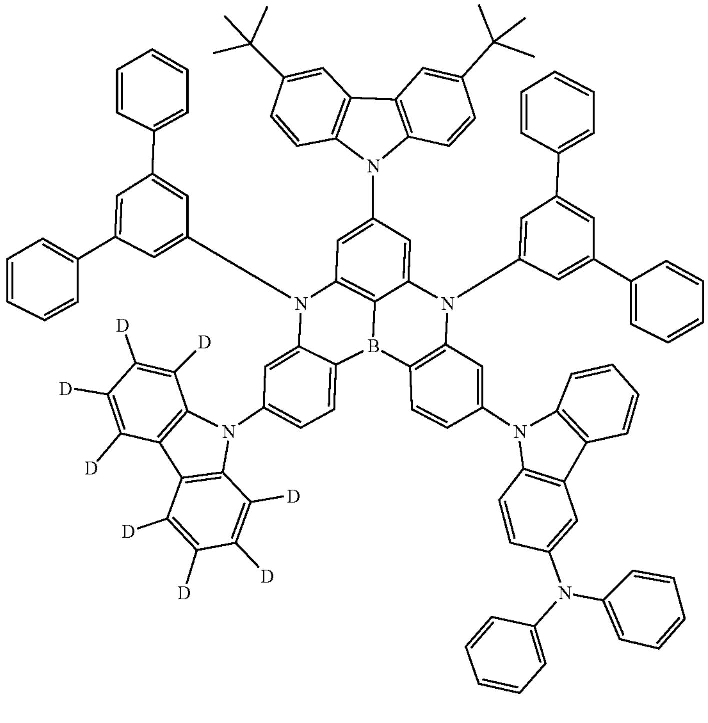

-continued
279
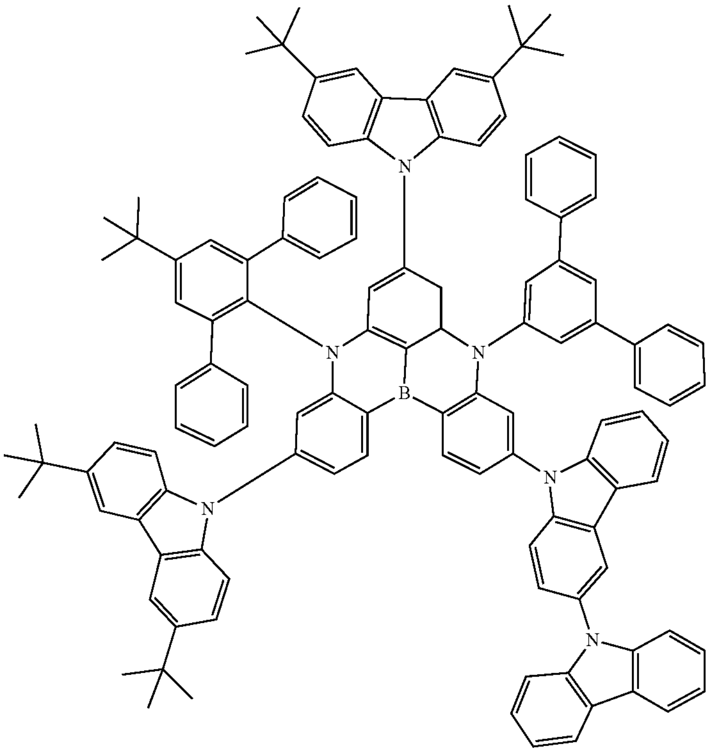
280
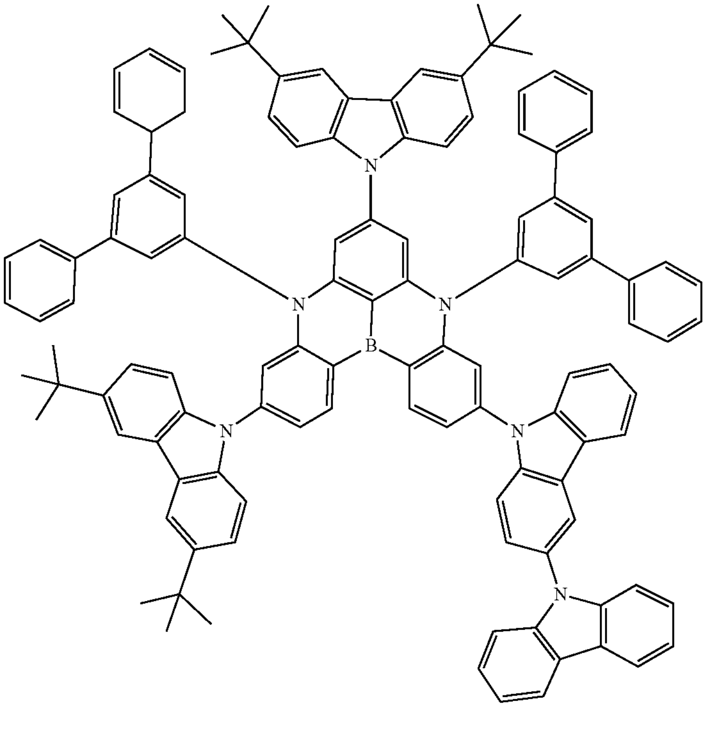

-continued
281
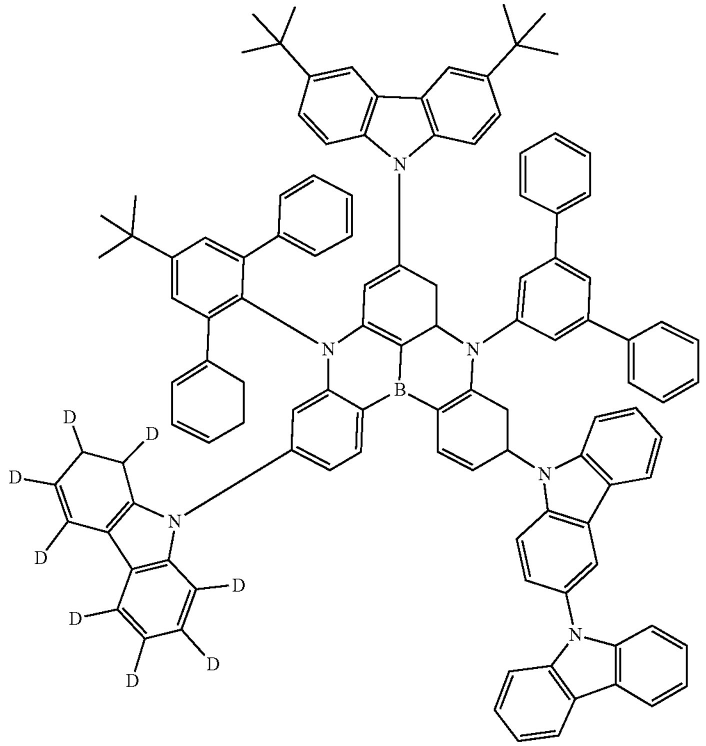
282
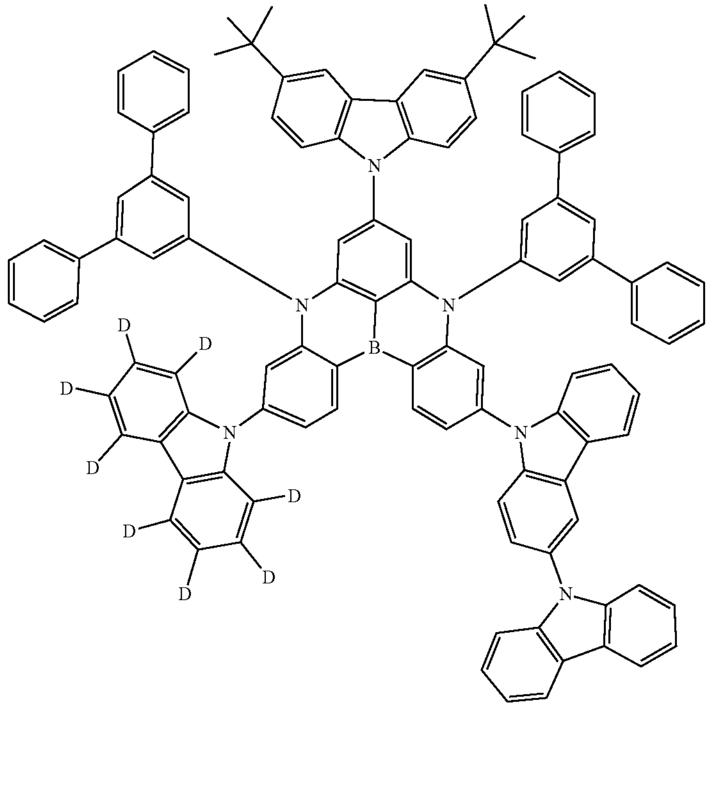

-continued
283
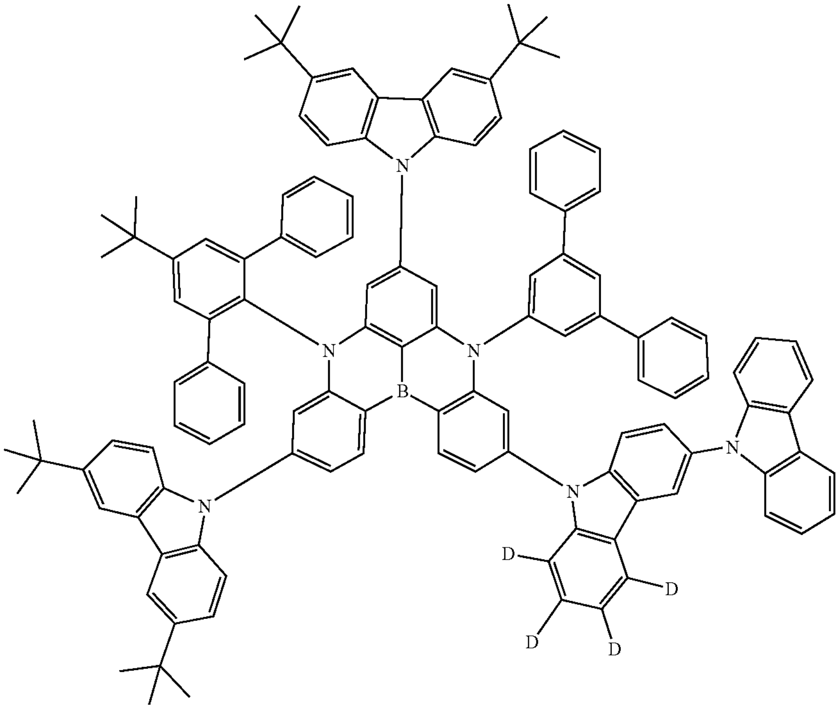
284
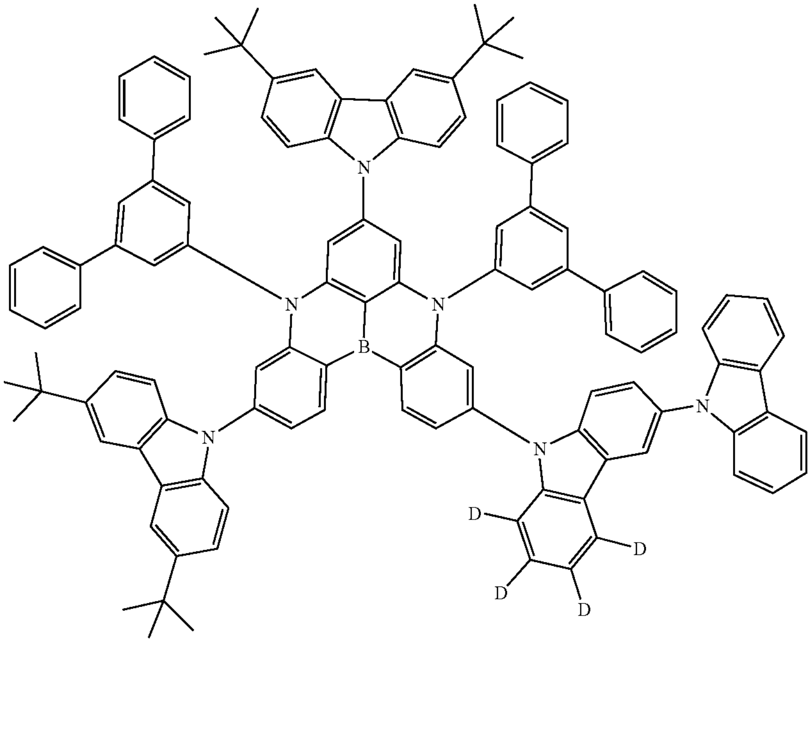

-continued
285
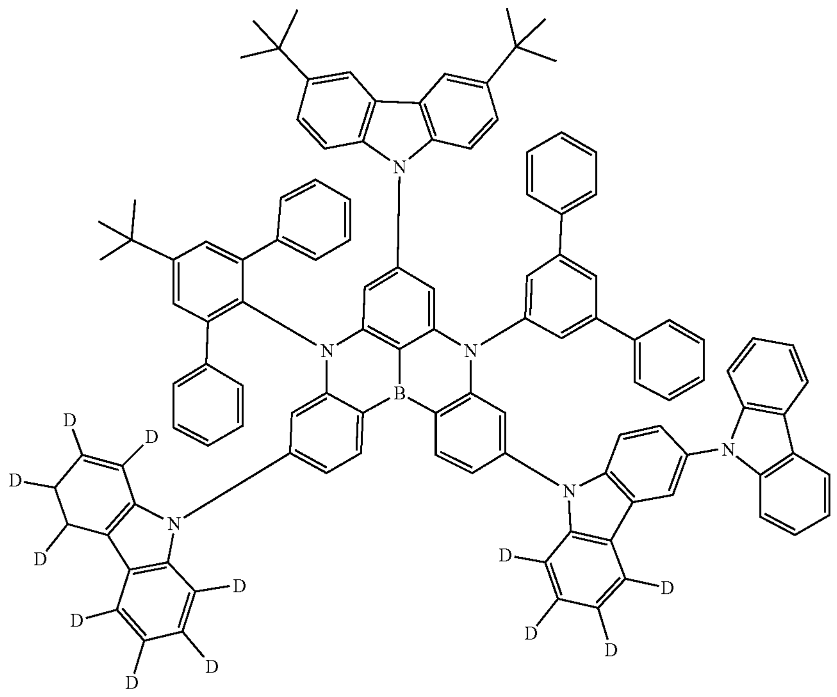
286
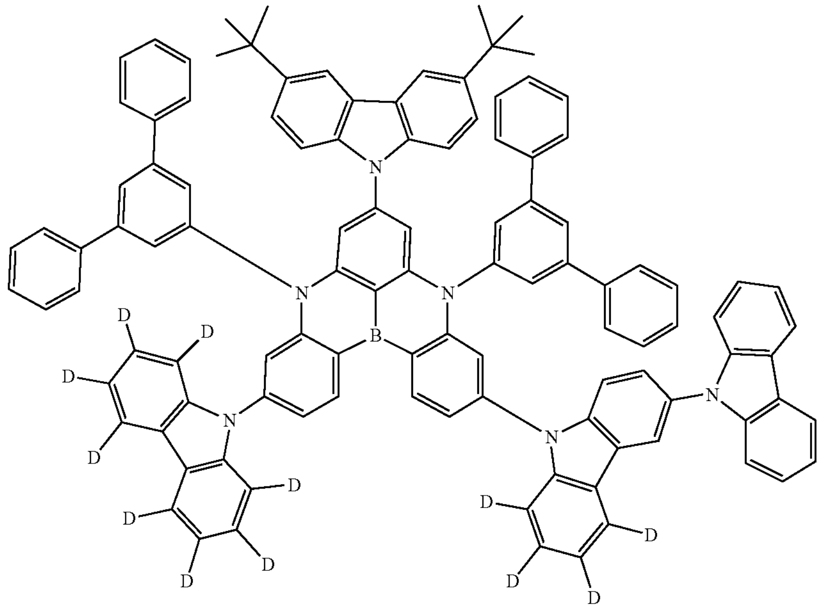

-continued
287
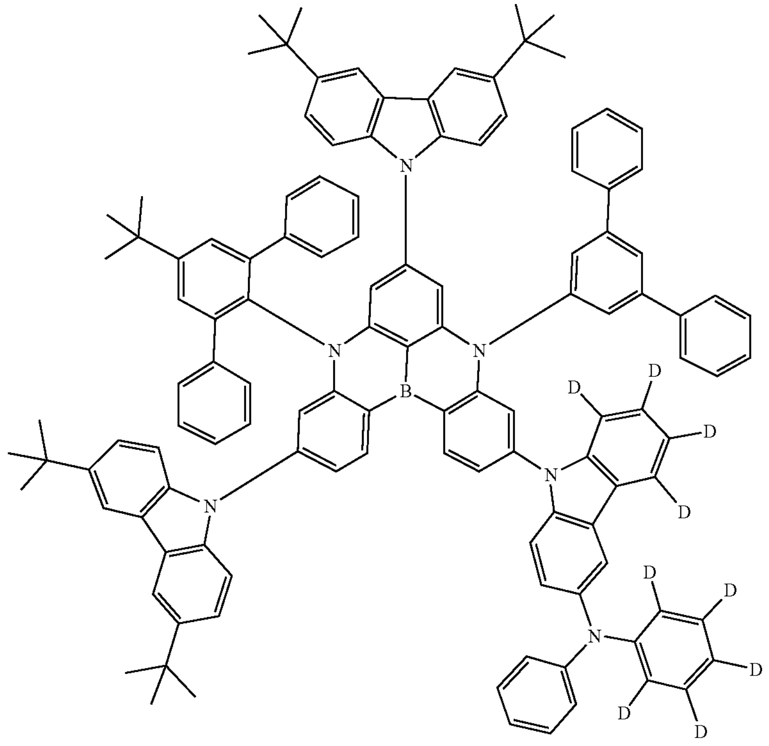
288
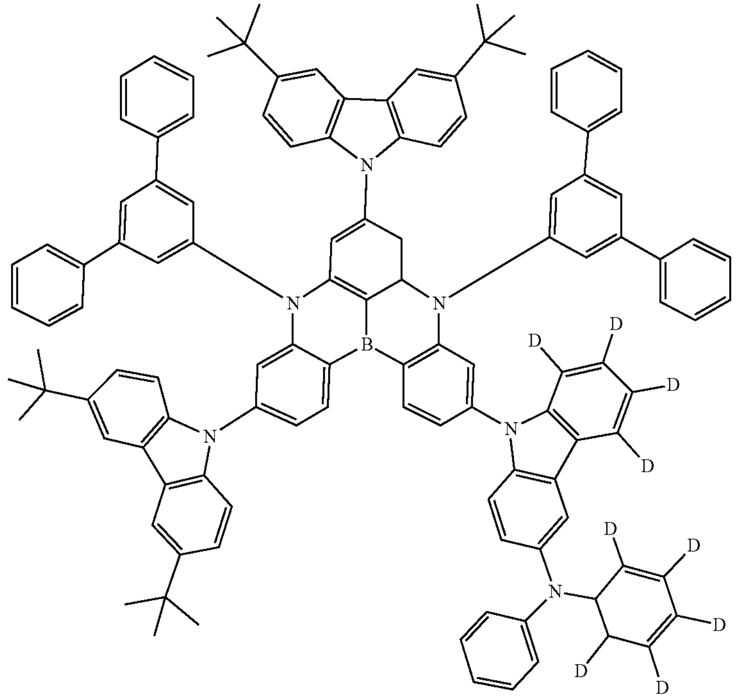

-continued
289
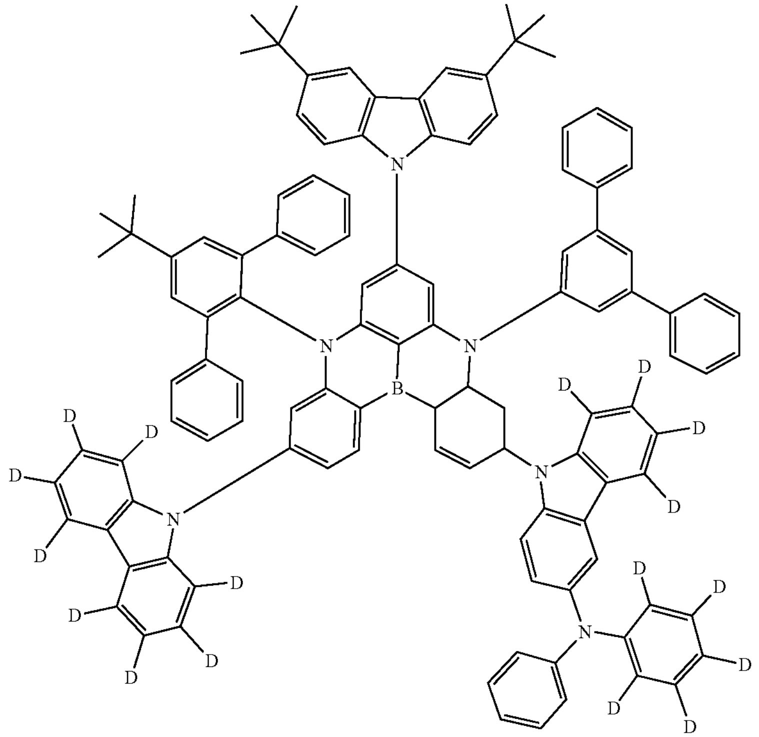
290
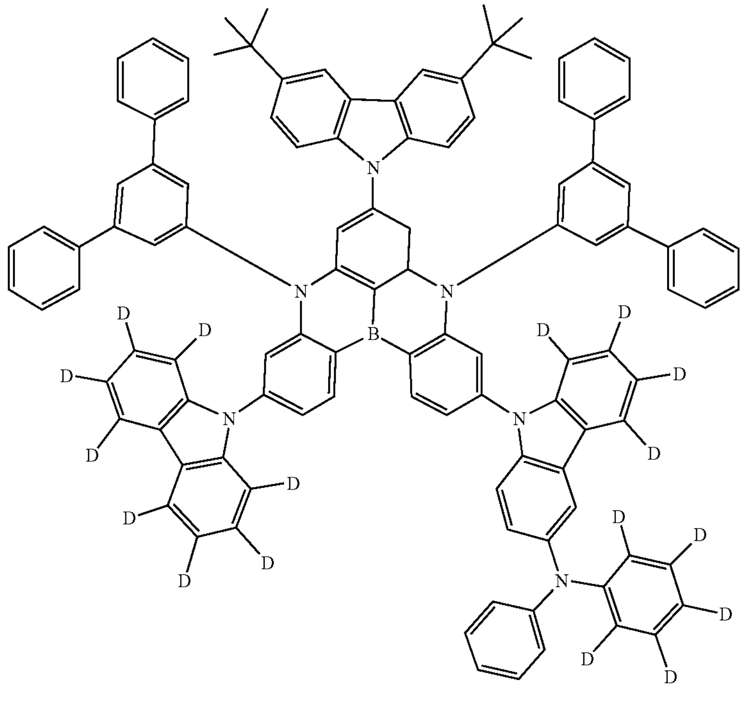

-continued
291
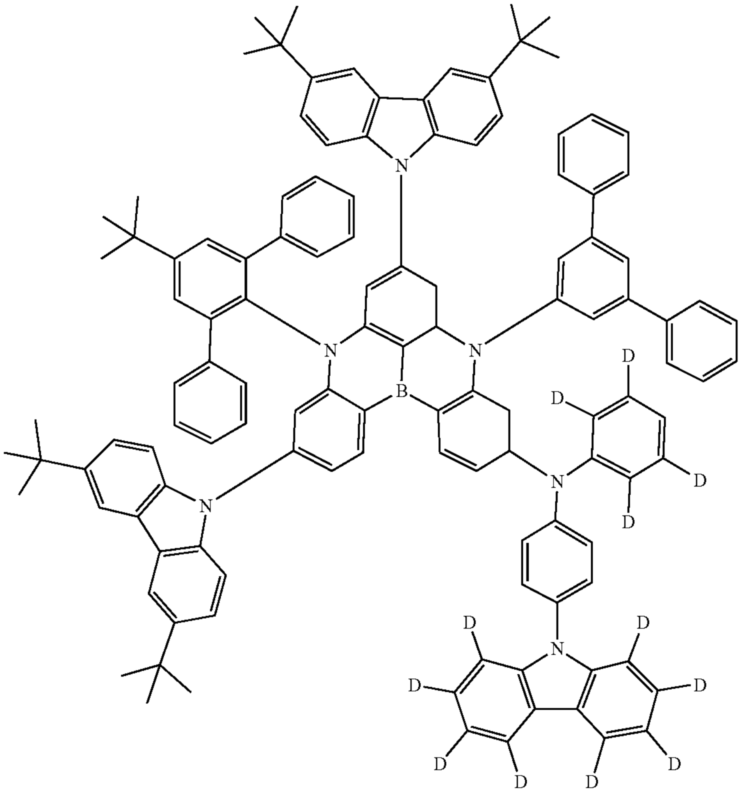
292
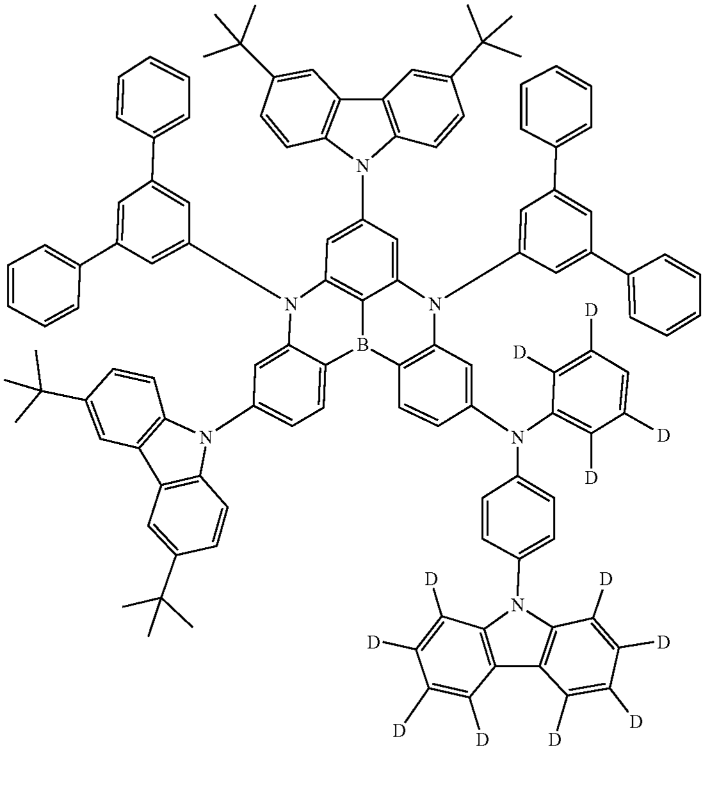

-continued
293
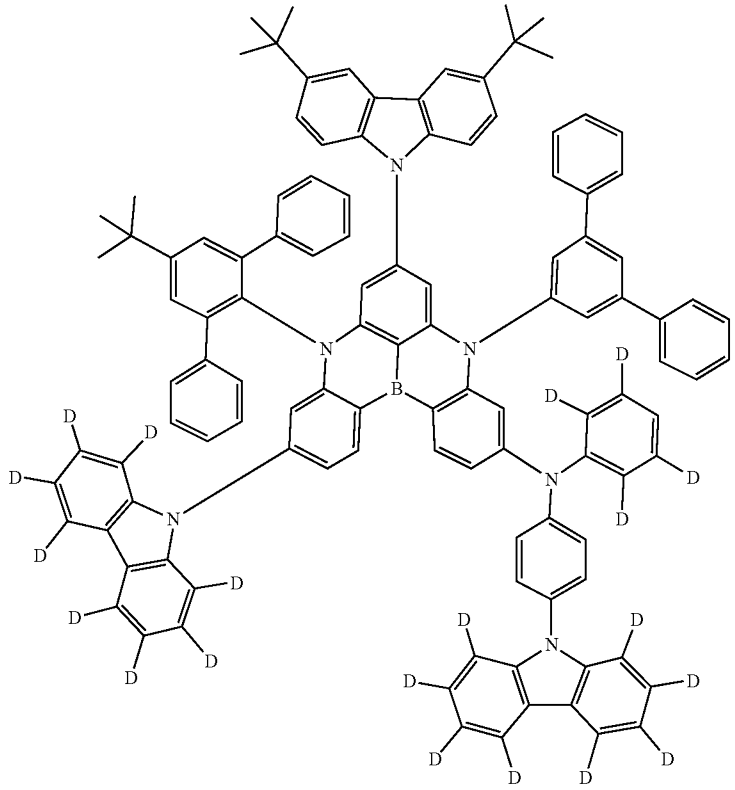
294
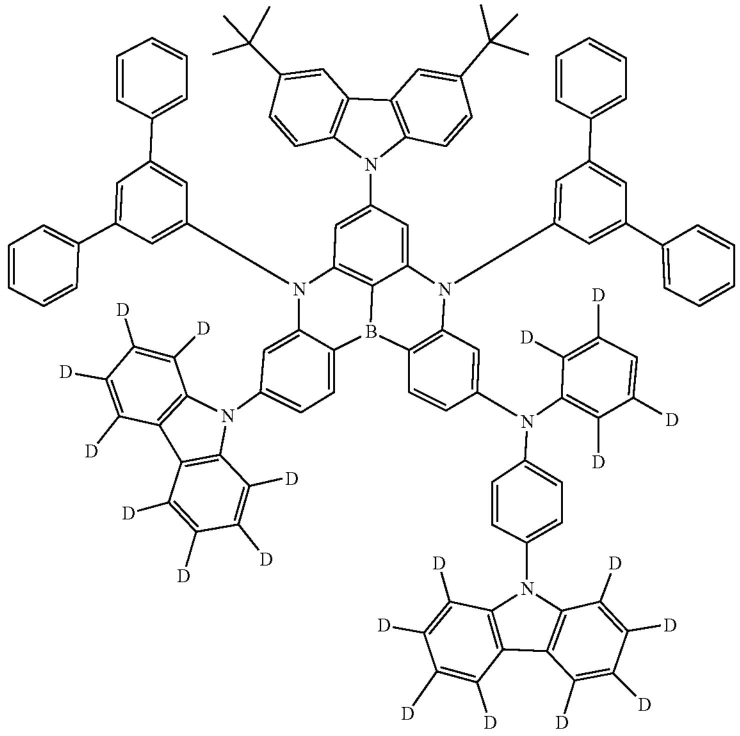

-continued
295
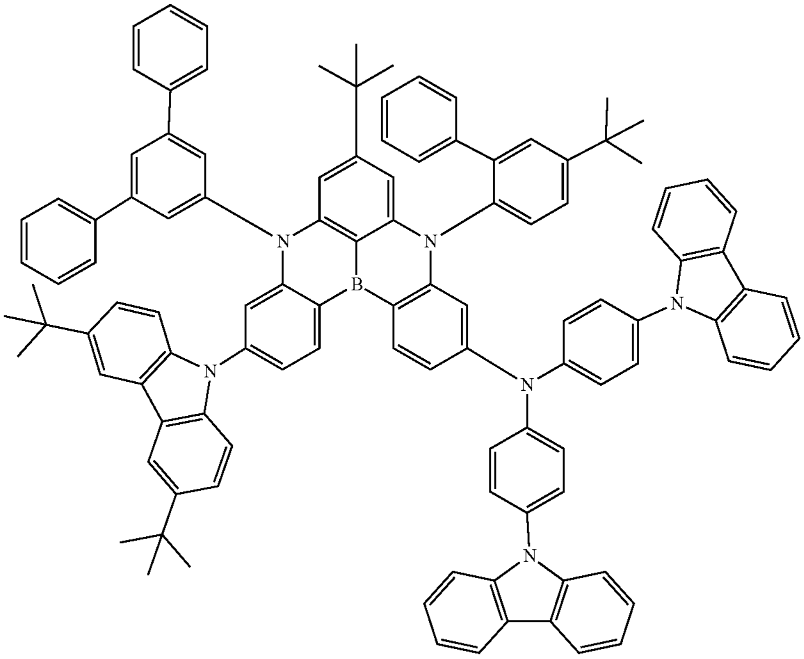
296
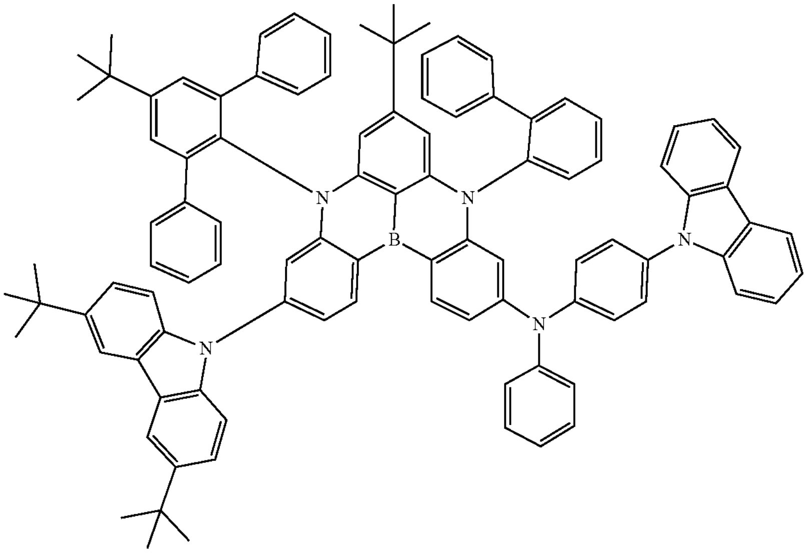

-continued
297
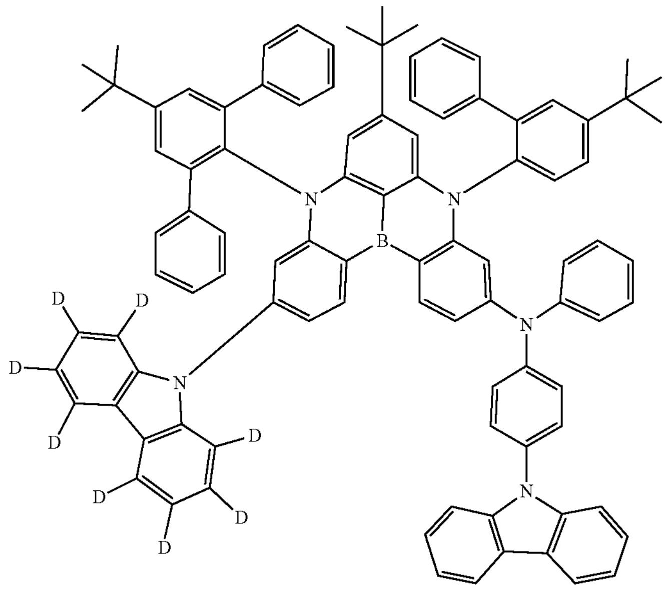
298
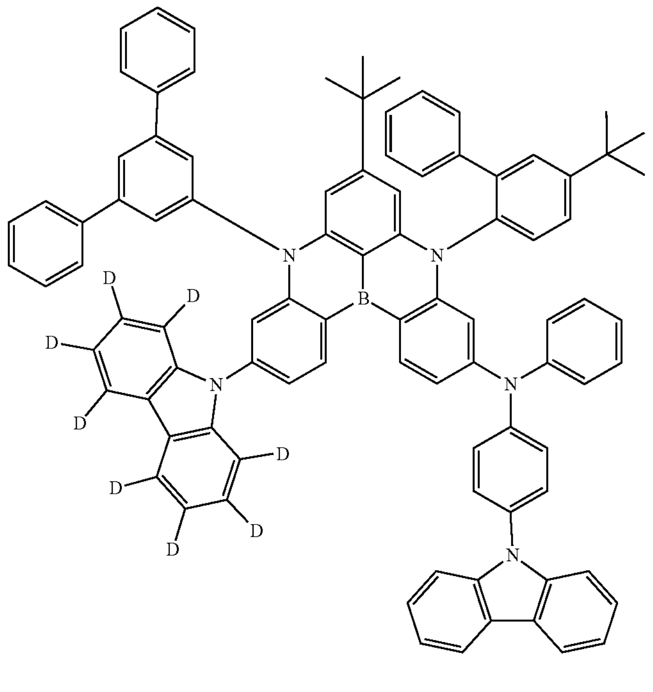

-continued
299
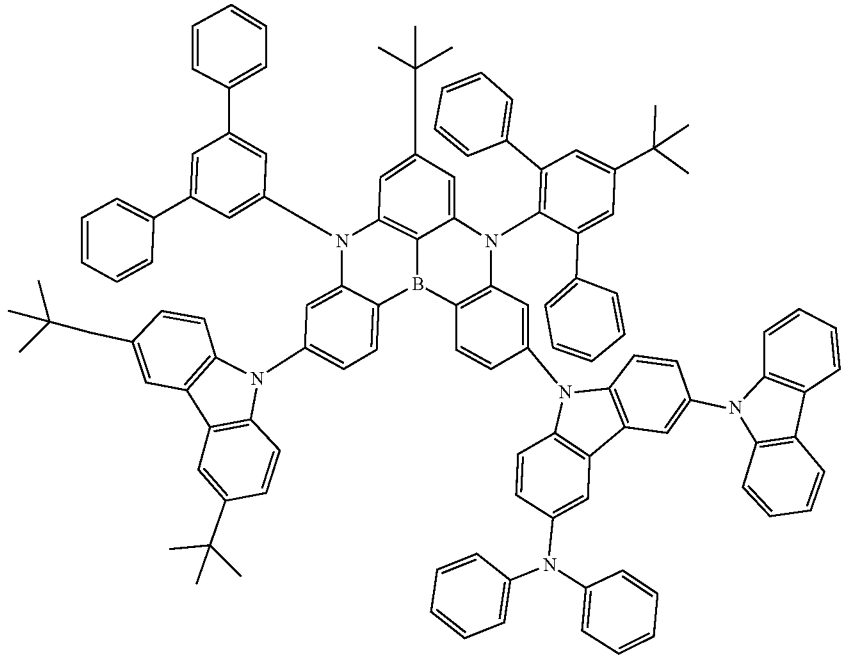
300
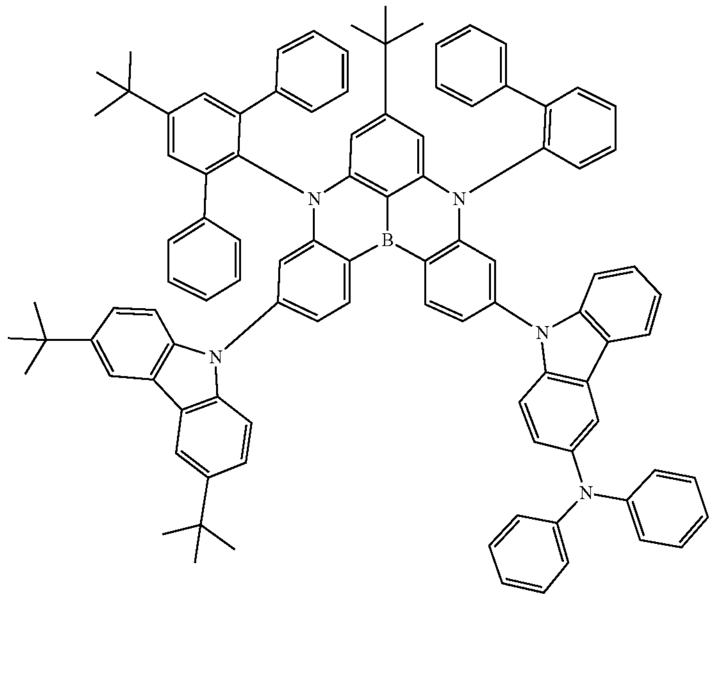

-continued
301
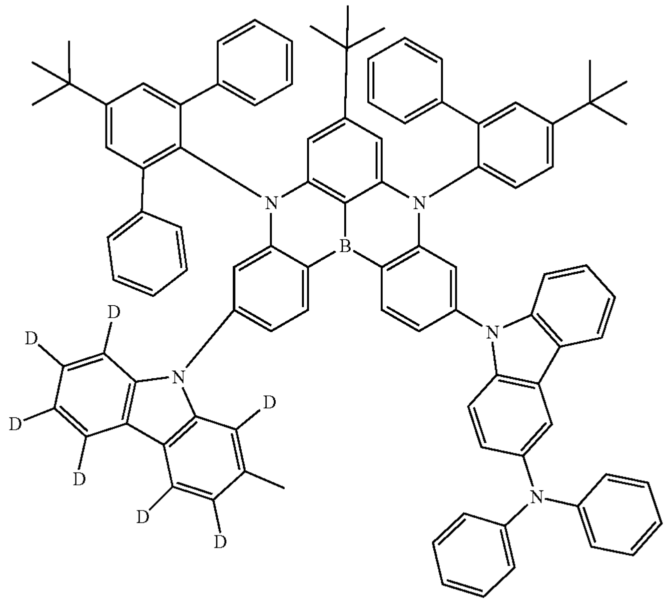
302
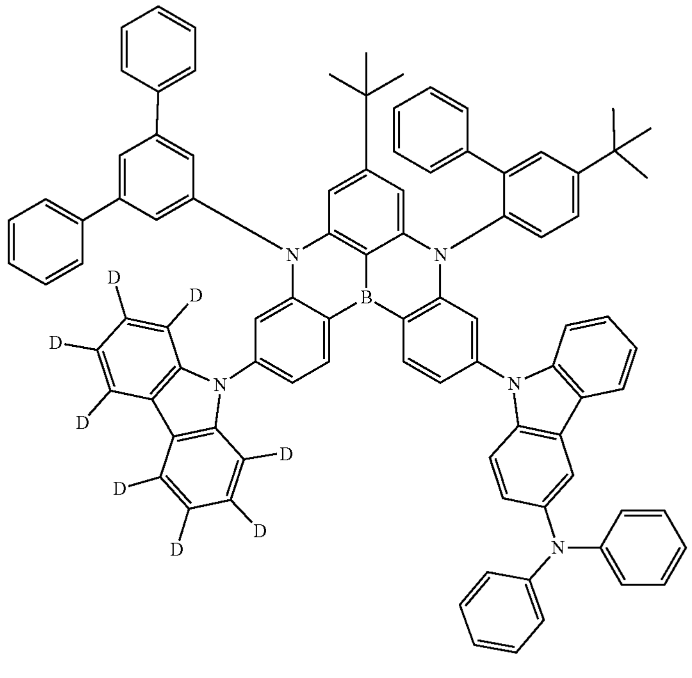

-continued
303
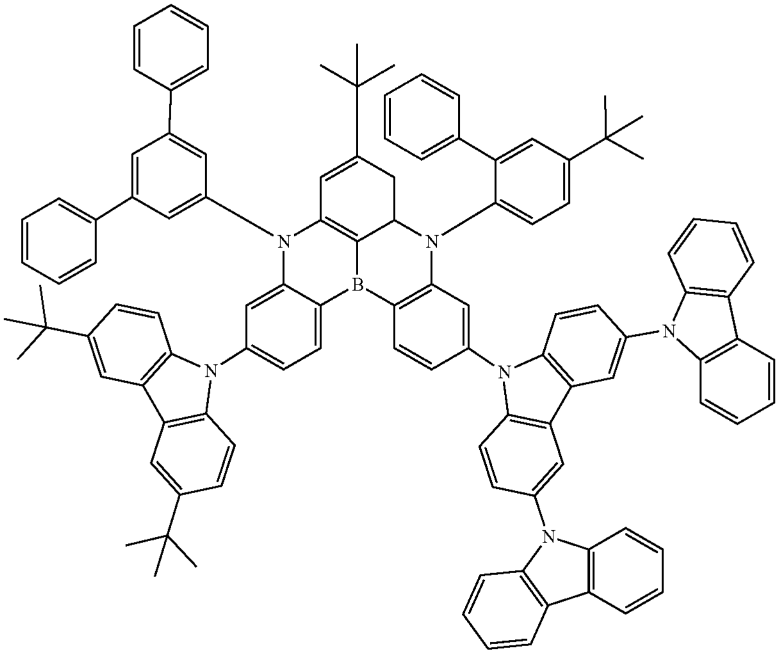
304
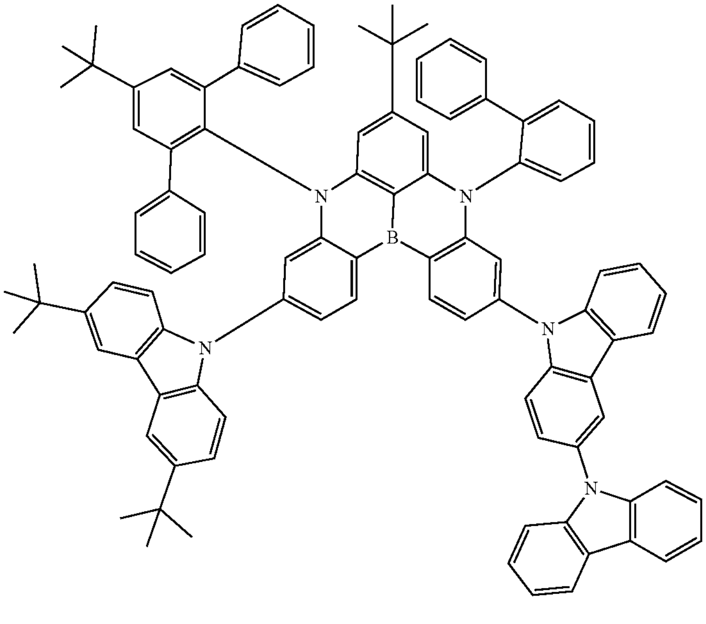

-continued
307
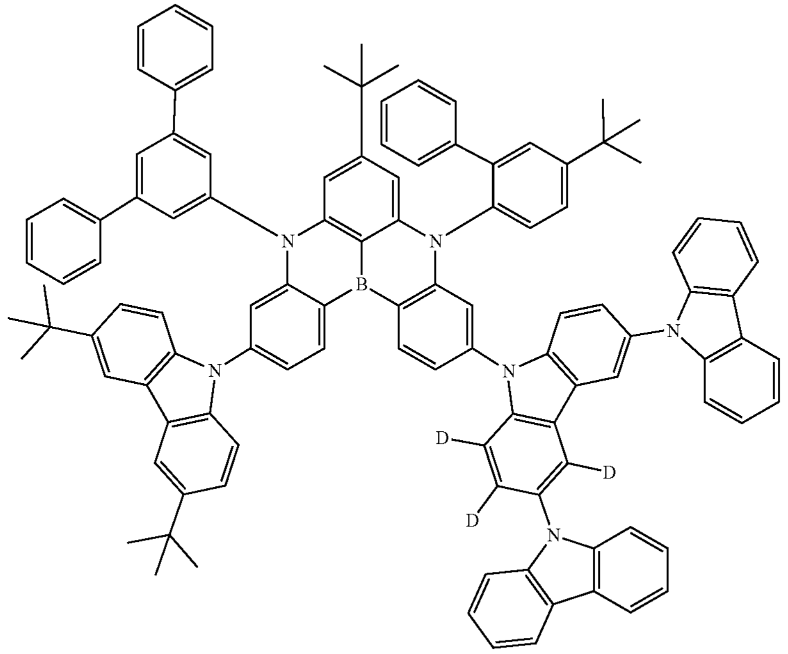
308
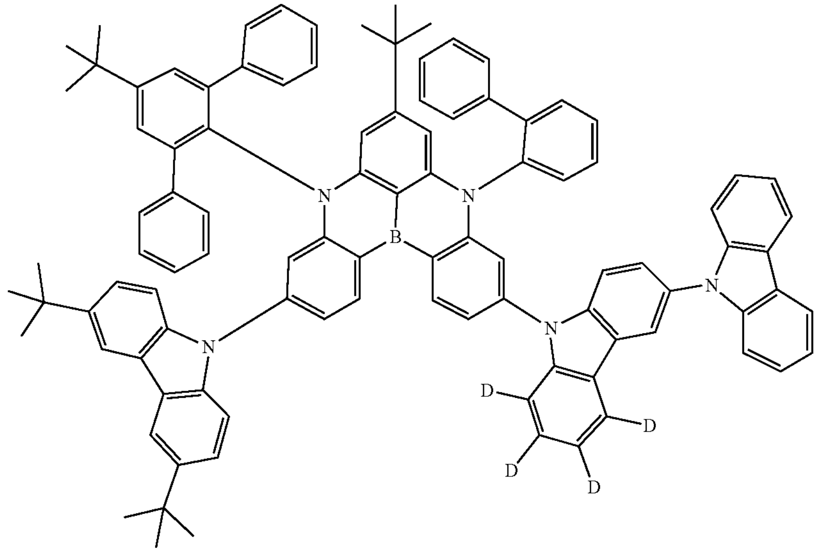

-continued
305
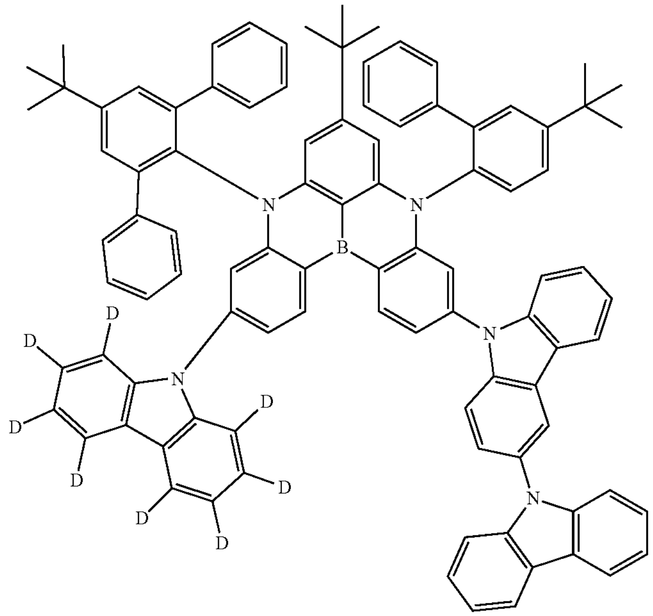
306
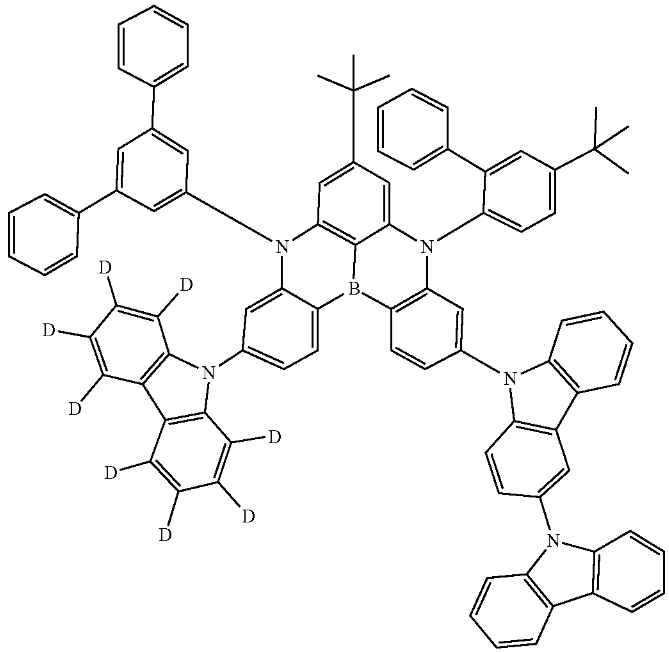

-continued
309
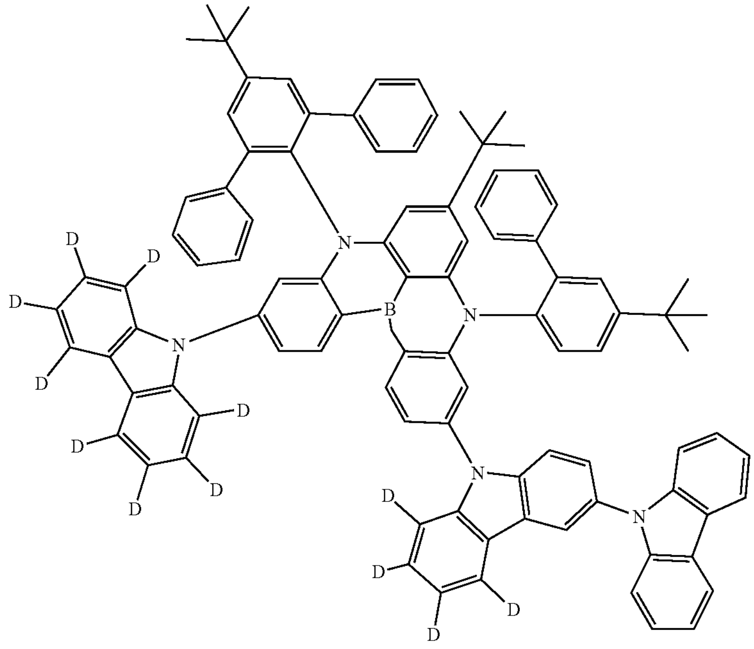
310
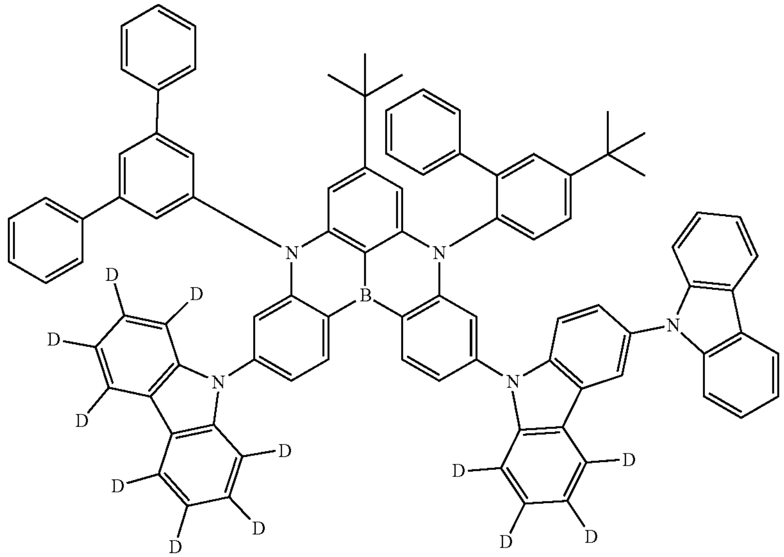

-continued
311
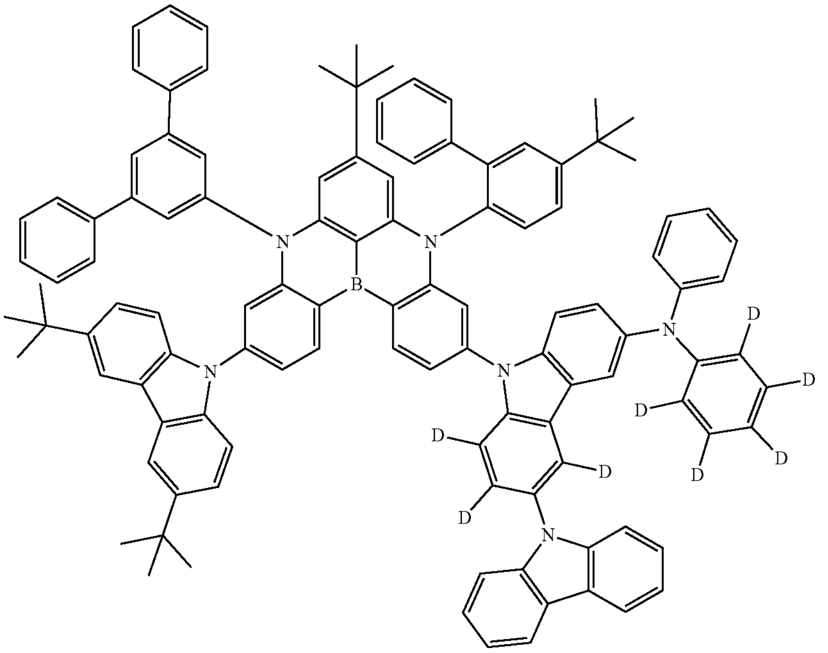
312
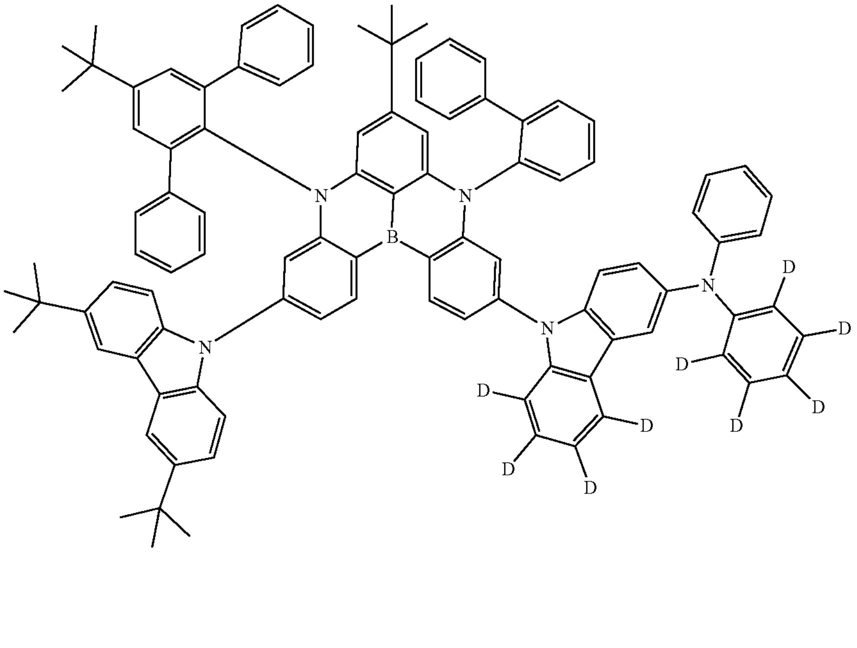

-continued
313
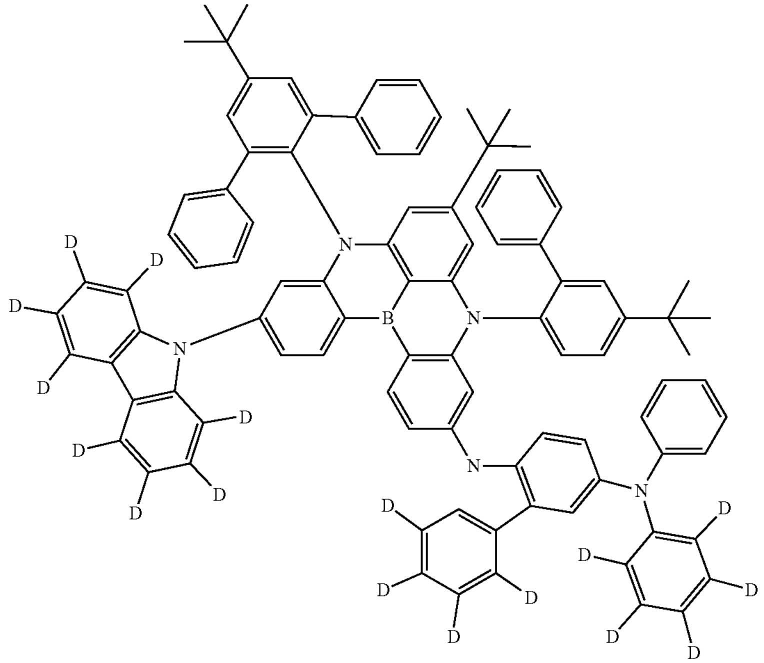
314
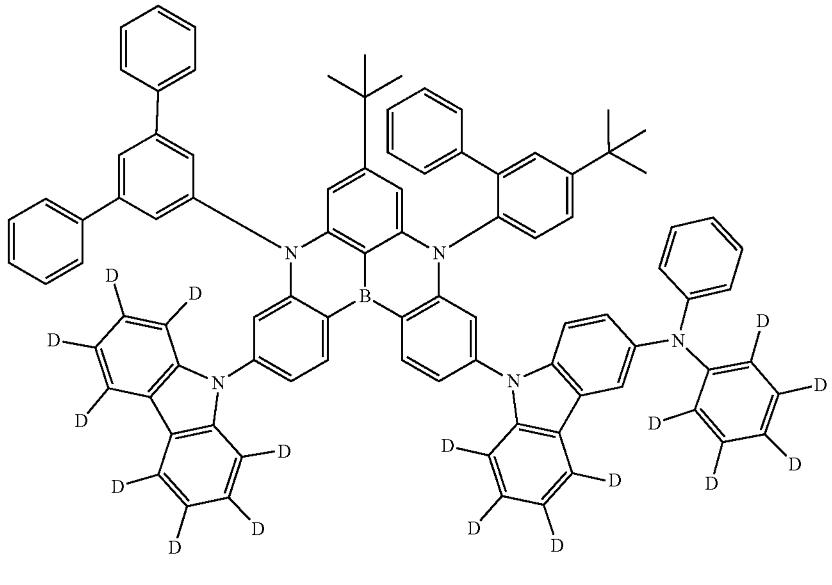

-continued
315
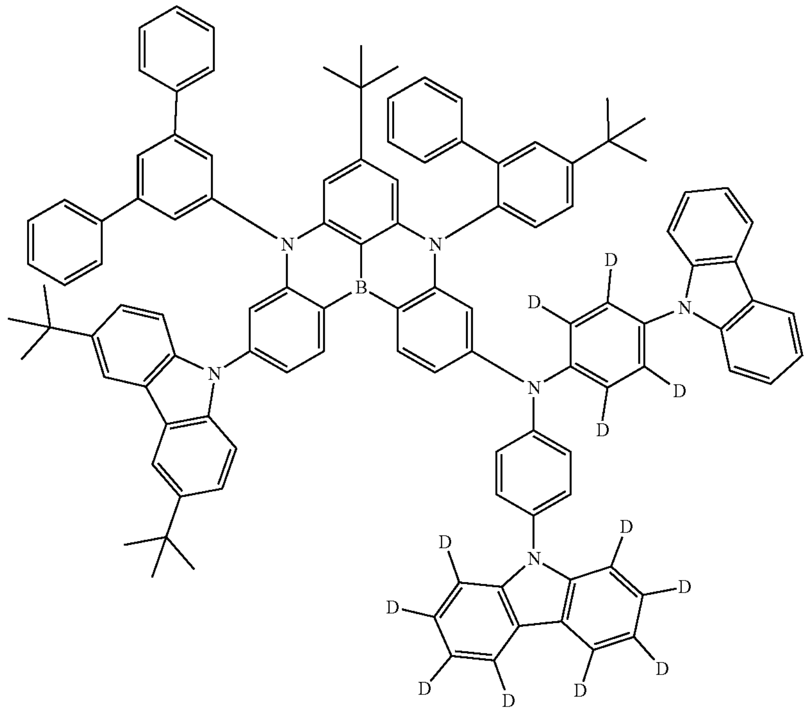
316
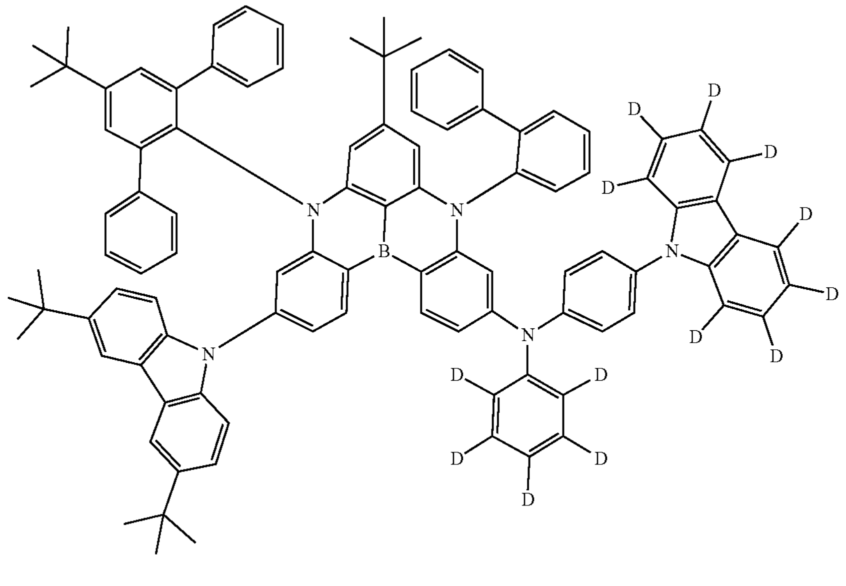

-continued
317
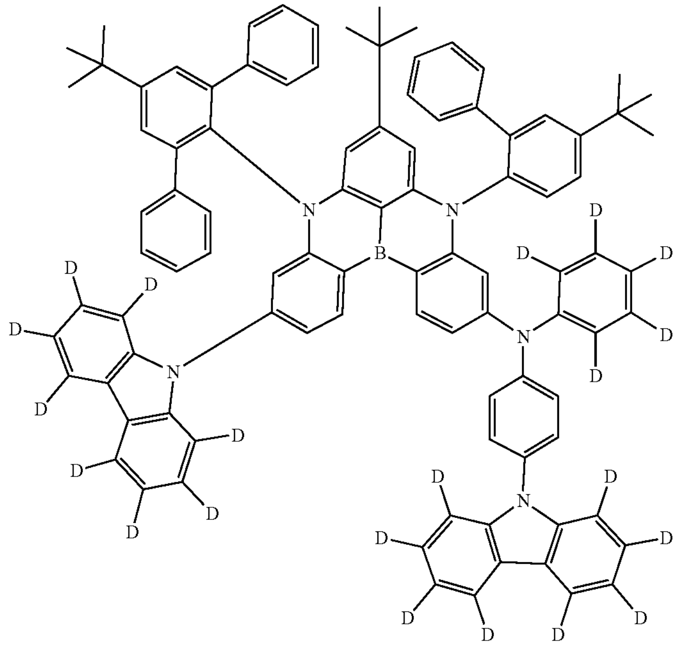
318
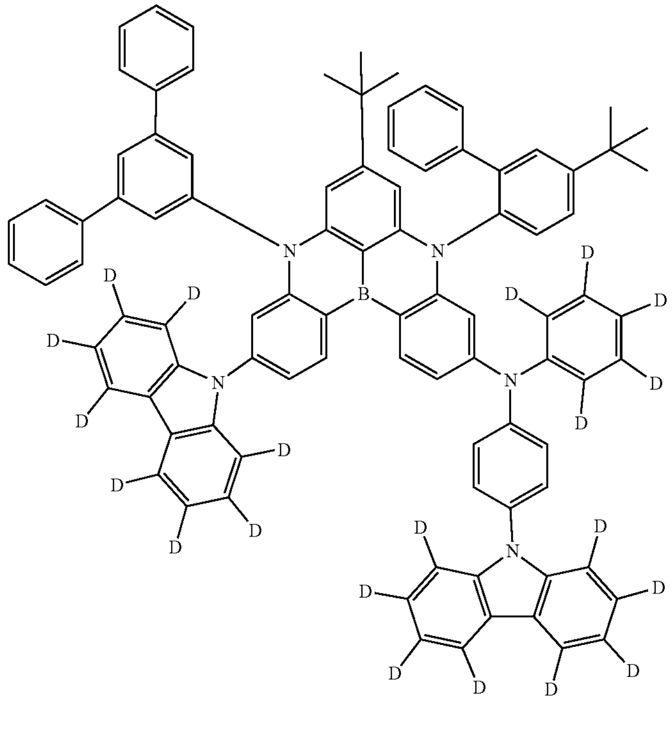

-continued
319
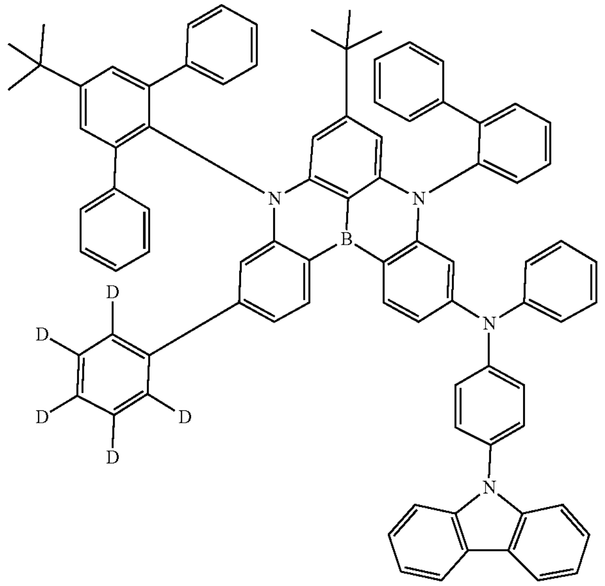
320
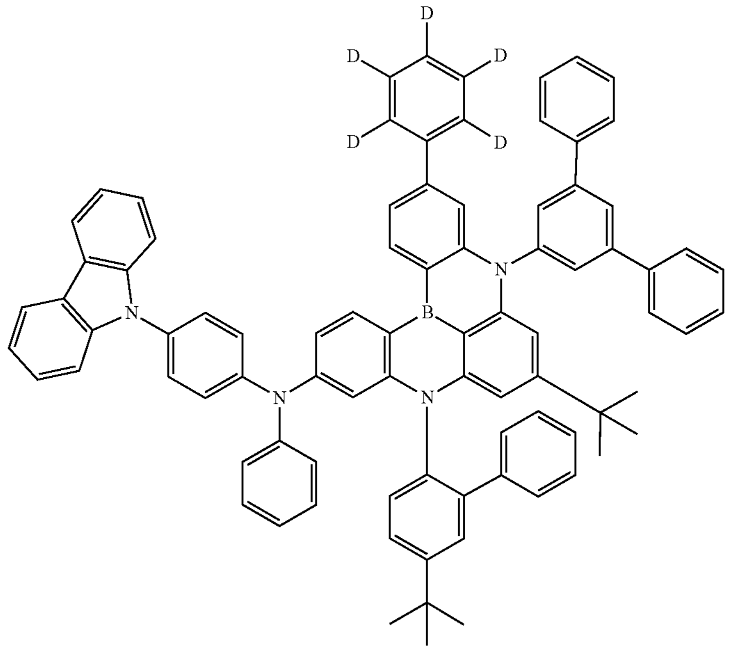

-continued
321
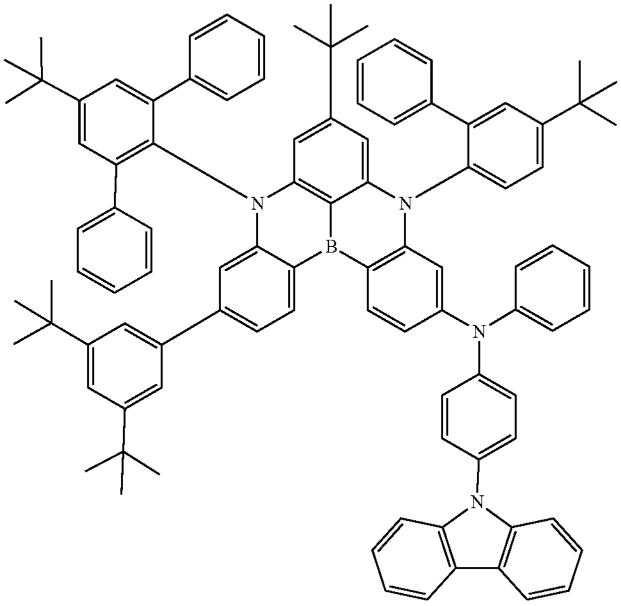
322
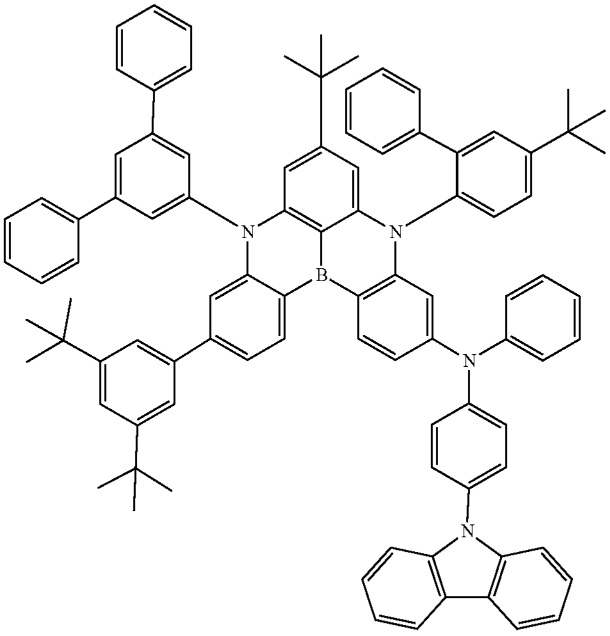

-continued
323
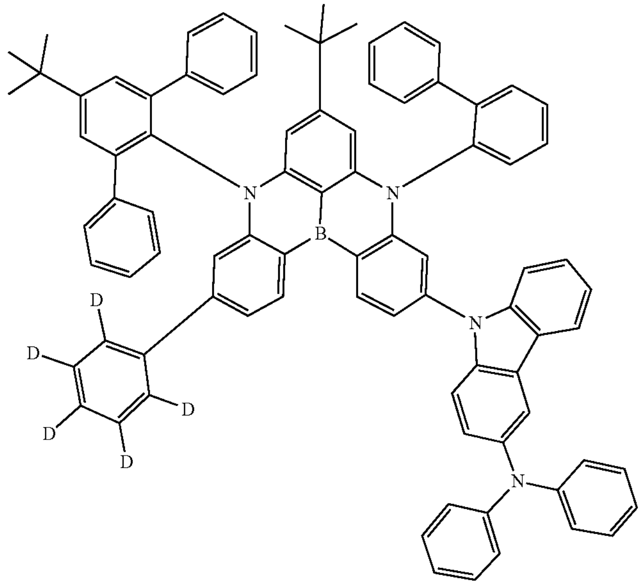
324
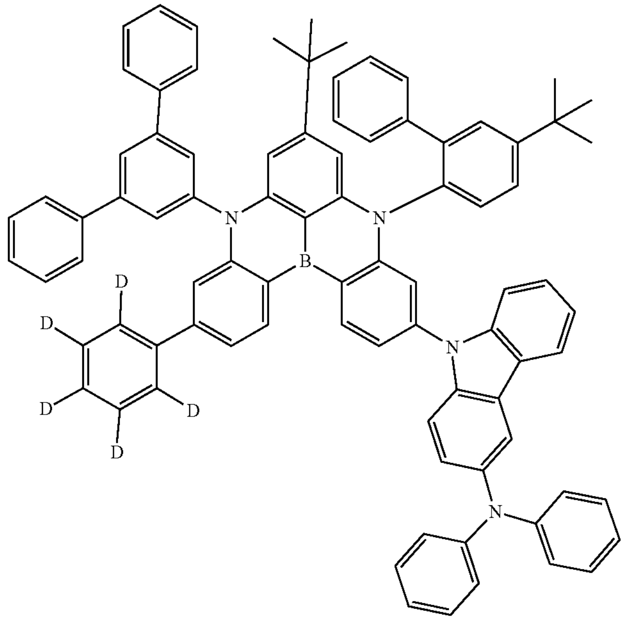

-continued
325
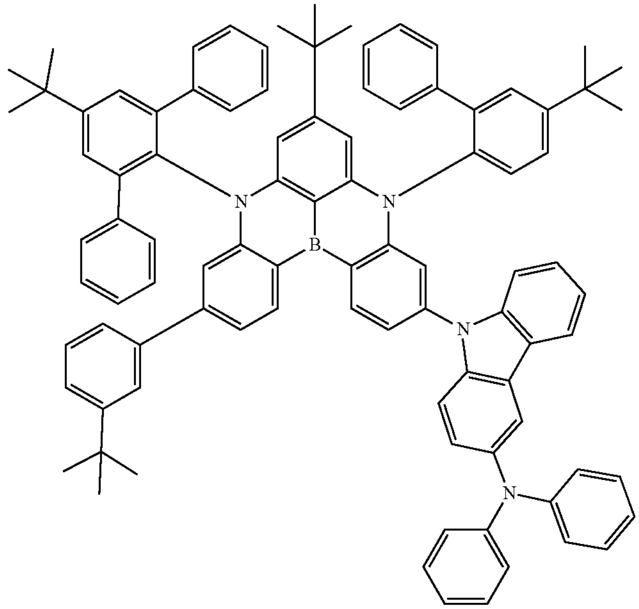
326
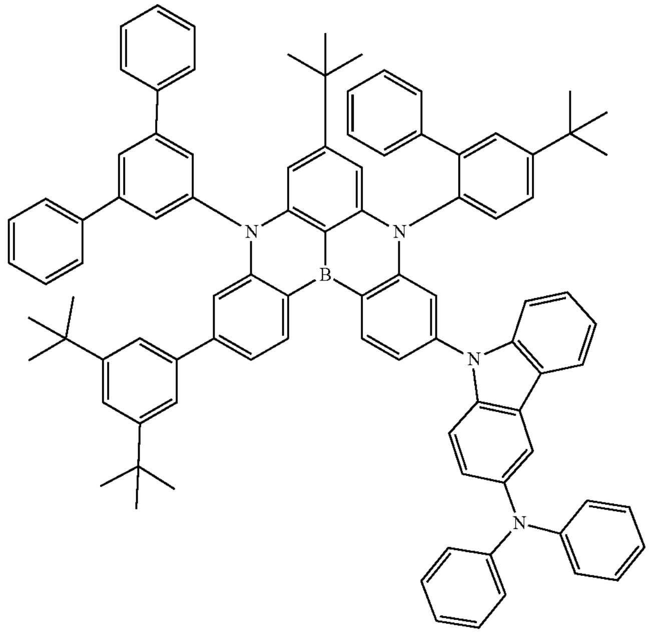

-continued
327
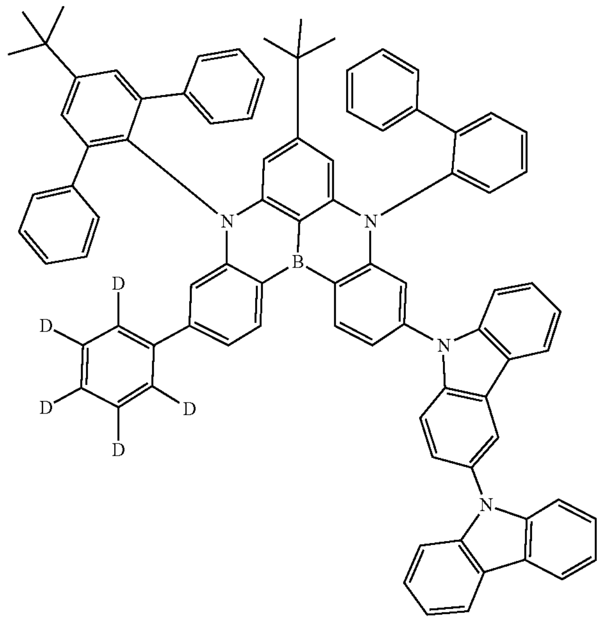
328
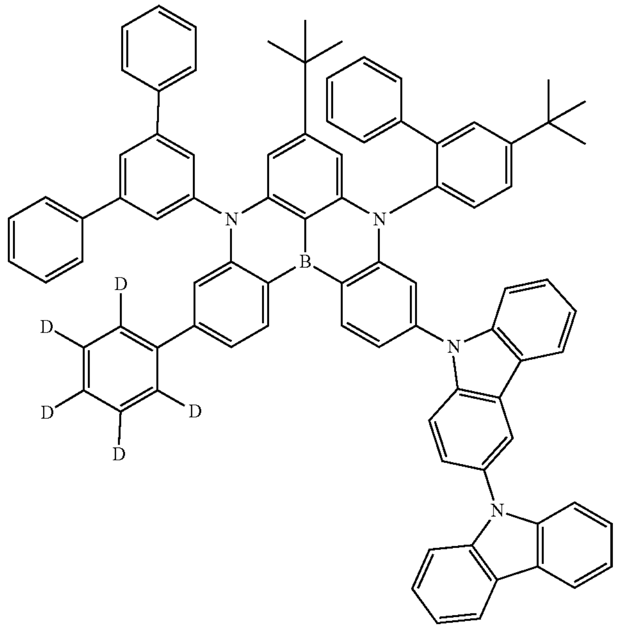

-continued
329
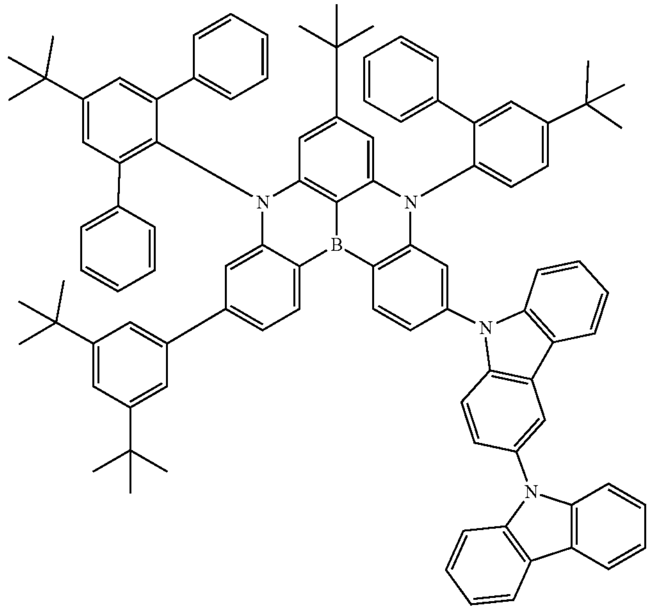
330
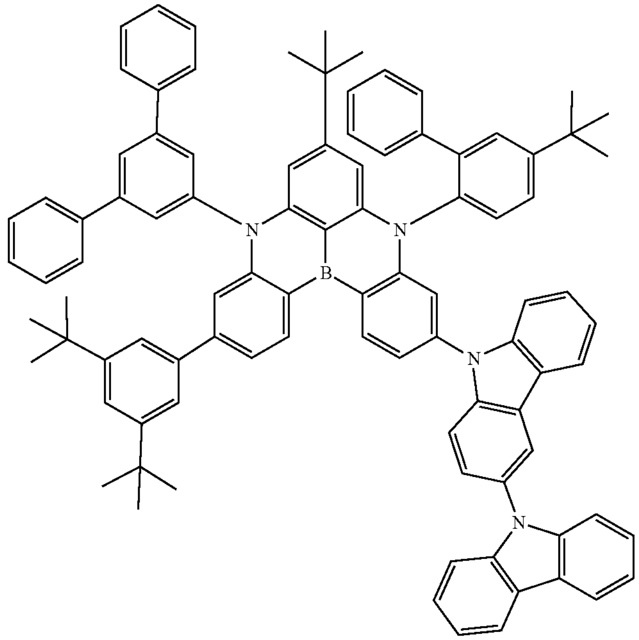

-continued
331
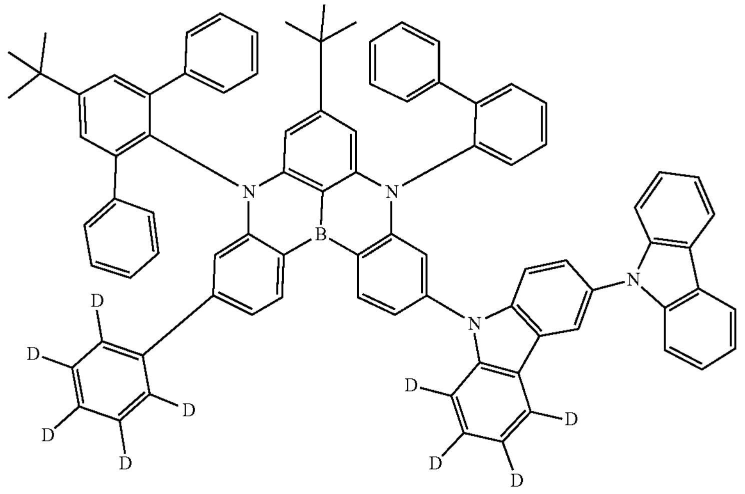
332
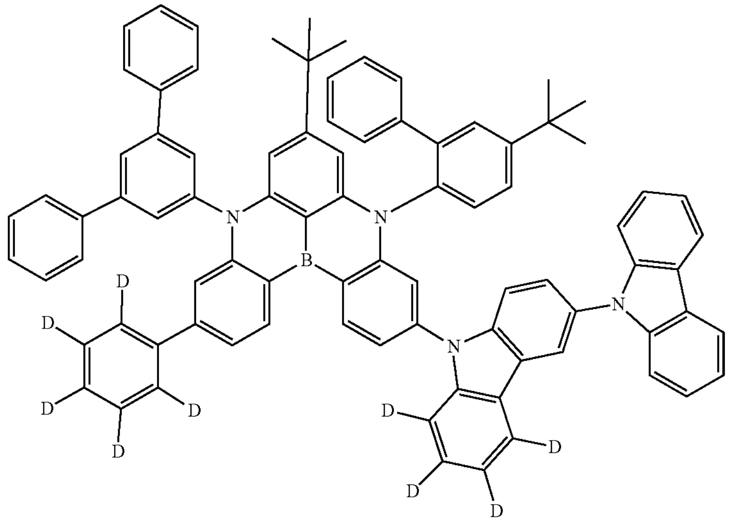
333
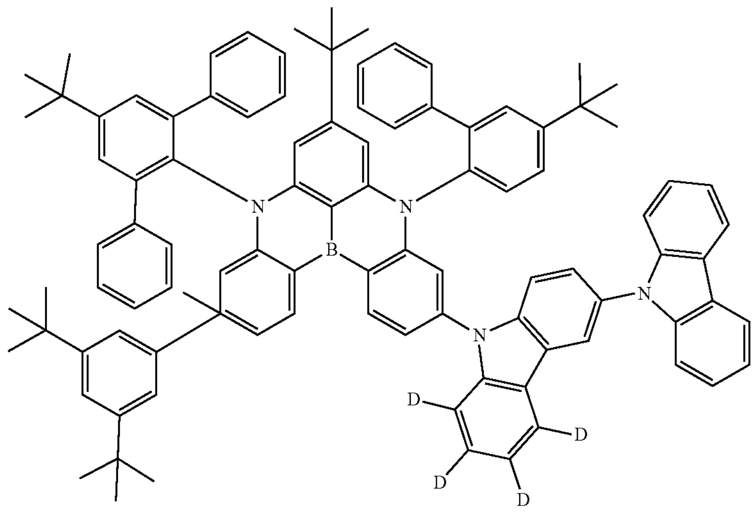

-continued
334
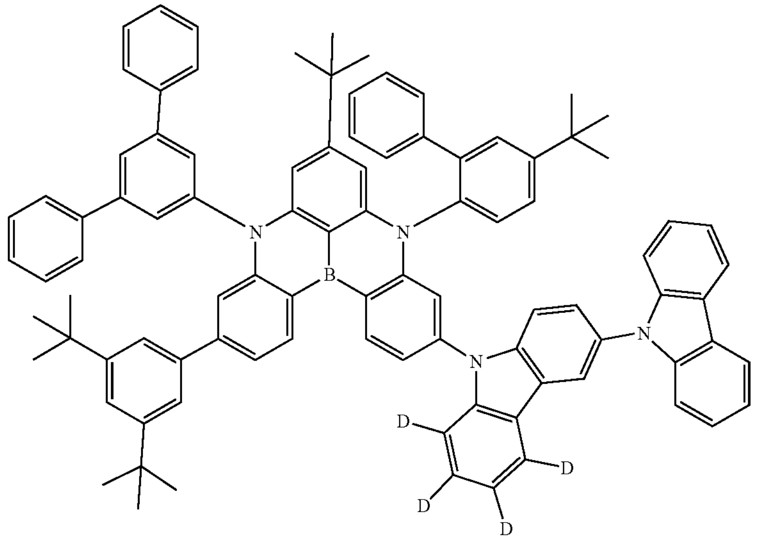
335
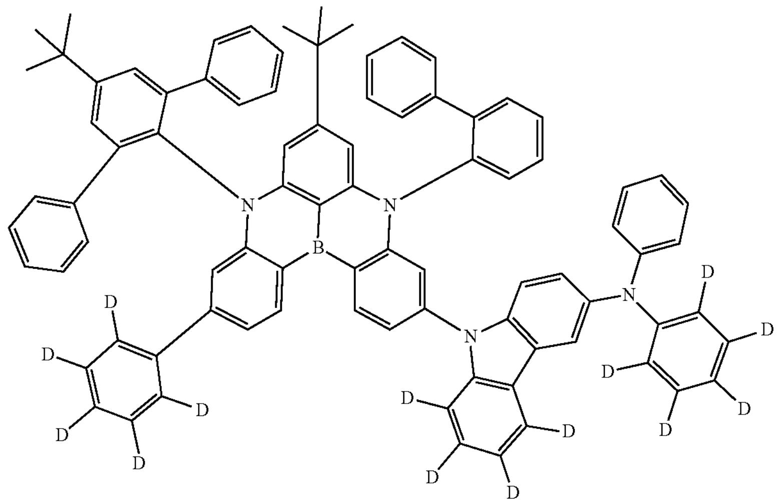
336
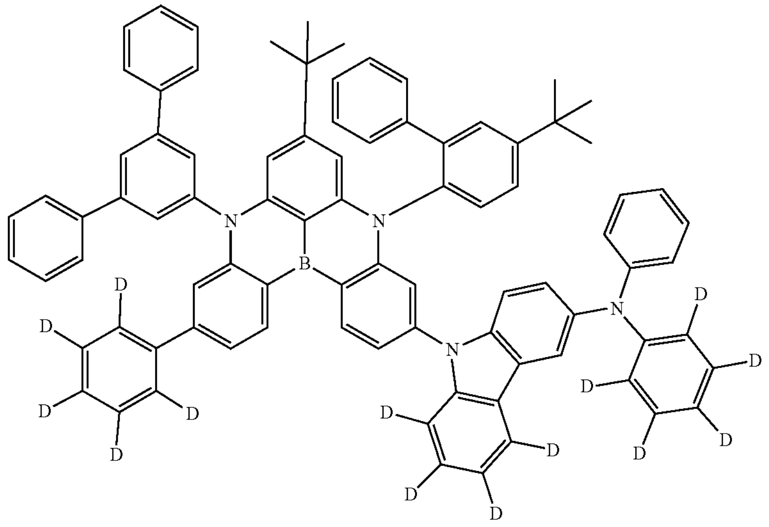

-continued
337
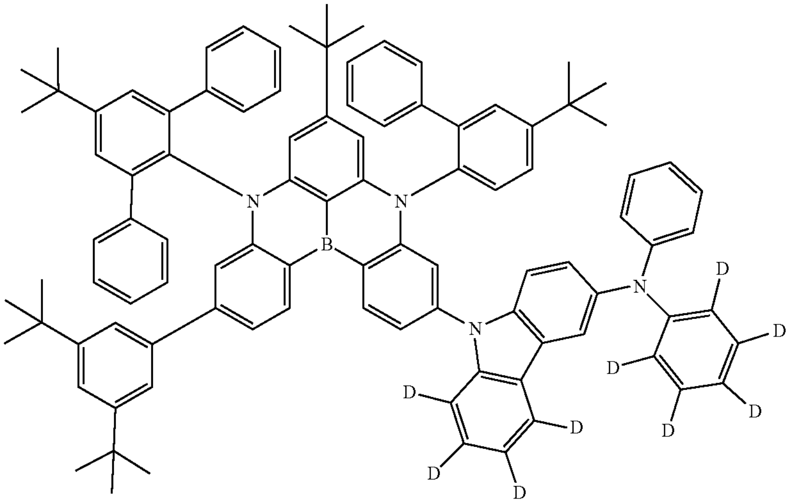
338
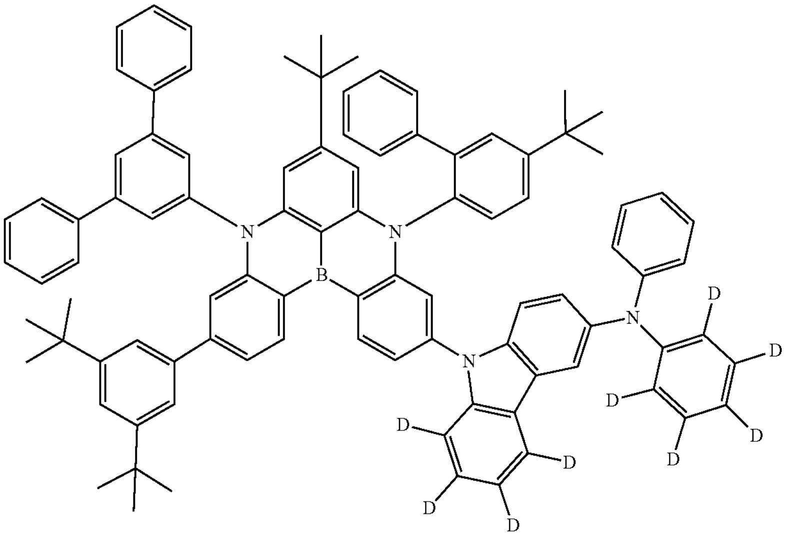
339
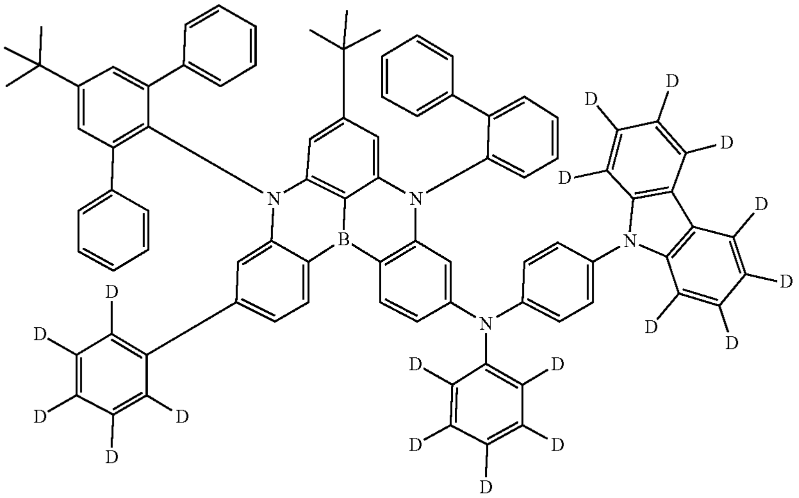

-continued
340
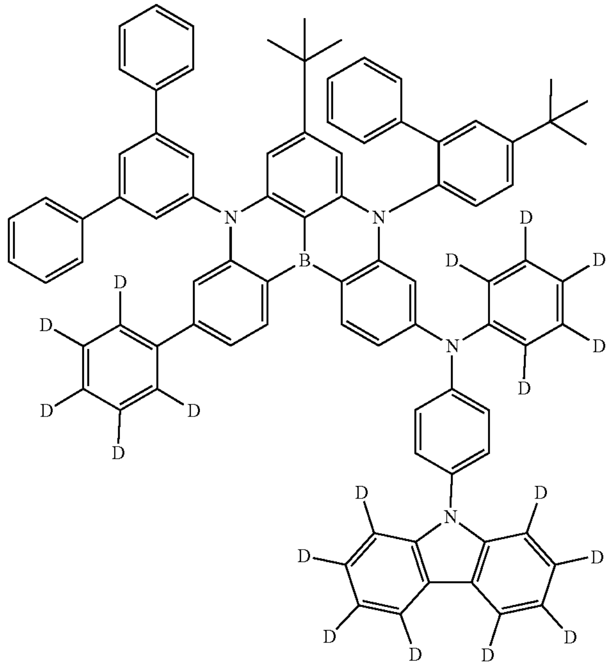
341
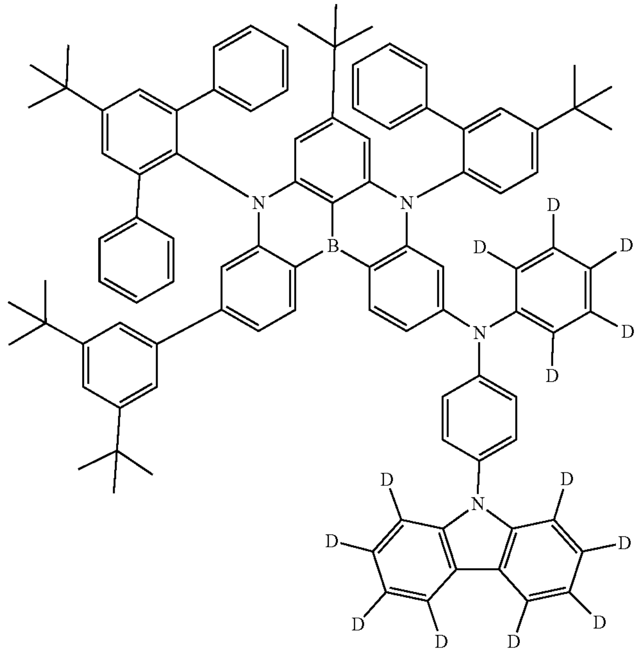

-continued
342
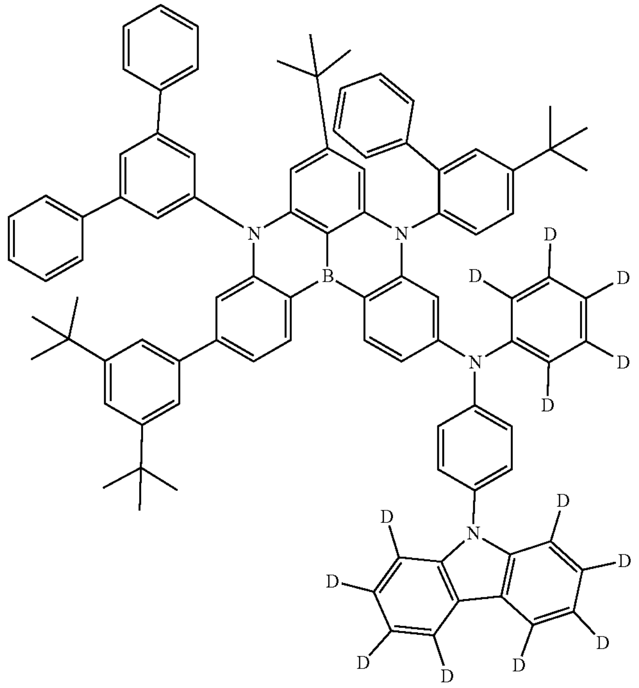
343
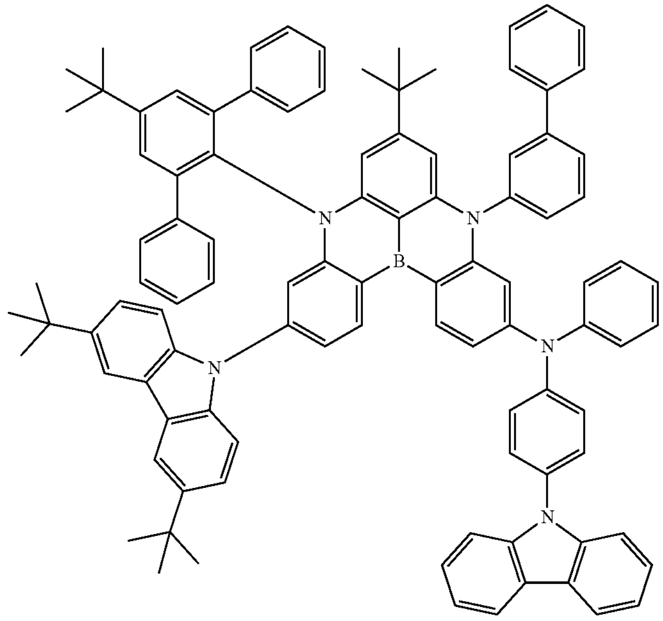

-continued
344
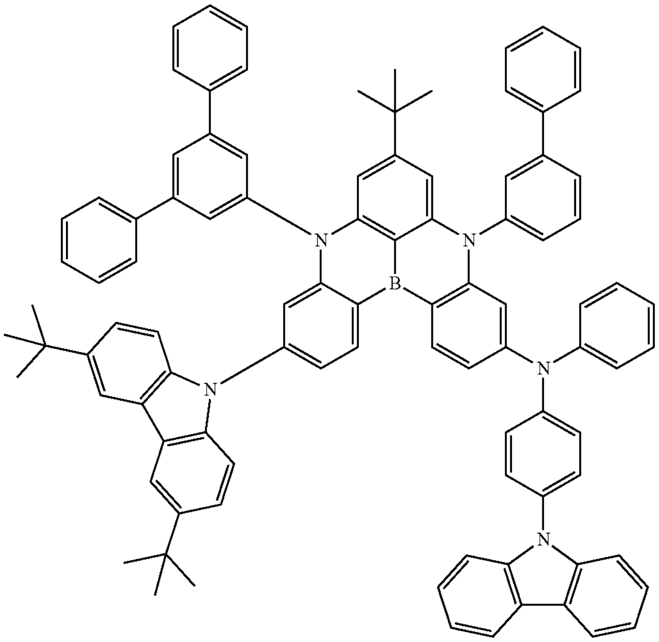
345
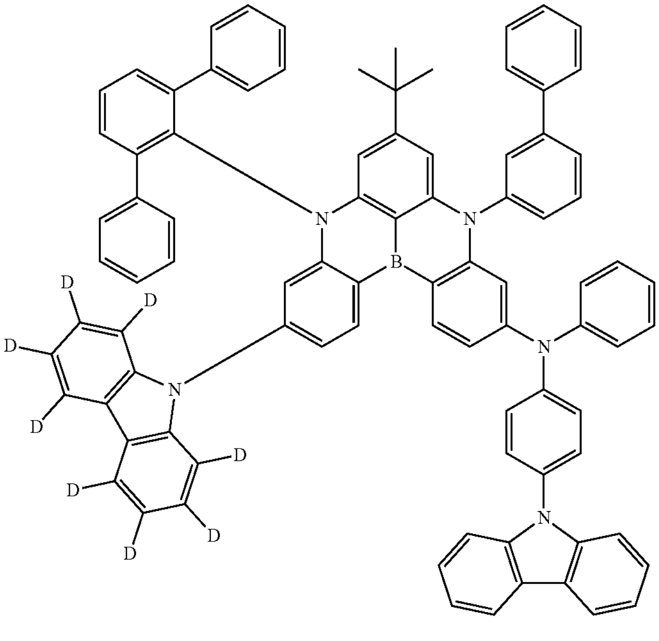

-continued
346
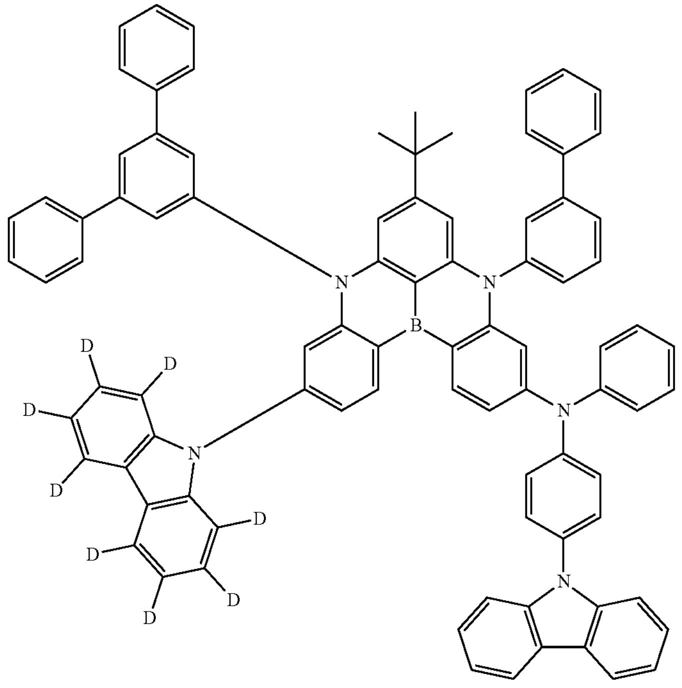
347
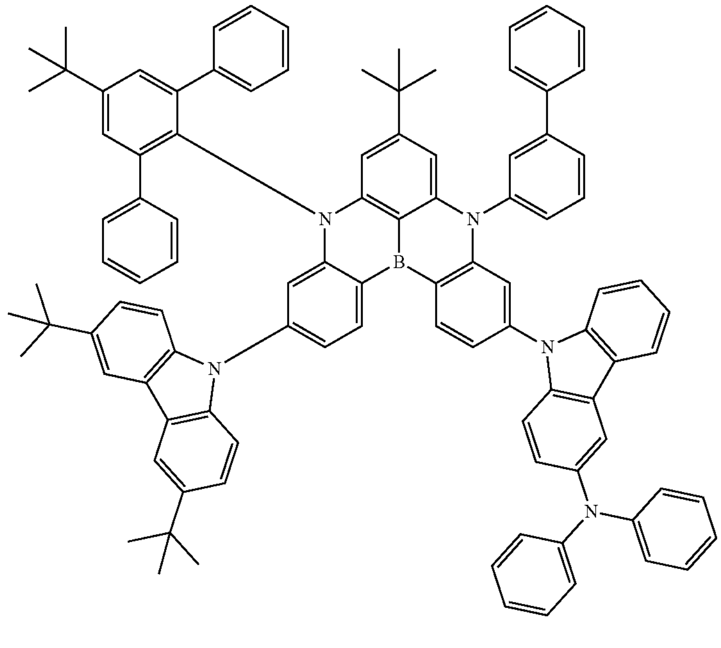

-continued
348
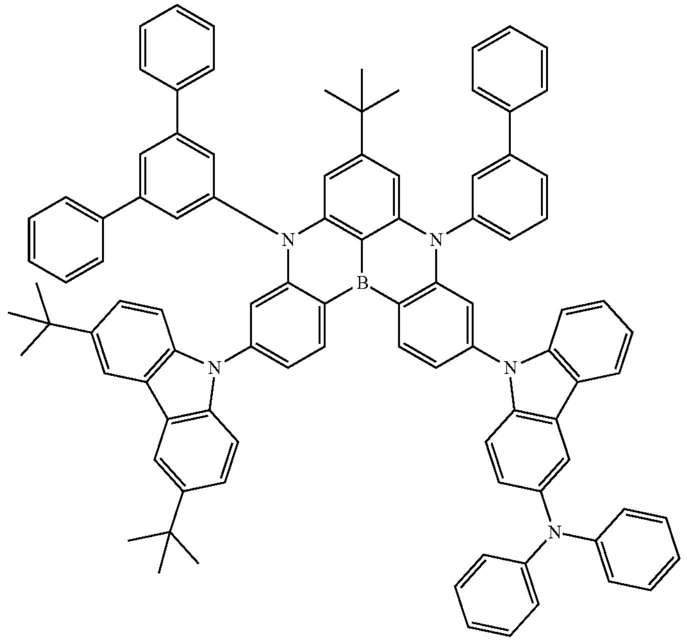
349
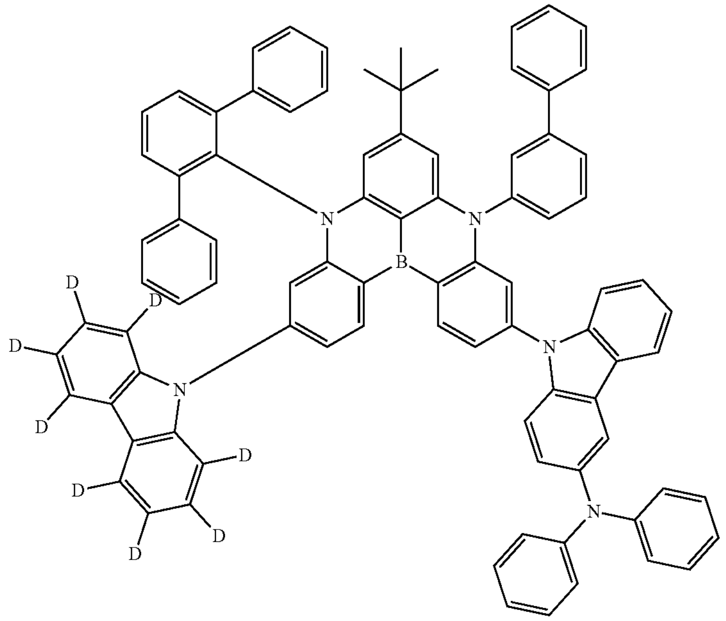

-continued
350
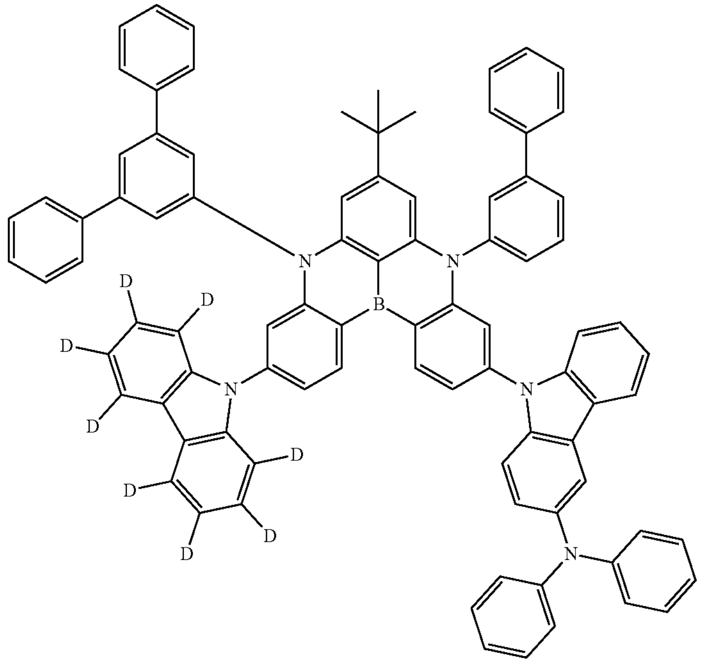
351
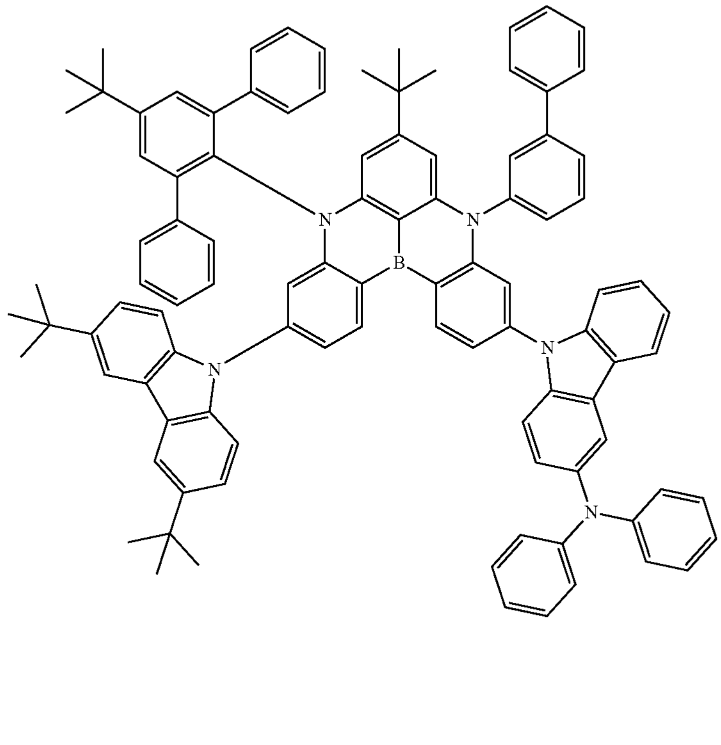

-continued
352
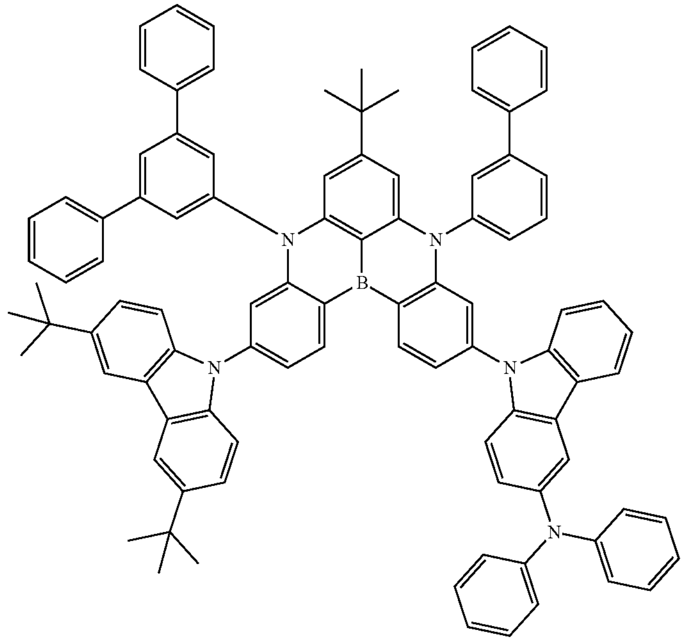
353
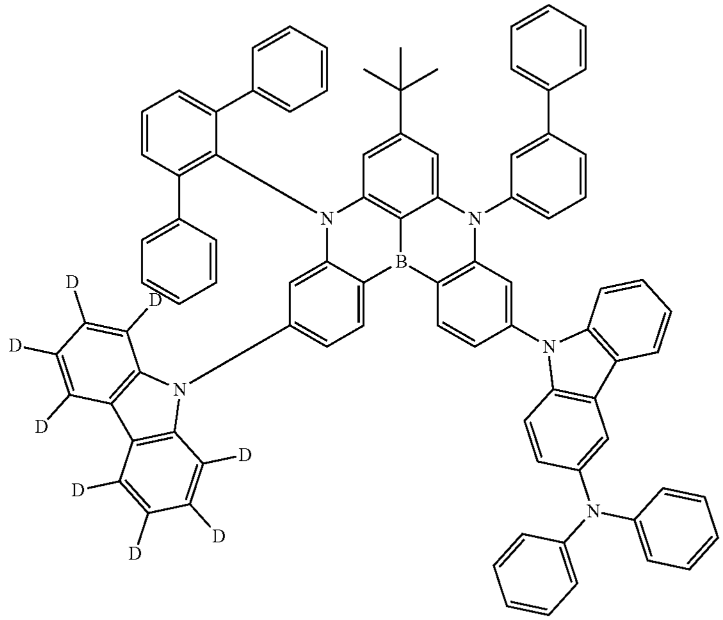

-continued
354
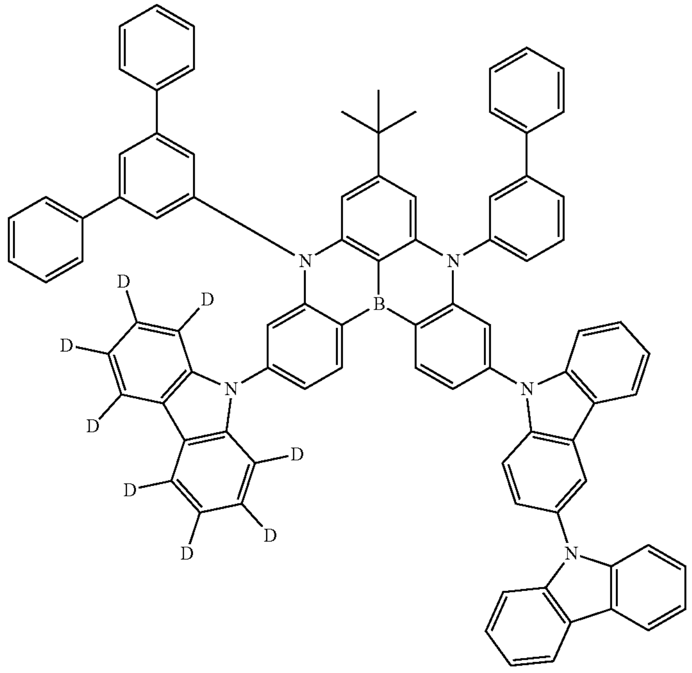
355
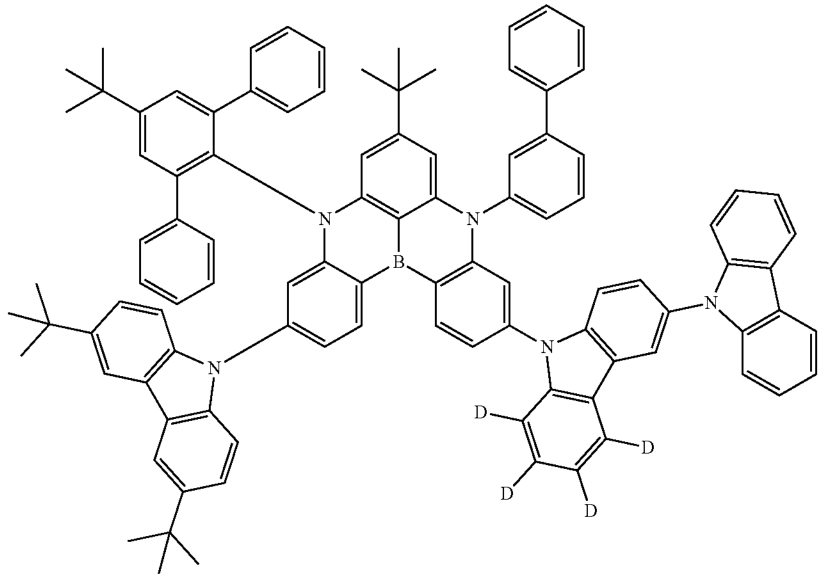

-continued
356
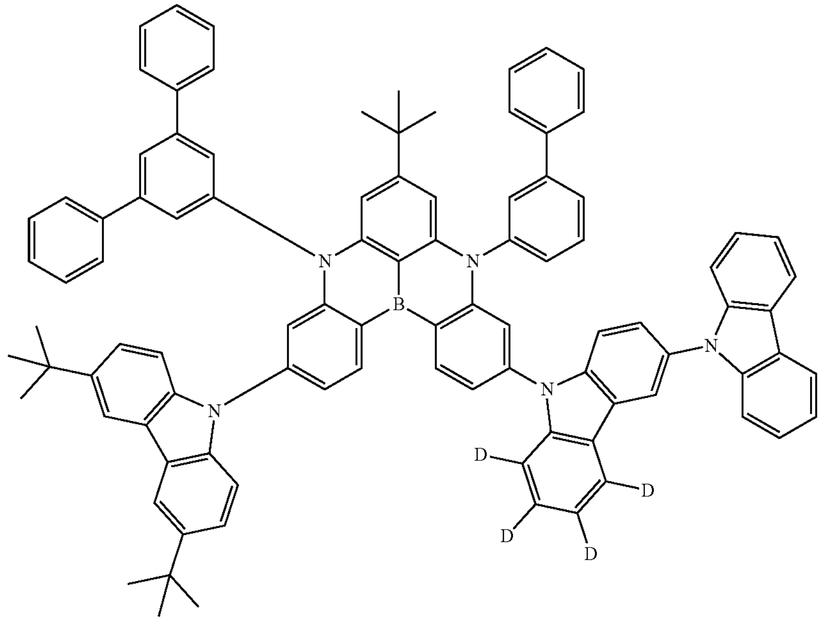
357
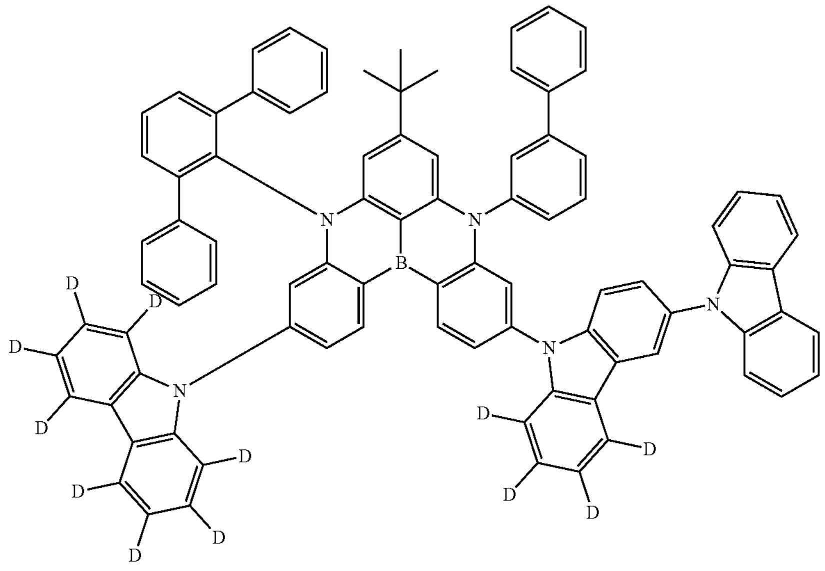

-continued
358
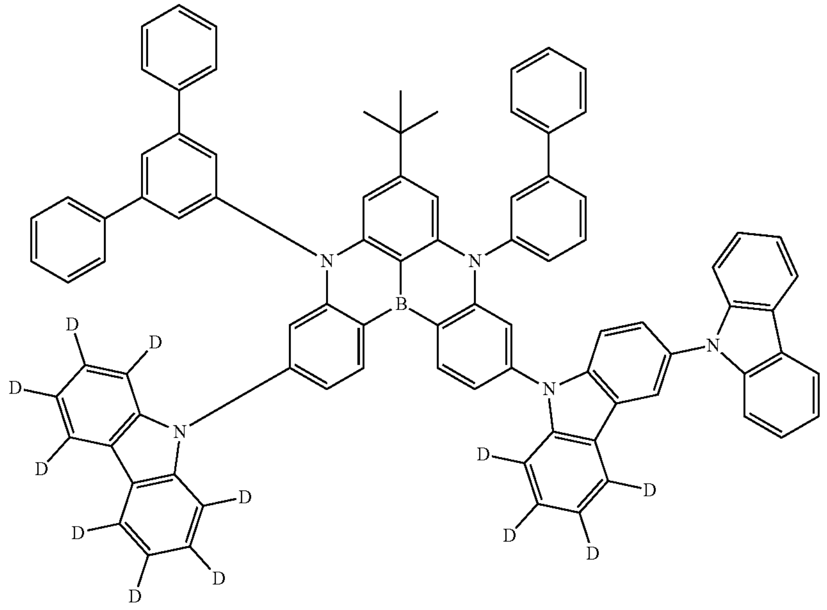
359
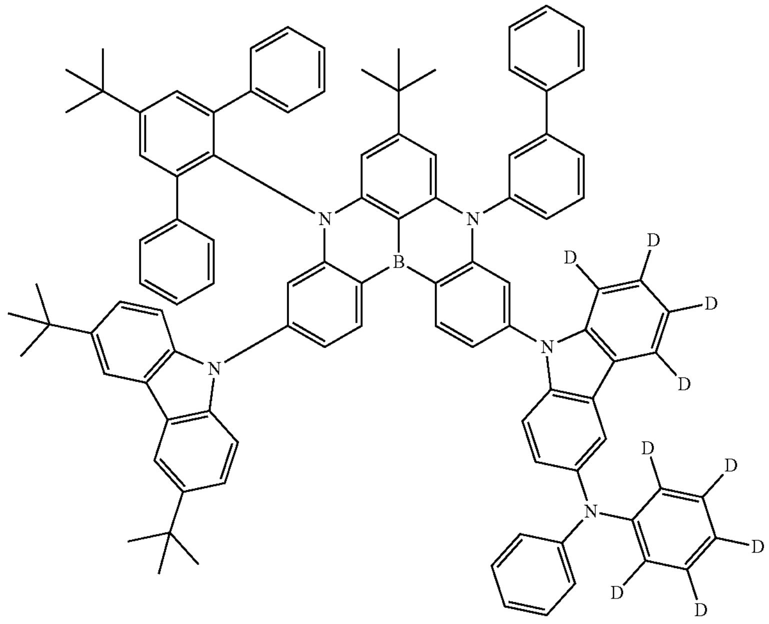

-continued
360
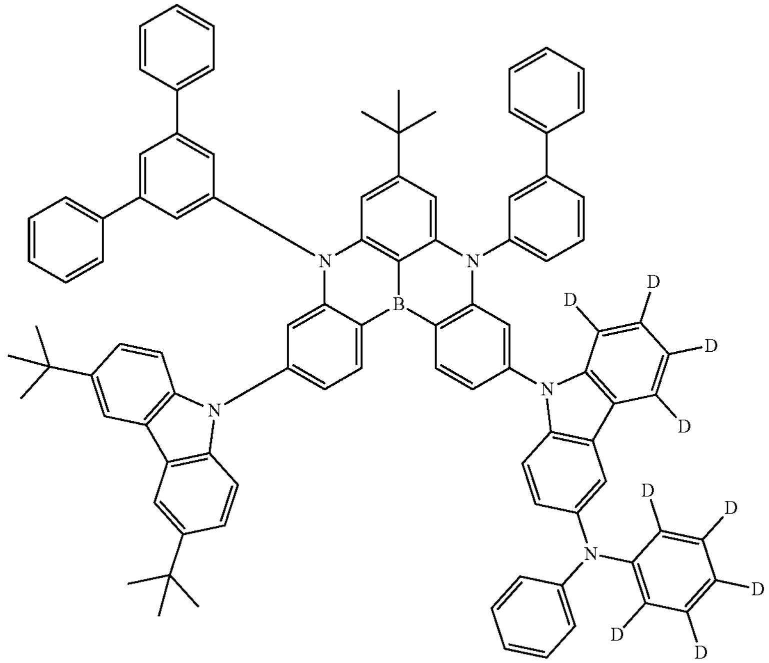
361
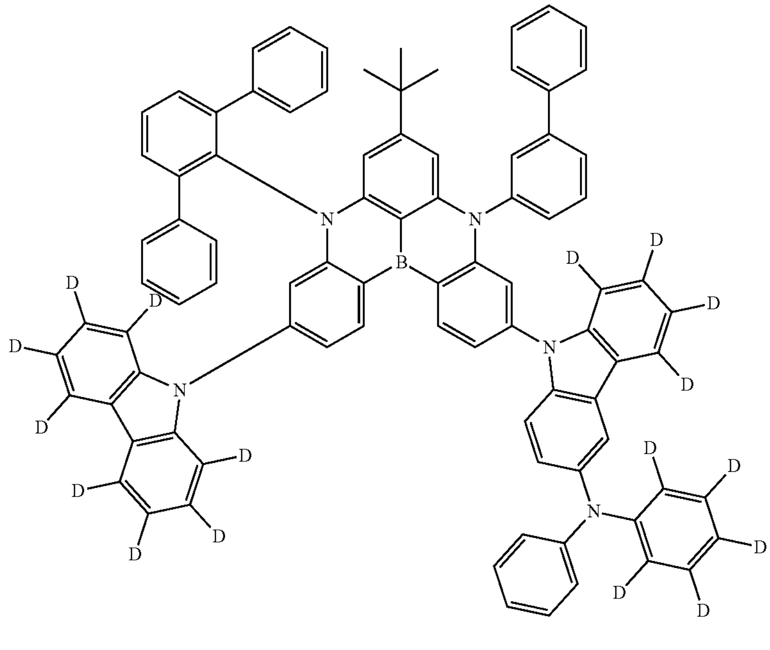

-continued
362
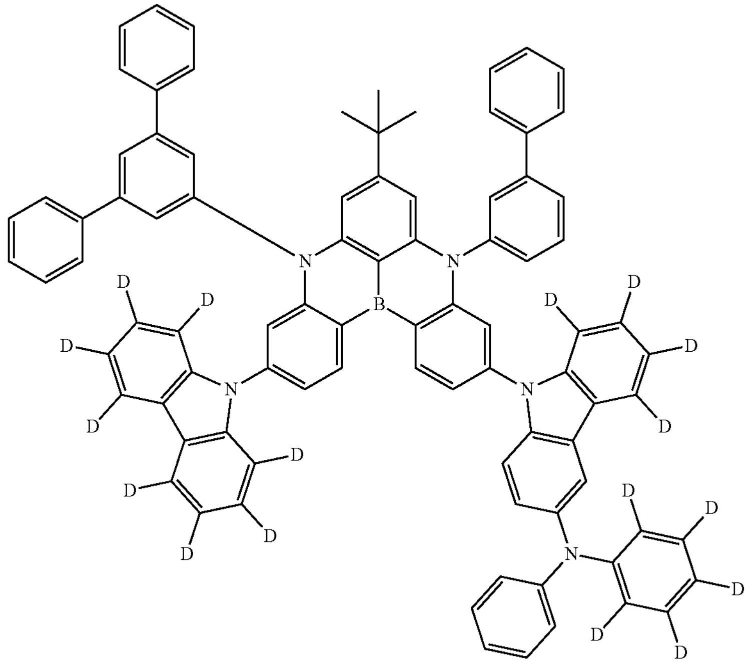
363
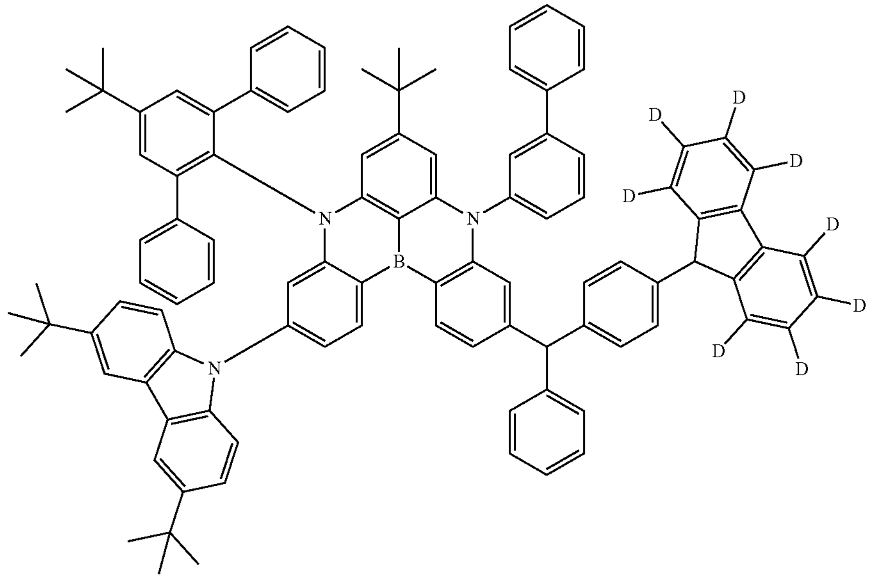

-continued
364
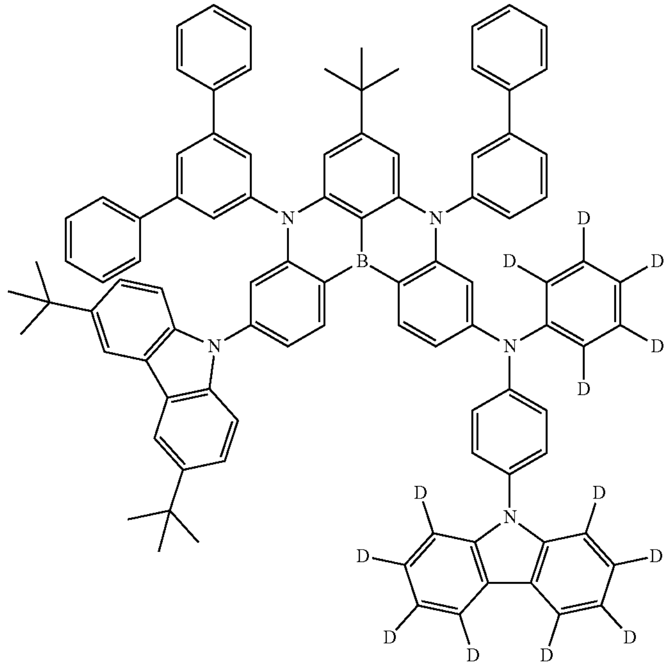
365
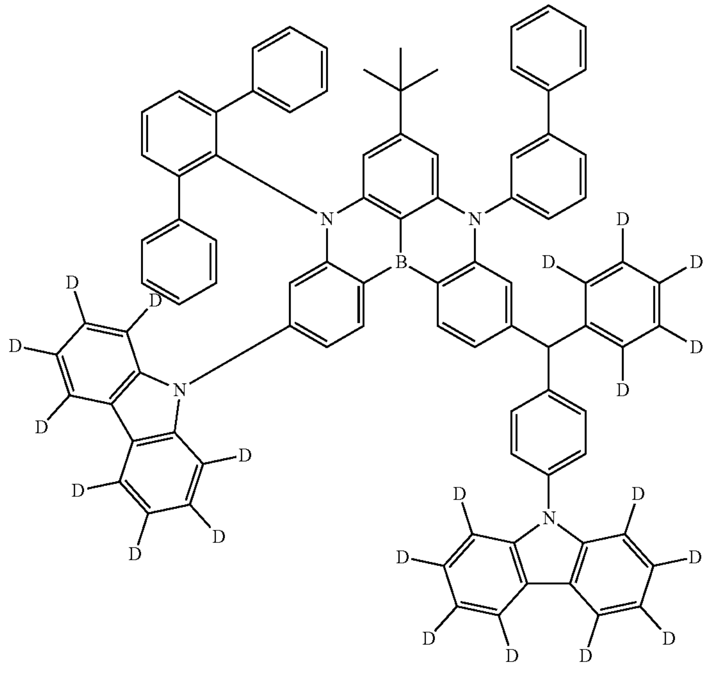

-continued
366
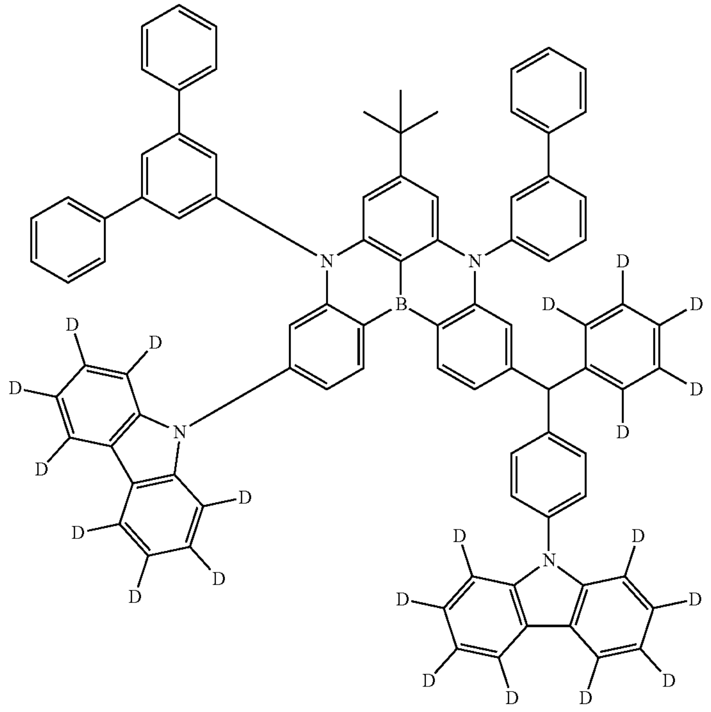
367
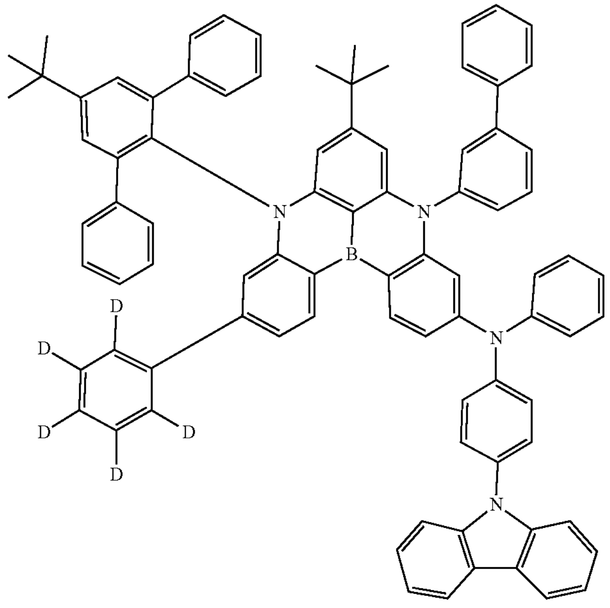

-continued
368
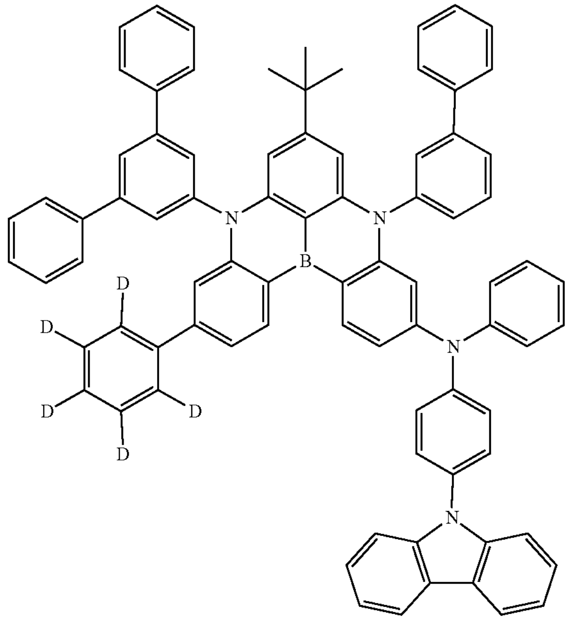
369
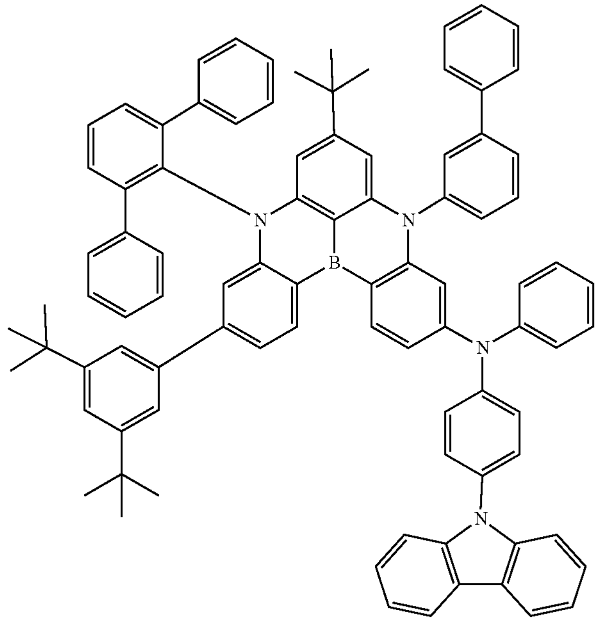

-continued
370
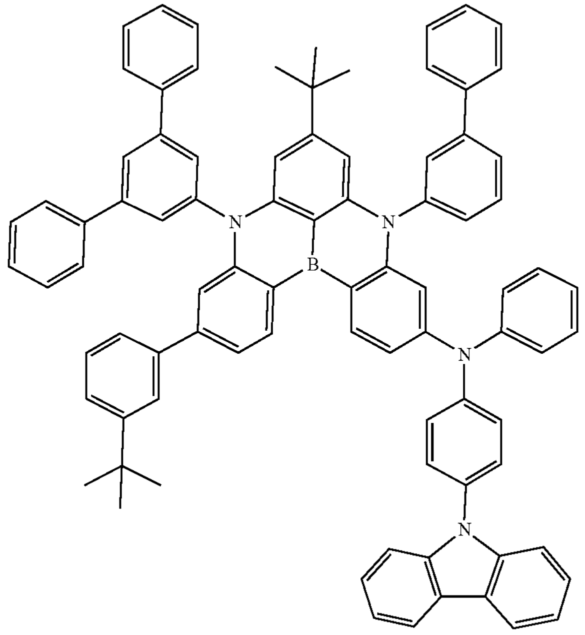
371
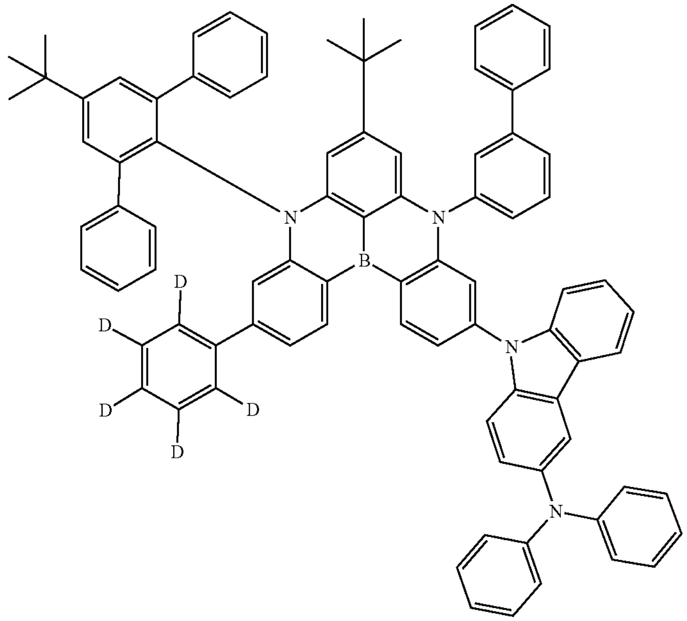

-continued
372
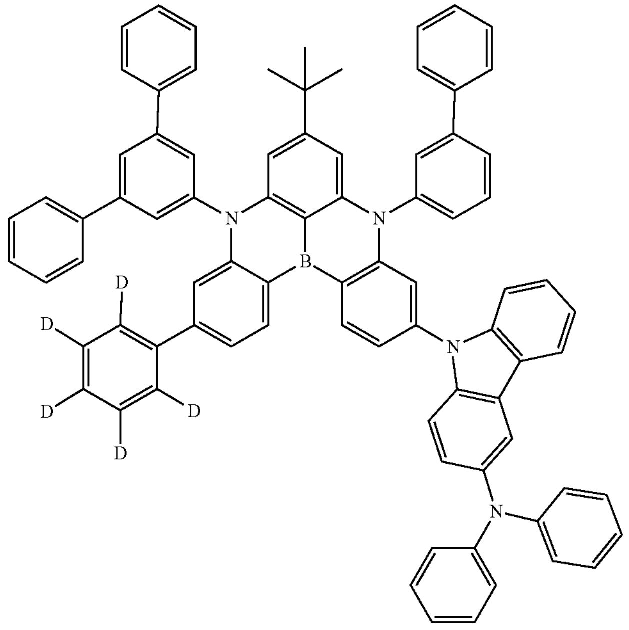
373
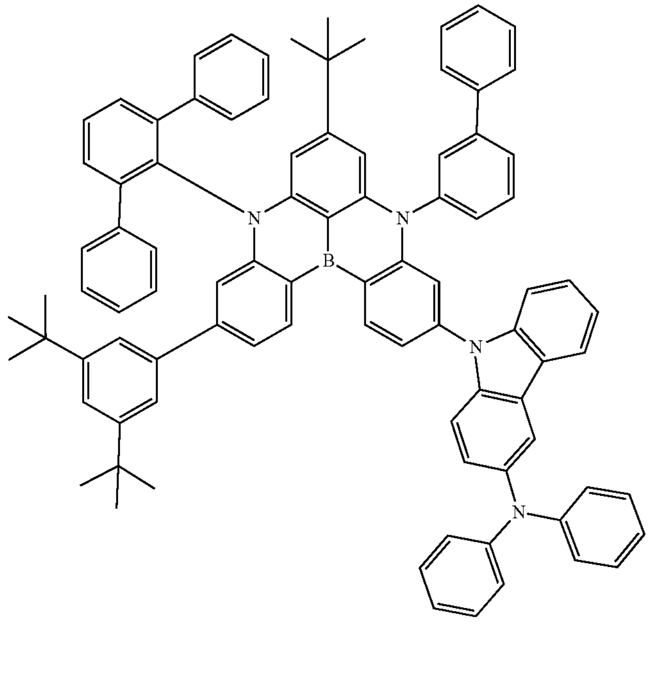

-continued
374
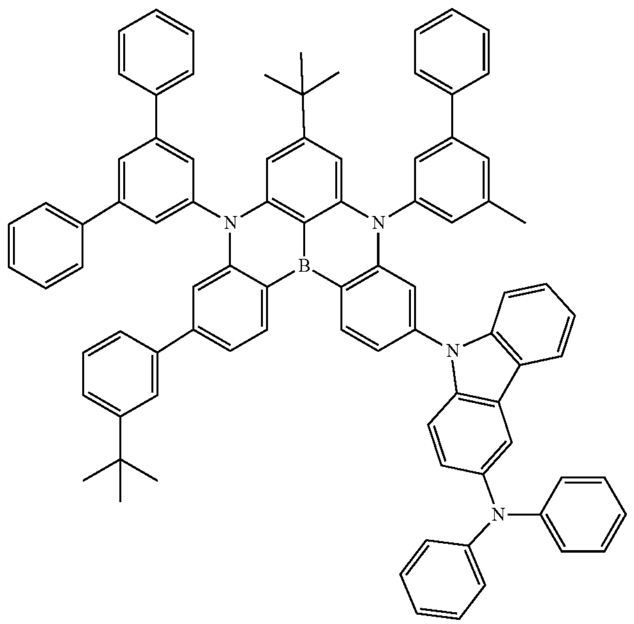
375
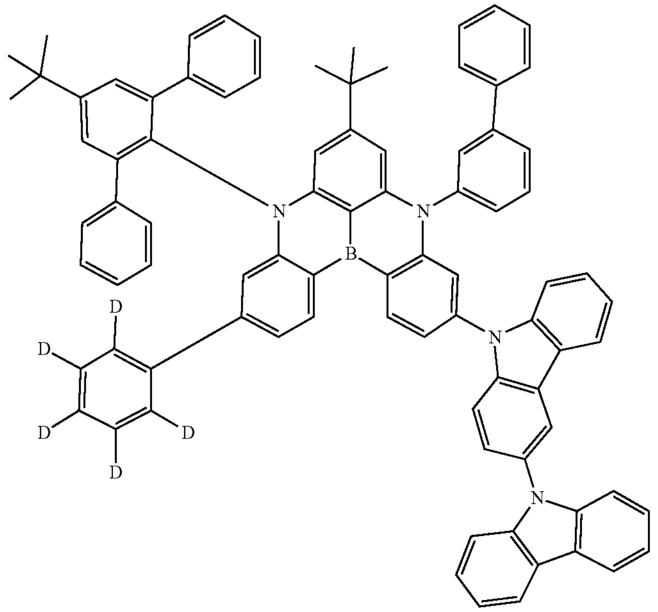

-continued
376
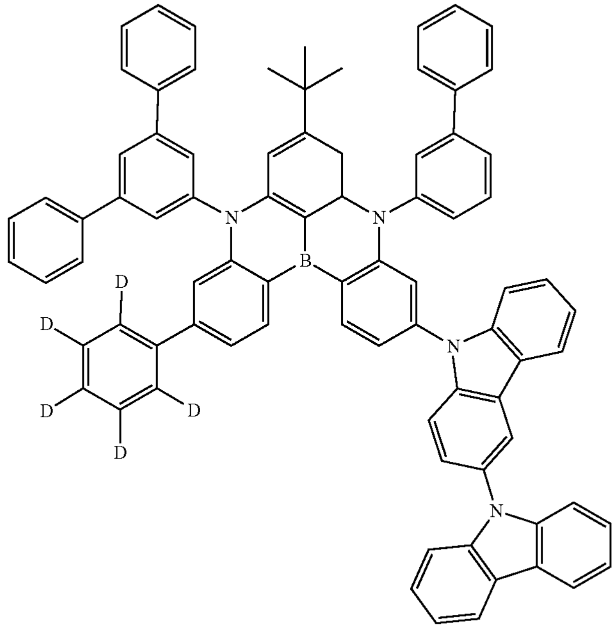
377
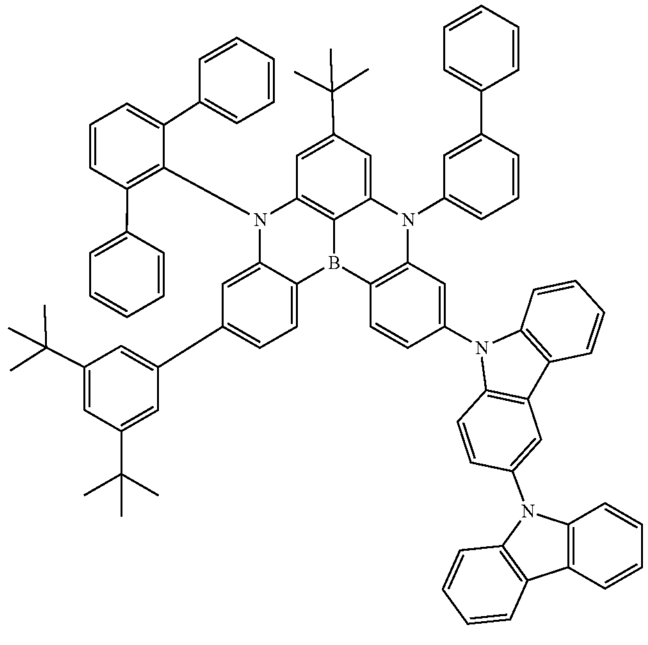

-continued
378
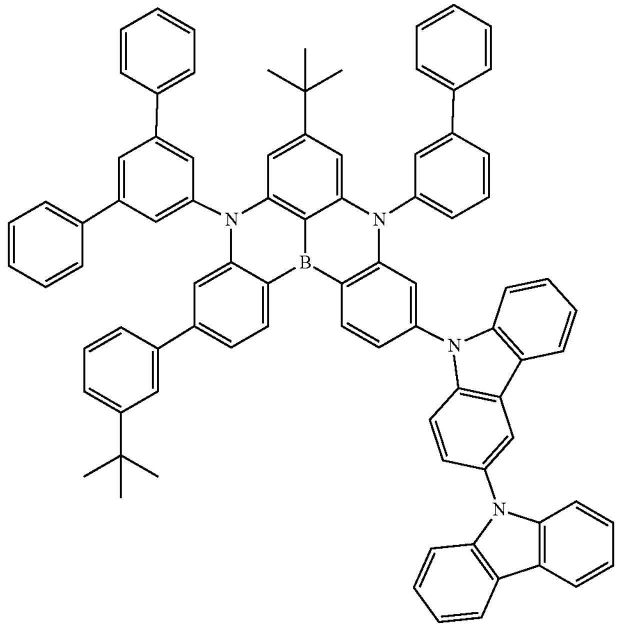
379
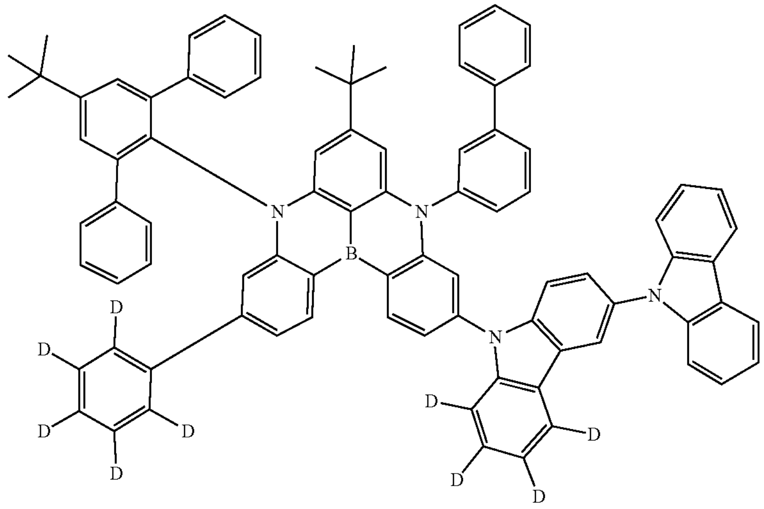
380
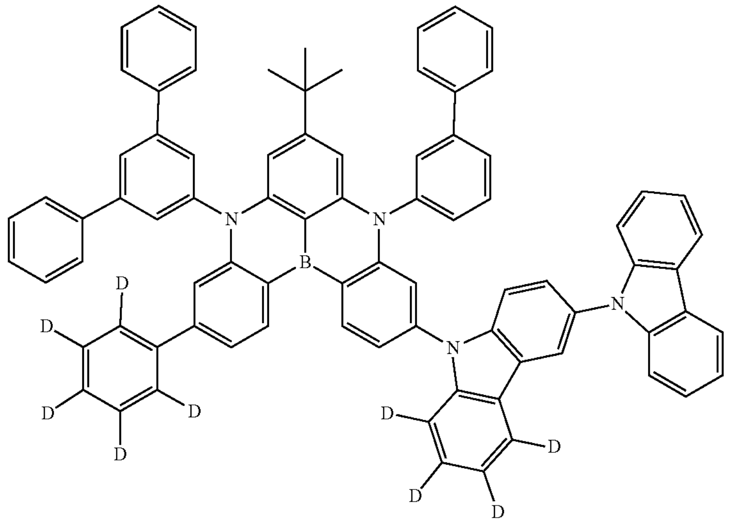

-continued
381
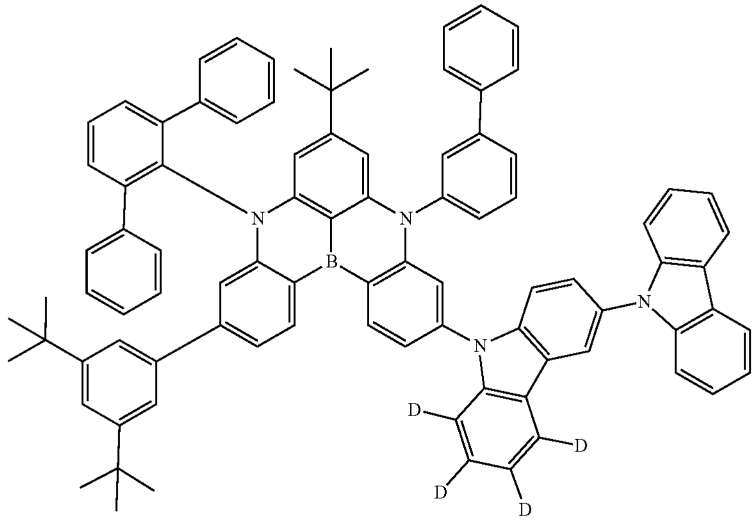
382
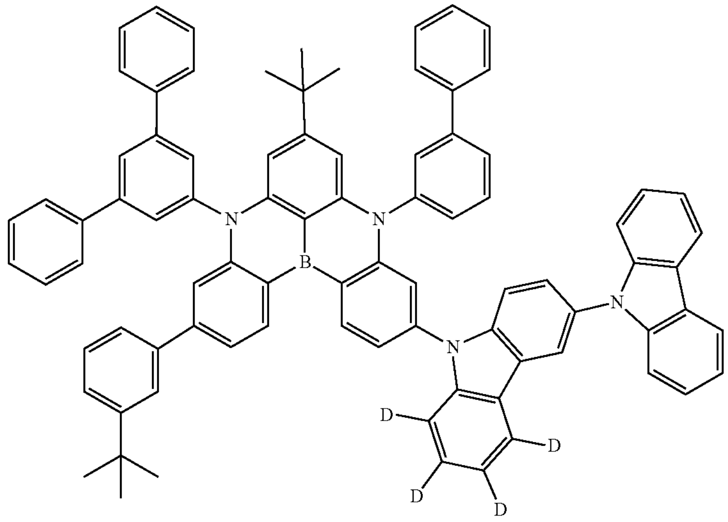
383
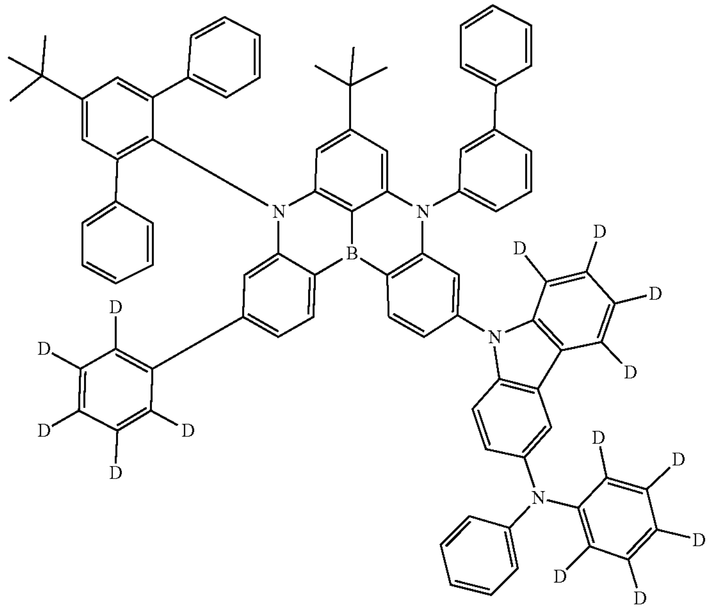

-continued
384
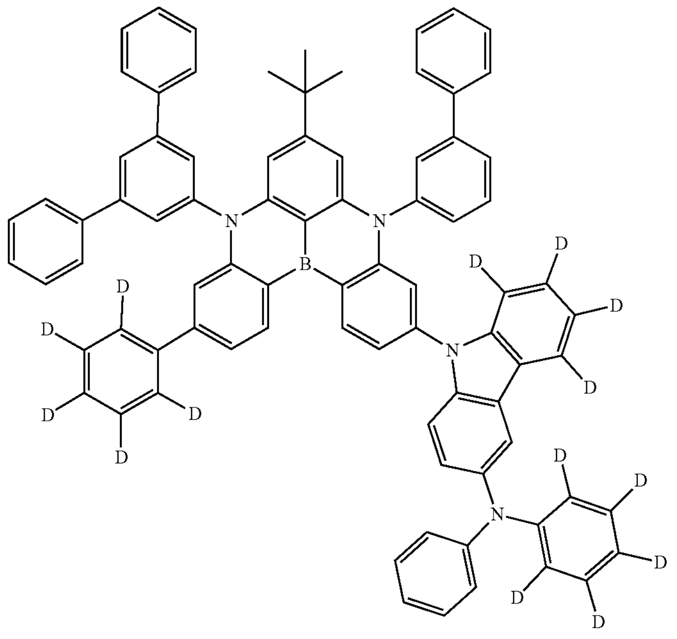
385
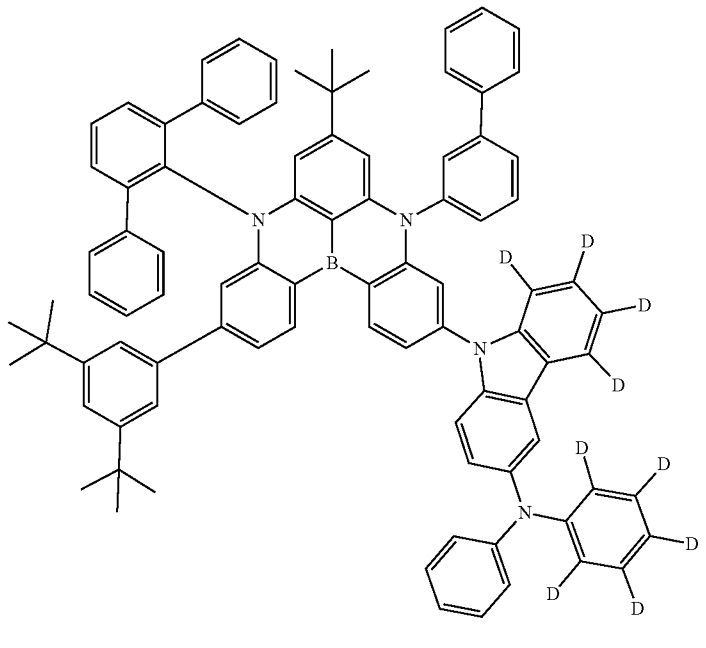

-continued
386
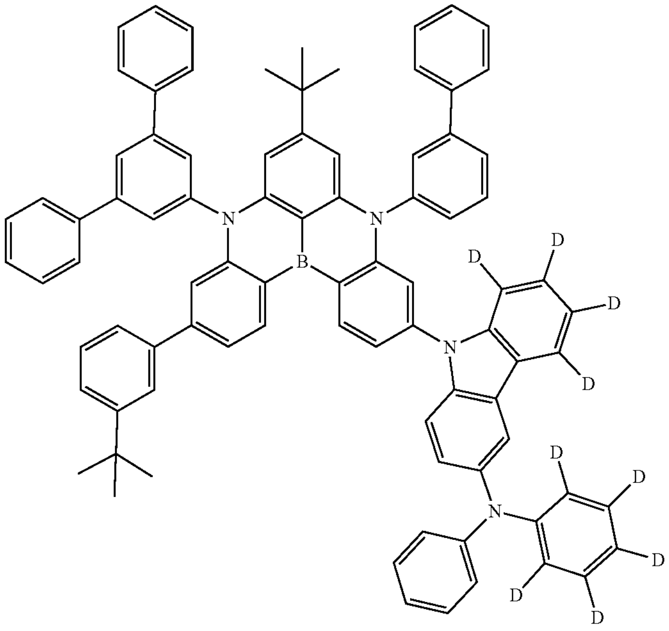
387
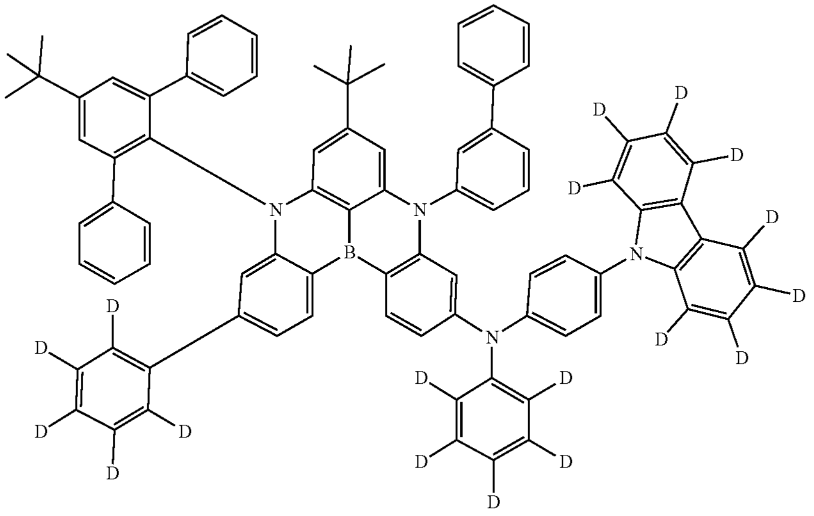

-continued
388
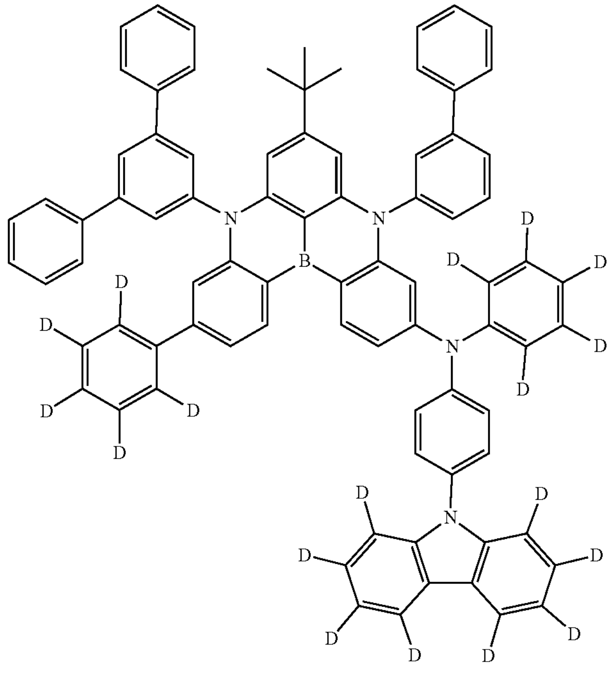
389
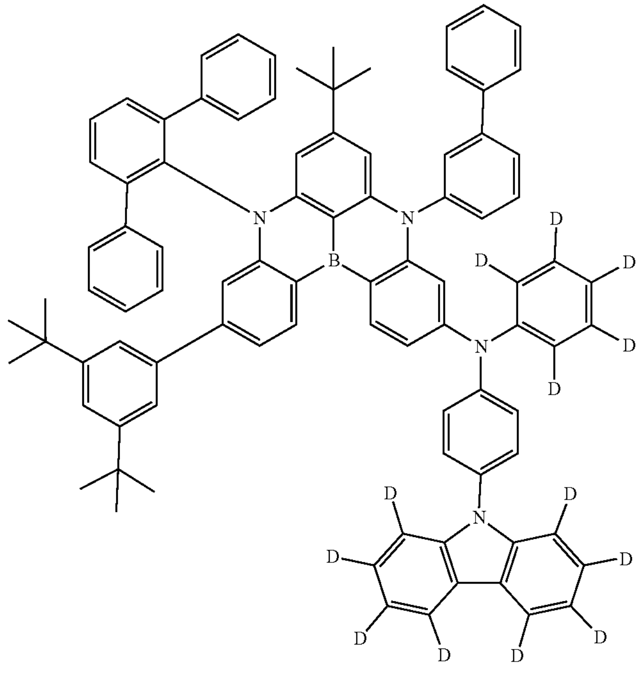

-continued
390
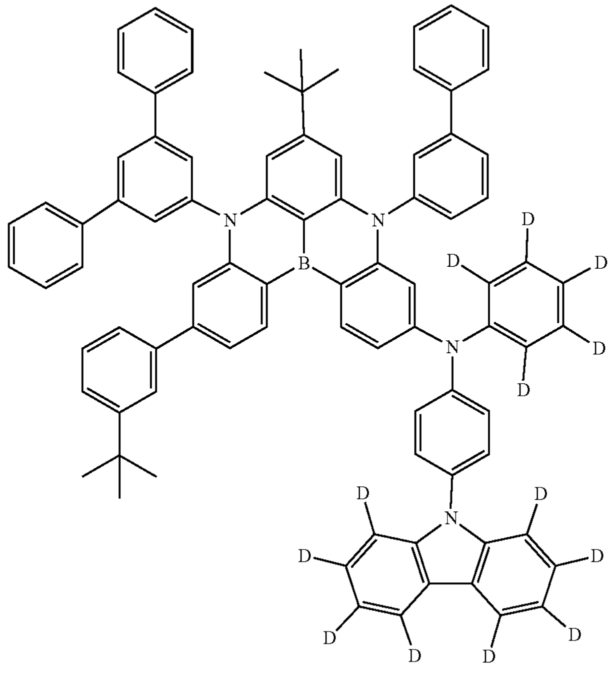
391
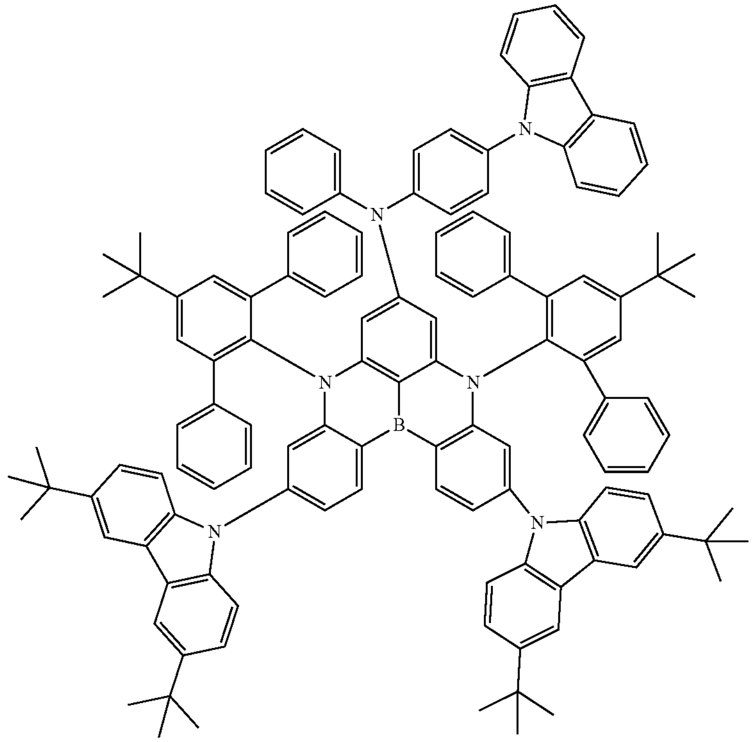

-continued
392
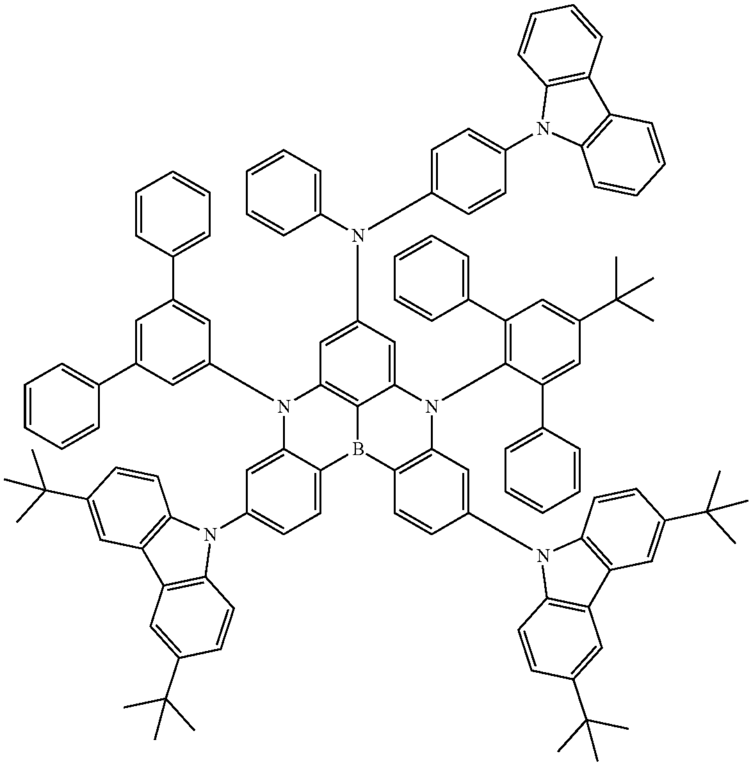
393
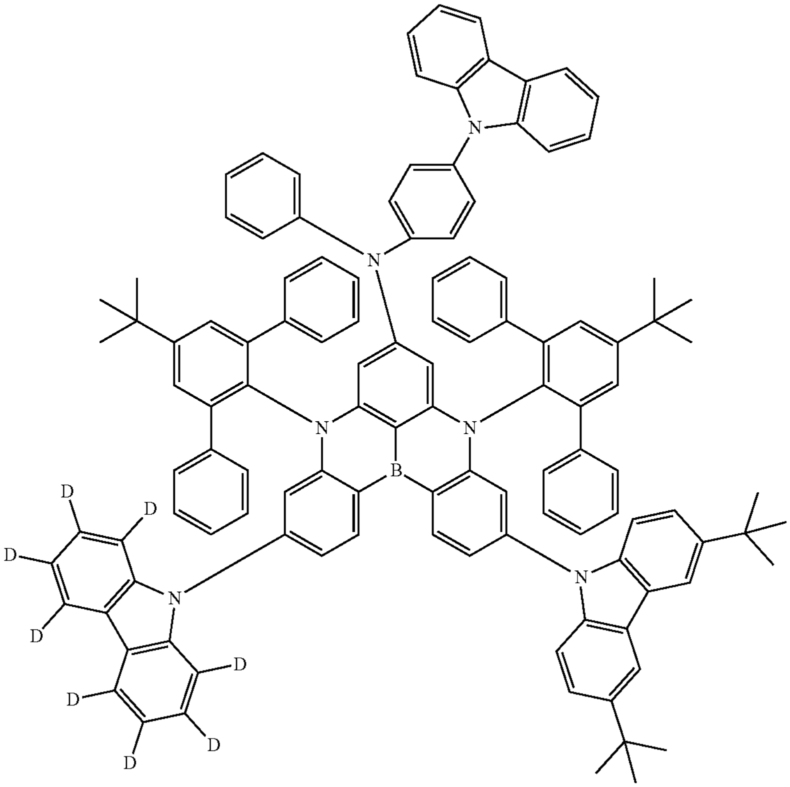

-continued
394
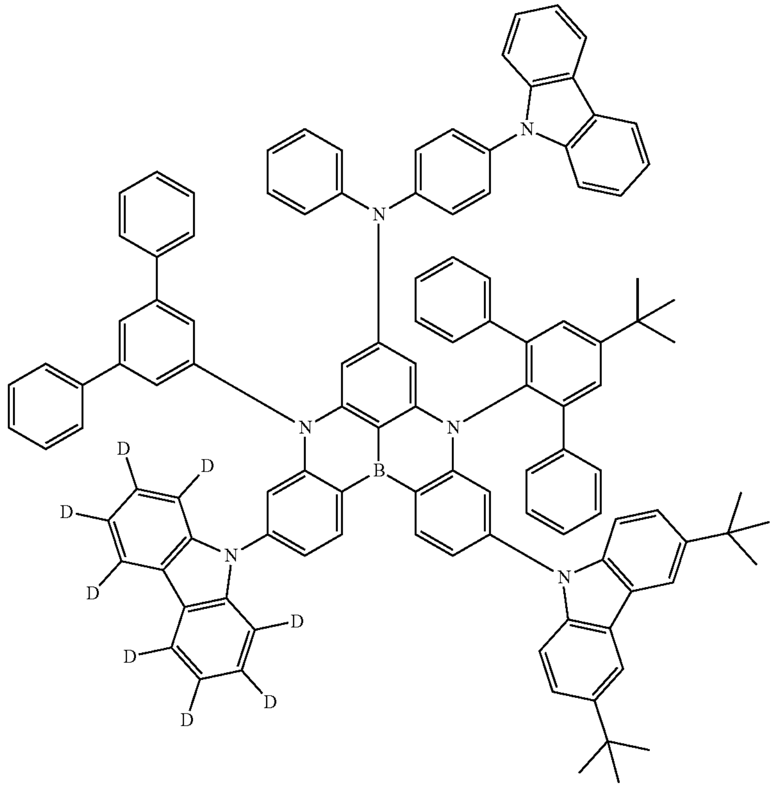
395
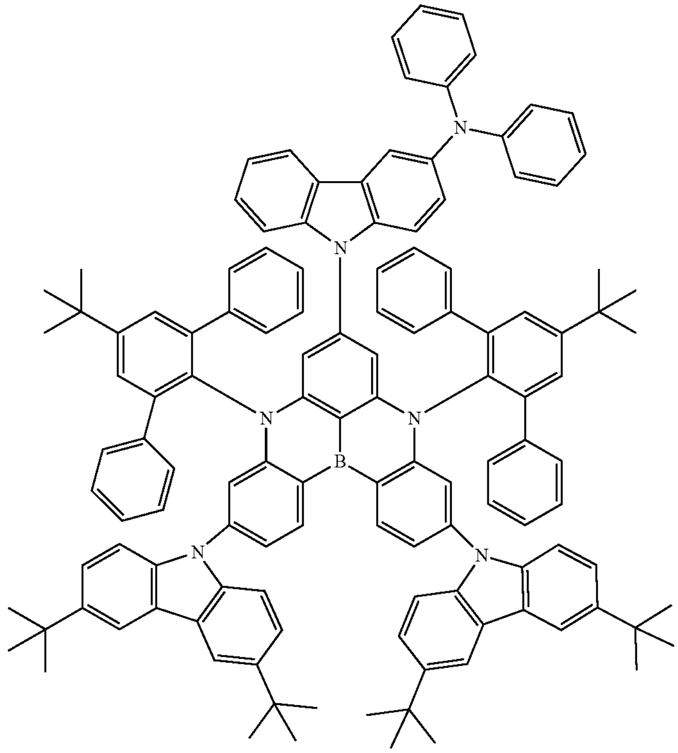

-continued
396
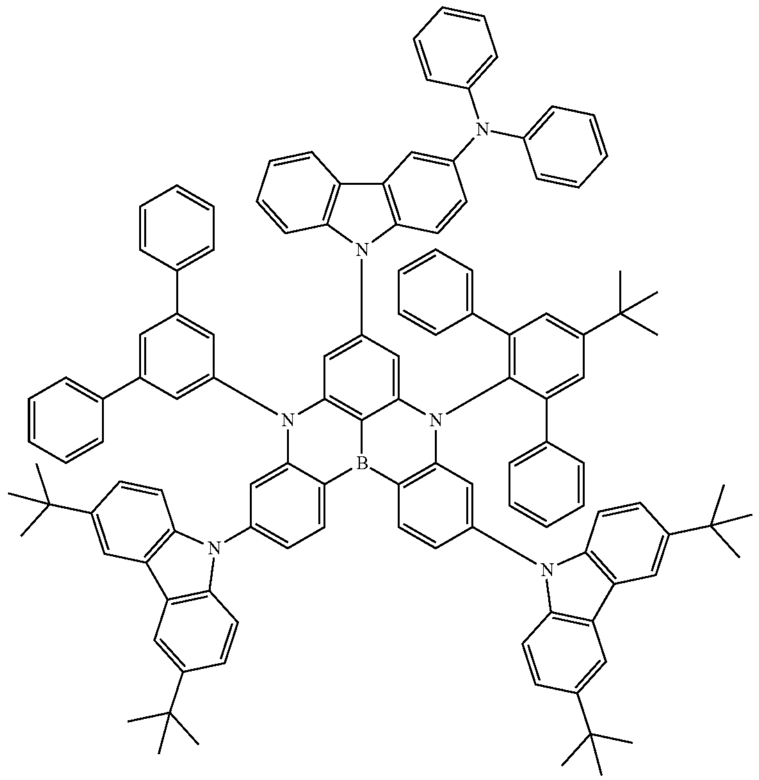
397
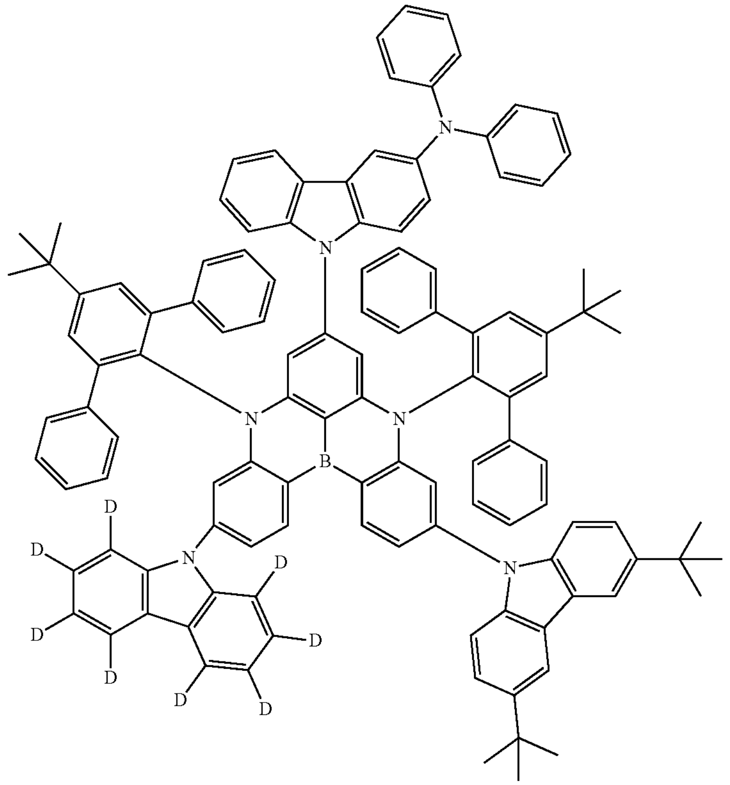

-continued
398
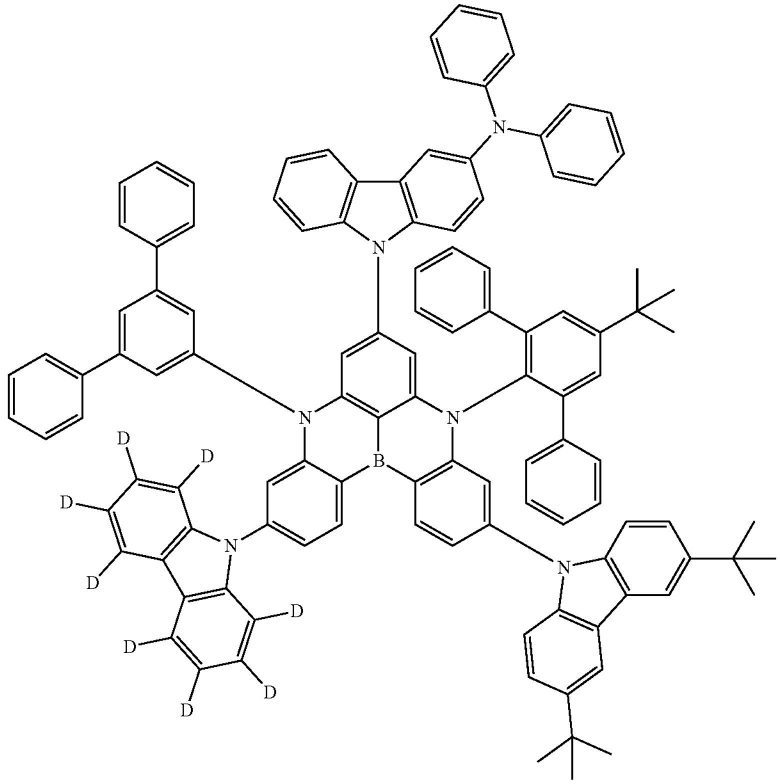
399
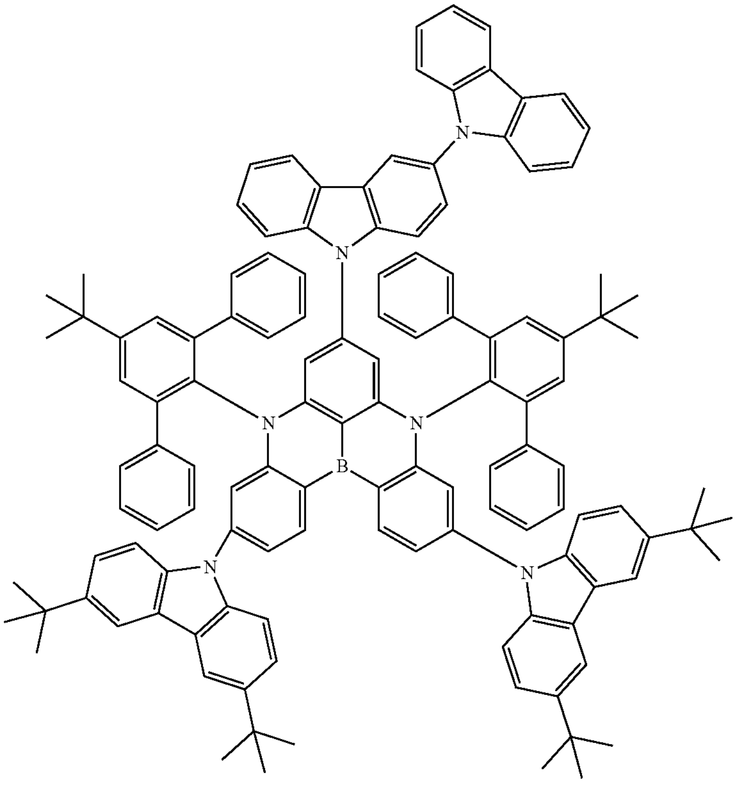

-continued
400
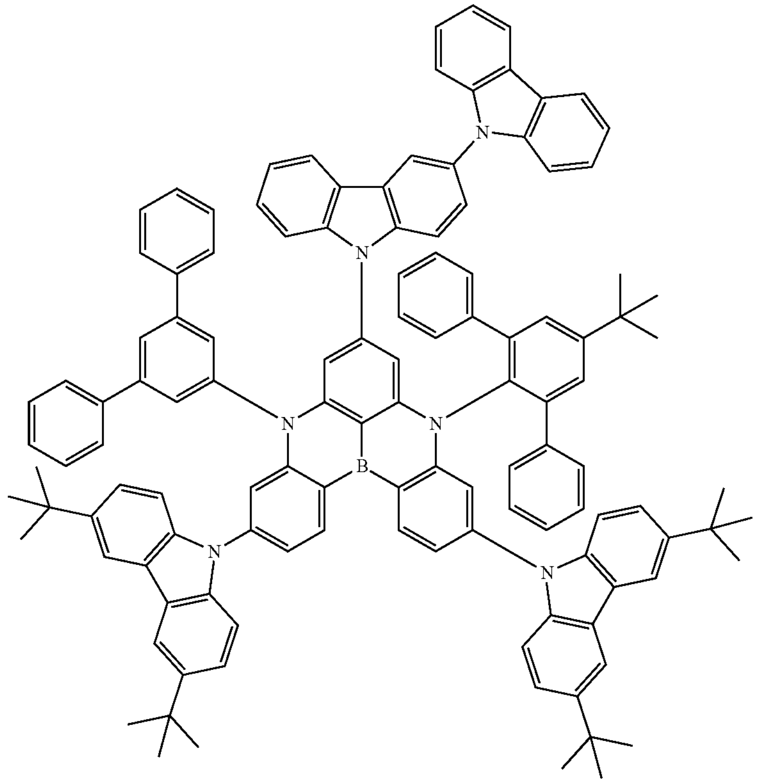
401
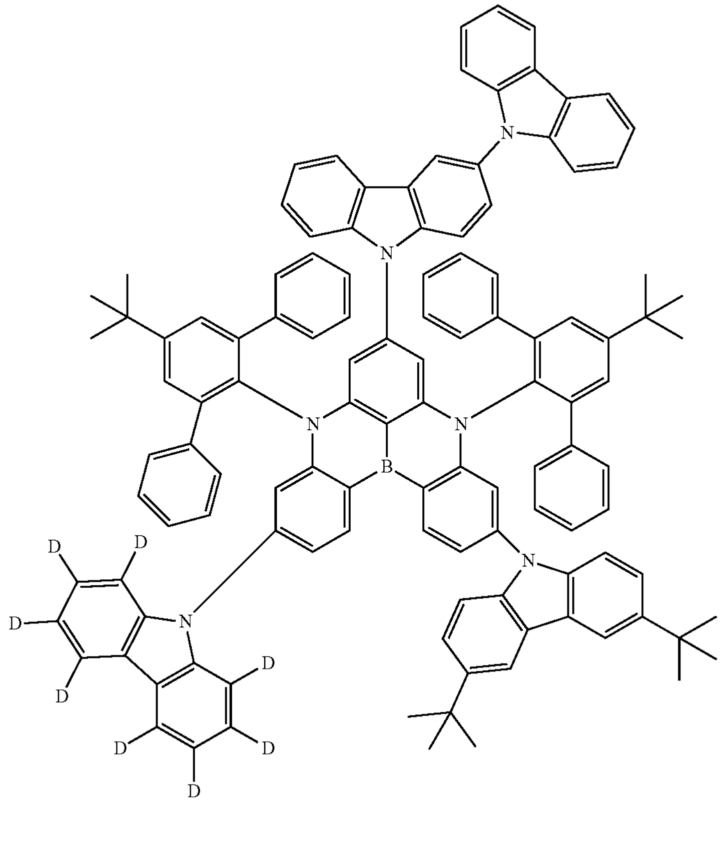

-continued
402
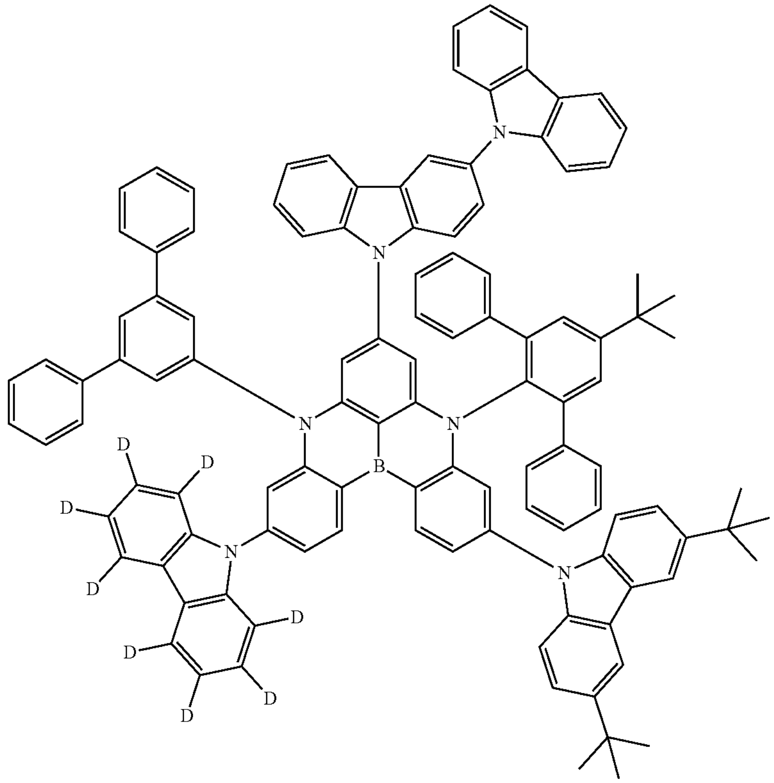
403
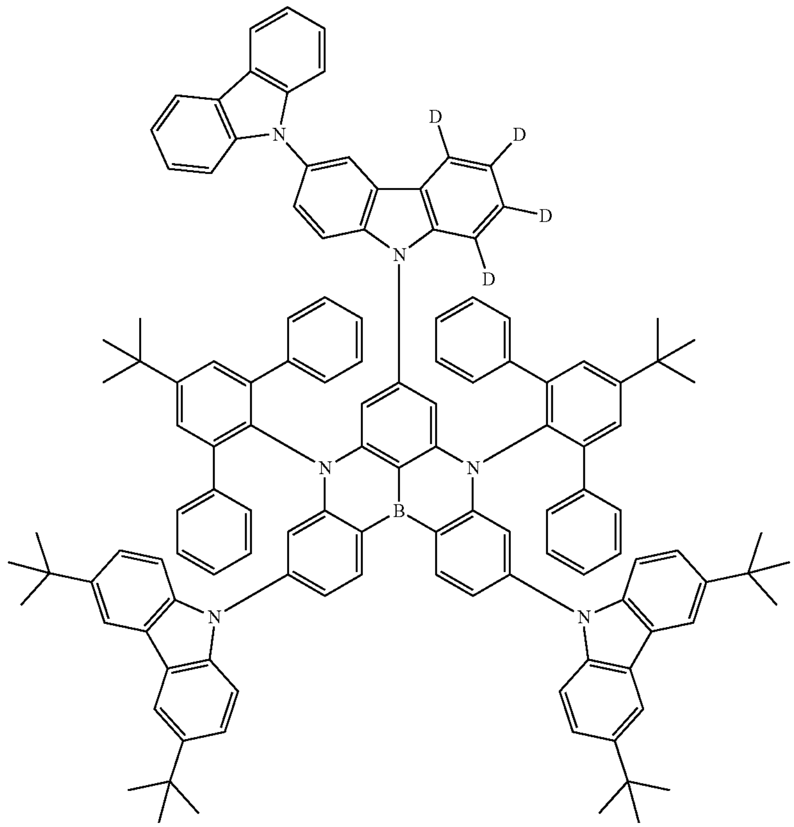

-continued
404
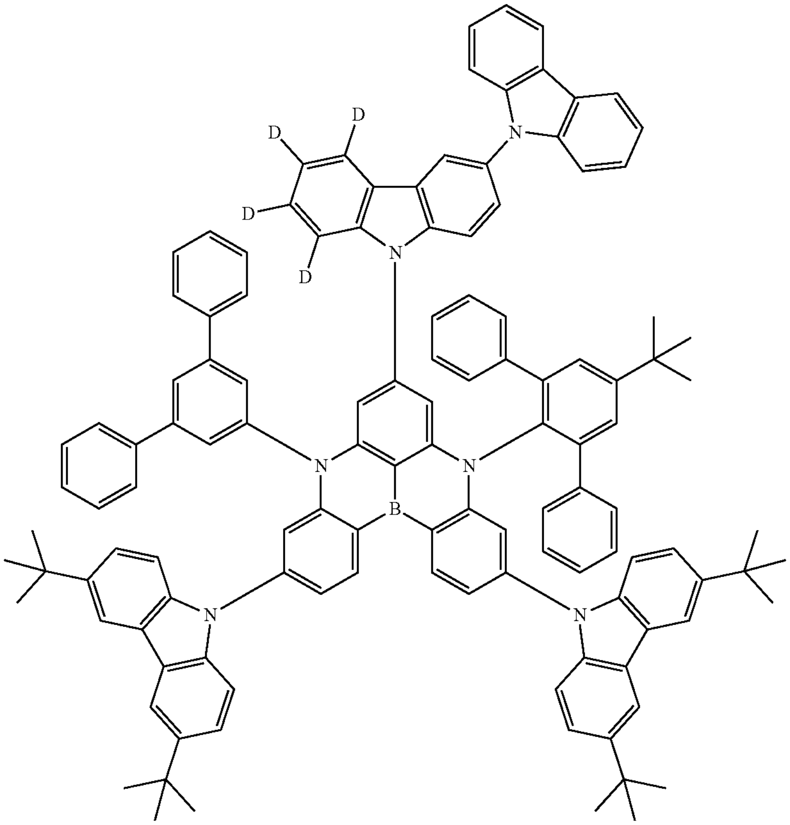
405
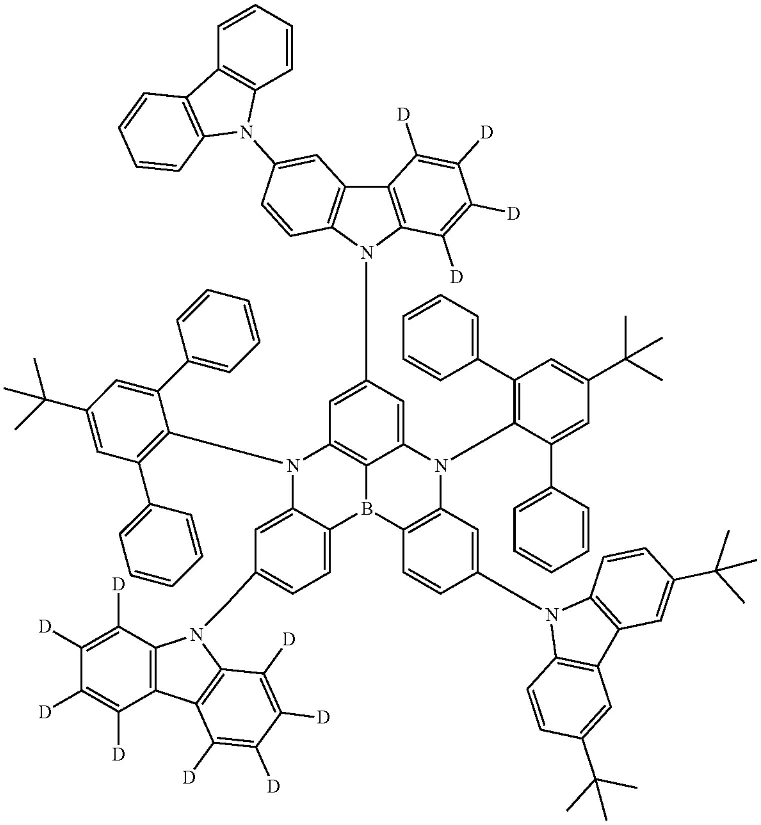

-continued
406
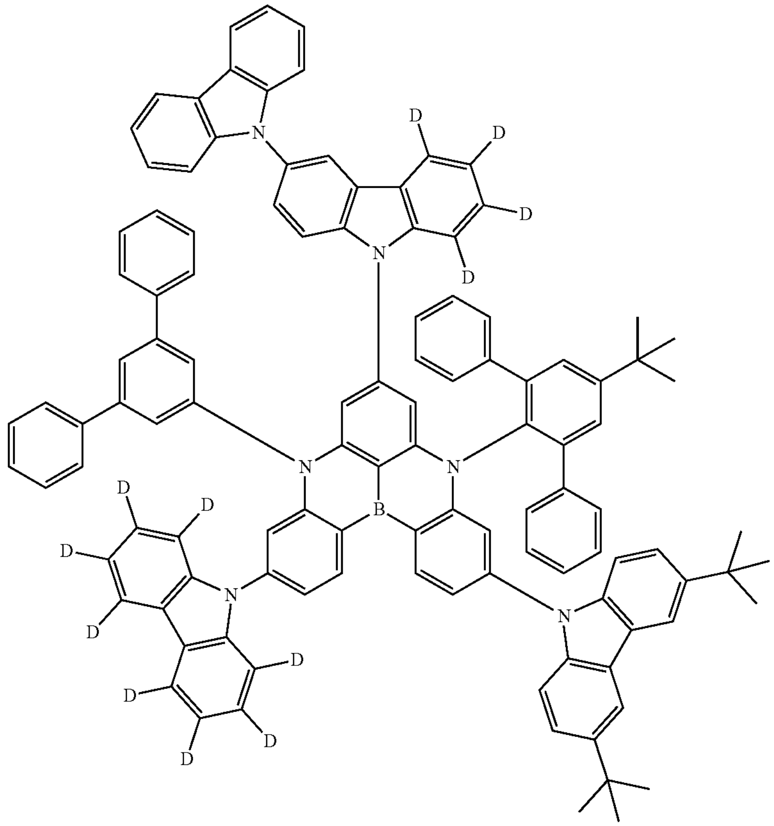
407
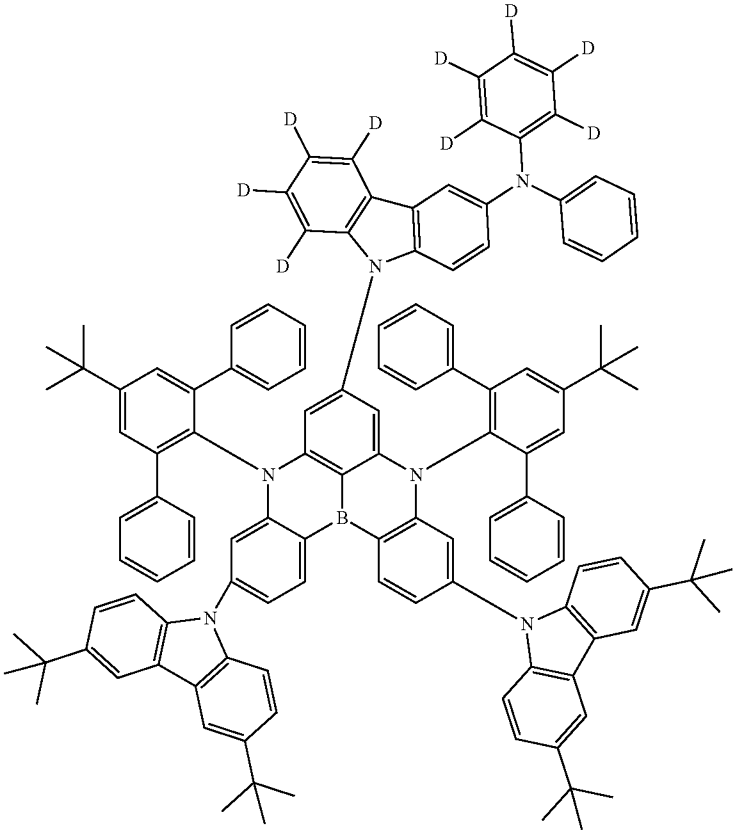

-continued
408
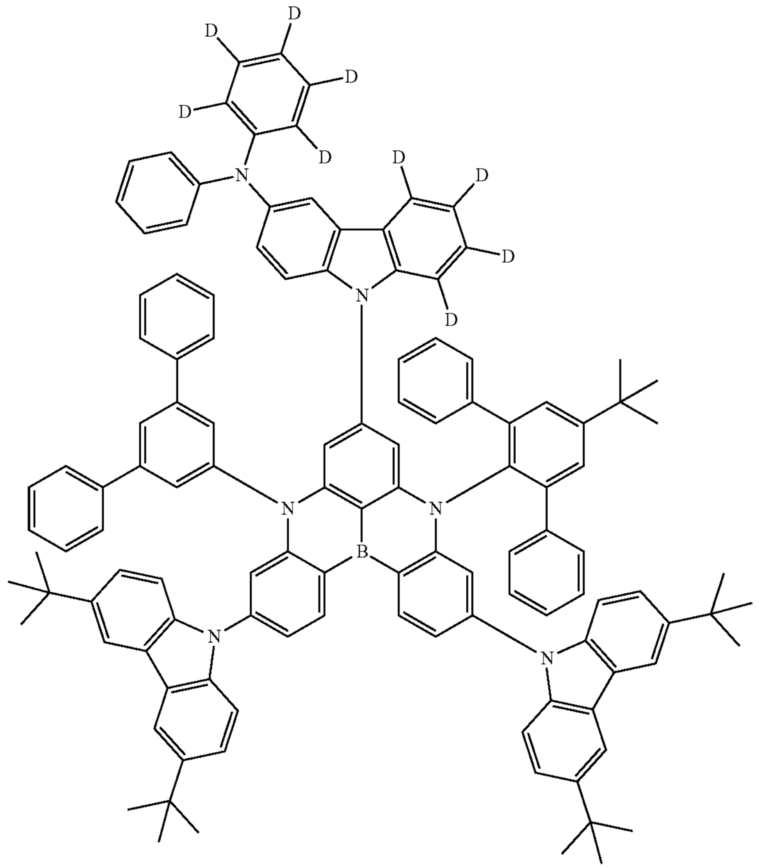

-continued
409
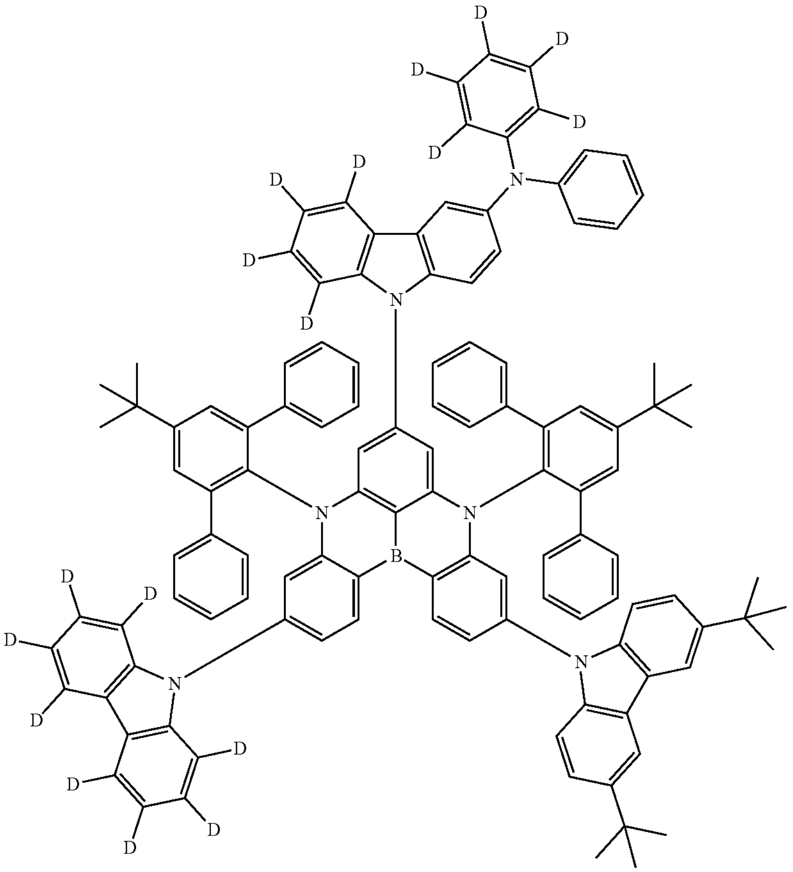

-continued
410
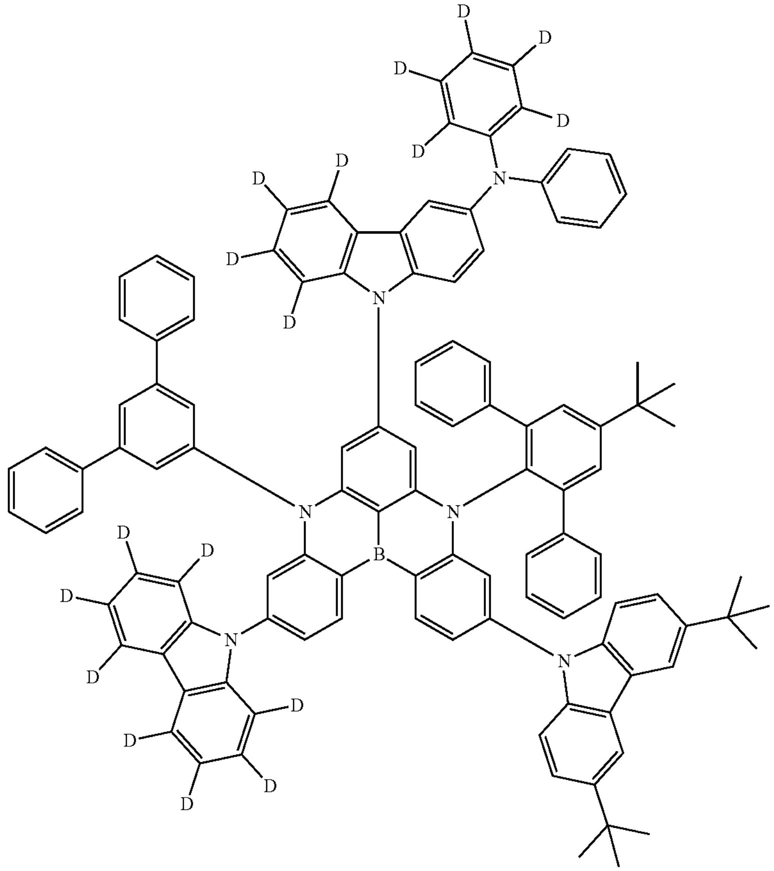

-continued
411
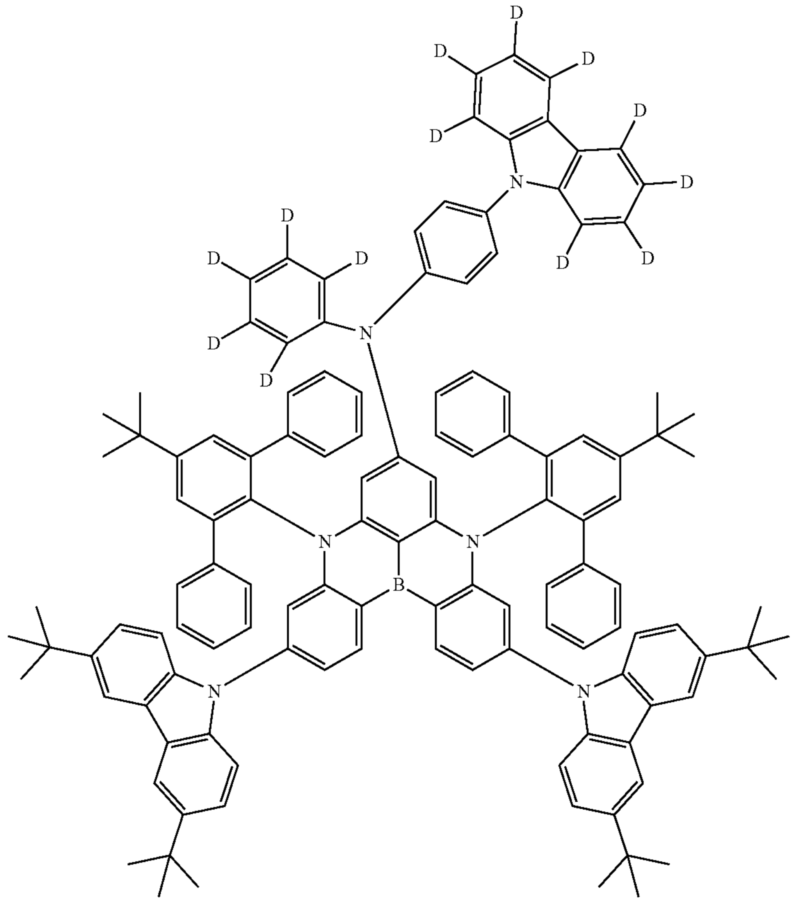

-continued
412
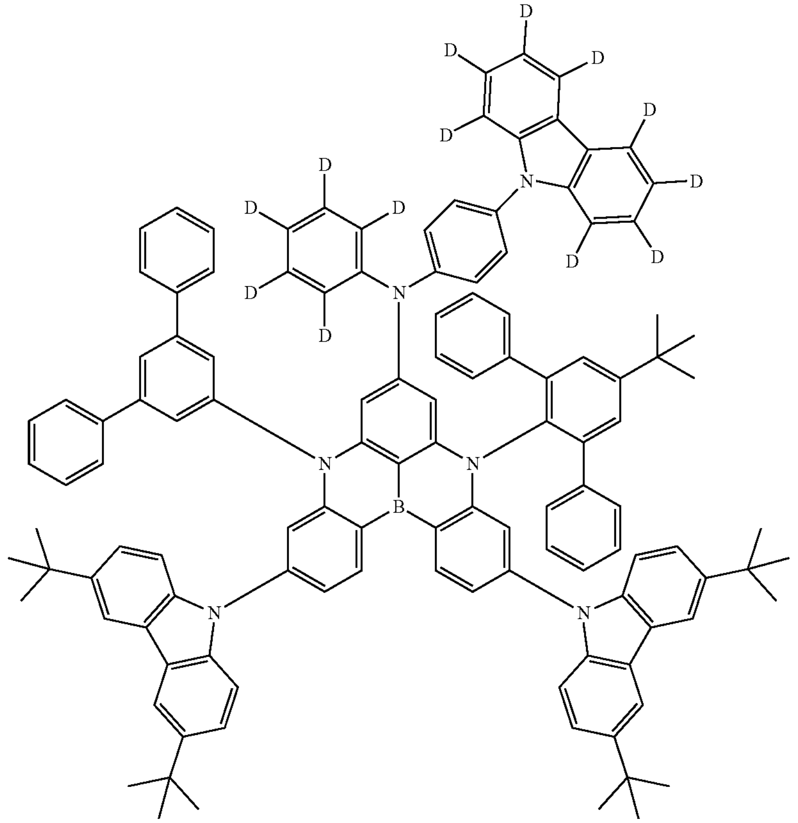

-continued
413
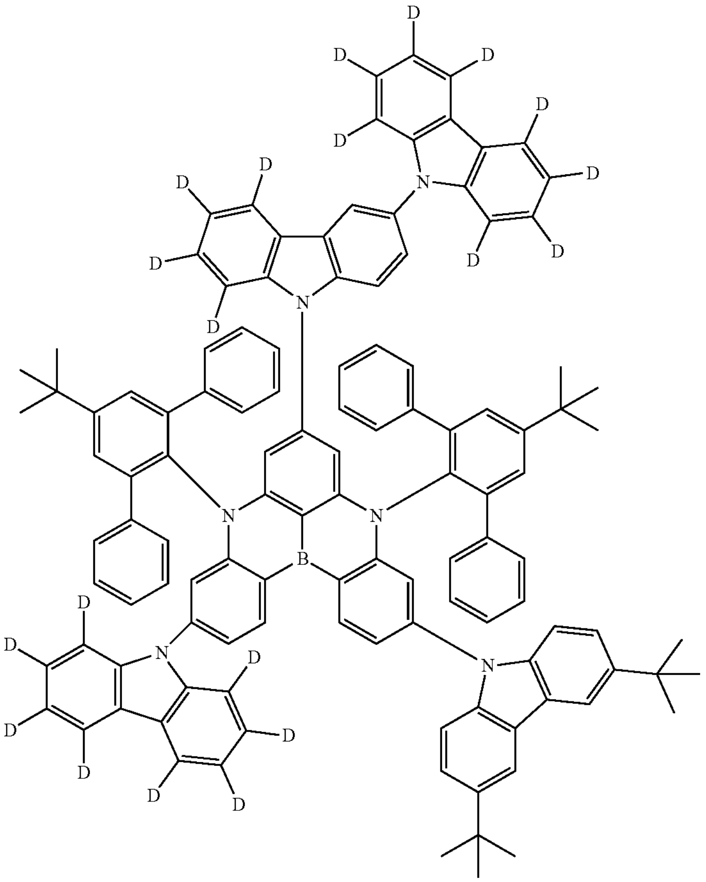

-continued
414
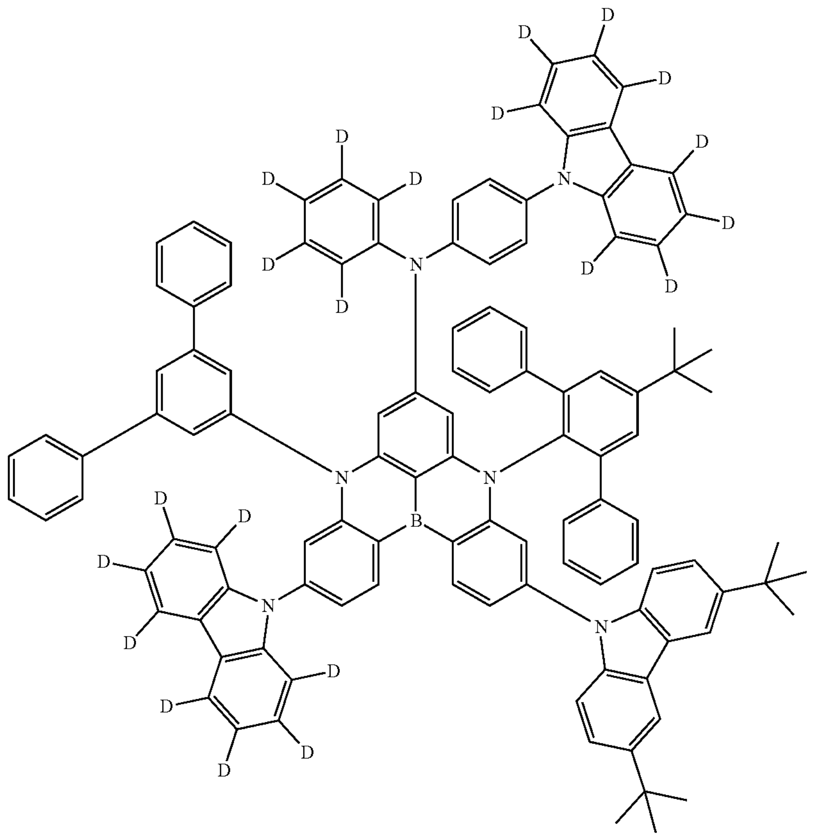
415
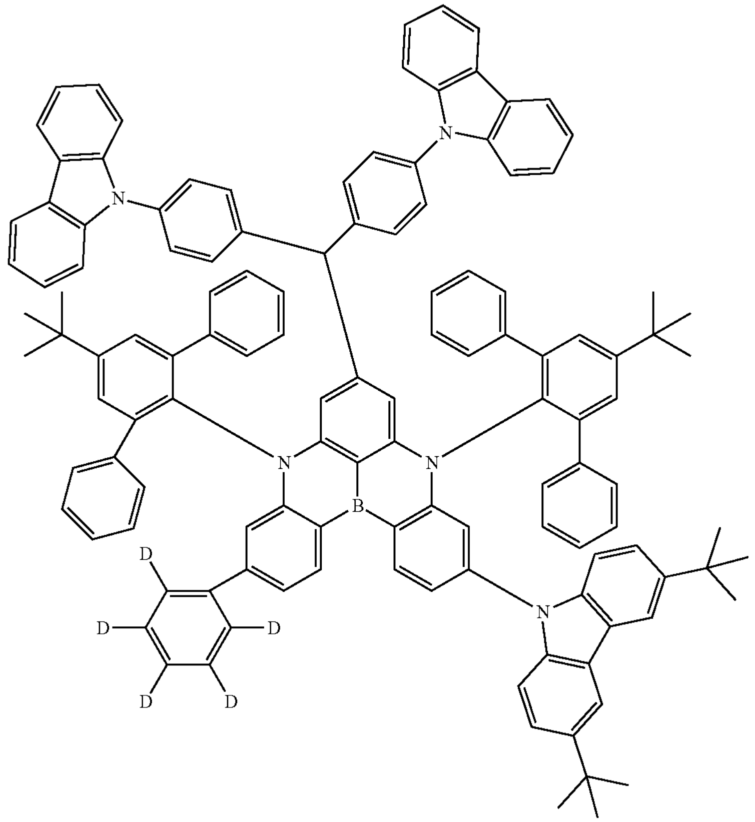

-continued
416
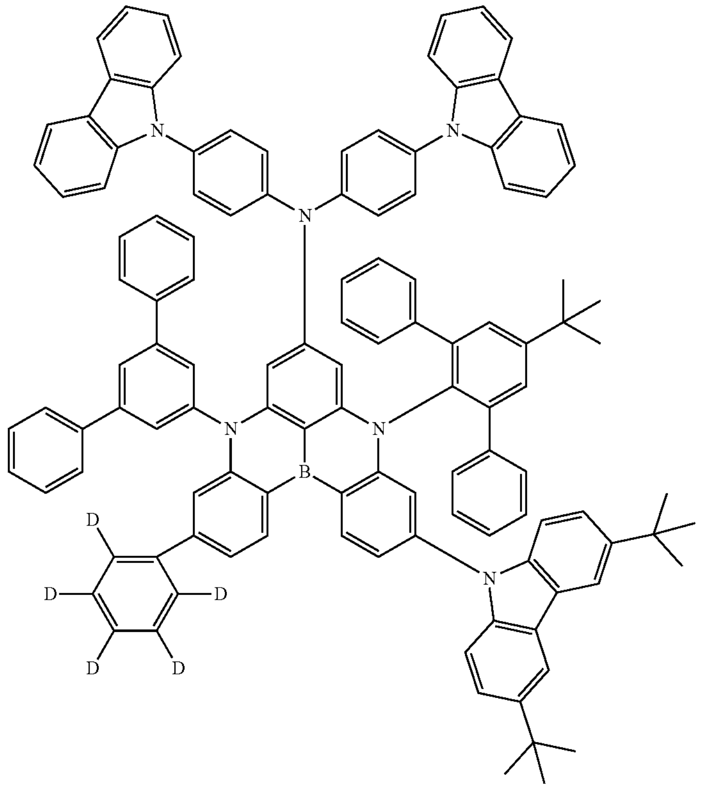
417
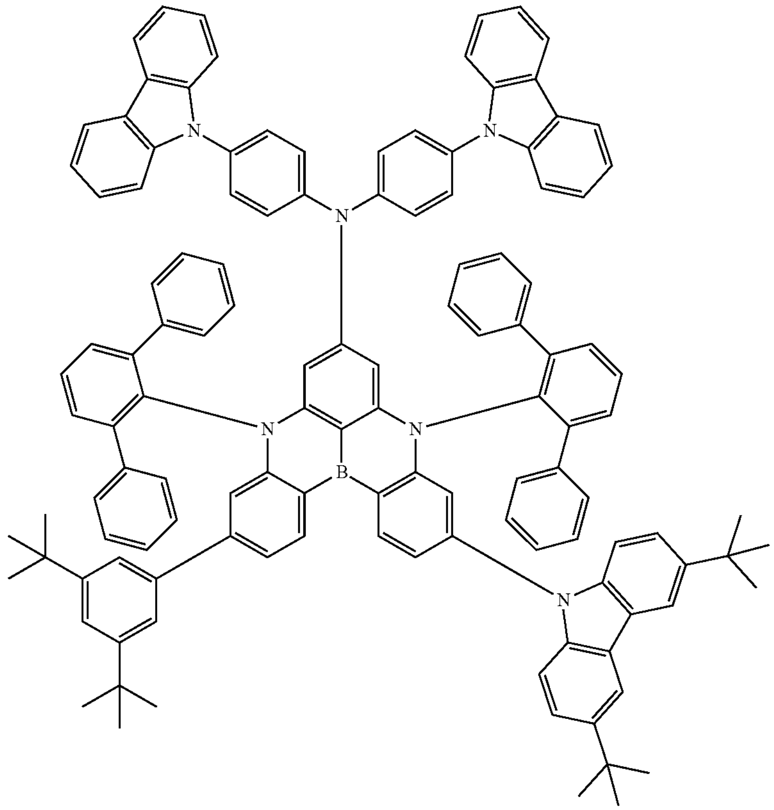

-continued
418
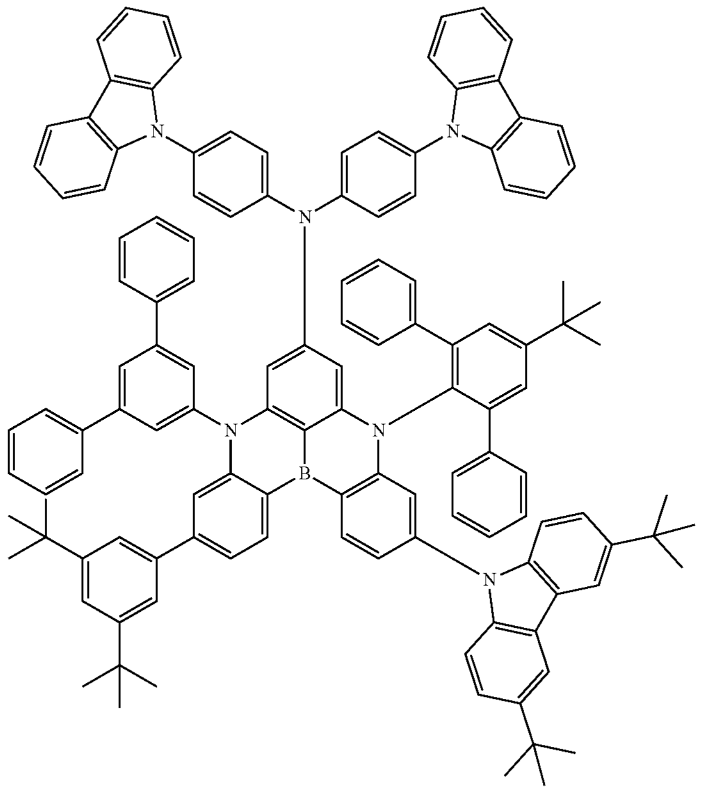
419
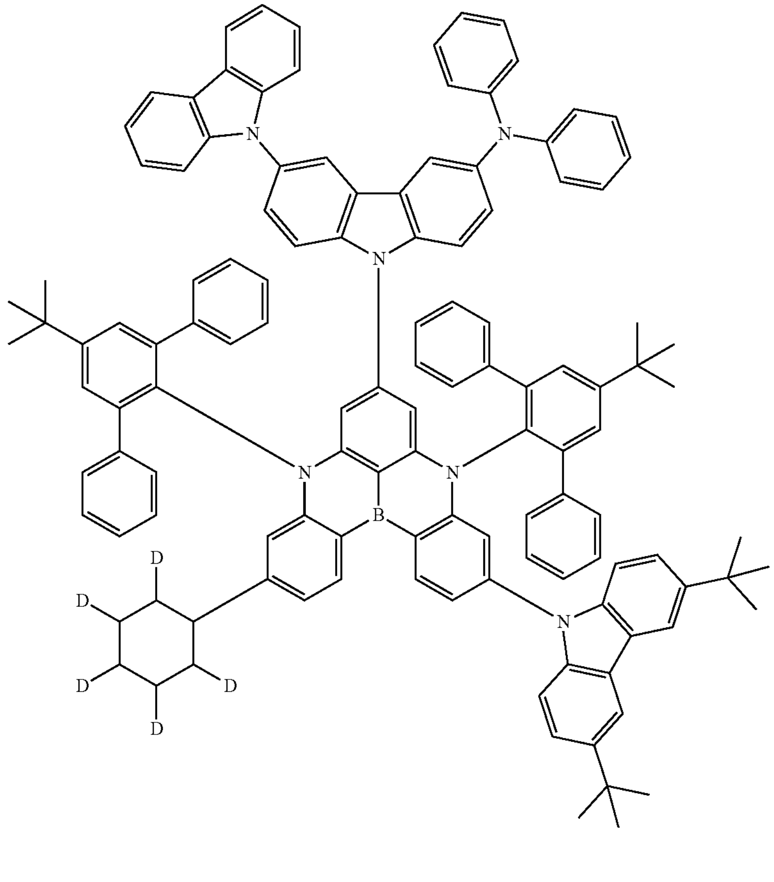

-continued
420
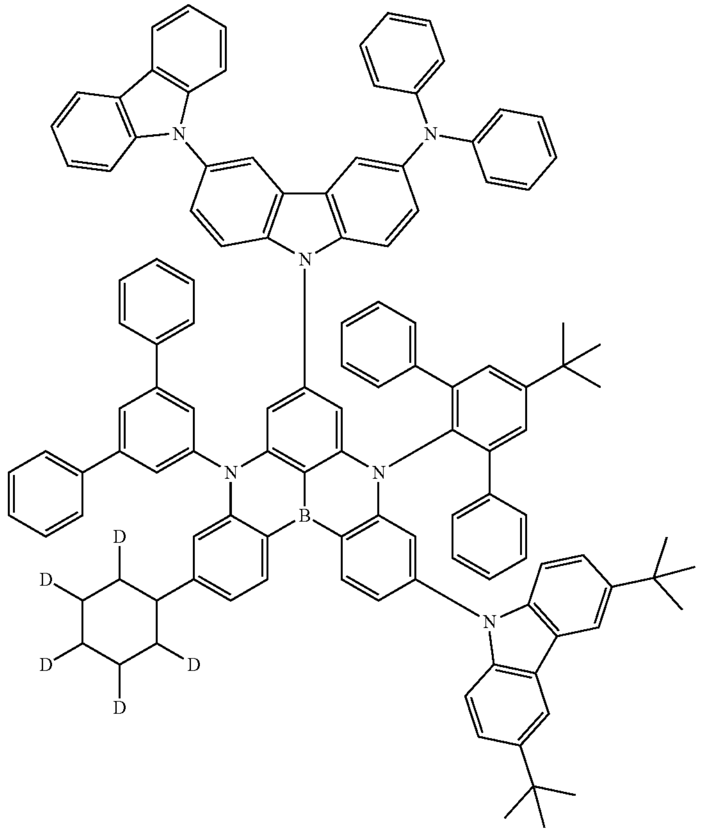
421
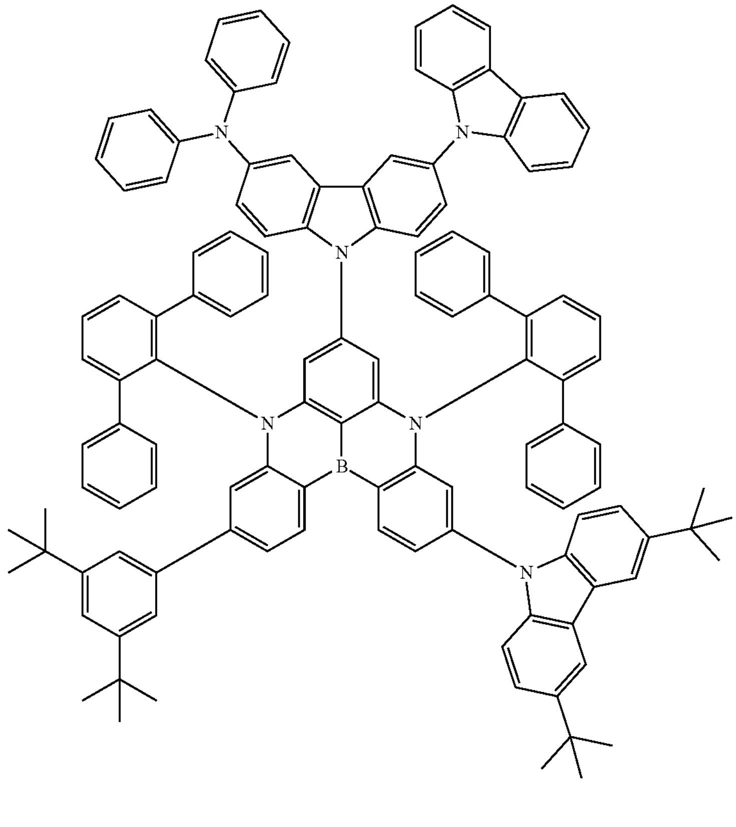

-continued
422
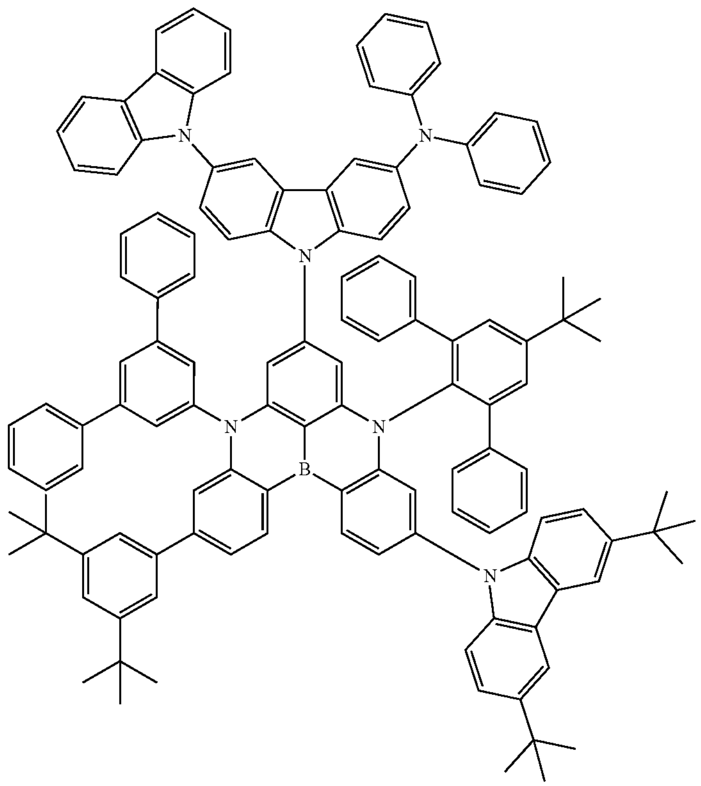
423
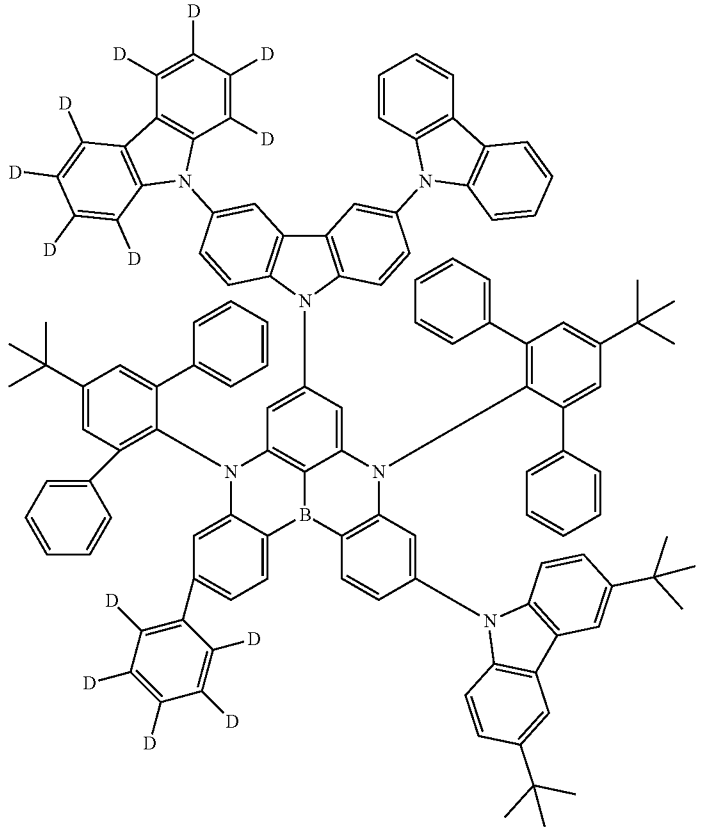

-continued
424
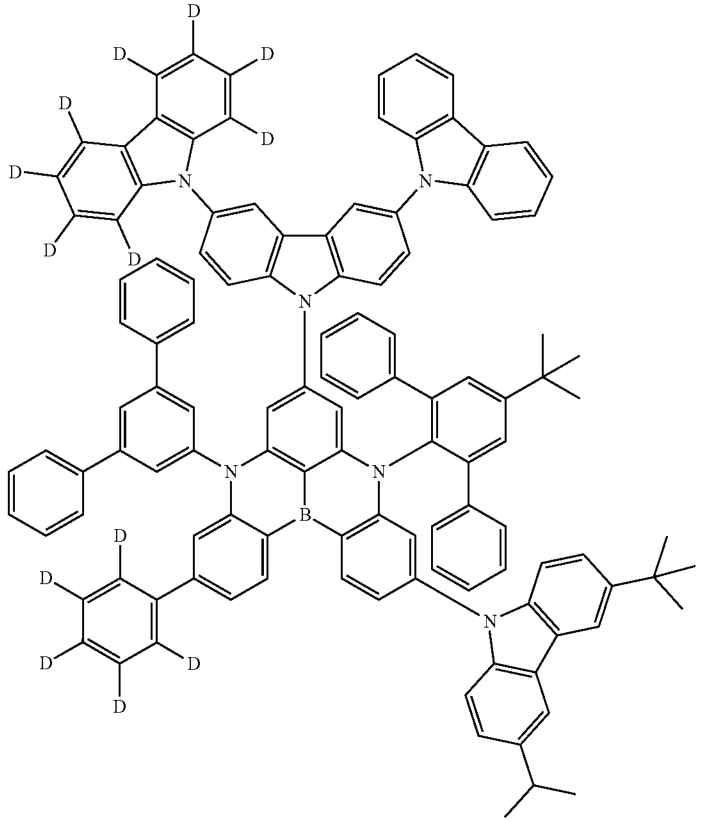
425
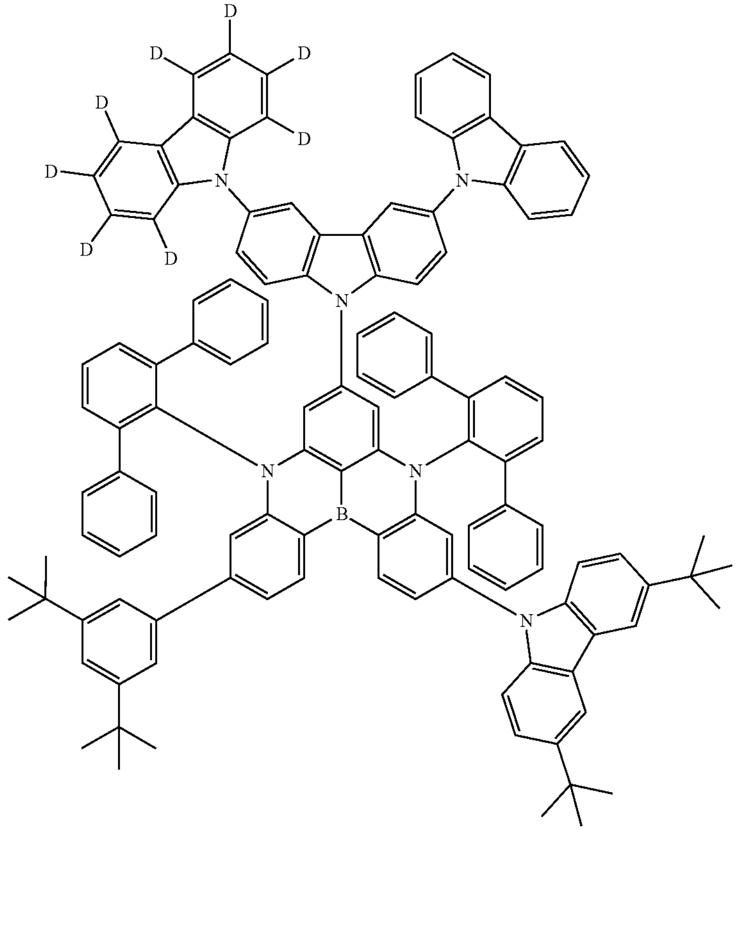

-continued
426
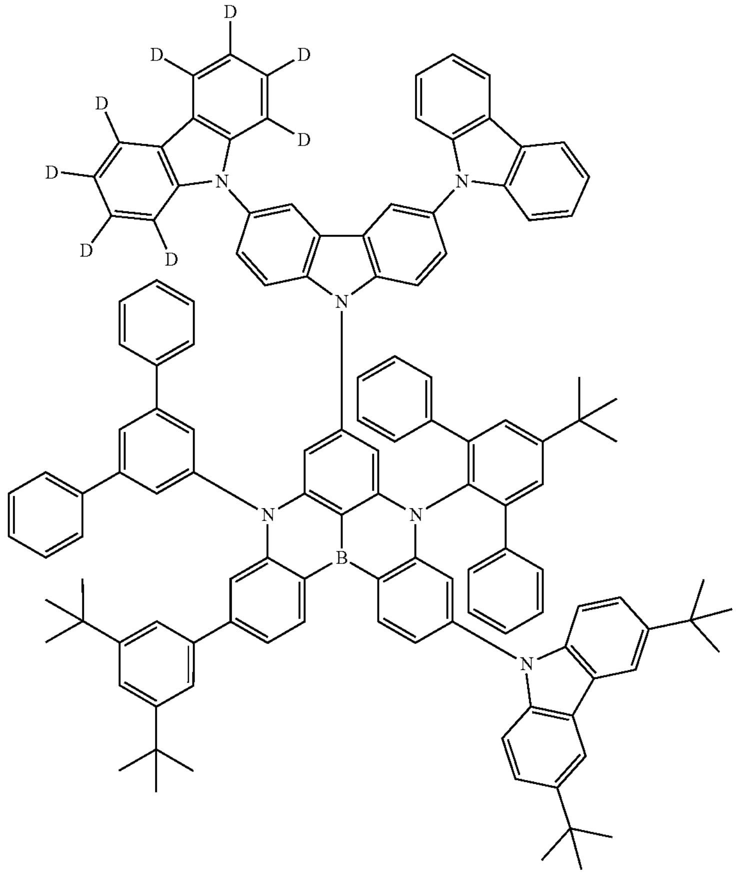

-continued
427
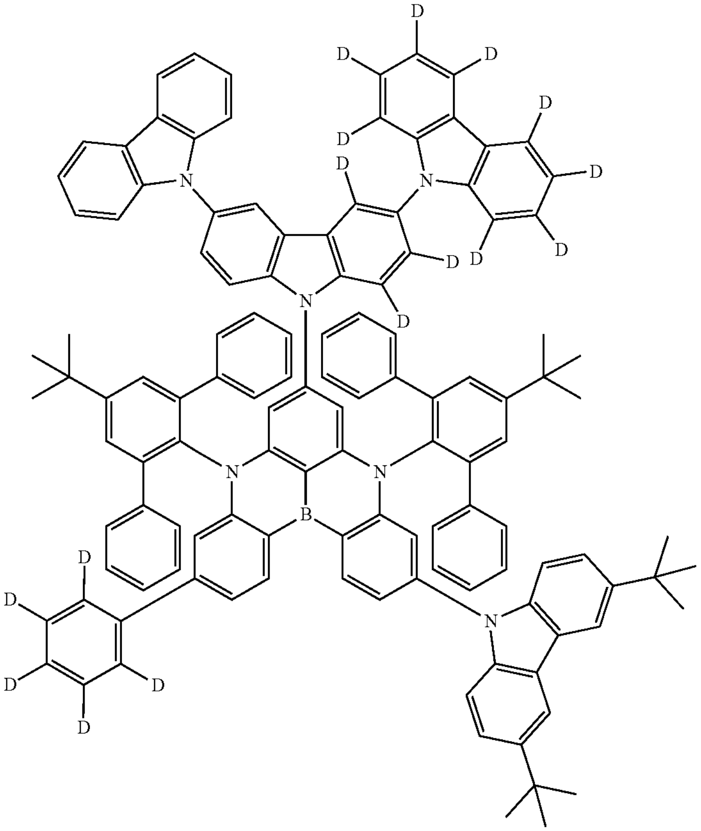

-continued
428
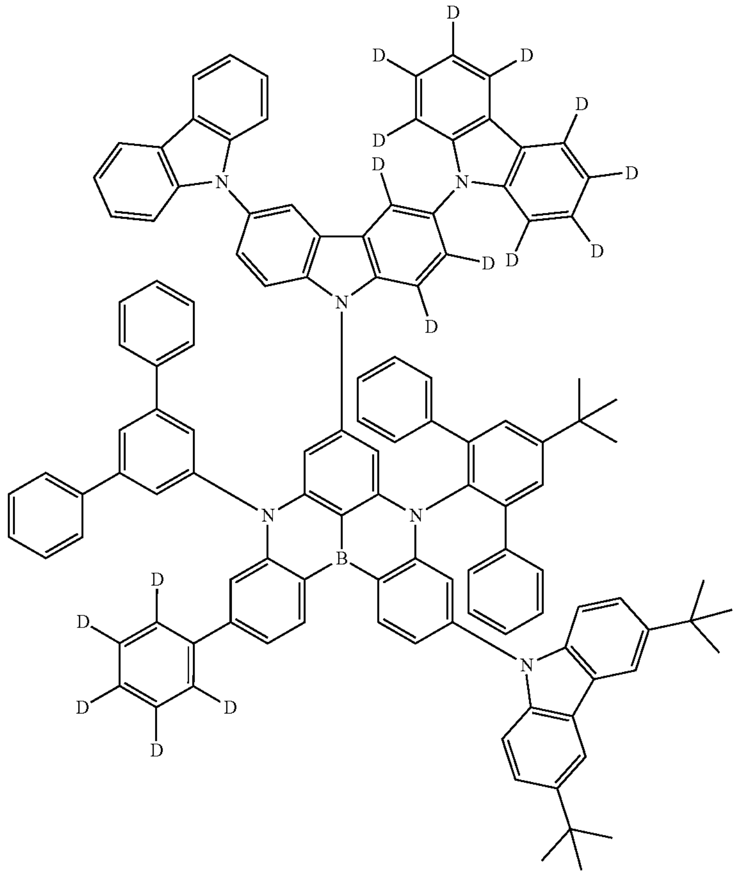

-continued
429
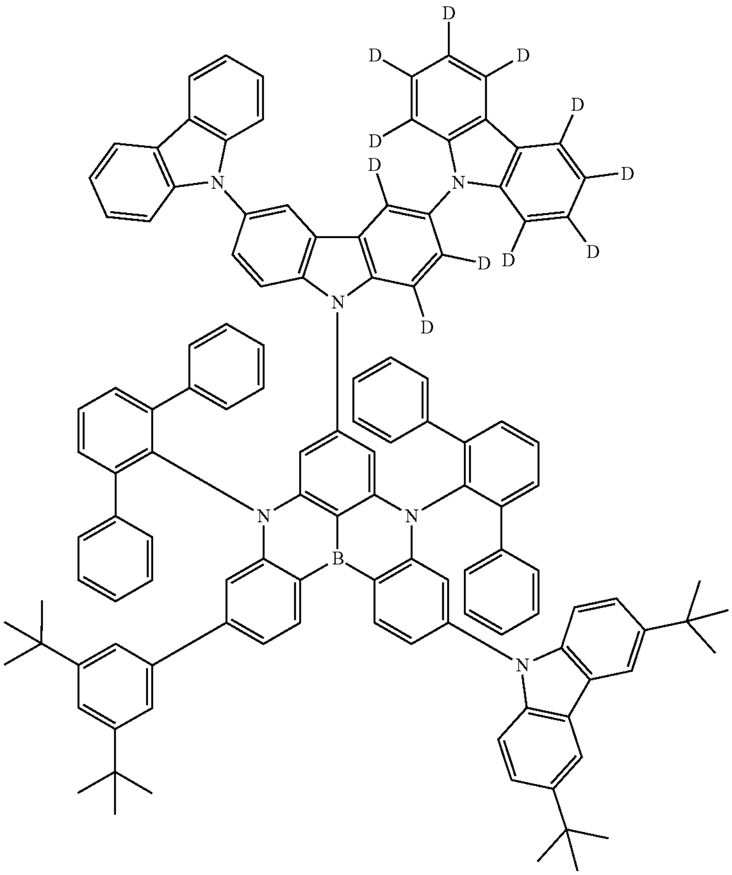

-continued
430
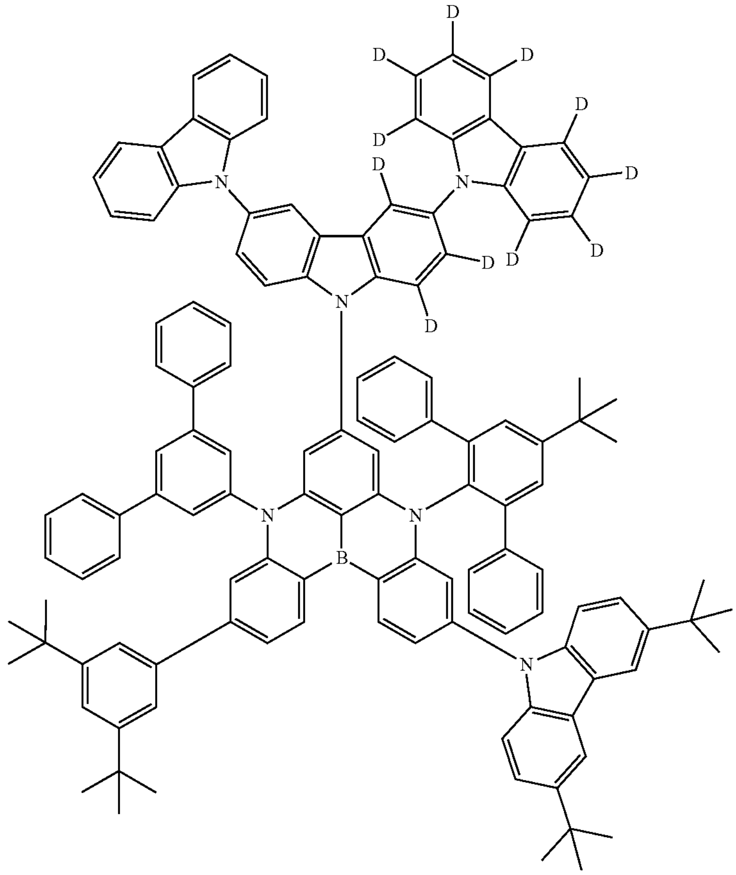

-continued
431
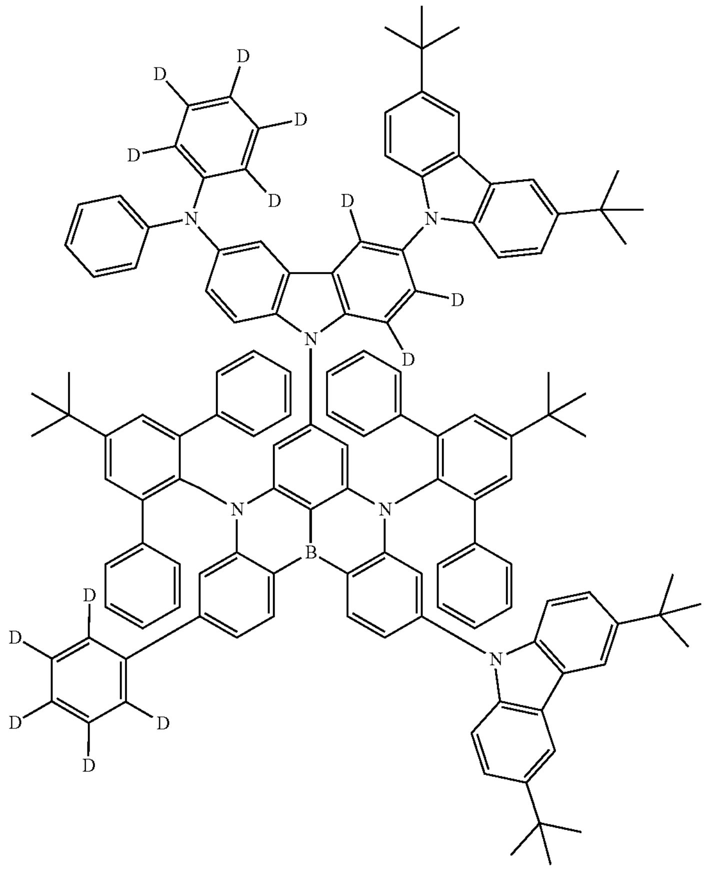

-continued
432
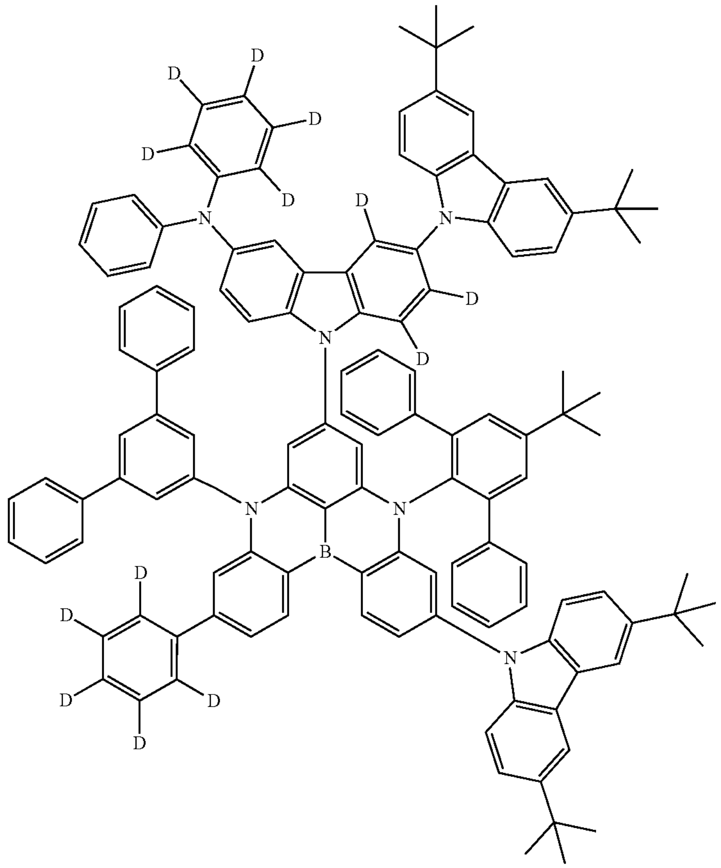

-continued
433
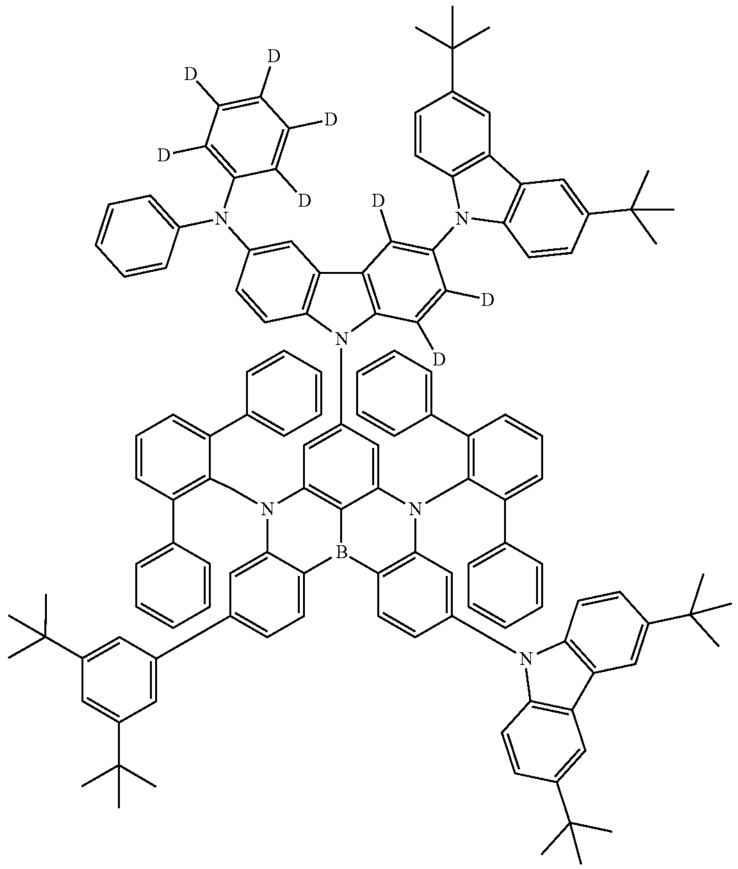

-continued
434
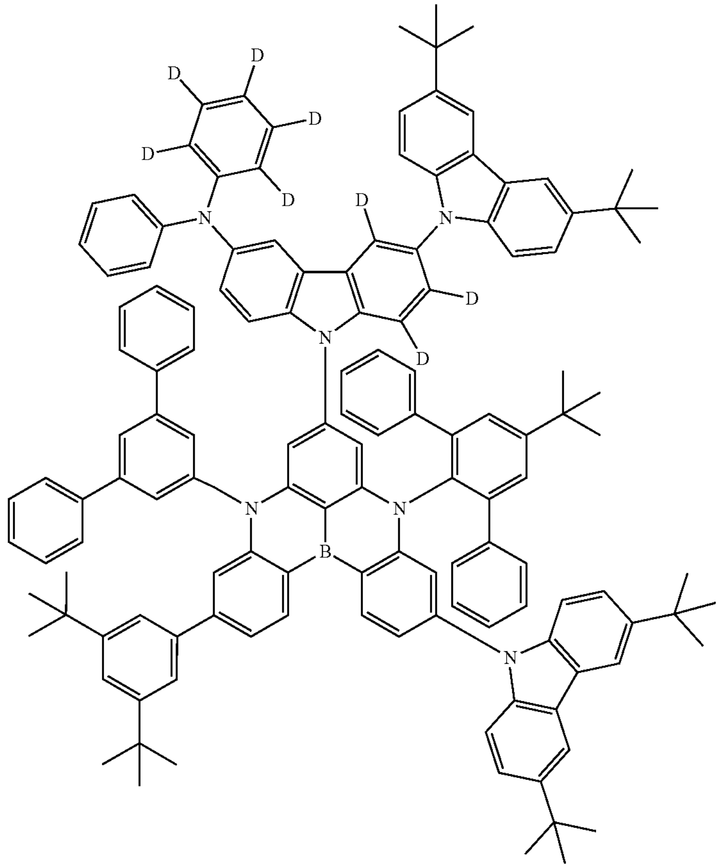

-continued
435
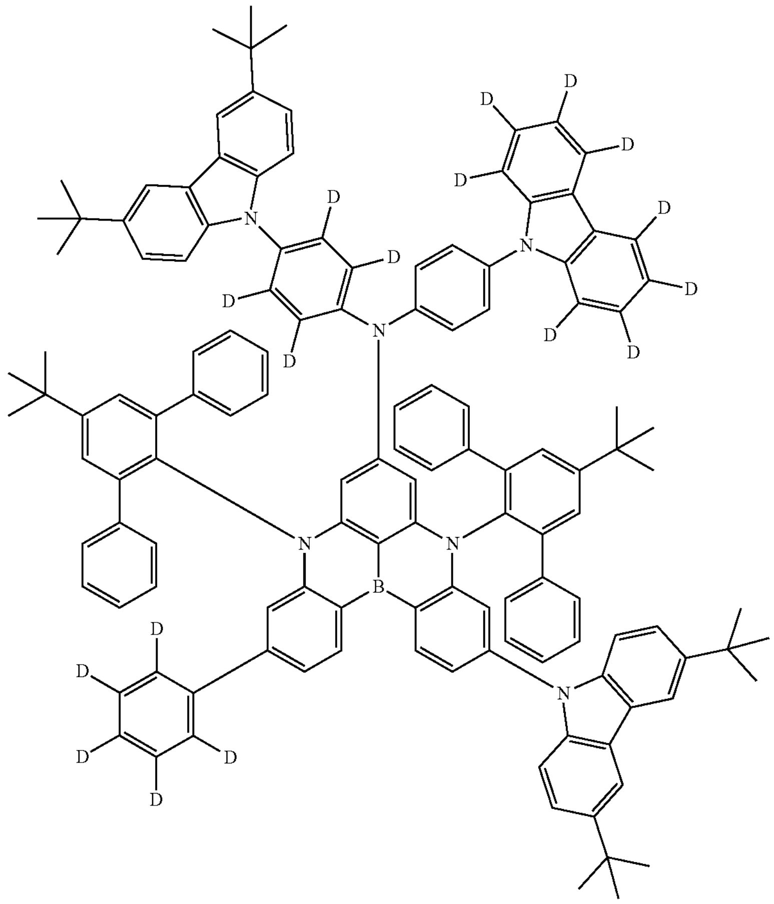

-continued
436
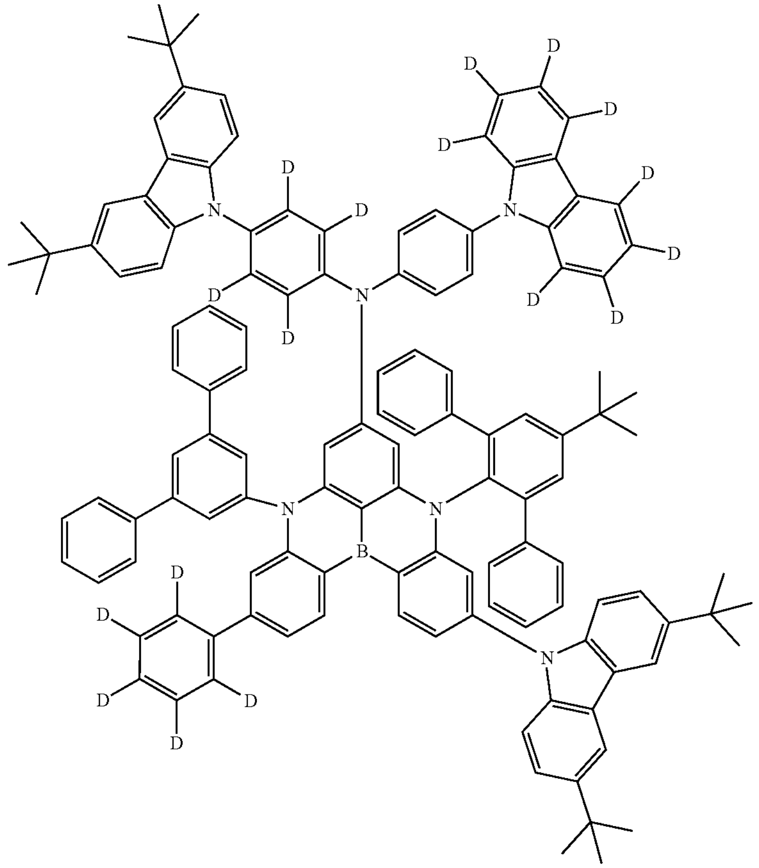

-continued
437
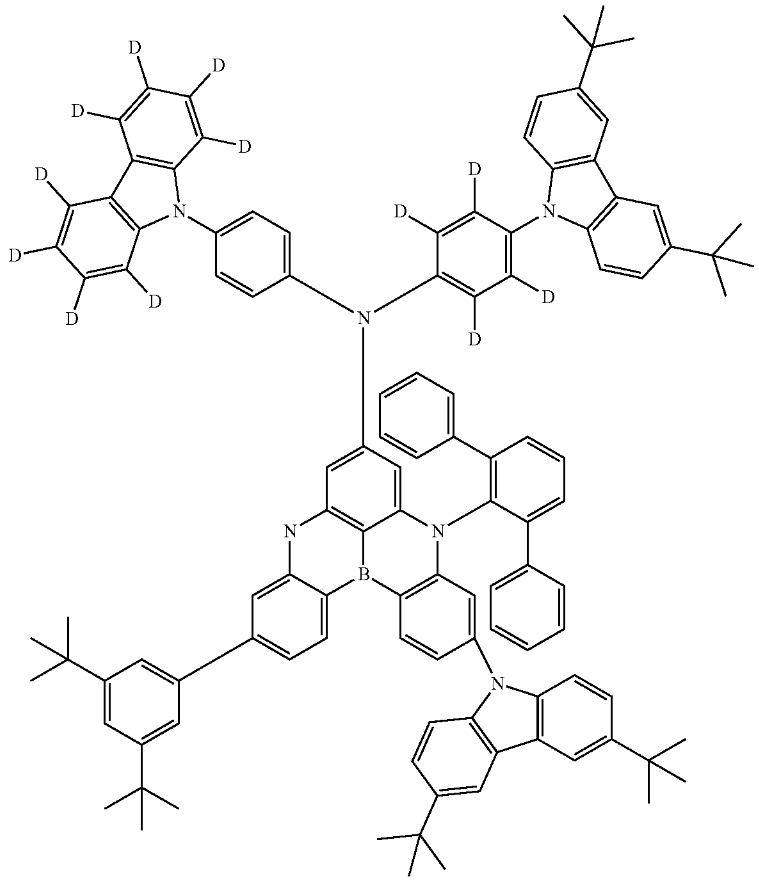

-continued
438
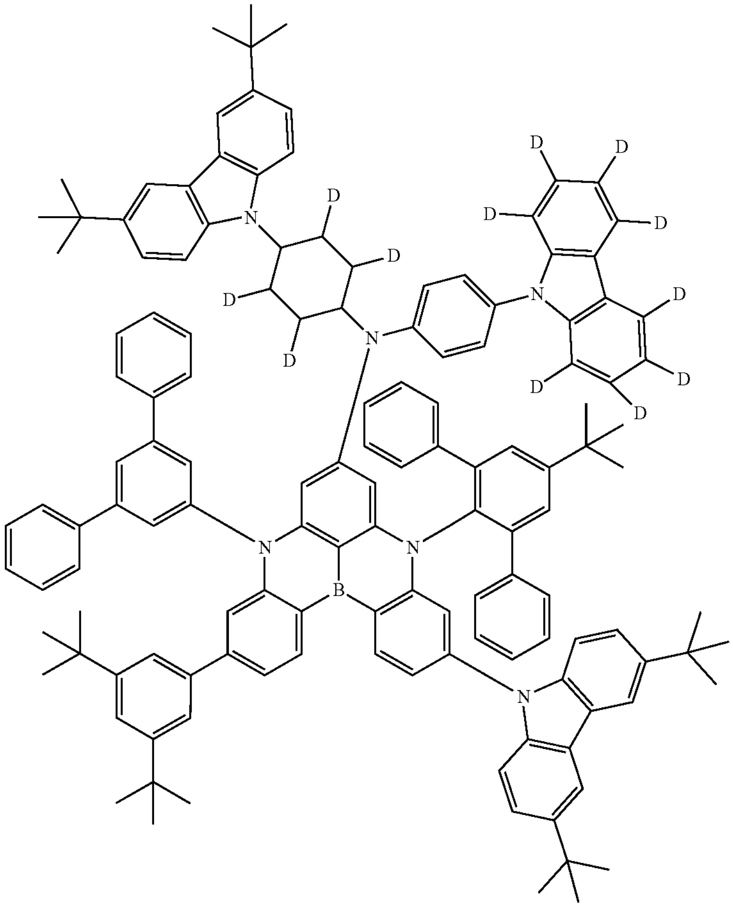
439
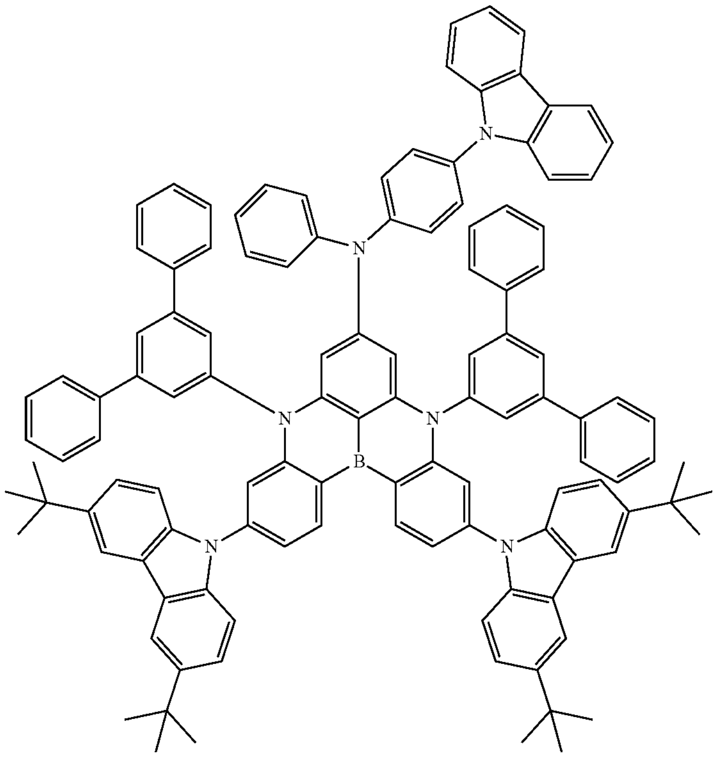

-continued
440
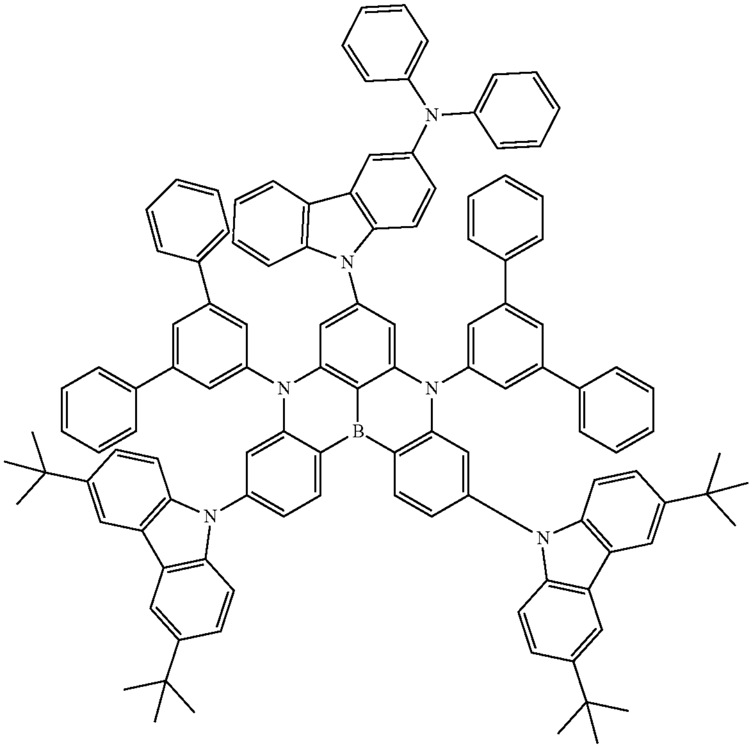
441
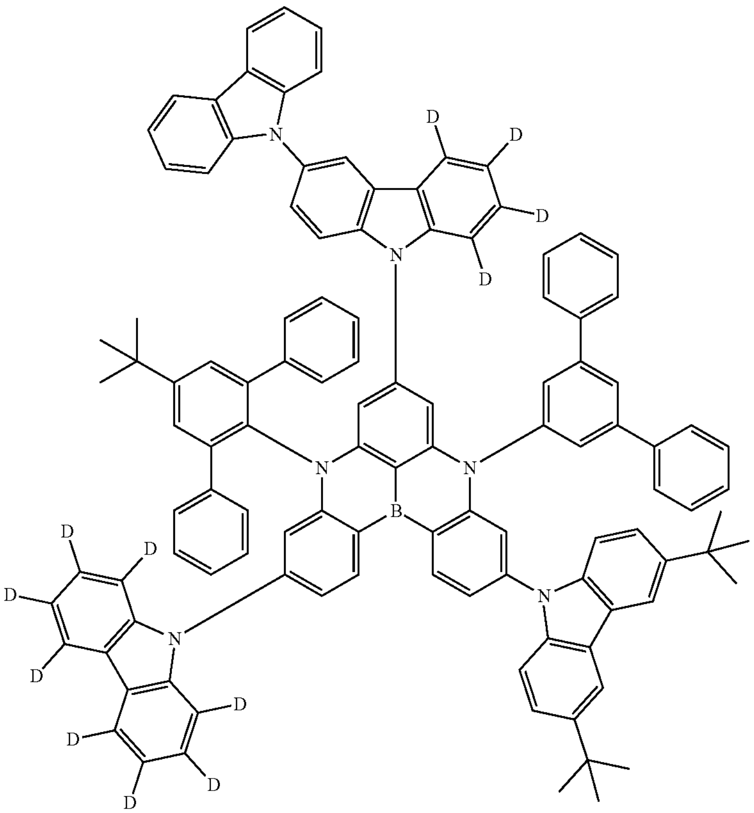

-continued
442
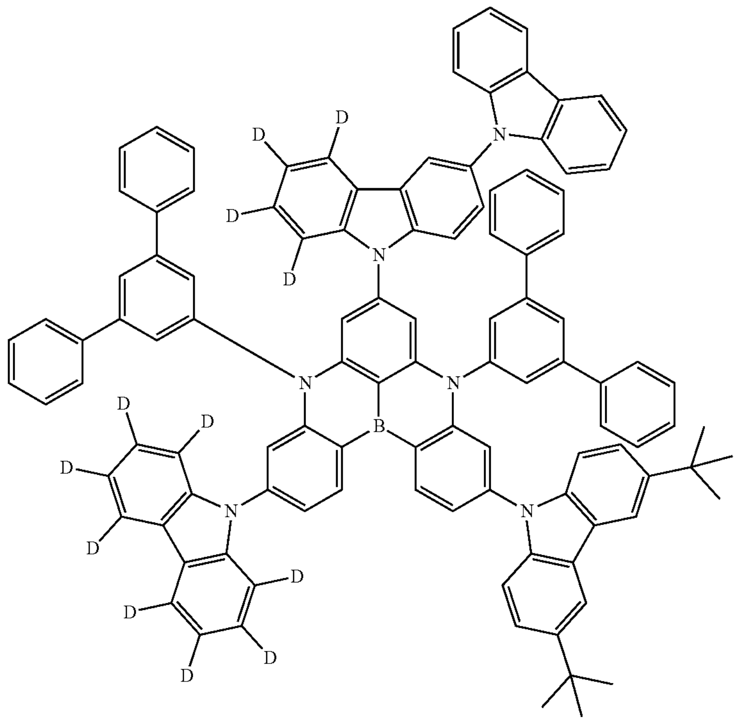
443
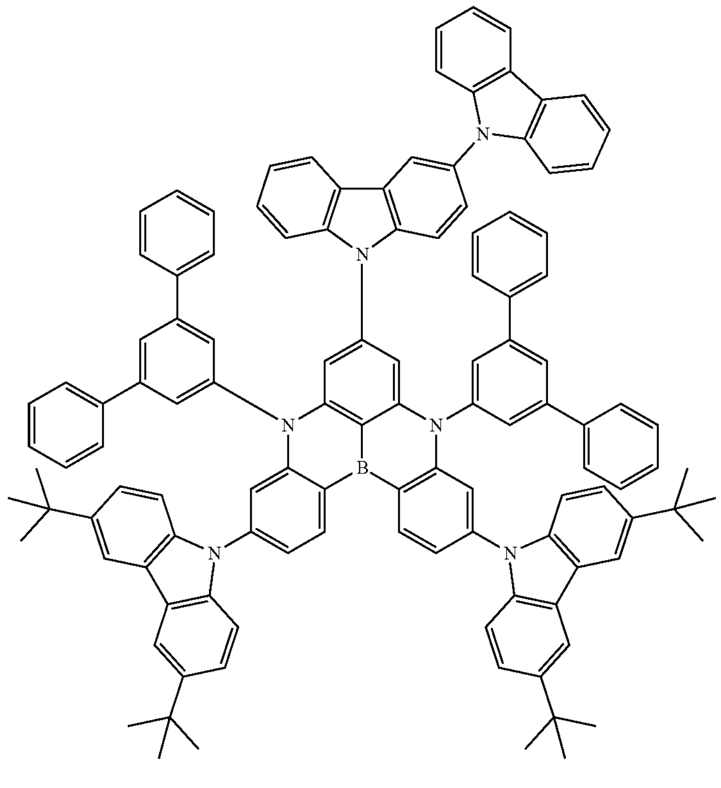

-continued
444
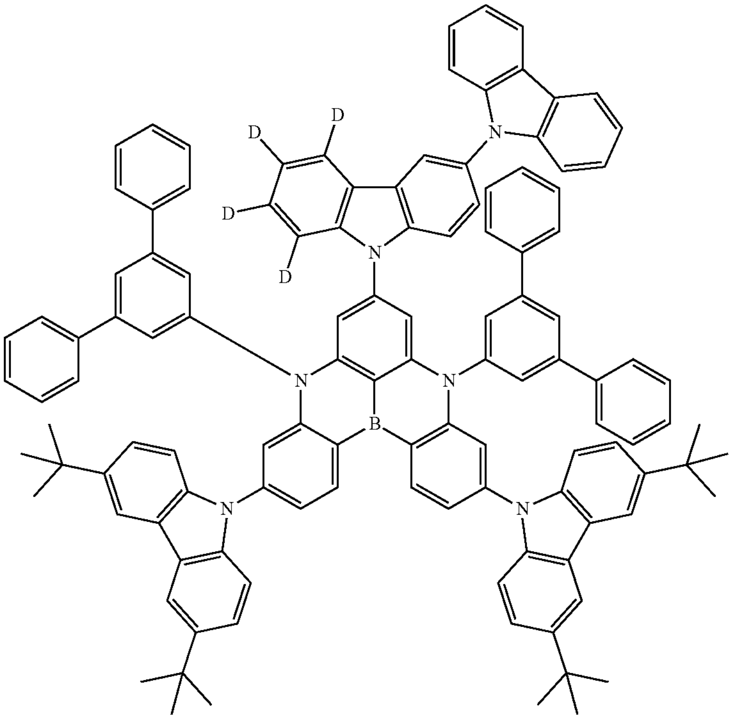
445
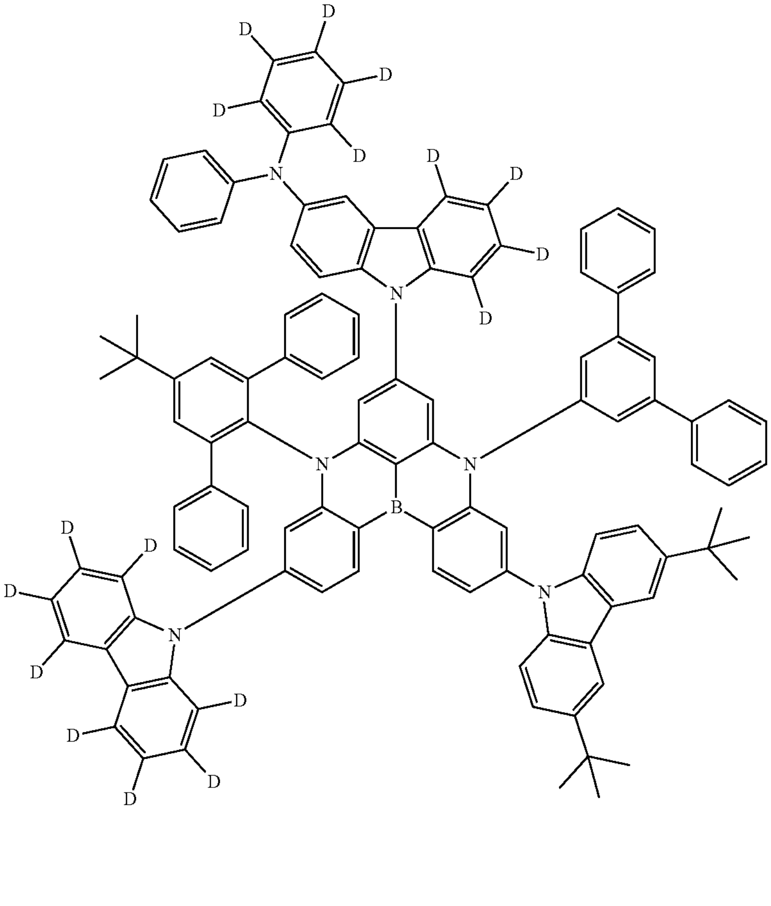

-continued
446
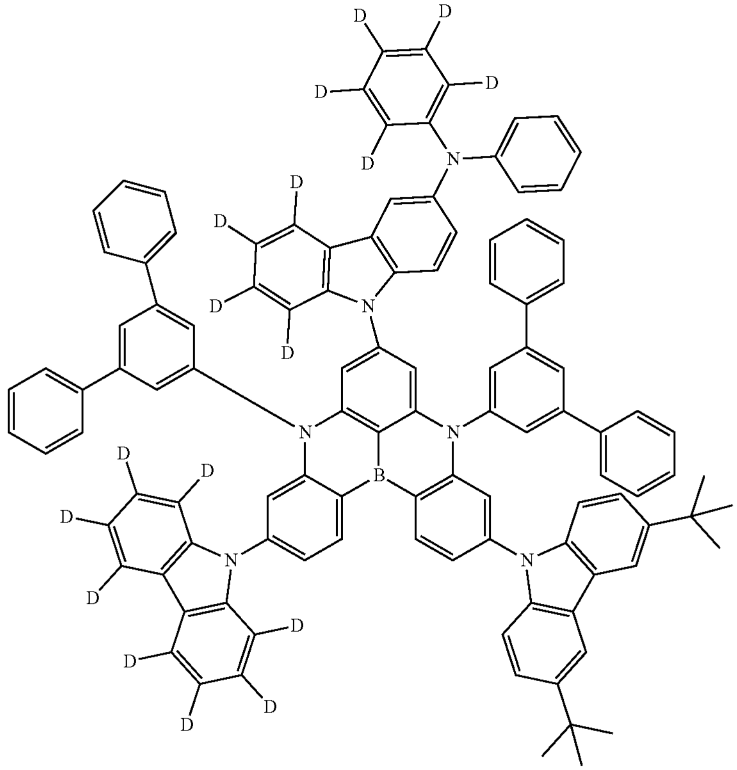
447
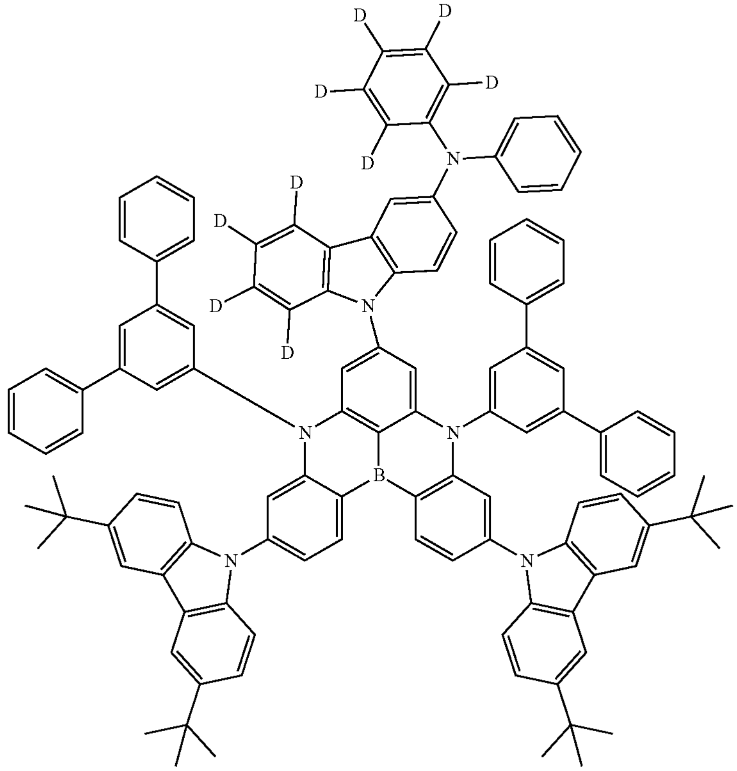

-continued
448
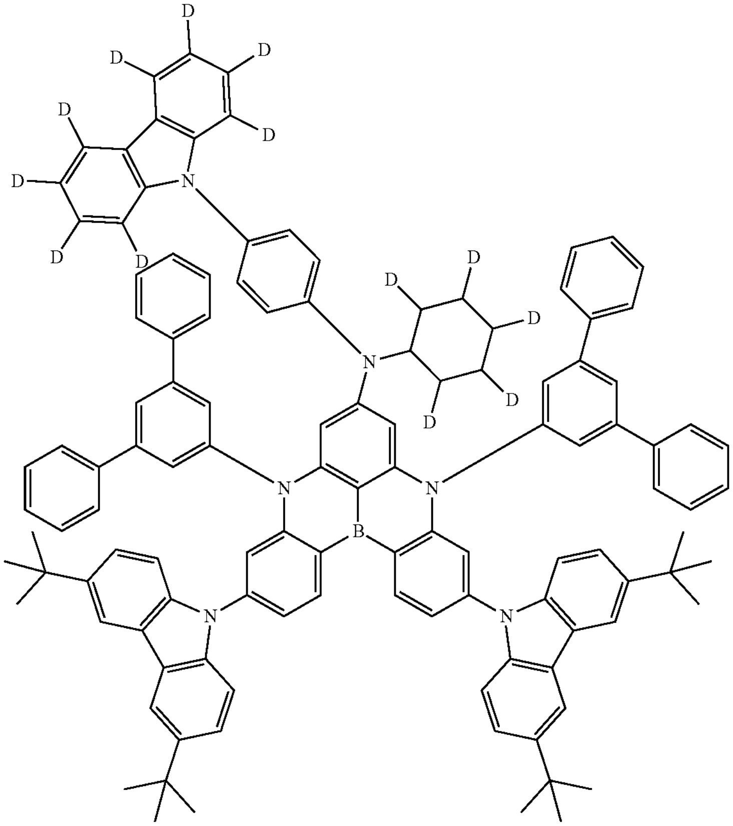
449
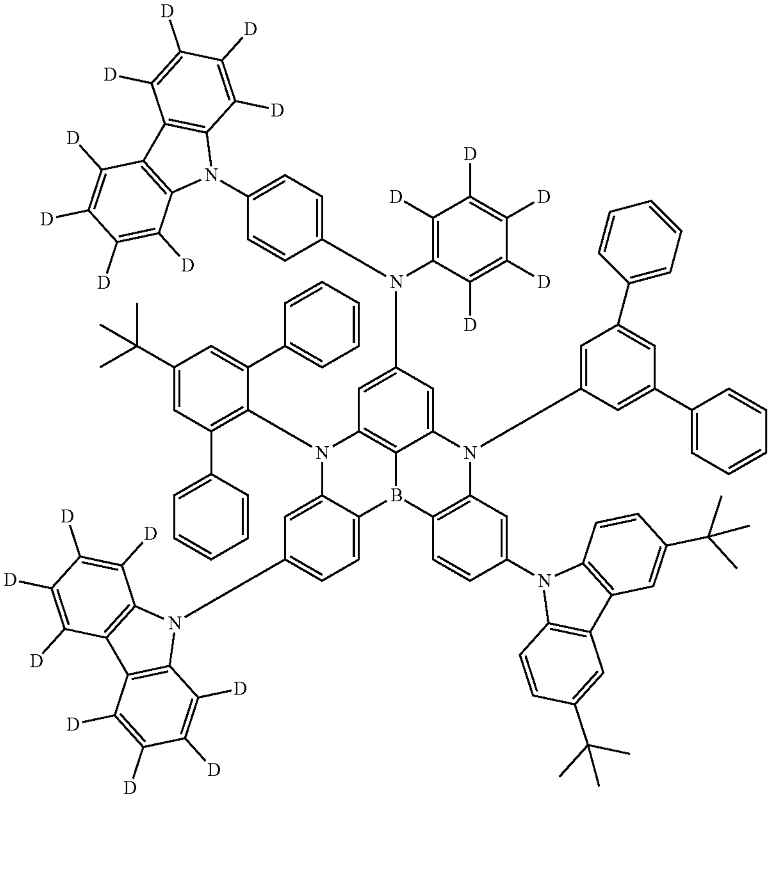

-continued
450
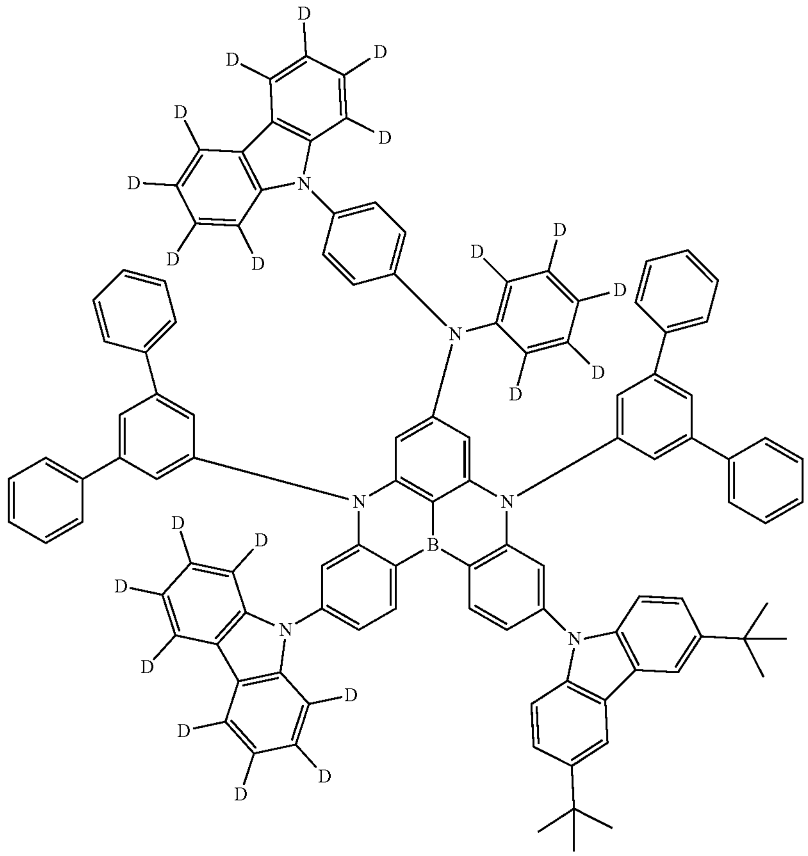
451
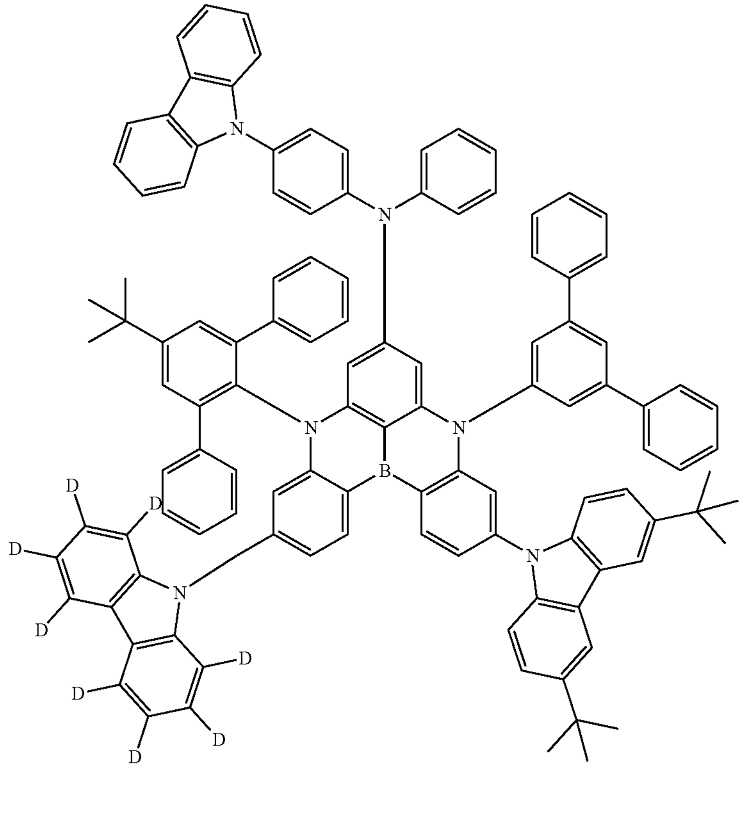

-continued
452
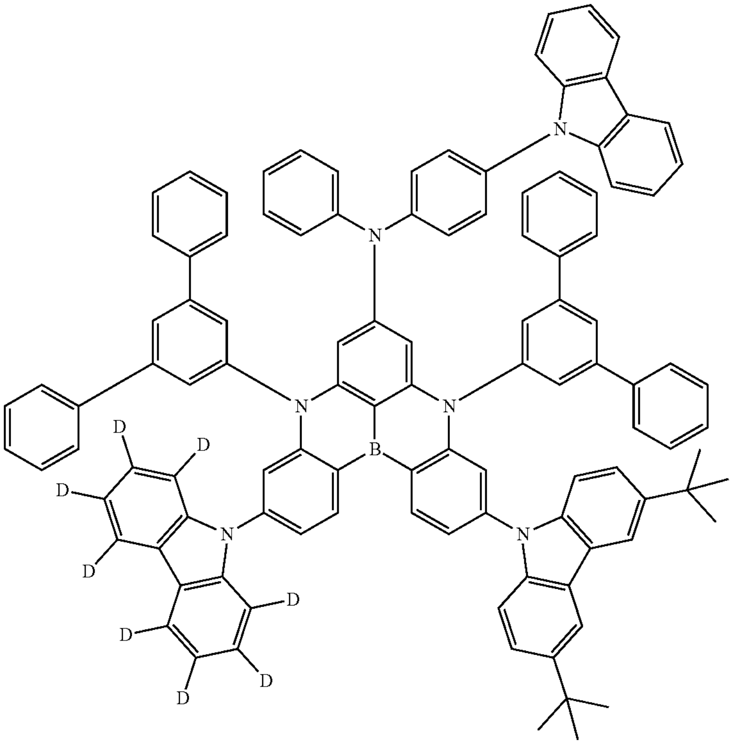
453
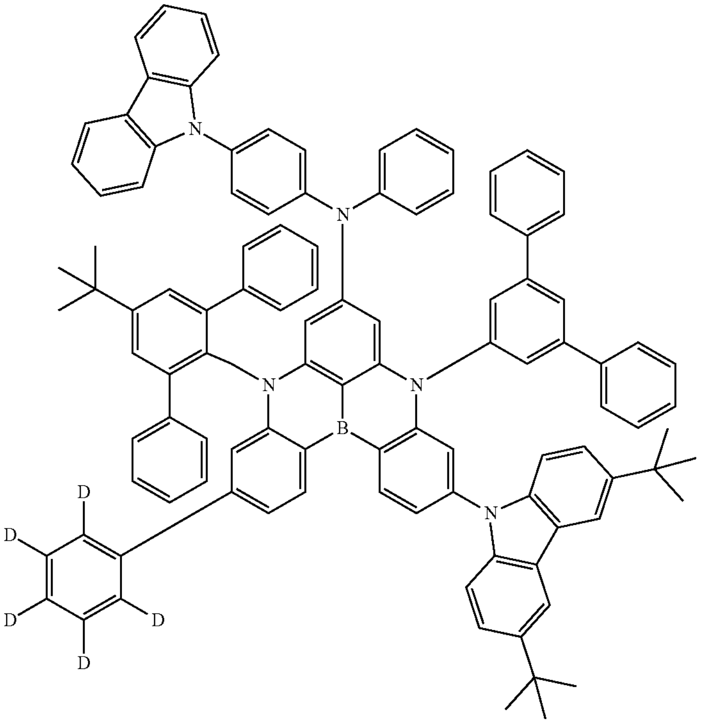

-continued
454
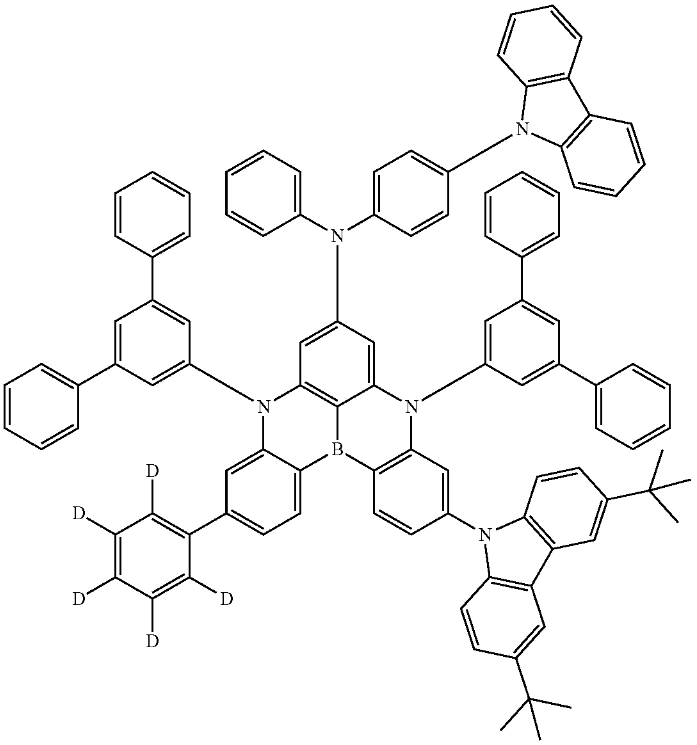
455
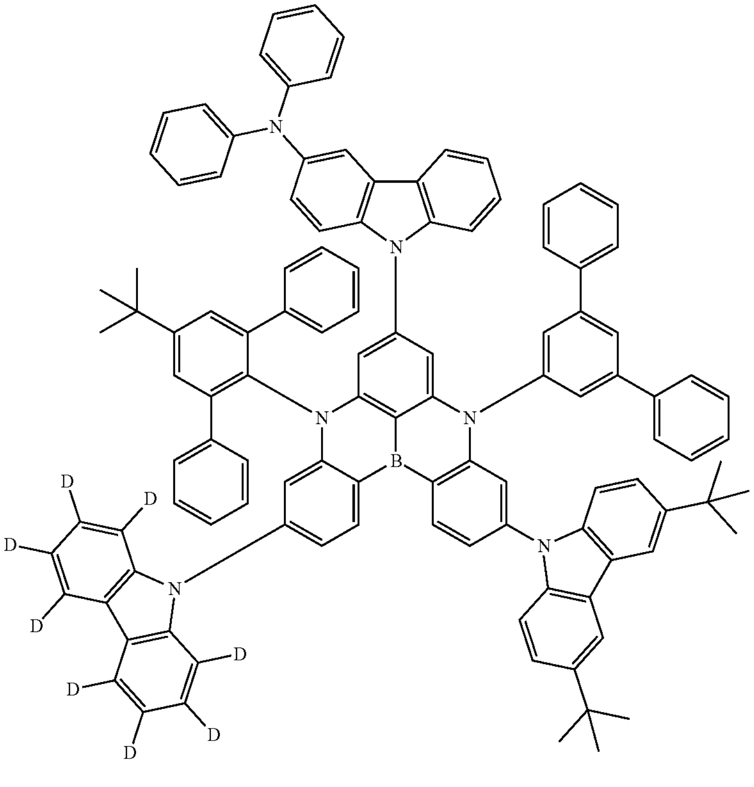

-continued
456
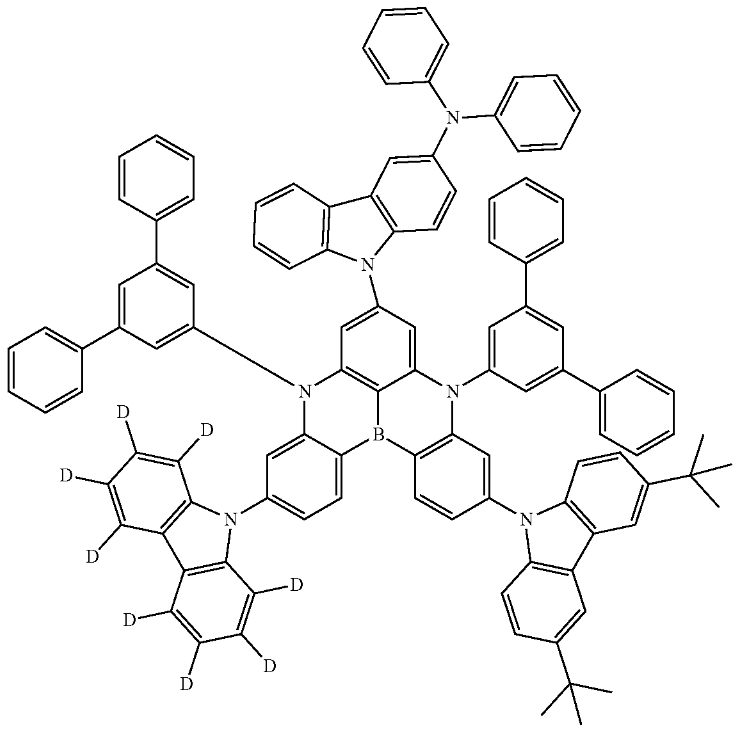
457
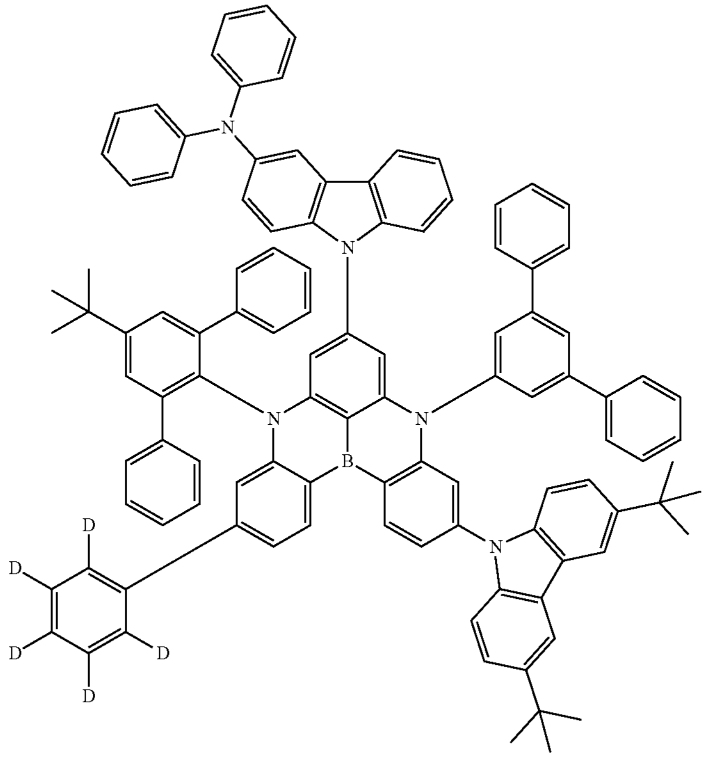

-continued
458
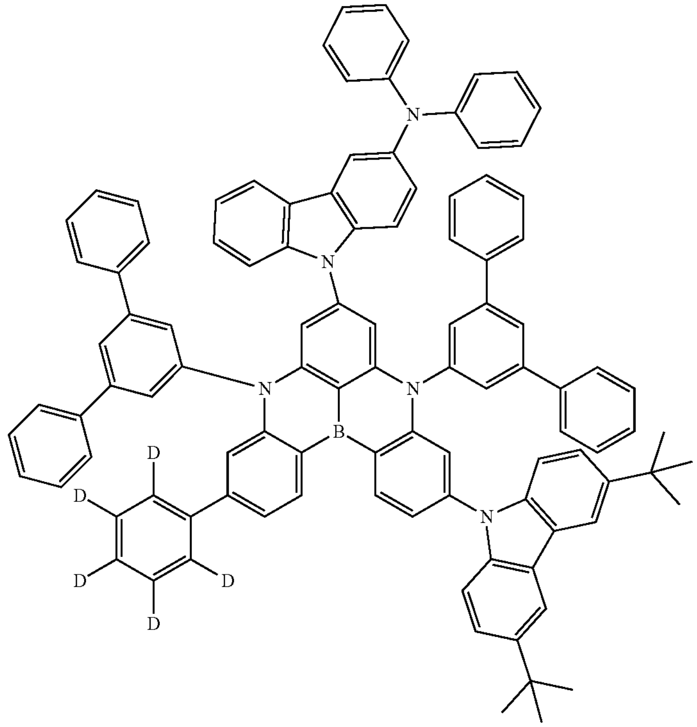
459
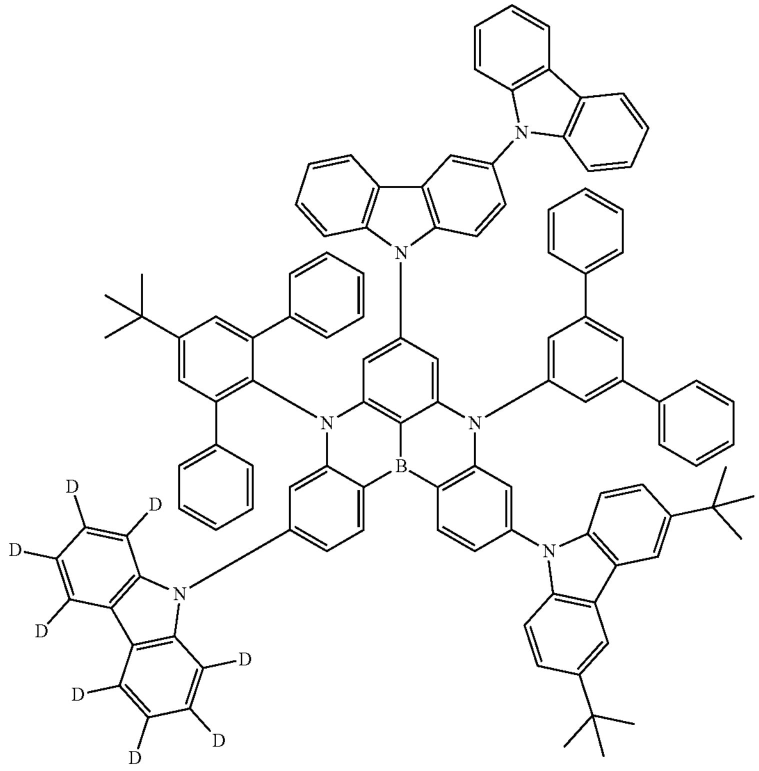

-continued
460
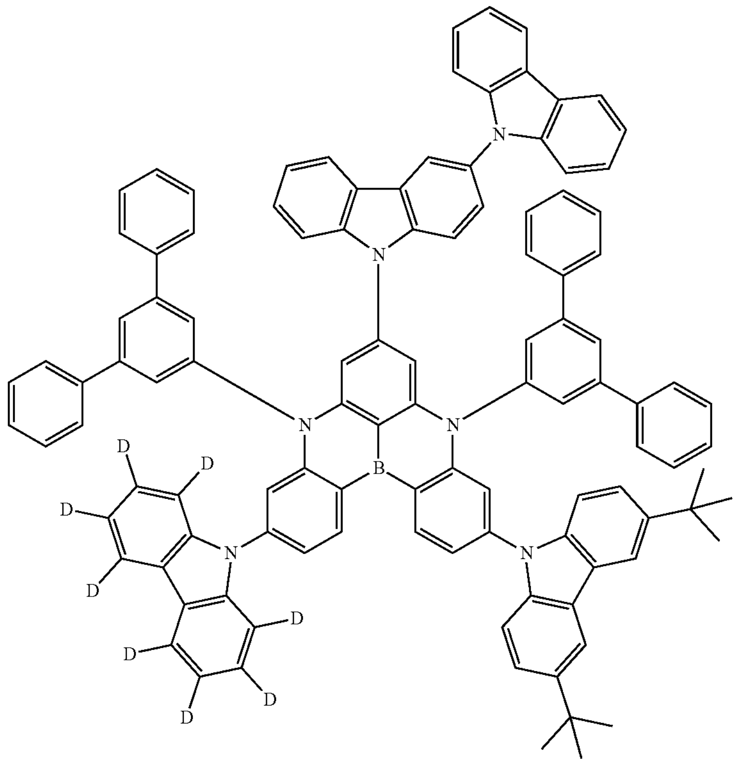
461
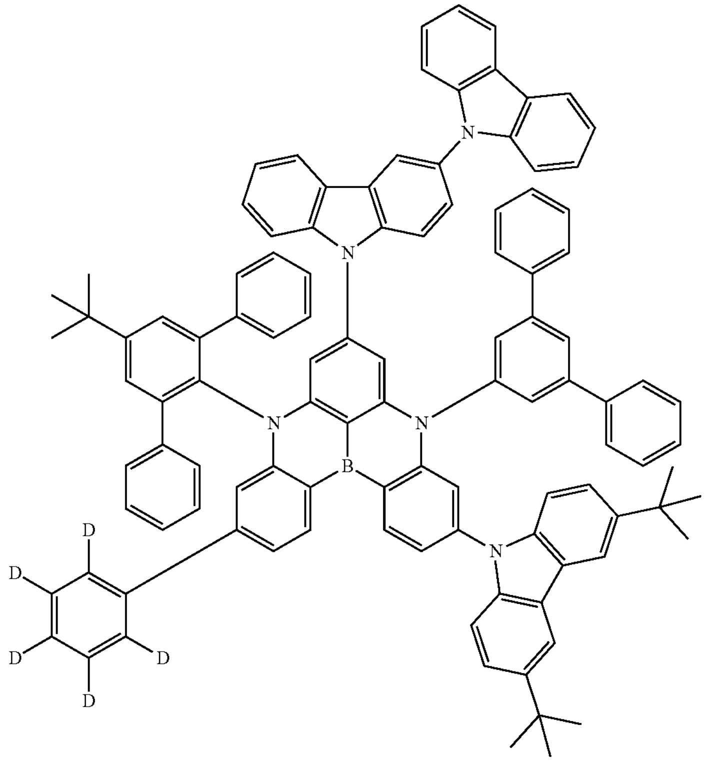

-continued
462
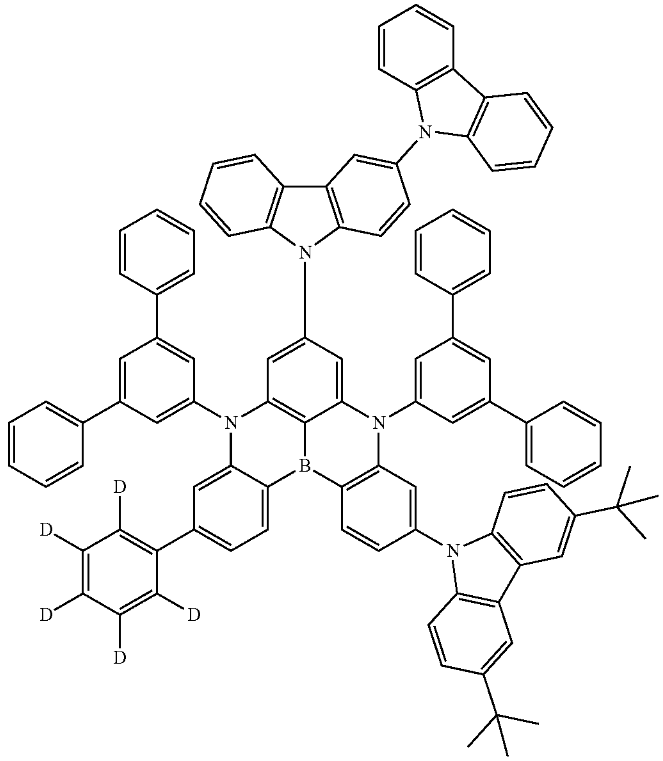
463
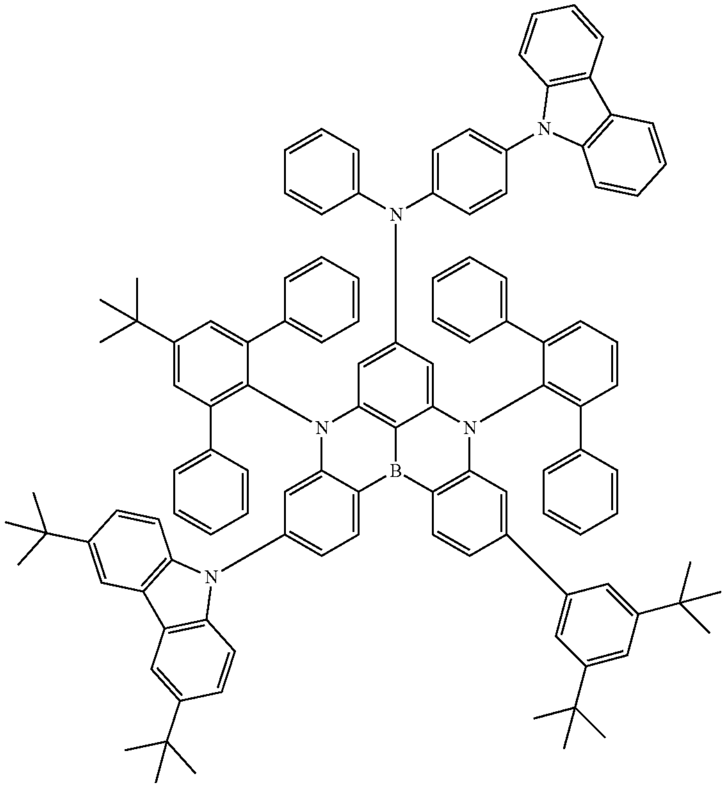

-continued
464
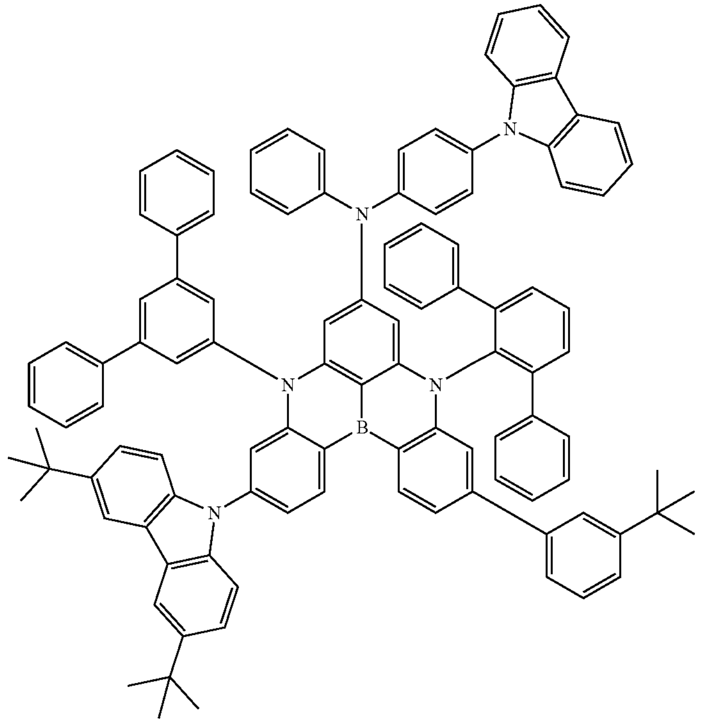
465
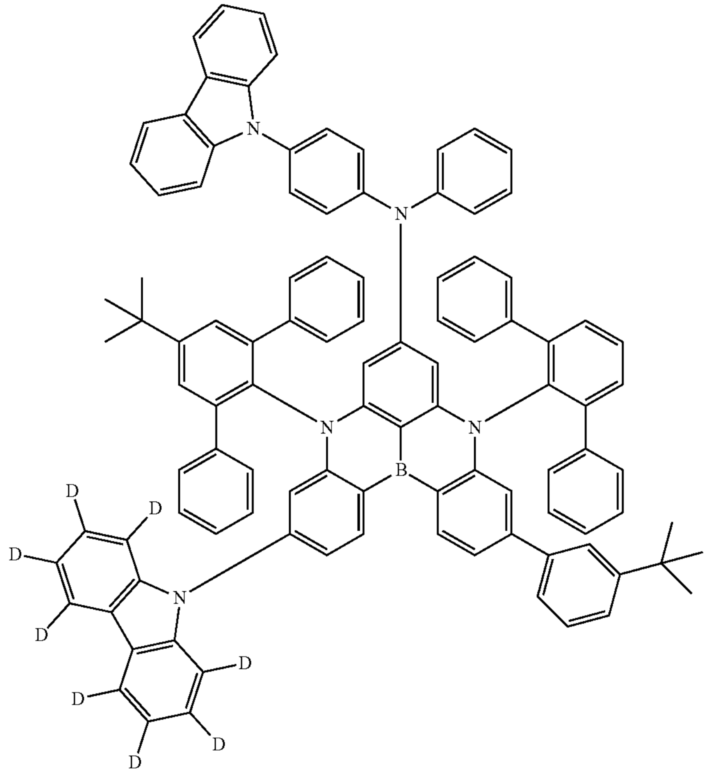

-continued
466
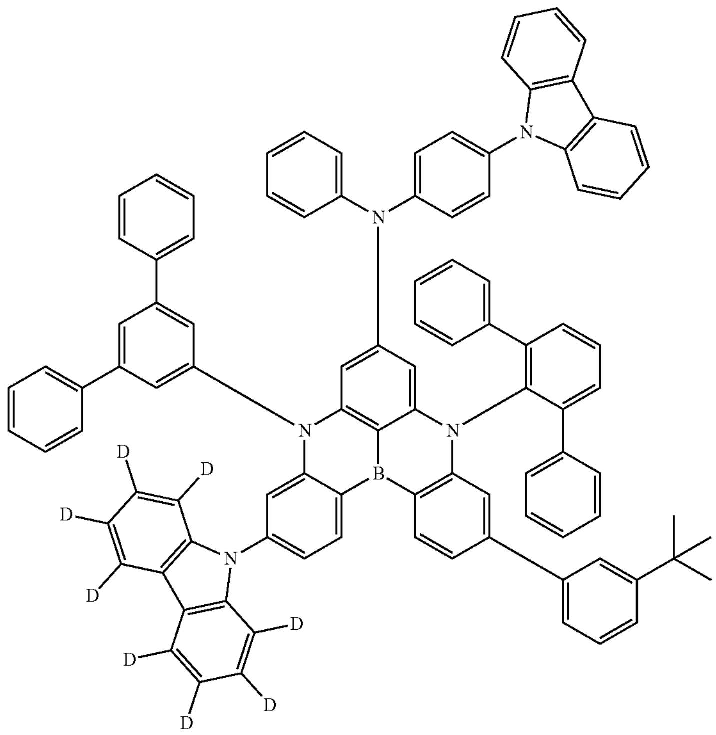
467
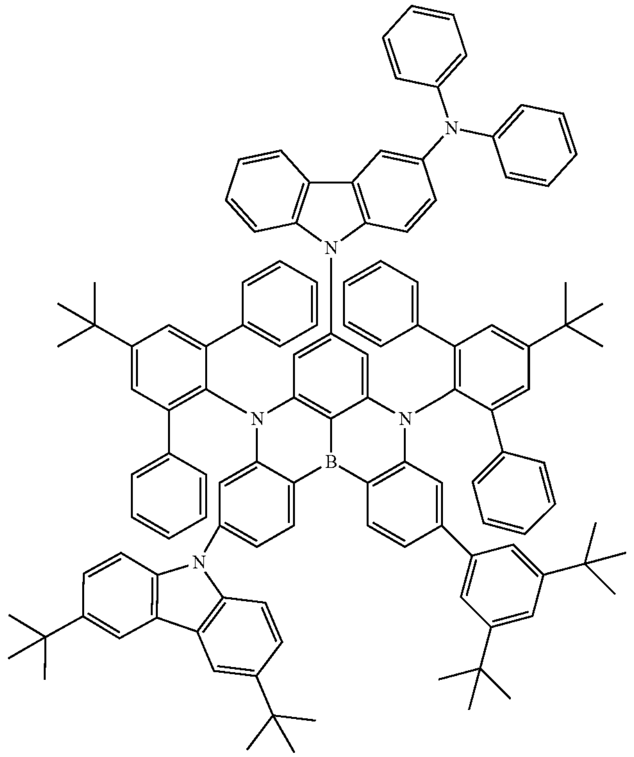

-continued
468
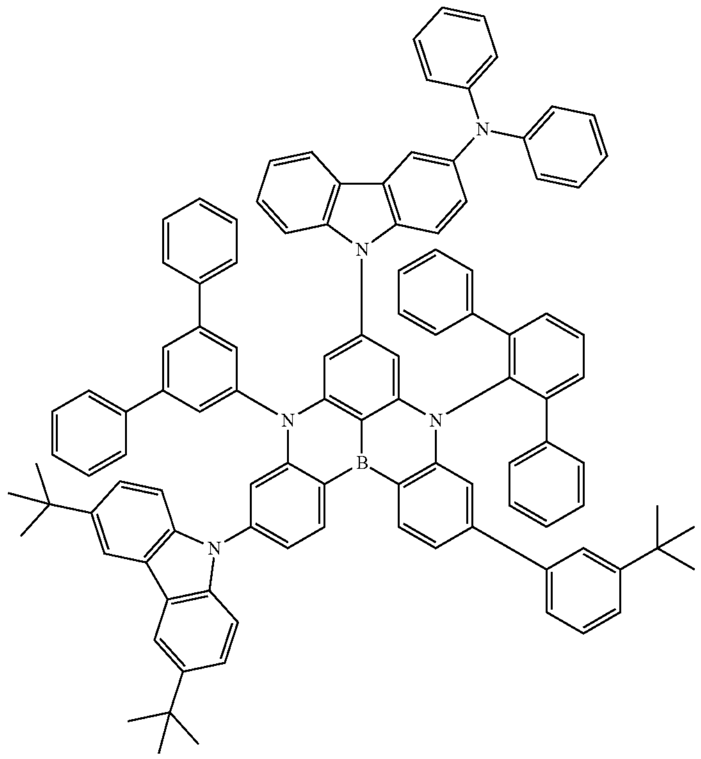
469
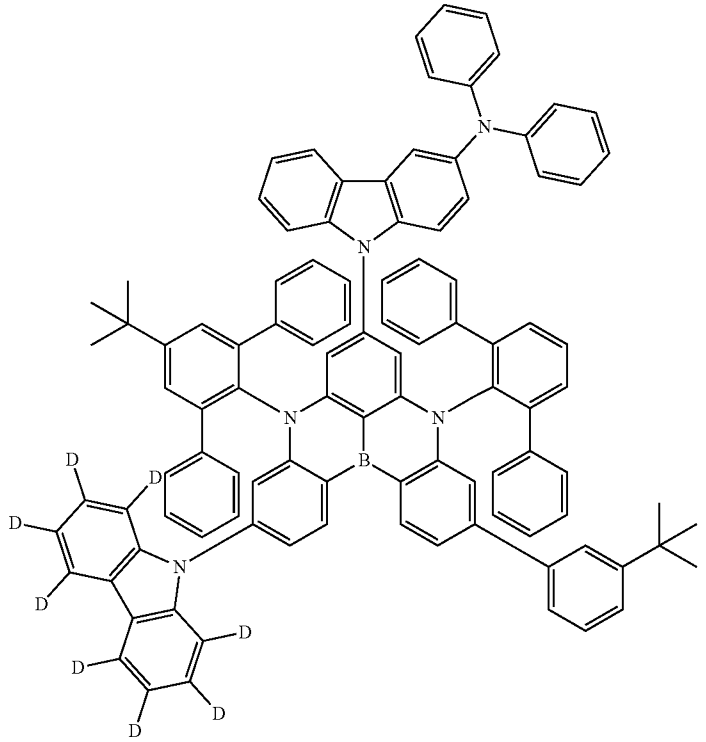

-continued
470
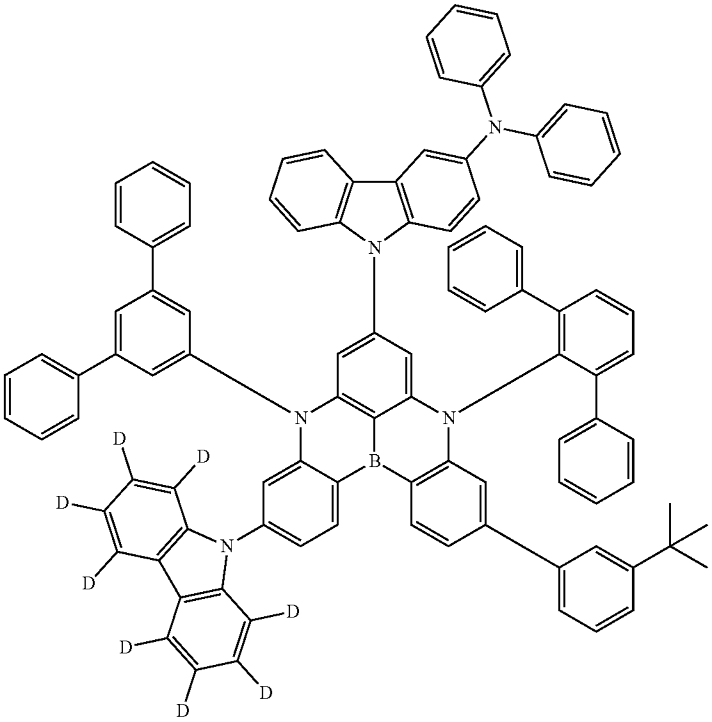
471
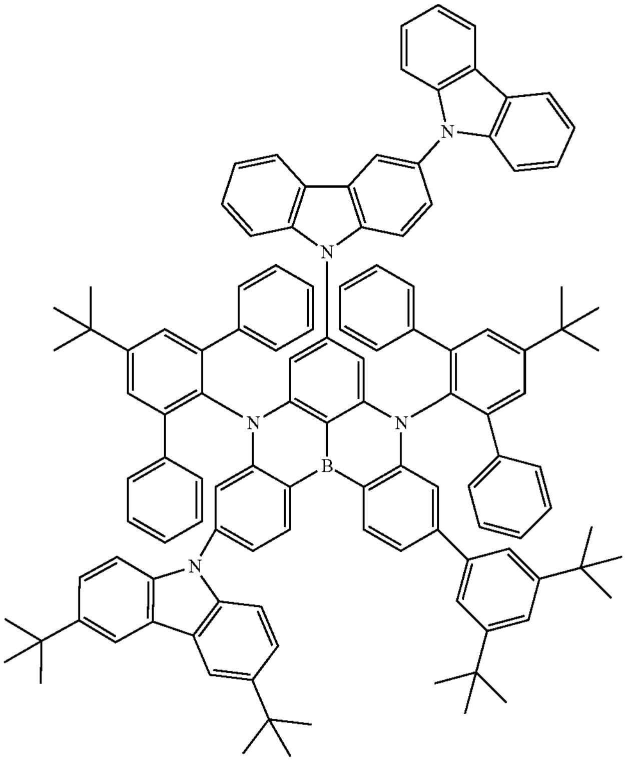

-continued
472
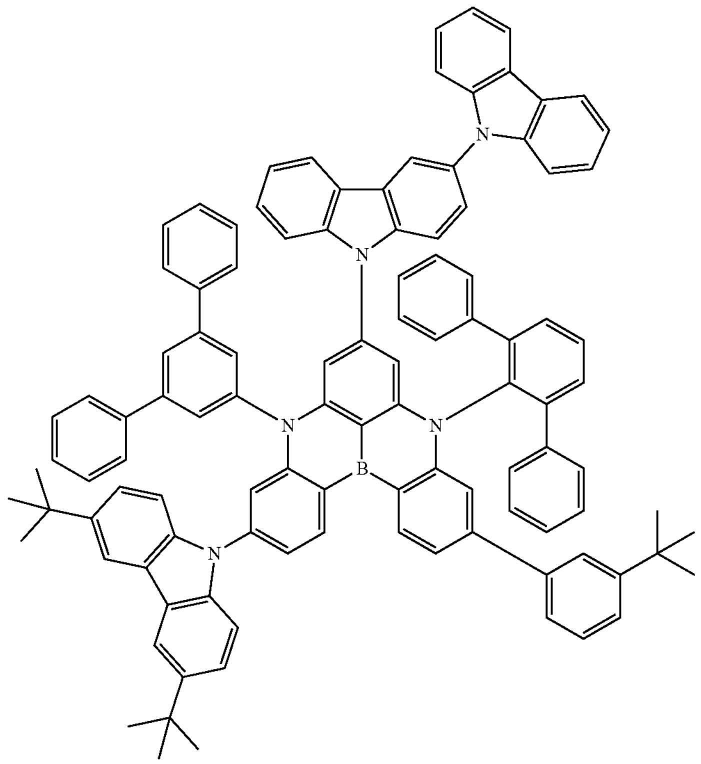
473
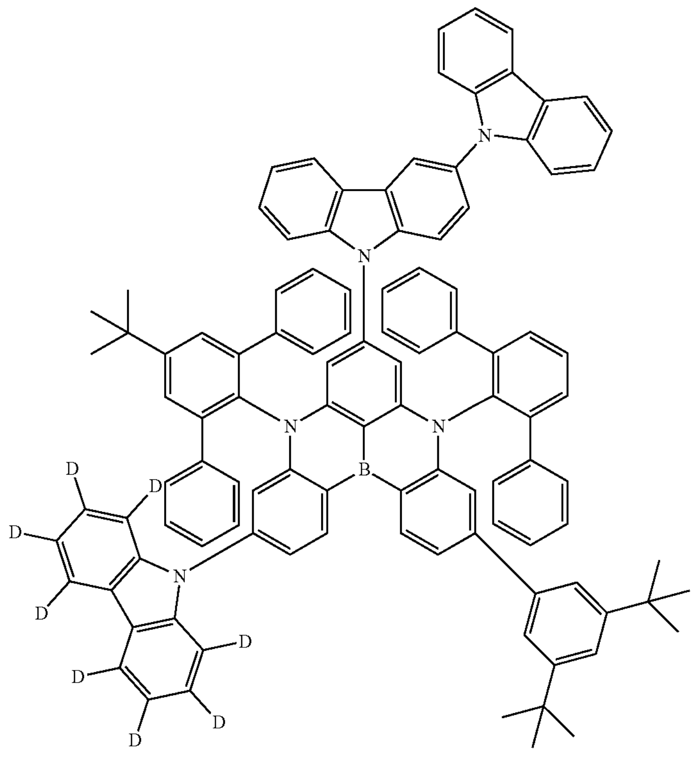

-continued
474
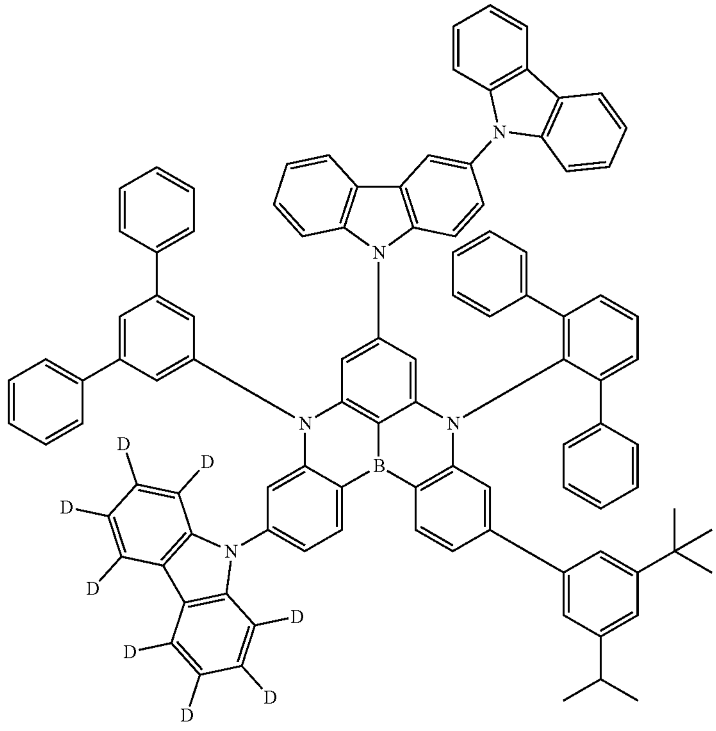
475
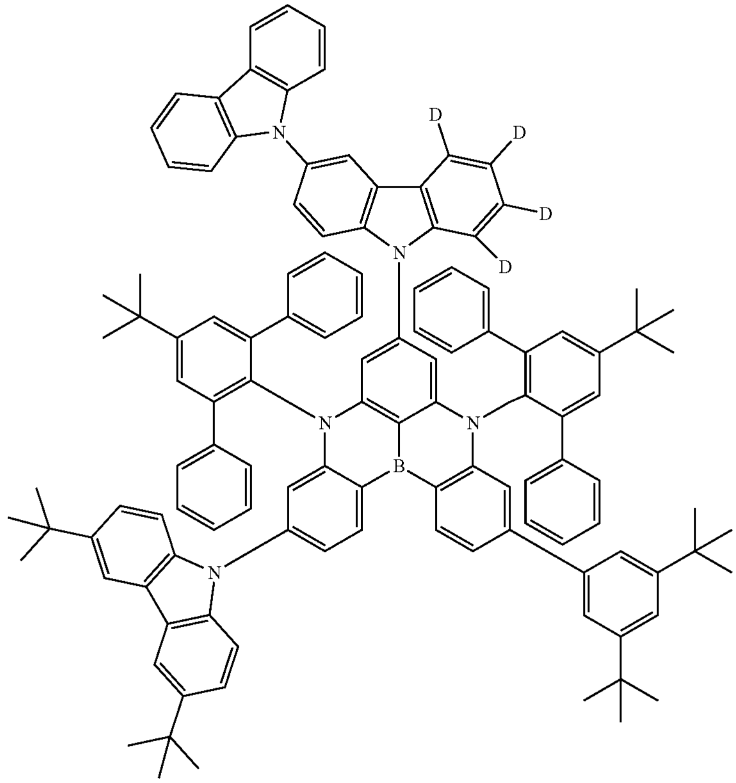

-continued
476
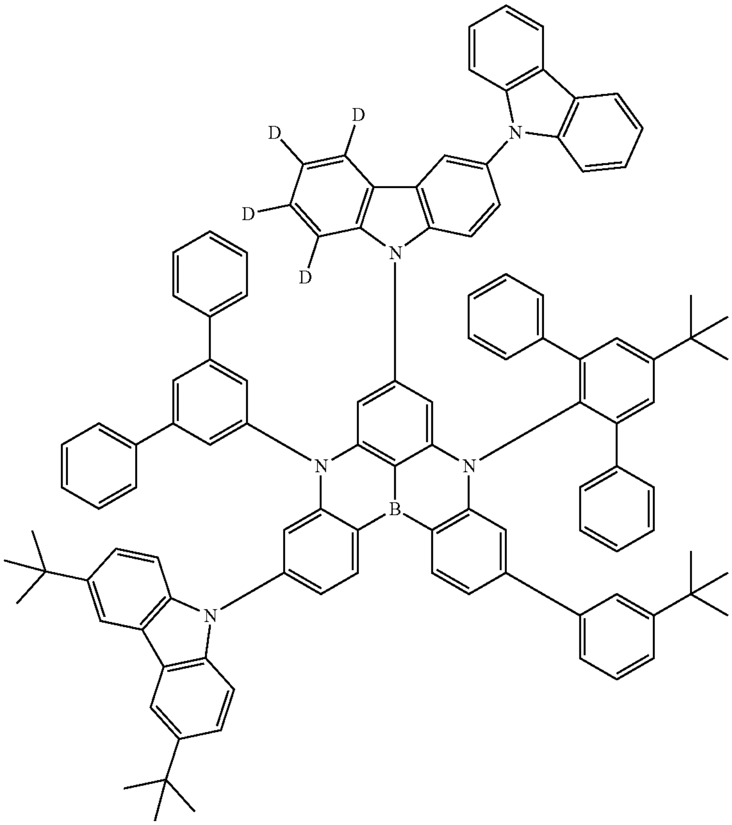
477
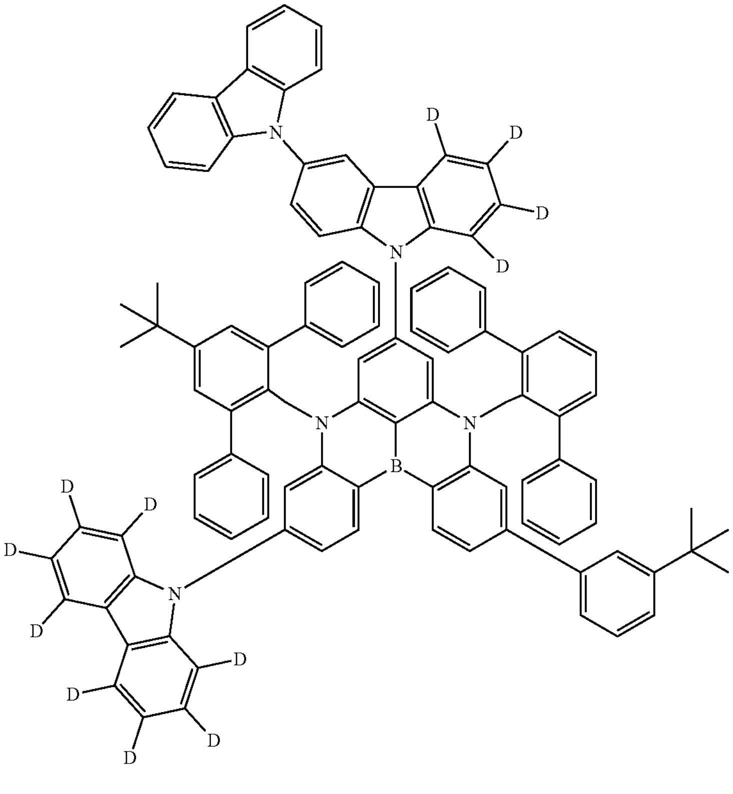

-continued
478
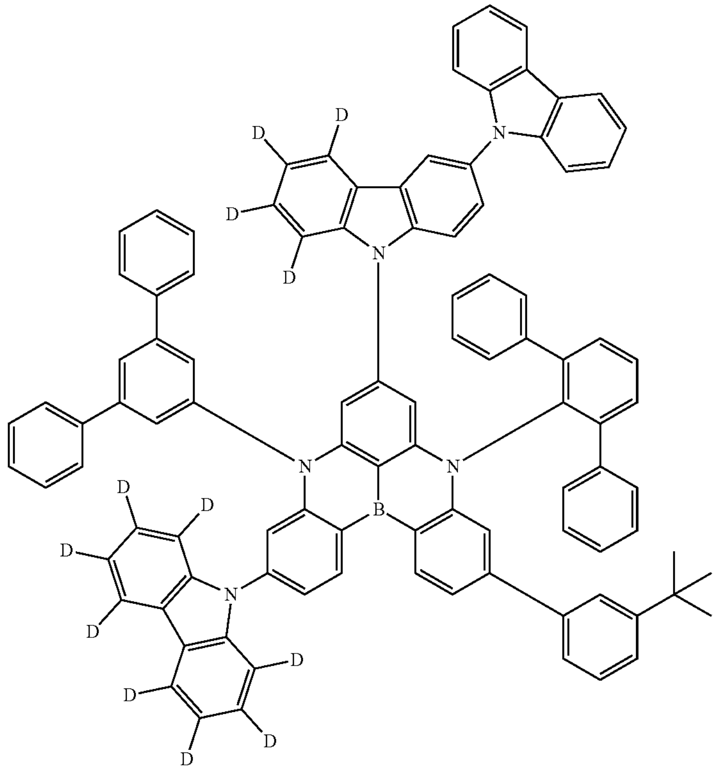
479
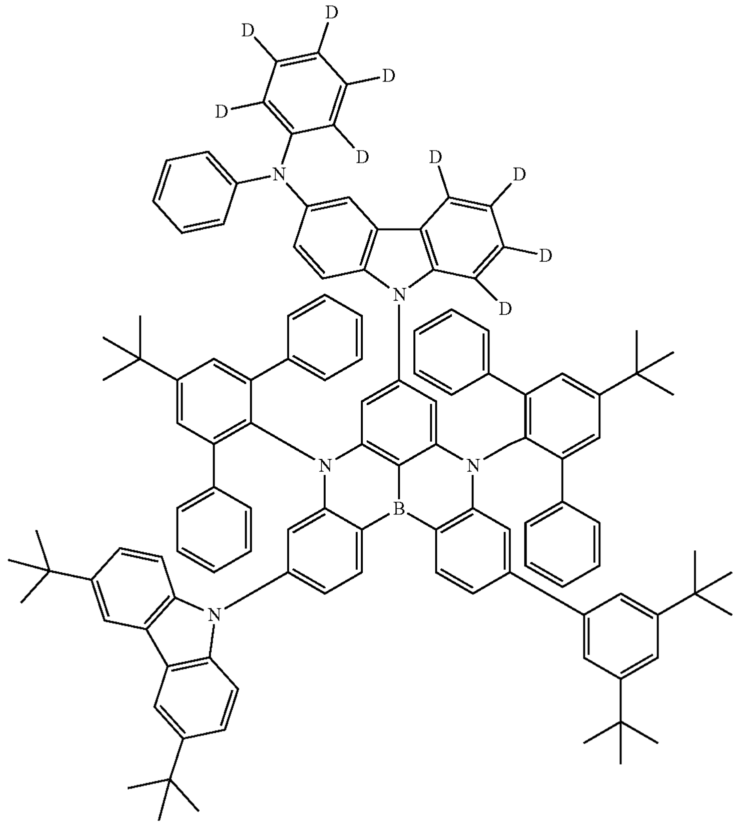

-continued
480
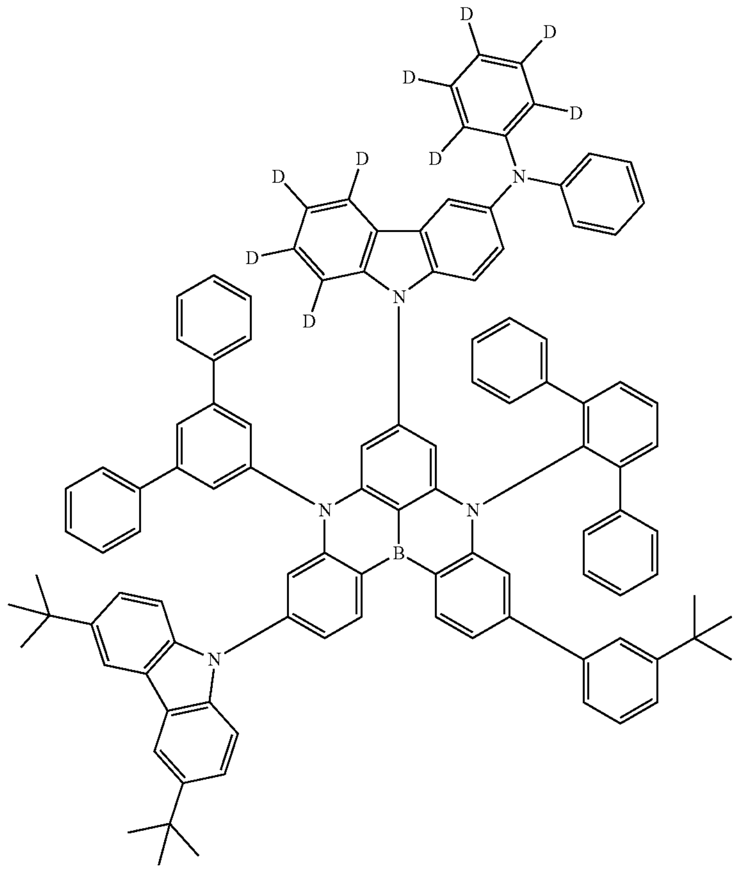
481
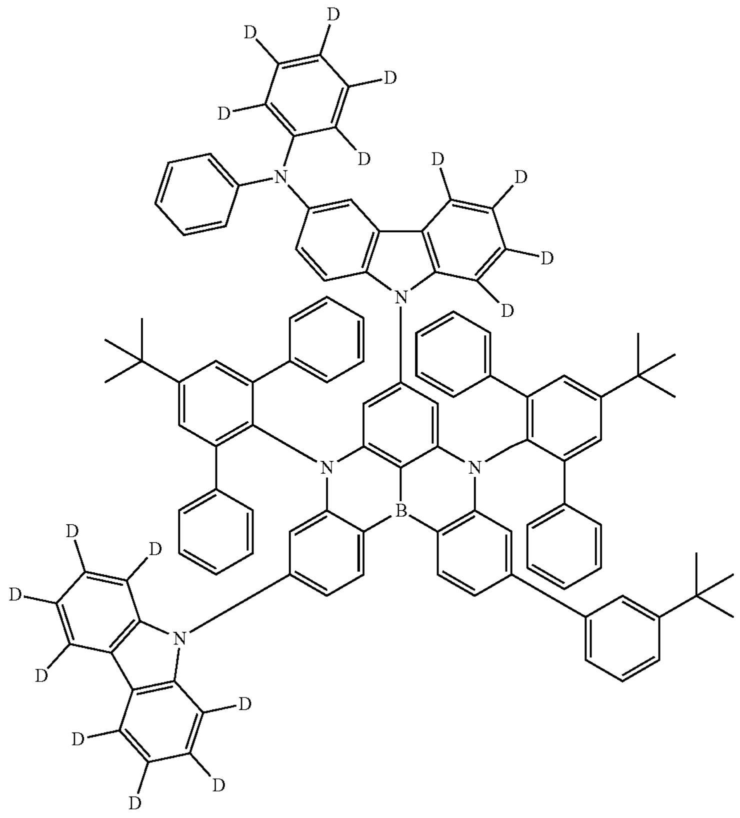

-continued
482
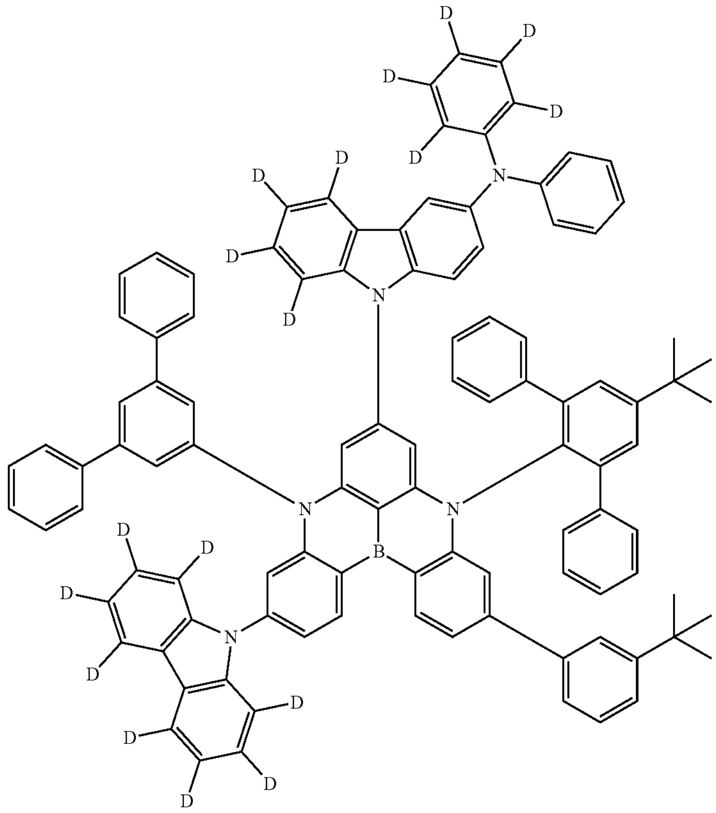
483
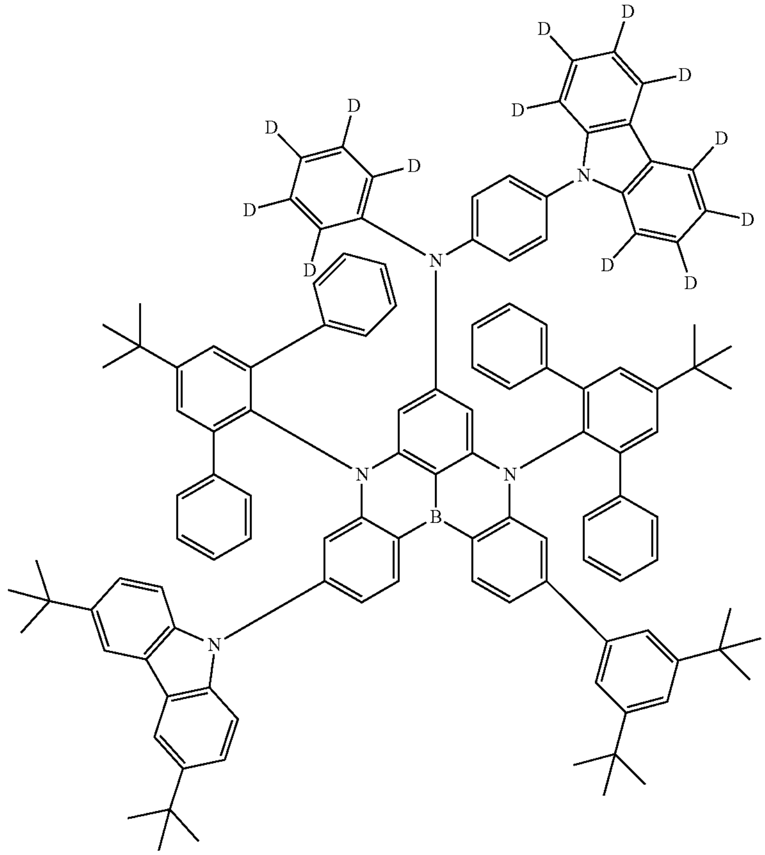

-continued
484
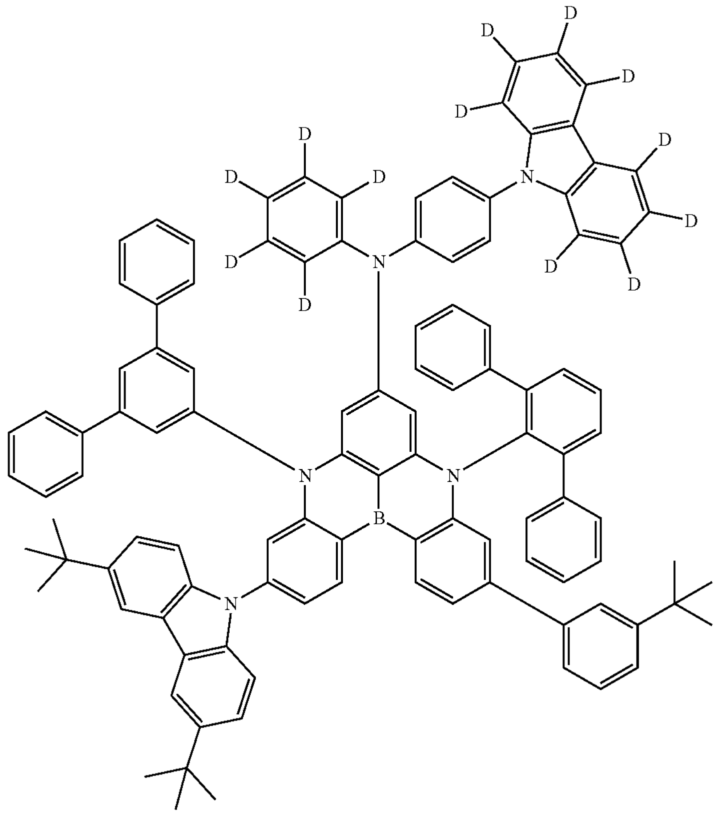
485
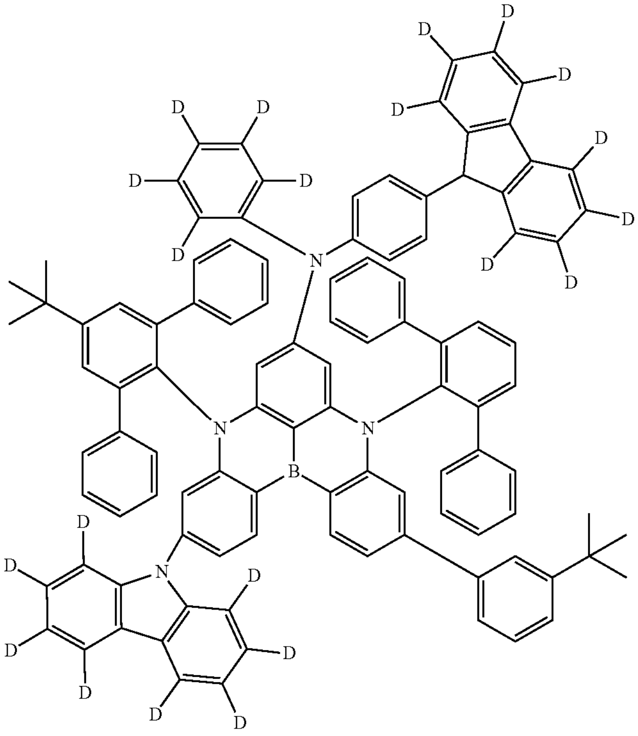

-continued
486
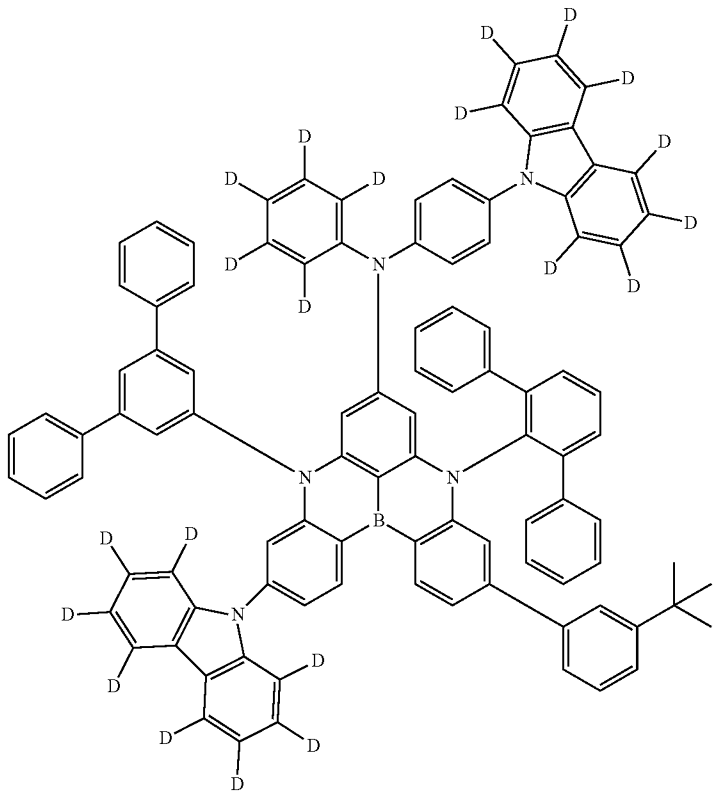
487
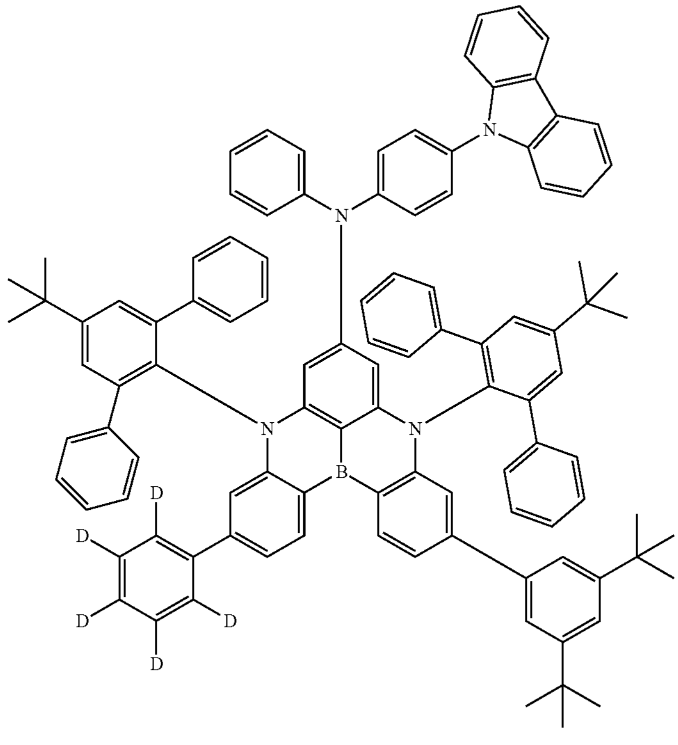

-continued
488
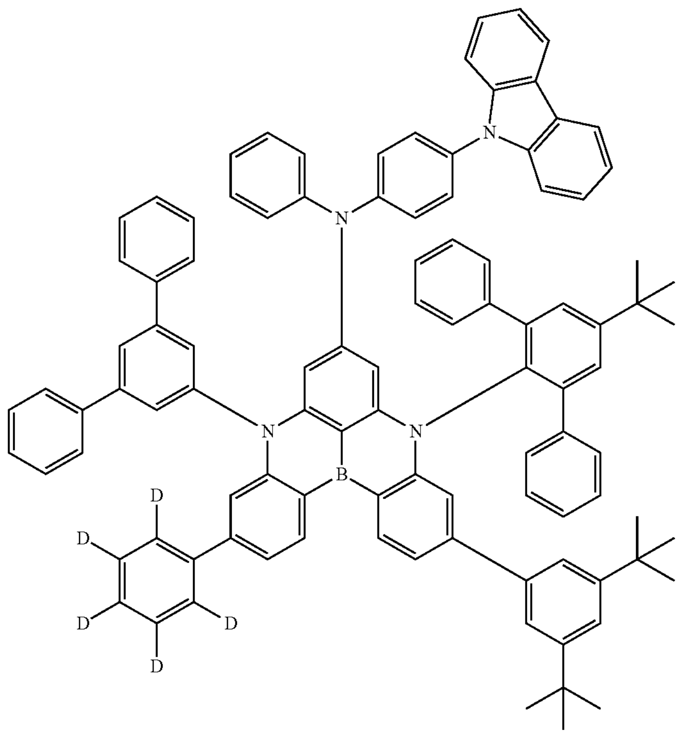
489
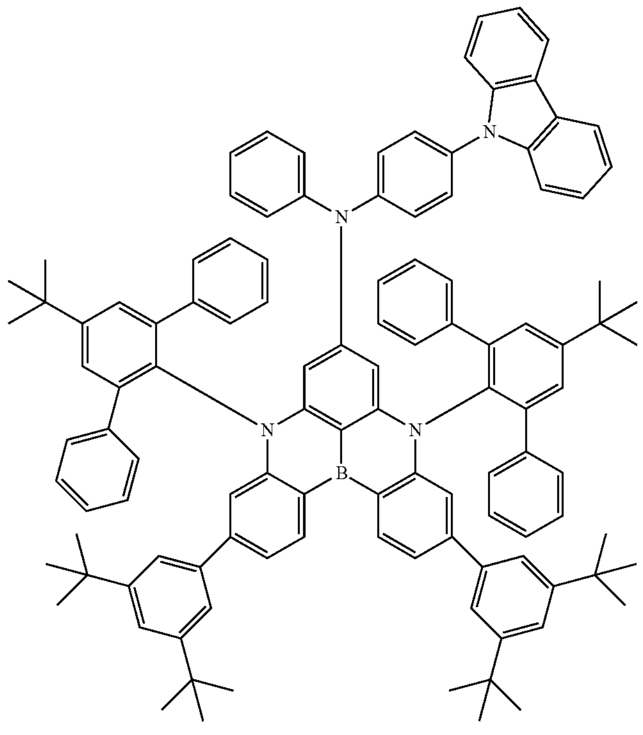

-continued
490
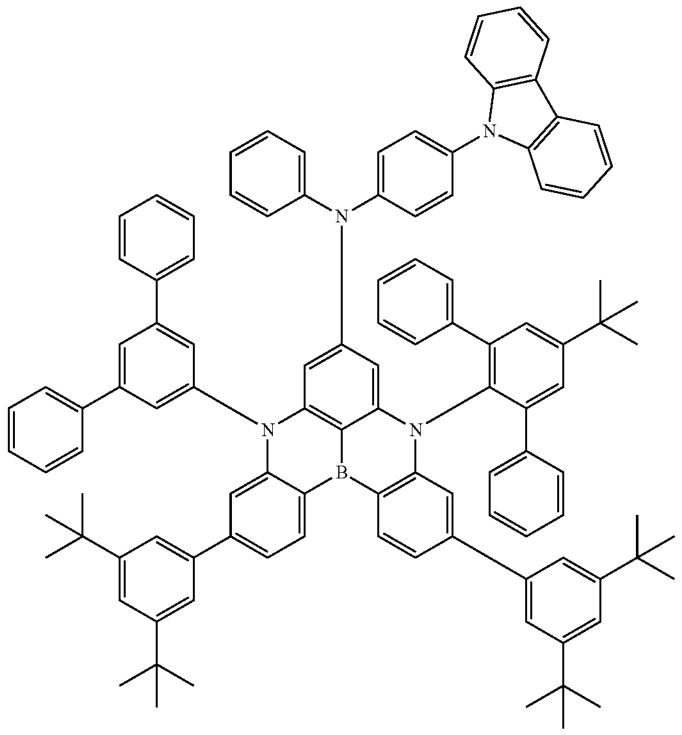
491
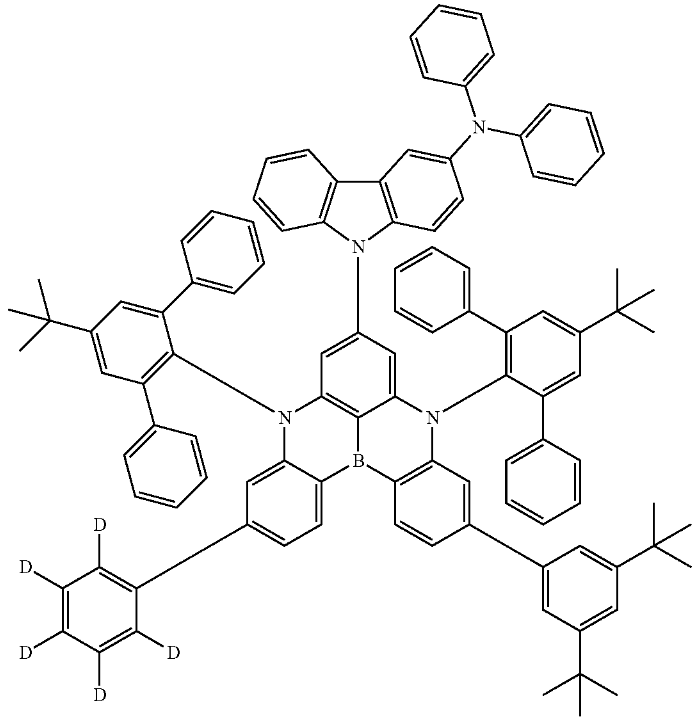

-continued
492
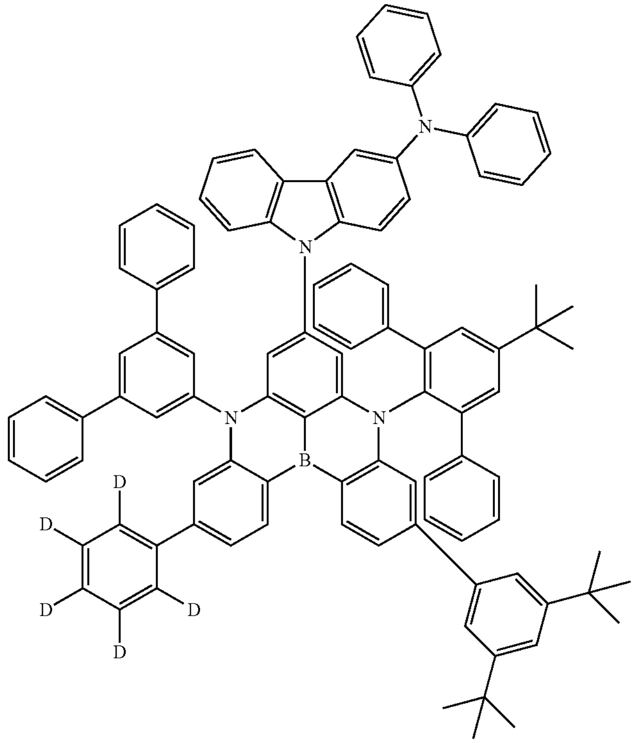
493
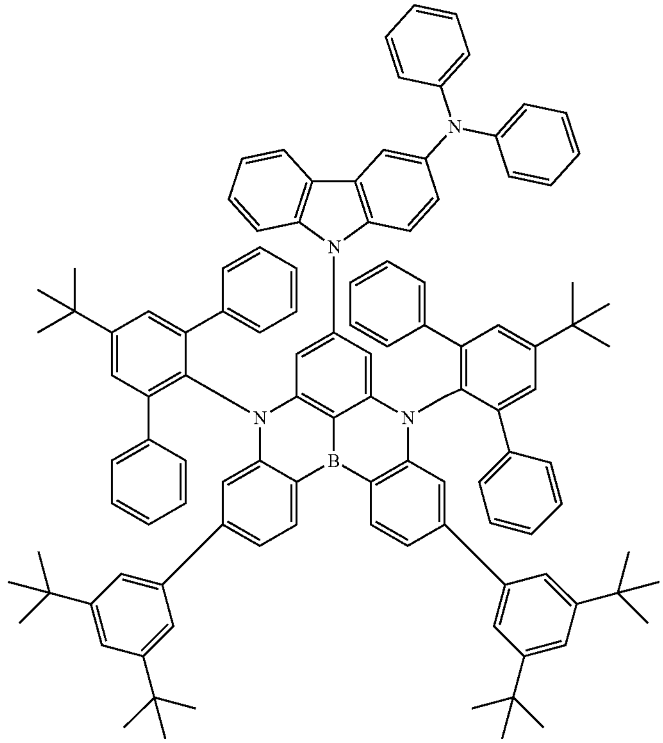

-continued
494
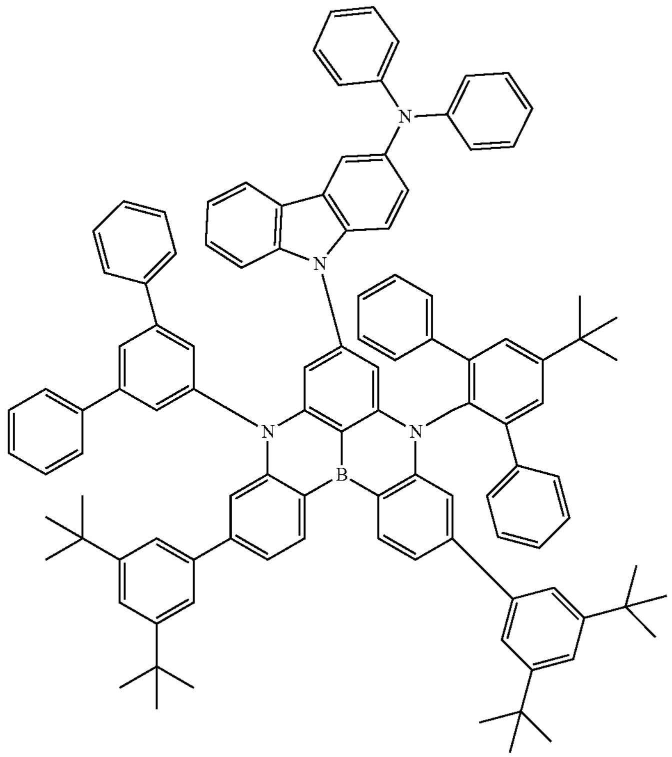
495
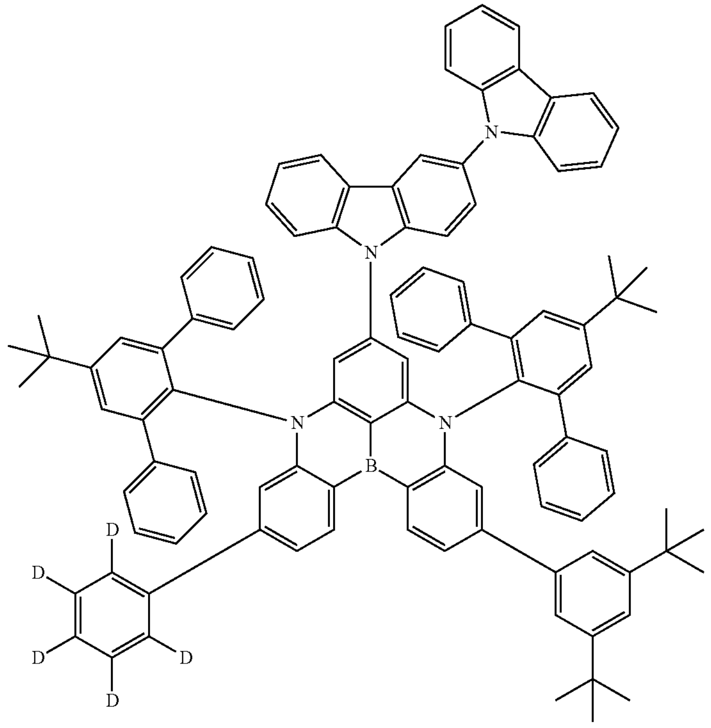

-continued
496
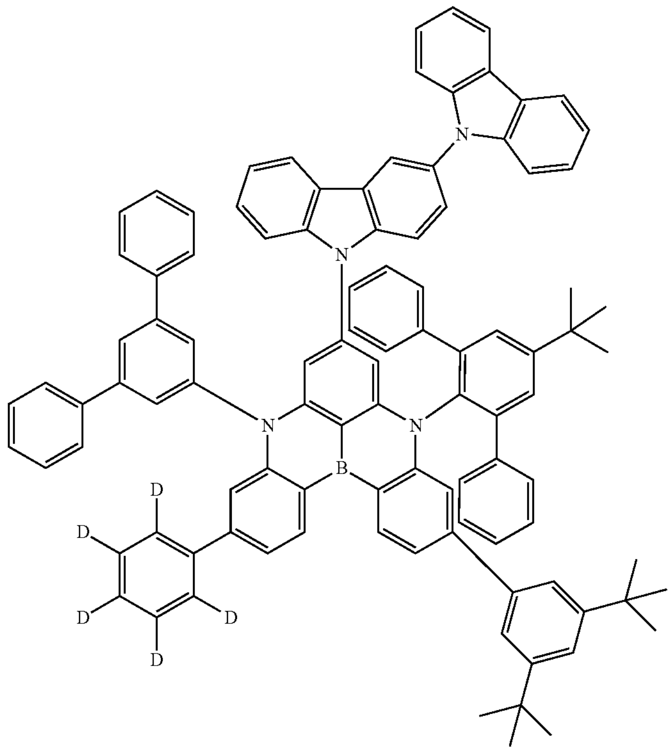
497
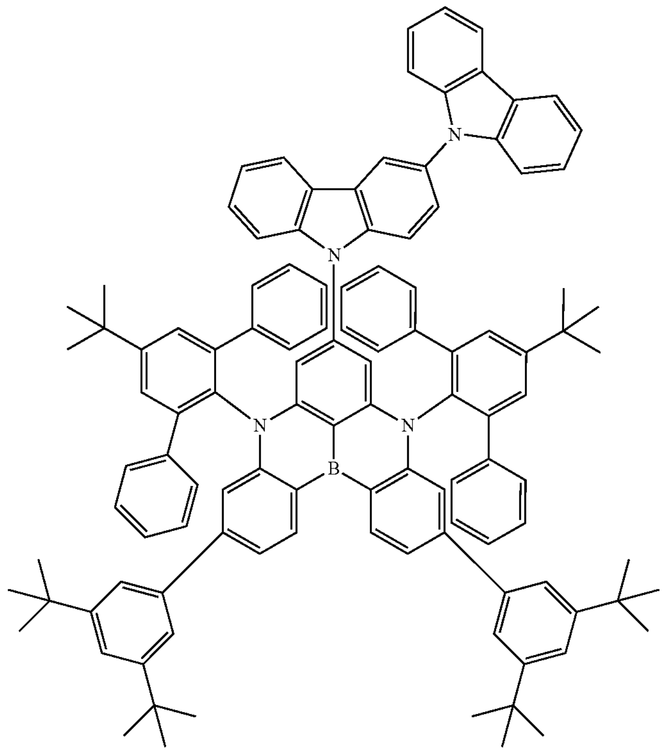

-continued
498
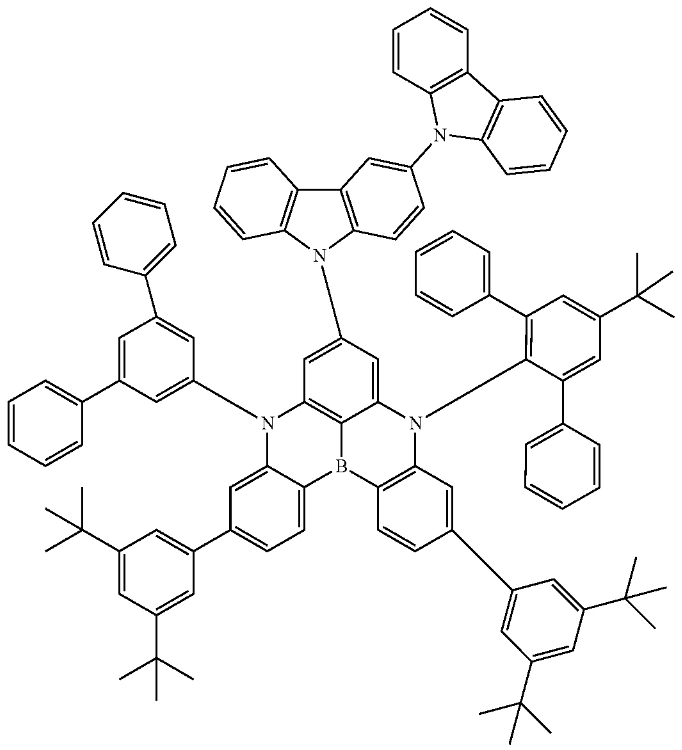
499
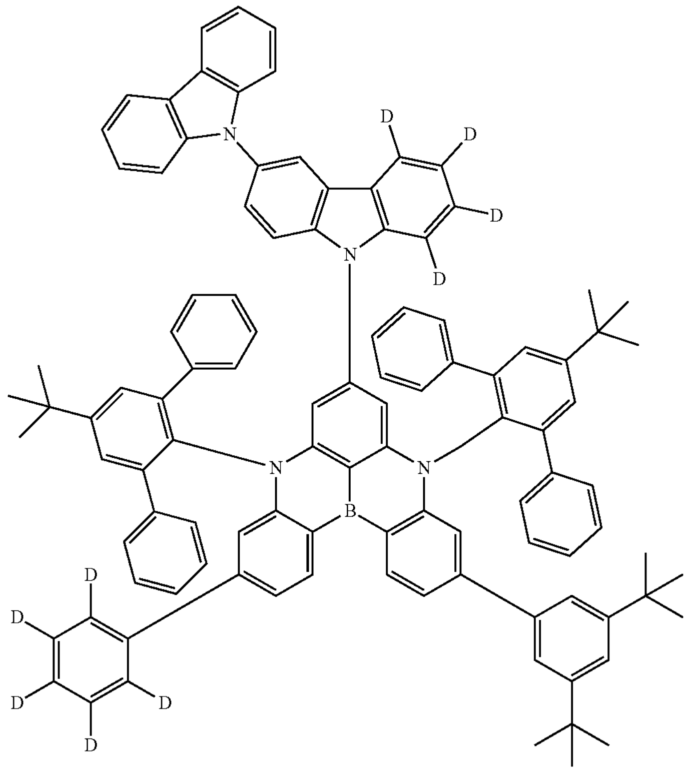

-continued
500
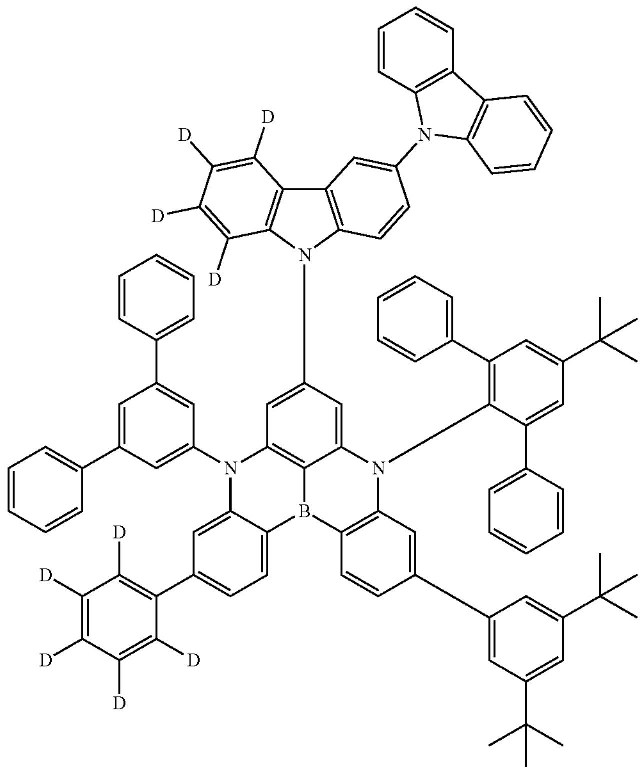
501
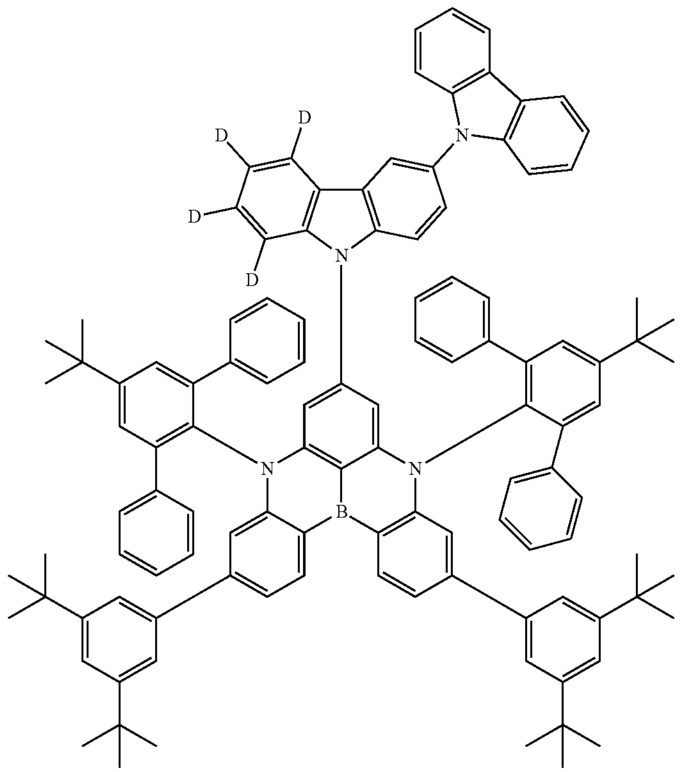

-continued
502
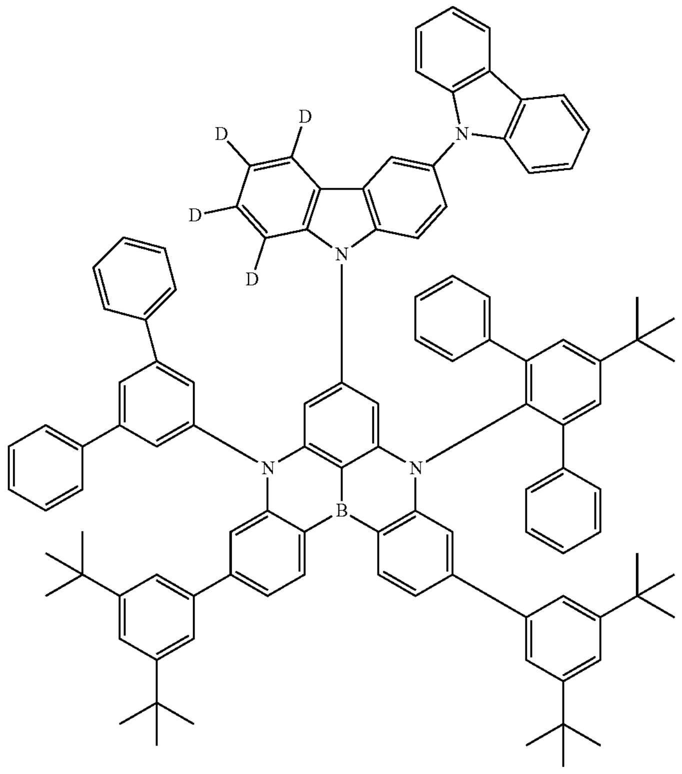
503
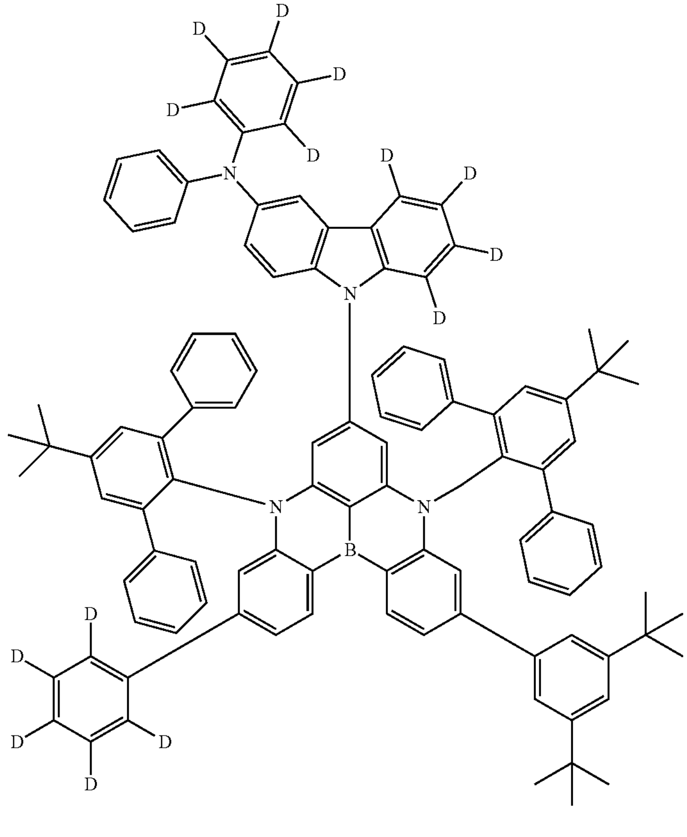

-continued
504
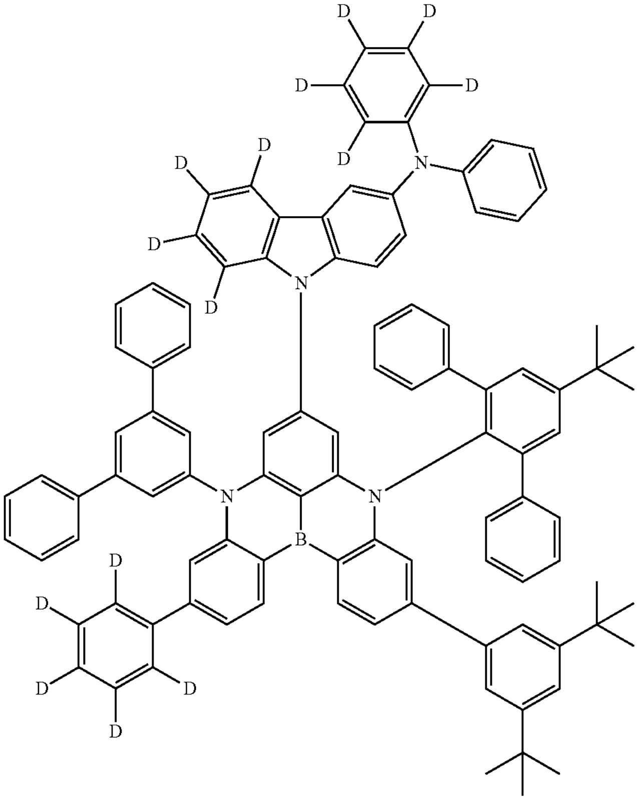
505
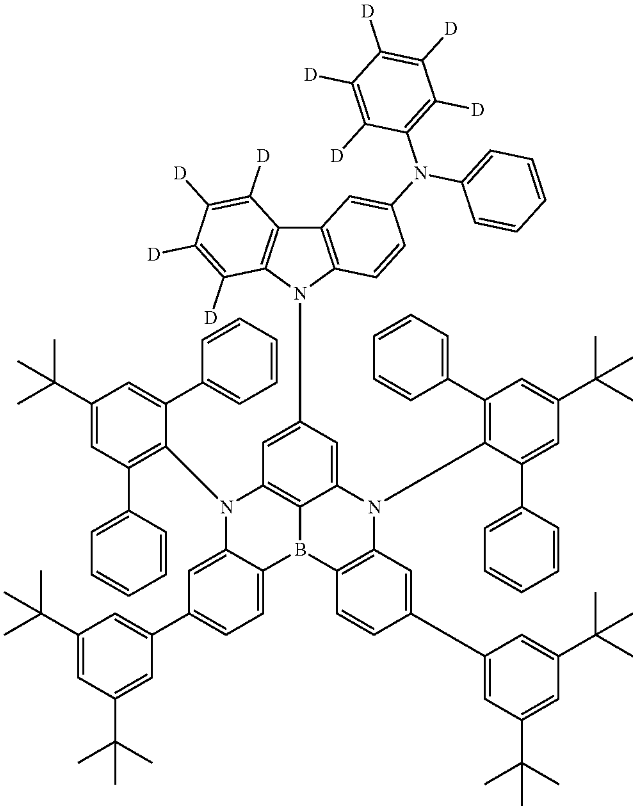

-continued
506
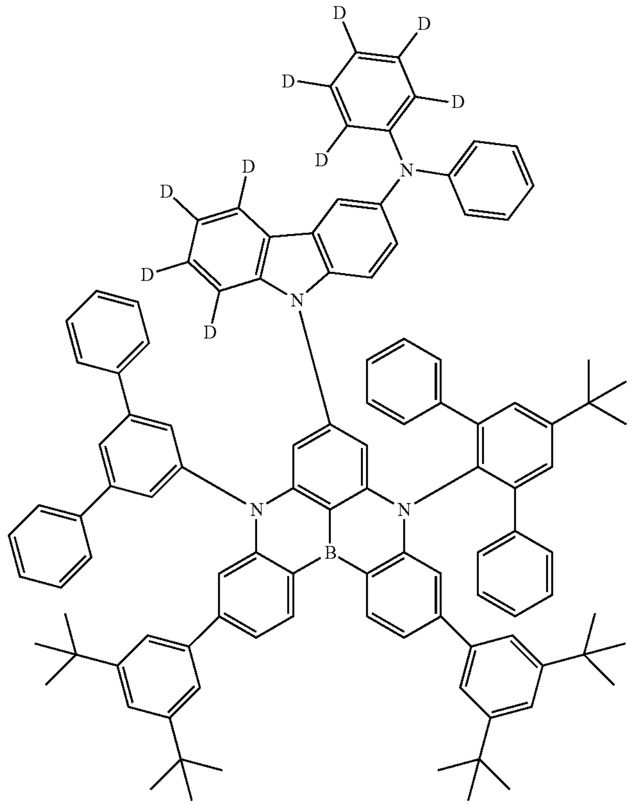
507
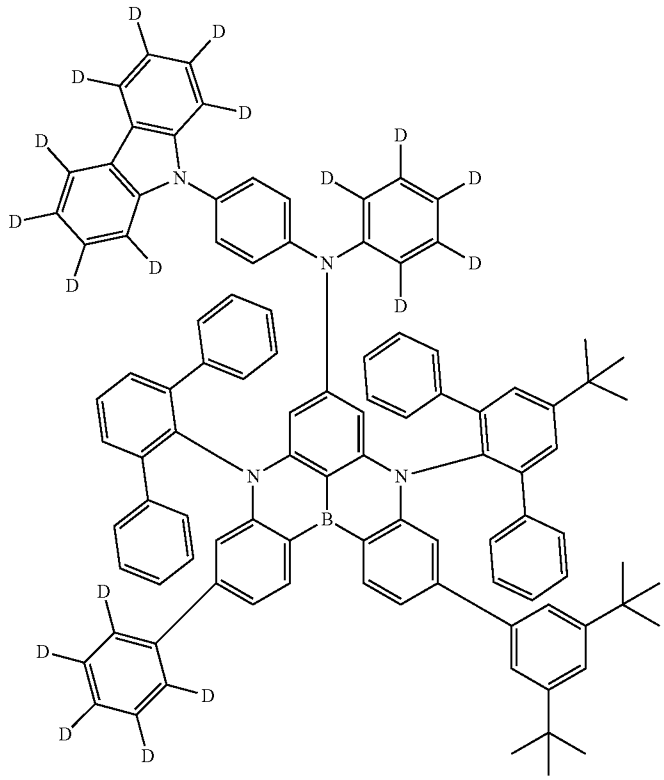

-continued
508
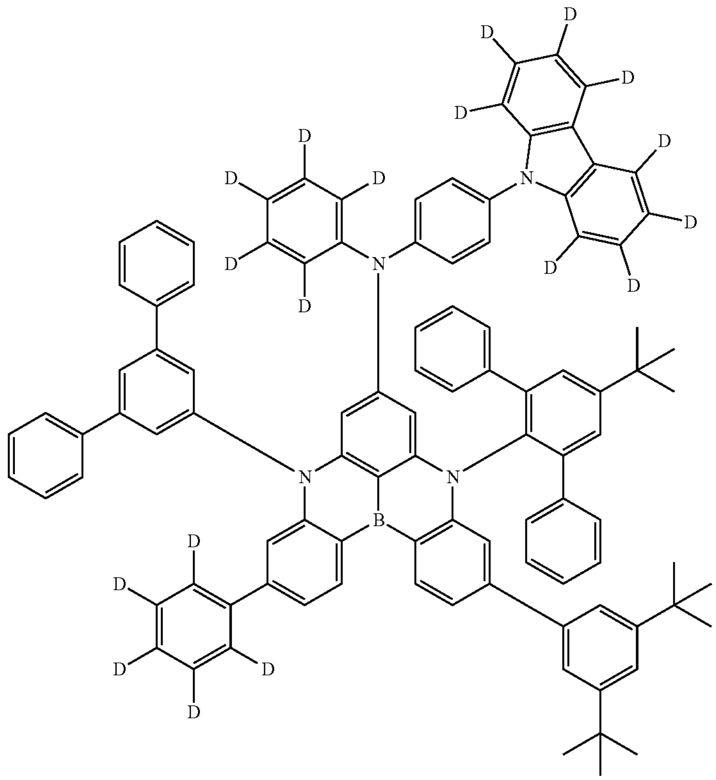
509
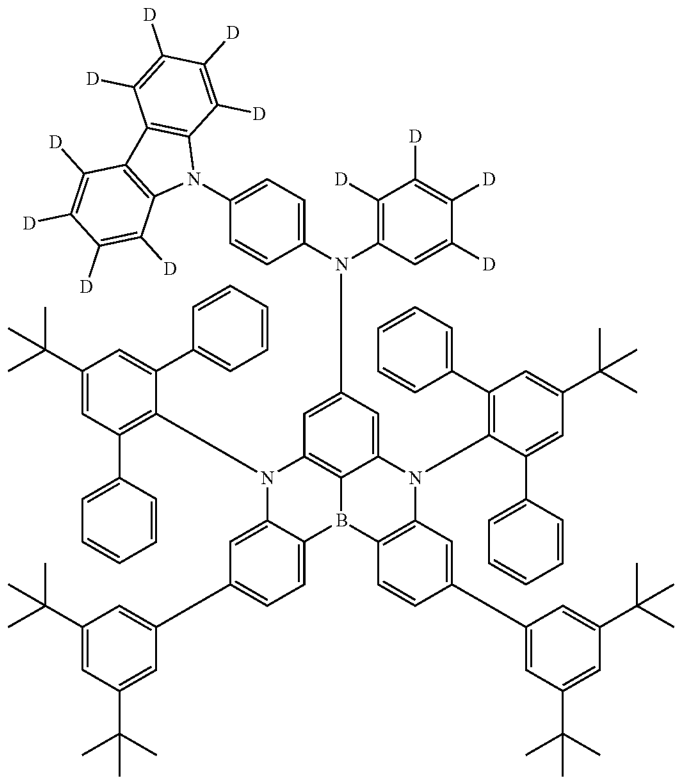

-continued
510
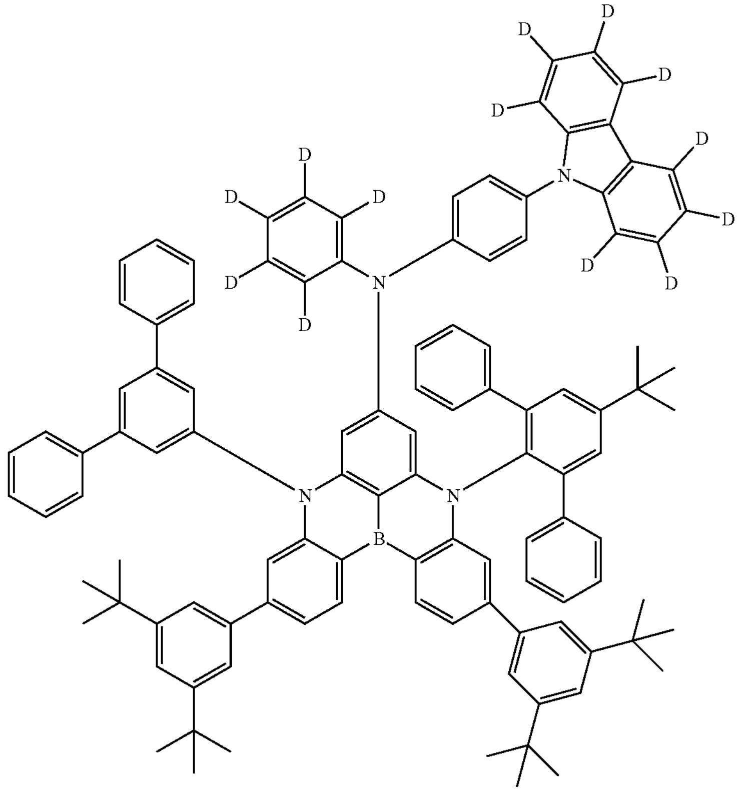
511
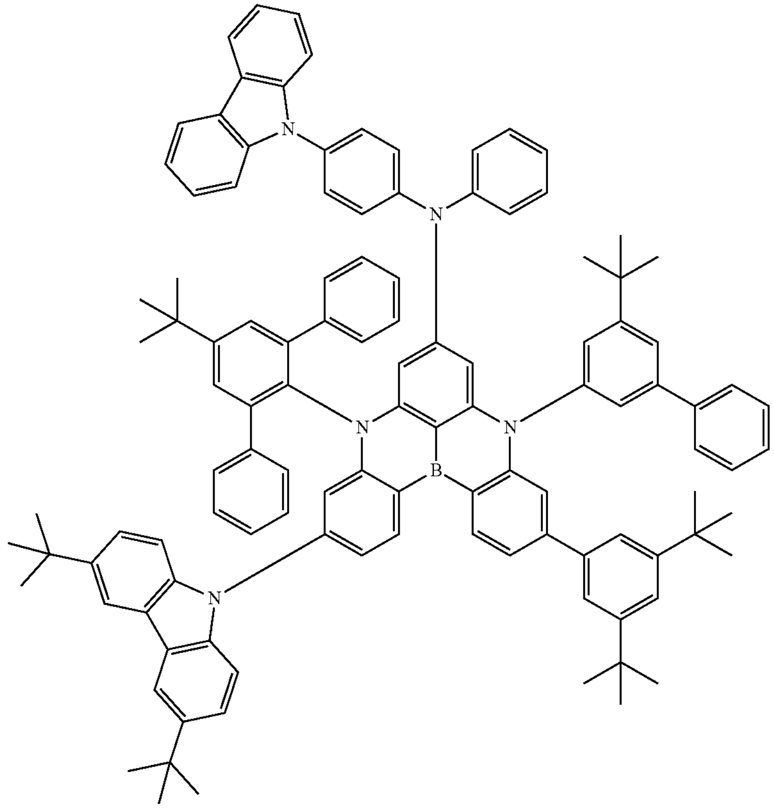

-continued
512
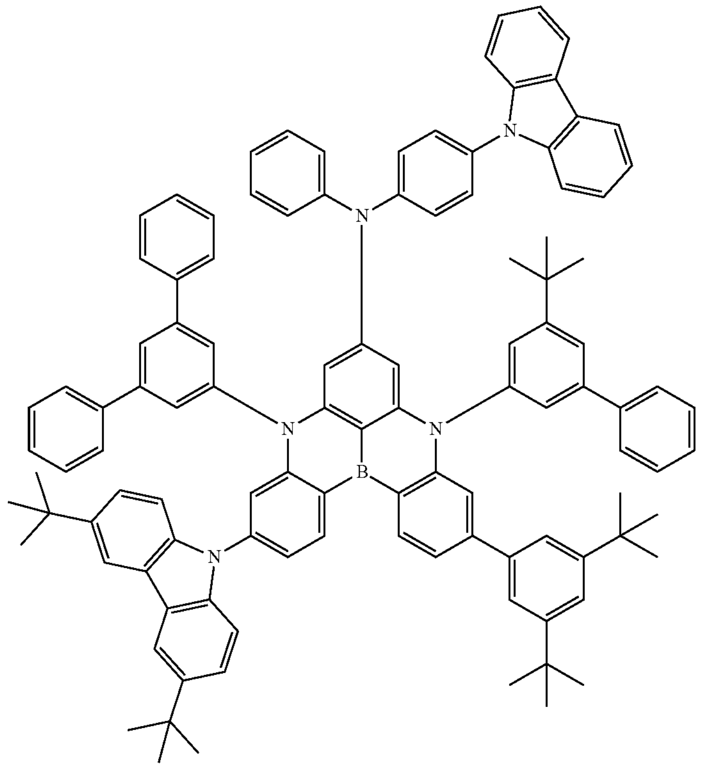
513
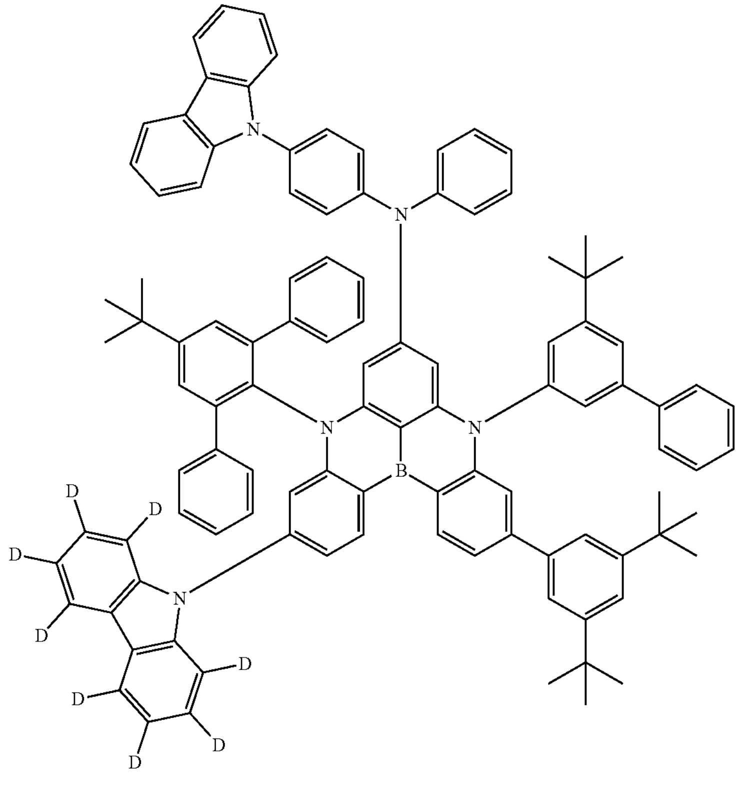

-continued
514
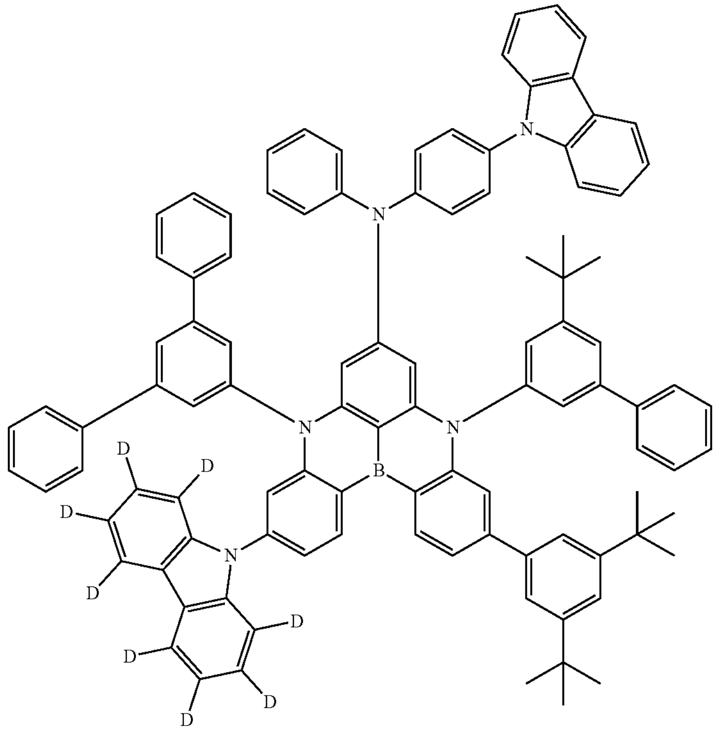
515
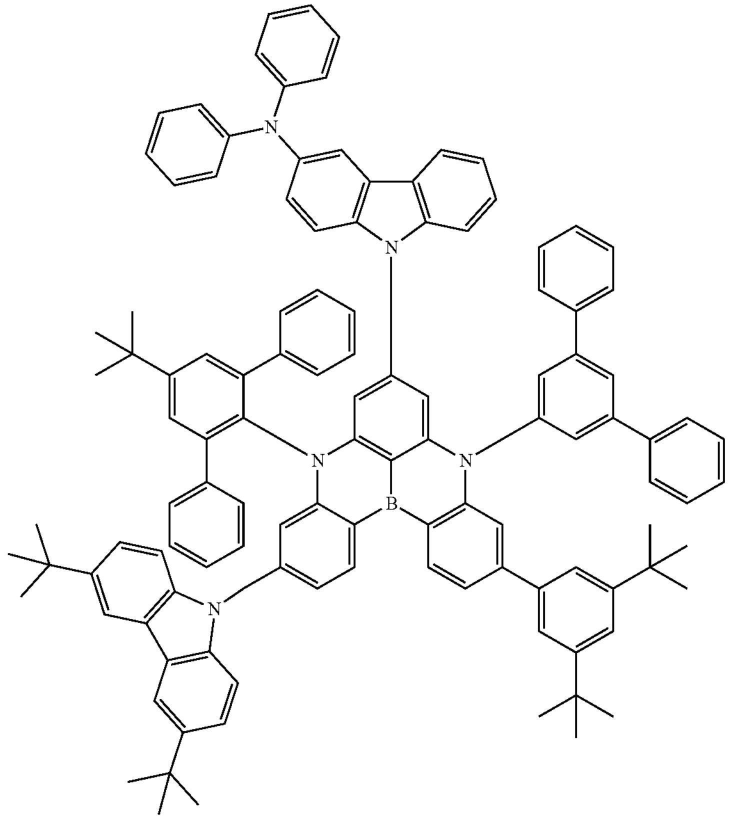

-continued
516
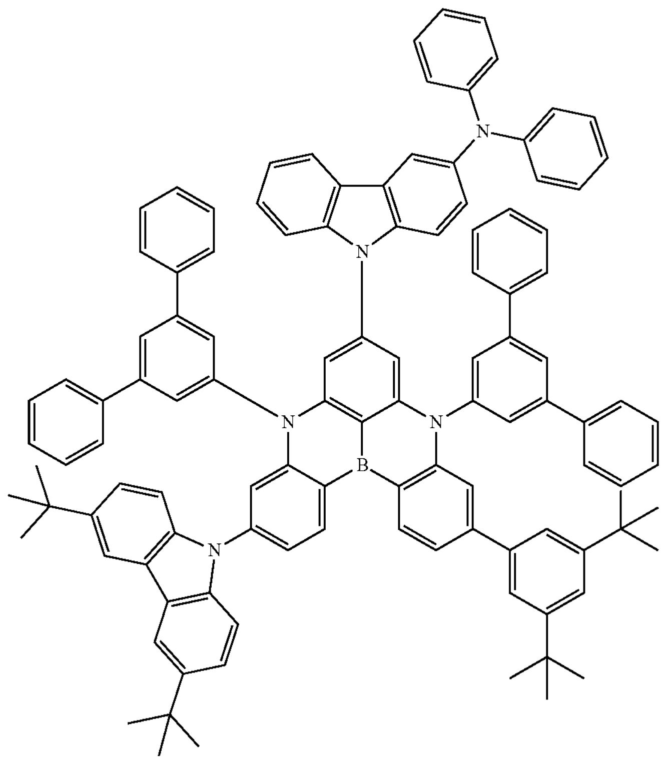
517
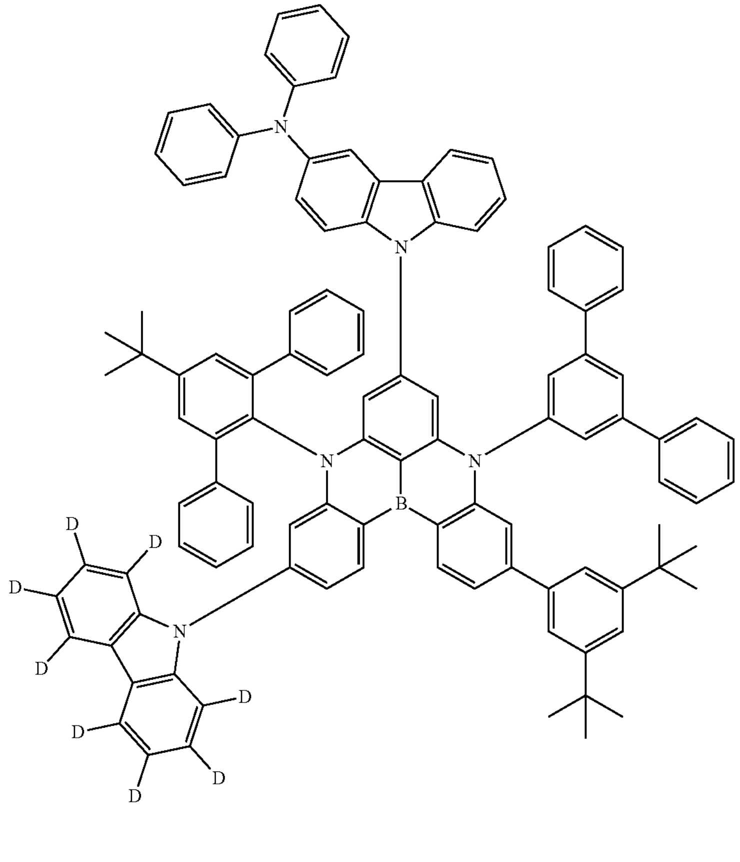

-continued
518
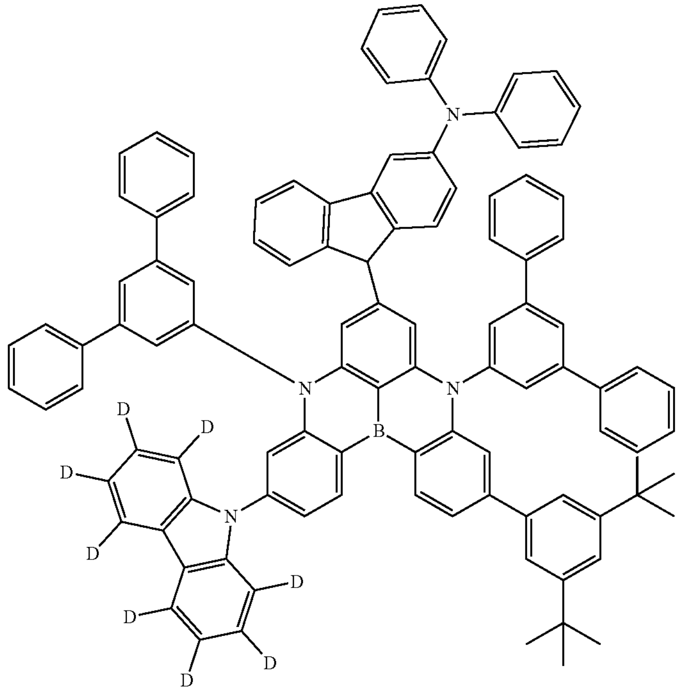
519
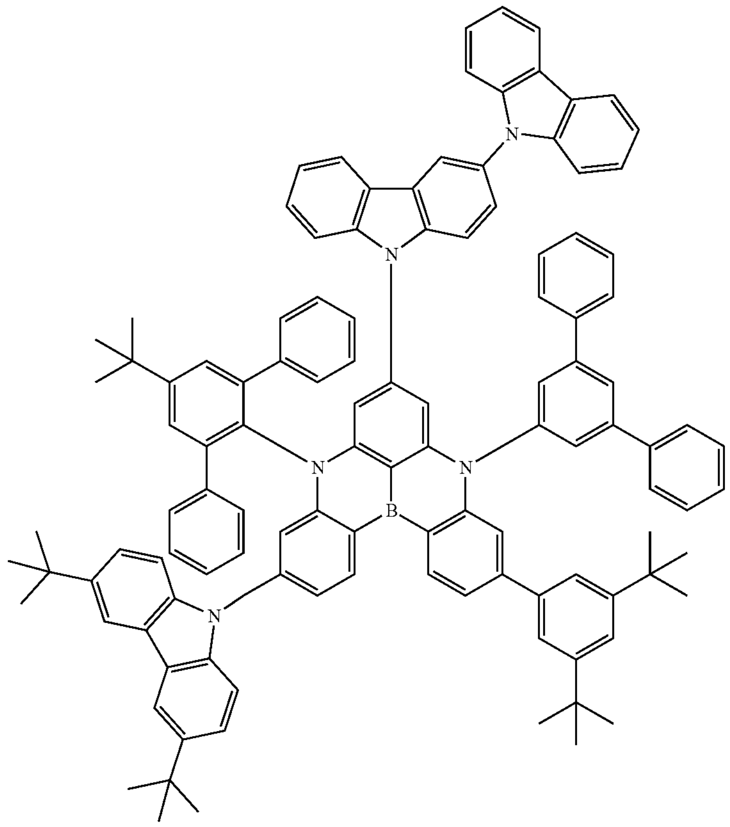

-continued
520
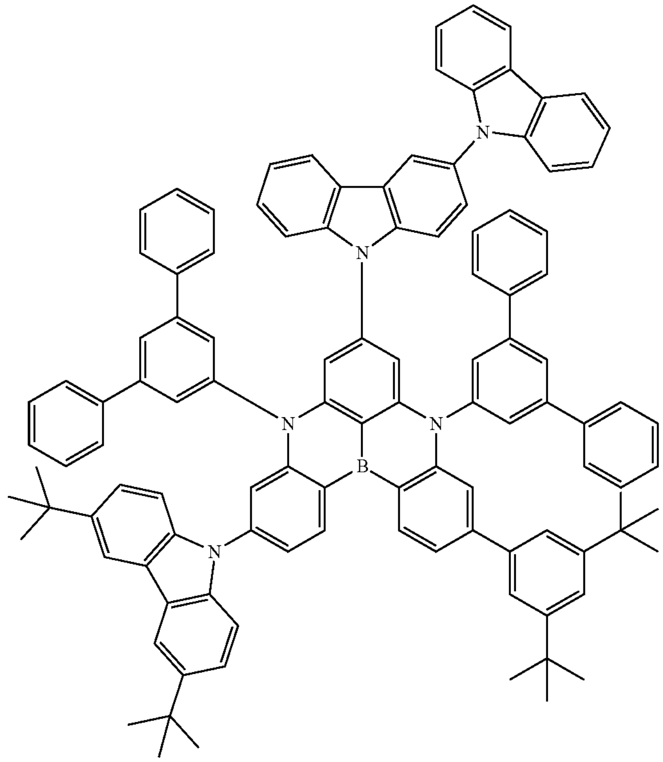
521
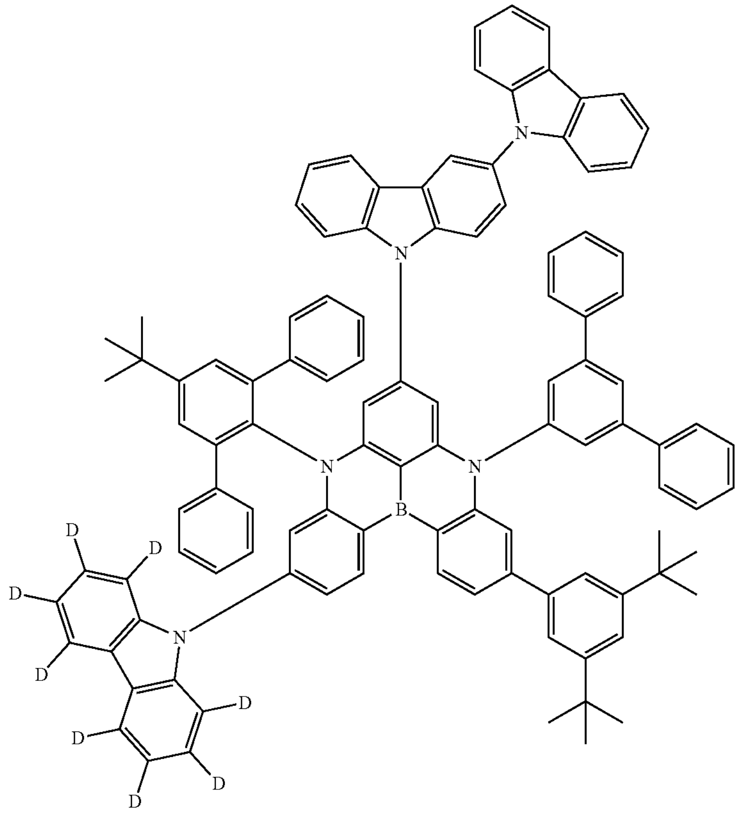

-continued
522
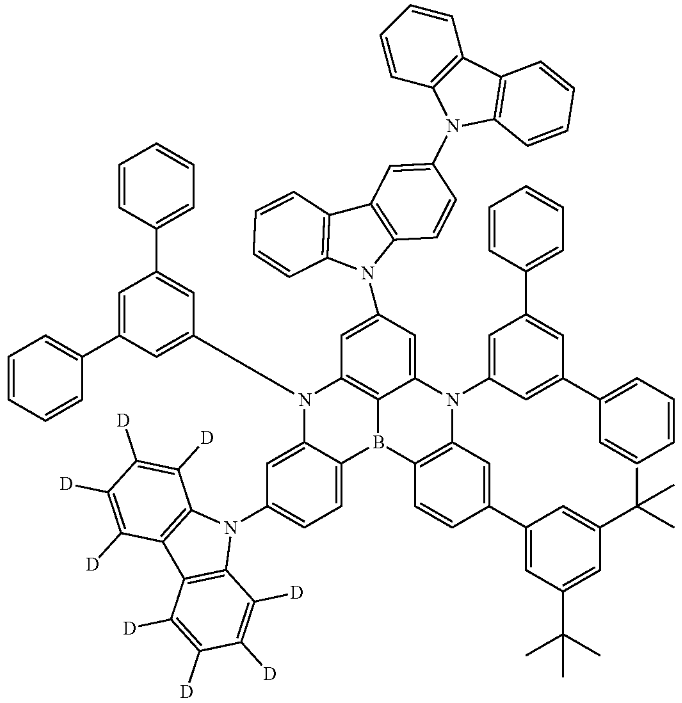
523
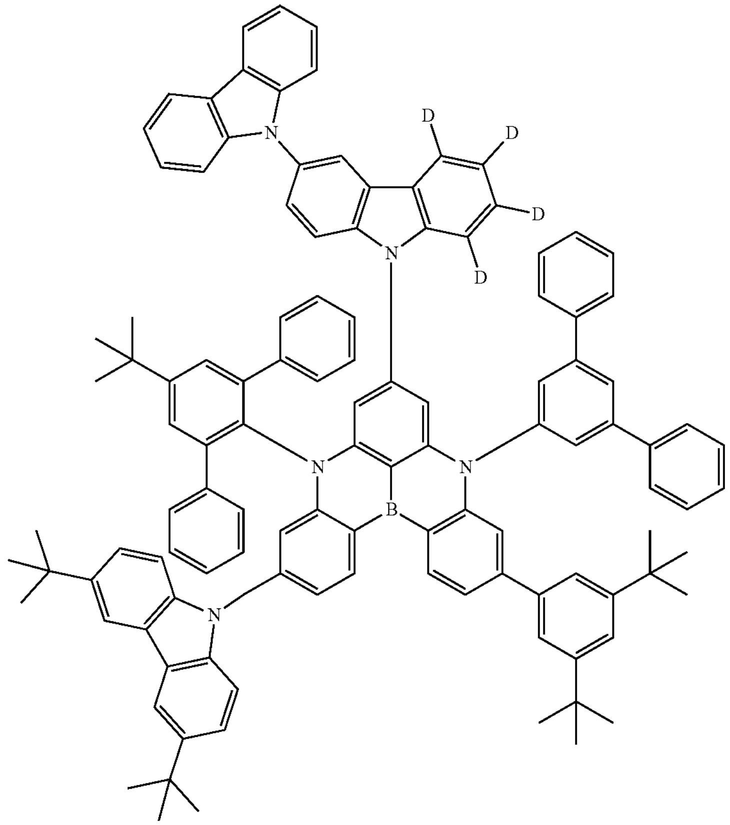

-continued
524
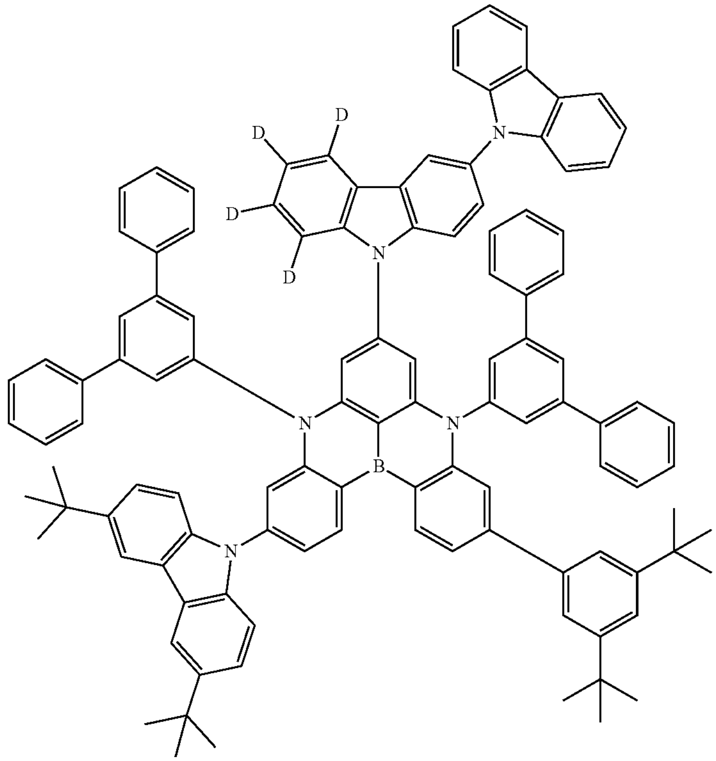
525
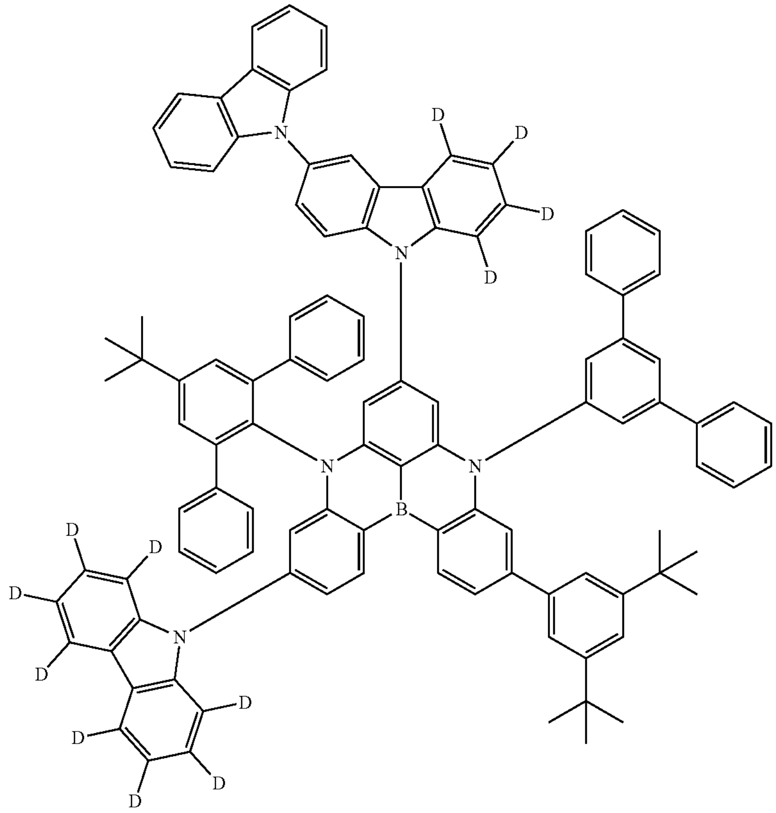

-continued
526
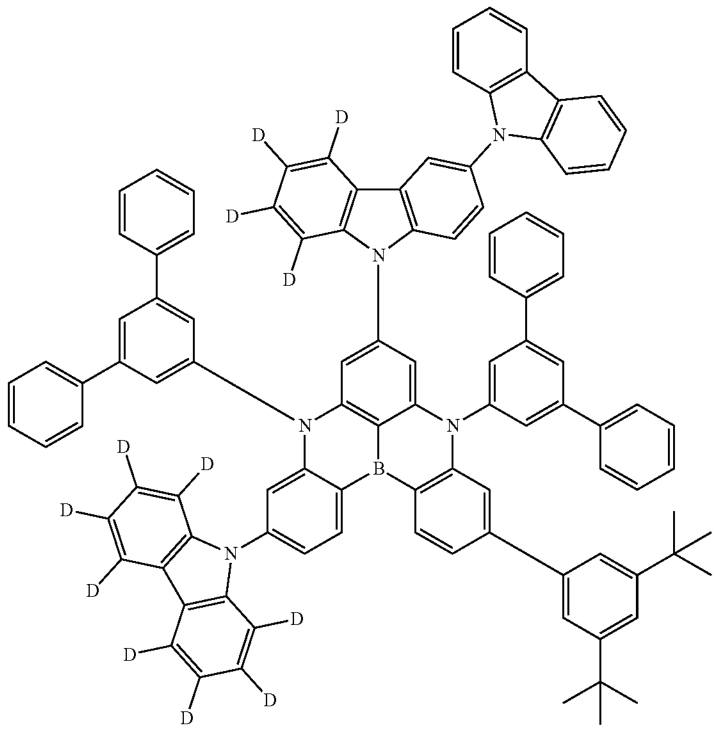
527
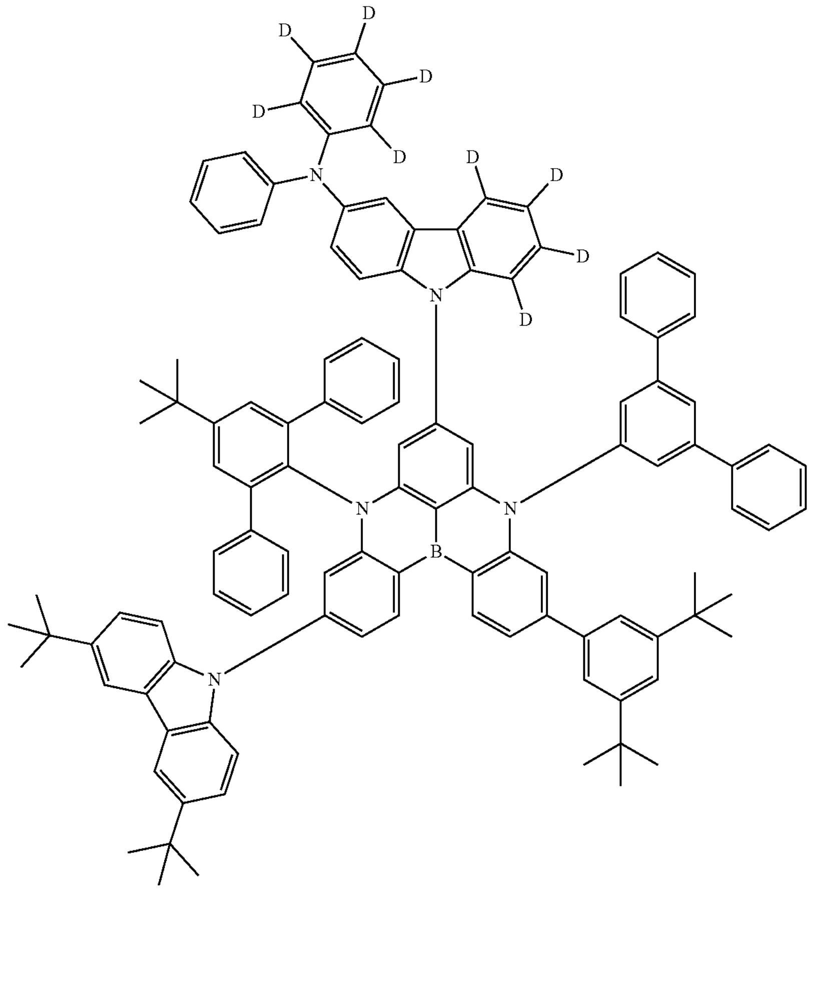

-continued
528
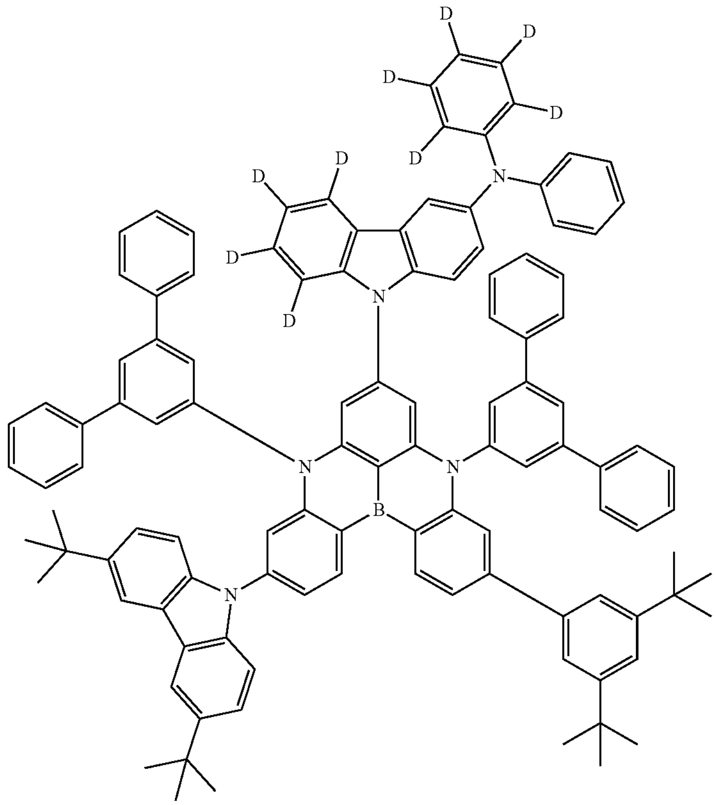
529
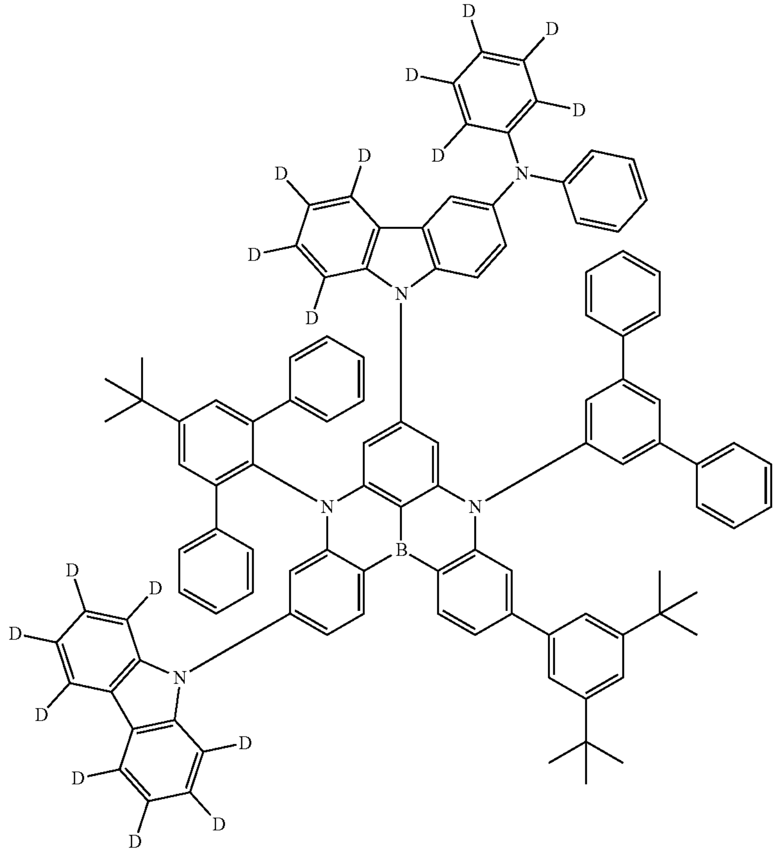

-continued
530
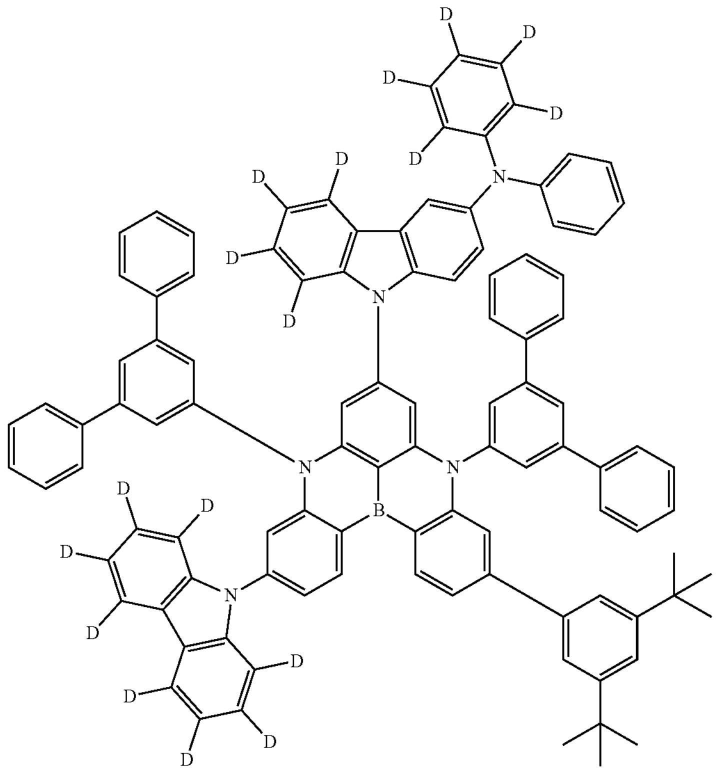
531
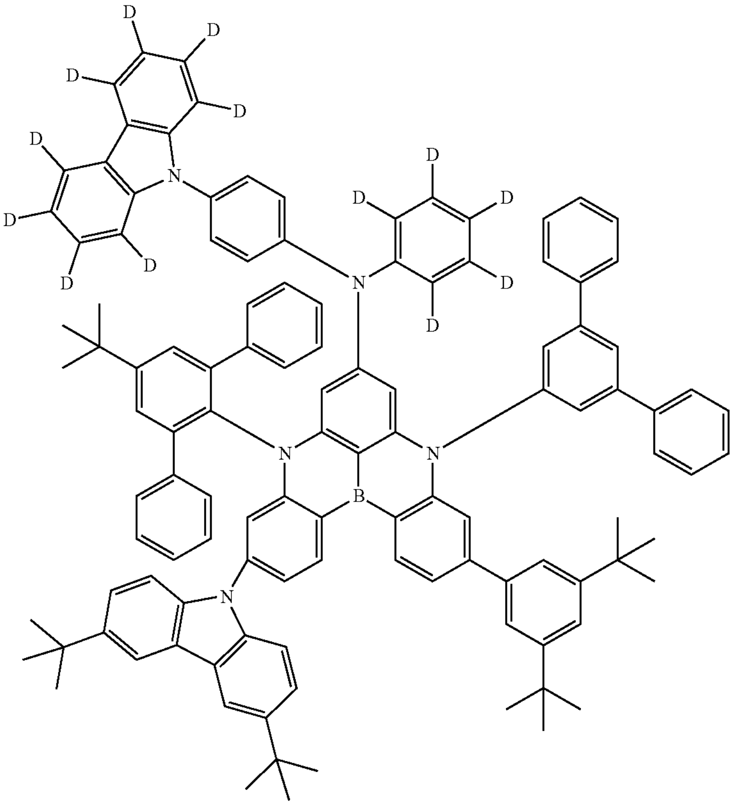

-continued
532
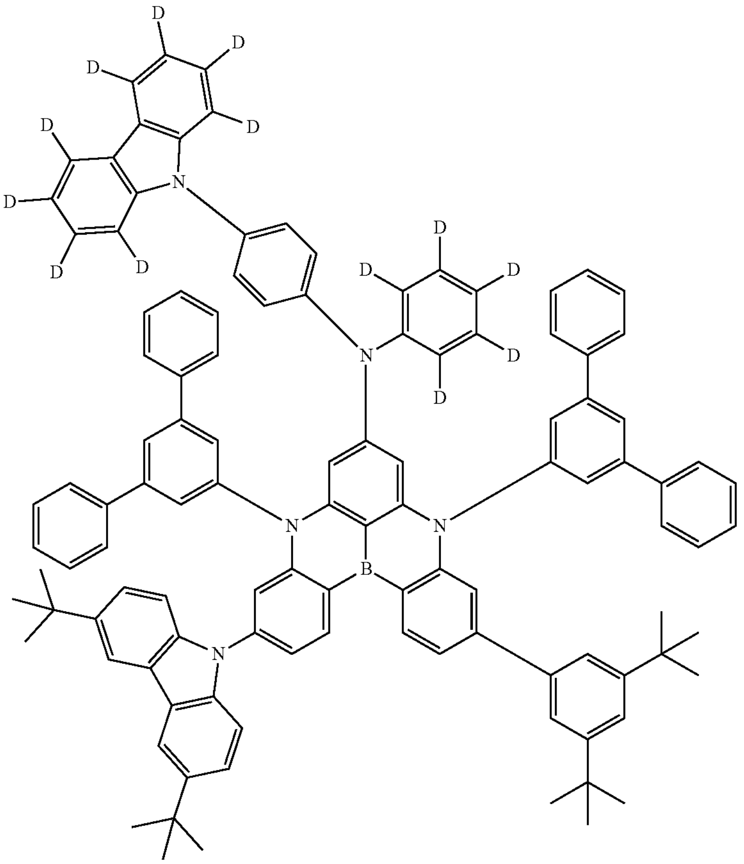
533
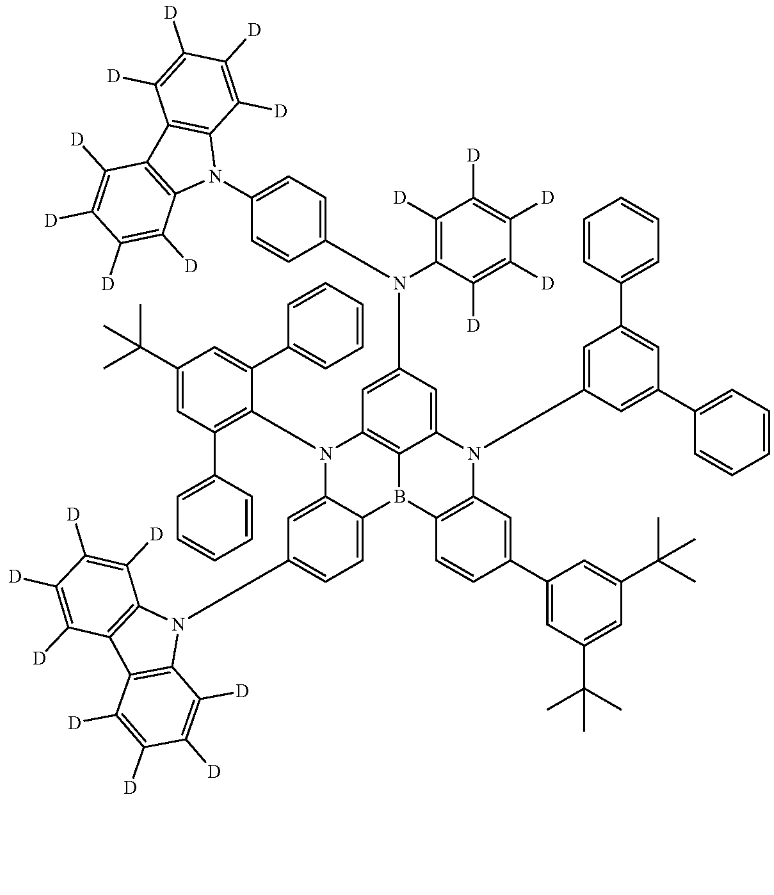

-continued
534
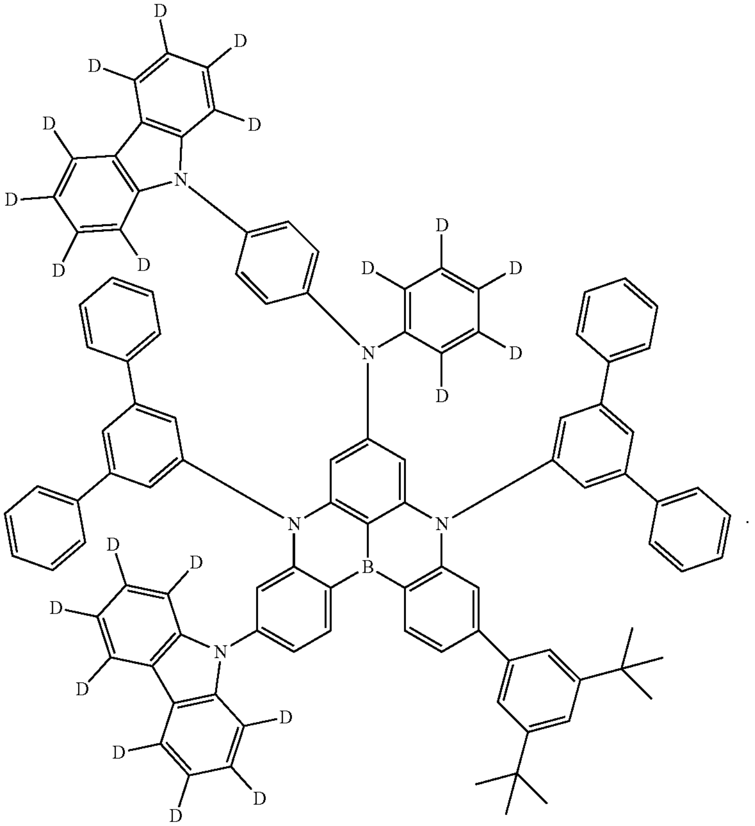
* * * * *